US012540145B2

(12) United States Patent
Lim et al.

(10) Patent No.: US 12,540,145 B2
(45) Date of Patent: Feb. 3, 2026

(54) COMPOUND AND ORGANIC LIGHT EMITTING DEVICE COMPRISING THE SAME

(71) Applicant: LG Chem, Ltd., Seoul (KR)

(72) Inventors: Byeong Yun Lim, Daejeon (KR); Jaechol Lee, Daejeon (KR); Yongwook Kim, Daejeon (KR); Soyoung Yu, Daejeon (KR); Shin Sung Kim, Daejeon (KR); Young Kwang Kim, Daejeon (KR); Su Hun Jeong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 411 days.

(21) Appl. No.: 18/277,714

(22) PCT Filed: Mar. 31, 2022

(86) PCT No.: PCT/KR2022/004566
§ 371 (c)(1),
(2) Date: Aug. 17, 2023

(87) PCT Pub. No.: WO2022/220453
PCT Pub. Date: Oct. 20, 2022

(65) Prior Publication Data
US 2024/0188440 A1 Jun. 6, 2024

(30) Foreign Application Priority Data
Apr. 15, 2021 (KR) ........................ 10-2021-0049431

(51) Int. Cl.
*H10K 85/10* (2023.01)
*C07F 5/02* (2006.01)
(Continued)

(52) U.S. Cl.
CPC .............. *C07F 5/027* (2013.01); *C09K 11/06* (2013.01); *H10K 85/658* (2023.02); *C09K 2211/1018* (2013.01); *H10K 50/12* (2023.02)

(58) Field of Classification Search
CPC .................................................... H10K 85/658
(Continued)

(56) References Cited

U.S. PATENT DOCUMENTS 11,723,263 B2 * 8/2023 Hatakeyama ........ C07D 307/77 428/690
12,006,335 B2 * 6/2024 Kim ...................... C07F 7/0812
(Continued)

FOREIGN PATENT DOCUMENTS

JP 2020038896 A 3/2020
JP 2021504373 A 2/2021
(Continued)

OTHER PUBLICATIONS

International Search Report for PCT/KR2022/004566 mailed Jun. 30, 2022. 4 pages.

*Primary Examiner* — Christopher M Raabe
(74) *Attorney, Agent, or Firm* — Lerner David LLP

(57) ABSTRACT

The present disclosure provides a novel compound represented by the following Chemical Formula 1 and an organic light emitting device including the same:
(Continued)

[Chemical Formula 1]

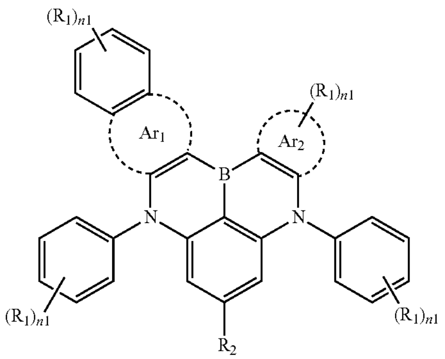

wherein $R_1$, $R_2$ and n1 are described herein.

11 Claims, 1 Drawing Sheet

(51) Int. Cl.
*C09K 11/06* (2006.01)
*H10K 85/60* (2023.01)
*H10K 50/12* (2023.01)

(58) Field of Classification Search
USPC .................................................. 313/498–512
See application file for complete search history.

(56) References Cited

U.S. PATENT DOCUMENTS

| | | | |
|---|---|---|---|
| 2004/0251816 A1 | 12/2004 | Leo et al. | |
| 2015/0236274 A1 | 8/2015 | Hatakeyama et al. | |
| 2018/0094000 A1 | 4/2018 | Hatakeyama et al. | |
| 2019/0058124 A1 | 2/2019 | Hatakeyama et al. | |
| 2019/0378992 A1 | 12/2019 | Skulason et al. | |
| 2020/0144513 A1 | 5/2020 | Hatakeyama et al. | |
| 2020/0144514 A1 | 5/2020 | Hatakeyama et al. | |
| 2020/0144515 A1 | 5/2020 | Hatakeyama et al. | |
| 2020/0172558 A1 | 6/2020 | Joo et al. | |
| 2020/0176679 A1* | 6/2020 | Jeong | C07F 5/027 |
| 2020/0190116 A1 | 6/2020 | Hatakeyama et al. | |
| 2021/0184121 A1 | 6/2021 | Suh et al. | |
| 2021/0395274 A1 | 12/2021 | Hatakeyama et al. | |
| 2023/0096132 A1 | 3/2023 | Hatakeyama et al. | |

FOREIGN PATENT DOCUMENTS

| | | | |
|---|---|---|---|
| KR | 20000051826 | A | 8/2000 |
| KR | 20160119683 | A | 10/2016 |
| KR | 20170130435 | A | 11/2017 |
| KR | 20190059998 | A | 5/2019 |
| KR | 20190101900 | A | 9/2019 |
| KR | 102094830 | B1 | 3/2020 |
| KR | 102144446 | B1 | 8/2020 |
| KR | 20200125583 | A | 11/2020 |
| KR | 20210023254 | A | 3/2021 |
| KR | 20210027179 | A | 3/2021 |
| WO | 2003012890 | A2 | 2/2003 |
| WO | 2020218079 | A1 | 10/2020 |
| WO | 2020251049 | A1 | 12/2020 |

* cited by examiner

[FIG. 1]
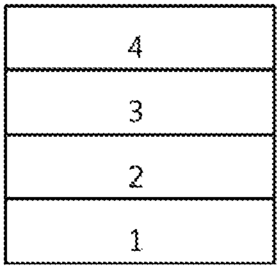
[FIG. 2]
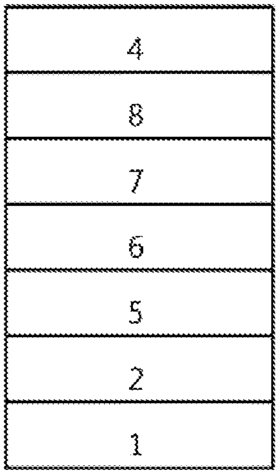

COMPOUND AND ORGANIC LIGHT EMITTING DEVICE COMPRISING THE SAME

CROSS-REFERENCE TO RELATED APPLICATION(S)

This application is a national phase entry under 35 U.S.C. § 371 of International Application No. PCT/KR2022/004566 filed on Mar. 31, 2022, which claims priority from Korean Patent Application No. 10-2021-0049431 filed on Apr. 15, 2021, all the disclosures of which are incorporated by reference herein in its entirety.

TECHNICAL FIELD

The present disclosure relates to a novel compound and an organic light emitting device comprising the same.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, and an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer, and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

For the organic materials used in the organic light emitting devices as described above, the development of new materials is continuously required.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed by a solution process, and a hybrid process utilizing traditional deposition processes is being studied as a subsequent process.

Therefore, the present disclosure provides a novel material for an organic light emitting device that can be used for an organic light emitting device and at the same time, can be used for a solution process.

PRIOR ART LITERATURE

Patent Literature (Patent Literature 1) Korean Unexamined Patent Publication No. 10-2000-0051826

DETAILED DESCRIPTION

Technical Problem

It is an object of the present disclosure to provide a novel compound and an organic light emitting device comprising the same.

Technical Solution

According to an aspect of the present disclosure, there is provided a compound represented by the following Chemical Formula 1:

[Chemical Formula 1]

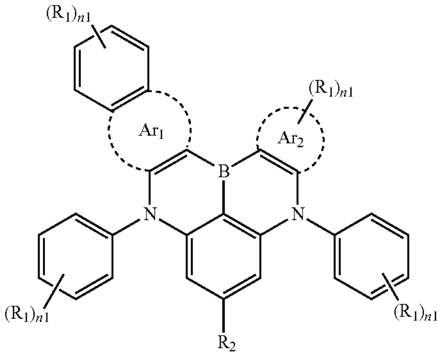

in Chemical Formula 1, $Ar_1$ is furan or thiophene fused with two adjacent rings, $Ar_2$ is benzene, benzofuran or benzothiophene fused with one adjacent ring;

each n1 is independently an integer of 1 to 4;

at least one of $R_1$ is benzofuranyl or benzothiophenyl, the rest are independently hydrogen, deuterium, halogen, cyano, a substituted or unsubstituted $C_{1-60}$ alkyl, a substituted or unsubstituted $C_{2-60}$ alkenyl, a substituted or unsubstituted $C_{2-60}$ alkynyl, a substituted or unsubstituted $C_{3-30}$ cycloalkyl, a substituted or unsubstituted $C_{6-60}$ aryl, or a substituted or unsubstituted $C_{2-60}$ heteroaryl containing any one or more heteroatoms selected from N, O or S, and $R_2$ is hydrogen; deuterium; or a substituted or unsubstituted $C_{1-60}$ alkyl.

According to another aspect of the present disclosure, there is provided an organic light emitting device comprising: a first electrode; a second electrode that is provided opposite to the first electrode; and one or more organic material layers that are provided between the first electrode and the second electrode, wherein one or more layers of the organic material layers include the compound represented by Chemical Formula 1.

Advantageous Effects

The above-mentioned compound represented by Chemical Formula 1 can be used as a material for an organic material layer of an organic light emitting device, can be used in a solution process, and can improve the efficiency, achieve low driving voltage and/or improve lifetime characteristics in the organic light emitting device.

BRIEF DESCRIPTION OF THE DRAWINGS

FIG. 1 shows an example of an organic light emitting device comprising a substrate 1, an anode 2, a light emitting layer 3, and a cathode 4.

FIG. 2 shows an example of an organic light emitting device comprising a substrate 1, an anode 2, a hole injection layer 5, a hole transport layer 6, a light emitting layer 7, an electron injection and transport layer 8, and a cathode 4.

DETAILED DESCRIPTION OF THE EMBODIMENTS

Hereinafter, embodiments of the present disclosure will be described in more detail to facilitate understanding of the invention.

DEFINITION OF TERMS

As used herein, the notation

and 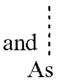 mean a bond linked to another substituent group.

As used herein, the term “substituted or unsubstituted” means being substituted with one or more substituents selected from the group consisting of deuterium; a halogen group; a cyano group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heteroaryl containing at least one of N, O or S atoms, or being substituted with a substituent to which two or more substituents of the above-exemplified substituents are linked, or being unsubstituted. For example, “a substituent in which two or more substituents are linked” may be a biphenyl group. Namely, a biphenyl group may be an aryl group, or it may also be interpreted as a substituent in which two phenyl groups are linked.

In the present disclosure, the carbon number of a carbonyl group is not particularly limited, but is preferably 1 to 40. Specifically, the carbonyl group may be a substituent group having the following structural formulas, but is not limited thereto.

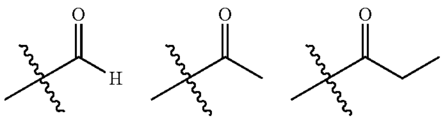

-continued

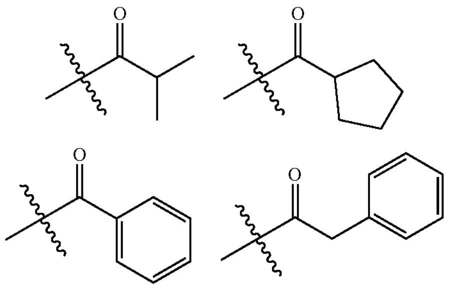

In the present disclosure, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a substituent group having the following structural formulas, but is not limited thereto.

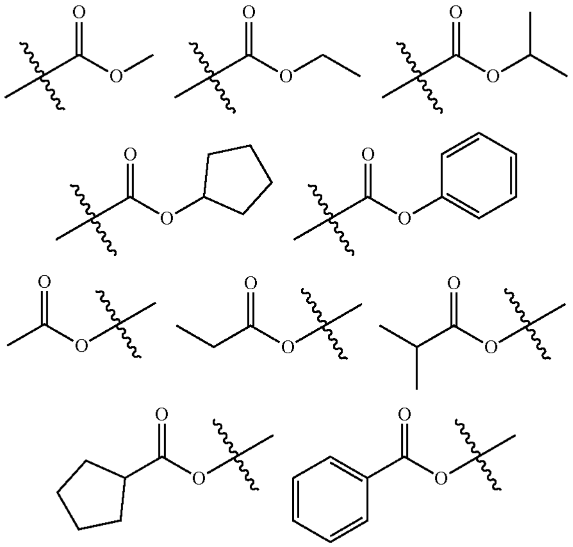

In the present disclosure, the carbon number of an imide group is not particularly limited, but is preferably 1 to 25. Specifically, the imide group may be a substituent group having the following structural formulas, but is not limited thereto.

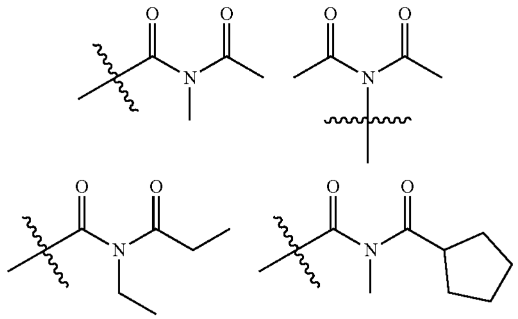

-continued

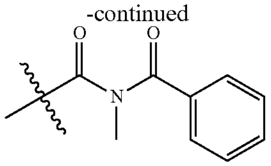

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group may be straight-chain or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present disclosure, the alkenyl group may be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it may be a monocyclic aryl group or a polycyclic aryl group. According to one embodiment, the carbon number of the aryl group is 6 to 30. According to one embodiment, the carbon number of the aryl group is 6 to 20. The aryl group may be a phenyl group, a biphenyl group, a terphenyl group or the like as the monocyclic aryl group, but is not limited thereto. The polycyclic aryl group includes a naphthyl group, an anthracenyl group, a phenanthryl group, a pyrenyl group, a perylenyl group, a chrysenyl group, a fluorenyl group, or the like, but is not limited thereto.

In the present disclosure, the fluorenyl group may be substituted, and two substituents may be connected to each other to form a spiro structure. In the case where the fluorenyl group is substituted,

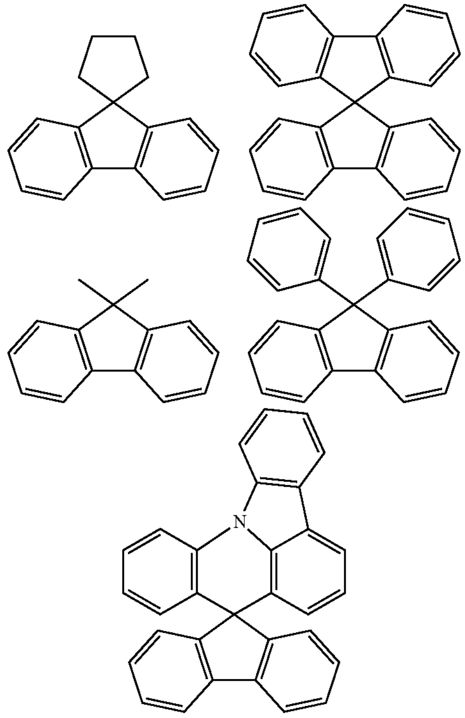

and the like can be formed. However, the structure is not limited thereto

In the present disclosure, a heteroaryl is a heteroaryl containing at least one of O, N, Si or S as a heteroatom, and the carbon number thereof is not particularly limited, but is preferably 2 to 60. Examples of the heteroaryl include xanthene, thioxanthene, a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group, the arylamine group and the arylsily group is the same as the above-mentioned examples of the aryl group. In the present disclosure, the alkyl group in the aralkyl group, the alkylaryl group and the alkylamine group is the same as the above-mentioned examples of the alkyl group. In the present disclosure, the heteroaryl in the heteroarylamine may be applied to the above-mentioned description of the heteroaryl. In the present disclosure, the alkenyl group in the aralkenyl group is the same as the above-mentioned examples of the alkenyl group. In the present disclosure, the above-mentioned description of the aryl group may be applied except that the arylene is a divalent group. In the present disclosure, the above-mentioned description of the heteroaryl may be applied except that the heteroarylene is a divalent group. In the present disclosure, the above-mentioned description of the aryl group or cycloalkyl group may be applied except that the hydrocarbon ring is not a monovalent group but formed by combining two substituent groups. In the present disclosure, the above-mentioned description of the heteroaryl may be applied, except that the heterocyclic group is not a monovalent group but formed by combining two substituent groups.

(Compound)

The present disclosure provides the compound represented by Chemical Formula 1.

The compound represented by Chemical Formula 1 is characterized by containing at least one benzofuranyl or benzothiophenyl in its molecular structure, whereby not only it has a solubility suitable for a solution process, but also its synthesis is easy. Additionally, when an organic light emitting device is manufactured using the compound, the efficiency of the organic light emitting device is increased and the lifespan is also significantly improved.

Preferably, the benzofuranyl is benzofuran-2-yl (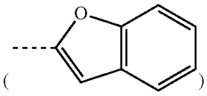)

or benzofuran-3-yl (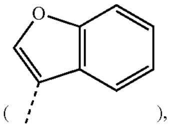), and the benzothiophenyl is benzothiophen-2-yl (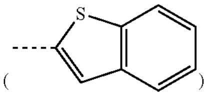)

or benzothiophen-3-yl (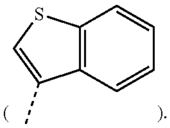).

Preferably, the Chemical Formula 1 is represented by any one of the following Chemical Formulas 1-1 to 1-4:

[Chemical Formula 1-1]

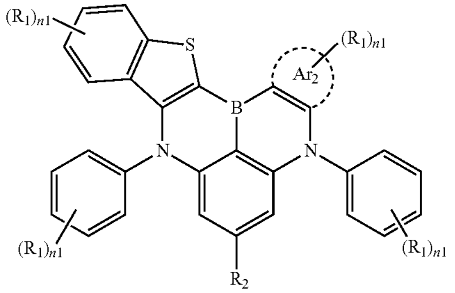

[Chemical Formula 1-2]

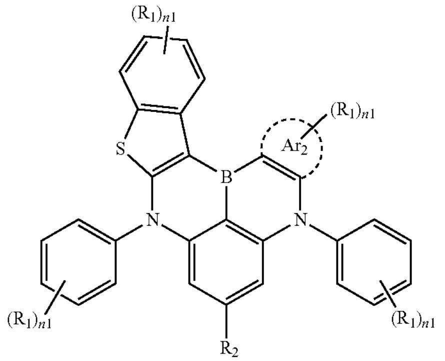

[Chemical Formula 1-3]

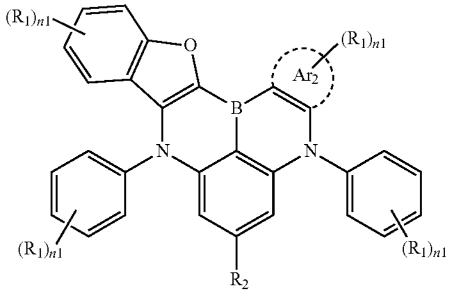

-continued

[Chemical Formula 1-4]

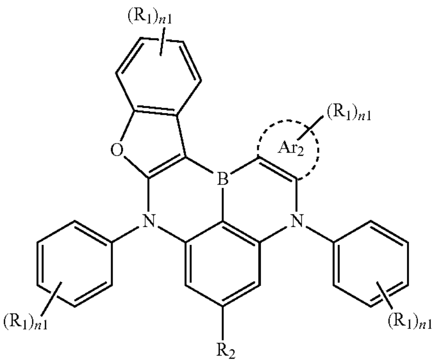

in Chemical Formulas 1-1 to 1-4, $Ar_2$, n1, $R_1$, and $R_2$ are as defined above.

Preferably, at least one of $R_1$ is

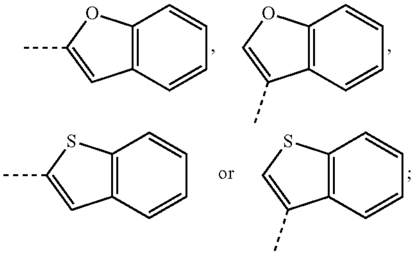

and the rest are independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from N, O or S.

Preferably, at least one of $R_1$ is

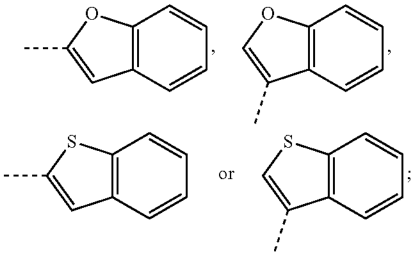

and the rest are independently hydrogen, deuterium, a $C_{3-10}$ alkyl, phenyl, dibenzofuranyl, or dibenzothiophenyl.

Preferably, at least one of $R_1$ is

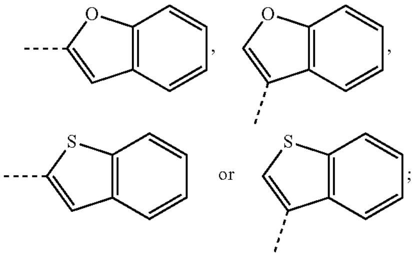

and the rest are independently hydrogen, deuterium, methyl, ethyl, propyl, isopropyl, butyl, isobutyl, tertbutyl, phenyl, dibenzofuranyl, or dibenzothiophenyl.

Preferably, $R_2$ is hydrogen, deuterium, or a $C_{1-4}$ alkyl.

Preferably, $R_2$ is hydrogen, deuterium, methyl, ethyl, propyl, isopropyl, butyl, isobutyl, or tertbutyl.

Representative examples of the compound represented by Chemical Formula 1 are as follows.

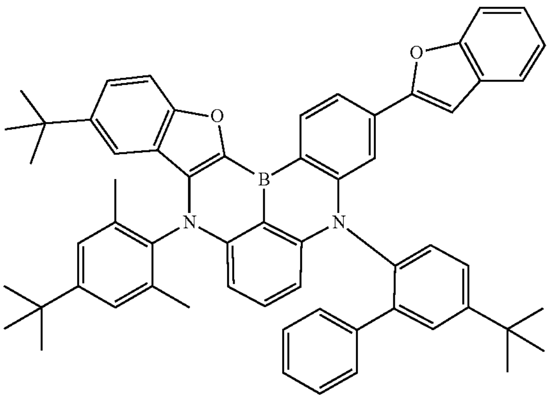

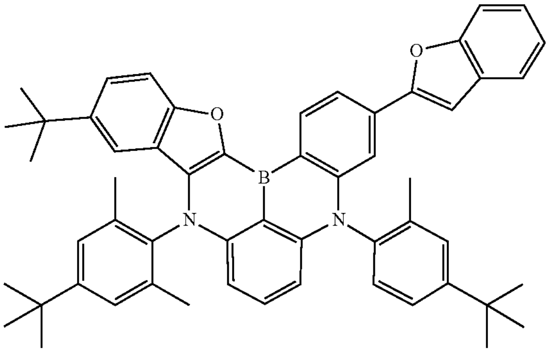

-continued
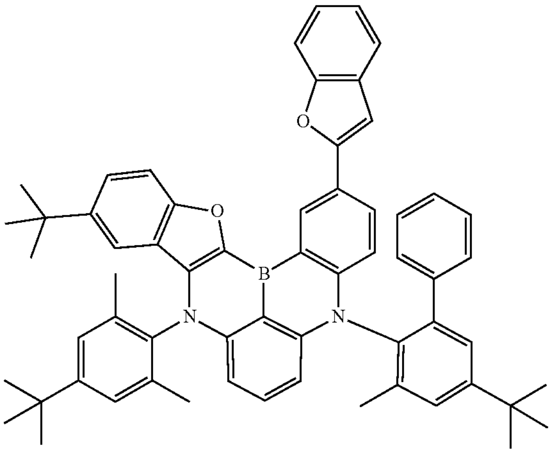
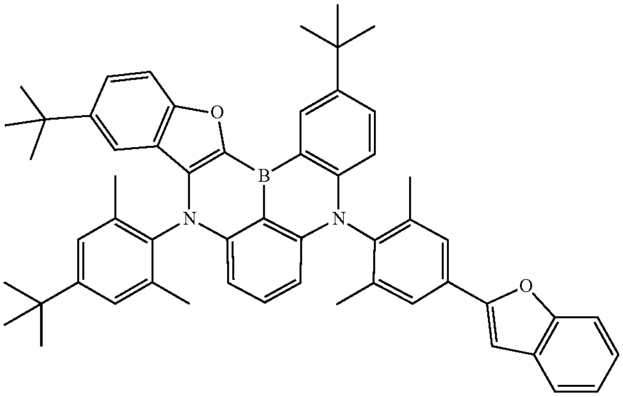
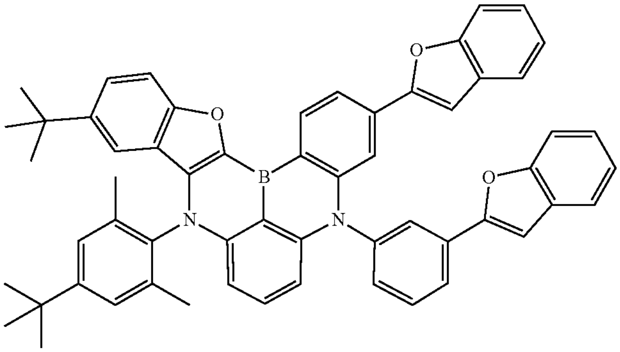
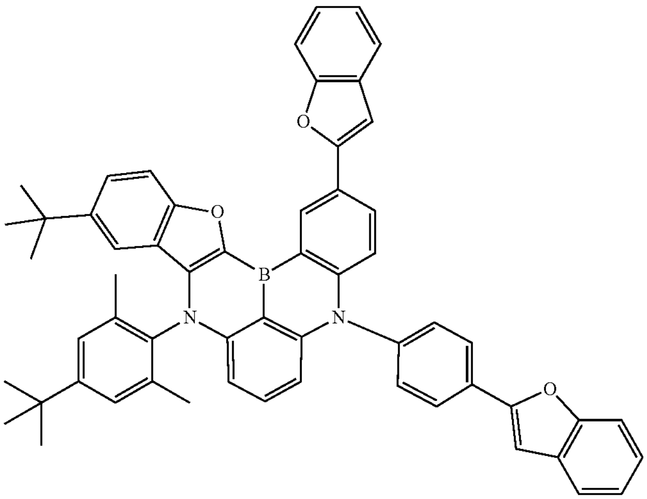
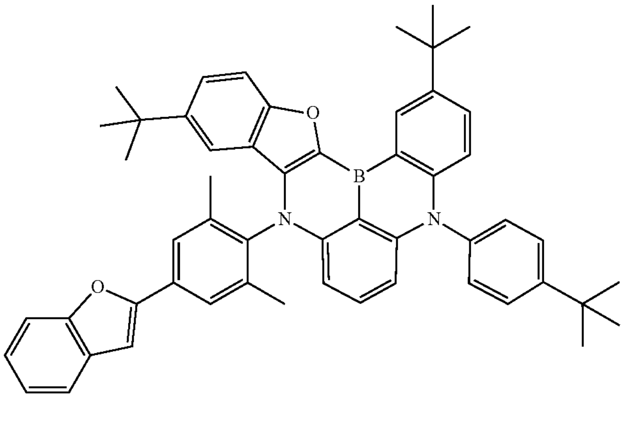

-continued
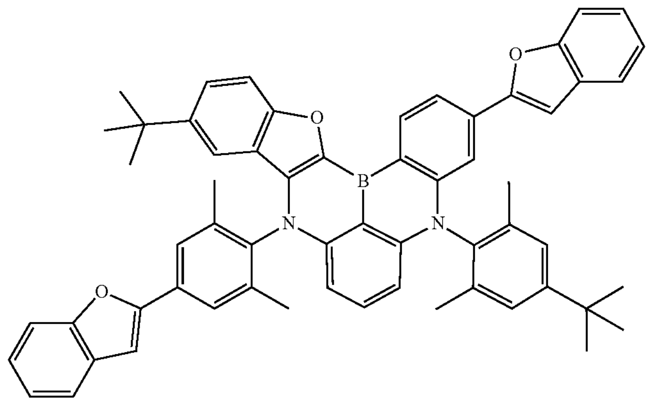
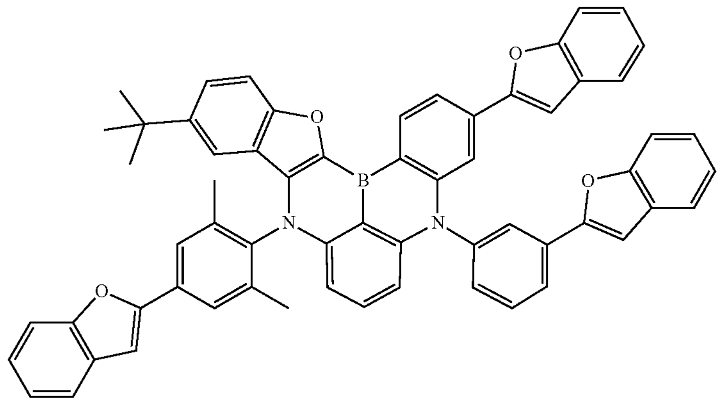
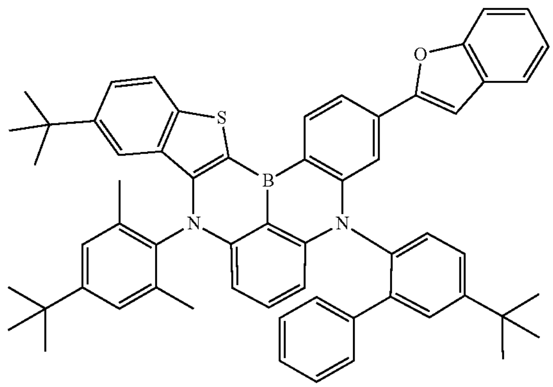
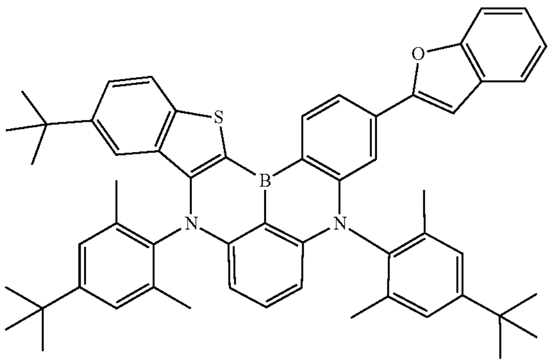
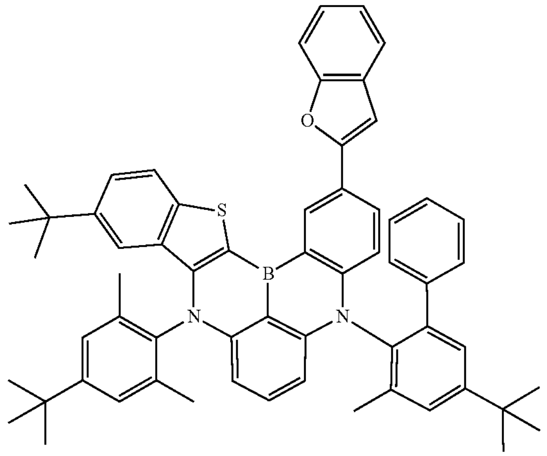

-continued
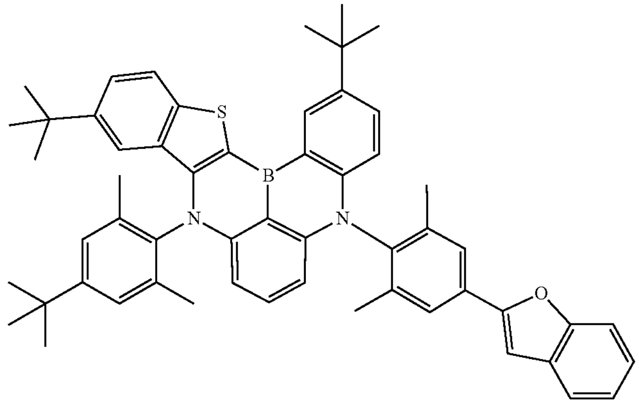
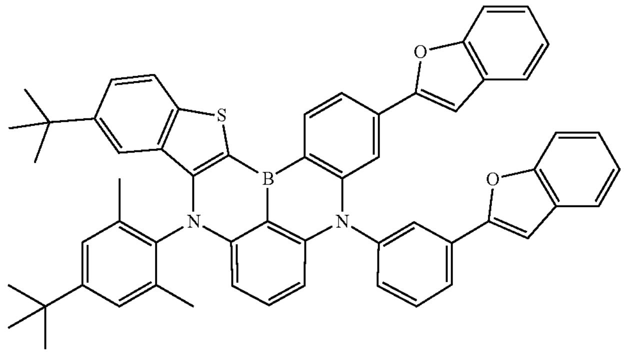
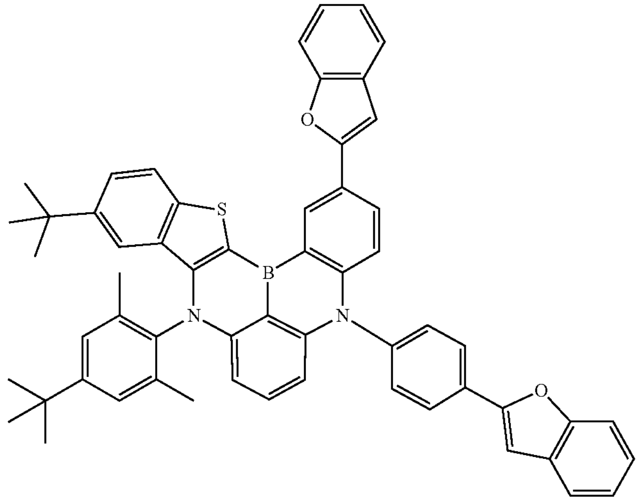
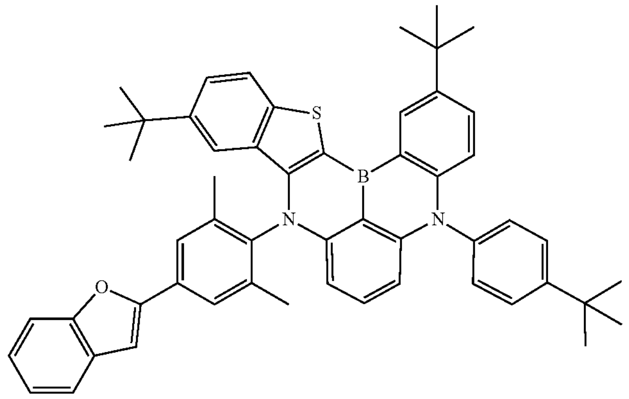

-continued
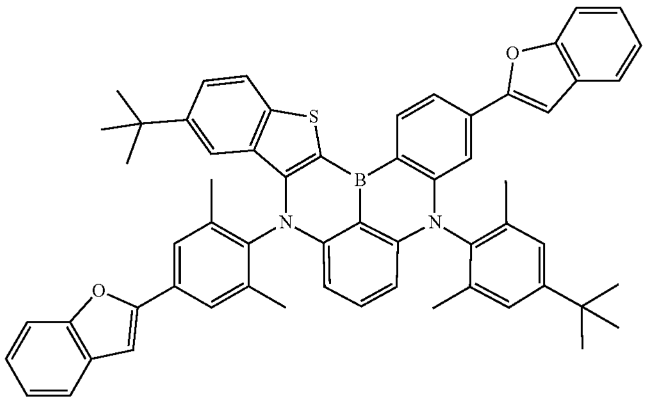
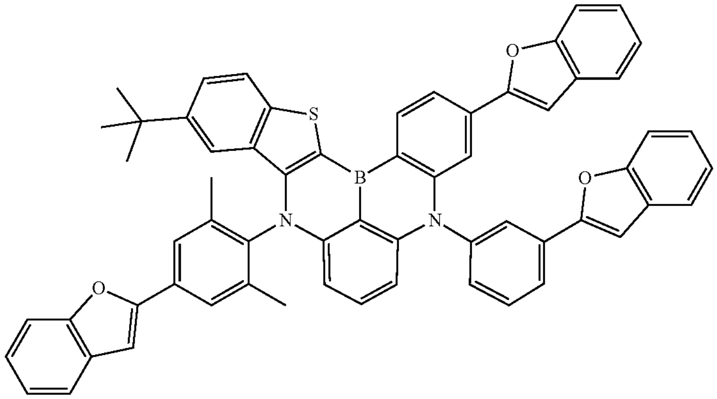
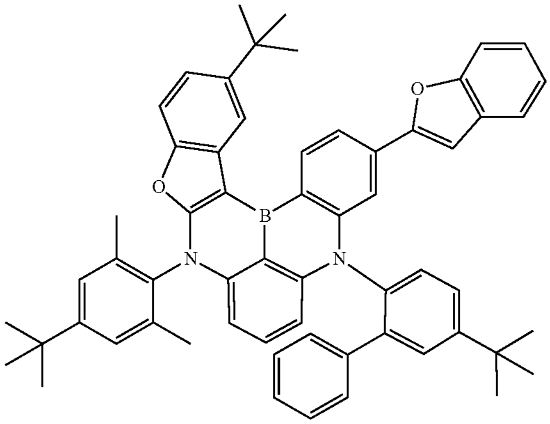
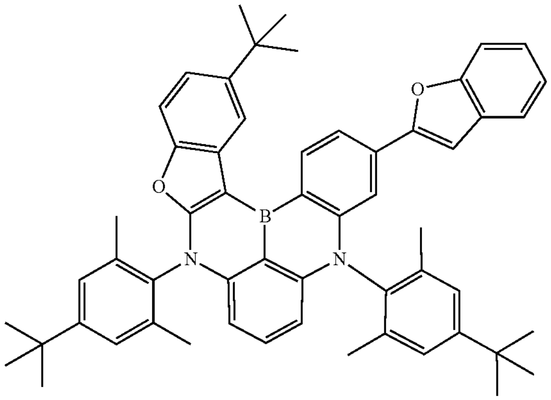
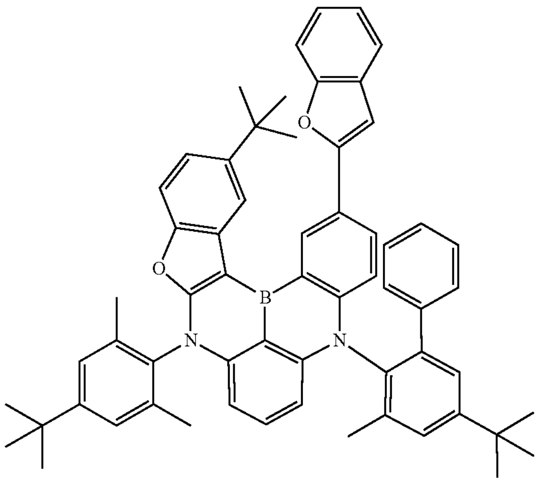
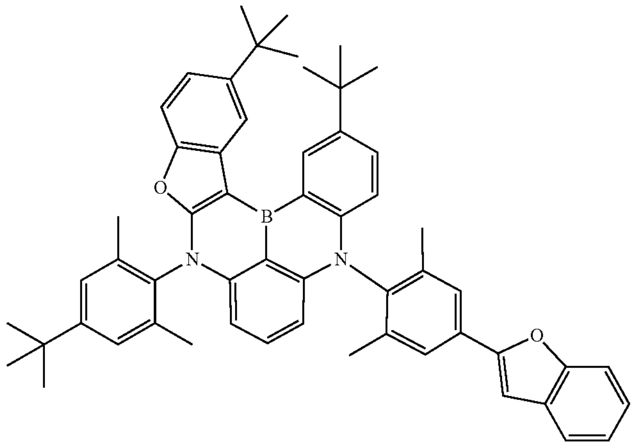

-continued
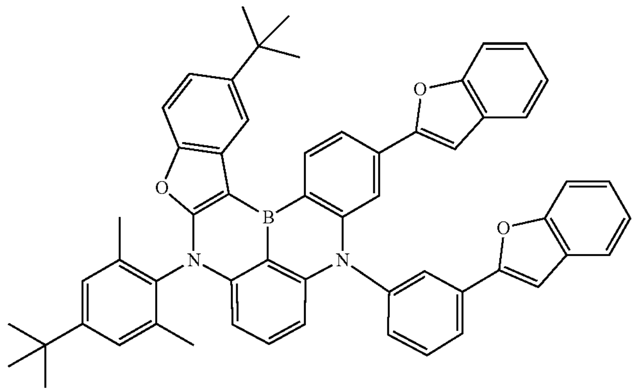
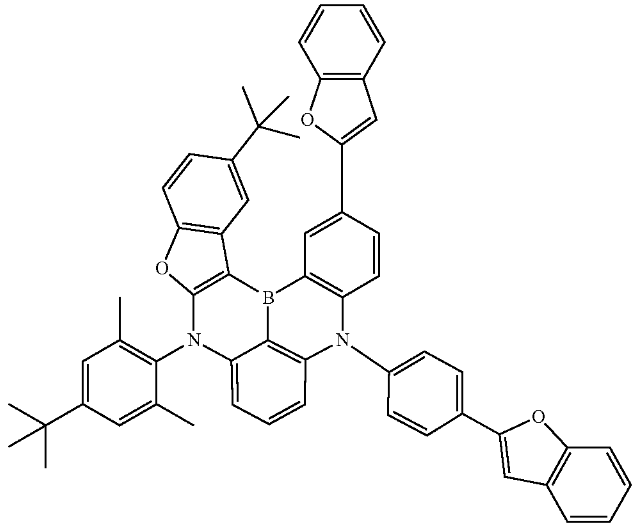
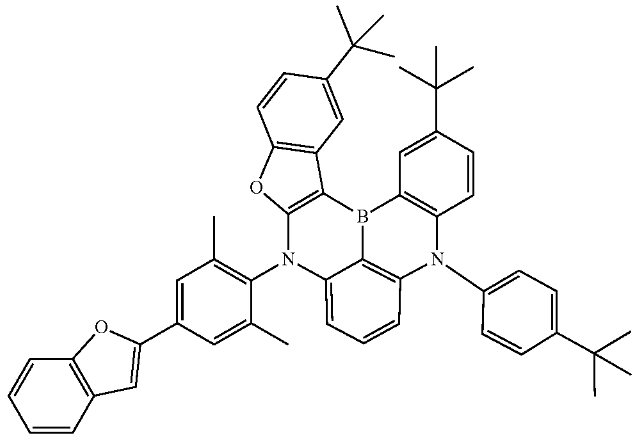

-continued
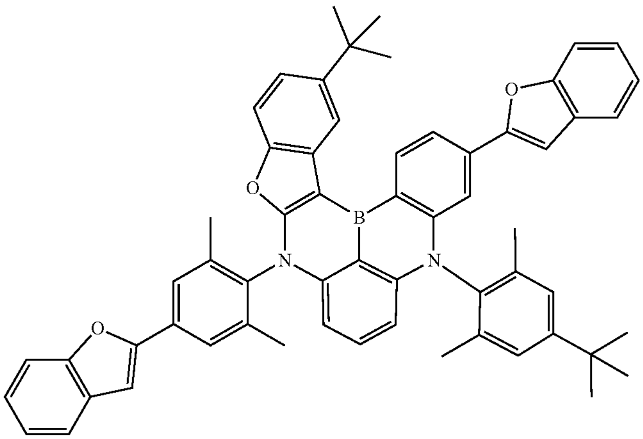
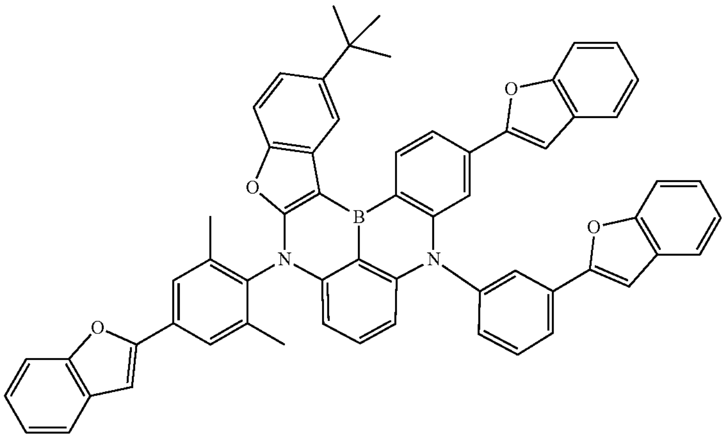
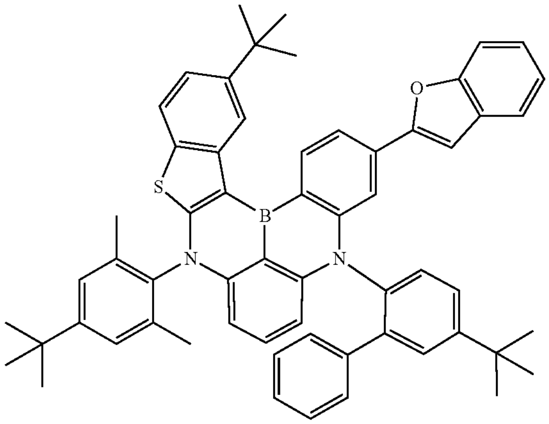
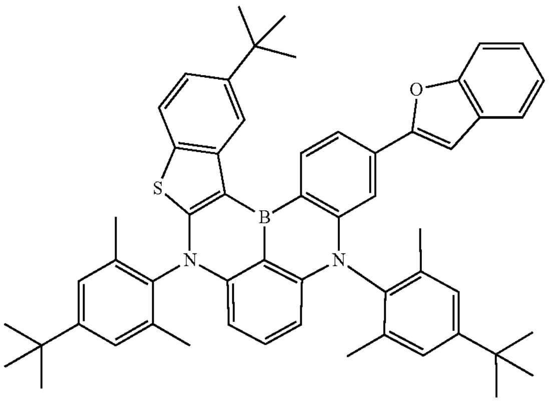

-continued
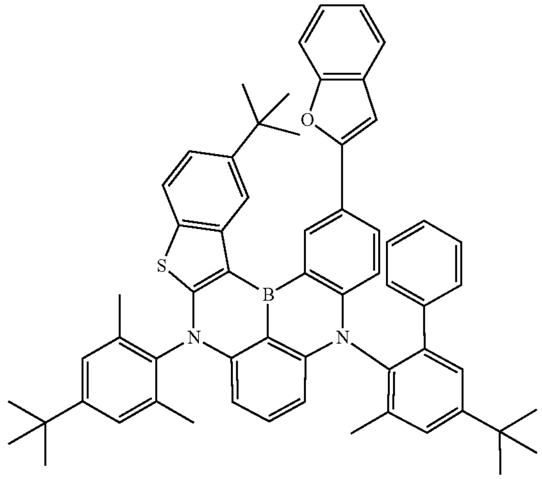
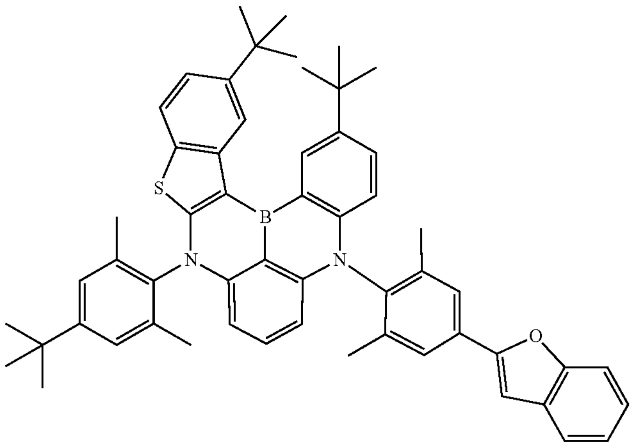
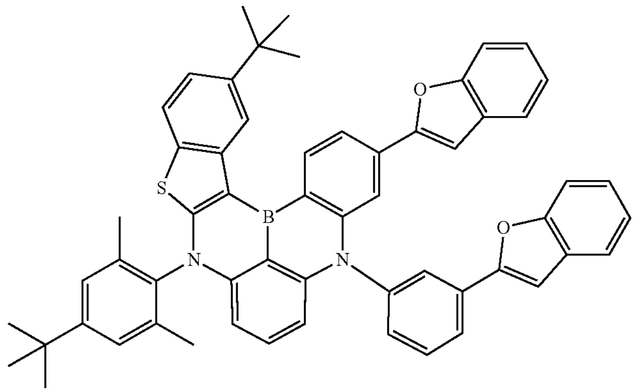
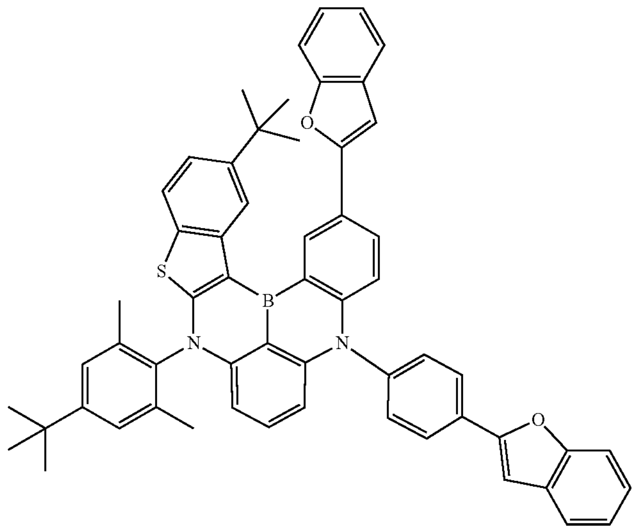

-continued
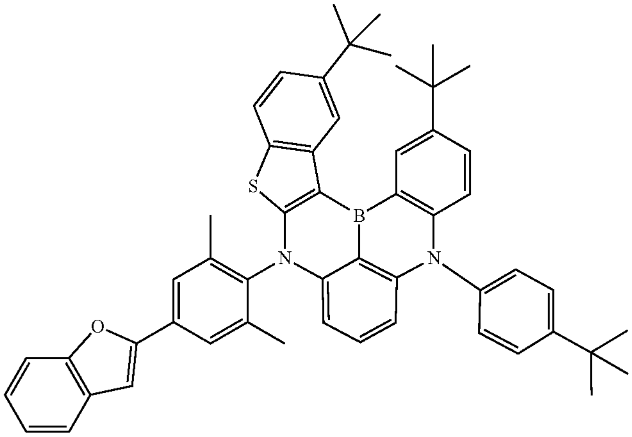
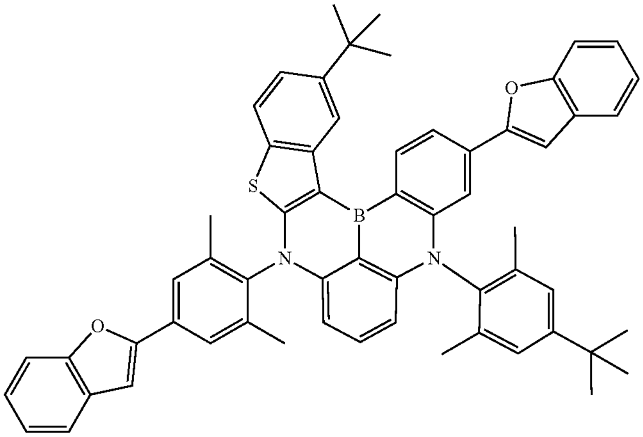
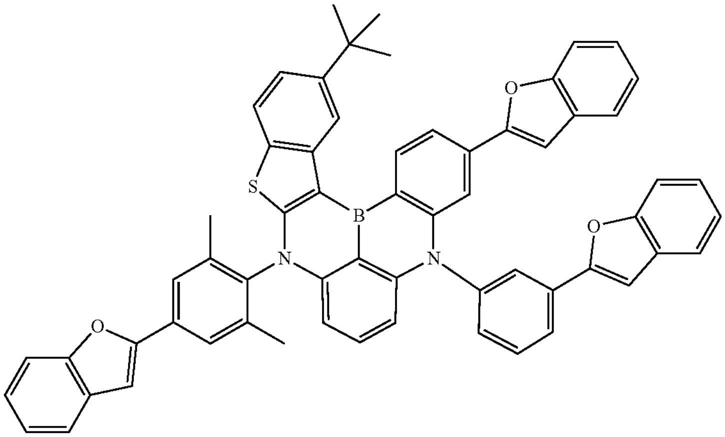
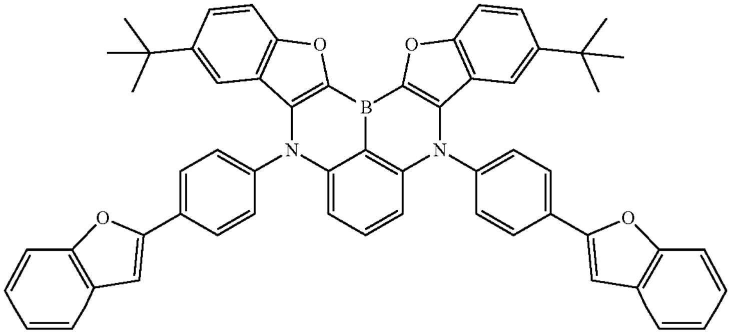

-continued
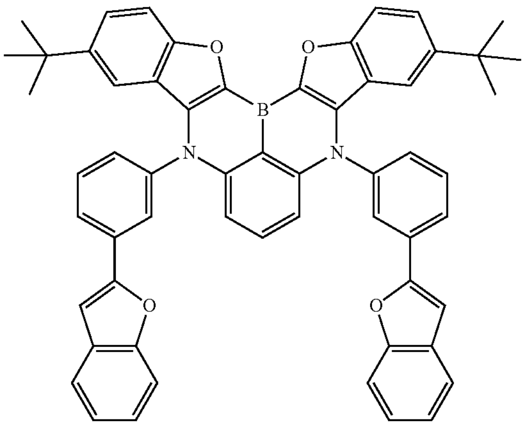
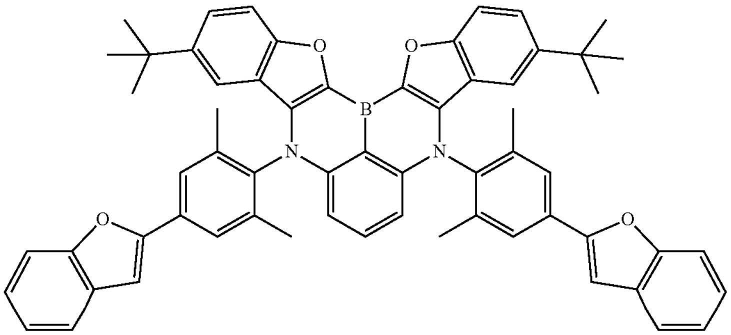
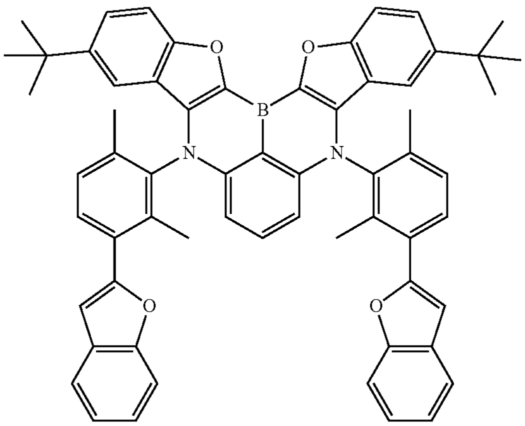
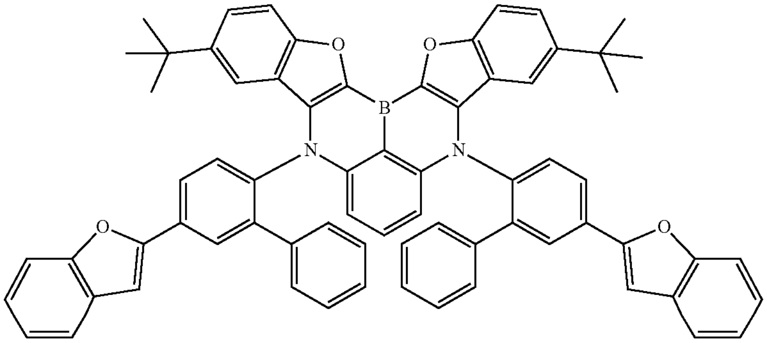

-continued
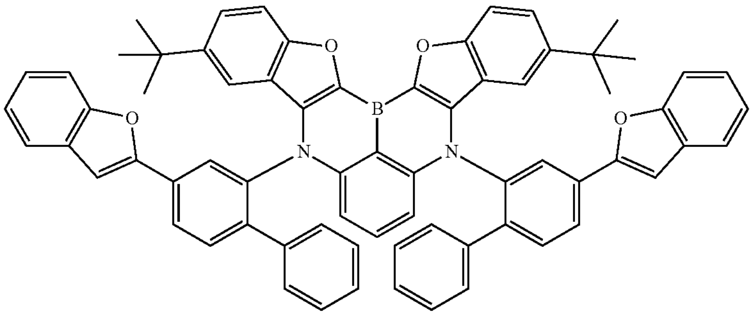
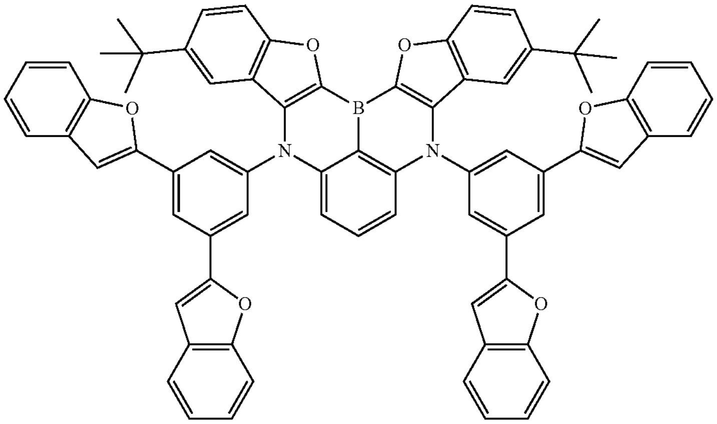
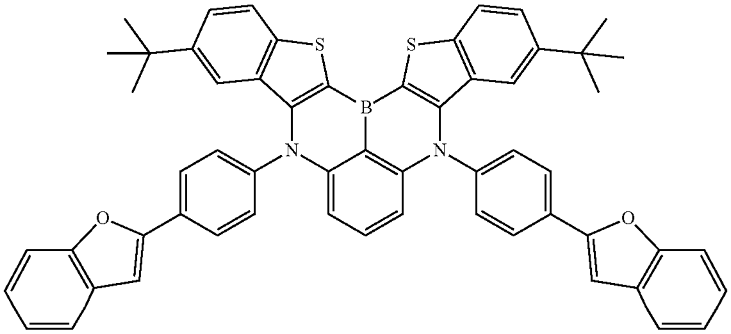
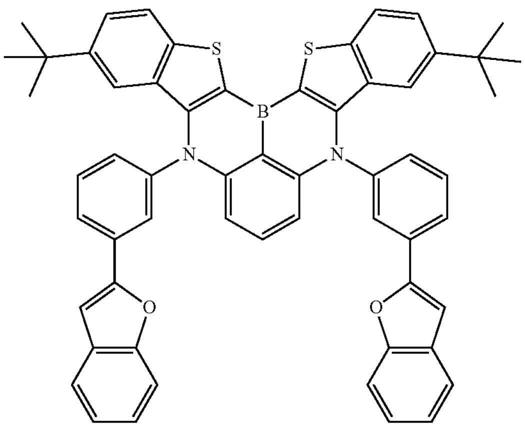

-continued
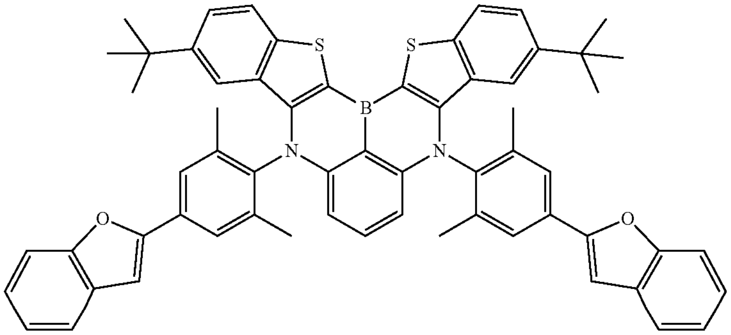
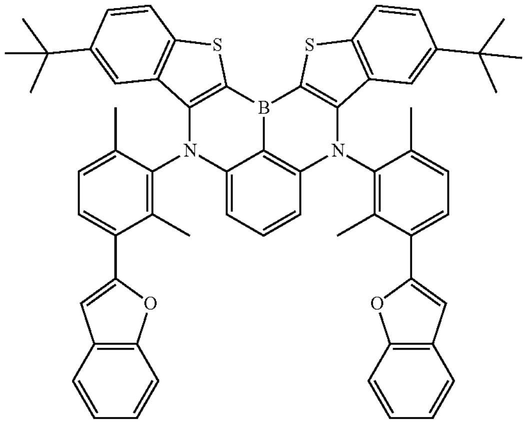
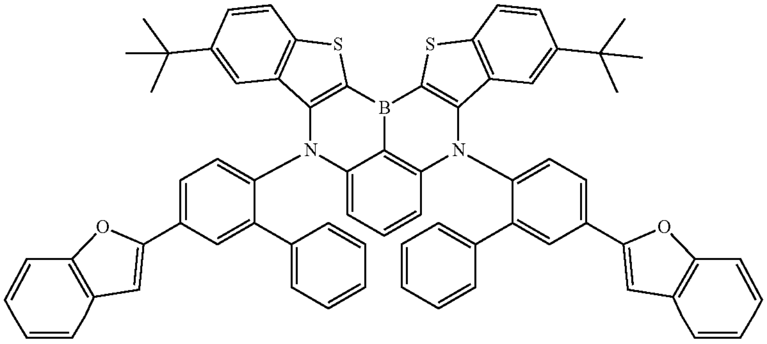
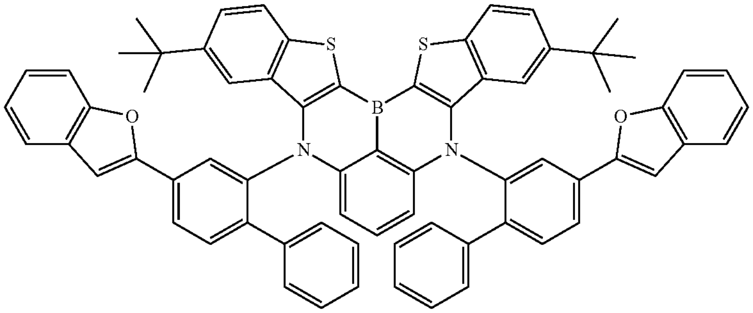

-continued
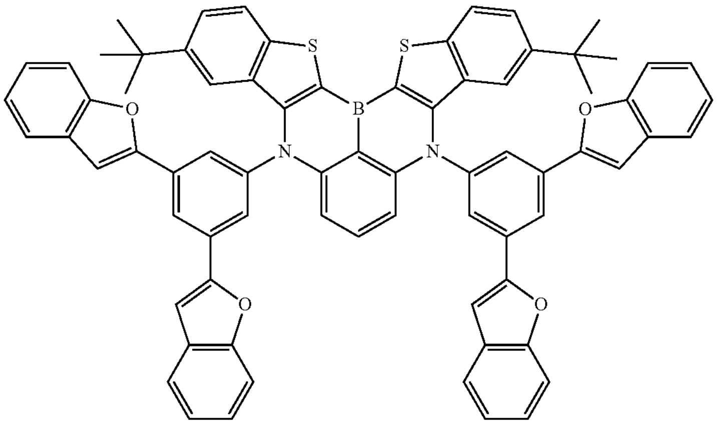
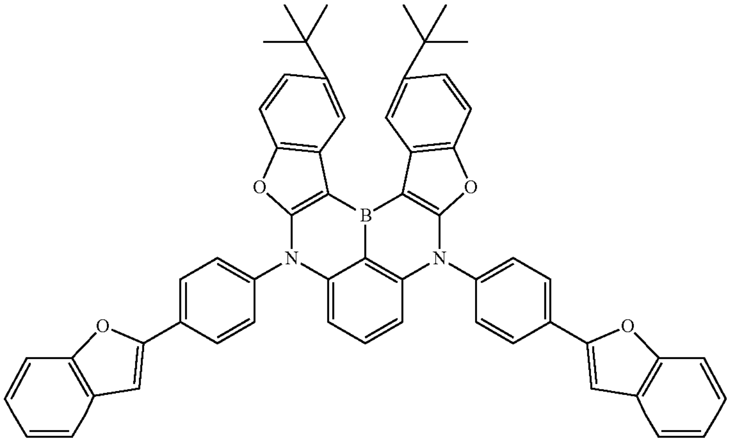
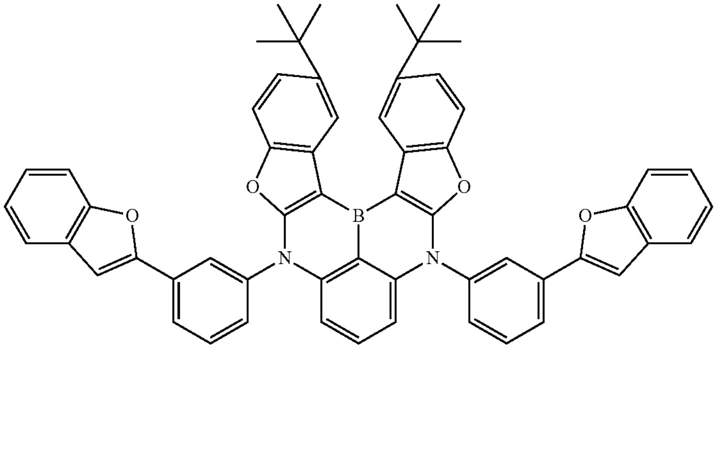

-continued
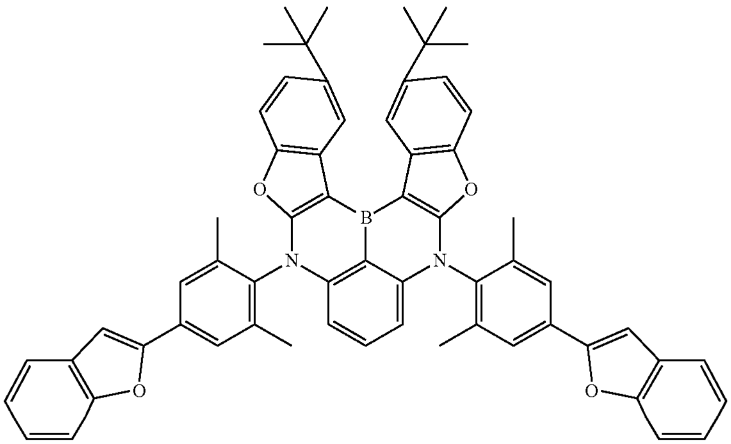
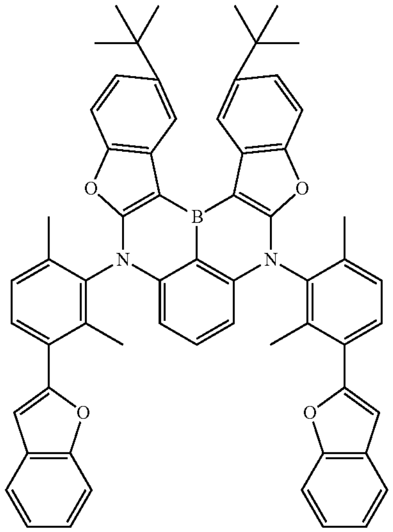
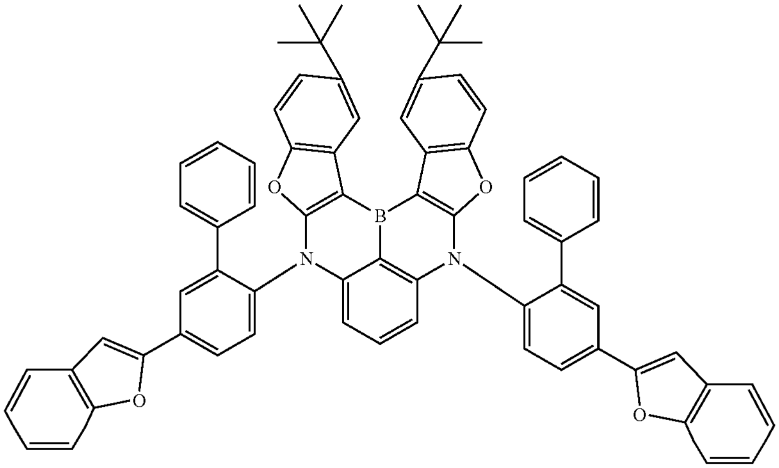
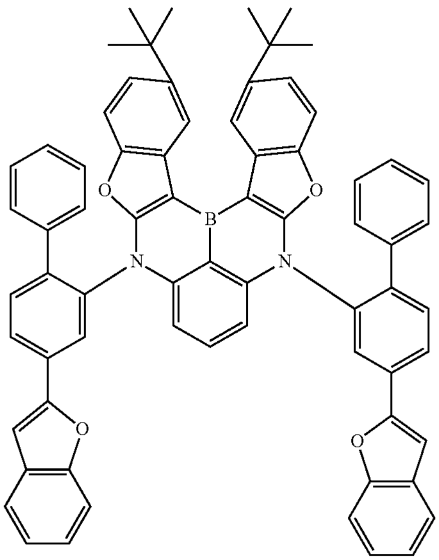
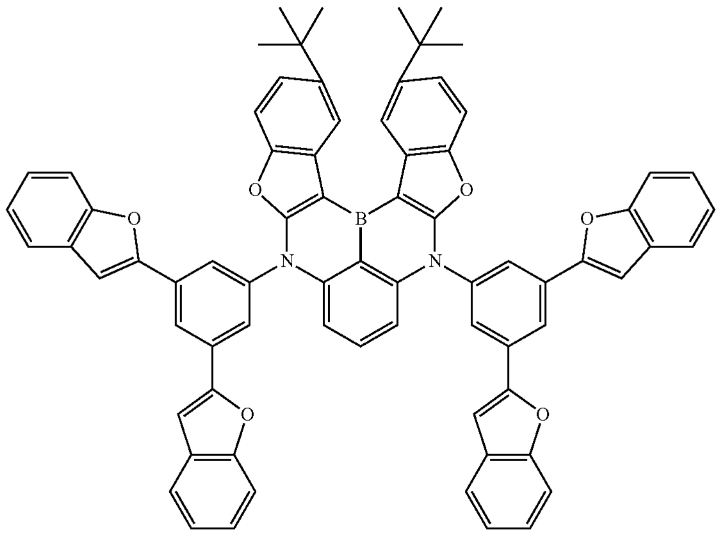

-continued
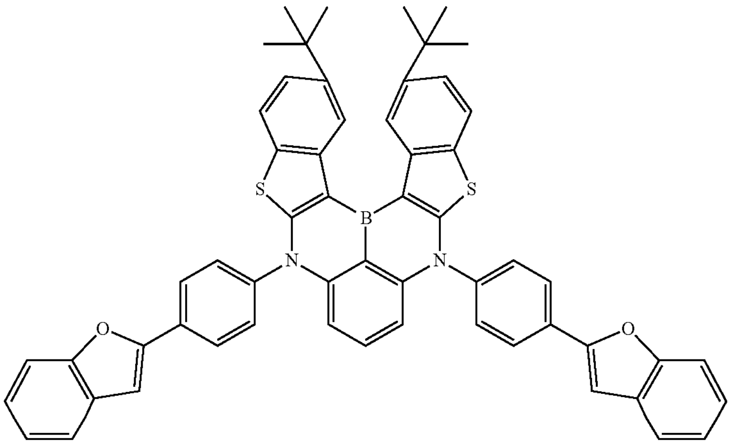
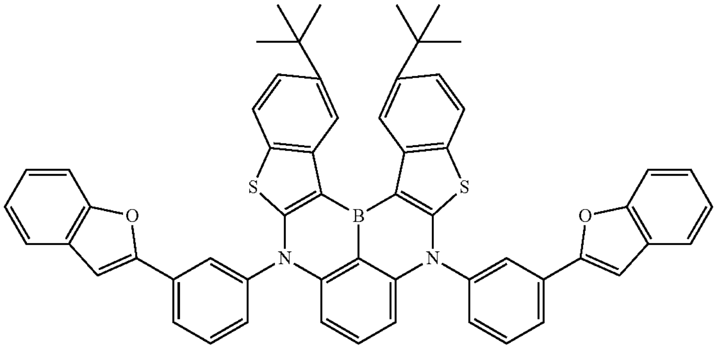
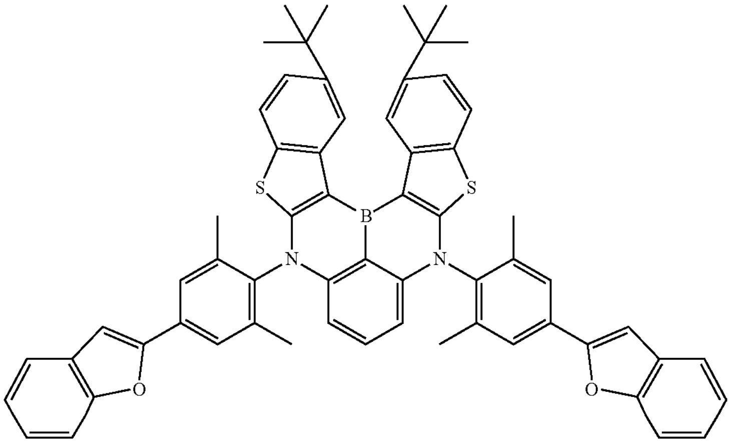
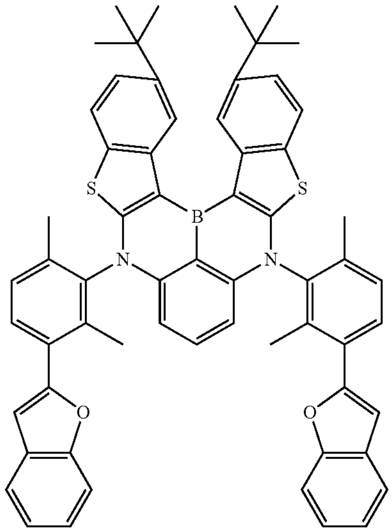

-continued
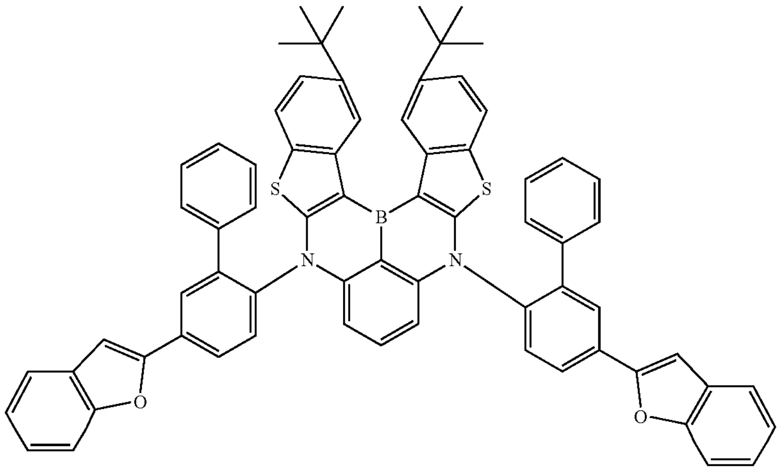
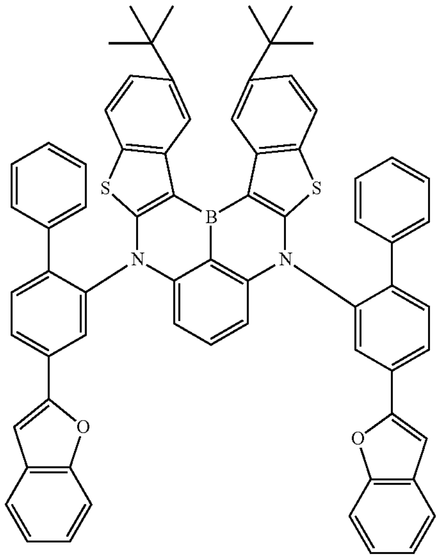
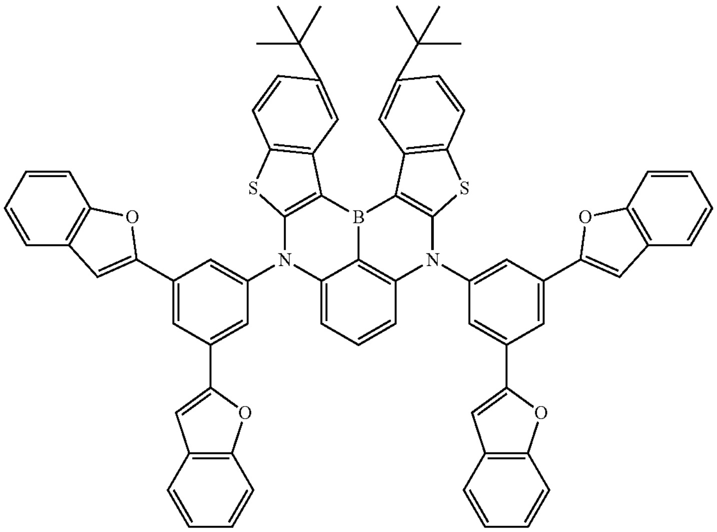
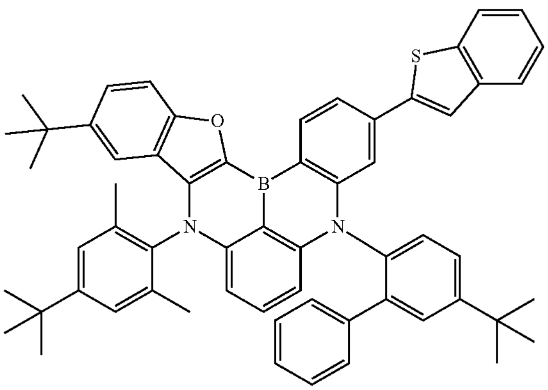
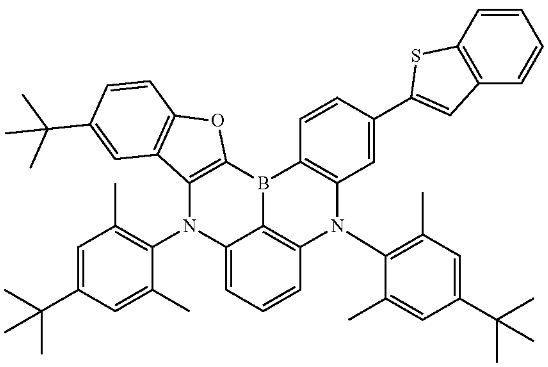

-continued
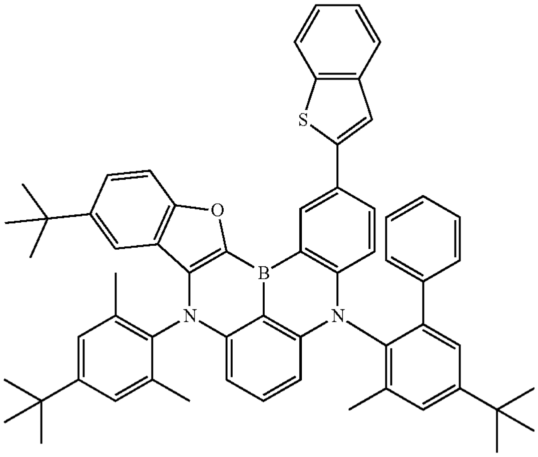
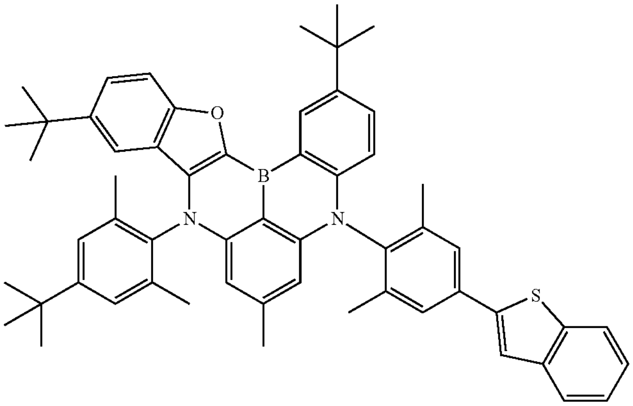
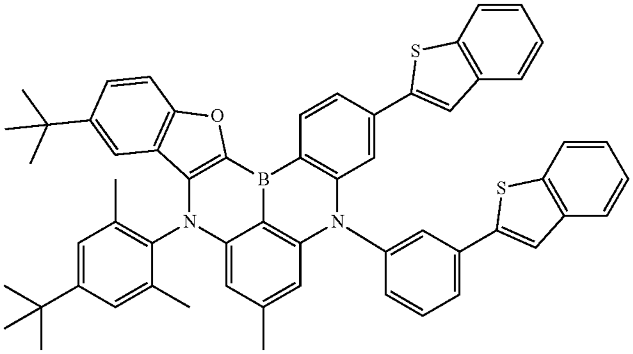
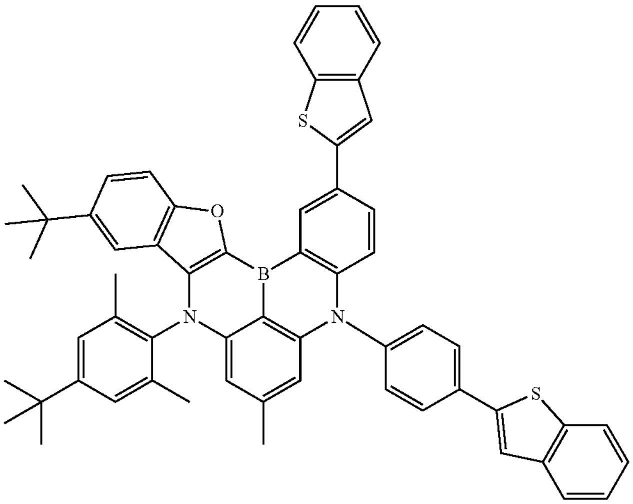

-continued
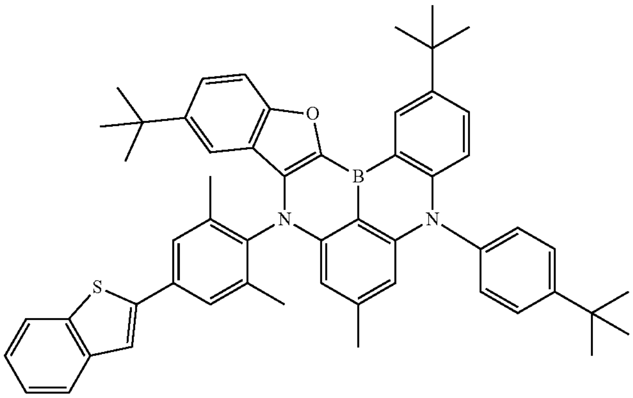
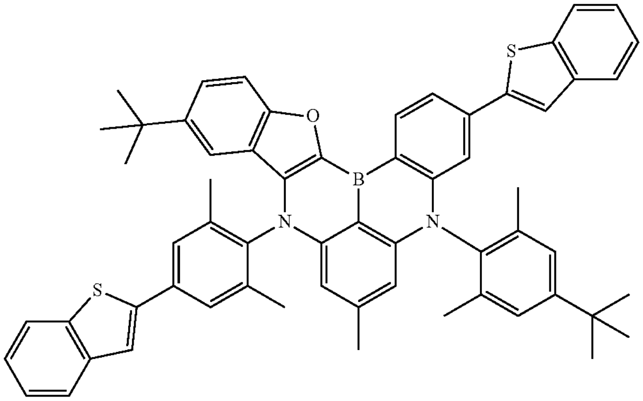
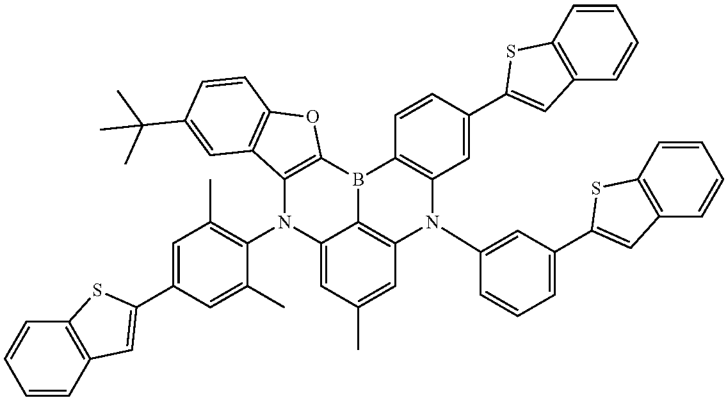
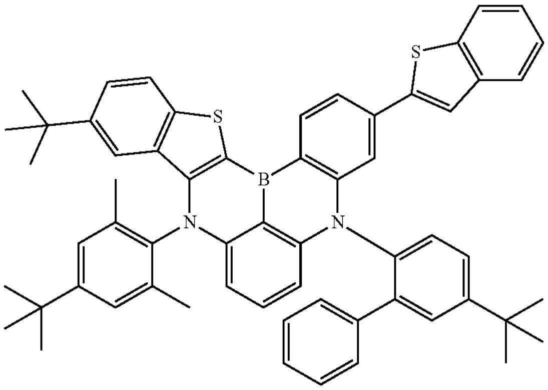
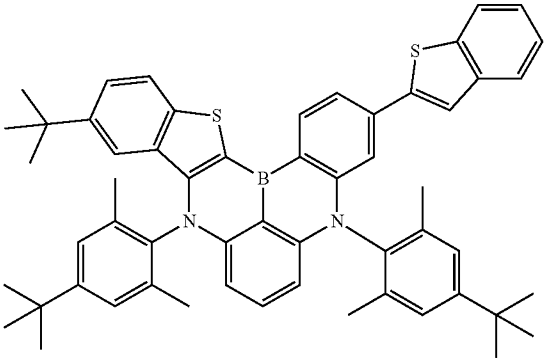

-continued
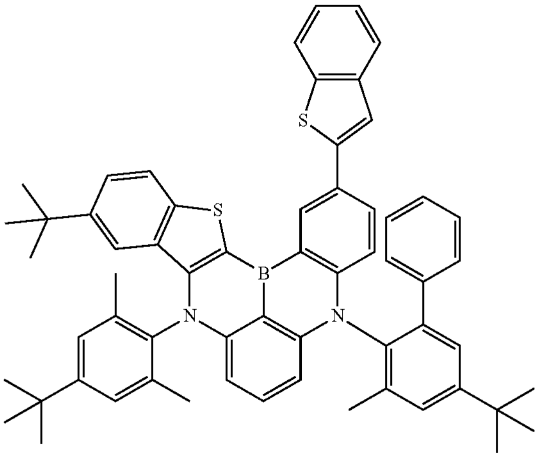
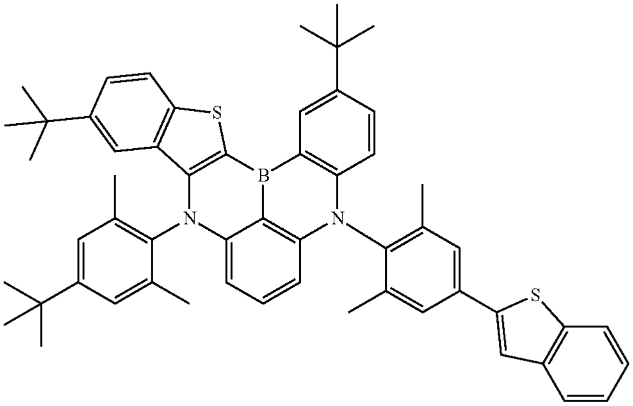
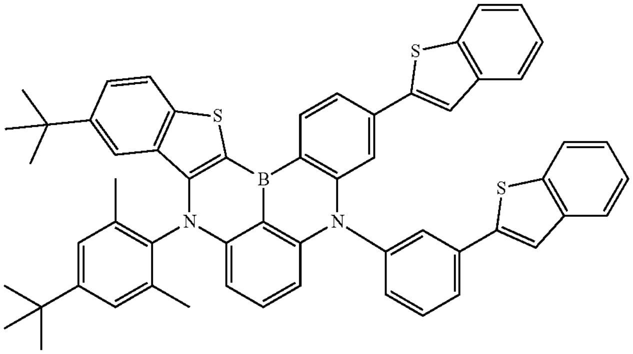
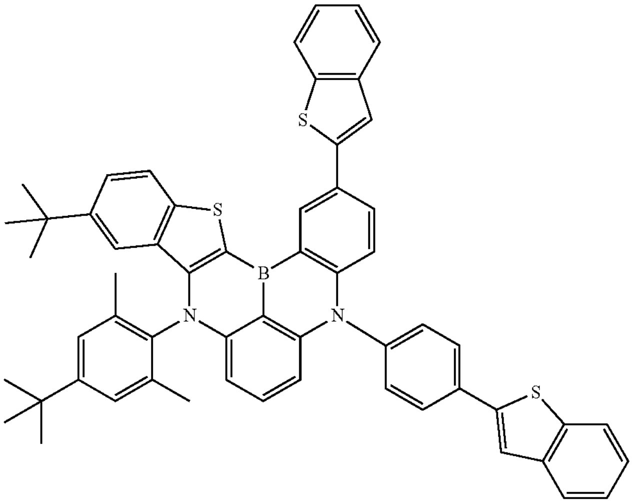
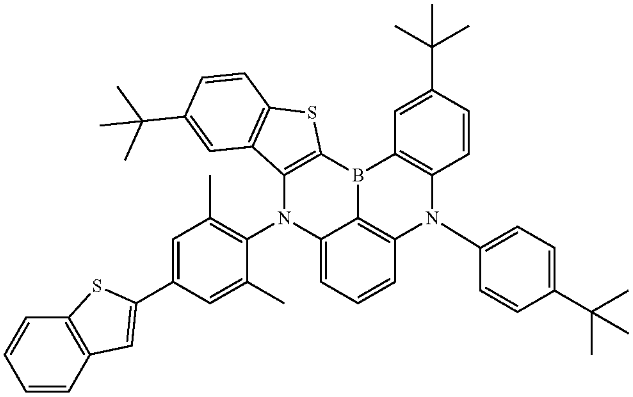

-continued
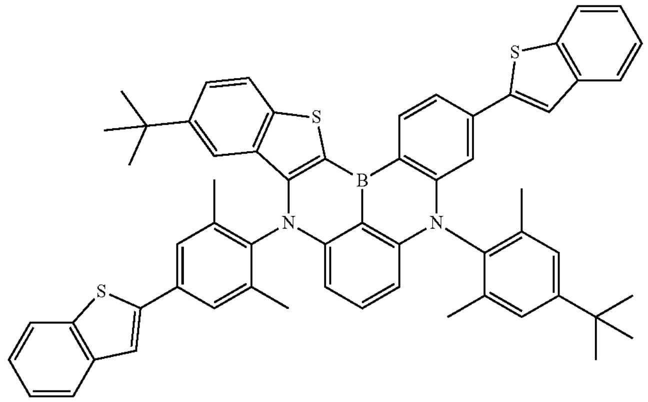
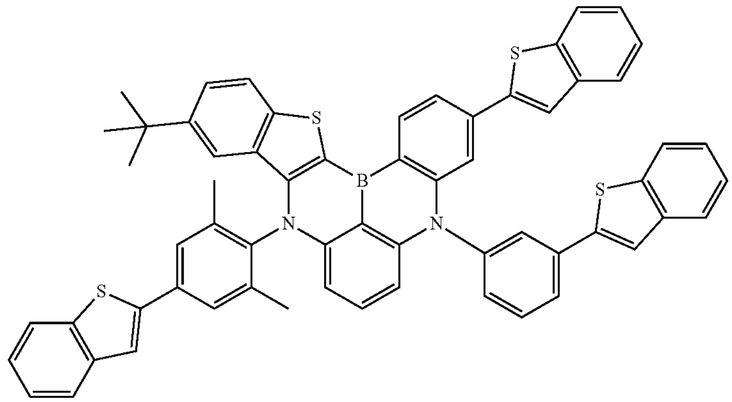
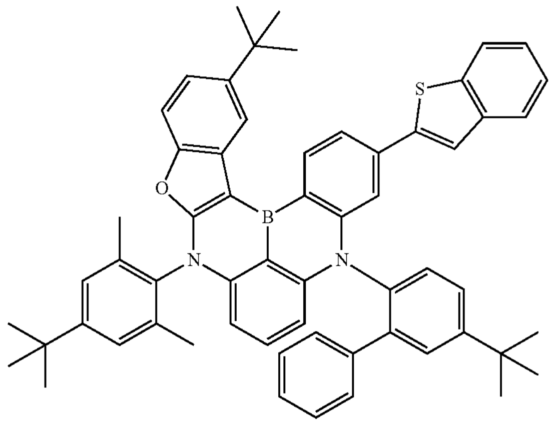
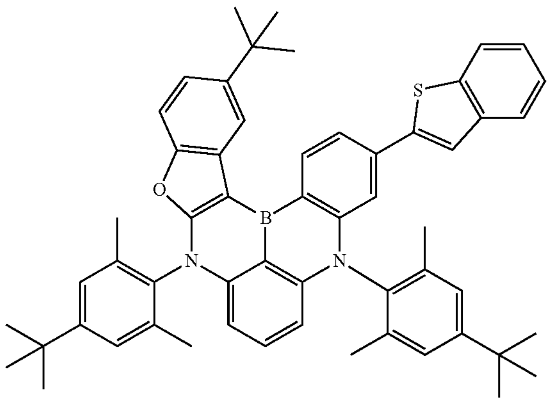
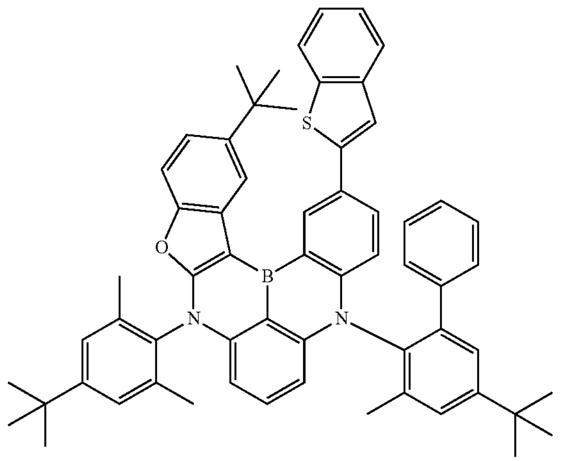
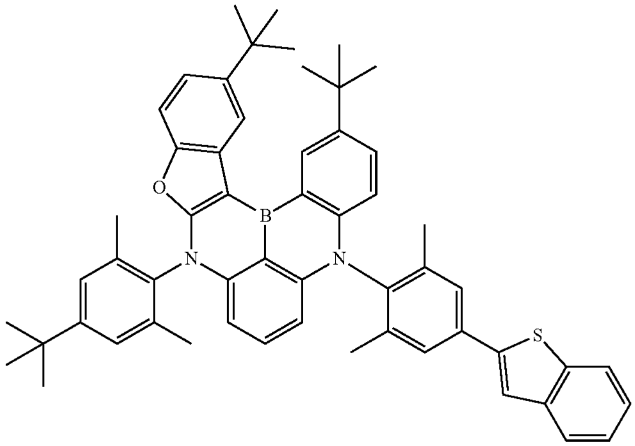

-continued
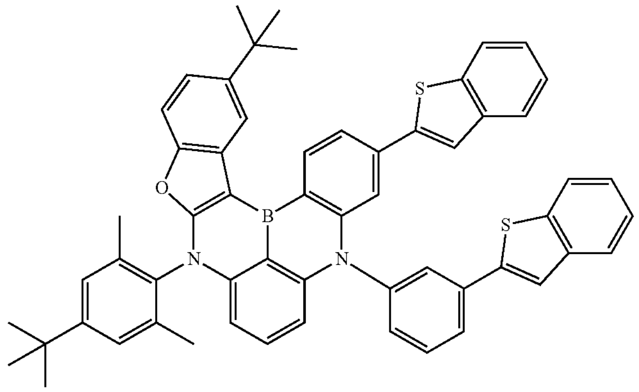
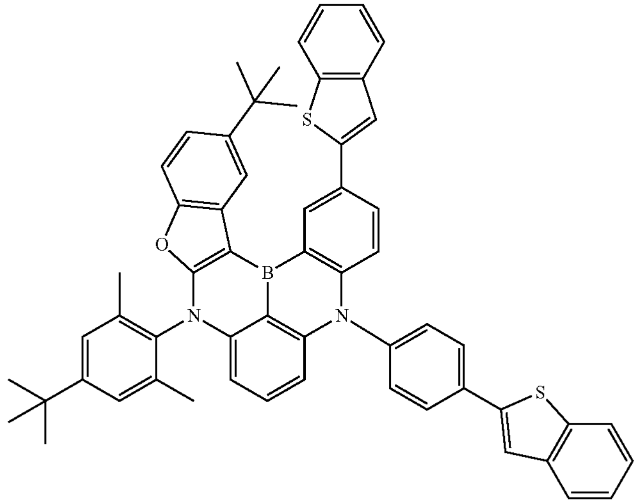
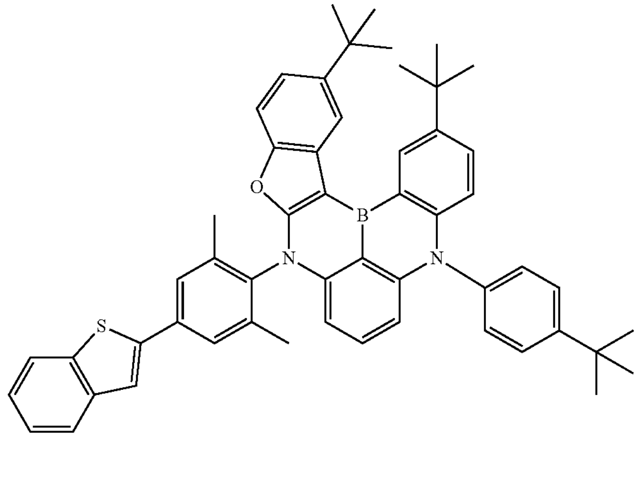

-continued
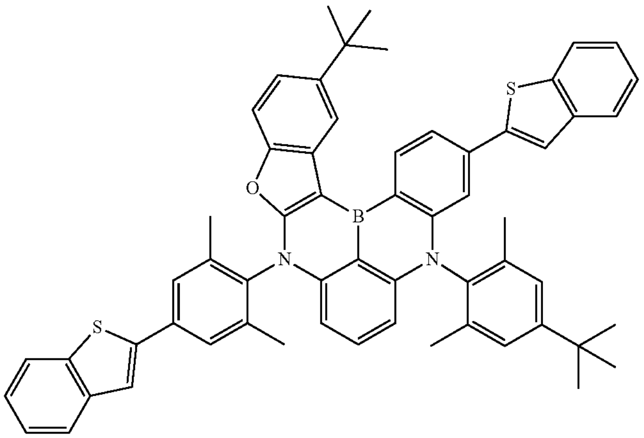
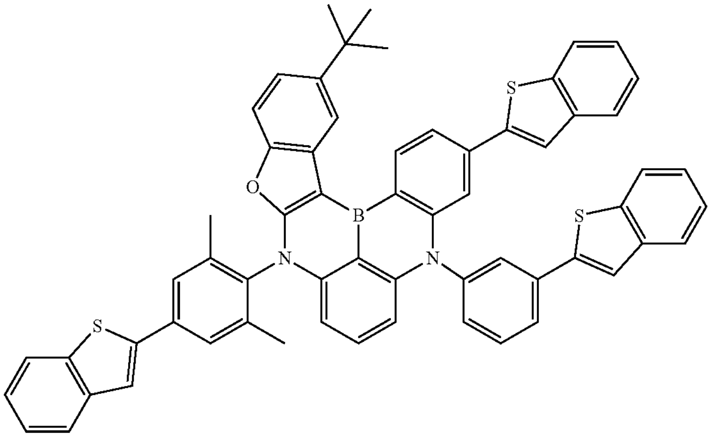
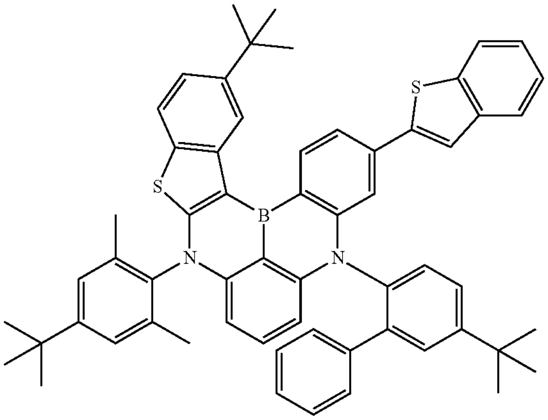
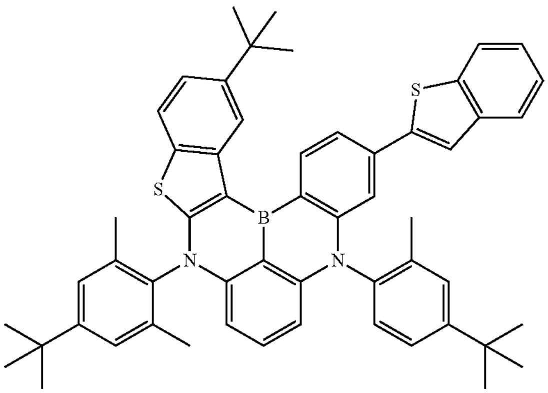

-continued
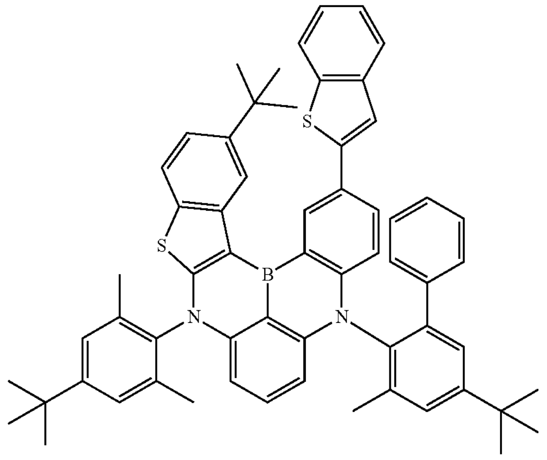
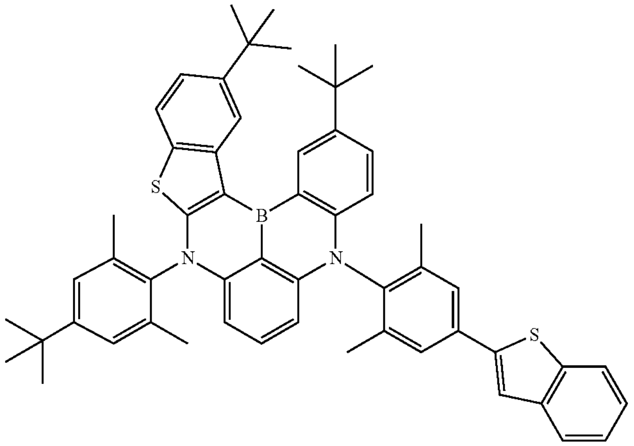
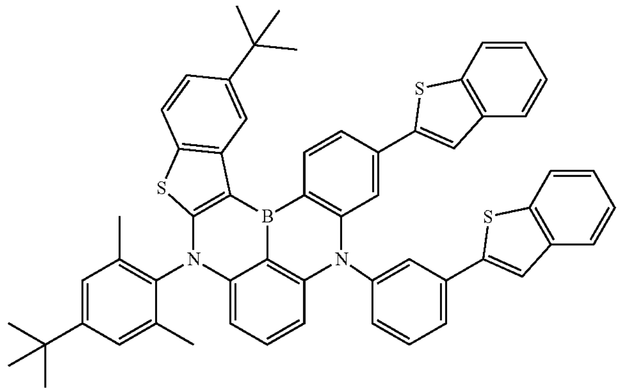
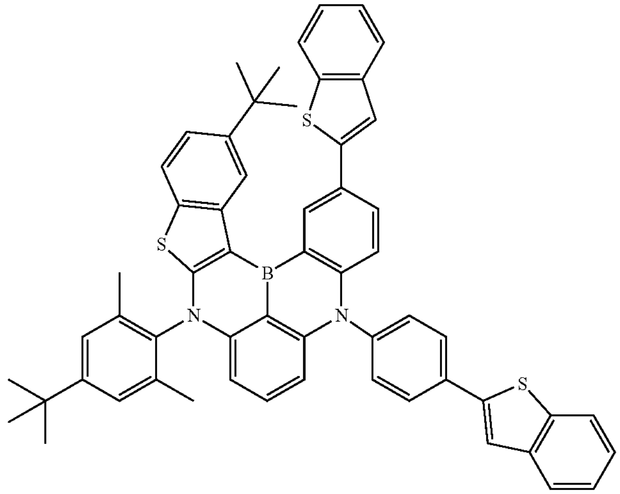

-continued
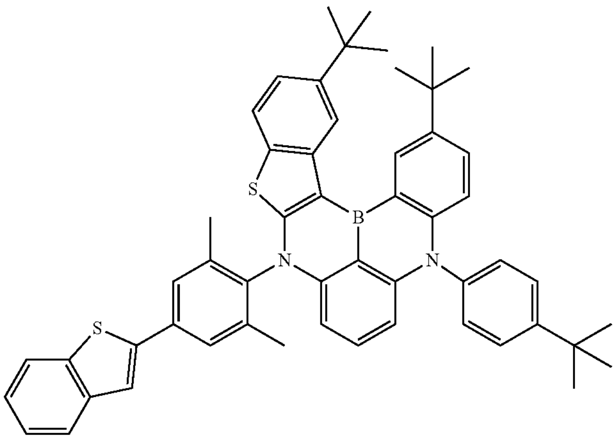
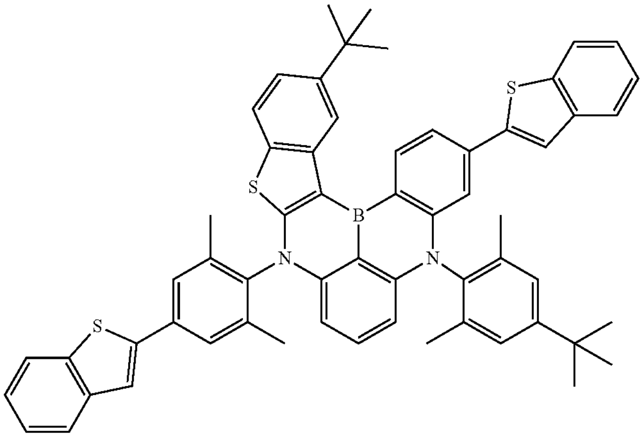
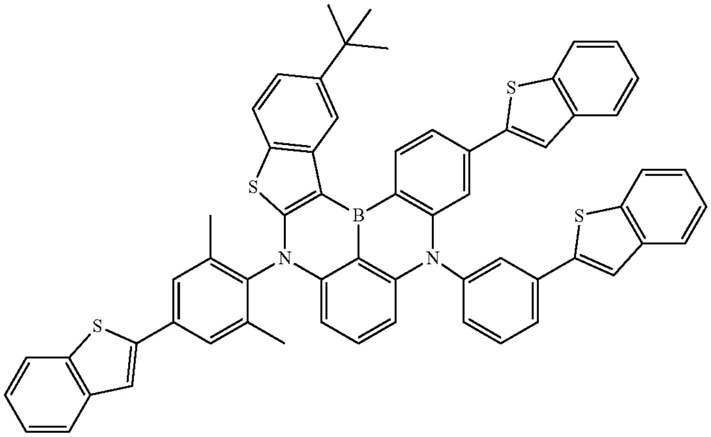
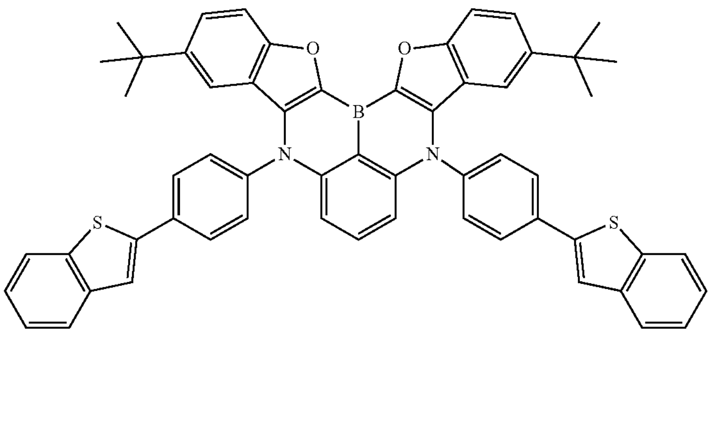

-continued
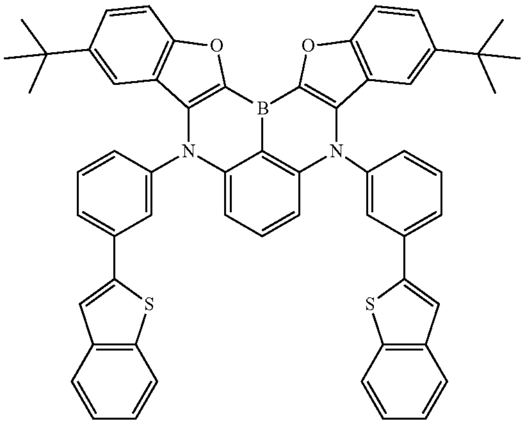
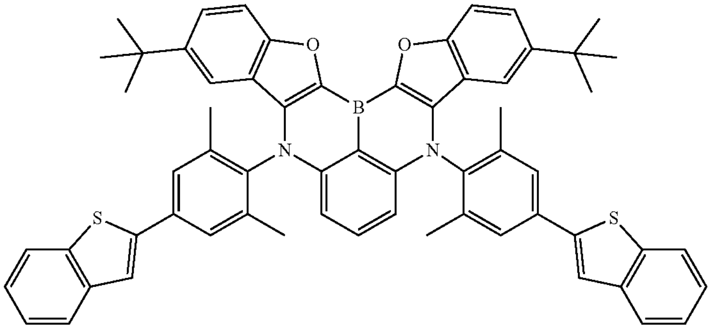
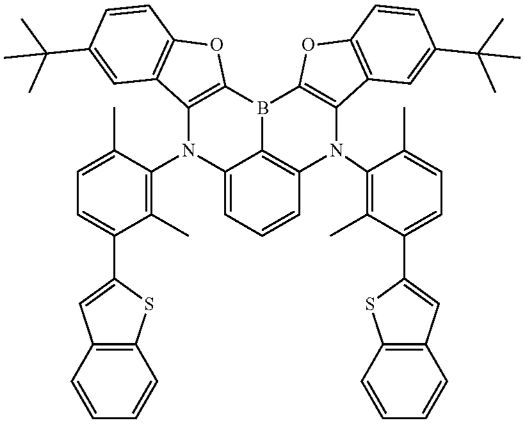
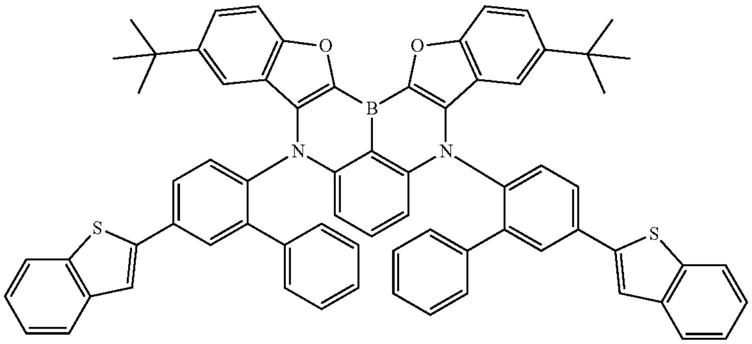

-continued
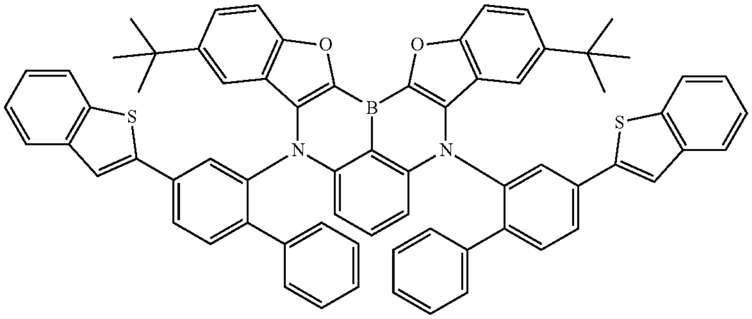
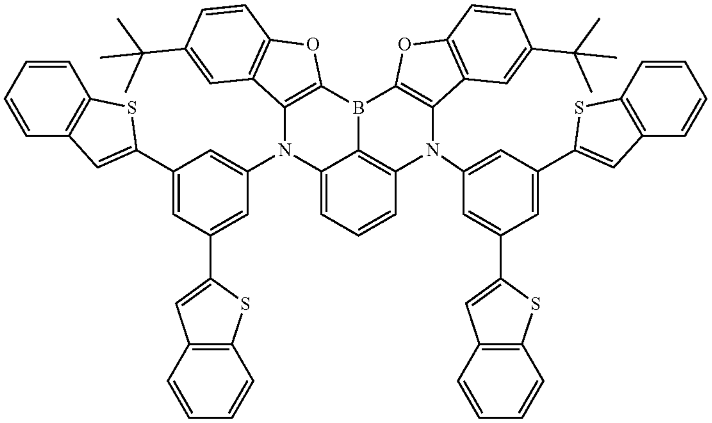
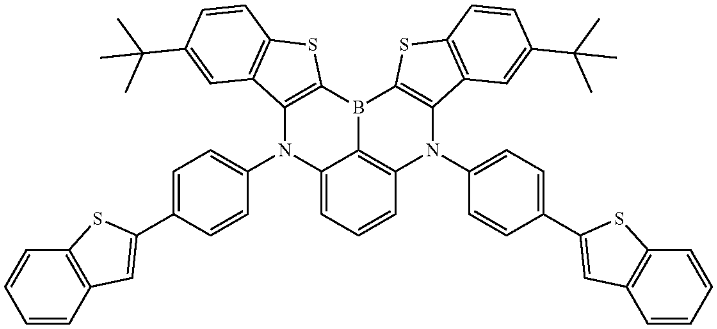
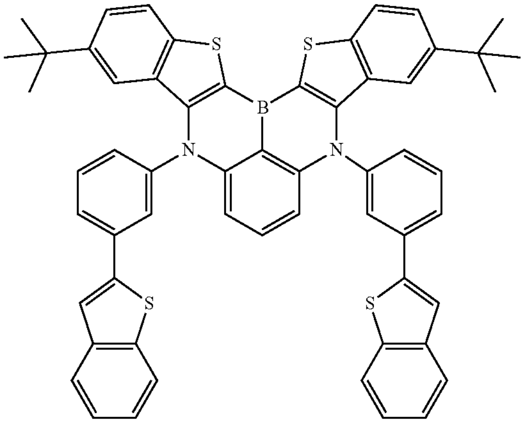

-continued
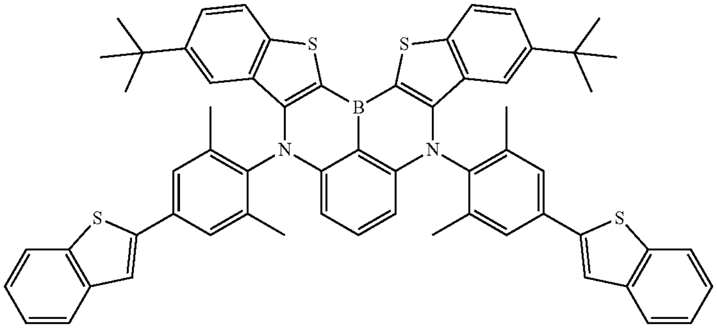
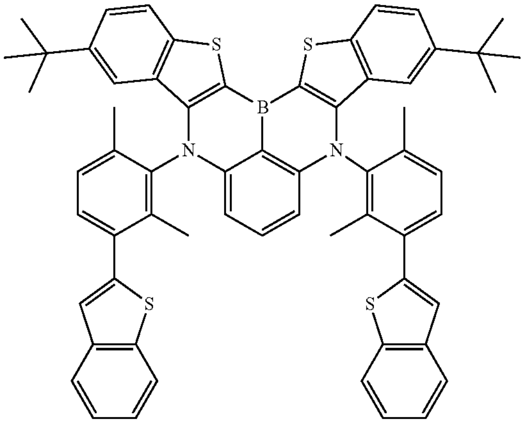
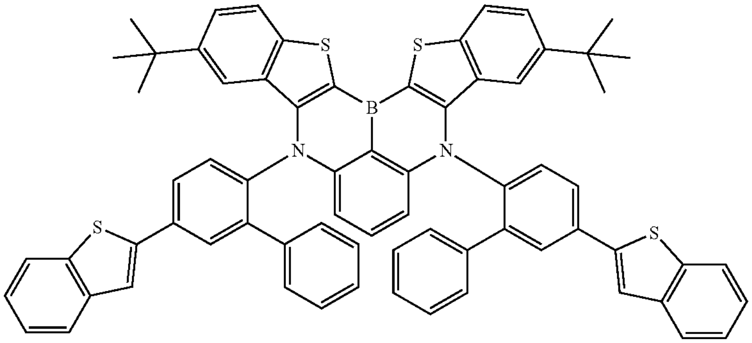
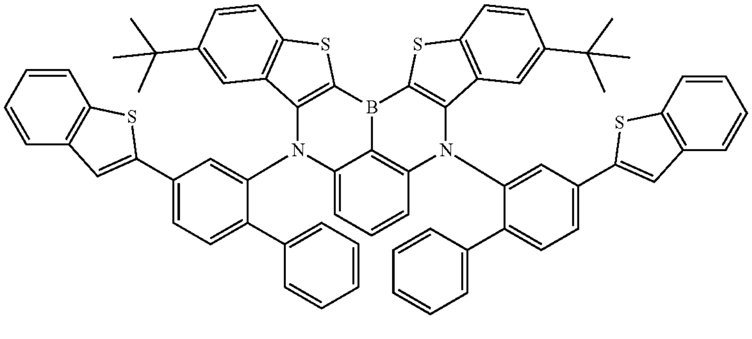

-continued
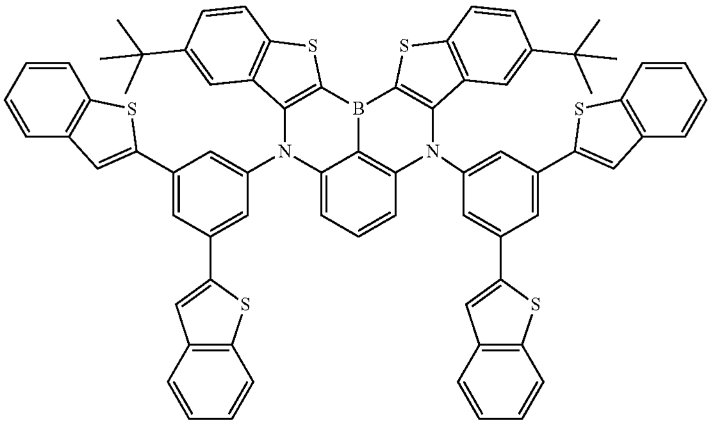
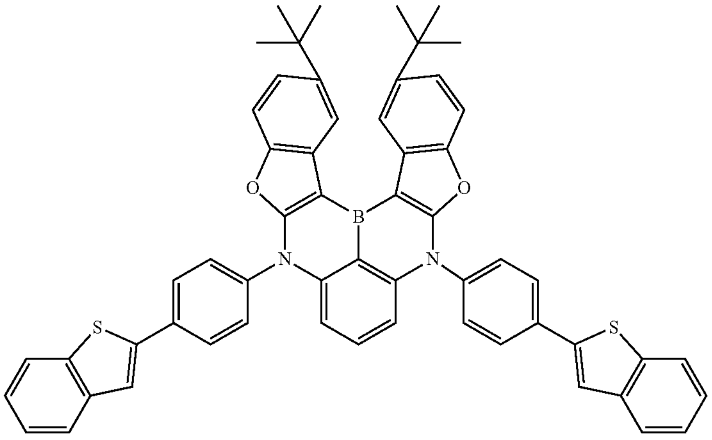
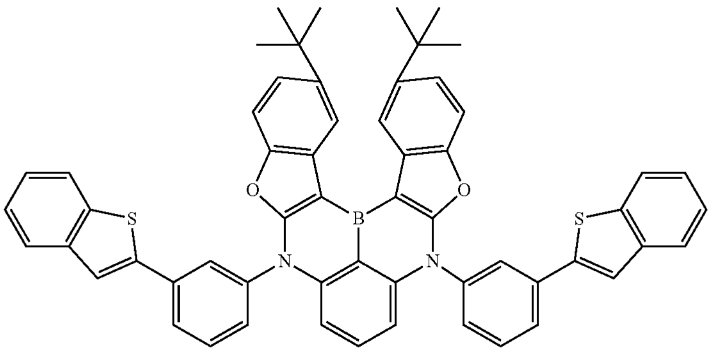

-continued
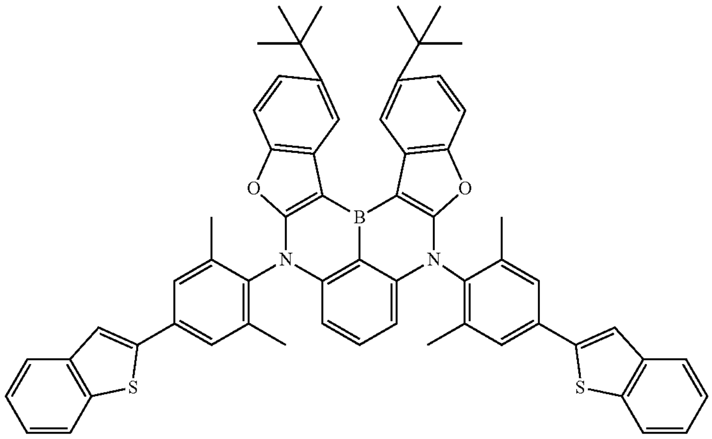
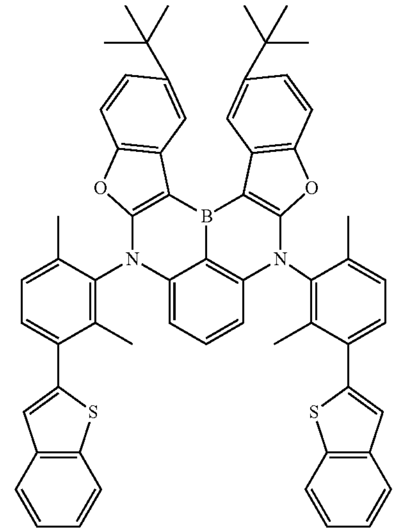
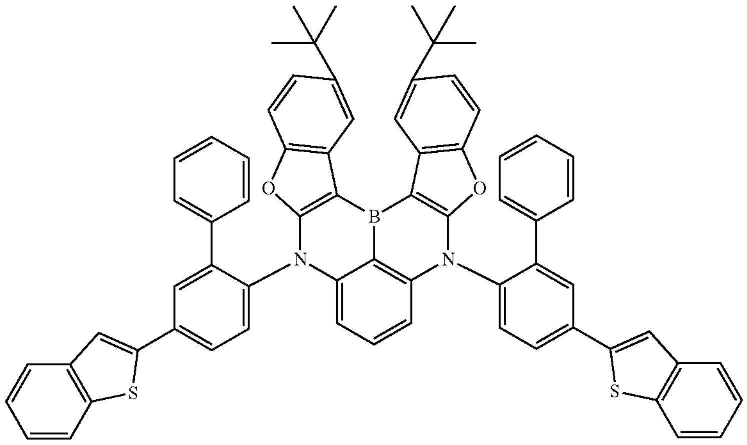
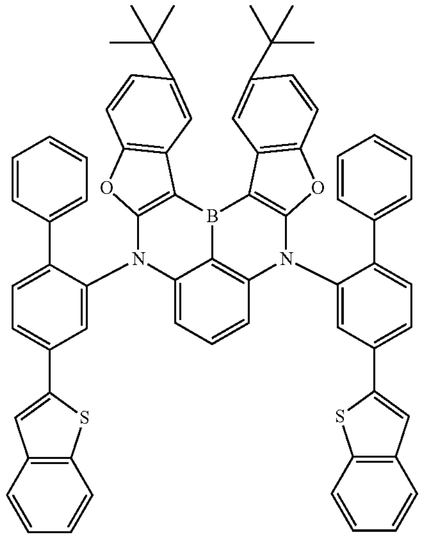
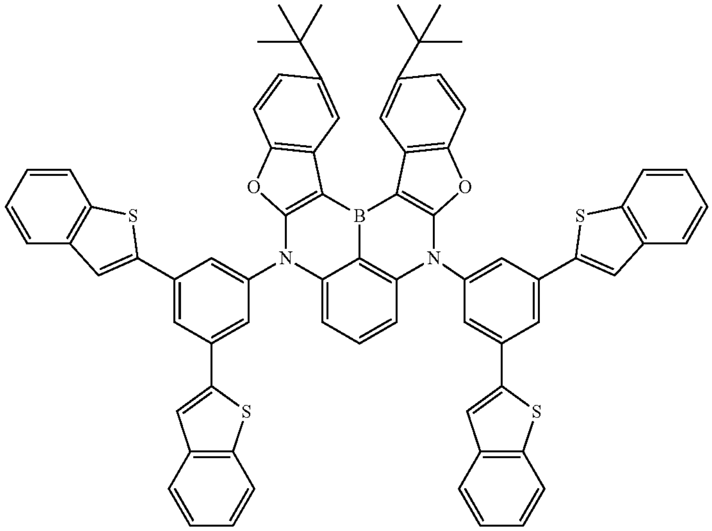

-continued
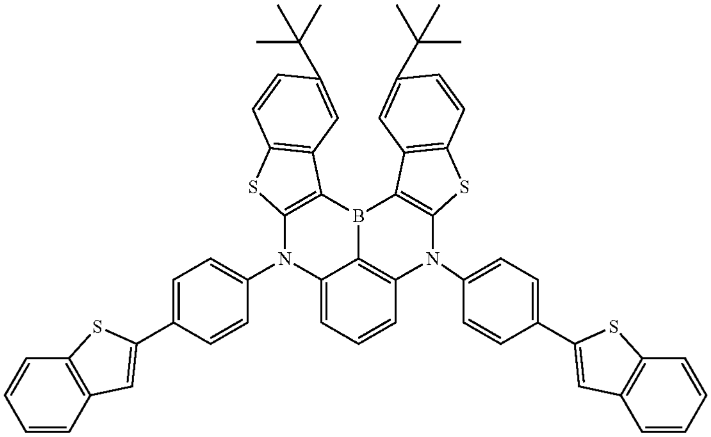
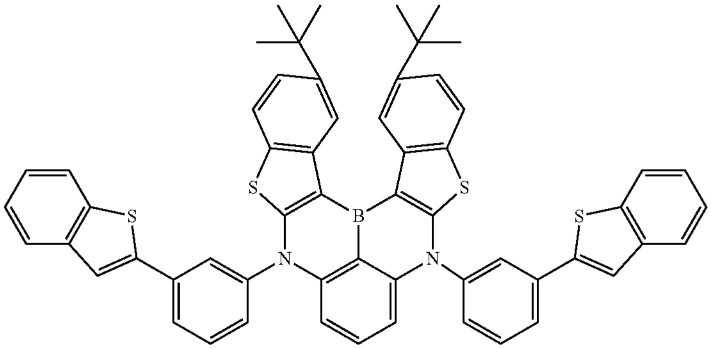
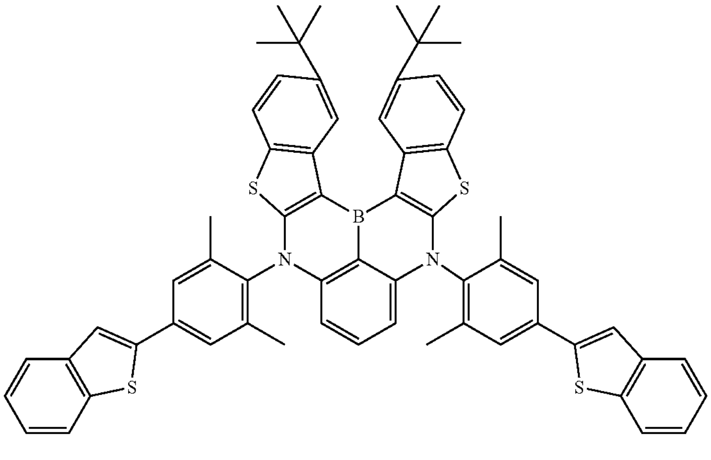
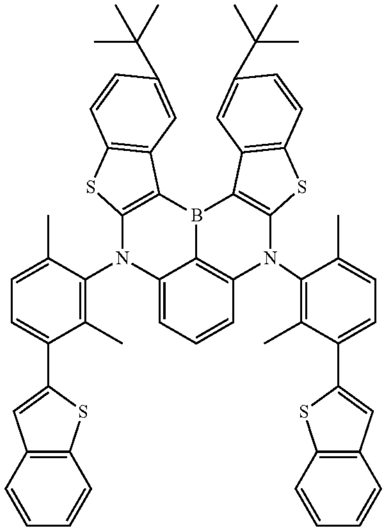

-continued
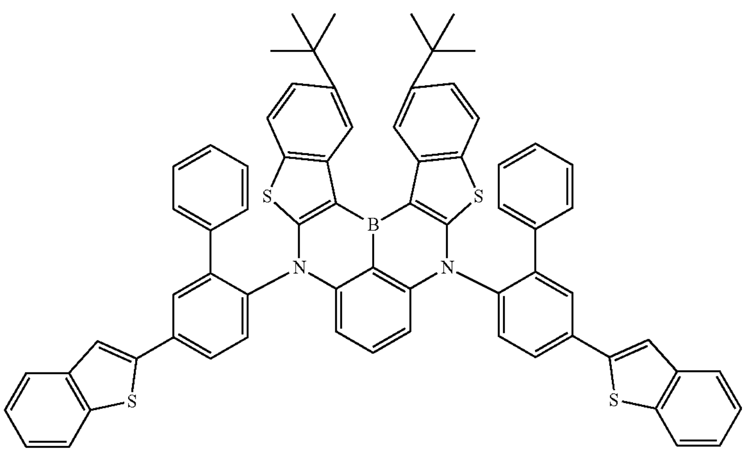
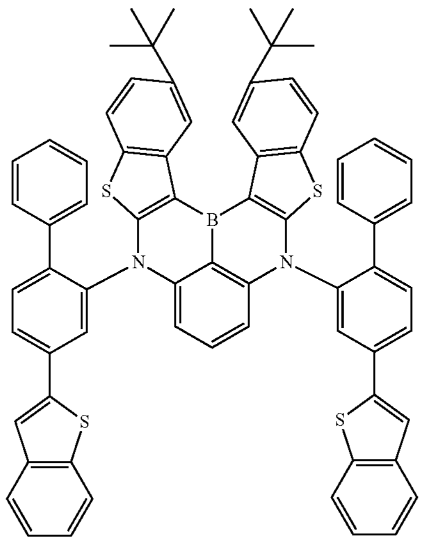
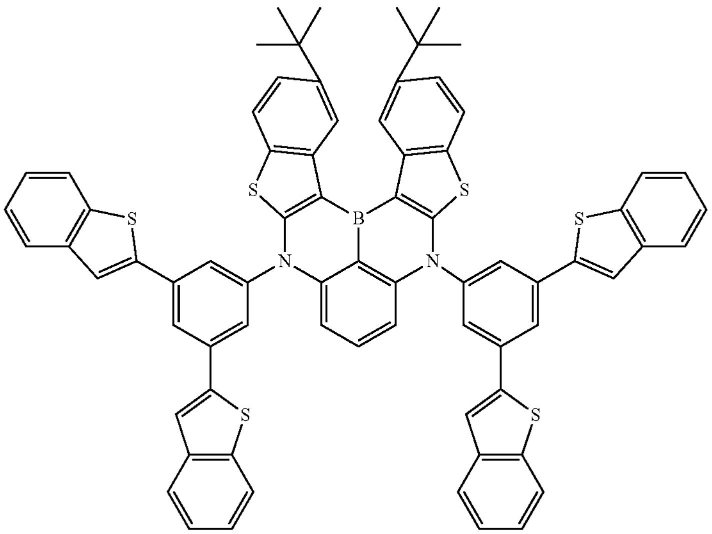
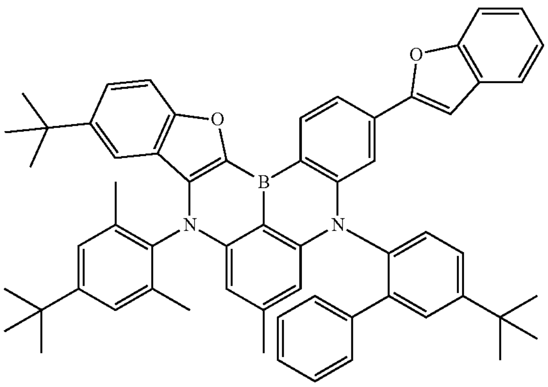
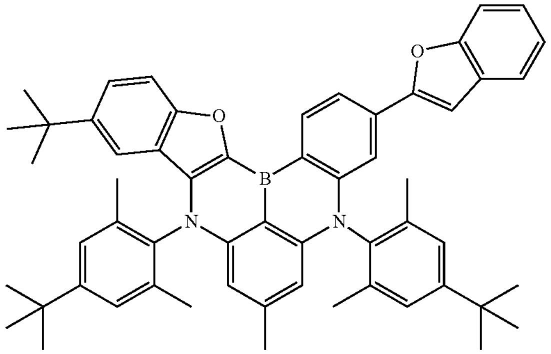

-continued
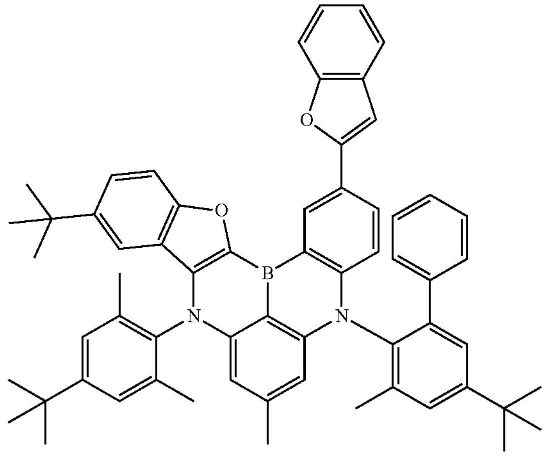
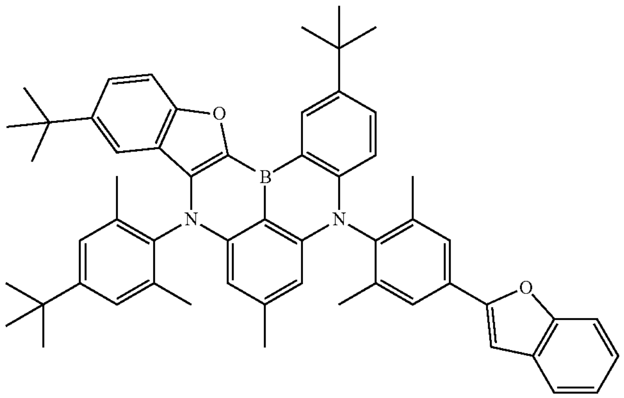
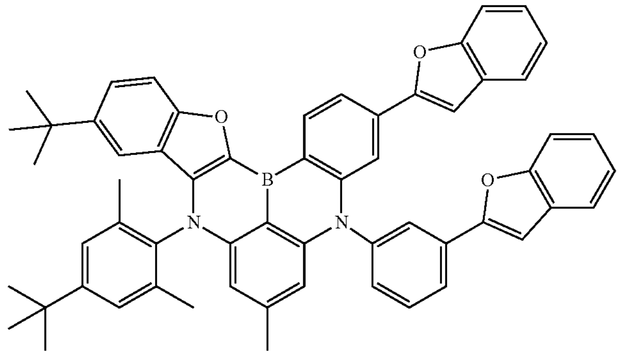
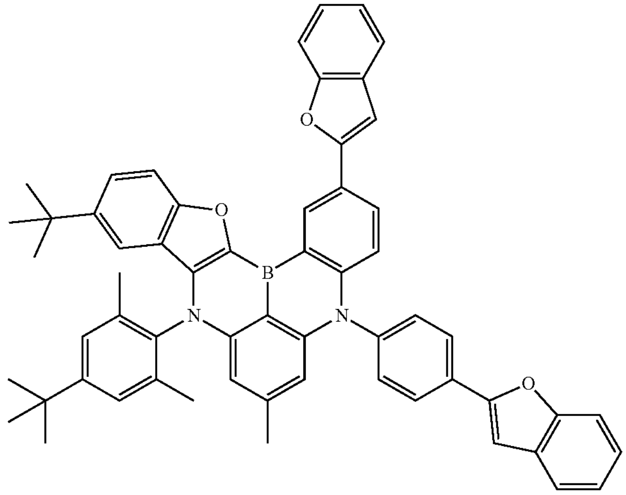
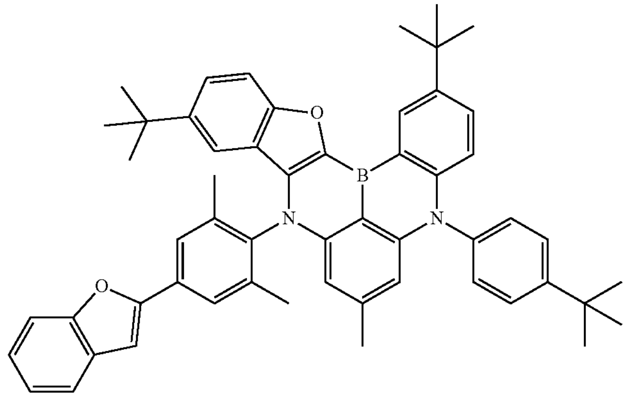

-continued
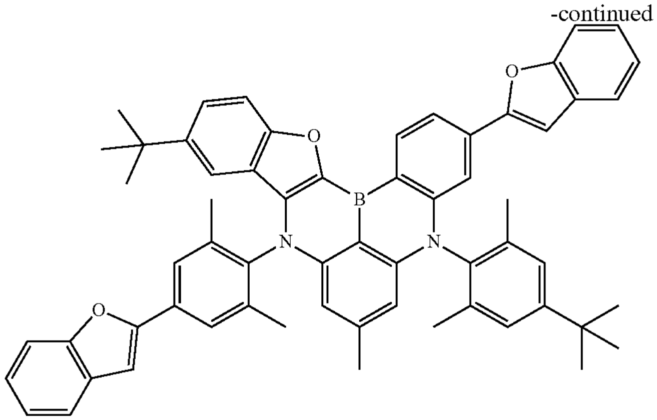
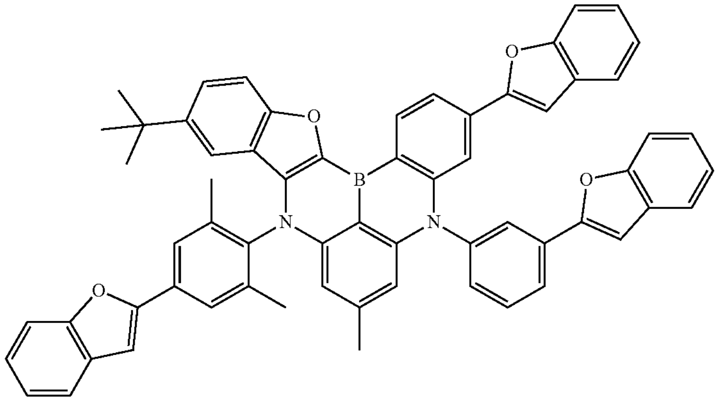
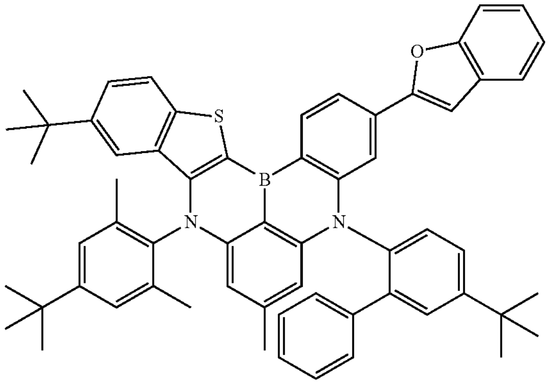
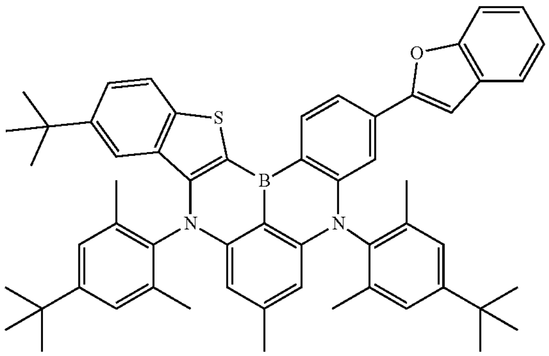
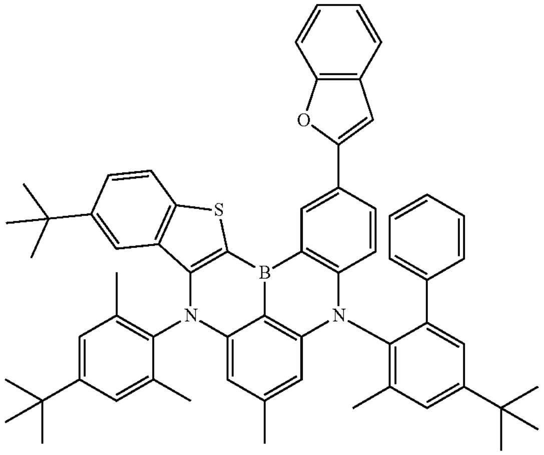
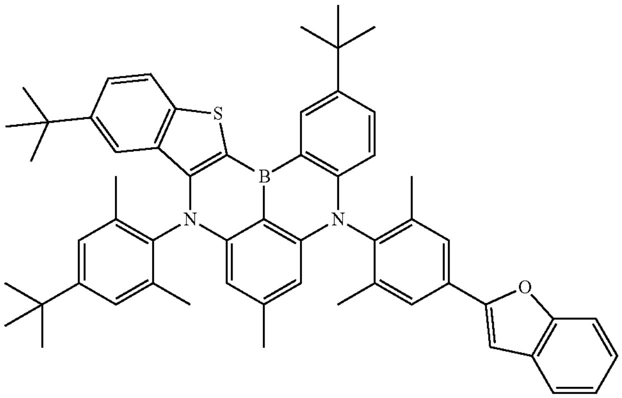

-continued
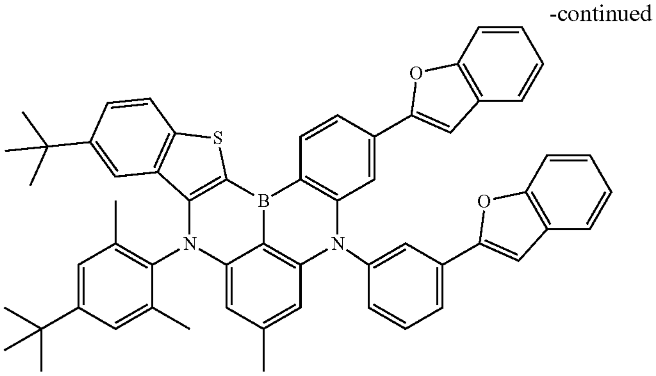
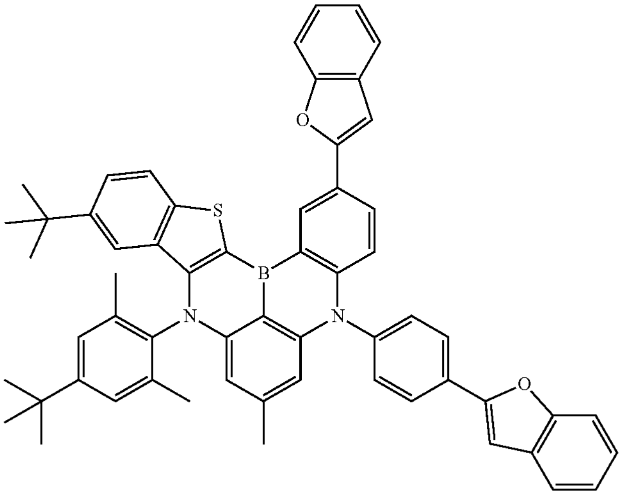
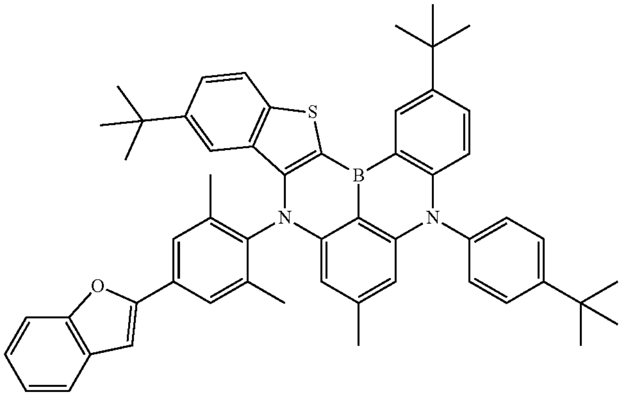
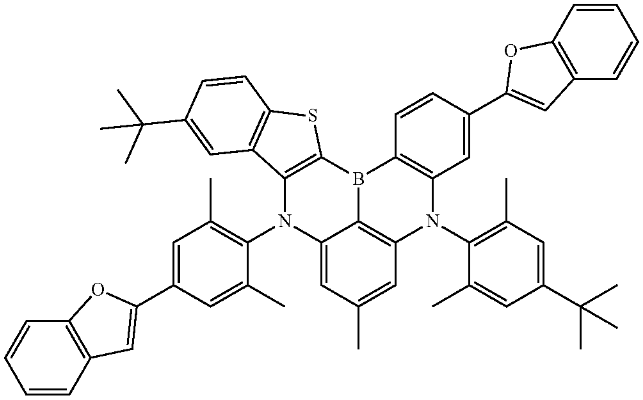

-continued
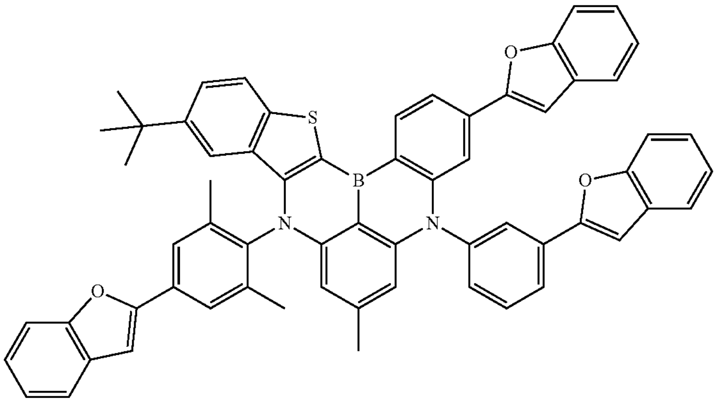
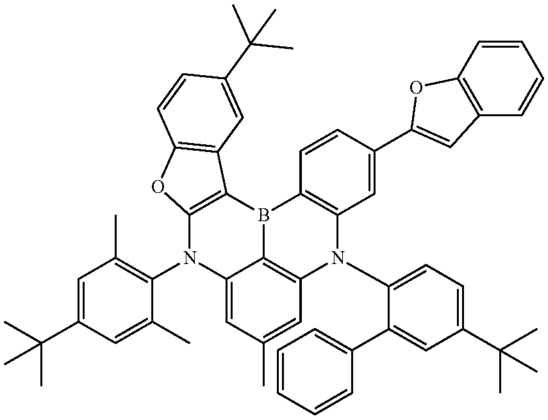
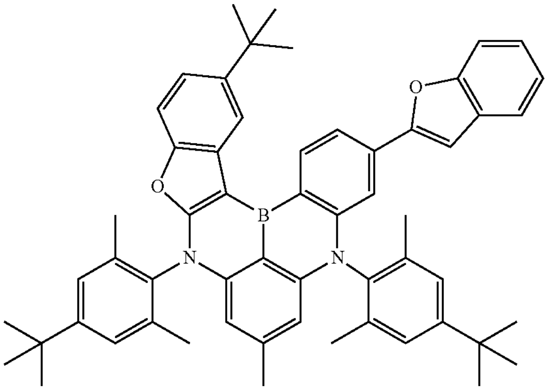
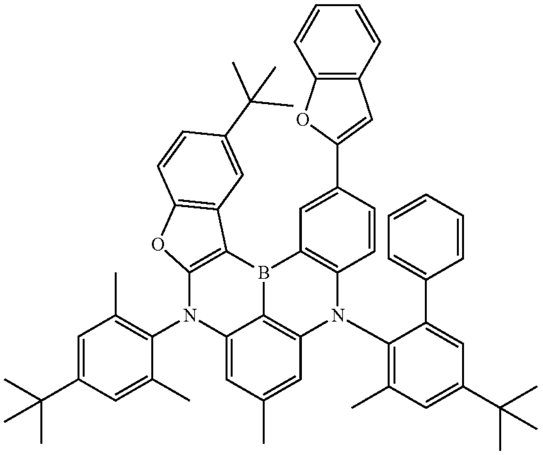
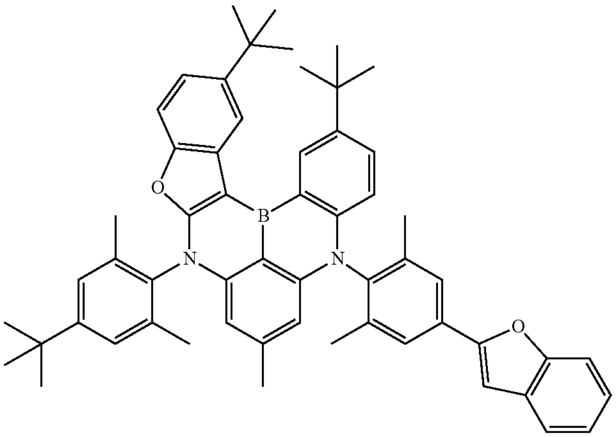
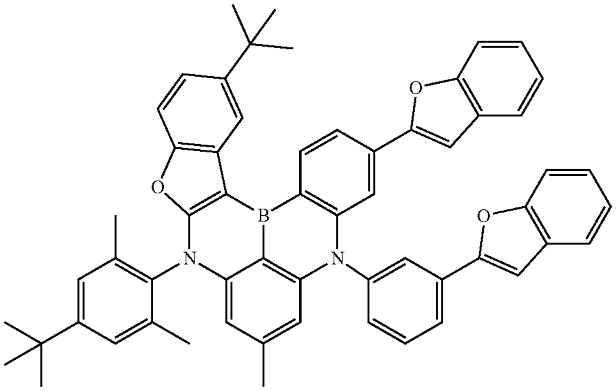

-continued
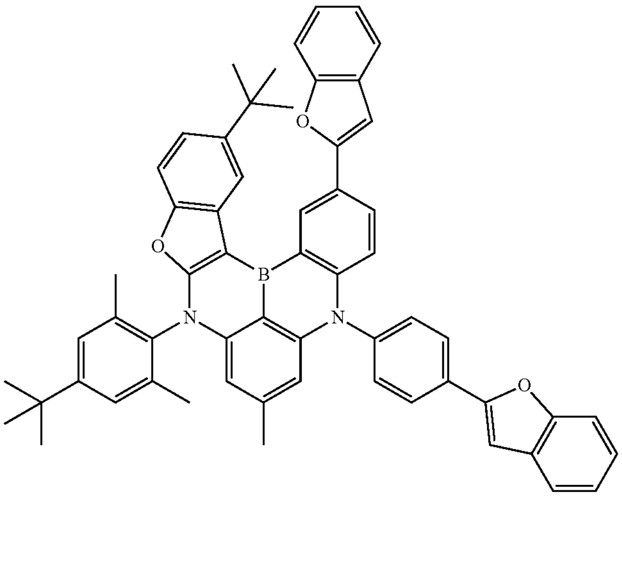
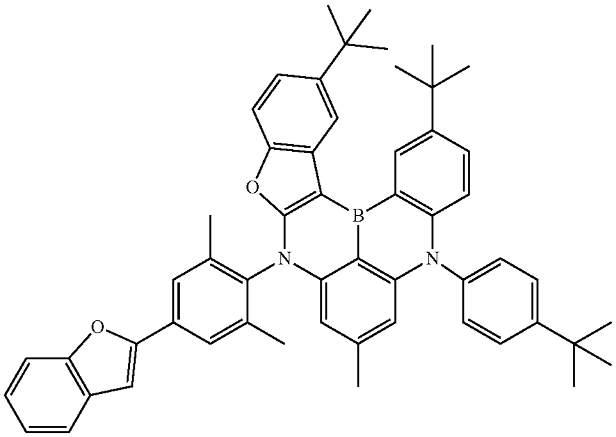
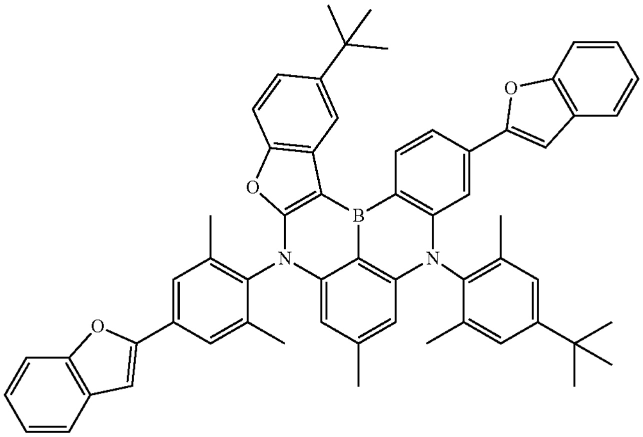

-continued
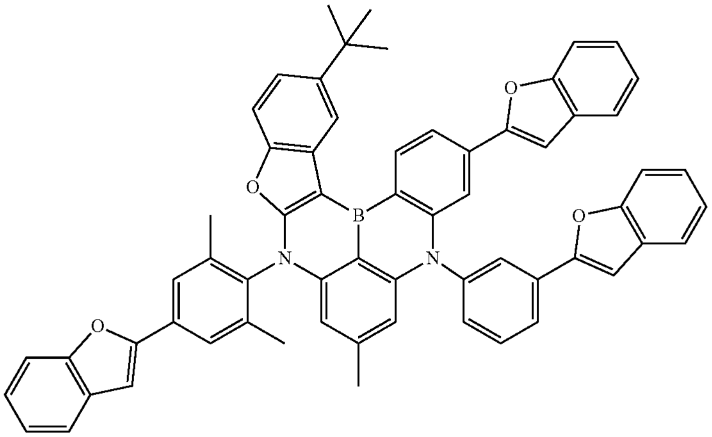
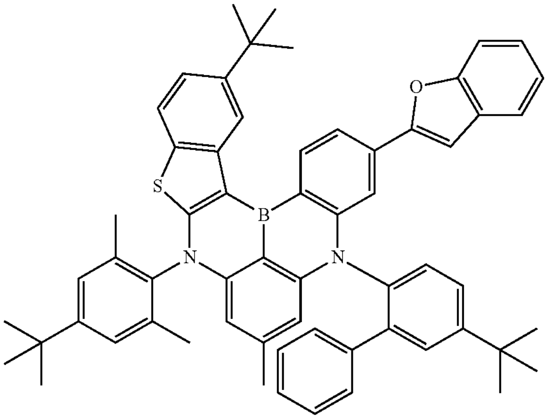
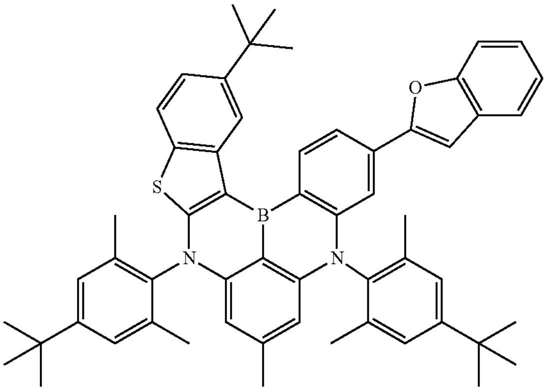
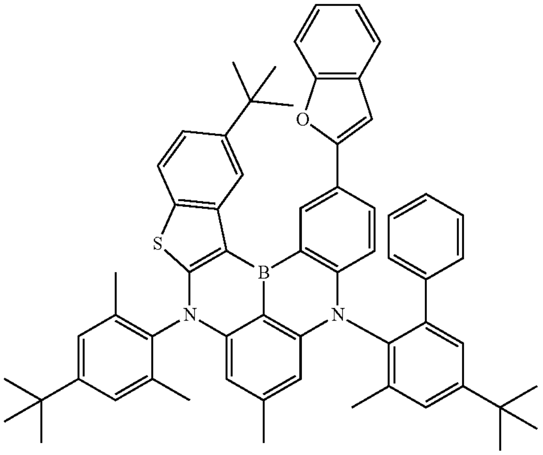
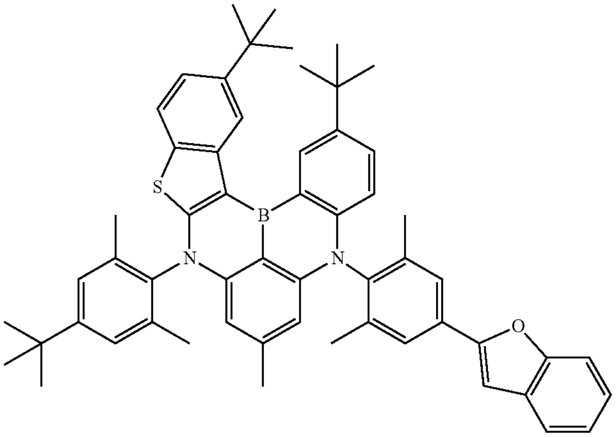
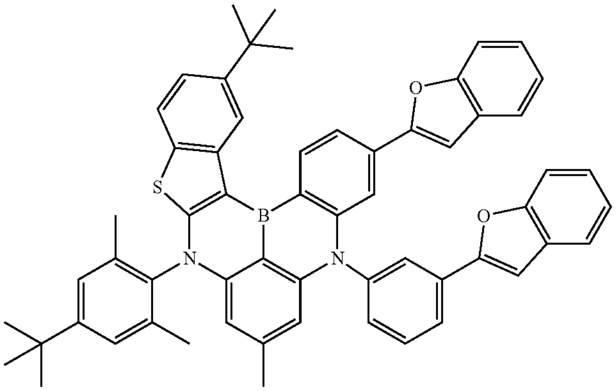

-continued
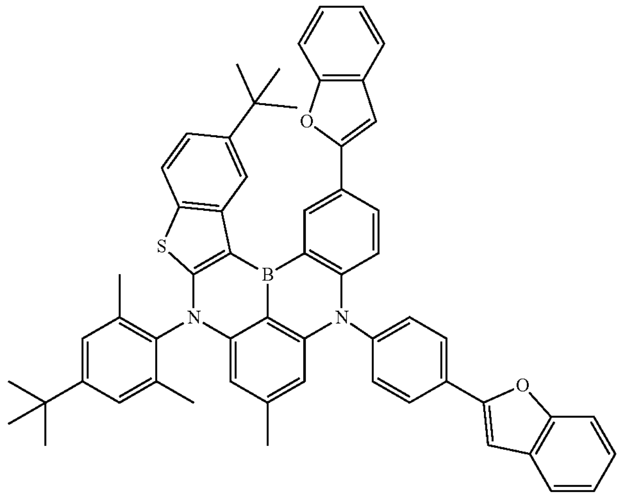
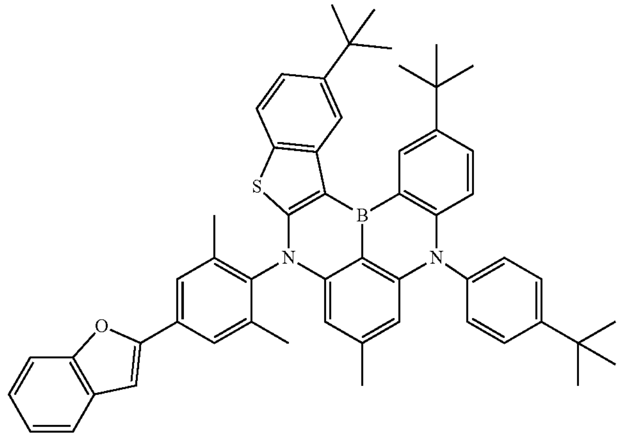
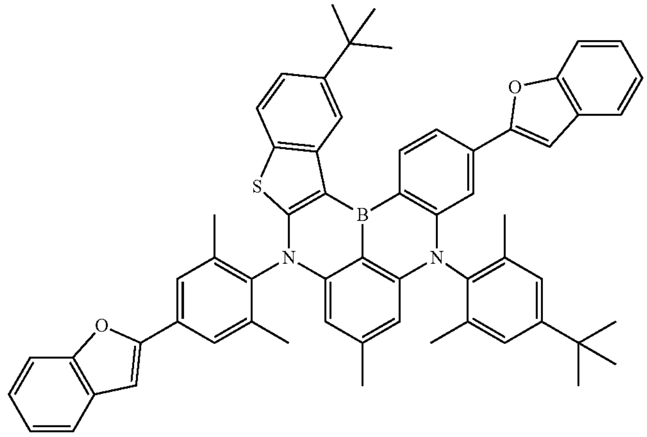

-continued
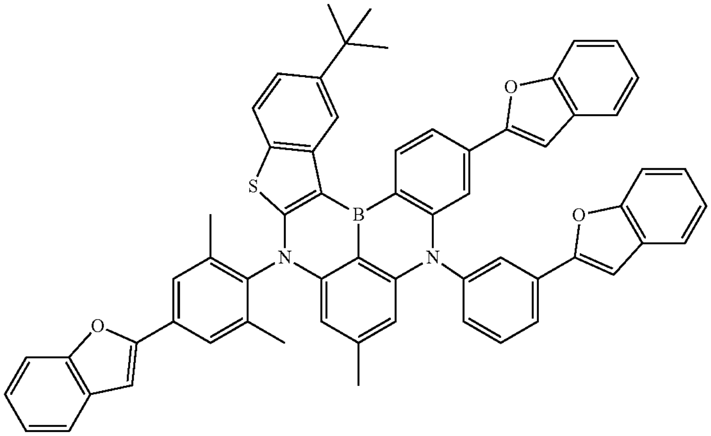
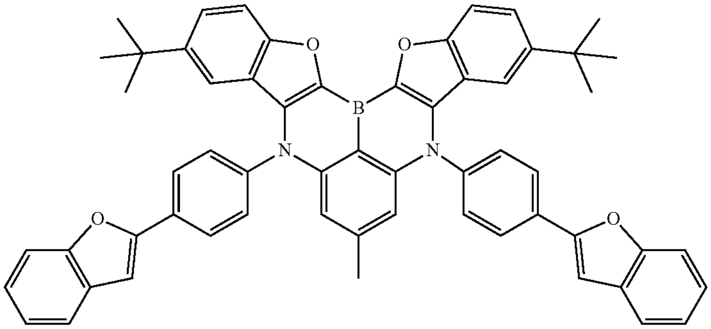
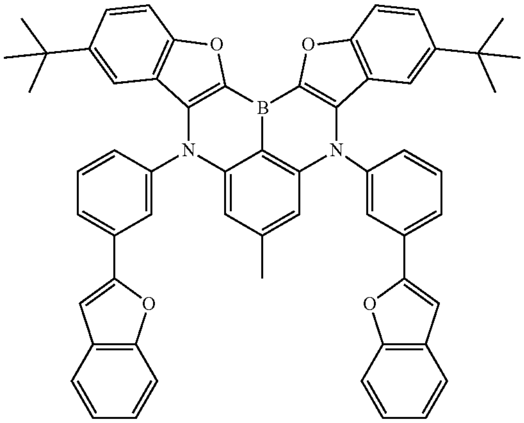
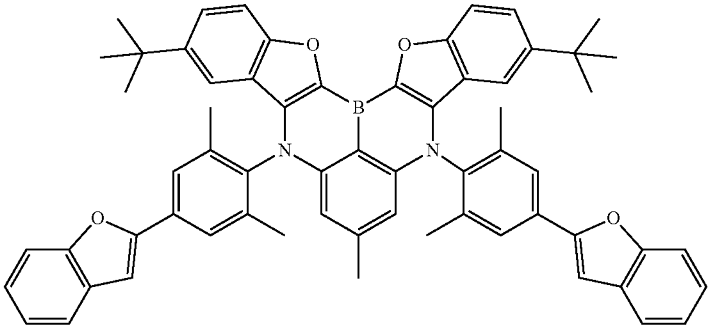

-continued
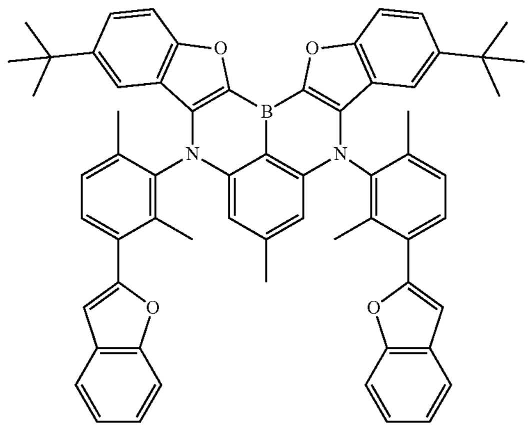
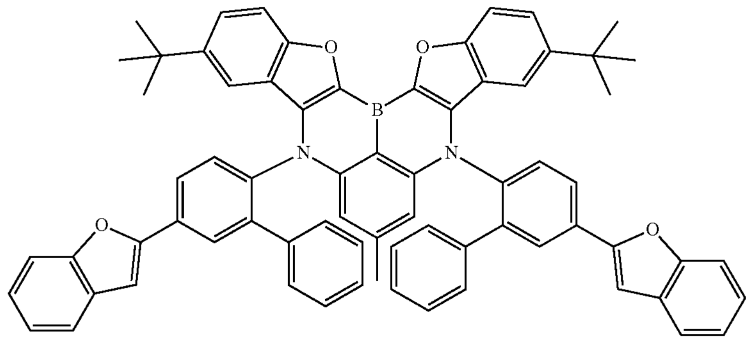
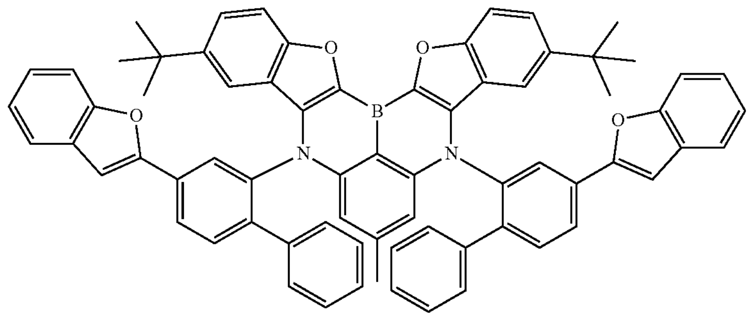
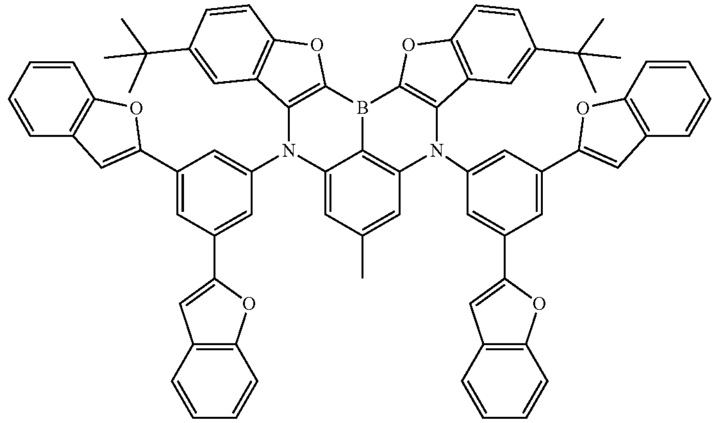

-continued
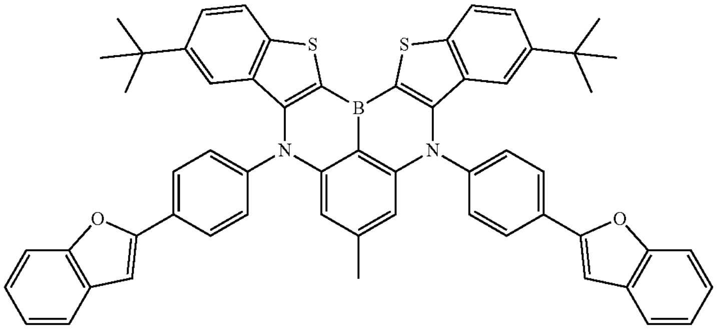
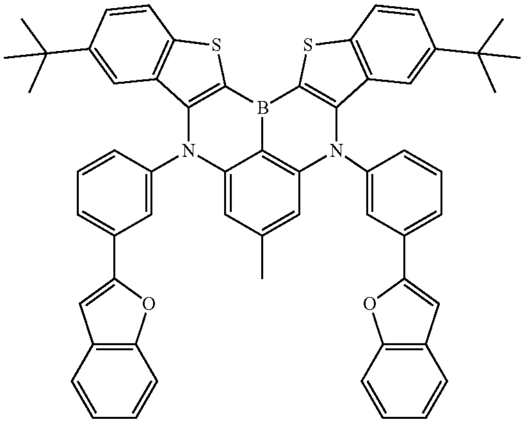
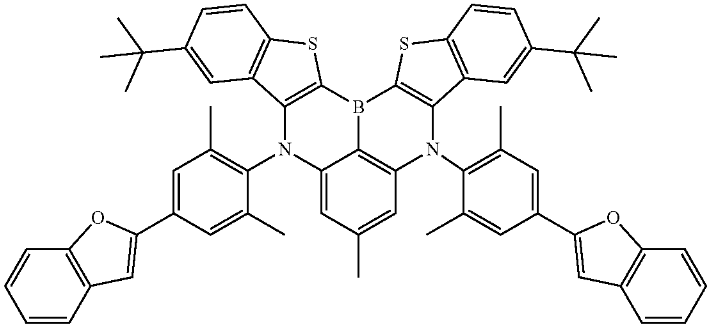
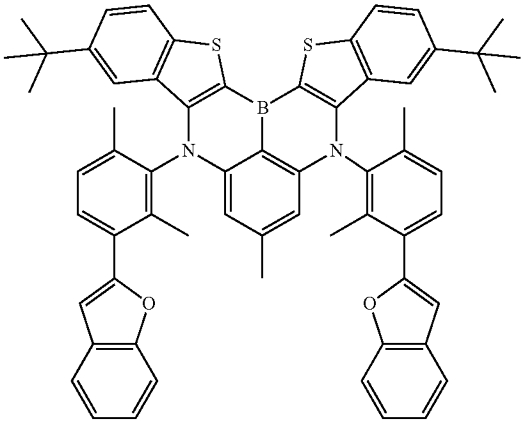

-continued
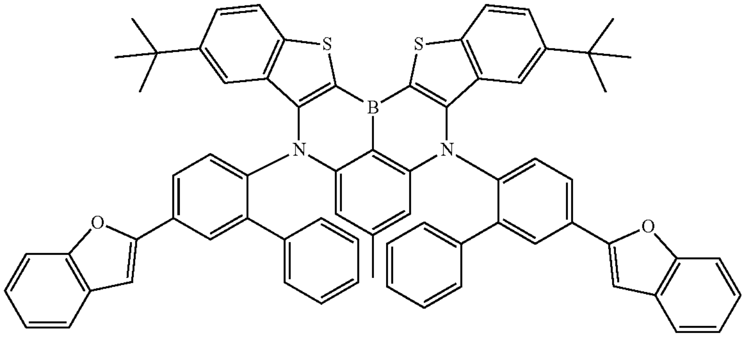
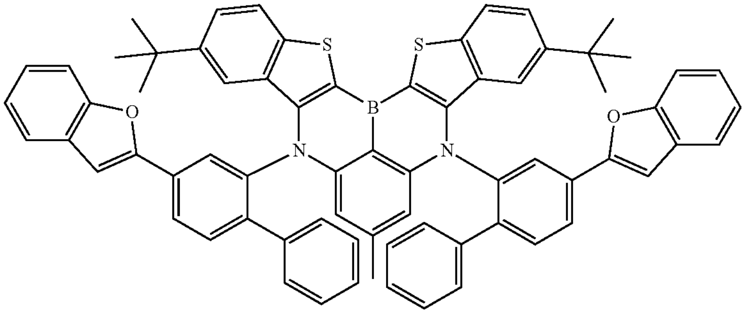
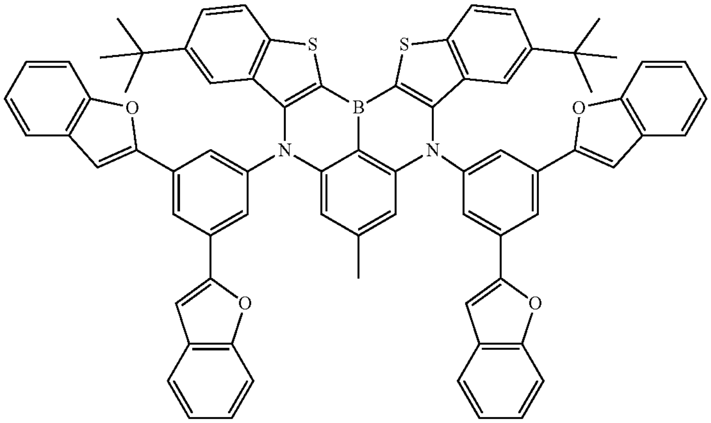
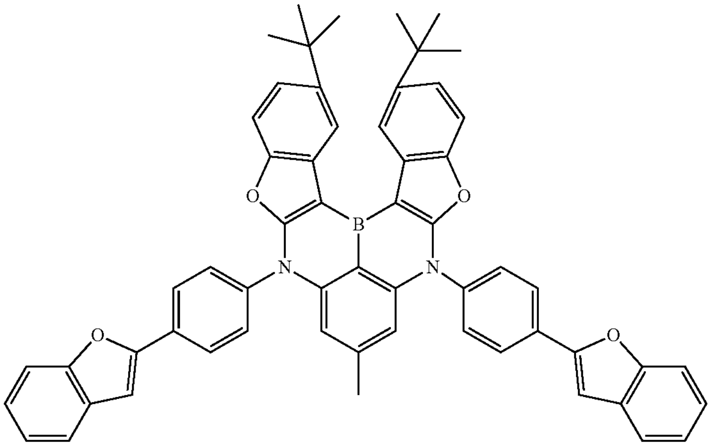

-continued
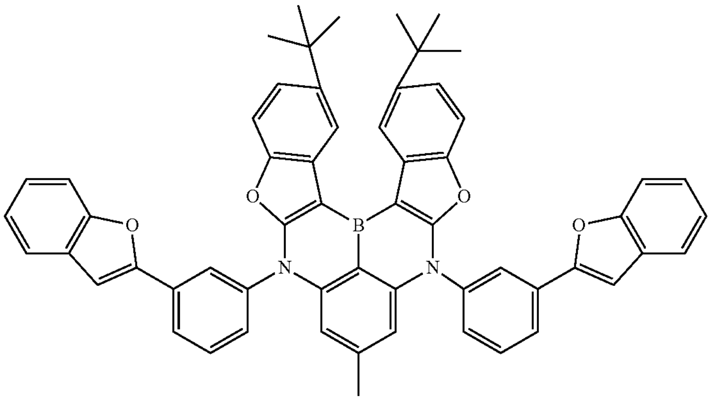
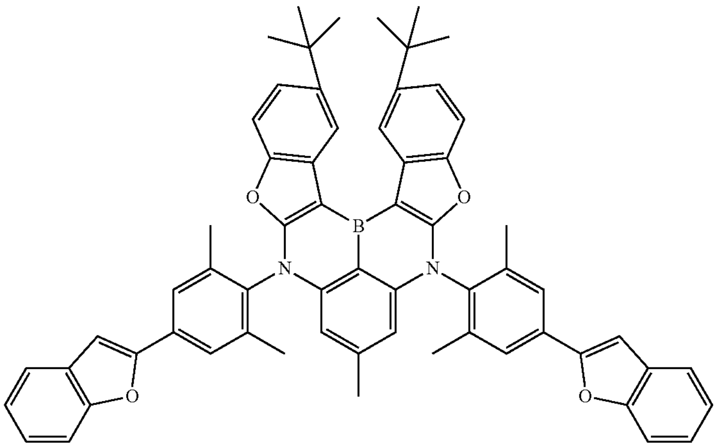
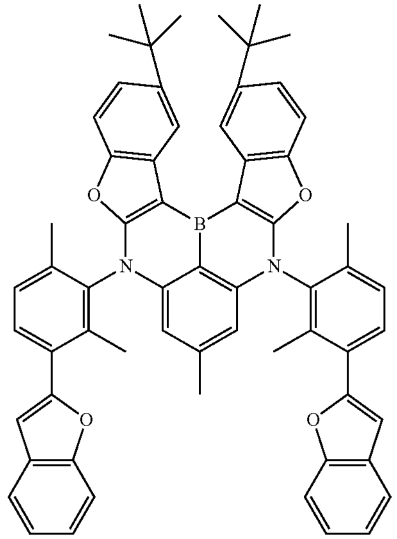
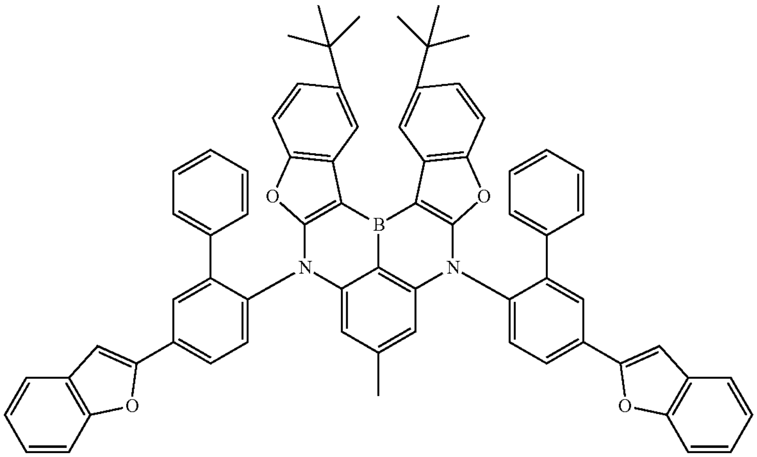
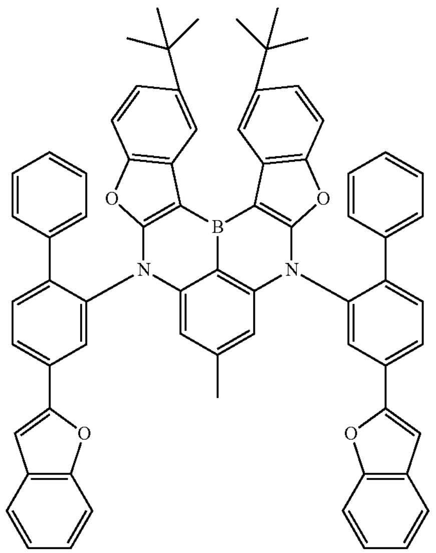

-continued
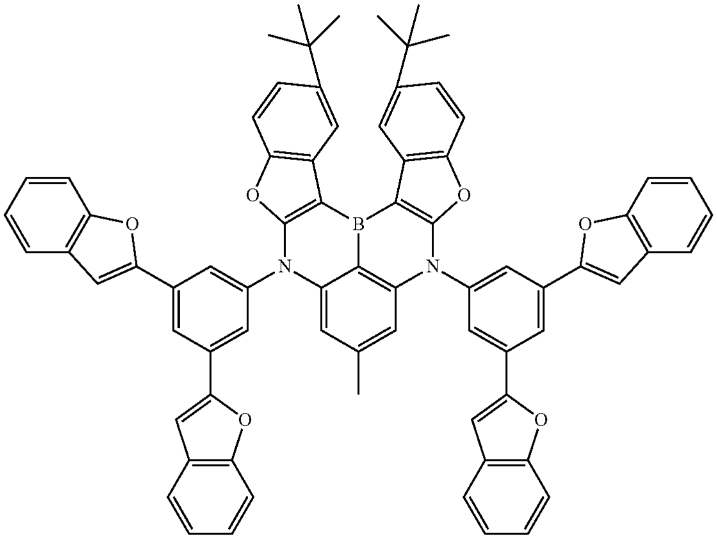
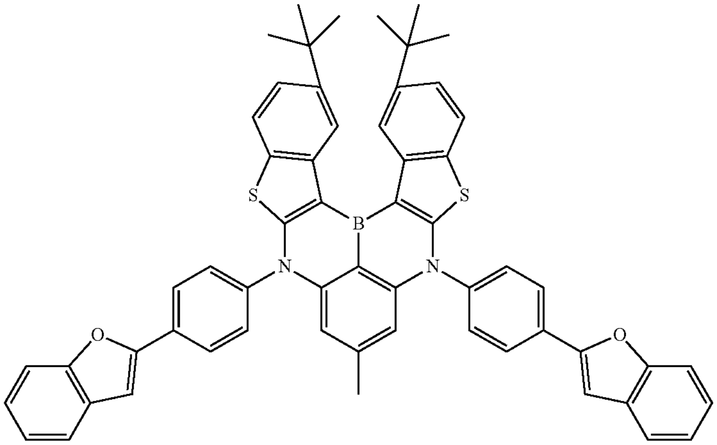
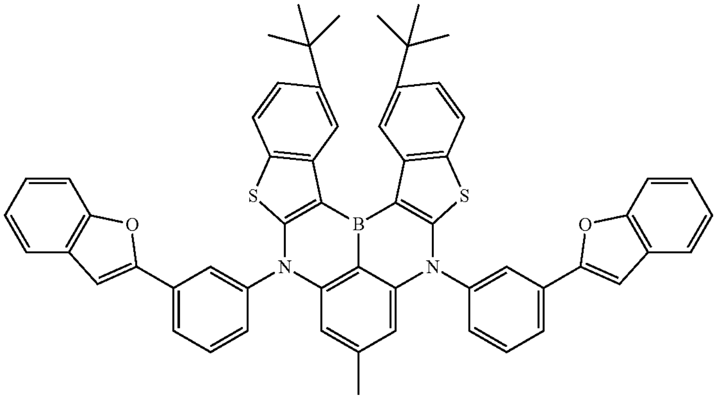

-continued
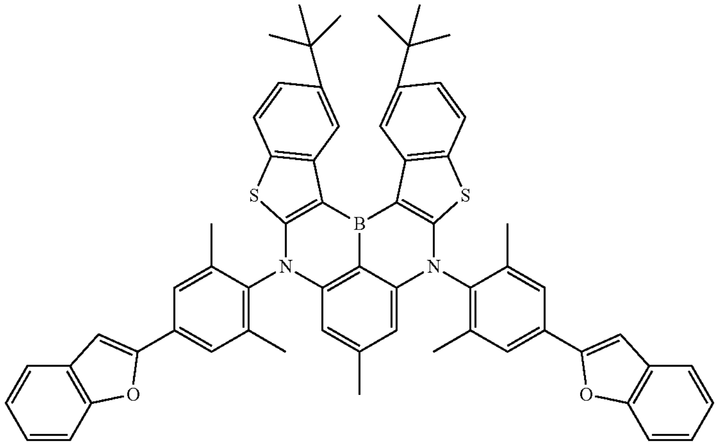
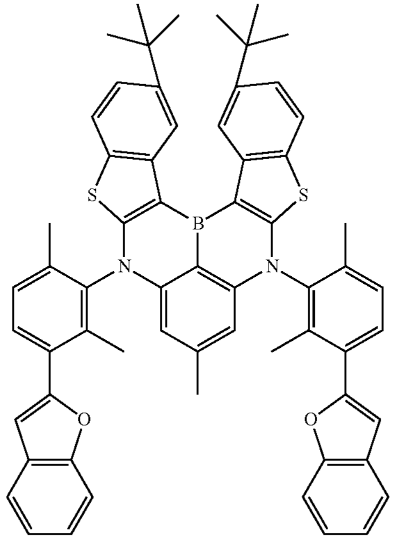
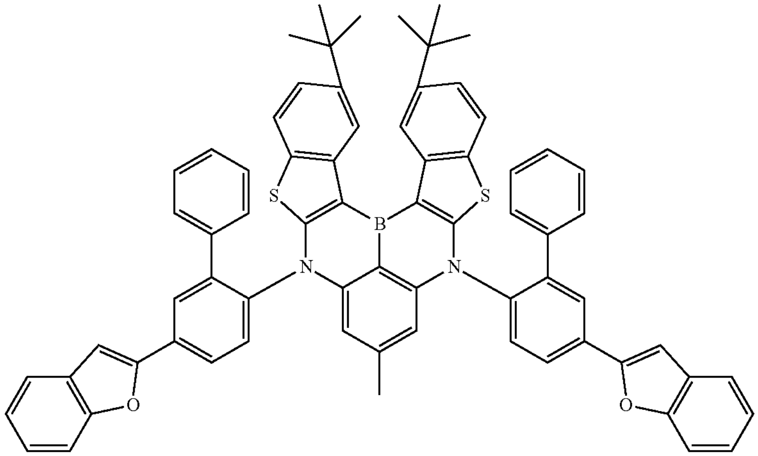
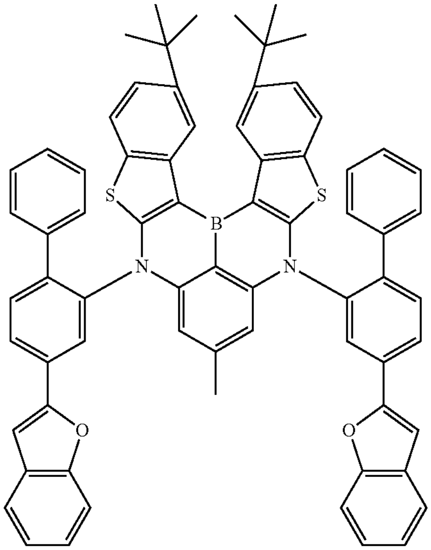
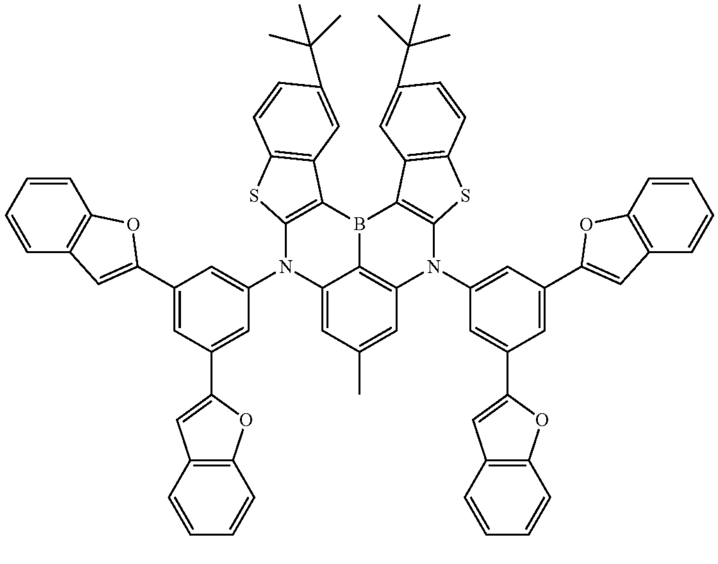

-continued
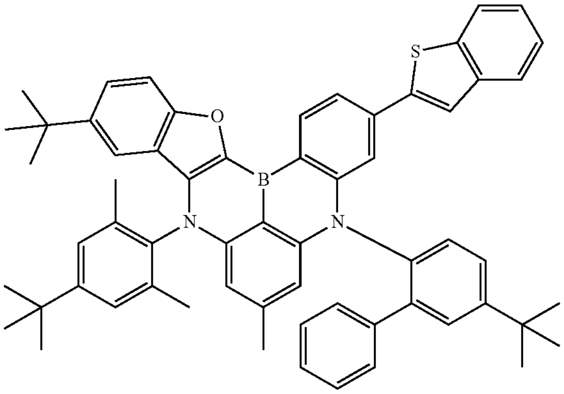
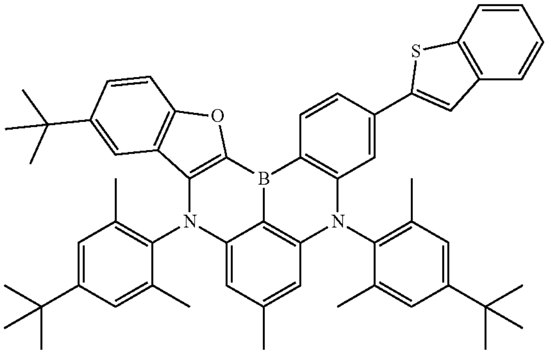
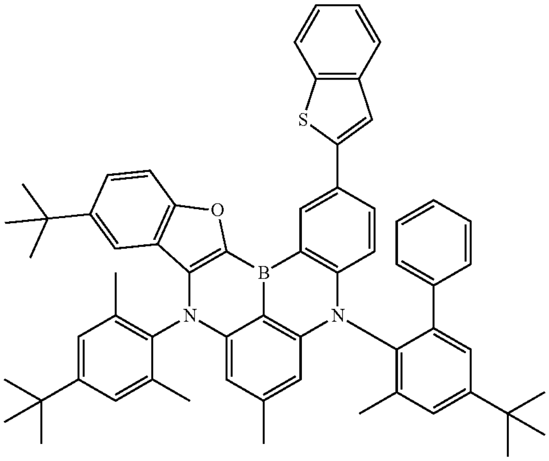
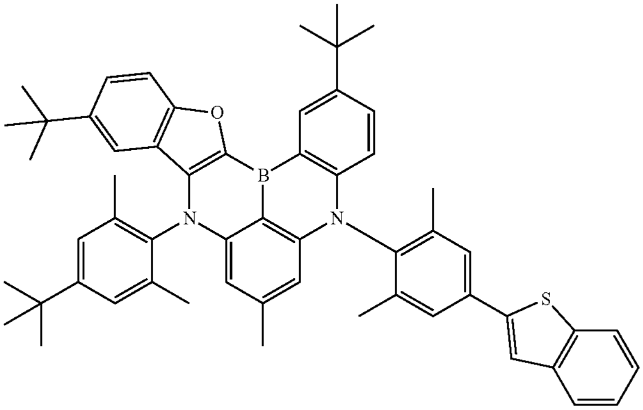
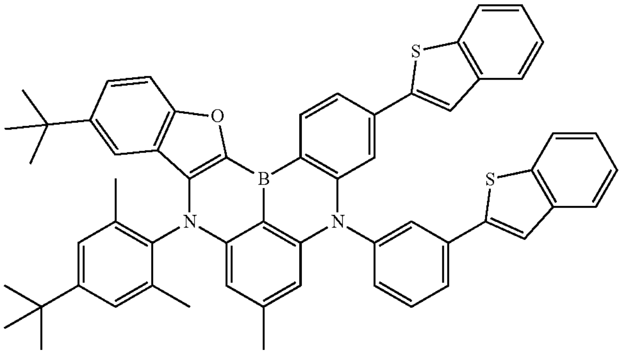
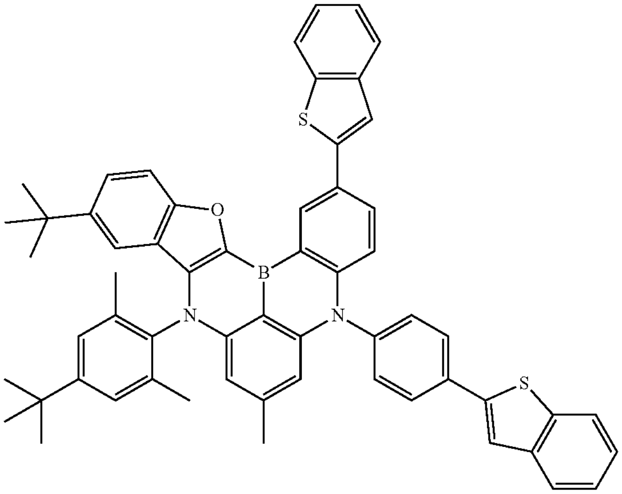

-continued
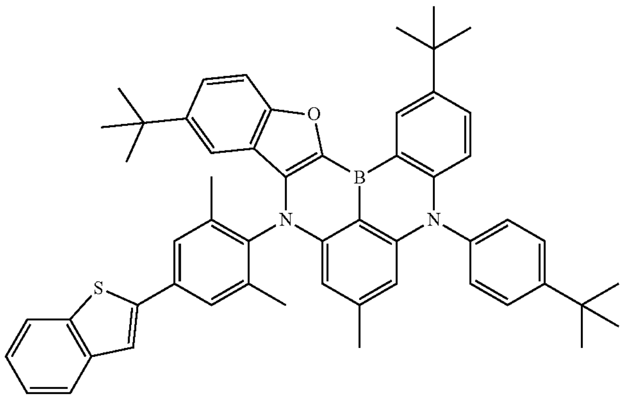
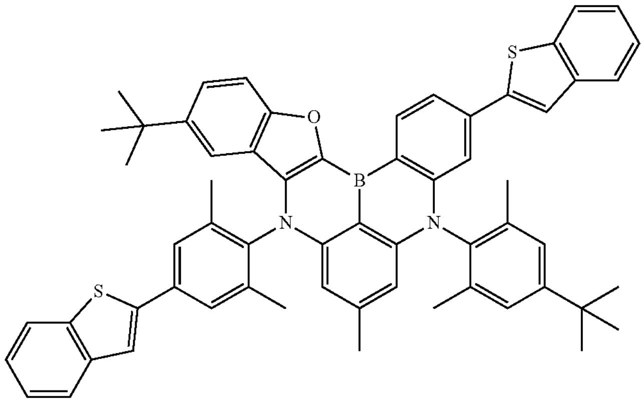
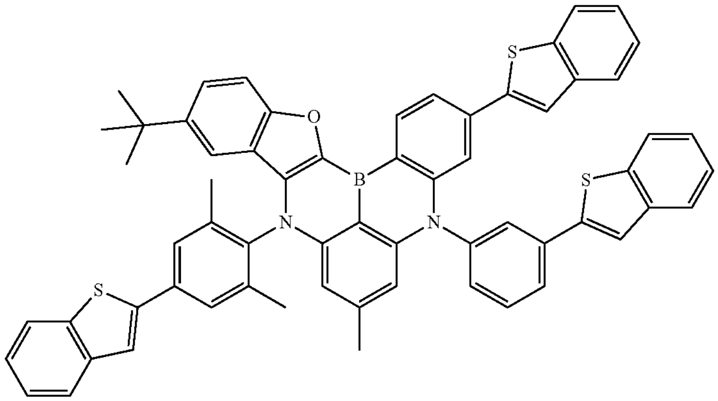
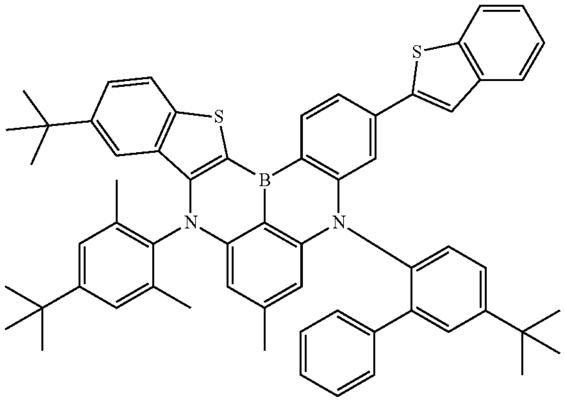
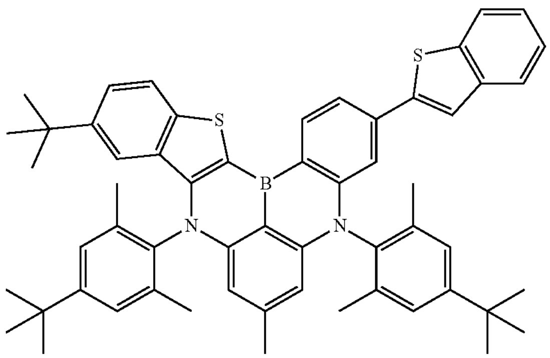

-continued
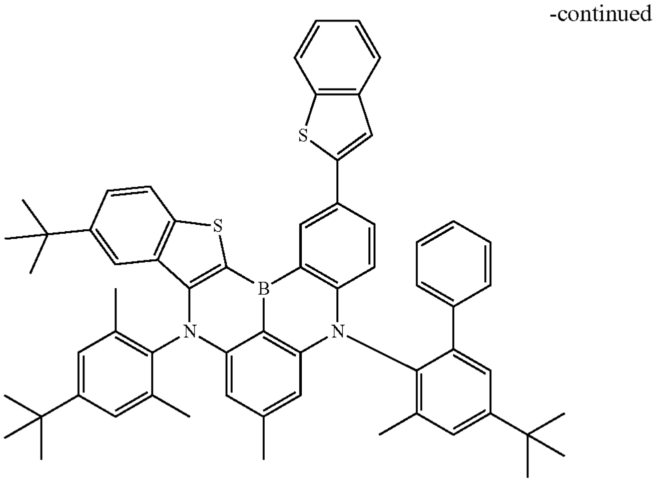
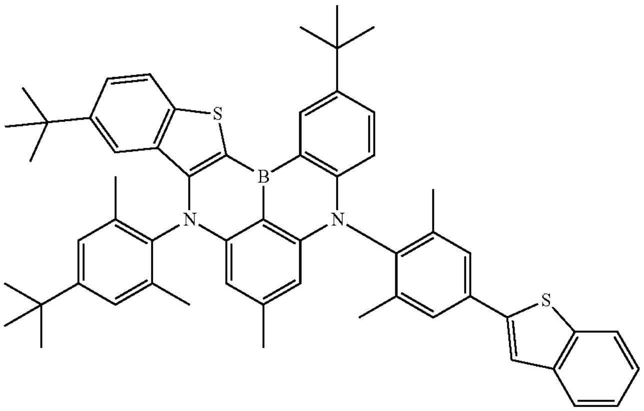
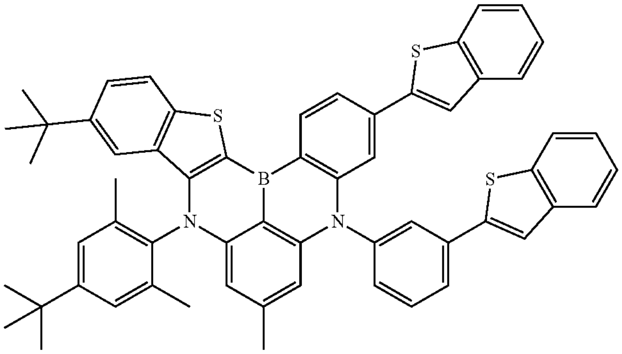
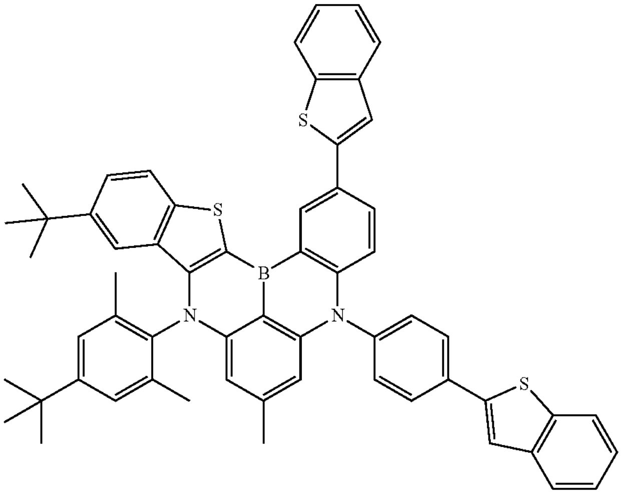

-continued
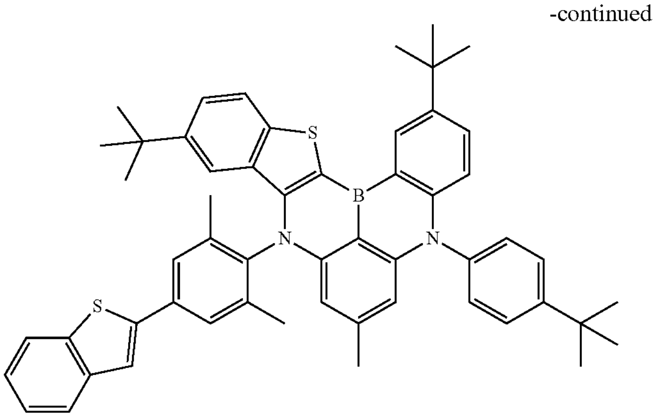
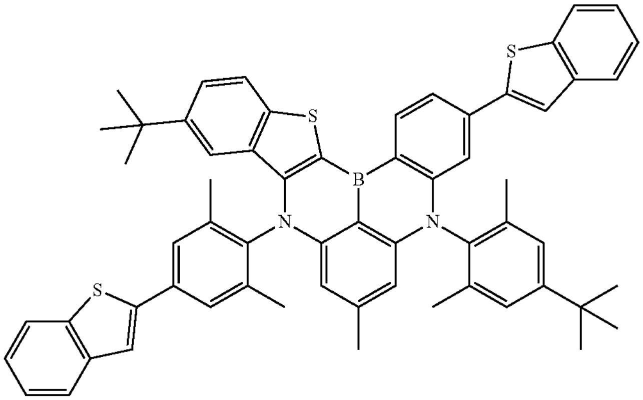
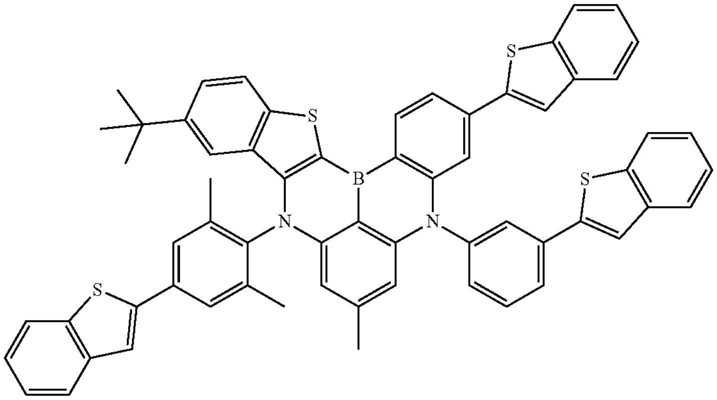
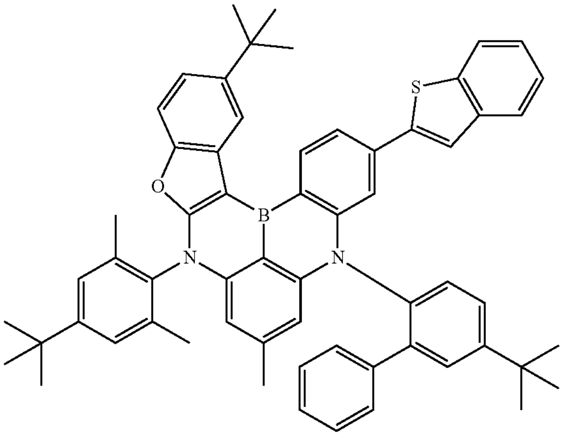
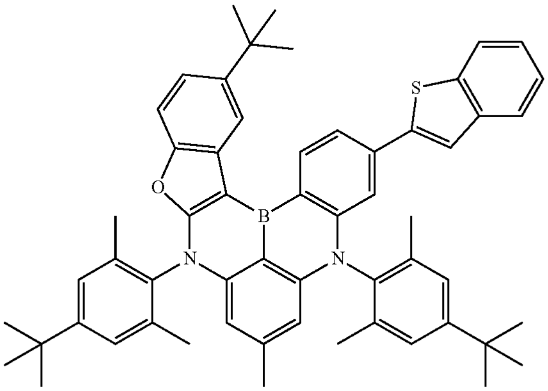

-continued
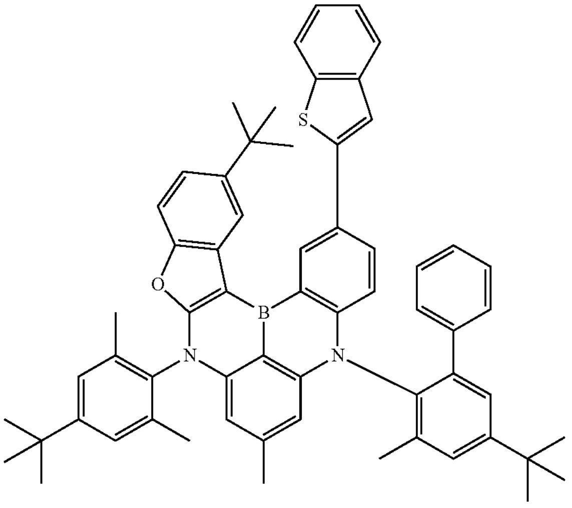
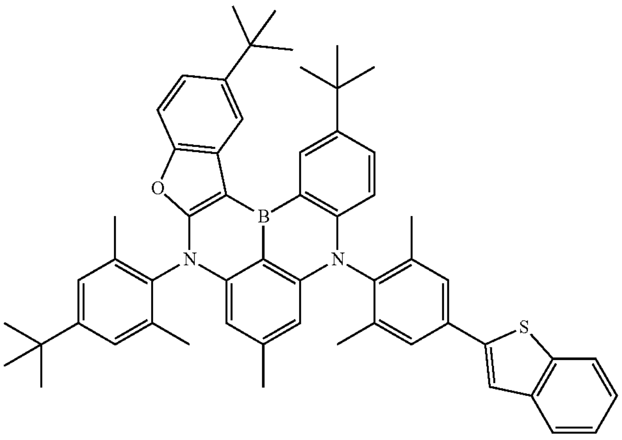
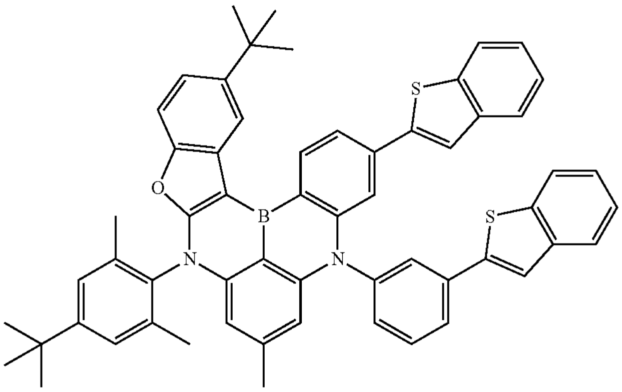
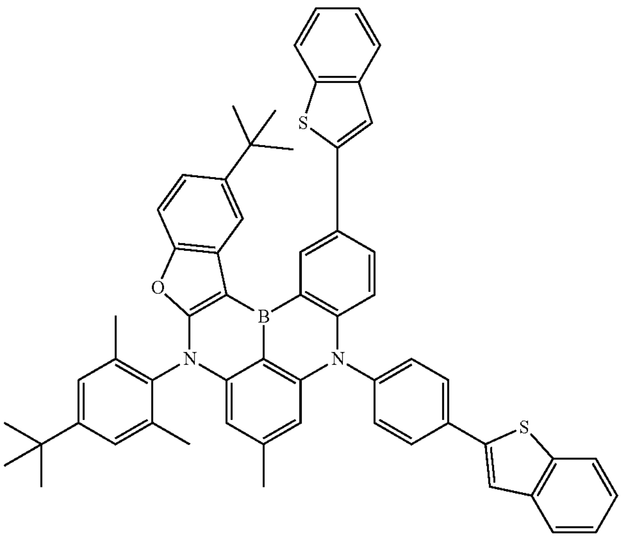

-continued
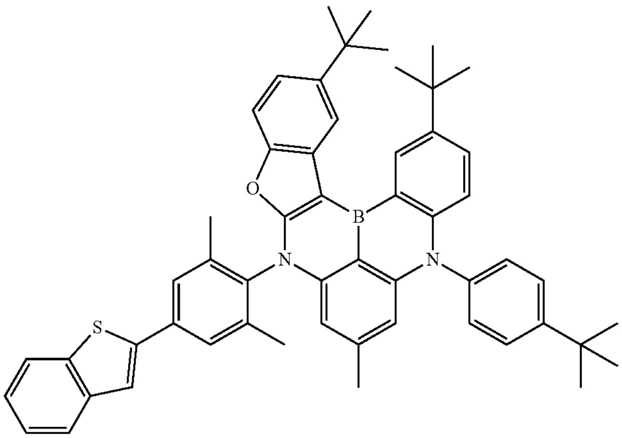
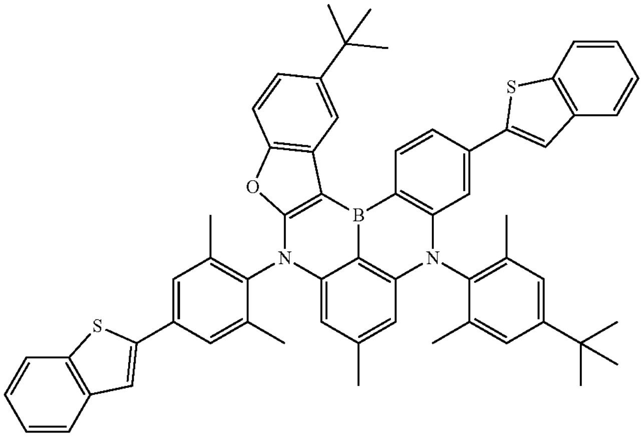
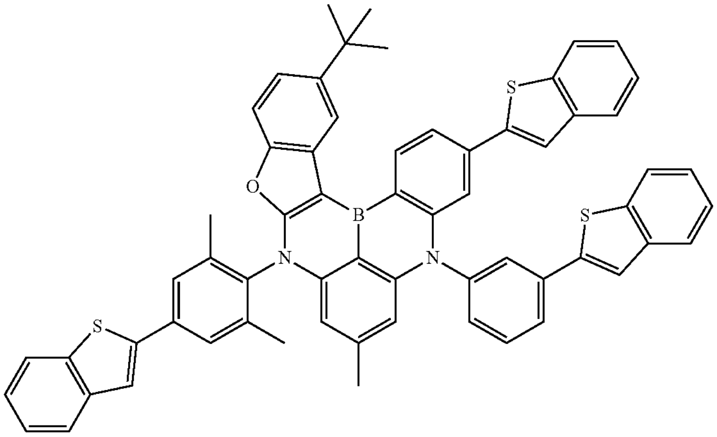

-continued
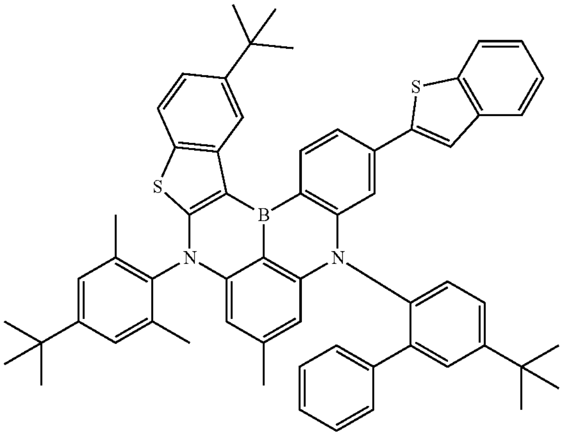
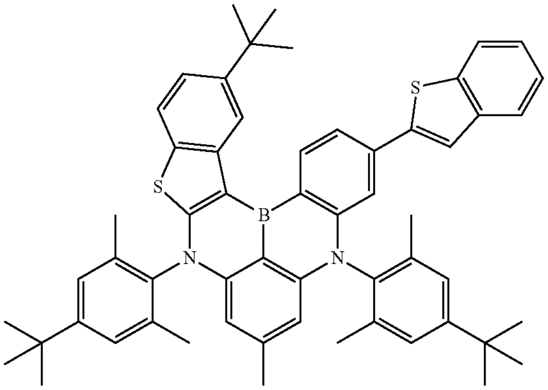
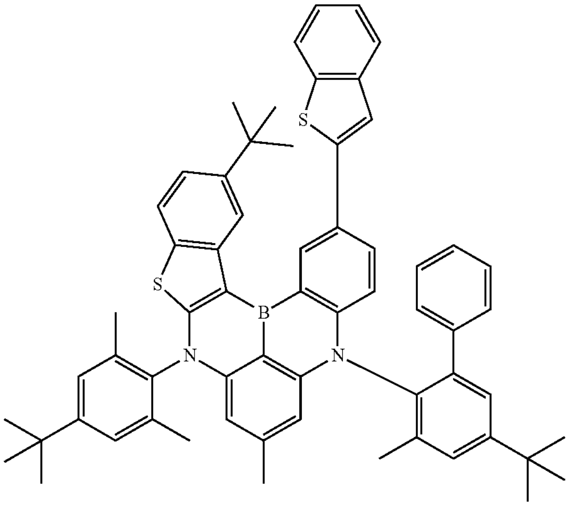
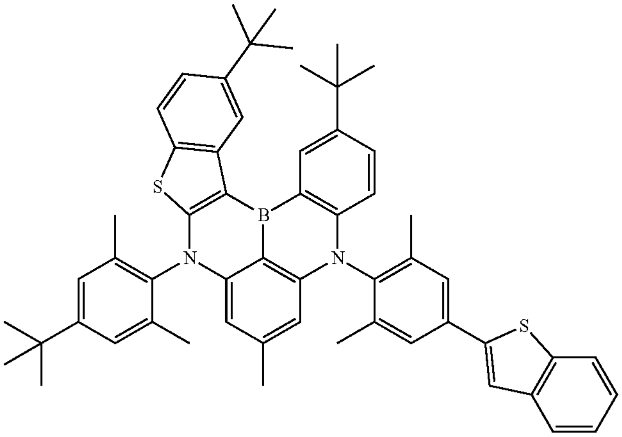
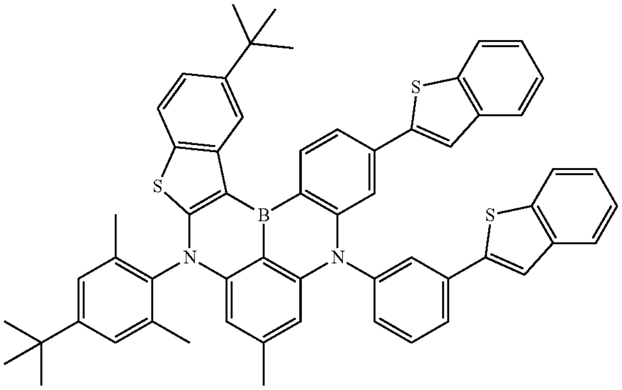

-continued
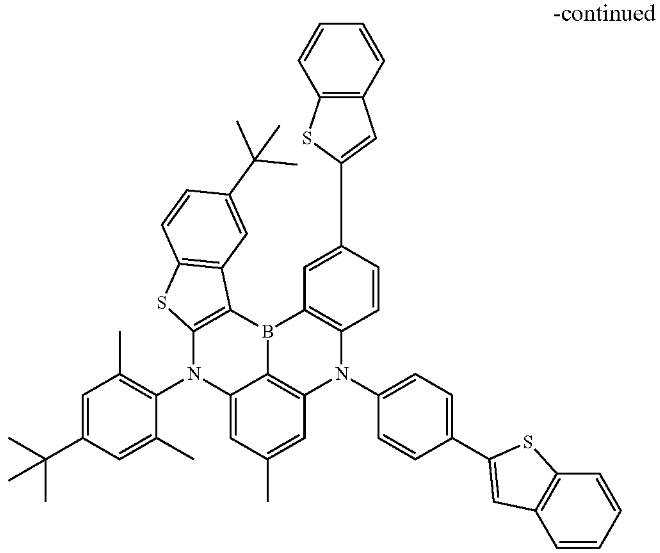
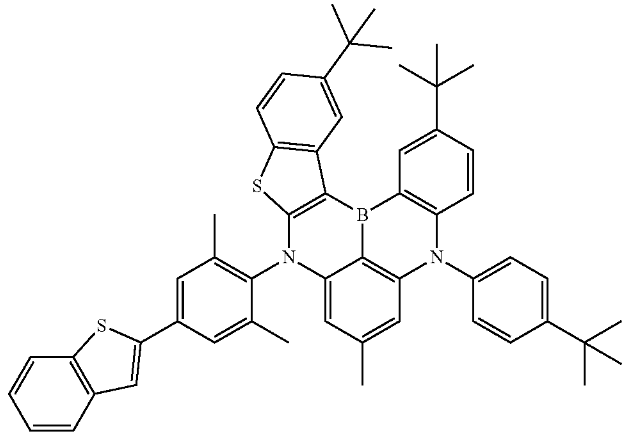
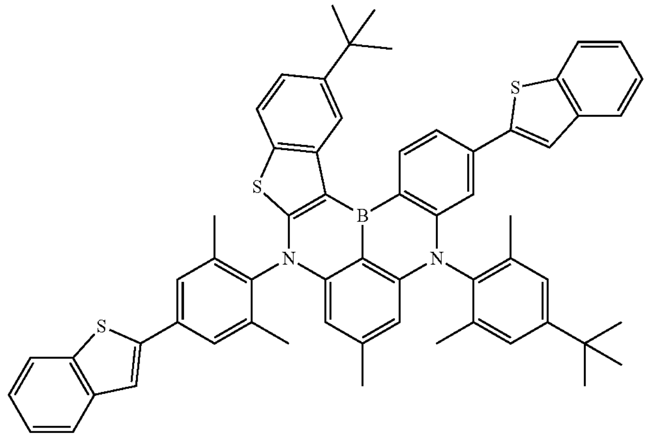

-continued
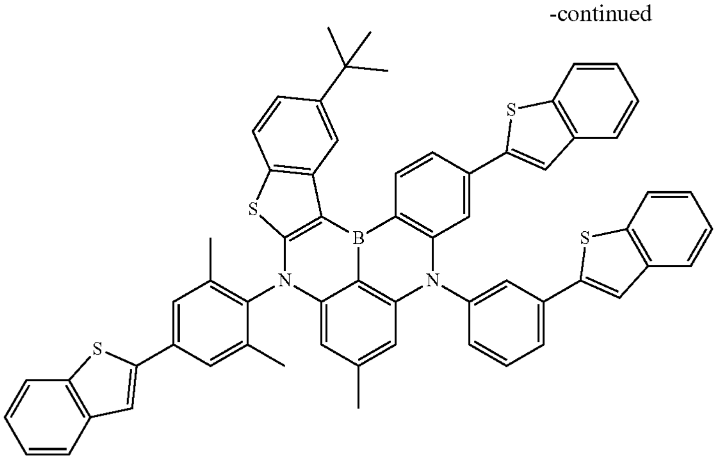
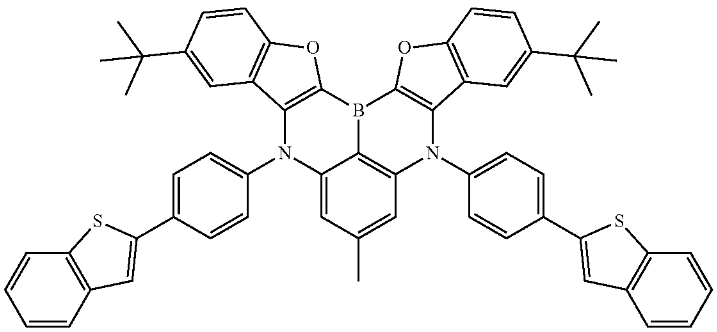
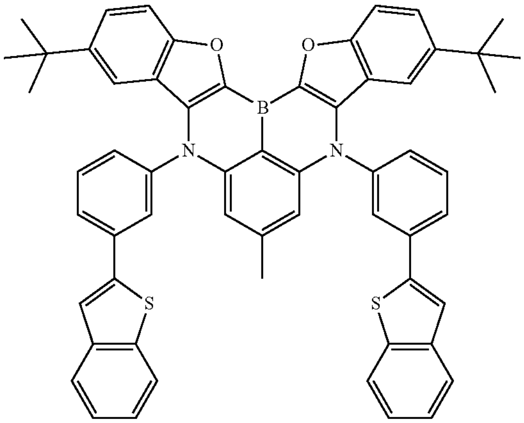
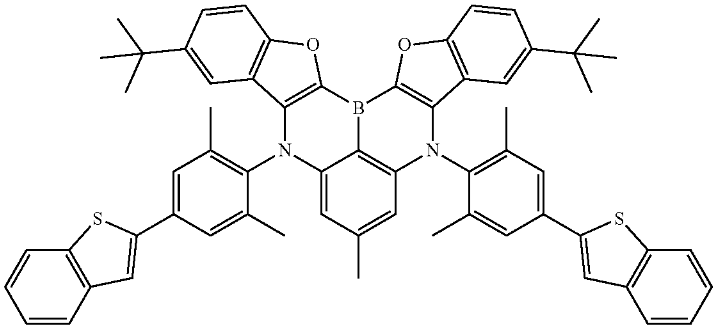

-continued
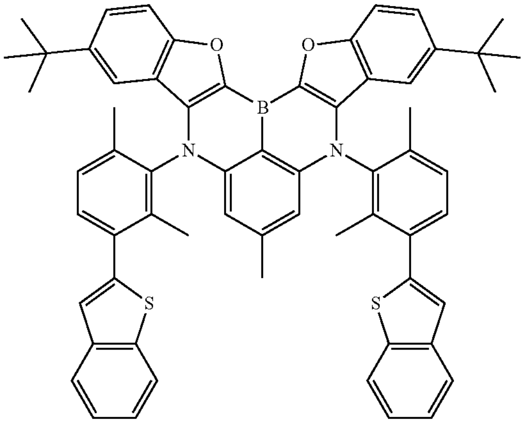
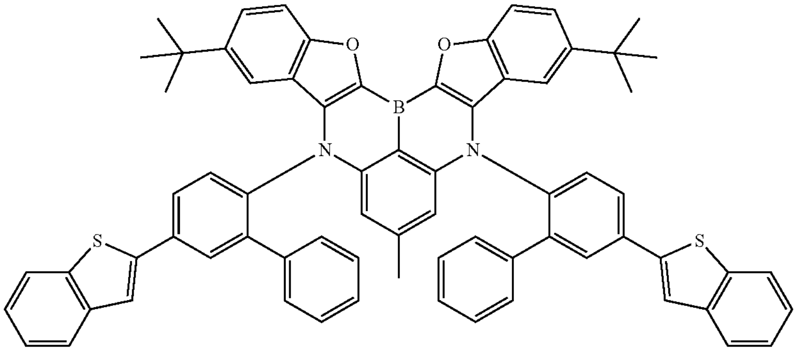
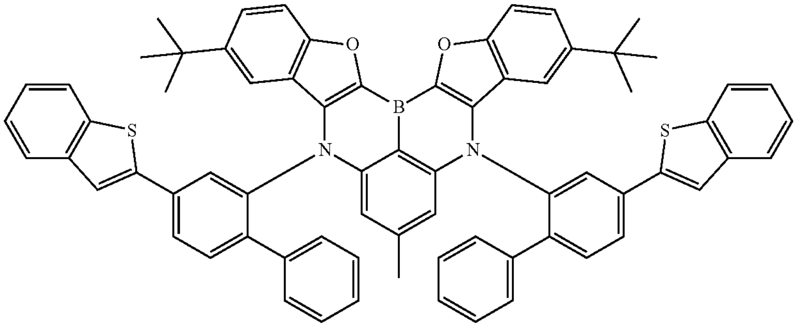
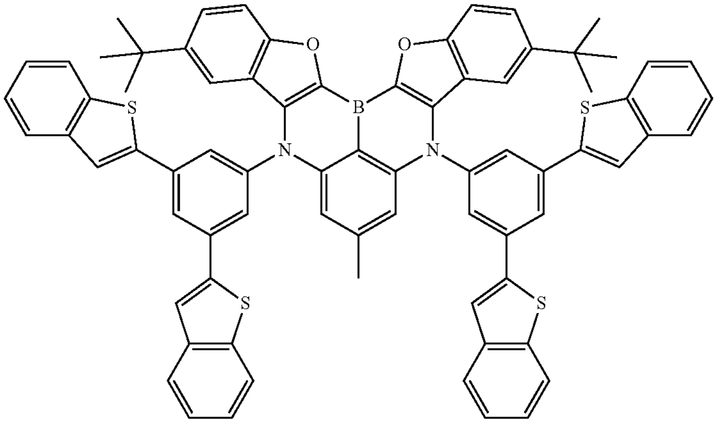

-continued
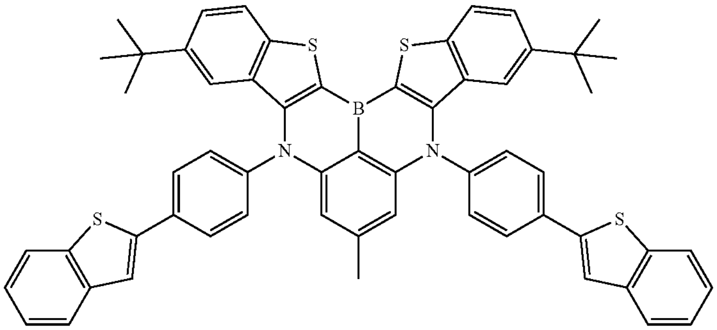
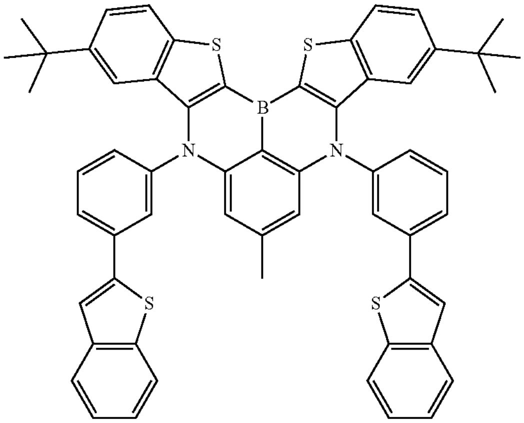
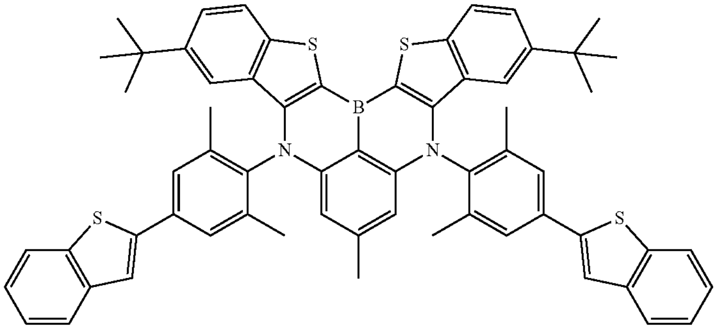
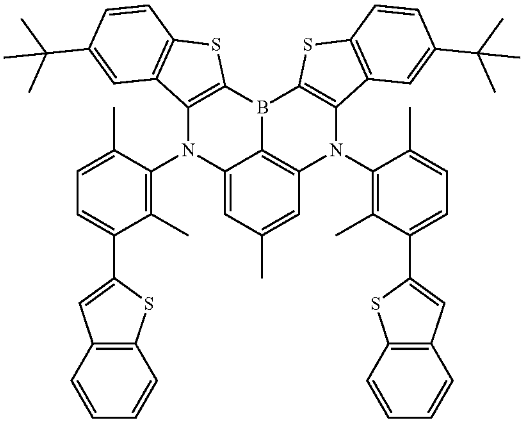

-continued
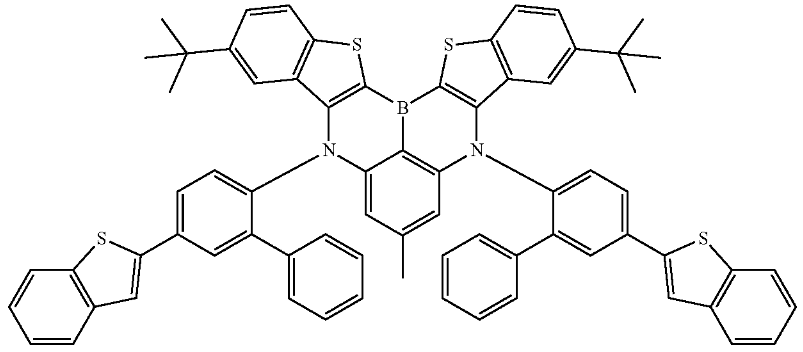
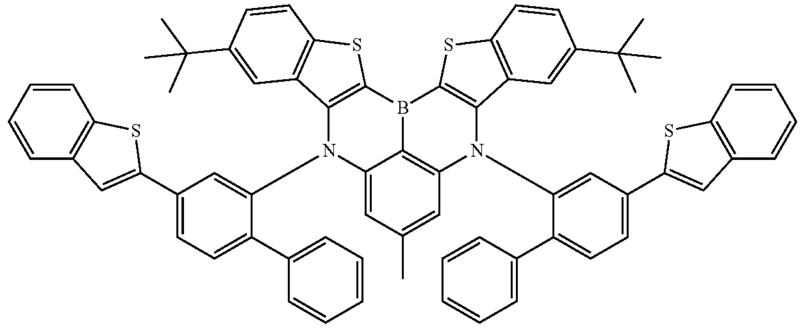
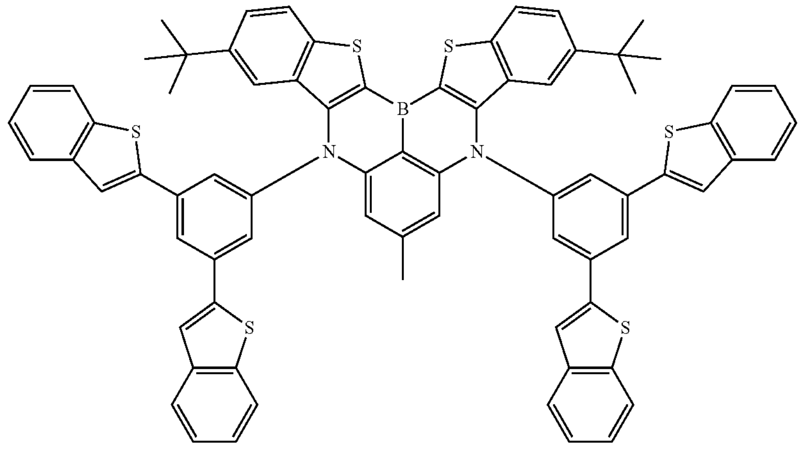
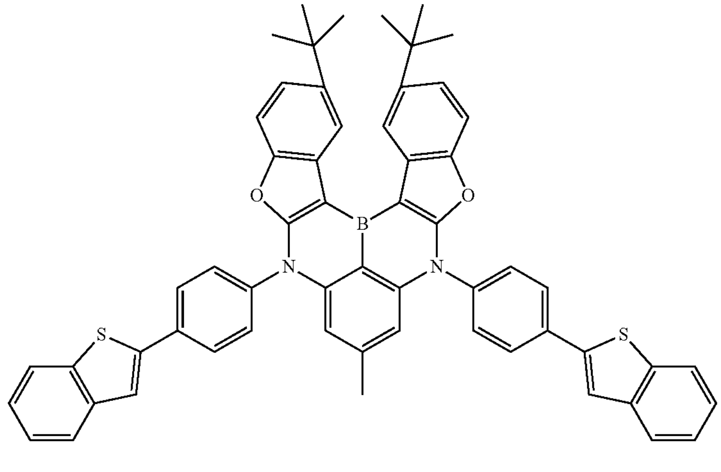

-continued
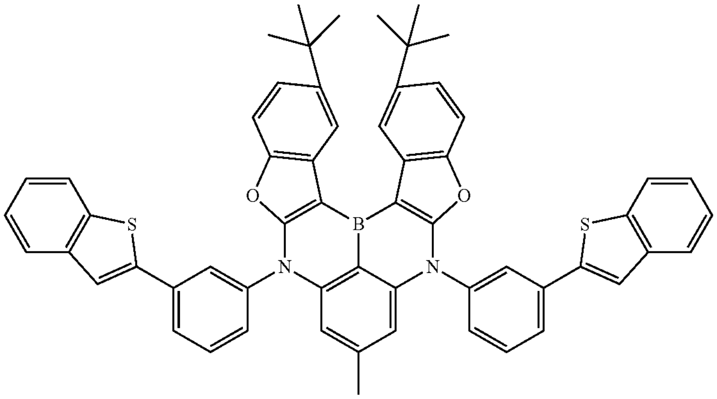
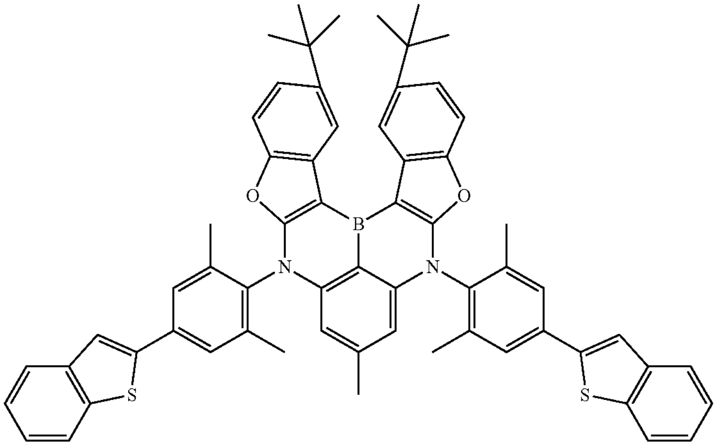
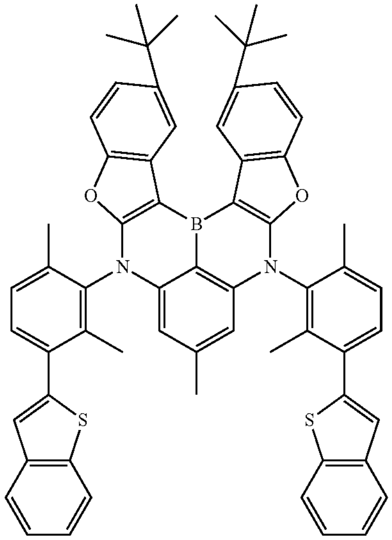
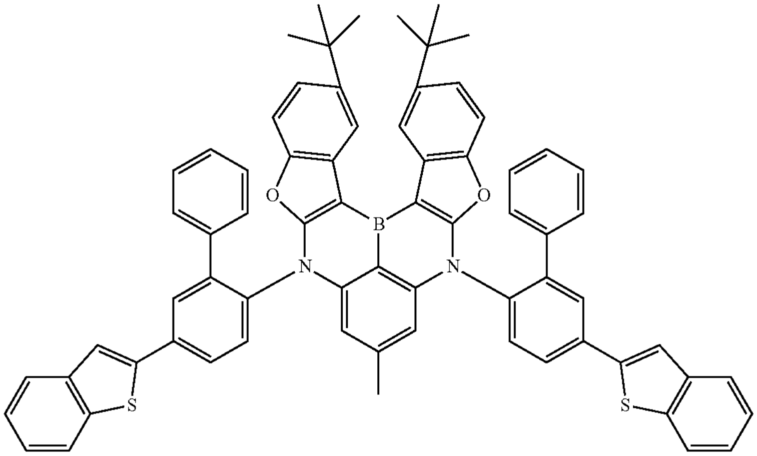
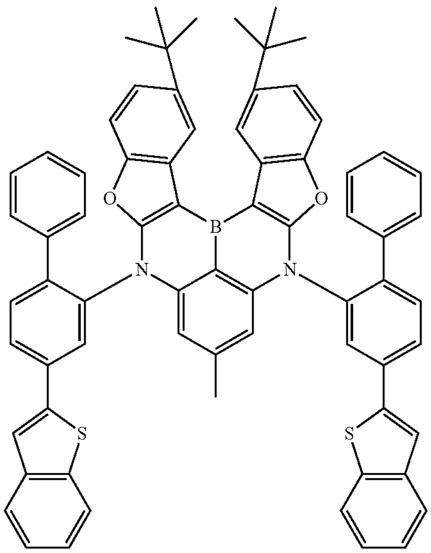

-continued
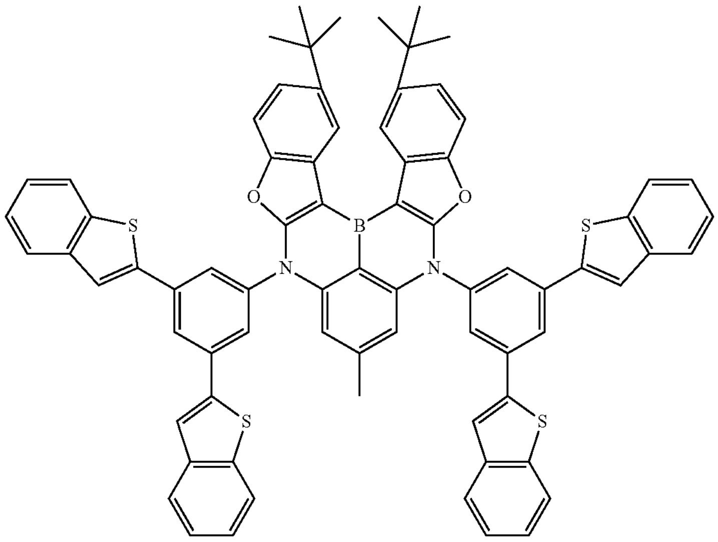
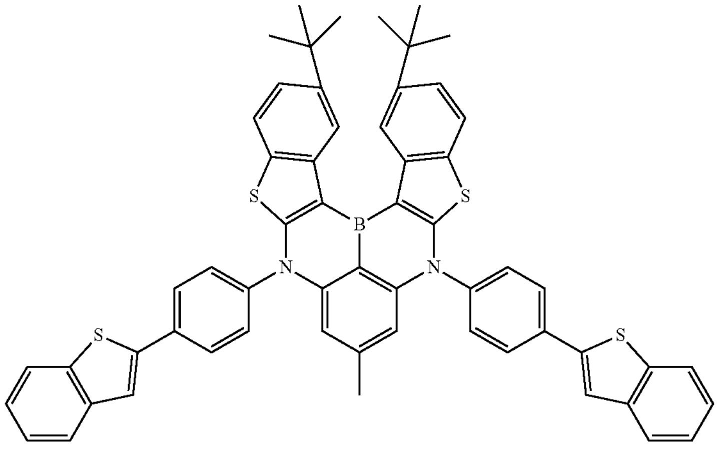
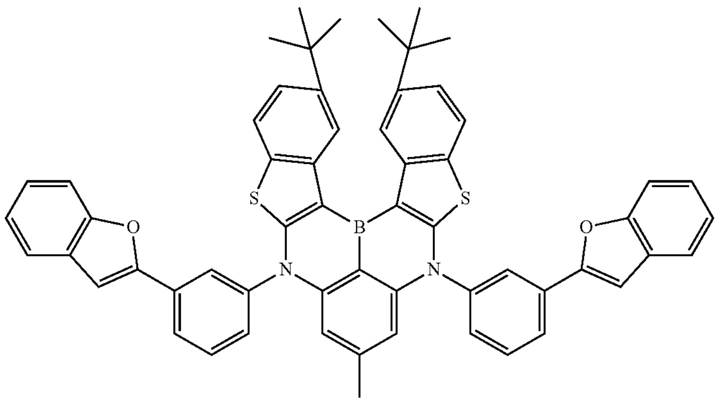

-continued
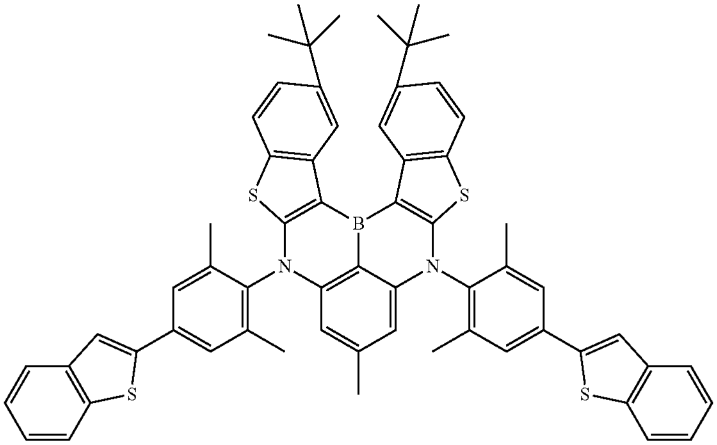
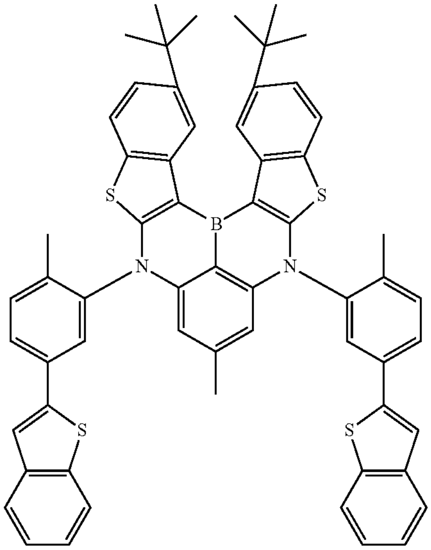
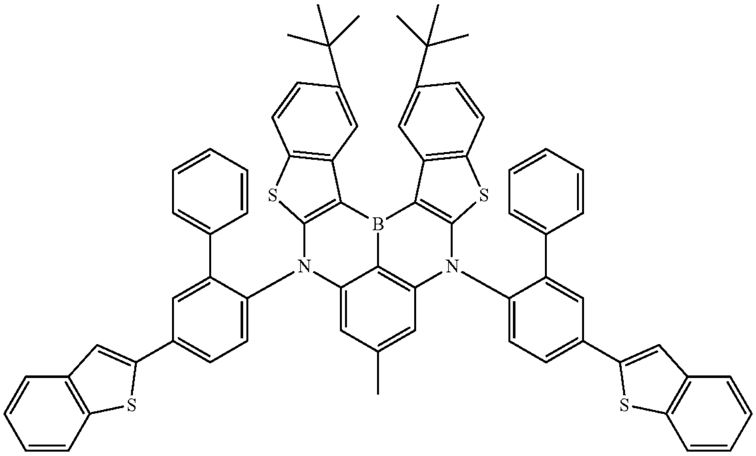
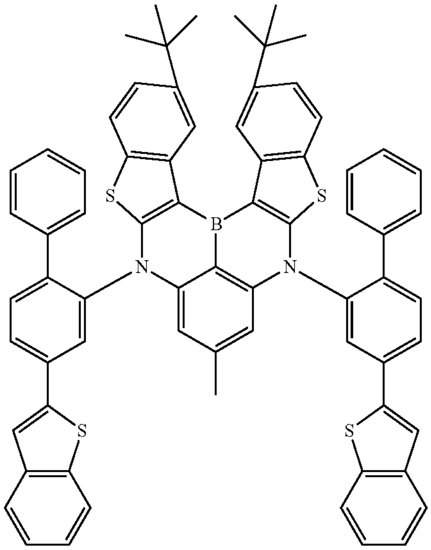
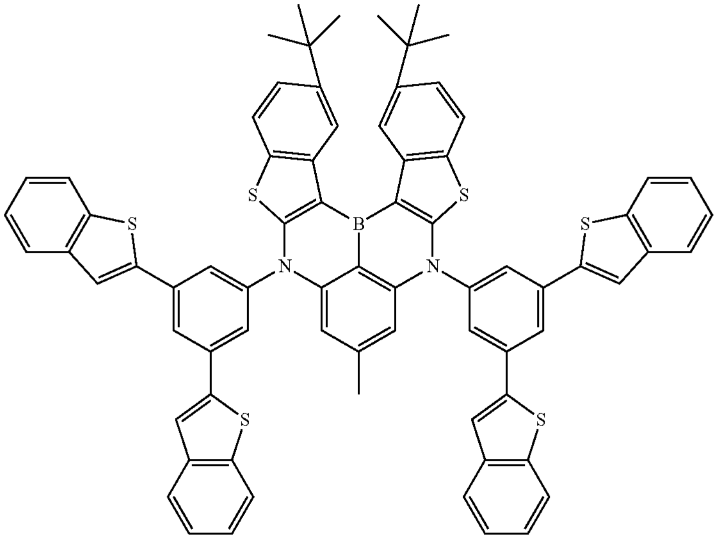

-continued
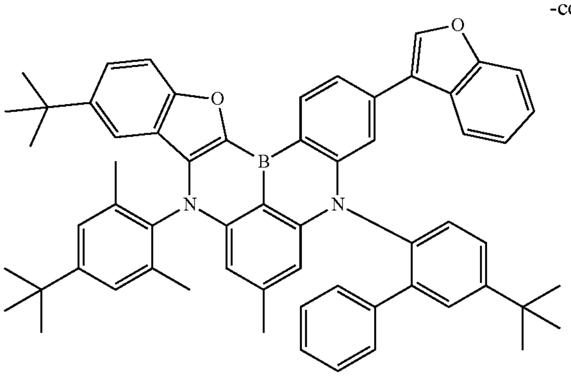
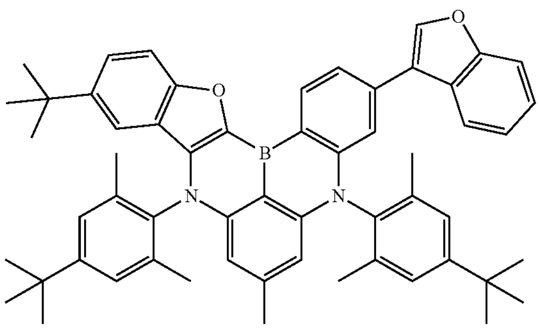
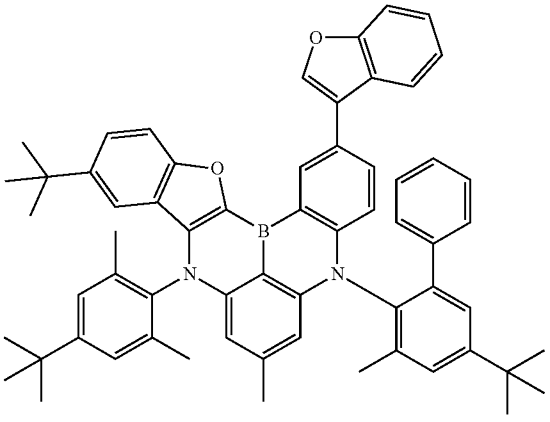
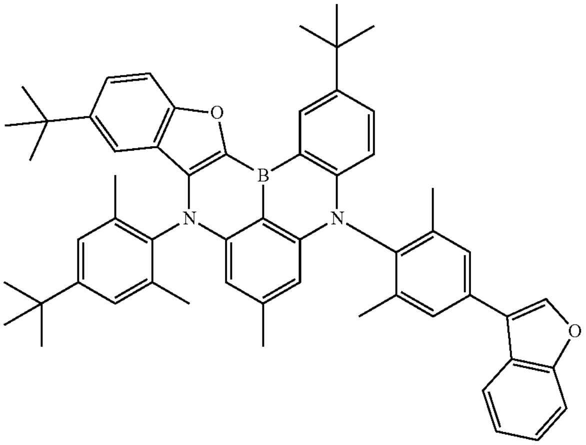
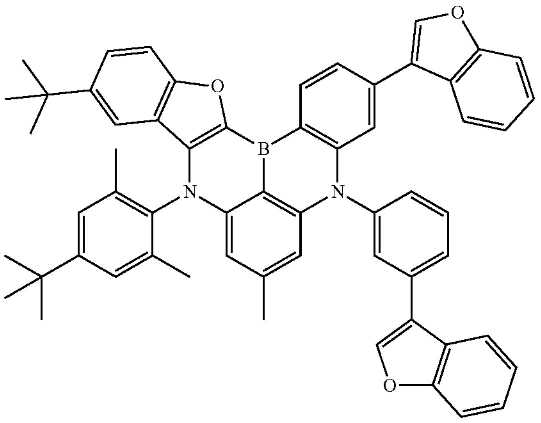
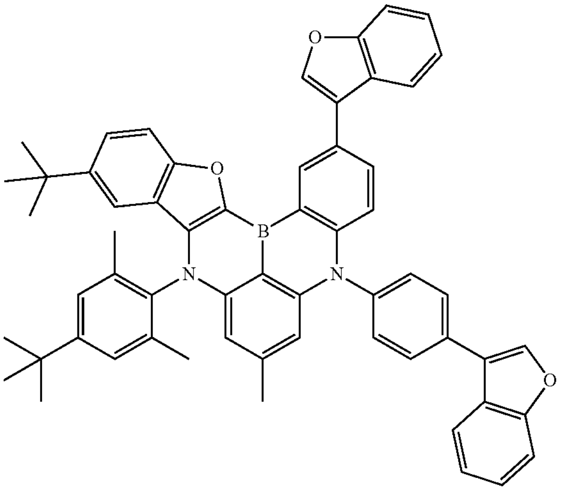
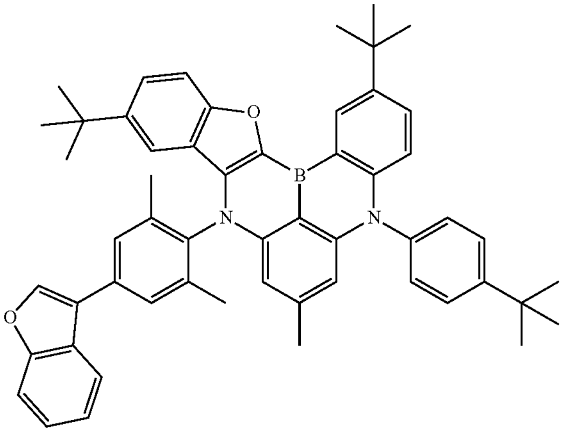
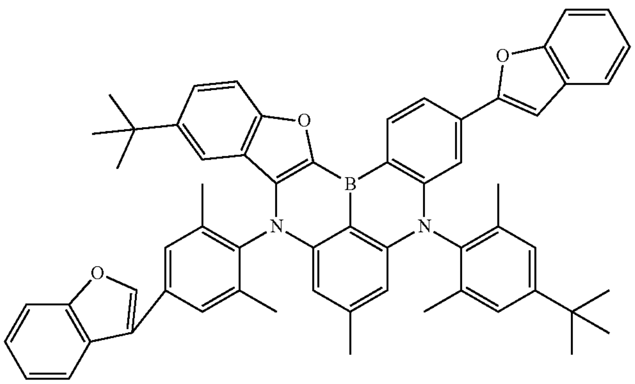

-continued
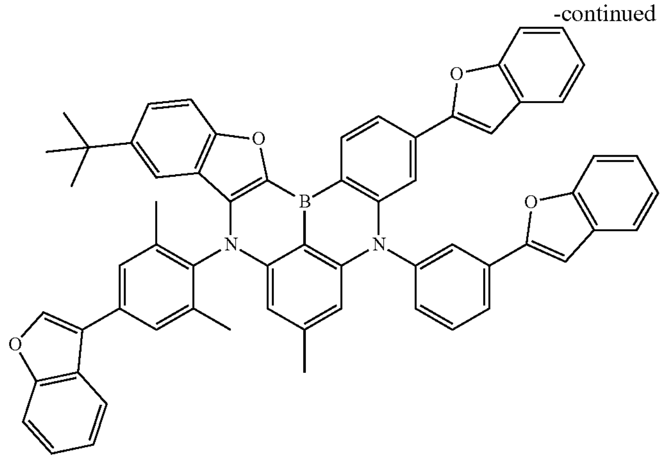
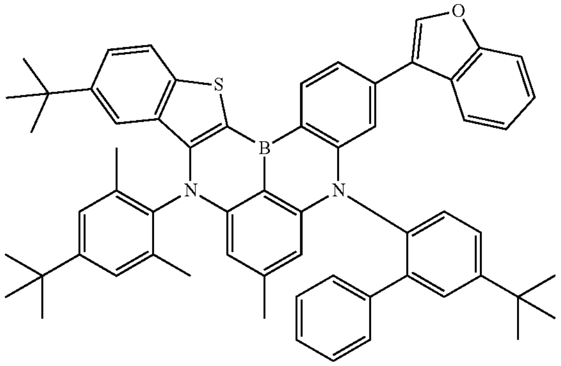
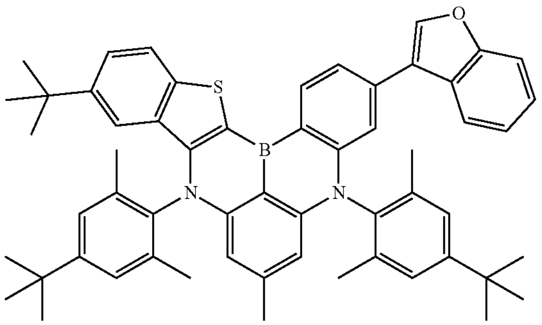
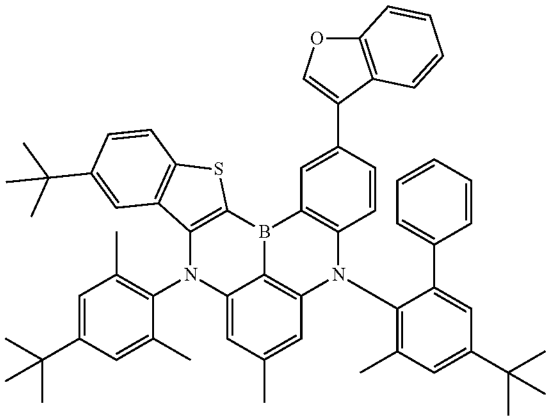
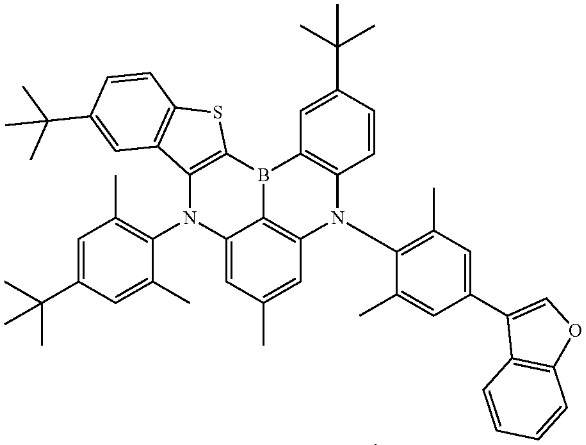
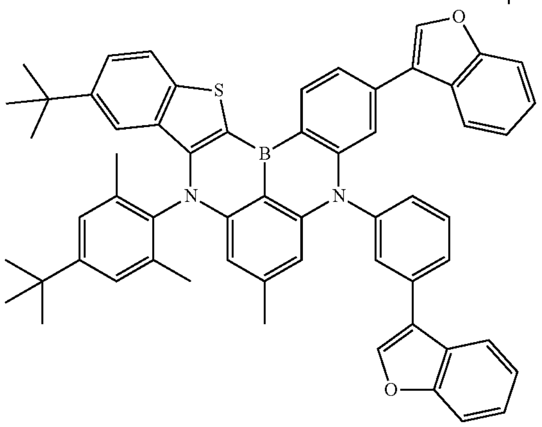
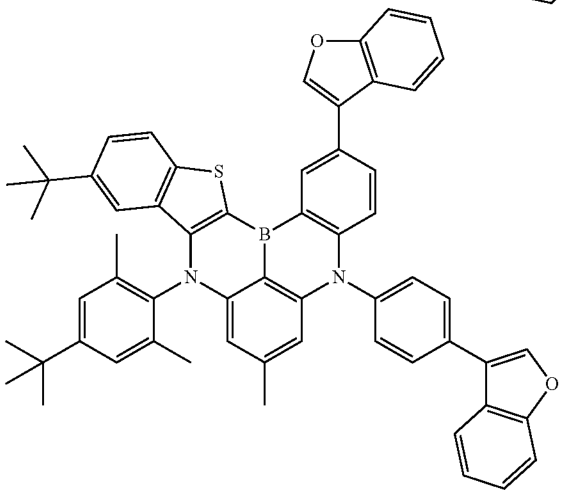

-continued
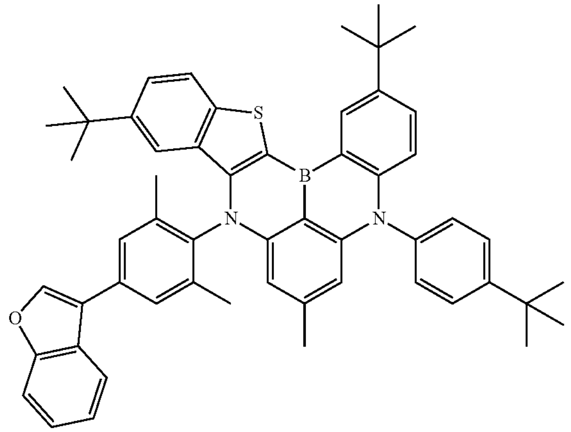
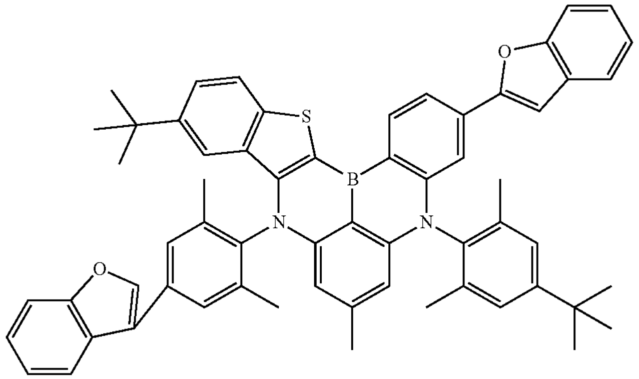
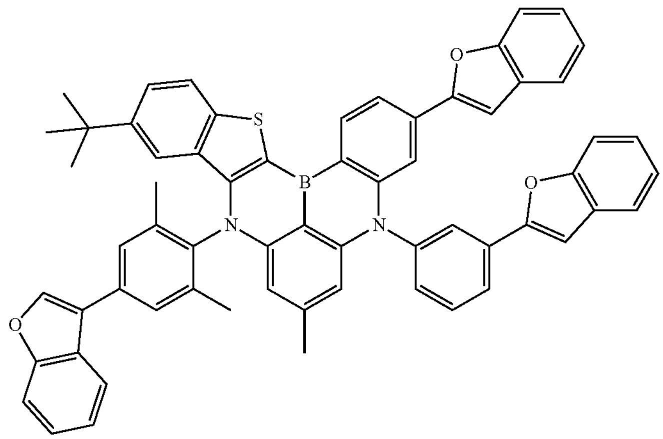
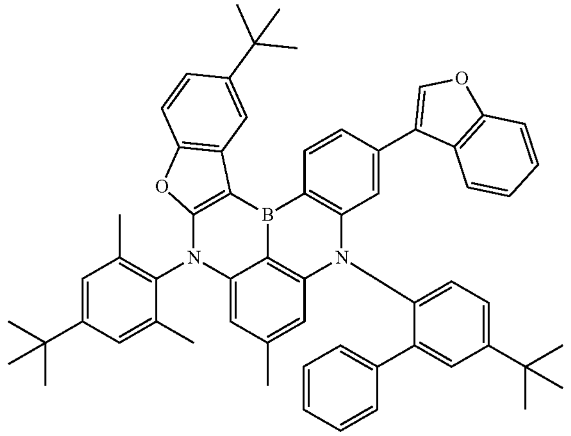
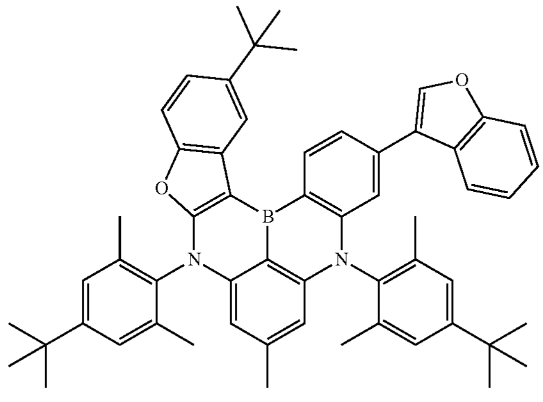

-continued
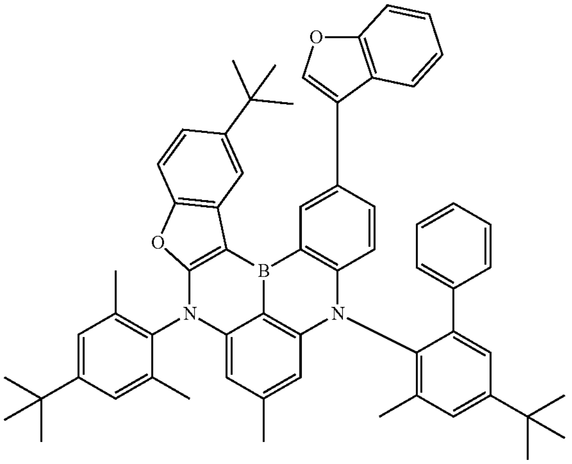
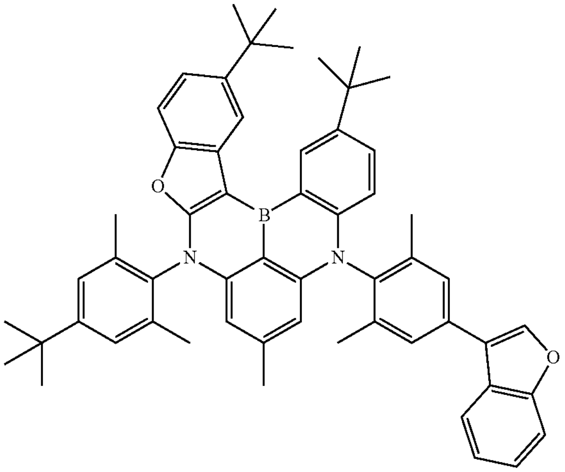
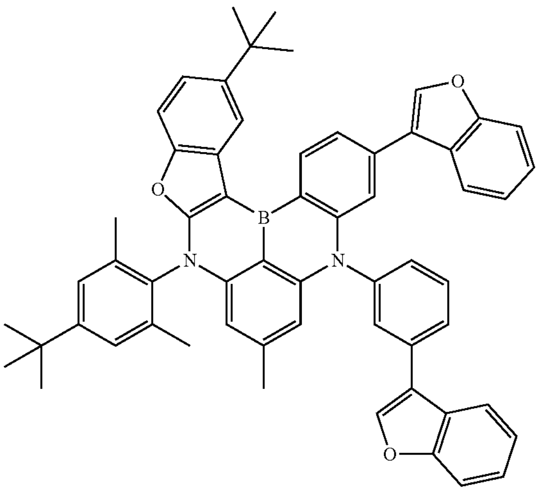
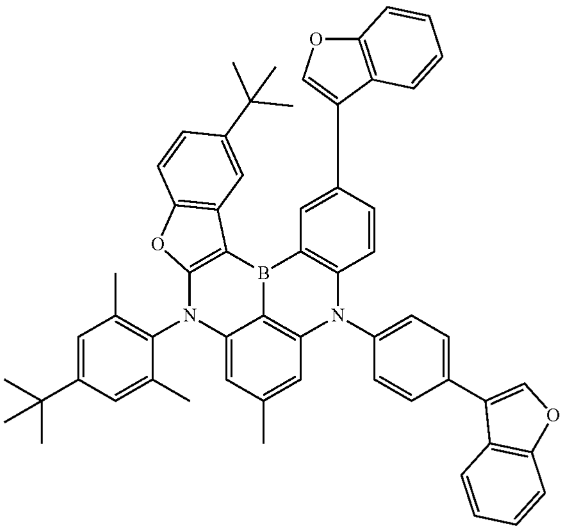
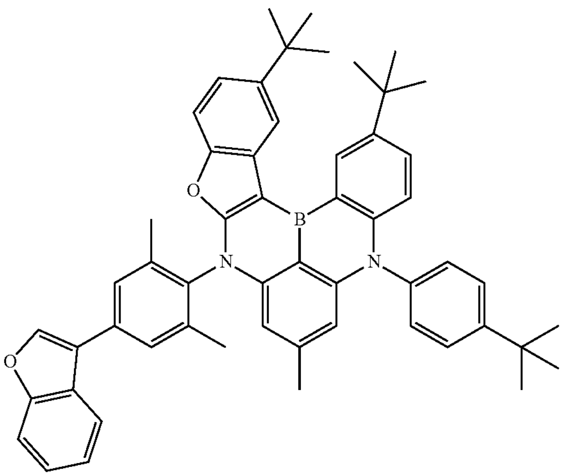
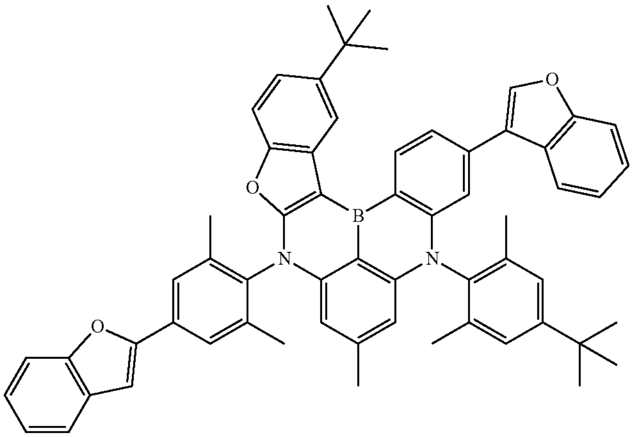

-continued
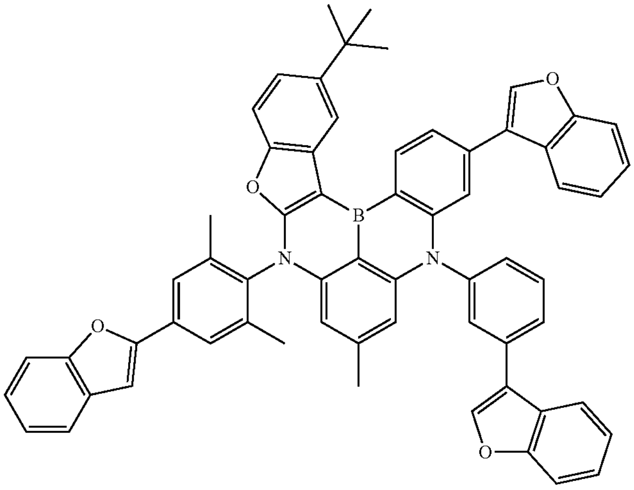
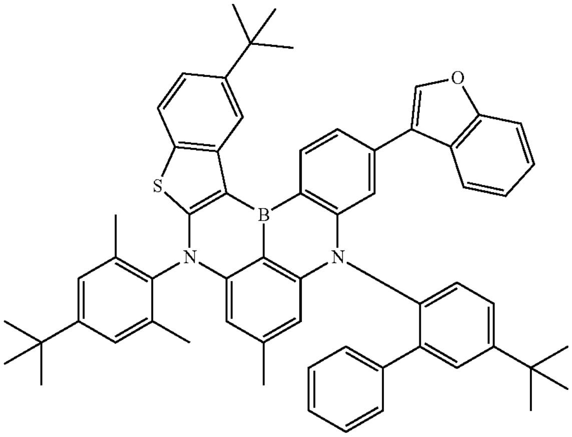
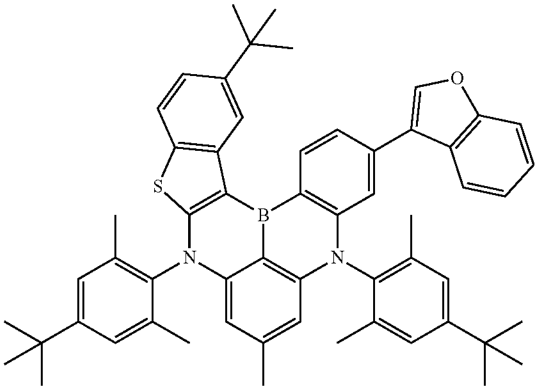
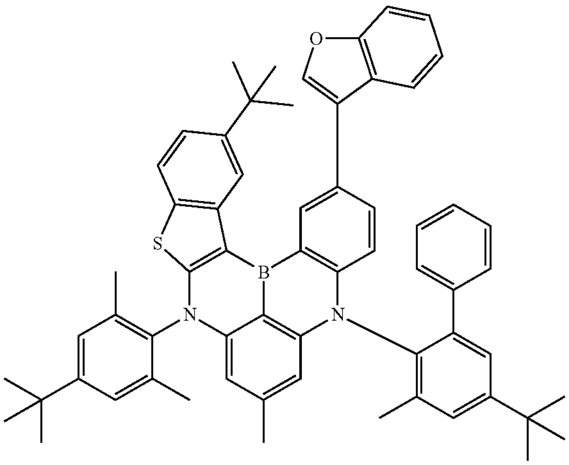
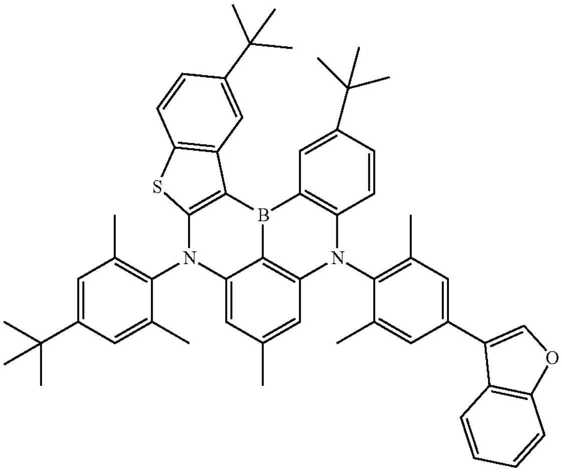

-continued
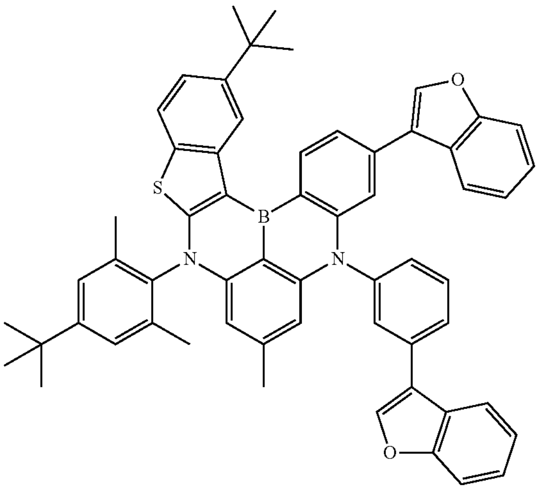
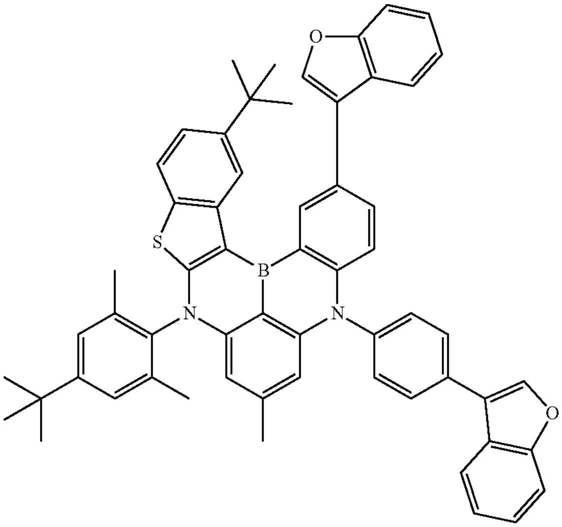
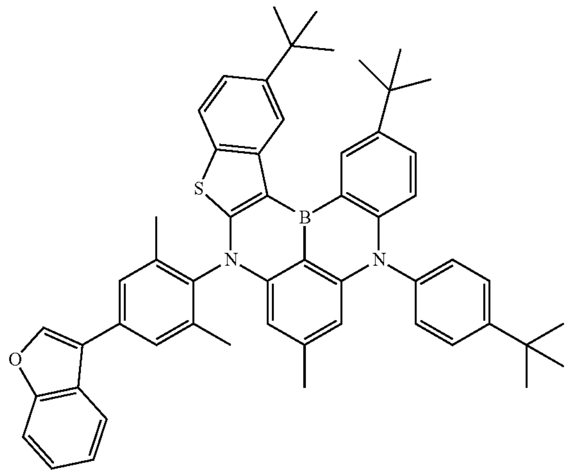
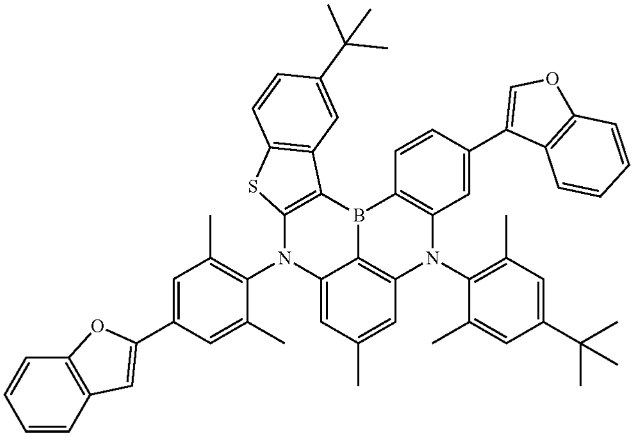
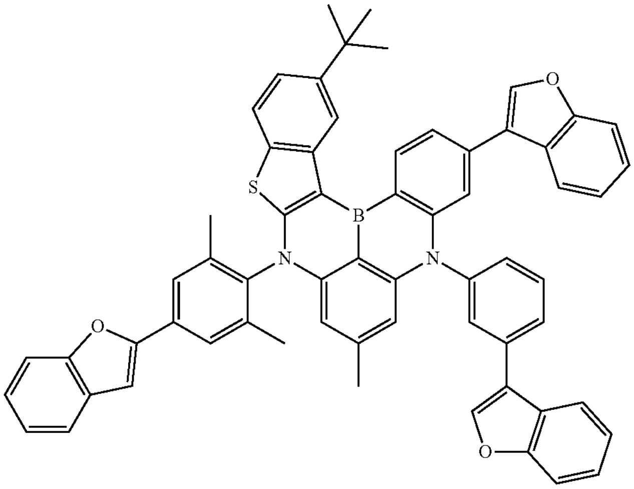

-continued
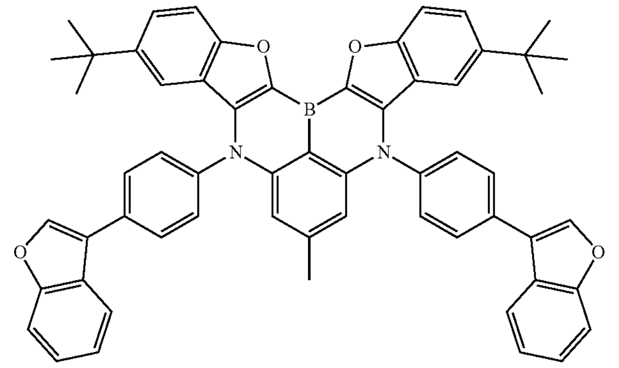
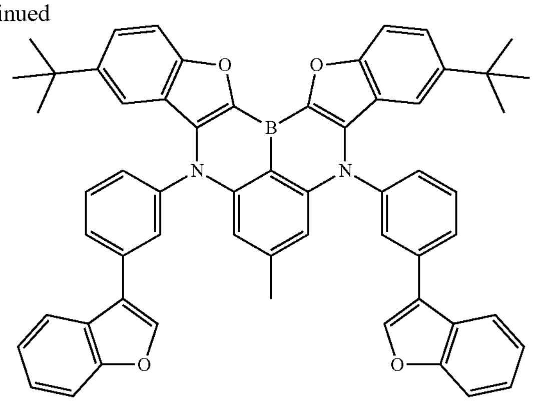
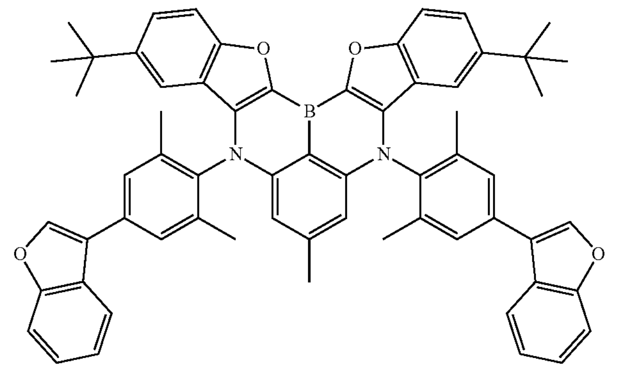
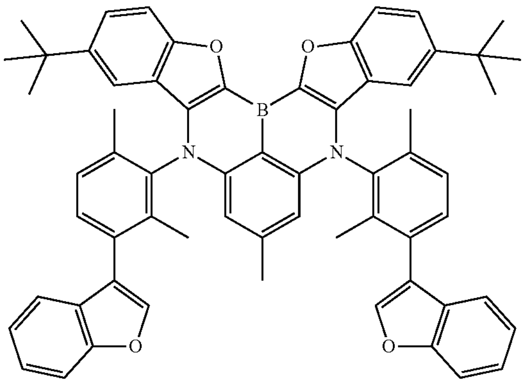
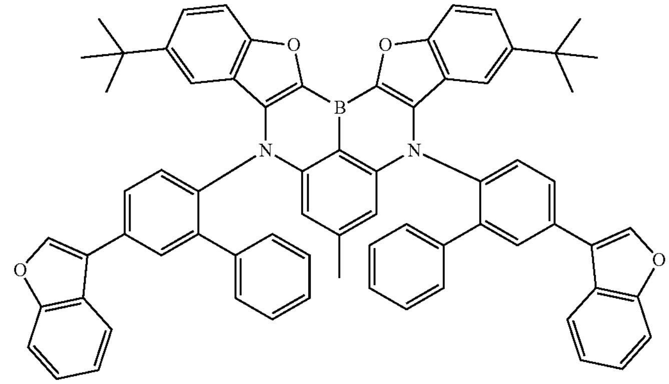
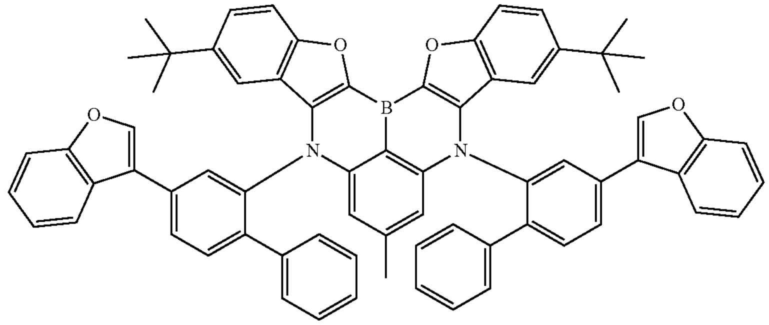

-continued
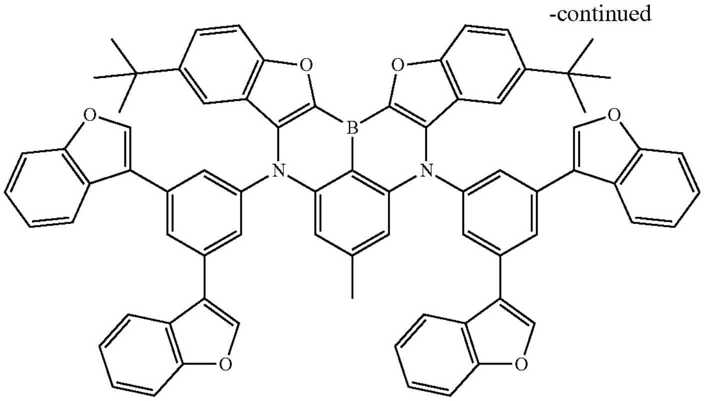
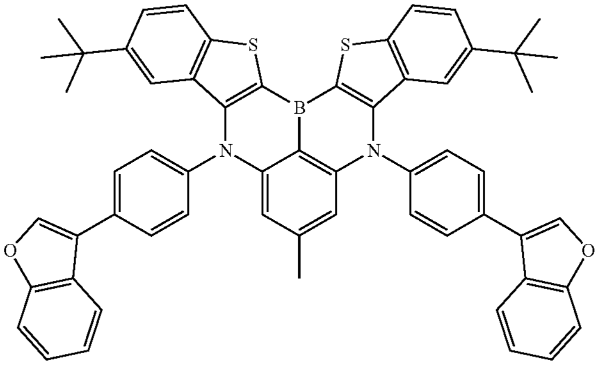
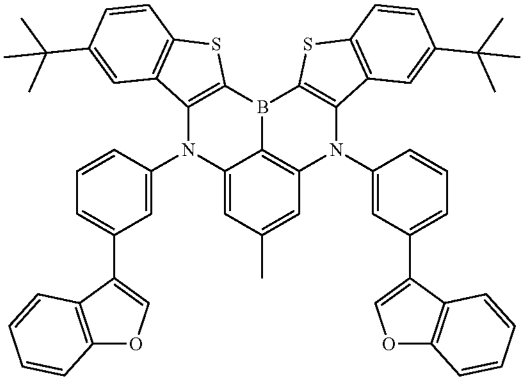
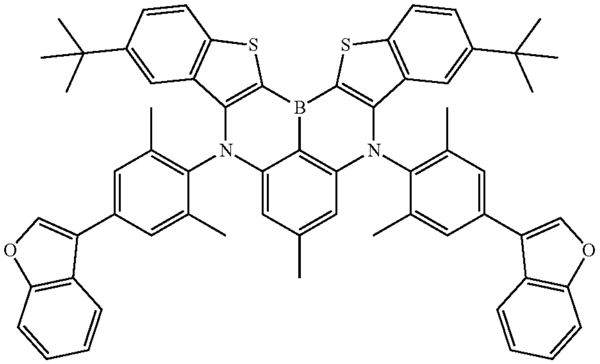
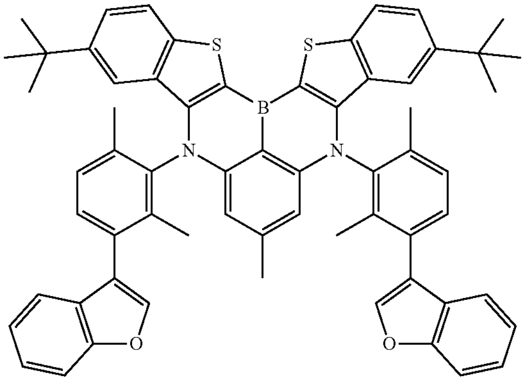
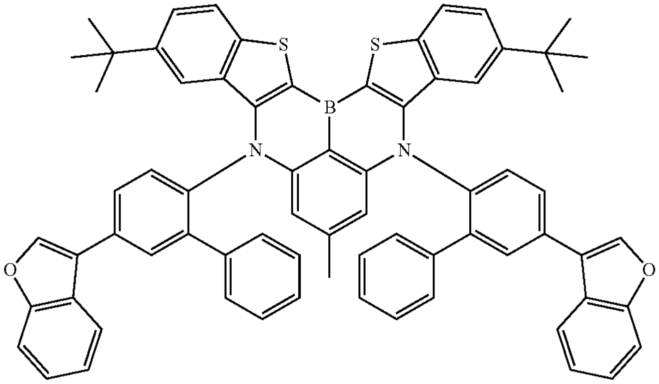

-continued
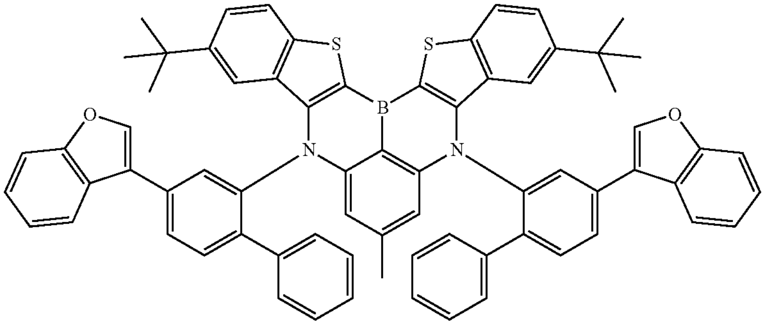
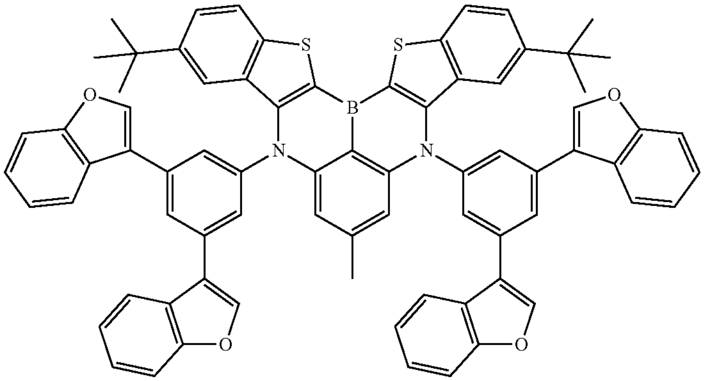
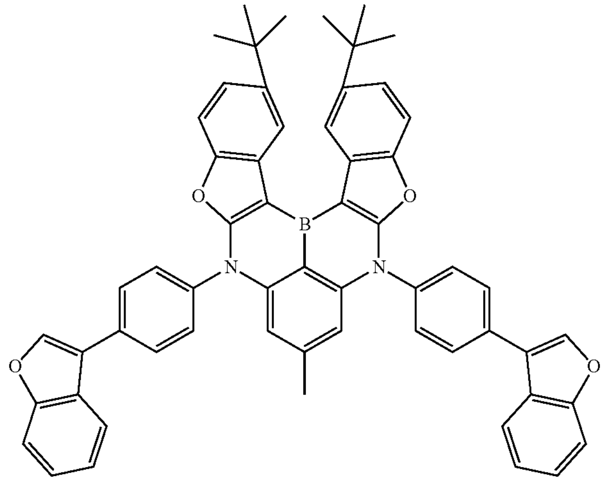
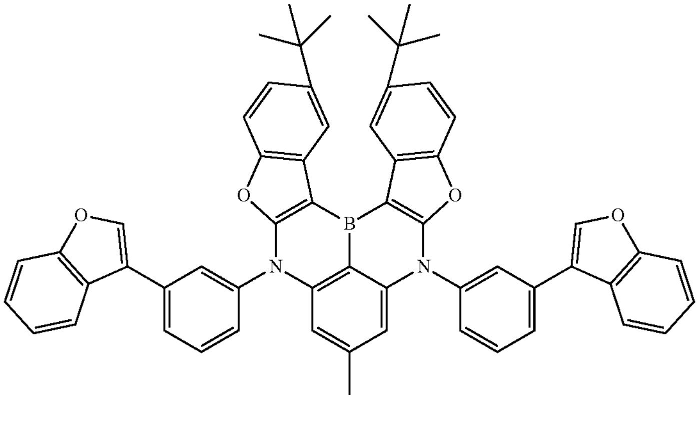

-continued
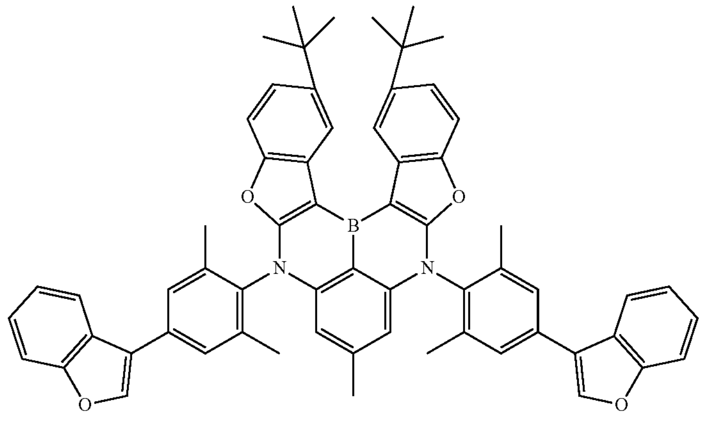
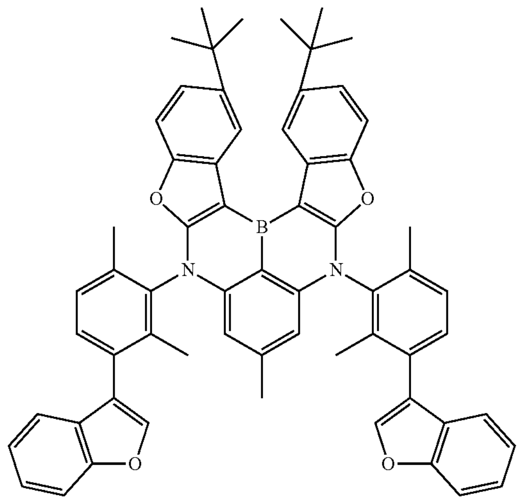
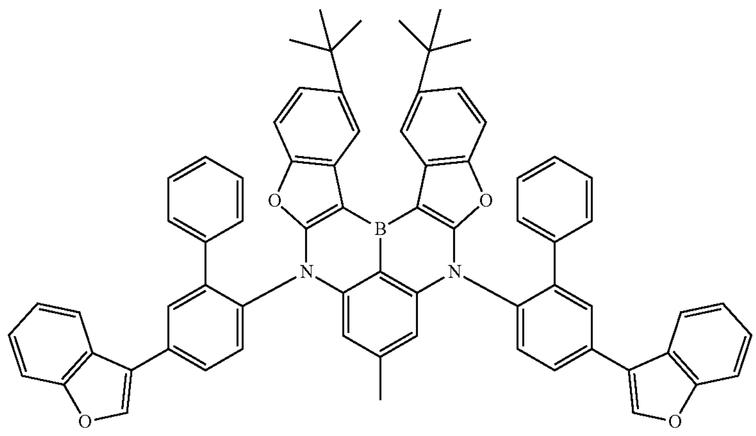

-continued
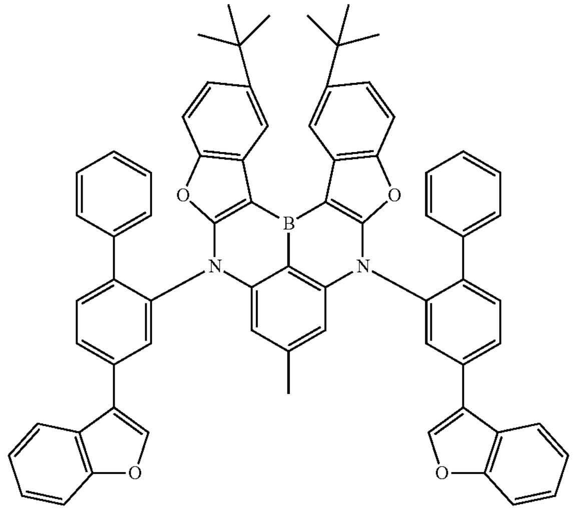
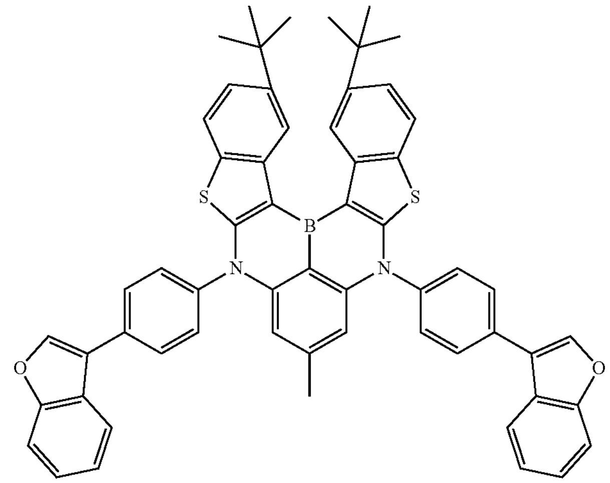
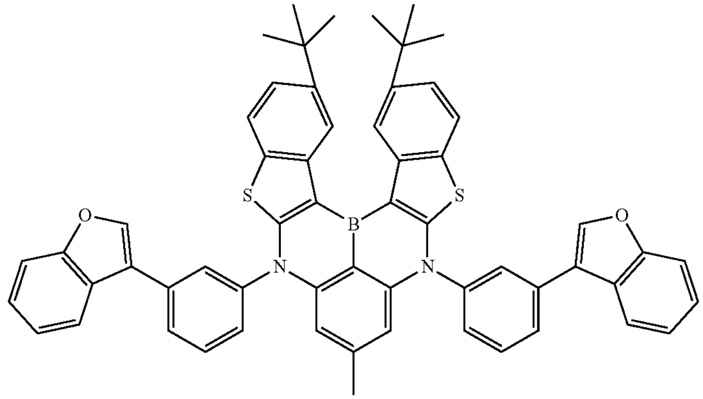

-continued
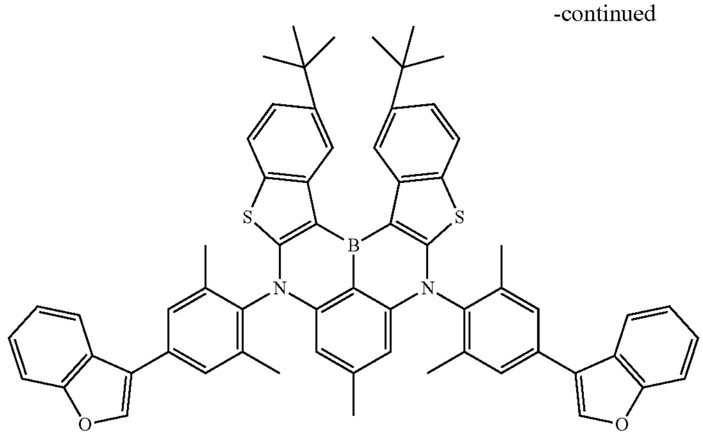
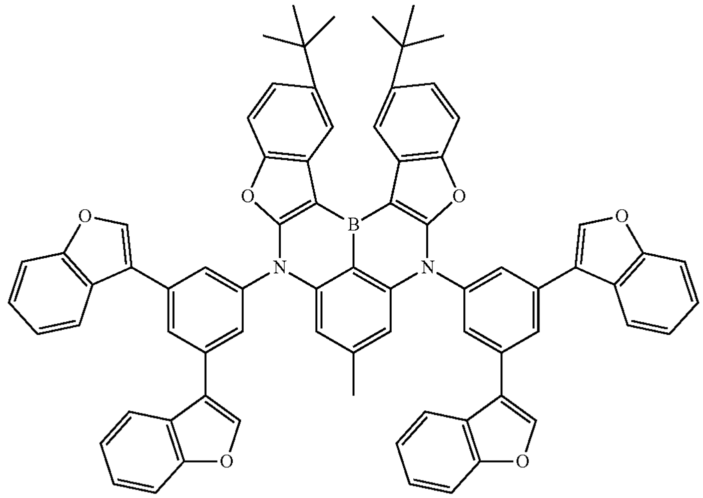
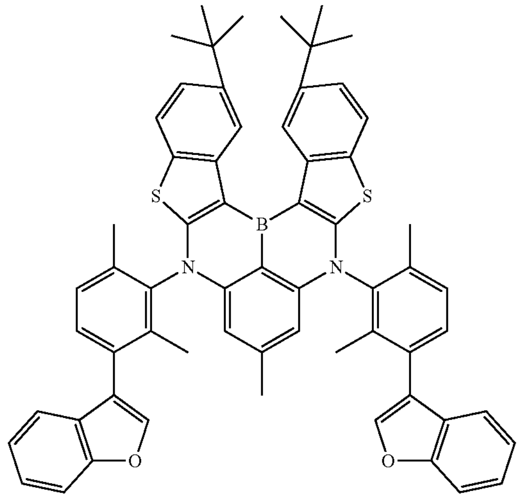

-continued
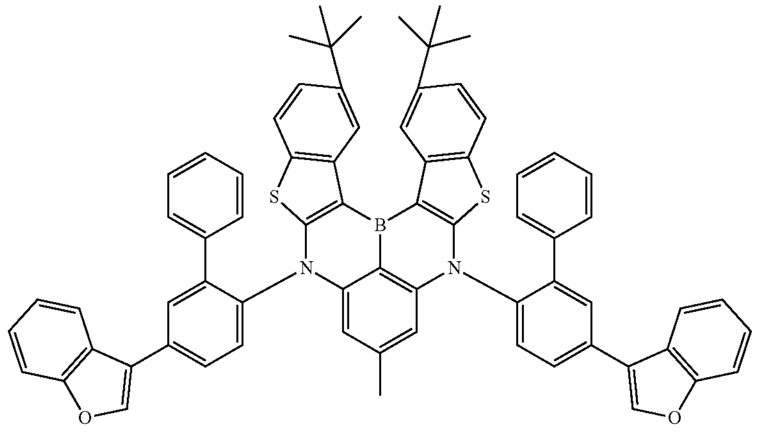
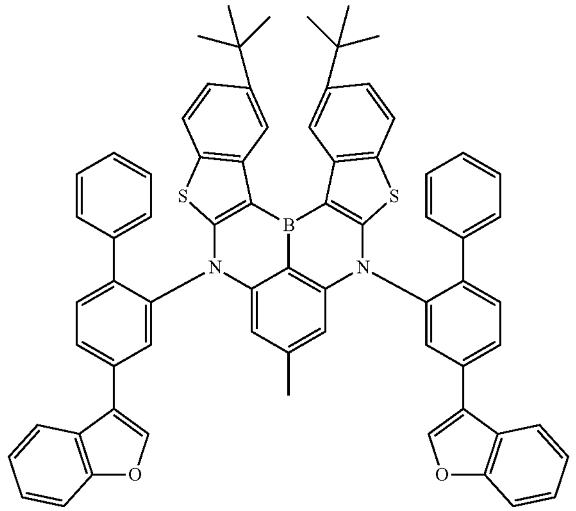
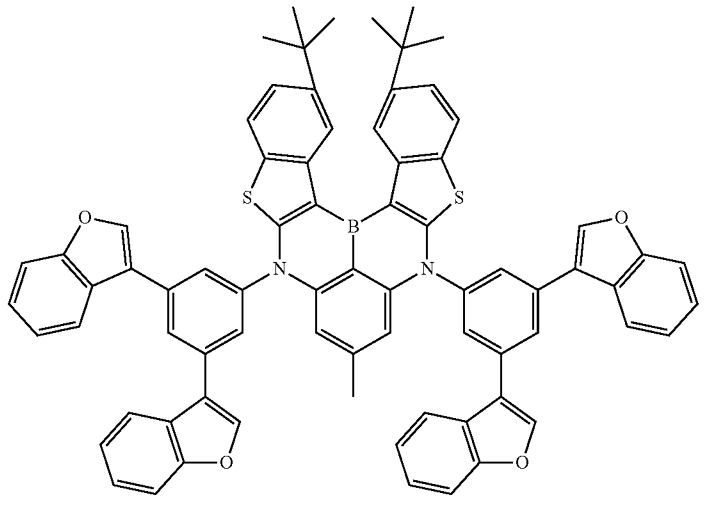

-continued
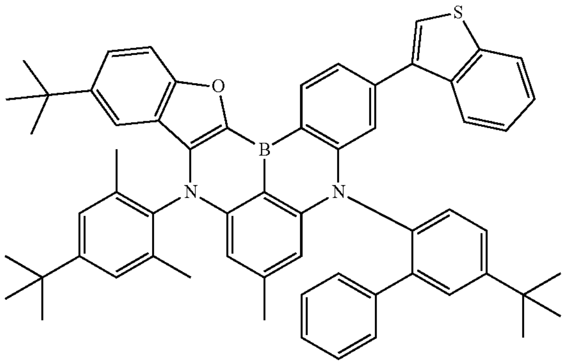
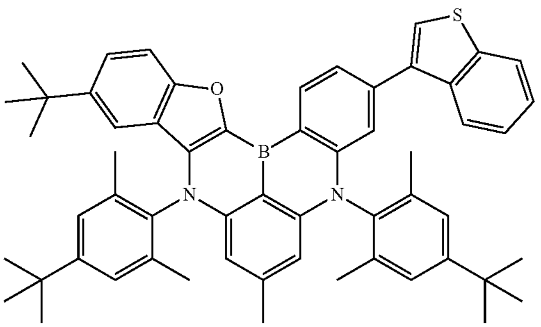
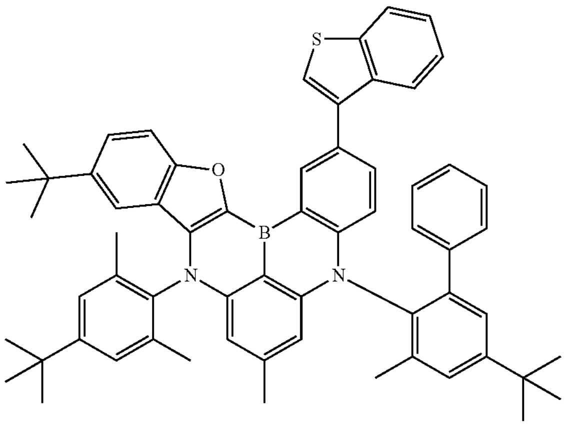
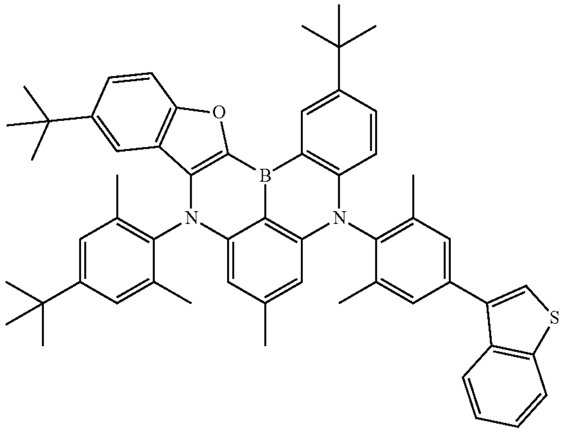
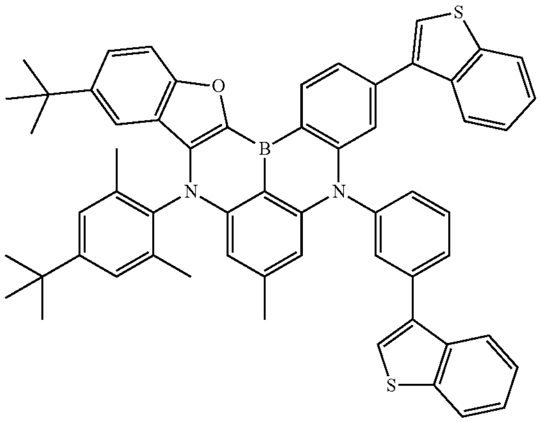
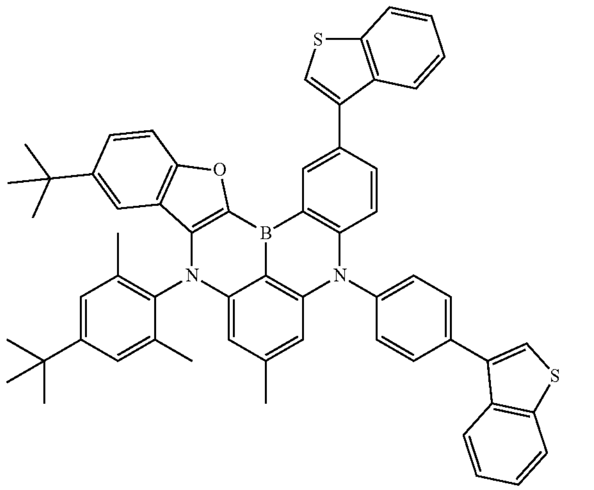
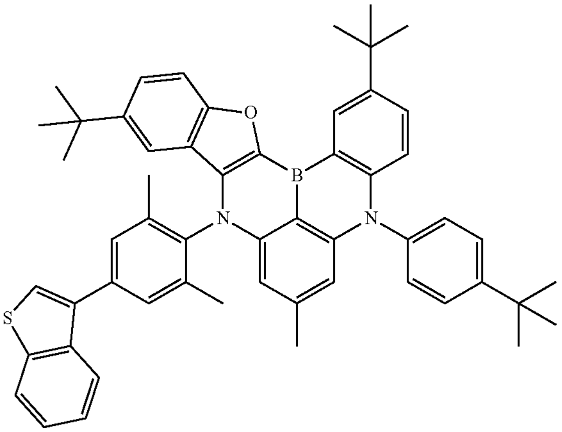
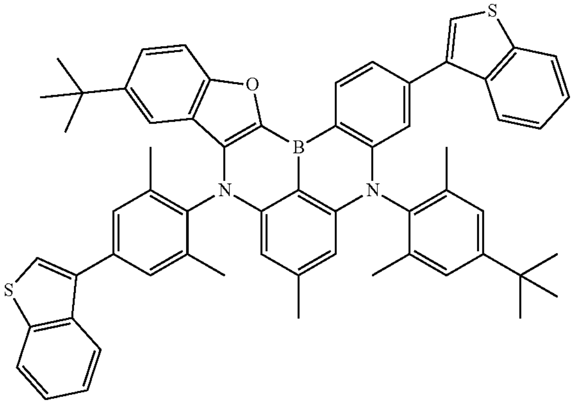

-continued
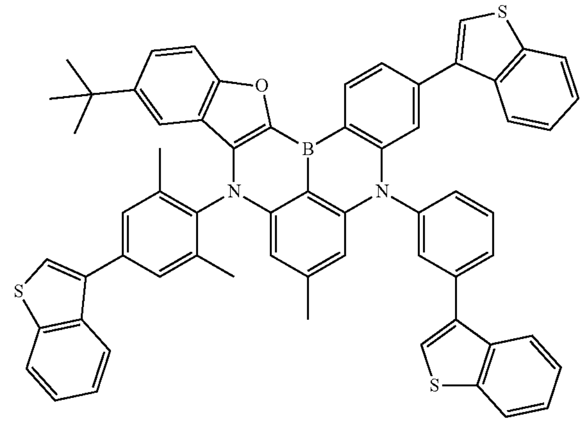
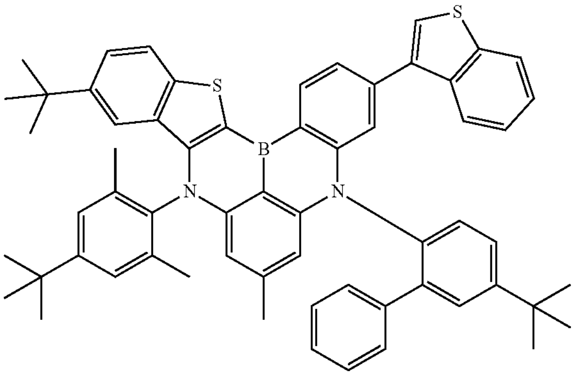
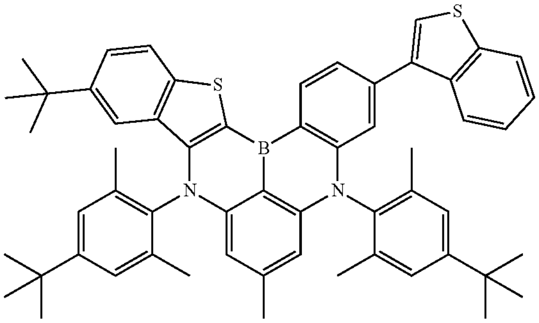
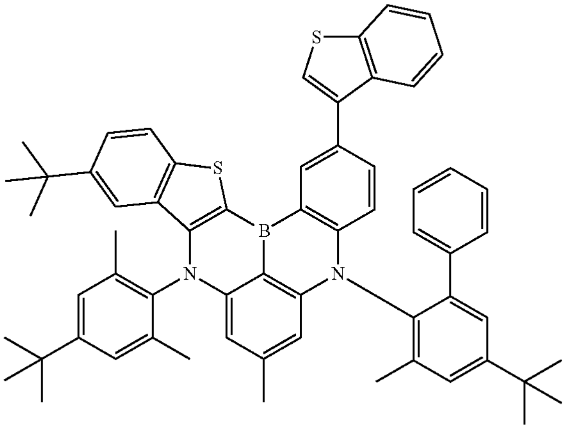
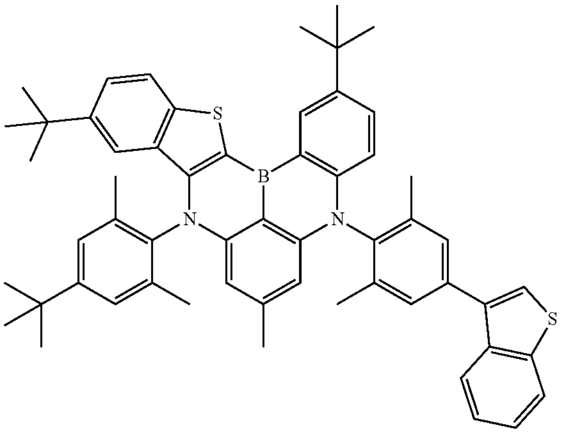
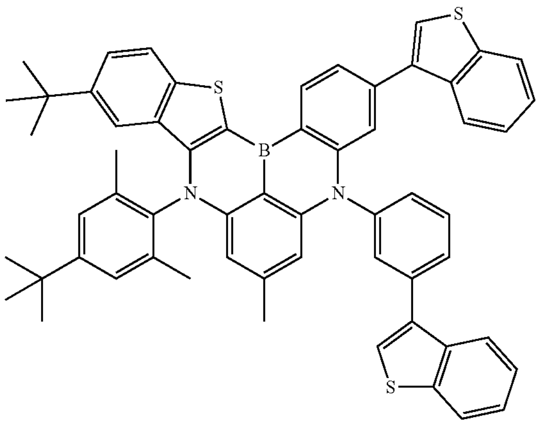

-continued
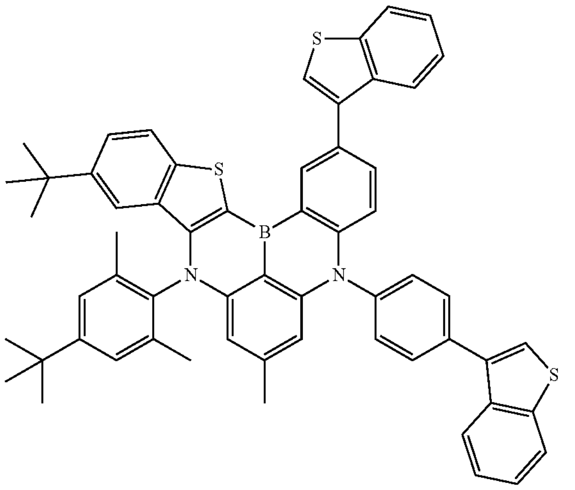
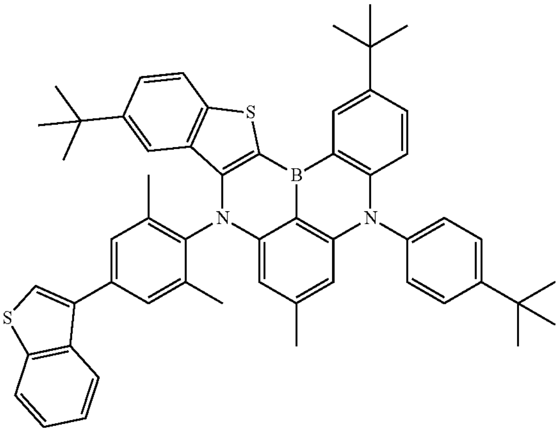
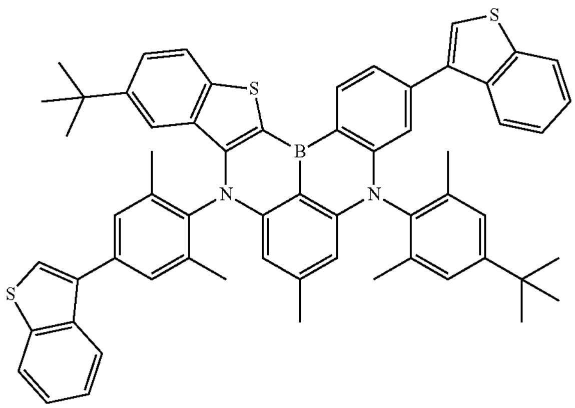
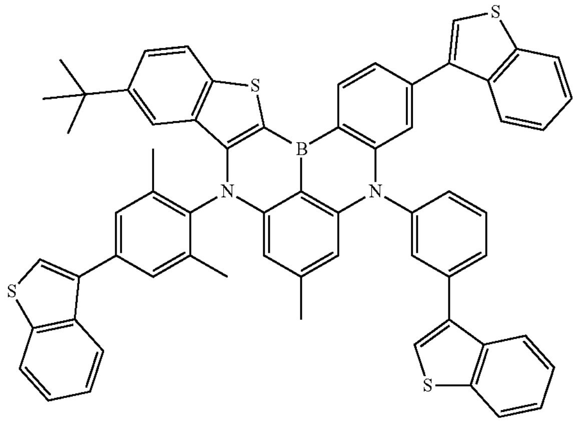
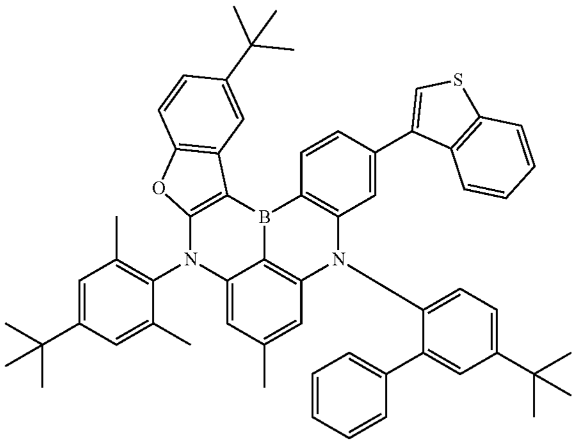
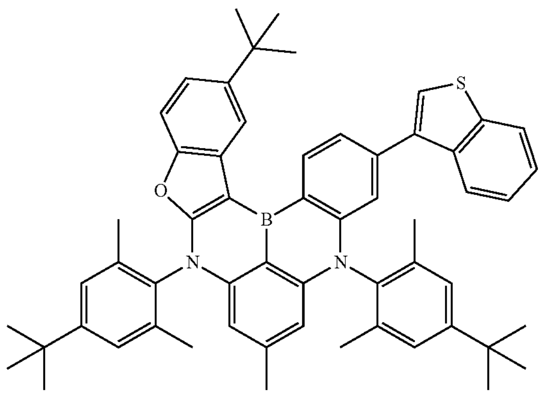

-continued
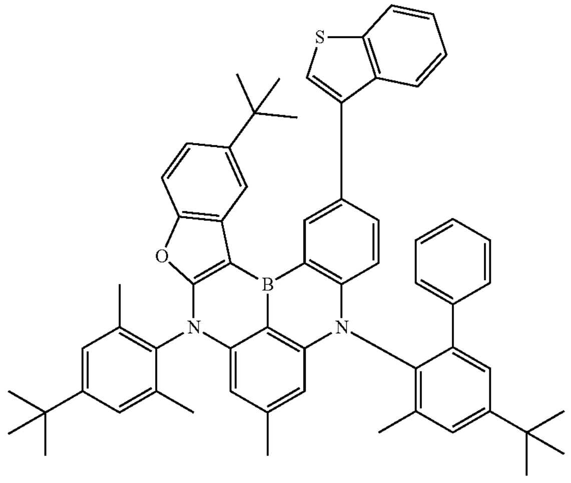
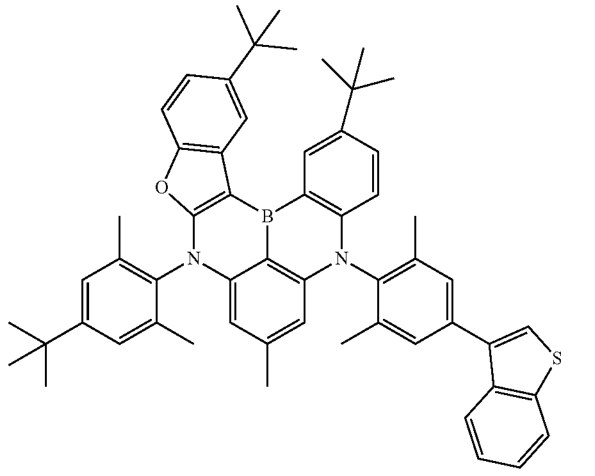
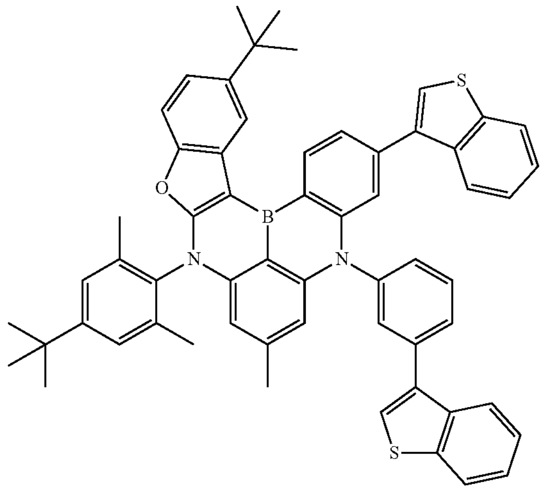
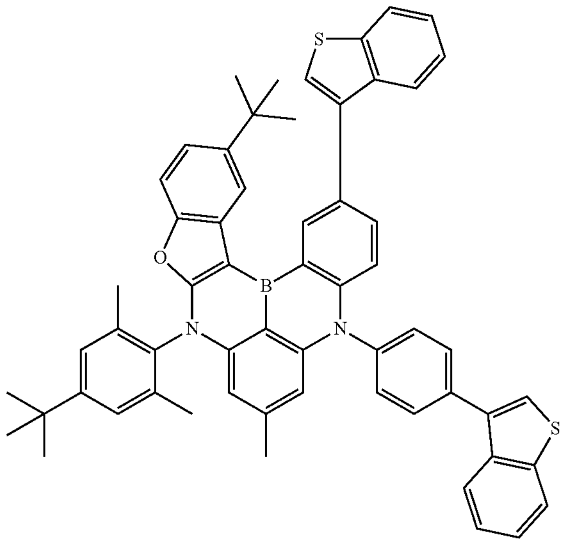
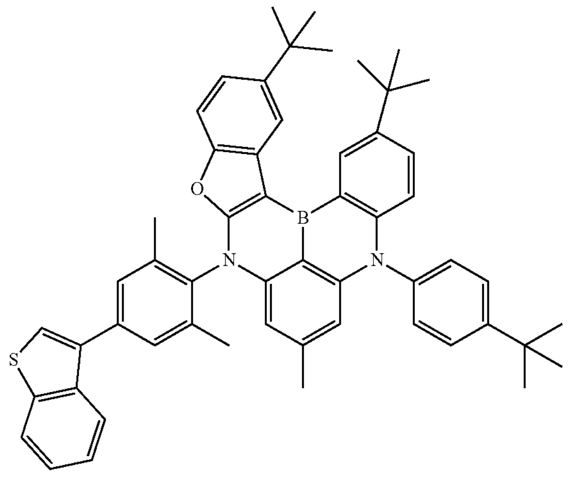
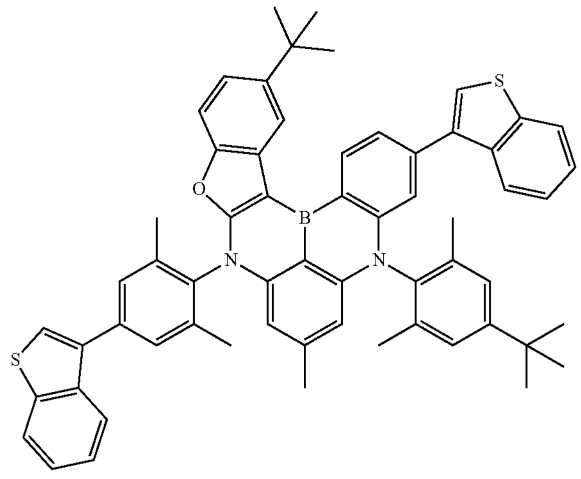

-continued
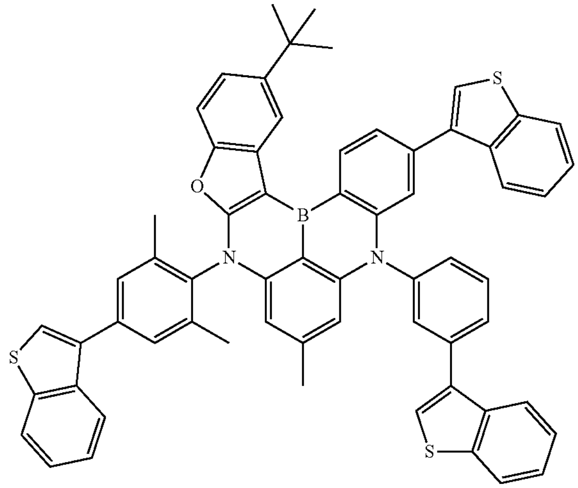
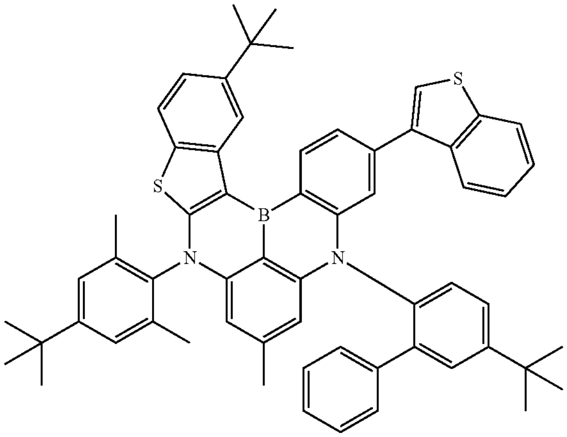
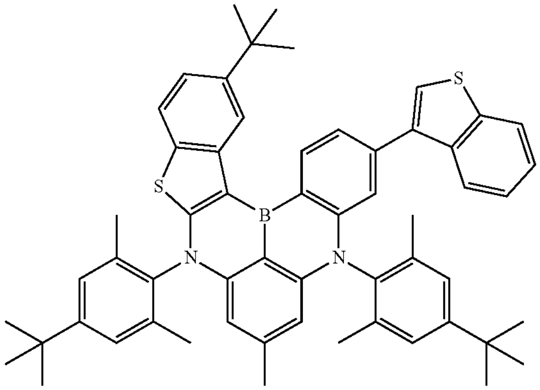
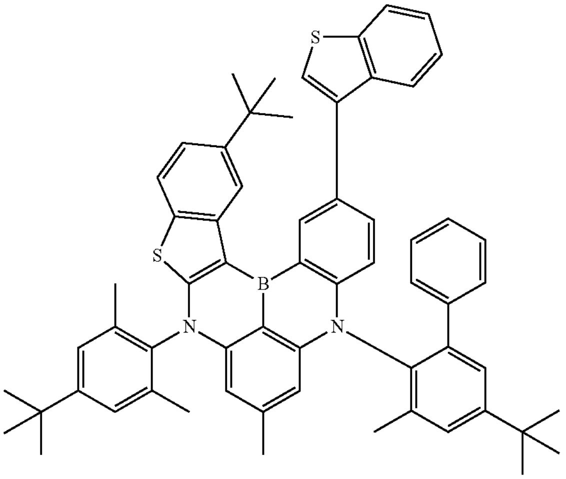
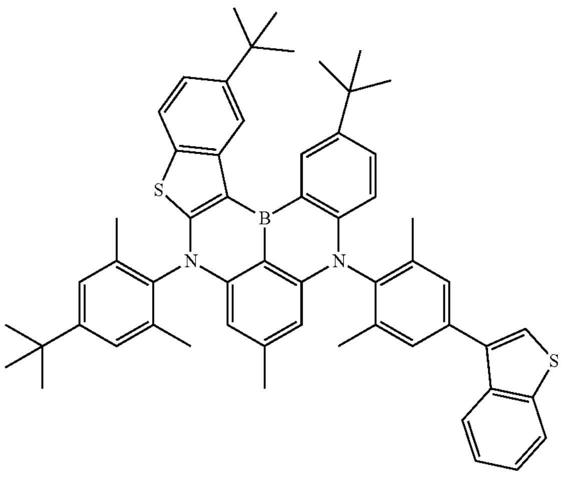
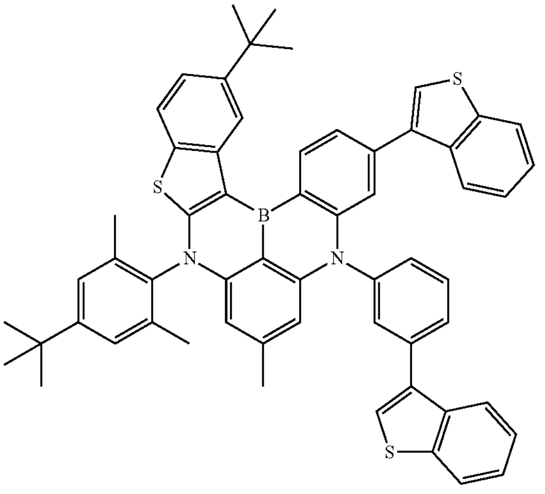

-continued
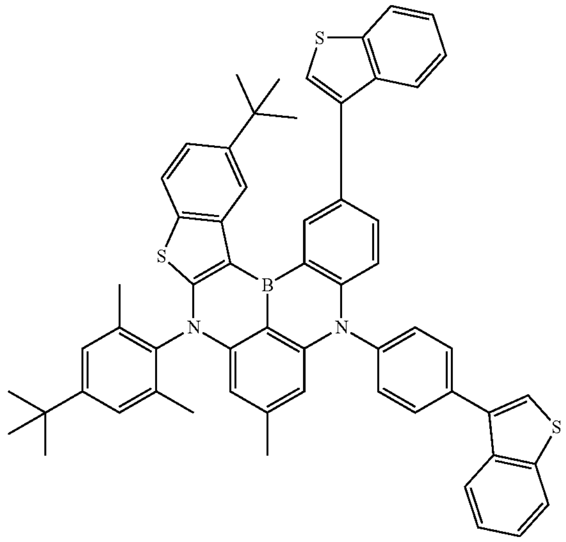
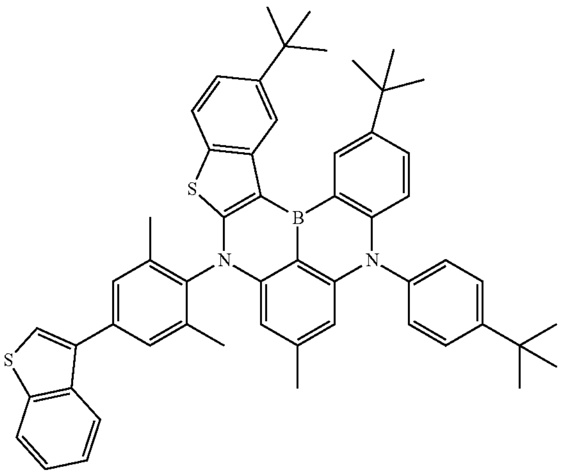
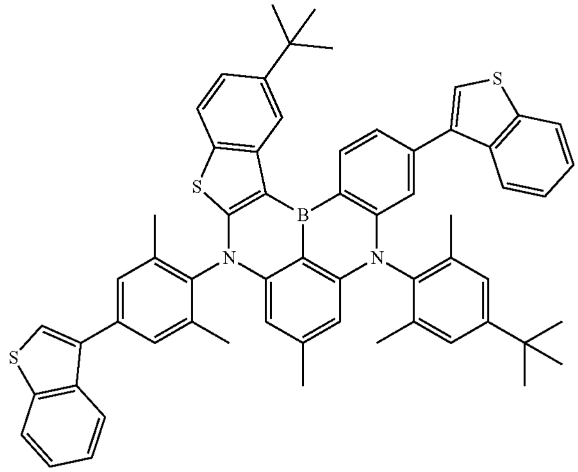
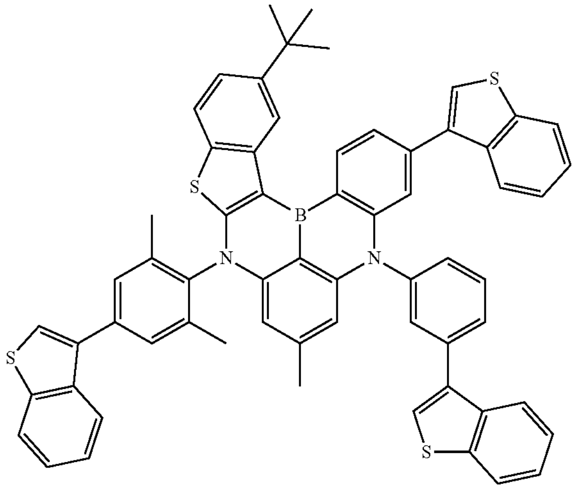
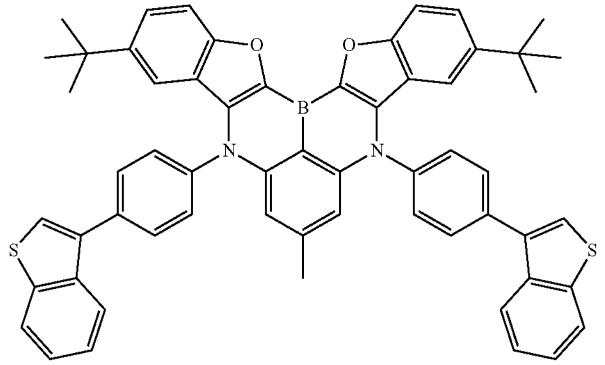
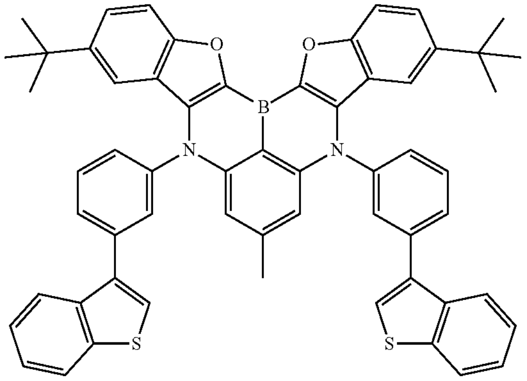

-continued
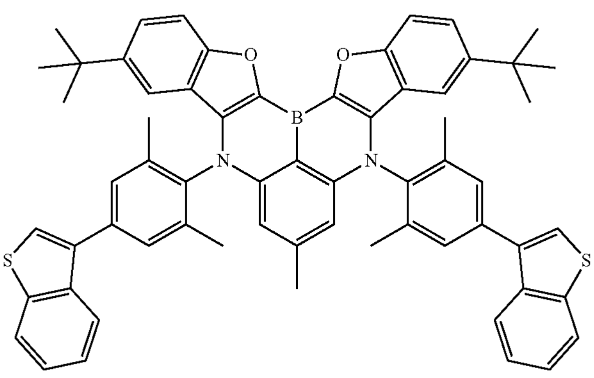
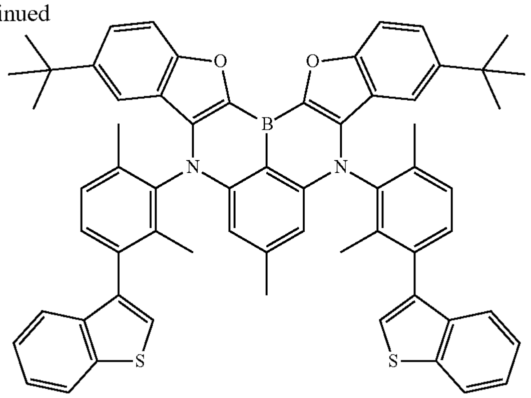
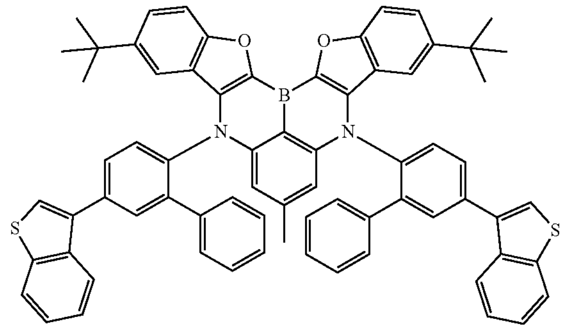
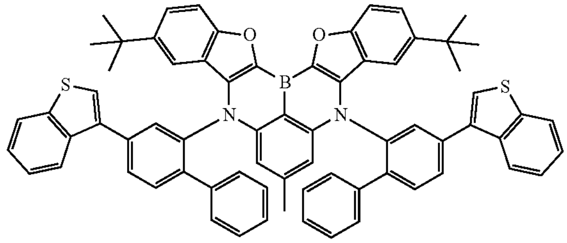
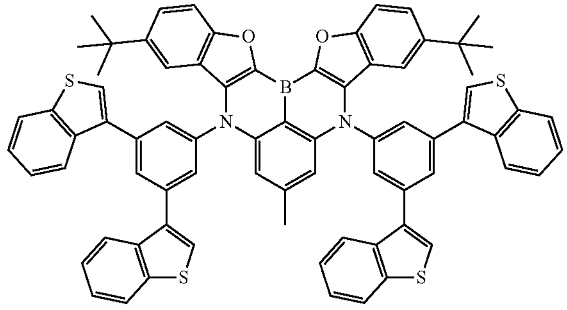
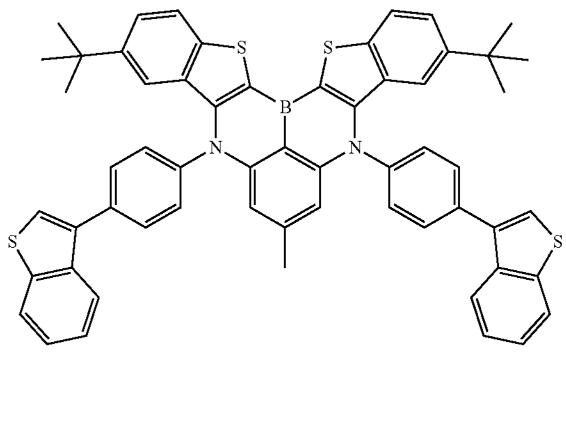
-continued
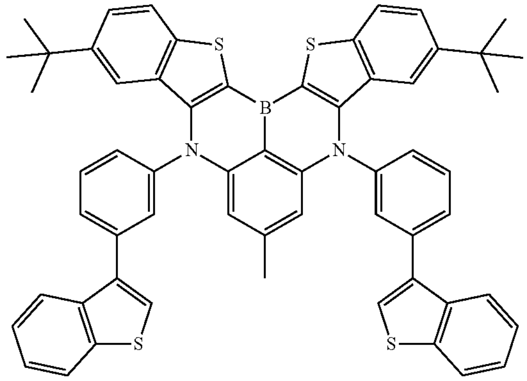
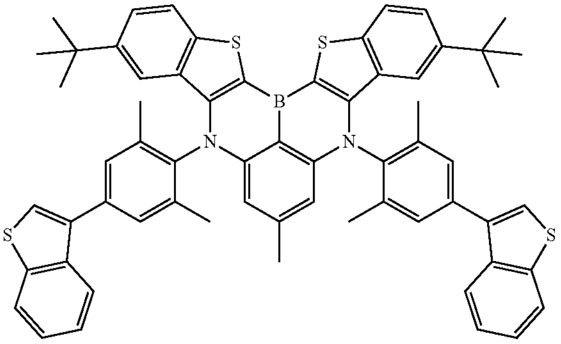
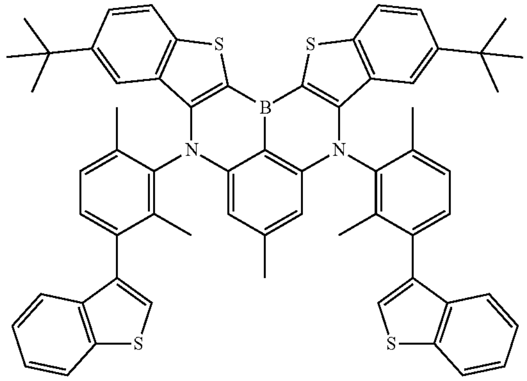

-continued
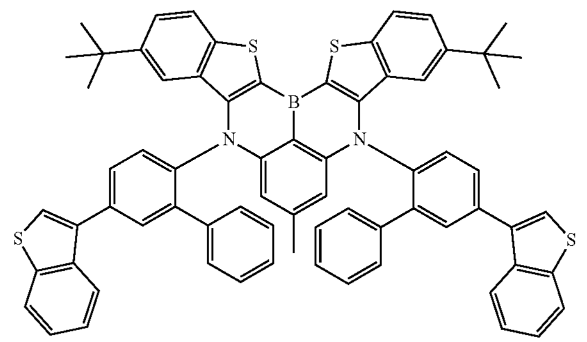
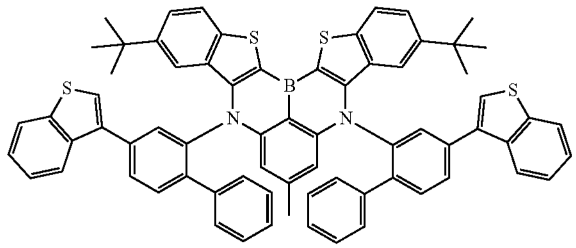
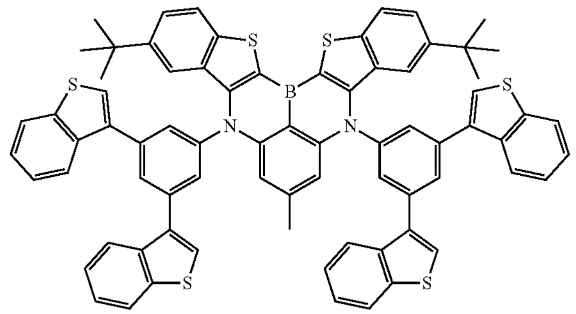
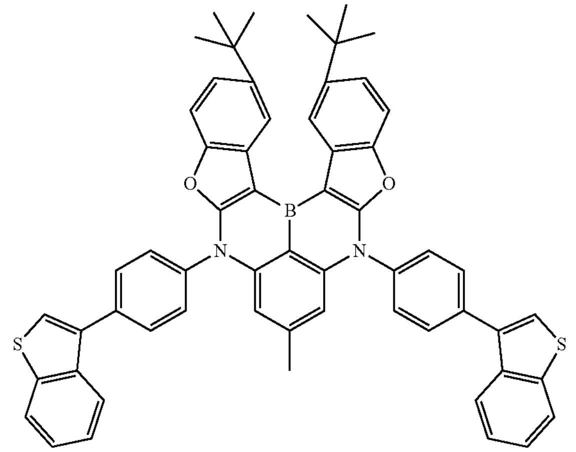
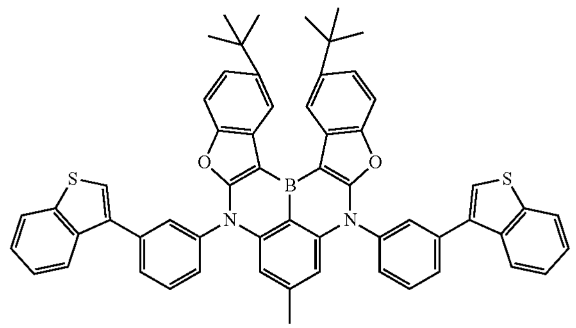
-continued
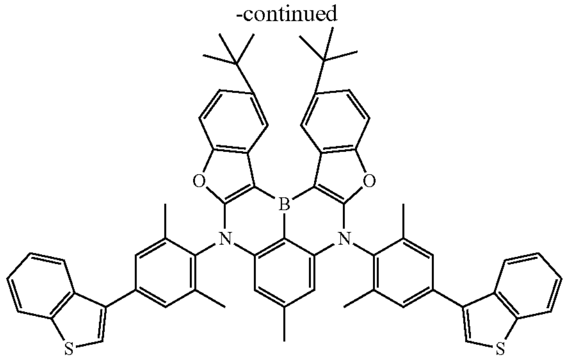
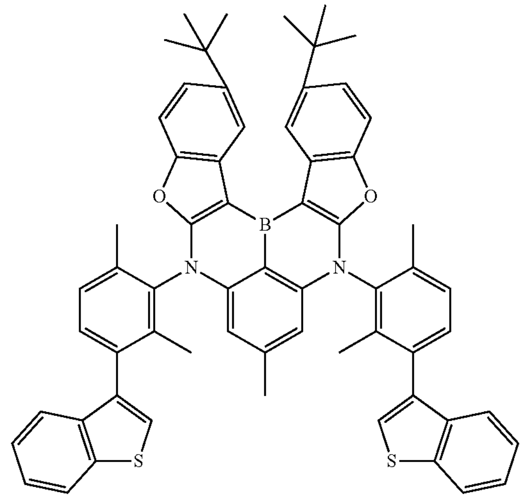
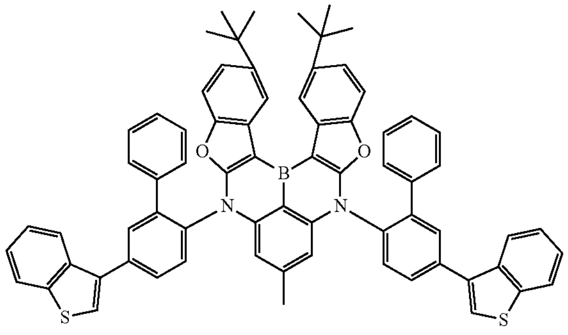
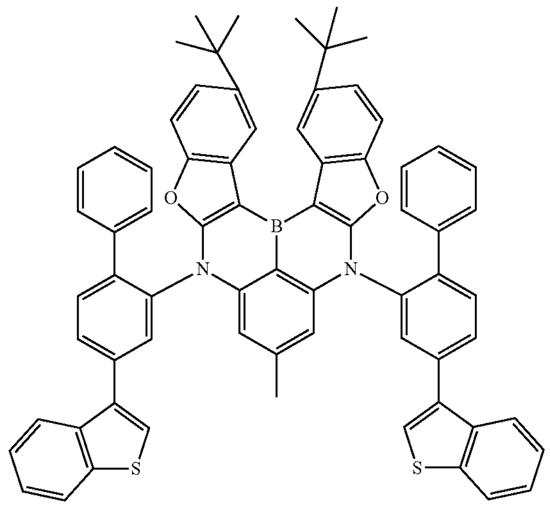

-continued
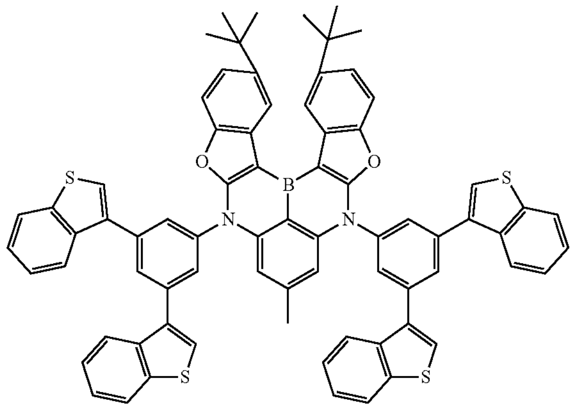
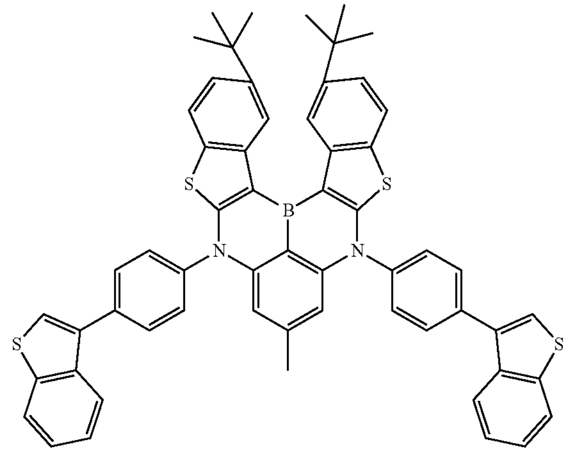
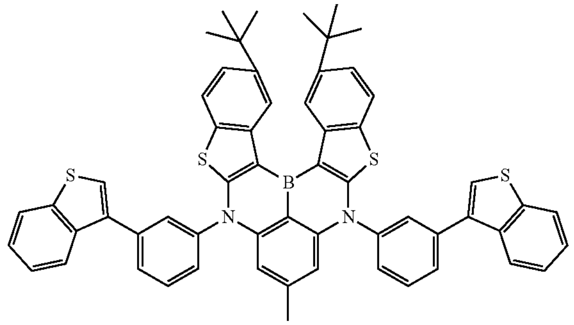
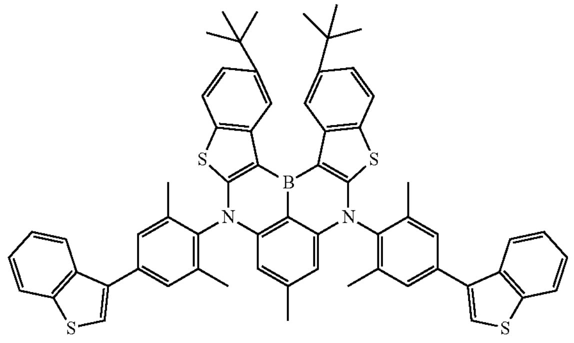
-continued
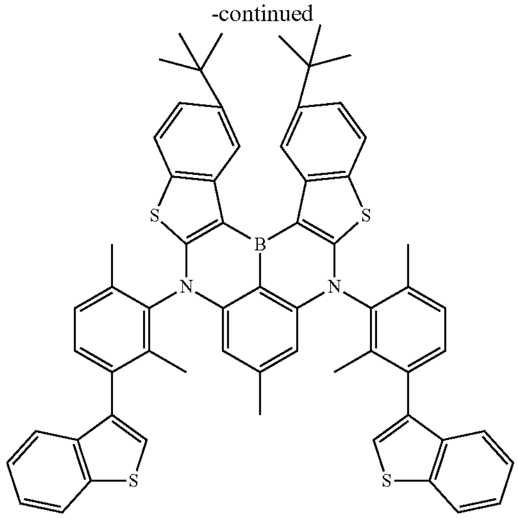
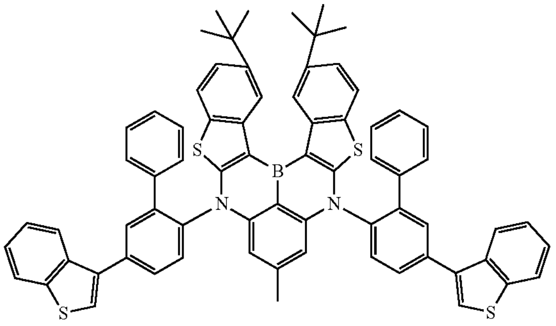
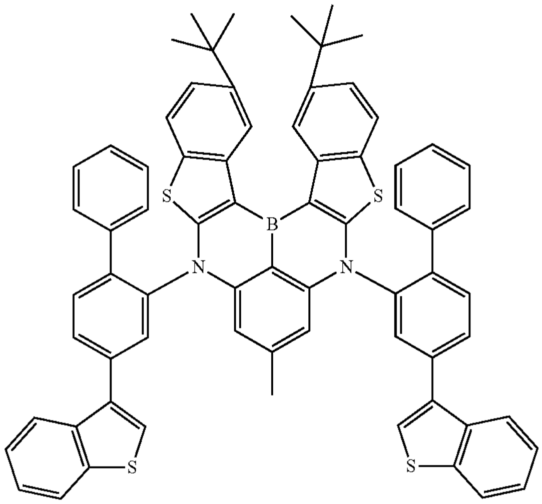
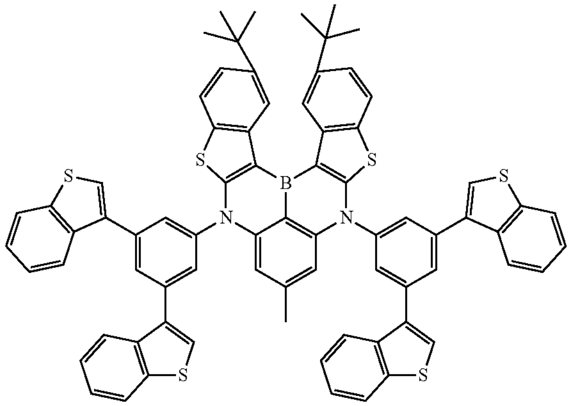

-continued
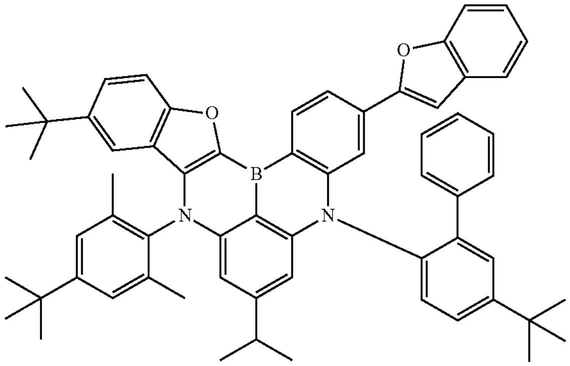
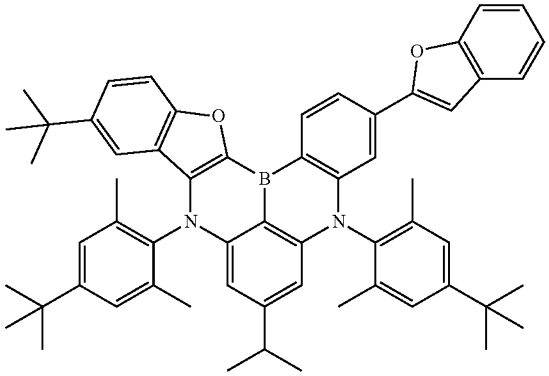
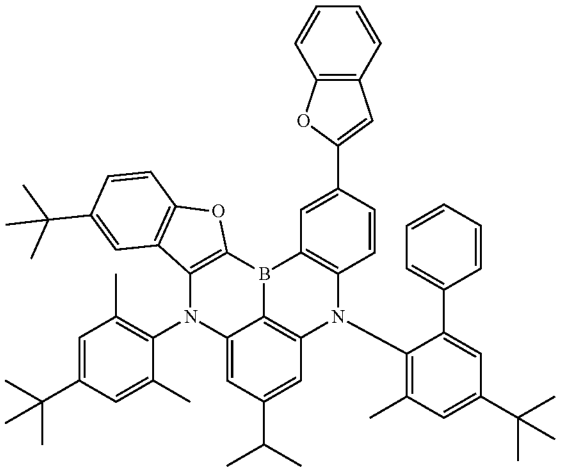
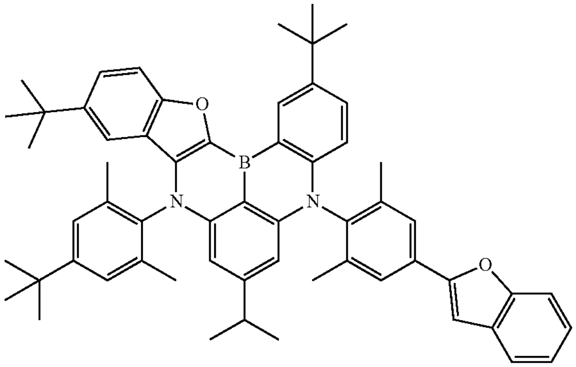
-continued
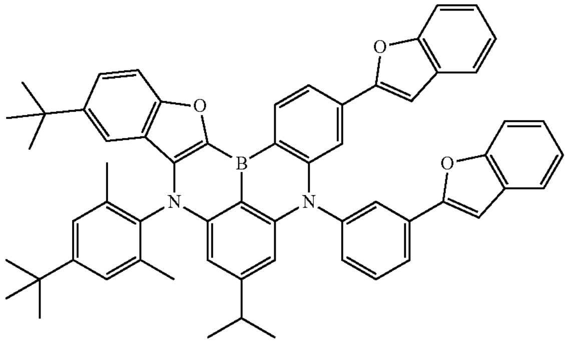
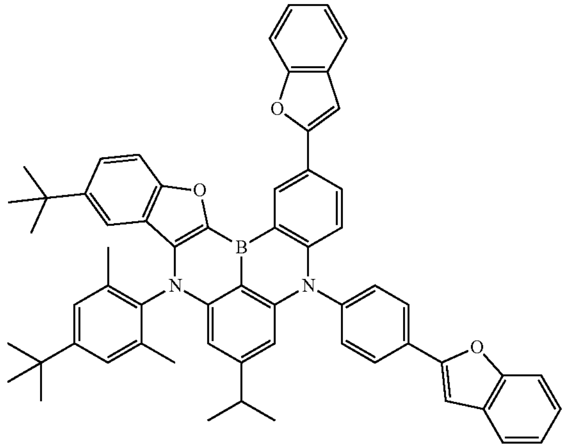
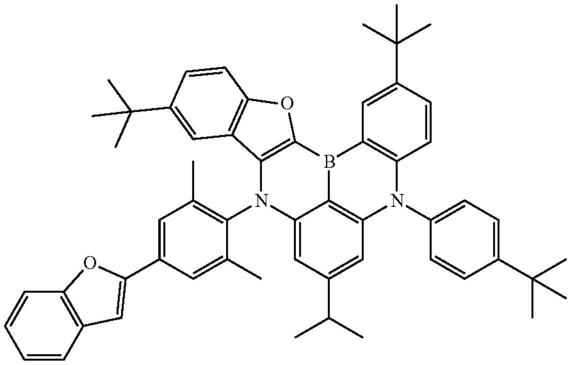
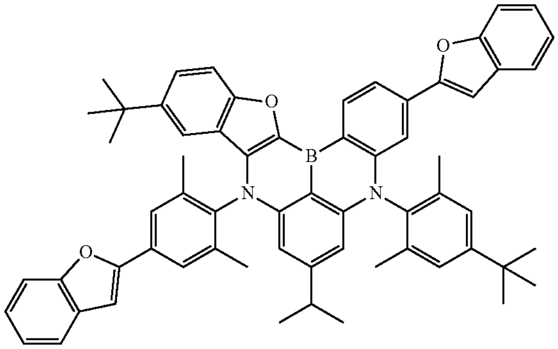

-continued
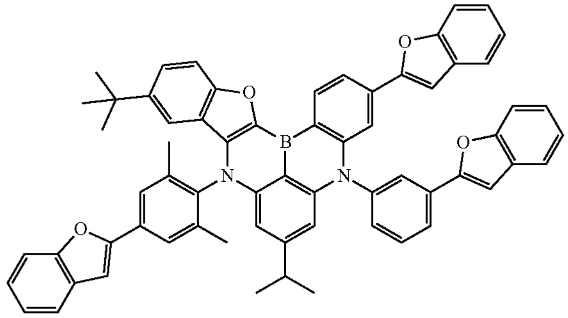
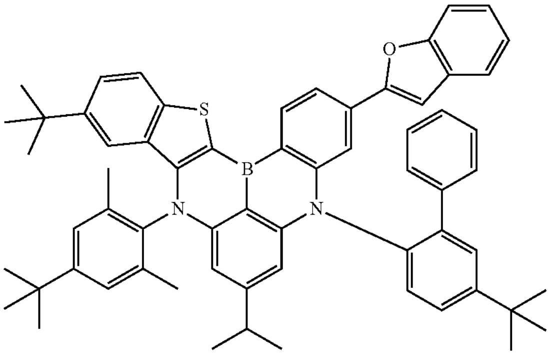
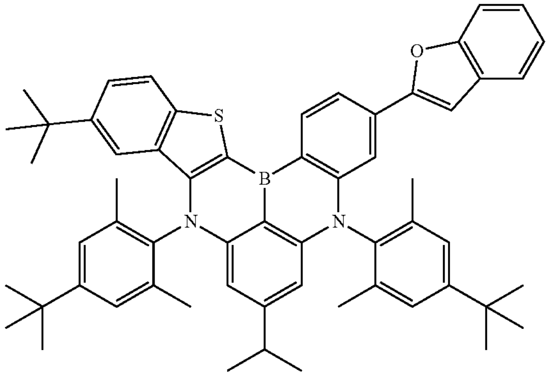
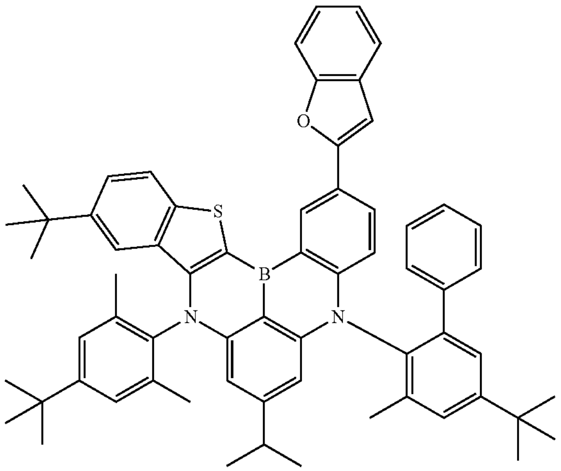
-continued
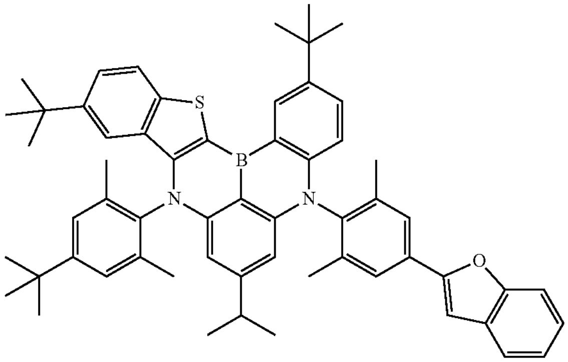
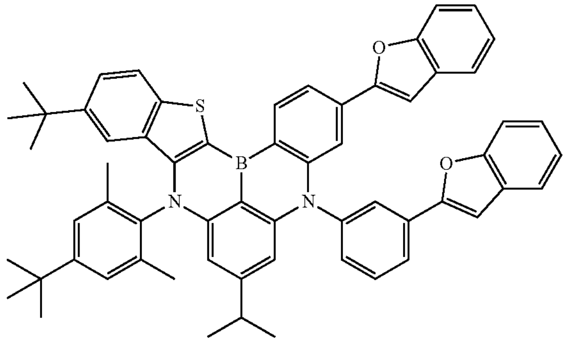
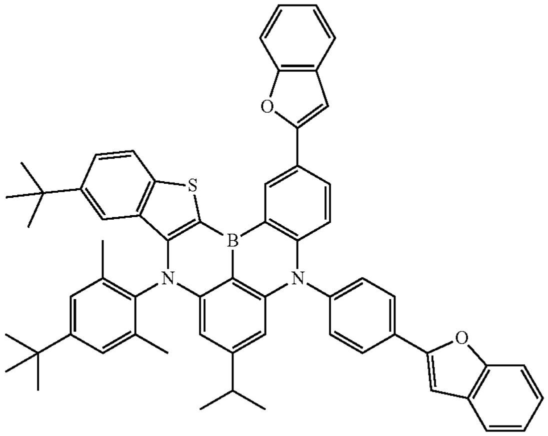
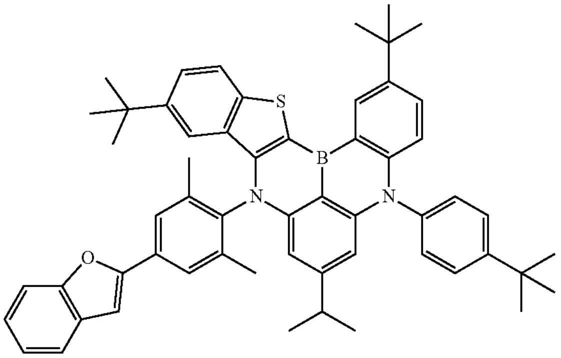

-continued
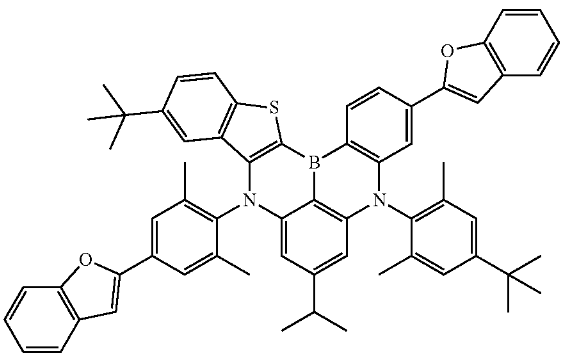
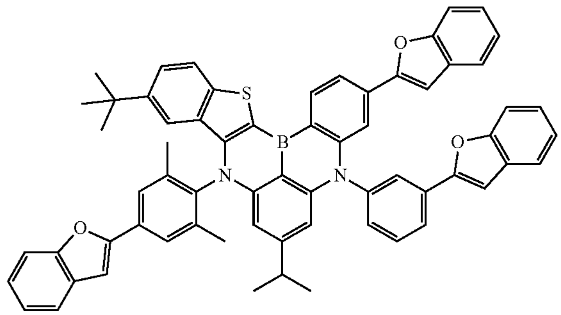
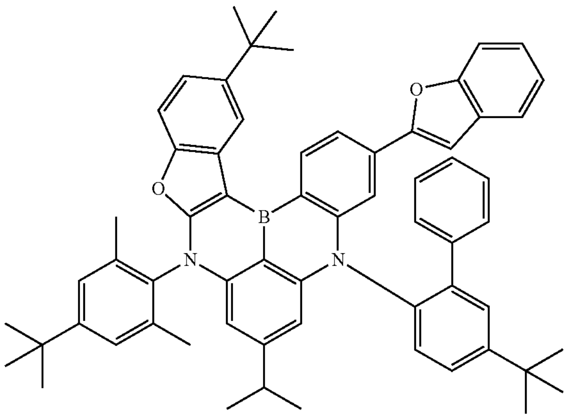
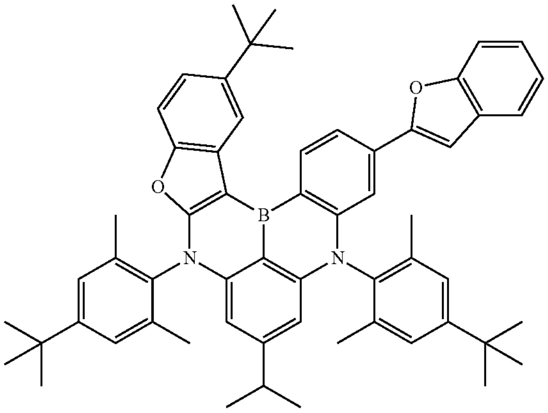
-continued
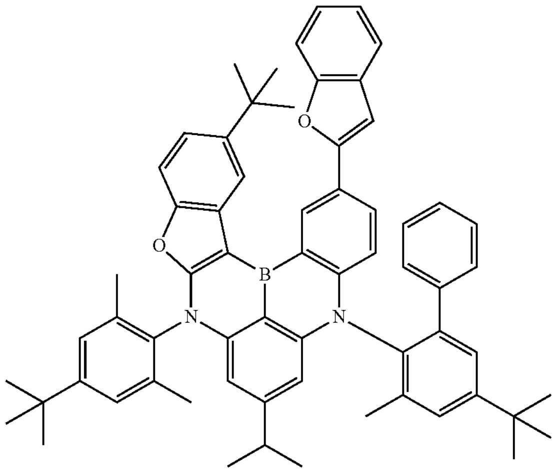
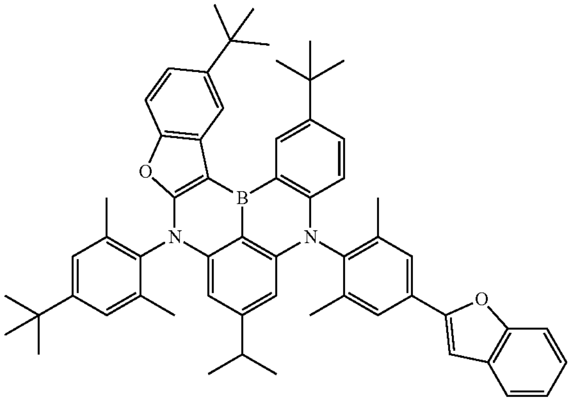
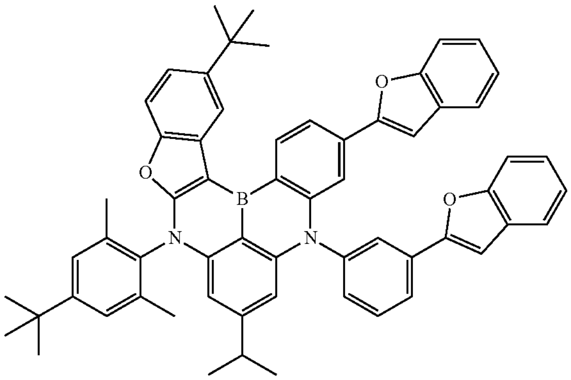
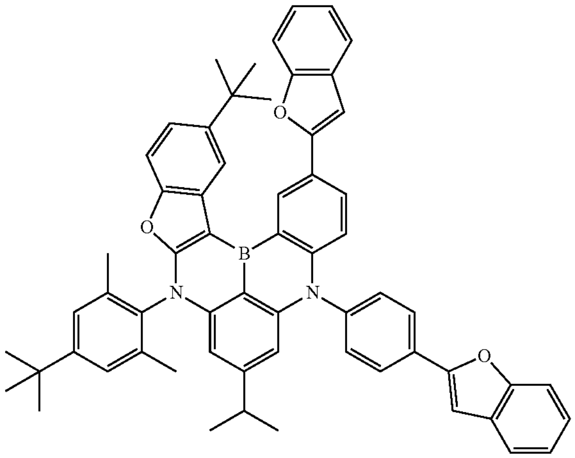

-continued
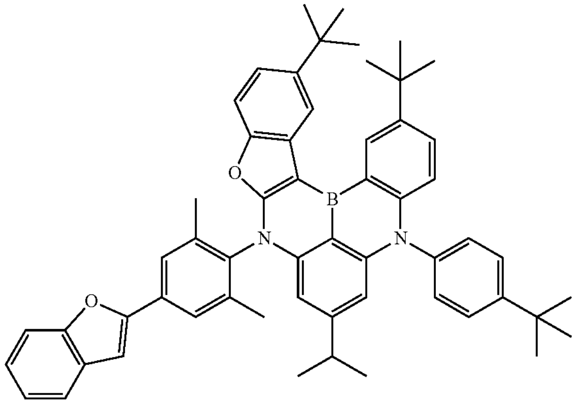
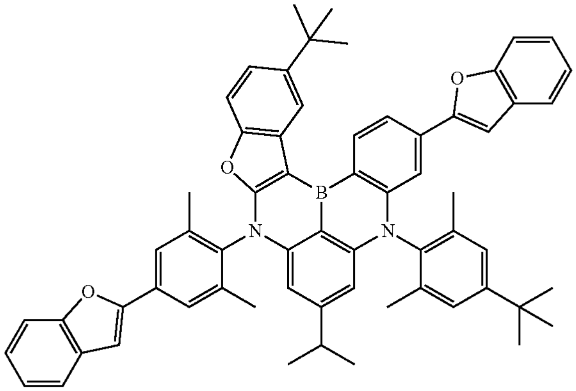
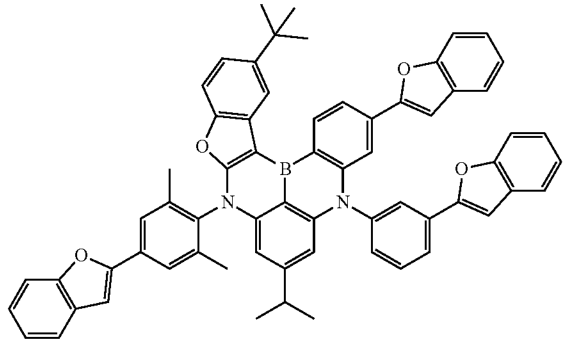
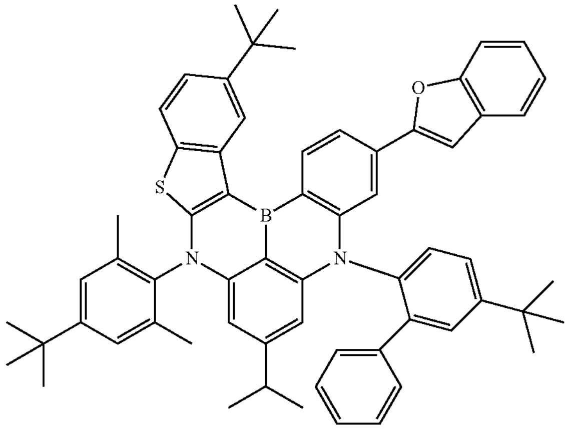
-continued
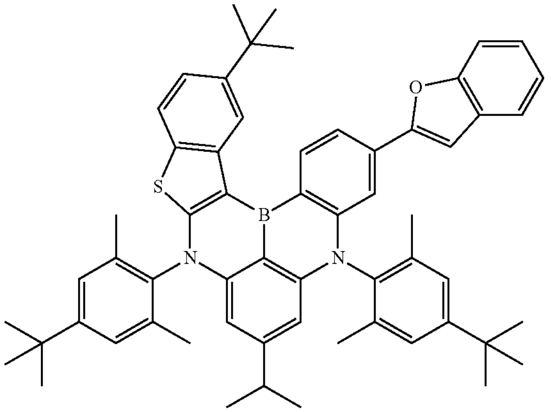
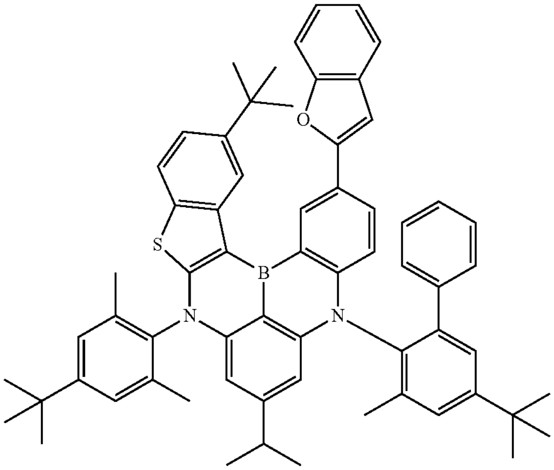
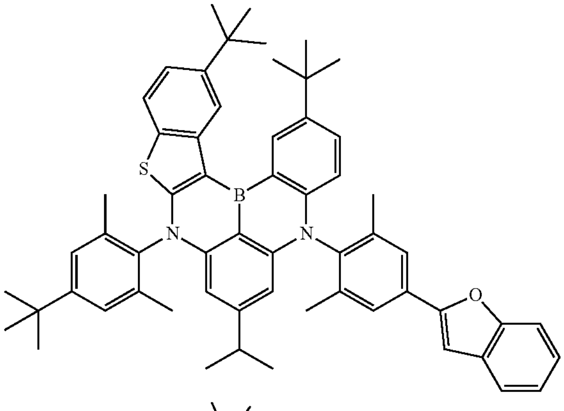
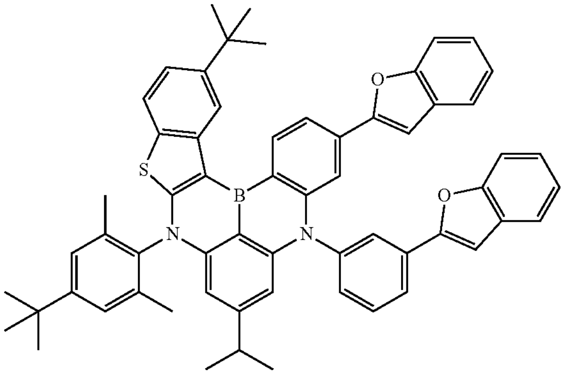

-continued
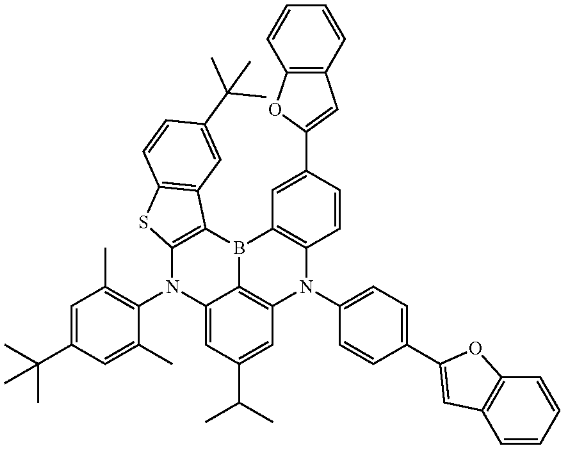
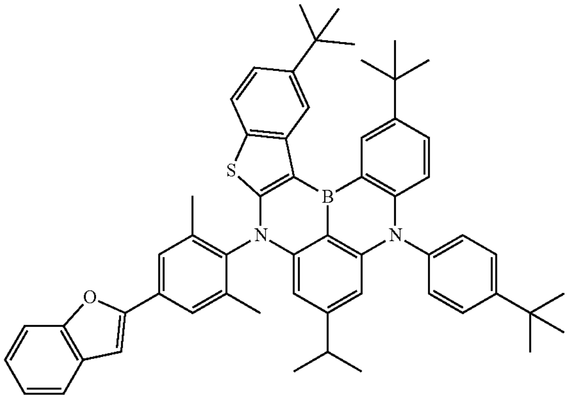
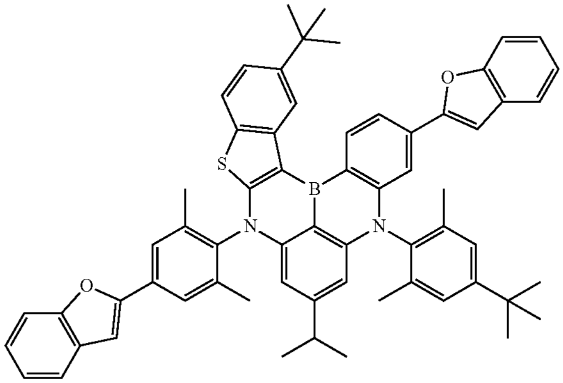
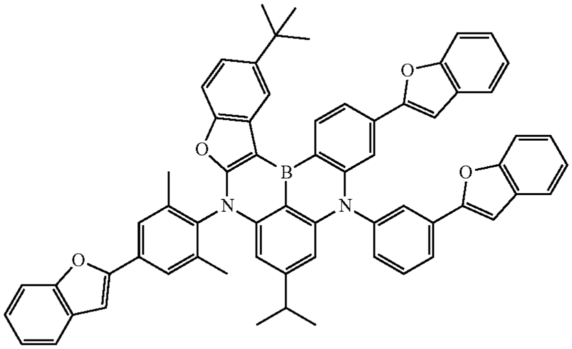
-continued
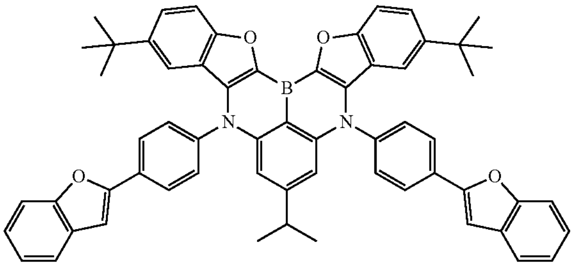
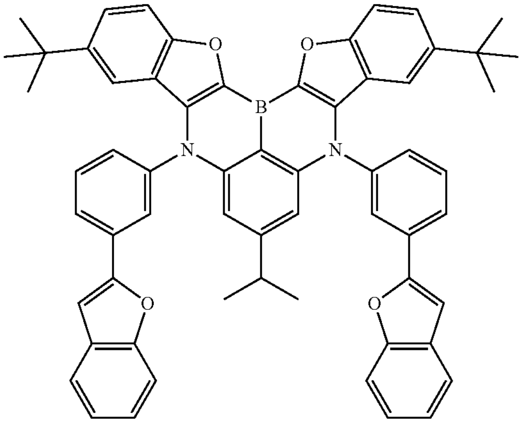
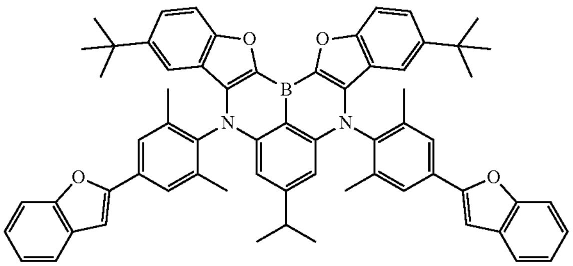
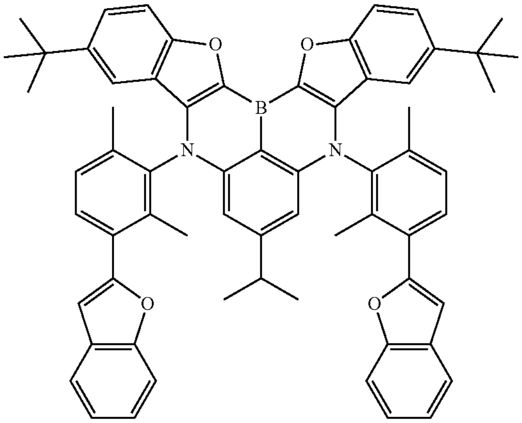
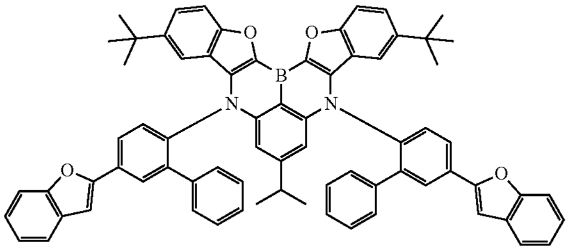

-continued
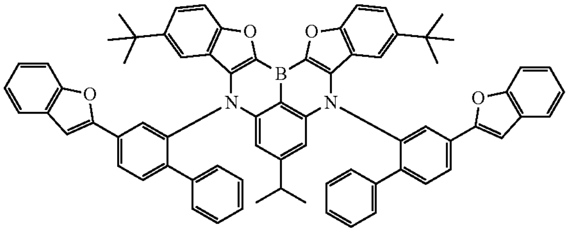
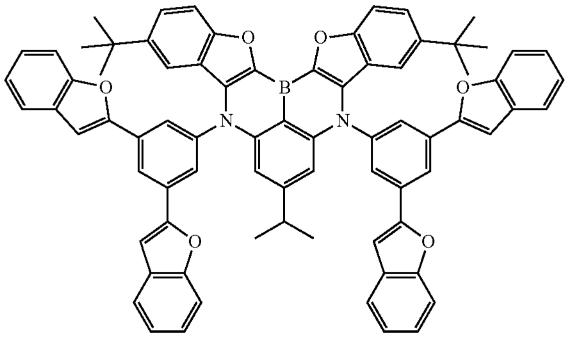
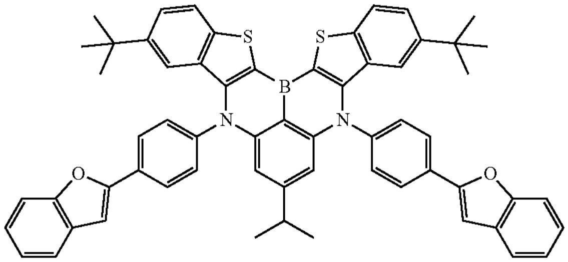
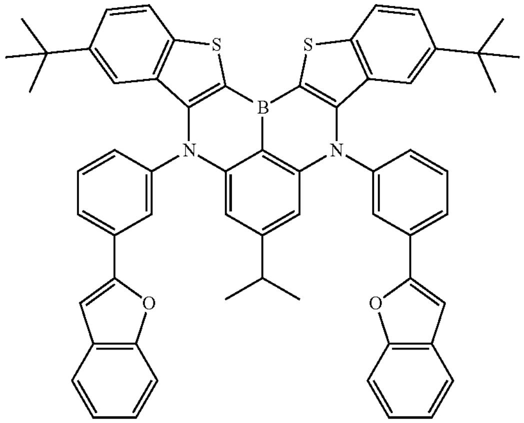
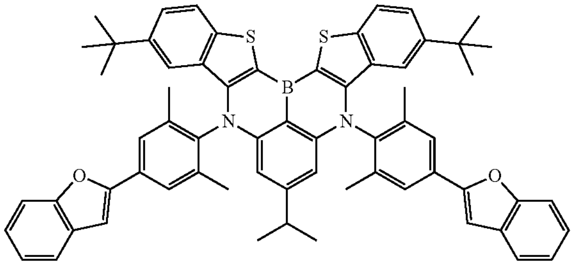
-continued
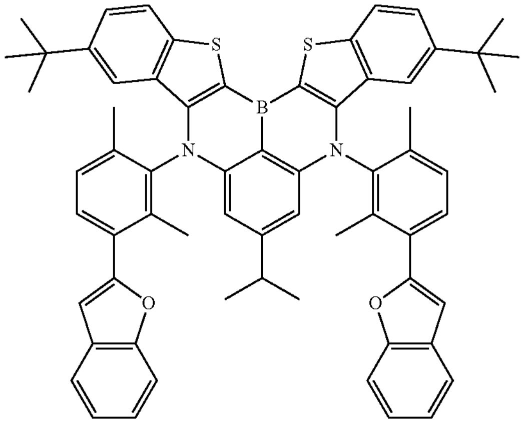
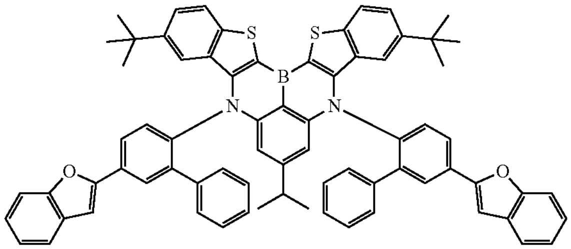
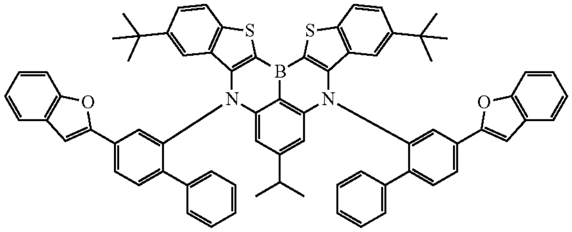
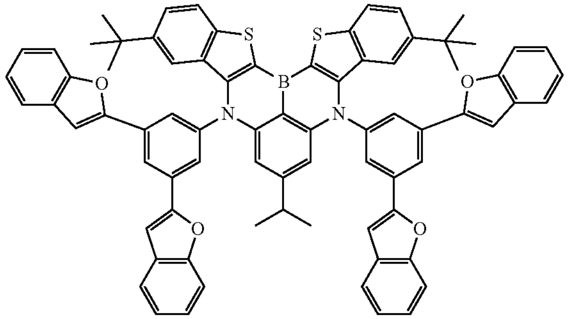
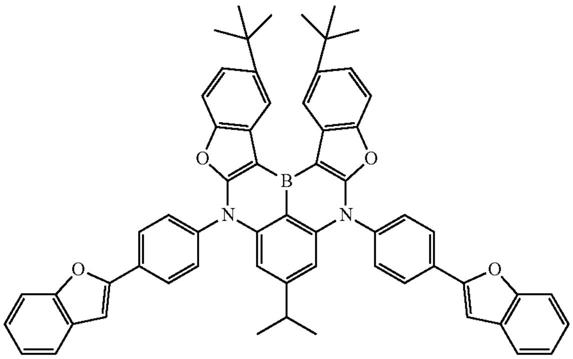

-continued
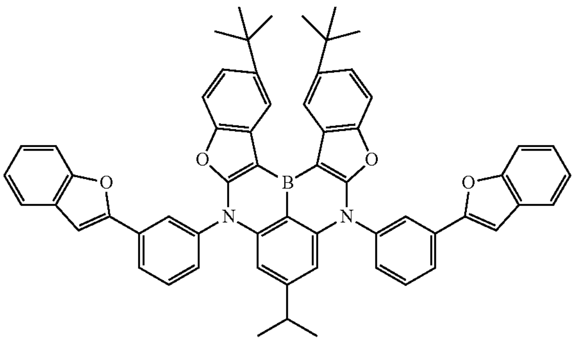
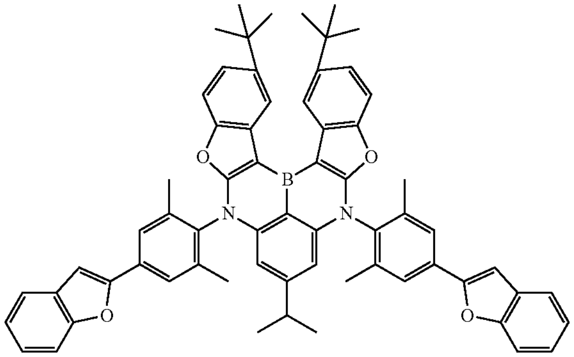
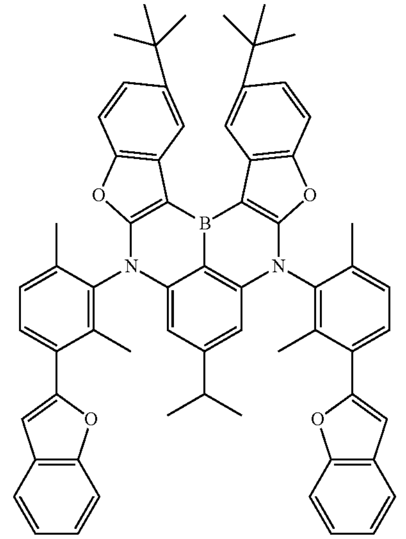
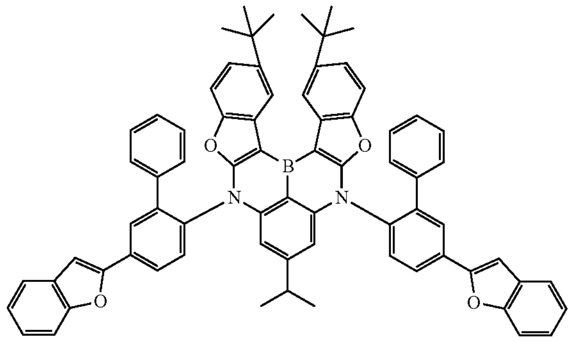
-continued
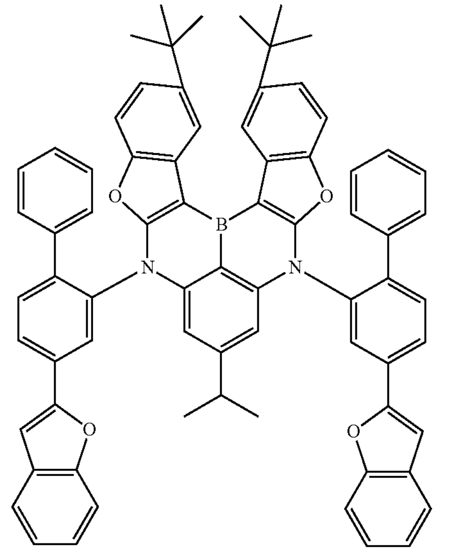
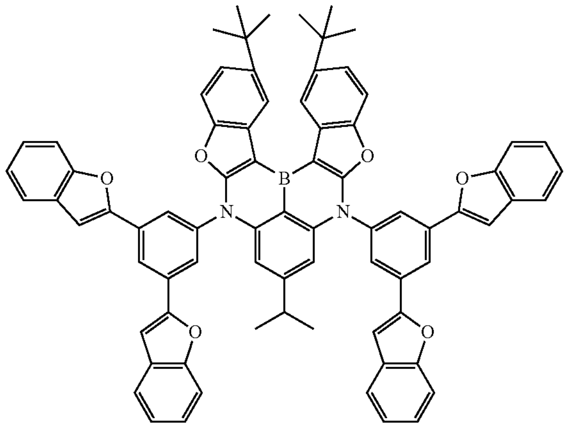
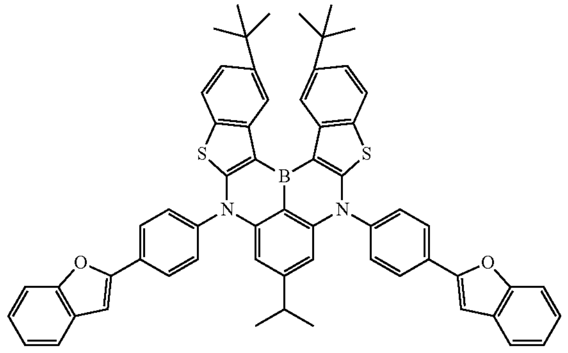
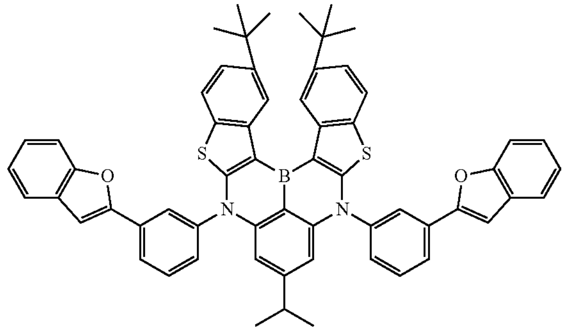

-continued
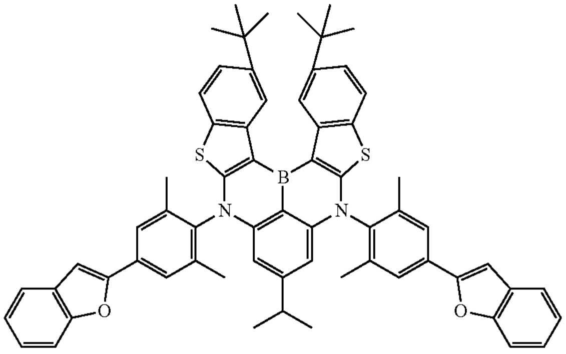
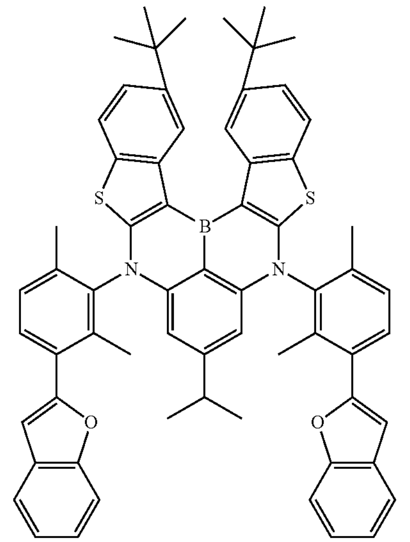
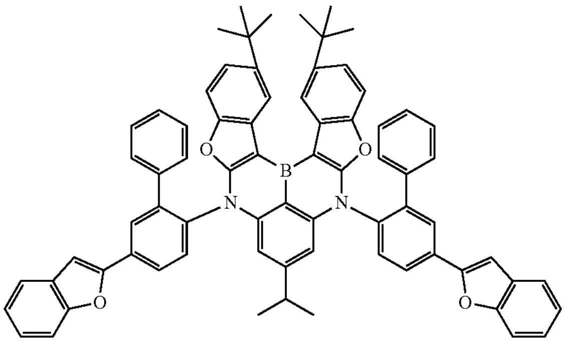
-continued
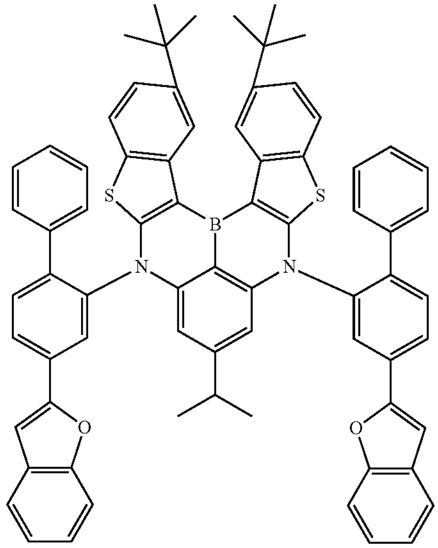
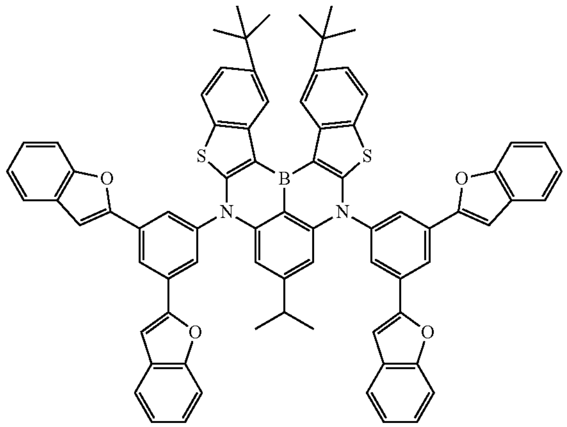
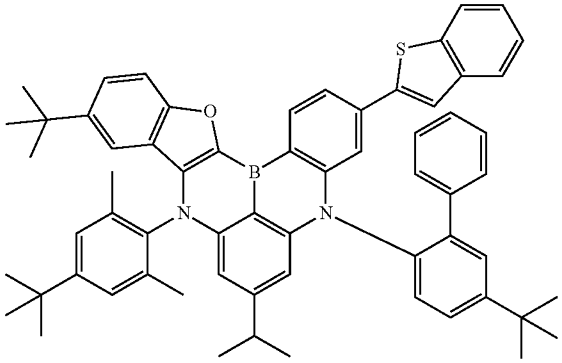
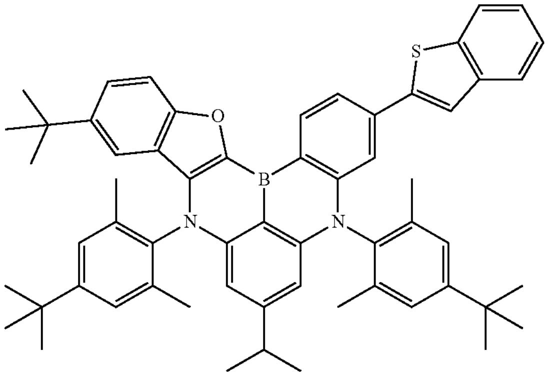

-continued
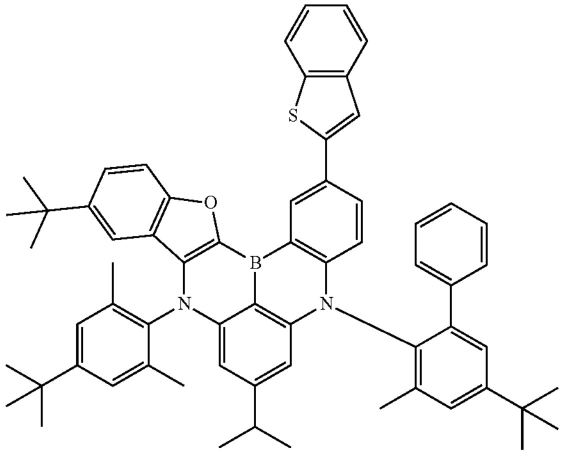
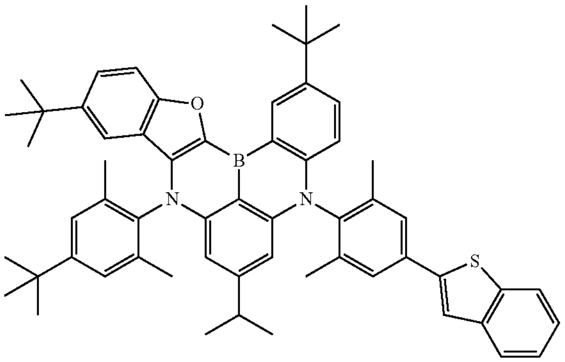
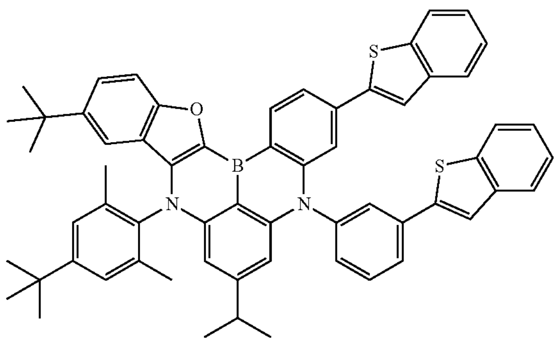
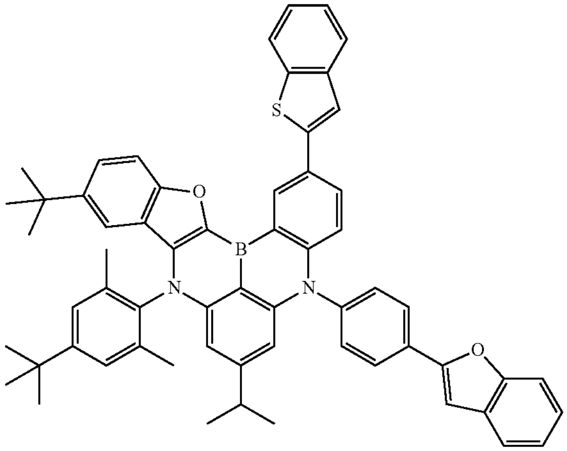
-continued
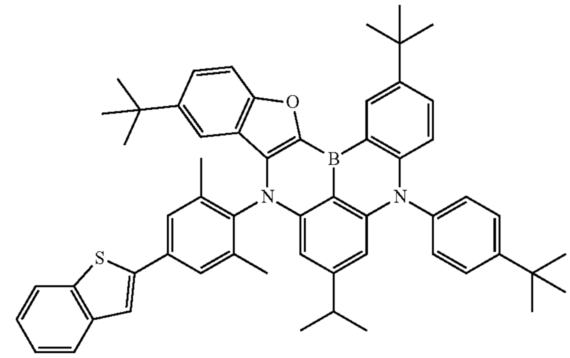
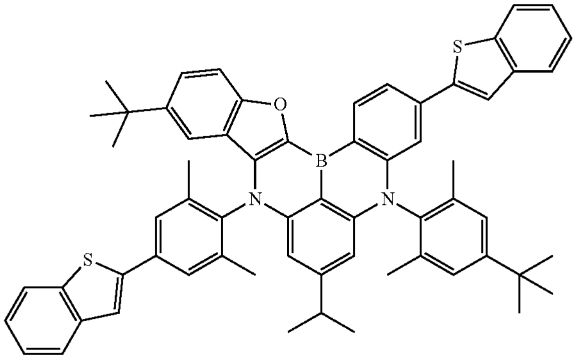
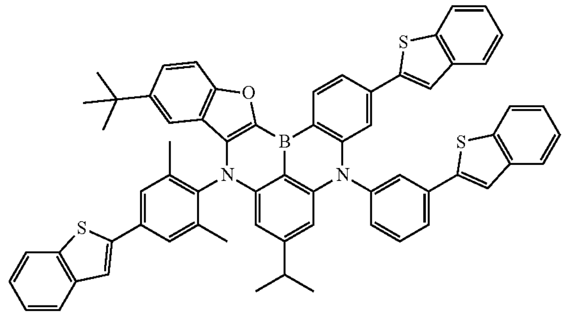
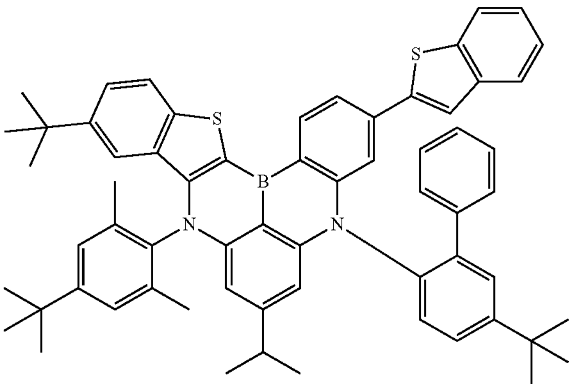

-continued
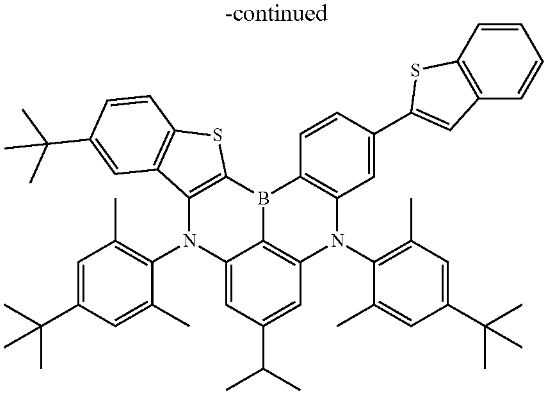
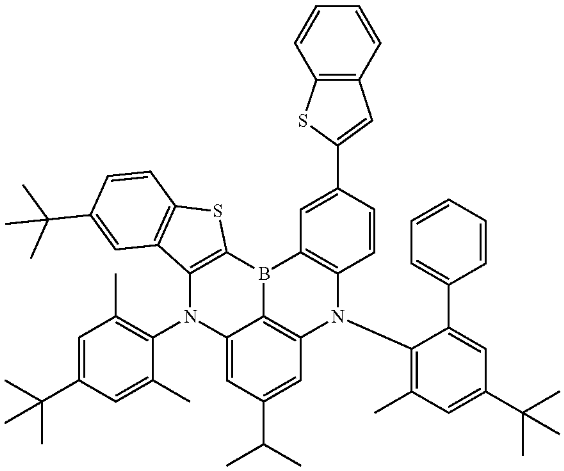
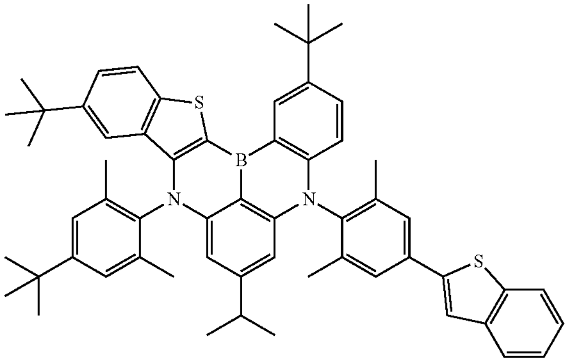
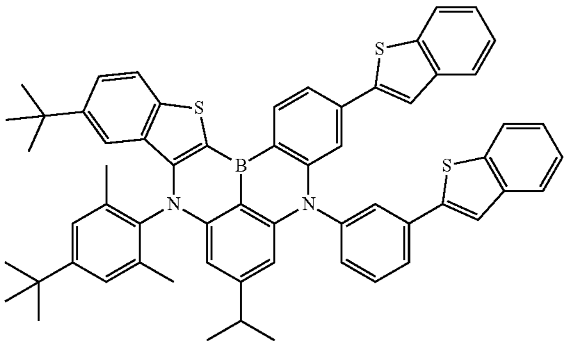
-continued
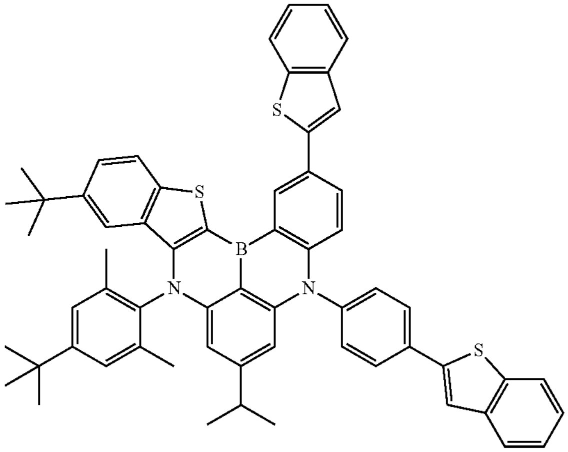
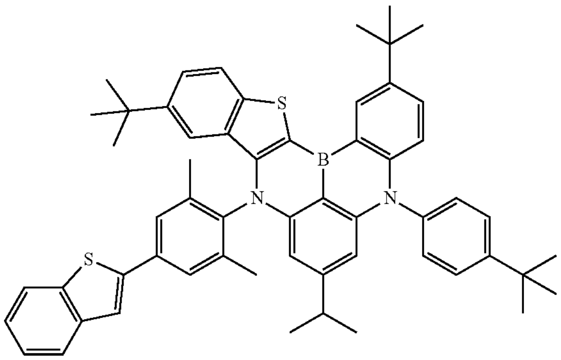
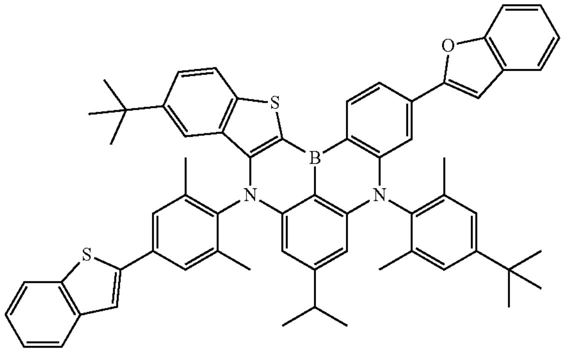
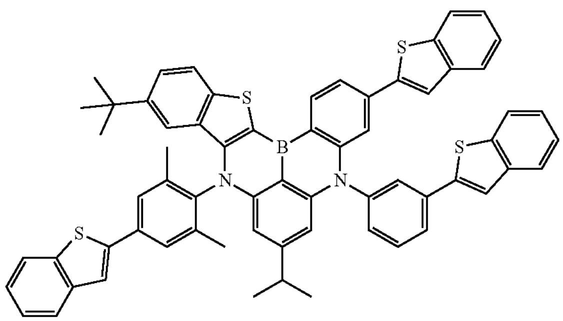

-continued
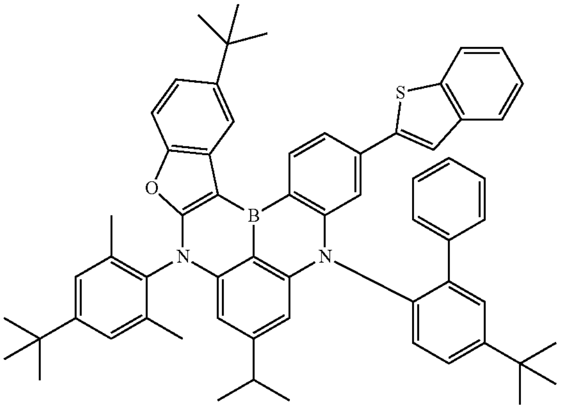
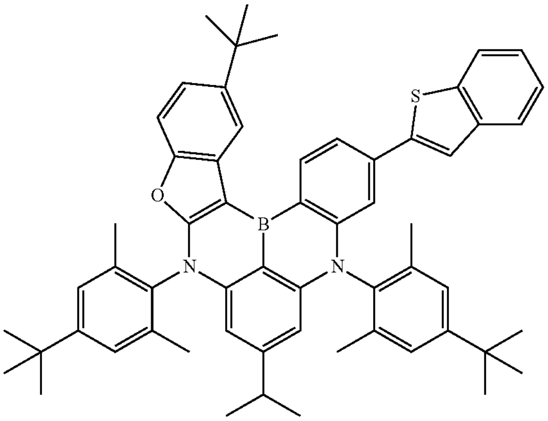
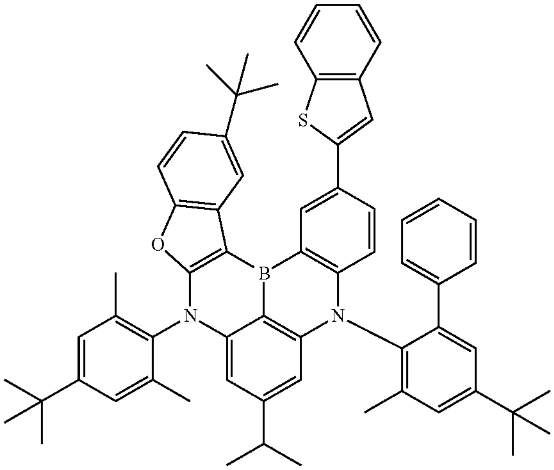
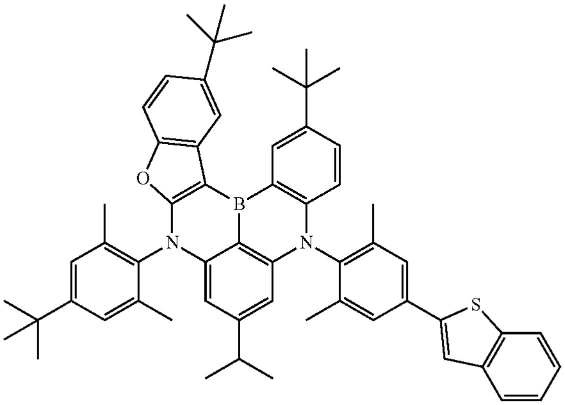
-continued
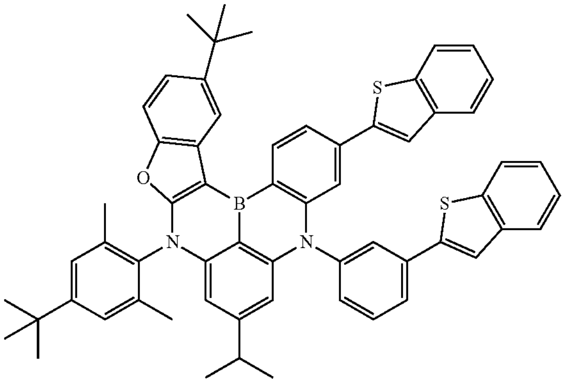
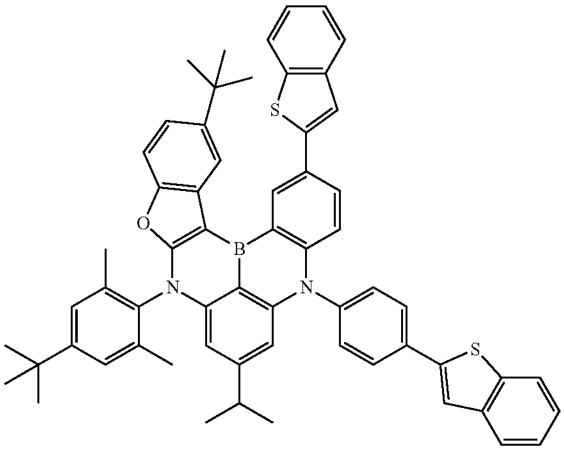
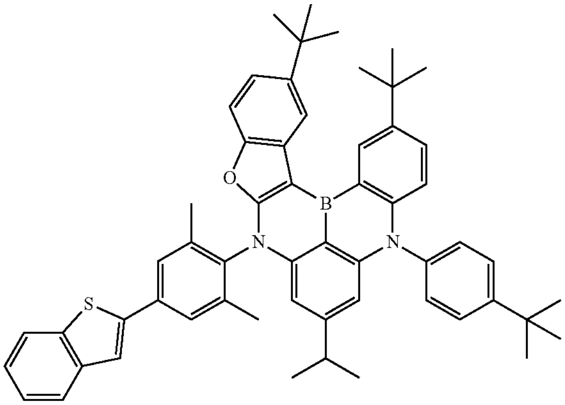
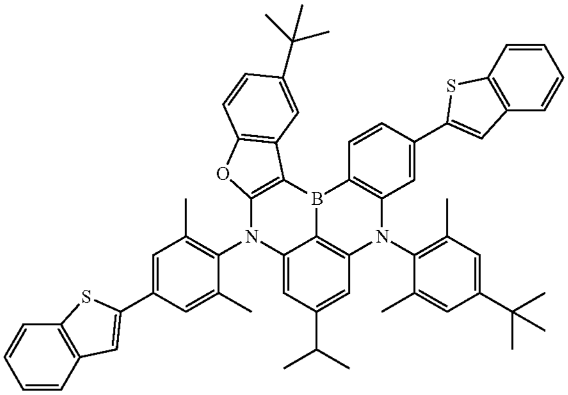

-continued
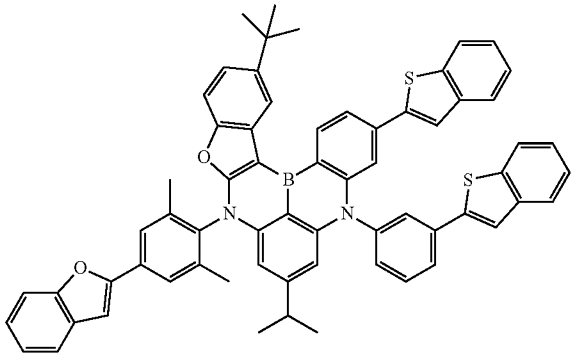
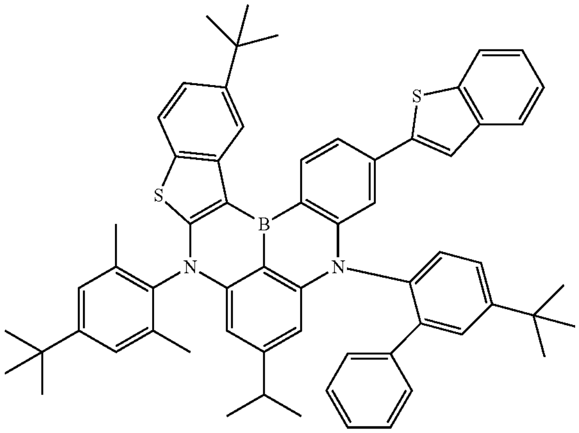
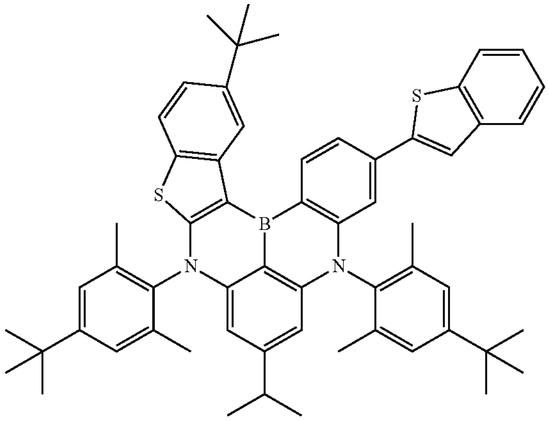
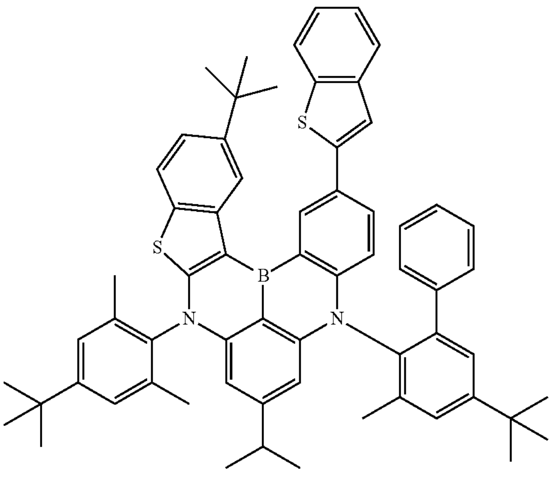
-continued
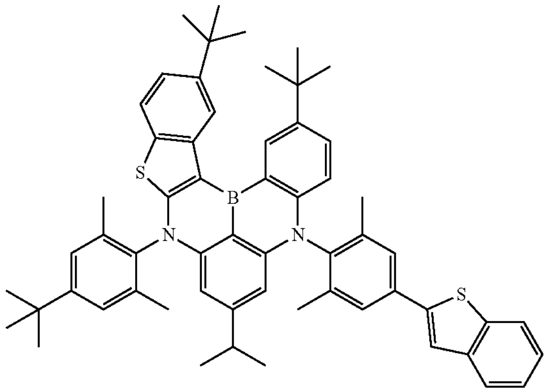
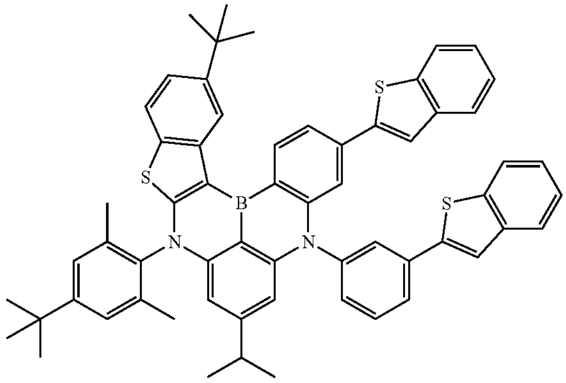
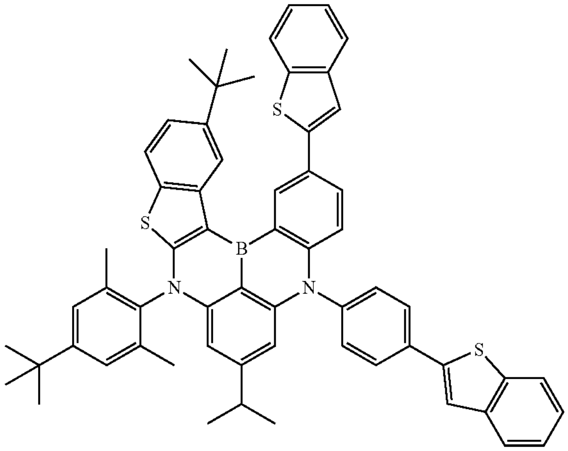
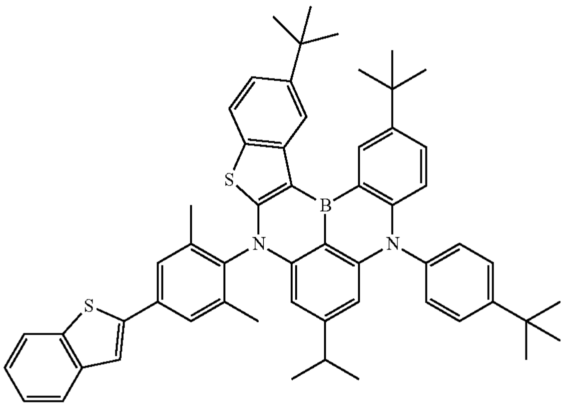

-continued
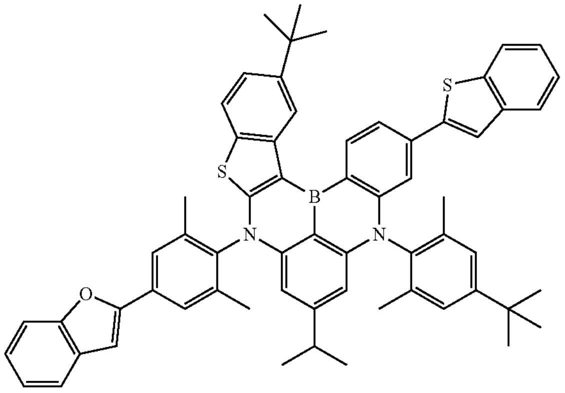
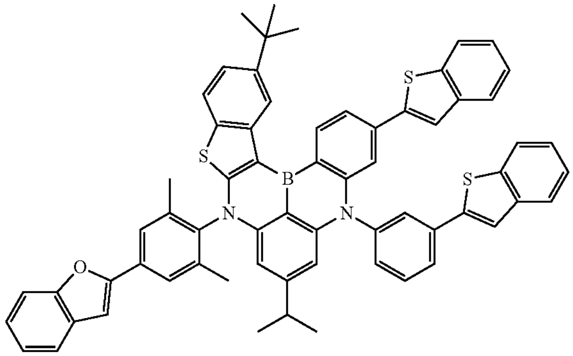
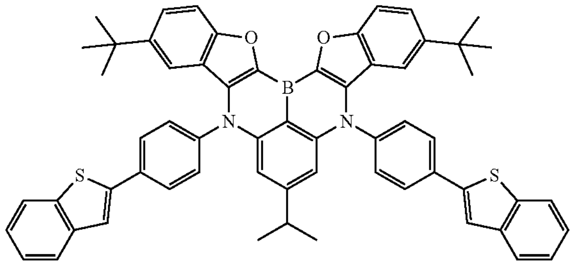
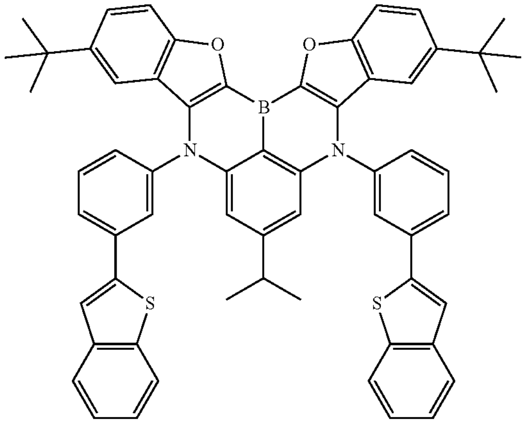
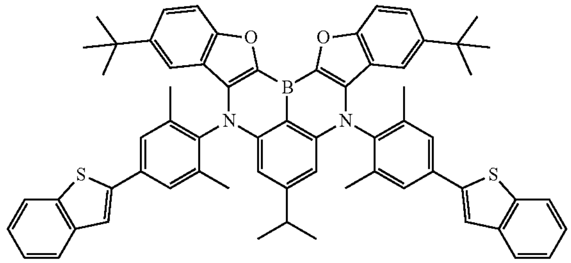
-continued
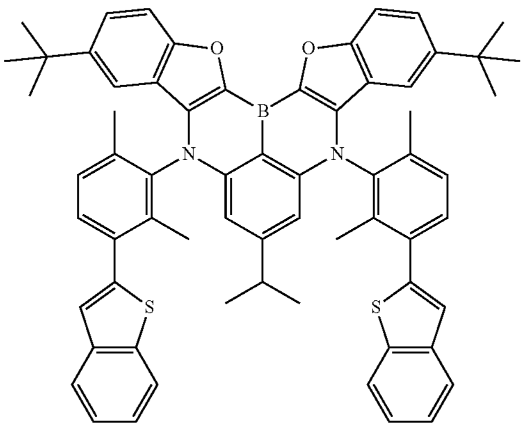
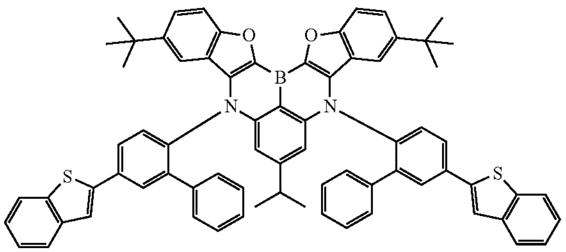
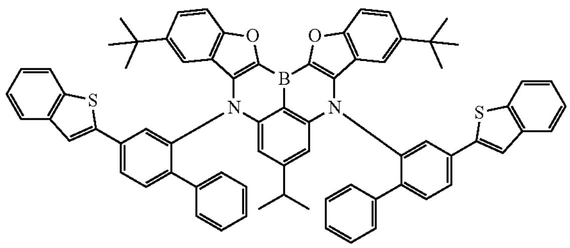
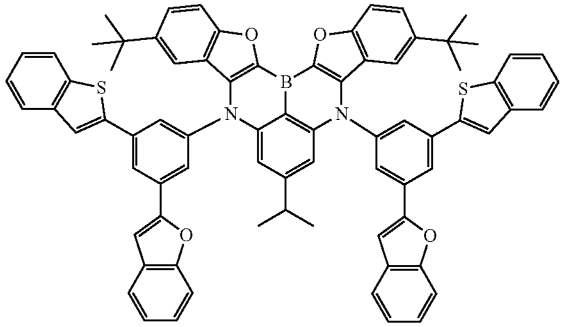
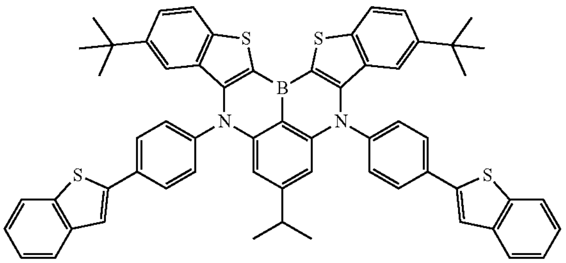

-continued
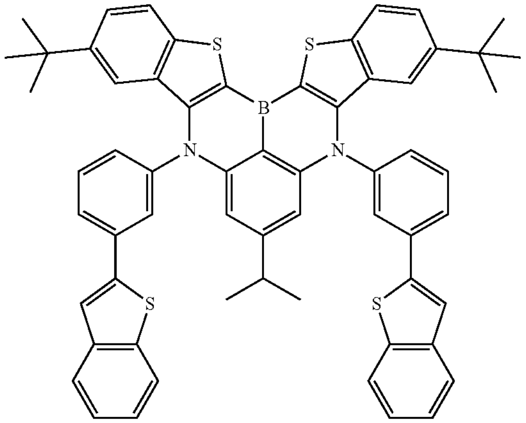
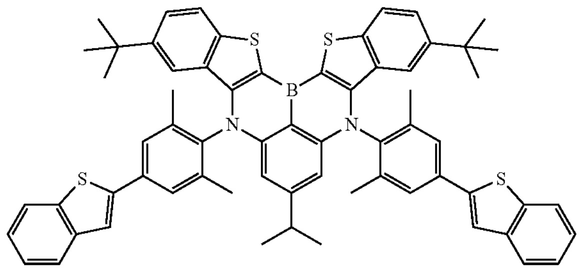
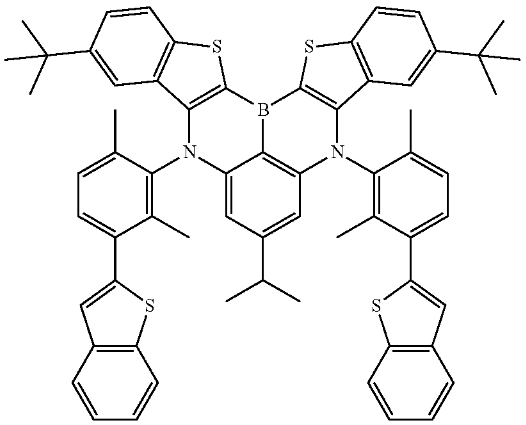
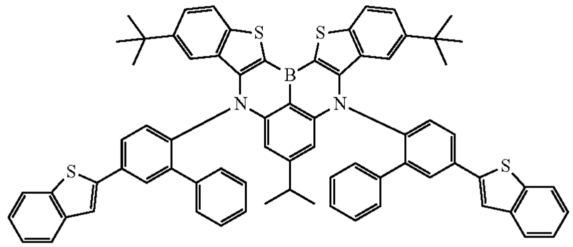
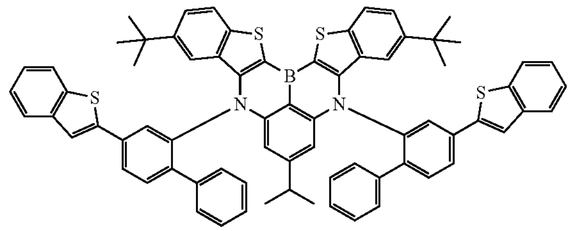
-continued
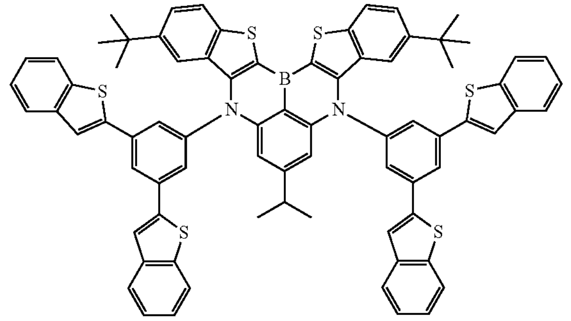
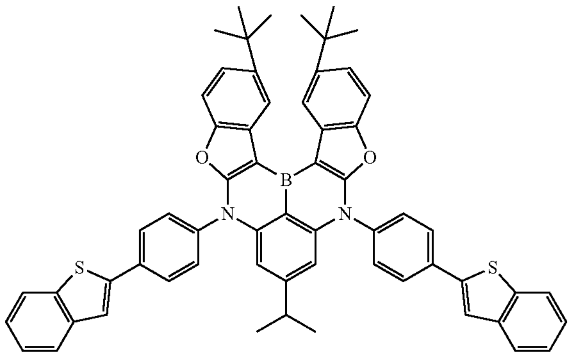
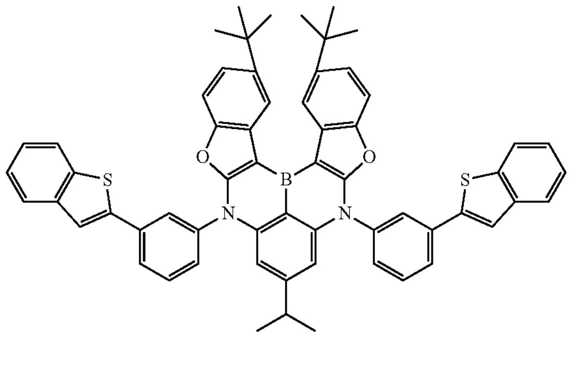
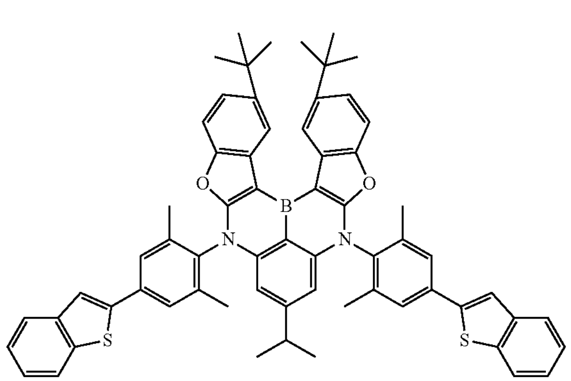

-continued
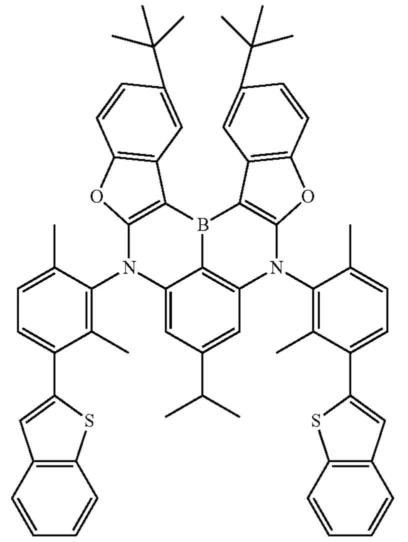
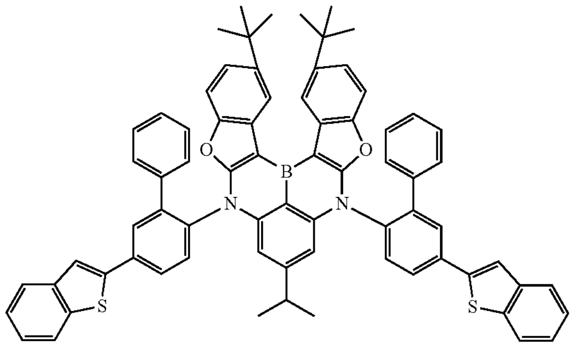
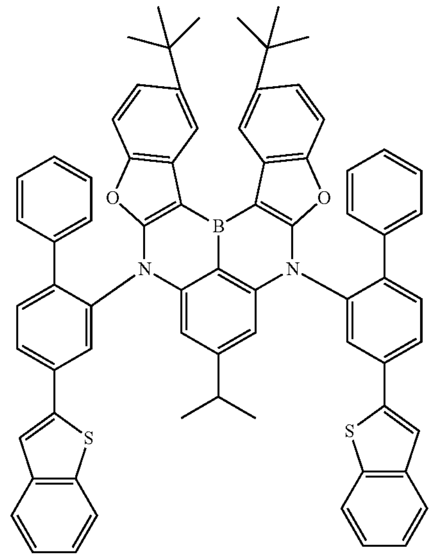
-continued
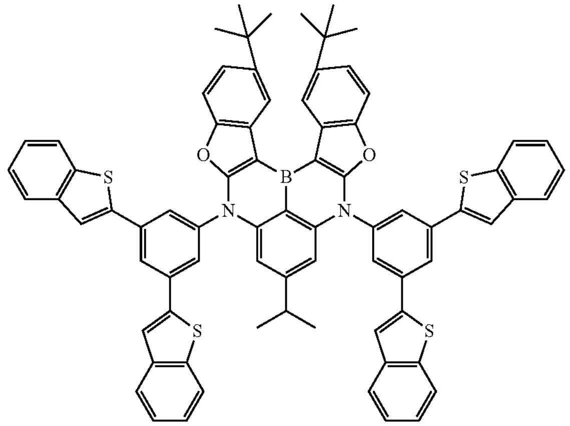
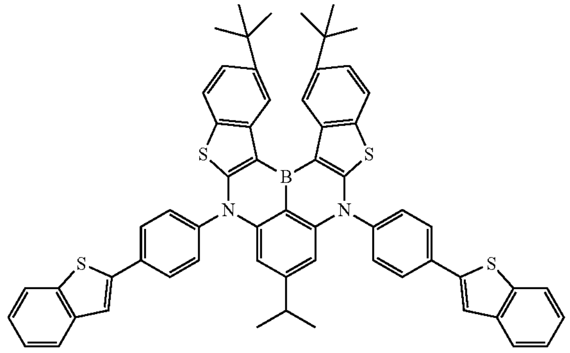
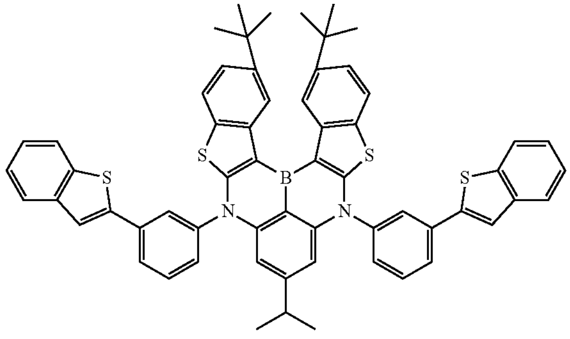
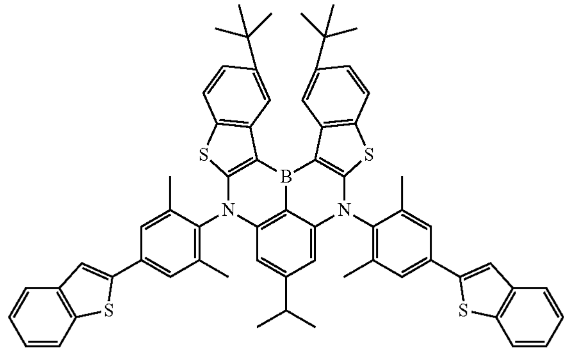

-continued
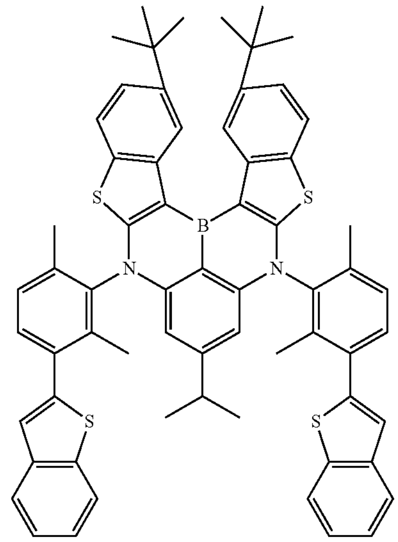
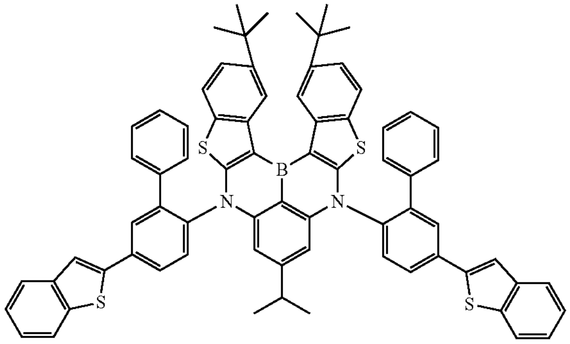
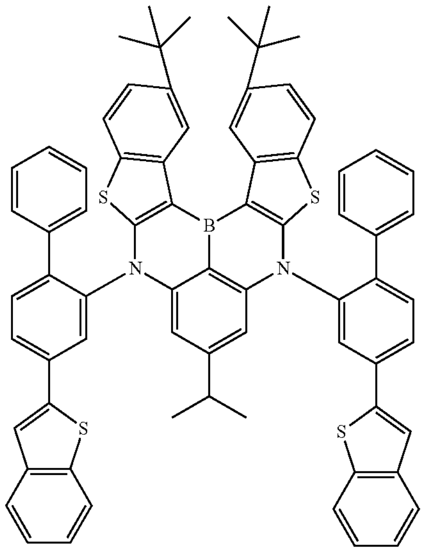
-continued
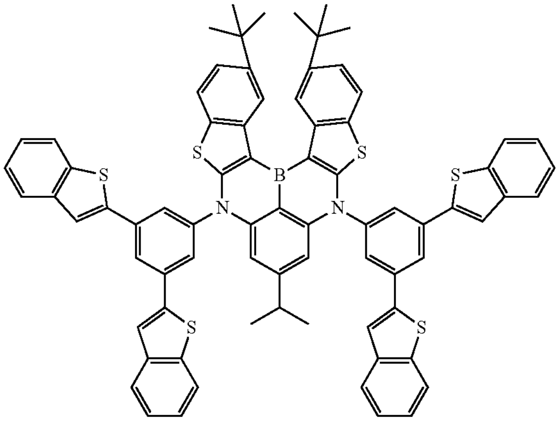
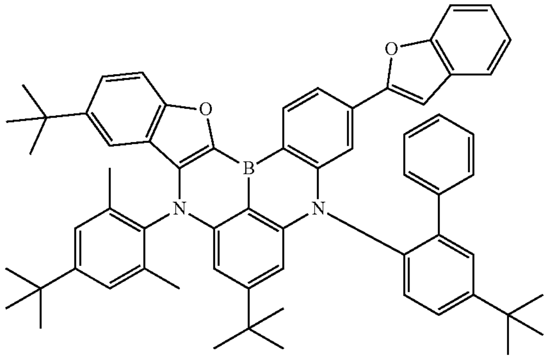
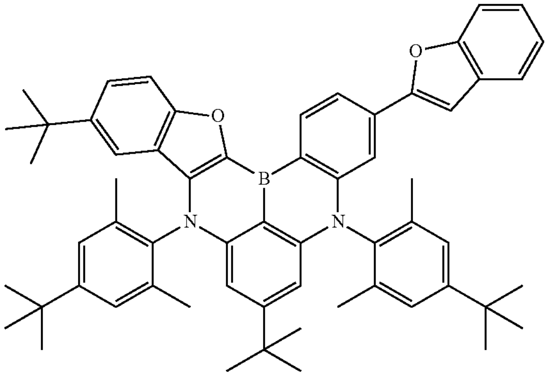
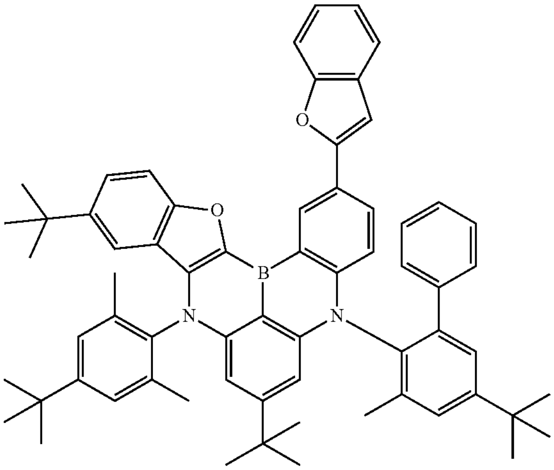

-continued
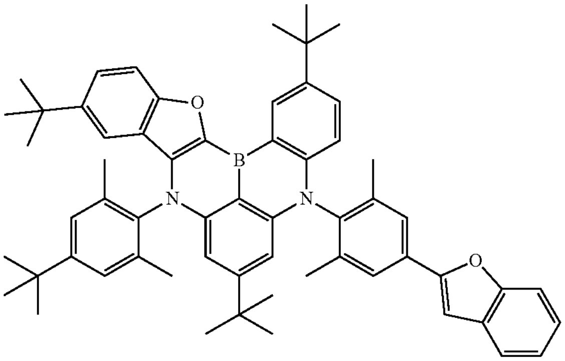
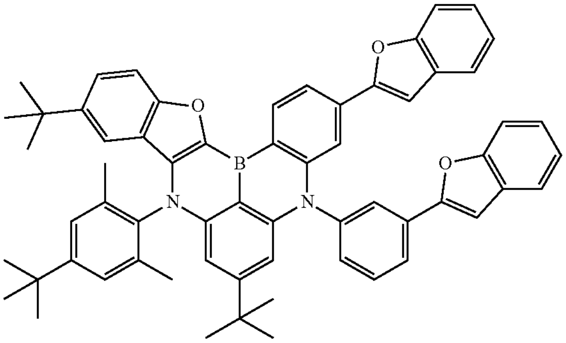
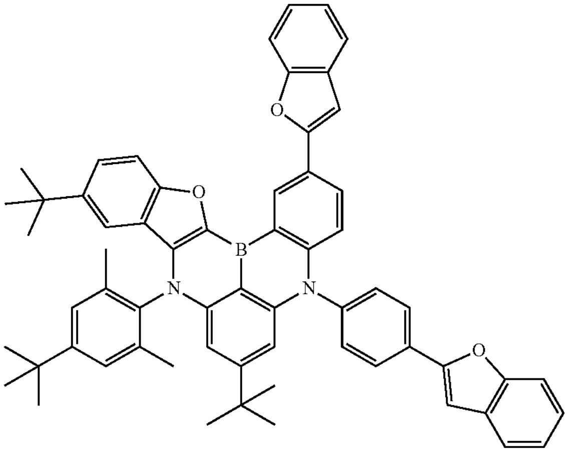
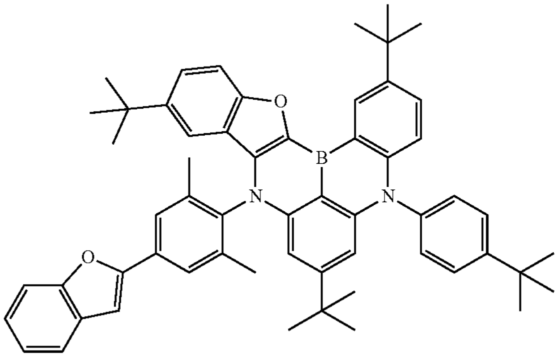
-continued
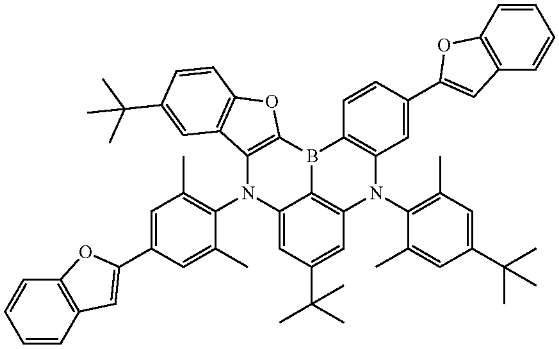
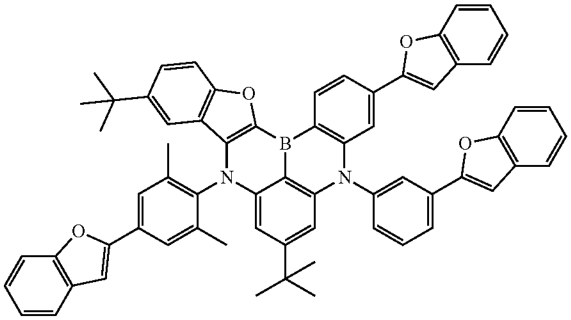
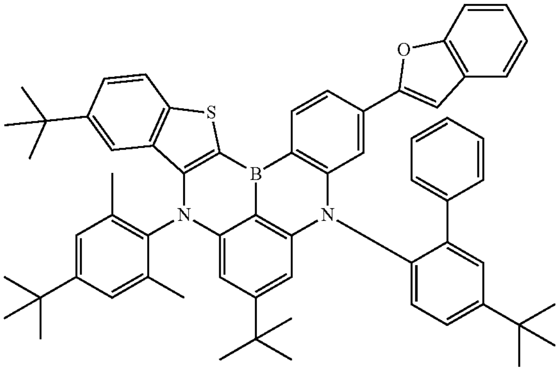
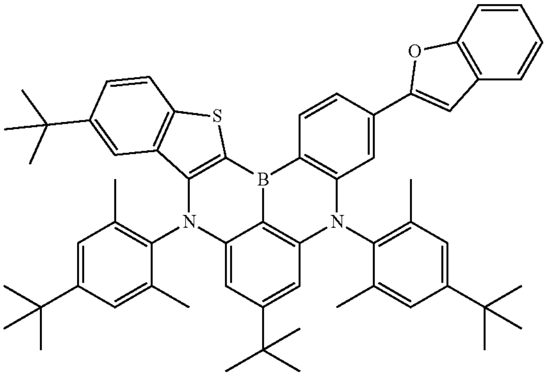

-continued
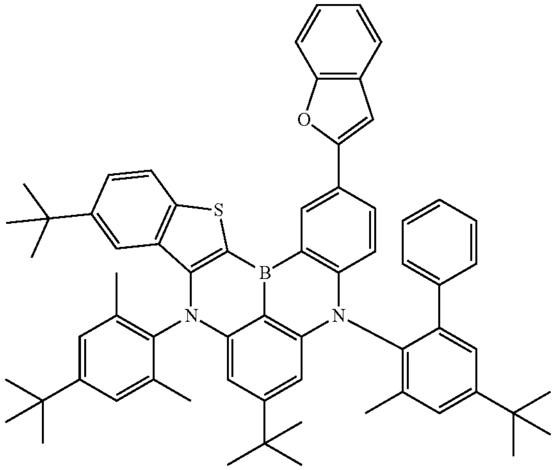
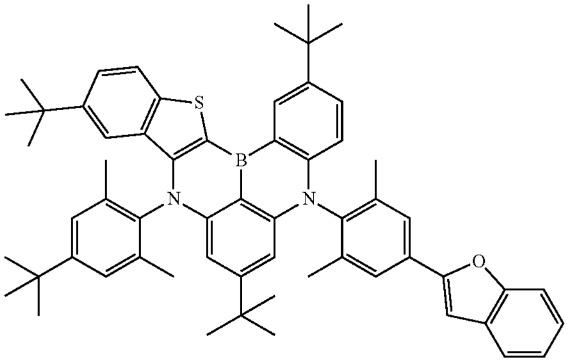
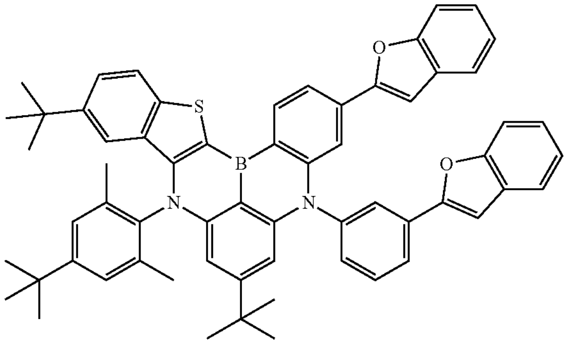
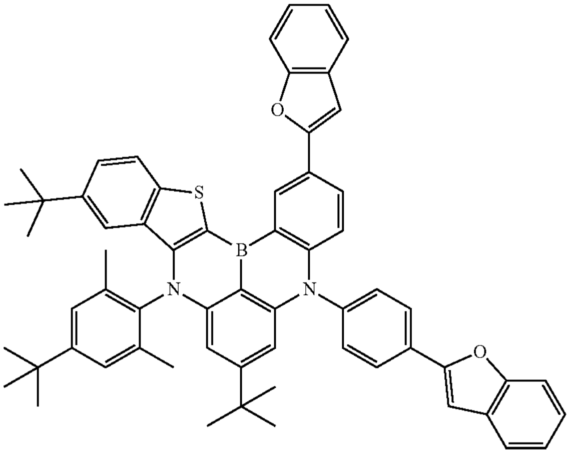
-continued
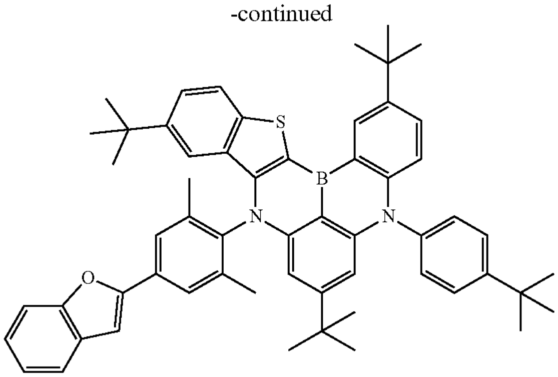
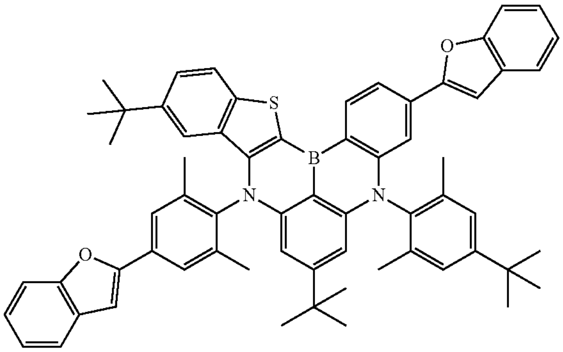
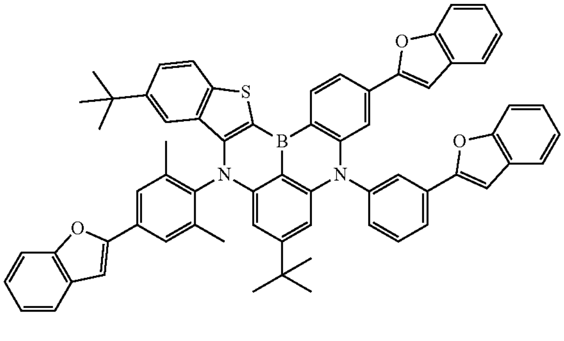
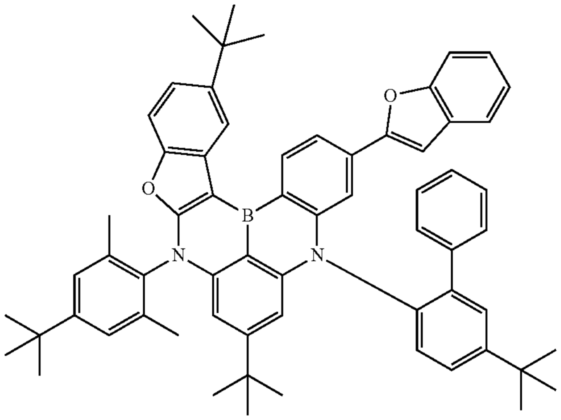

-continued
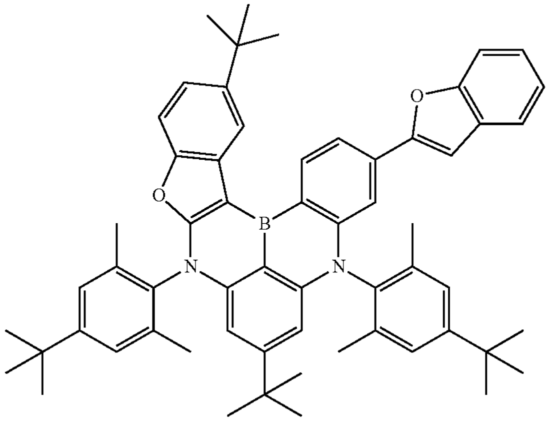
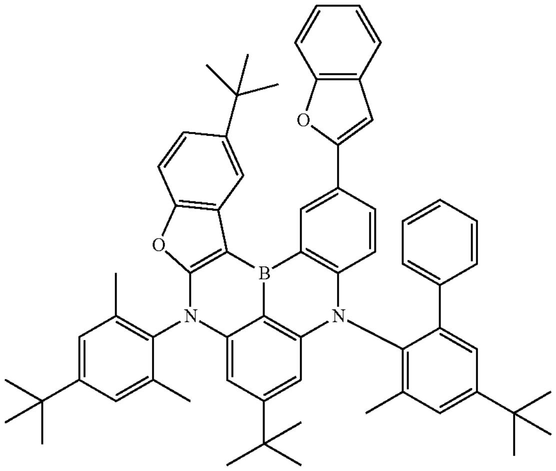
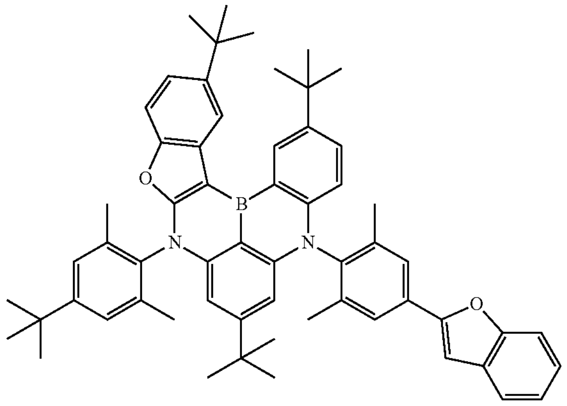
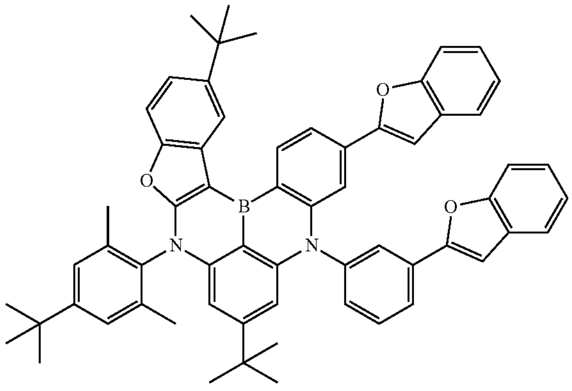
-continued
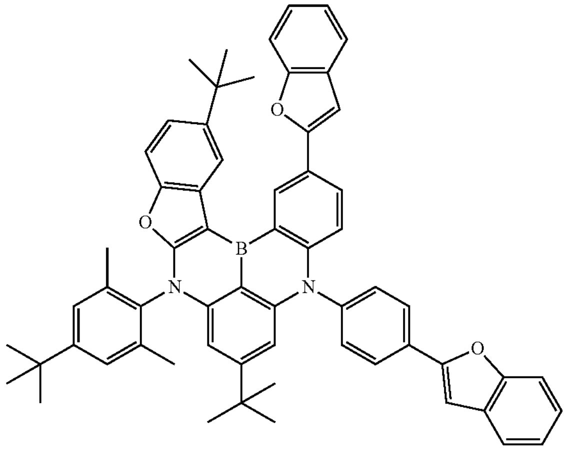
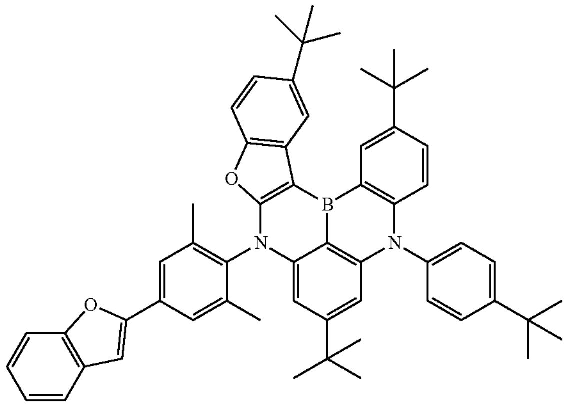
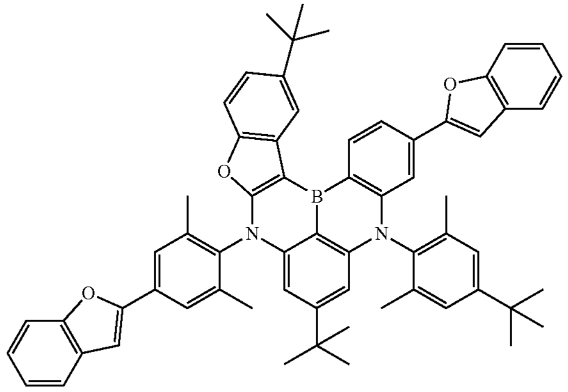
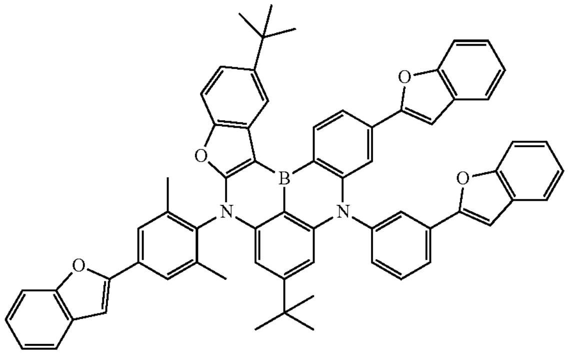

-continued
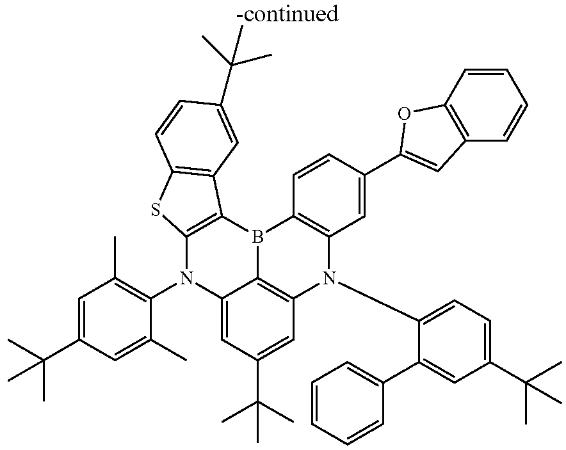
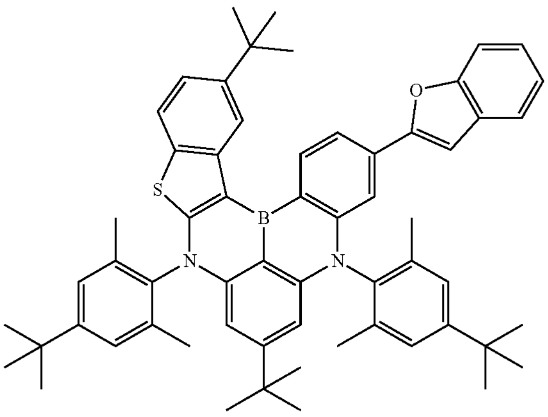
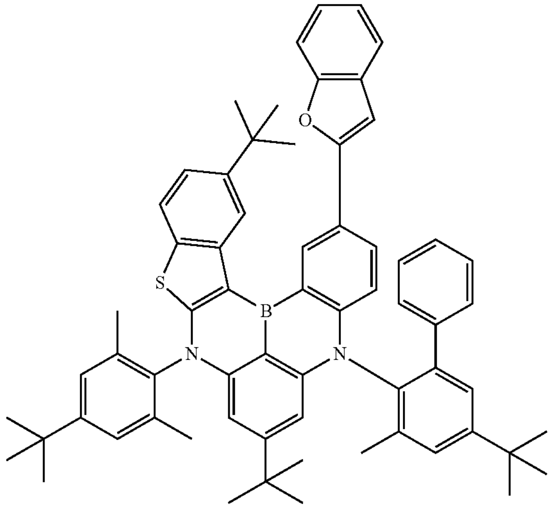
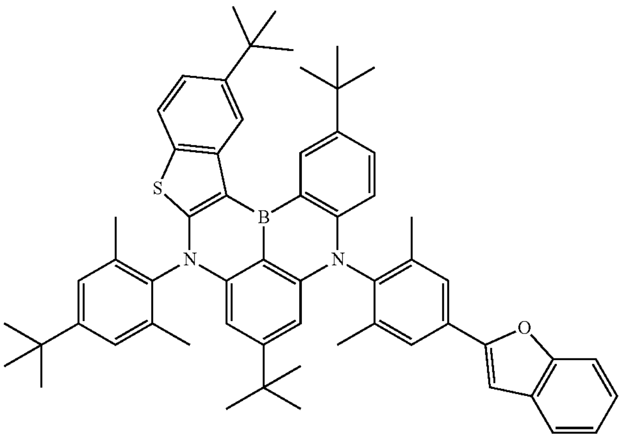

-continued
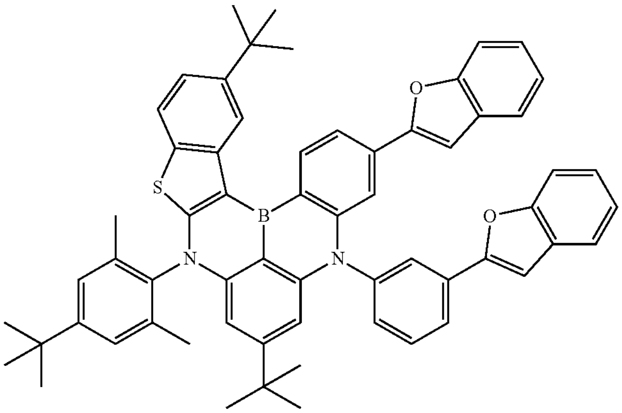
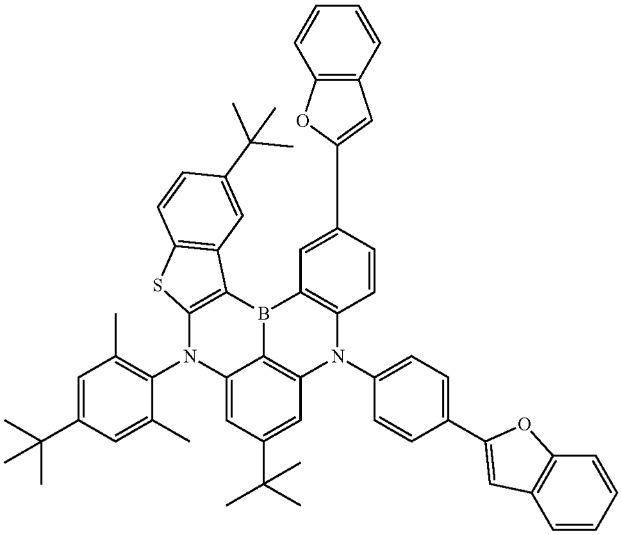
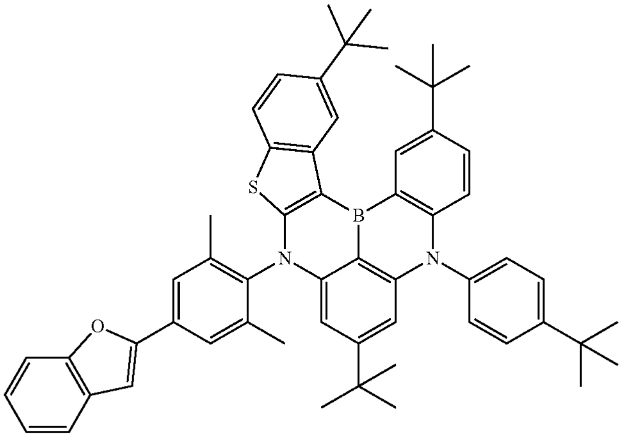

-continued
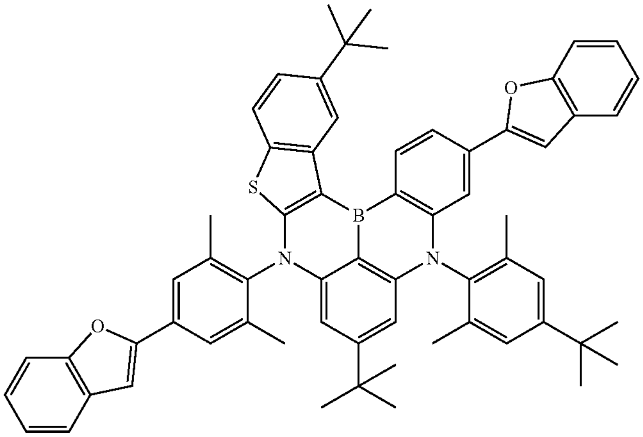
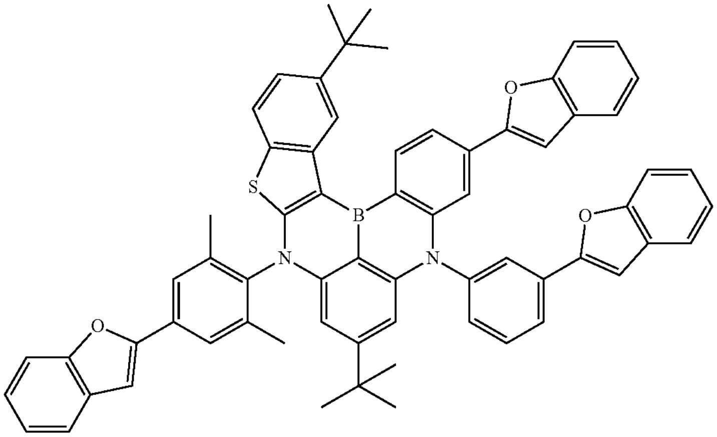
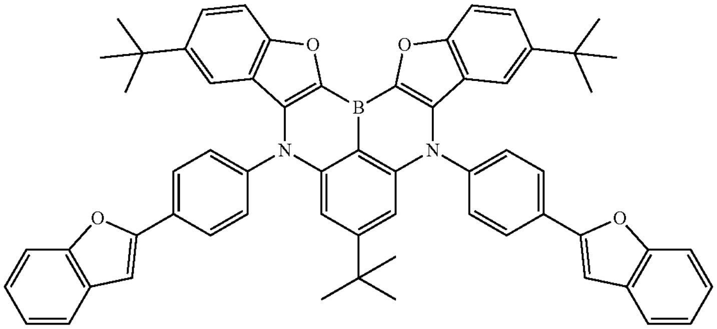
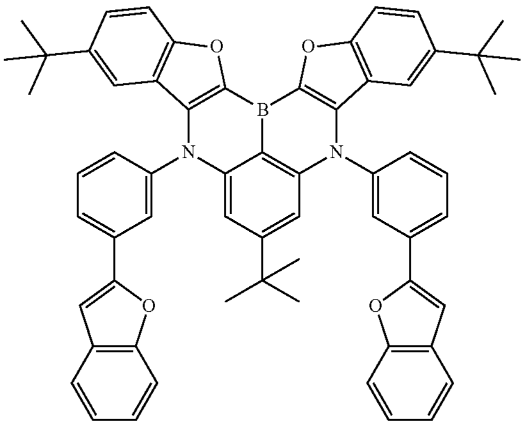

-continued
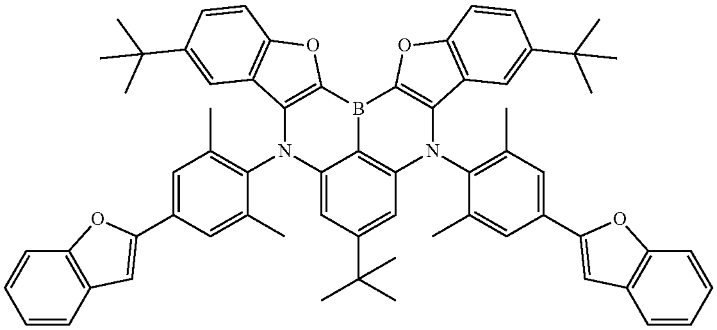
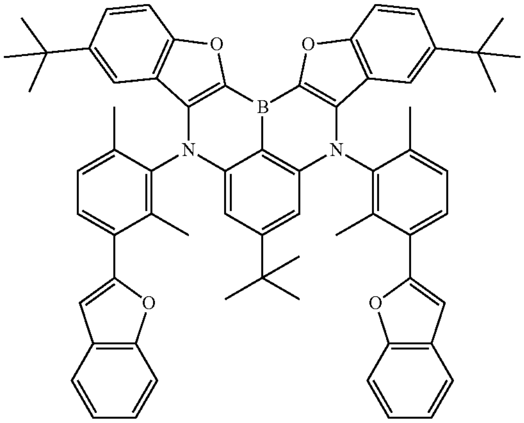
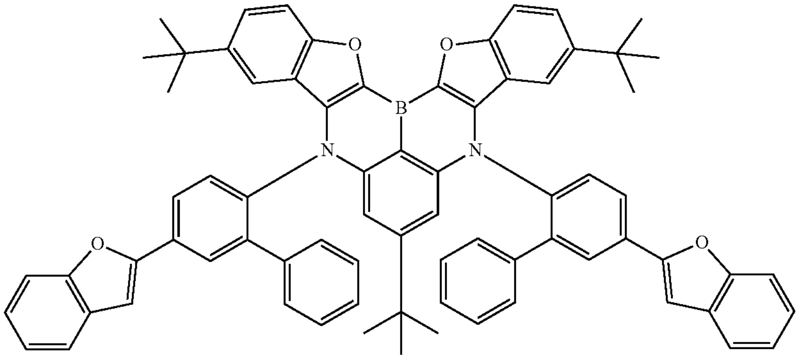
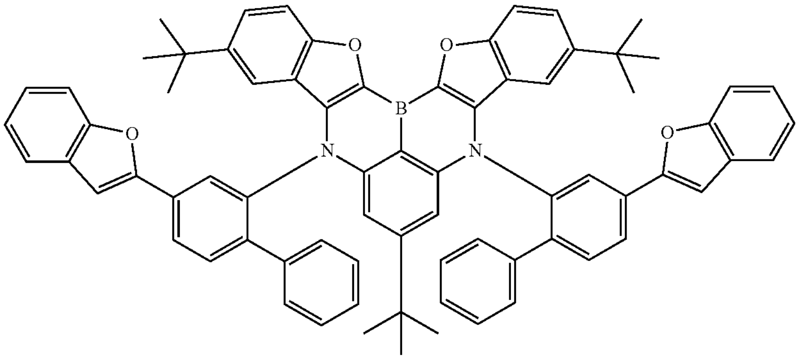

-continued
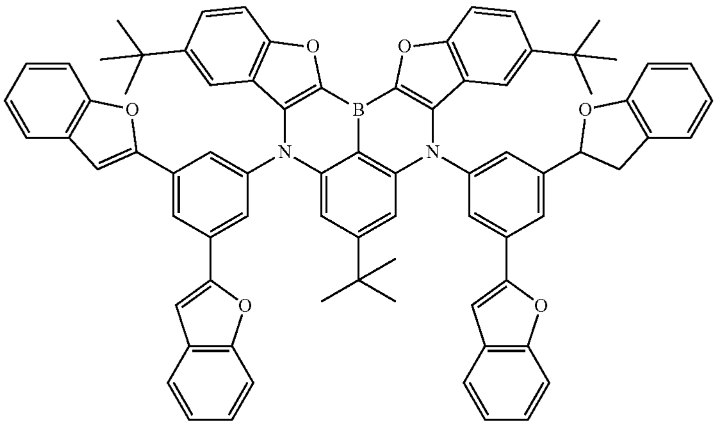
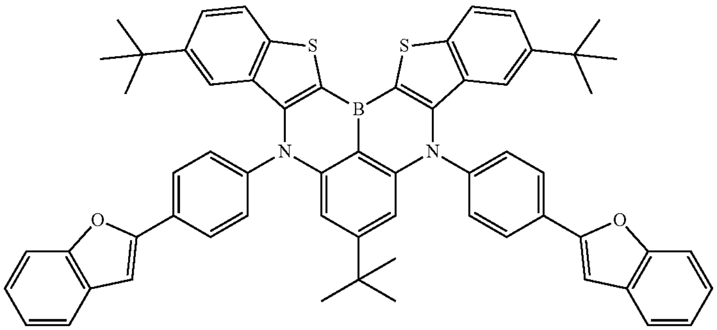
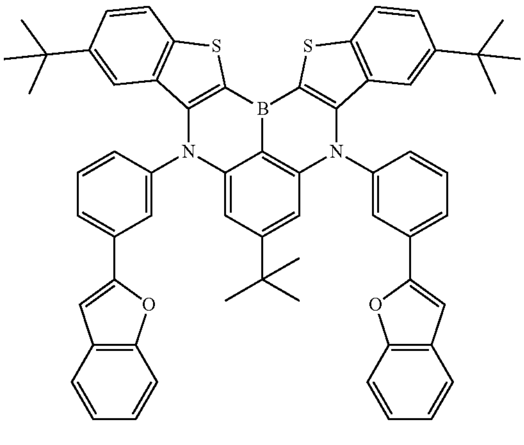
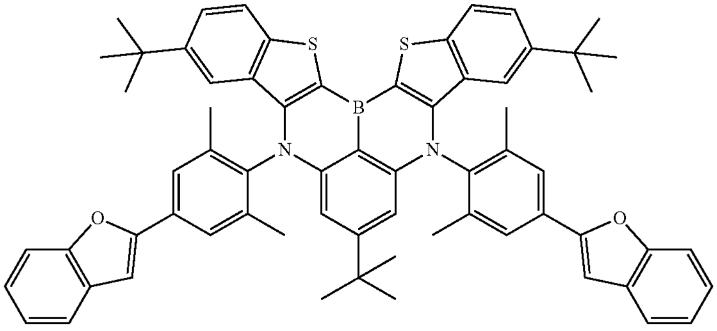

-continued
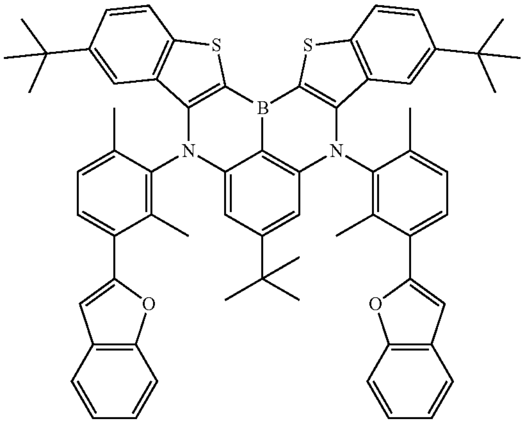
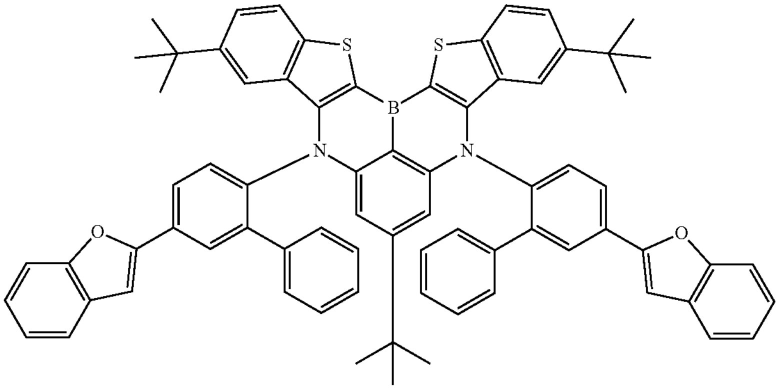
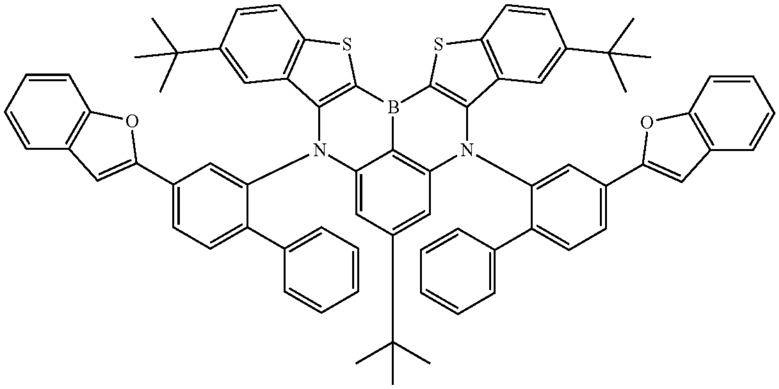
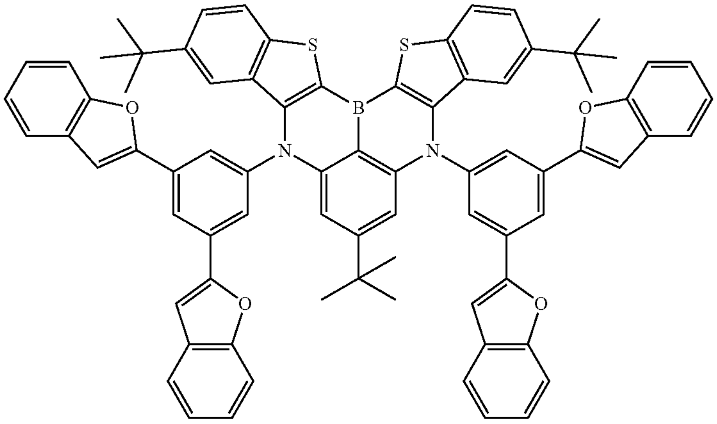

-continued
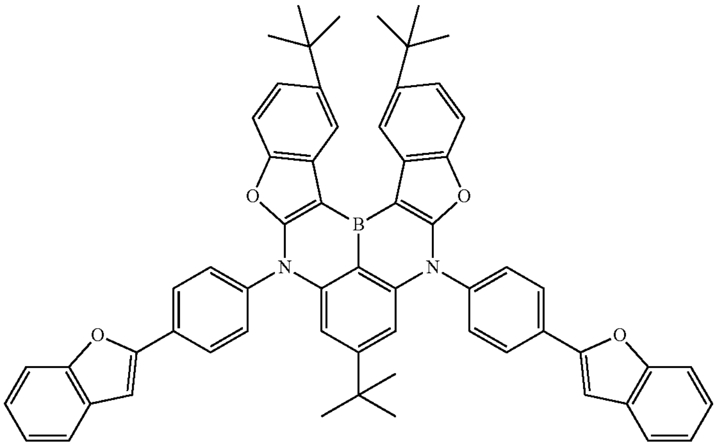
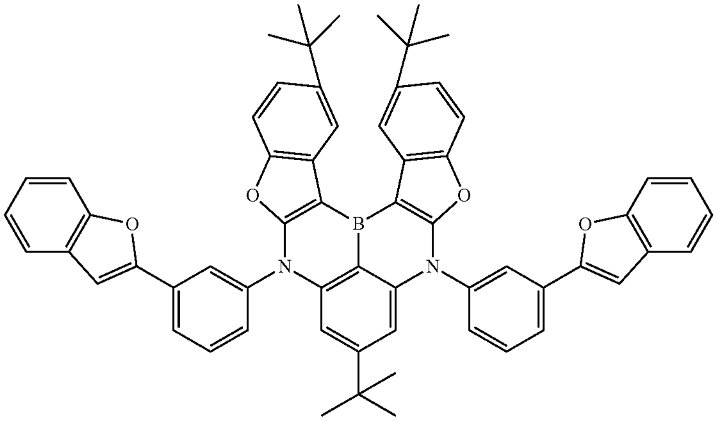
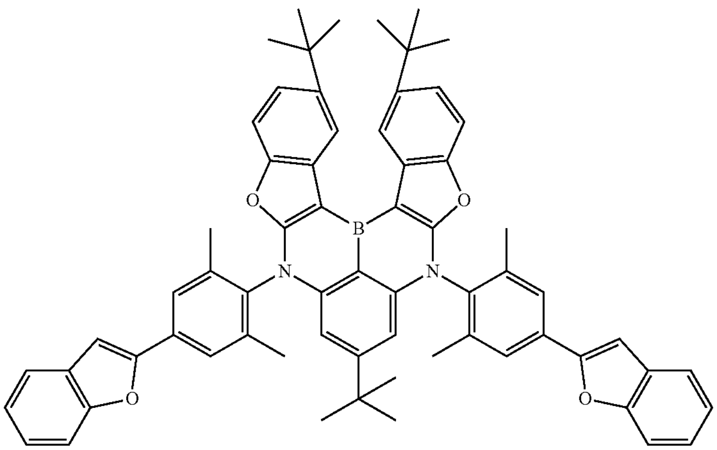
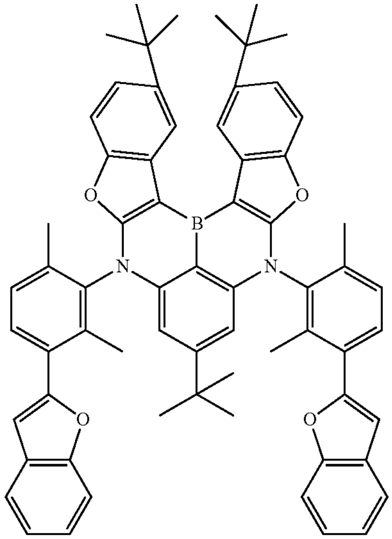

-continued
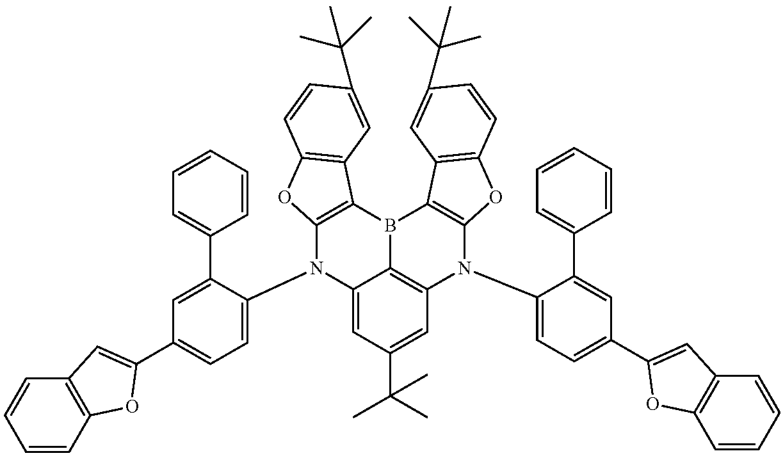
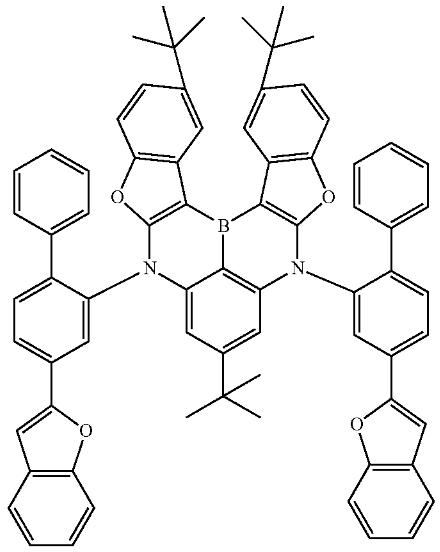
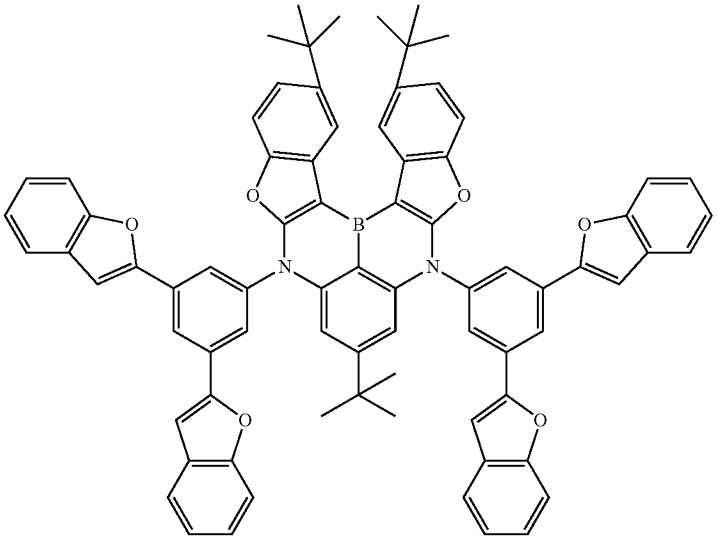
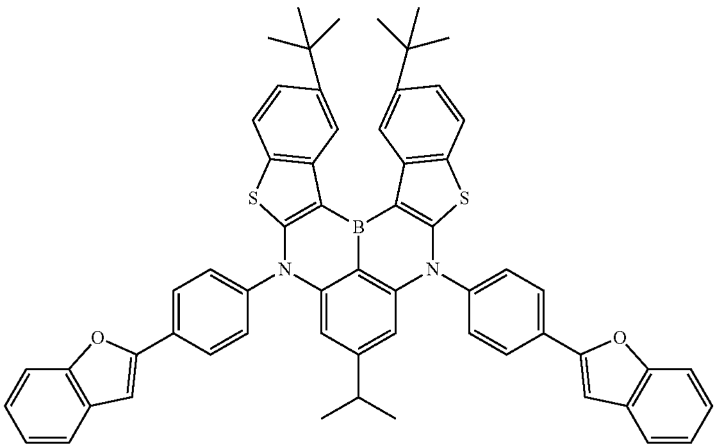

-continued
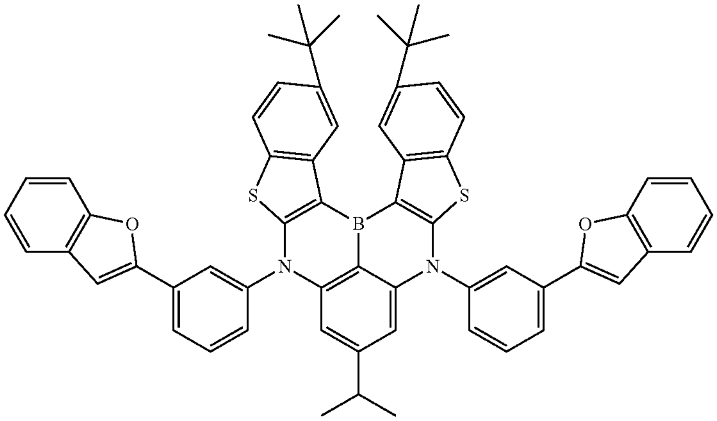
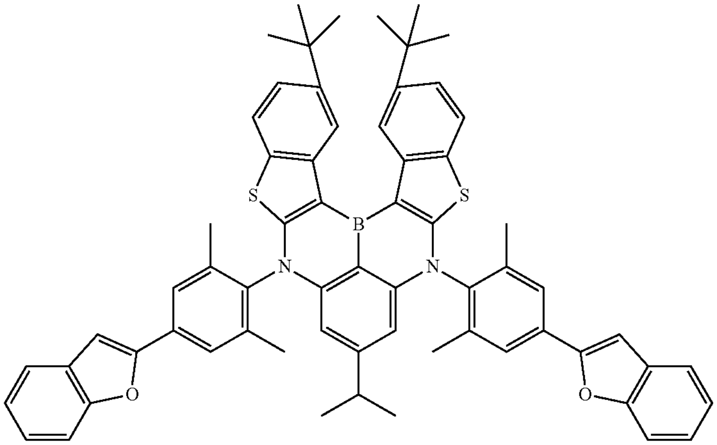
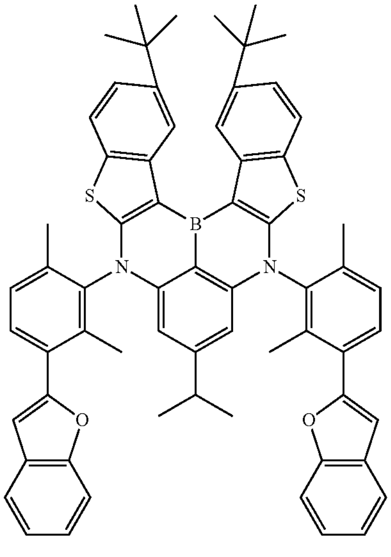
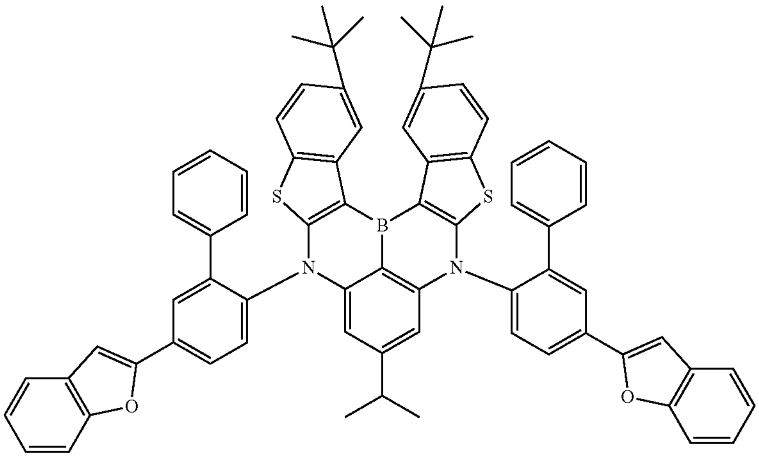

-continued
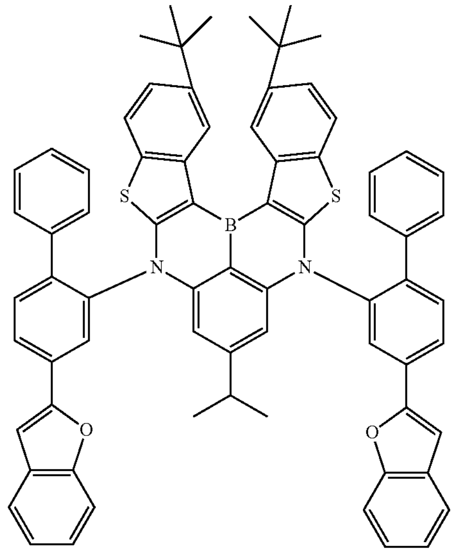
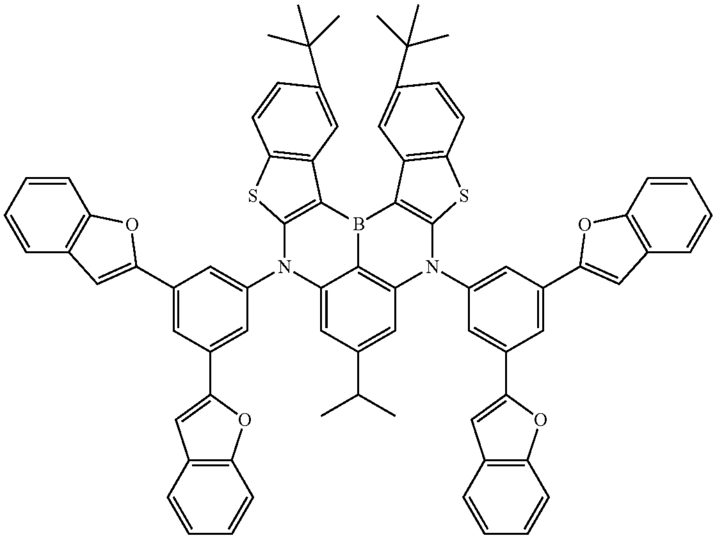
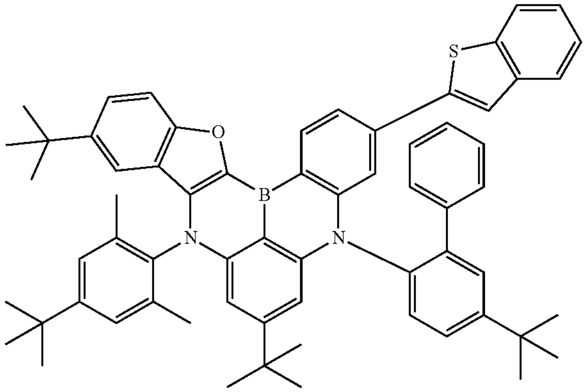
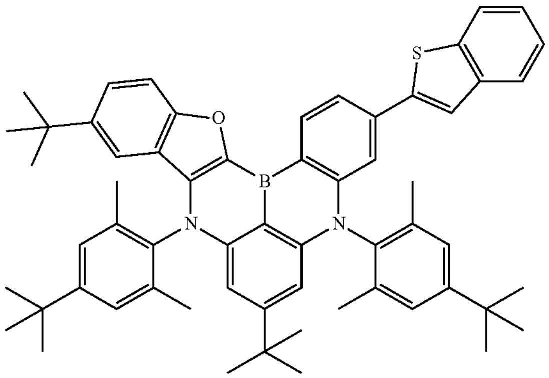
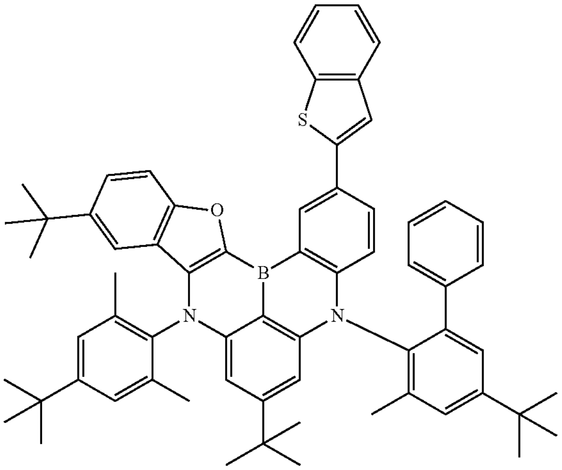

-continued
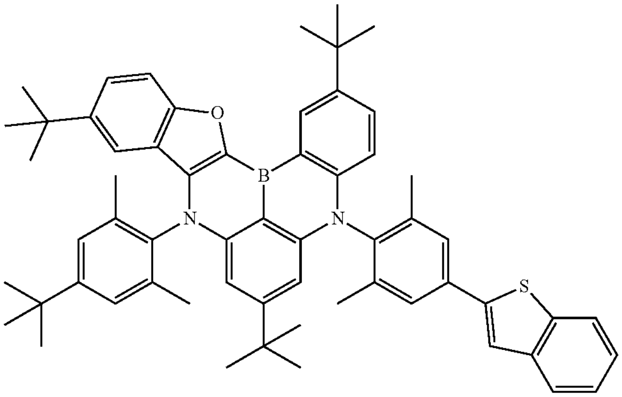
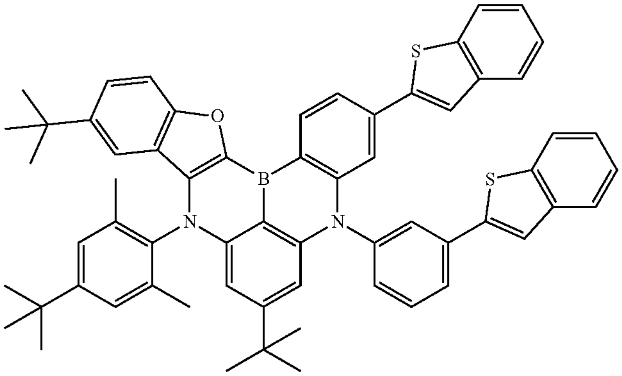
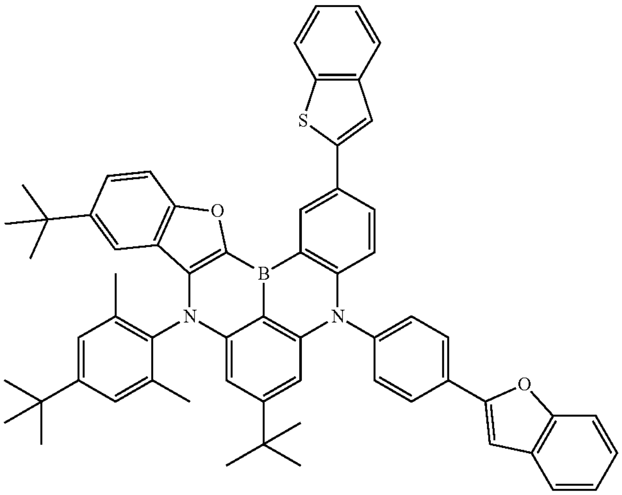
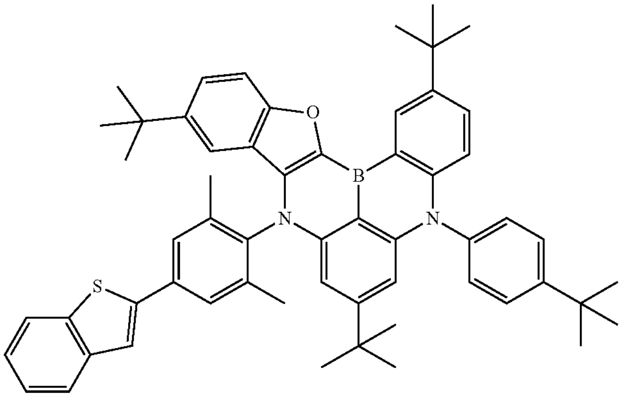

-continued
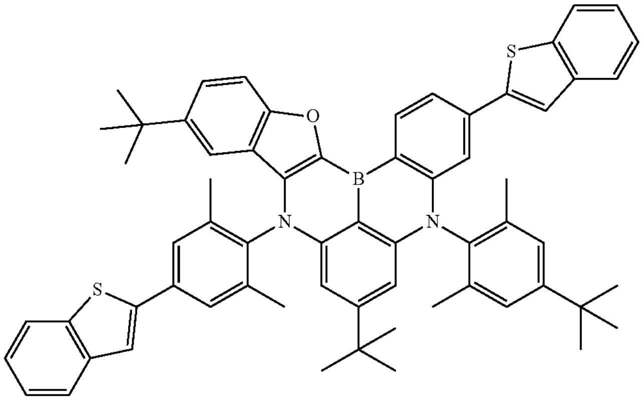
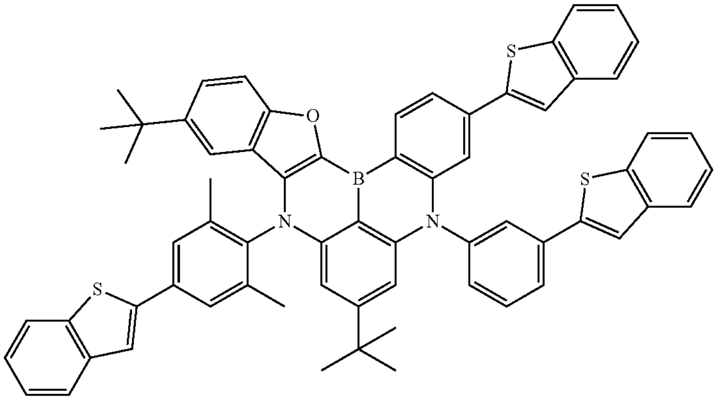
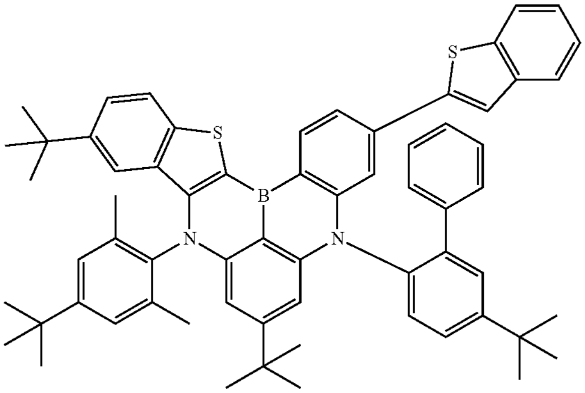
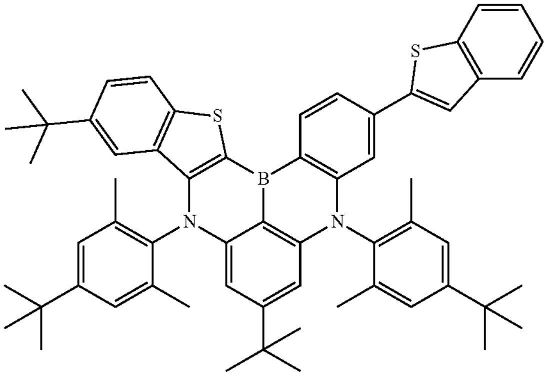
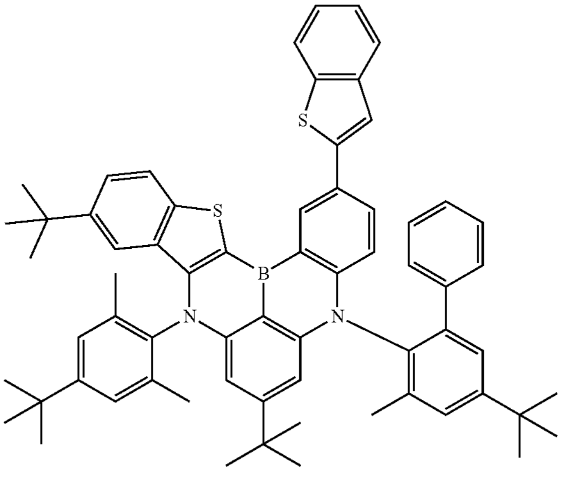

-continued
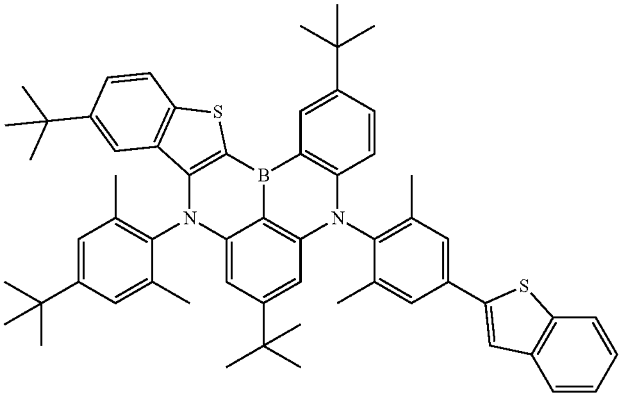
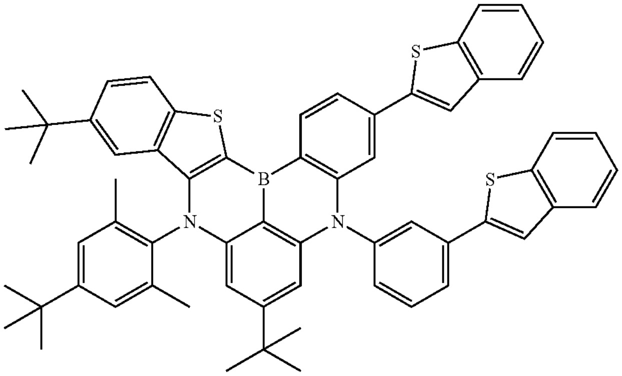
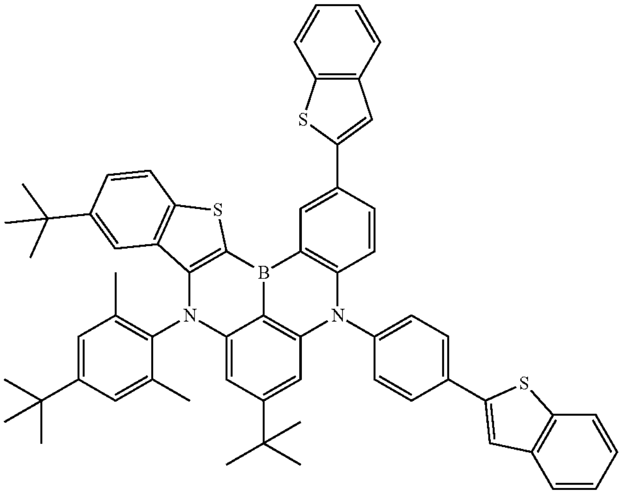
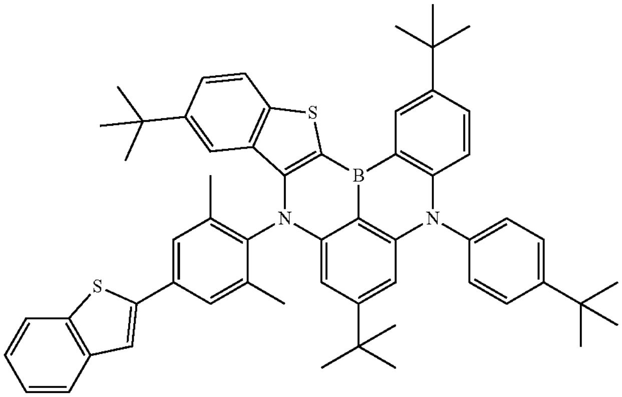

-continued
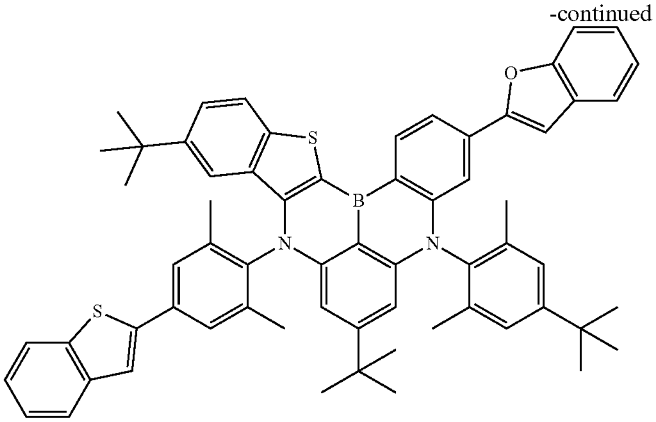
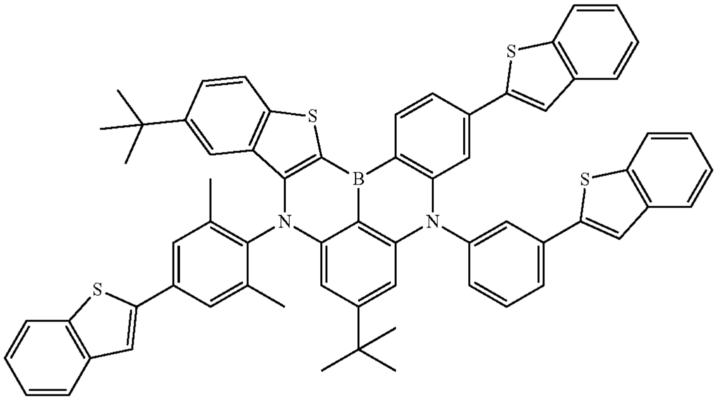
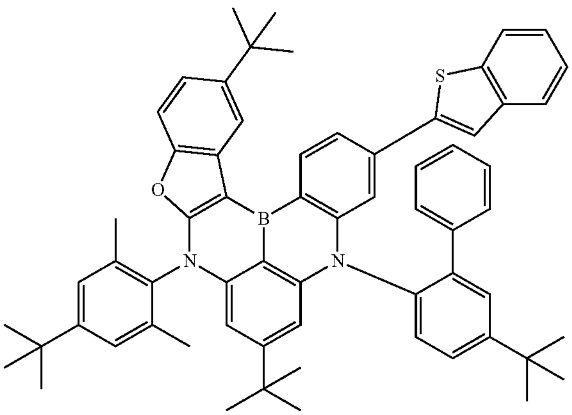
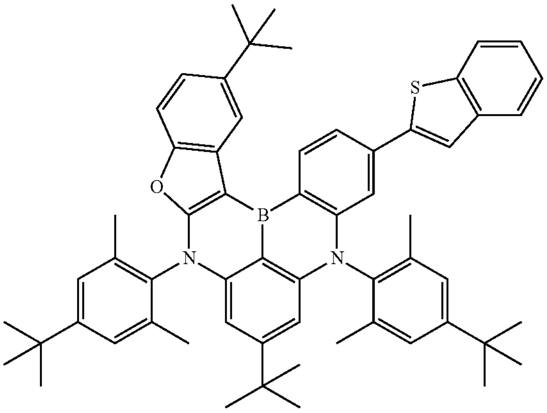
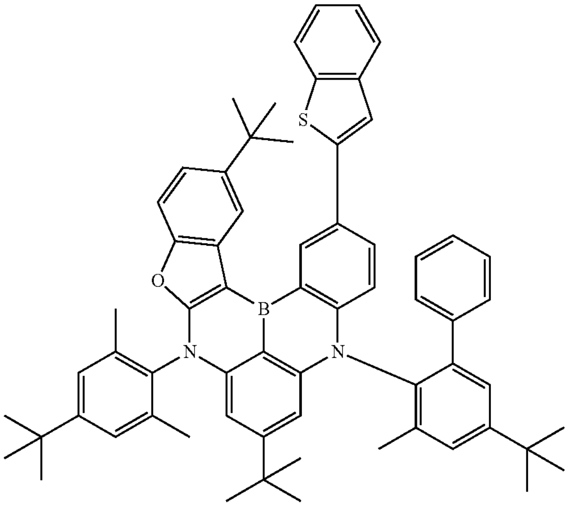

-continued
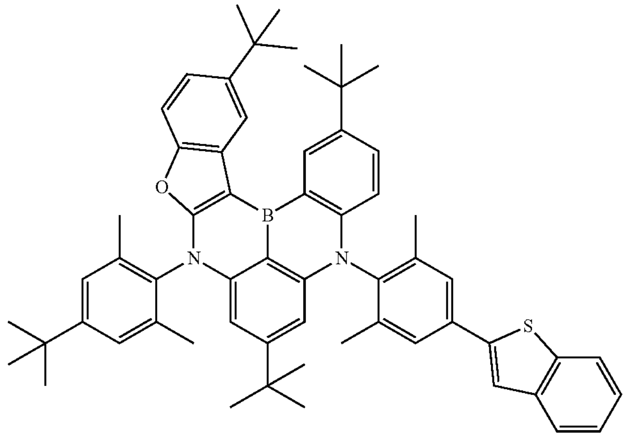
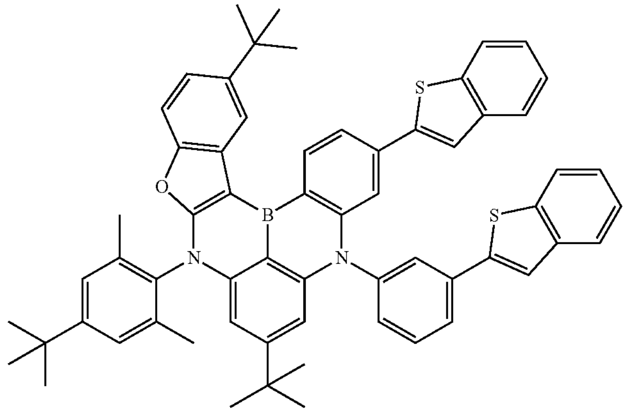
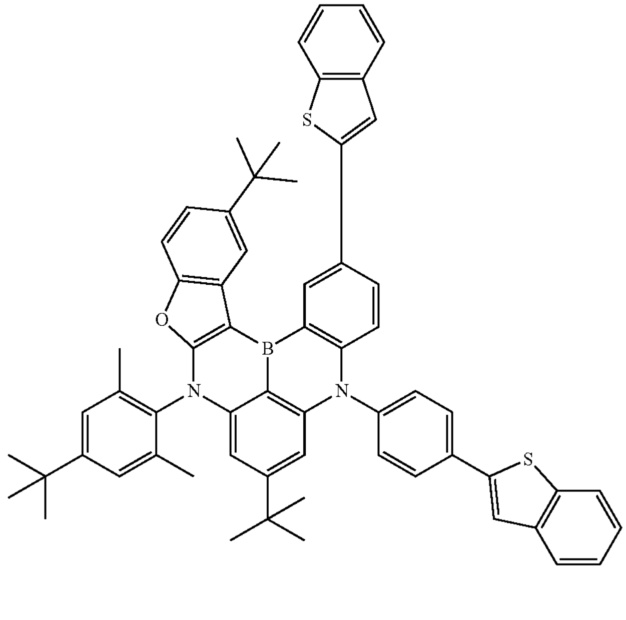

-continued
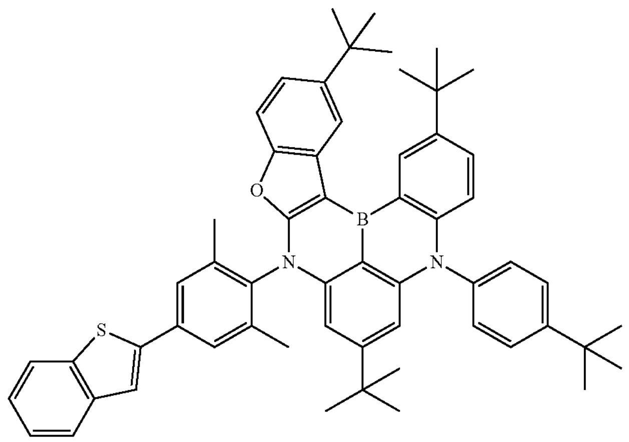
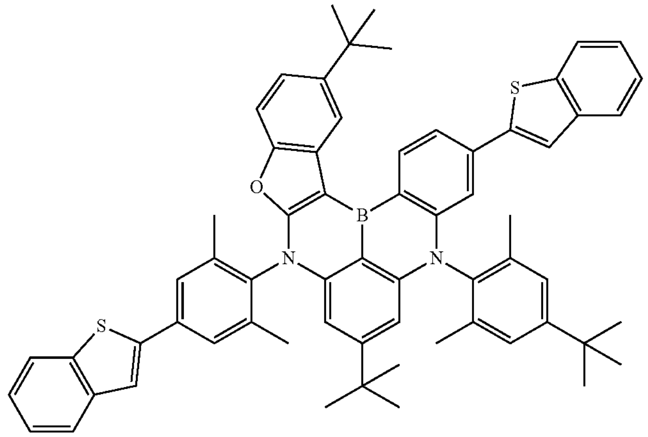
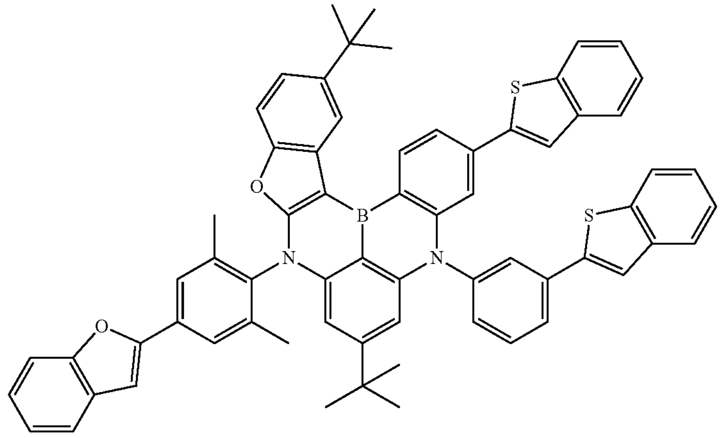

-continued
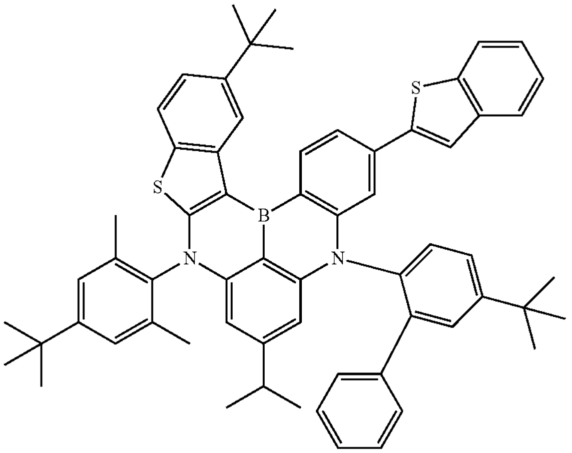
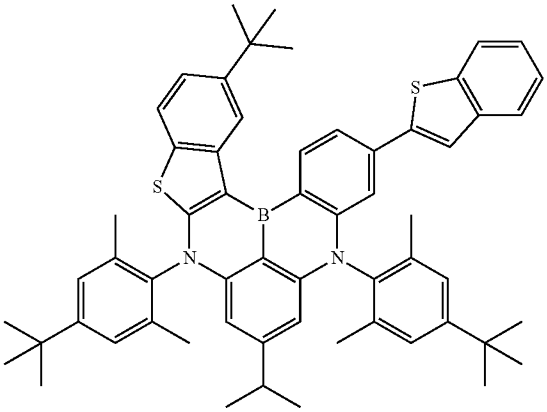
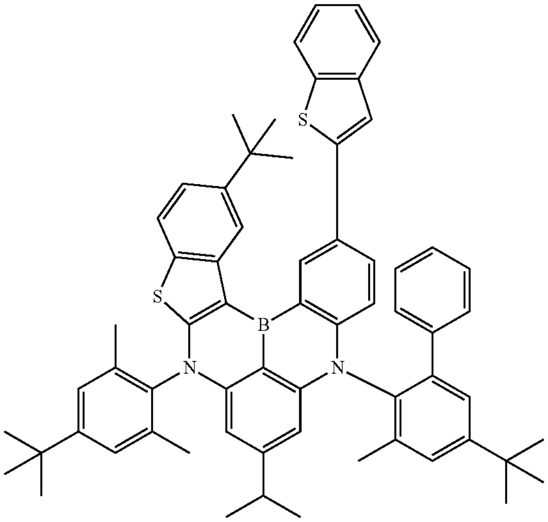
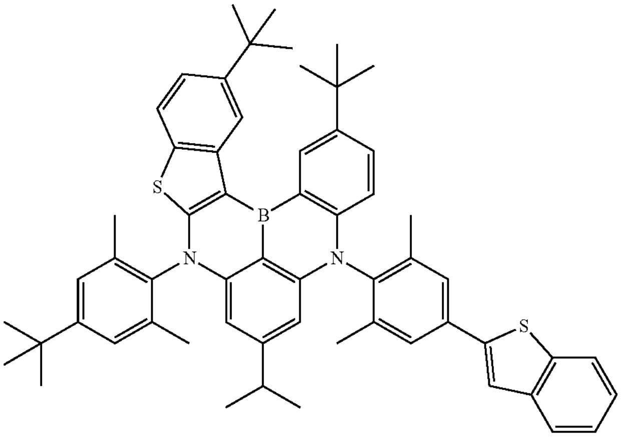
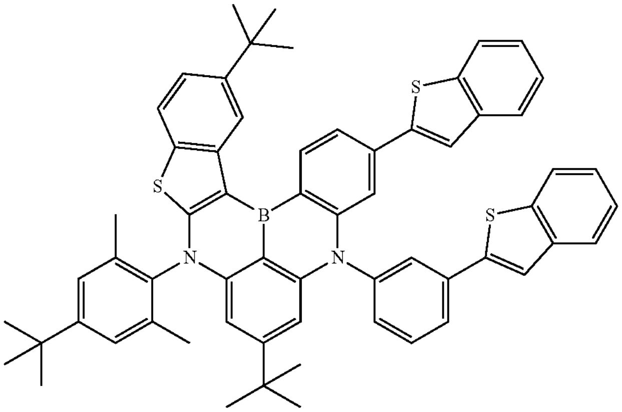

-continued
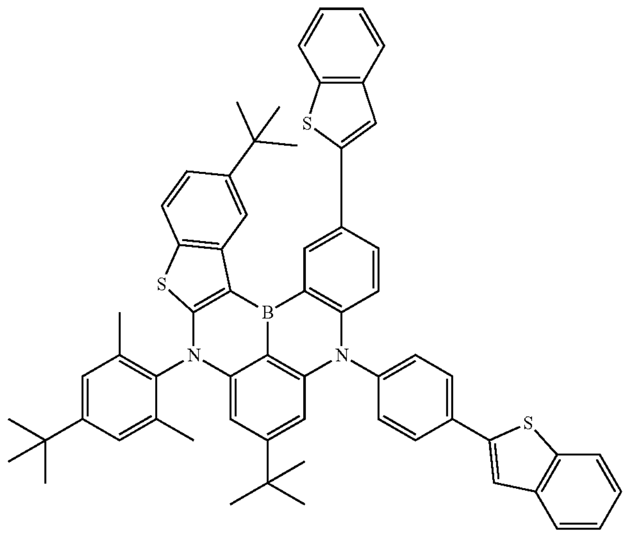
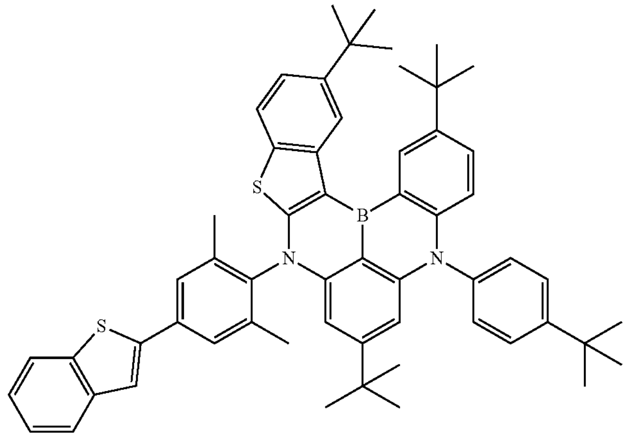
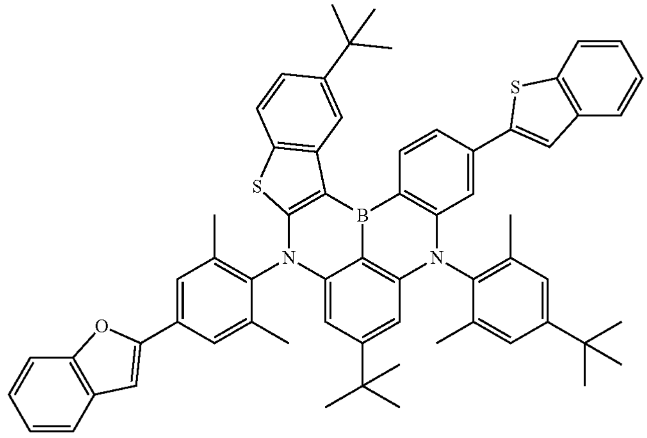

-continued
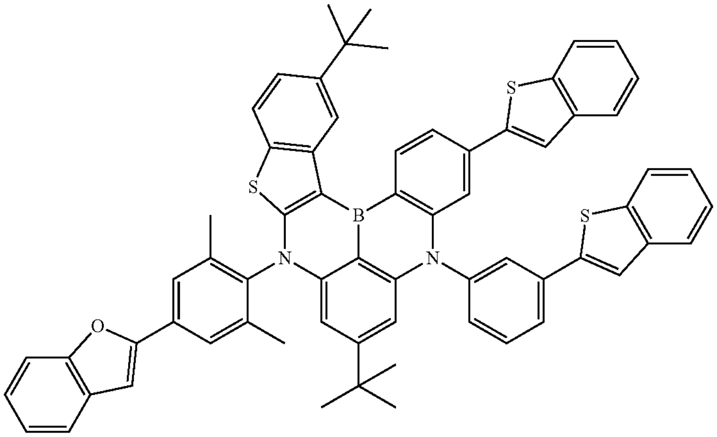
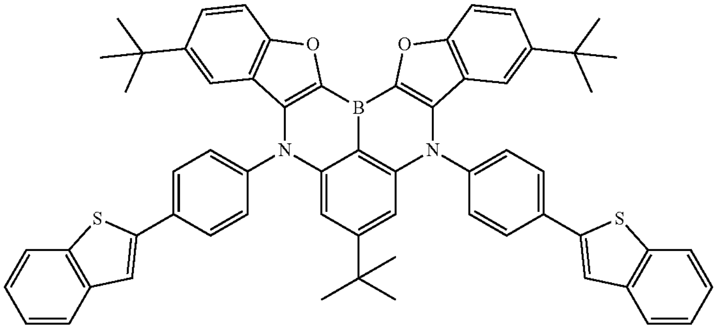
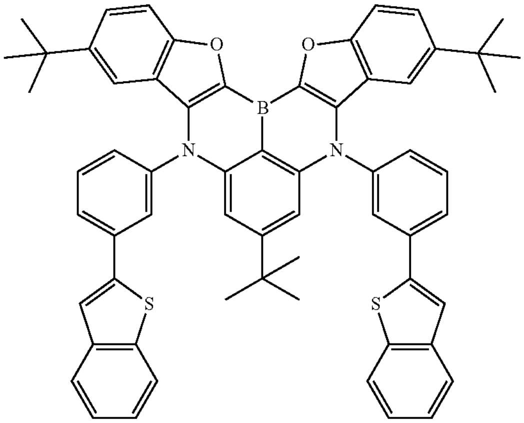
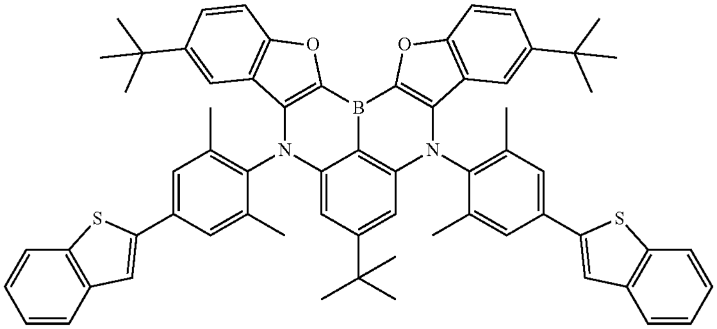

-continued
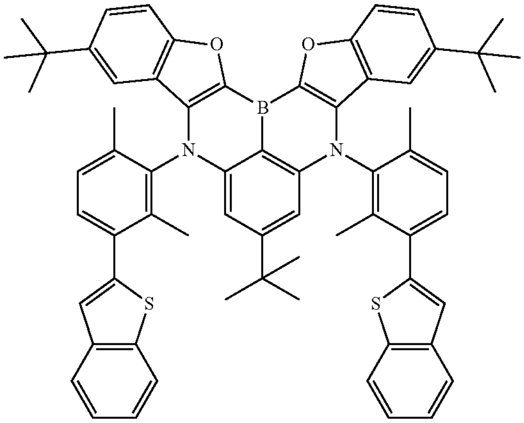
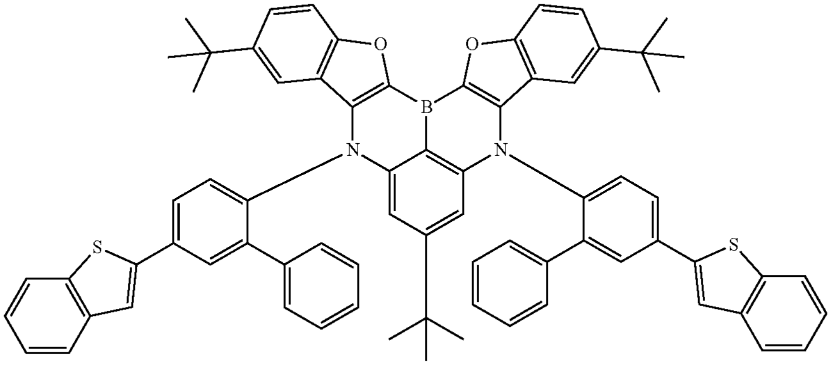
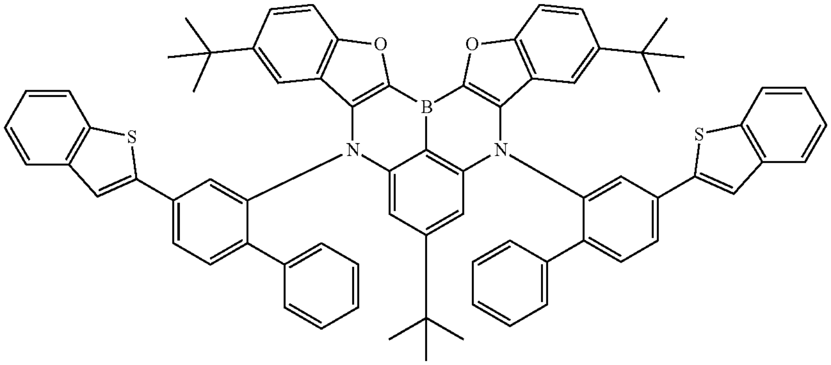
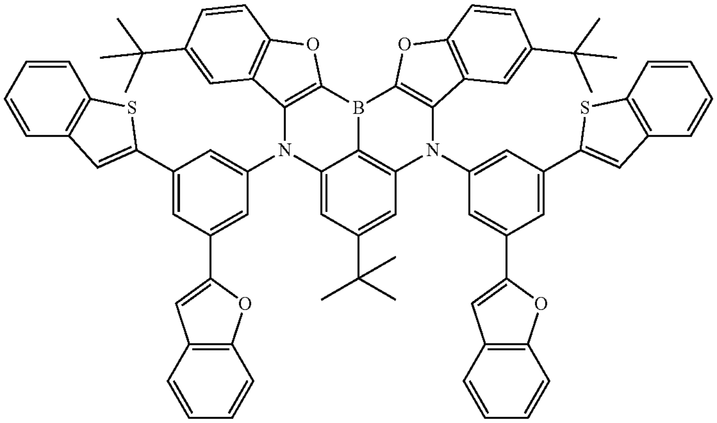

-continued
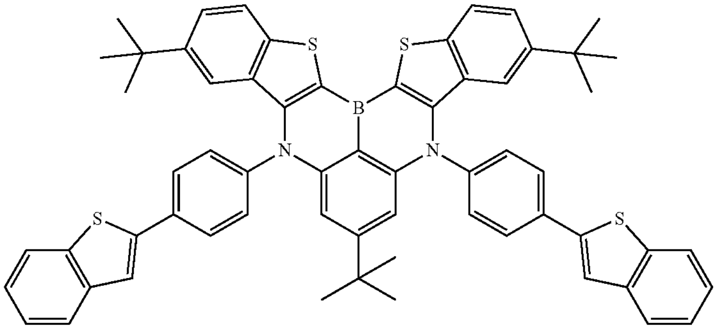
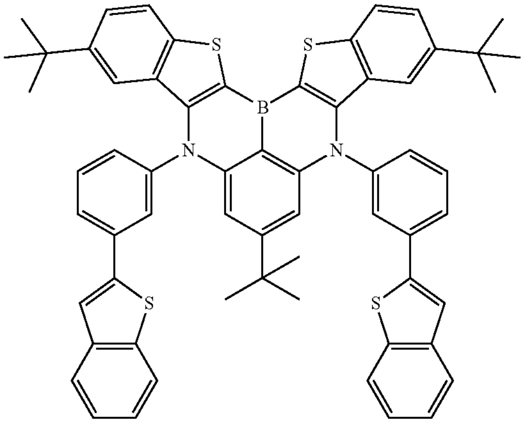
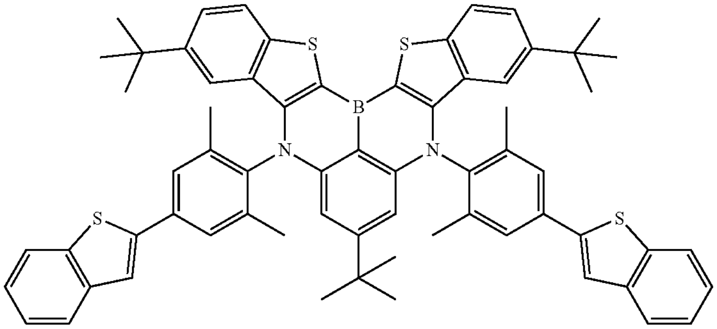
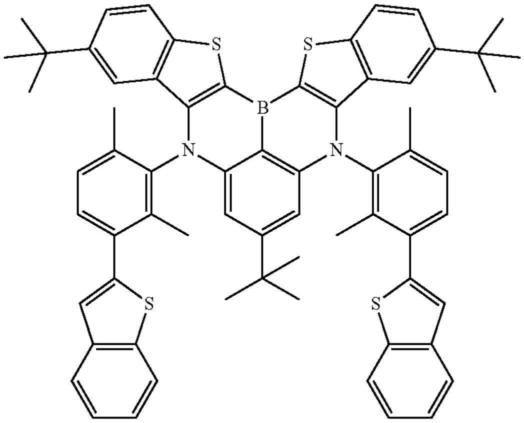

-continued
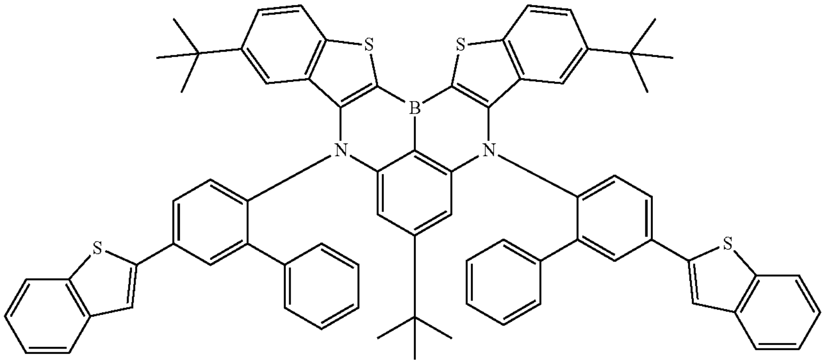
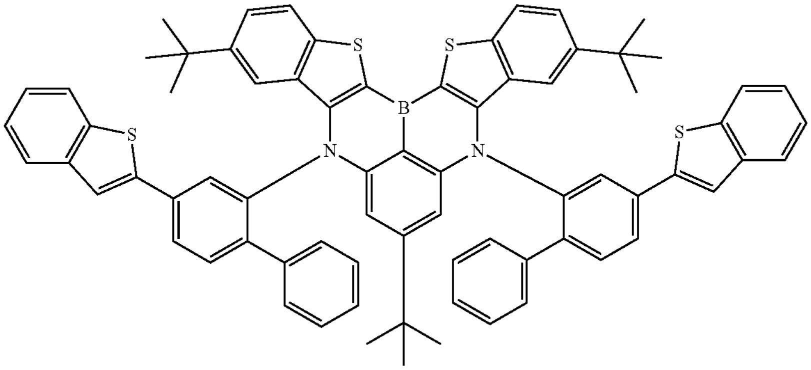
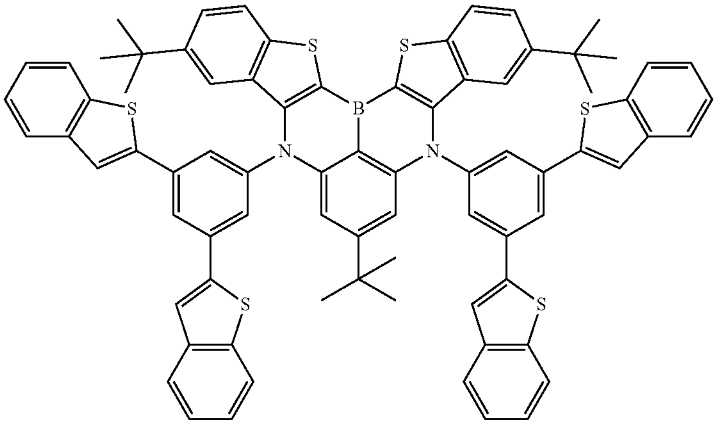
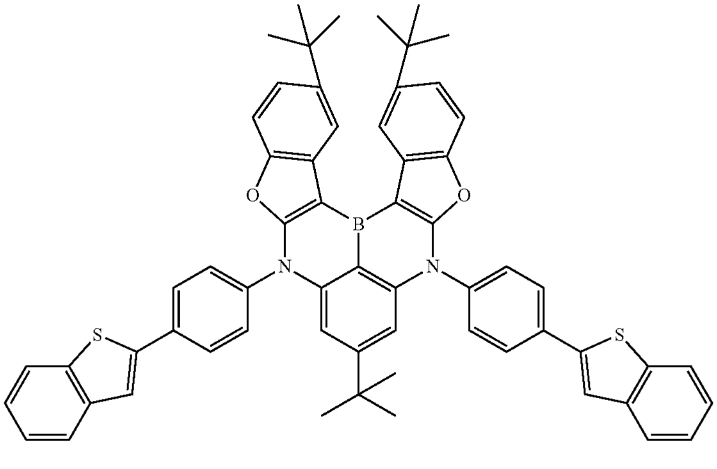

-continued
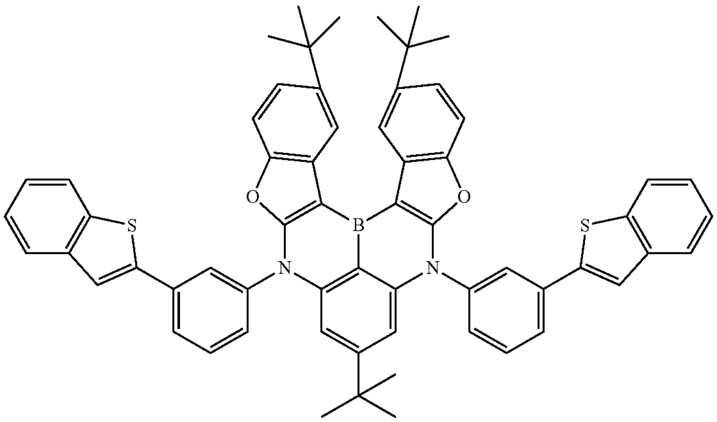
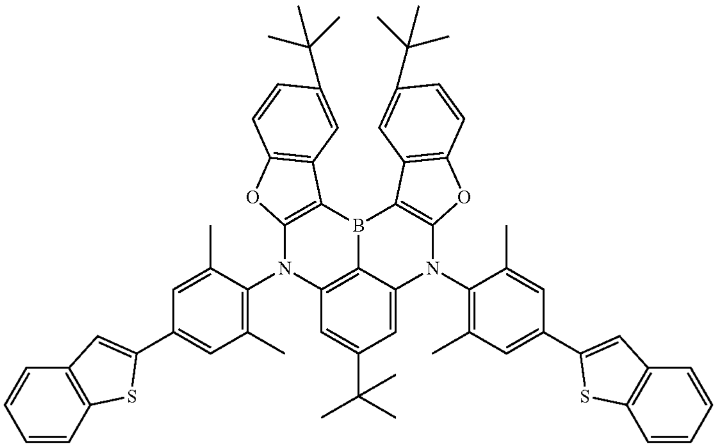
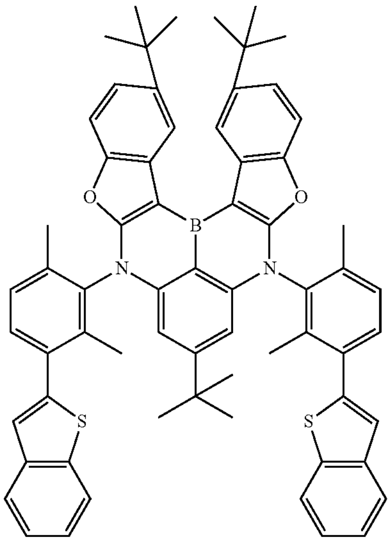

-continued
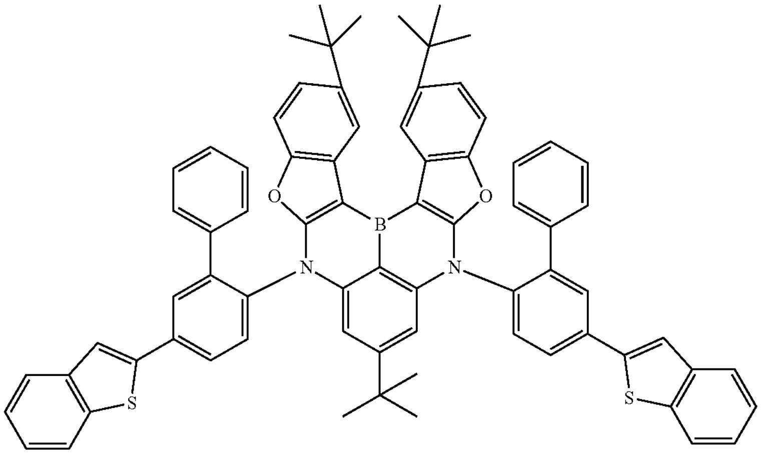
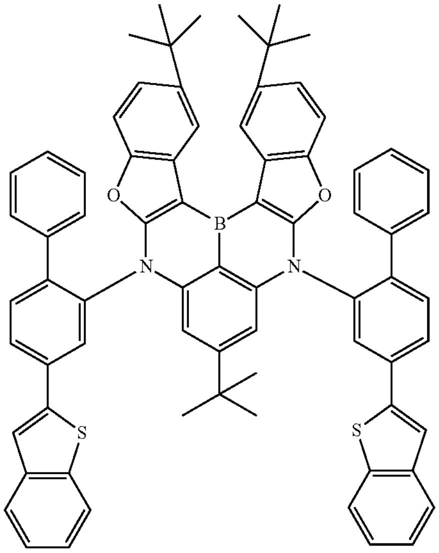
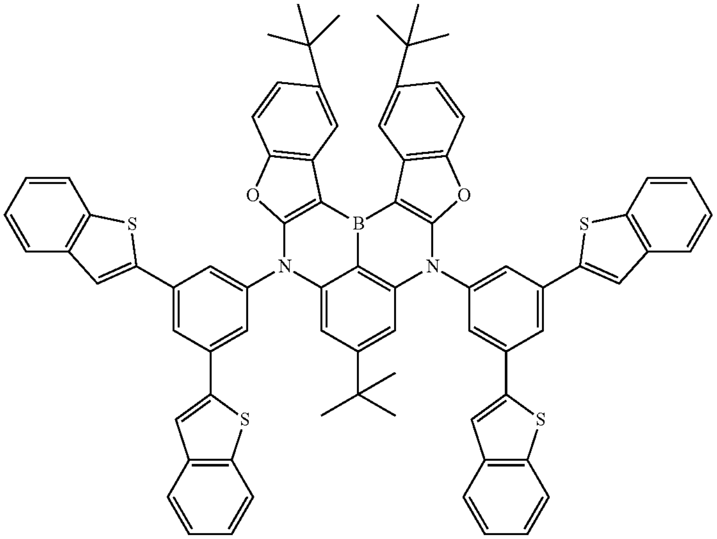
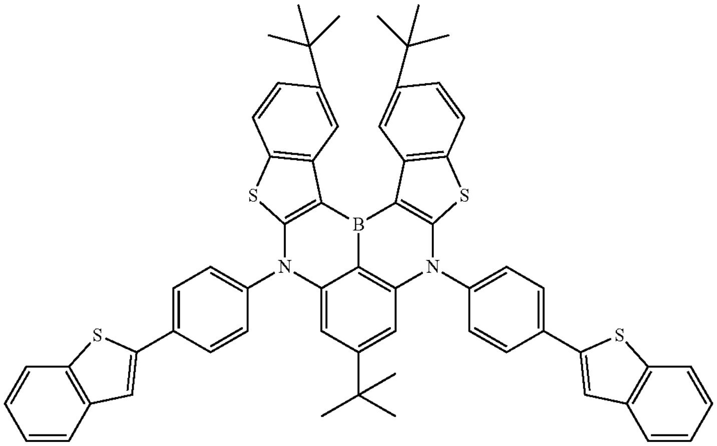

-continued
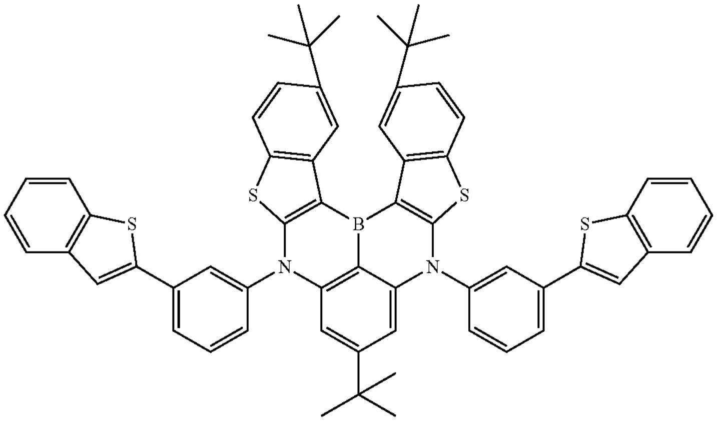
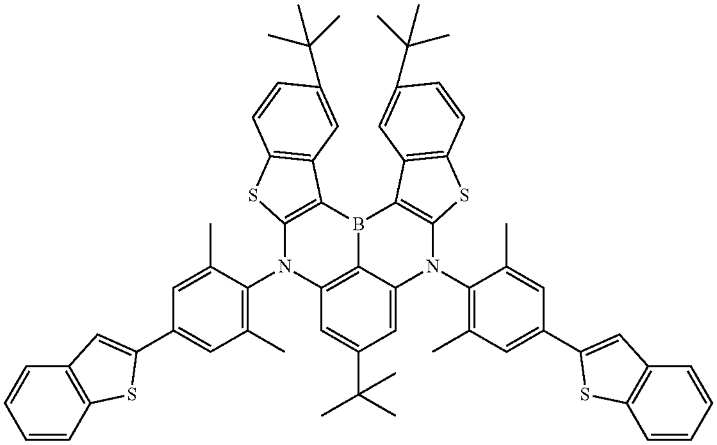
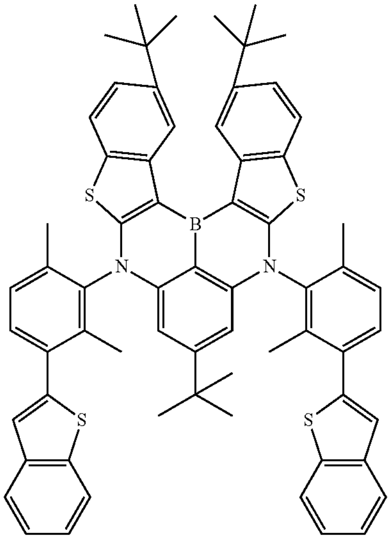
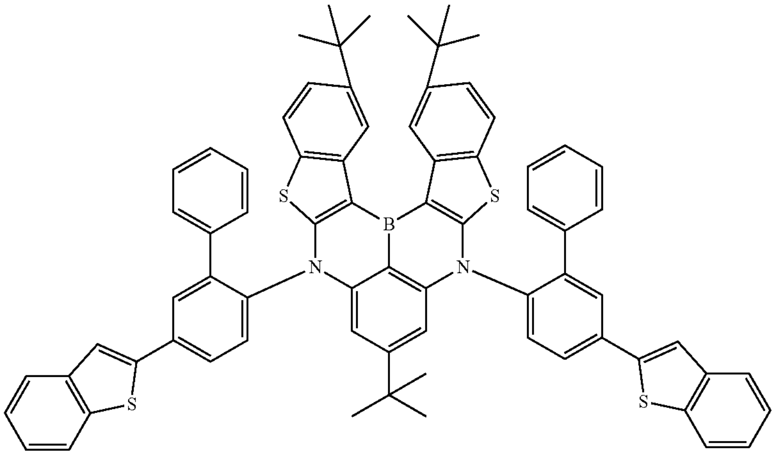

-continued
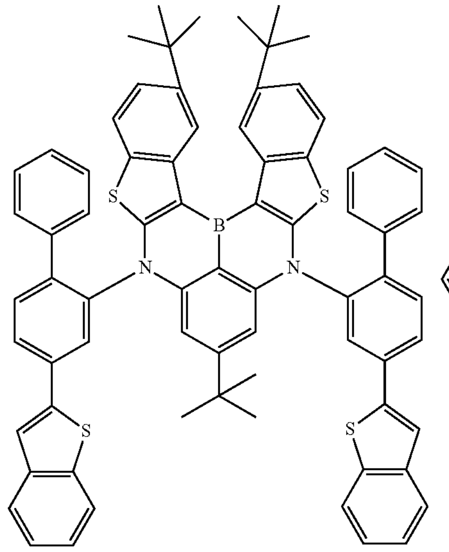
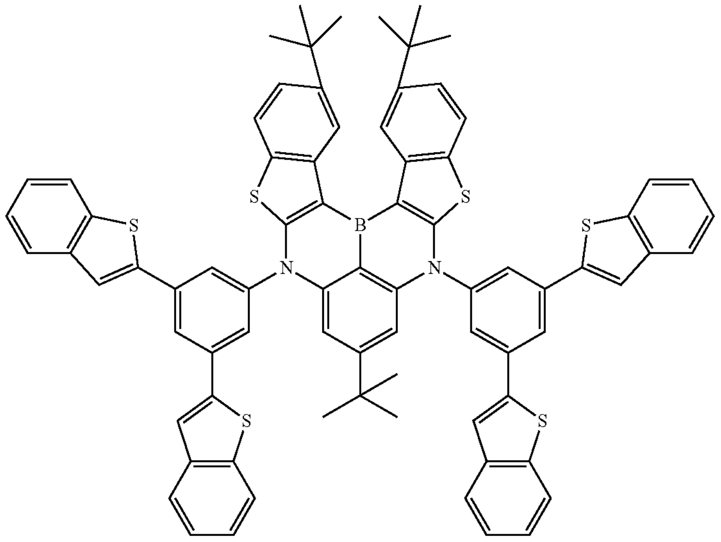
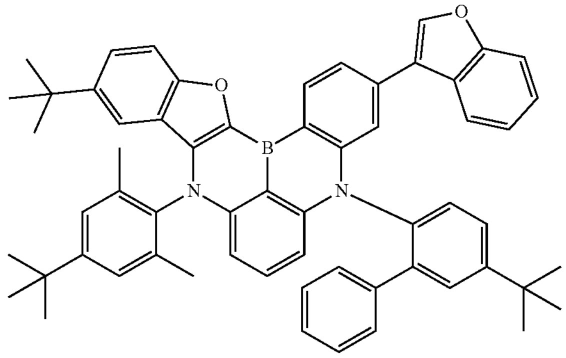
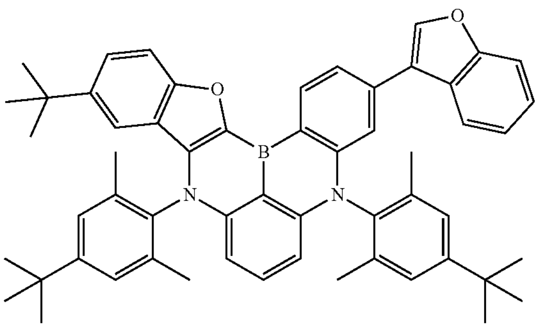
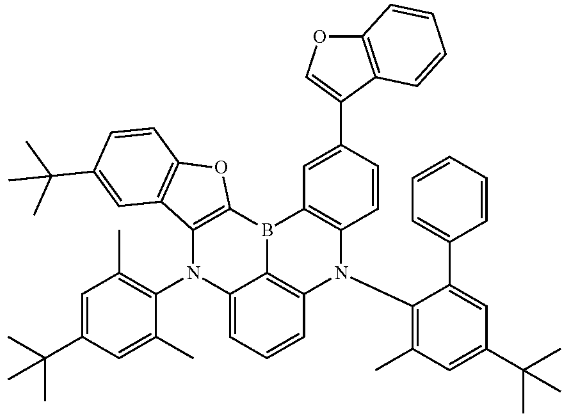
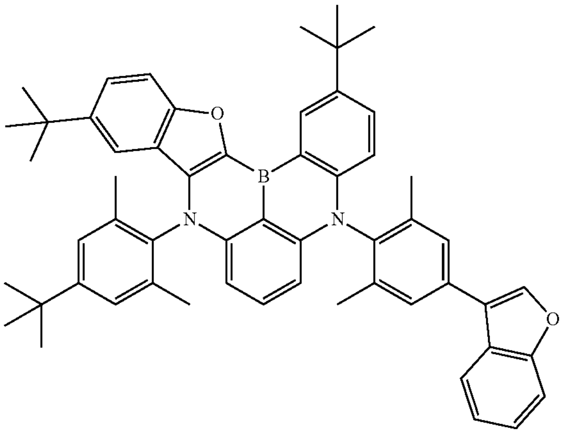

-continued
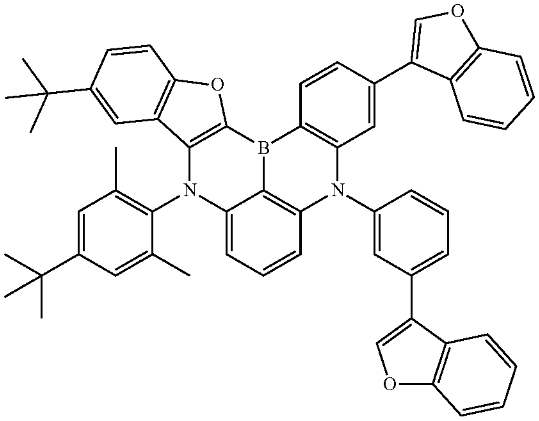
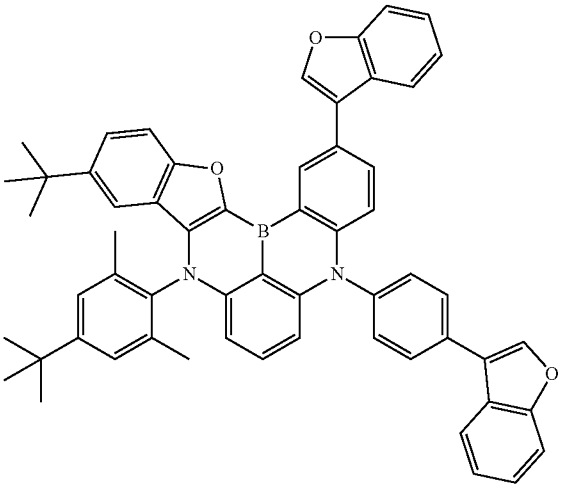
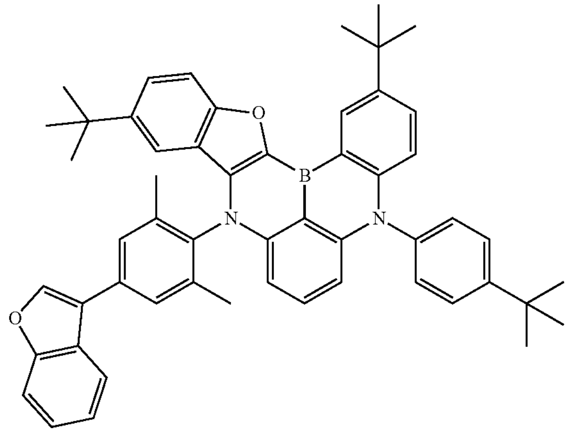
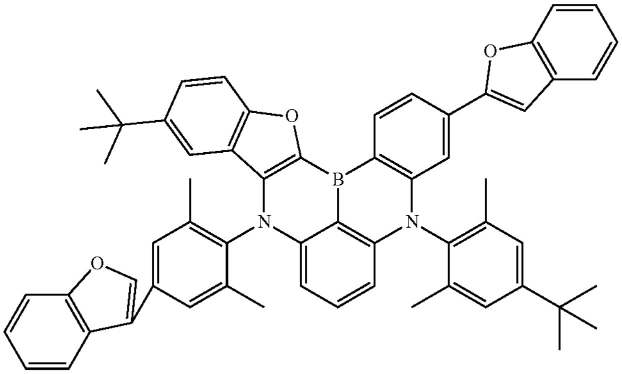
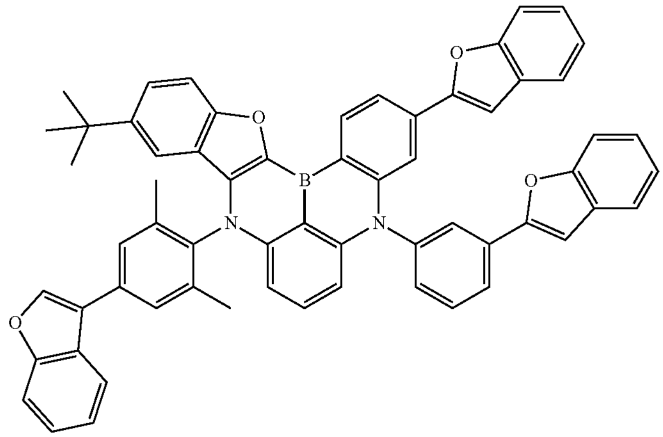
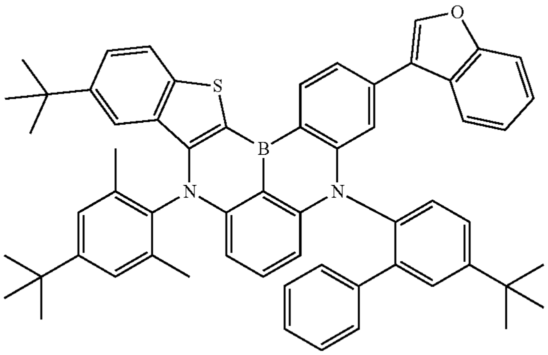

-continued
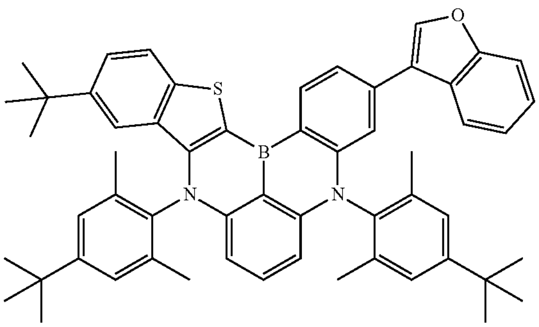
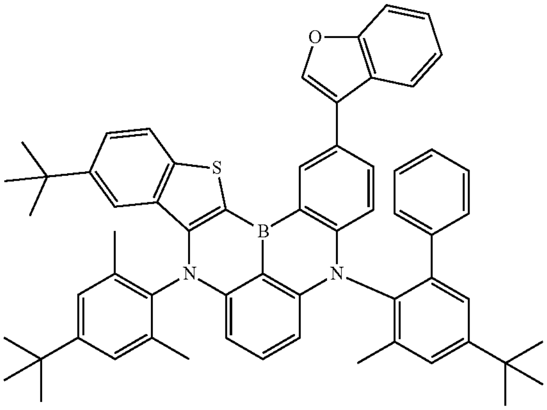
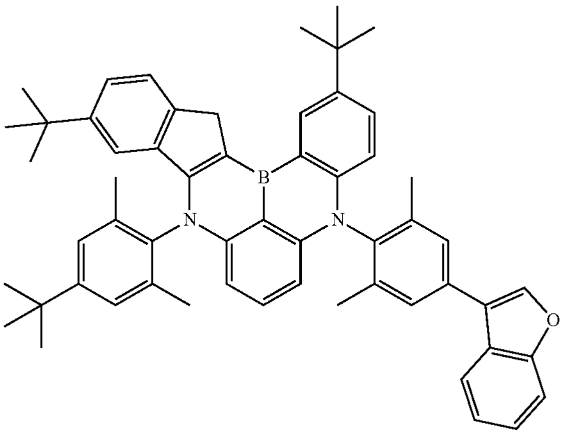
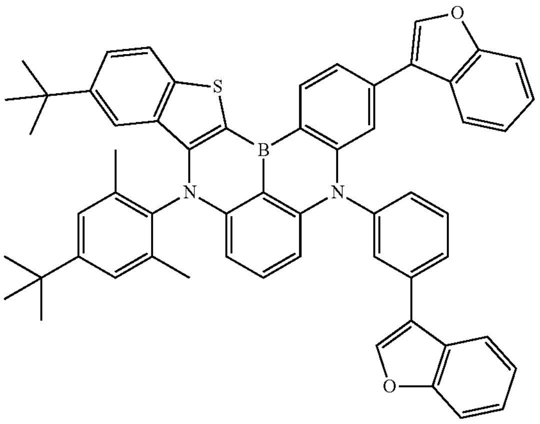
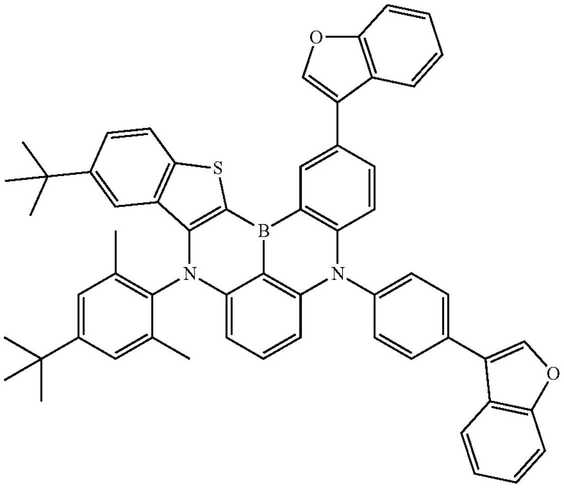
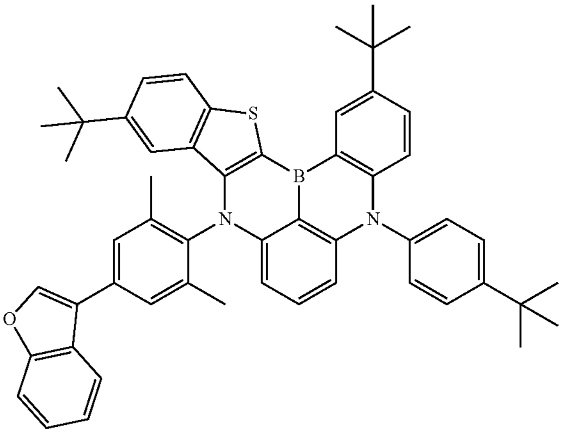

-continued
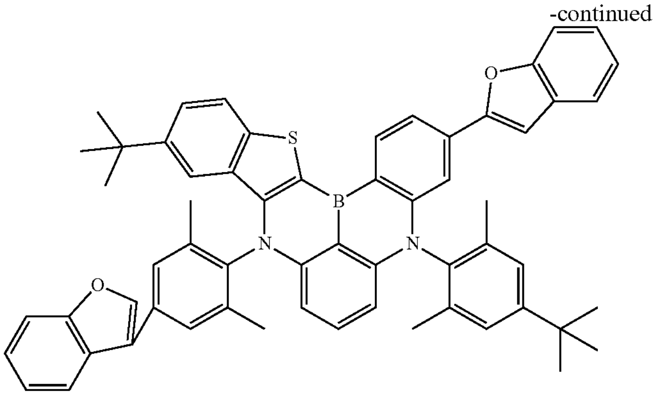
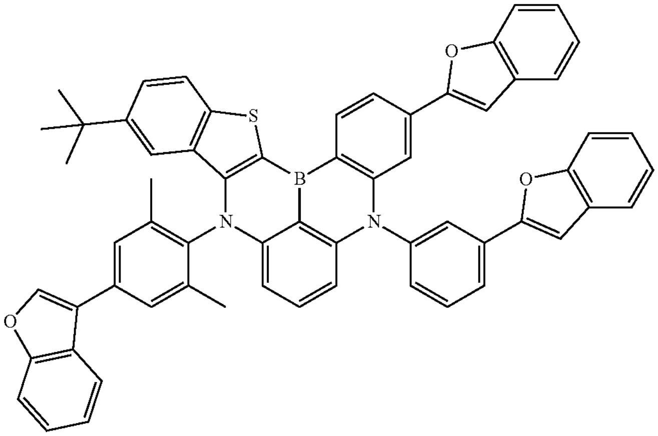
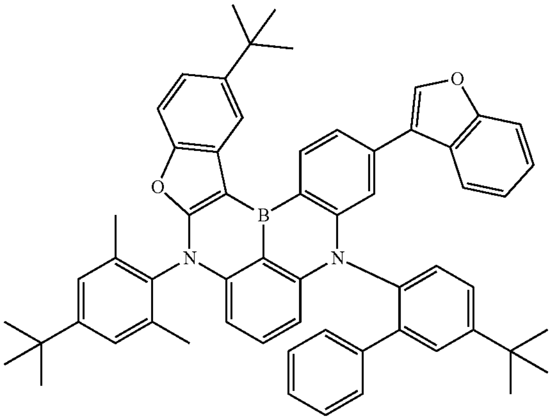
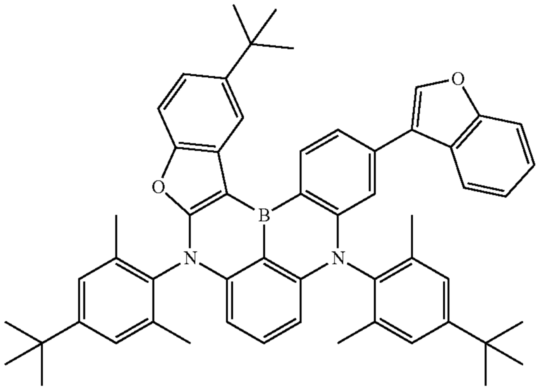
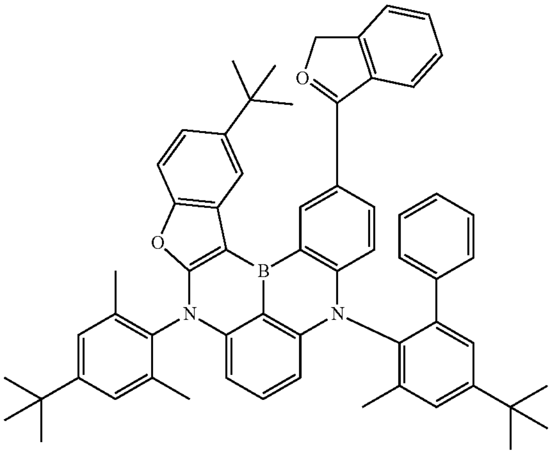
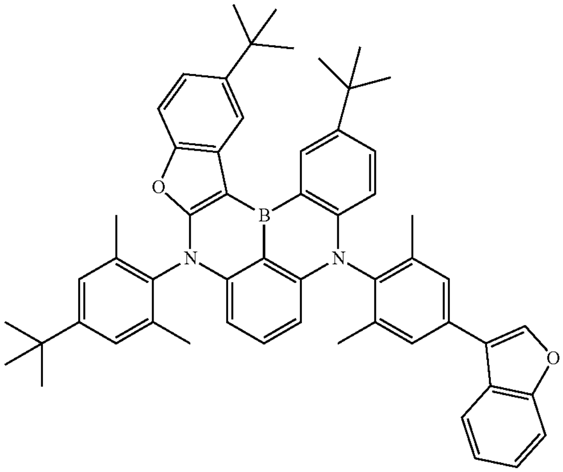

-continued
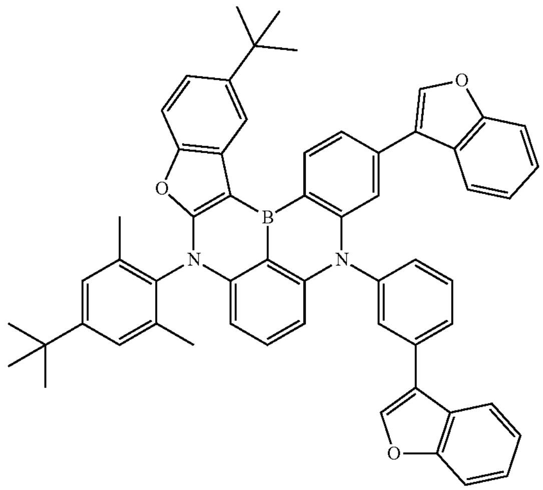
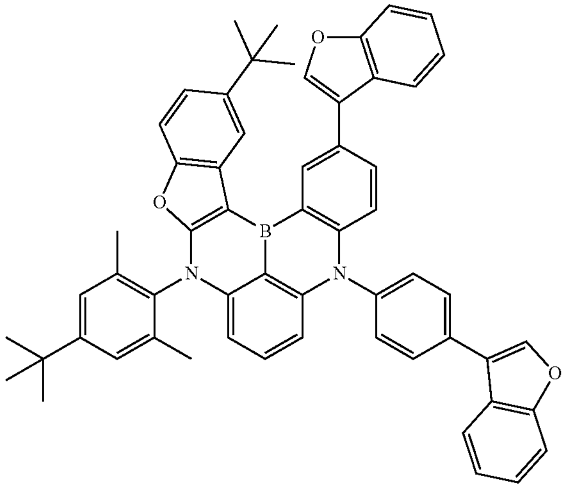
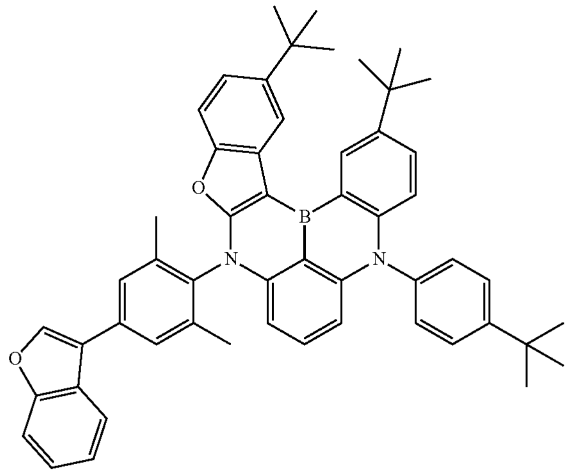
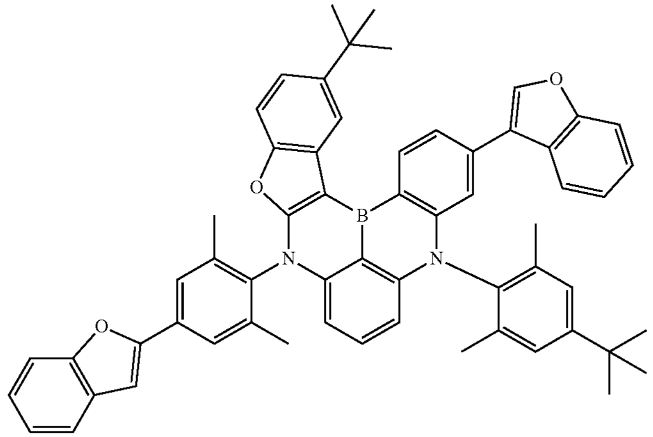

-continued
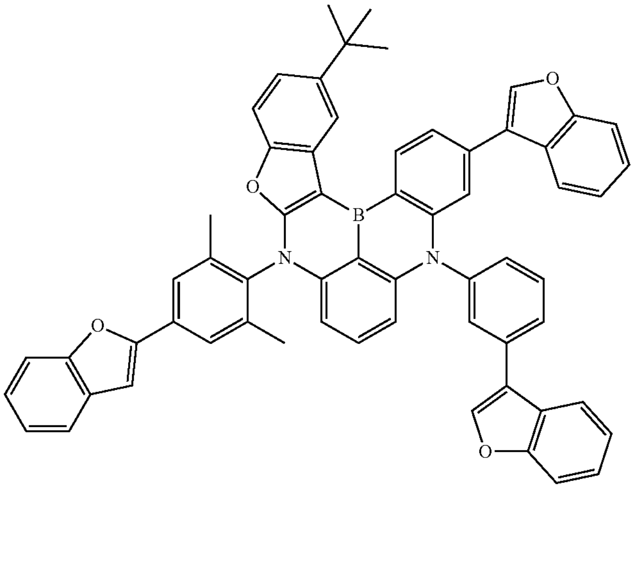
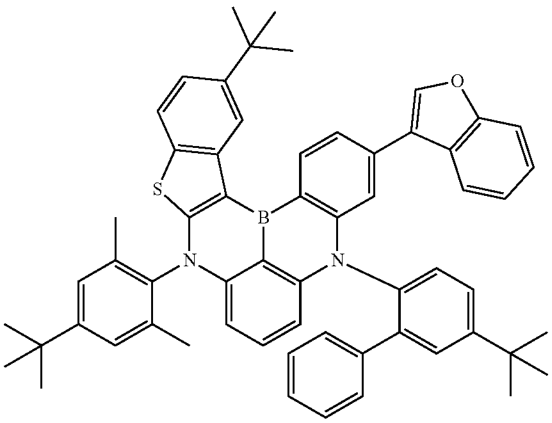
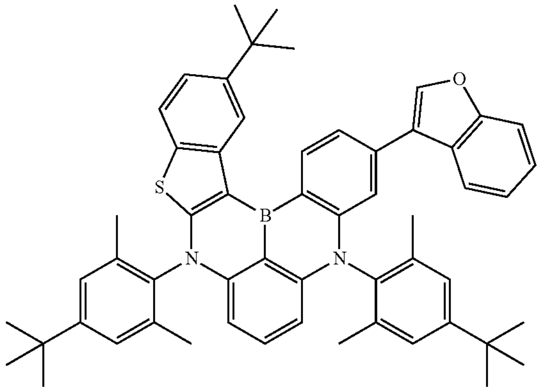
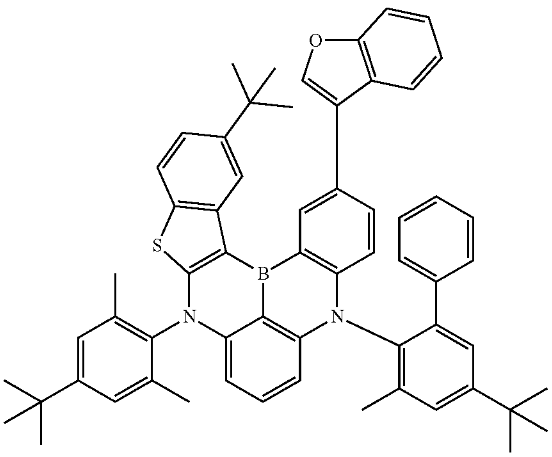
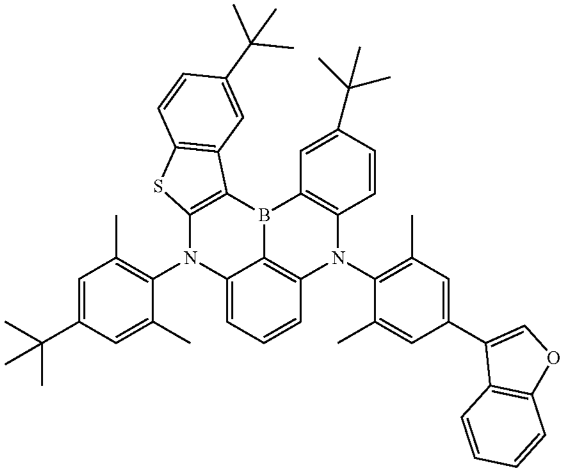

-continued
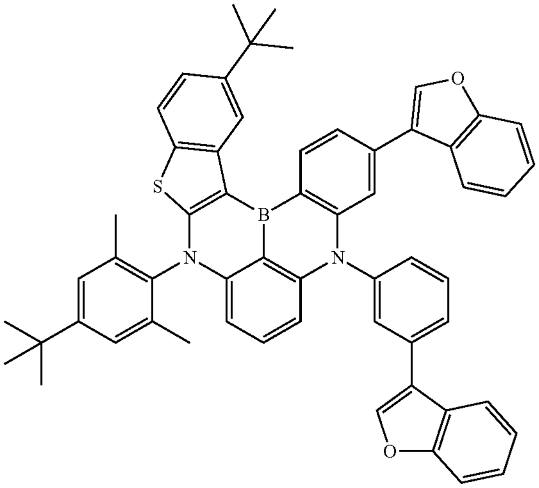
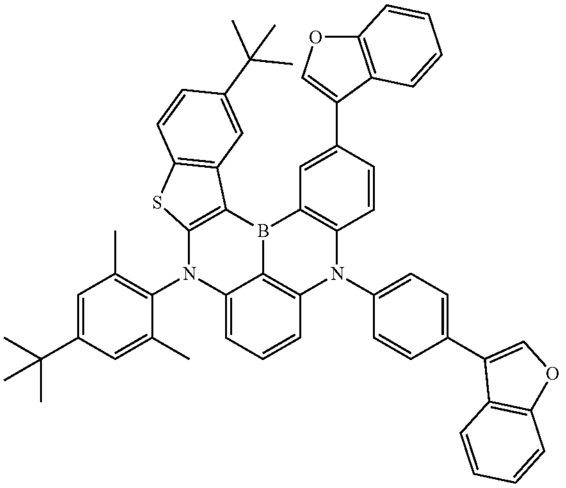
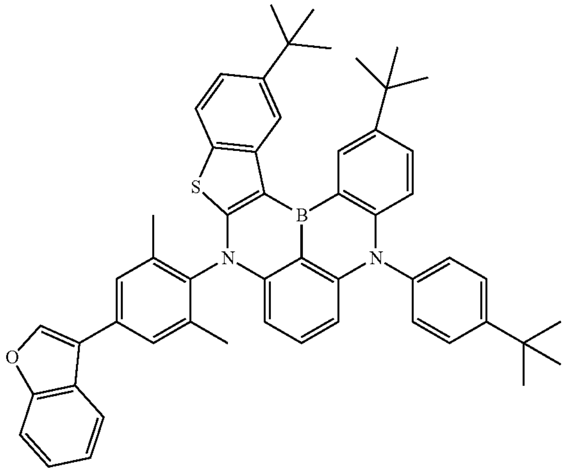
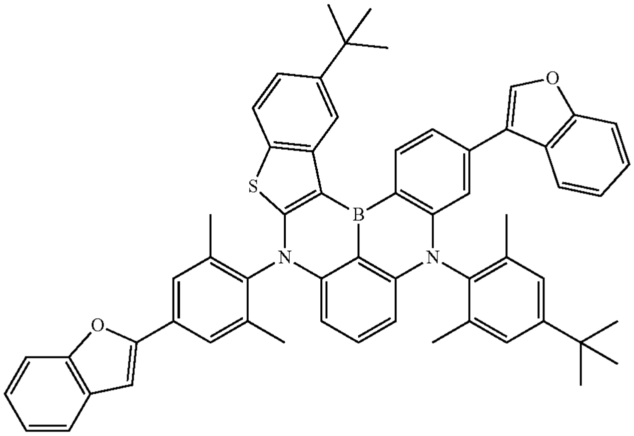

-continued
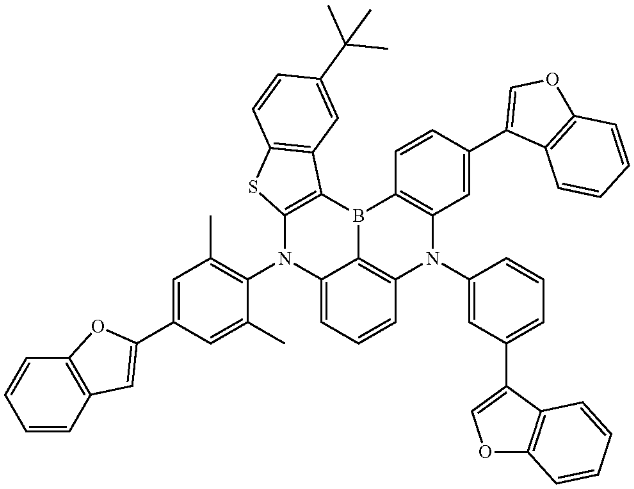
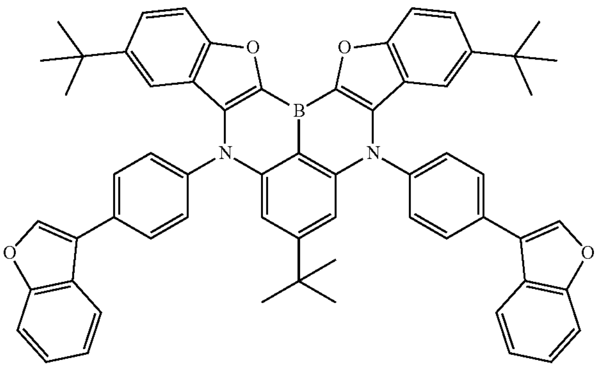
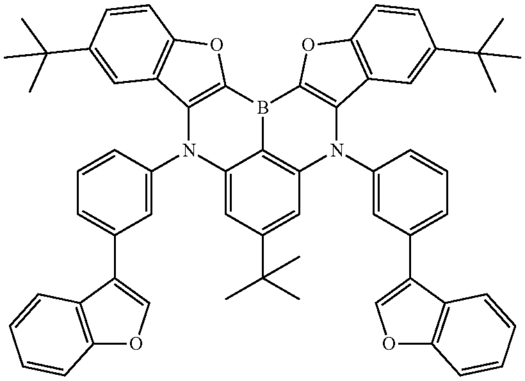
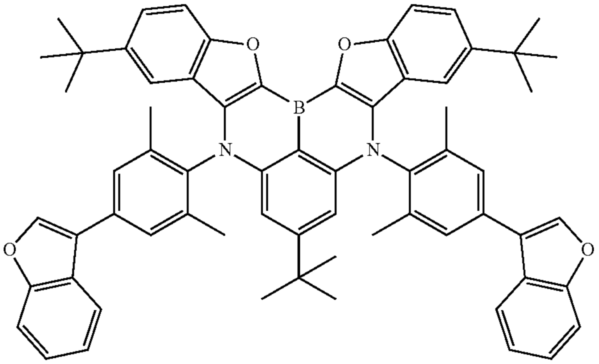
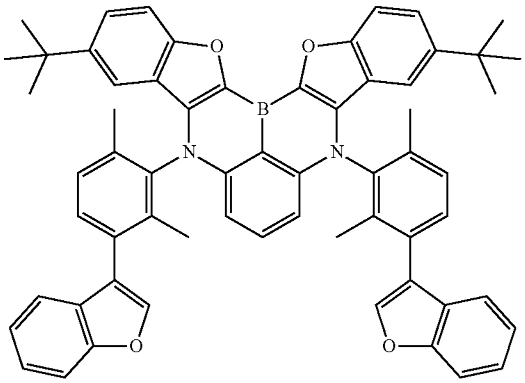
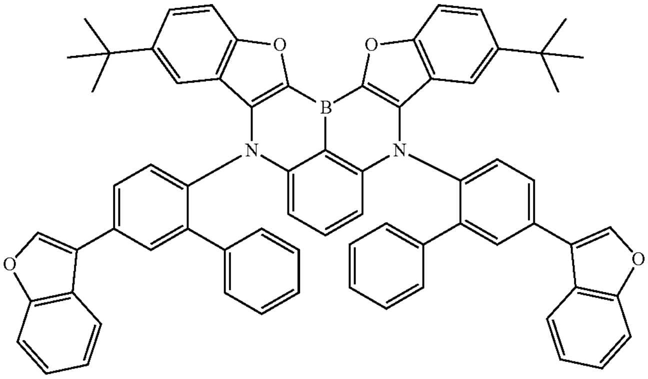

-continued
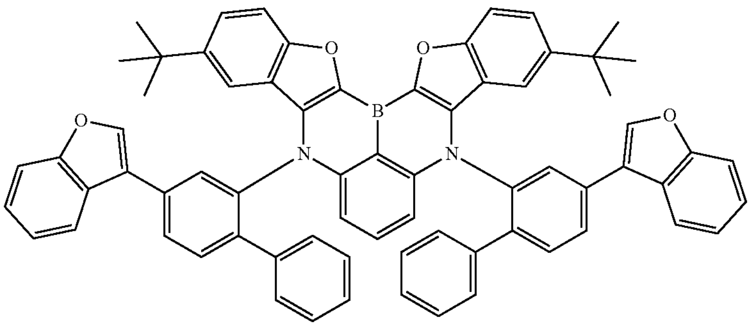
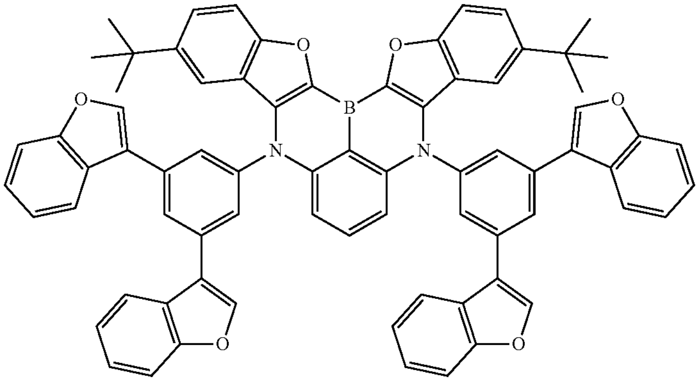
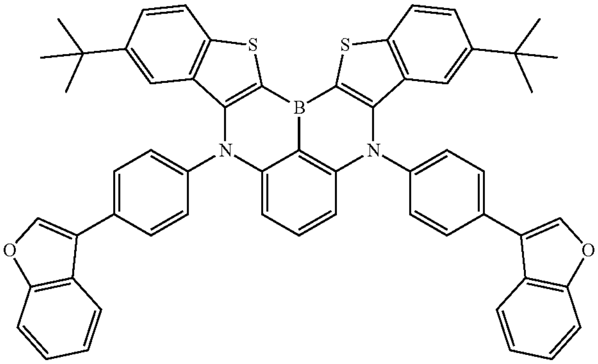
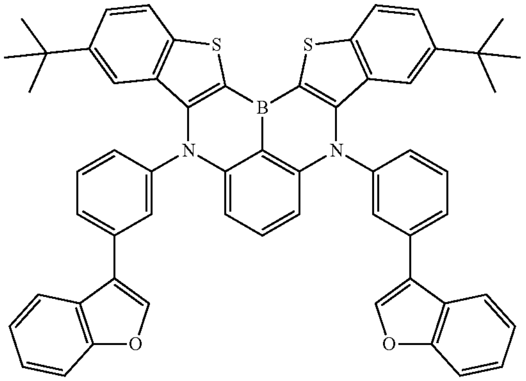
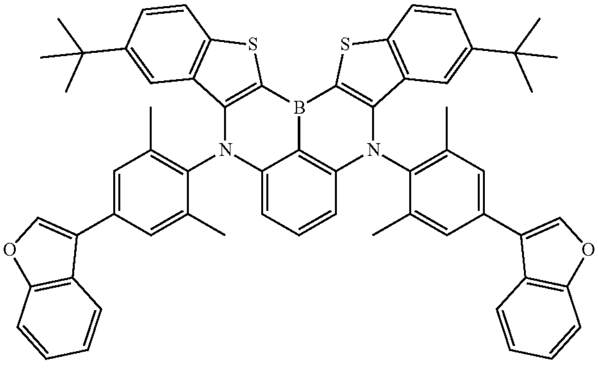
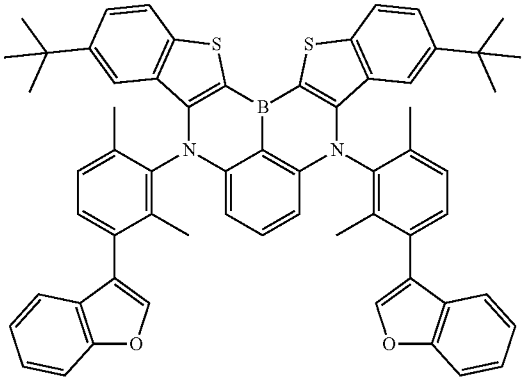

-continued
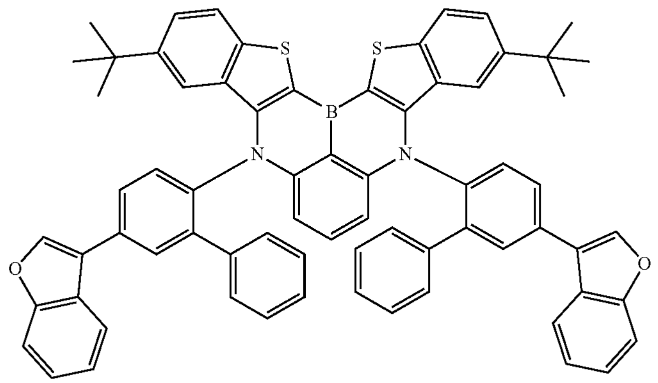
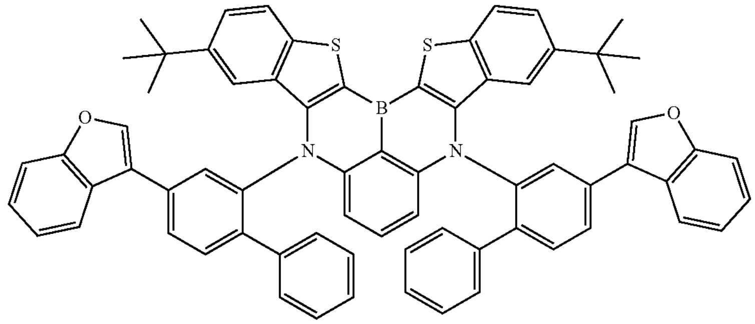
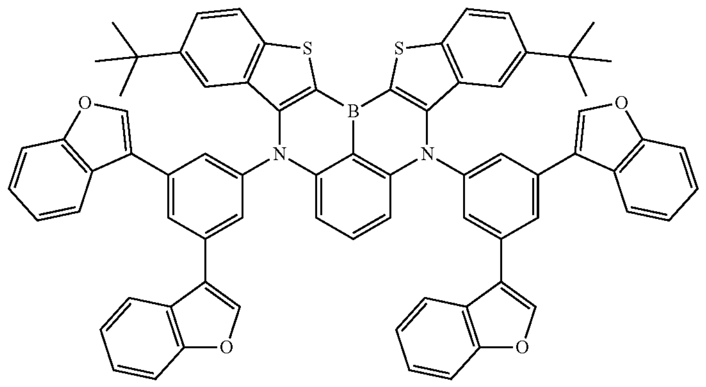
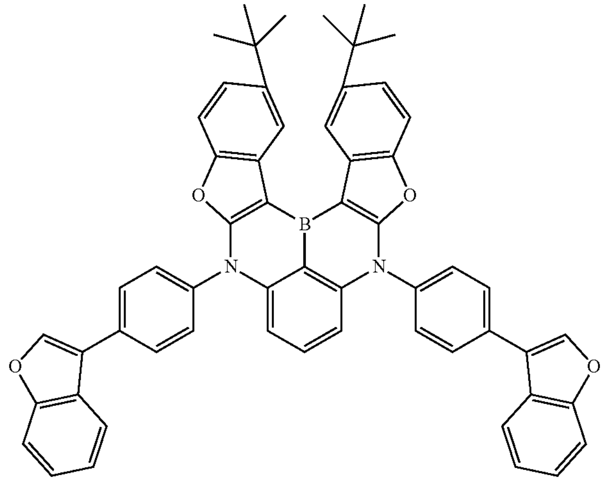

-continued
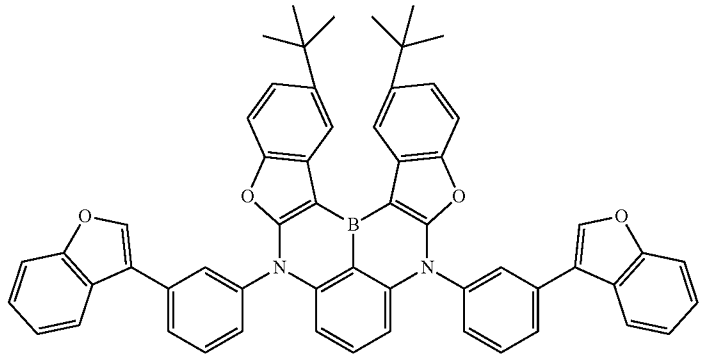
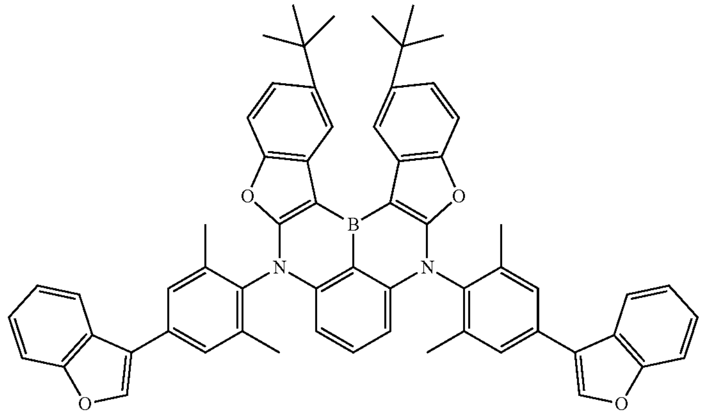
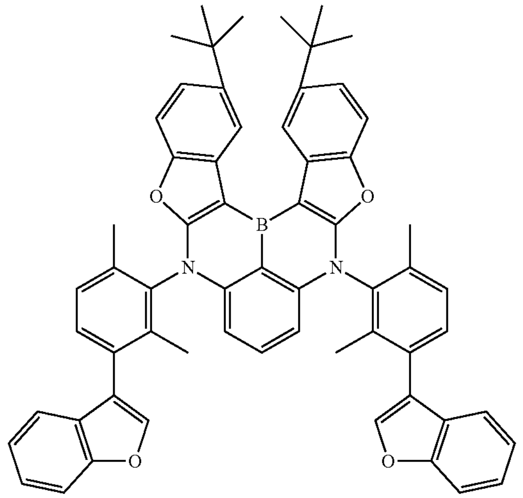
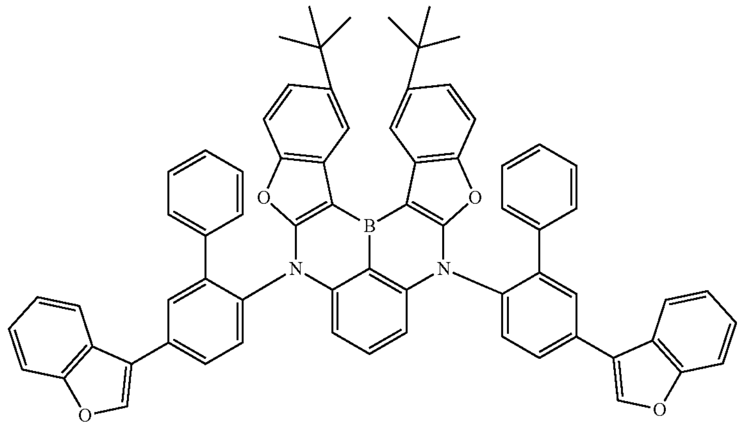

-continued
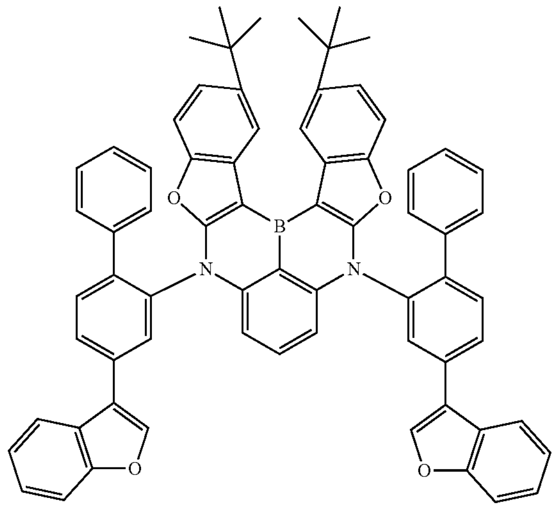
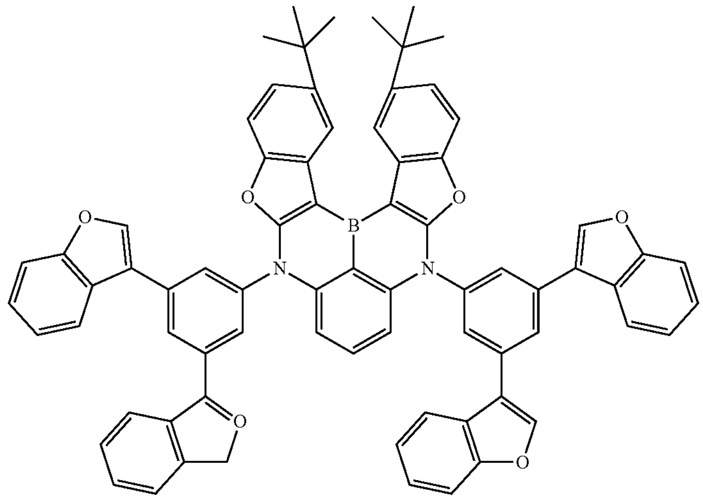
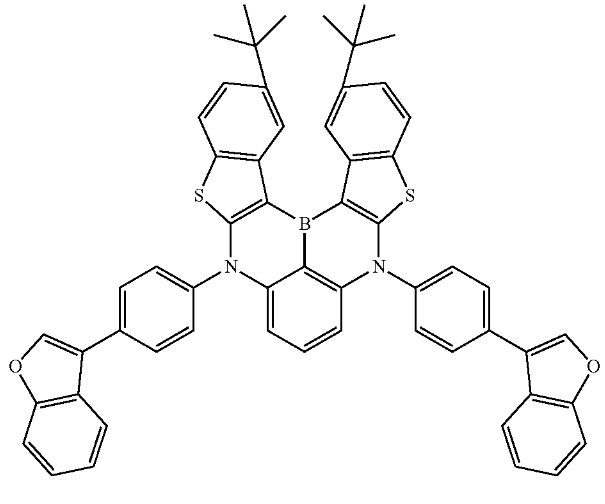

-continued
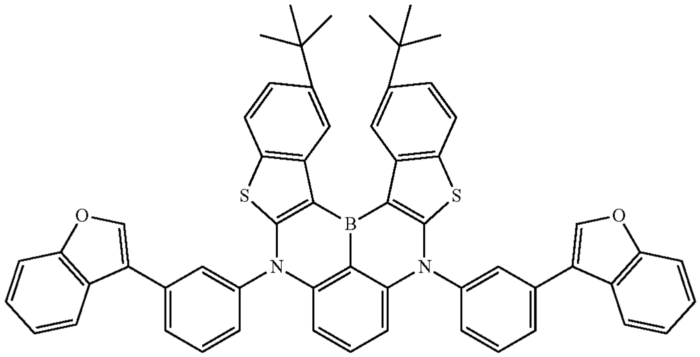
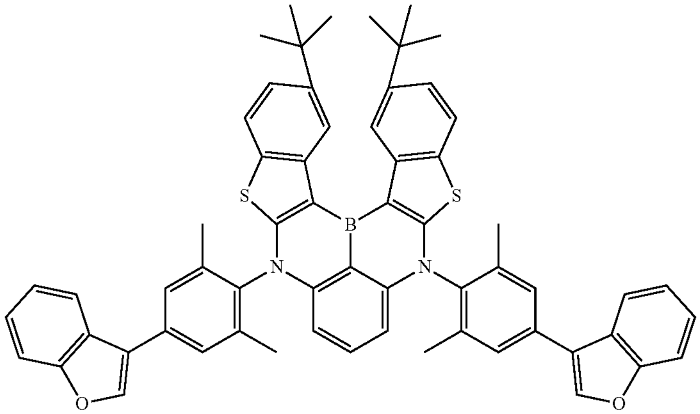
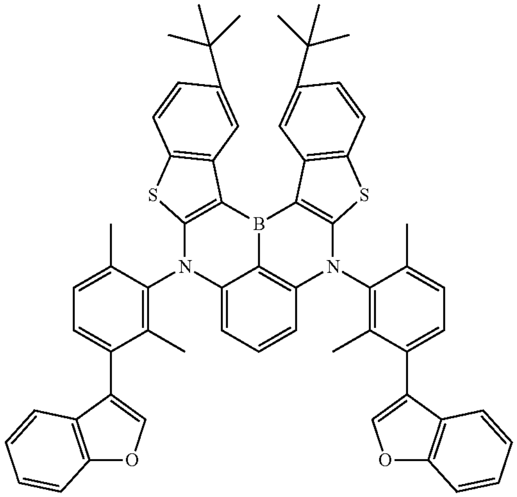
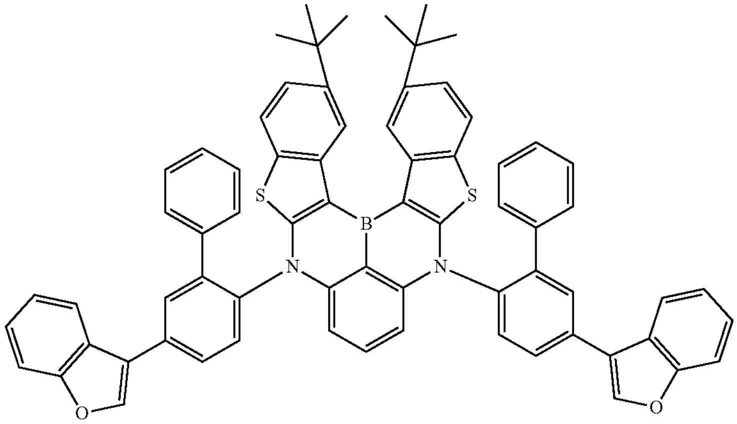

-continued
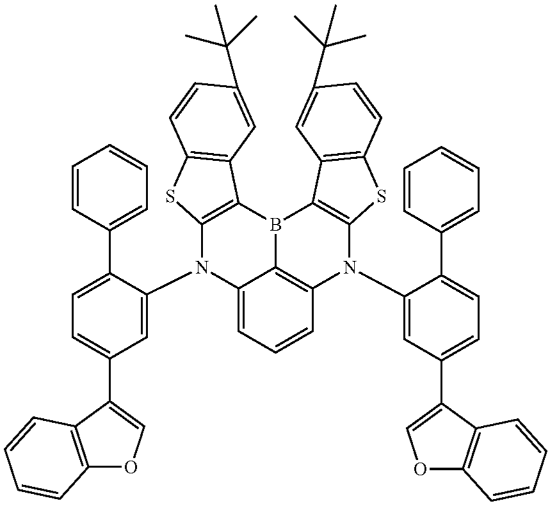
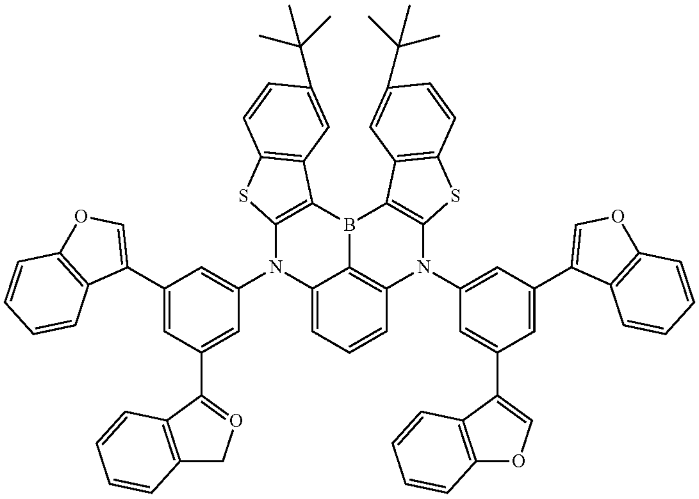
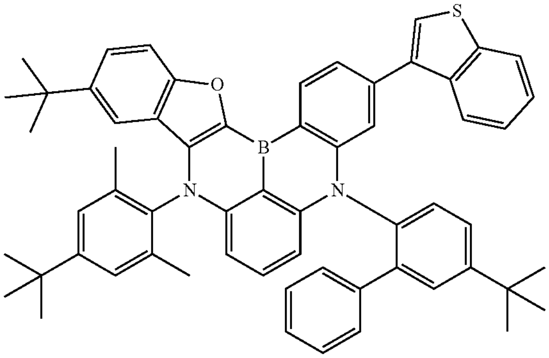
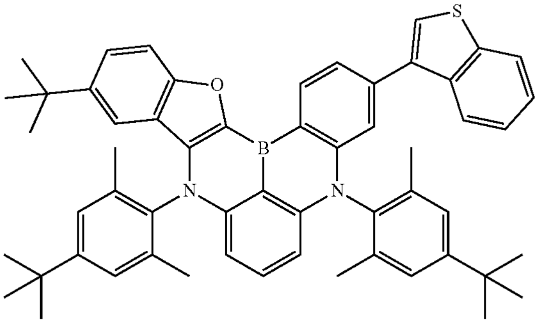

-continued
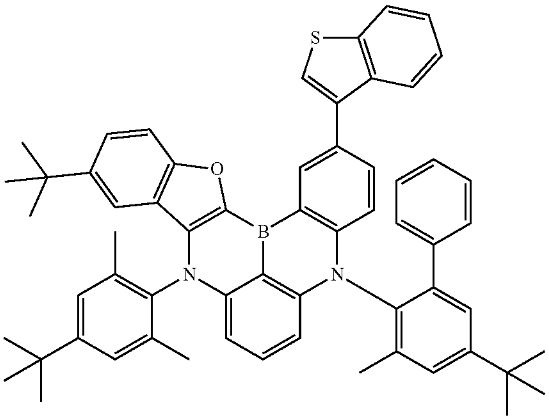
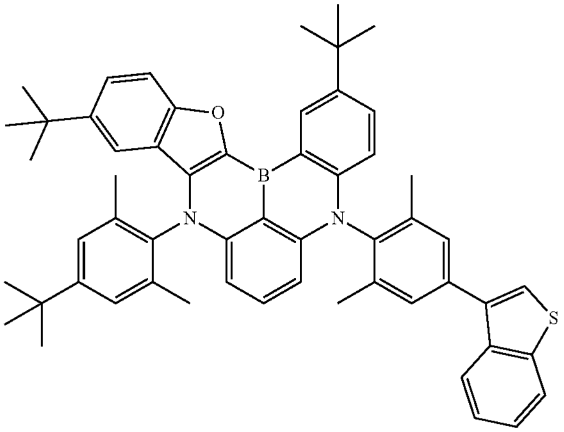
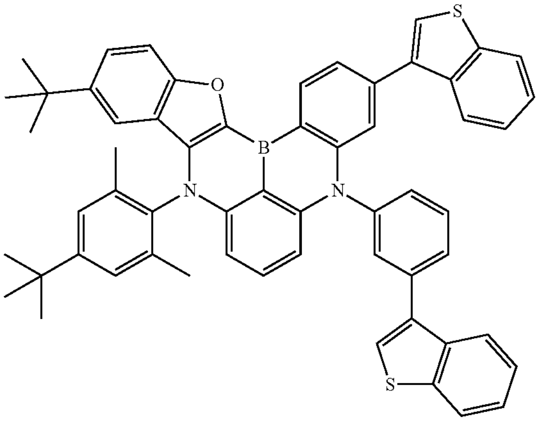
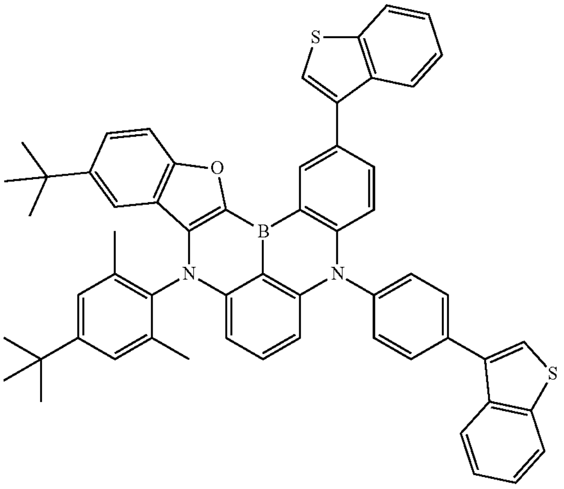
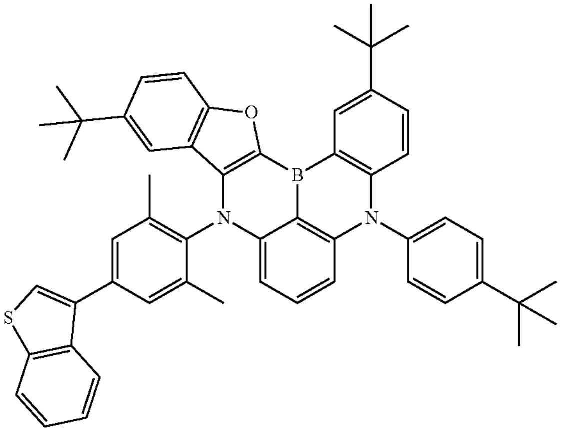
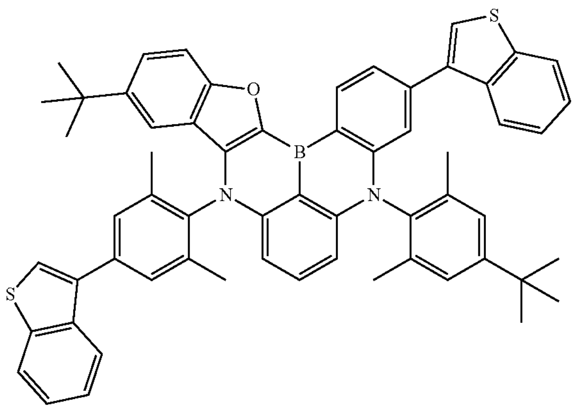

-continued
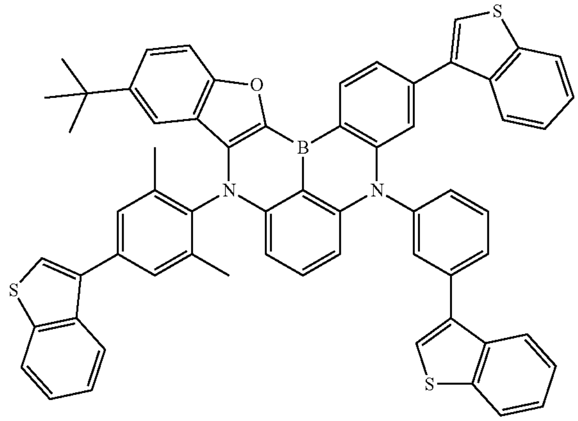
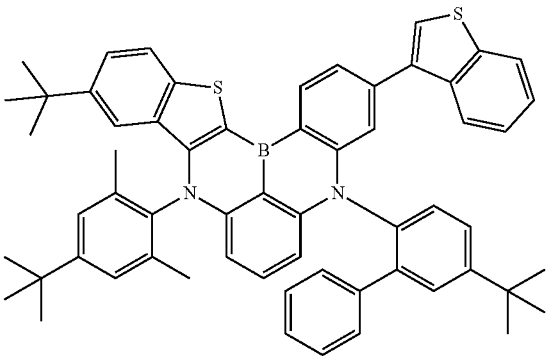
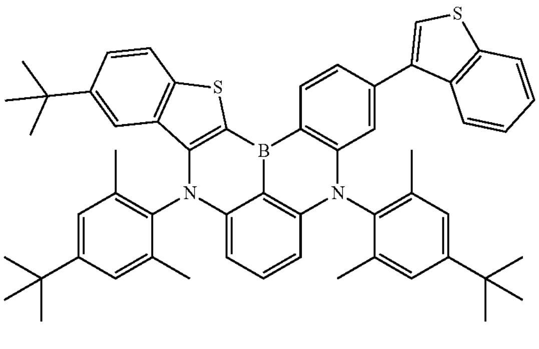
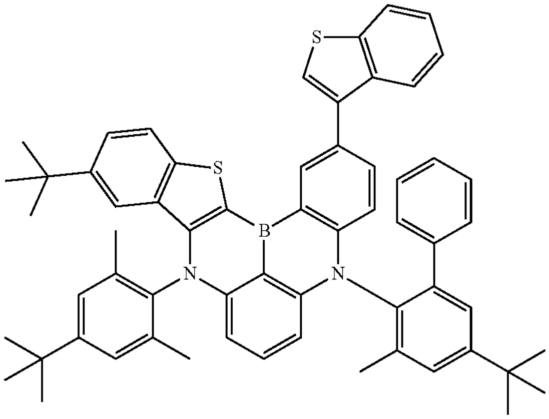
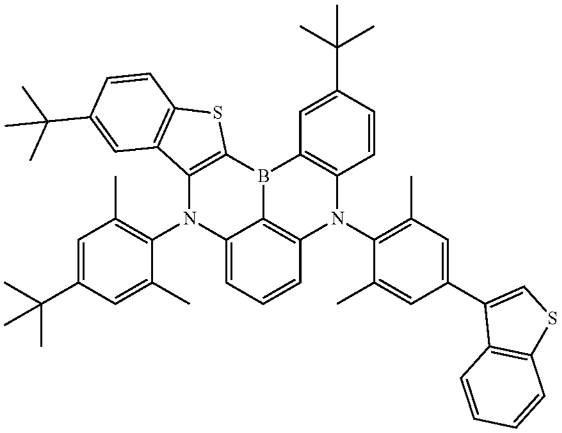
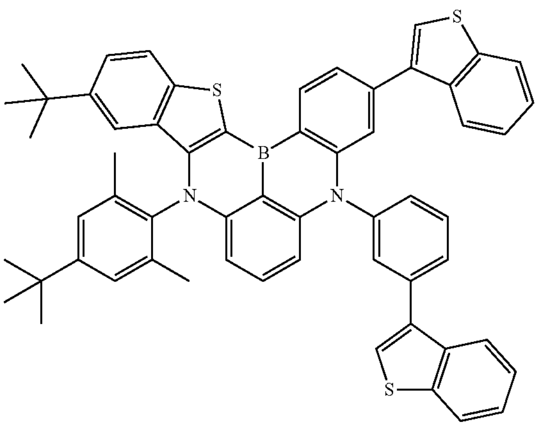

-continued
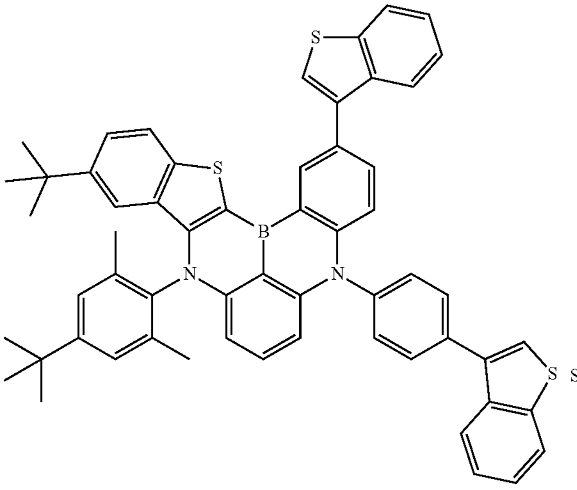
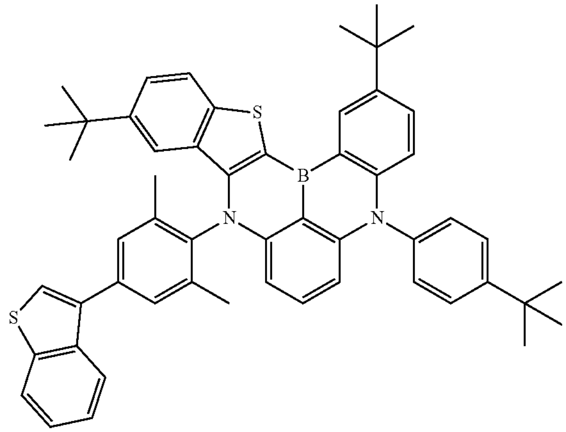
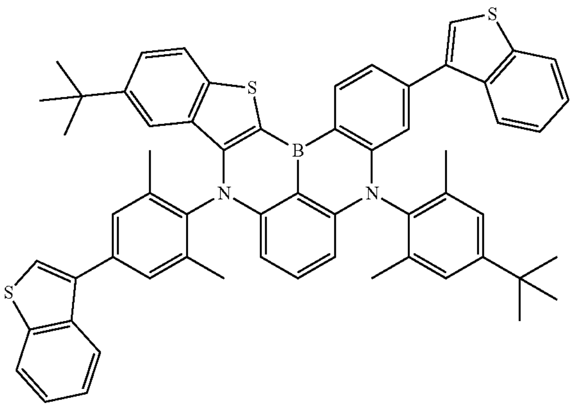
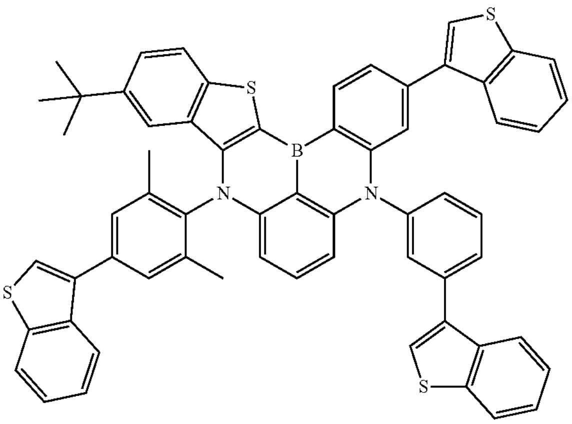
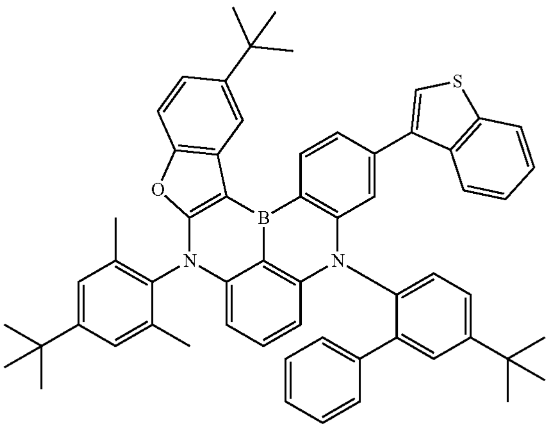
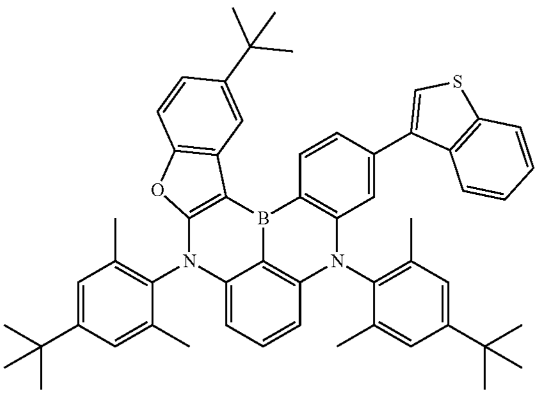

-continued
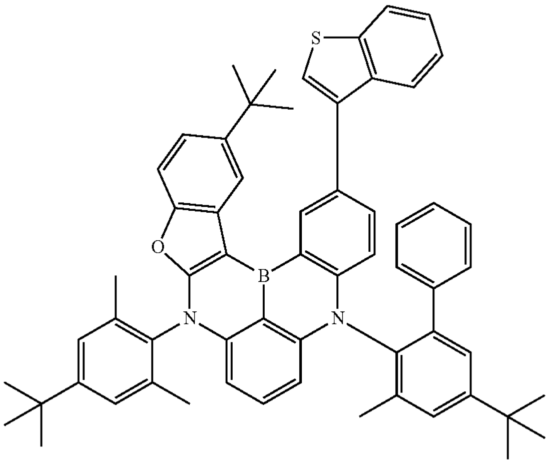
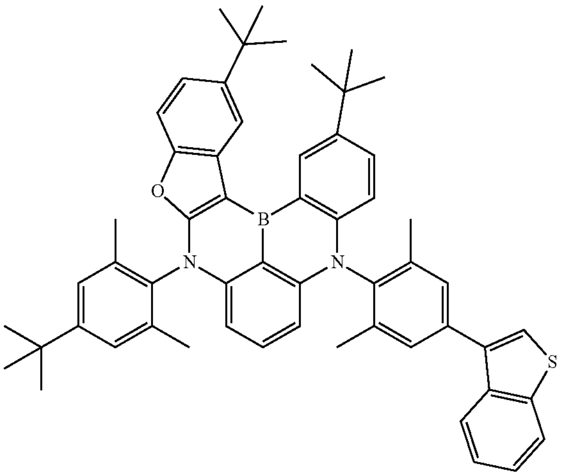
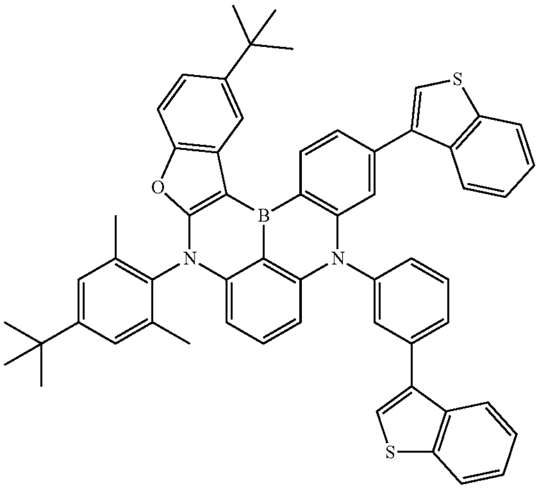
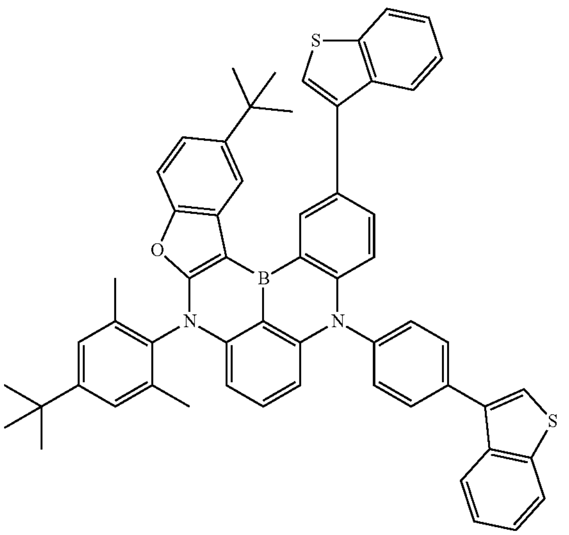
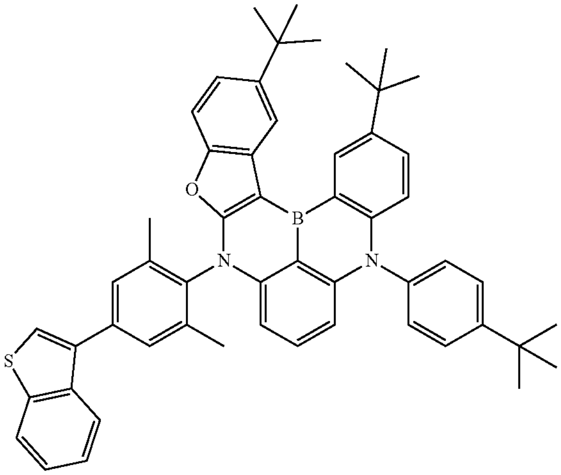
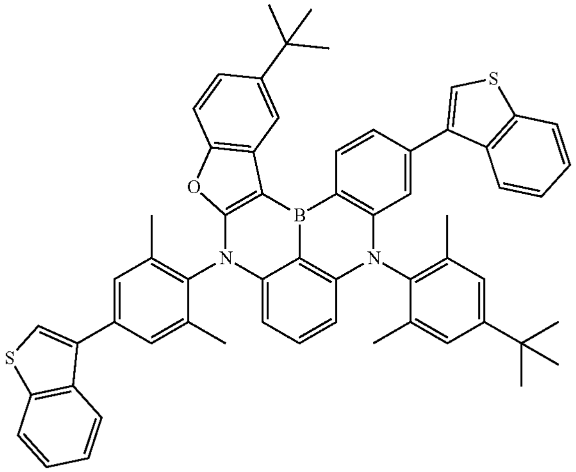

-continued
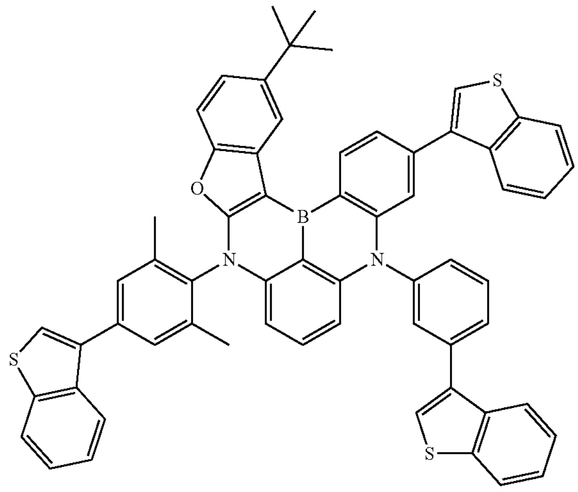
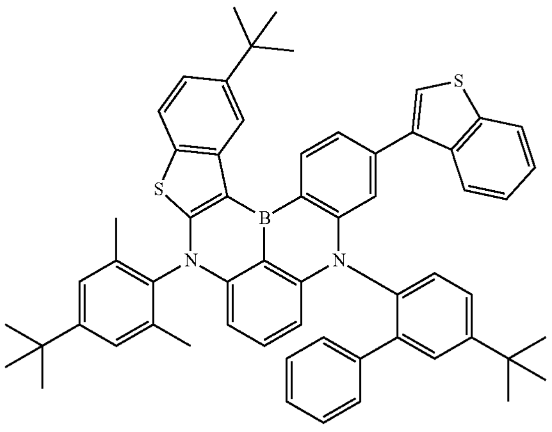
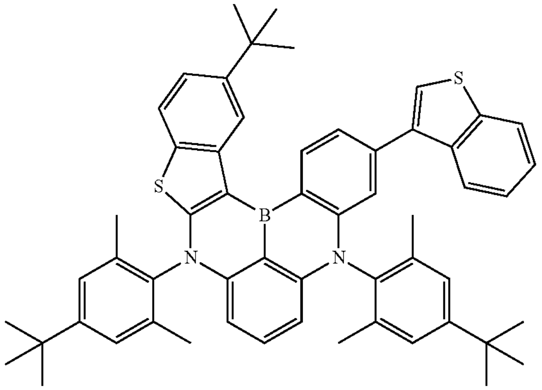
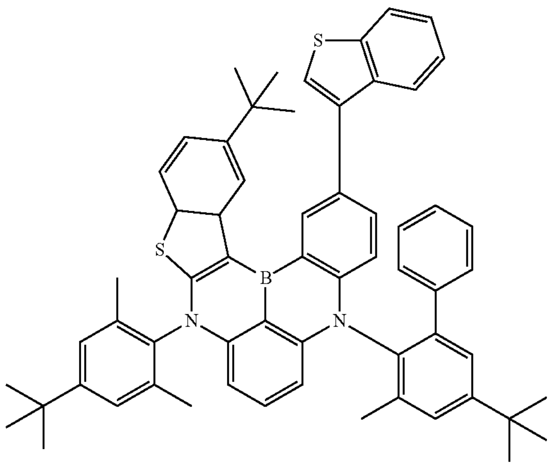
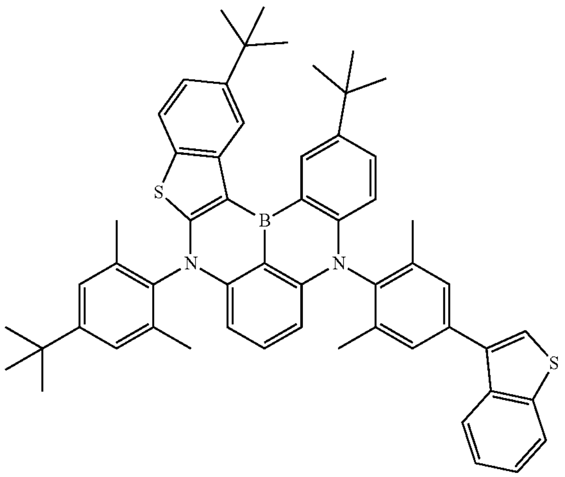
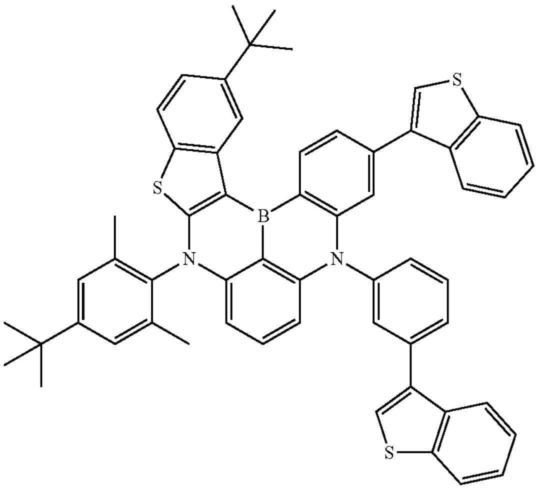

-continued
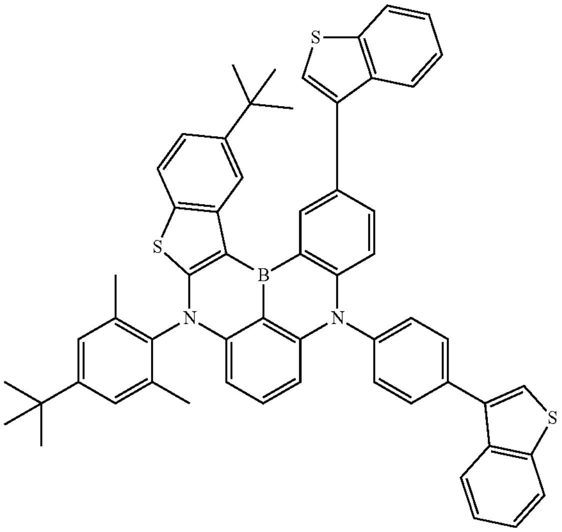
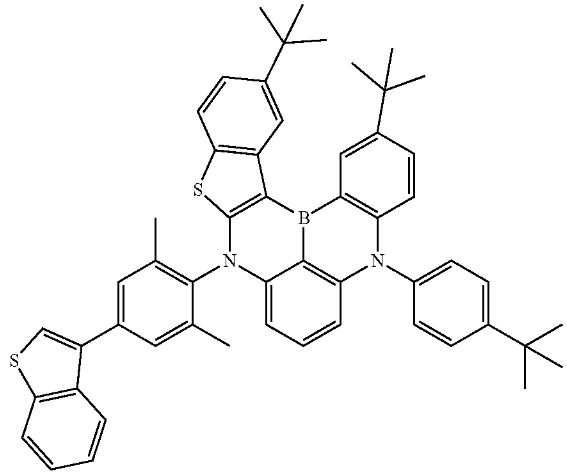
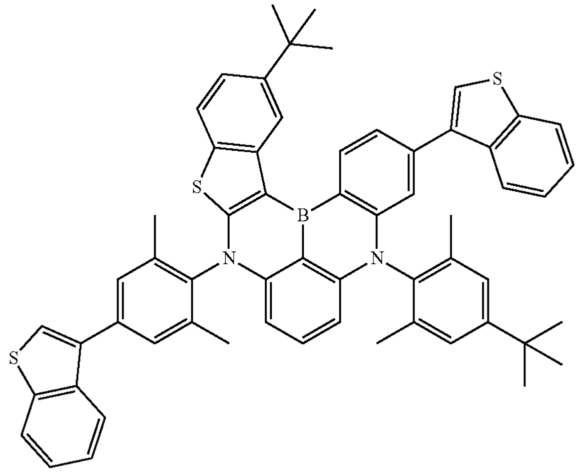
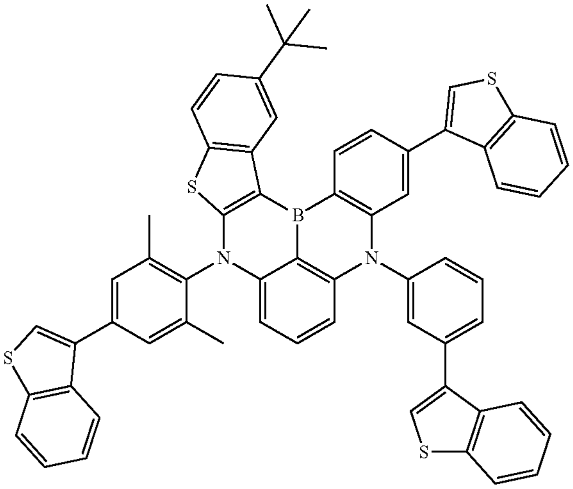
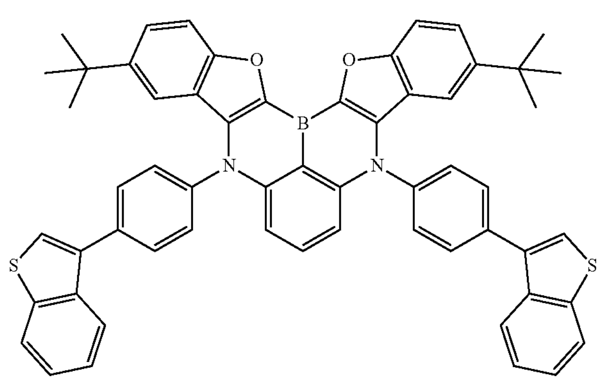
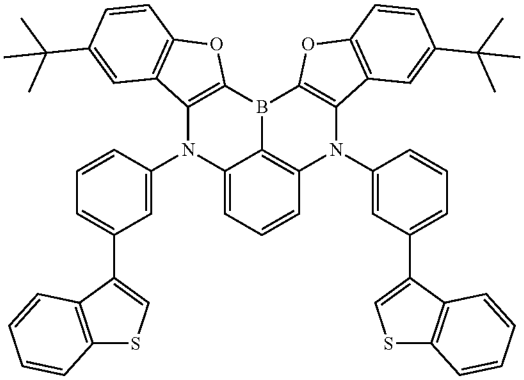

-continued
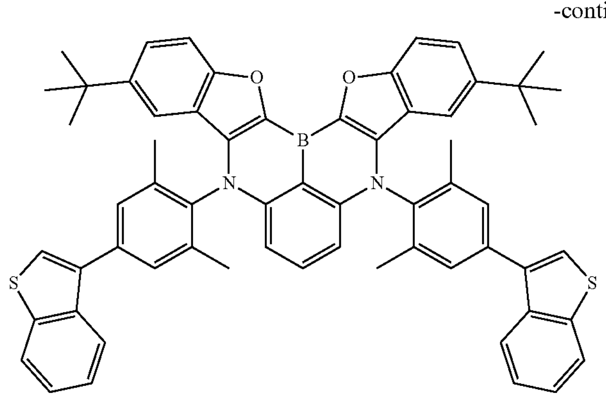
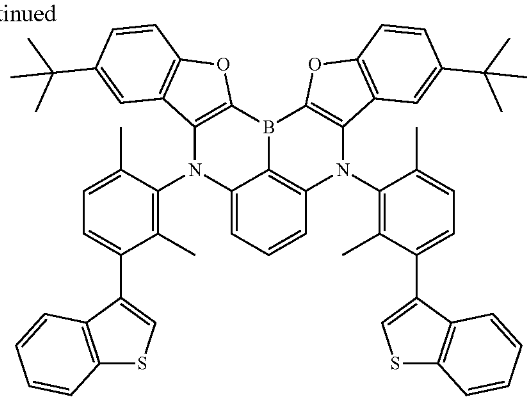
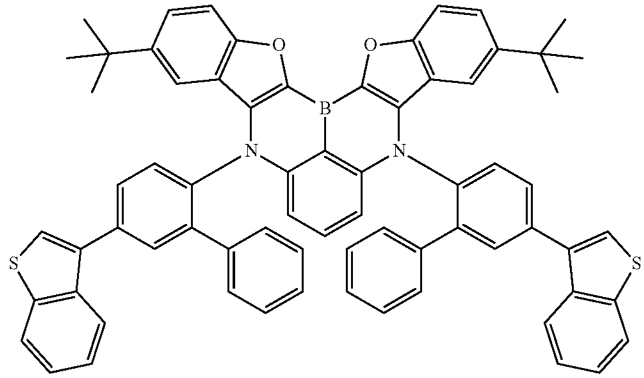
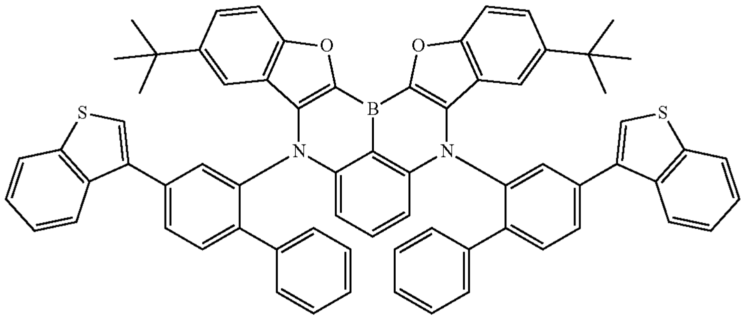
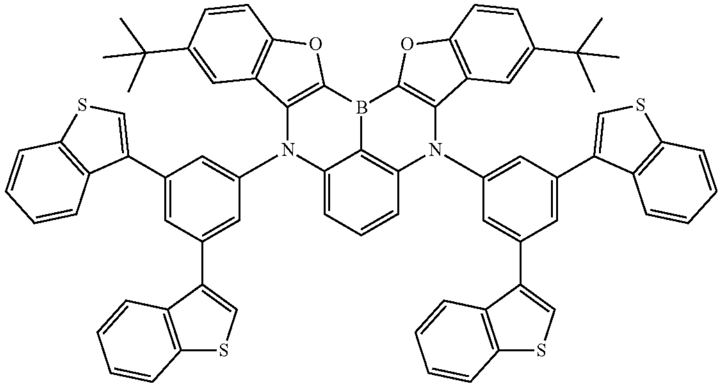

-continued
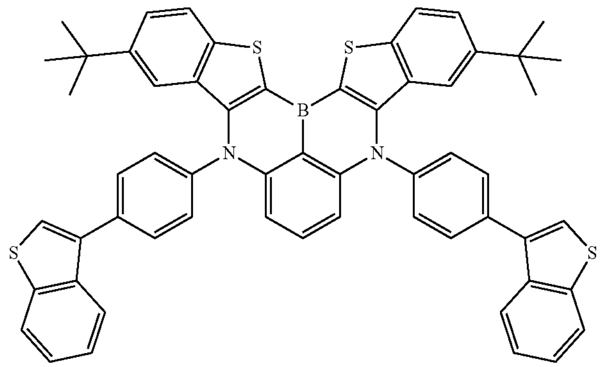
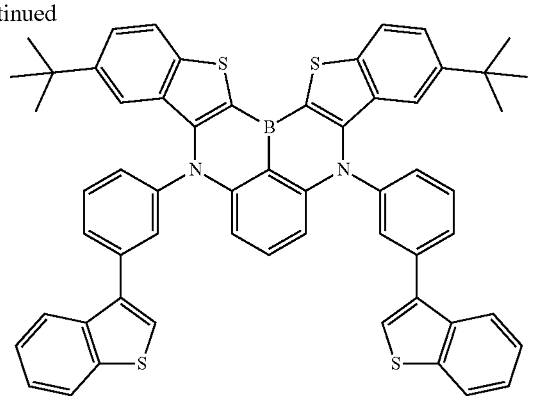
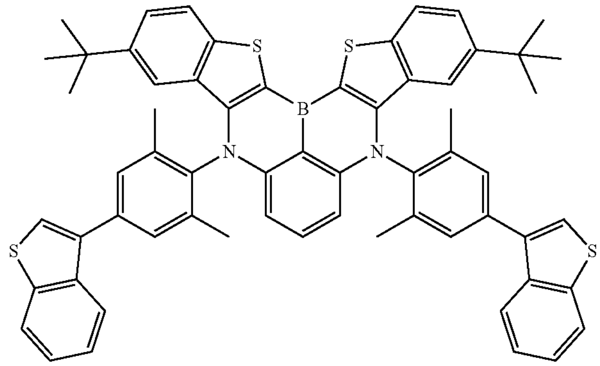
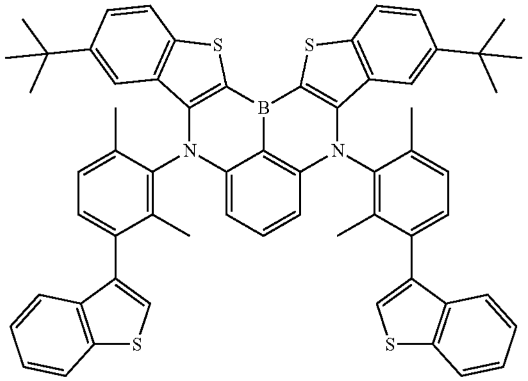
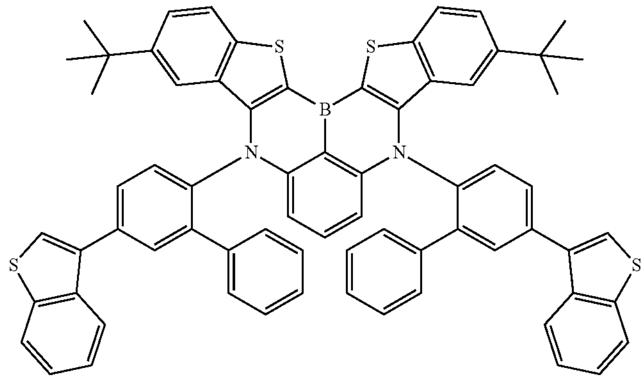
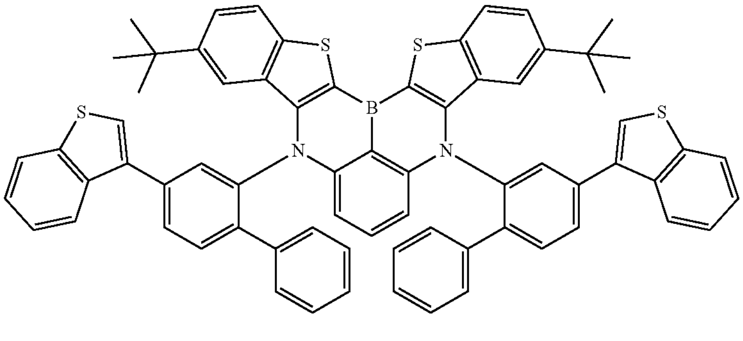

-continued
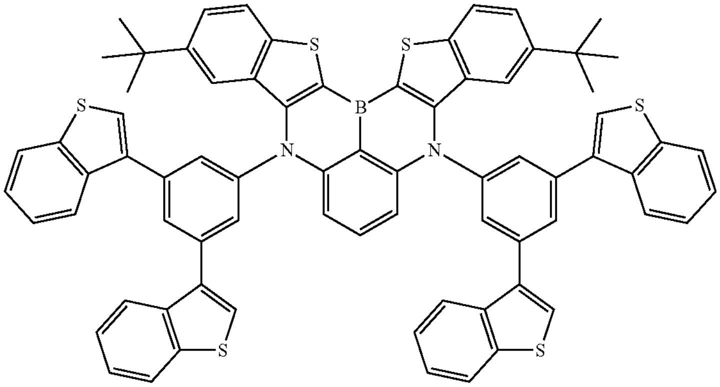
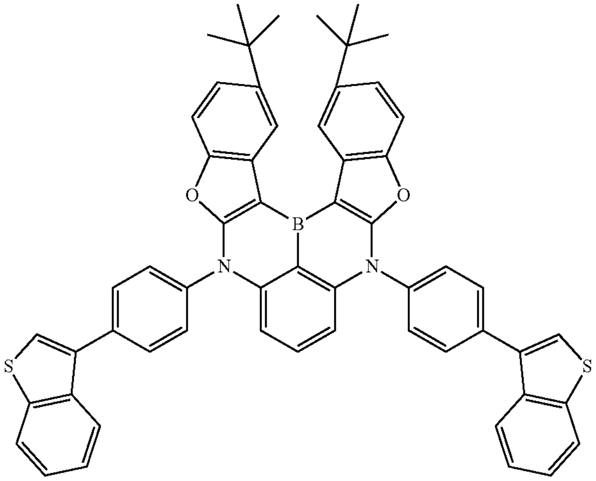
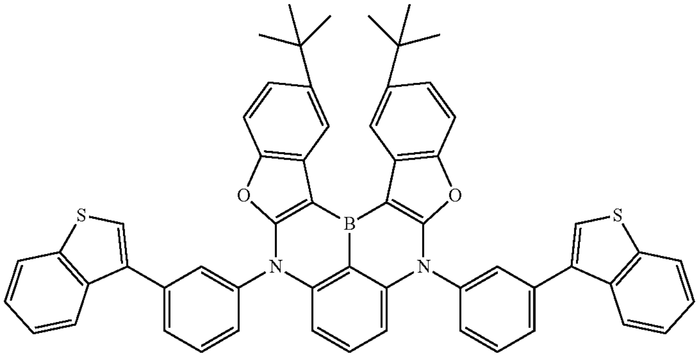
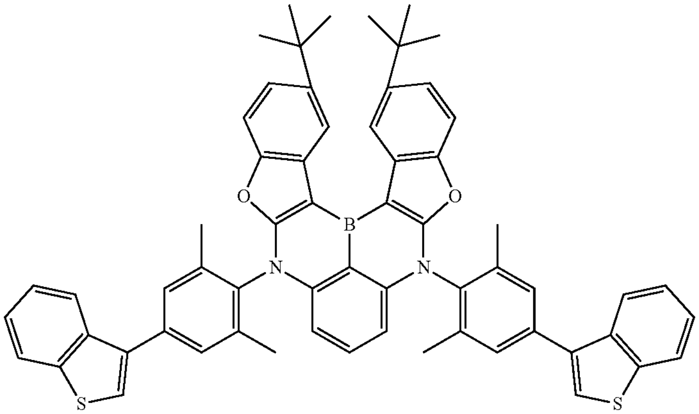

-continued
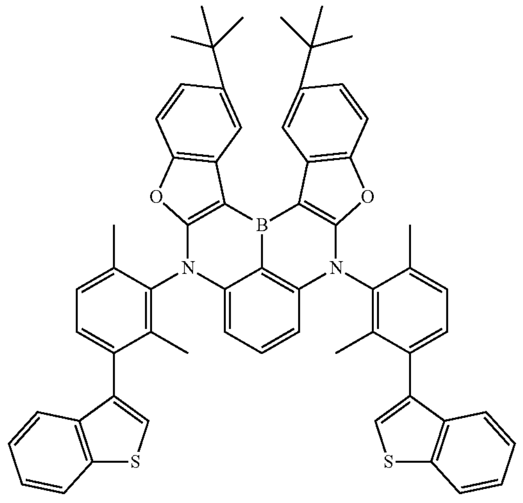
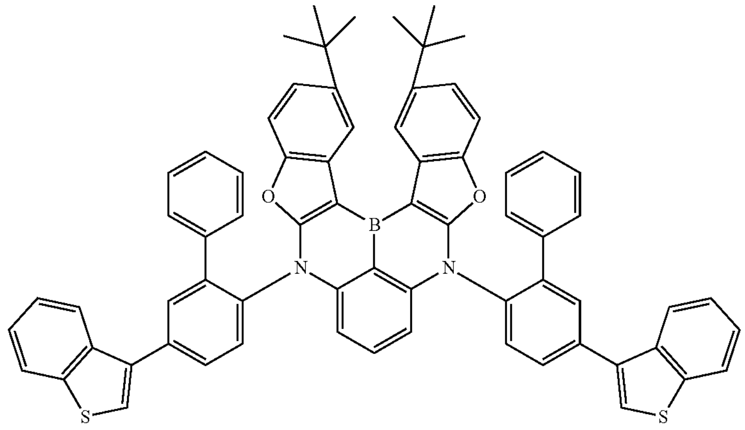
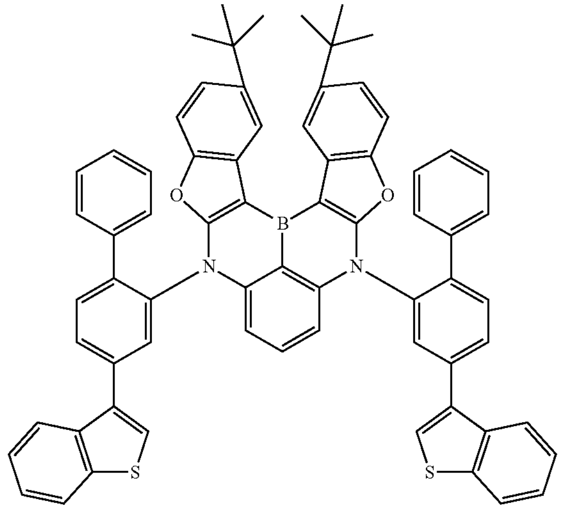

-continued
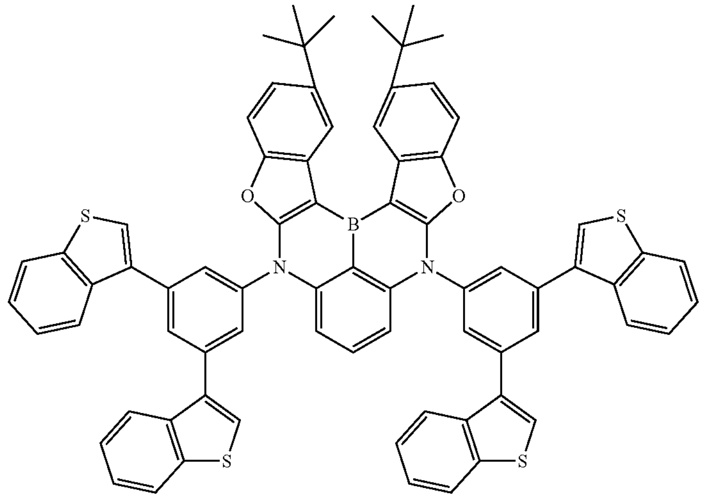
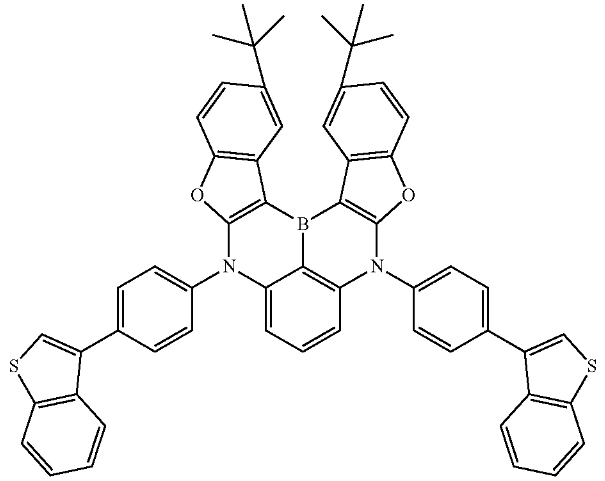
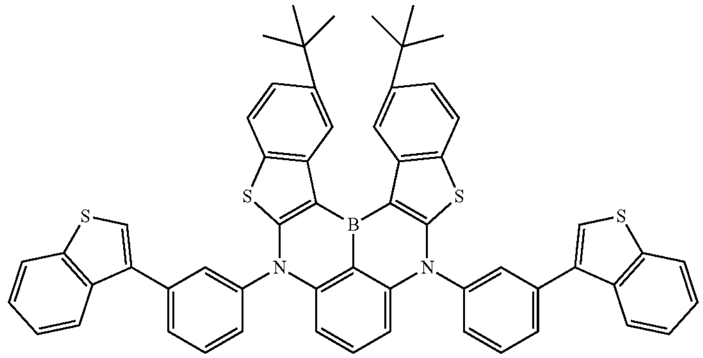

-continued
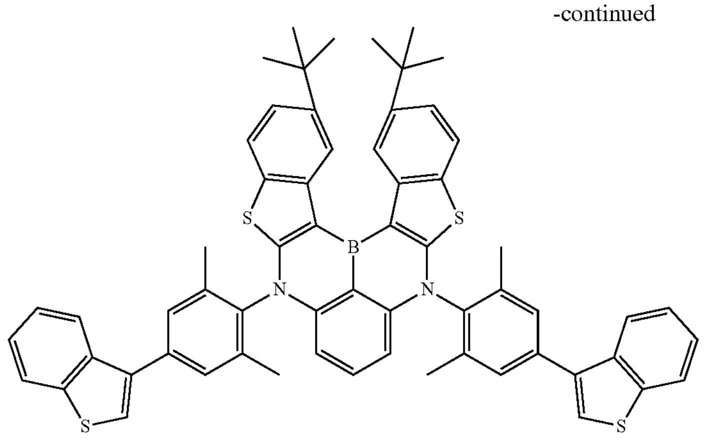
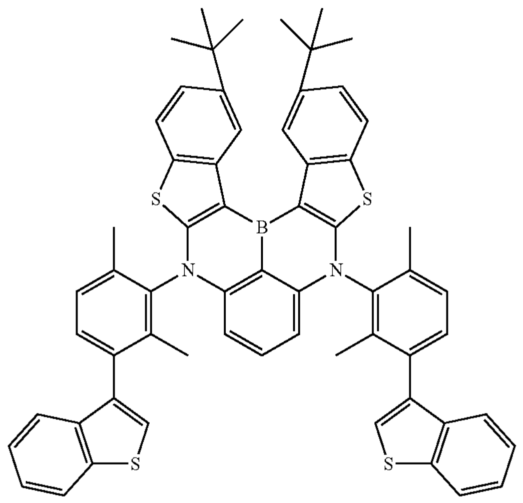
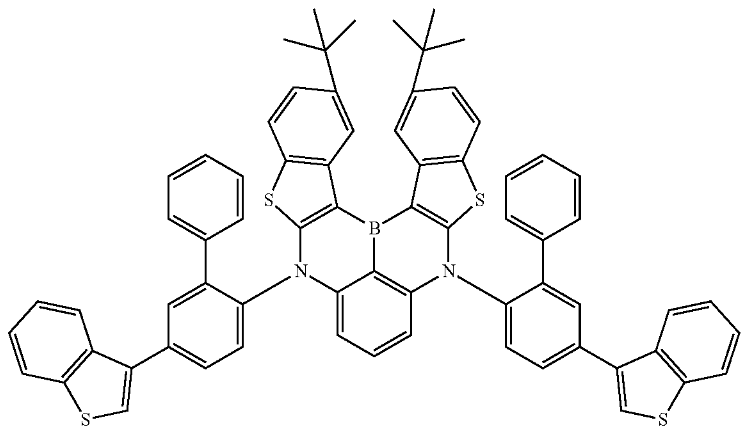

-continued
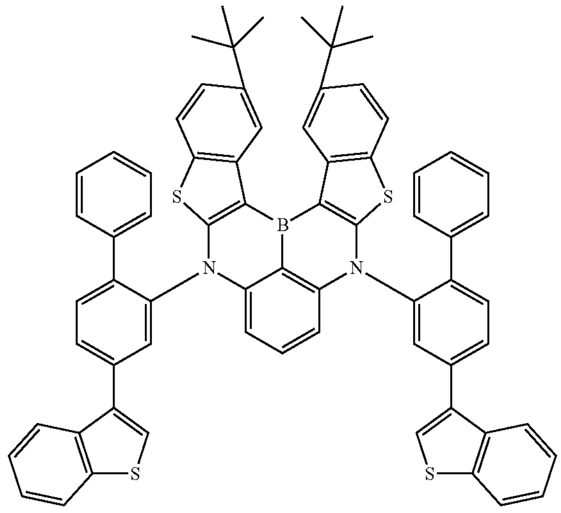
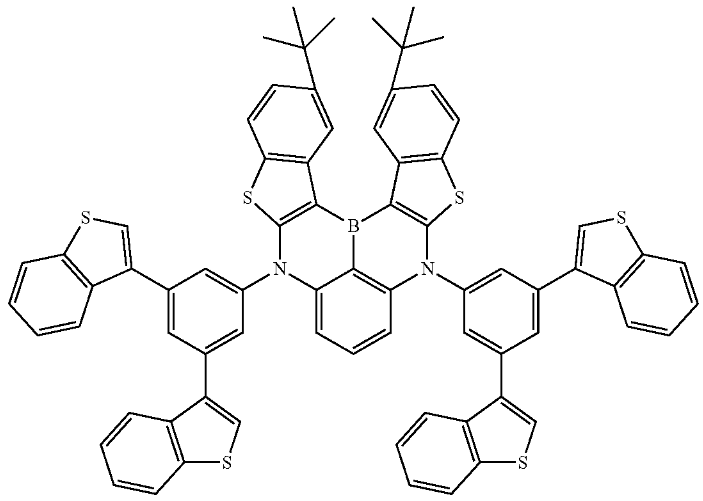
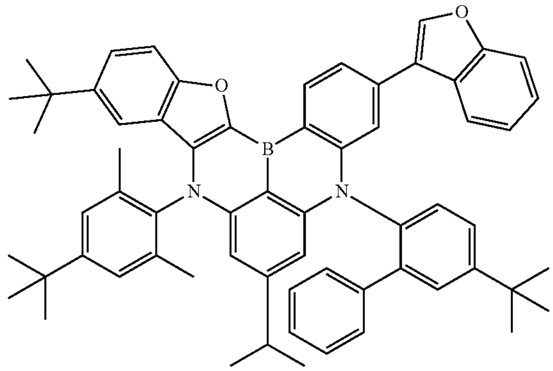
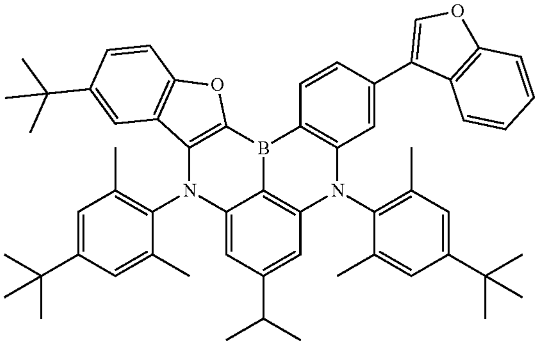

-continued
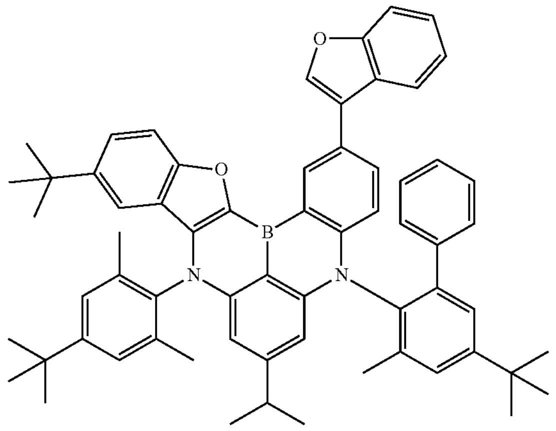
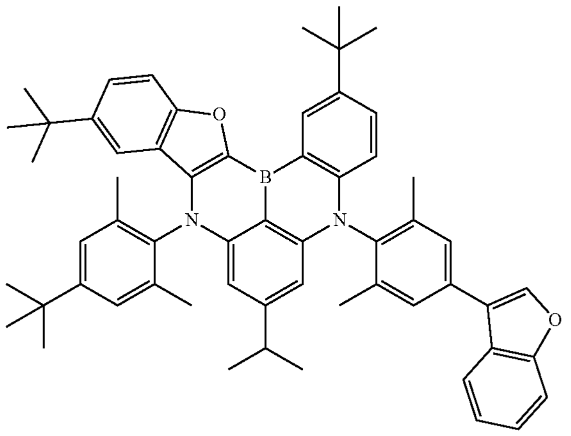
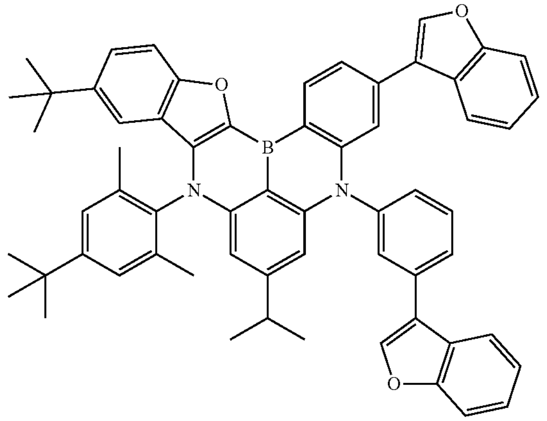
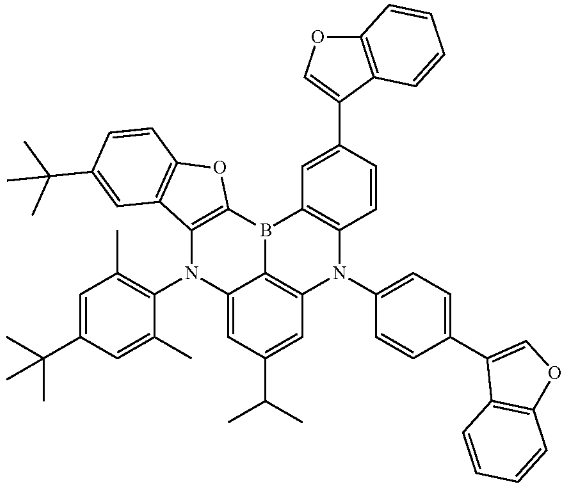
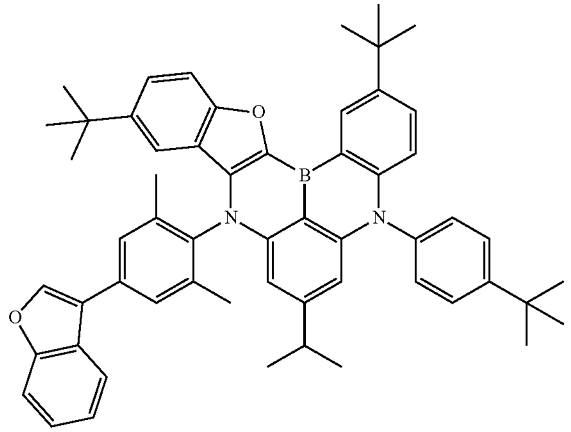
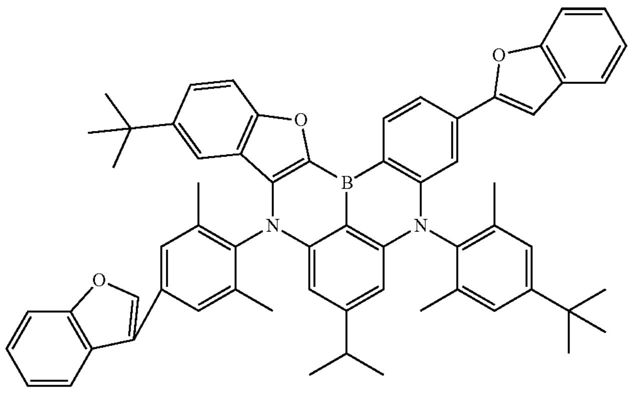

-continued
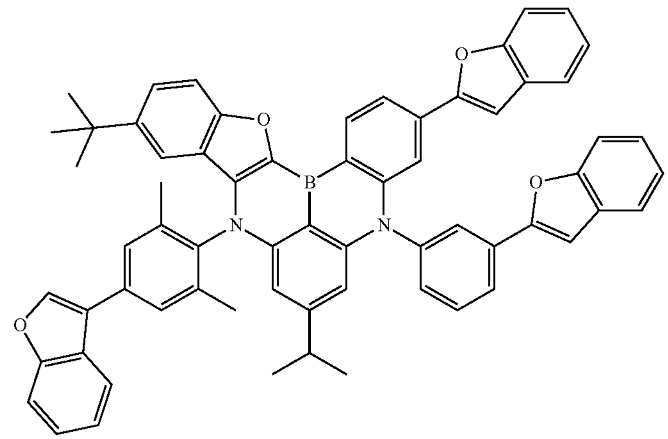
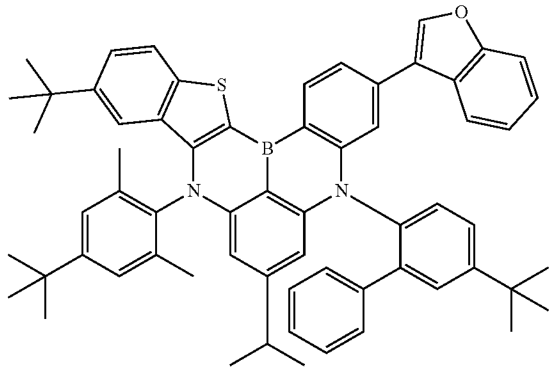
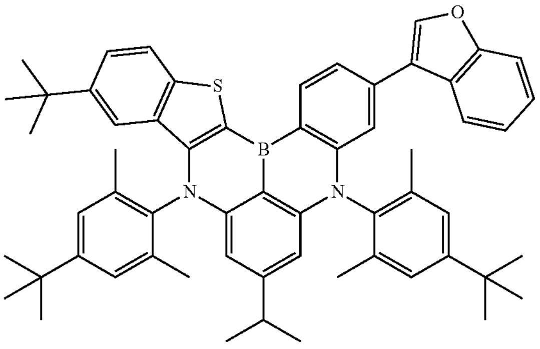
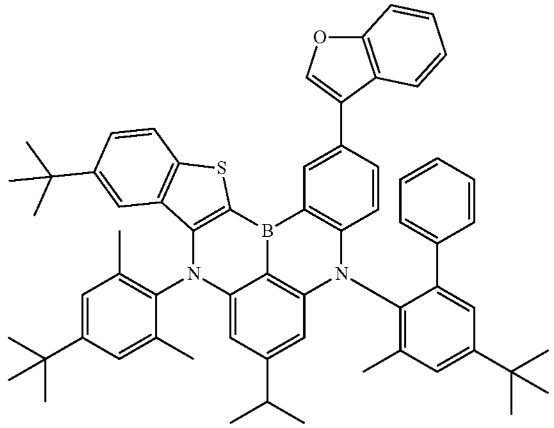
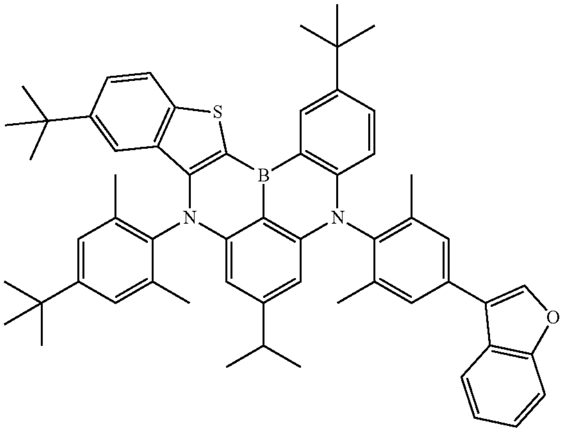

-continued
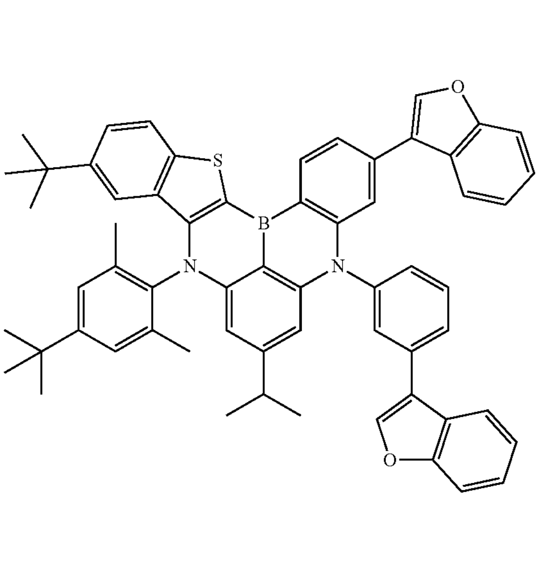
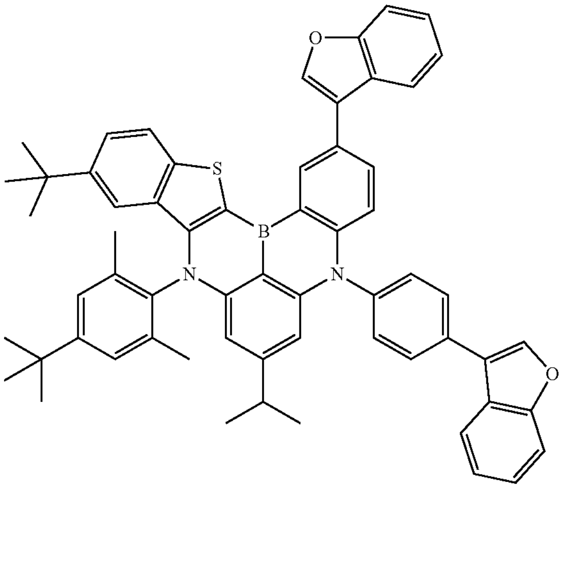
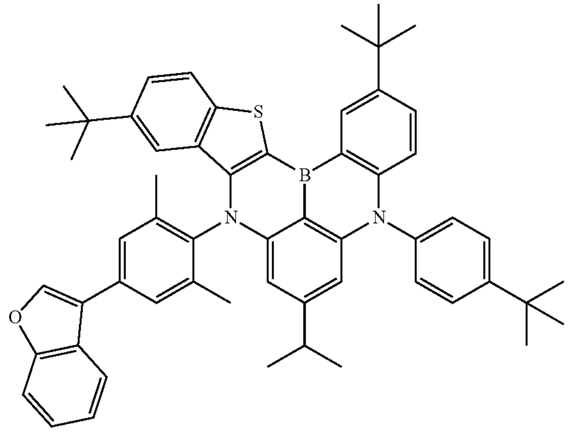
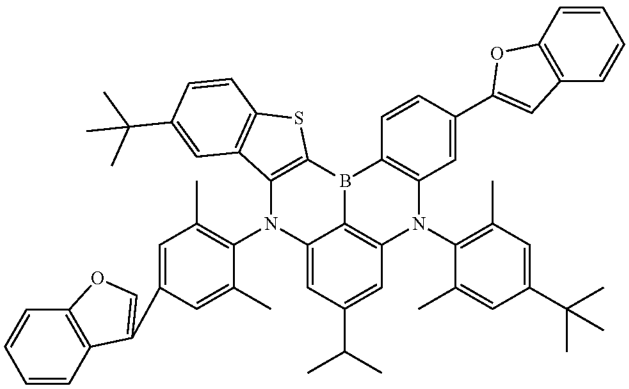
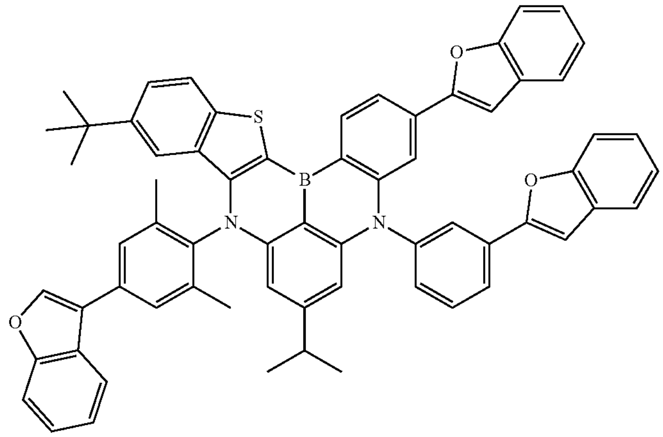

-continued
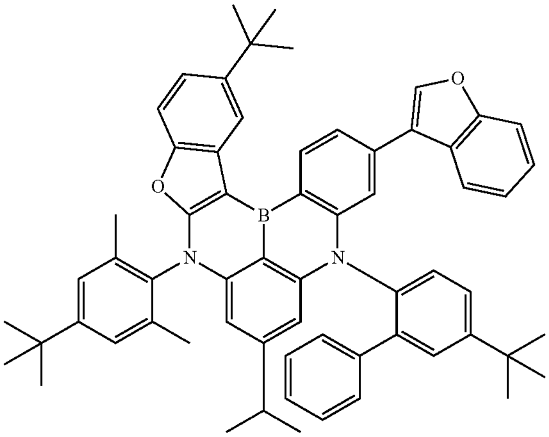
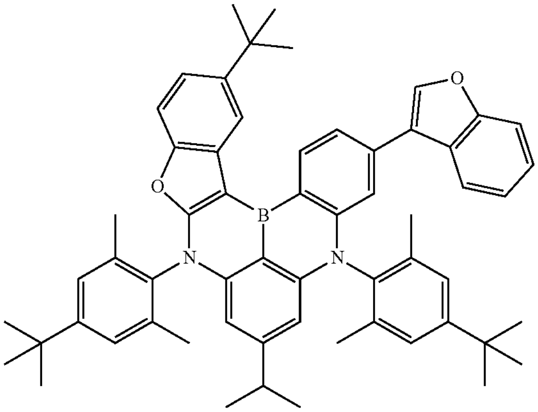
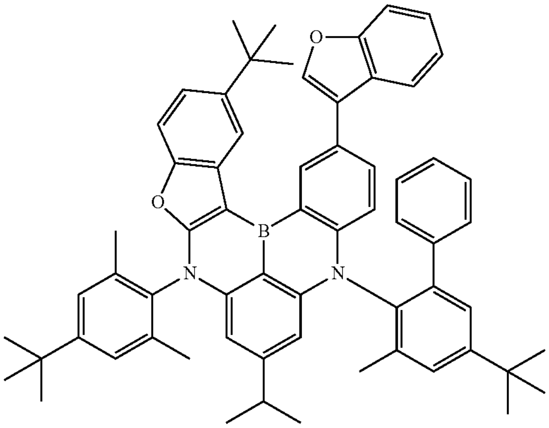
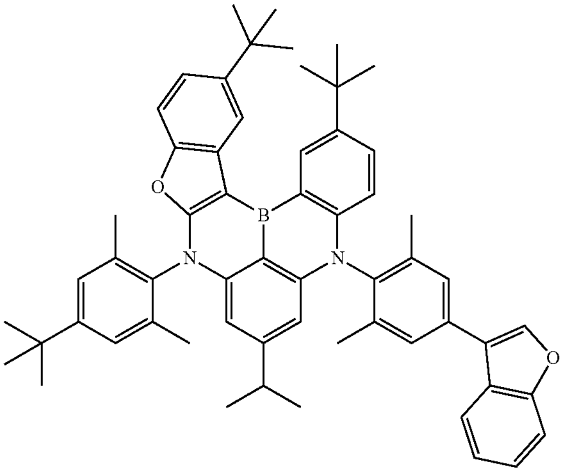
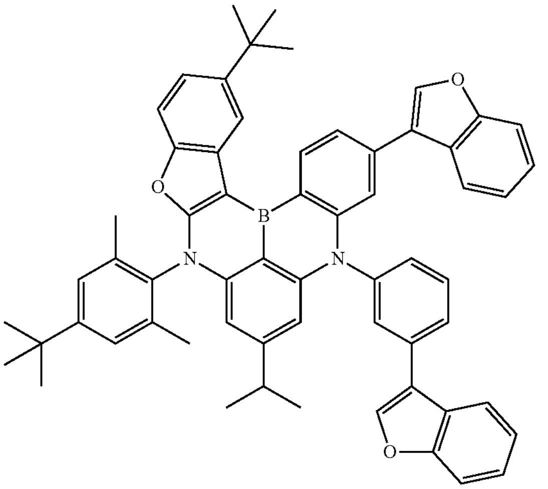
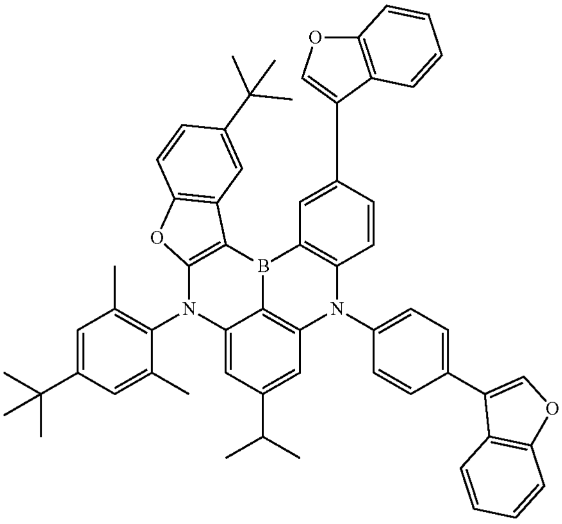

-continued
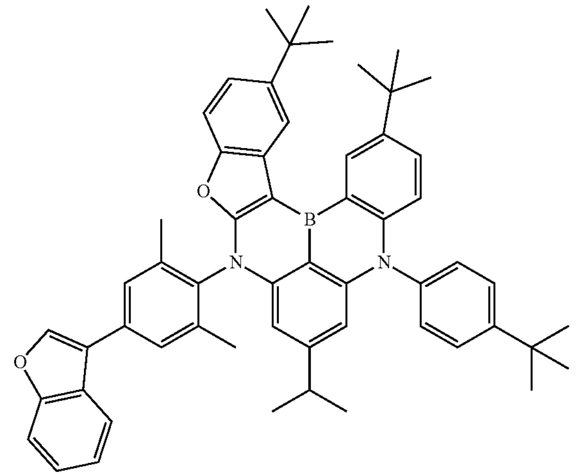
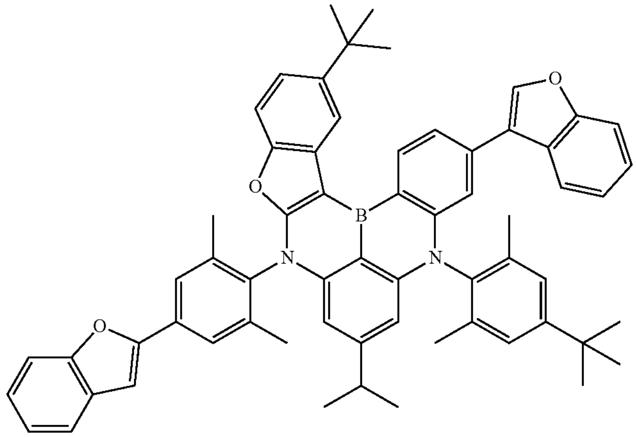
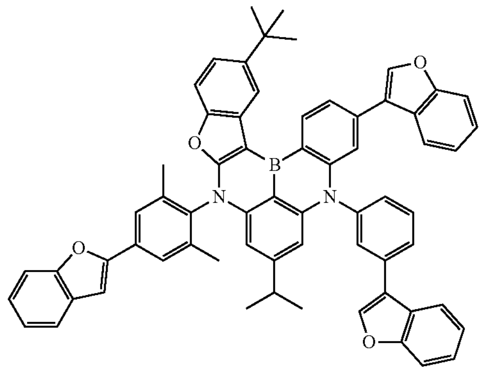
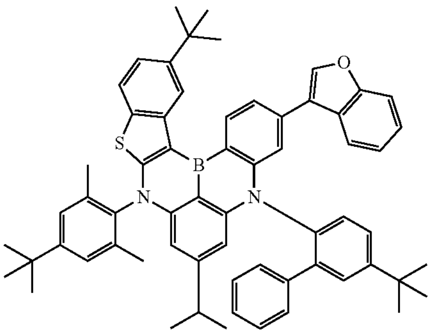
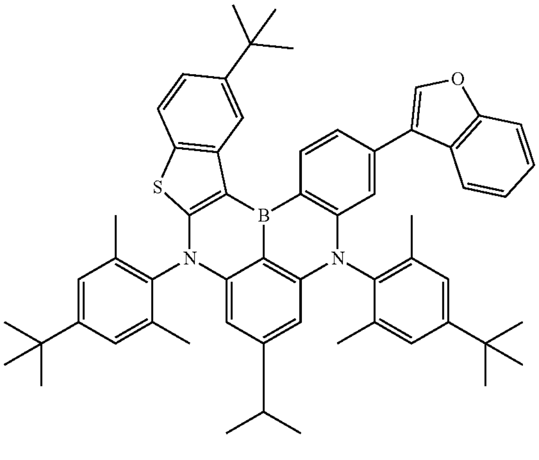
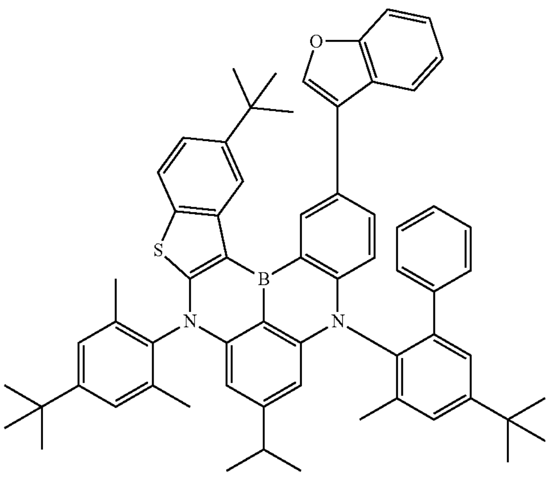

-continued
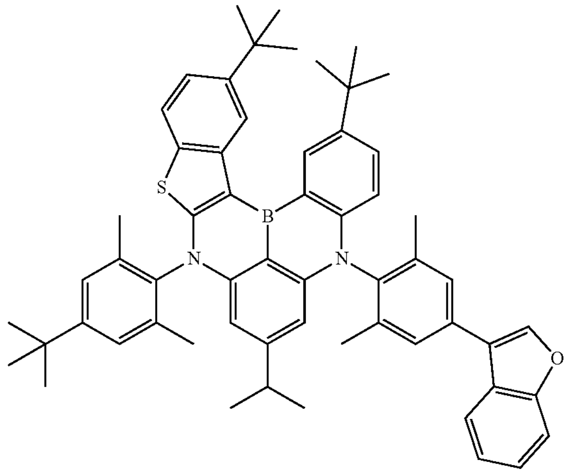
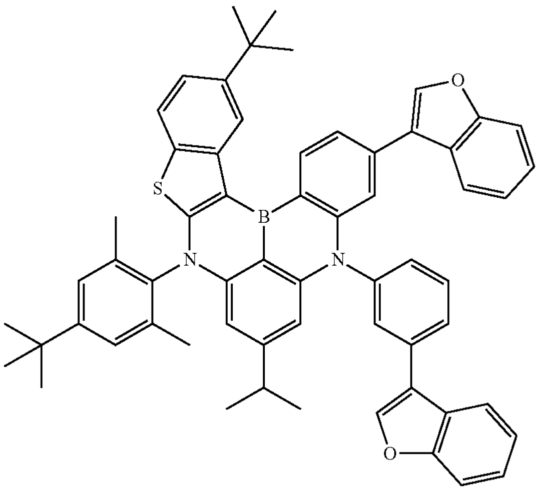
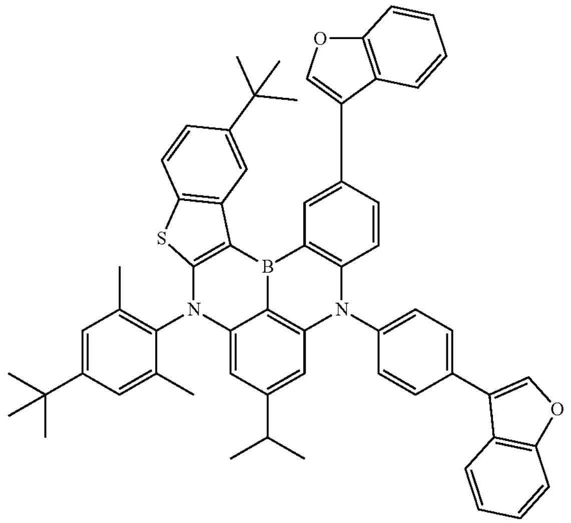
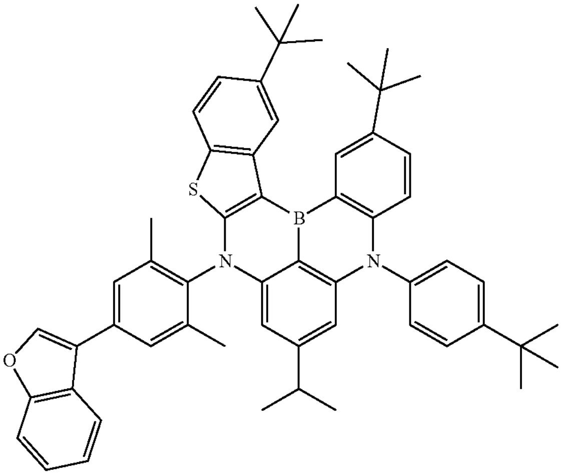
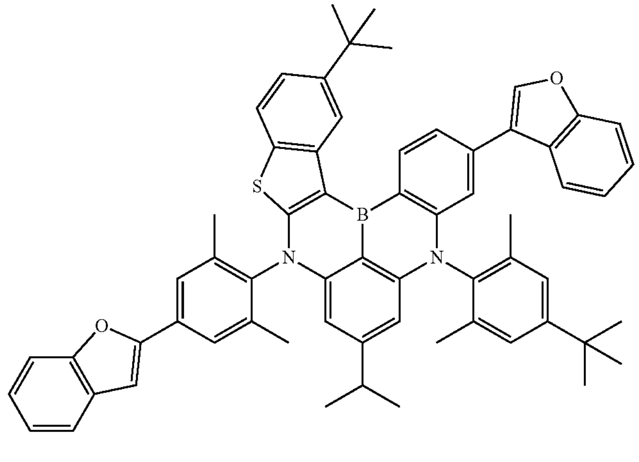

-continued
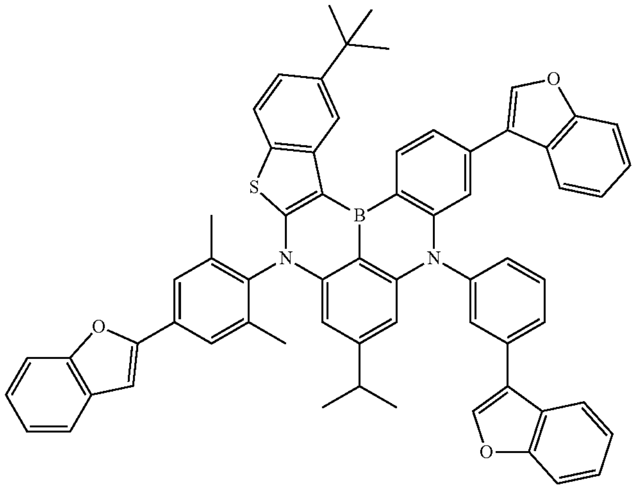
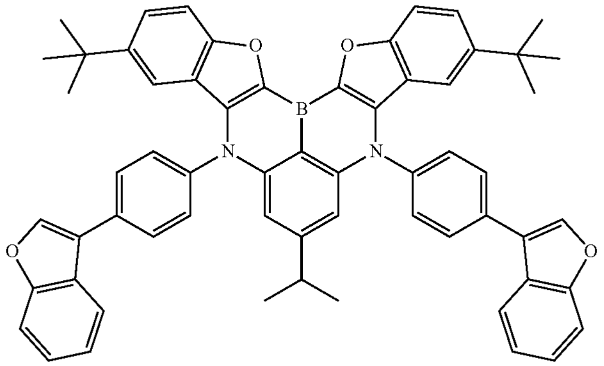
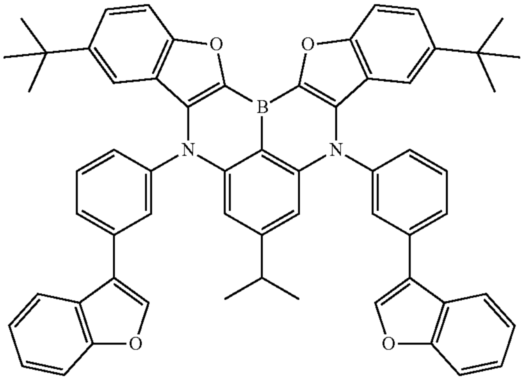
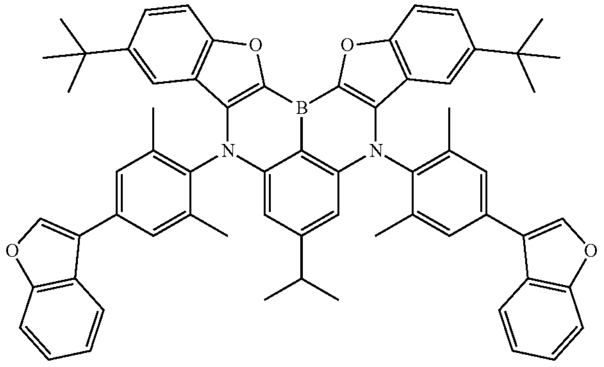
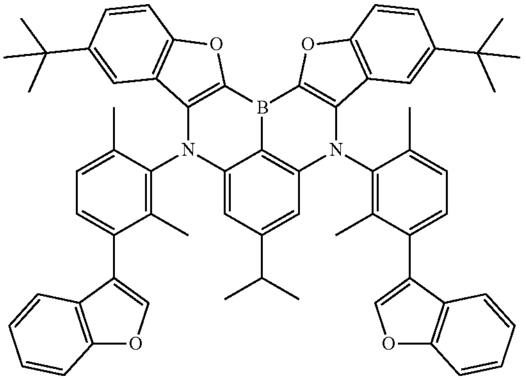
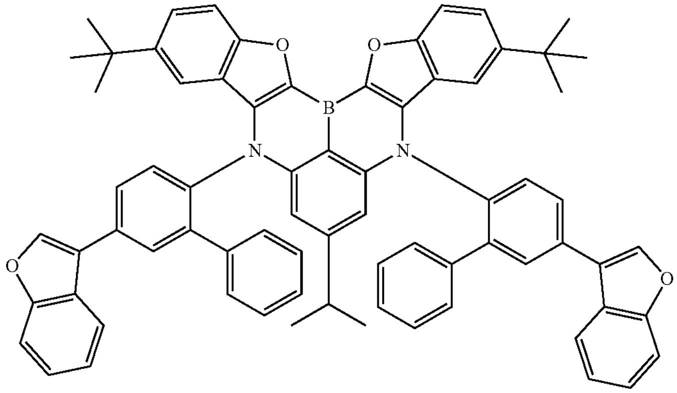

-continued
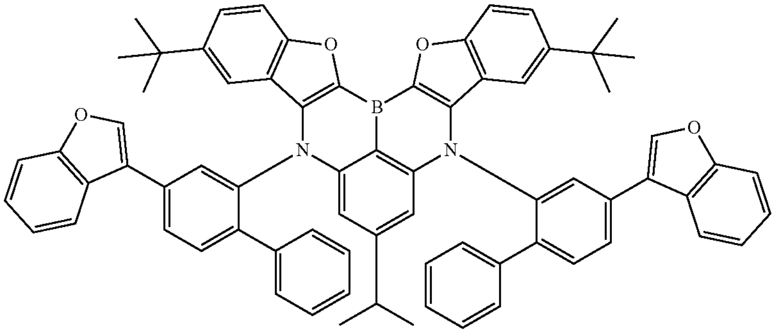
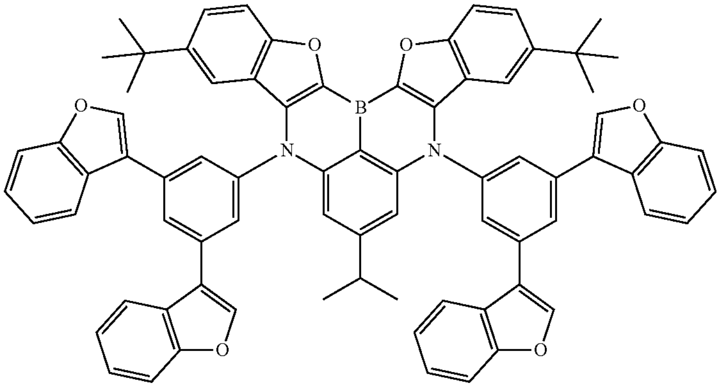
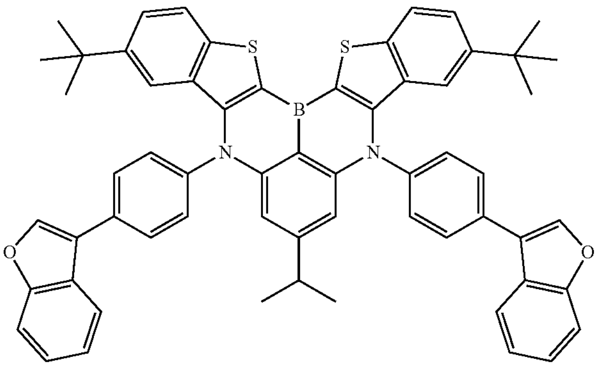
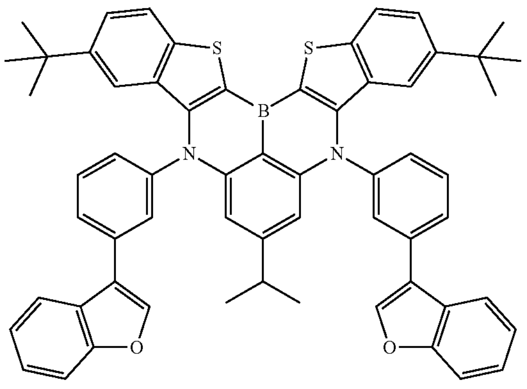
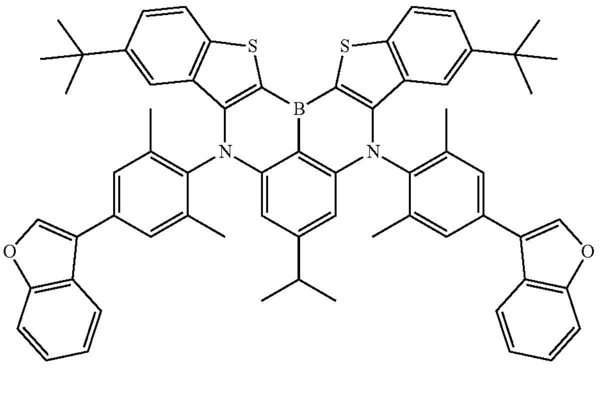
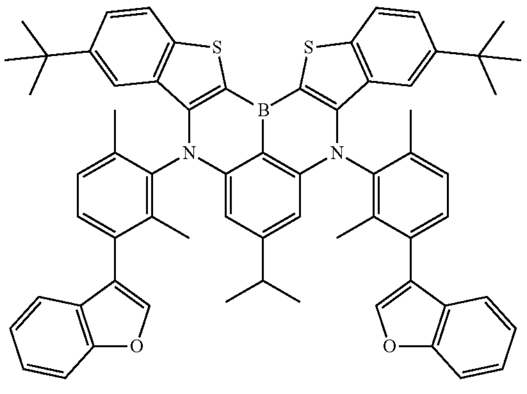

-continued
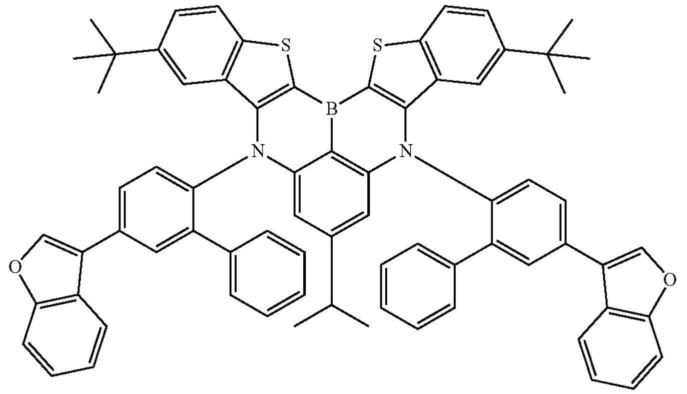
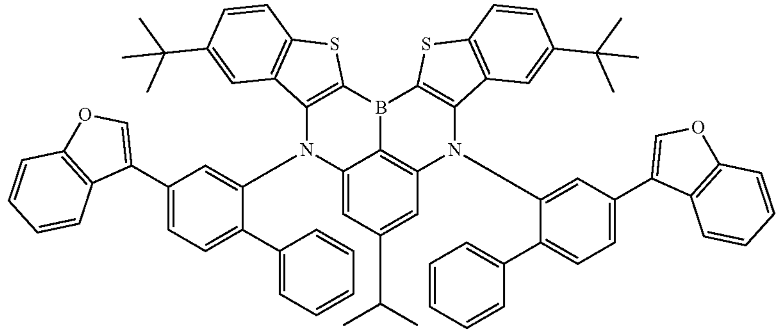
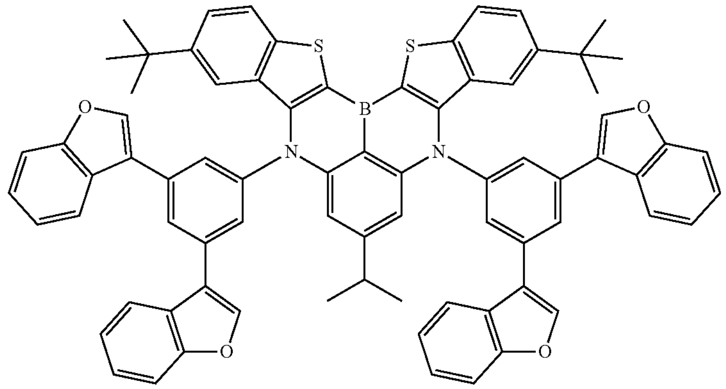
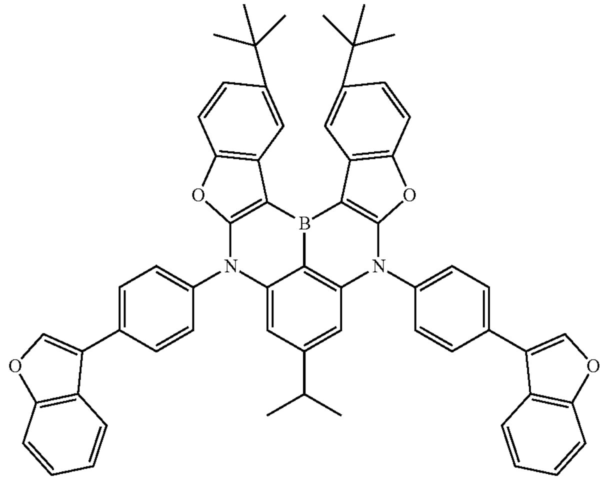

-continued
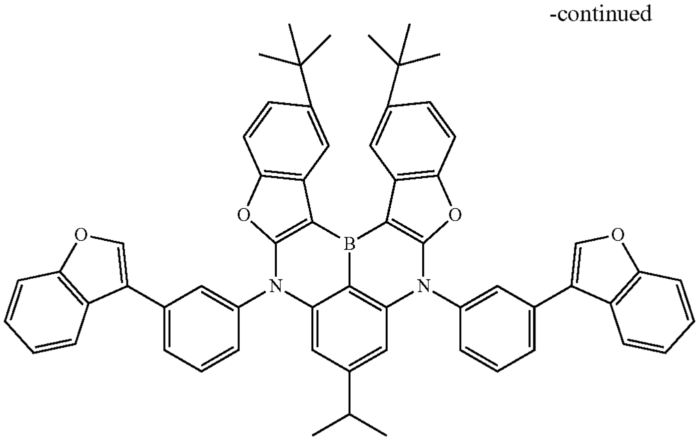
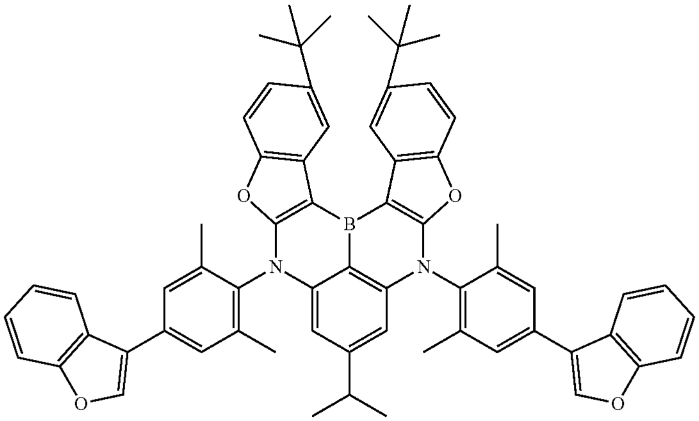
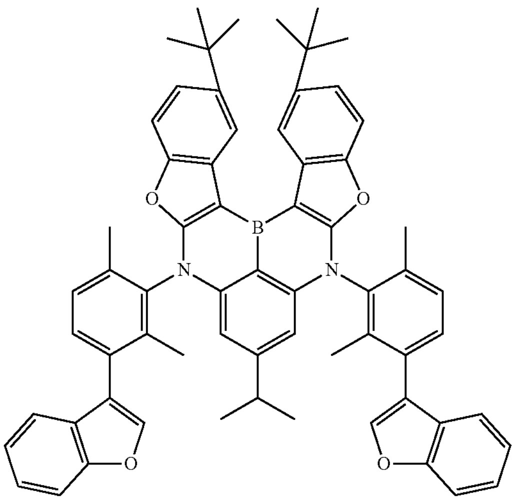

-continued
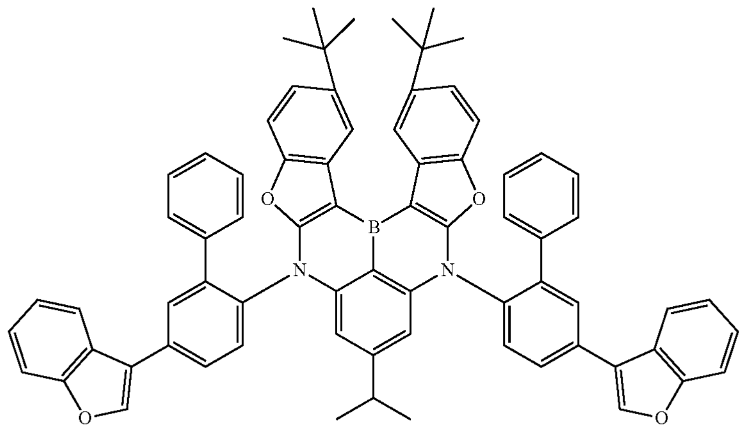
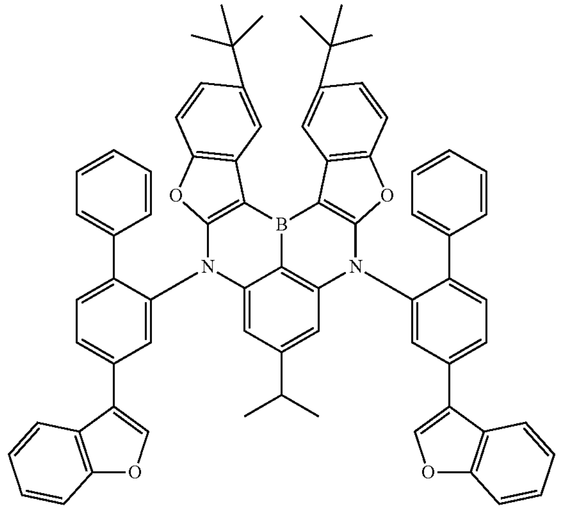
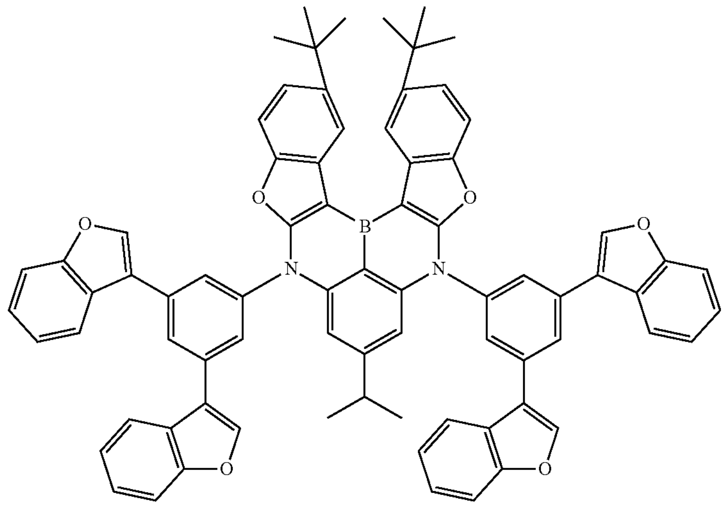

-continued
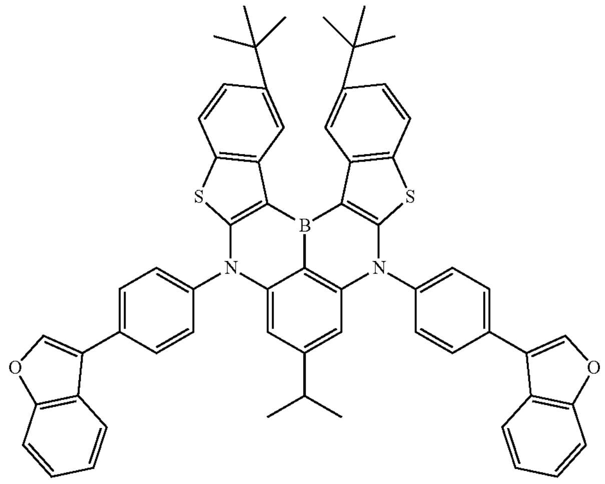
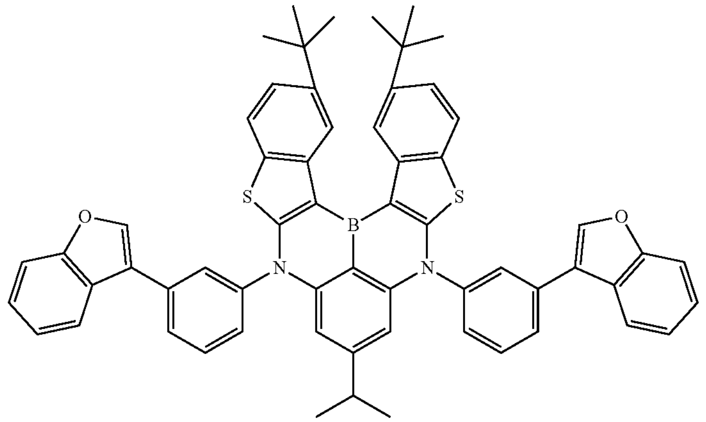
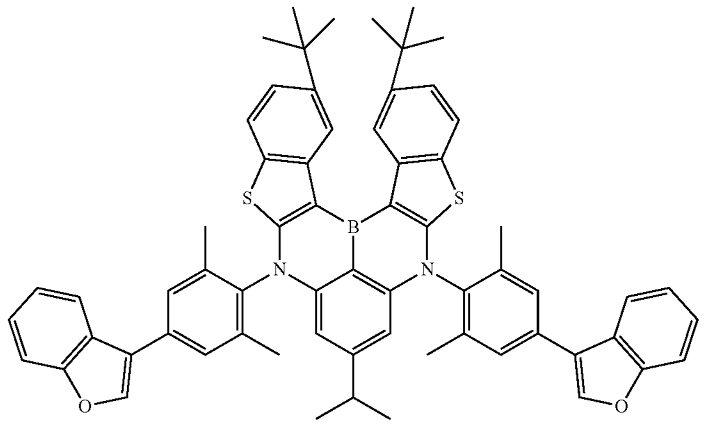

-continued
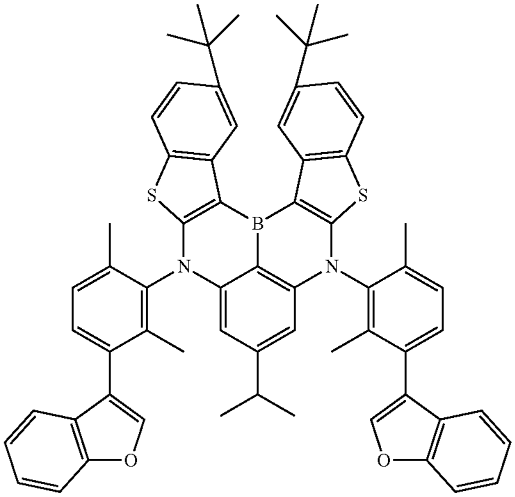
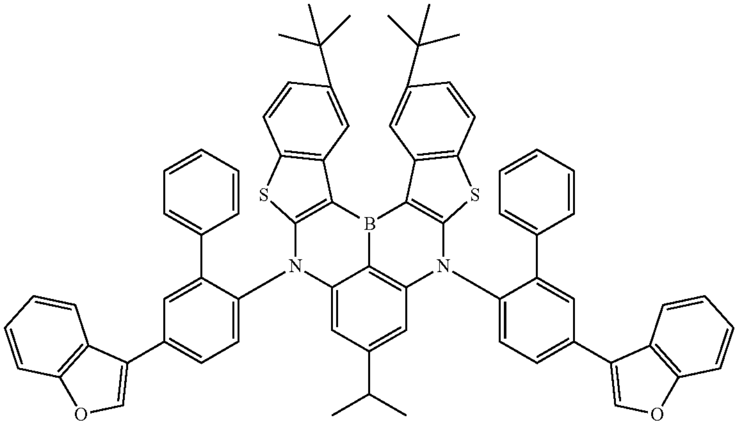
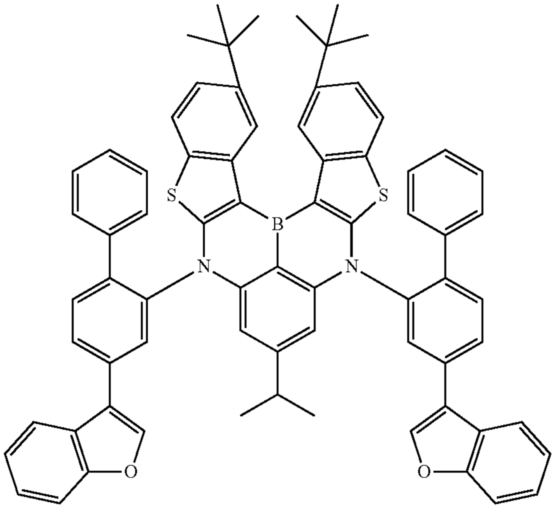

-continued
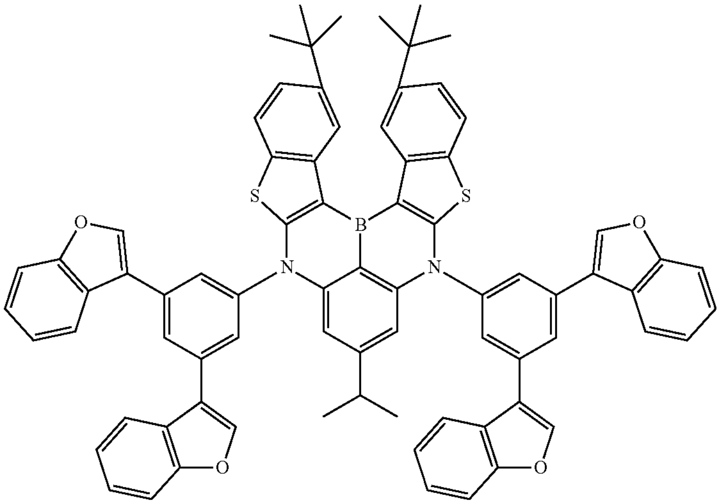
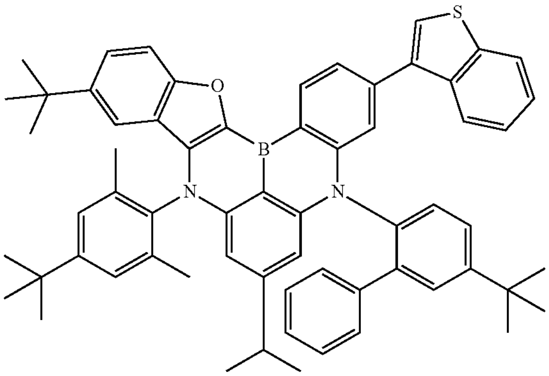
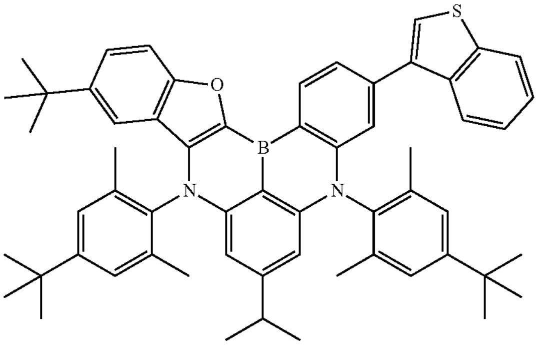
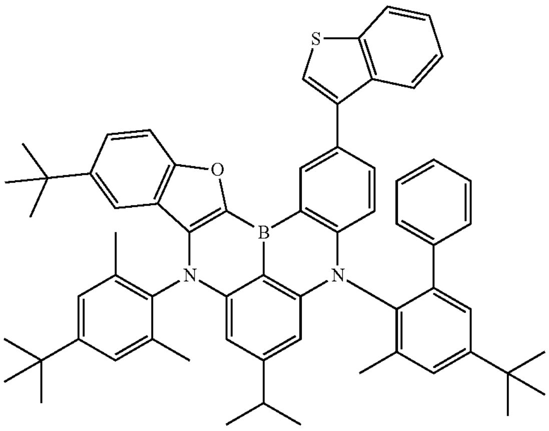
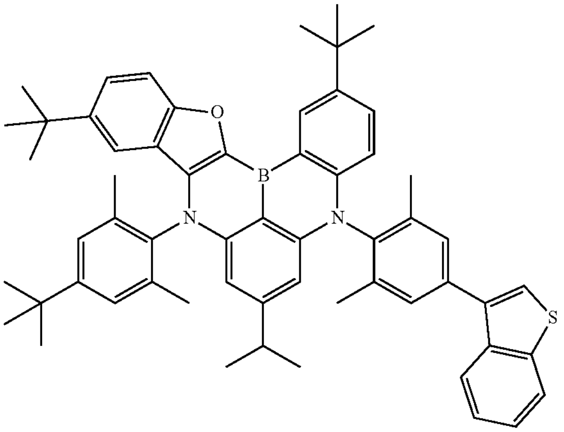

-continued
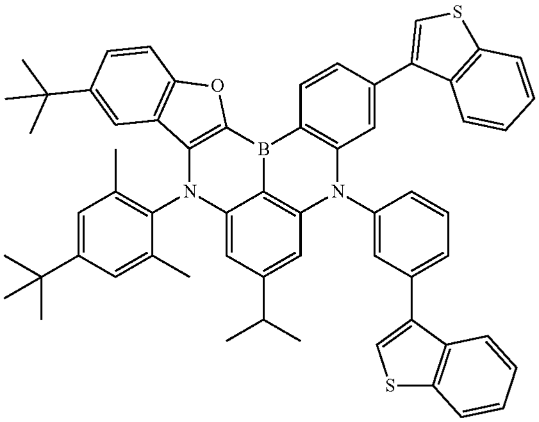
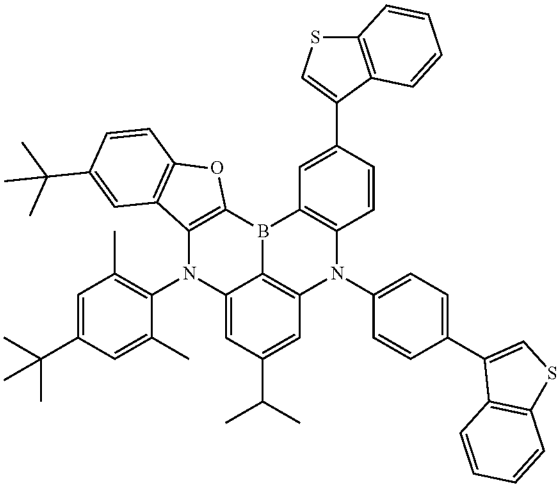
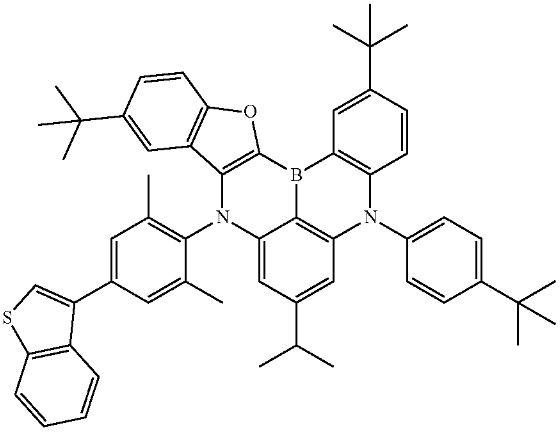
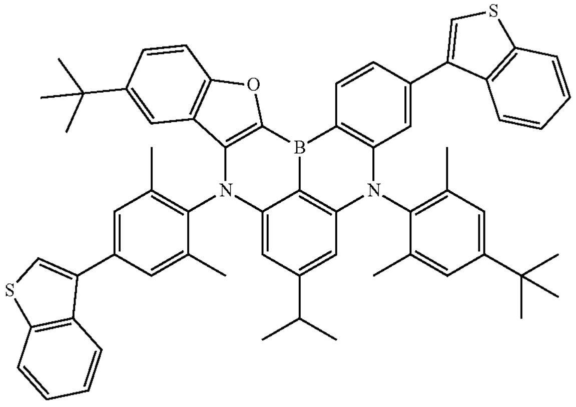
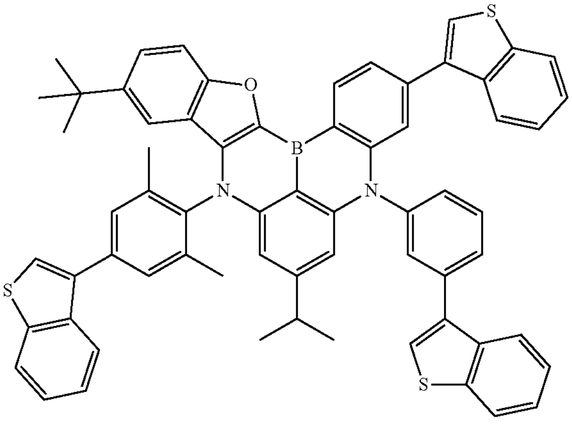
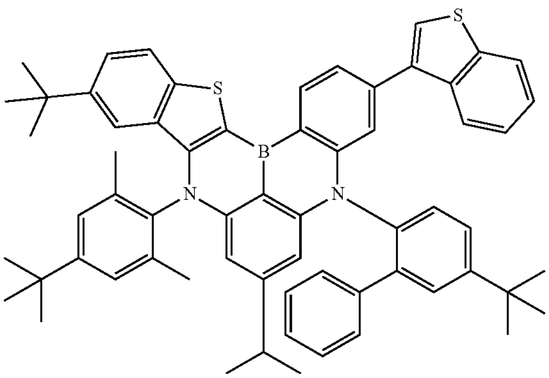

-continued
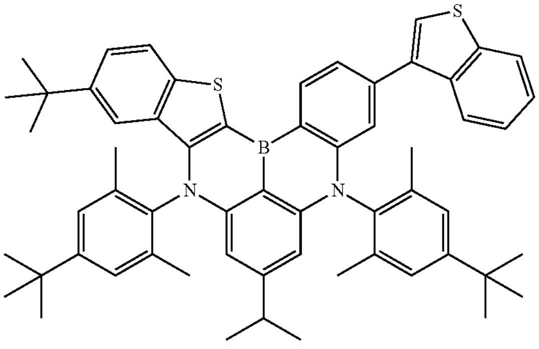
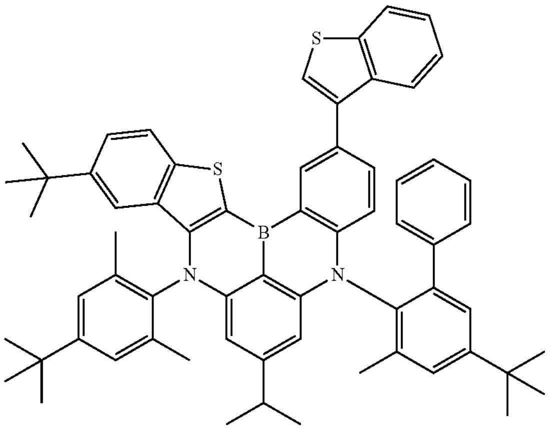
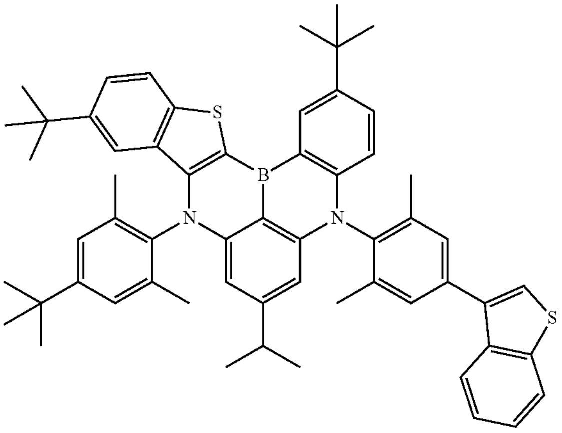
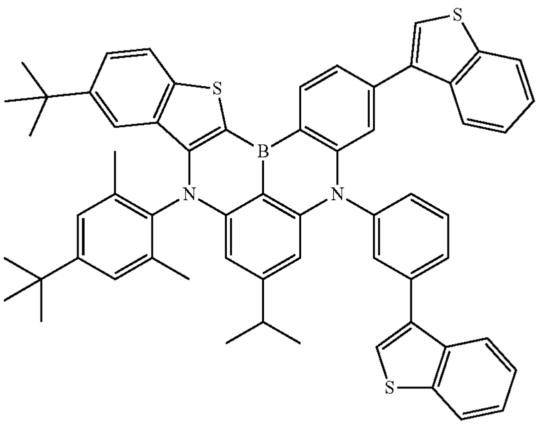
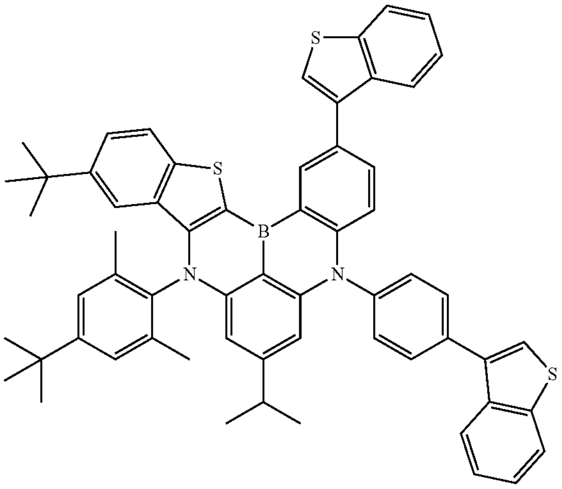
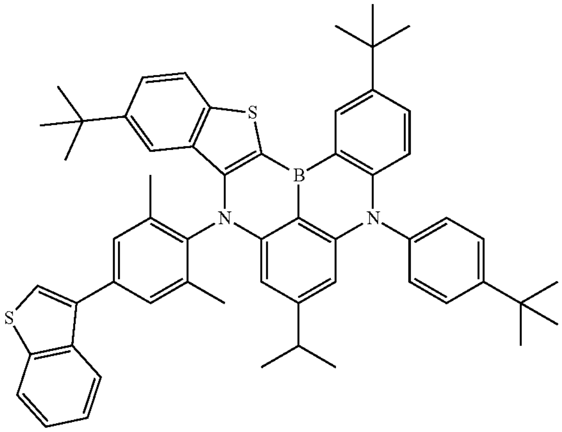

-continued
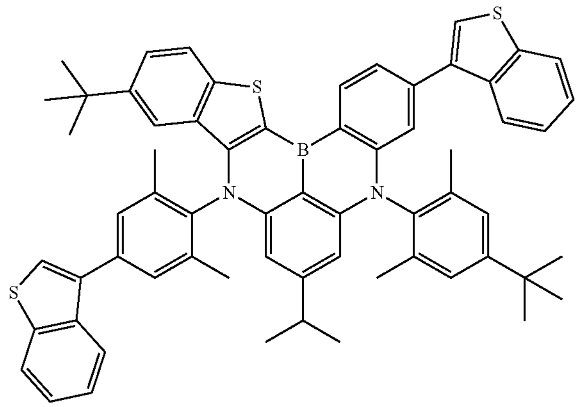
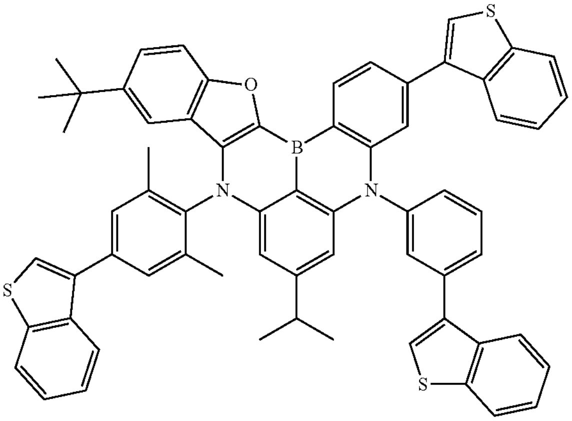
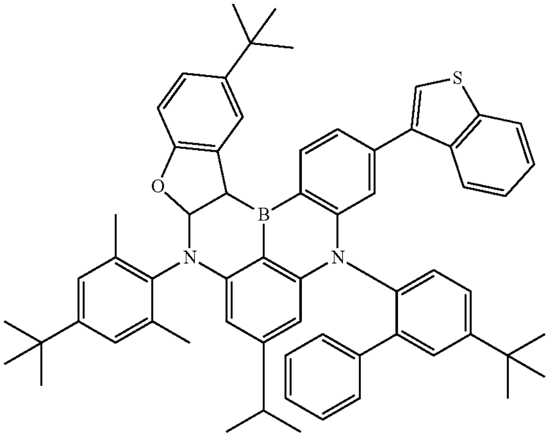
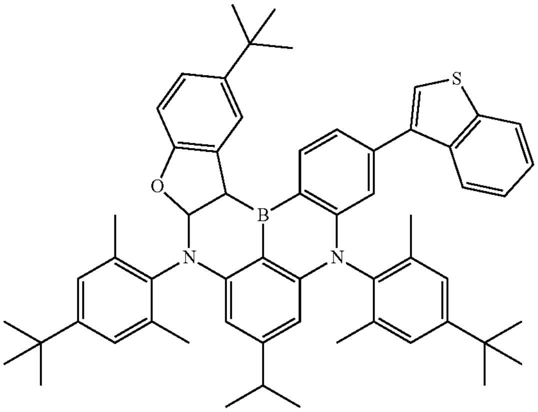
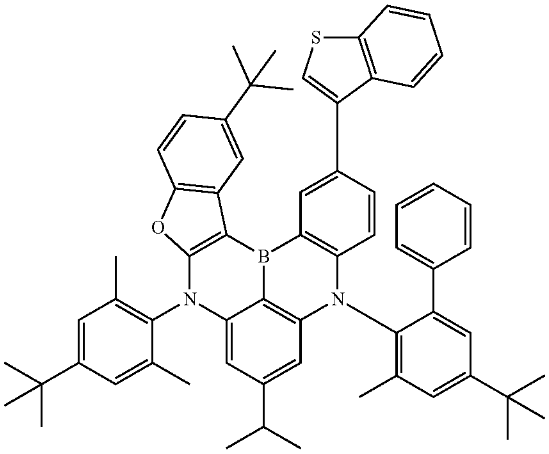
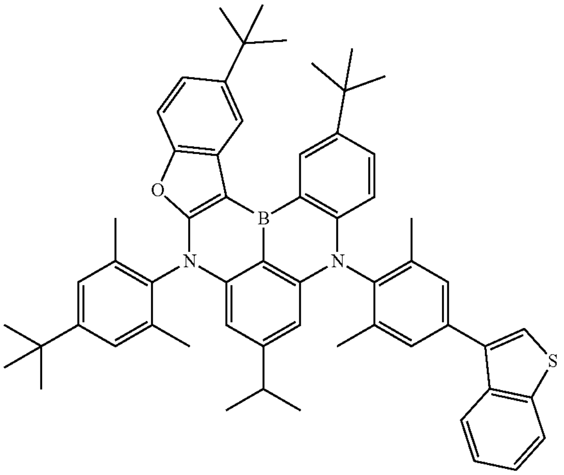

-continued
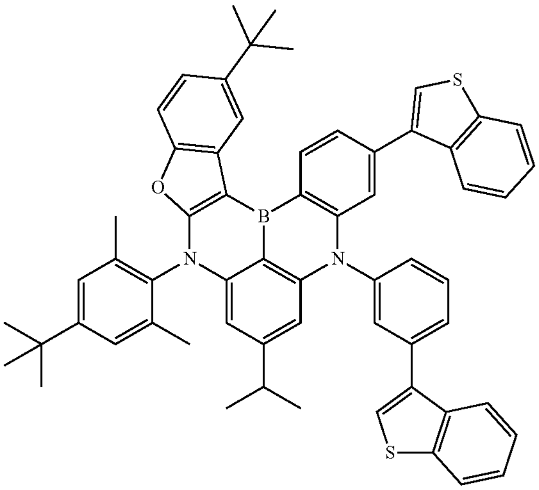
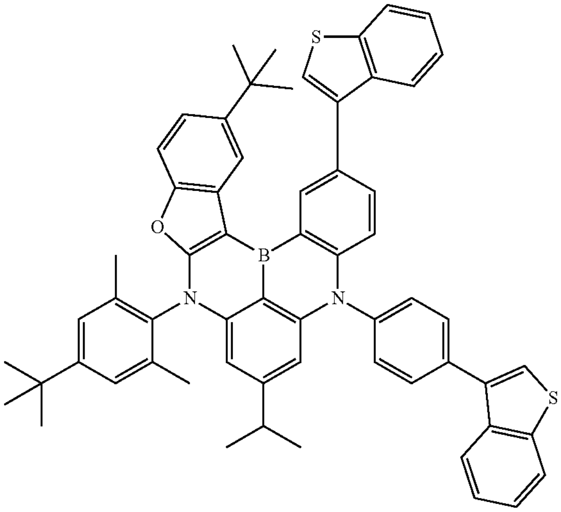
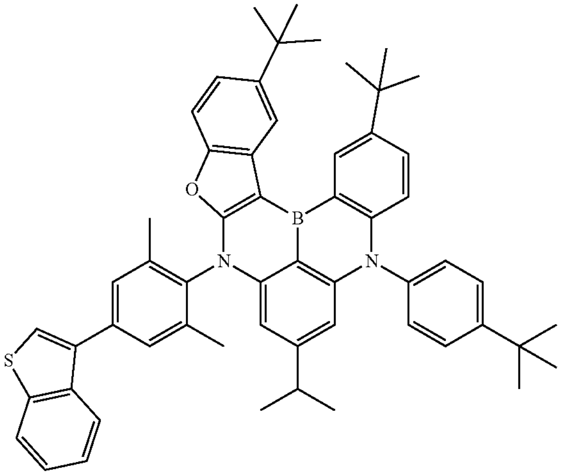
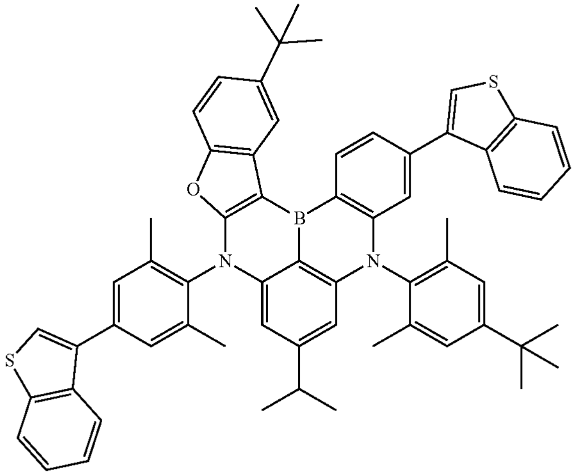
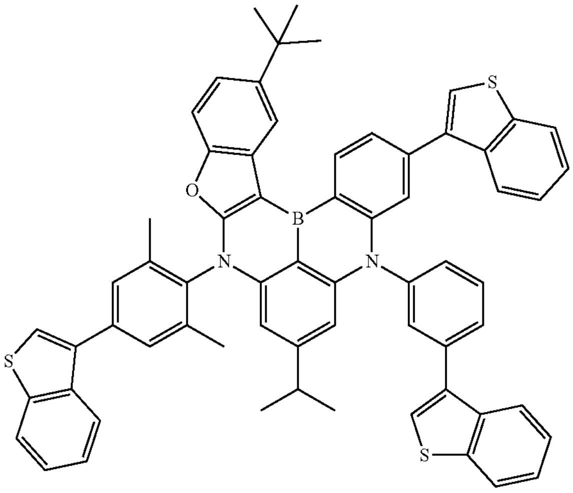
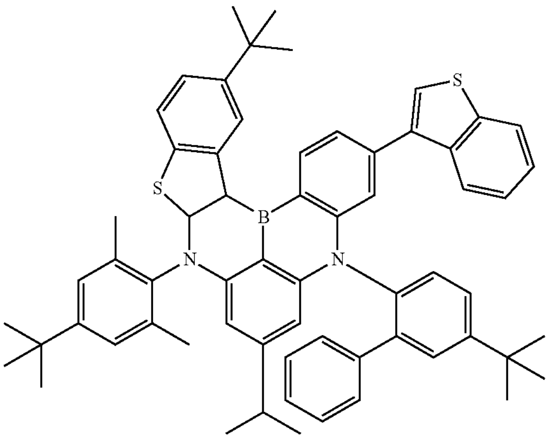

-continued
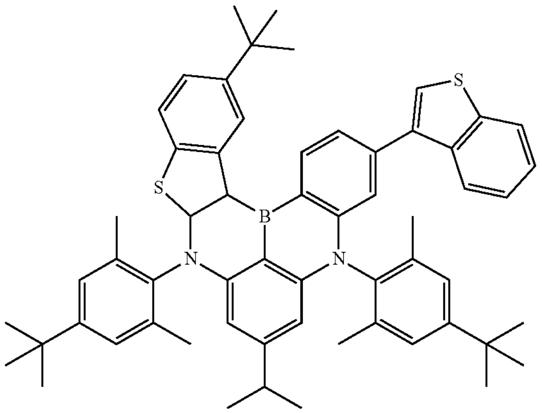
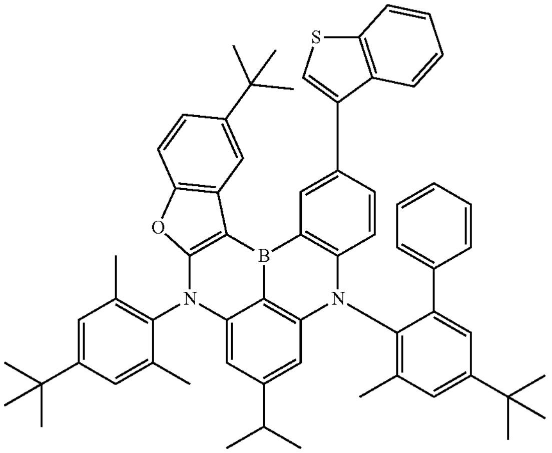
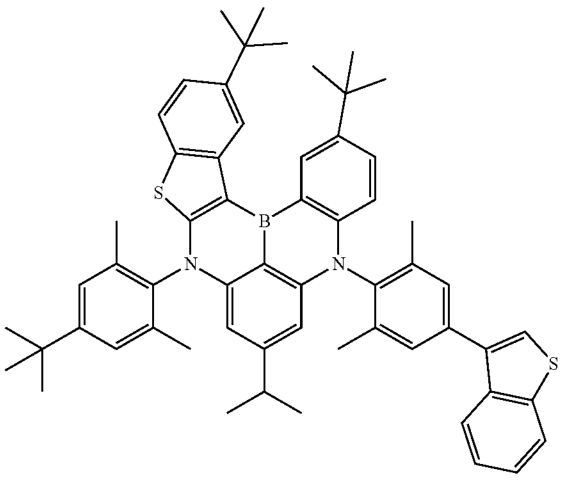
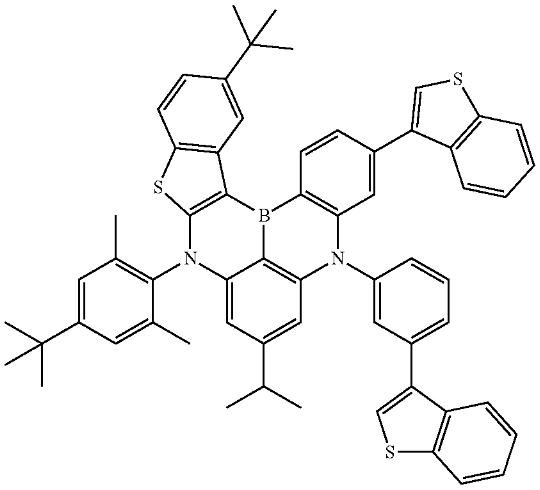
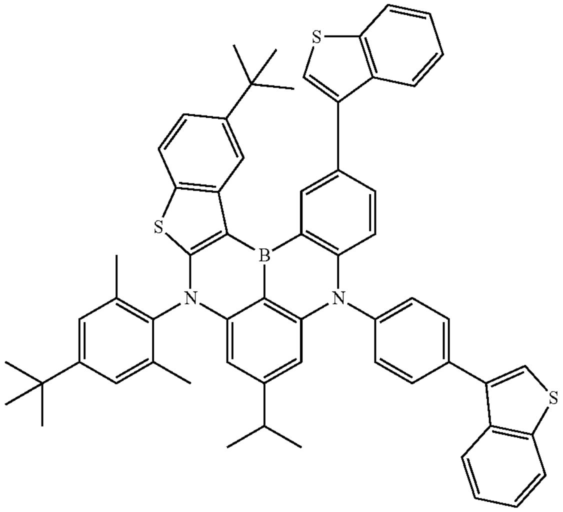
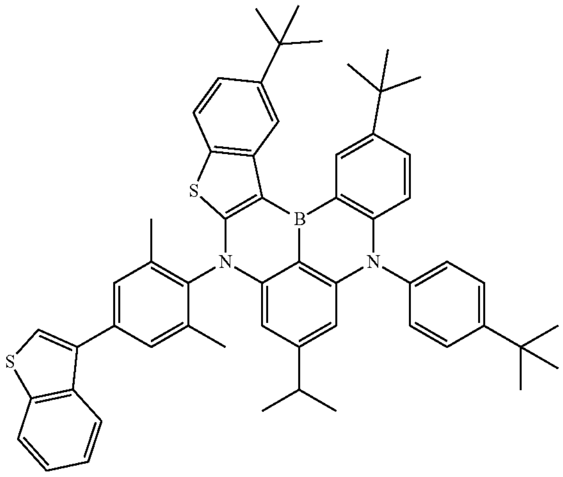

-continued
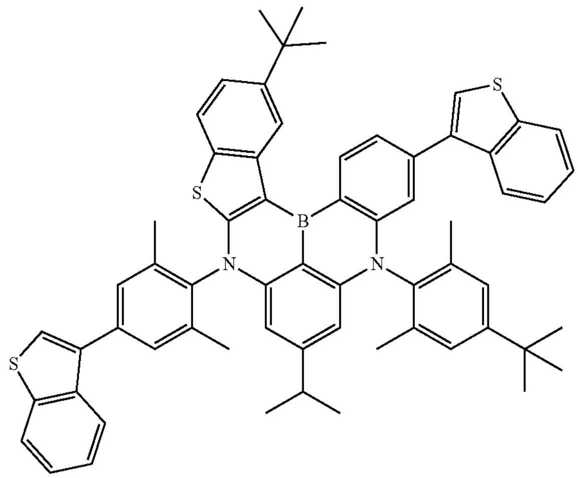
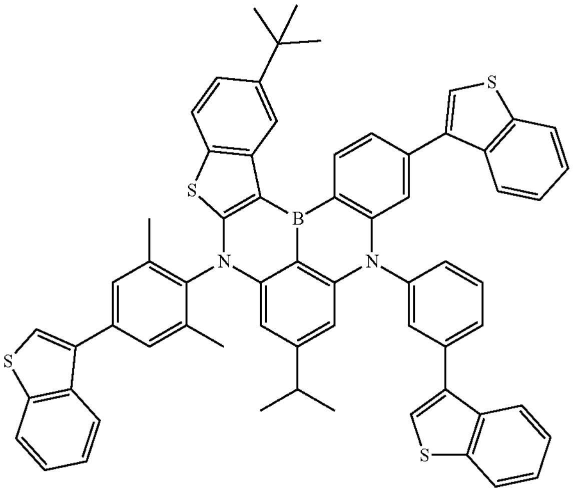
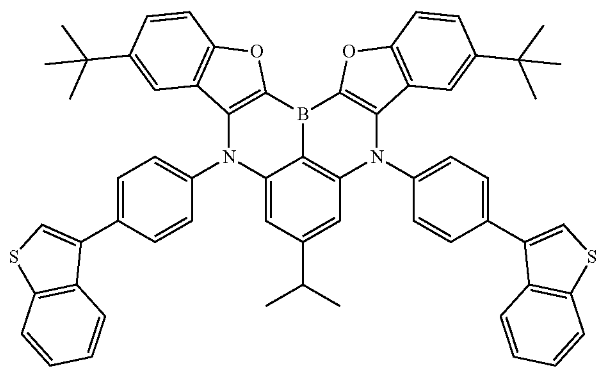
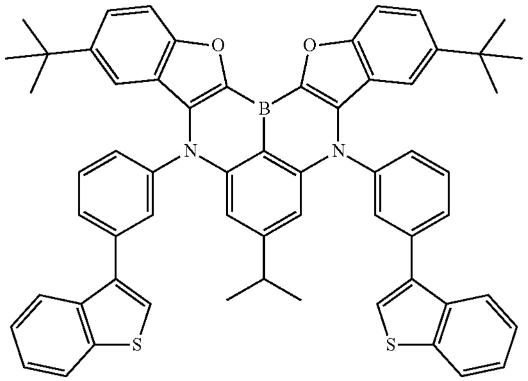
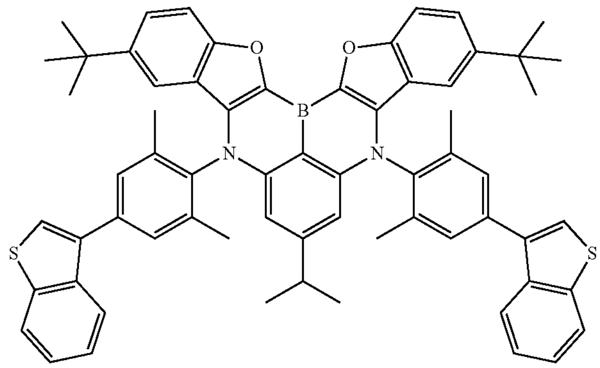
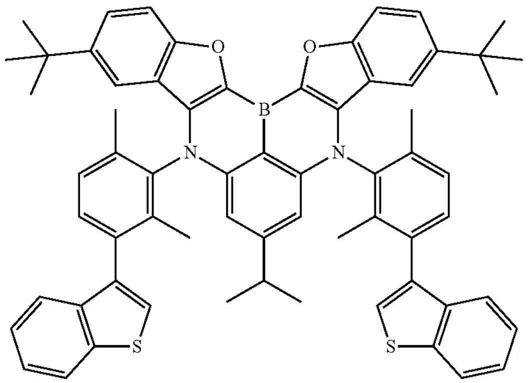
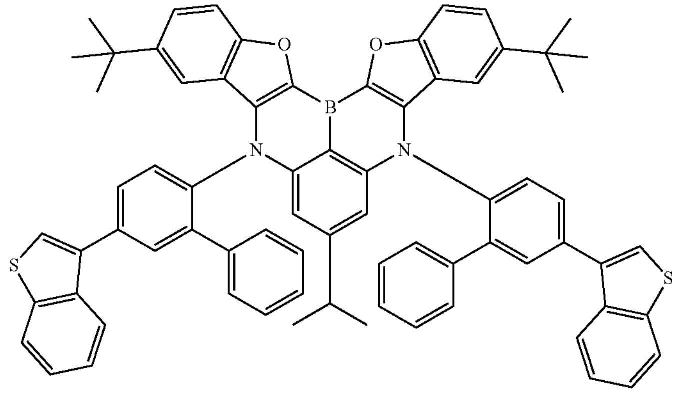

-continued
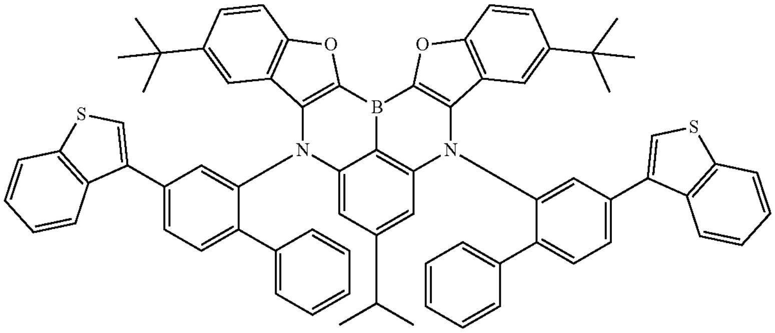
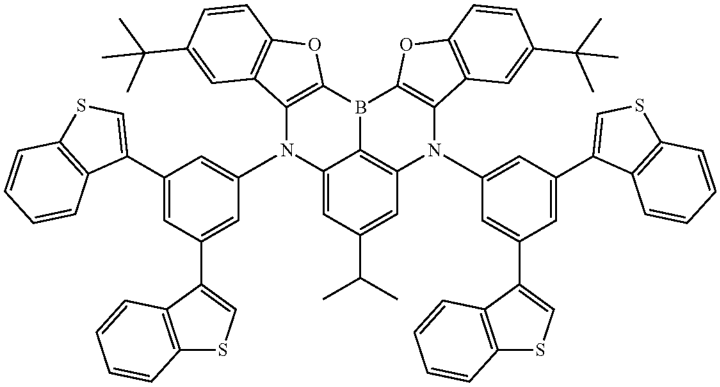
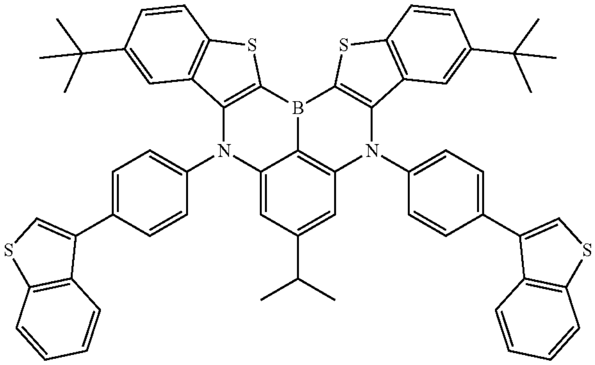
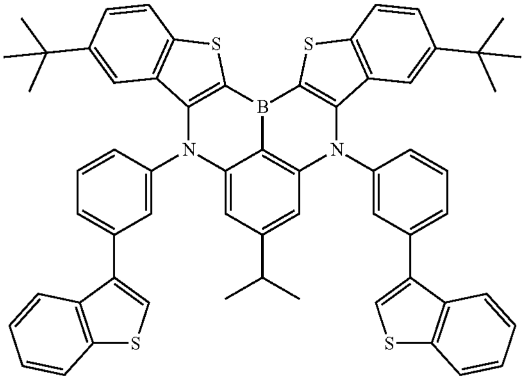
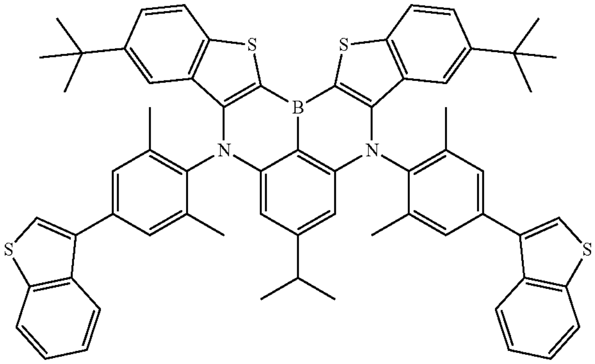
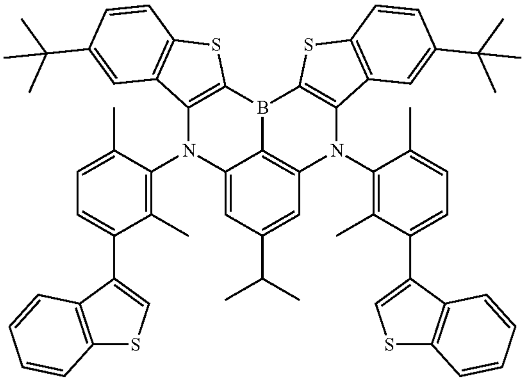

-continued
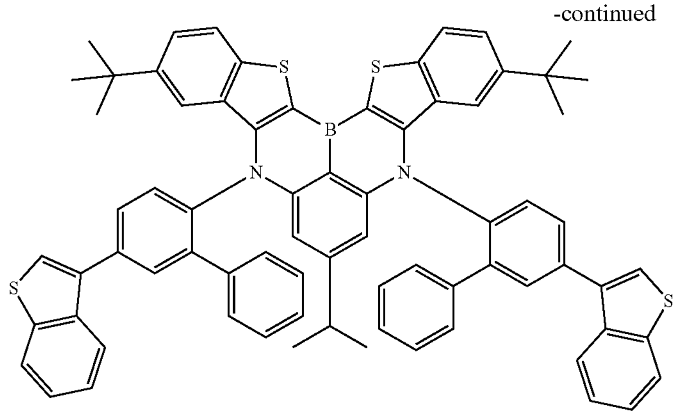
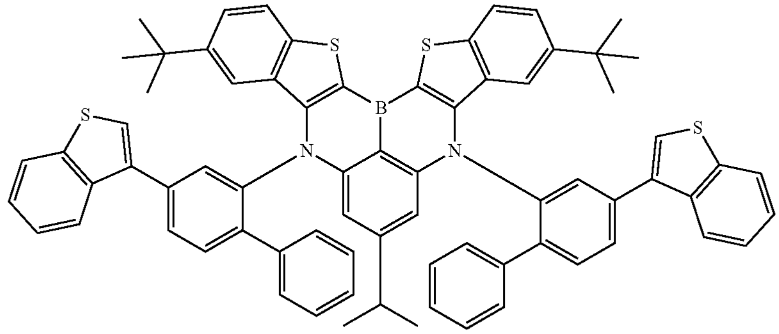
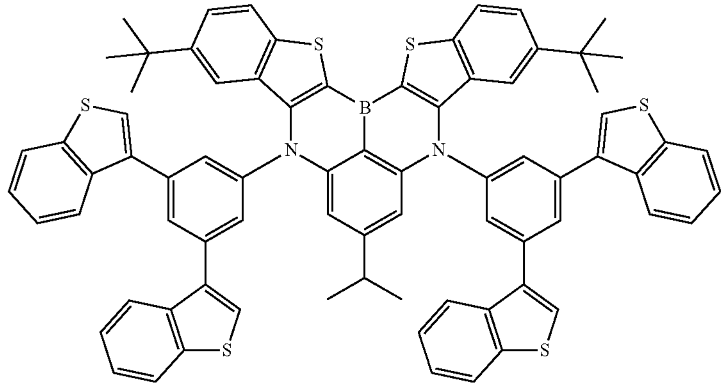
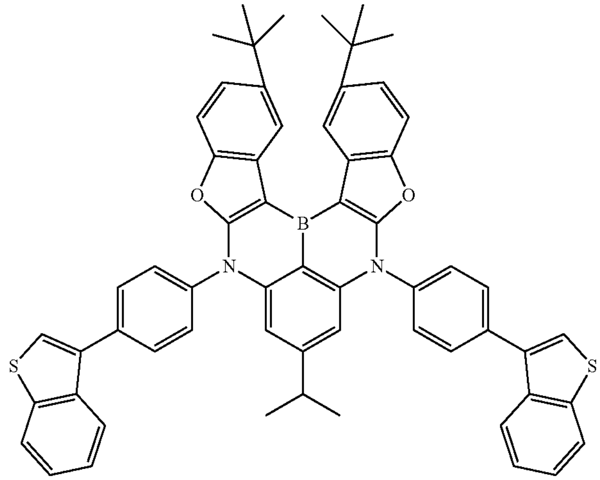

-continued
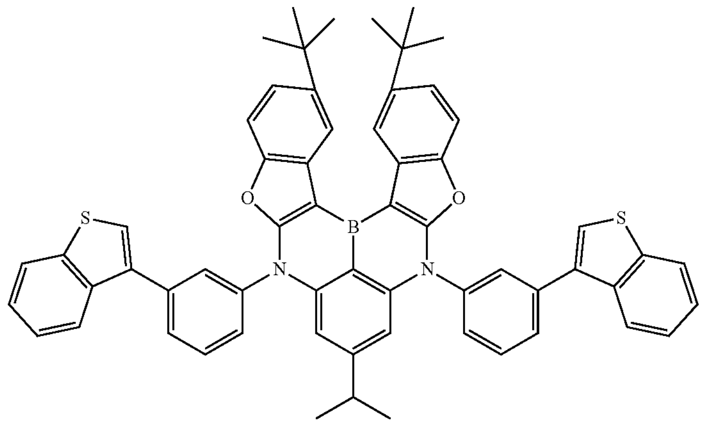
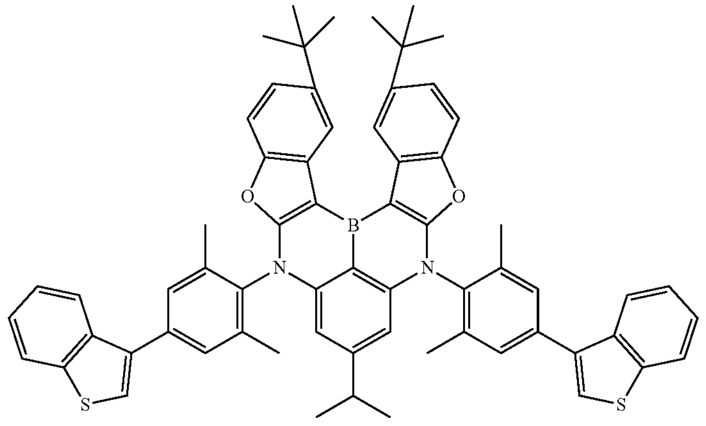
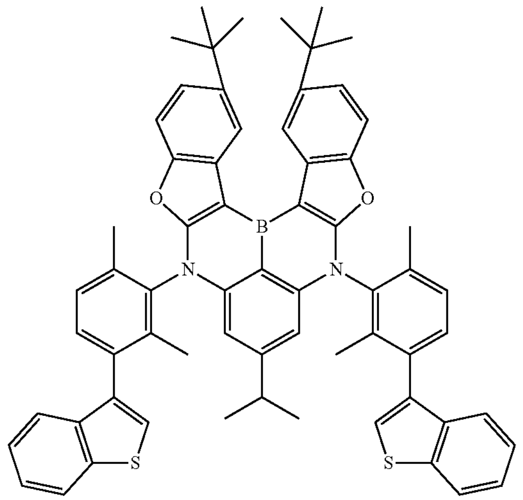

-continued
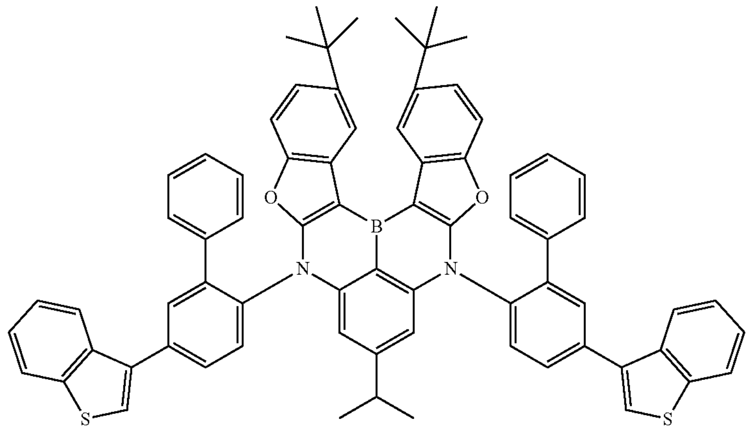
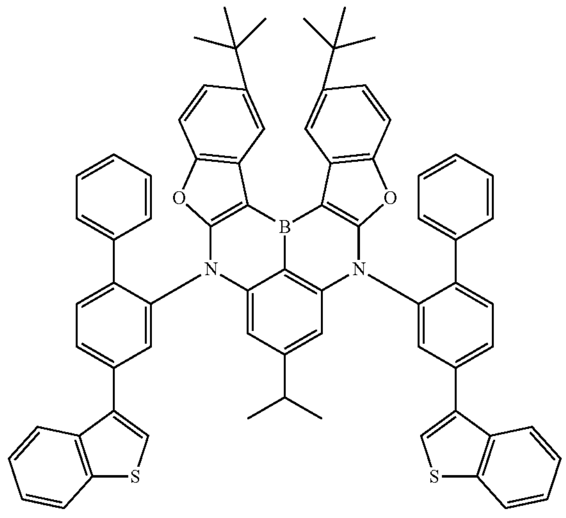
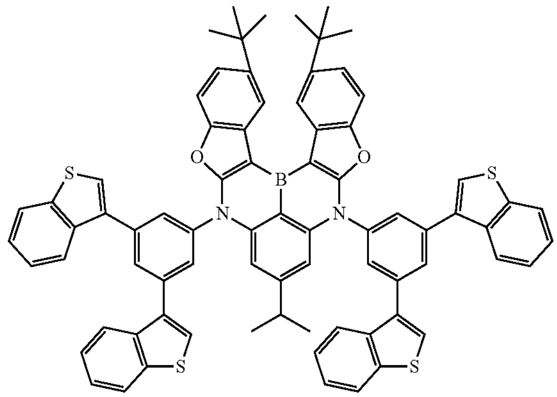
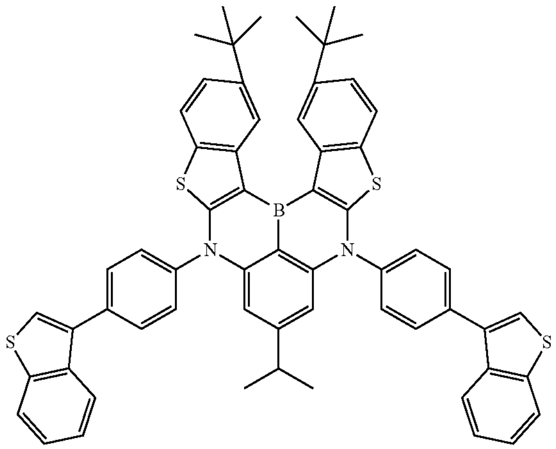

-continued
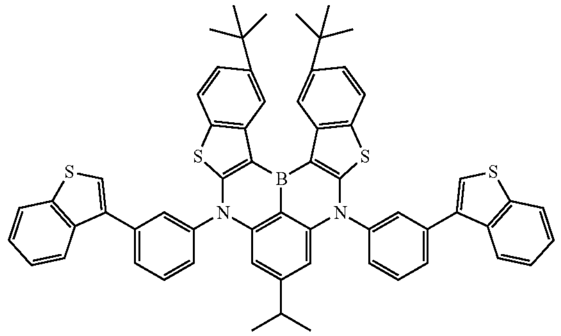
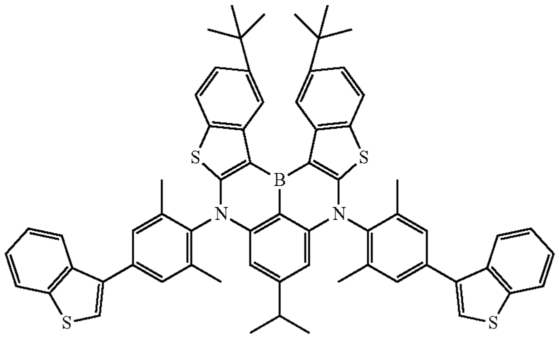
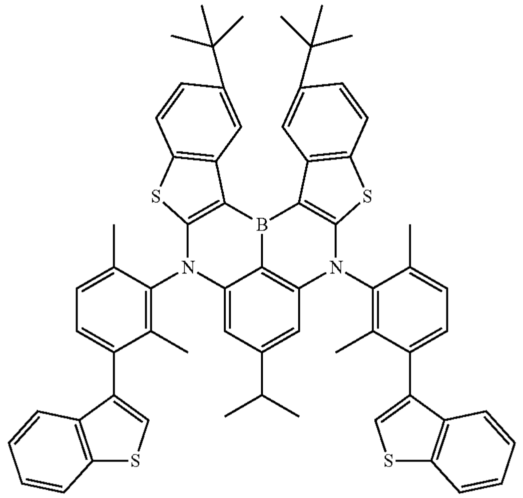
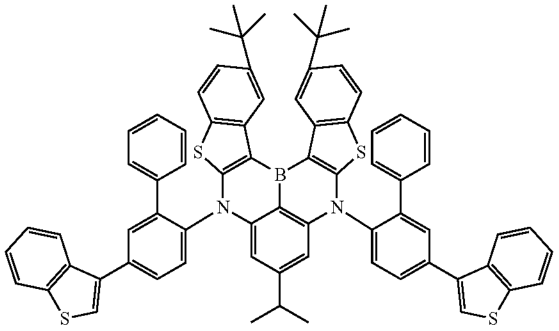
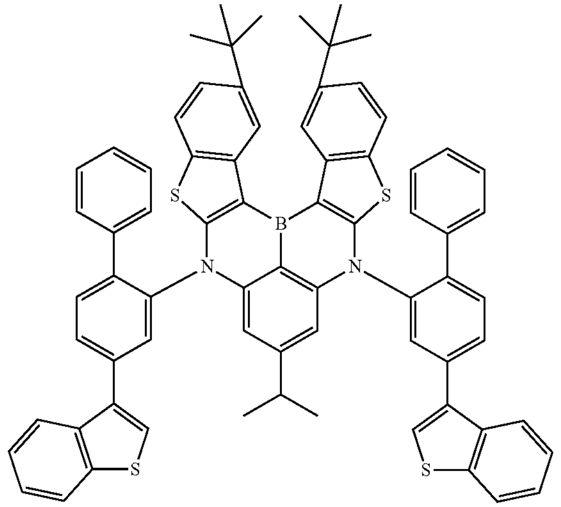
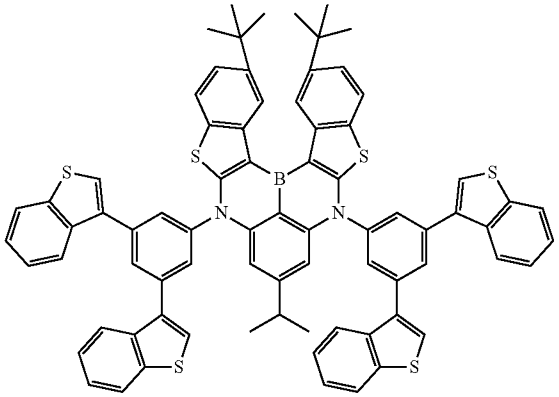

-continued
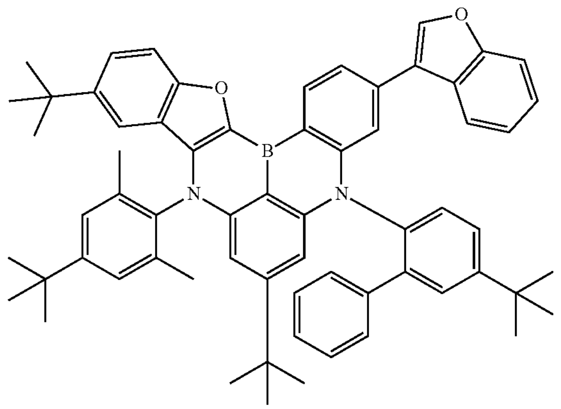
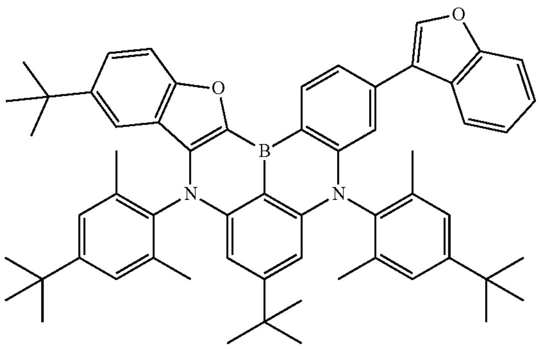
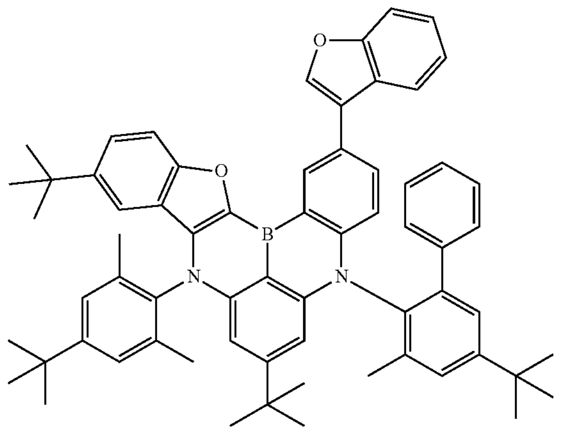
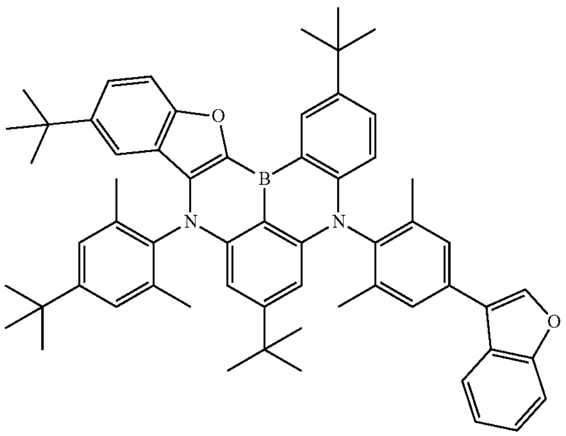
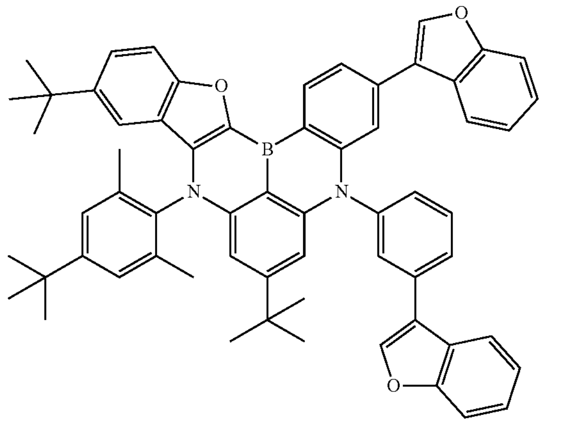
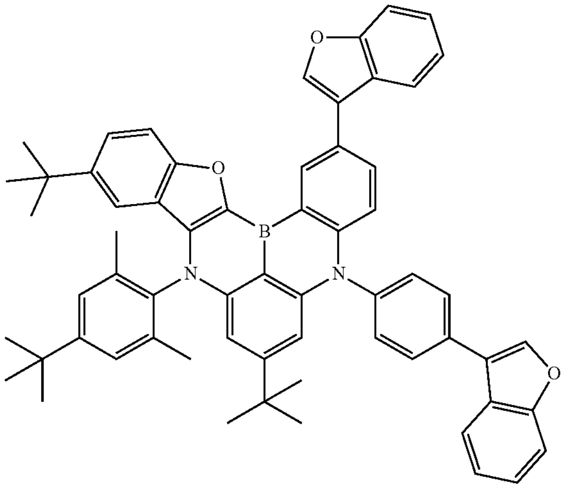

-continued
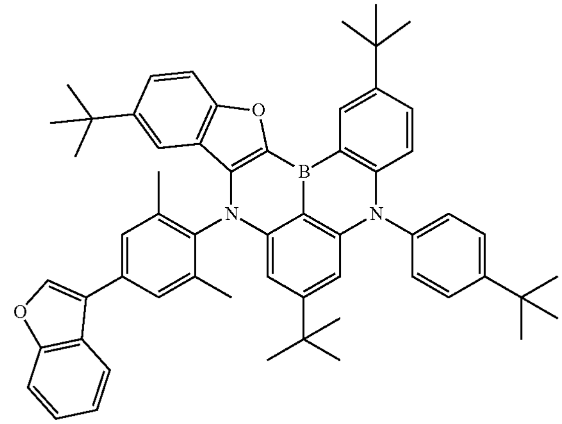
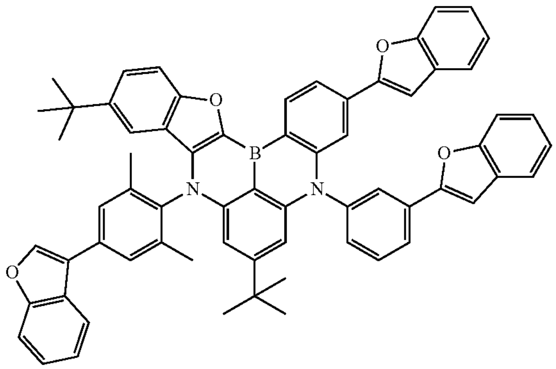
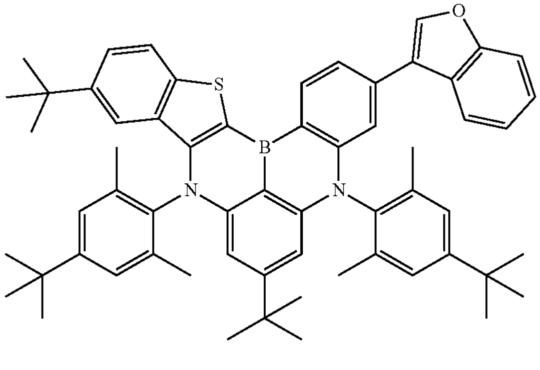
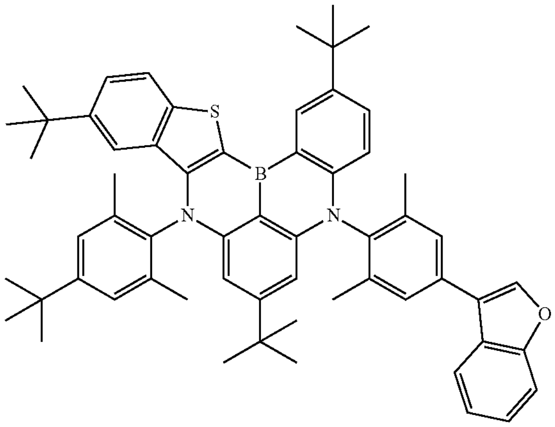
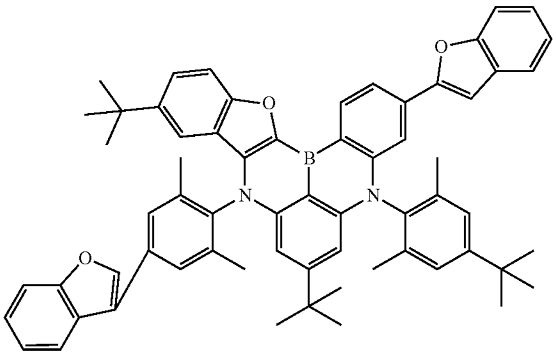
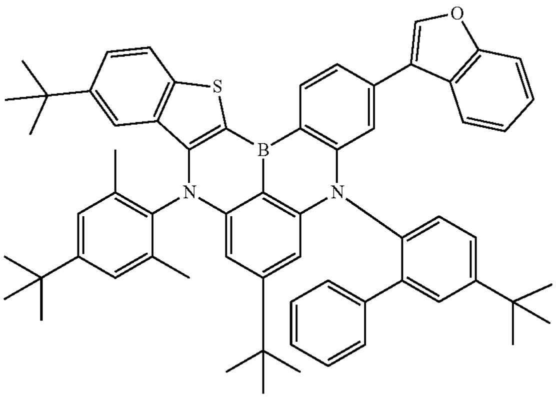
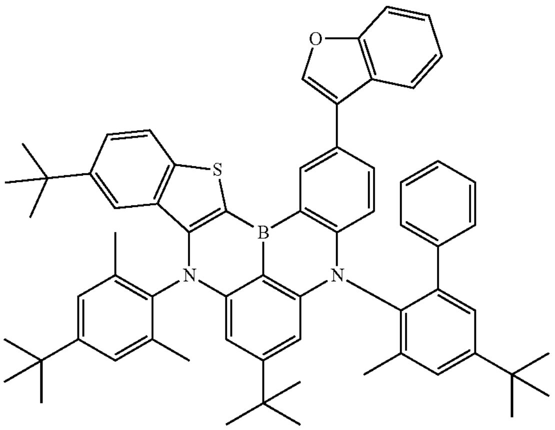
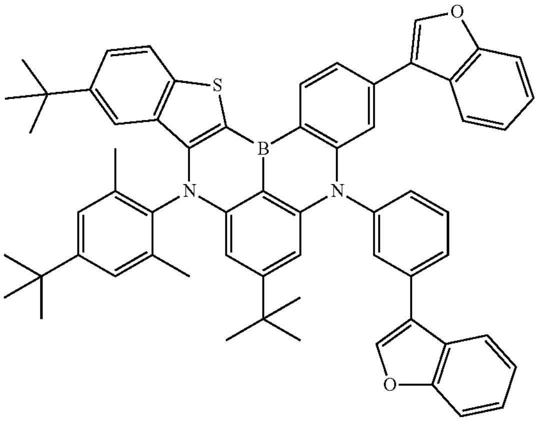

-continued
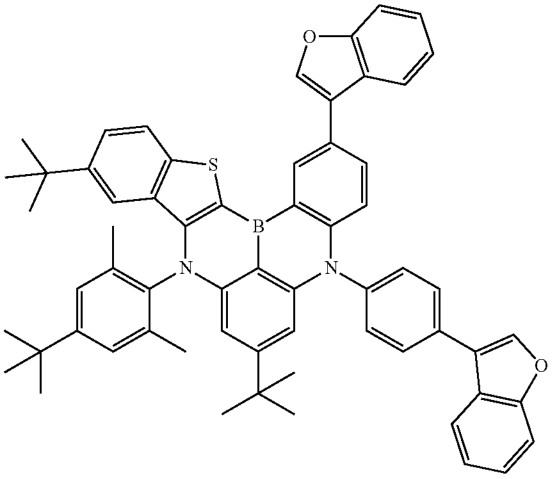
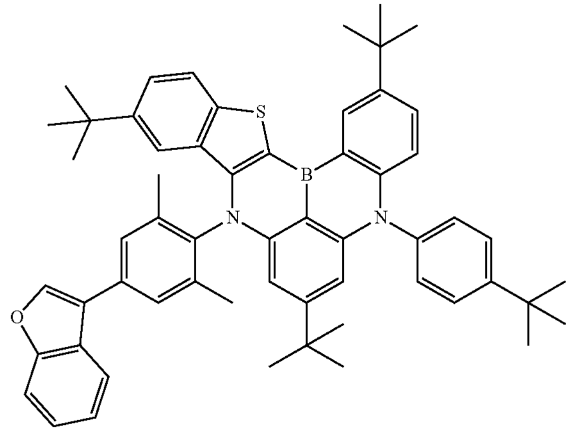
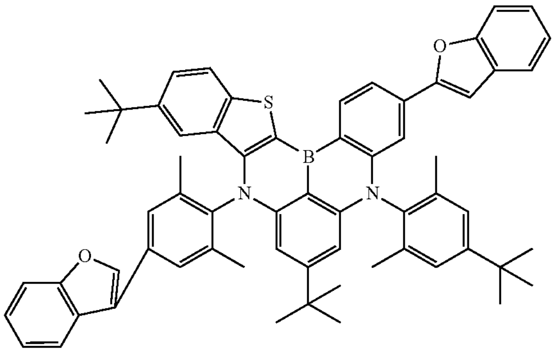
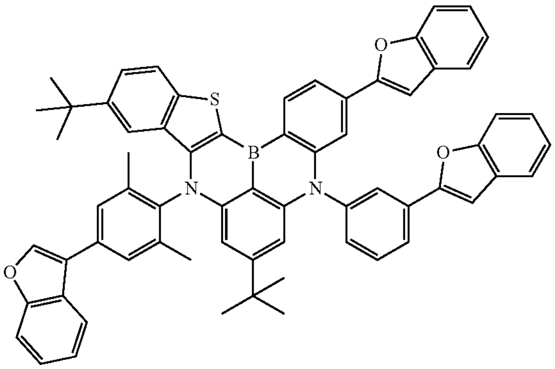
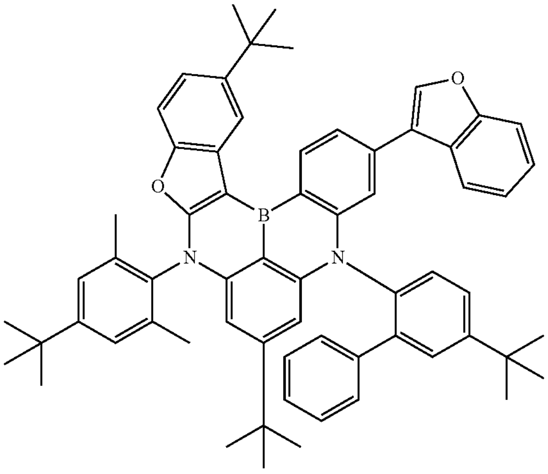
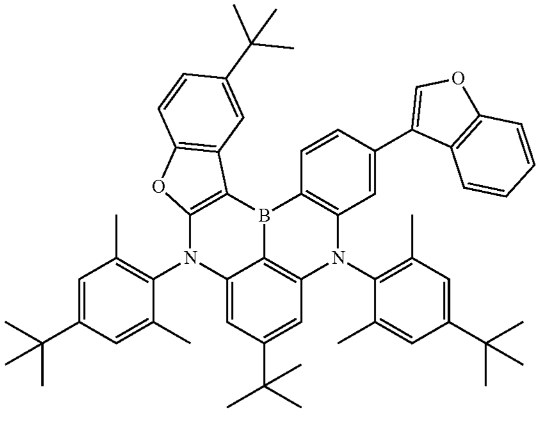

-continued
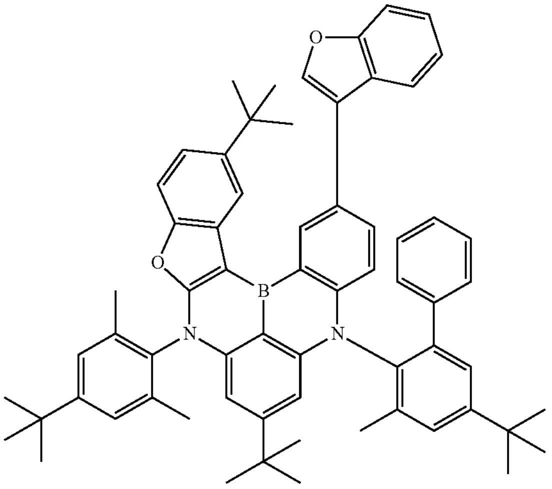
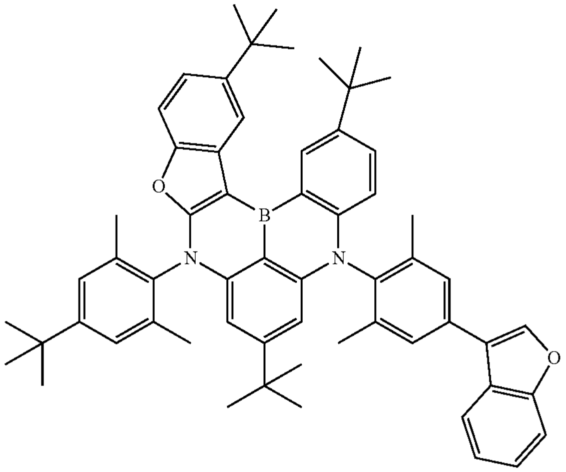
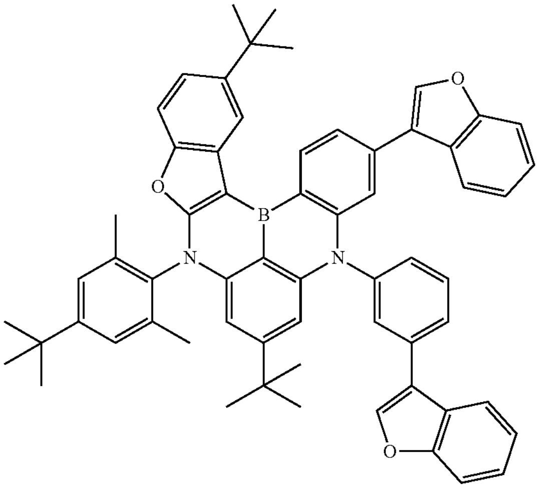
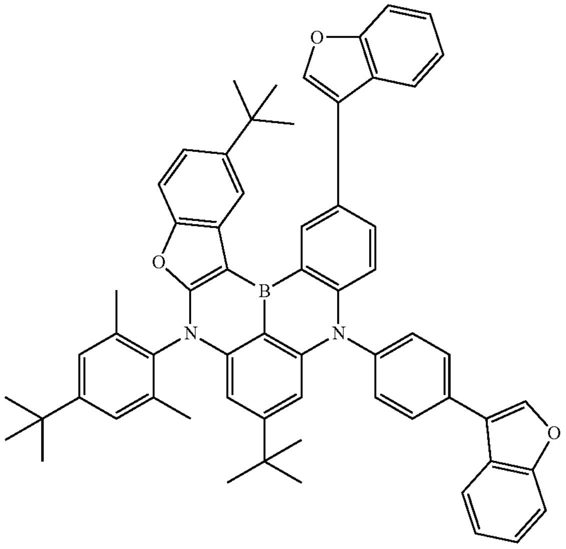
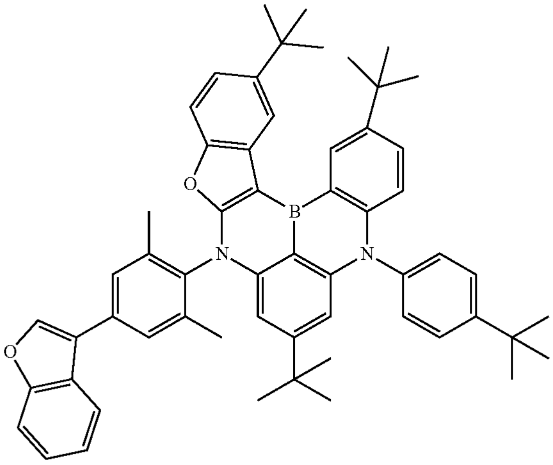
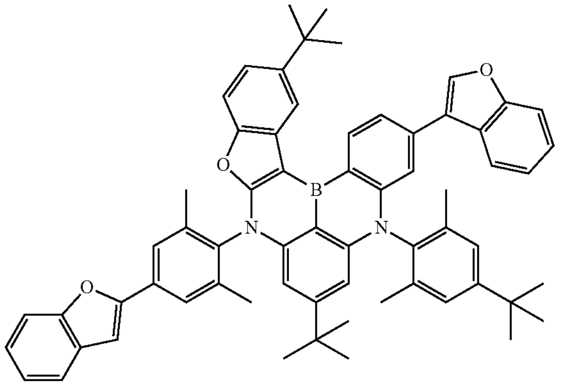

-continued
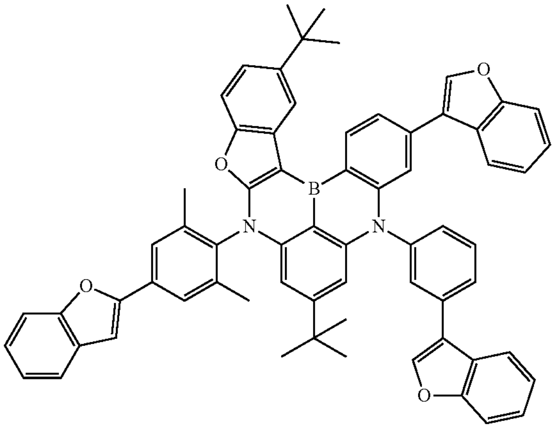
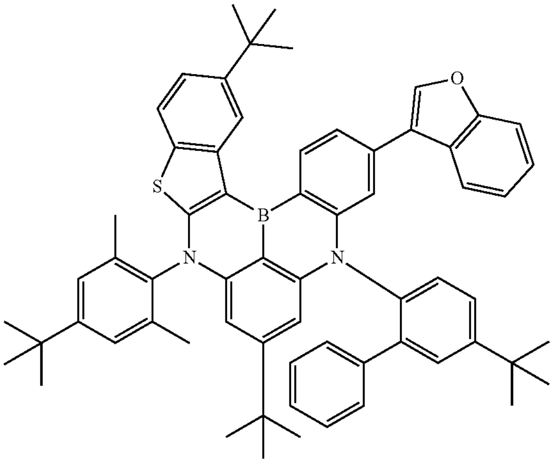
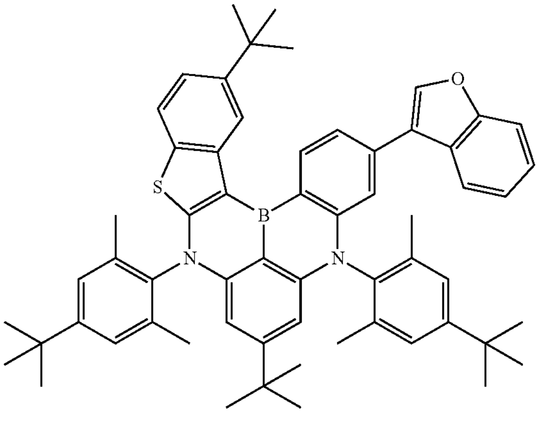
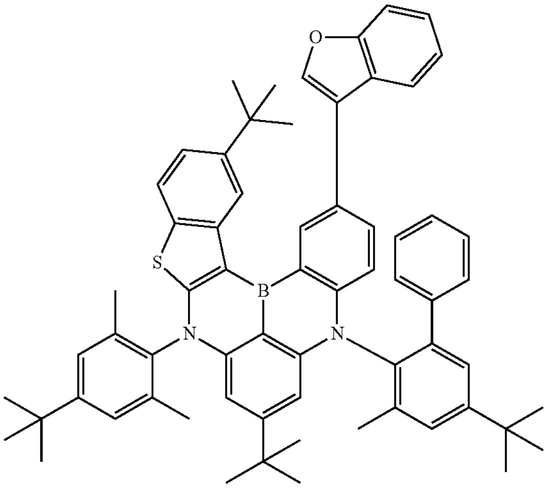
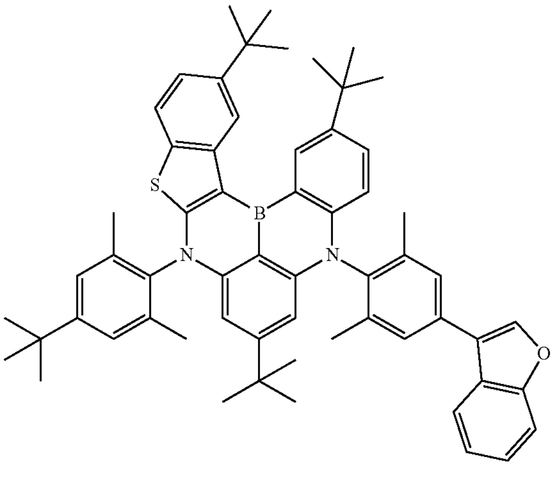
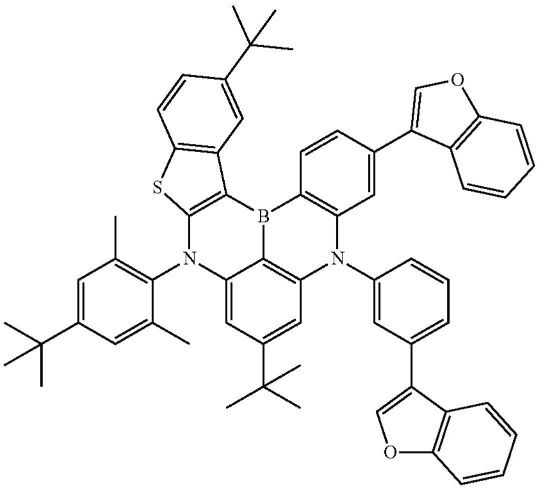

-continued
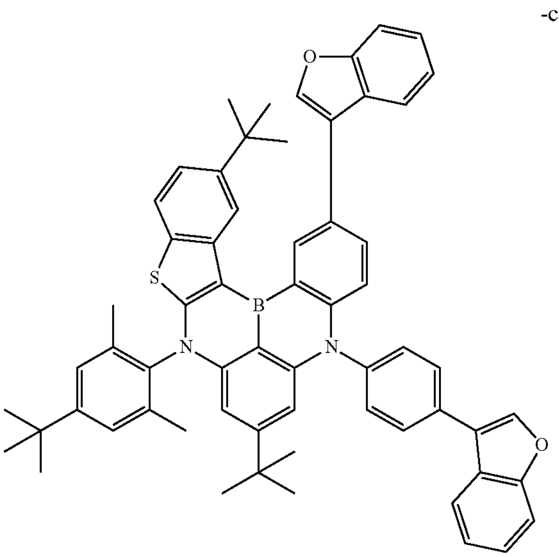
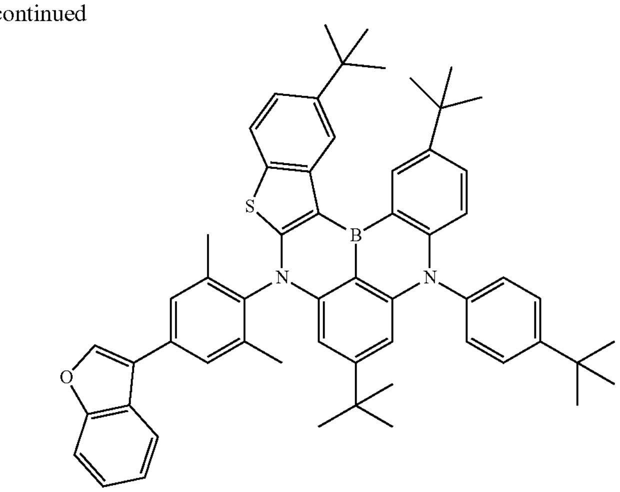
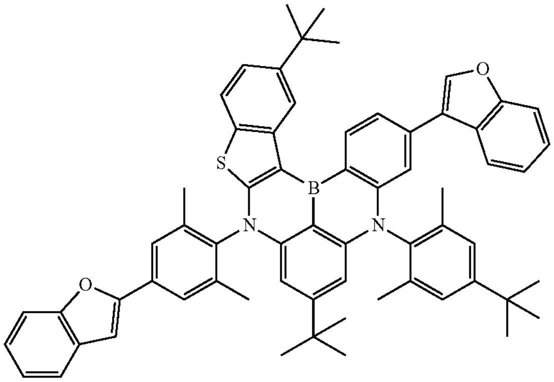
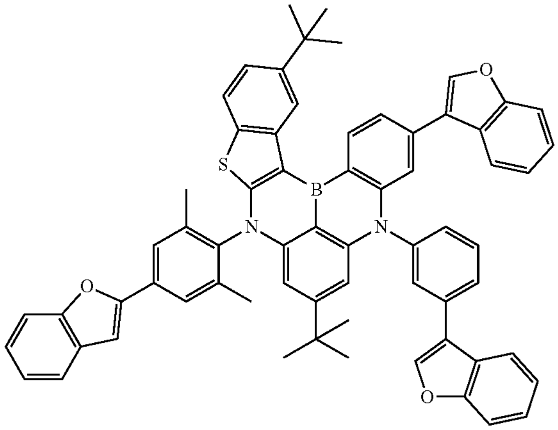
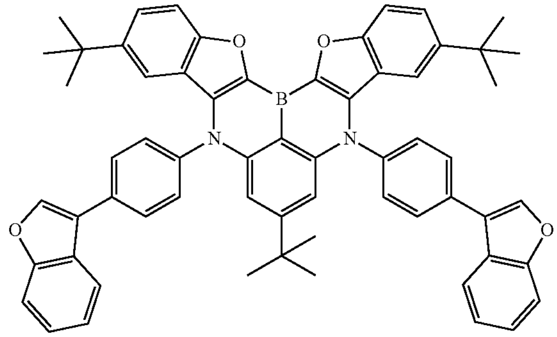
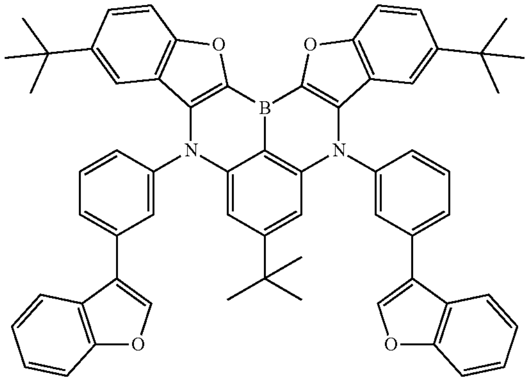
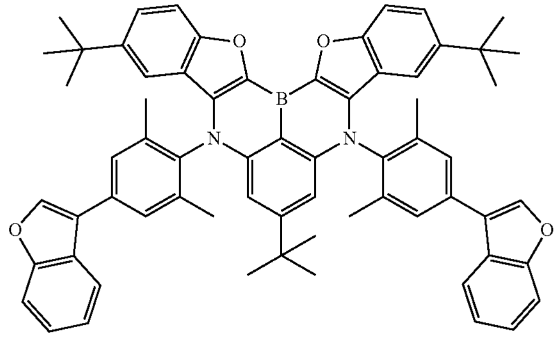
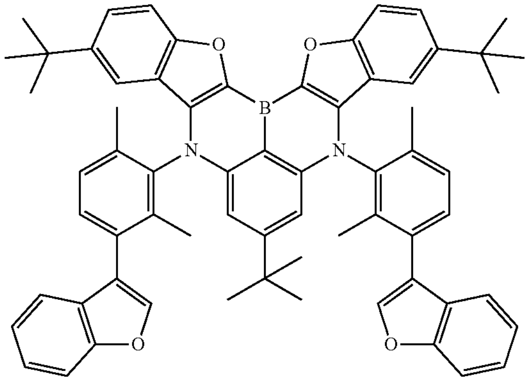

-continued
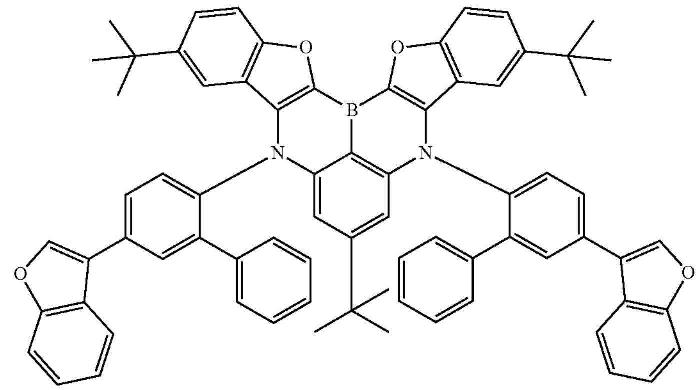
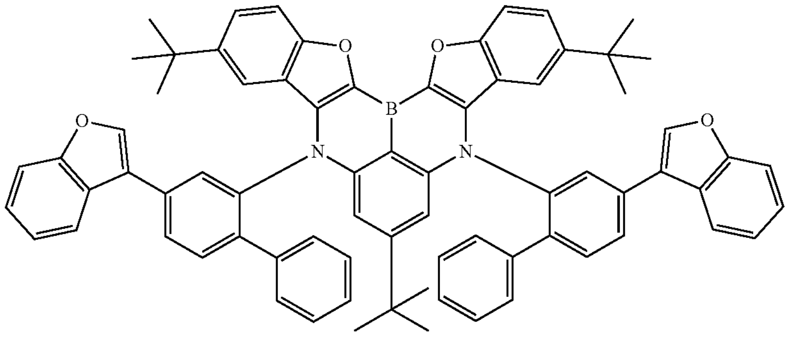
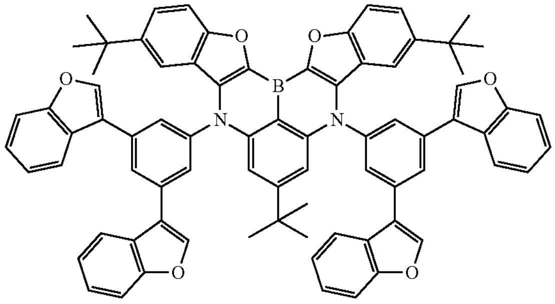
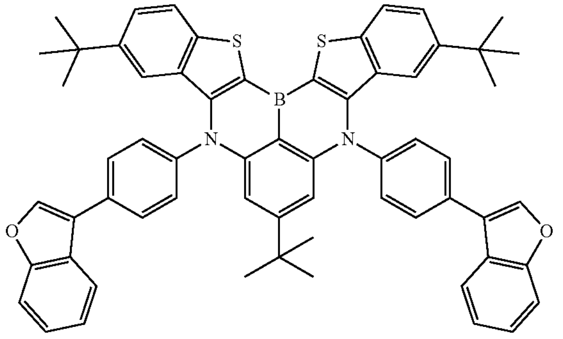
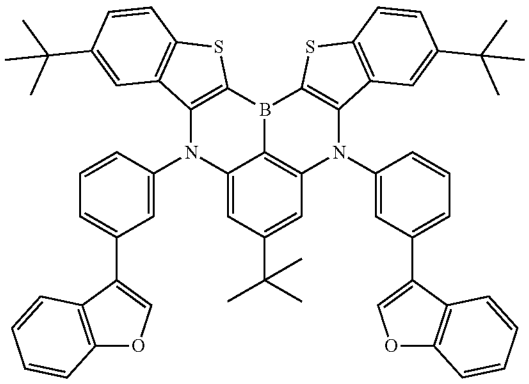
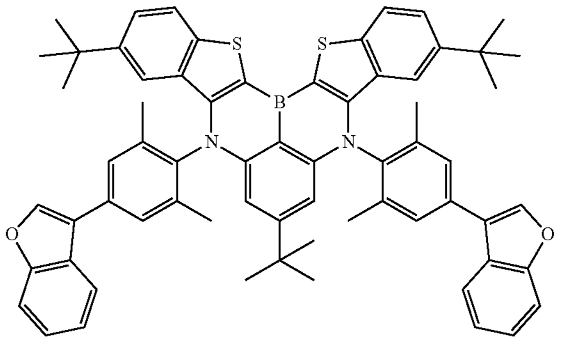

-continued
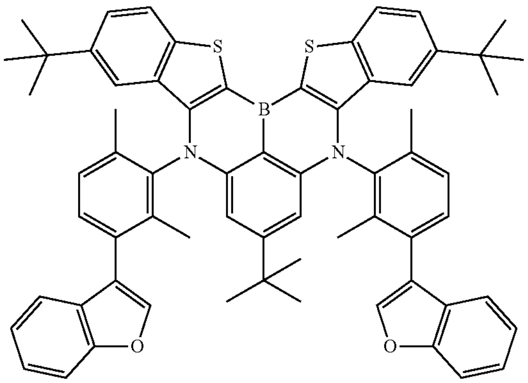
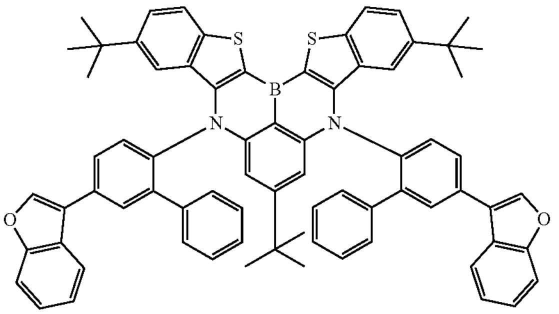
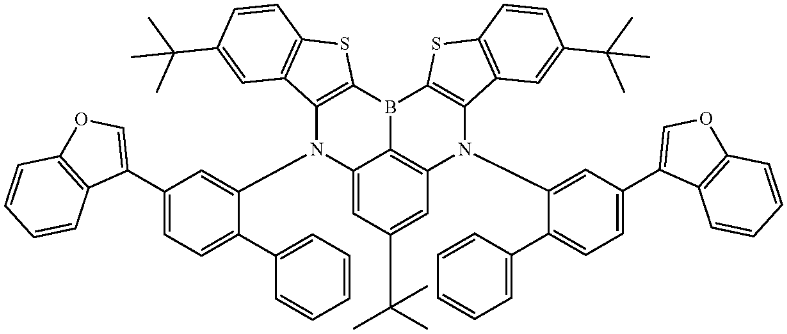
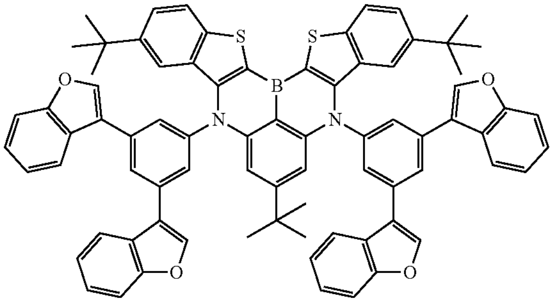
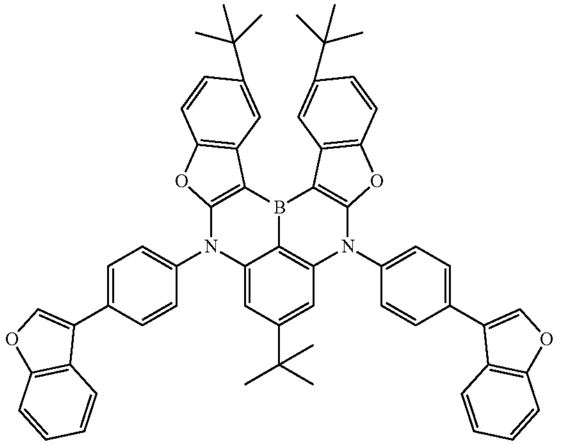
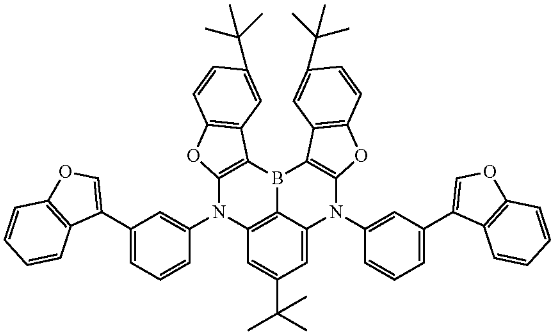
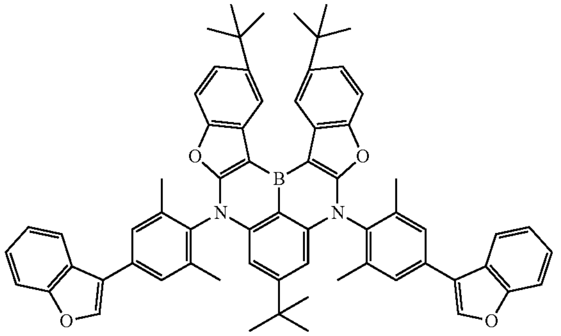

-continued
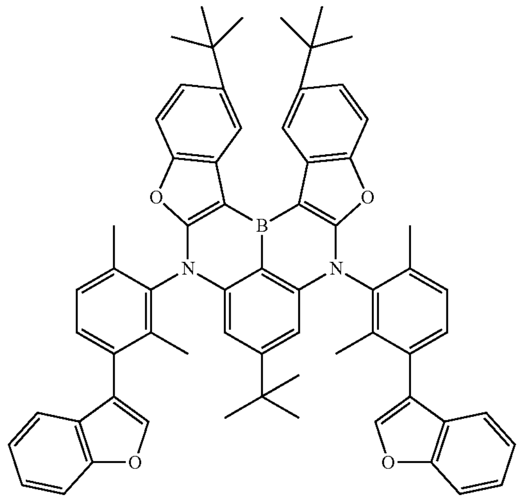
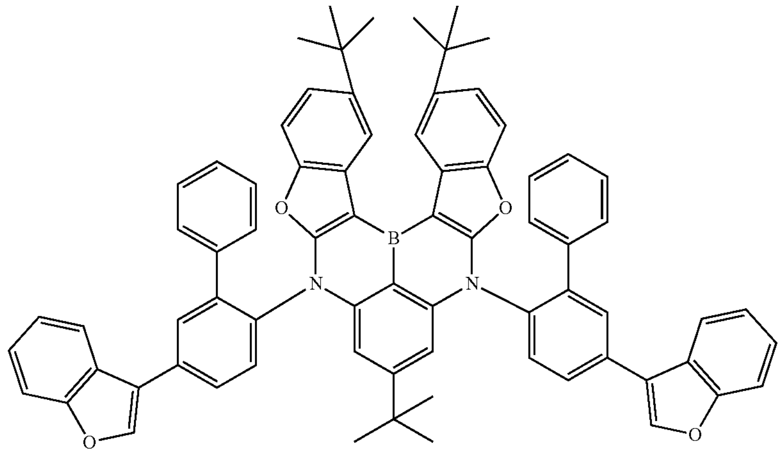
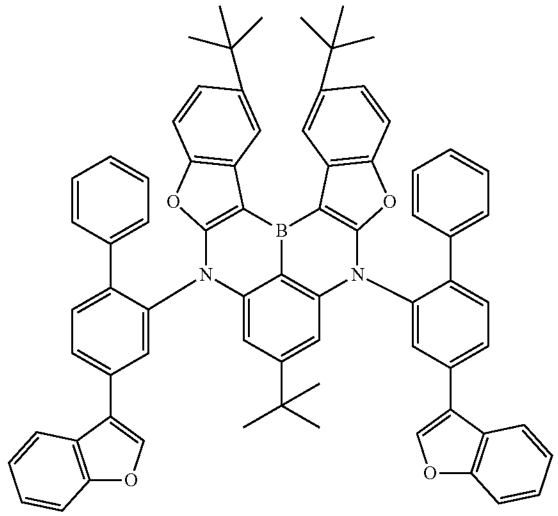
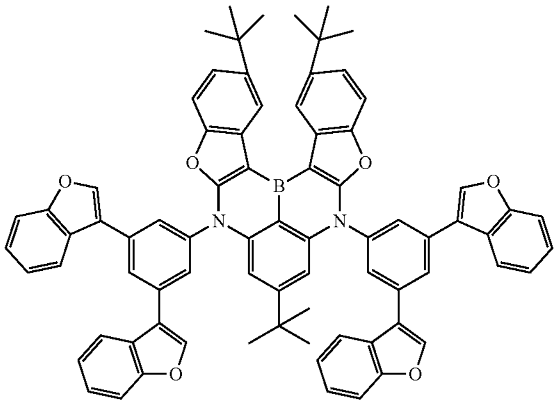

-continued
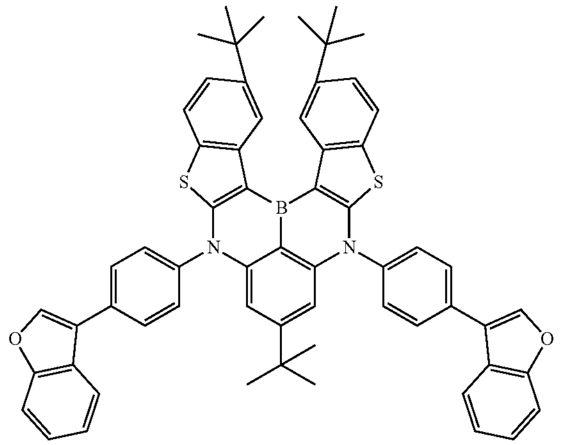
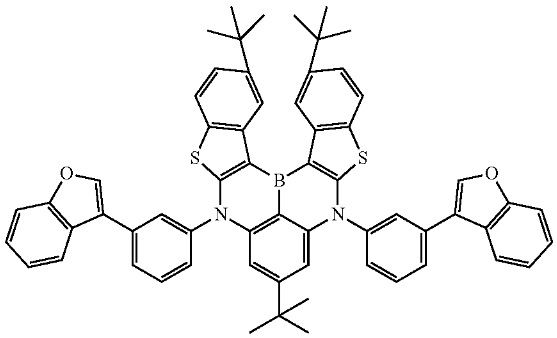
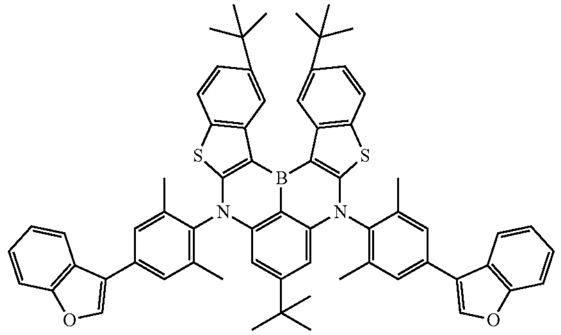
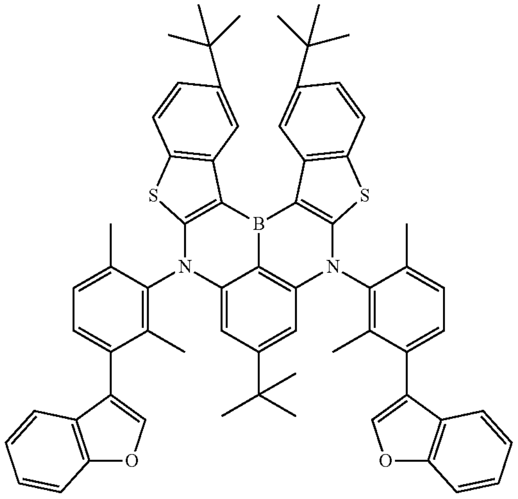
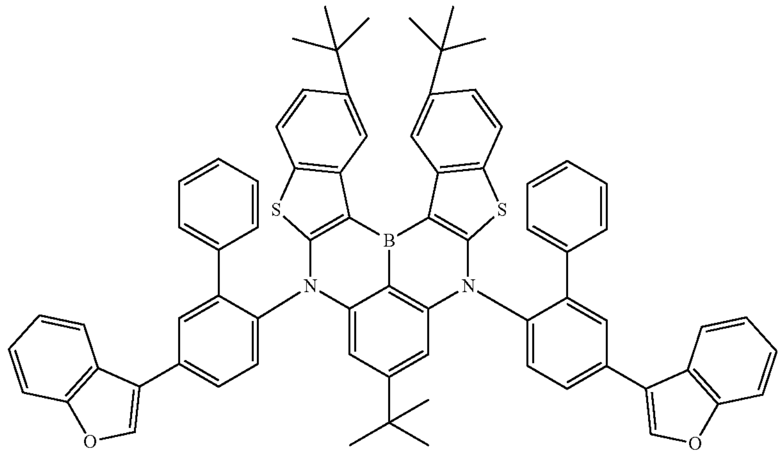

-continued
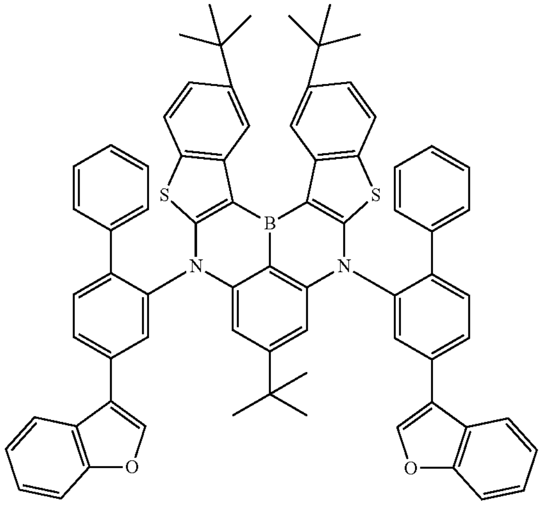
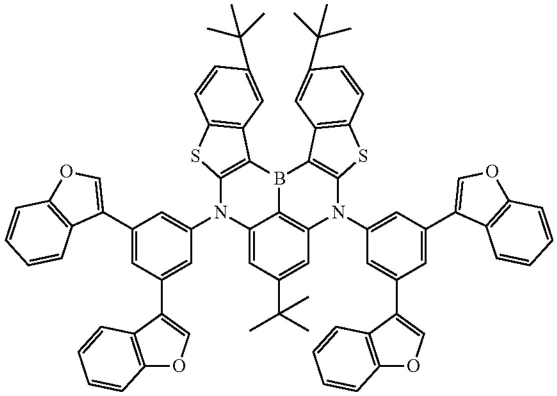
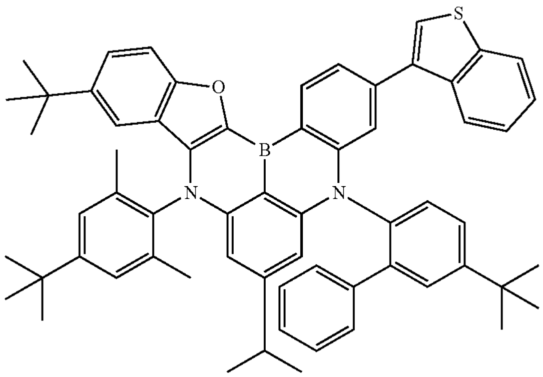
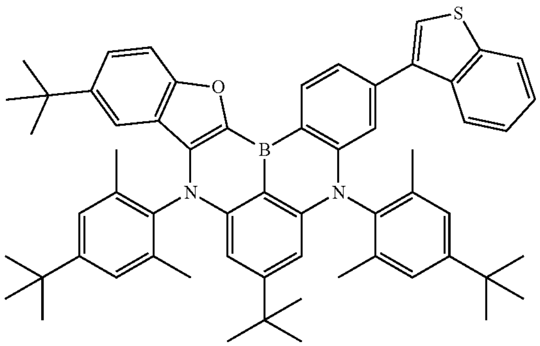
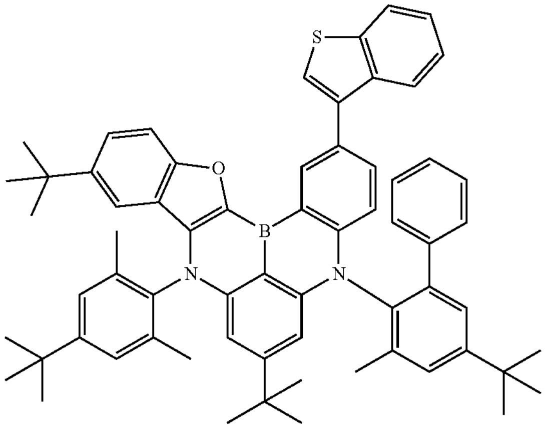
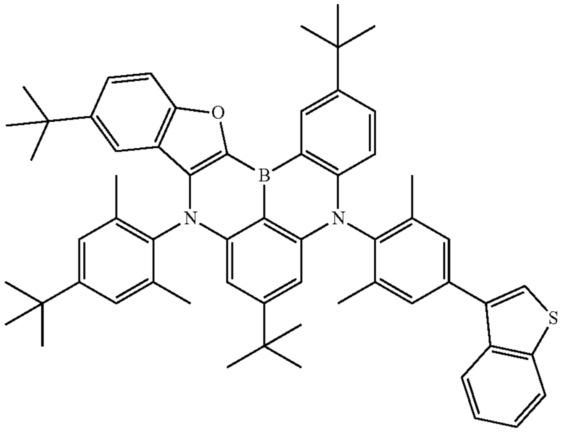

-continued
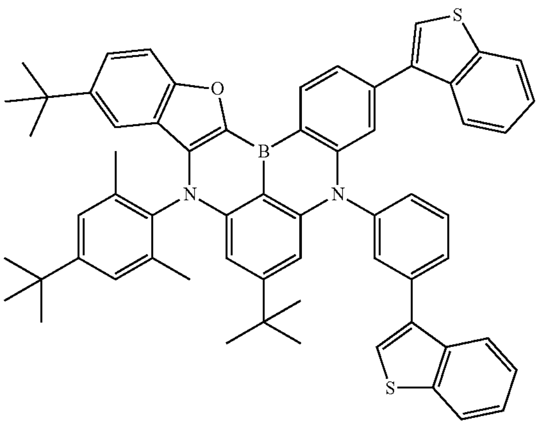
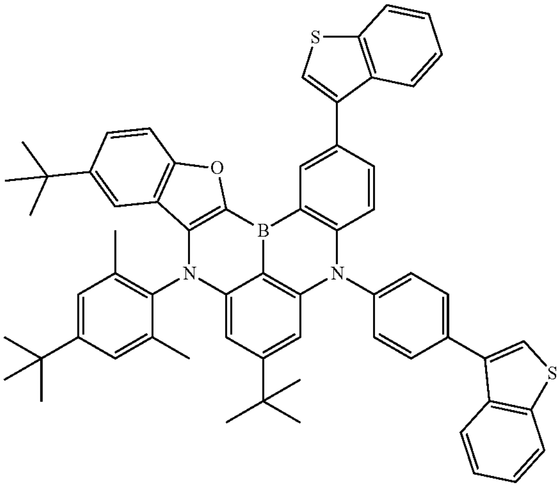
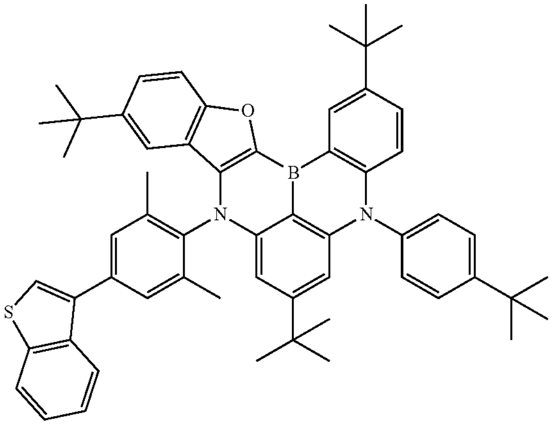
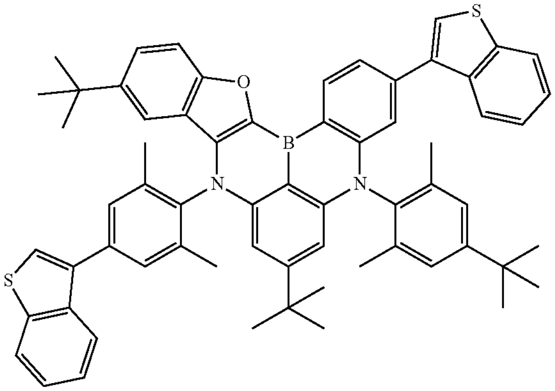
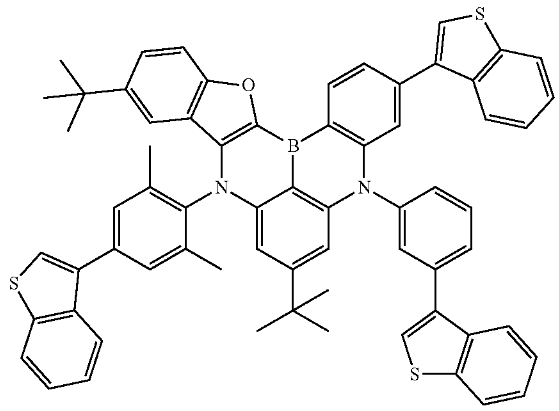
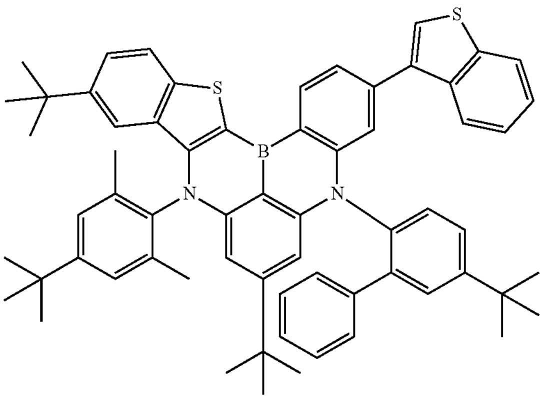

-continued
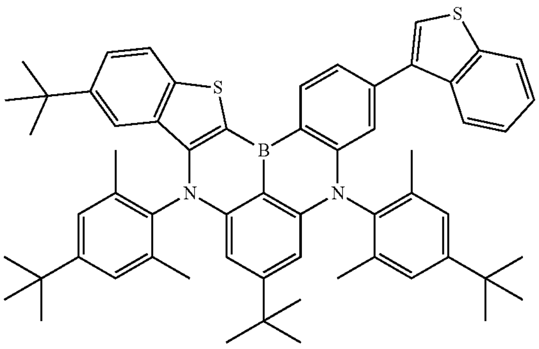
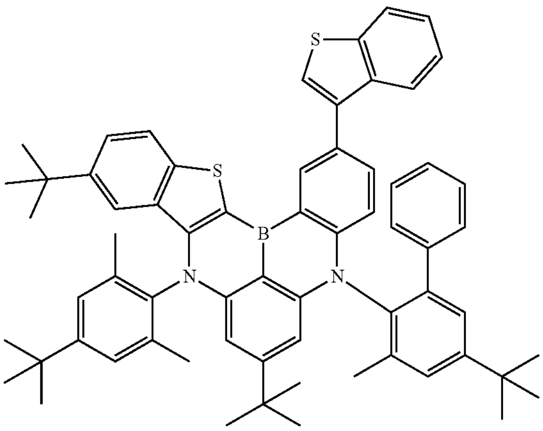
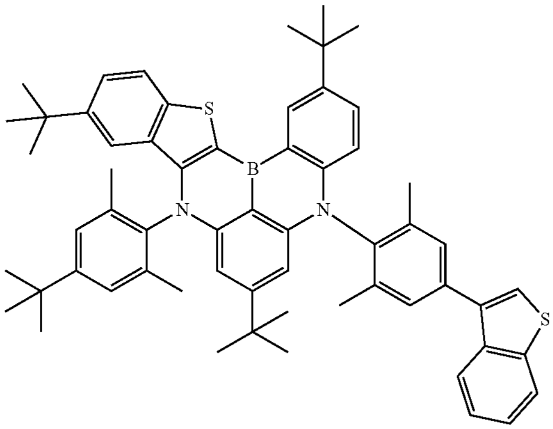
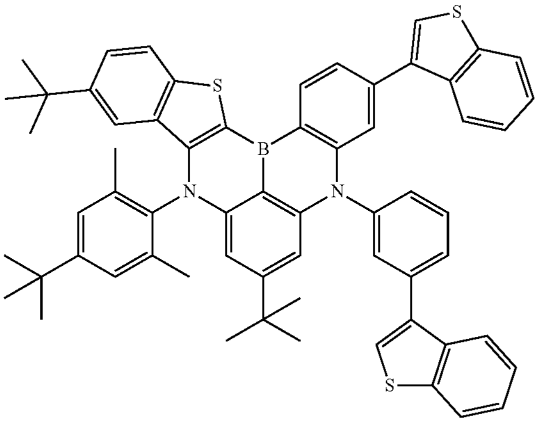
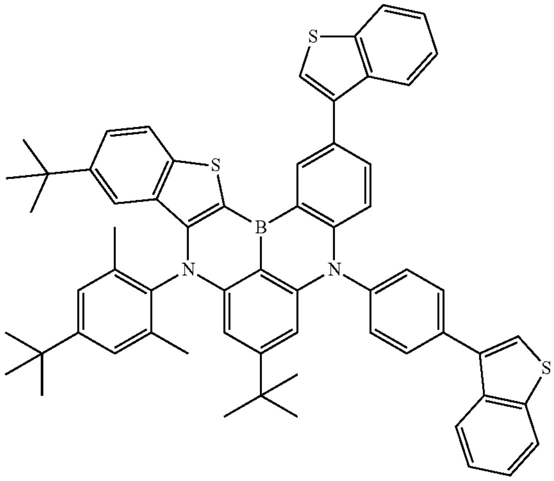
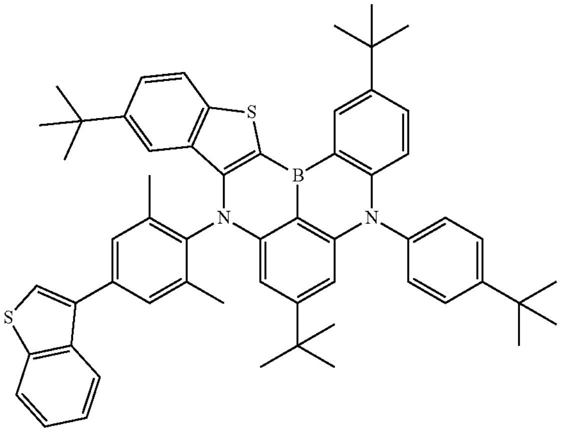

-continued
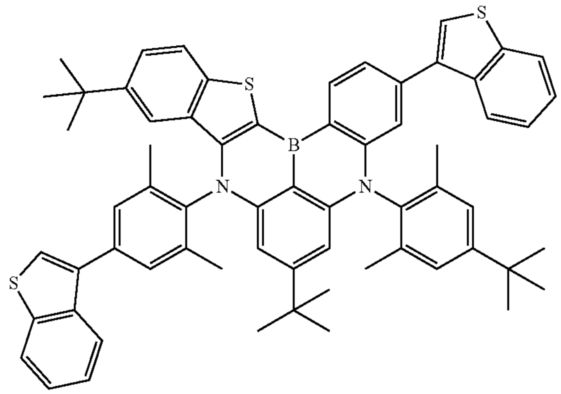
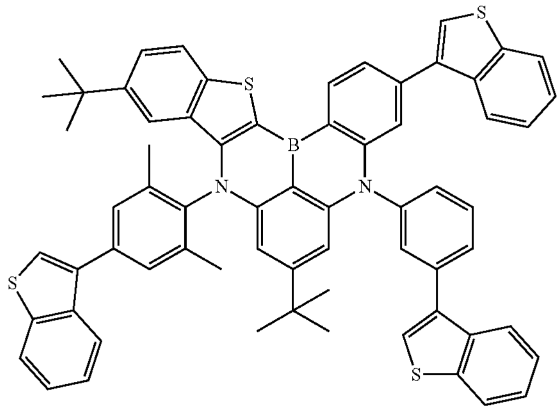
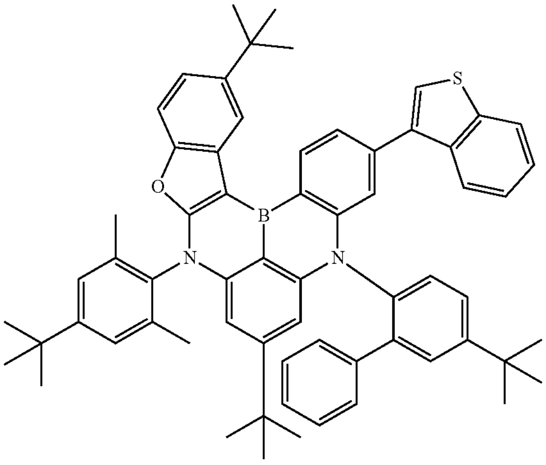
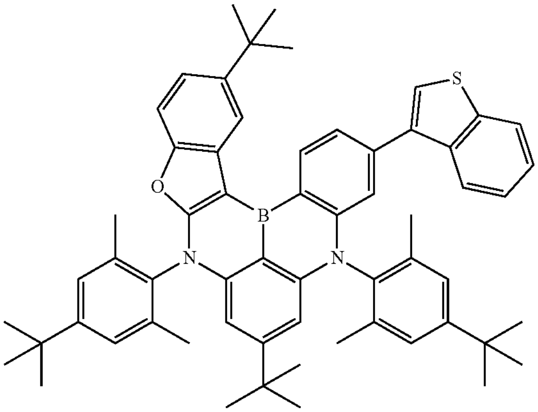
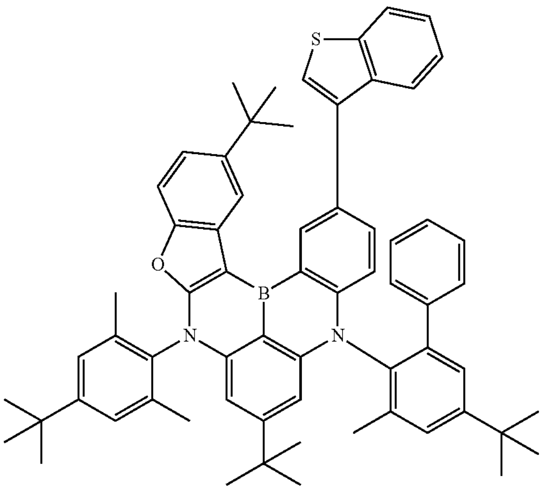
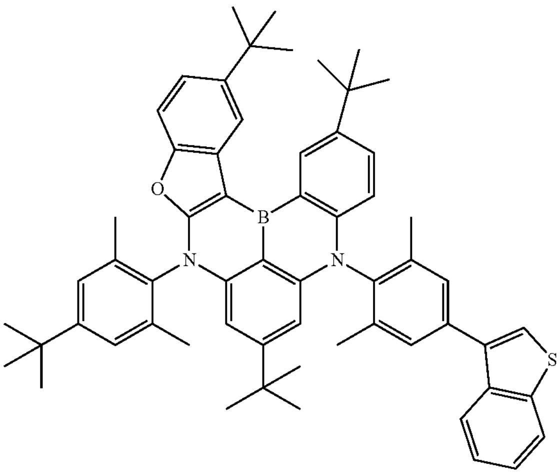

-continued
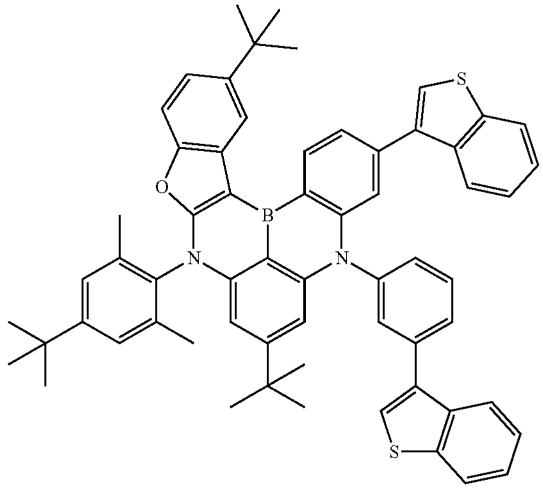
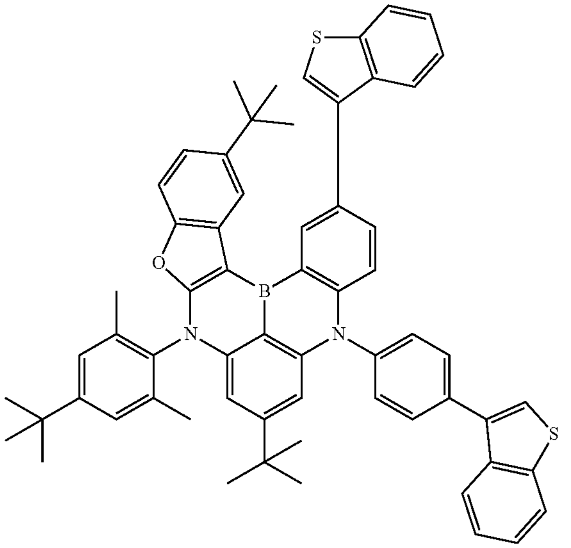
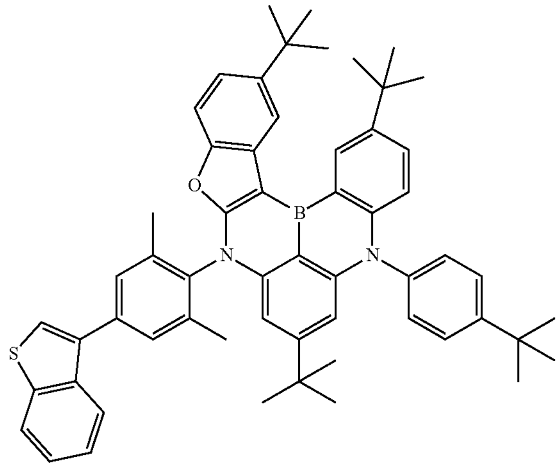
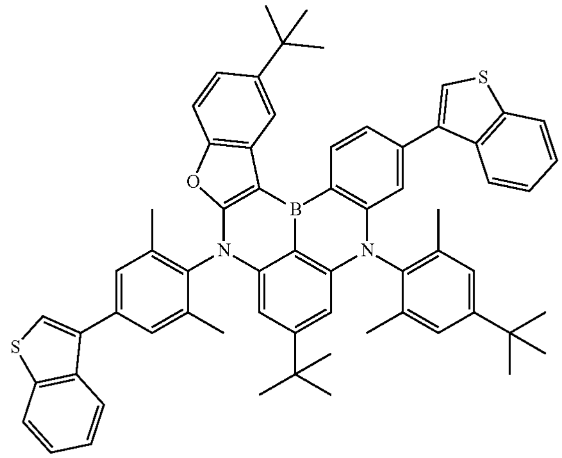
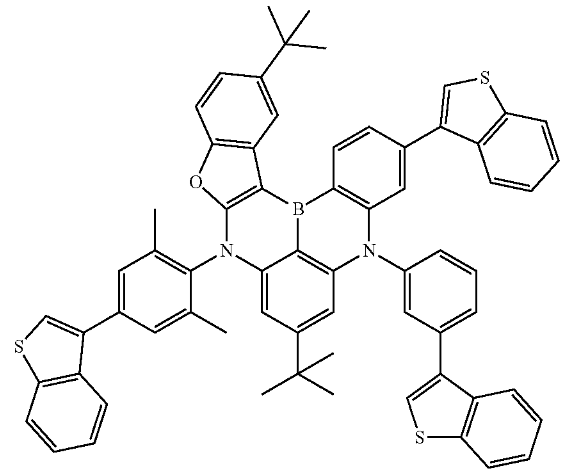
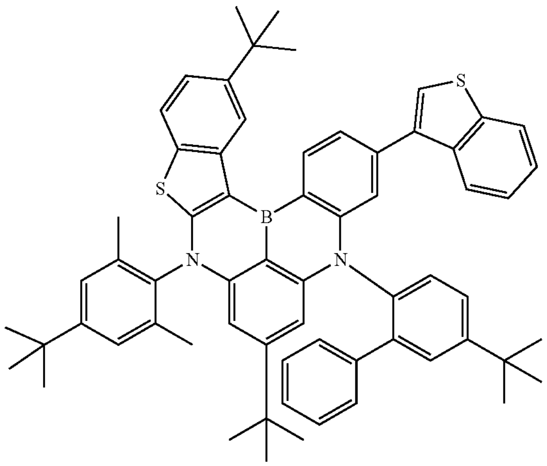

-continued
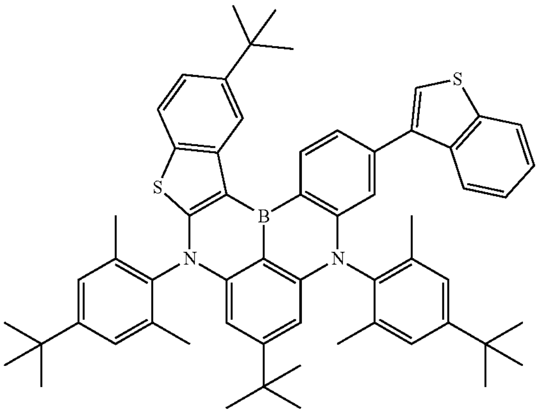
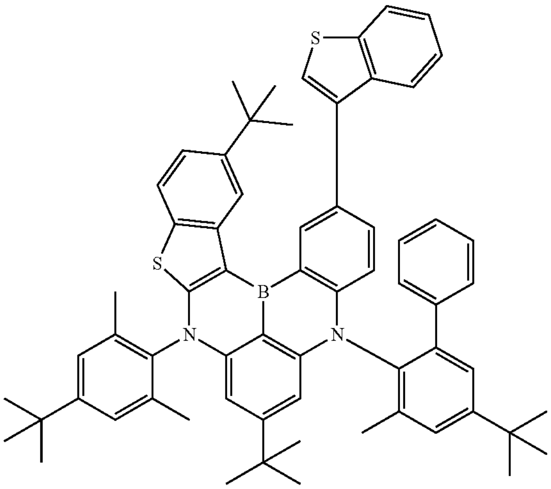
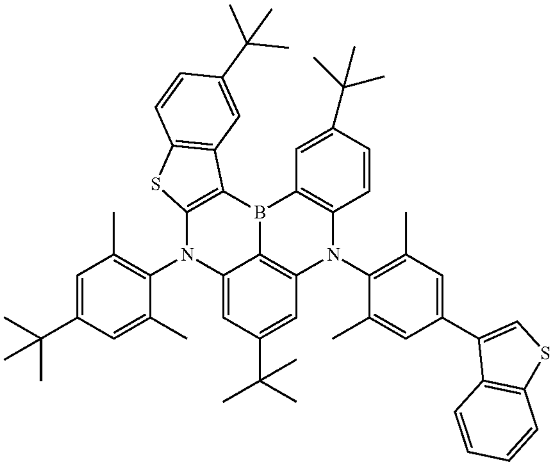
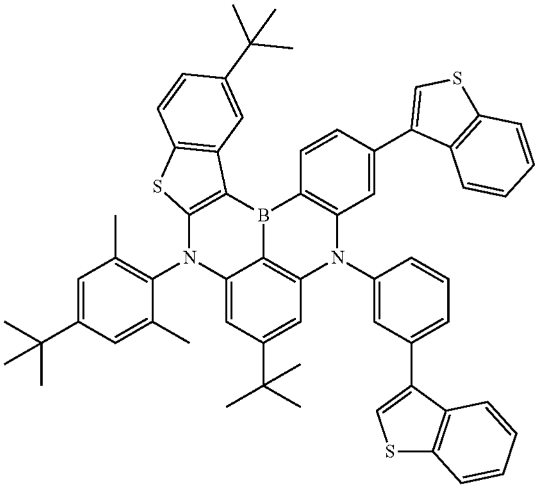
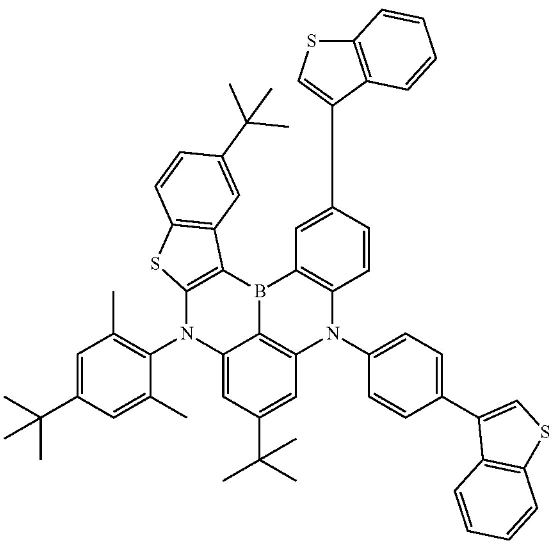
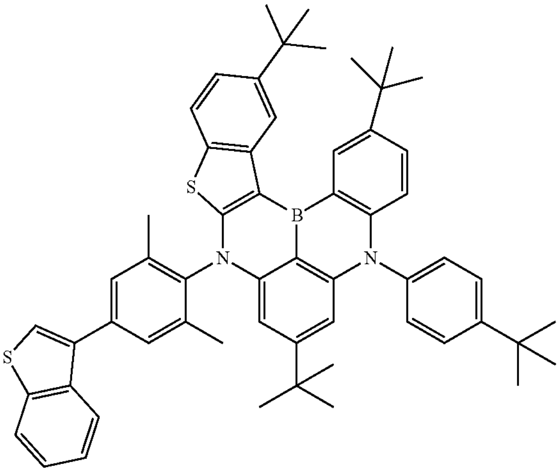

-continued
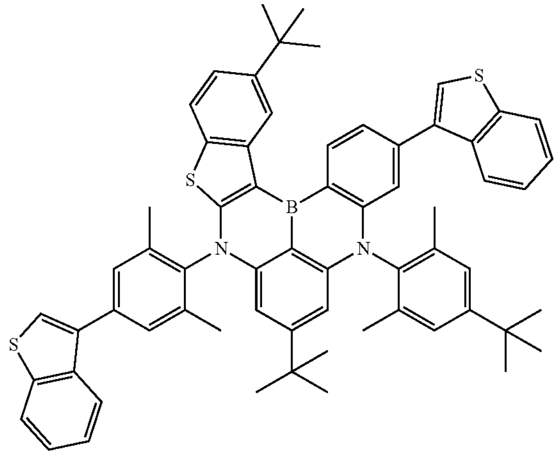
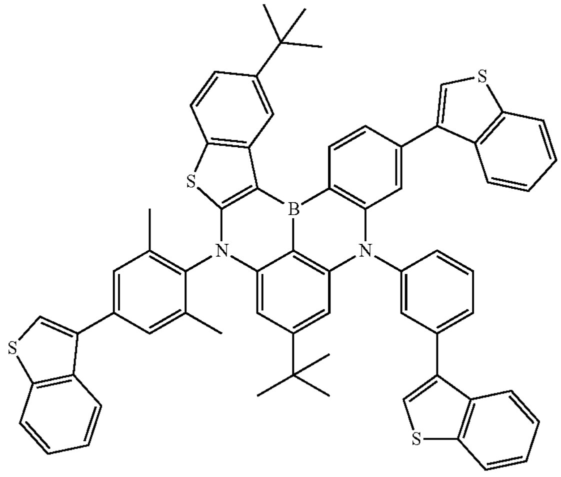
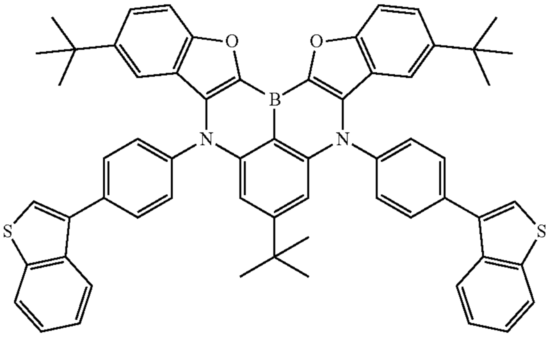
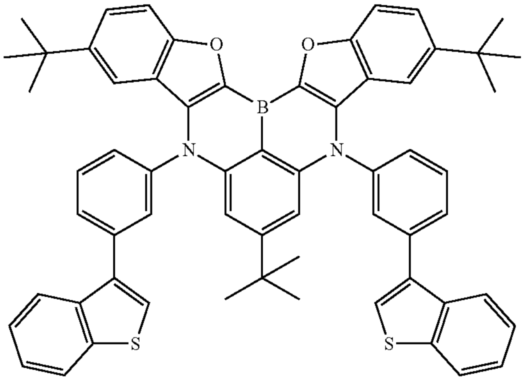
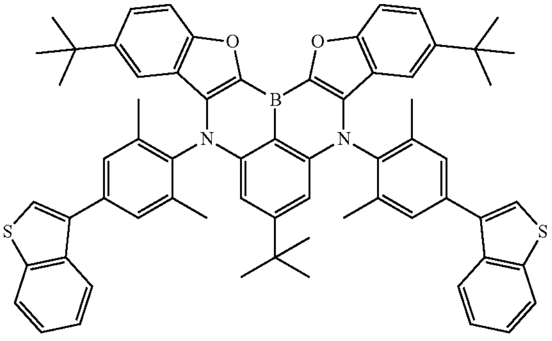
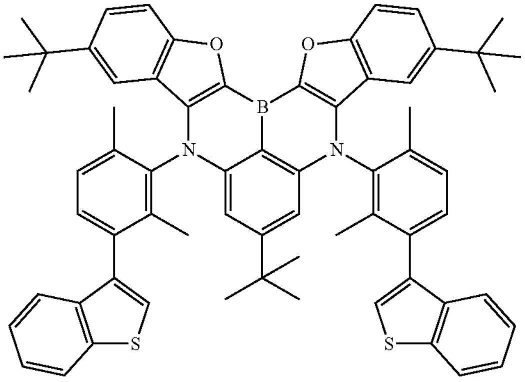
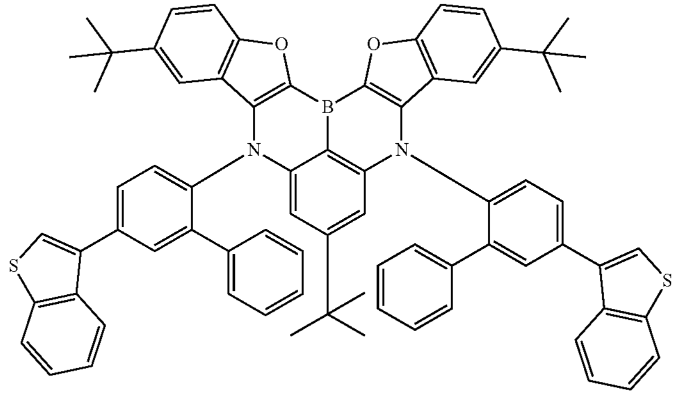

-continued
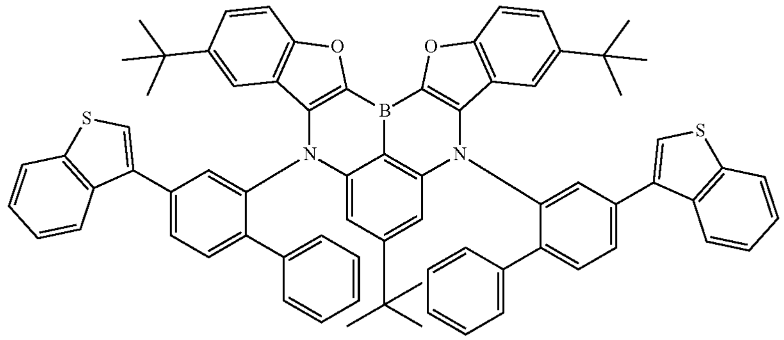
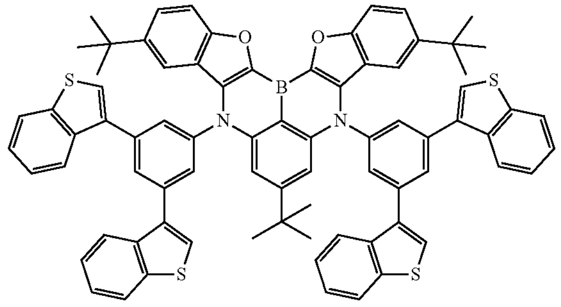
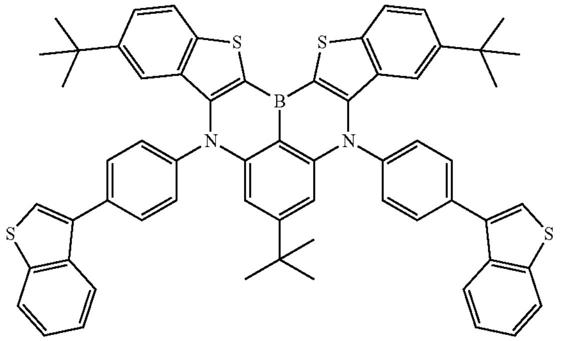
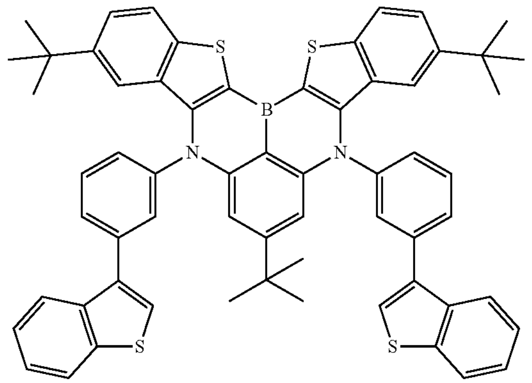
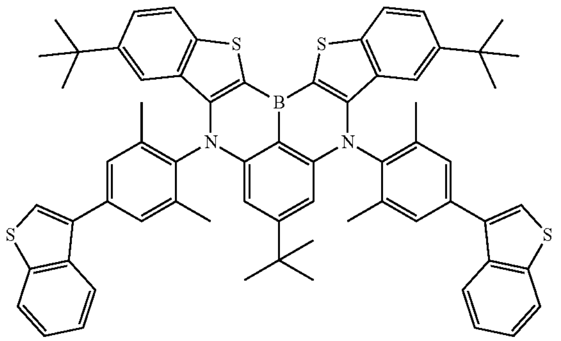
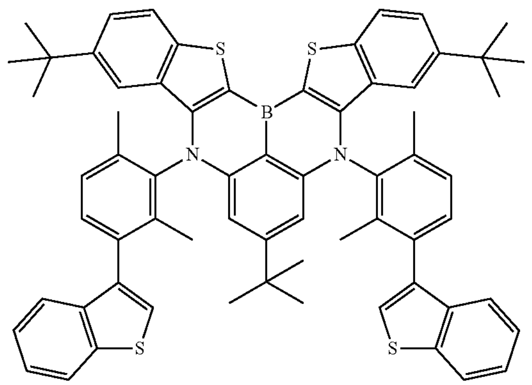
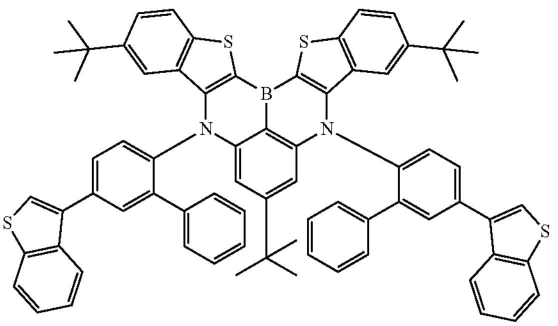

-continued
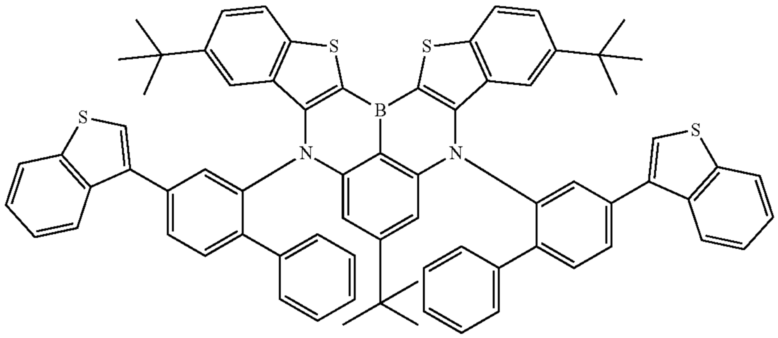
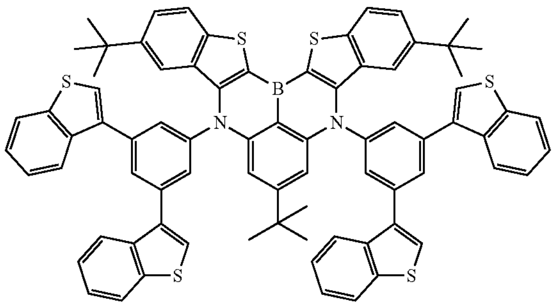
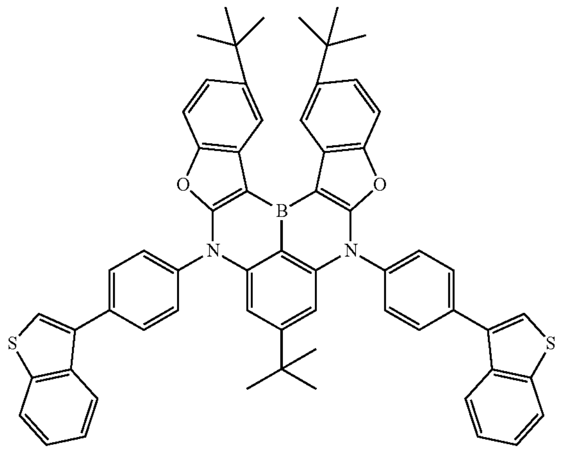
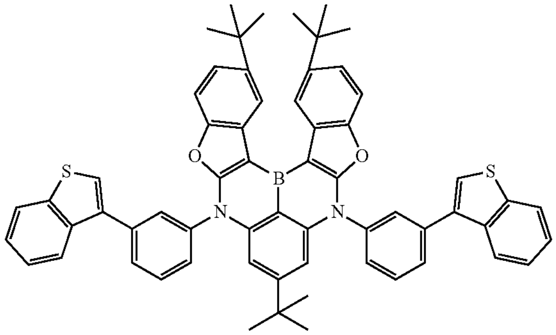
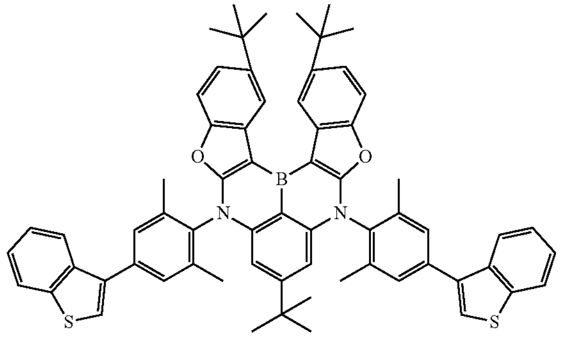
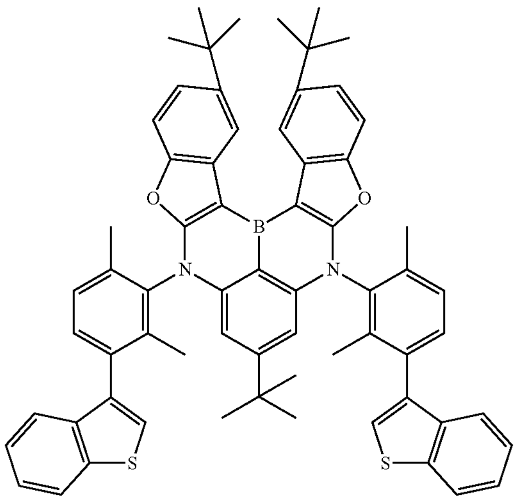

-continued
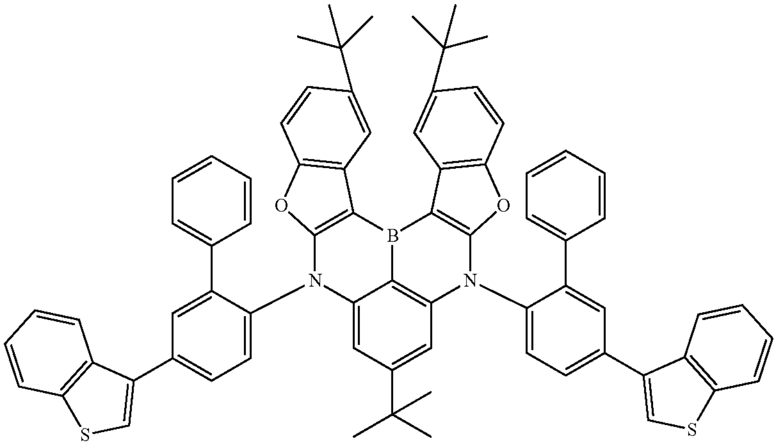
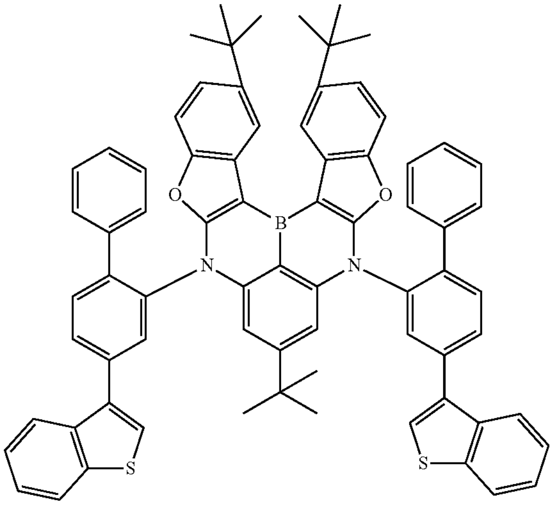
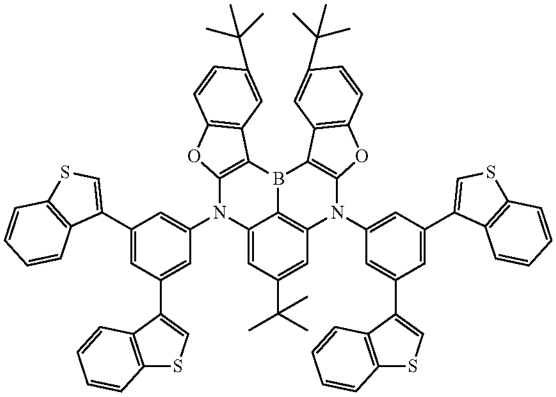
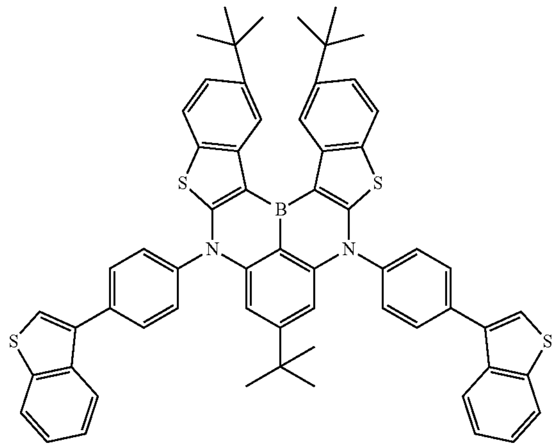
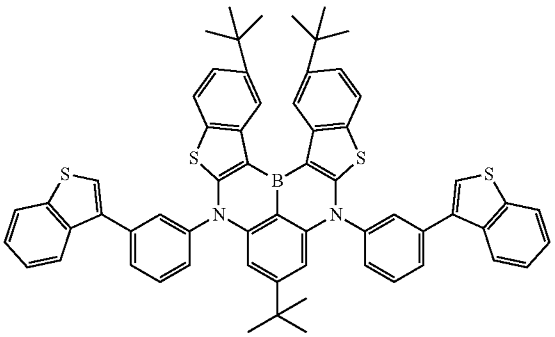

-continued
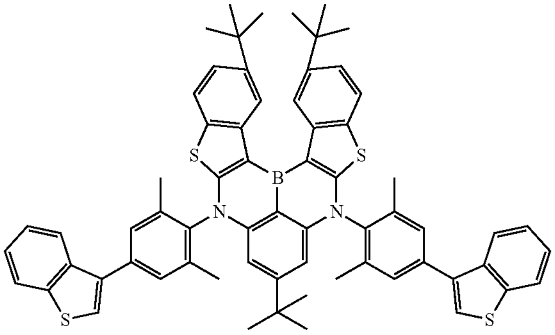
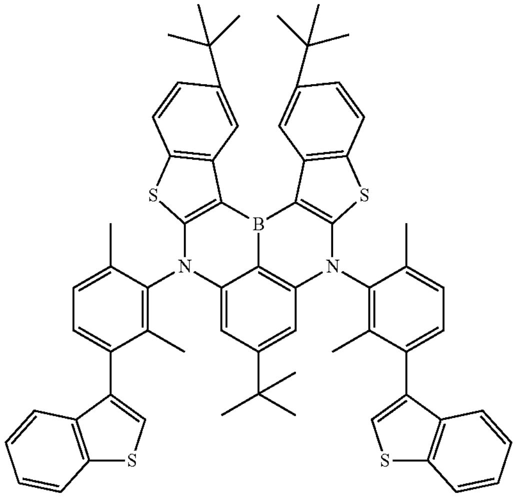
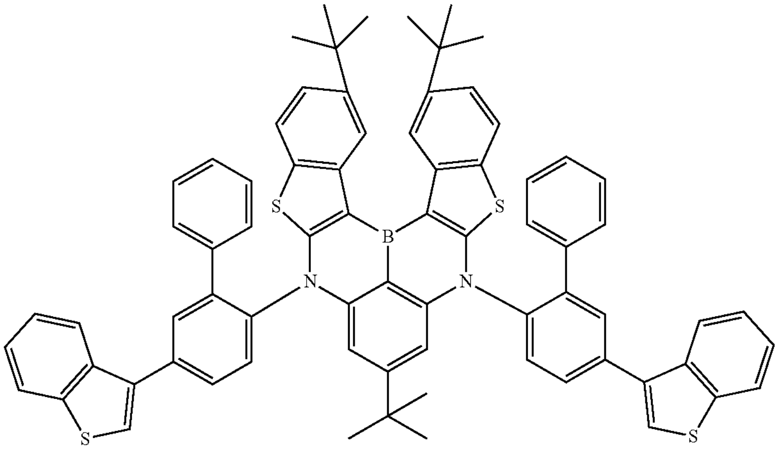
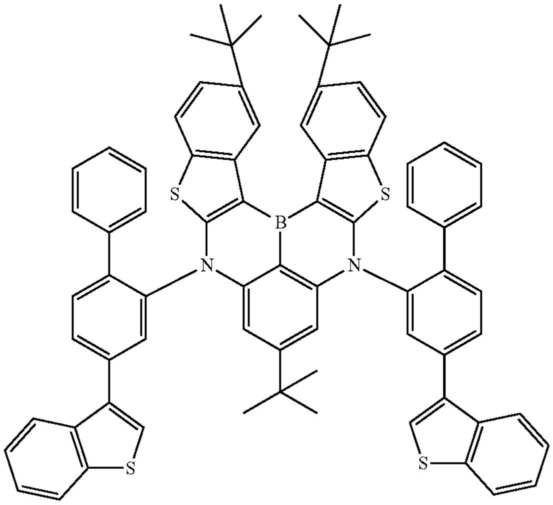
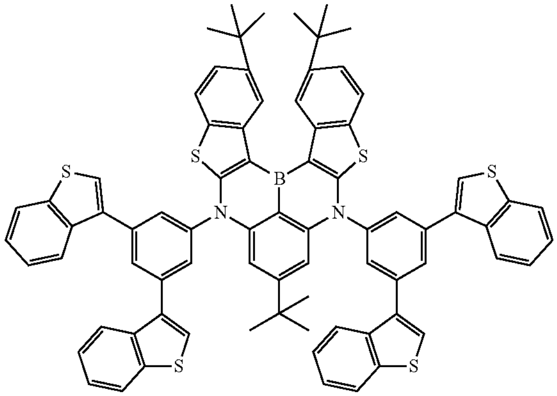

Meanwhile, the present disclosure provides a method for preparing the compound represented by Chemical Formula 1, as shown in the following Reaction Scheme 1 as an example.

[Reaction Scheme 1]

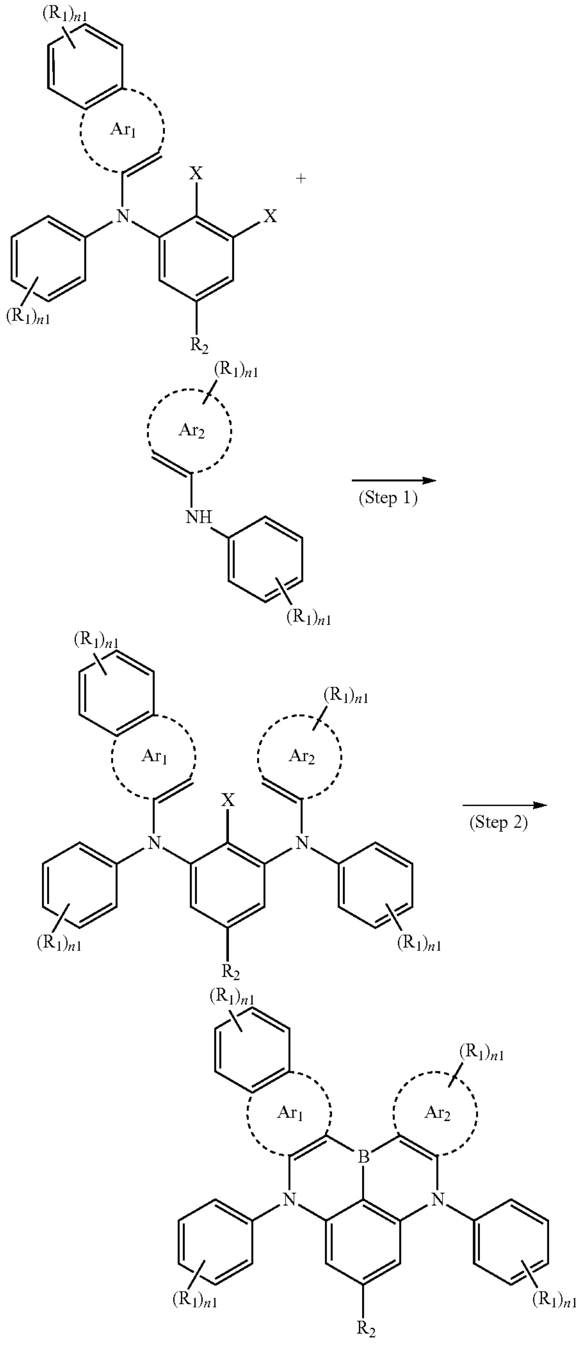

In Reaction Scheme 1, the definition of the remaining substituents except for X are the same as defined above, and X is halogen, preferably bromo or chloro.

Step 1 is an amine substitution reaction, which is preferably carried out in the presence of a palladium catalyst and a base, and a reactive group for the amine substitution reaction can be modified as known in the art. Step 2 is a reaction with $BI_3$, which is preferably carried out in the presence of a base. The above preparation method may be further embodied in Preparation Examples described hereinafter.

Meanwhile, the organic material layer including the compound according to the present disclosure can be formed using various methods such as a vacuum deposition method and a solution process, and the solution process will be described in detail below.

(Coating Composition)

The compound according to the present disclosure can form an organic material layer, particularly a light emitting layer, of an organic light emitting device by a solution process. For this purpose, the present disclosure provides a coating composition including the above-mentioned compound according to the present disclosure and a solvent.

The solvent is not particularly limited as long as it is a solvent capable of dissolving or dispersing the compound according to the present disclosure. Examples of the solvent may include chlorine-based solvents such as chloroform, methylene chloride, 1,2-dichloroethane, 1,1,2-trichloroethane, chlorobenzene and o-dichlorobenzene; ether-based solvents such as tetrahydrofuran and dioxane; aromatic hydrocarbon-based solvents such as toluene, xylene, trimethylbenzene, and mesitylene; aliphatic hydrocarbon-based solvents such as cyclohexane, methylcyclohexane, n-pentane, n-hexane, n-heptane, n-octane, n-nonane and n-decane; ketone-based solvents such as acetone, methyl ethyl ketone, and cyclohexanone; ester-based solvents such as ethyl acetate, butyl acetate and ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol, and derivatives thereof; alcohol-based solvents such as methanol, ethanol, propanol, isopropanol and cyclohexanol; sulfoxide-based solvents such as dimethyl sulfoxide; amide-based solvents such as N-methyl-2-pyrrolidone and N,N-dimethylformamide; benzoate-based solvents such as butylbenzoate, and methyl-2-methoxybenzoate; tetraline; 3-phenoxy-toluene, and the like. In addition, the above-mentioned solvents may be used singly or in combination of two or more solvents.

Further, the coating composition may further include a compound used as a host material, and the compound used for the host material will be described later. Further, the coating composition may include a compound used as a dopant material, and the compound used for the dopant material will be described later.

Further, the viscosity of the coating composition is preferably 1 cP or more. Also, in consideration of the easiness of coating the coating composition, the viscosity of the coating composition is preferably 10 cP or less. Moreover, the concentration of the compound according to the present disclosure in the coating composition is preferably 0.1 wt/v % or more. Further, the concentration of the compound according to the present disclosure in the coating composition is preferably 20 wt/v % or less, so that the coating composition is optimally coated.

In another embodiment of the present disclosure, there is provided a method for forming a light emitting layer using the above-mentioned coating composition. Specifically, the method includes the steps of: coating the above-mentioned light emitting layer according to the present disclosure onto the anode by a solution process; and heat-treating the coated coating composition.

The solution process uses the above-mentioned coating composition according to the present disclosure, and refers to spin coating, dip coating, doctor blading, inkjet printing, screen printing, spray method, roll coating, and the like, but is not limited thereto.

The heat treatment temperature in the heat treatment step is preferably from 150 to 230° C. Further, a heat treatment time may be 1 minute to 3 hours, more preferably 10 minutes to 1 hour. Further, the heat treatment is preferably carried out in an inert gas atmosphere such as argon and nitrogen.

(Organic Light Emitting Device)

In another embodiment of the present disclosure, there is provided an organic light emitting device including the compound represented by Chemical Formula 1. In one example, the present disclosure provides an organic light emitting device comprising: a first electrode; a second electrode that is provided opposite to the first electrode; and one or more organic material layers that are provided between the first electrode and the second electrode, wherein one or more layers of the organic material layers include the compound represented by Chemical Formula 1.

The organic material layer of the organic light emitting device of the present disclosure may have a single-layer structure, or it may have a multilayered structure in which two or more organic material layers are stacked. For example, the organic light emitting device of the present disclosure may have a structure comprising a hole injection layer, a hole transport layer, a light emitting layer, an electron transport layer, an electron injection layer and the like as the organic material layer. However, the structure of the organic light emitting device is not limited thereto, and it may include a smaller number of organic layers.

Further, the organic material layer may include a light emitting layer, wherein the light emitting layer may include the compound represented by Chemical Formula 1. Particularly, the compound according to the present disclosure can be used as a dopant of the light emitting layer.

Further, the organic light emitting device according to the present disclosure may be a normal type organic light emitting device in which an anode, one or more organic material layers and a cathode are sequentially stacked on a substrate. Further, the organic light emitting device according to the present disclosure may be an inverted type organic light emitting device in which a cathode, one or more organic material layers and an anode are sequentially stacked on a substrate. For example, the structure of an organic light emitting device according to an embodiment of the present disclosure is illustrated in FIGS. 1 and 2.

FIG. 1 shows an example of an organic light emitting device comprising a substrate 1, an anode 2, a light emitting layer 3, and a cathode 4. In such a structure, the compound represented by Chemical Formula 1 may be included in the light emitting layer.

FIG. 2 shows an example of an organic light emitting device comprising a substrate 1, an anode 2, a hole injection layer 5, a hole transport layer 6, a light emitting layer 7, an electron injection and transport layer 8, and a cathode 4. In such a structure, the compound represented by Chemical Formula 1 may be included in the light emitting layer.

The organic light emitting device according to the present disclosure may be manufactured by materials and methods known in the art, except that at least one of the organic material layers includes the compound represented by Chemical Formula 1. Further, when the organic light emitting device includes a plurality of organic material layers, the organic material layers may be formed of the same material or different materials.

For example, the organic light emitting device according to the present disclosure can be manufactured by sequentially stacking an anode, an organic material layer and a cathode on a substrate. In this case, the organic light emitting device may be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon.

In addition to such a method, the organic light emitting device may be manufactured by sequentially depositing a cathode material, an organic material layer and an anode material on a substrate (International Publication WO 2003/012890). However, the manufacturing method is not limited thereto.

In one example, the first electrode is an anode, and the second electrode is a cathode, or alternatively, the first electrode is a cathode and the second electrode is an anode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive compounds such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole injecting effect to the light emitting layer or the light emitting material, prevents excitons produced in the light emitting layer from moving to a hole injection layer or the electron injection material, and further is excellent in the ability to form a thin film. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

The hole transport layer is a layer that receives holes from a hole injection layer and transports the holes to the light emitting layer. The hole transport material is suitably a material having large mobility to the holes, which may receive holes from the anode or the hole injection layer and transfer the holes to the light emitting layer. Specific examples thereof include an arylamine-based organic material, a conductive compound, a block copolymer in which a conjugate portion and a non-conjugate portion are present together, and the like, but are not limited thereto.

The light emitting layer may include a host material and a dopant material. The host material may be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

Examples of the dopant material include an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

The electron injection and transport layer is a layer for simultaneously performing the roles of an electron transport layer and an electron injection layer that inject electrons from an electrode and transport the received electrons up to the light emitting layer, and is formed on the light emitting layer or the electron adjustment layer. The electron injection and transport material is suitably a material which can receive electrons well from a cathode and transfer the electrons to a light emitting layer, and has a large mobility for electrons. Specific examples of the electron injection and transport material include: an Al complex of 8-hydroxyquinoline; a complex including $Alq_3$; an organic radical compound; a hydroxyflavone-metal complex, a triazine derivative, and the like, but are not limited thereto. Alternatively, LiF, NaF, NaCl, CsF, $Li_2O$, BaO, fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like can be used, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

In addition to the above-mentioned materials, the light emitting layer, the hole injection layer, the hole transport layer, the electron transport layer, and the electron injection layer may further include an inorganic compound or a polymer compound such as quantum dots.

The quantum dots may be, for example, colloidal quantum dots, alloy quantum dots, core-shell quantum dots, or core quantum dots. The quantum dots may be quantum dots including elements belonging to groups 2 and 16, elements belonging to groups 13 and 15, elements belonging to groups 13 and 17, elements belonging to groups 11 and 17, or elements belonging to groups 14 and 15. Quantum dots including elements such as cadmium (Cd), selenium (Se), zinc (Zn), sulfur (S), phosphorus (P), indium (In), tellurium (Te), lead (Pb), gallium (Ga) or arsenic (As) may be used.

The organic light emitting device according to the present disclosure may be a bottom emission device, a top emission device, or a double-sided light emitting device, and in particular, may be a bottom emission device that requires relatively high luminous efficiency.

In addition, the compound according to the present disclosure may be included in an organic solar cell or an organic transistor in addition to an organic light emitting device.

The preparation of the compound represented by Chemical Formula 1 and the organic light emitting device including the same will be specifically described in the following Examples. However, the following Examples are provided for illustrative purposes only, and are not intended to limit the scope of the present disclosure.

EXAMPLE

Example 1: Preparation of Compound 1

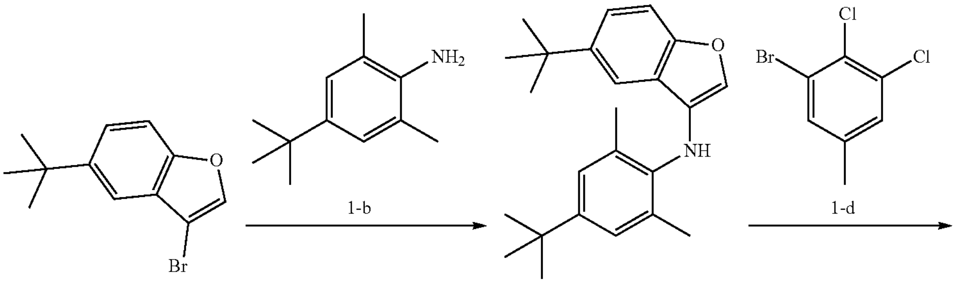
1-a 1-b 1-c 1-d

-continued

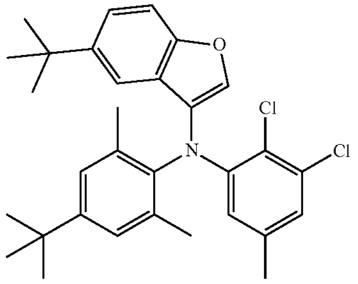

1-e

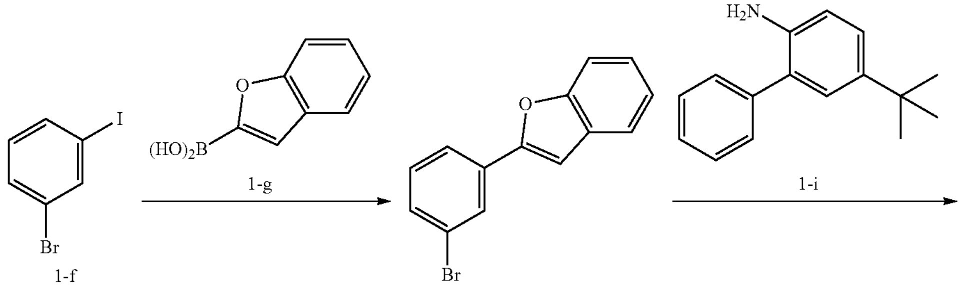

1-f 1-h

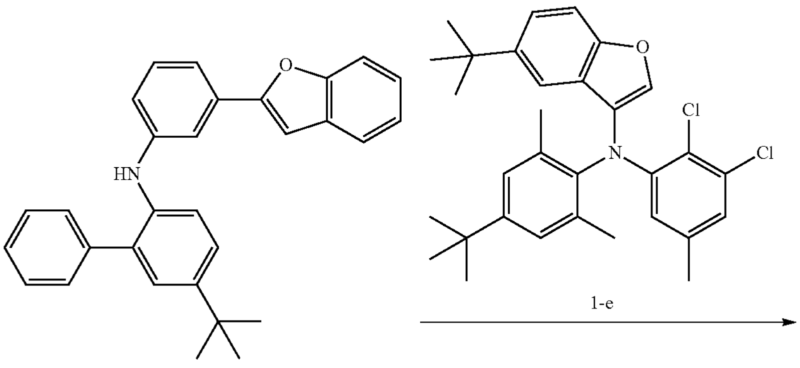

1-j

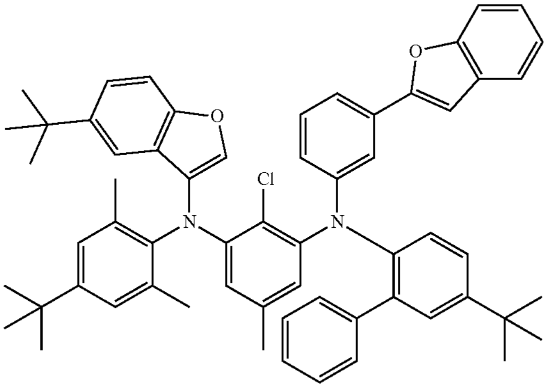

1-k

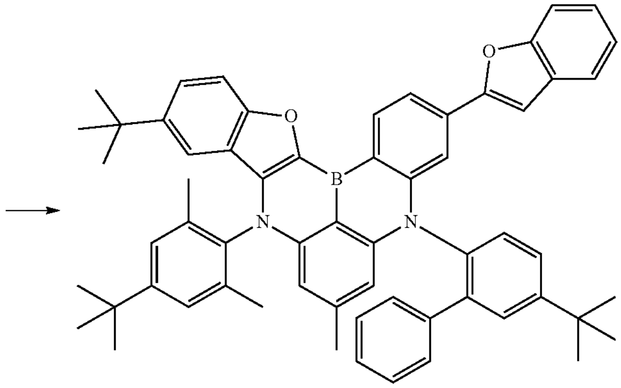

1

Compound 1-a (1.0 eq.), NaOt-Bu (4 eq.), and 1-b (1.05 eq.) were placed in a round bottom flask and dissolved in anhydrous toluene (0.1 M). $Pd(t-Bu_3P)_2$ (5 mol %) was added dropwise thereto at a bath temperature of 10000, and the mixture was stirred for 2 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 1-c (Yield: 76%).

Compound 1-d (1.0 eq.), NaOt-Bu (4 eq.), and Compound 1-c (1.05 eq.) were placed in a round bottom flask and dissolved in anhydrous toluene (0.1 M). $Pd(t-BU_3P)_2$ (5 mol %) was added dropwise thereto at a bath temperature of 120° C., and the mixture was stirred for 4 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 1-e (Yield: 81%).

Compound 1-f (1.0 eq.) and Compound 1-g (1.05 eq.) were placed in a round bottom flask and dissolved in anhydrous THF (0.1 M). $K_2CO_3$ (aq.) (1.5 eq.) was dropwise added to the reaction solution. $Pd(PPh_3)_4$ (1.5 mol %) was added dropwise thereto at a bath temperature of 80° C., and the mixture was stirred for 2 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 1-h (Yield: 62%).

Compound 1-h (1.0 eq.), NaOt-Bu (4 eq.), and Compound 1-i (1.05 eq.) were placed in a round bottom flask and dissolved in anhydrous toluene (0.1 M). $Pd(t\text{-}Bu_3P)_2$ (5 mol %) was added dropwise thereto at a bath temperature of 100° C., and the mixture was stirred for 2 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 1-j (Yield: 76%).

Compound 1-e (1.0 eq.), NaOt-Bu (4 eq.), and Compound 1-j (1.05 eq.) were placed in a round bottom flask and dissolved in anhydrous toluene (0.1 M). $Pd(t\text{-}Bu_3P)_2$ (5 mol %) was added dropwise thereto at a bath temperature of 100° C., and the mixture was stirred overnight. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 1-k (Yield: 71%).

Compound 1-k (1.0 eq.) was placed in a round bottom flask and dissolved in anhydrous toluene (0.03 M). $BI_3$ (2.0 eq.) was added dropwise thereto, and the mixture was stirred overnight at a bath temperature of 80° C. After the reaction, the reaction mixture was cooled at room temperature and sufficiently diluted with $CH_2Cl_2$. $EtNi\text{-}Pr_2$ (15.0 eq.) and sat. $Na_2S_2O_3$ (aq.) were sequentially dropwise added to the reaction mixture, washed with $CH_2Cl_2$/brine, and the organic layer was separated. Water was removed with $MgSO_4$ and passed through a Celite-Florisil-Silica pad. The passed solution was concentrated under reduced pressure, and then purified by column chromatography to prepare Compound 1 (Yield: 71%).

m/z $[M+H]^+$ 863.5

Example 2: Preparation of Compound 2

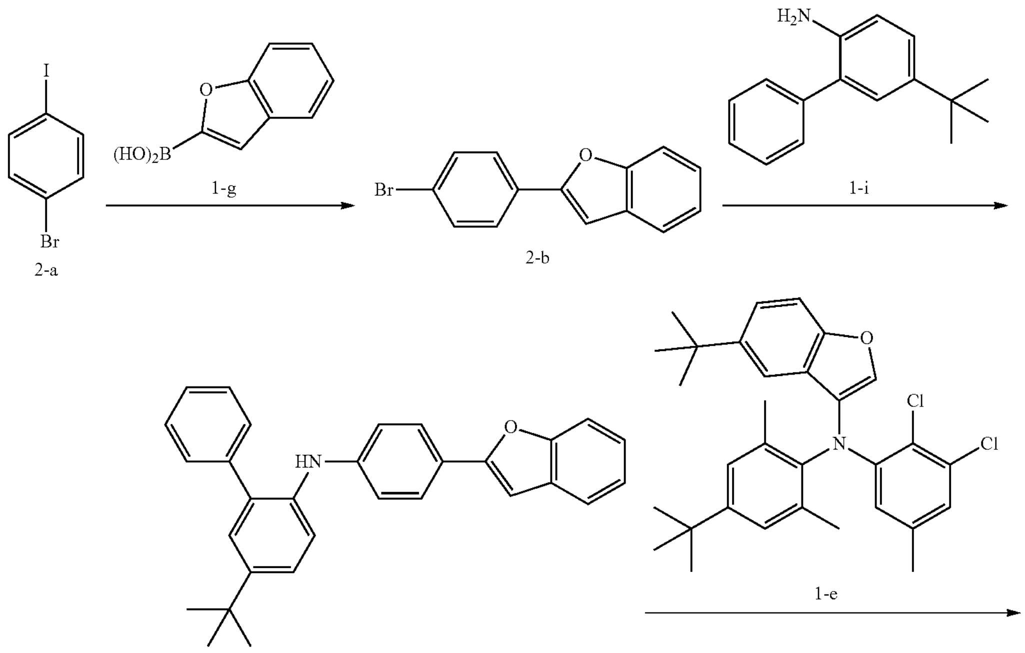

2-a 2-b 2-c

-continued

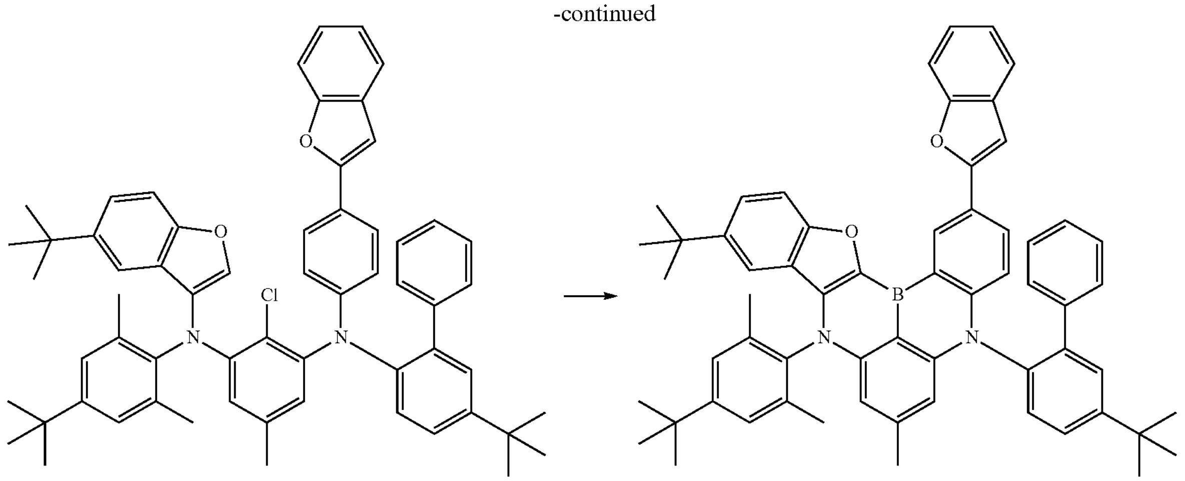

2-d

2

Compound 2 was prepared in the same manner as in the preparation method of Compound 1, except that Compound 2-a was used instead of Compound 1-f.

m/z $[M+H]^+$ 863.4

Example 3: Preparation of Compound 3

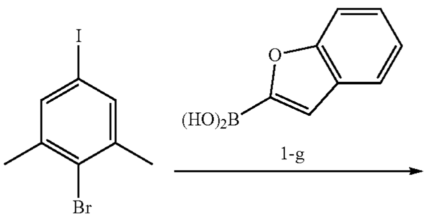

3-a 1-g

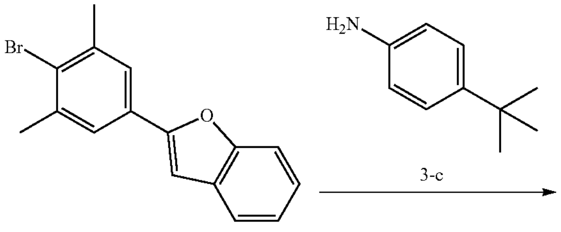

3-b 3-c

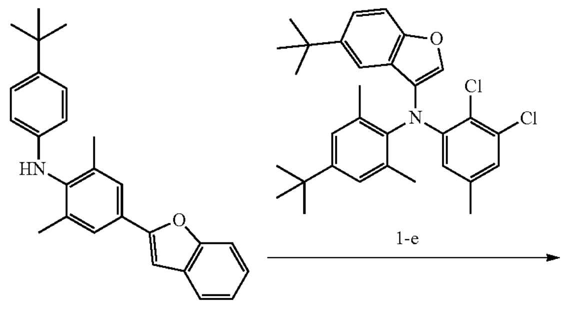

3-d 1-e

-continued

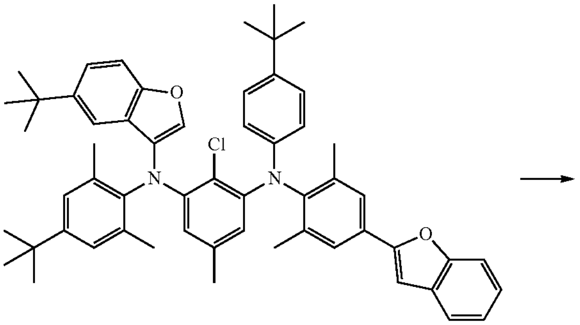

3-e

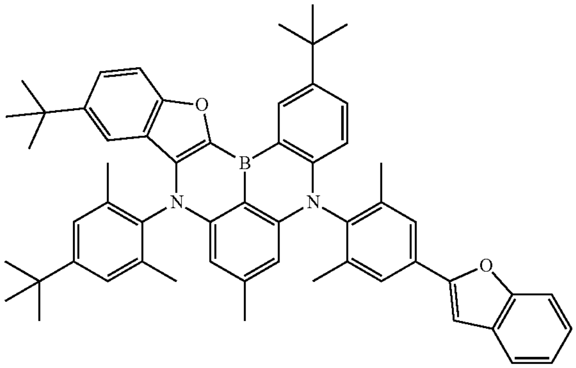

3

Compound 3 was prepared in the same manner as in the preparation method of Compound 1, except that Compound 3-a was used instead of Compound 1-f, and Compound 3-c was used instead of Compound 1-i.

m/z $[M+H]^+$ 815.5

Example 4: Preparation of Compound 4
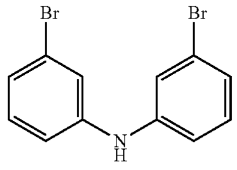
4-a
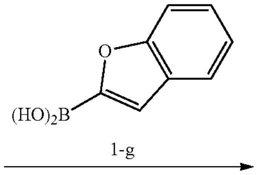
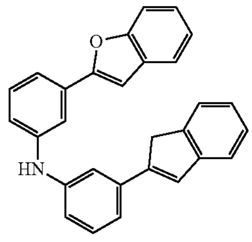
4-b
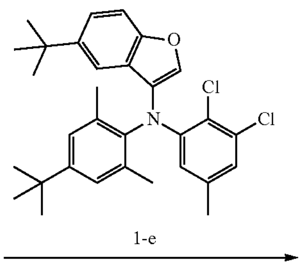
-continued
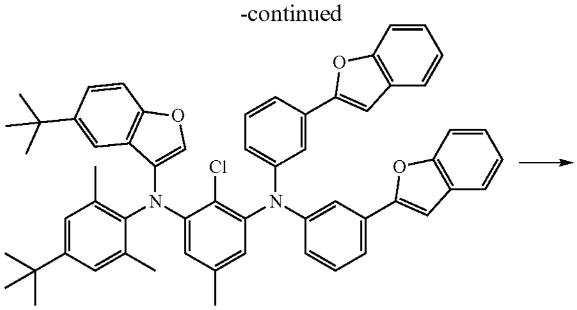
4-c
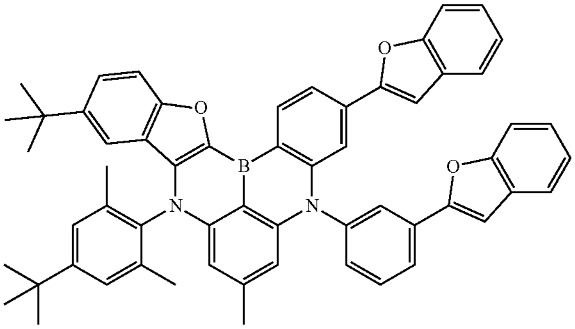
4
Compound 4 was prepared in the same manner as in the preparation method of Compound 1, except that Compound 4-a was used instead of Compound 1-f.
m/z $[M+H]^+$ 847.6
Example 5: Preparation of Compound 5
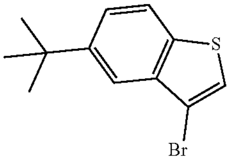
5-a
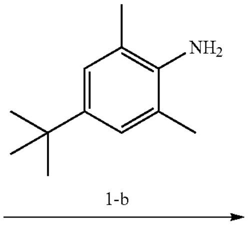
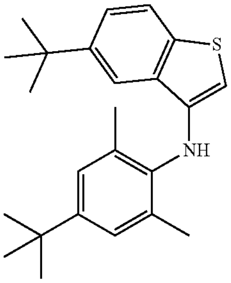
5-b
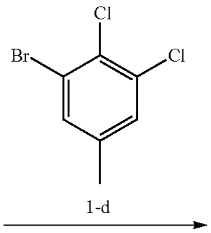
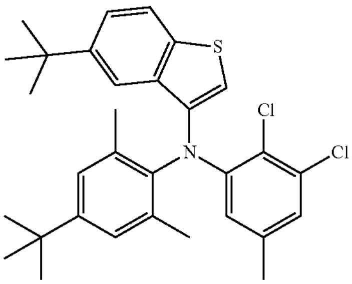
5-c -continued
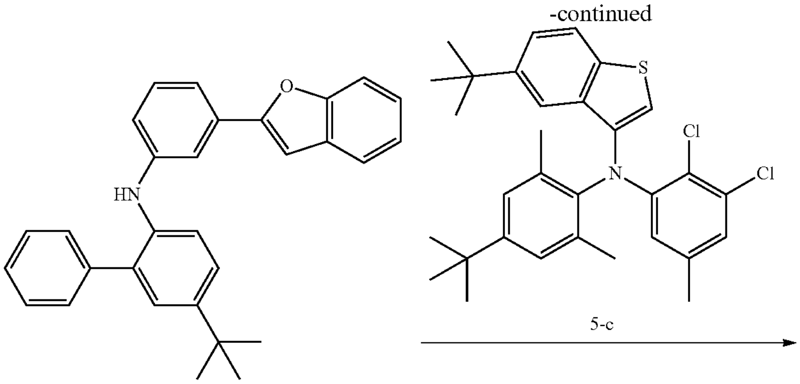
1-j
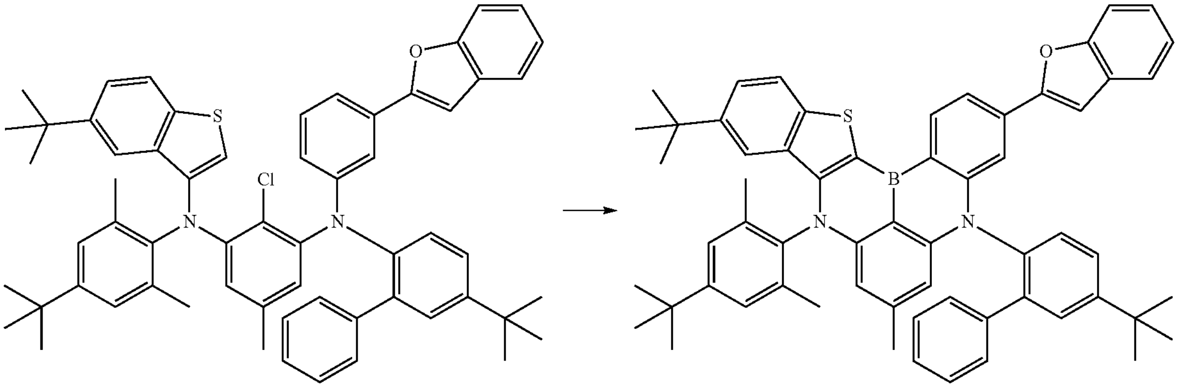
5-d 5
Compound 6 was prepared in the same manner as in the preparation method of Compound 5, except that Compound 2-c was used instead of Compound 1-j.
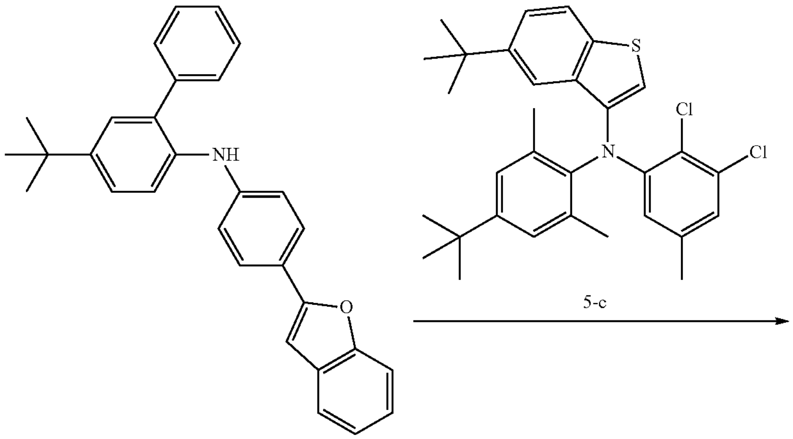
2-c -continued
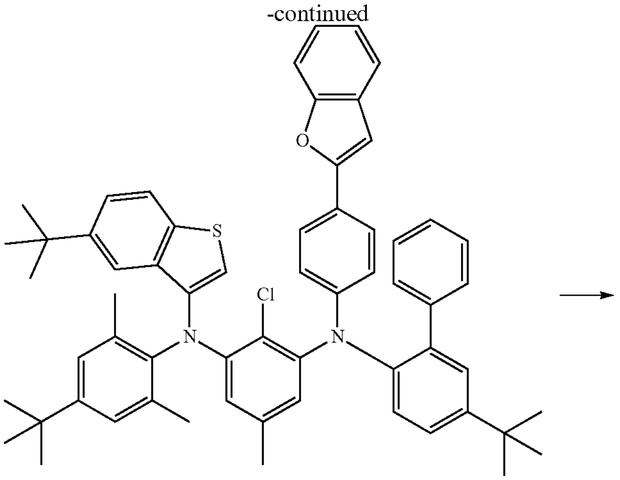
6-a
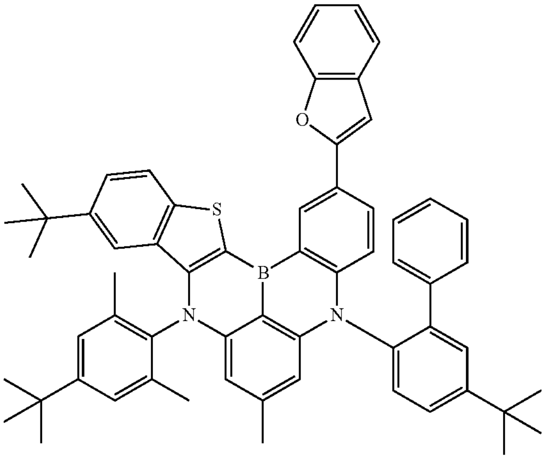
6
m/z $[M+H]^+$ 879.4
-continued
Example 7: Preparation of Compound 7
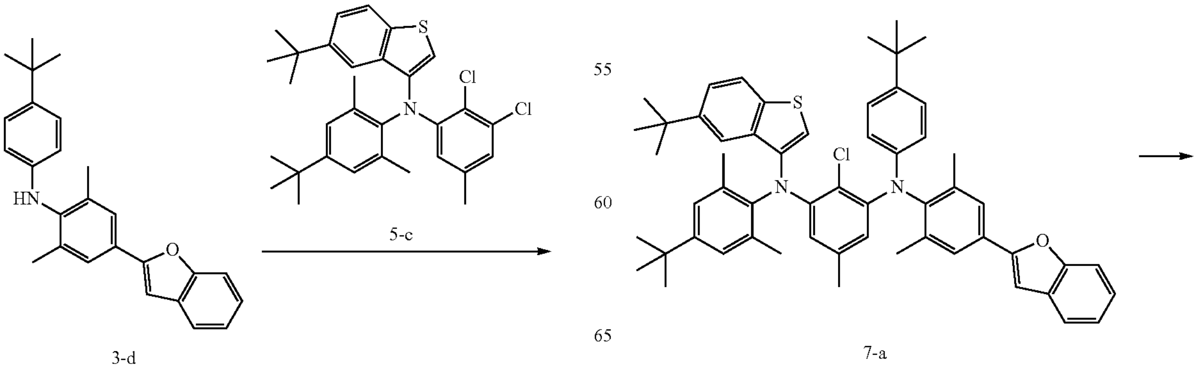
3-d
5-c
7-a -continued

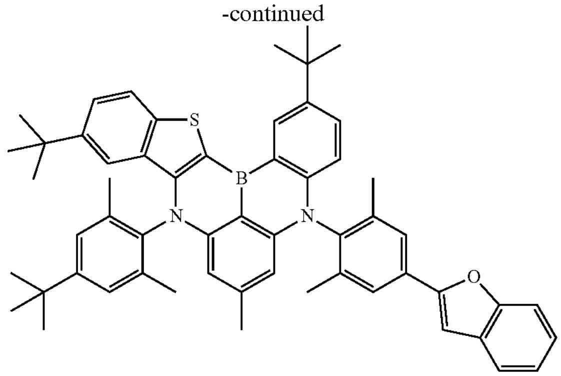

7

Compound 7 was prepared in the same manner as in the preparation method of Compound 5, except that Compound 3-d was used instead of Compound 1-j.

m/z $[M+H]^+$ 831.4

Example 8: Preparation of Compound 8

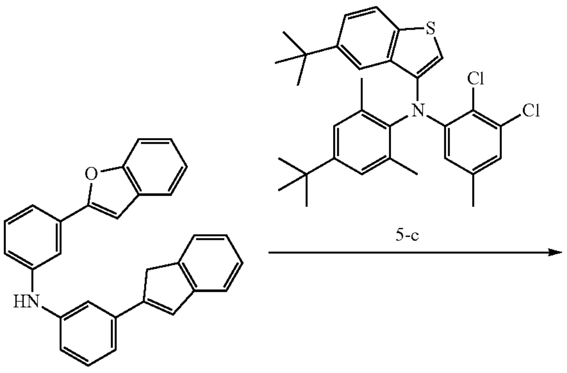

4-b 5-c

-continued

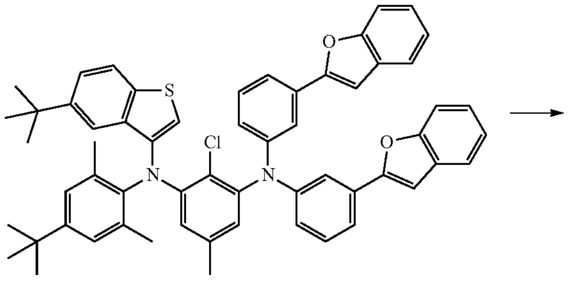

8-a

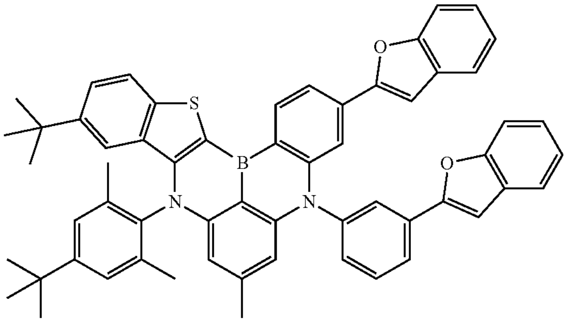

8

Compound 8 was prepared in the same manner as in the preparation method of Compound 5, except that Compound 4-b was used instead of Compound 1-j.

m/z $[M+H]^+$ 863.4

Example 9: Preparation of Compound 9

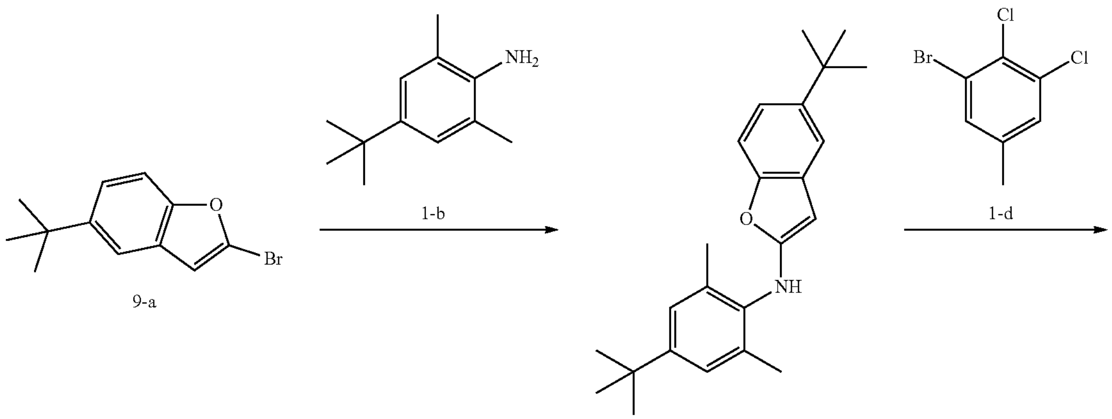

9-a 1-b 1-d 9-b

-continued
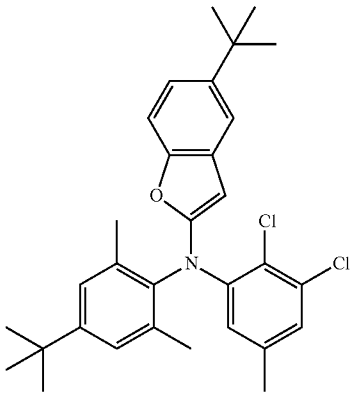
9-c
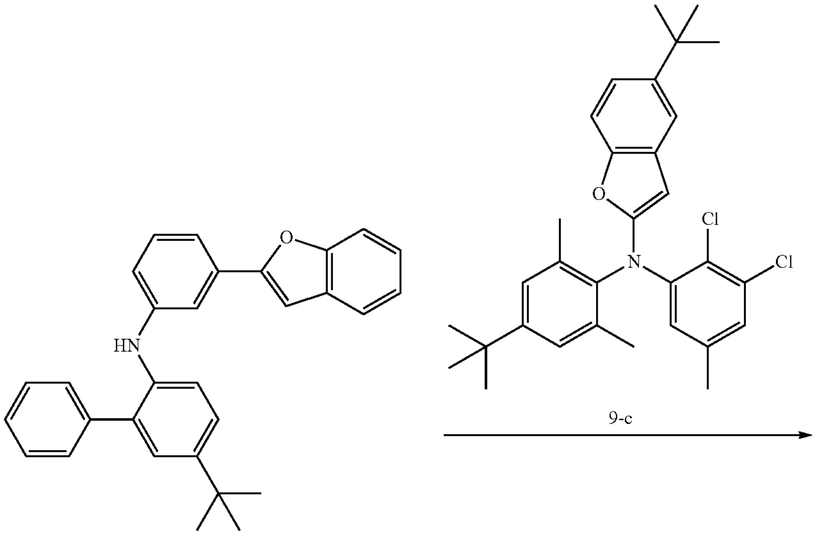
1-j
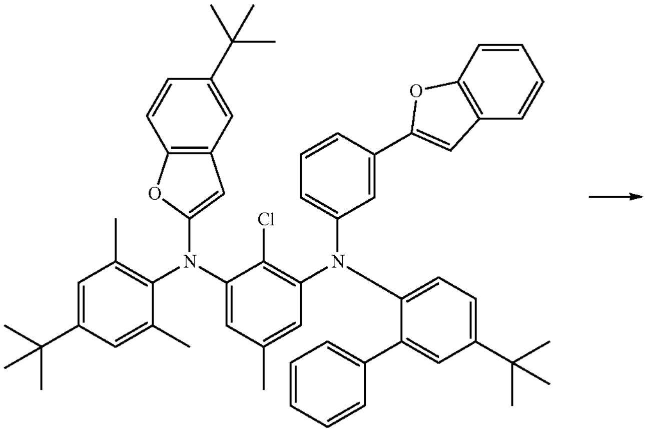
9-d

-continued
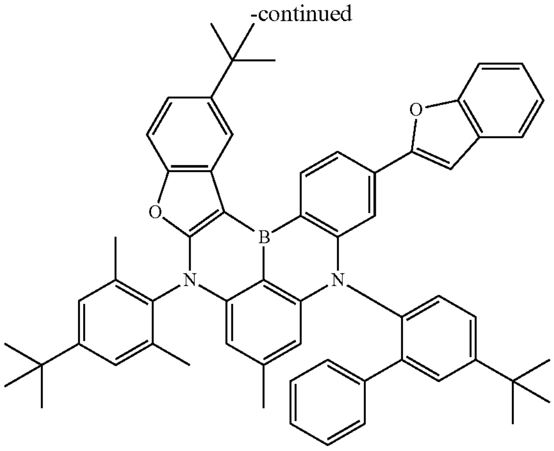
9
Compound 9 was prepared in the same manner as in the preparation method of Compound 1, except that Compound 9-a was used instead of Compound 1-a.
m/z $[M+H]^+$ 863.5
Example 10: Preparation of Compound 10
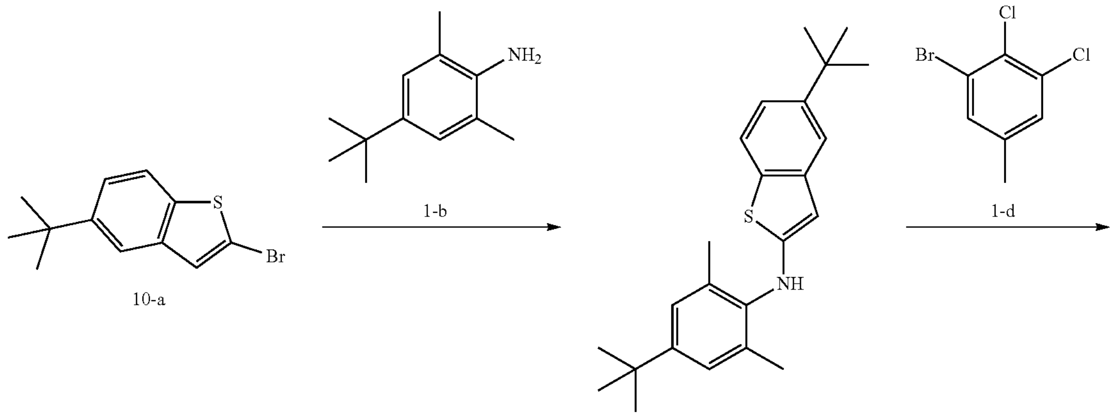
10-a
10-b
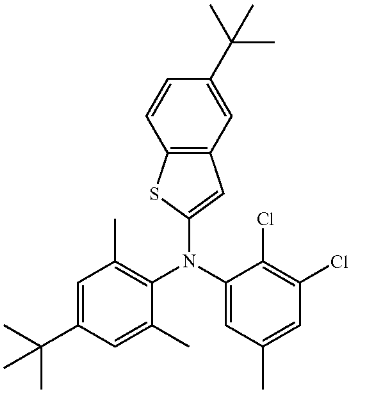
10-c -continued
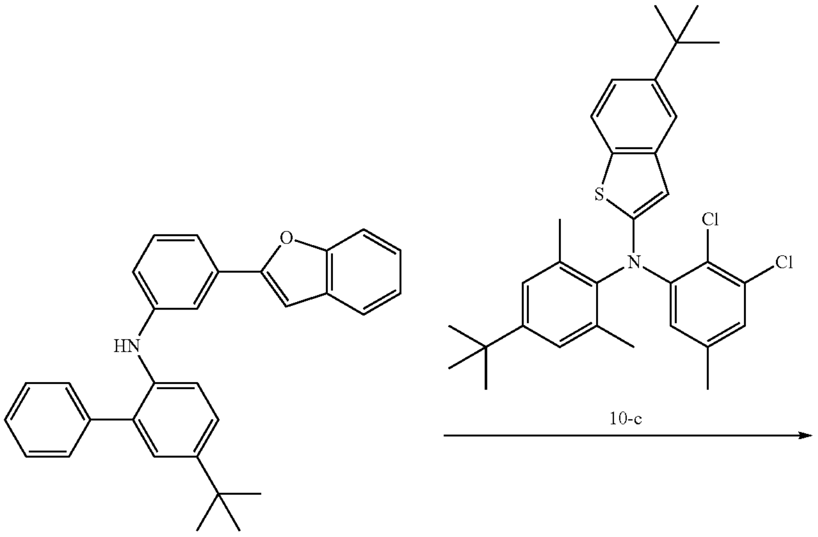
1-j
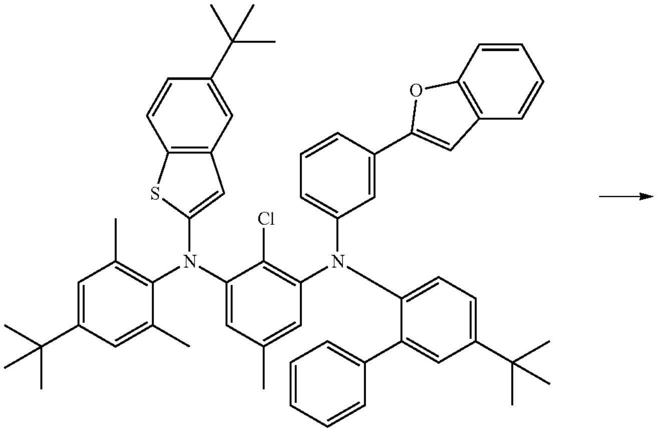
10-d
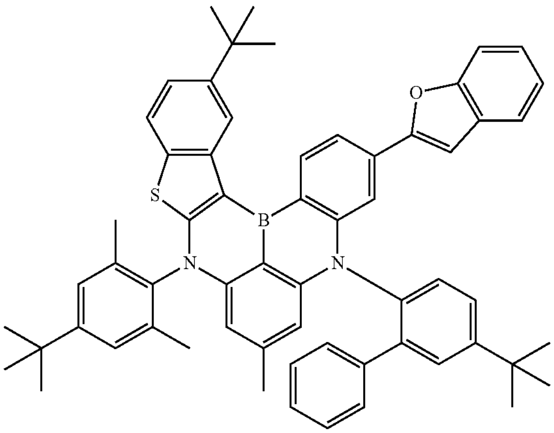
10

Compound 10 was prepared in the same manner as in the preparation method of Compound 1, except that Compound 10-a was used instead of Compound 1-a.

m/z $[M+H]^+$ 879.2

Example 11: Preparation of Compound 11 and dissolved in anhydrous toluene (0.1 M). $Pd(t-Bu_3P)_2$ (5 mol %) was added dropwise thereto at a bath temperature of 100° C., and the mixture was stirred for 4 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-

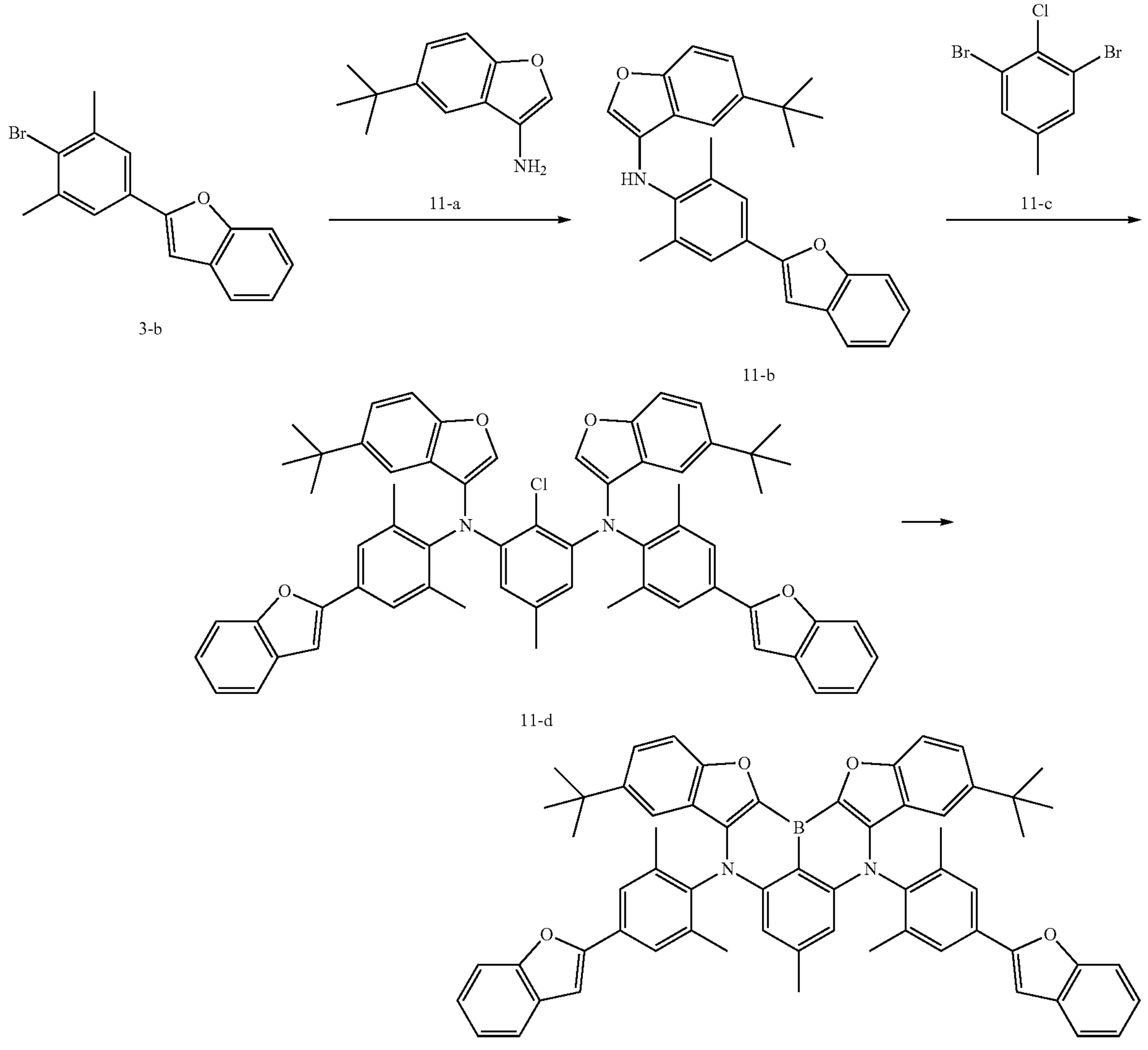

3-b 11-b 11-d

11

Compound 3-b (1.0 eq.), NaOt-Bu (4 eq.), and Compound 11-a (1.05 eq.) were placed in a round bottom flask and dissolved in anhydrous toluene (0.1 M). $Pd(t-Bu_3P)_2$ (5 mol %) was added dropwise thereto at a bath temperature of 100° C., and the mixture was stirred for 2 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 11-b (Yield: 81%).

Compound 11-c (1.0 eq.), NaOt-Bu (4 eq.), and Compound 11-a (1.05 eq.) were placed in a round bottom flask Silica pad. The passed solution was concentrated under reduced pressure, and then purified by column chromatography to prepare Compound 11-d (Yield: 79%).

Compound 11-d (1.0 eq.) was placed in a round bottom flask and dissolved in anhydrous toluene (0.03 M). $BI_3$ (2.0 eq.) was added dropwise thereto, and the mixture was stirred overnight at a bath temperature of 80° C. After the reaction, the reaction mixture was sufficiently cooled at room temperature and diluted with $CH_2Cl_2$. EtNi-$Pr_2$ (15.0 eq.) and sat. $Na_2S_2O_3$ (aq.) were sequentially dropwise added to the reaction mixture, washed with $CH_2Cl_2$/brine, and the organic layer was separated. Water was removed with $MgSO_4$ and passed through a Celite-Florisil-Silica pad. The passed solution was concentrated under reduced pressure, and then purified by column chromatography to prepare Compound 11 (Yield: 72%).

m/z $[M+H]^+$ 915.2

Example 12: Preparation of Compound 12

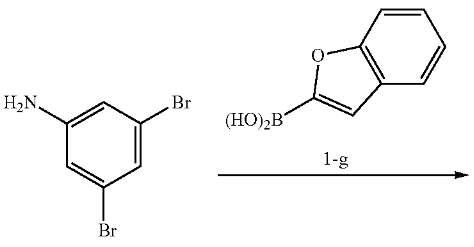

12-a 1-g

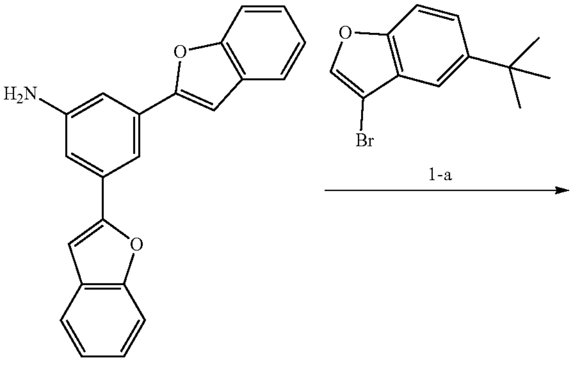

12-b 1-a

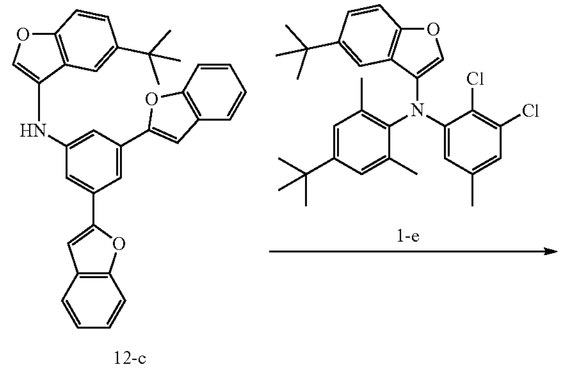

12-c 1-e

-continued

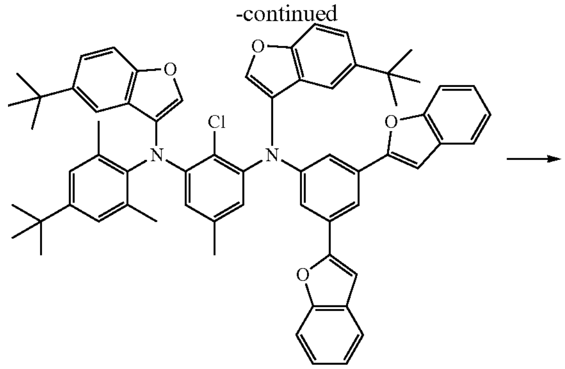

12-d

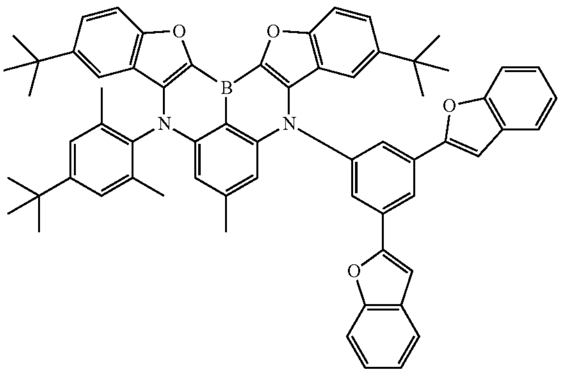

12

Compound 12-a (1.0 eq.) and Compound 1-g (1.05 eq.) were placed in a round bottom flask and dissolved in anhydrous THF (0.1 M). $K_2CO_3$ (aq.) (3 eq.) was dropwise added to the reaction solution. $Pd(PPh_3)_4$ (3 mol %) was added dropwise thereto at a bath temperature of 80° C., and the mixture was stirred for 4 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 12-b (Yield: 78%).

Compound 1-a (1.0 eq.), NaOt-Bu (4 eq.), and Compound 12-b (1.05 eq.) were placed in a round bottom flask and dissolved in anhydrous toluene (0.1 M). $Pd(t\text{-}Bu_3P)_2$ (5 mol %) was added dropwise thereto at a bath temperature of 100° C., and the mixture was stirred for 2 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 12-c (Yield: 82%).

Then, Compound 12 was prepared in the same manner as in the preparation method of Compound 1, except that Compound 12-c was used instead of Compound 1-j.

m/z $[M+H]^+$ 943.6

Example 13: Preparation of Compound 13
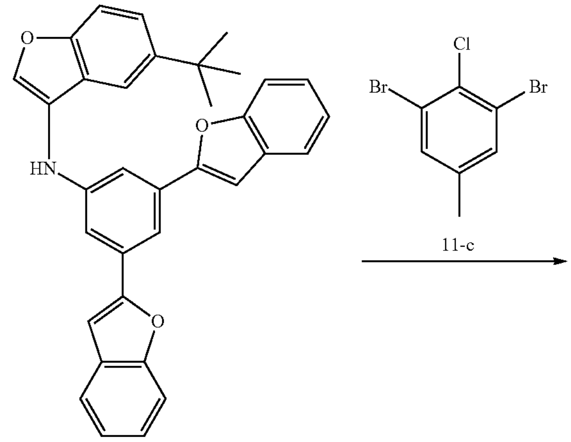
12-c
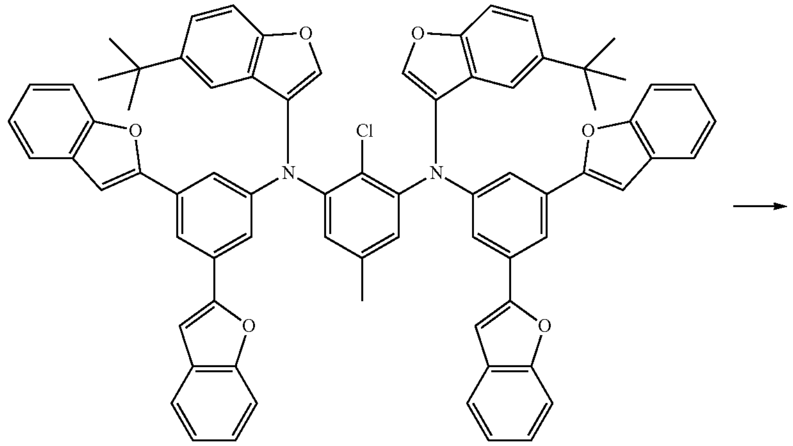
13-a
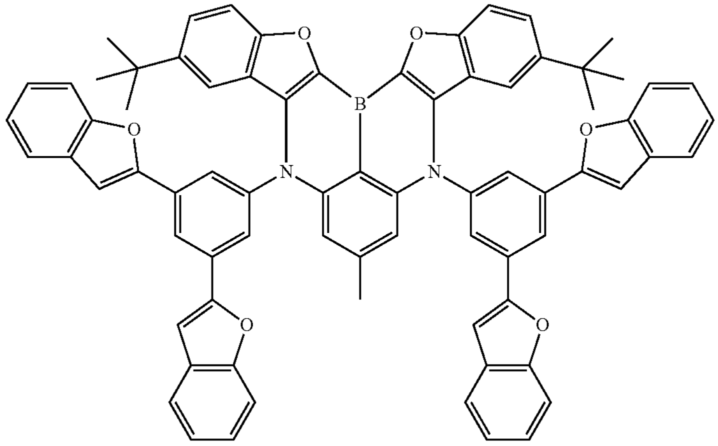
13
Compound 13 was prepared in the same manner as in the preparation method of Compound 11, except that Compound 12-c was used instead of Compound 11-b.
m/z $[M+H]^+$ 1091.2

Example 14: Preparation of Compound 14

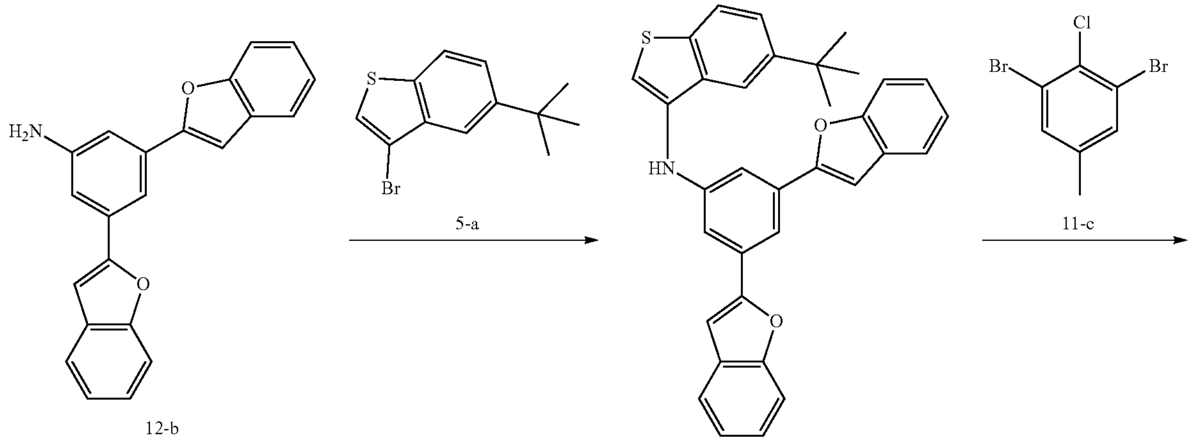

12-b 14-a

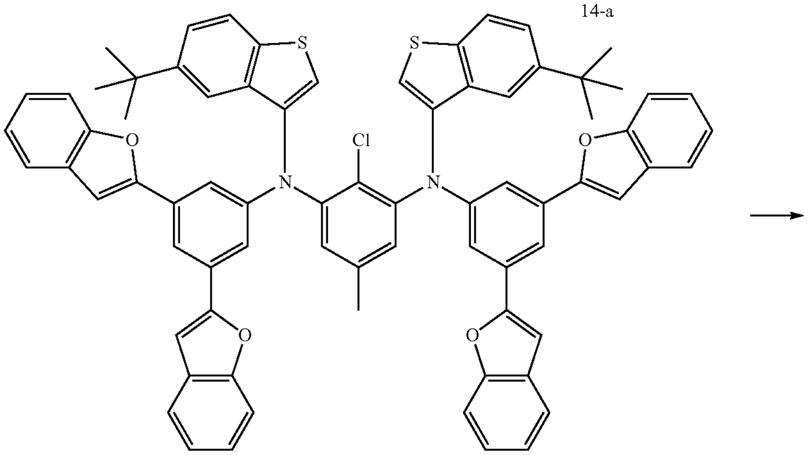

14-b

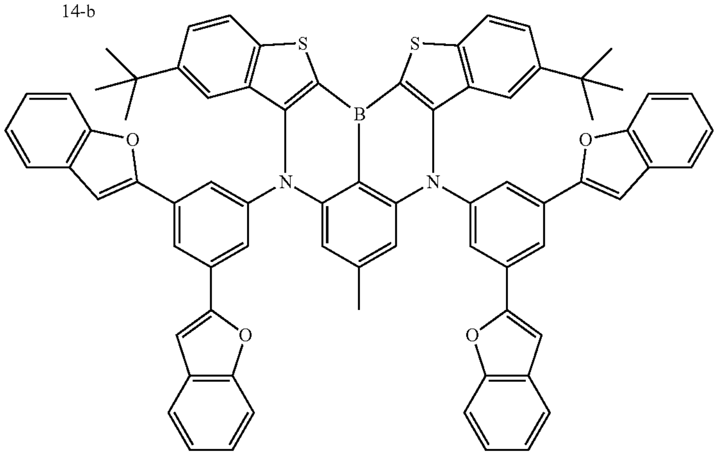

14

Compound 5-a (1.0 eq.), NaOt-Bu (4 eq.), and Compound 12-b (1.05 eq.) were placed in a round bottom flask and dissolved in anhydrous toluene (0.1 M). $Pd(t\text{-}BU_3P)_2$ (5 mol %) was added dropwise thereto at a bath temperature of 100° C., and the mixture was stirred for 2 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 14-a (Yield: 87%).

Then, Compound 14 was prepared in the same manner as in the preparation method of Compound 13, except that Compound 14-a was used instead of Compound 12-c.

m/z $[M+H]^+$ 1123.5

Example 15: Preparation of Compound 15

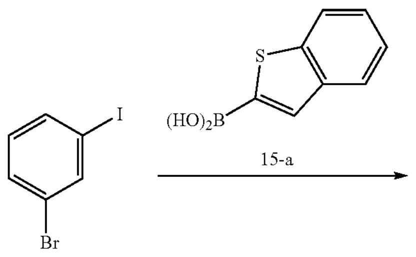

1-f

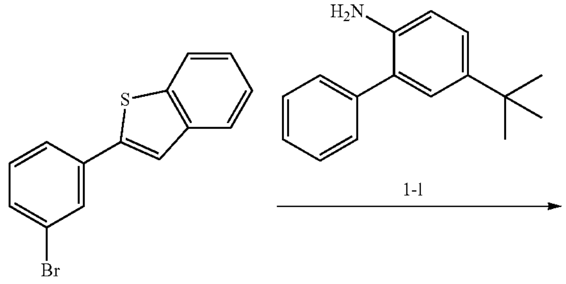

15-b

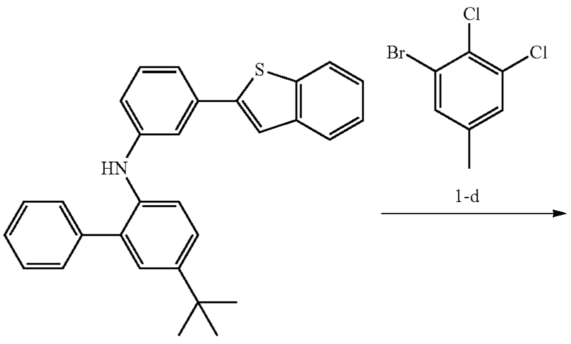

15-c

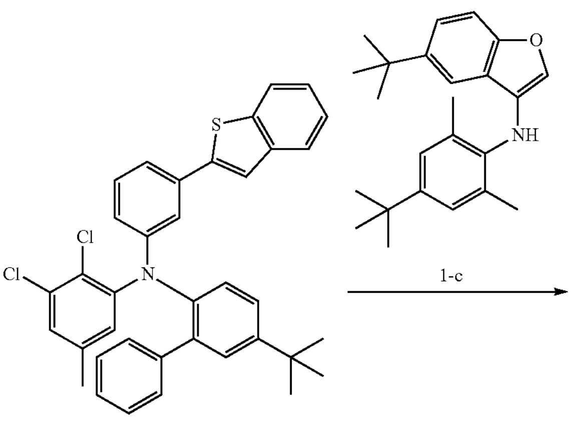

15-d

-continued

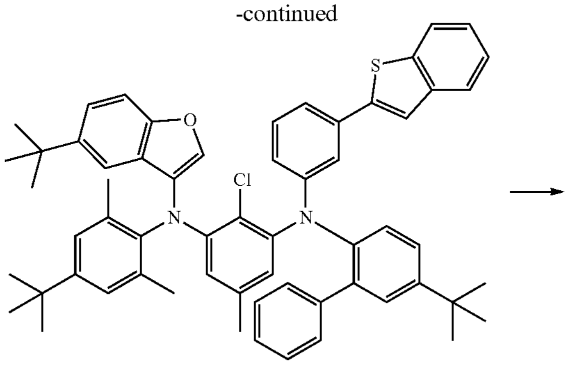

15-e

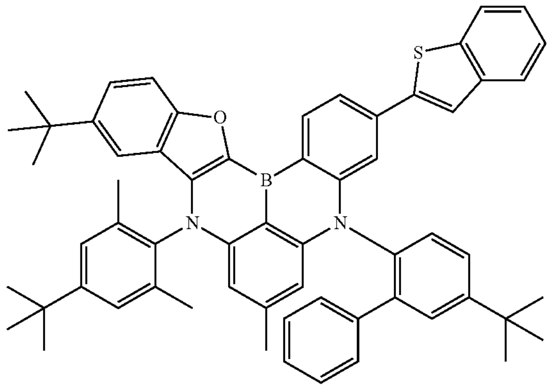

15

Compound 1-f (1.0 eq.) and Compound 15-a (1.05 eq.) were placed in a round bottom flask and dissolved in anhydrous THF (0.1 M). $K_2CO_3$ (aq.) (1.5 eq.) was dropwise added to the reaction solution. $Pd(PPh_3)_4$ (1.5 mol %) was added dropwise thereto at a bath temperature of 80° C., and the mixture was stirred for 2 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 15-b (Yield: 67%).

Compound 15-b (1.0 eq.), NaOt-Bu (4 eq.), and Compound 1-i (1.05 eq.) were placed in a round bottom flask and dissolved in anhydrous toluene (0.1 M). $Pd(t-Bu_3P)_2$ (5 mol %) was added dropwise thereto at a bath temperature of 100° C., and the mixture was stirred for 2 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 15-c (Yield: 72%).

Compound 1-d (1.0 eq.), NaOt-Bu (4 eq.), and Compound 15-c (1.05 eq.) were placed in a round bottom flask and dissolved in anhydrous toluene (0.1 M). $Pd(t-Bu_3P)_2$ (5 mol %) was added dropwise thereto at a bath temperature of 120° C., and the mixture was stirred for 4 hours. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil- Silica pad. The passed solution was concentrated under reduced pressure, and then purified by column chromatography to prepare Compound 15-d (Yield: 77%).

Compound 15-d (1.0 eq.), NaOt-Bu (4 eq.), and Compound 1-c (1.05 eq.) were placed in a round bottom flask and dissolved in anhydrous toluene (0.1 M). $Pd(t\text{-}Bu_3P)_2$ (5 mol %) was added dropwise thereto at a bath temperature of 100° C., and the mixture was stirred overnight. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound 15-e (Yield: 75%).

Compound 15-e (1.0 eq.) was placed in a round bottom flask and dissolved in anhydrous toluene (0.03 M). $BI_3$ (2.0 eq.) was added dropwise thereto, and the mixture was stirred overnight at a bath temperature of 80° C. After the reaction, the reaction mixture was cooled at room temperature and sufficiently diluted with $CH_2Cl_2$. EtNi-$Pr_2$ (15.0 eq.) and sat. $Na_2S_2O_3$ (aq.) were sequentially dropwise added to the reaction mixture, washed with $CH_2Cl_2$/brine, and the organic layer was separated. Water was removed with $MgSO_4$ and passed through a Celite-Florisil-Silica pad. The passed solution was concentrated under reduced pressure, and then purified by column chromatography to prepare Compound 15 (Yield: 78%).

m/z $[M+H]^+$ 879.5

Example 16: Preparation of Compound 16

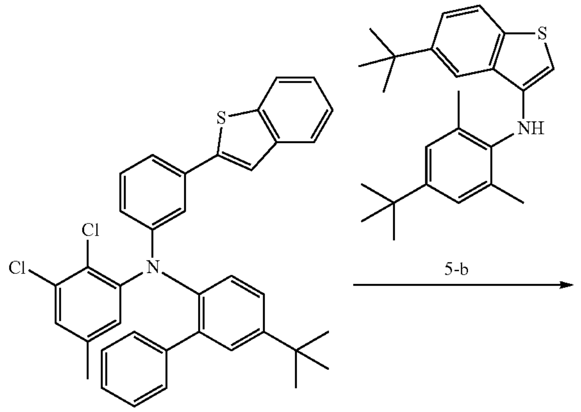

15-d

-continued

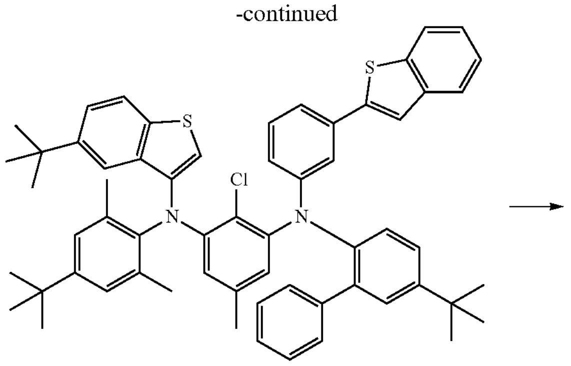

16-a

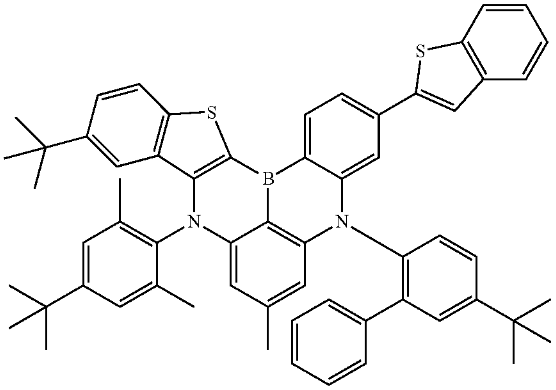

16

Compound 16 was prepared in the same manner as in the preparation method of Compound 15, except that Compound 5-b was used instead of Compound 1-c.

m/z $[M+H]^+$ 895.6

Example 17: Preparation of Compound 17

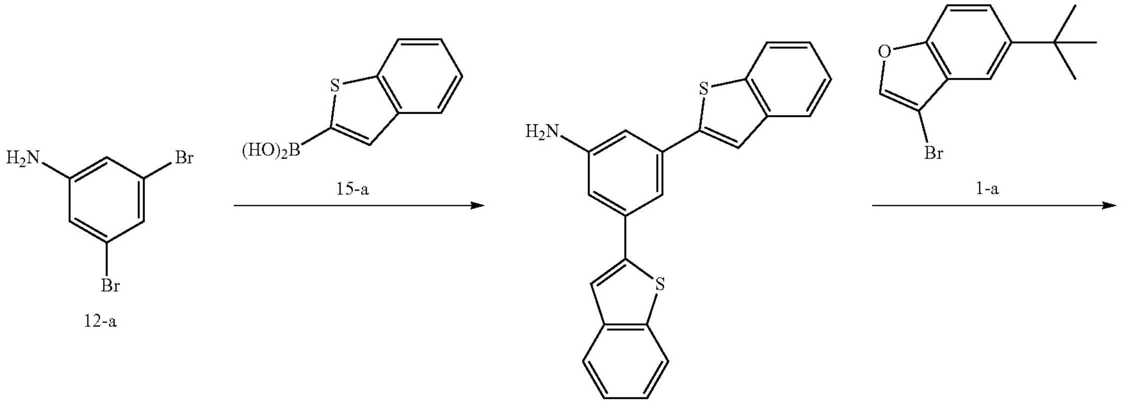

12-a 17-a

-continued
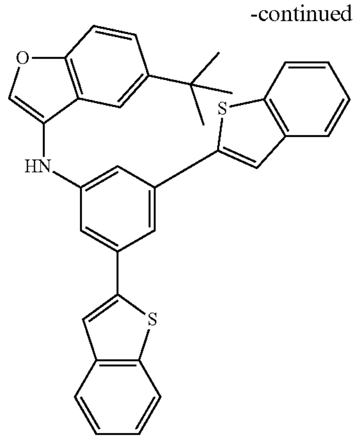
17-b
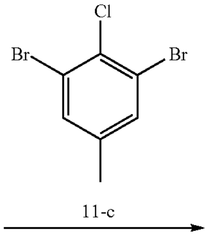
11-c
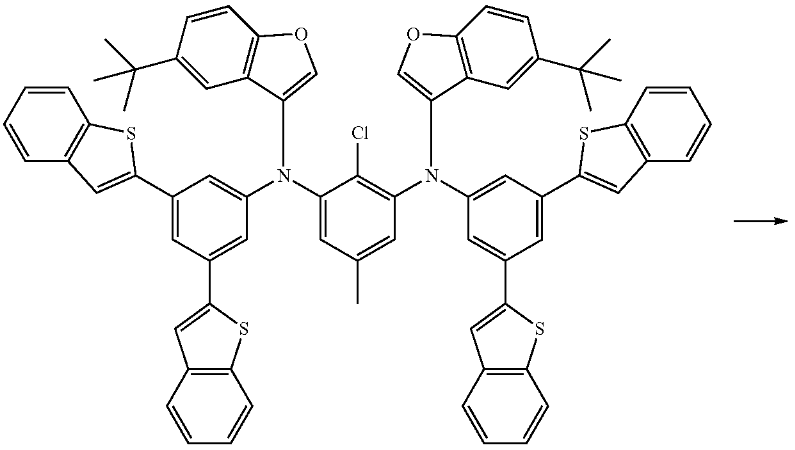
17-c
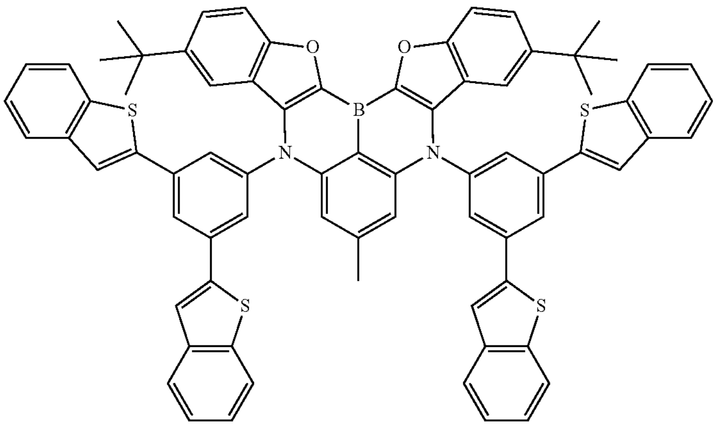
17
Compound 17 was prepared in the same manner as in the preparation method of Compound 12, except that Compound 15-a was used instead of Compound 1-g.
m/z $[M+H]^+$ 1155.2

Example 18: Preparation of Compound 18
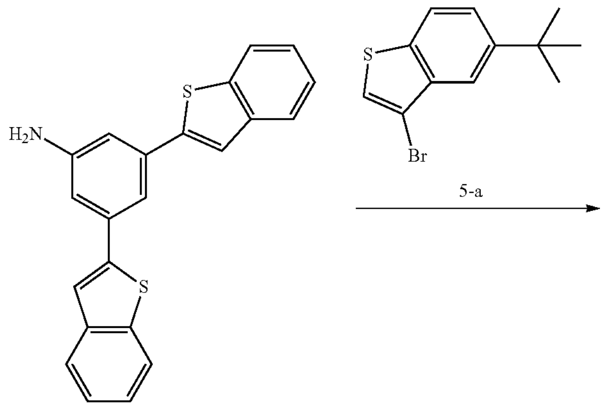
17-a
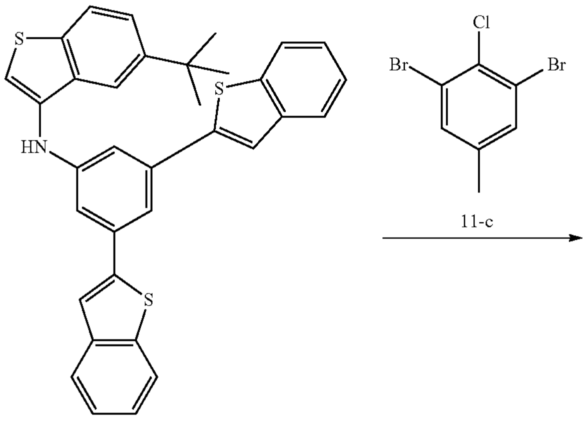
18-a
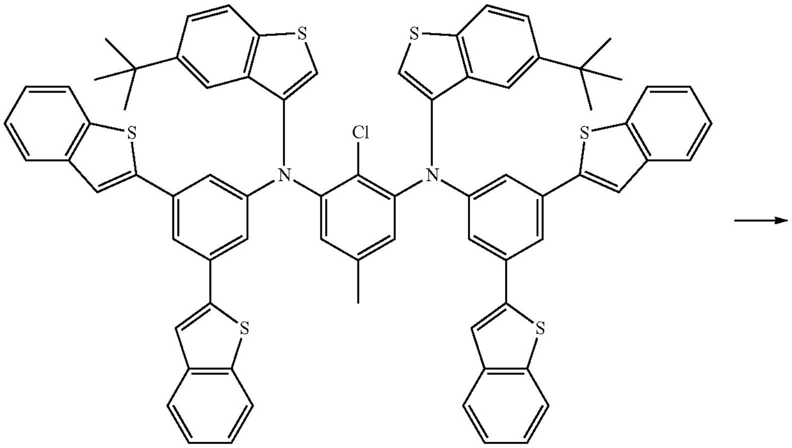
18-b -continued

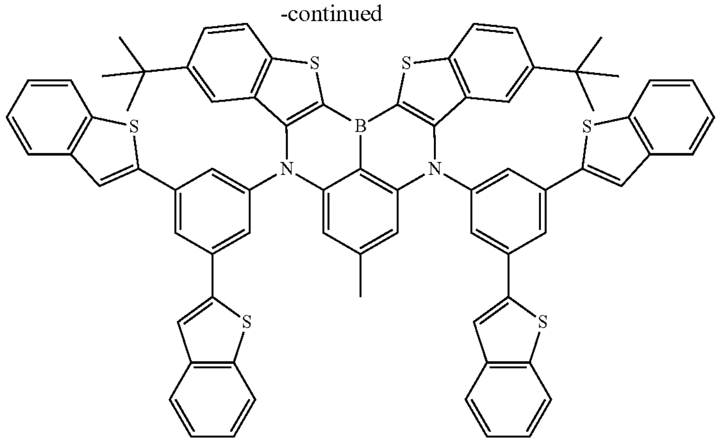

18

Compound 18 was prepared in the same manner as in the preparation method of Compound 17, except that Compound 5-a was used instead of Compound 1-a.

m/z $[M+H]^+$ 1187.3

COMPARATIVE EXAMPLE

Comparative Example 1: Preparation of Compound F

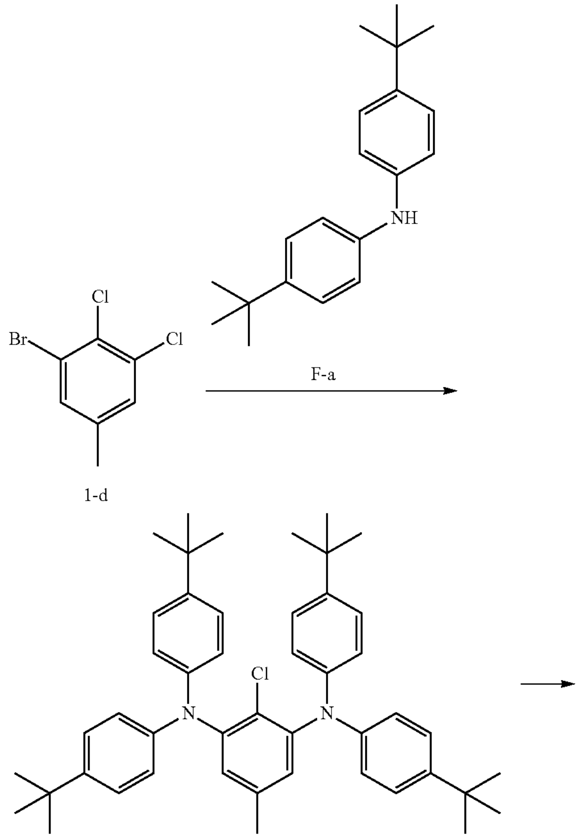

1-d

F-a

F-b

-continued

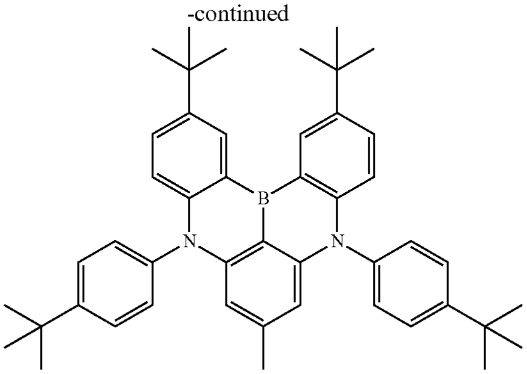

F

Compound 1-d (1.0 eq.), NaOt-Bu 4.0 eq.), and Compound F-a (2.05 eq.) were placed in a round bottom flask and dissolved in anhydrous toluene (0.1 M). $Pd(t-Bu_3P)_2$ (5 mol %) was added dropwise thereto at a bath temperature of 120° C., and the mixture was stirred overnight. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound F-b (Yield: 75%).

Compound F-b (1.0 eq.) was placed in a round bottom flask and dissolved in anhydrous toluene (0.03 M). $BI_3$ (2.0 eq.) was added dropwise thereto, and the mixture was stirred overnight at a bath temperature of 80° C. After the reaction, the reaction mixture was cooled at room temperature and sufficiently diluted with $CH_2Cl_2$. EtNi-$Pr_2$ (15.0 eq.) and sat. $Na_2S_2O_3$ (aq.) were sequentially dropwise added to the reaction mixture, washed with $CH_2Cl_2$/brine, and the organic layer was separated. Water was removed with $MgSO_4$ and passed through a Celite-Florisil-Silica pad. The passed solution was concentrated under reduced pressure, and then purified by column chromatography to prepare Compound F (Yield: 87%).

m/z $[M+H]^+$=659.6

Comparative Example 2: Preparation of Compound G

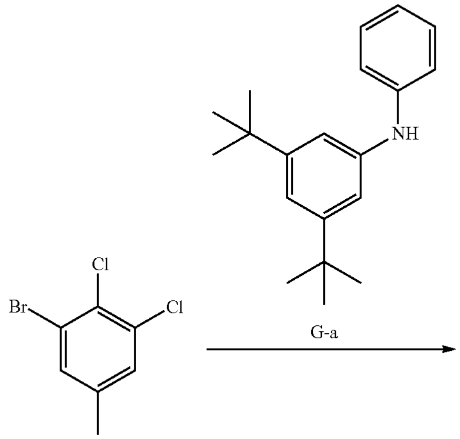

G-a 1-d

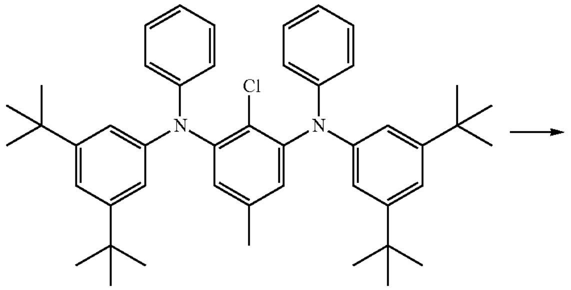

G-b

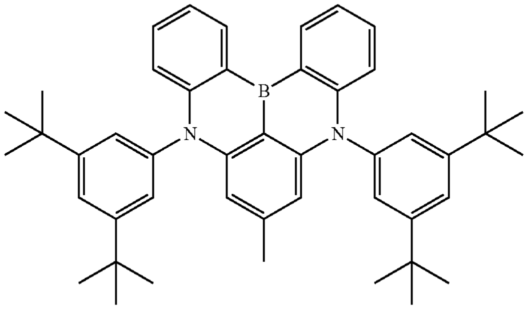

G

Compound G was prepared in the same manner as in the preparation method of Comparative Example 1, except that Compound G-a was used instead of Compound F-a.

m/z $[M+H]^+$=659.5

Comparative Example 3: Preparation of Compound H

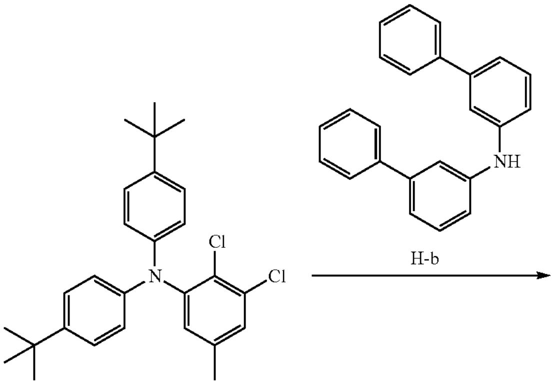

H-b

H-a

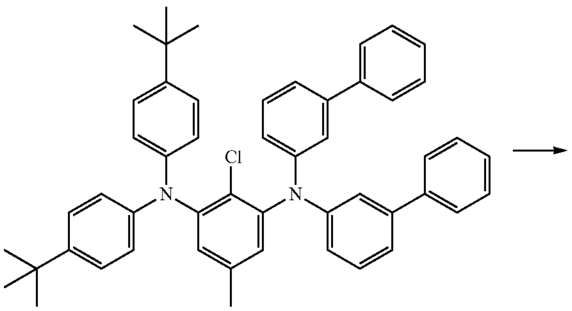

H-c

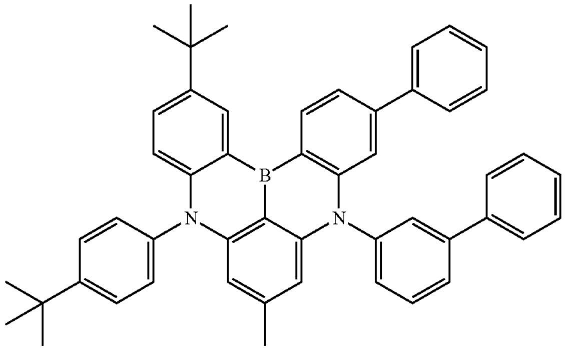

H

Compound H-a (1.0 eq.), NaOt-Bu 4.0 eq.), and H-b (1.05 eq.) were placed in a round bottom flask and dissolved in anhydrous toluene (0.1 M). $Pd(t\text{-}Bu_3P)_2$ (5 mol %) was added dropwise thereto at a bath temperature of 120° C., and the mixture was stirred overnight. After the reaction, the reaction mixture was cooled at room temperature, sufficiently diluted with $CH_2Cl_2$, and then washed with $CH_2Cl_2$/brine. The organic layer was separated, water was removed with $MgSO_4$ and passed through a Celite-Florisil-Silica pad. The passed solution was concentrated under reduced pressure, and then purified by column chromatography to prepare Compound H-c (Yield: 79%).

Compound H-c (1.0 eq.) was placed in a round bottom flask and dissolved in anhydrous toluene (0.03 M). $BI_3$ (2.0 eq.) was added dropwise thereto, and the mixture was stirred overnight at a bath temperature of 80° C. After the reaction, the reaction mixture was cooled at room temperature and sufficiently diluted with $CH_2Cl_2$. EtNi-$Pr_2$ (15.0 eq.) and sat. $Na_2S_2O_3$ (aq.) were sequentially dropwise added to the reaction mixture, washed with $CH_2Cl_2$/brine, and the organic layer was separated. Water was removed with $MgSO_4$ and passed through a Celite-Florisil-Silica pad. The passed solution was concentrated under reduced pressure, and then purified by column chromatography to prepare Compound H (yield: 73%).

m/z $[M+H]^+$=725.5

EXPERIMENTAL EXAMPLE

Experimental Example 1

A glass substrate on which ITO (indium tin oxide) was coated as a thin film to a thickness of 500 Å was put into distilled water in which a detergent was dissolved, and ultrasonically cleaned. At this time, a product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone, and methanol, dried, and then the substrate was cleaned for 5 minutes and then transferred to a glove box.

A coating composition, in which the following compound O and compound P (weight ratio of 2:8) were dissolved in cyclohexanone at 20 wt/v %, was spin-coated (4000 rpm) on the ITO transparent electrode, and heat-treated (cured) at 200° C. for 30 minutes to form a hole injection layer with a thickness of 400 Å. A coating composition, in which the following compound Q (Mn: 27,900; Mw: 35,600; measured by GPC (Agilent 1200 series) using PC Standard) was dissolved in toluene at 6 wt/v %, was spin-coated (4000 rpm) on the hole injection layer, and heat-treated at 200° C. for 30 minutes to form a hole transport layer with a thickness of 200 Å. A coating composition, in which the previously prepared compound 1 and the following compound R (weight ratio of 2:98) were dissolved in cyclohexanone at 2 wt/v %, was spin-coated (4000 rpm) on the hole transport layer, and heat-treated at 180° C. for 30 minutes to form a light emitting layer with a thickness of 400 Å. After transferring to a vacuum evaporator, the following compounds S was vacuum-deposited on the light emitting layer to a thickness of 350 Å to form an electron injection and transport layer. LiF (10 Å), and aluminum (1000 Å) were sequentially deposited on the electron injection and transport layer to form a cathode.

O

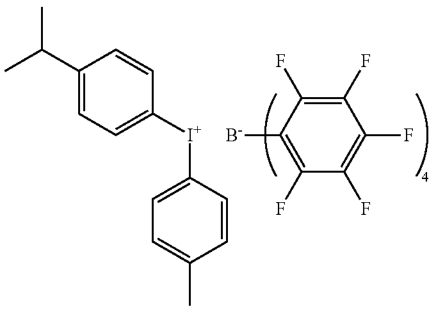

-continued

P

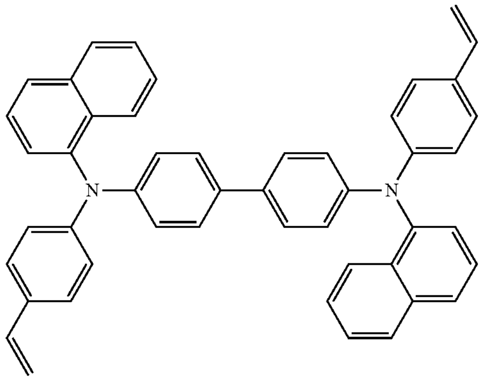

Q

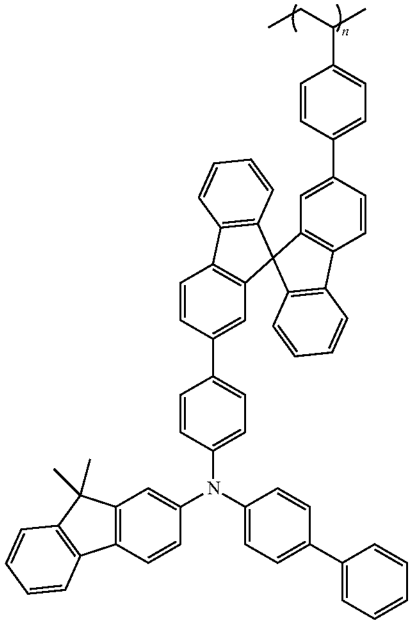

R

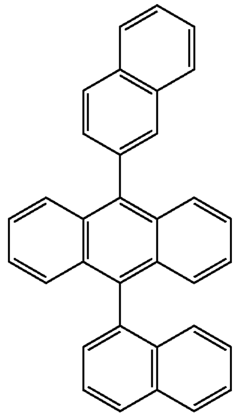

-continued

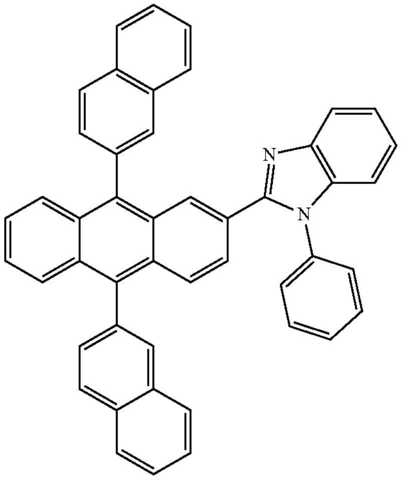

In the above-mentioned process, the vapor deposition rate of the organic material was maintained at 0.4 to 0.7 Å/sec, the deposition rate of LiF was maintained at 0.3 Å/sec, the deposition rate of aluminum was maintained at 2 Å/sec, and the degree of vacuum during the deposition was maintained at $2*10^{-7}$ to $5*10^{-8}$ torr.

Experimental Examples 2 to 18

An organic light emitting device was manufactured in the same manner as in Experimental Example 1, except that the compounds shown in Table 1 below were used instead of Compound 1.

Comparative Experimental Examples 1 to 3

An organic light emitting device was manufactured in the same manner as in Experimental Example 1, except that the compounds shown in Table below were used instead of Compound 1.

The driving voltage, external quantum efficiency (EQE), and lifetime were measured by applying a current of 10 $mA/cm^2$ to the organic light emitting devices manufactured in the Experimental Examples and Comparative Experimental Examples, and the results are shown in Table 1 below. At this time, the external quantum efficiency (EQE) was calculated as "(the number of emitted photon)/(the number of injected charge carrier)*100", and T90 means the time required for the luminance to be reduced to 90% of the initial luminance (500 nit).

TABLE 1

| | Compound (Dopant of the light emitting layer) | Driving voltage (V@10 $mA/cm^2$) | EQE (% @10 $mA/cm^2$) | Lifetime (hr) (T90@500 nit) |
|---|---|---|---|---|
| Experimental Example 1 | Compound 1 | 4.73 | 6.32 | 198 |
| Experimental Example 2 | Compound 2 | 4.76 | 6.24 | 189 |
| Experimental Example 3 | Compound 3 | 4.78 | 6.29 | 201 |
| Experimental Example 4 | Compound 4 | 4.67 | 6.32 | 187 |
| Experimental Example 5 | Compound 5 | 4.66 | 6.25 | 200 |
| Experimental Example 6 | Compound 6 | 4.70 | 6.10 | 185 |
| Experimental Example 7 | Compound 7 | 4.81 | 6.20 | 203 |
| Experimental Example 8 | Compound 8 | 4.67 | 6.25 | 198 |
| Experimental Example 9 | Compound 9 | 4.68 | 5.95 | 193 |
| Experimental Example 10 | Compound 10 | 4.73 | 5.85 | 195 |
| Experimental Example 11 | Compound 11 | 4.70 | 6.02 | 189 |
| Experimental Example 12 | Compound 12 | 4.75 | 6.23 | 192 |
| Experimental Example 13 | Compound 13 | 4.78 | 6.01 | 198 |
| Experimental Example 14 | Compound 14 | 4.80 | 5.99 | 195 |
| Experimental Example 15 | Compound 15 | 4.62 | 5.96 | 193 |
| Experimental Example 16 | Compound 16 | 4.65 | 6.02 | 185 |
| Experimental Example 17 | Compound 17 | 4.71 | 6.02 | 189 |
| Experimental Example 18 | Compound 18 | 4.72 | 6.03 | 195 |
| Comparative Experimental Example 1 | Compound F | 4.69 | 4.39 | 105 |
| Comparative Experimental Example 2 | Compound G | 4.68 | 4.23 | 99 |
| Comparative Experimental Example 3 | Compound H | 4.62 | 3.98 | 83 |

As shown in Table 1 above, the organic light emitting devices comprising the compounds of the present disclosure as the dopant of the light emitting layer exhibits excellent characteristics in terms of efficiency, driving voltage and lifetime.

DESCRIPTION OF SYMBOLS

| | |
|---|---|
| 1: substrate | 2: anode |
| 3: light emitting layer | 4: cathode |
| 5: hole injection layer | 6: hole transport layer |
| 7: light emitting layer | 8: electron injection and transport layer |

The invention claimed is:

1. A compound represented by Chemical Formula 1:

[Chemical Formula 1]

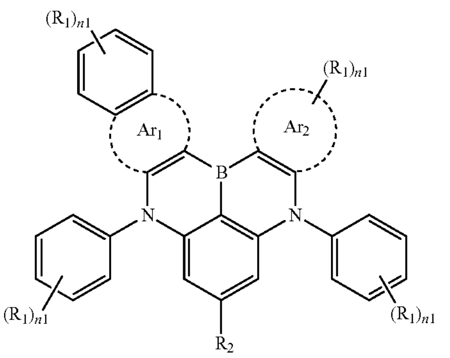

in Chemical Formula 1, $Ar_1$ is furan or thiophene fused with two adjacent rings, $Ar_2$ is benzene, benzofuran or benzothiophene fused with one adjacent ring, each n1 is independently an integer of 1 to 4, at least one of $R_1$ is benzofuranyl or benzothiophenyl, the rest are independently hydrogen, deuterium, halogen, cyano, a substituted or unsubstituted $C_{1-60}$ alkyl, a substituted or unsubstituted $C_{2-60}$ alkenyl, a substituted or unsubstituted $C_{2-60}$ alkynyl, a substituted or unsubstituted $C_{3-30}$ cycloalkyl, a substituted or unsubstituted $C_{6-60}$ aryl, or a substituted or unsubstituted $C_{2-60}$ heteroaryl containing one or more heteroatoms selected from N, O or S, and $R_2$ is hydrogen; deuterium; or a substituted or unsubstituted $C_{1-60}$ alkyl.

2. The compound of claim 1, wherein:

the compound is represented by any one of Chemical Formulas 1-1 to 1-4:

[Chemical Formula 1-1]

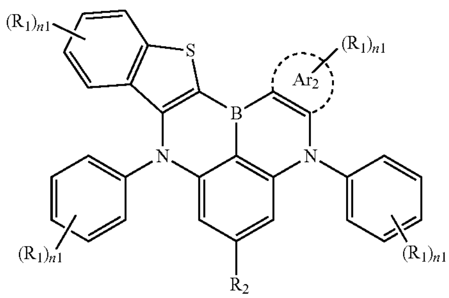

[Chemical Formula 1-2]

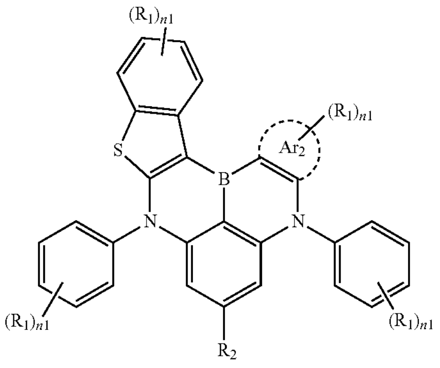

-continued

[Chemical Formula 1-3]

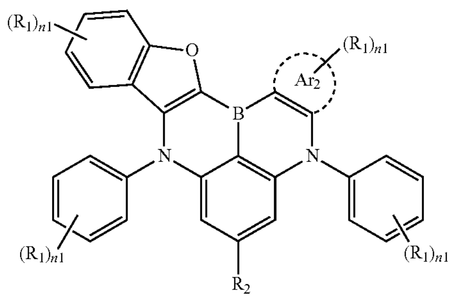

[Chemical Formula 1-4]

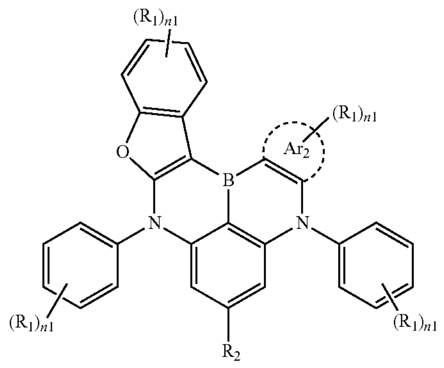

in Chemical Formulas 1-1 to 1-4, $Ar_2$, n1, $R_1$, and $R_2$ are as defined in claim 1.

3. The compound of claim 1, wherein:

at least one of $R_1$ is

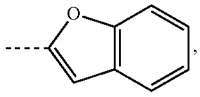,
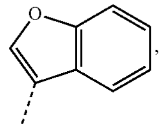,

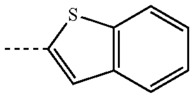
or
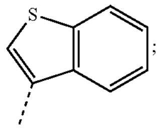;

and the rest are independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing one or more heteroatoms selected from N, O or S.

4. The compound of claim 1, wherein:

at least one of $R_1$ is

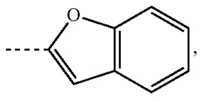,
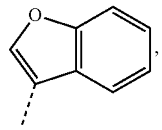,

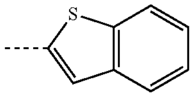
or
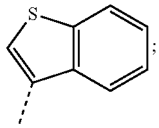;

and the rest are independently hydrogen, deuterium, a $C_{3-10}$ alkyl, phenyl, dibenzofuranyl, or dibenzothiophenyl.

5. The compound of claim 1, wherein:

at least one of $R_1$ is

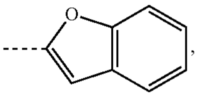,
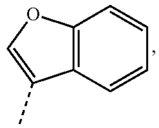,
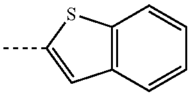
or
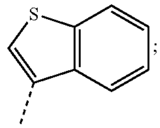;

and the rest are independently hydrogen, deuterium, methyl, ethyl, propyl, isopropyl, butyl, isobutyl, tert-butyl, phenyl, dibenzofuranyl, or dibenzothiophenyl.

6. The compound of claim 1, wherein:

$R_2$ is hydrogen, deuterium, or a $C_{1-4}$ alkyl.

7. The compound of claim 1, wherein:

$R_2$ is hydrogen, deuterium, methyl, ethyl, propyl, isopropyl, butyl, isobutyl, or tertbutyl.

8. The compound of claim 1, wherein:

the compound is any one selected from the group consisting of:

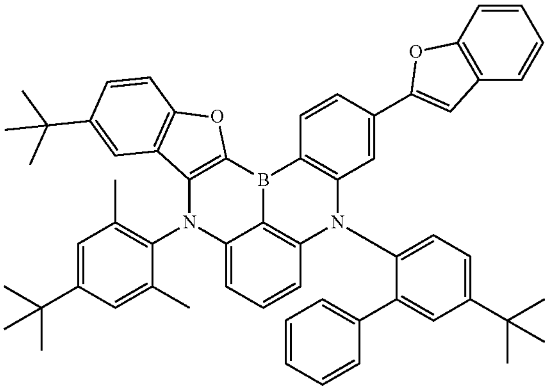
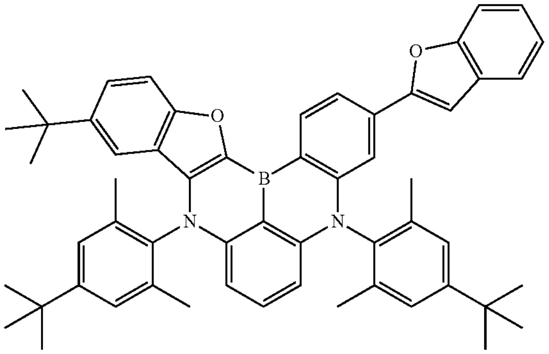
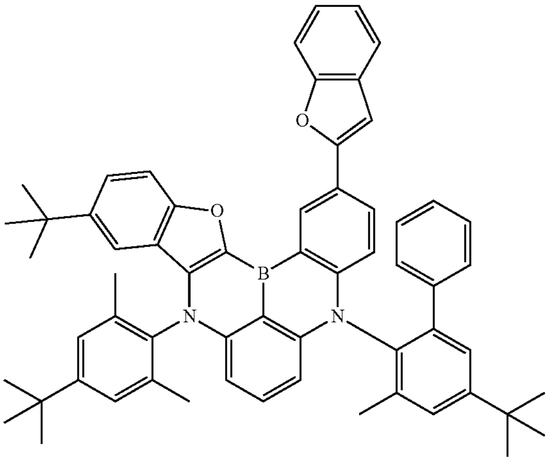
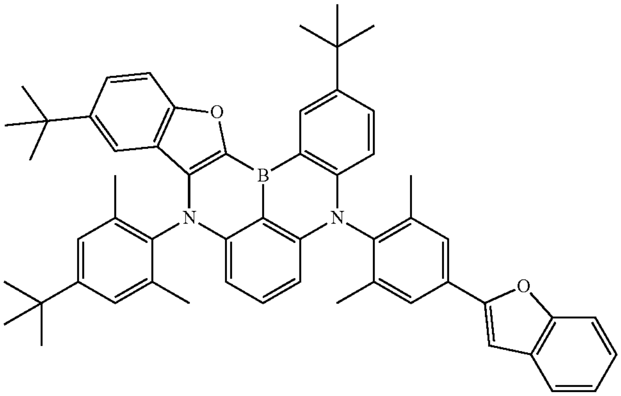

-continued
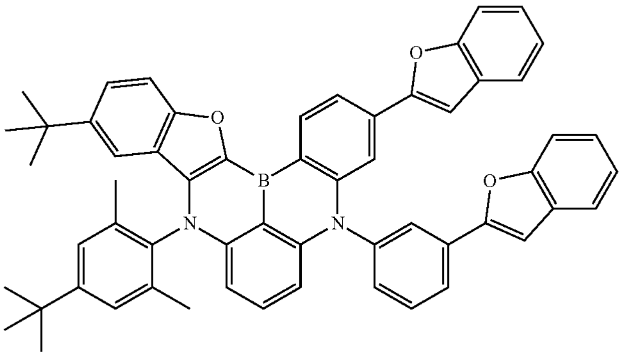
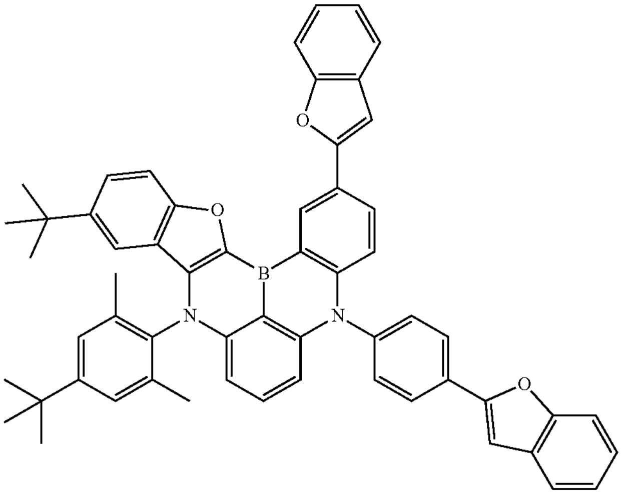
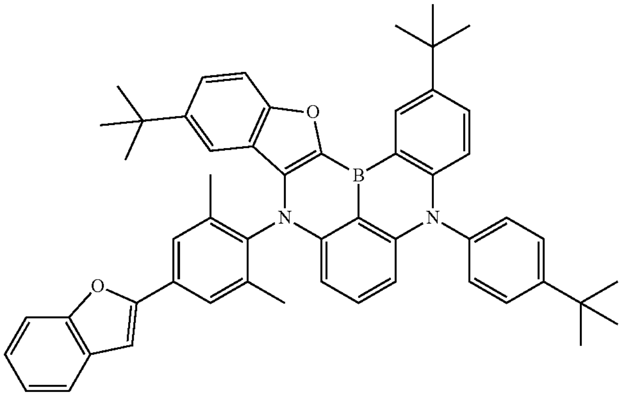
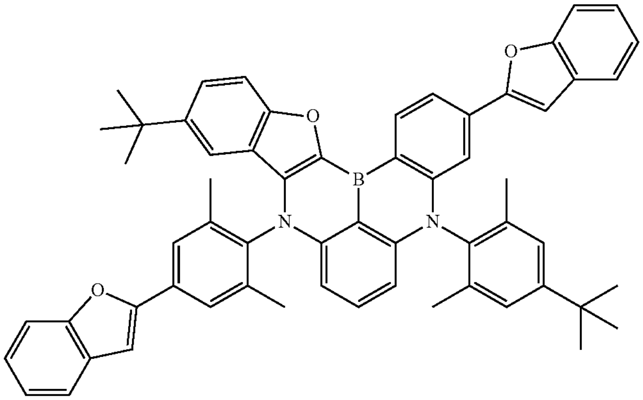

-continued
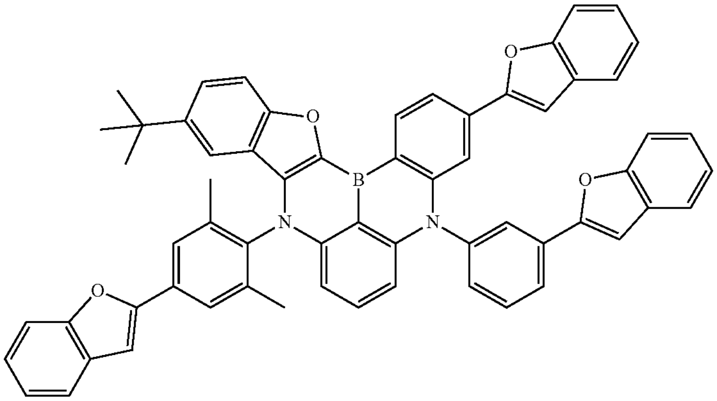
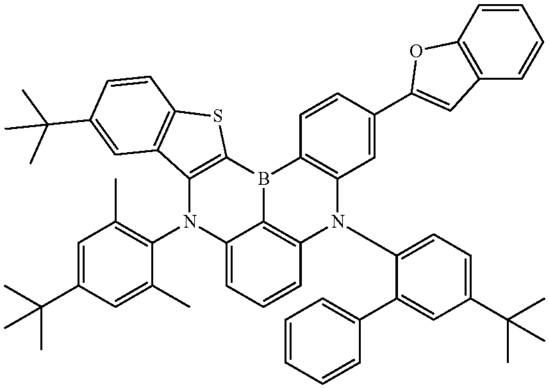
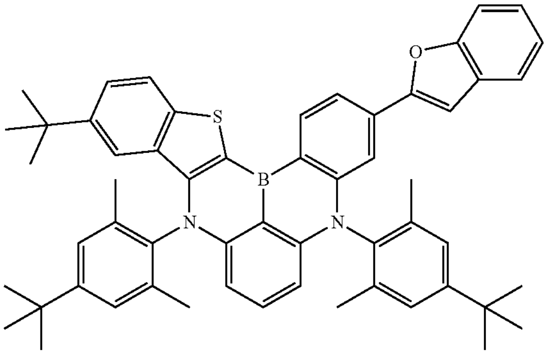
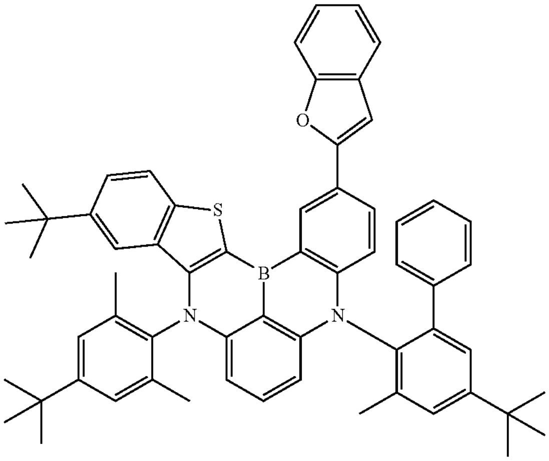
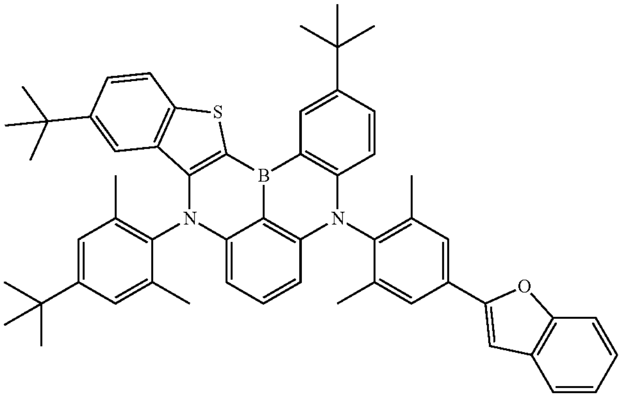

-continued
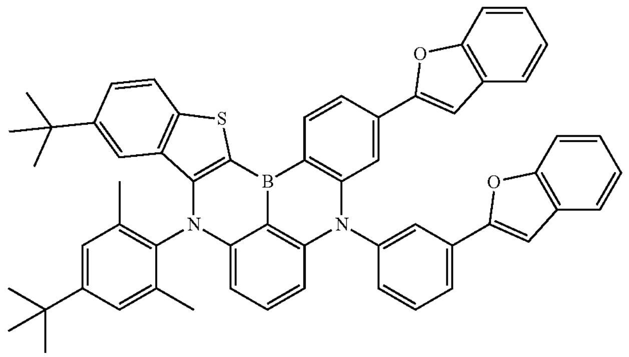
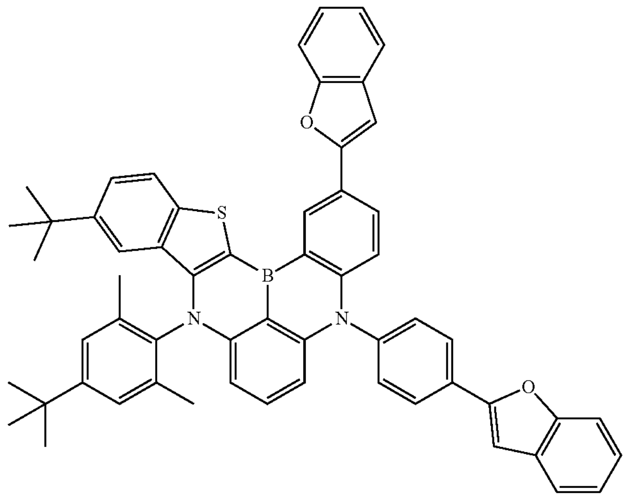
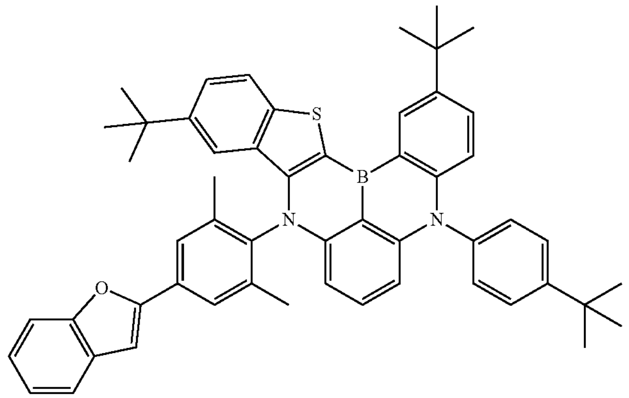
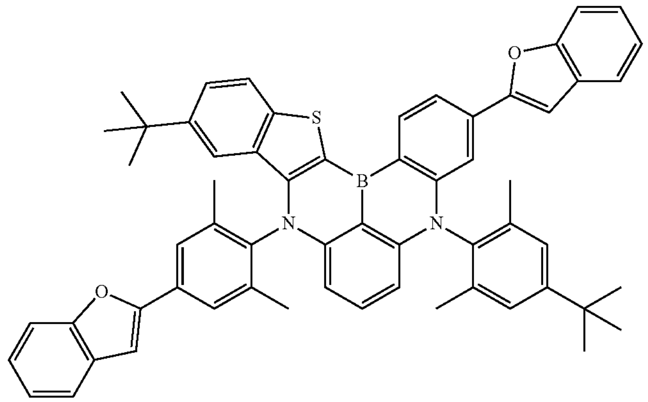

-continued
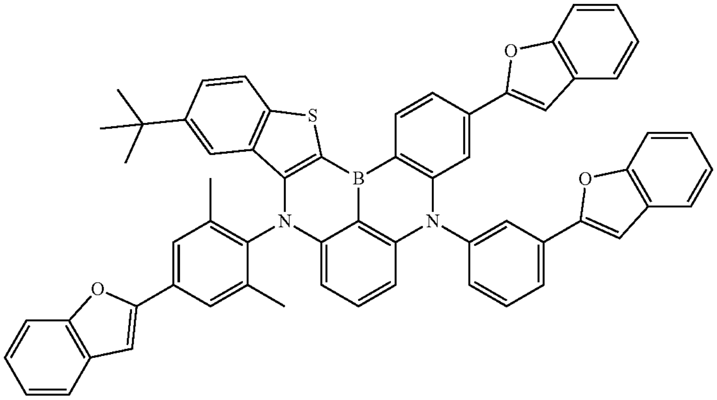
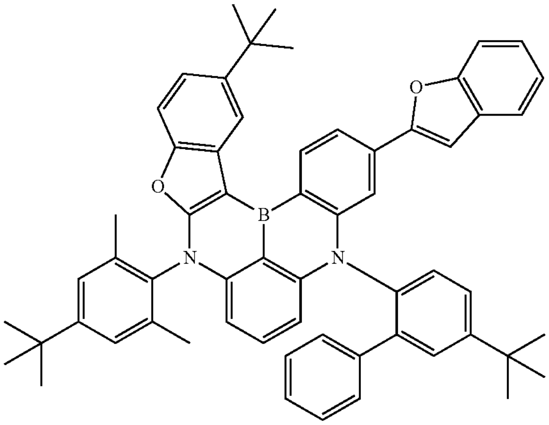
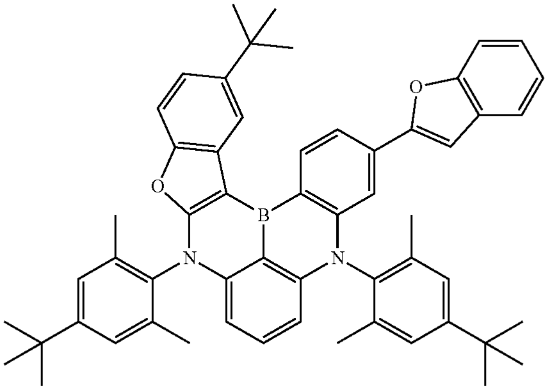
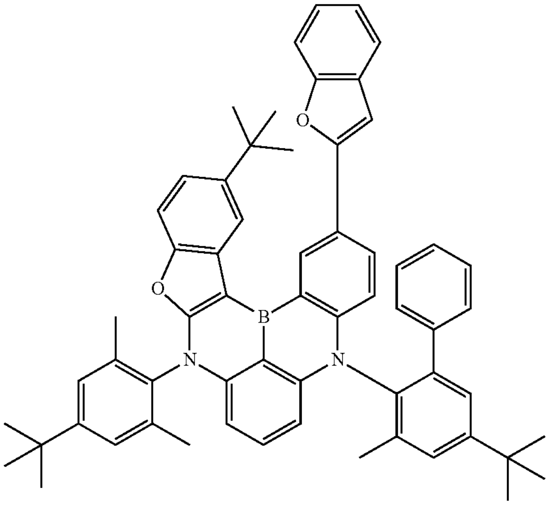
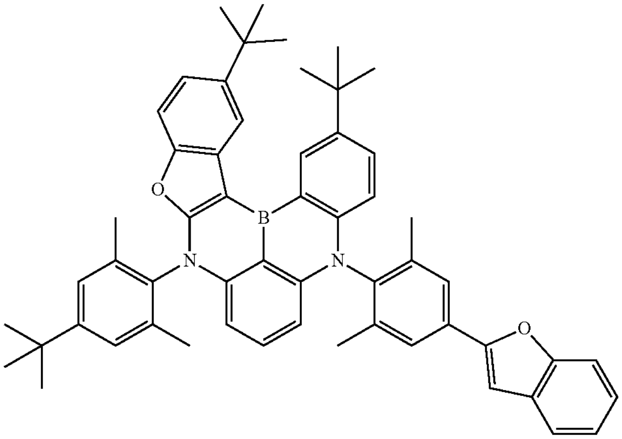
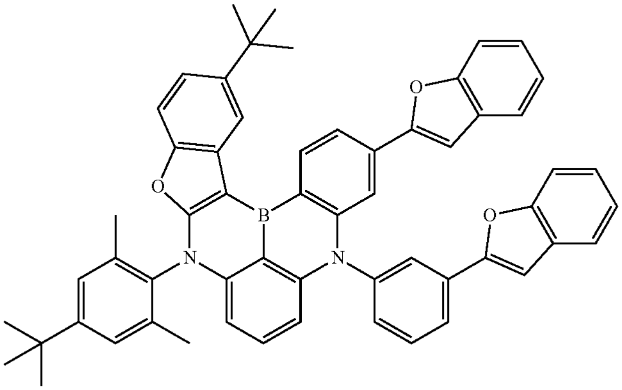

-continued
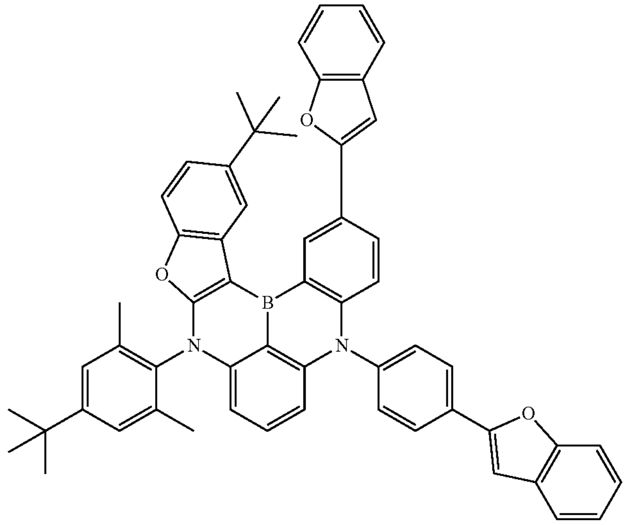
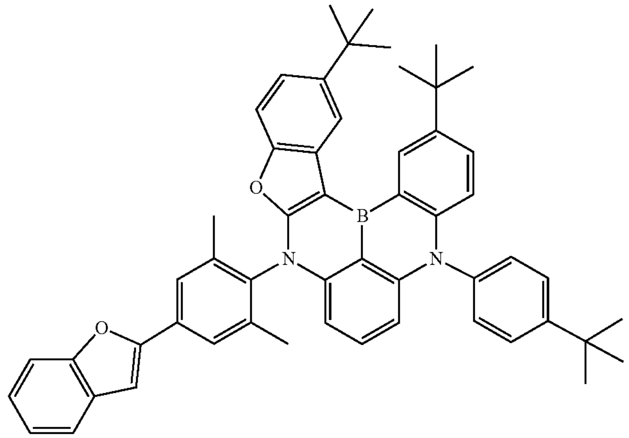
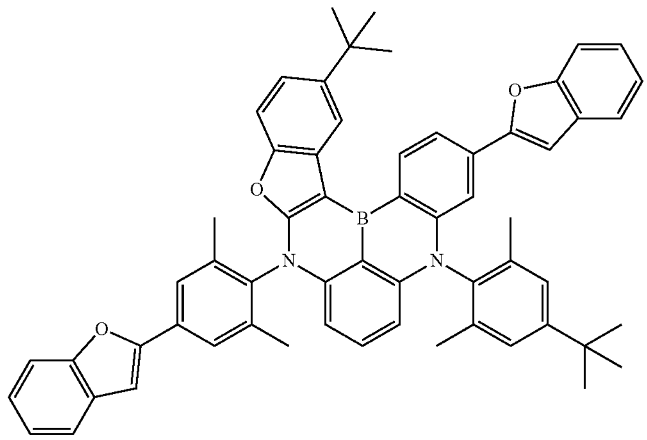

-continued
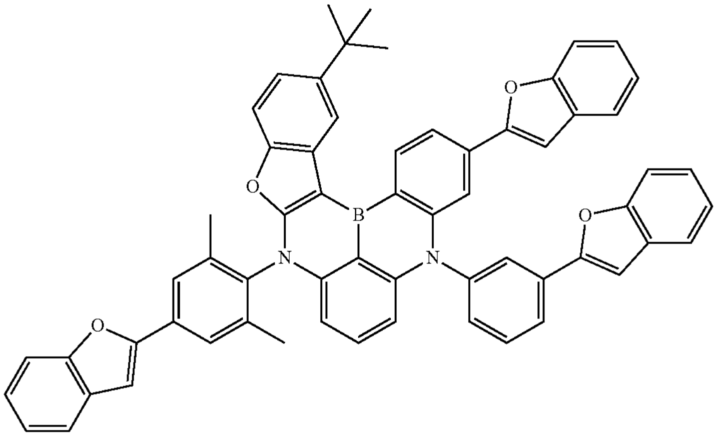
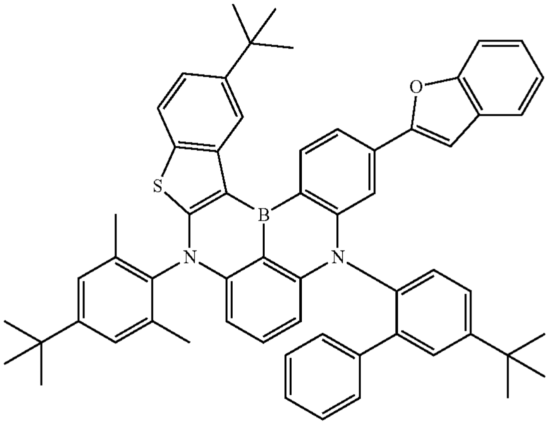
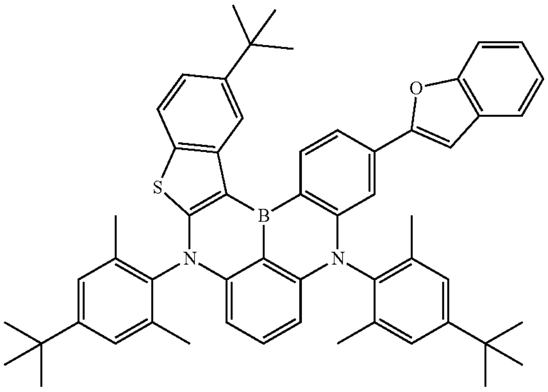
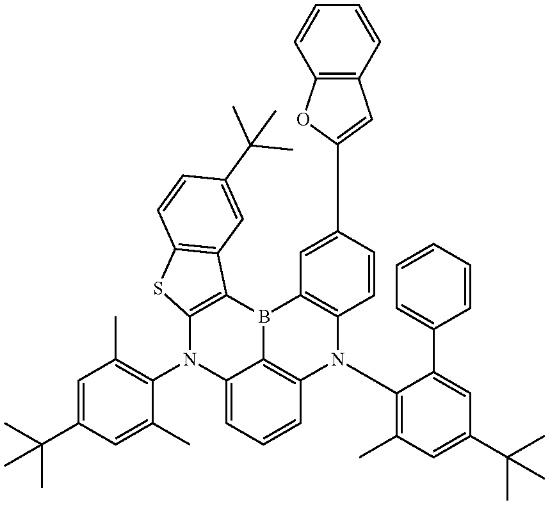

-continued
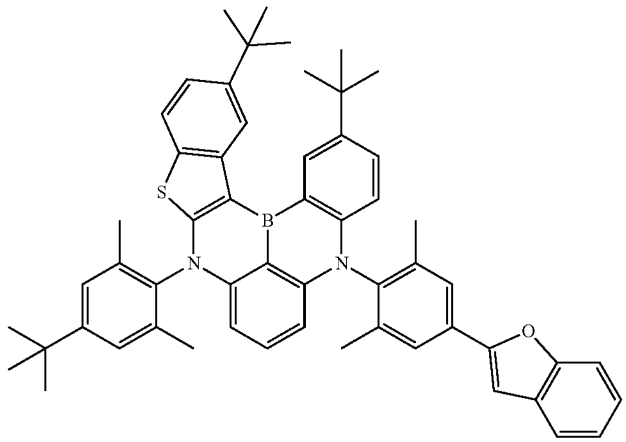
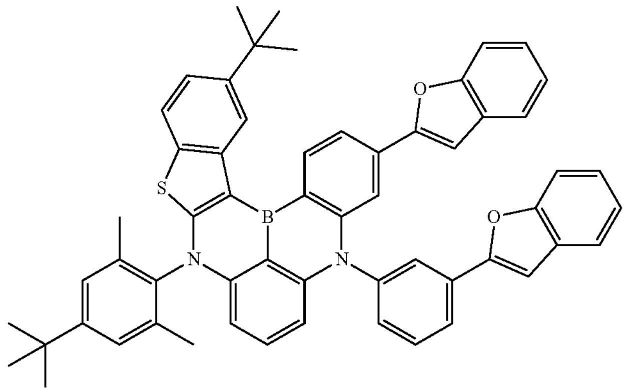
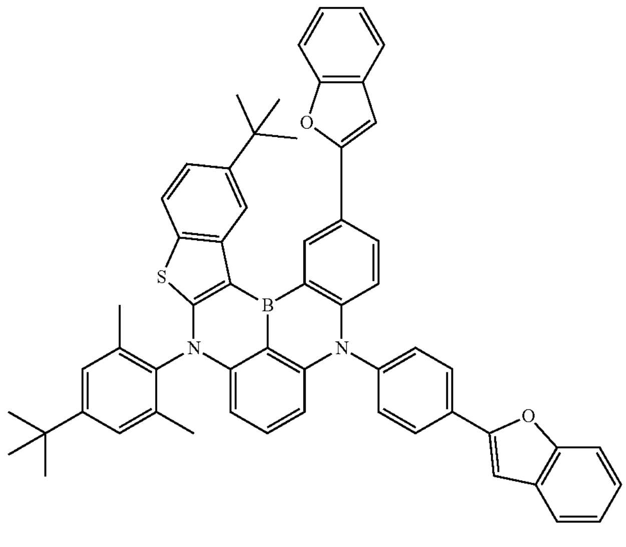

-continued
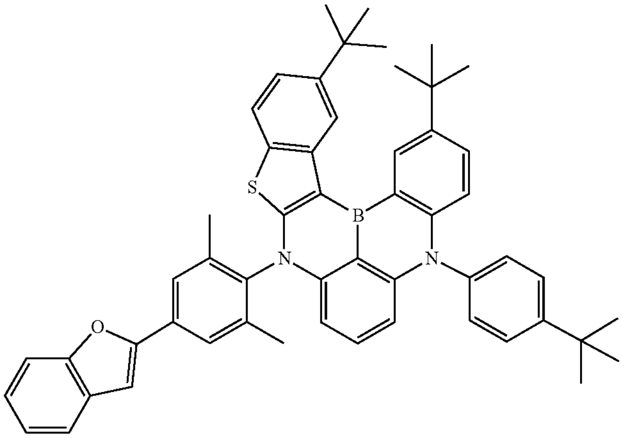
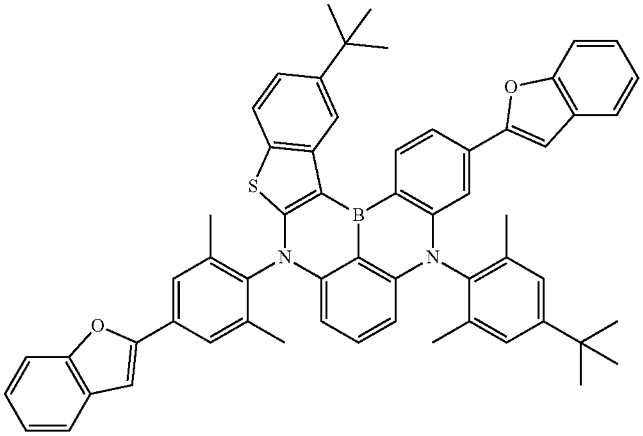
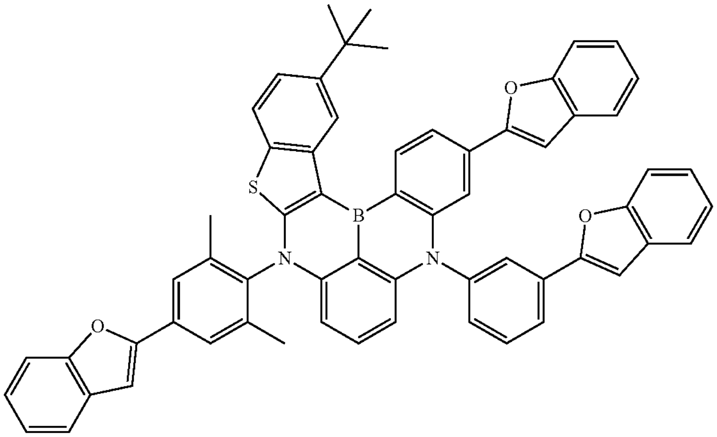
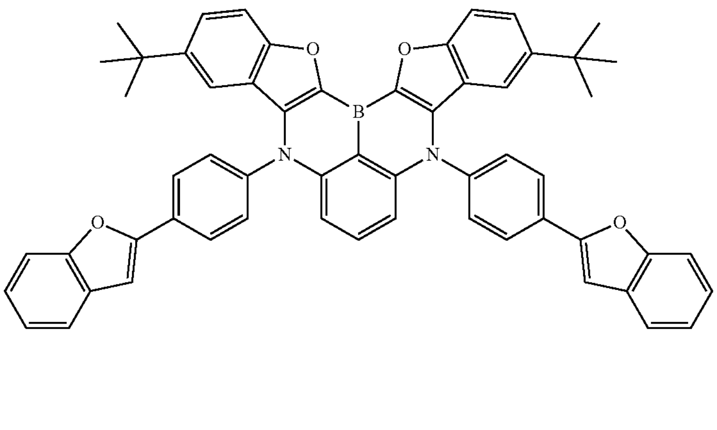

-continued
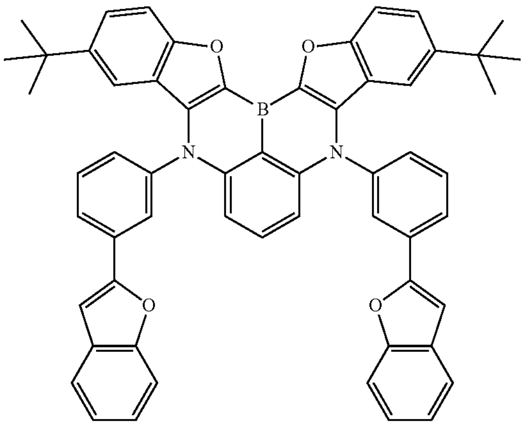
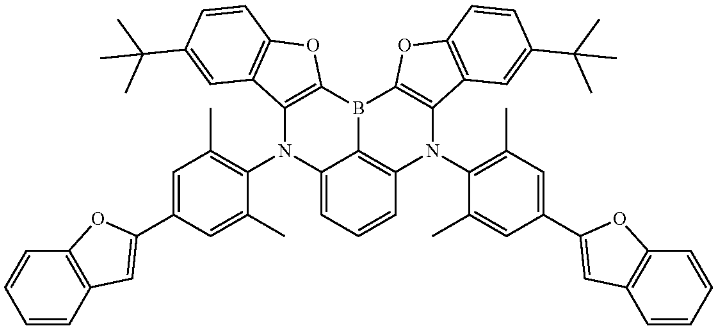
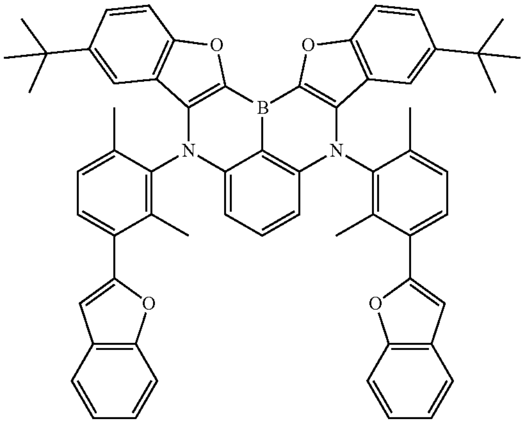
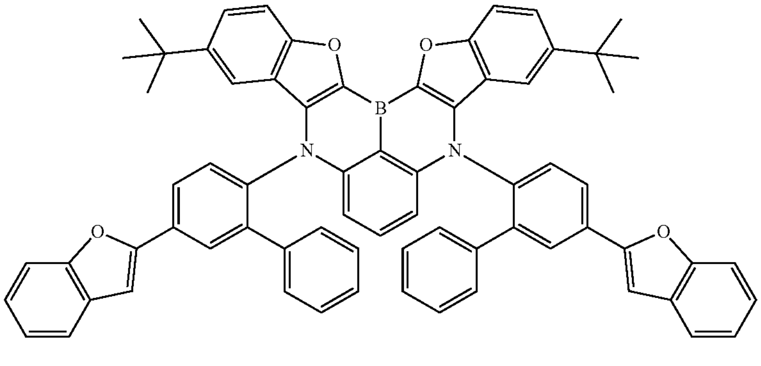

-continued
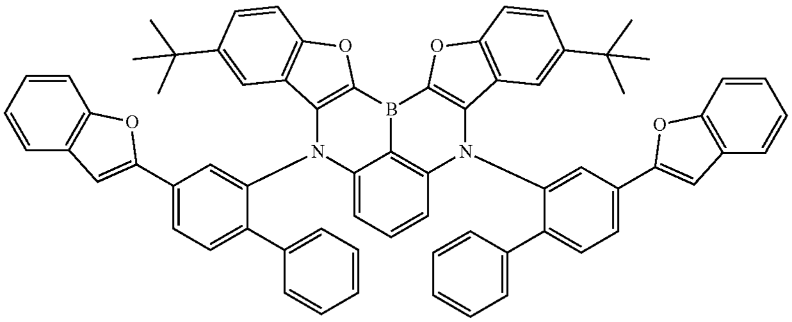
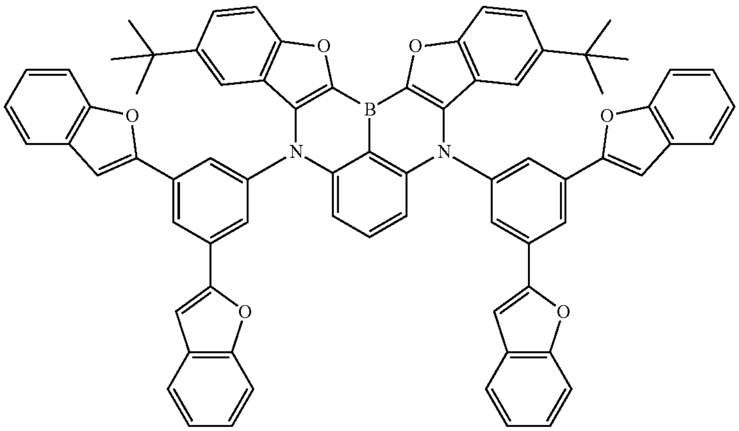
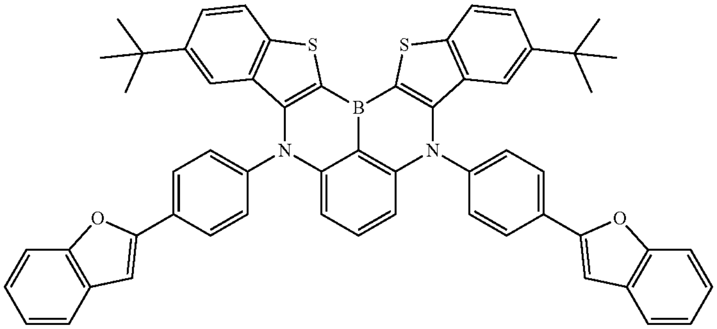
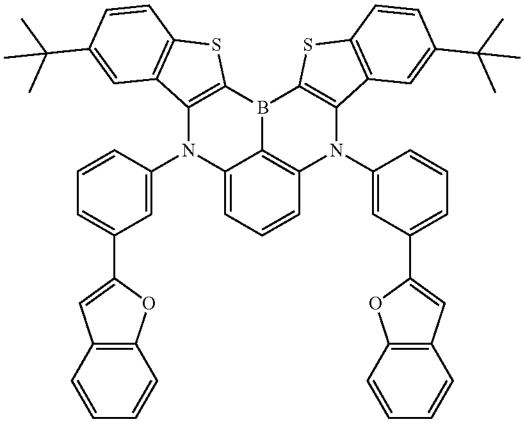

-continued
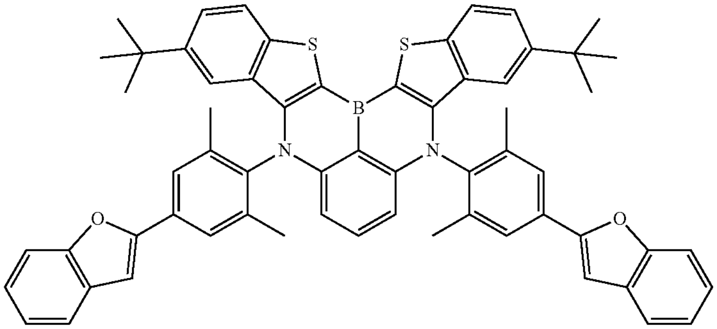
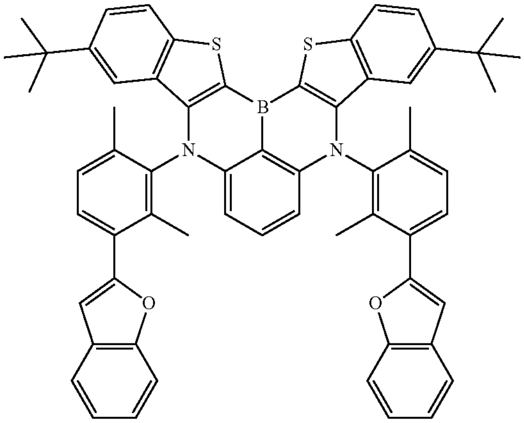
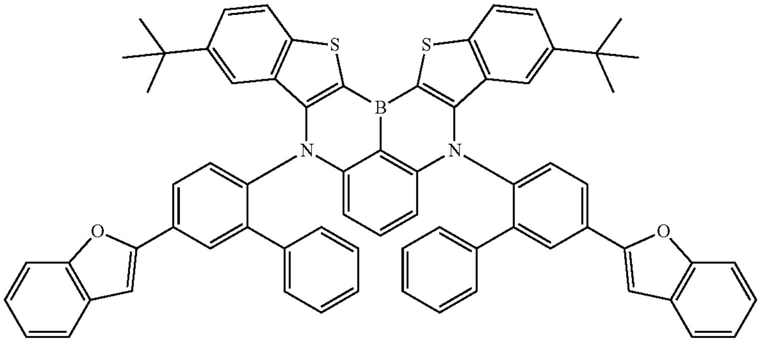
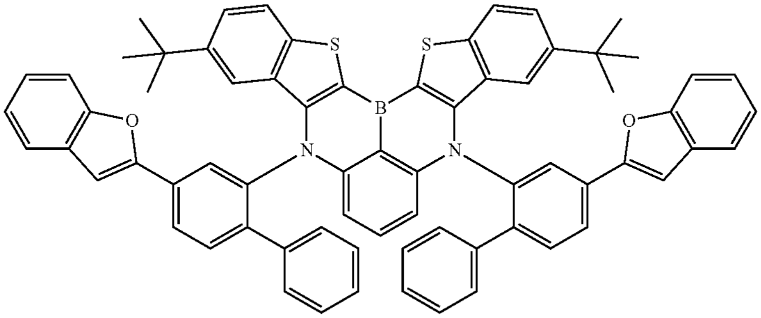

-continued
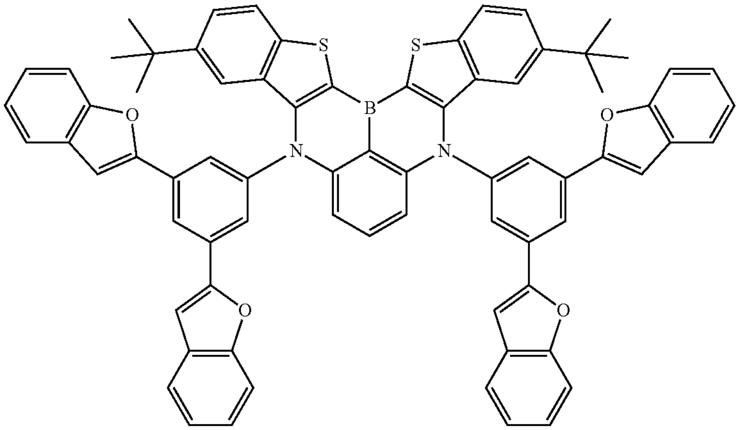
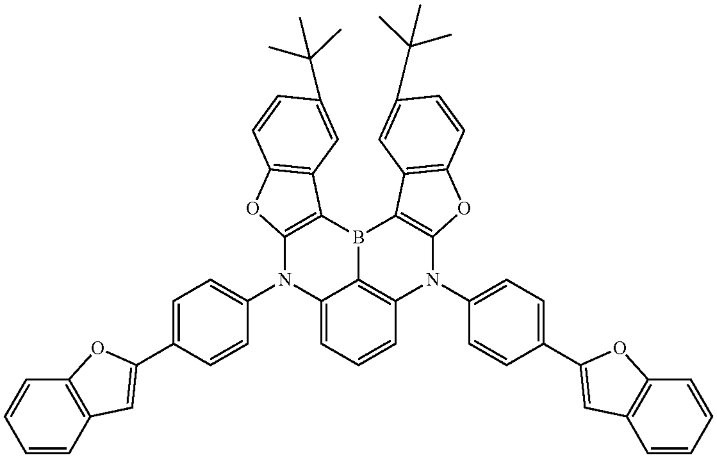
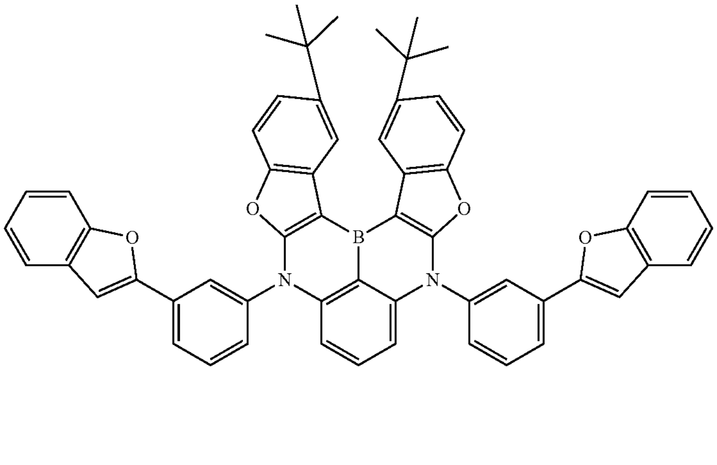

-continued
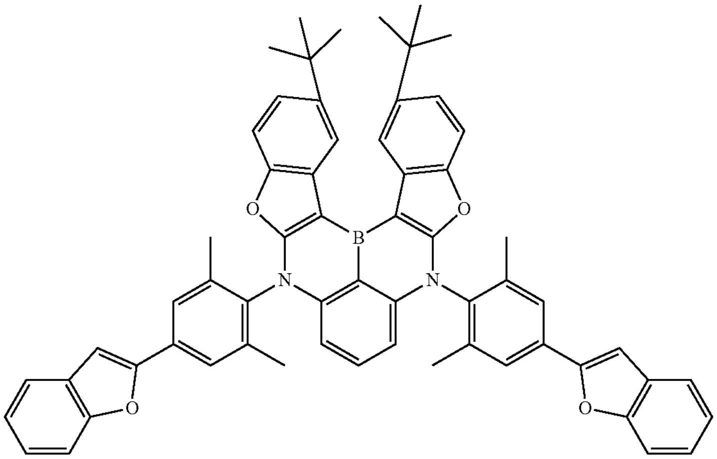
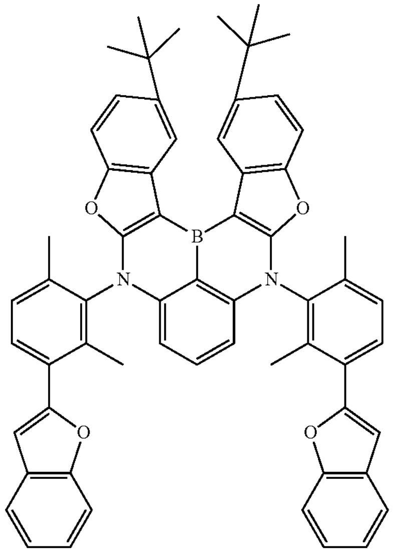
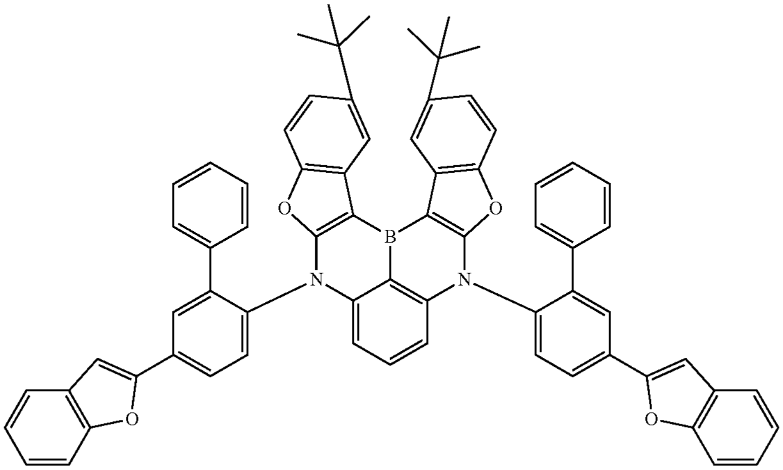
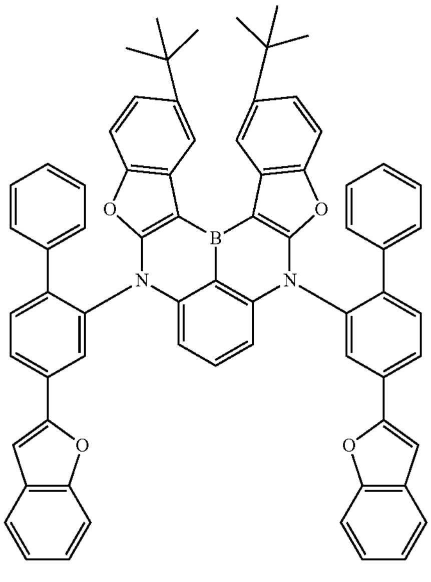
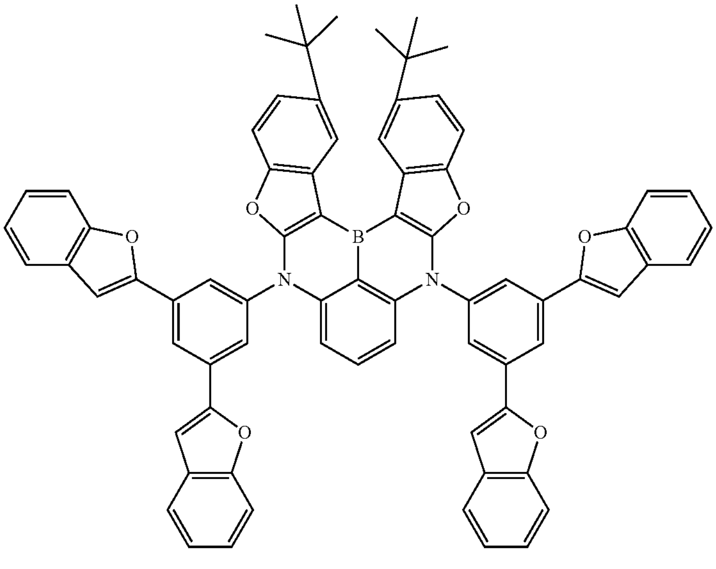

-continued
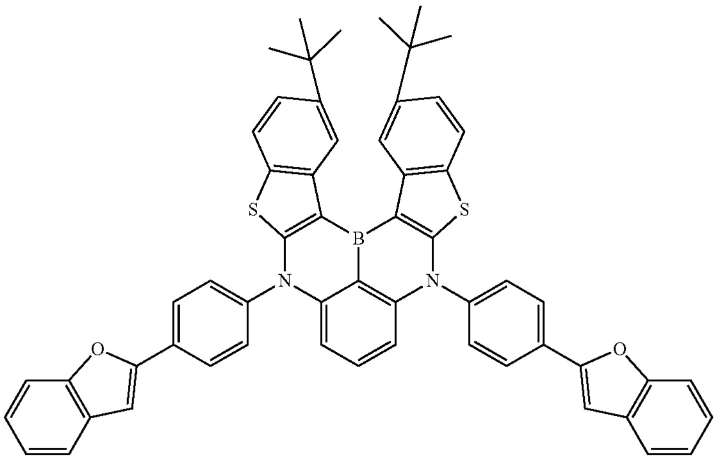
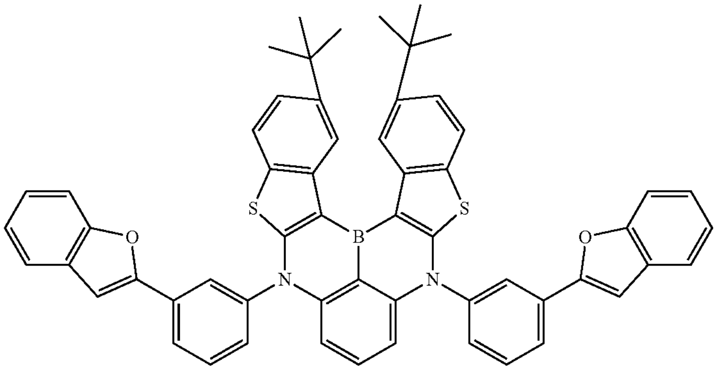
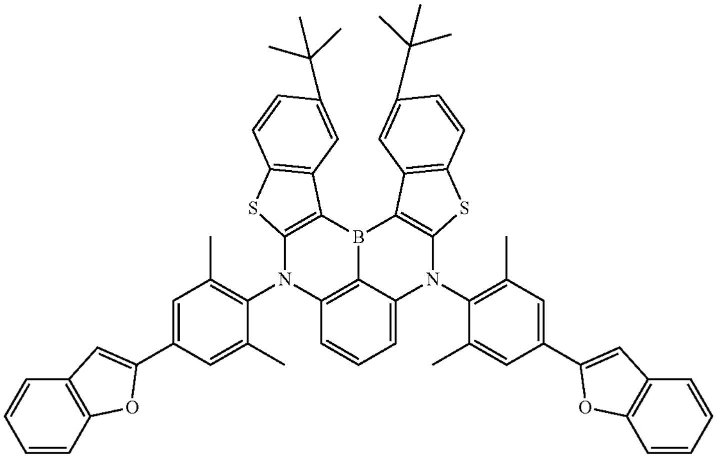

-continued
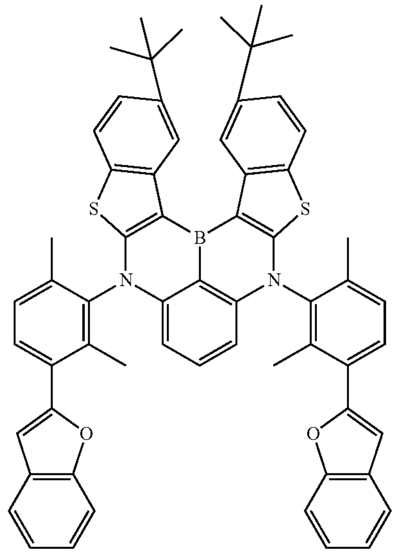
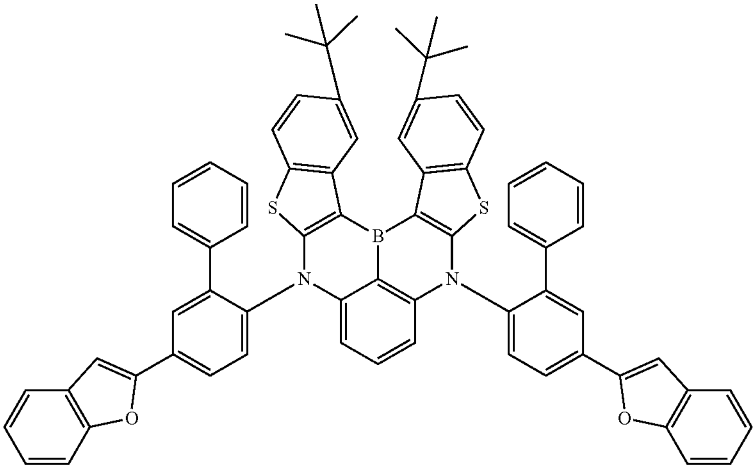
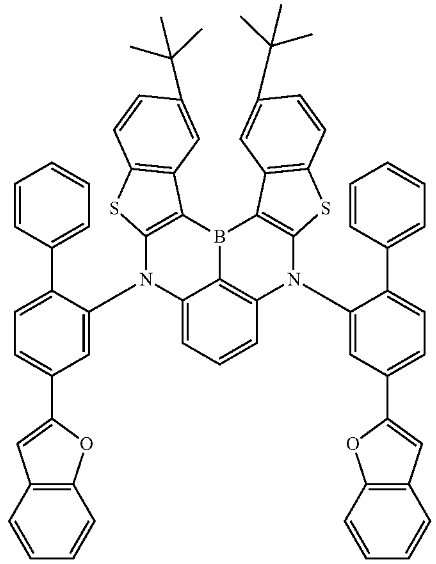
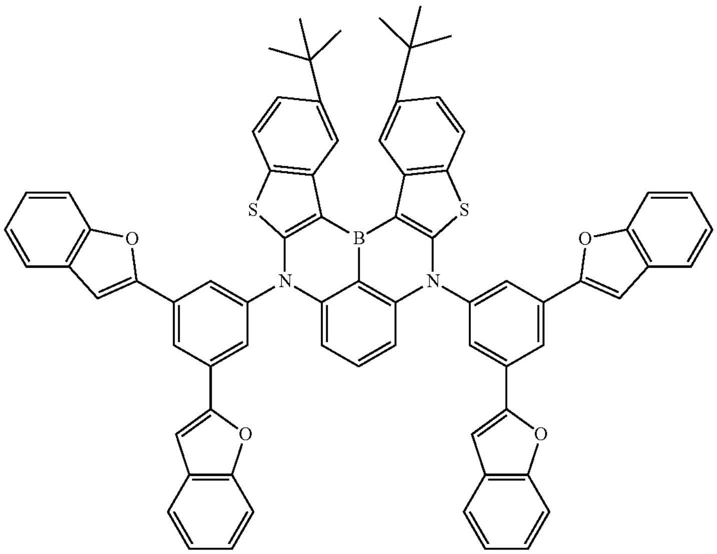
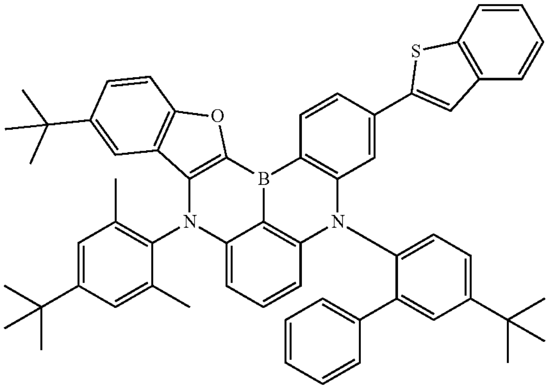
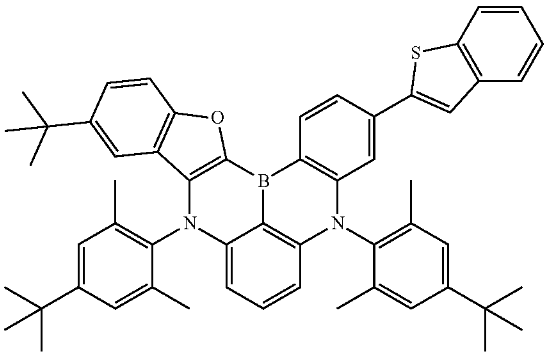

-continued
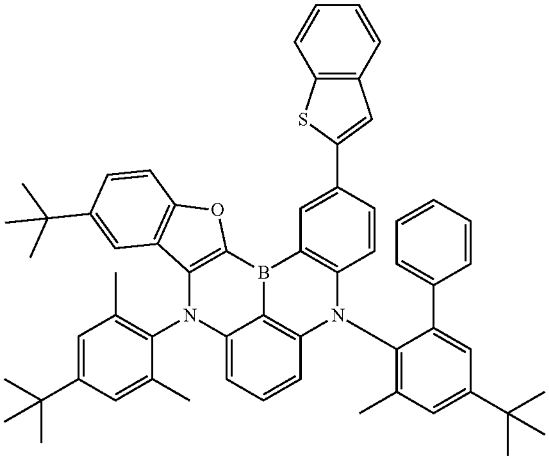
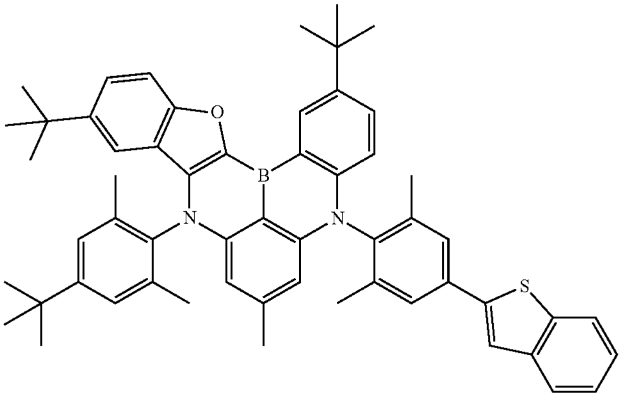
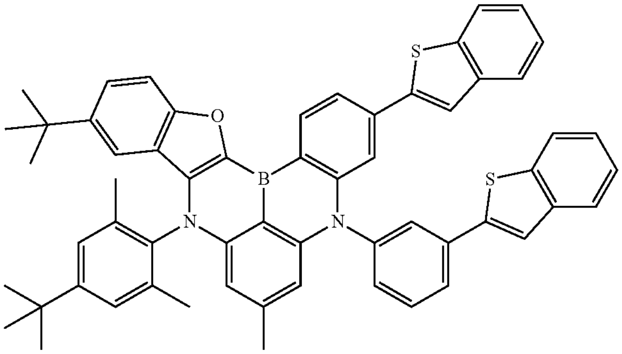
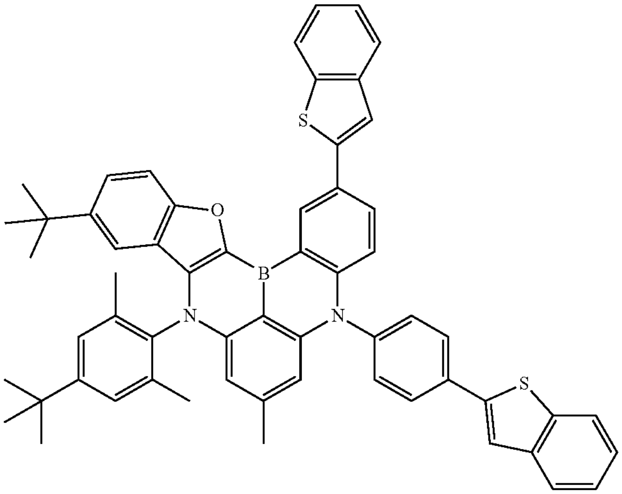
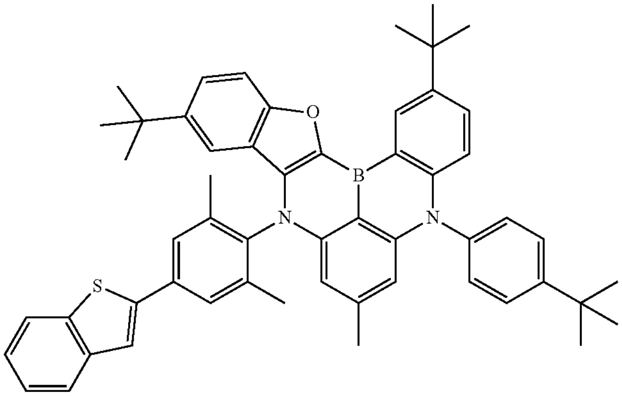

-continued
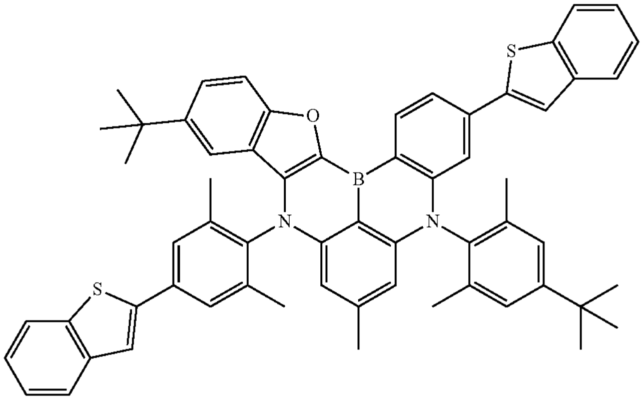
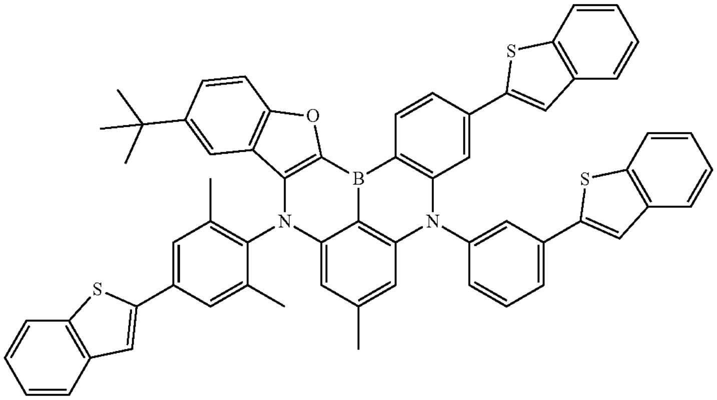
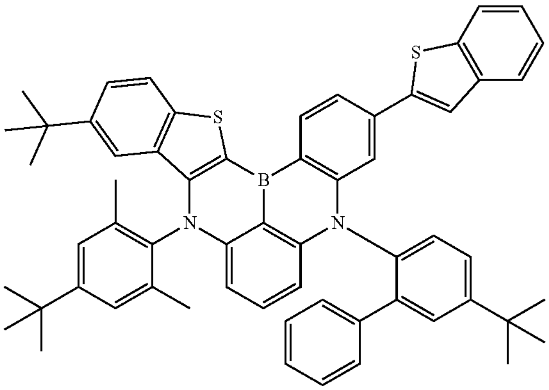
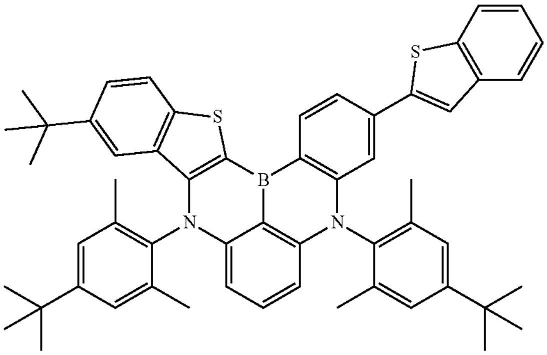
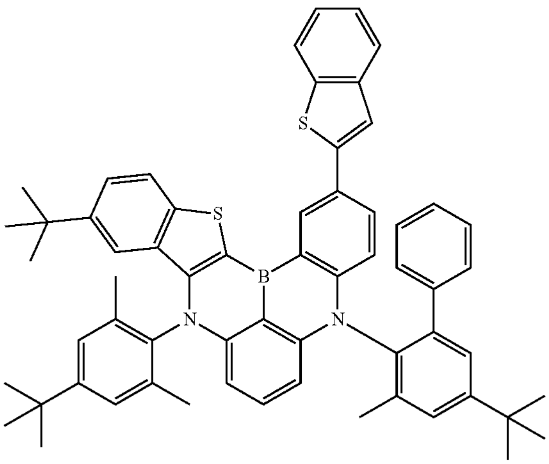
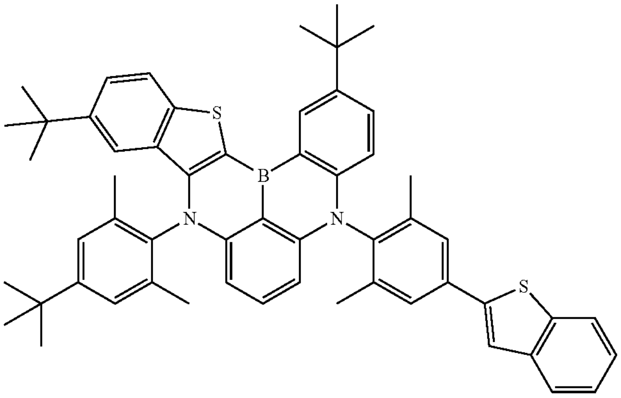

-continued
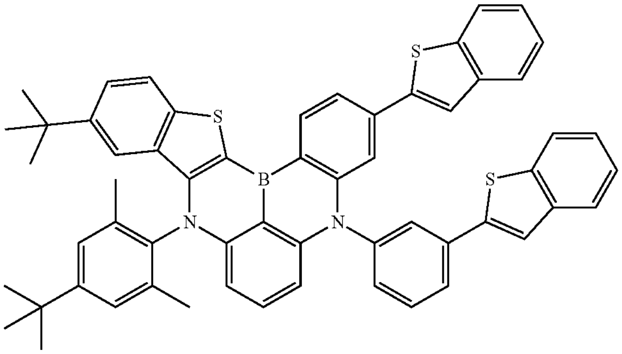
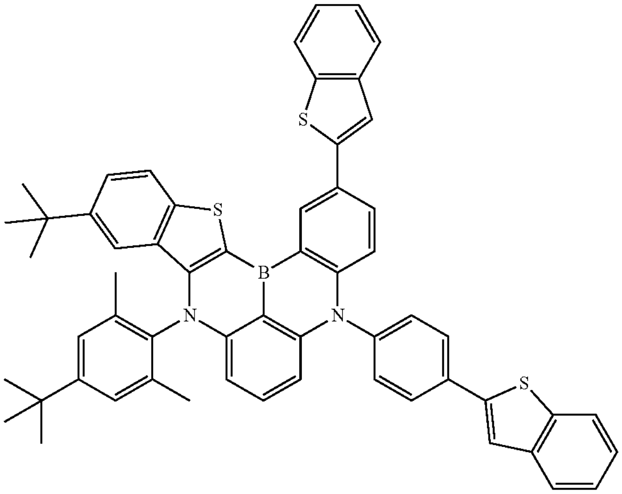
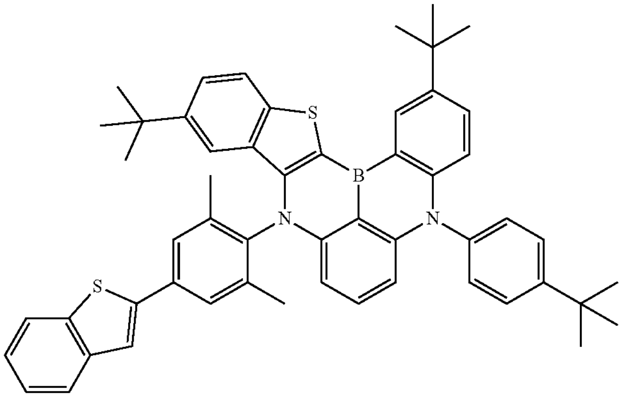
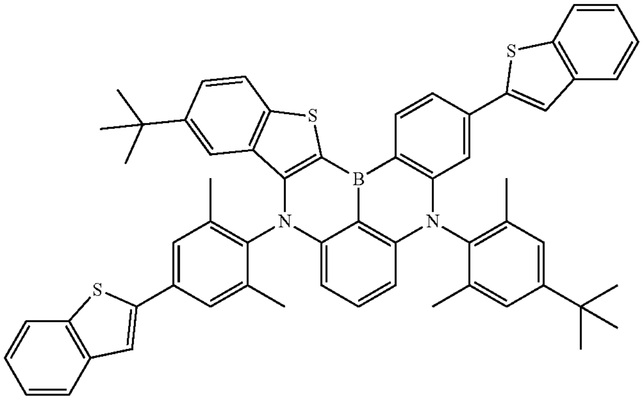

-continued
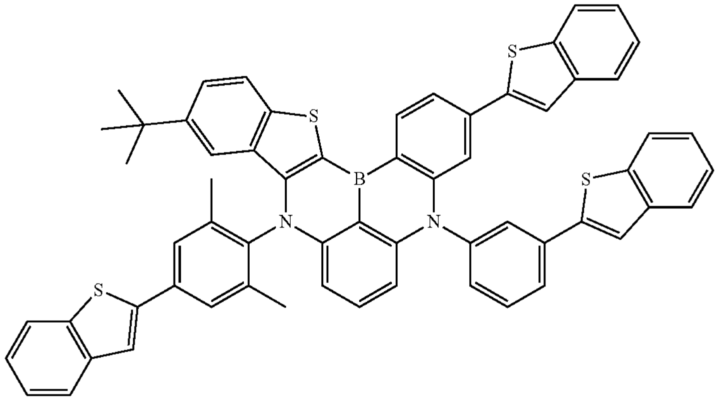
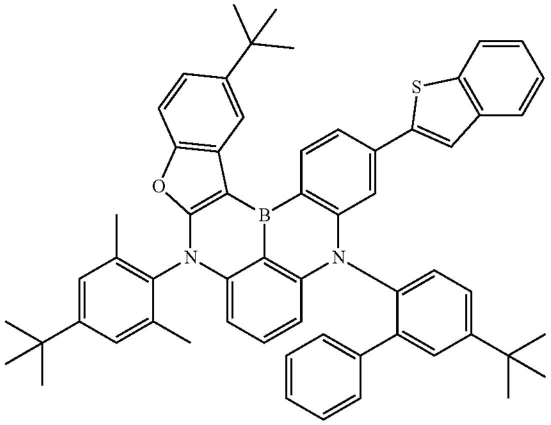
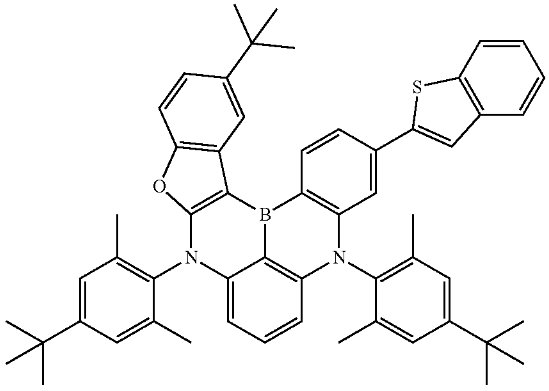
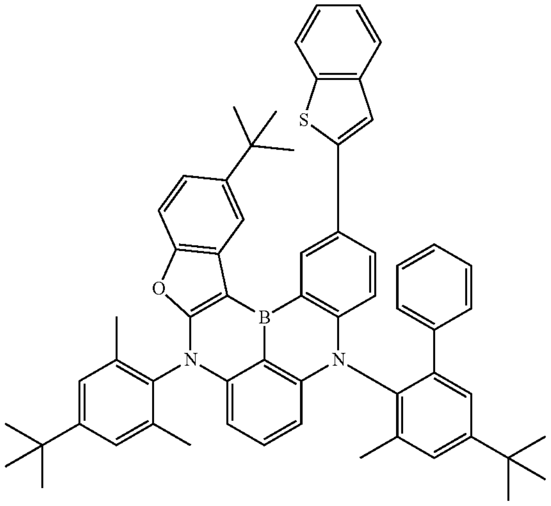
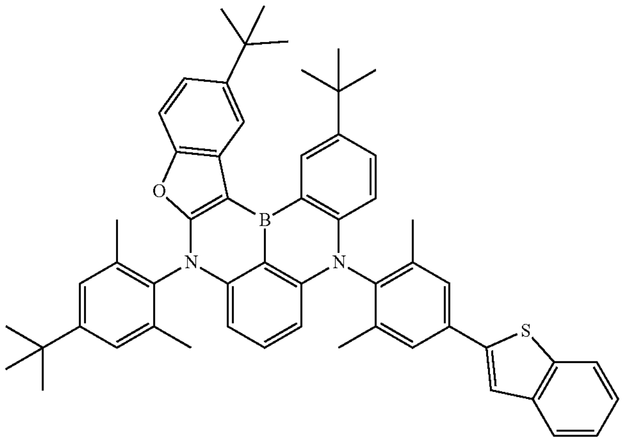
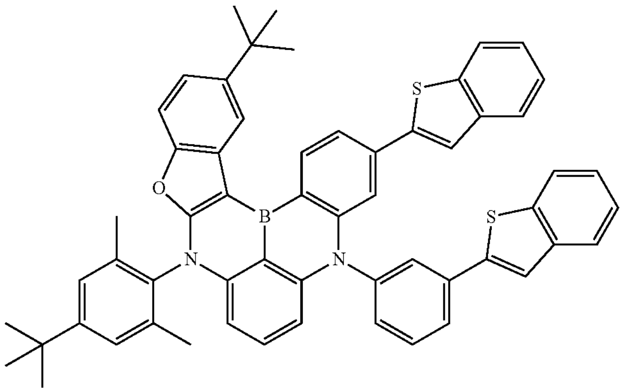

-continued
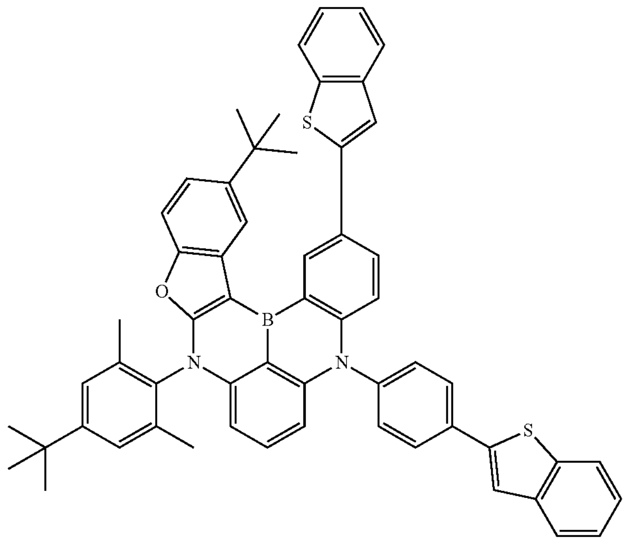
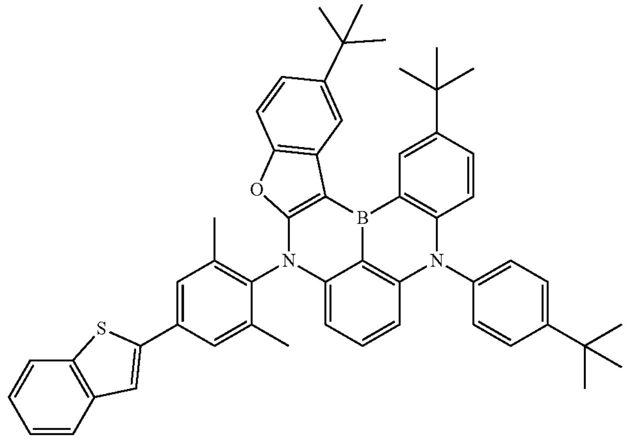
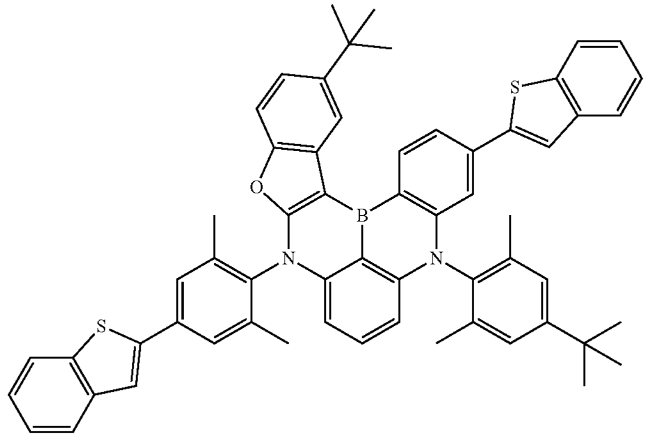

-continued
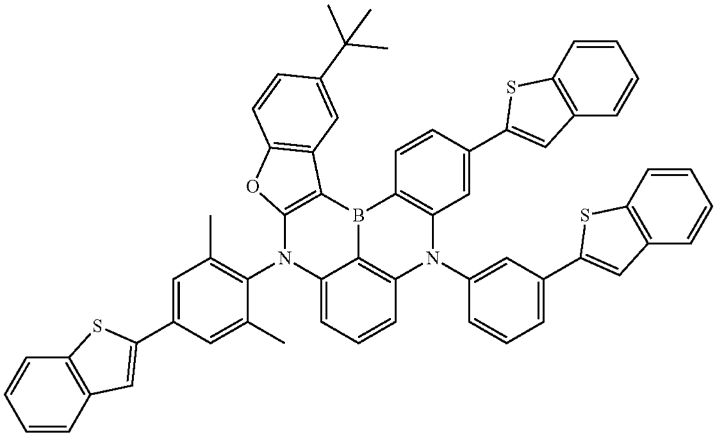
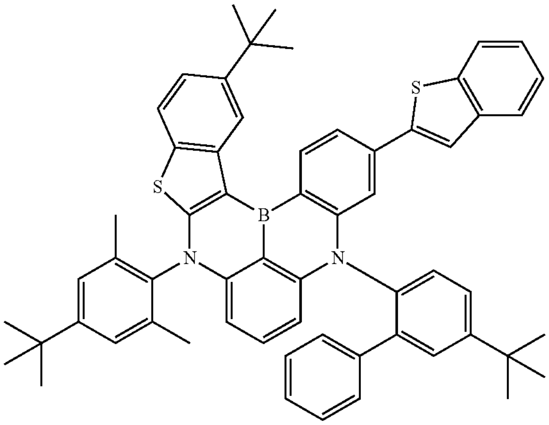
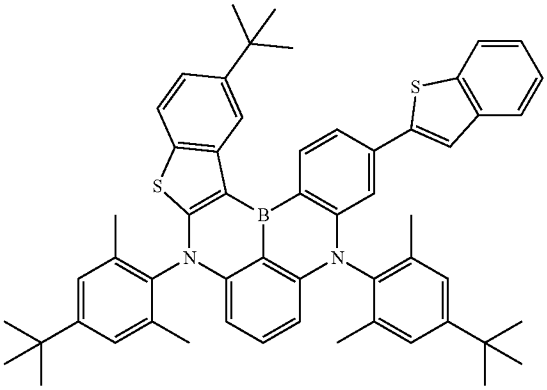
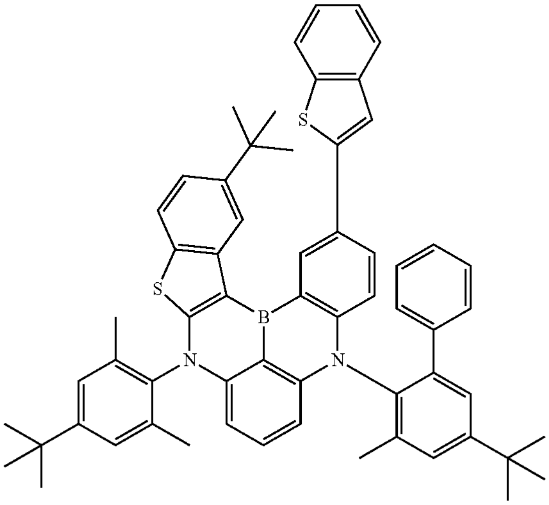
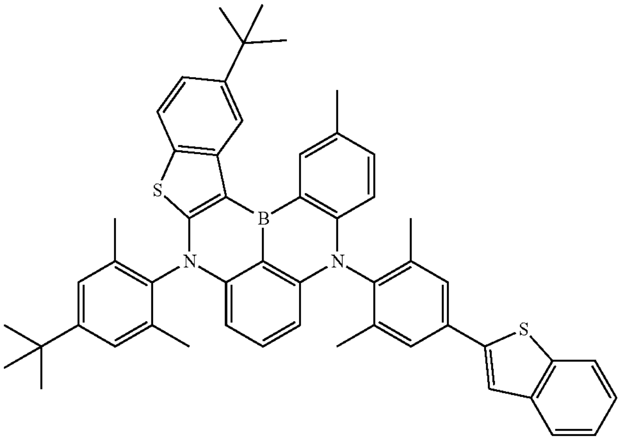

-continued
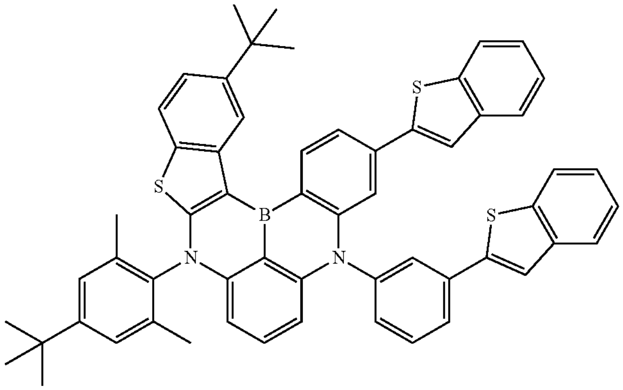
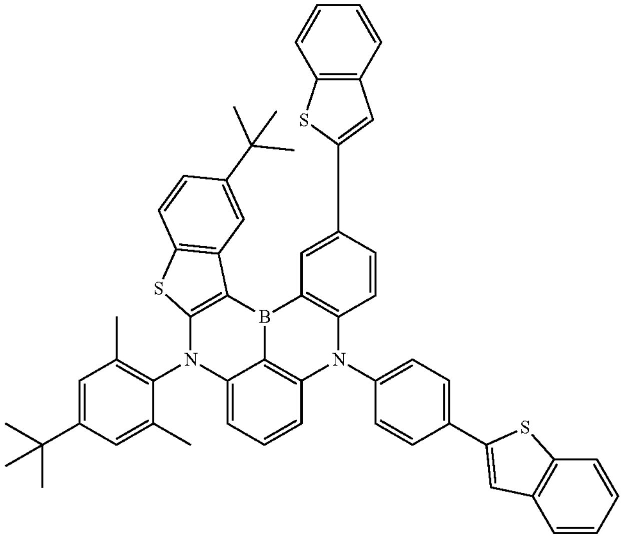
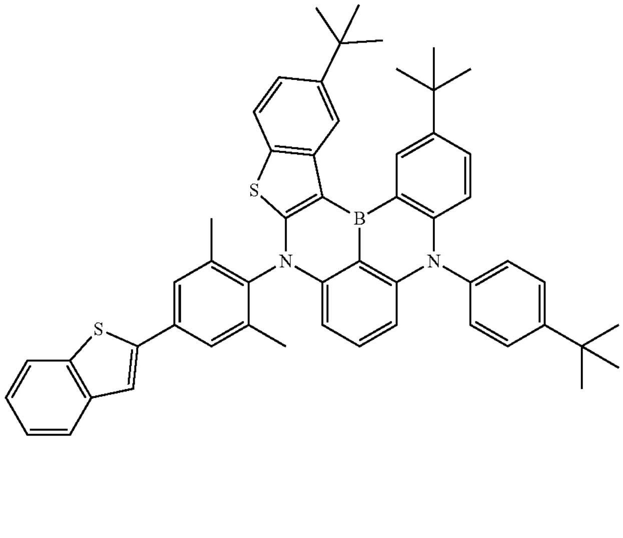

-continued
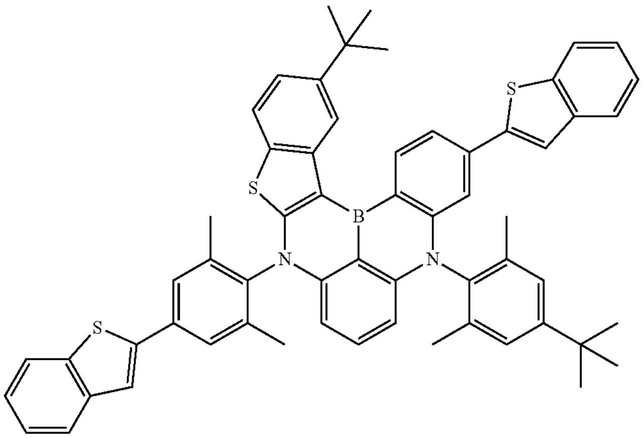
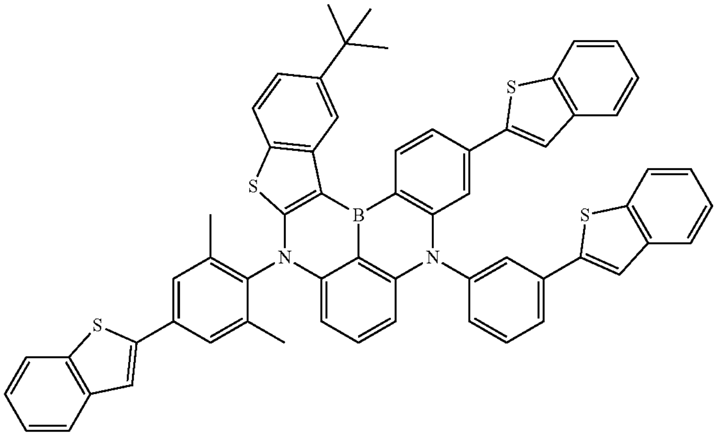
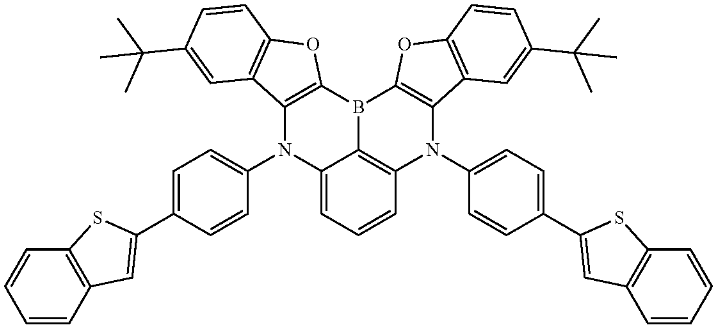
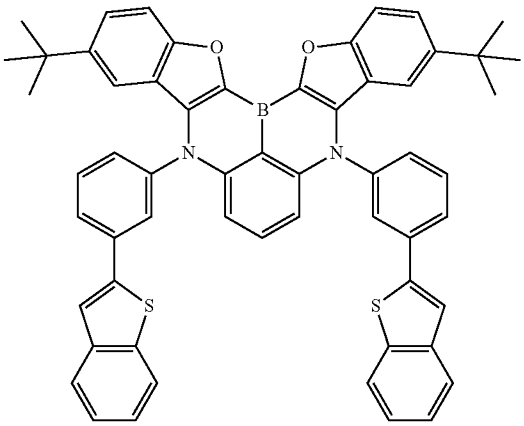

-continued
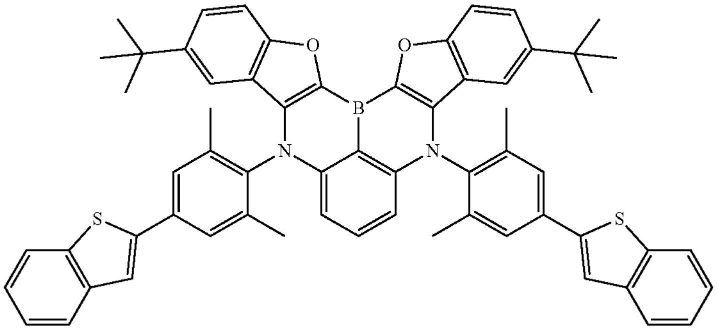
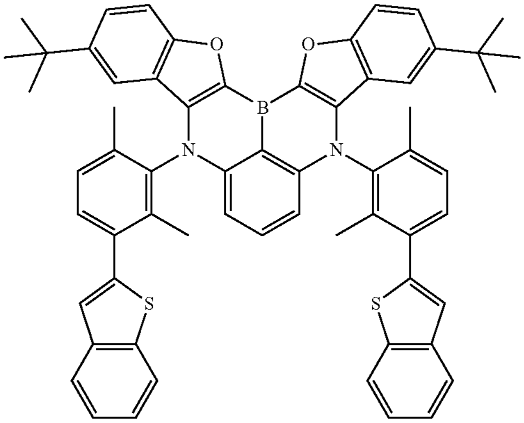
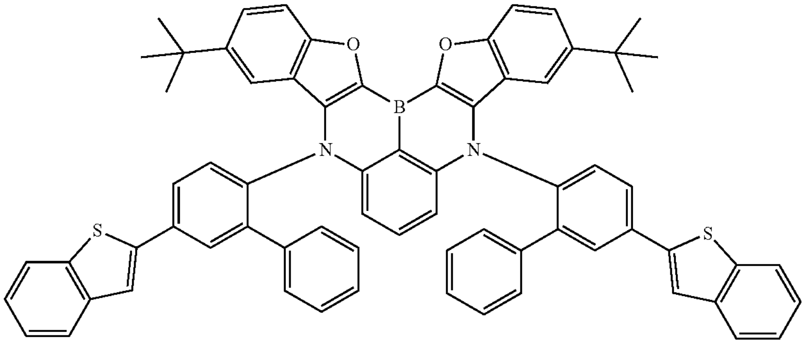
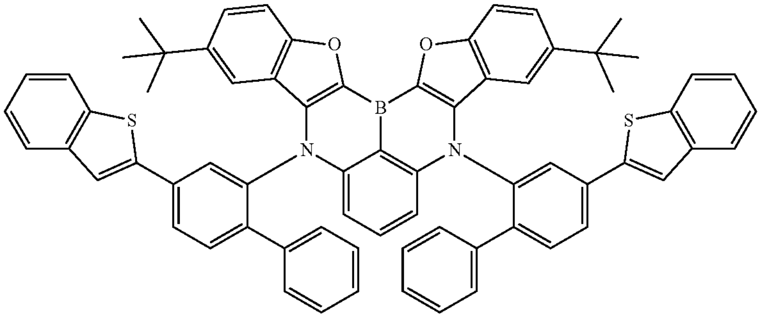

-continued
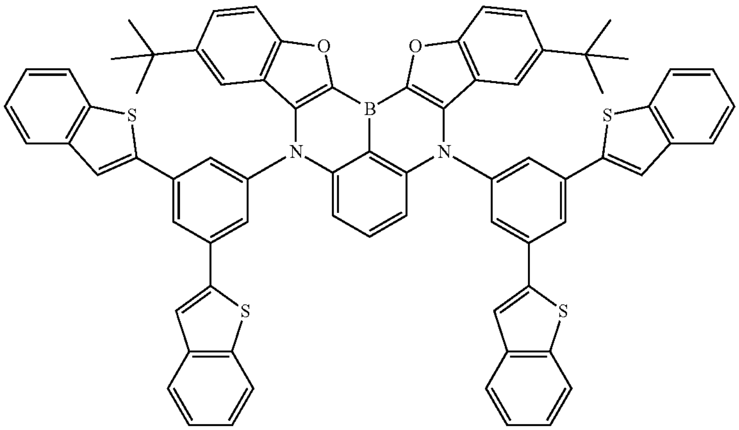
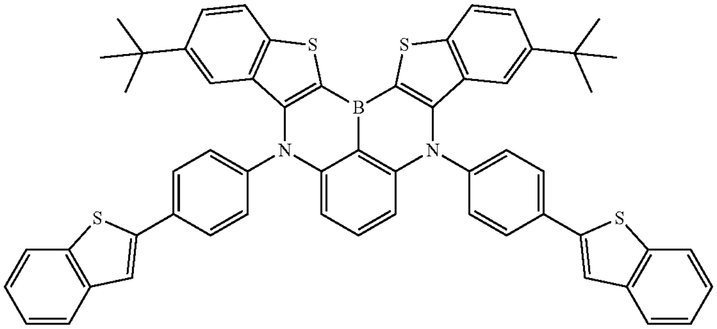
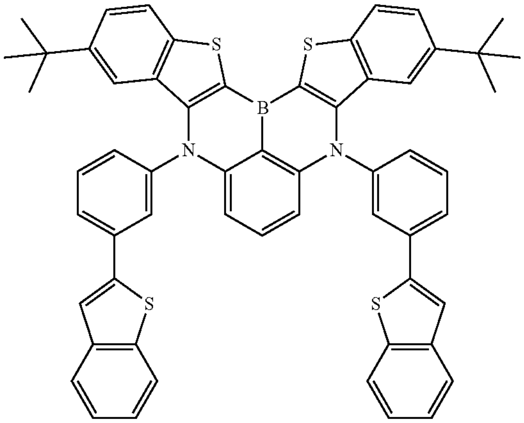
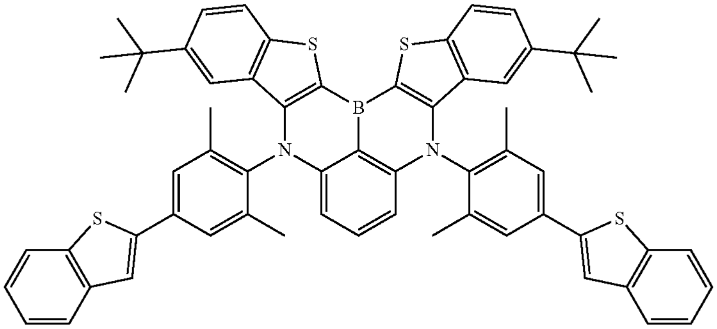

-continued
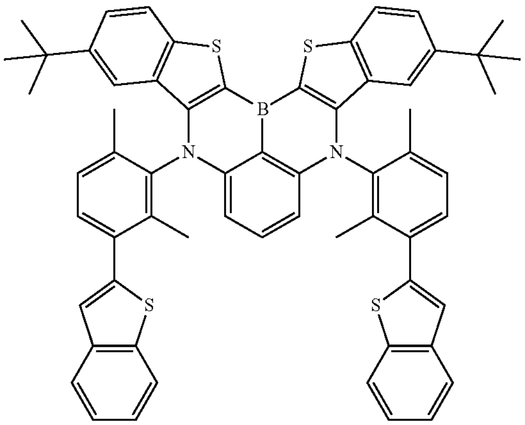
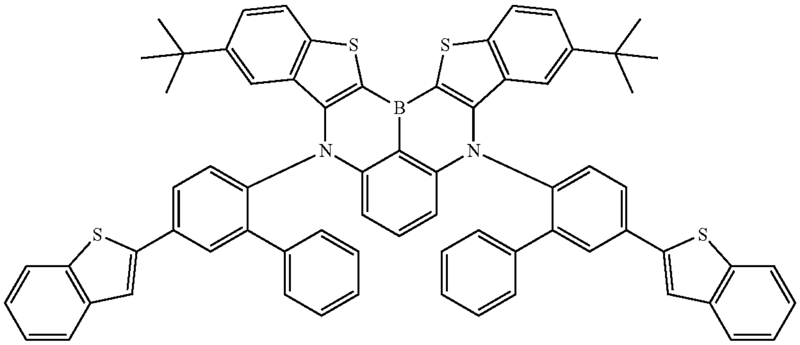
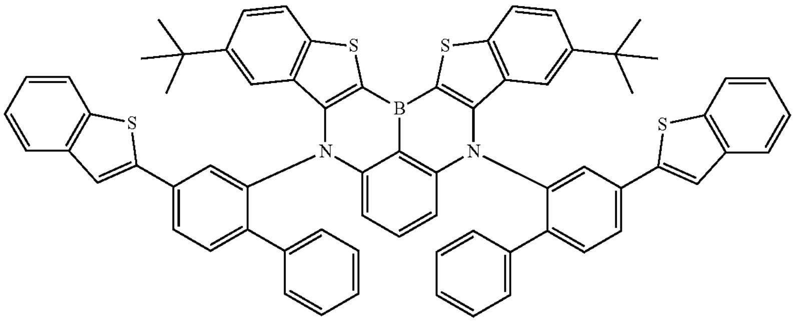
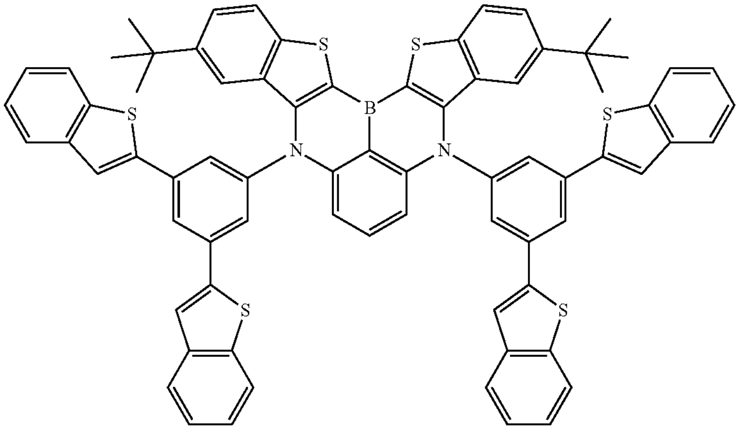

-continued
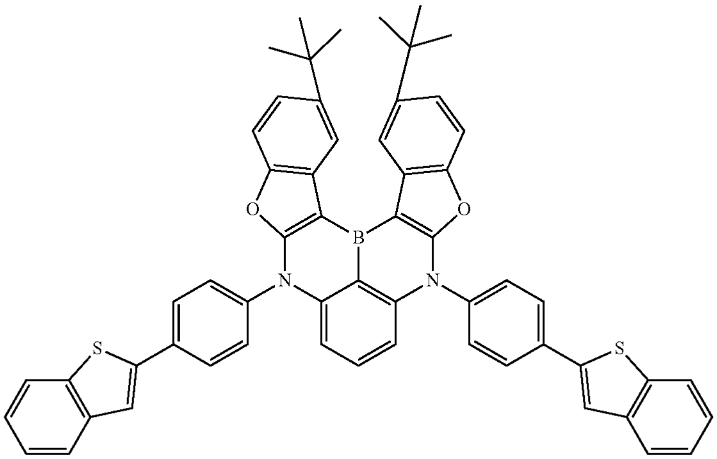
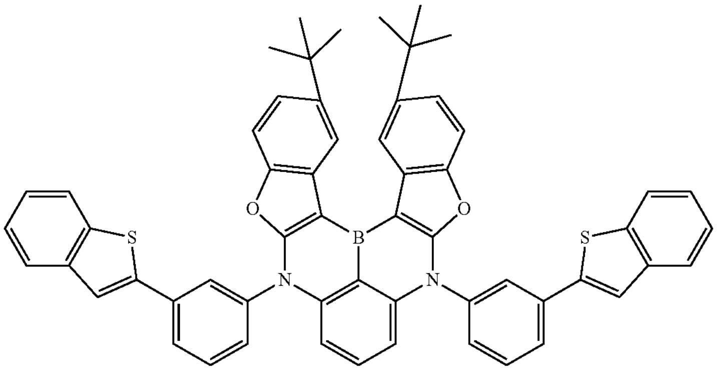
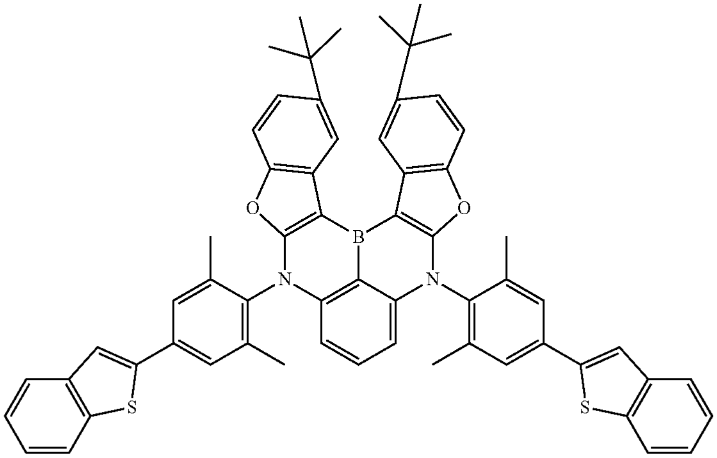

-continued
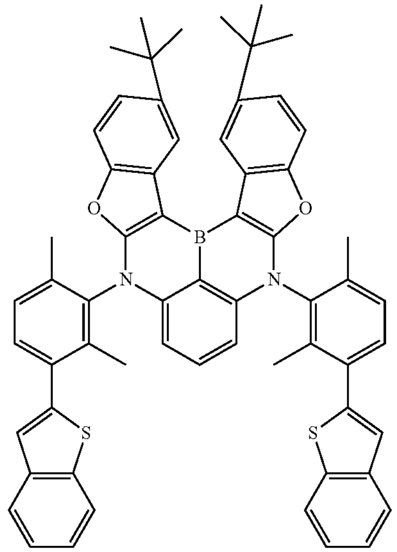
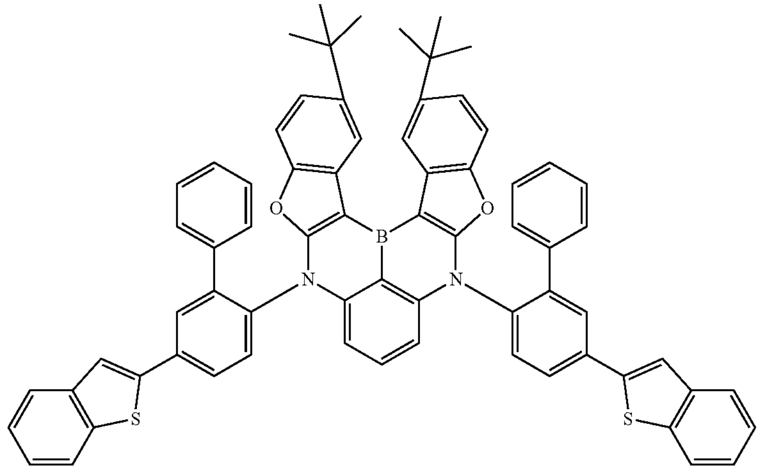
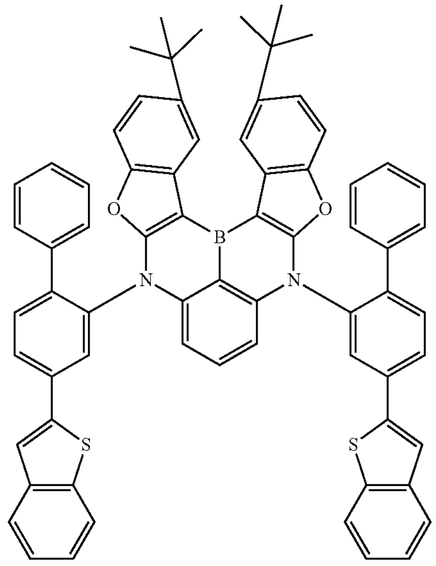
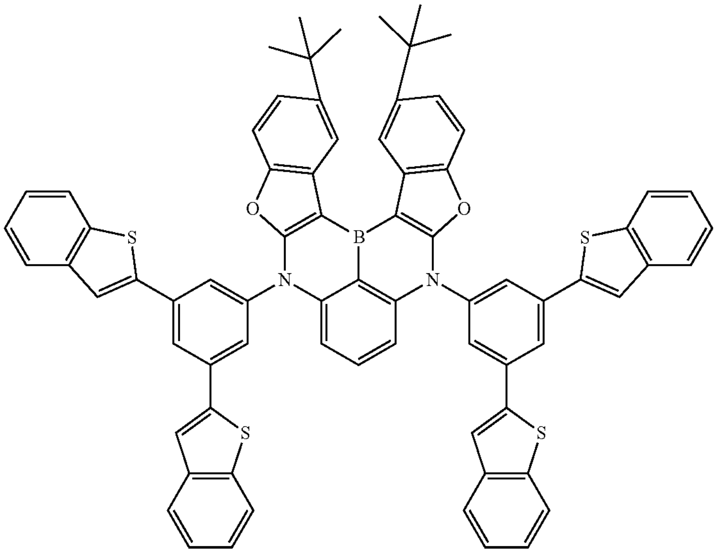
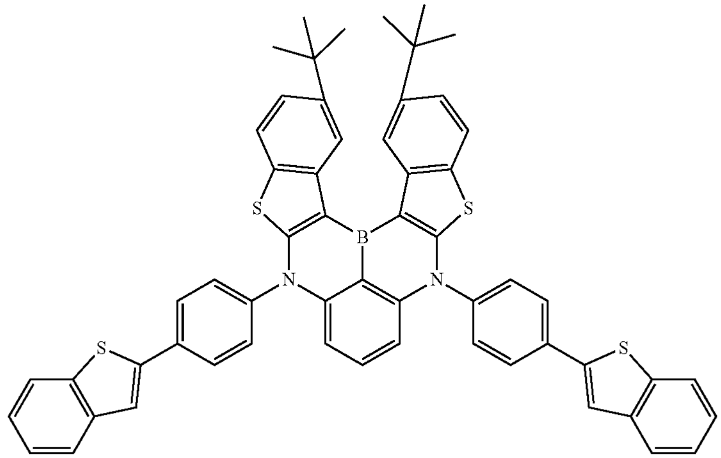

-continued
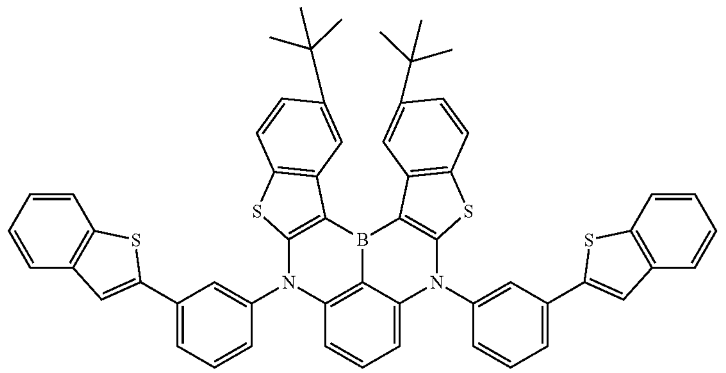
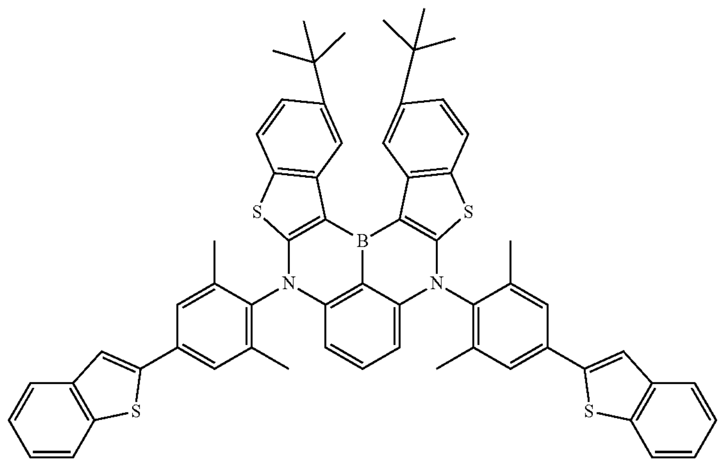
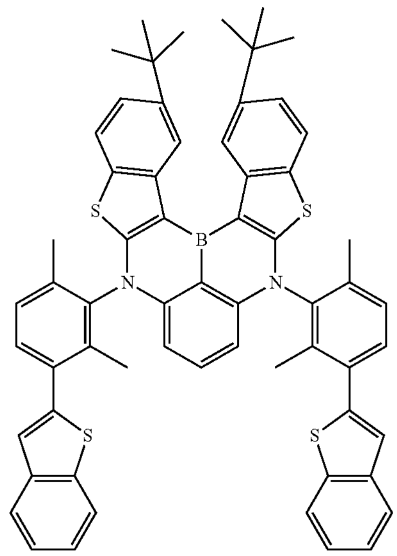
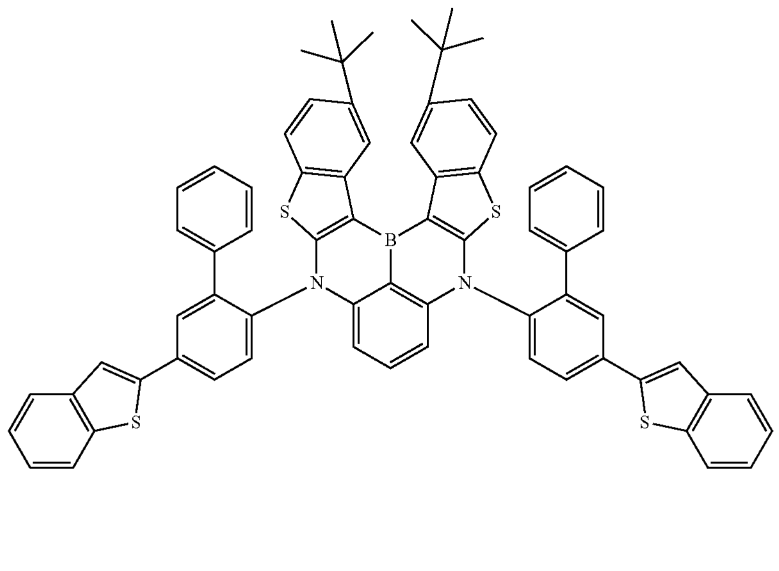

-continued
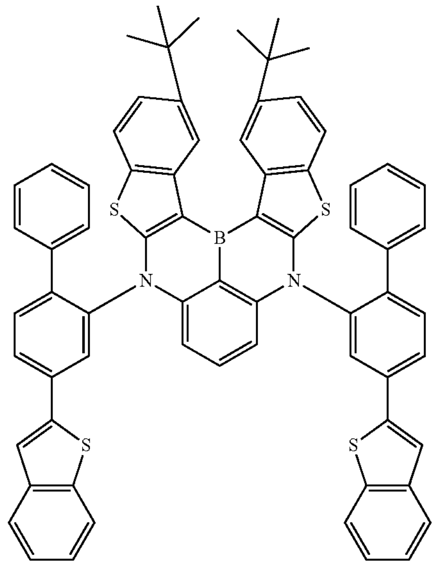
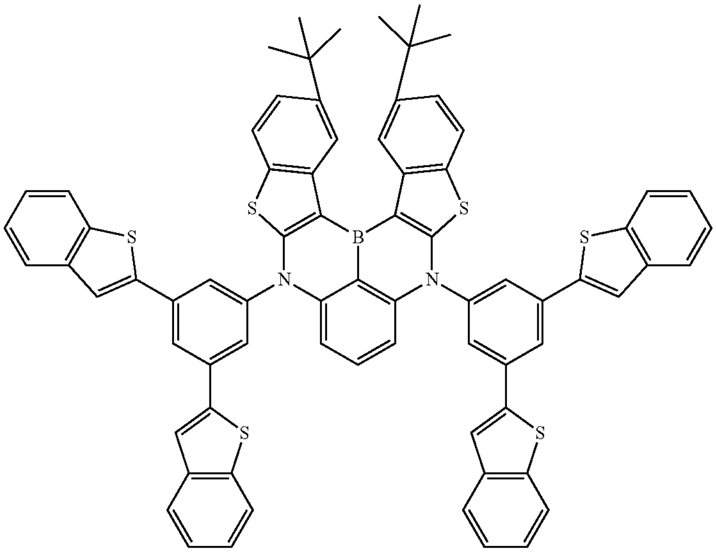
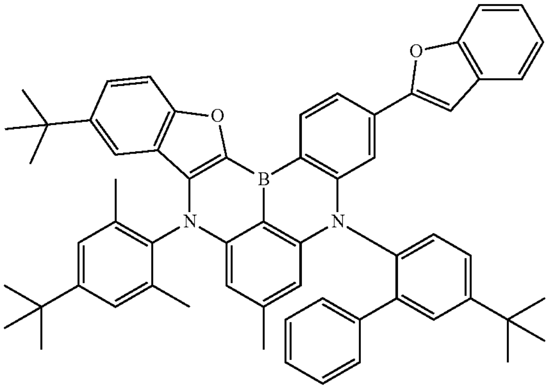
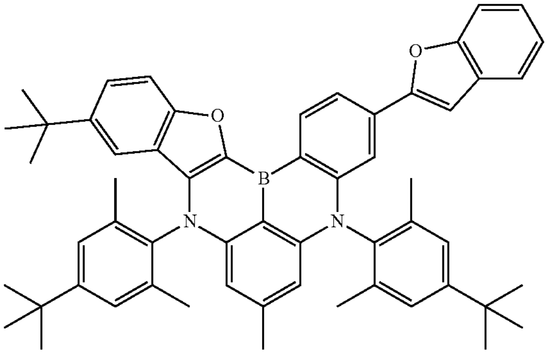
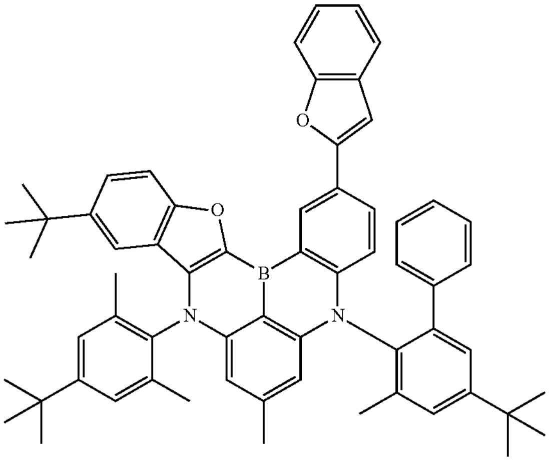
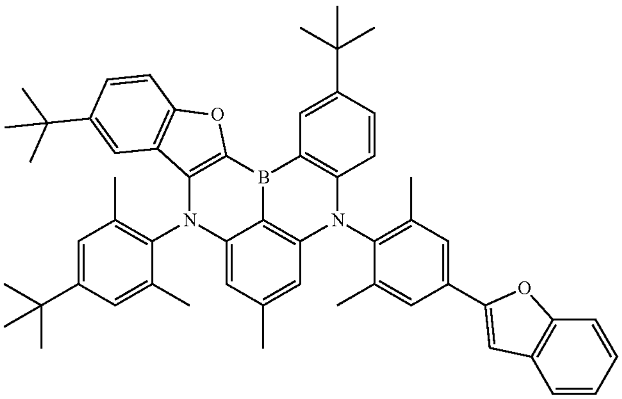

-continued
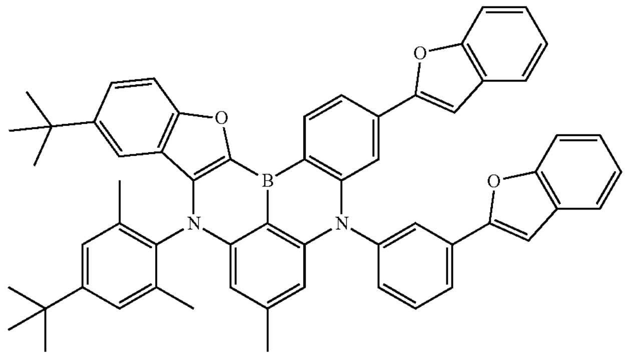
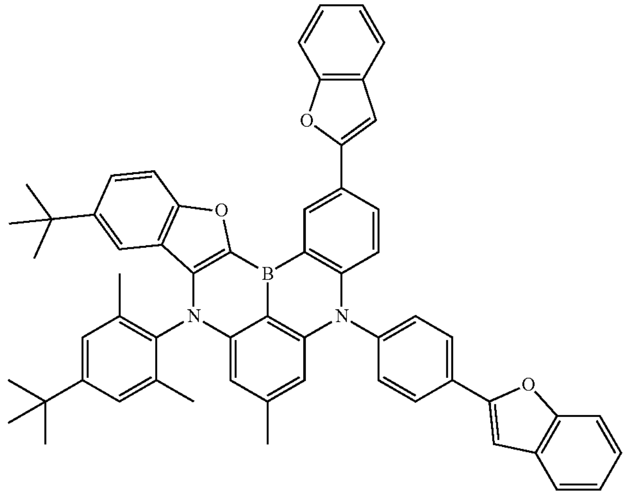
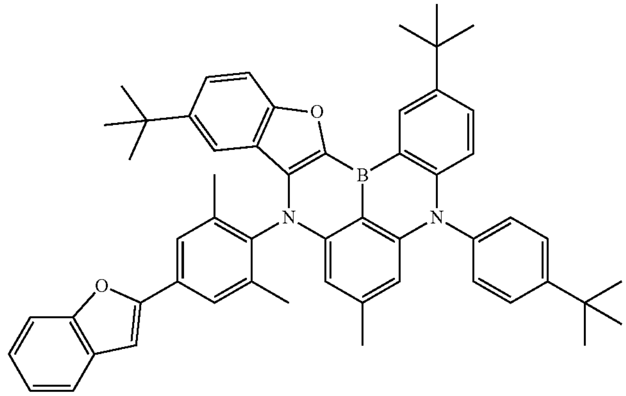
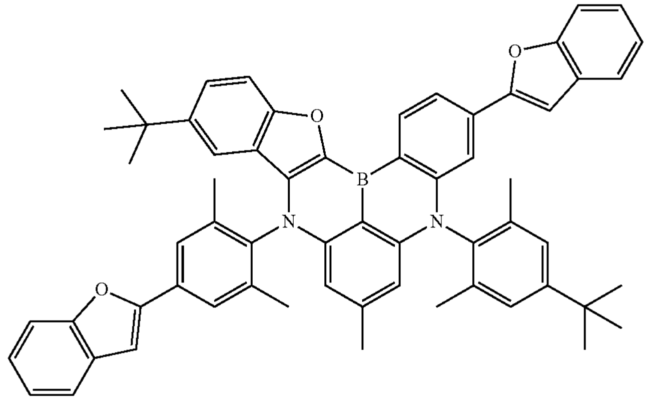

-continued
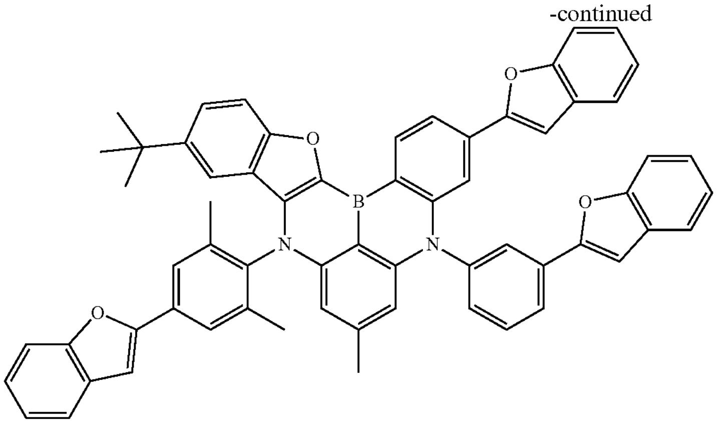
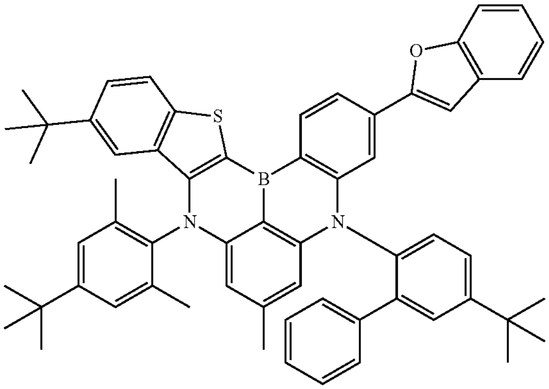
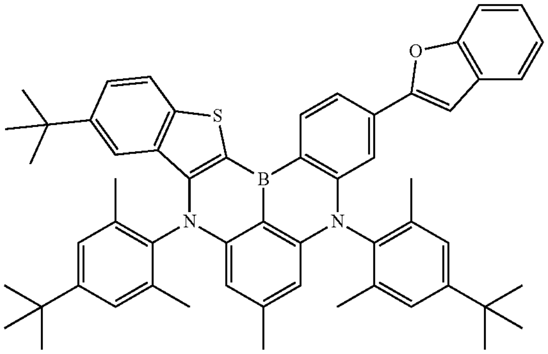
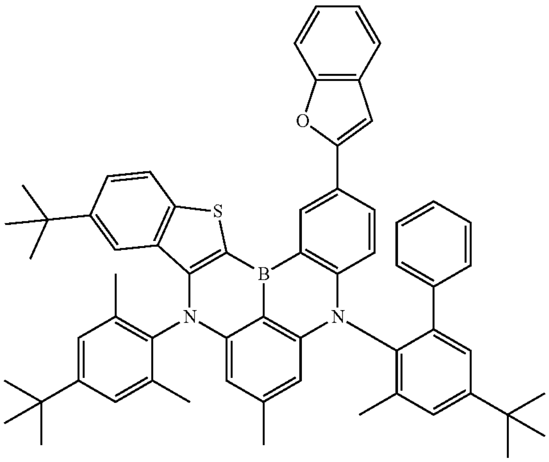
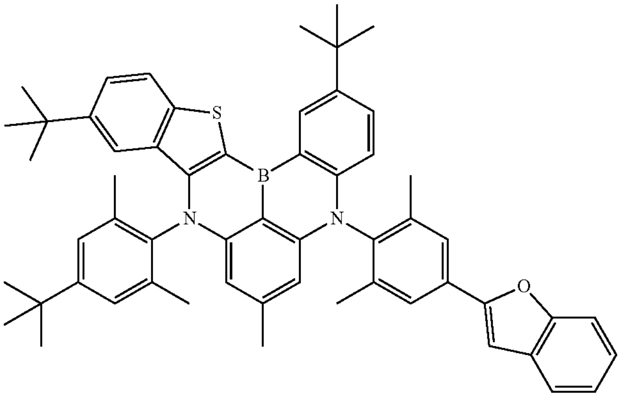
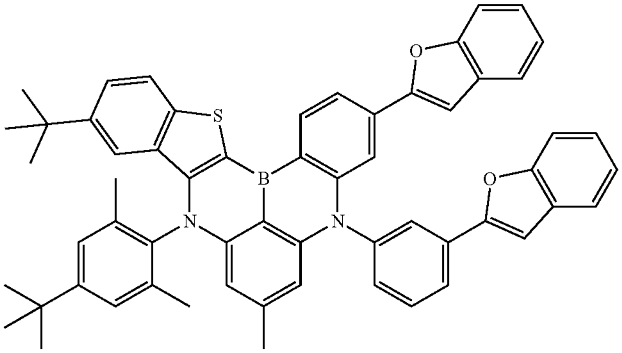

-continued
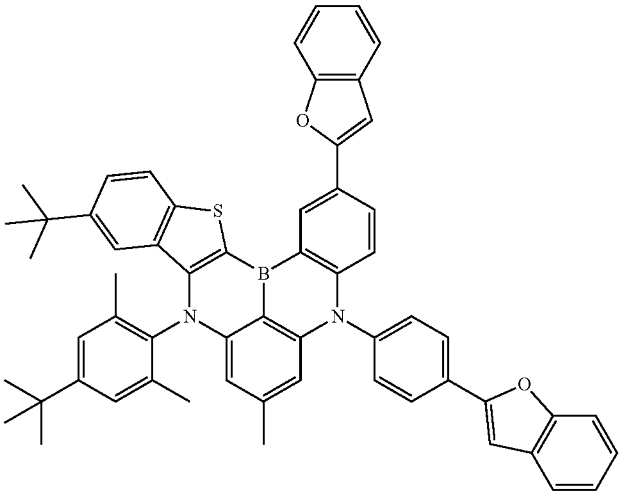
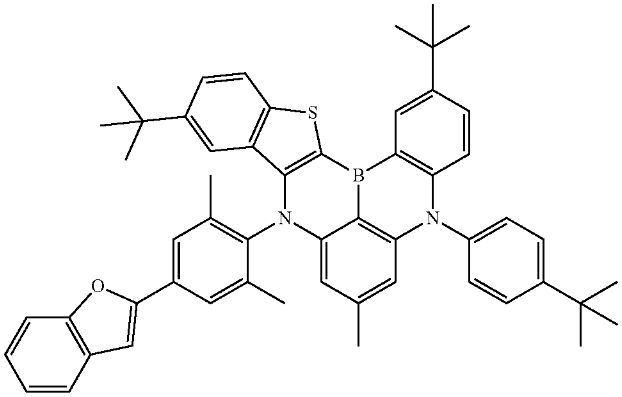
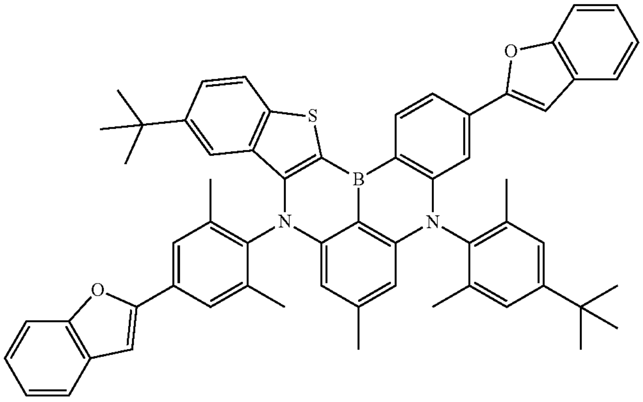
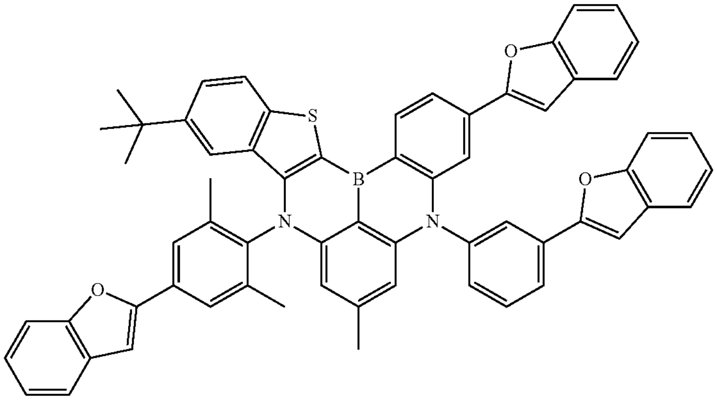

-continued
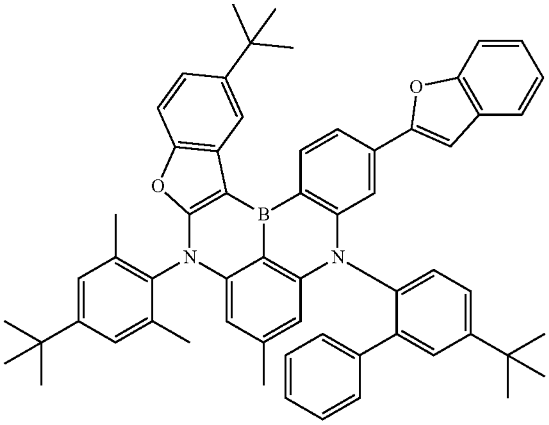
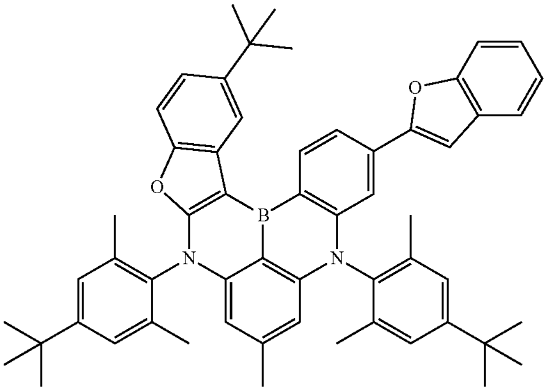
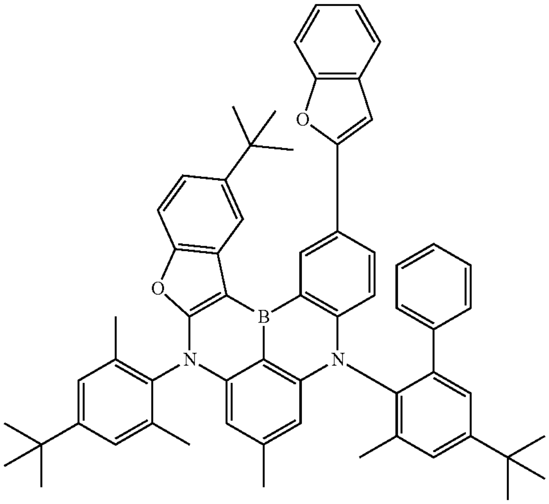
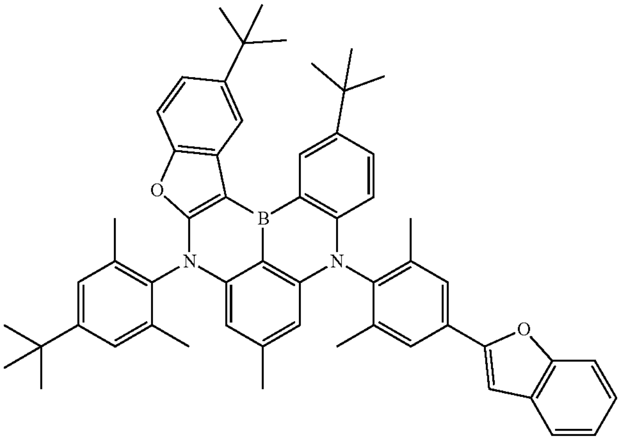
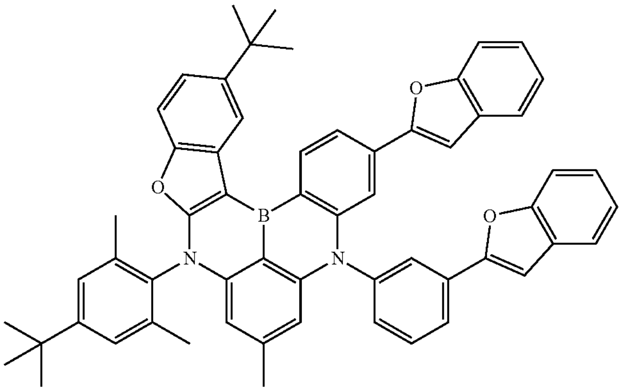

-continued
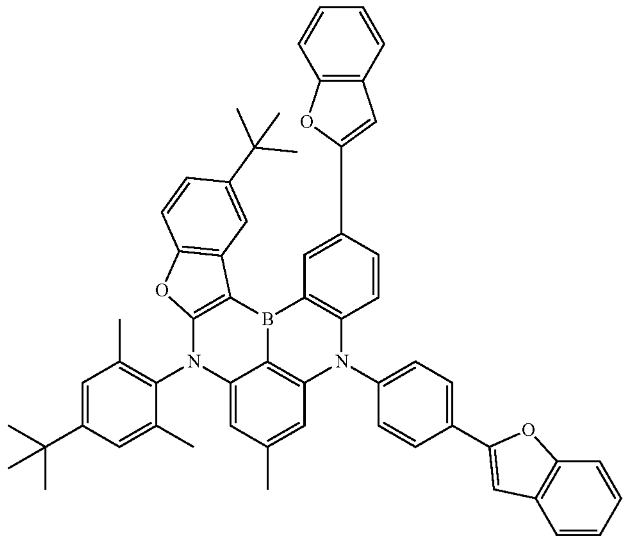
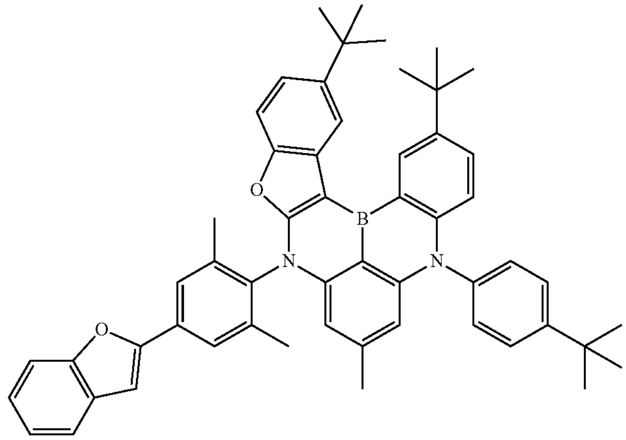
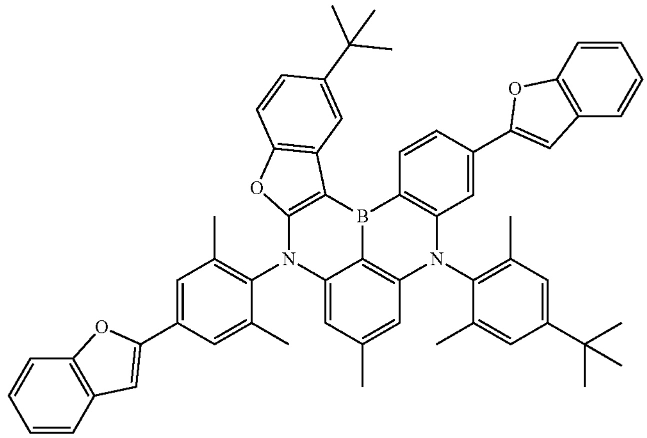

-continued
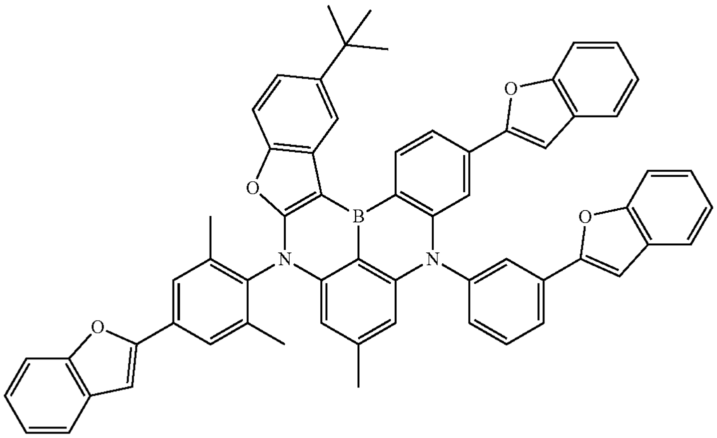
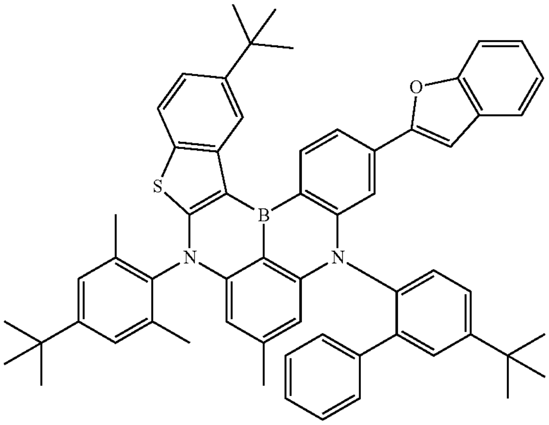
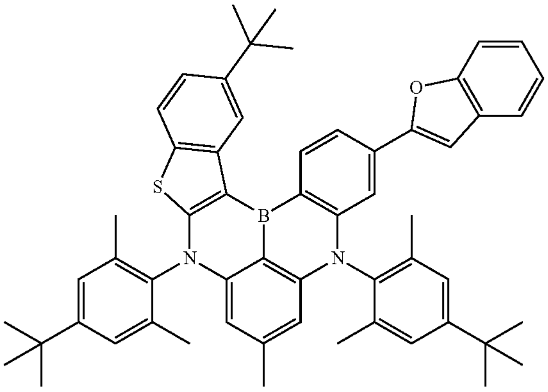
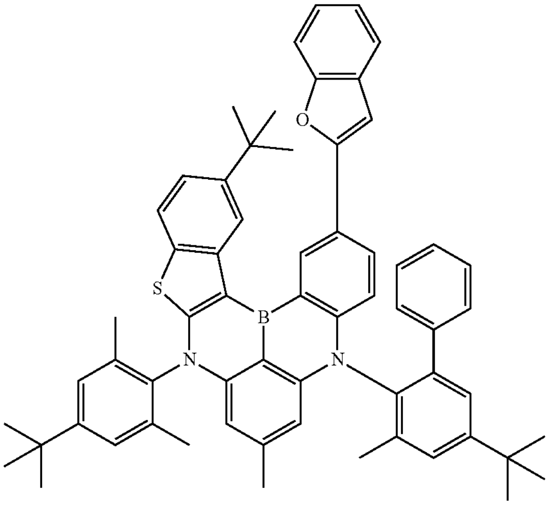

-continued
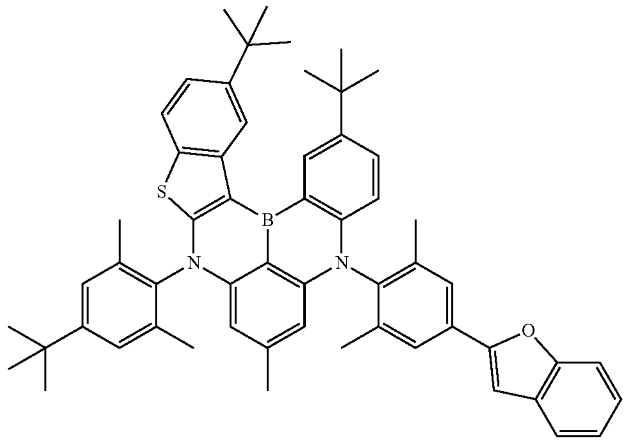
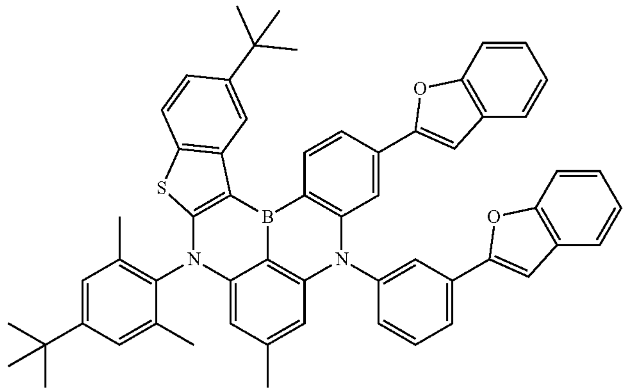
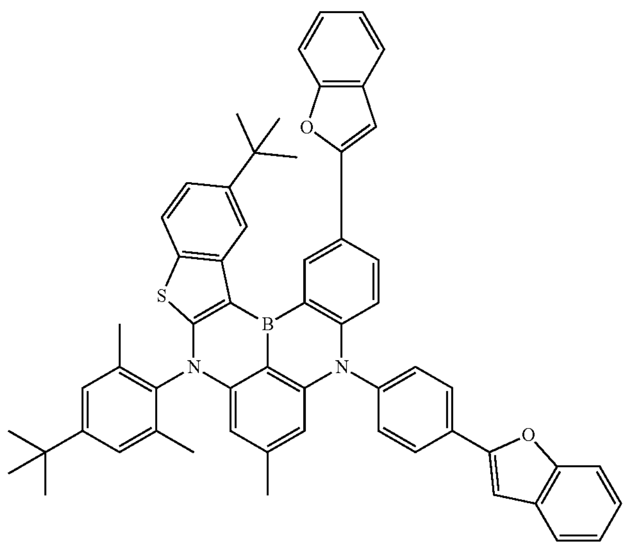

-continued
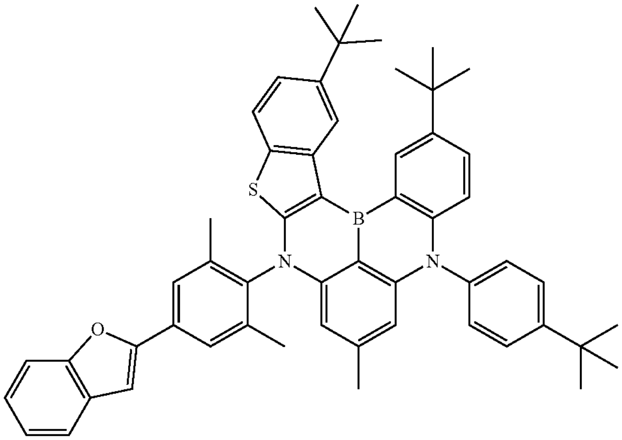
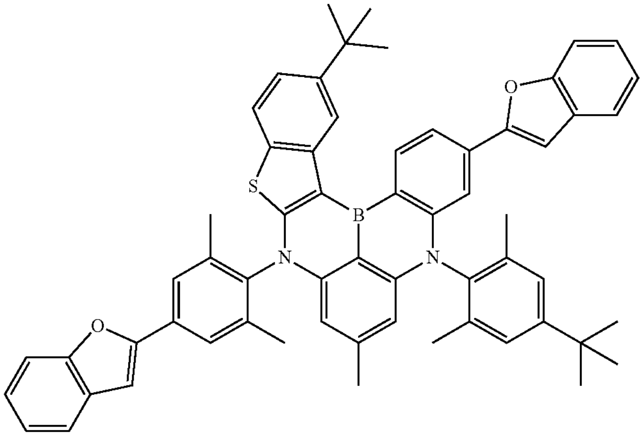
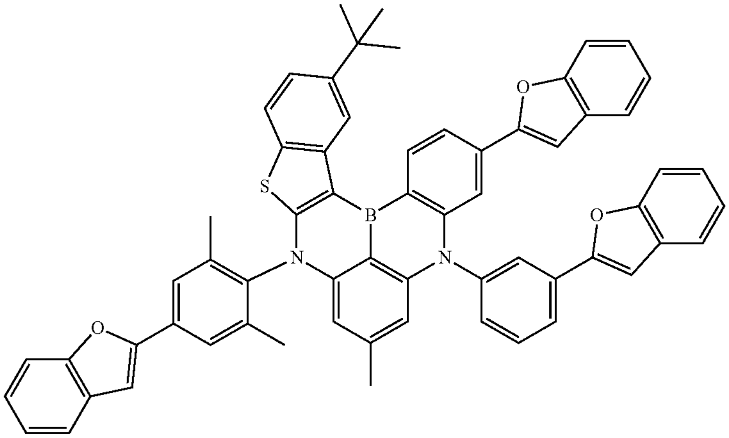
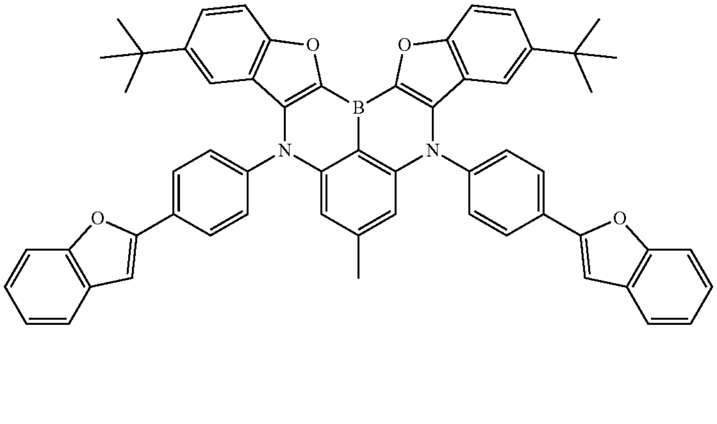

-continued
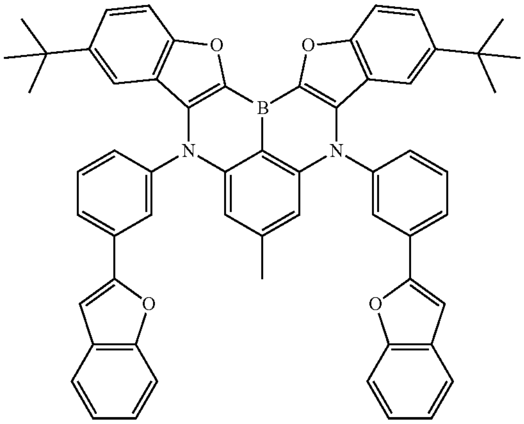
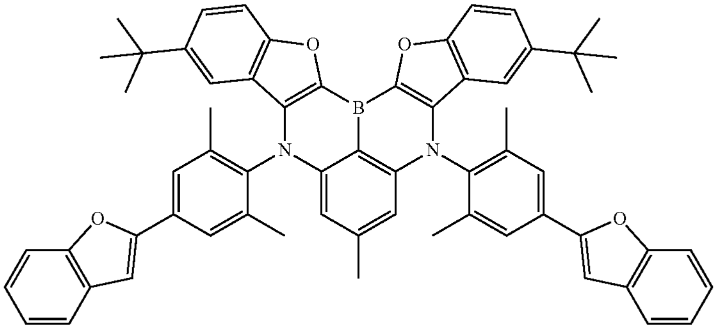
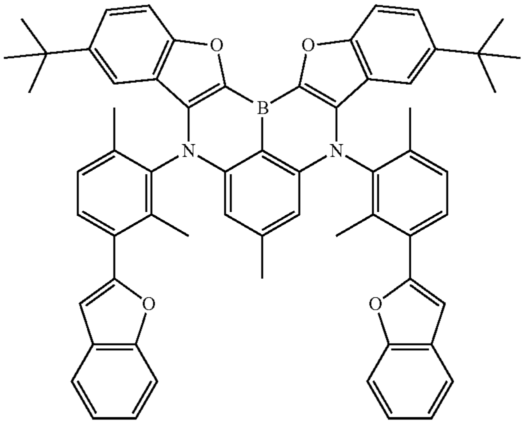
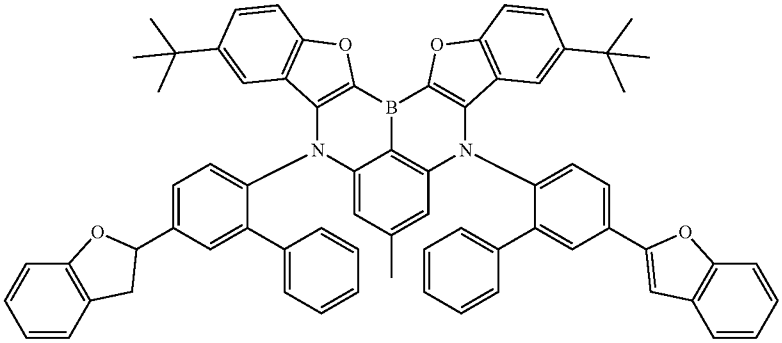

-continued
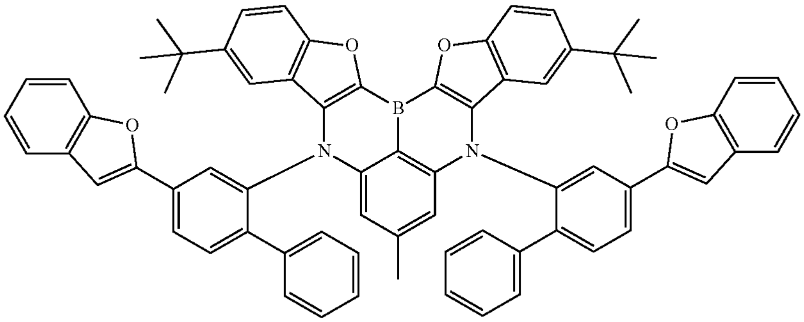
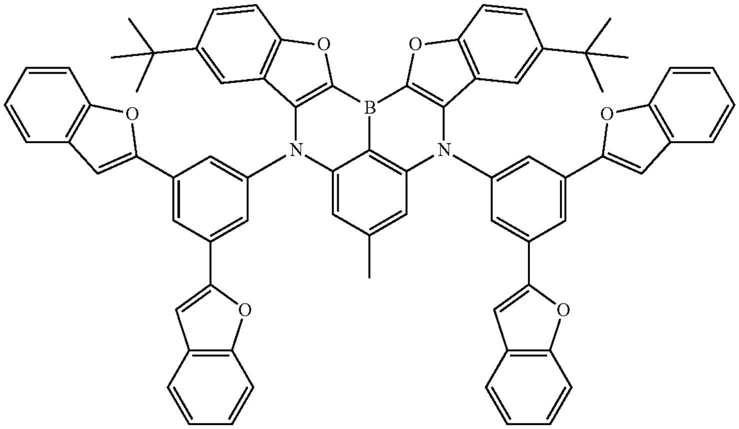
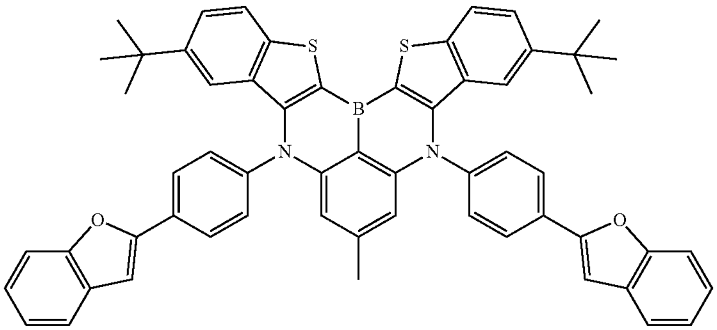
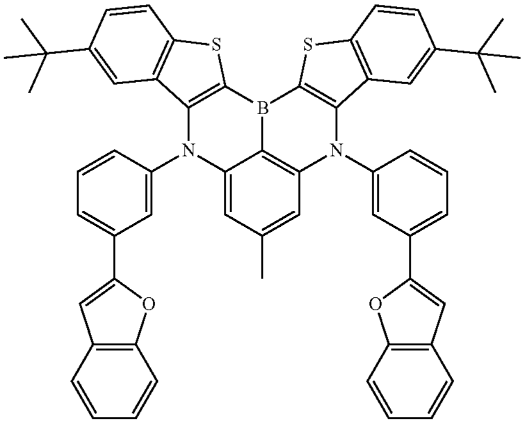

-continued
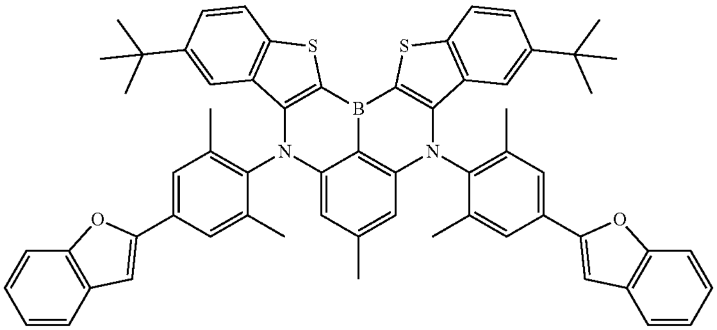
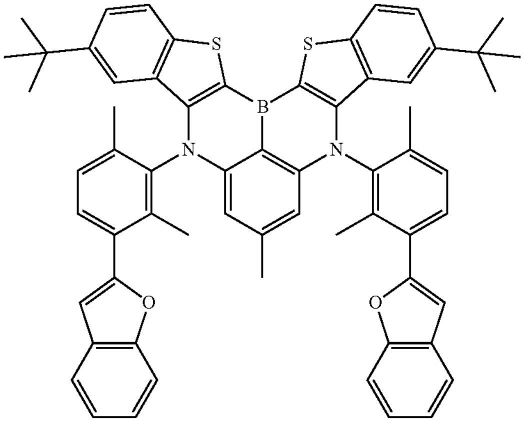
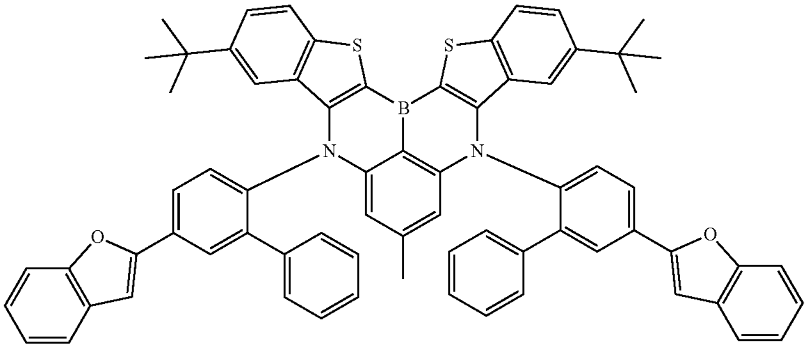
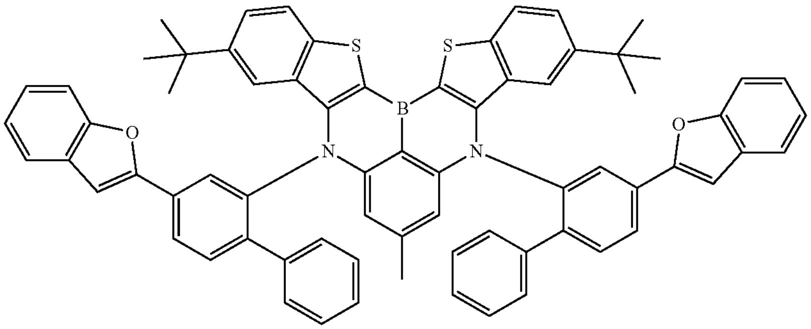

-continued
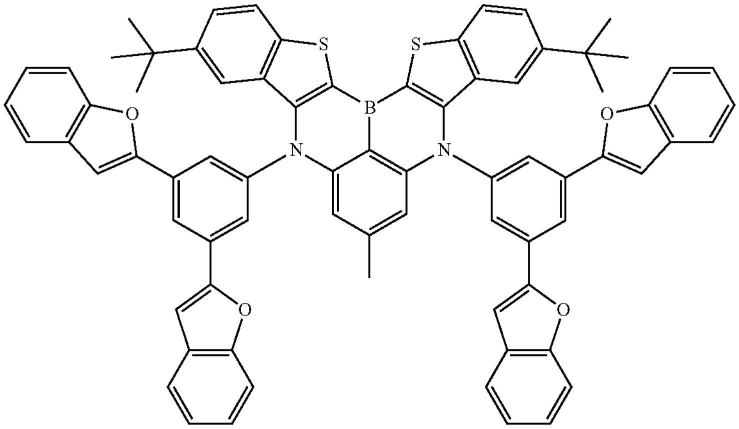
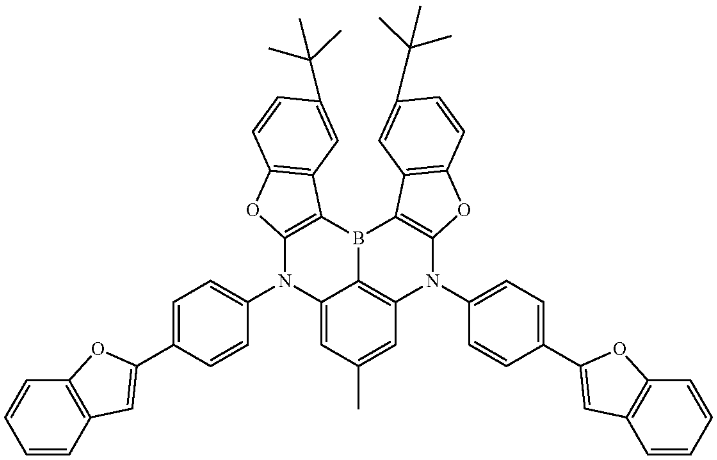
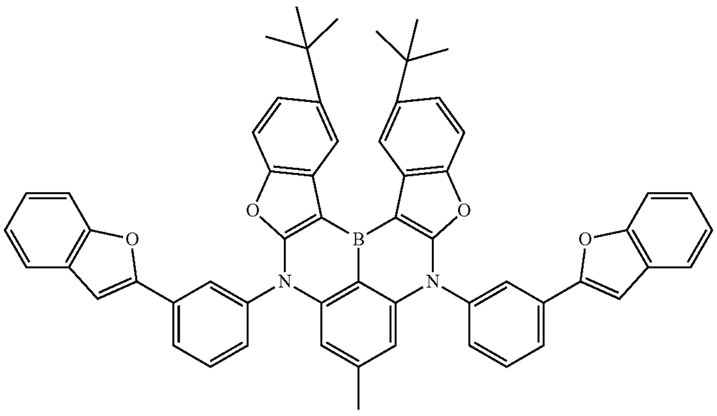

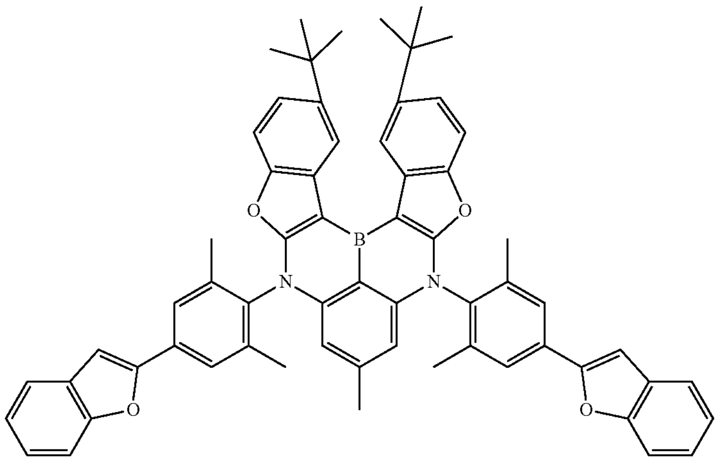
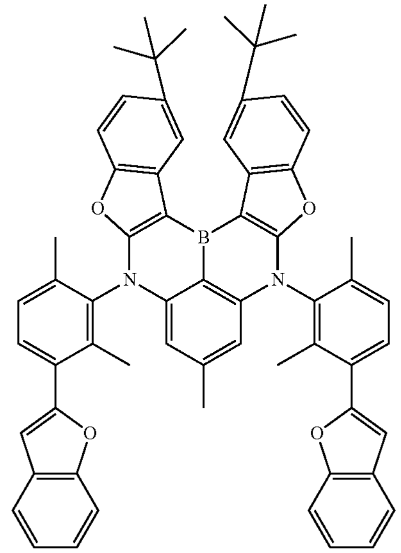
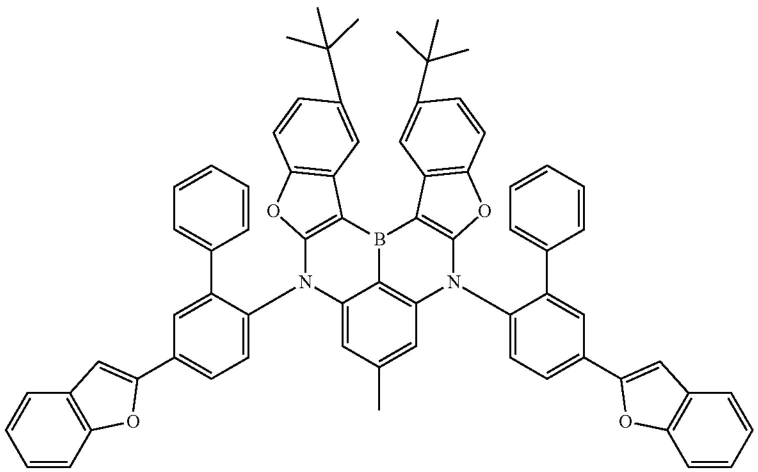
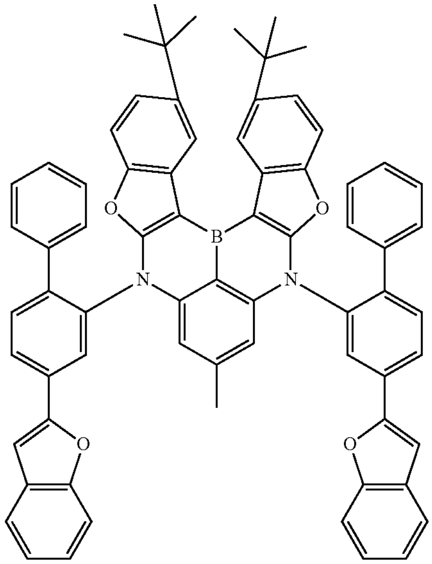
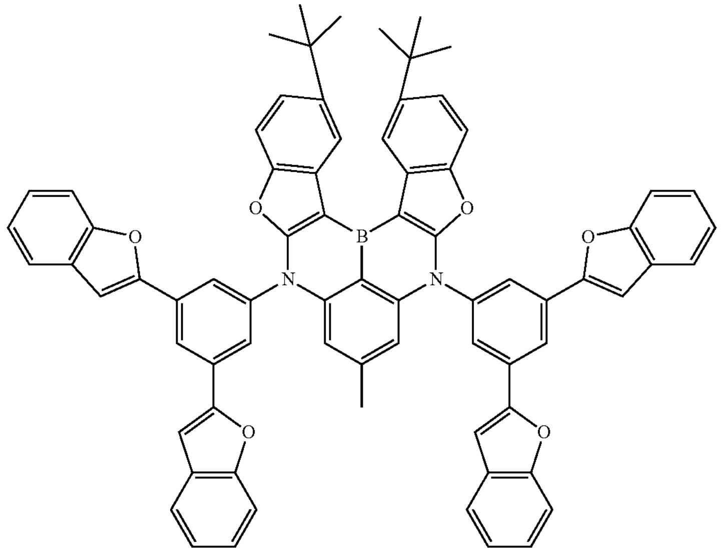

-continued
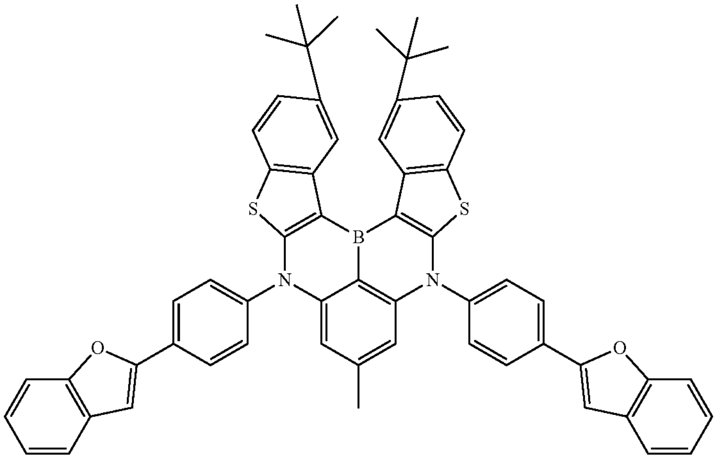
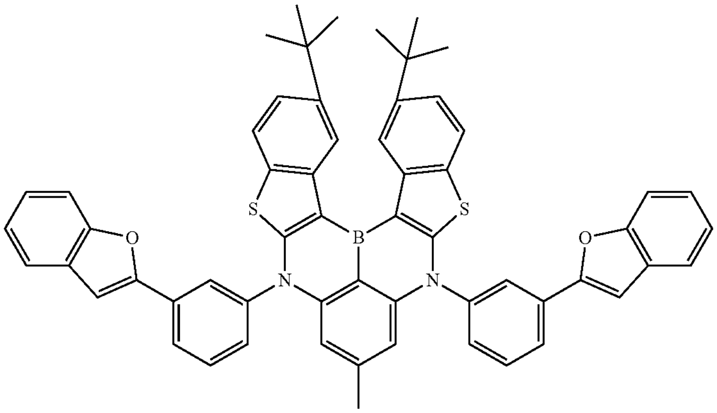
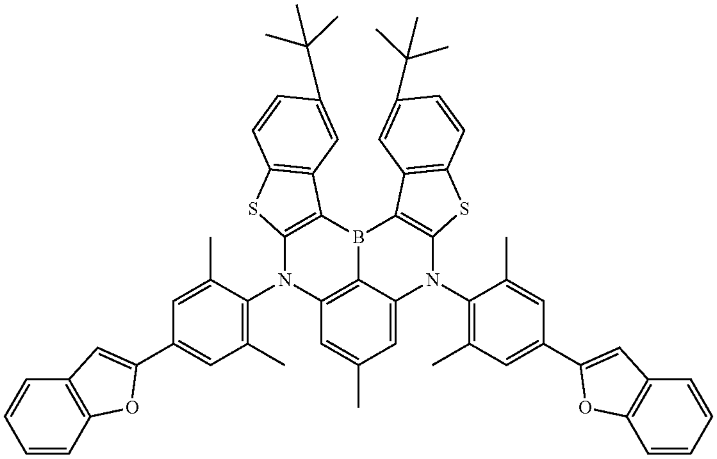
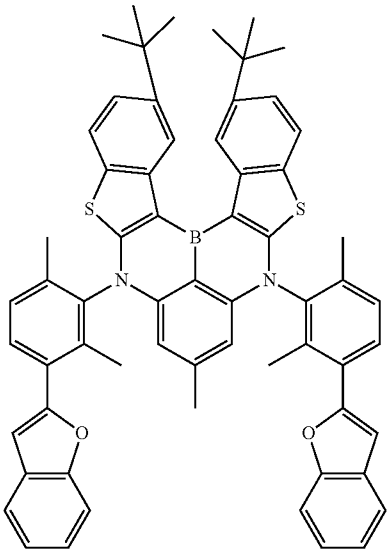

-continued
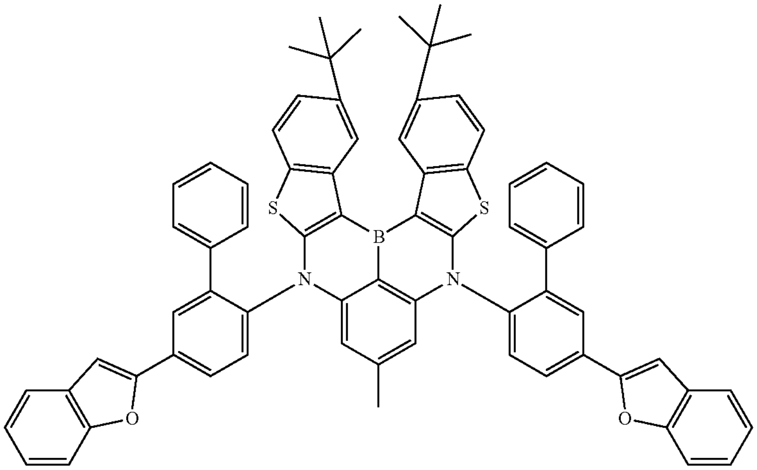
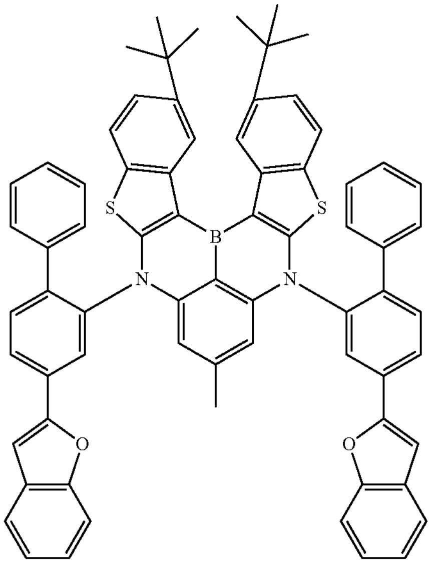
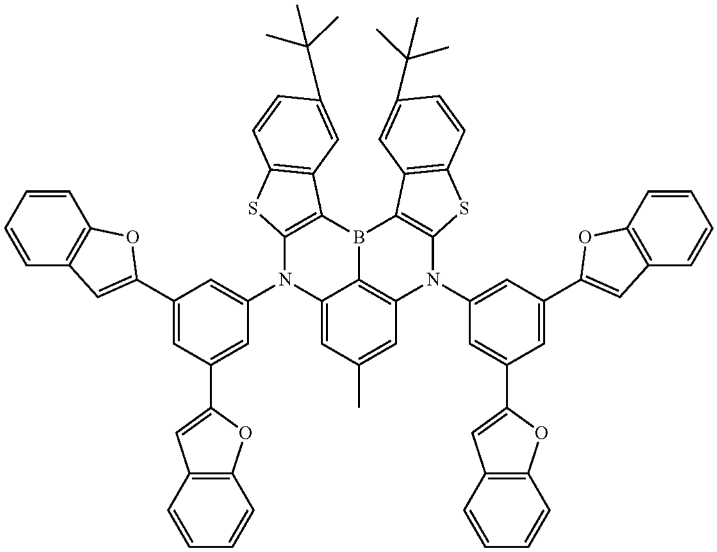
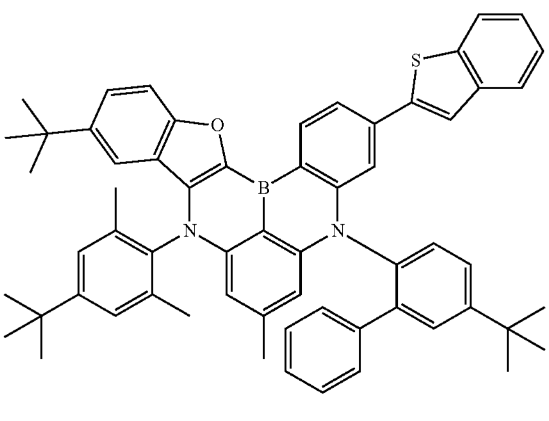
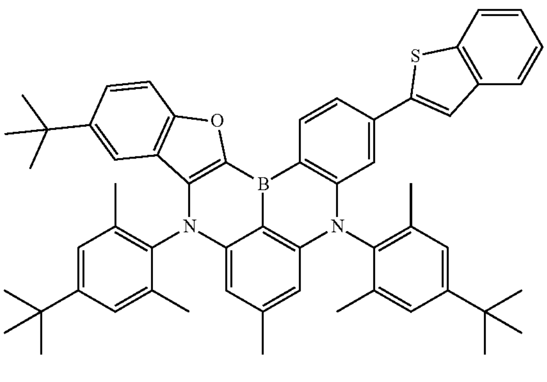

-continued
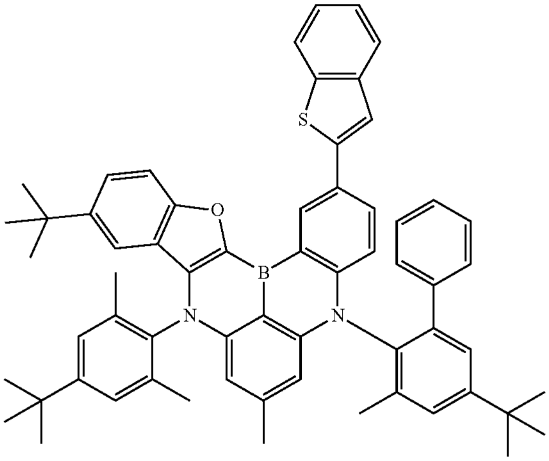
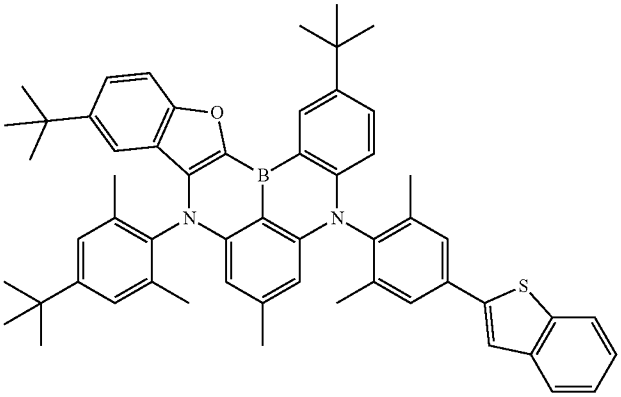
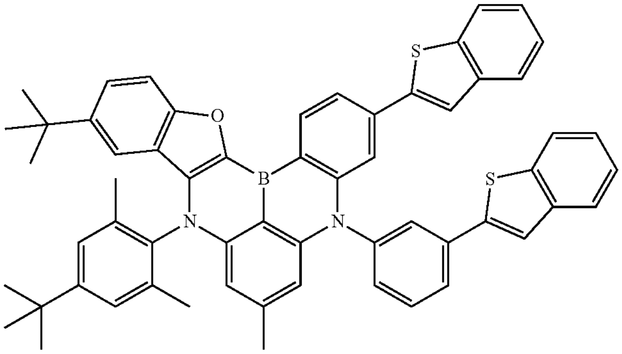
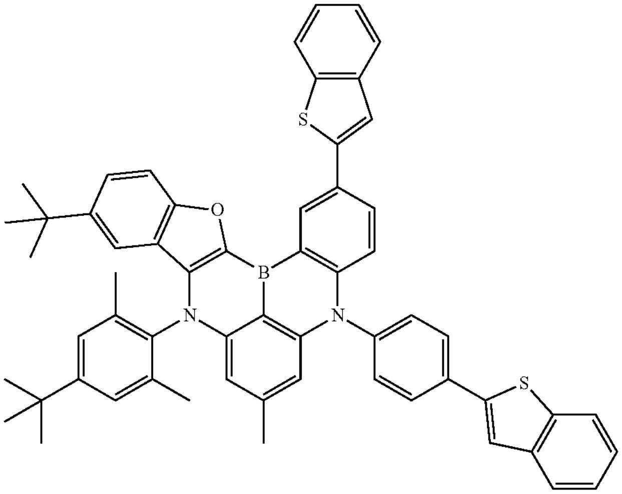
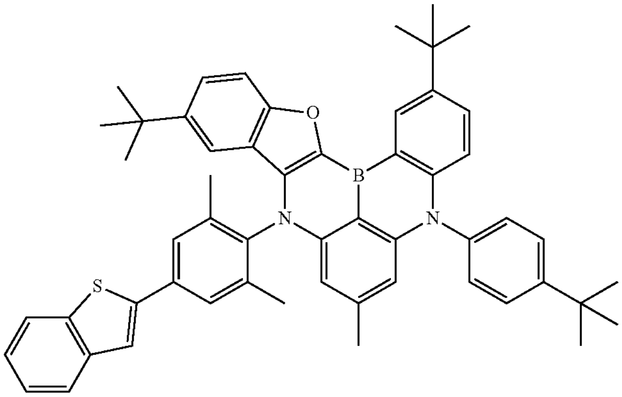

-continued
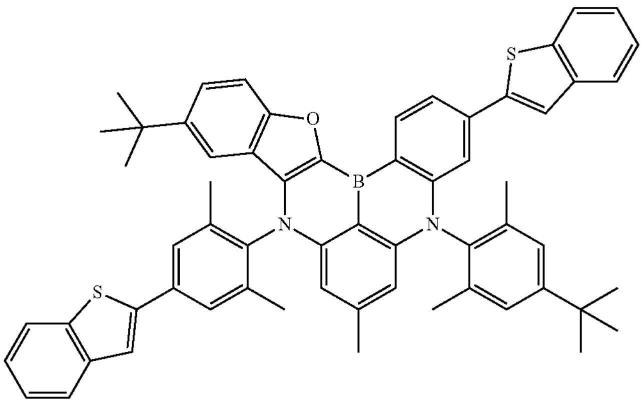
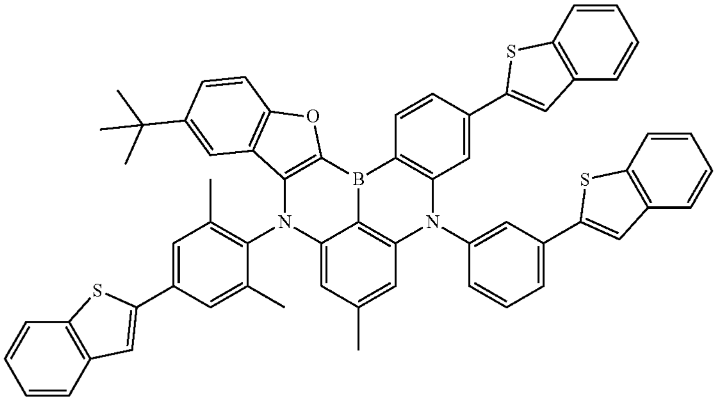
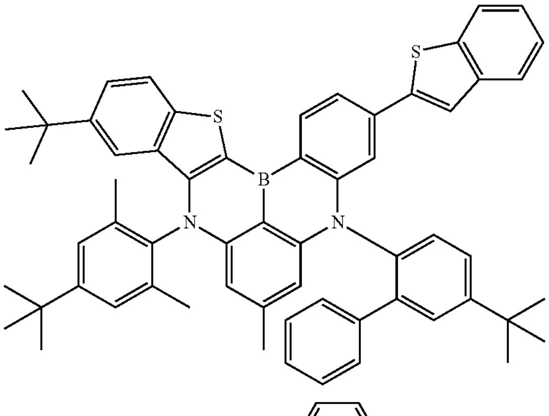 [SMILES: Cc1cc2c3c(c1)N(c1c(C)cc(C(C)(C)C)cc1C)c1c(oc4ccc(C(C)(C)C)cc14)B3c1ccc(-c3cc4ccccc4s3)cc1N2c1ccc(C(C)(C)C)cc1-c1ccccc1]
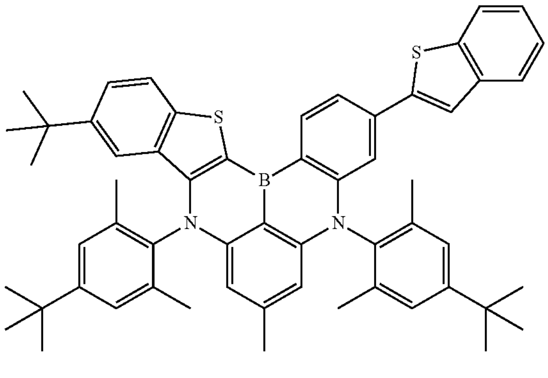
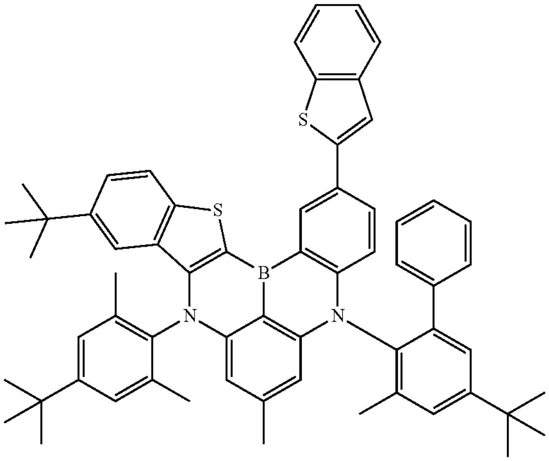
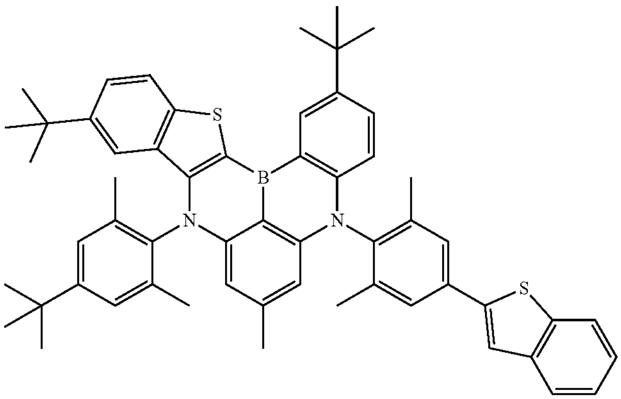

-continued
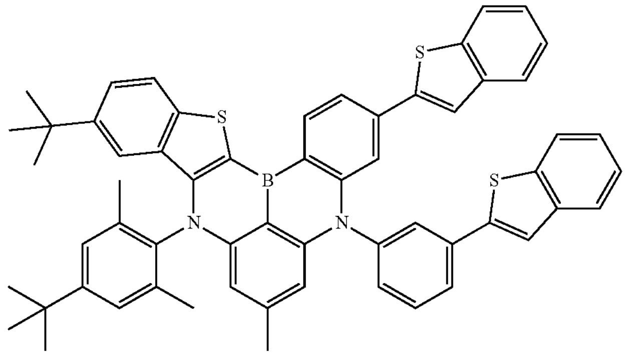
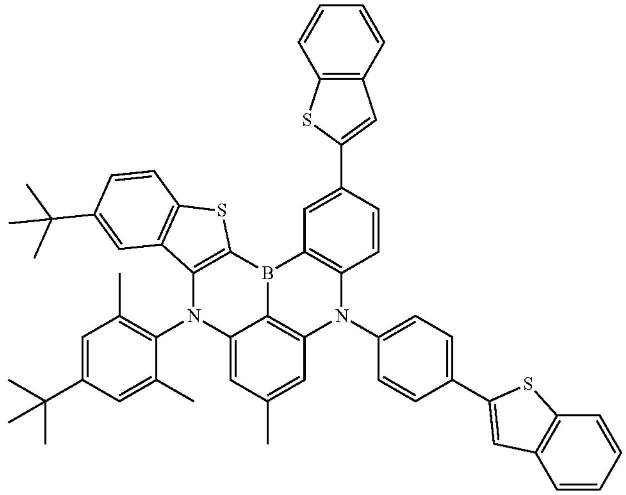
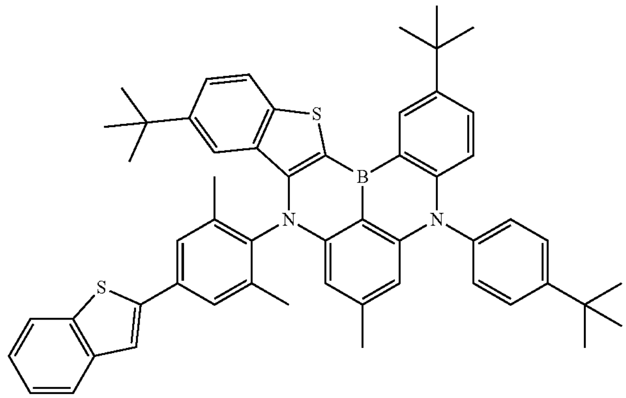
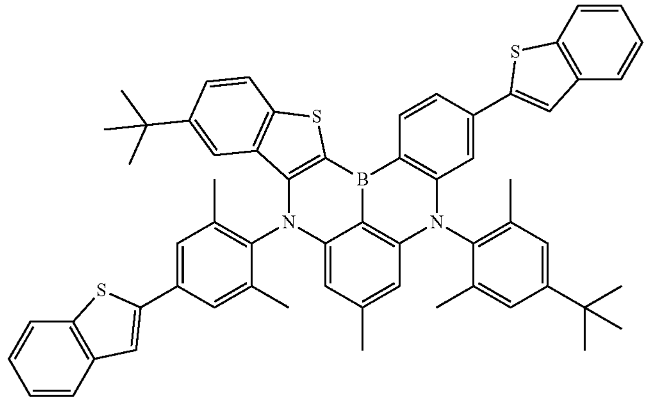

-continued
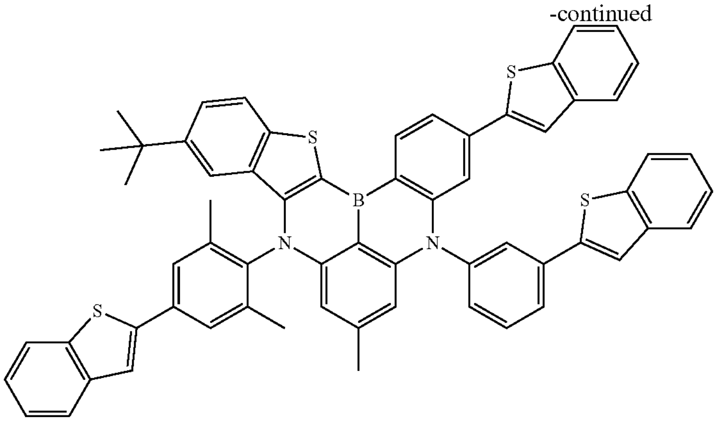
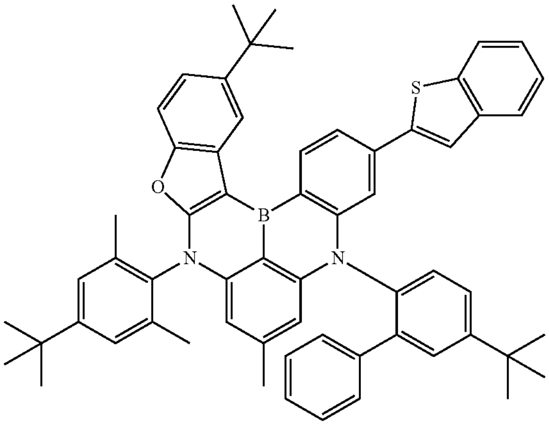
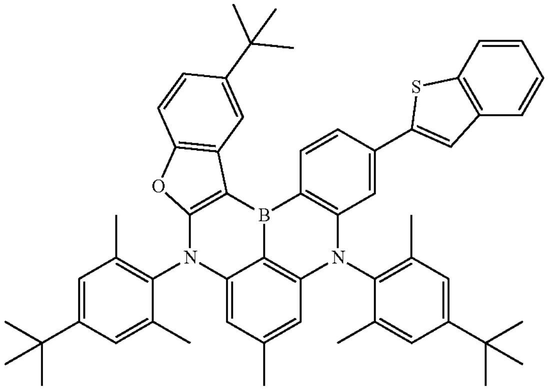
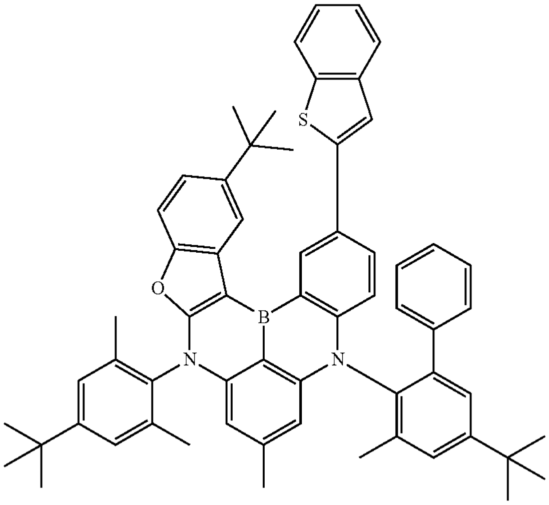
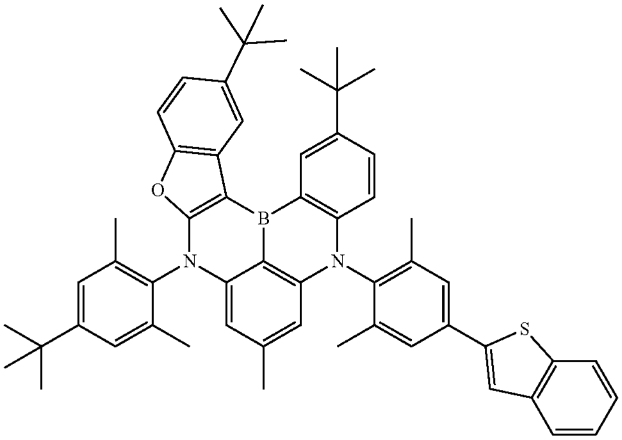
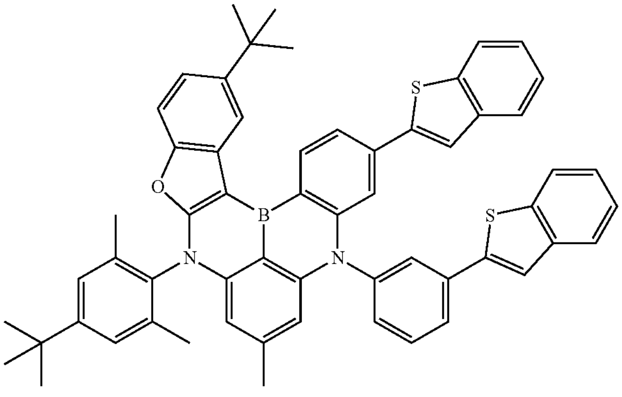

-continued
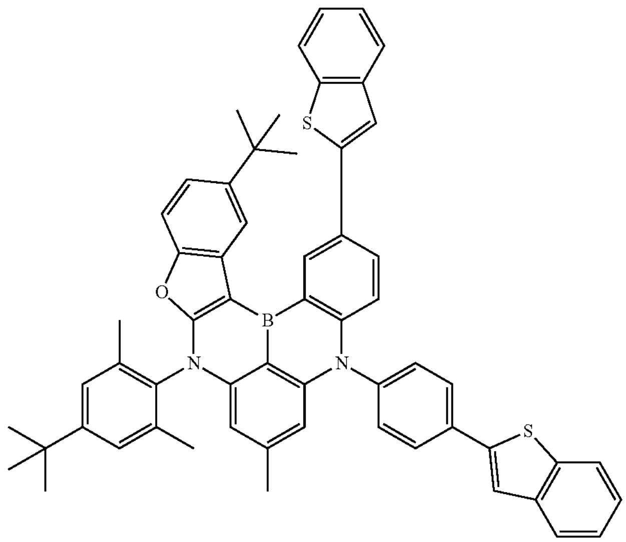
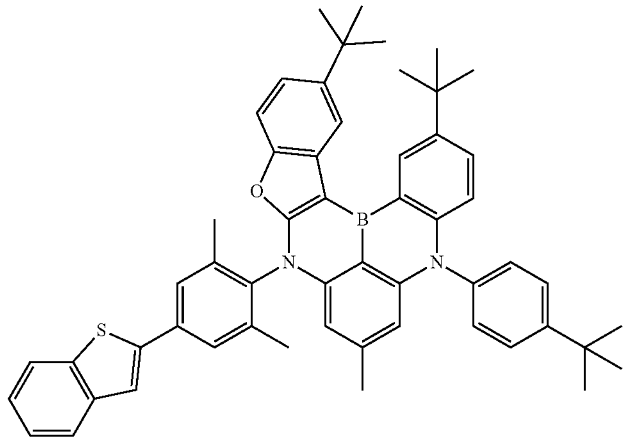
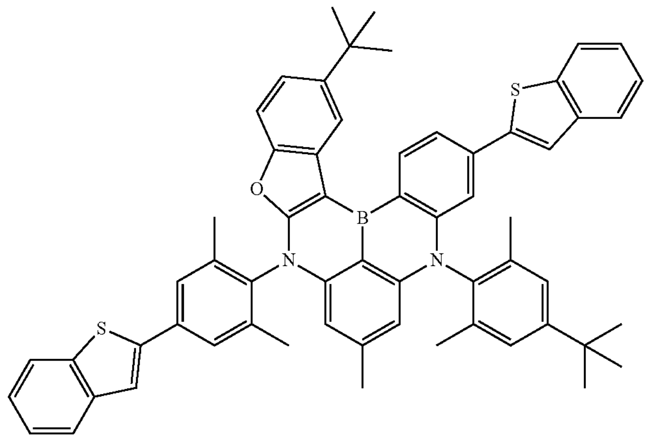

-continued
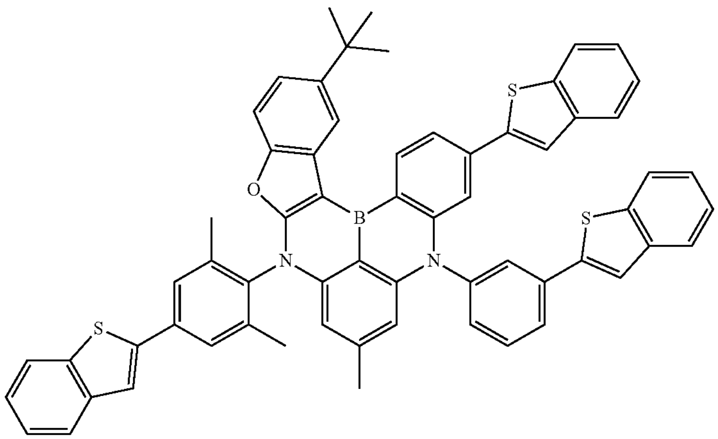
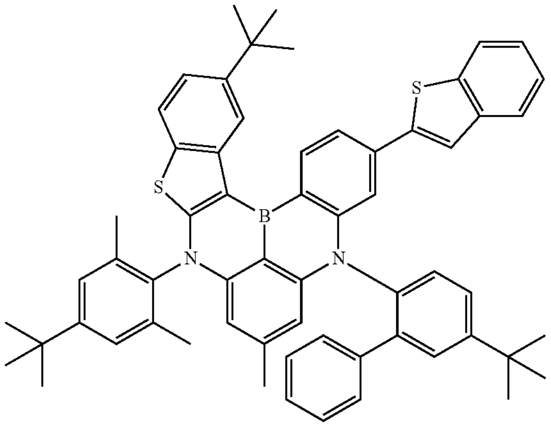
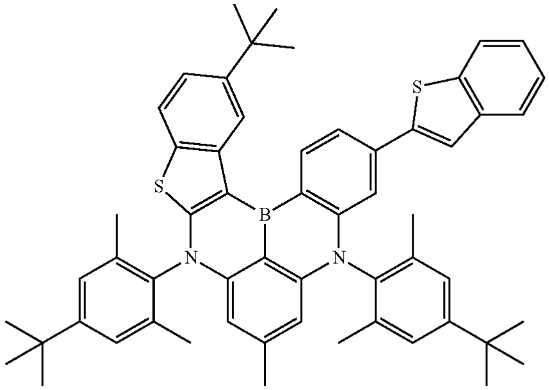
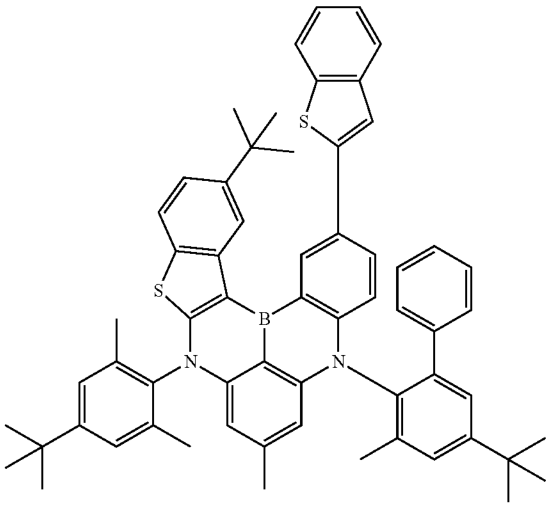
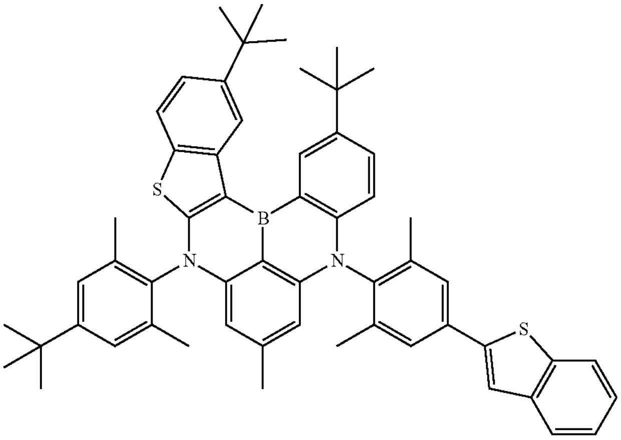

-continued
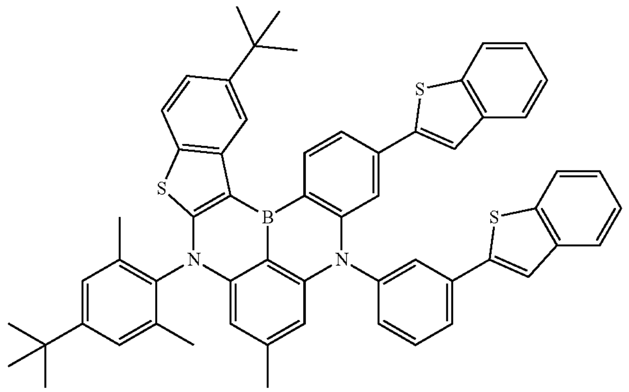
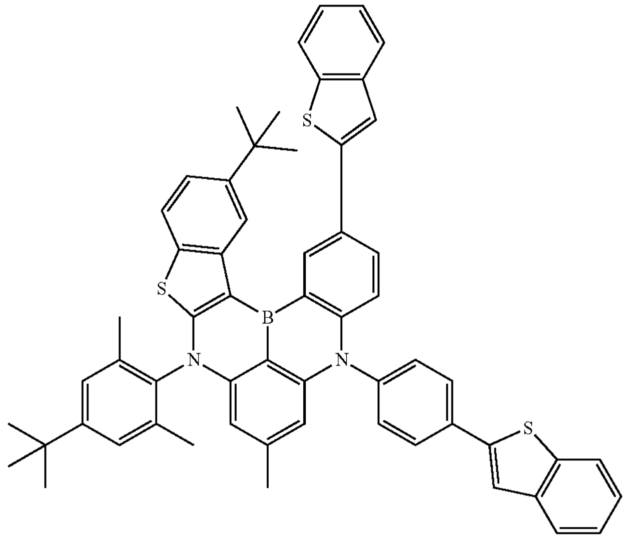
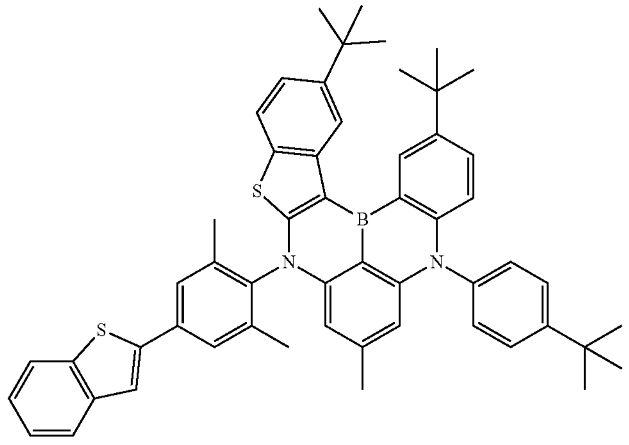

-continued
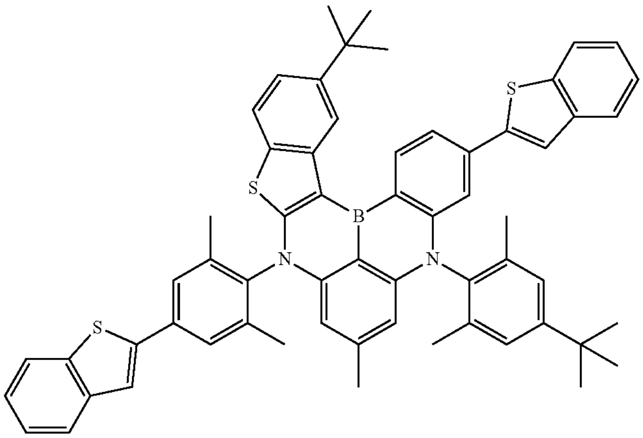
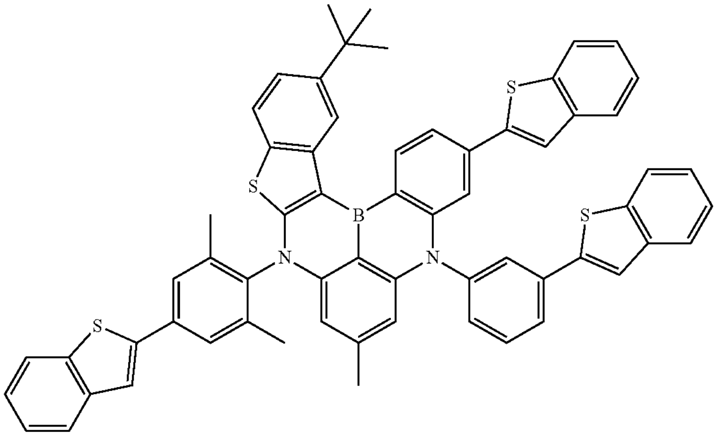
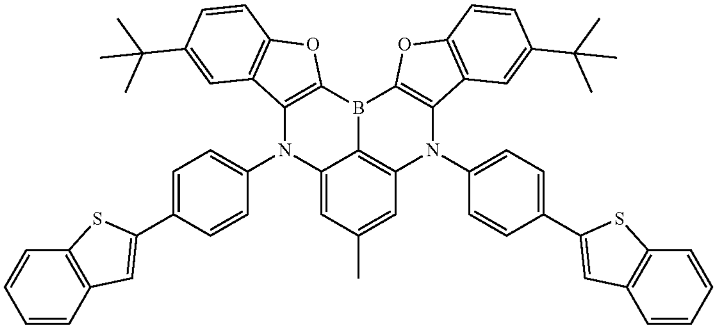
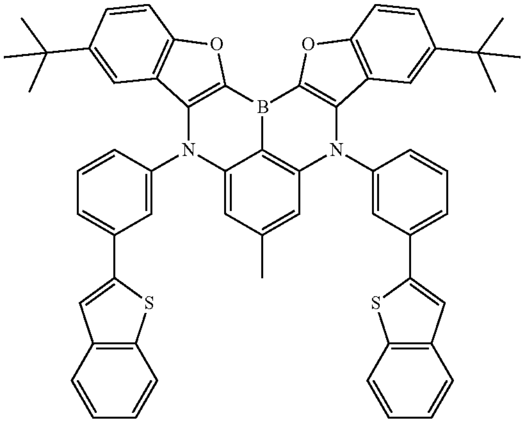

-continued
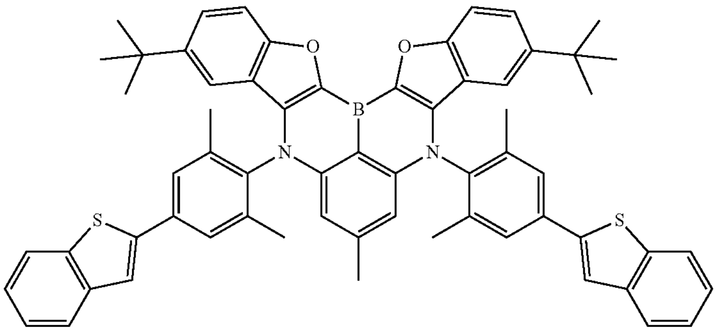
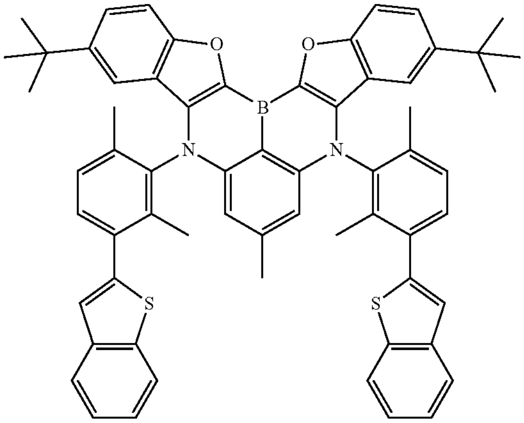
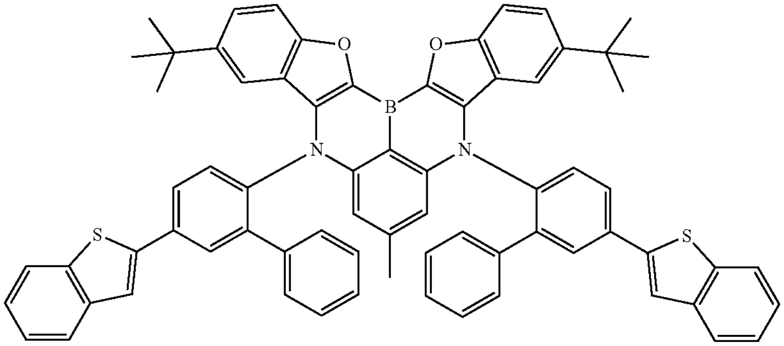
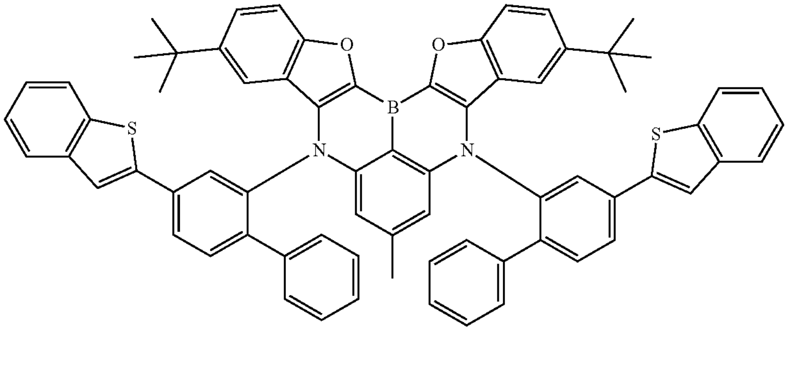

-continued
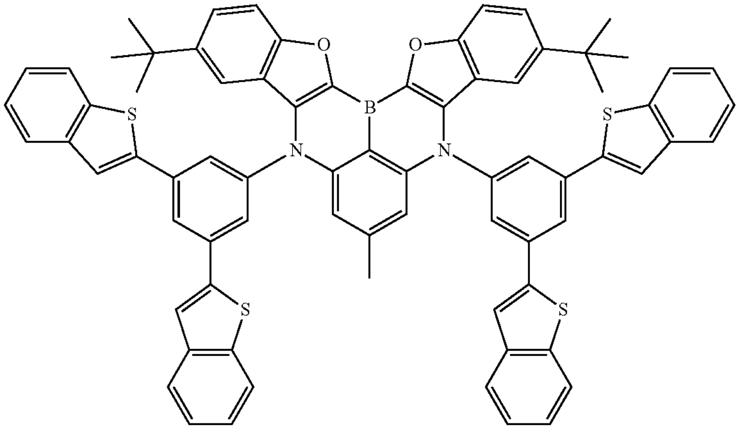
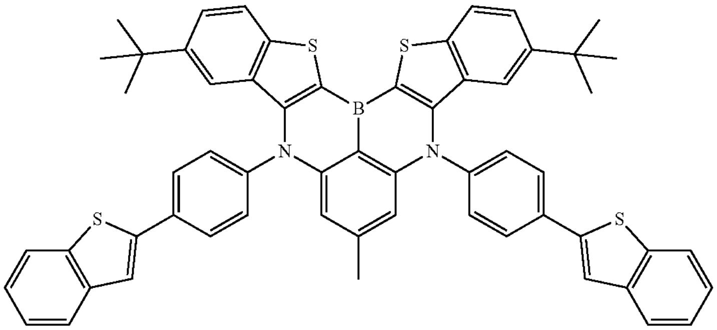
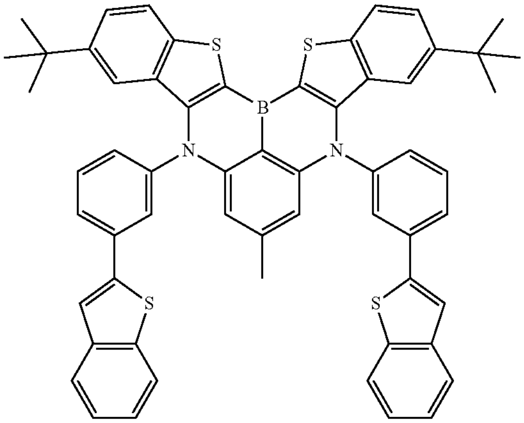
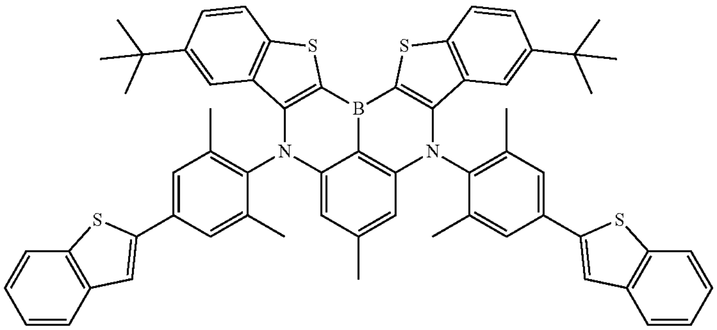

-continued
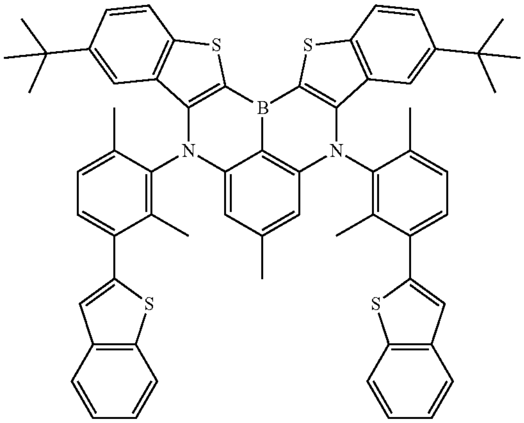
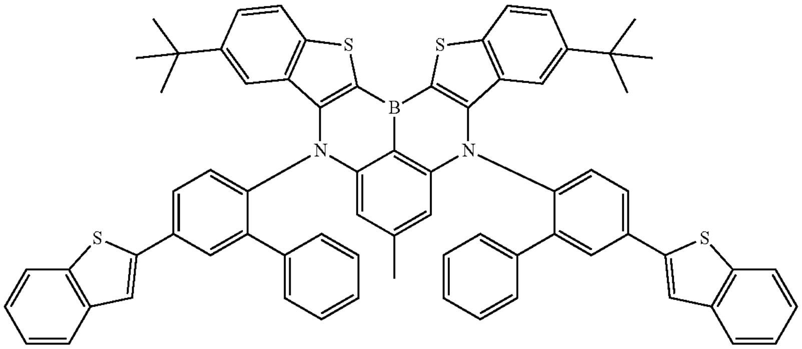
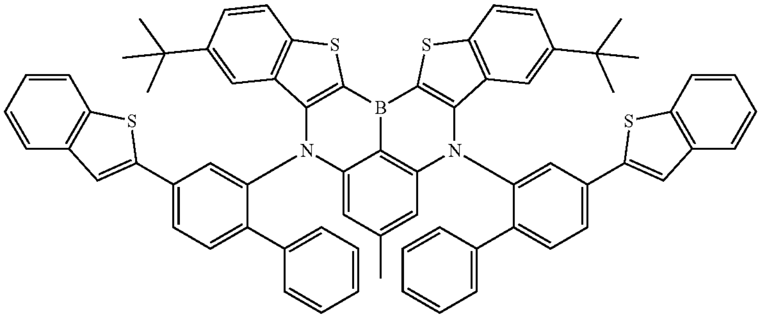
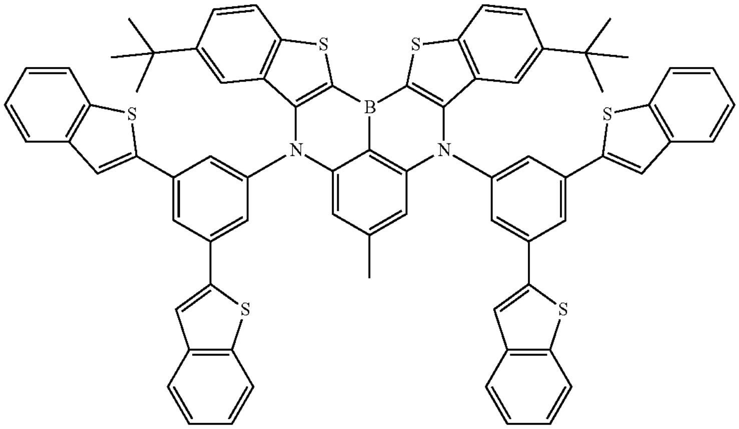

-continued
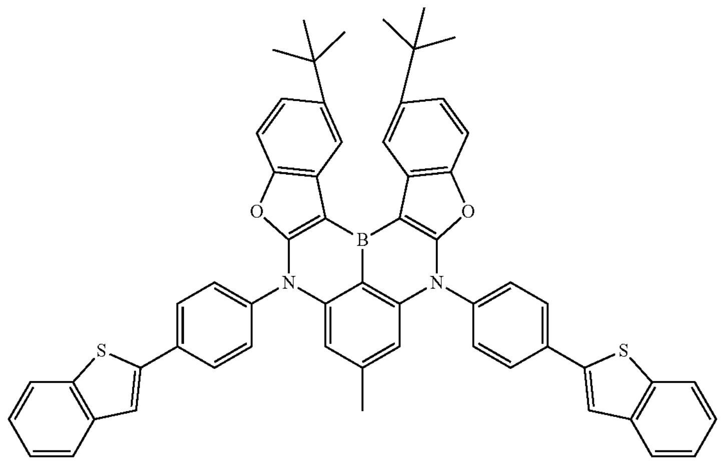
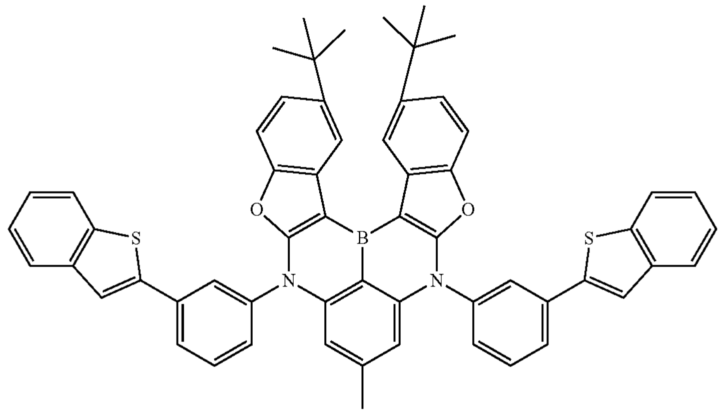
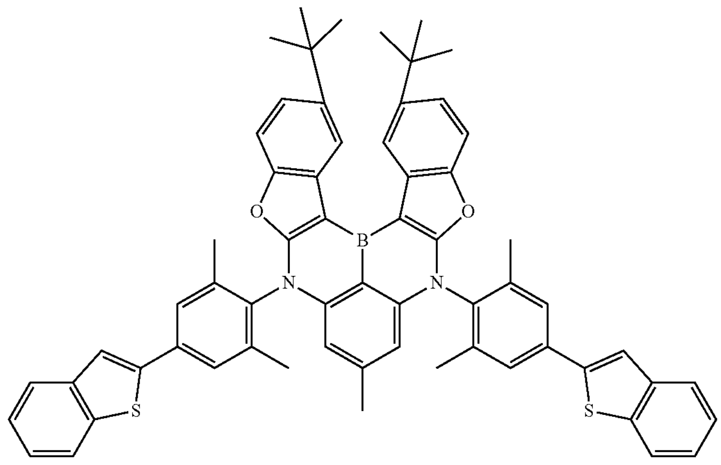

-continued
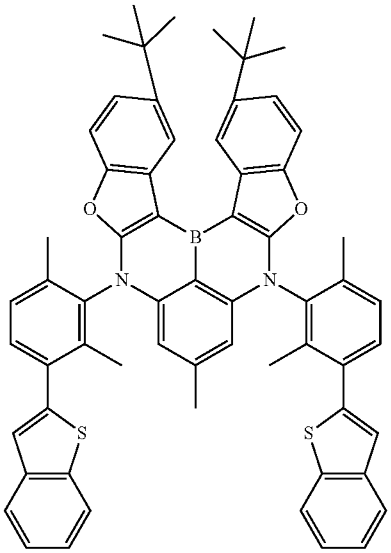
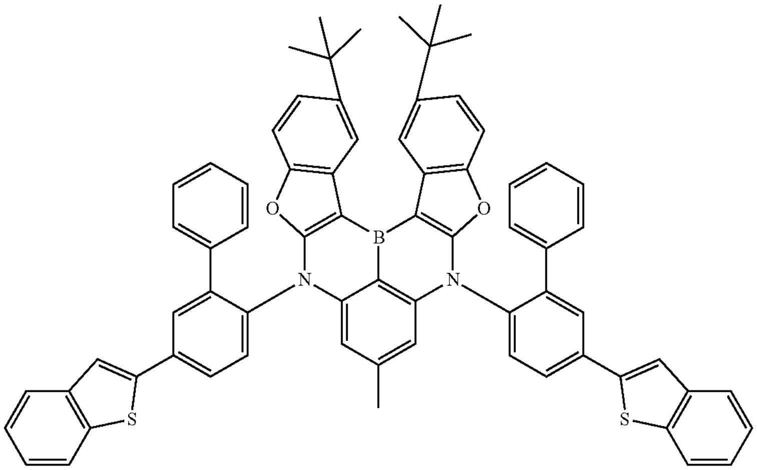
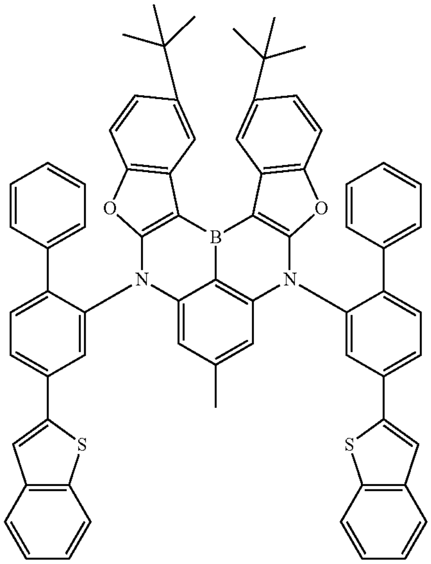

-continued
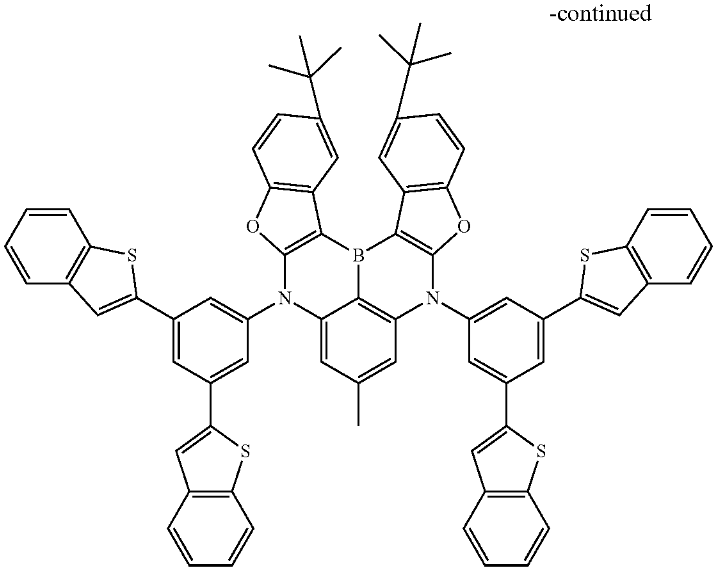
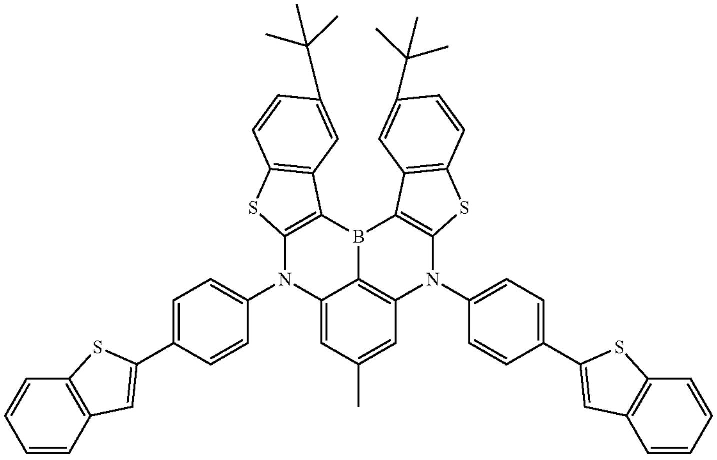
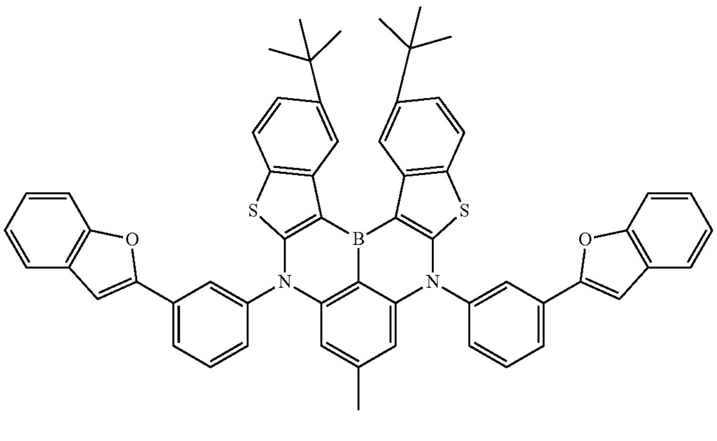

-continued
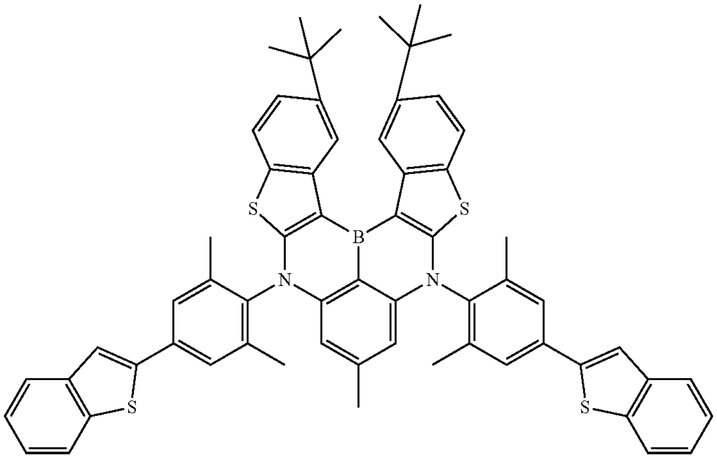
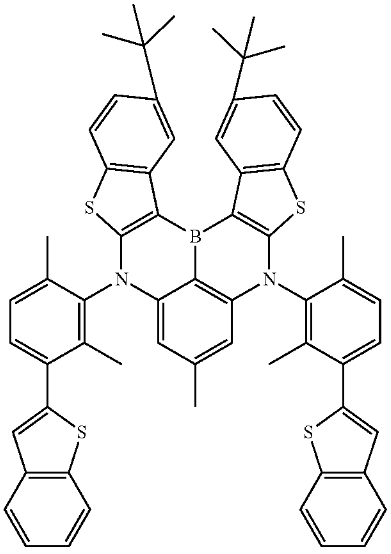
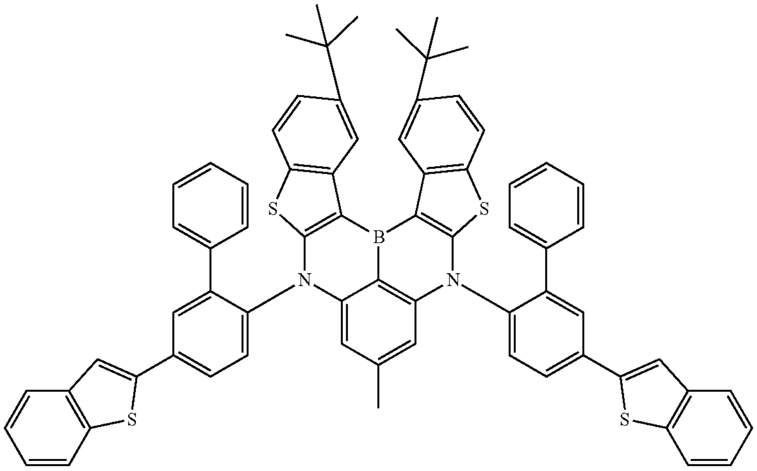

-continued
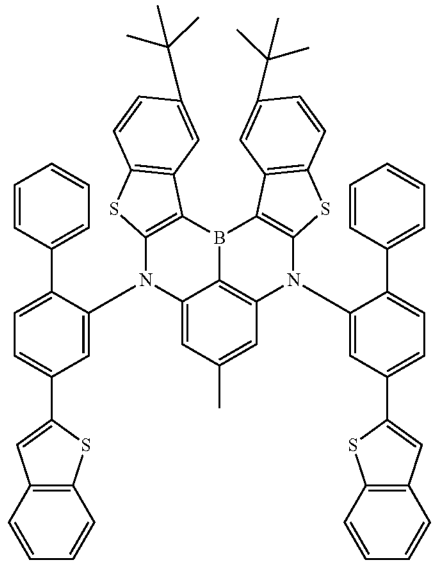
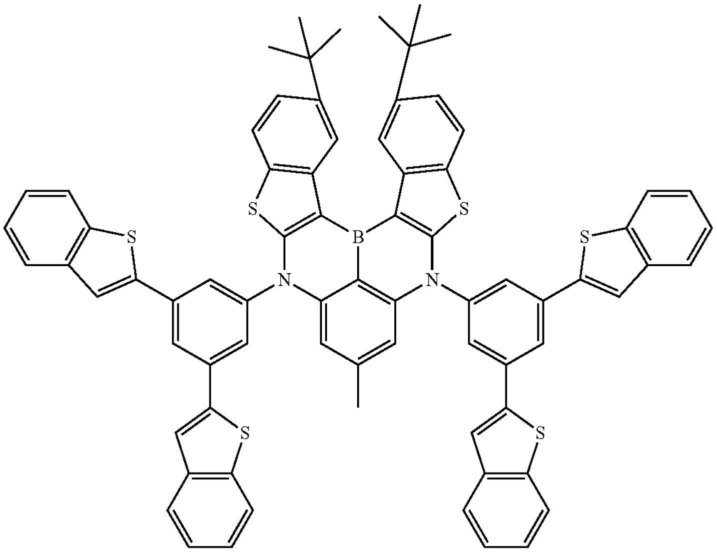
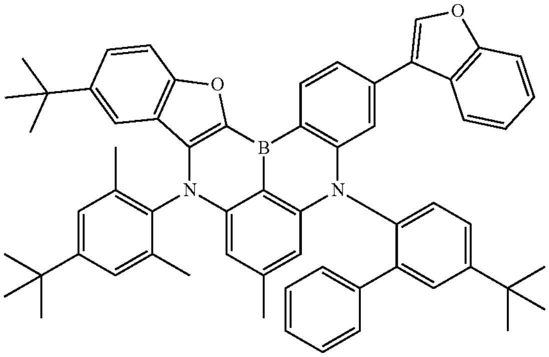
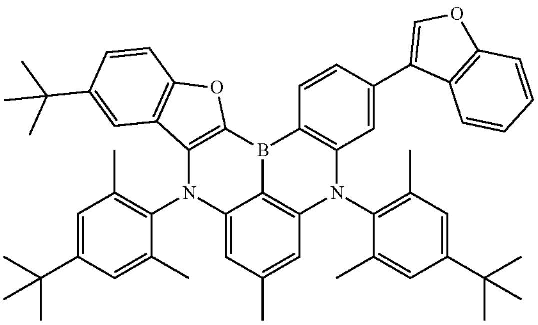
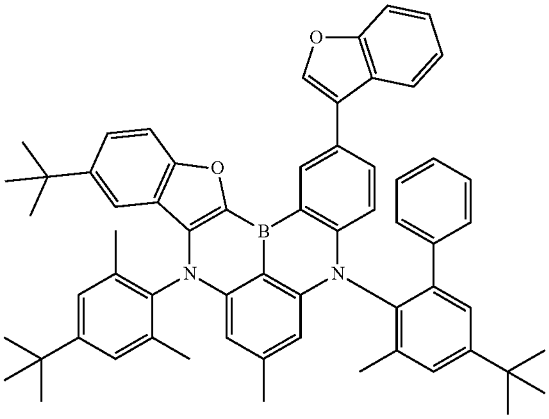
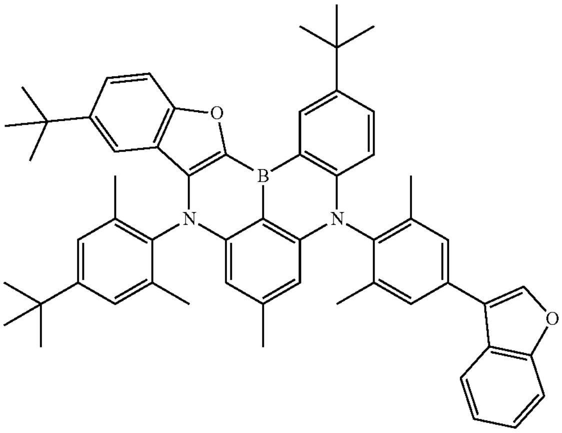

-continued
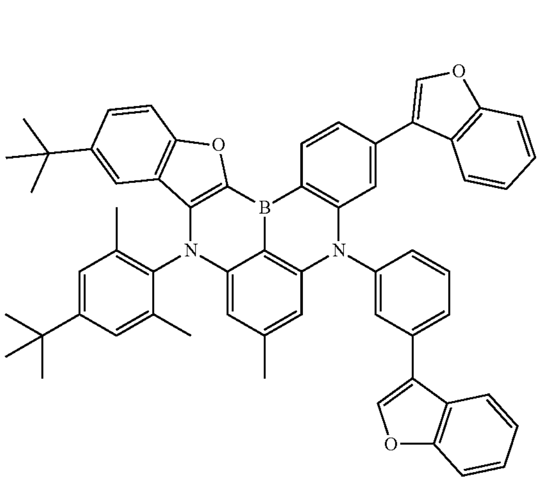
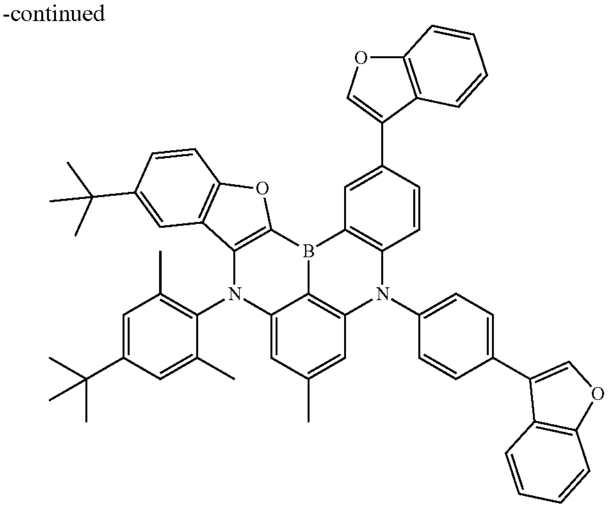
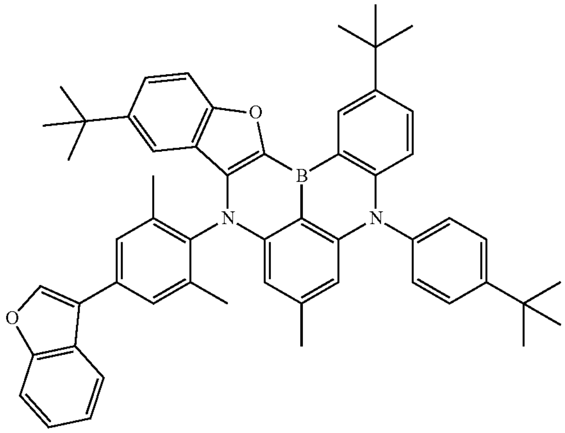
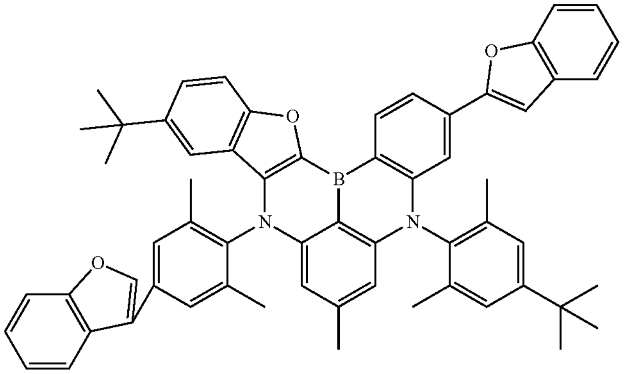
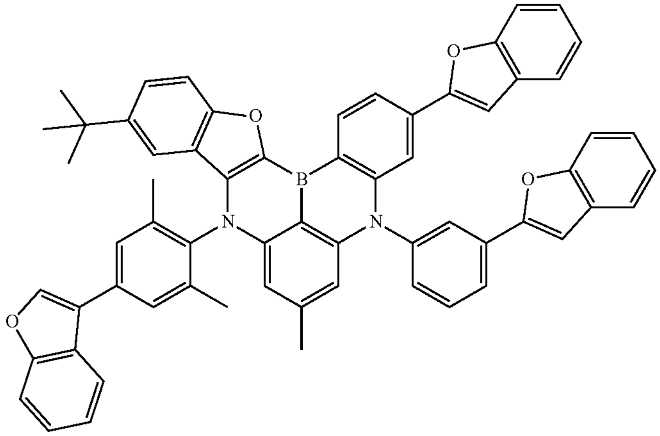
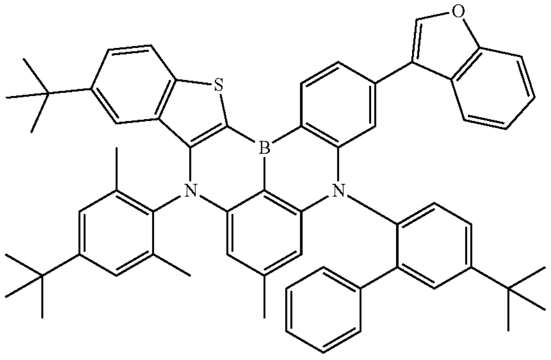
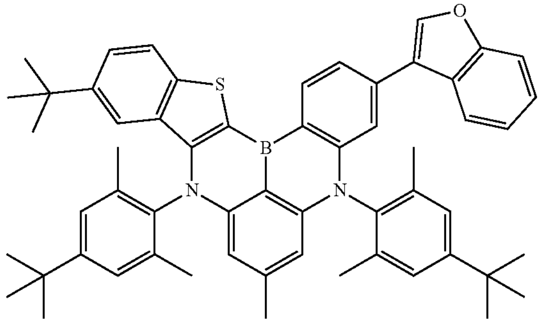

-continued
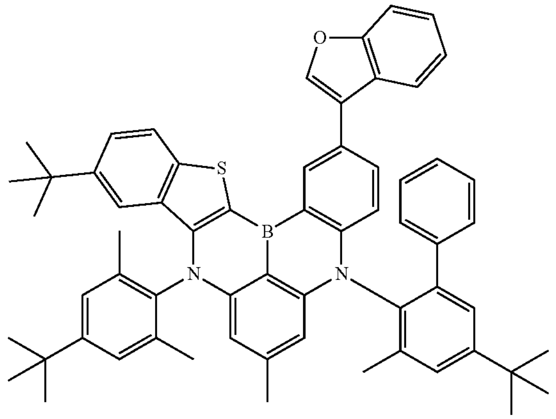
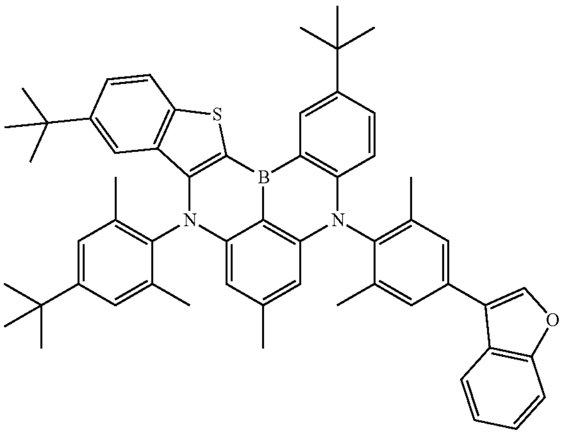
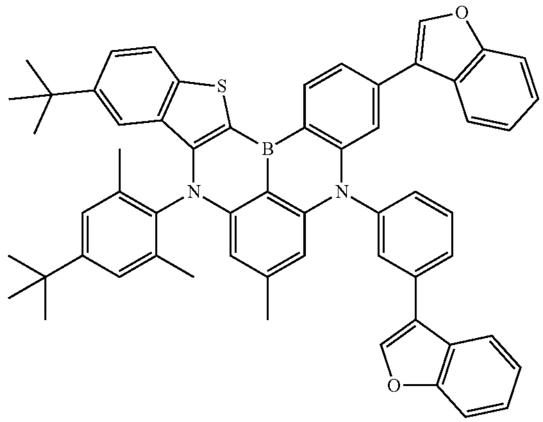
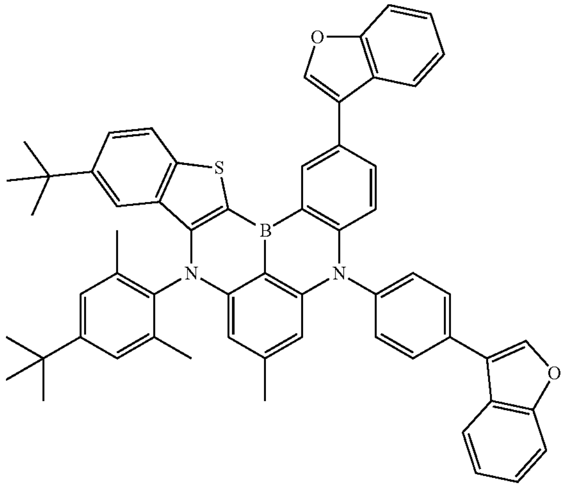
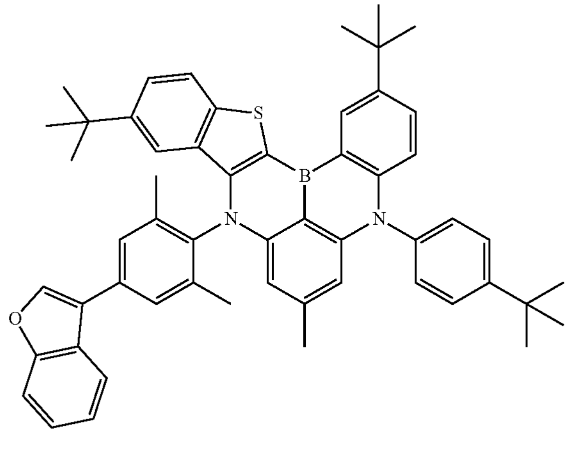
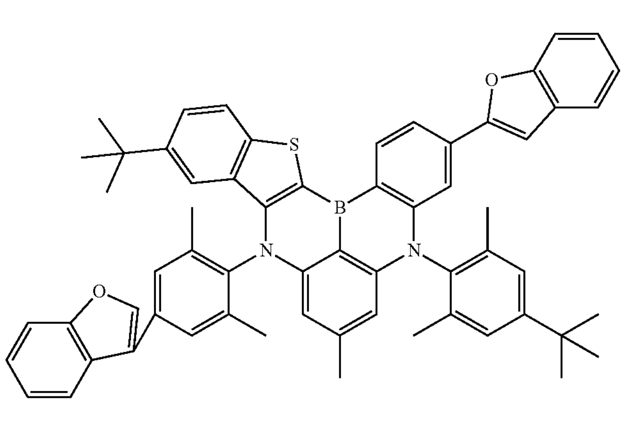

-continued
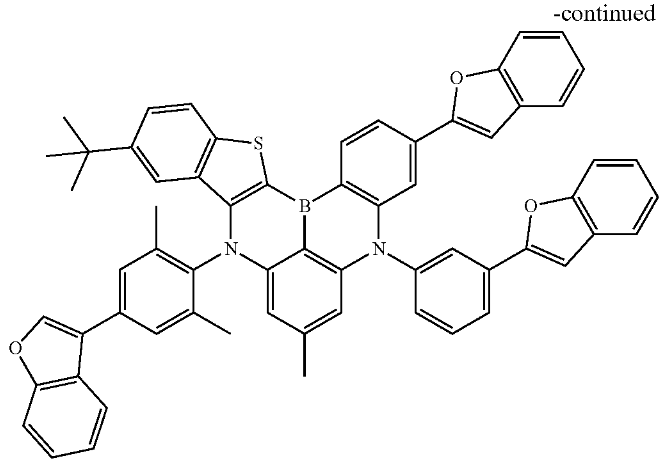
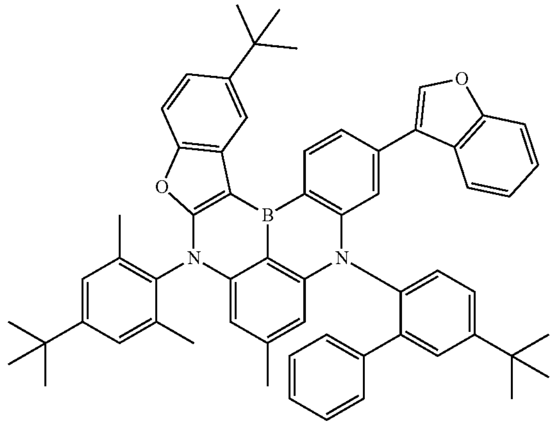
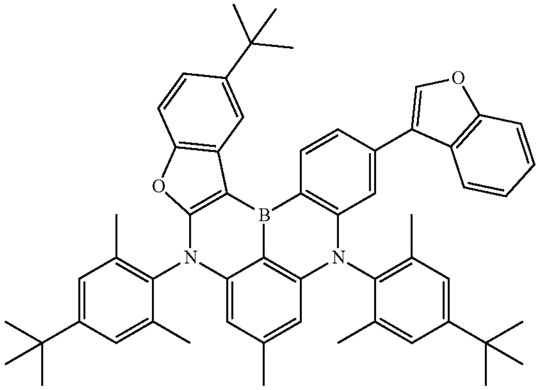
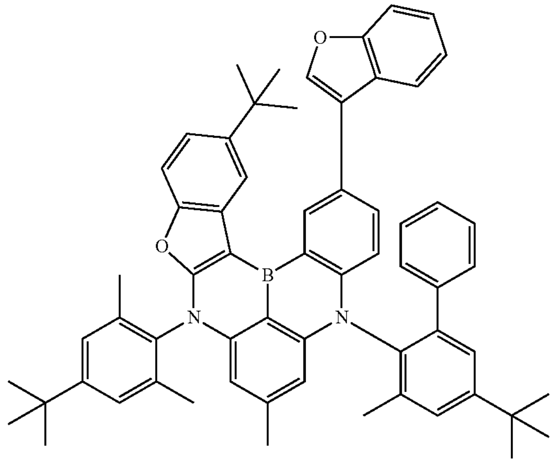
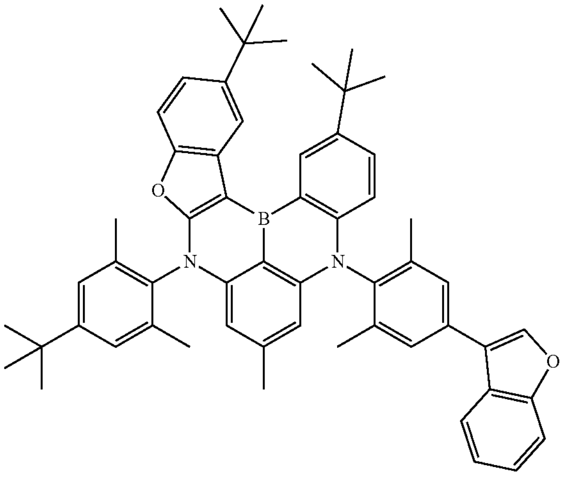

-continued
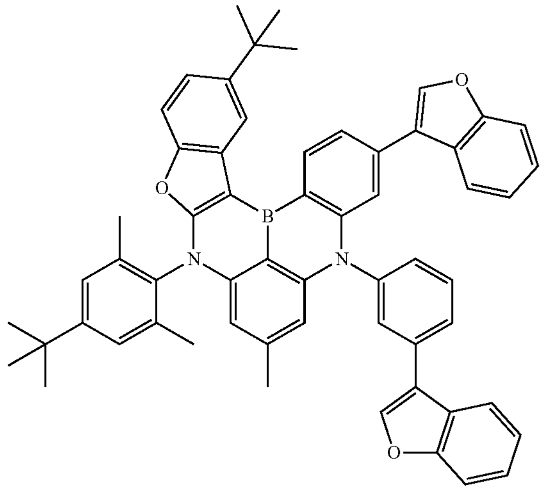
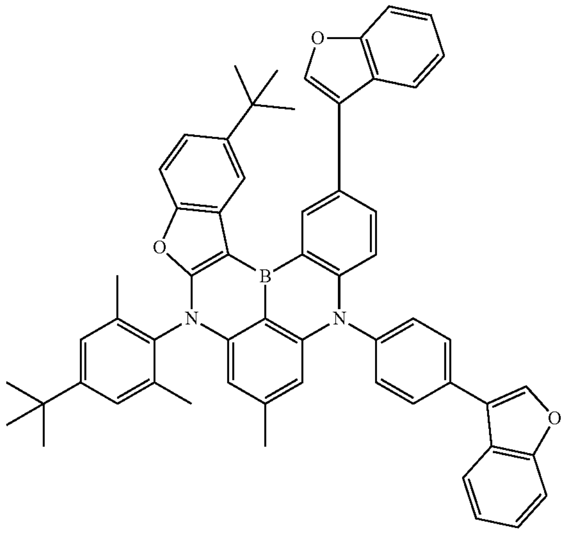
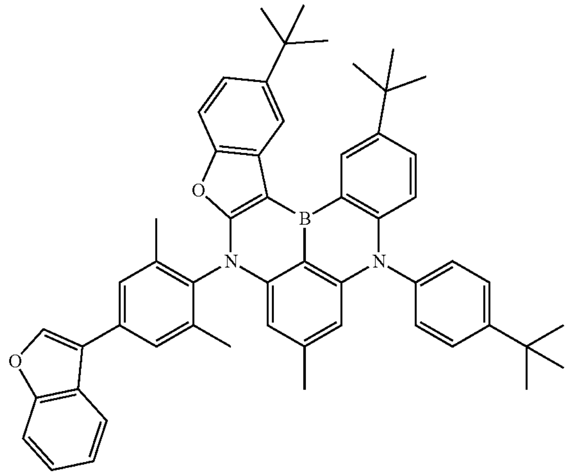
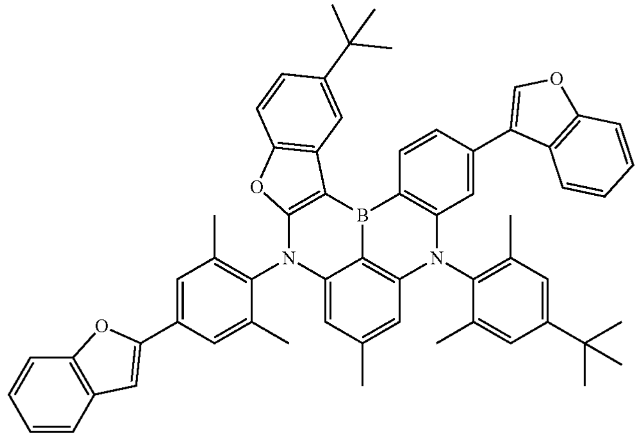

-continued
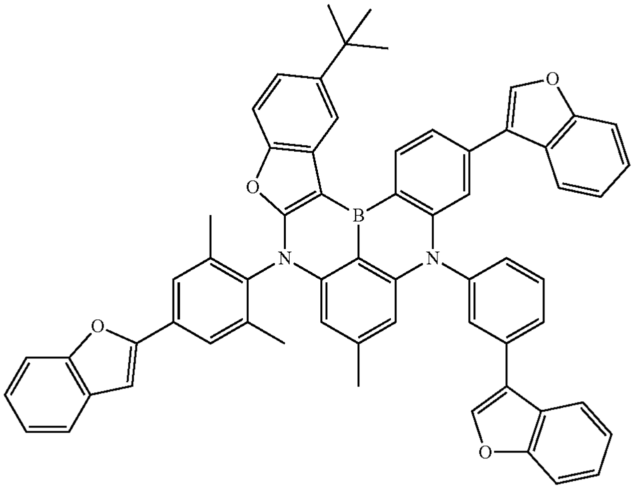
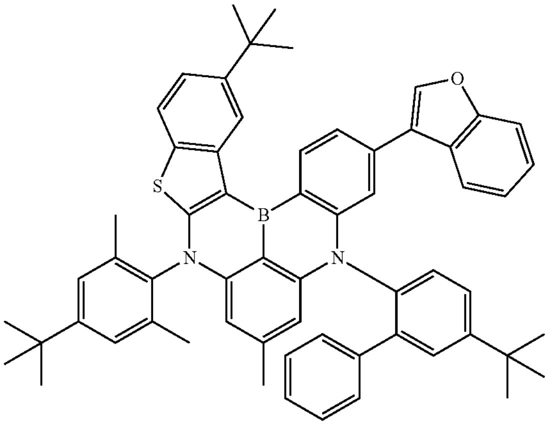
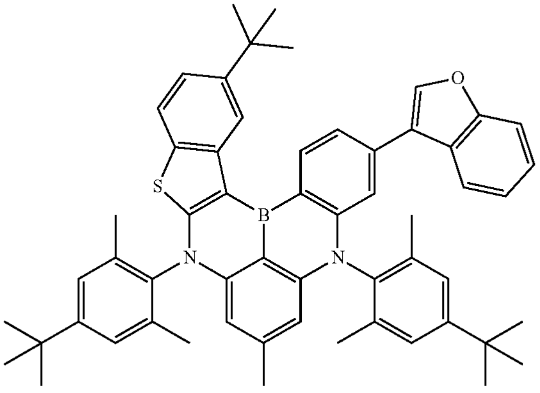
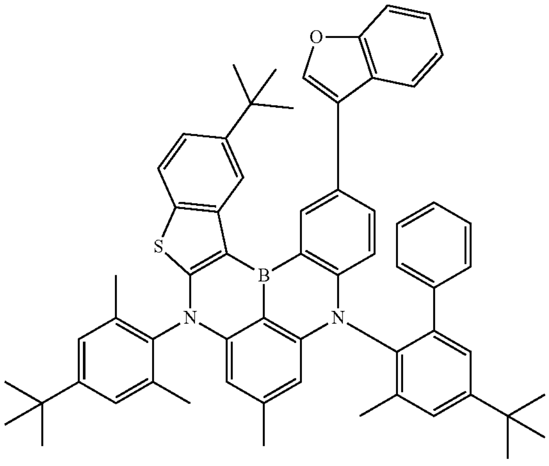
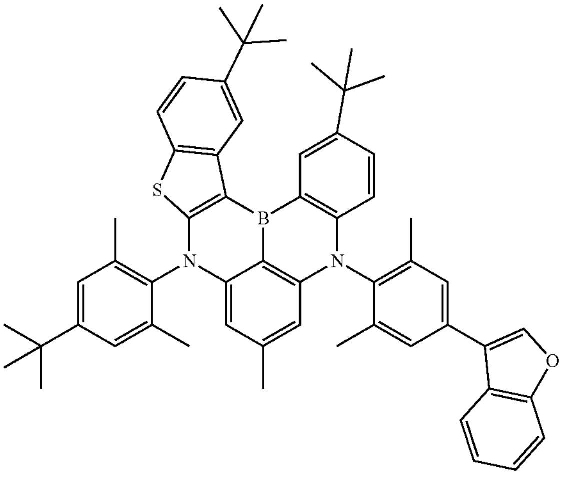
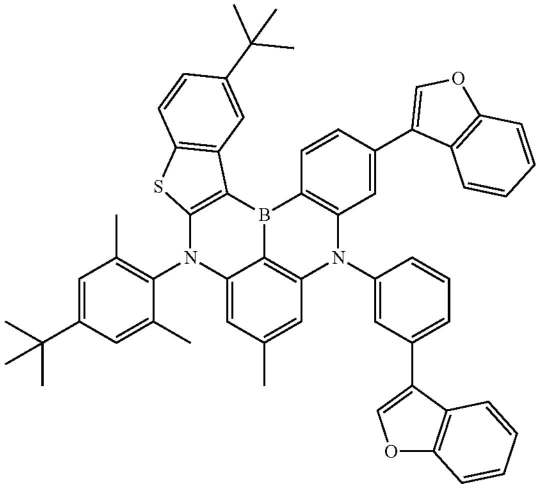

-continued
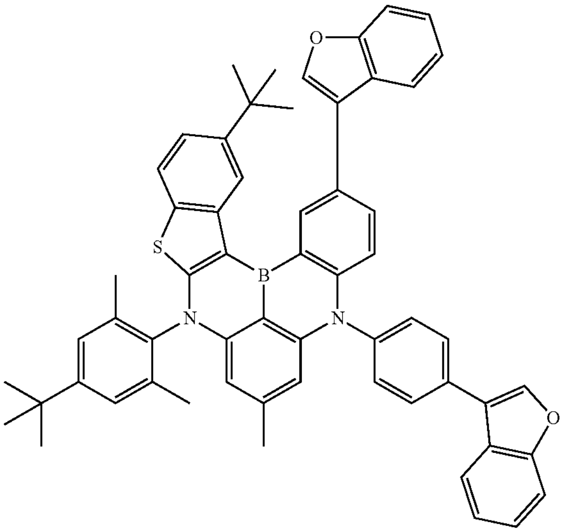
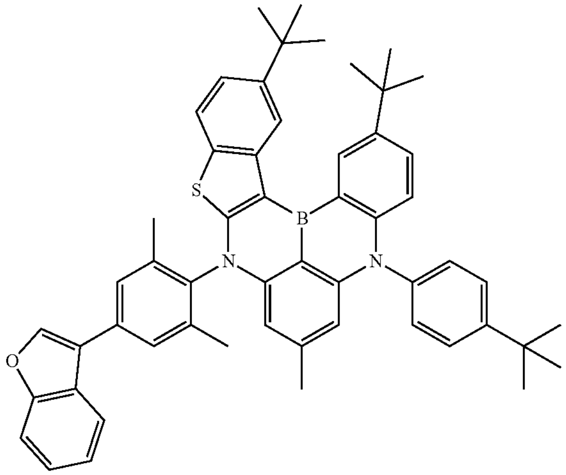
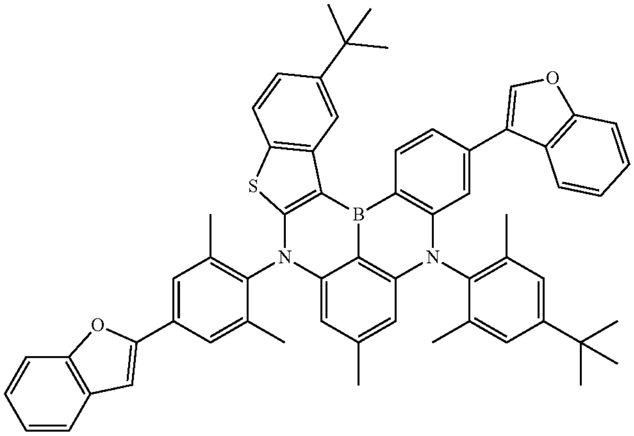
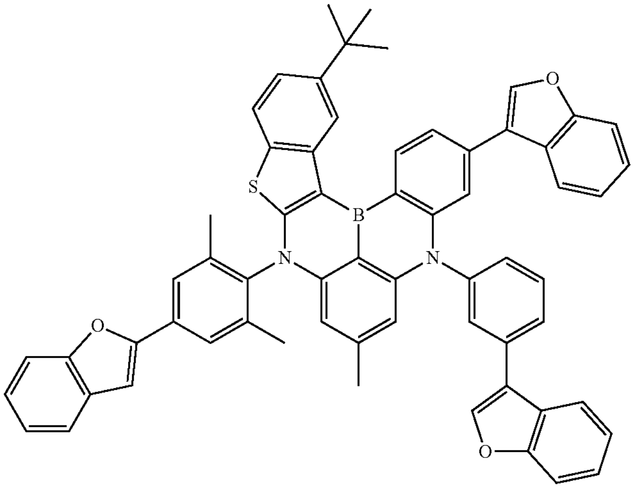

-continued
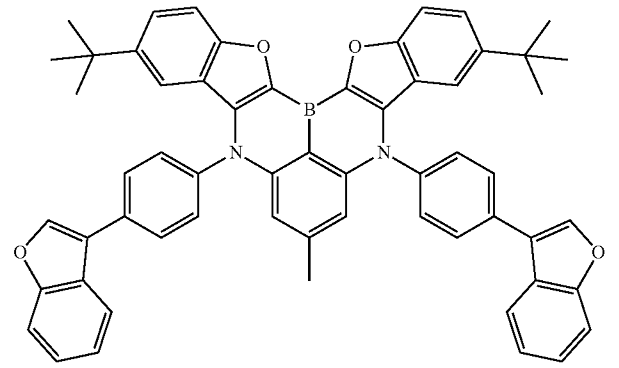
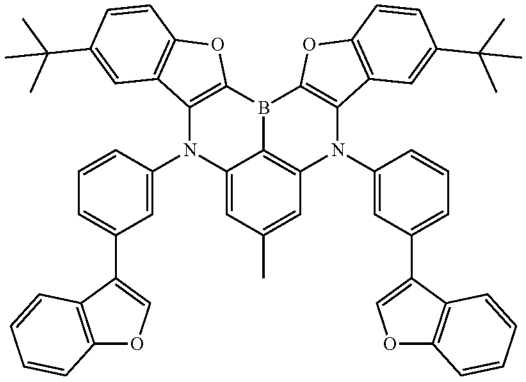
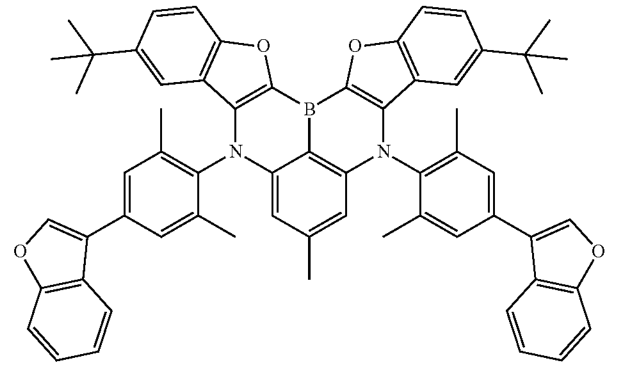
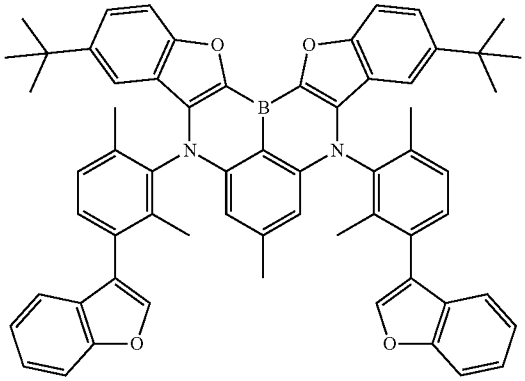
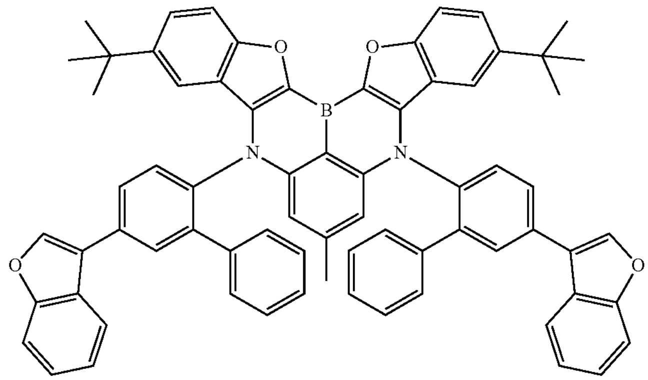
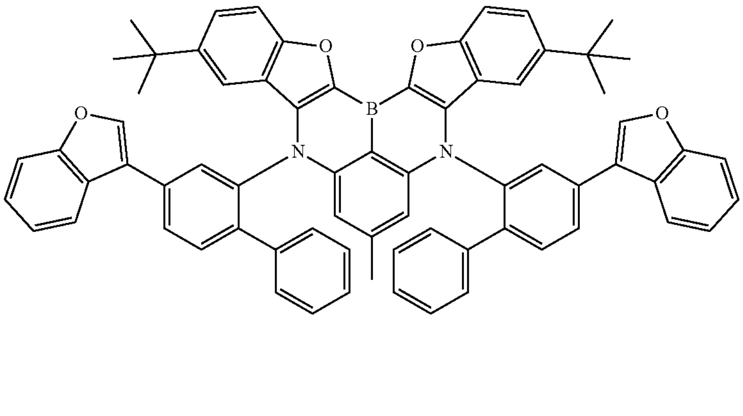

-continued
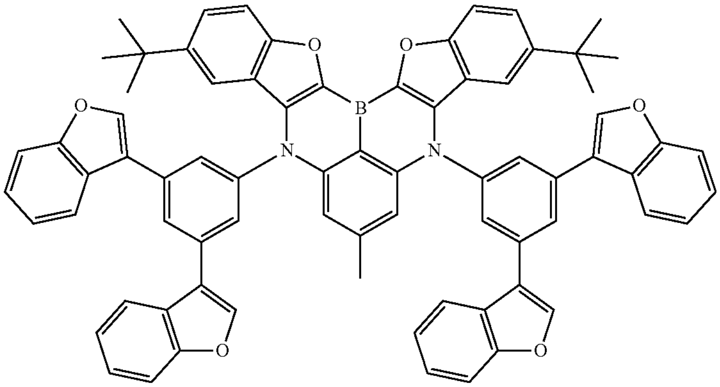
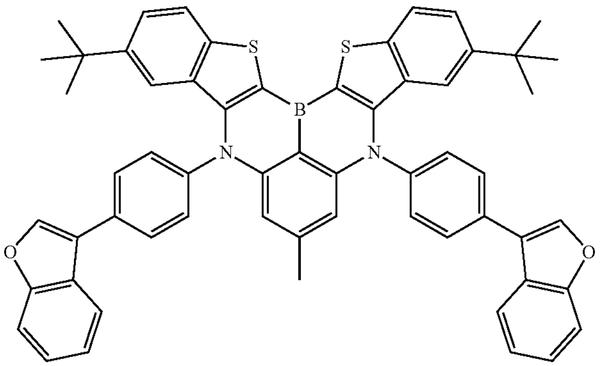
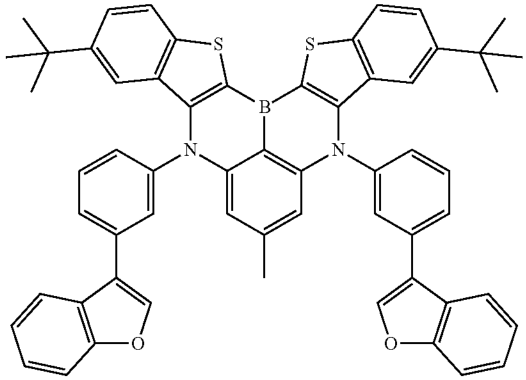
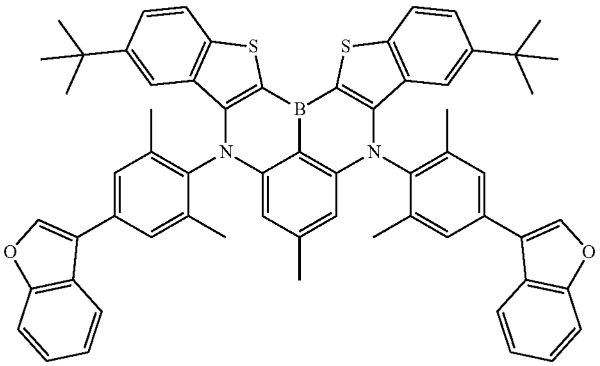
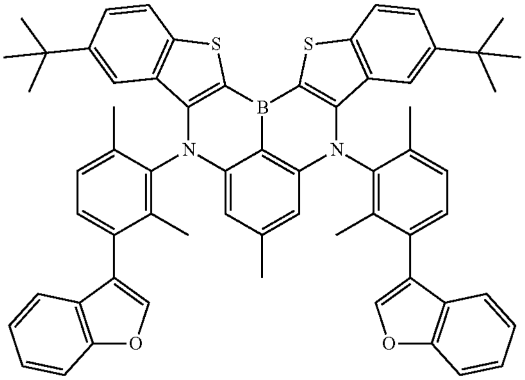
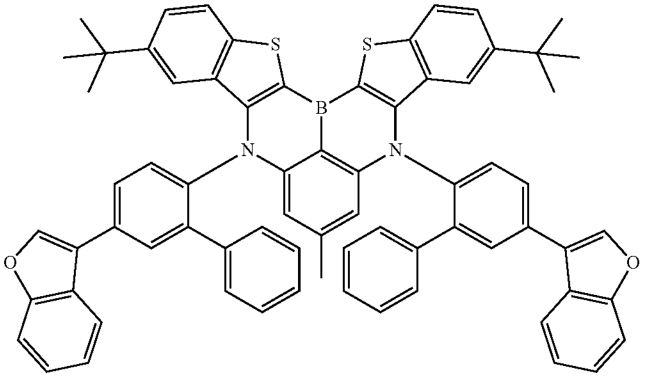

-continued
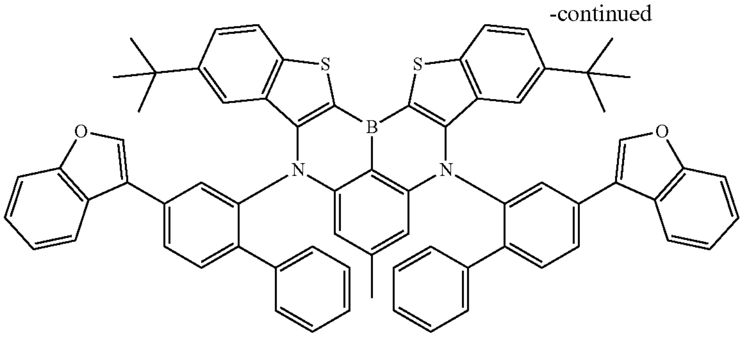
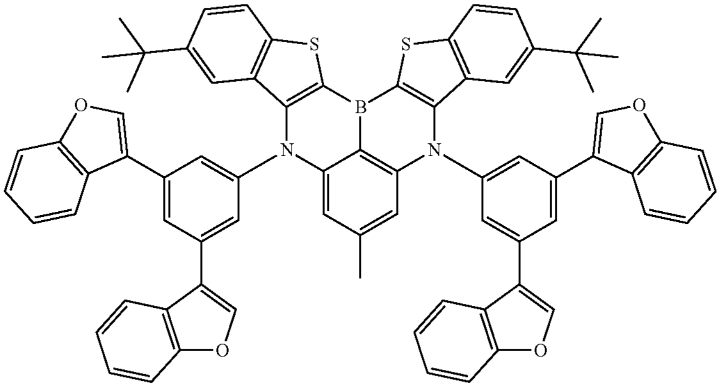
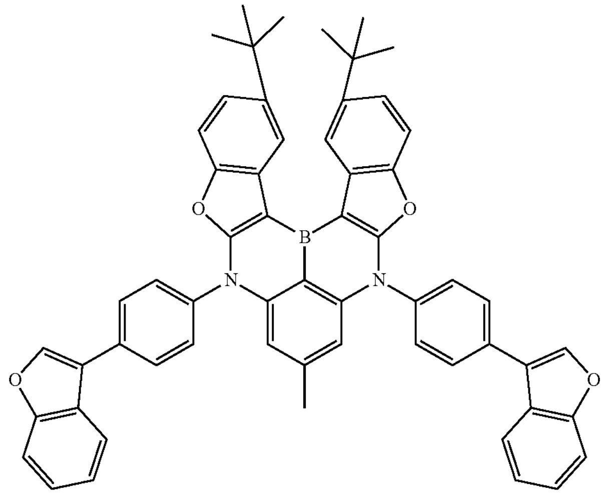
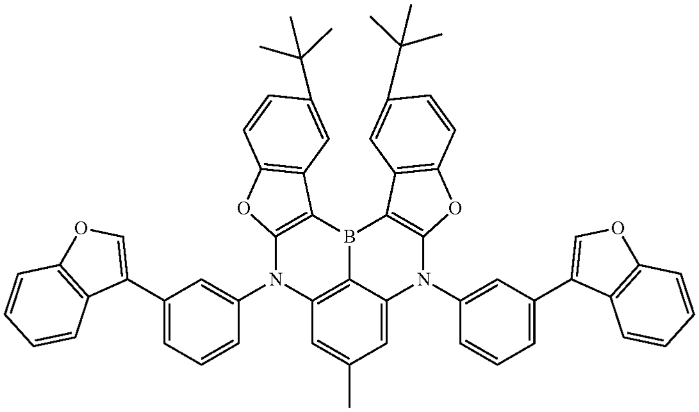

-continued
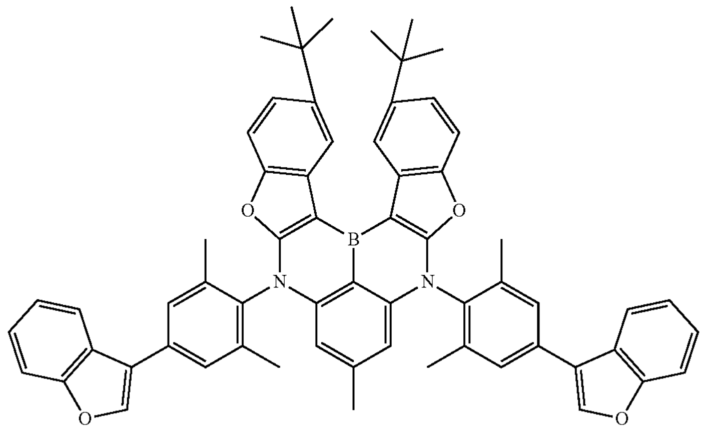
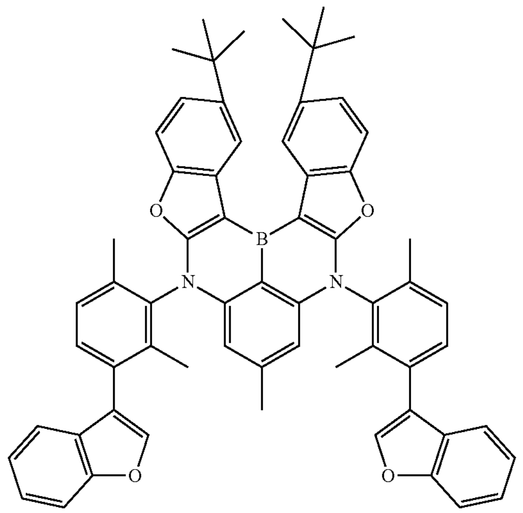
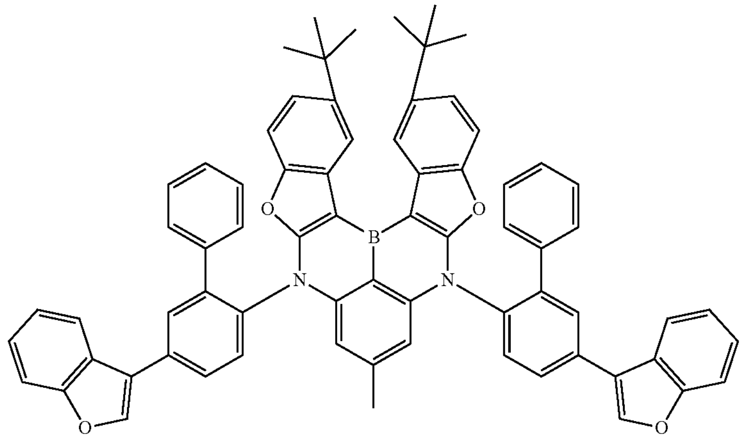

-continued
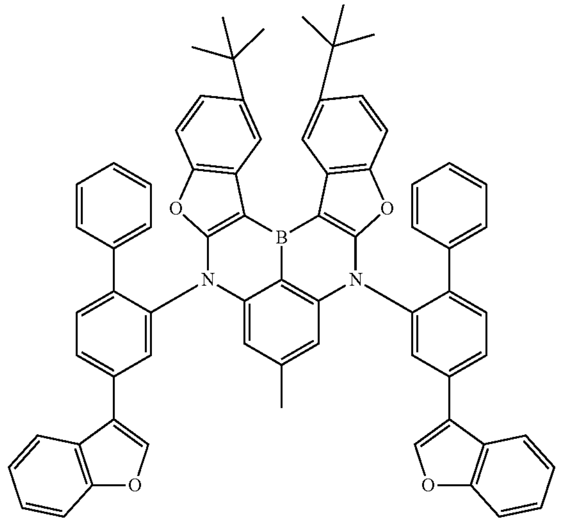
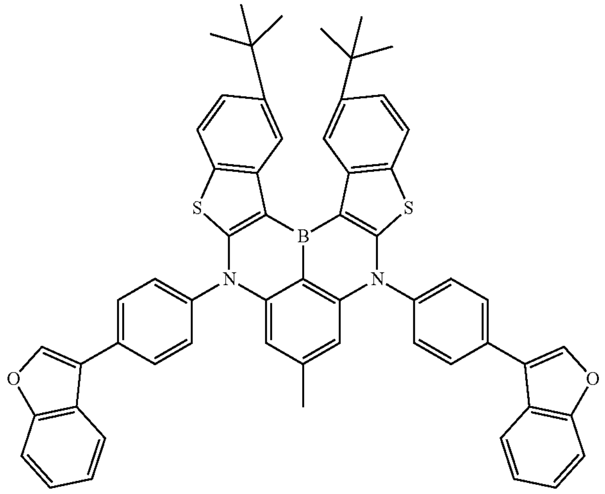
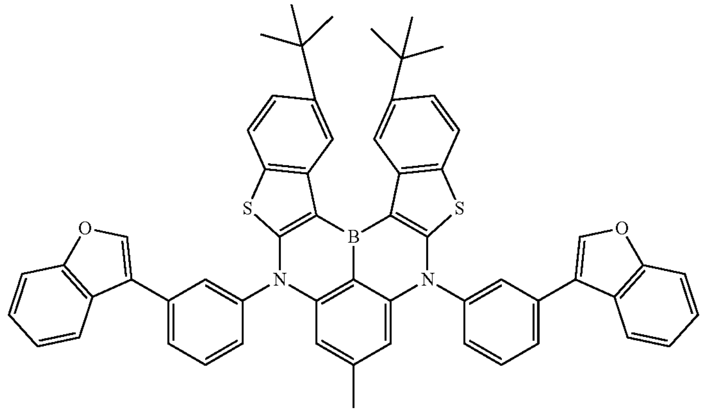
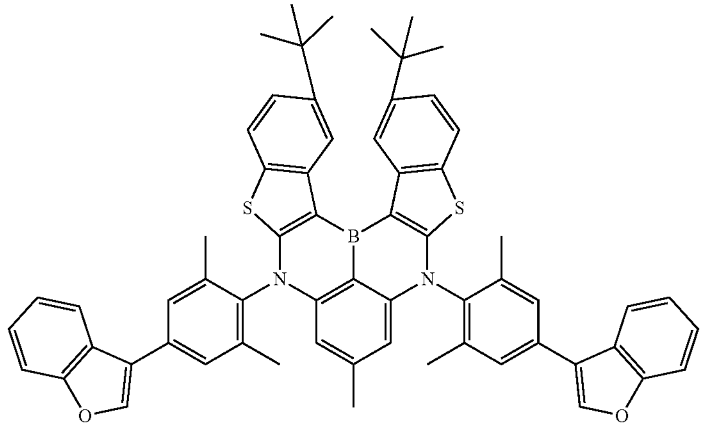

-continued
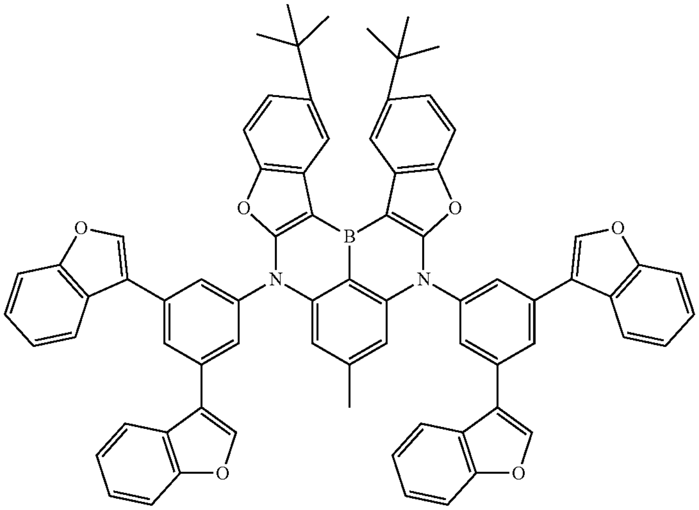
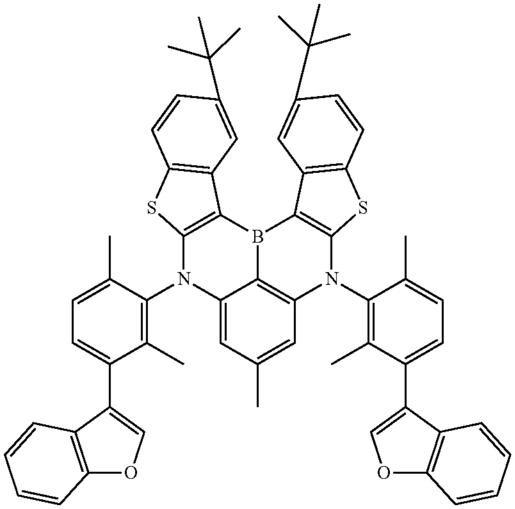
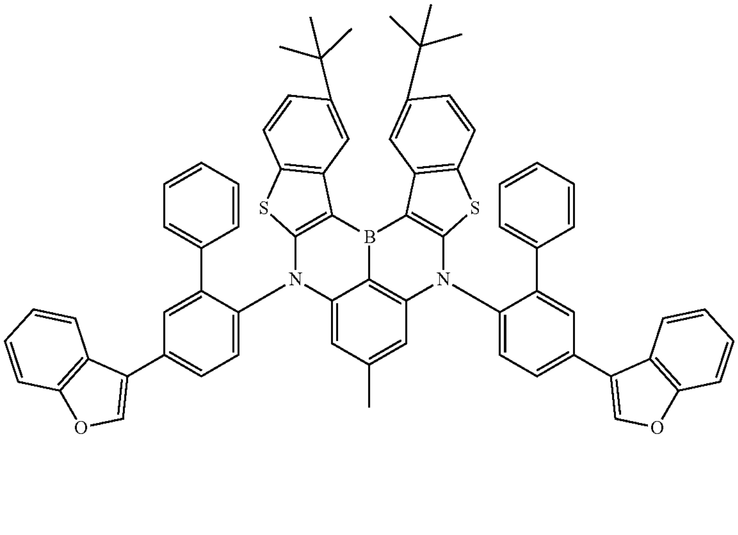

-continued
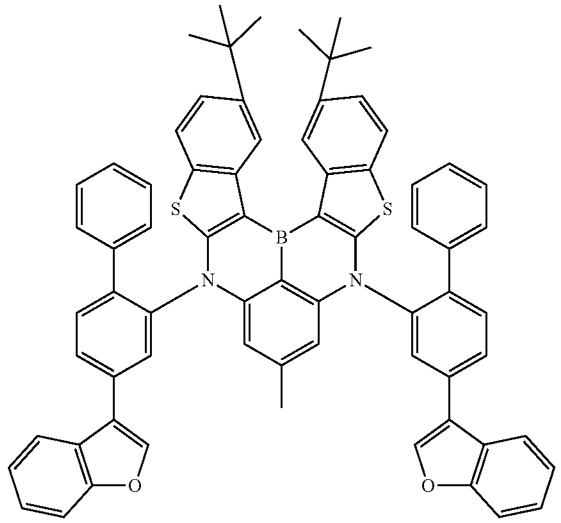
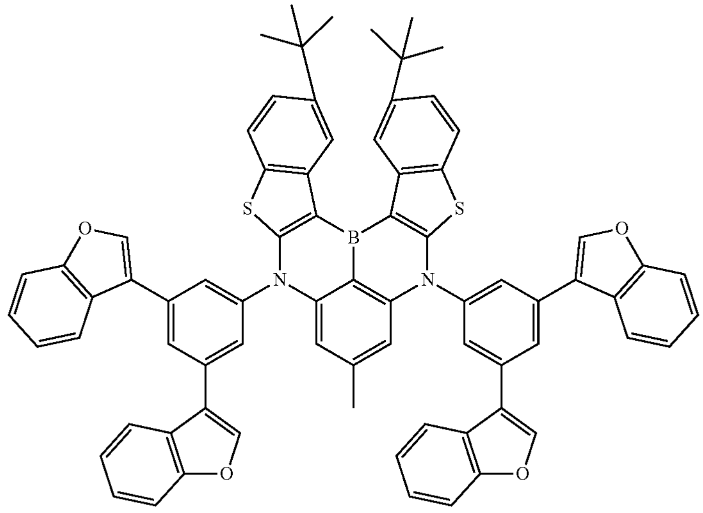
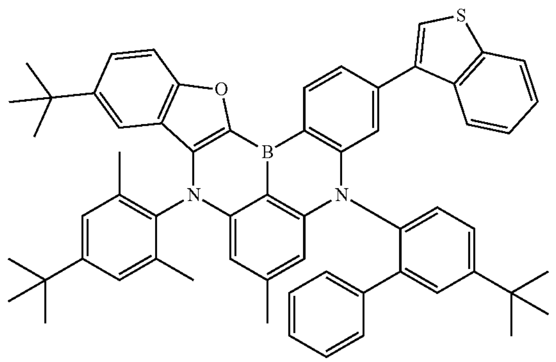
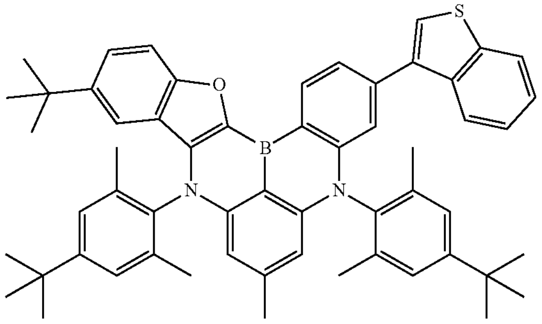

-continued
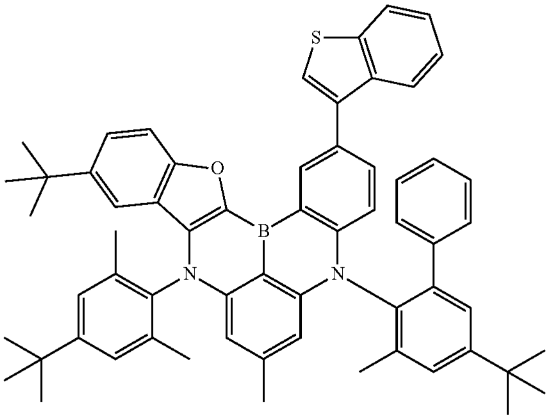
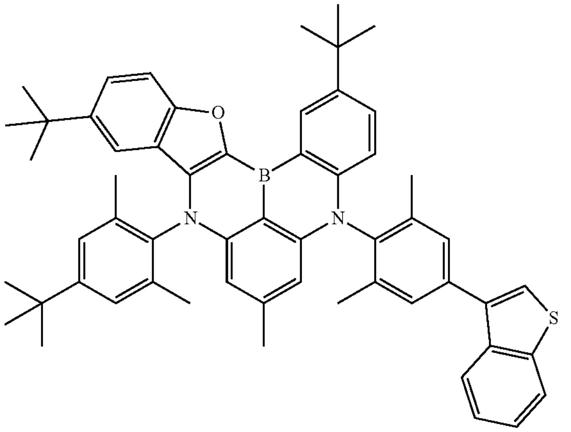
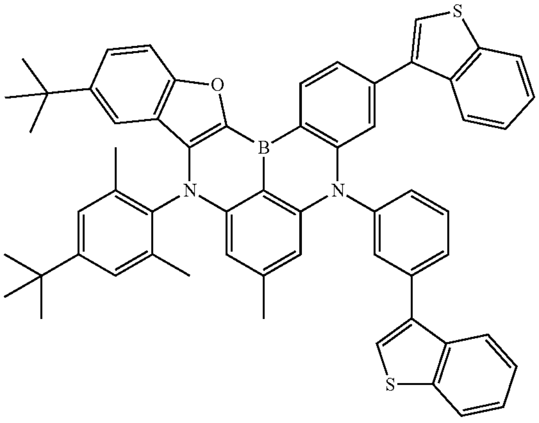
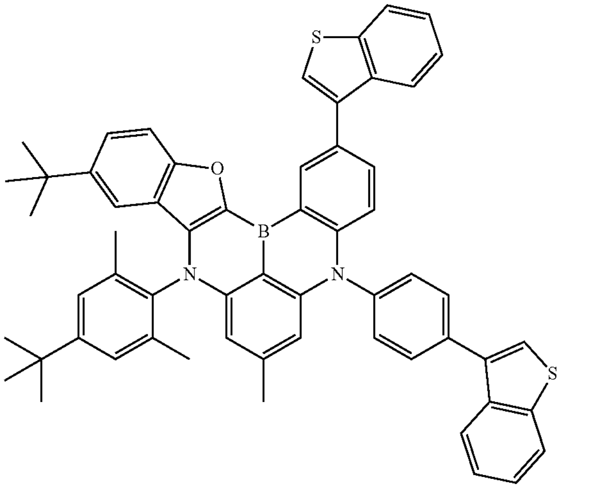
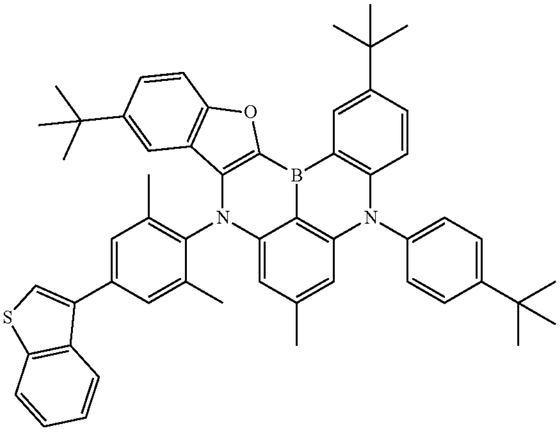
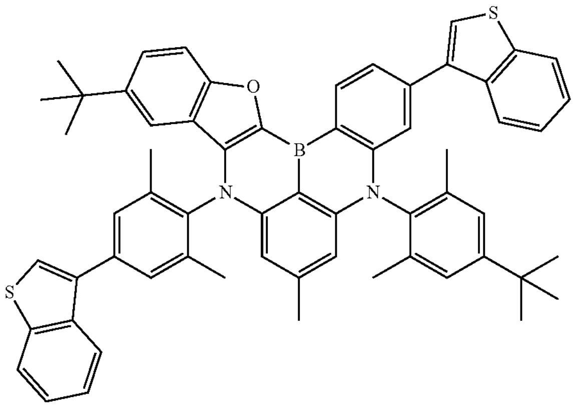

-continued
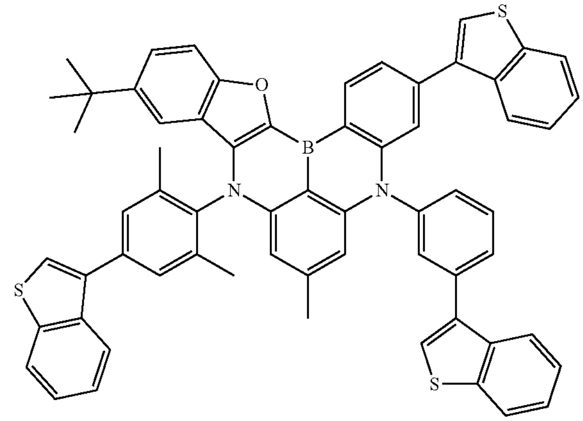
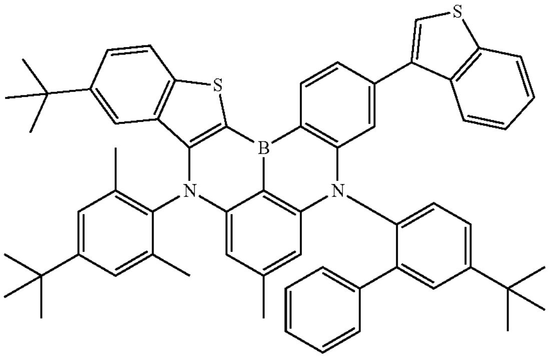
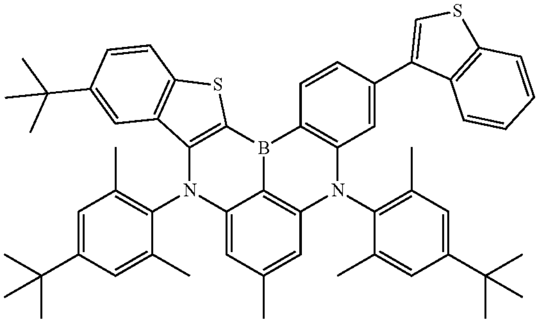
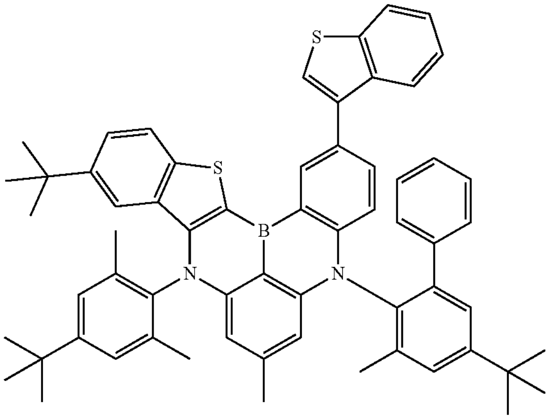
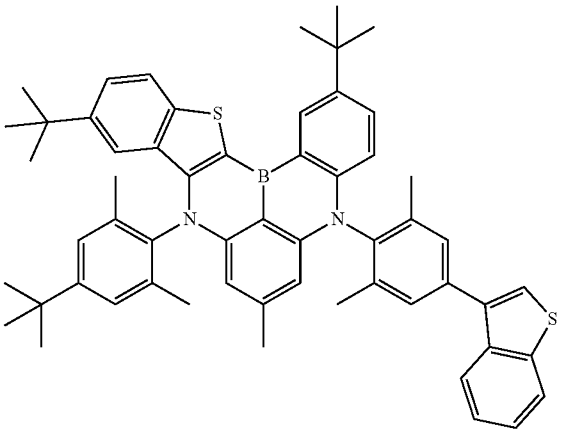
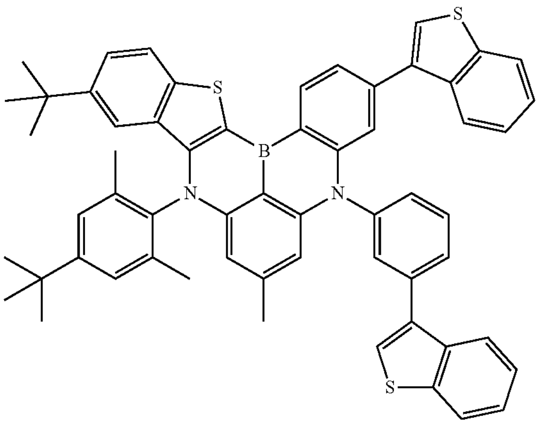

-continued
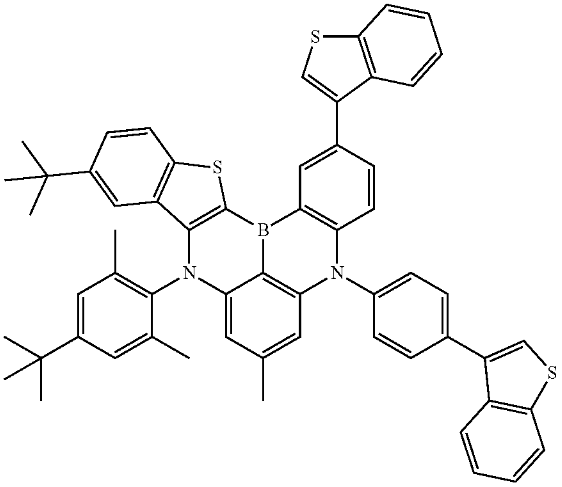
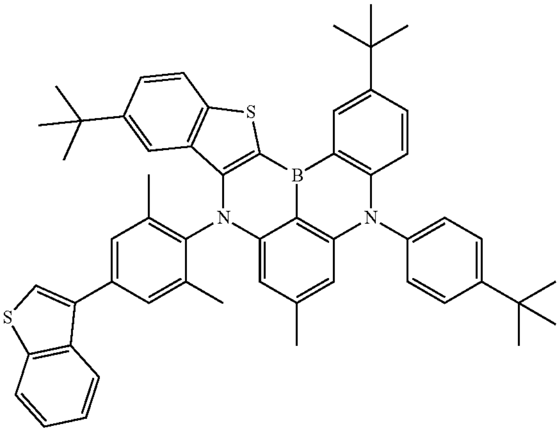
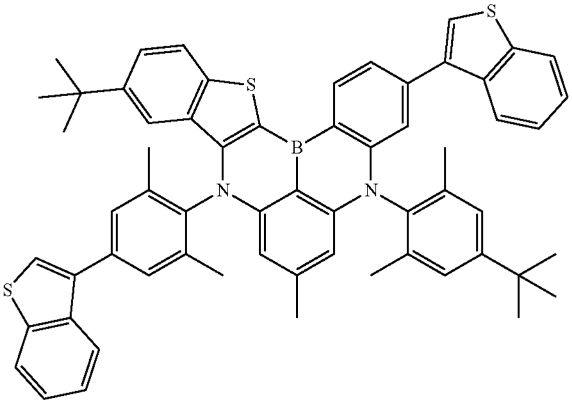
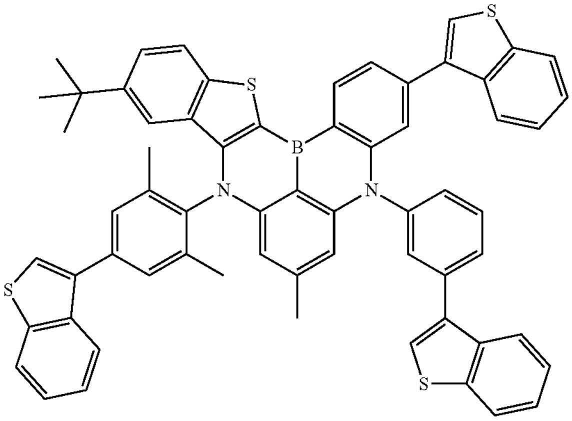
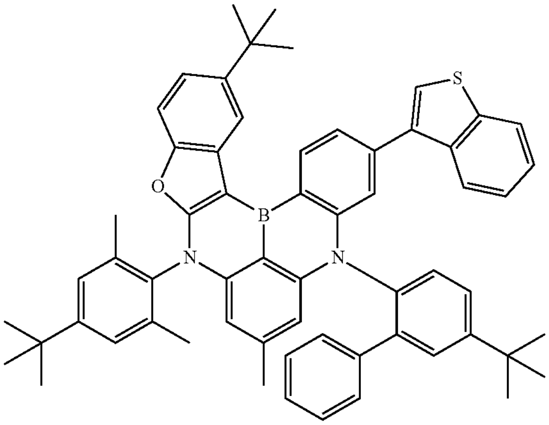
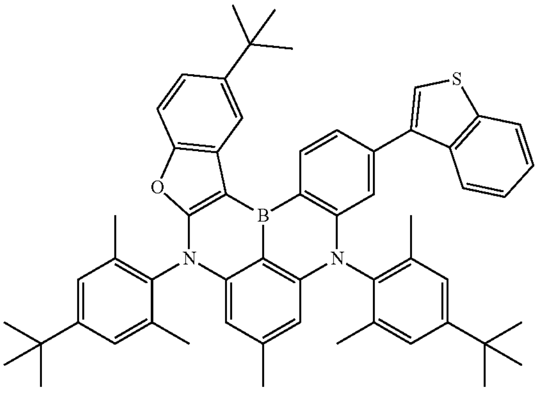

-continued
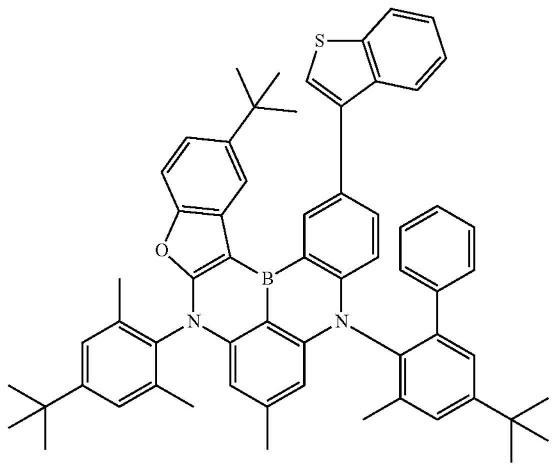
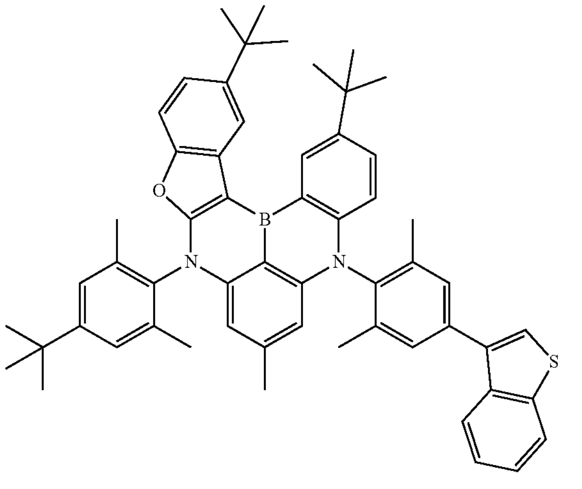
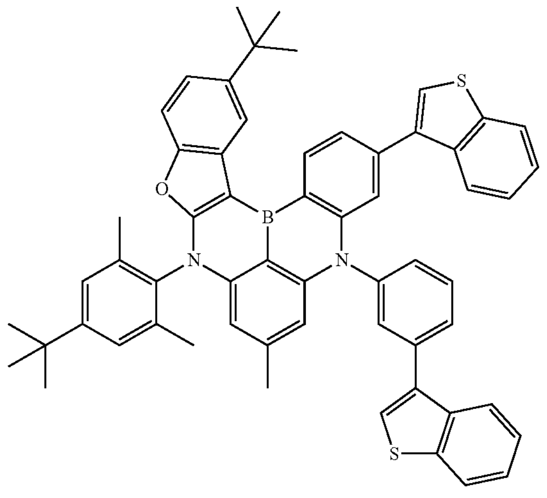
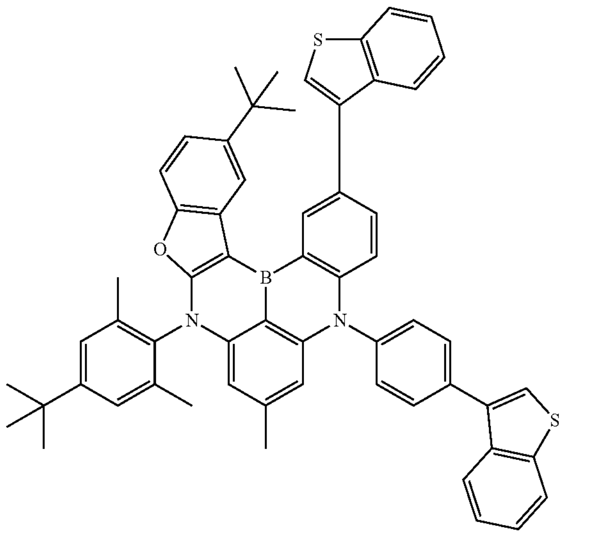
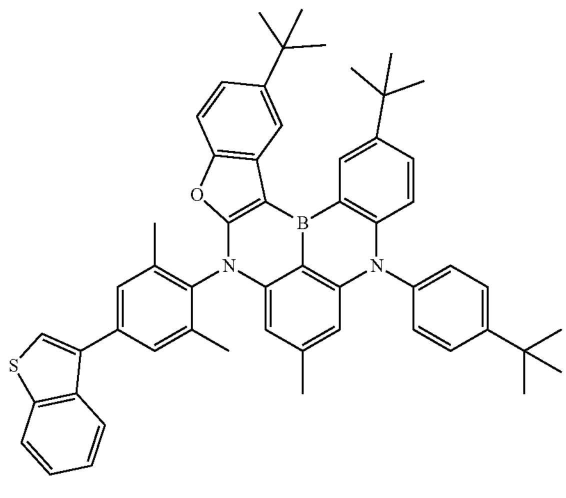
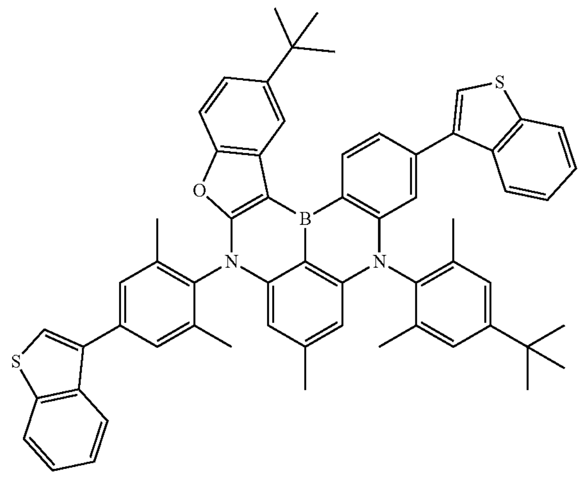

-continued
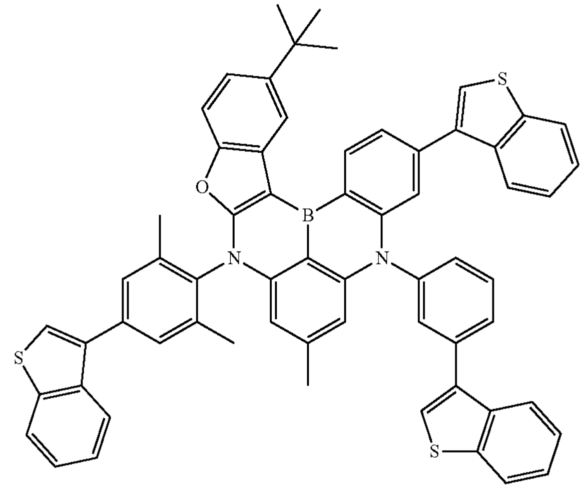
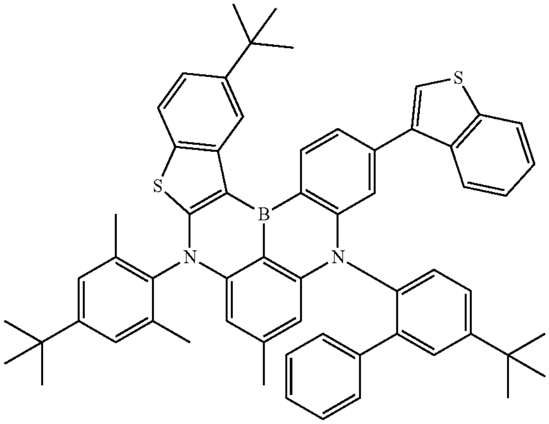
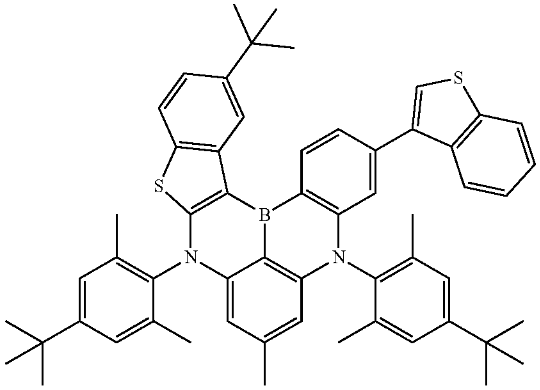
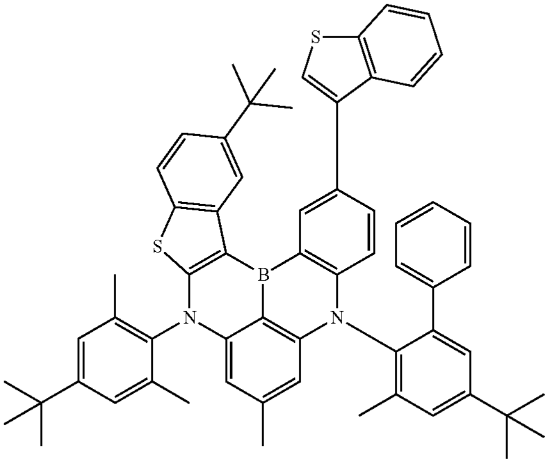
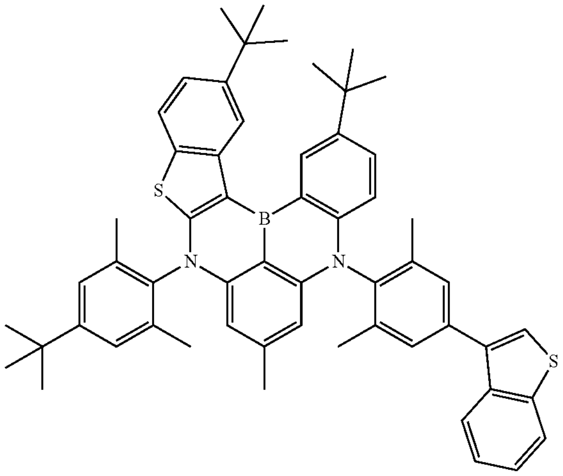
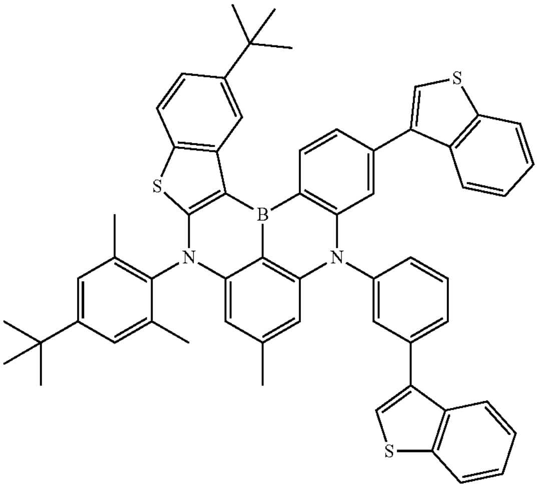

-continued
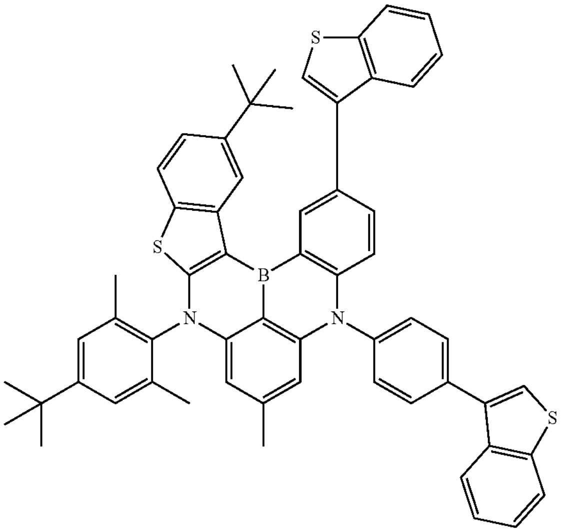
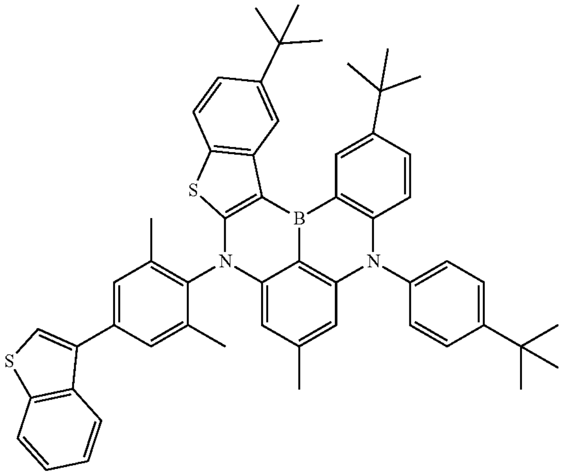
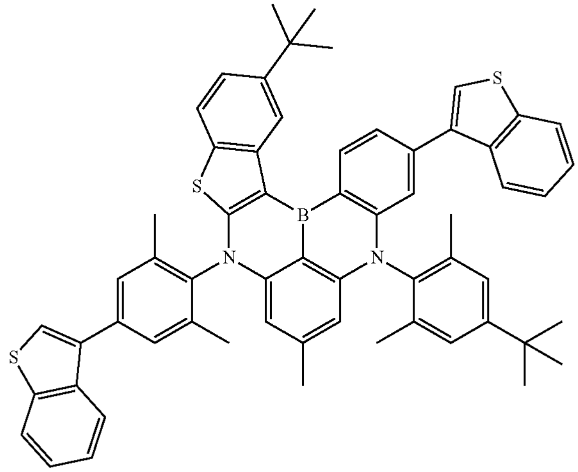
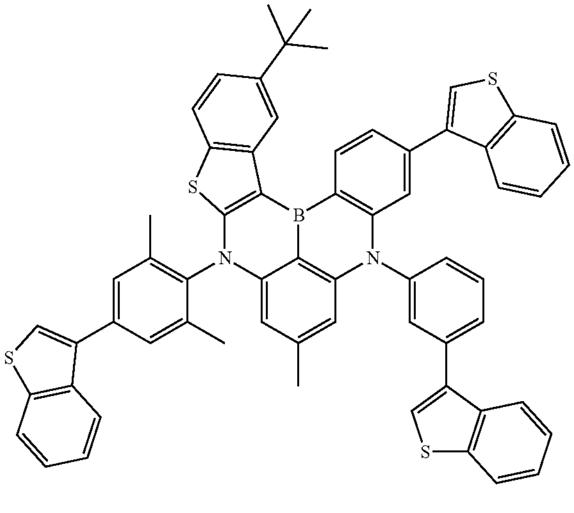
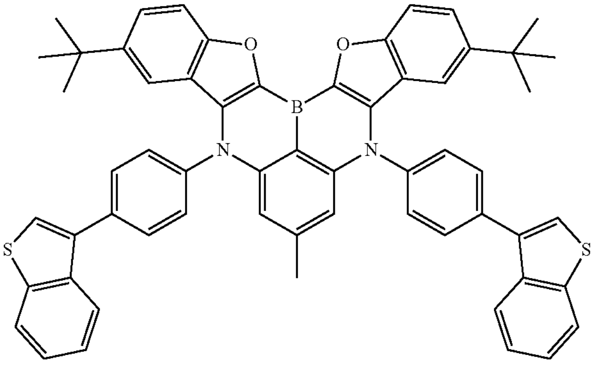
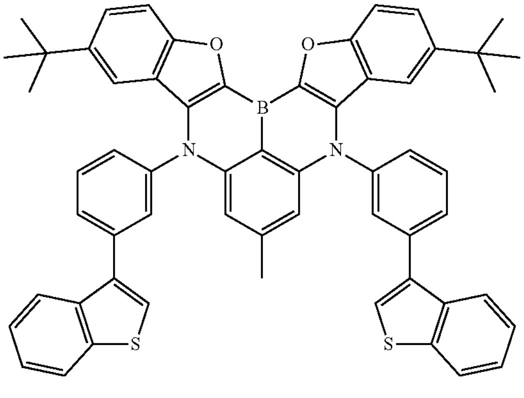

-continued
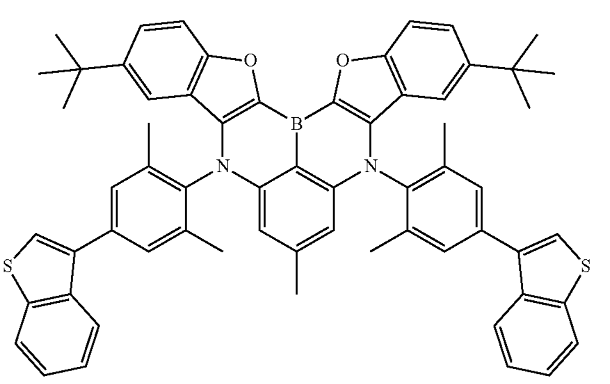
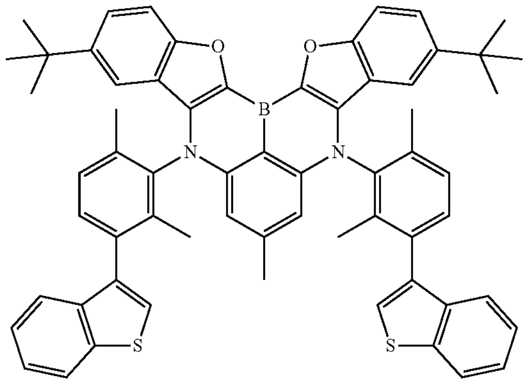
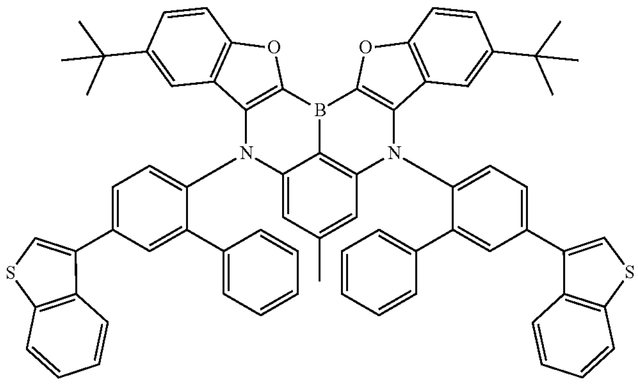
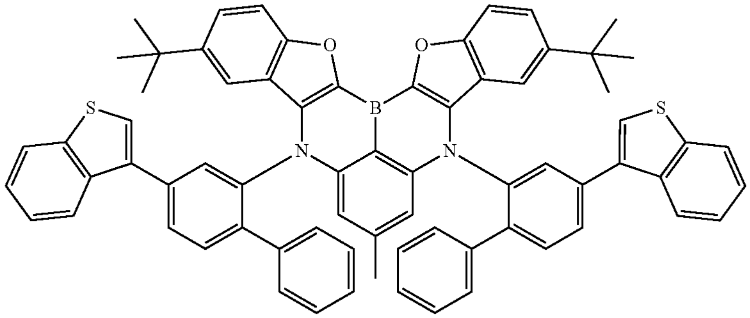
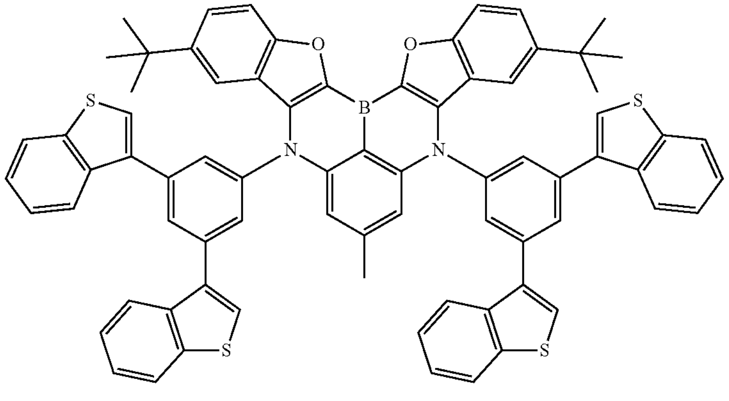

-continued
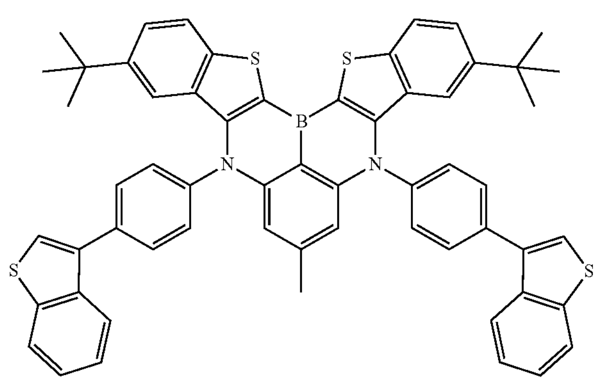
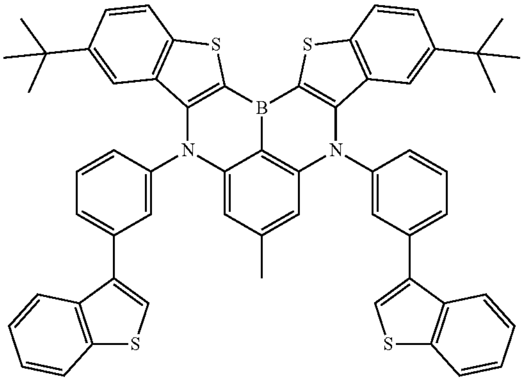
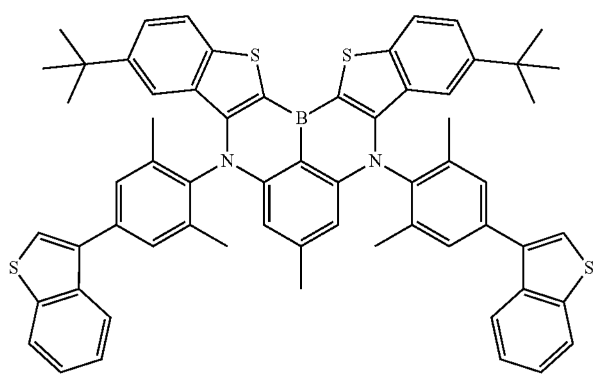
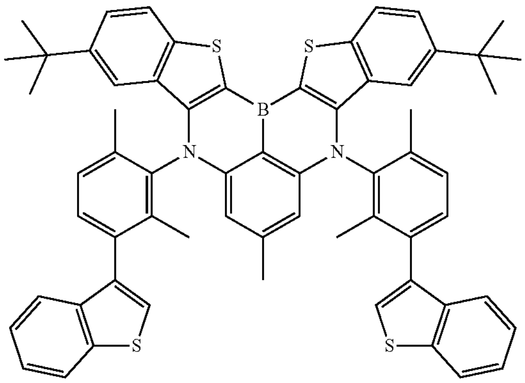
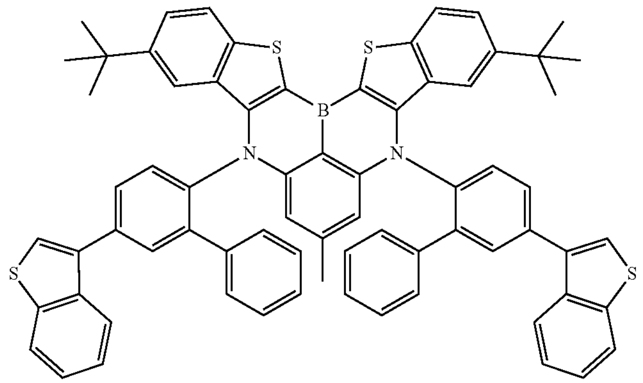

-continued
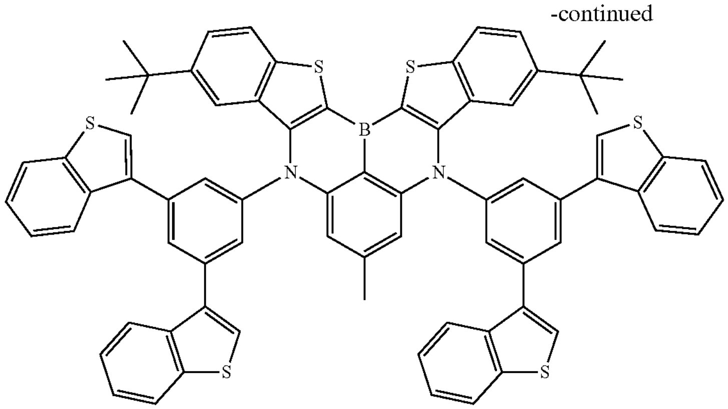
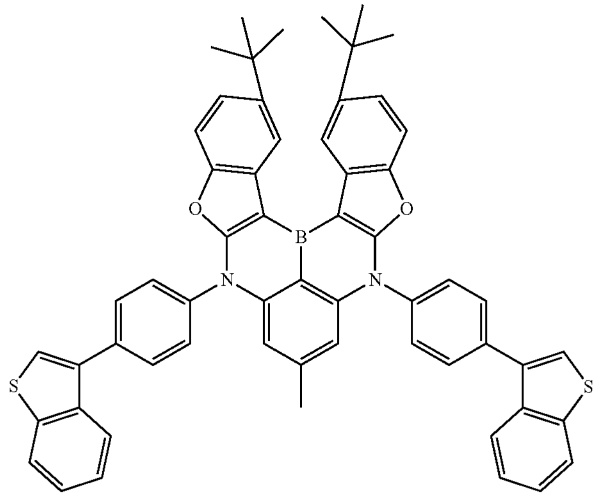
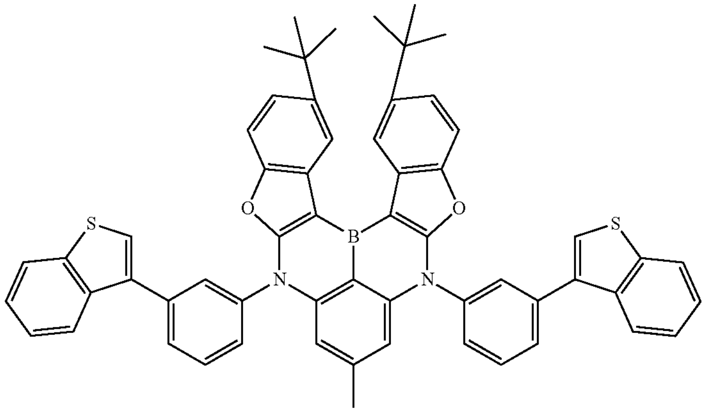
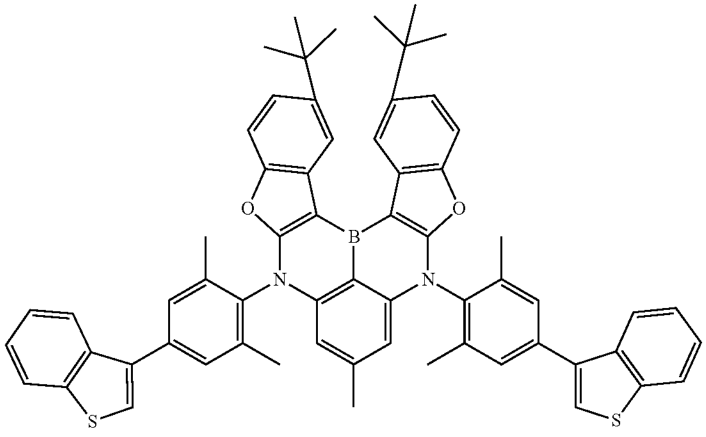

-continued
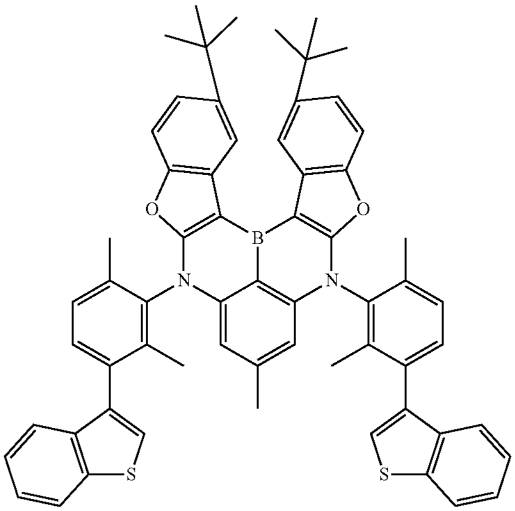
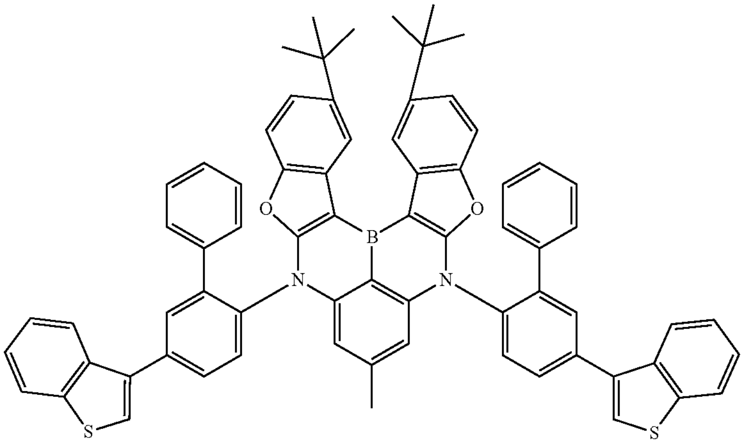
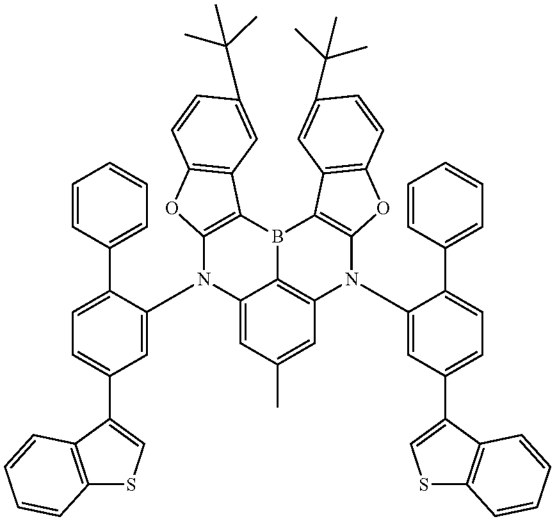

-continued
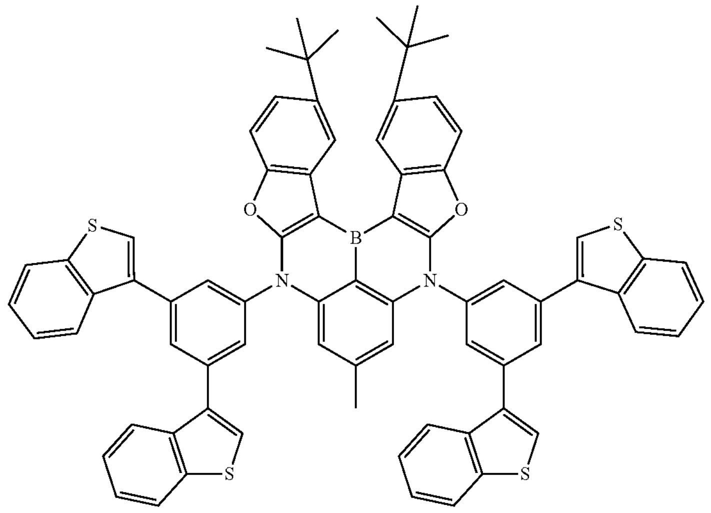
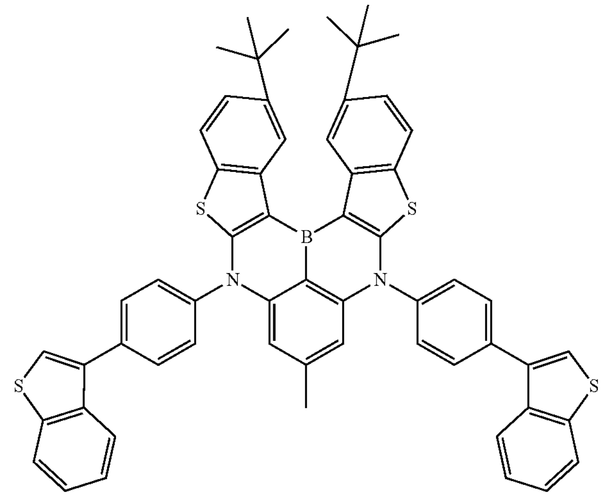
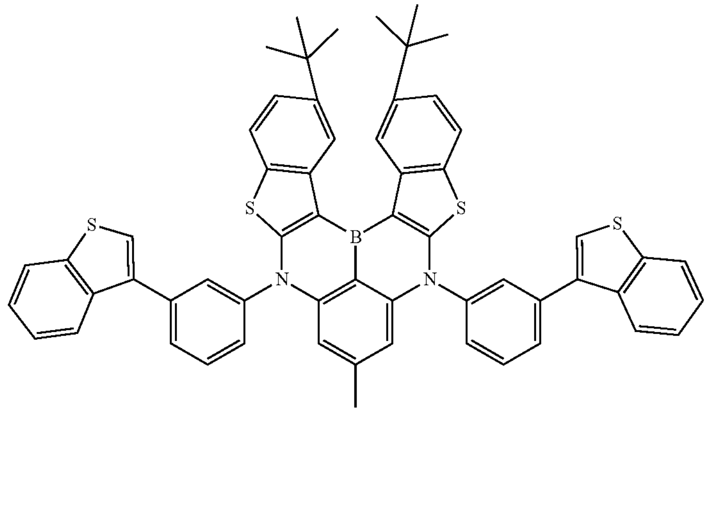

-continued
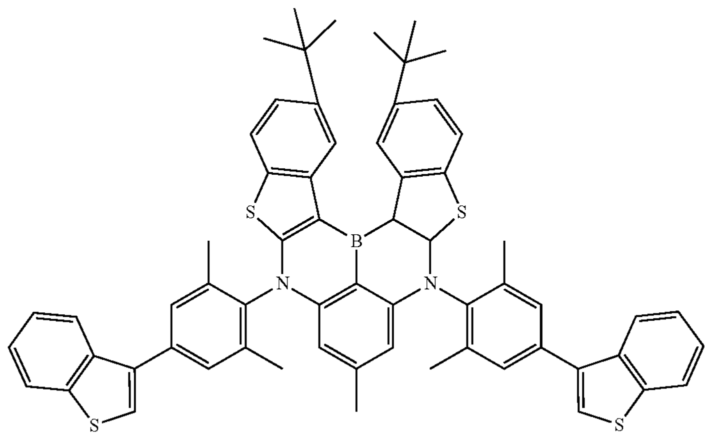
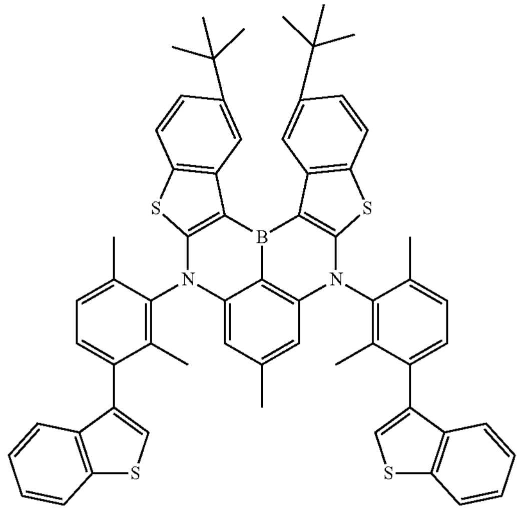
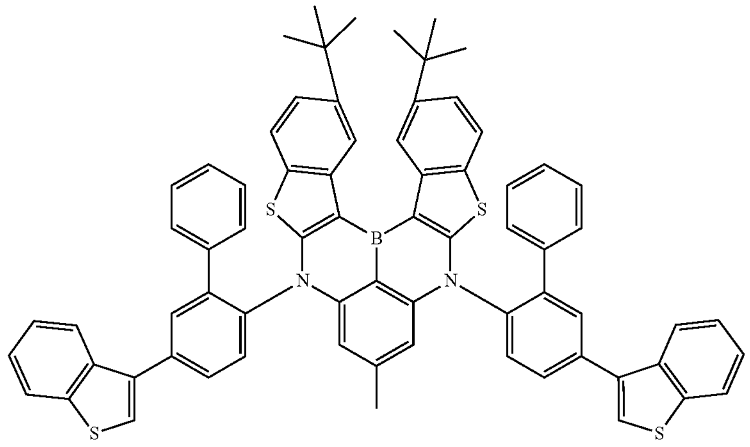

-continued
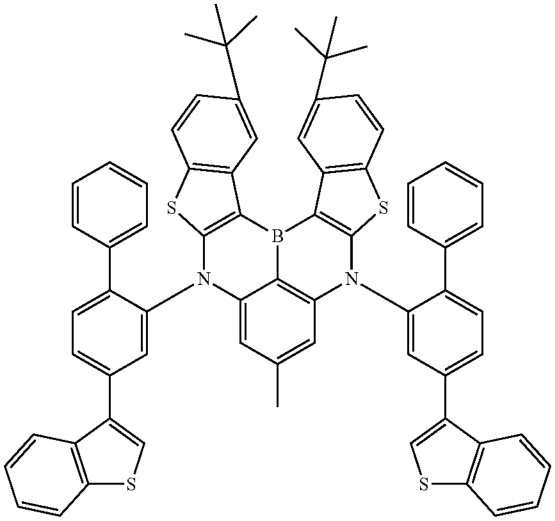
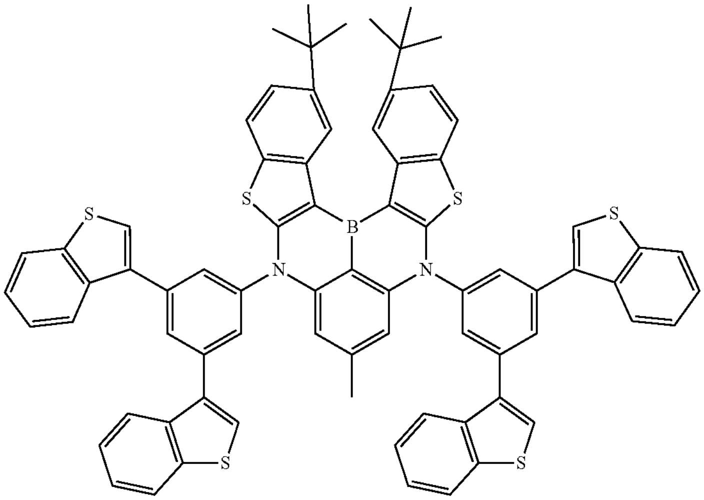
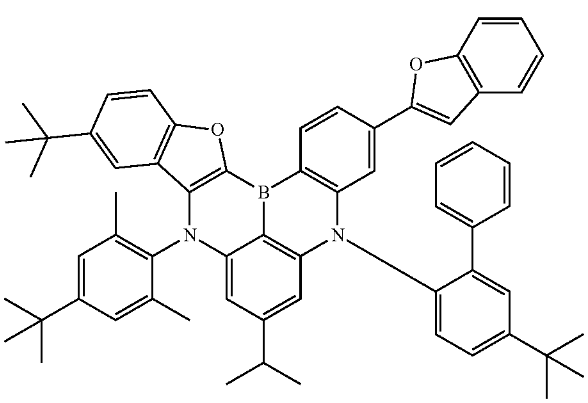
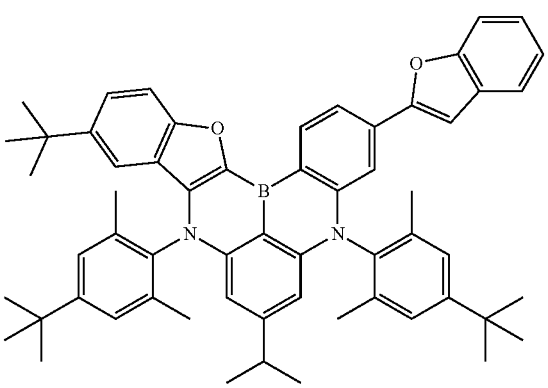

-continued
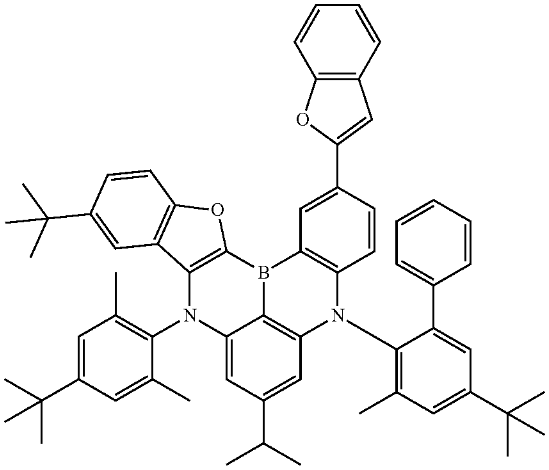
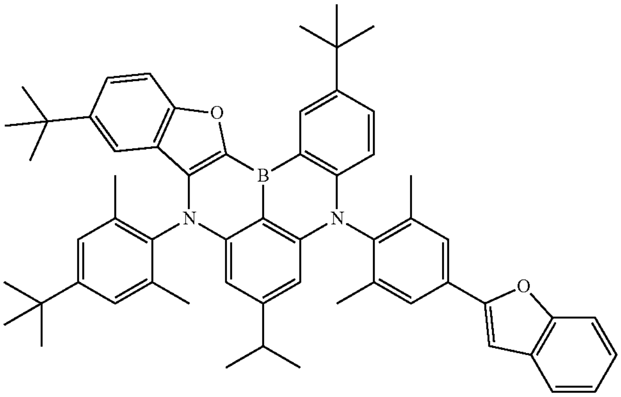
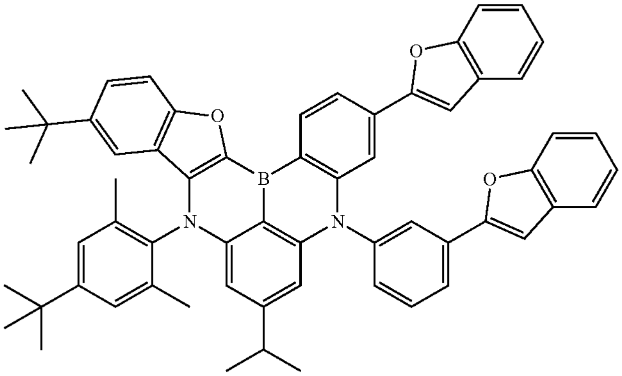
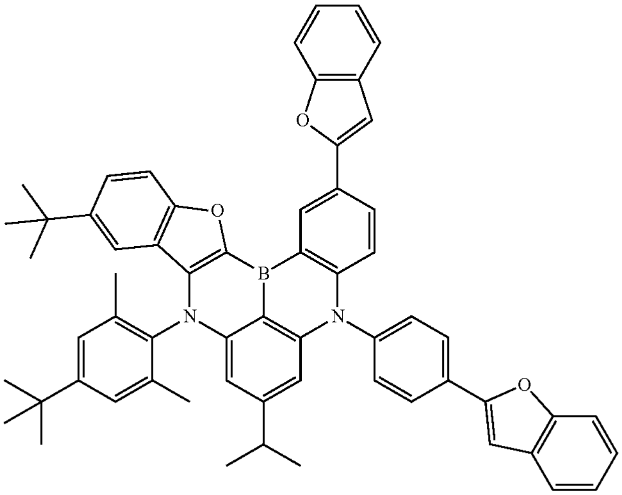

-continued
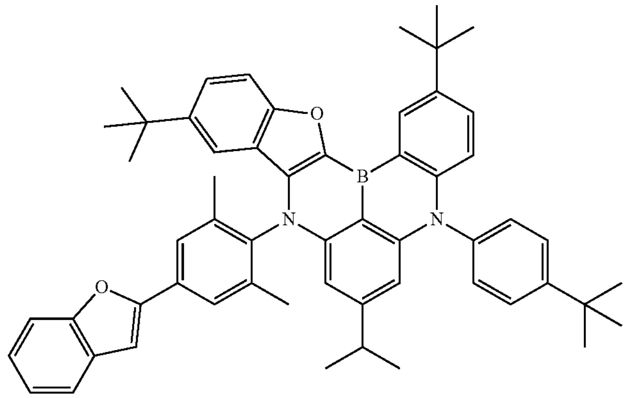
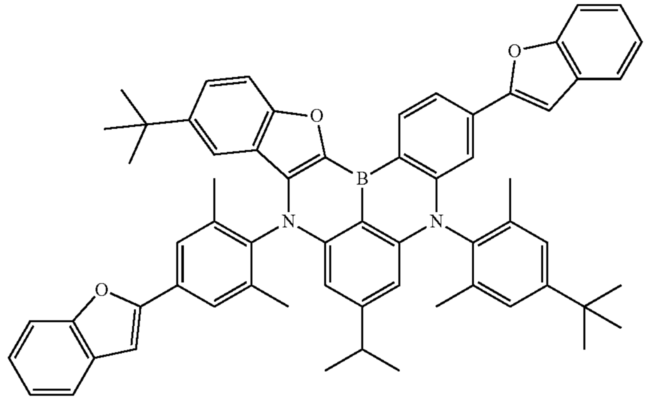
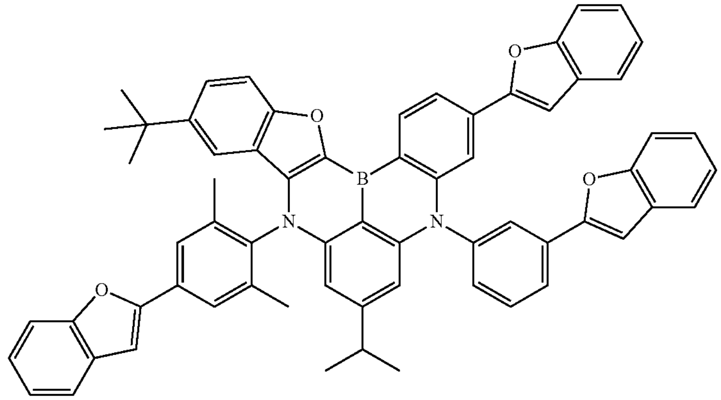
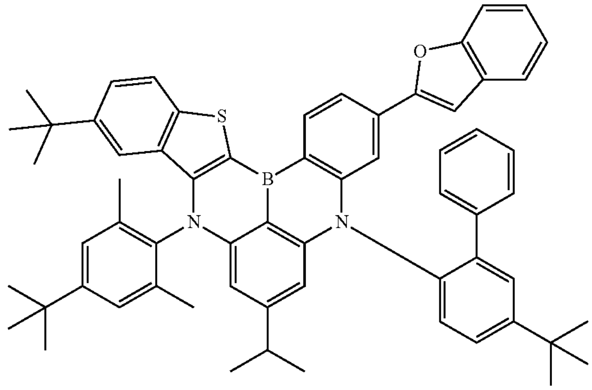
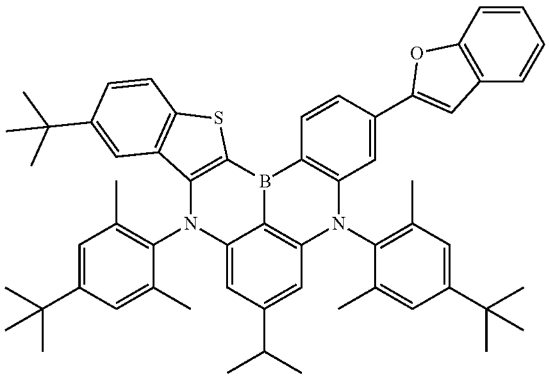

-continued
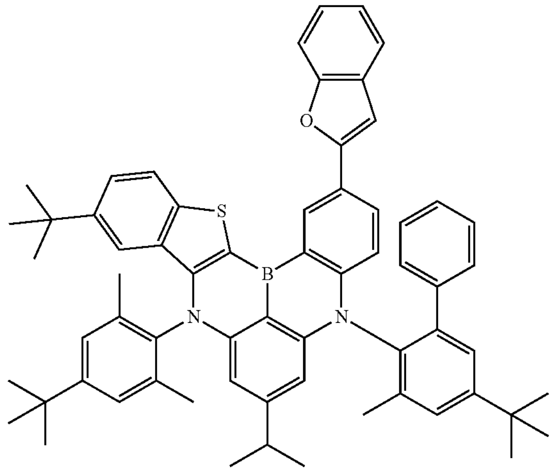
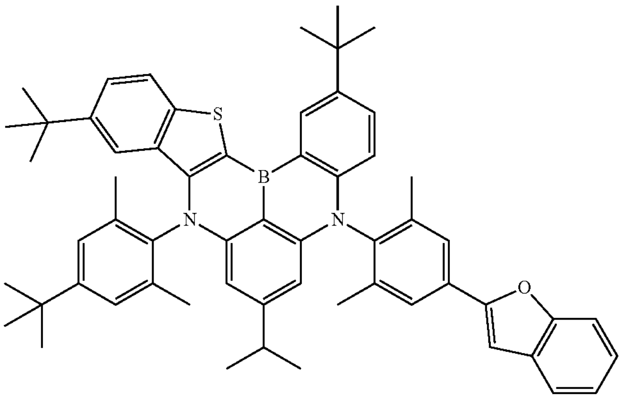
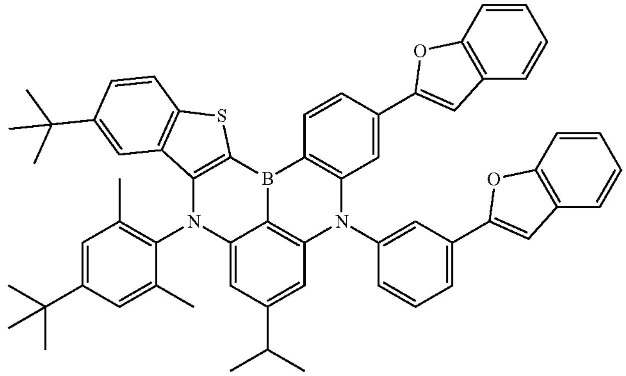
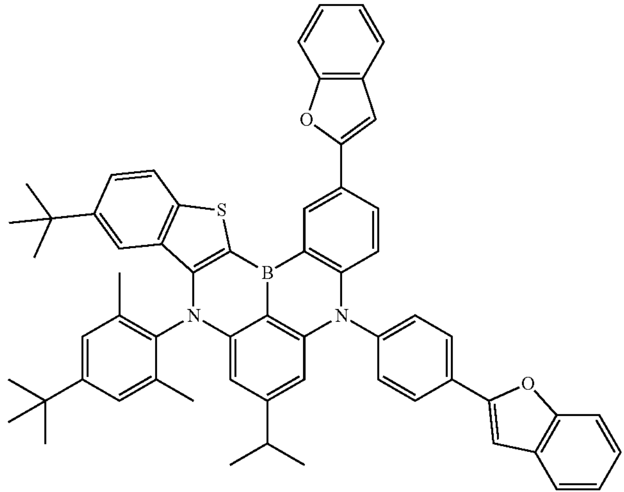

-continued
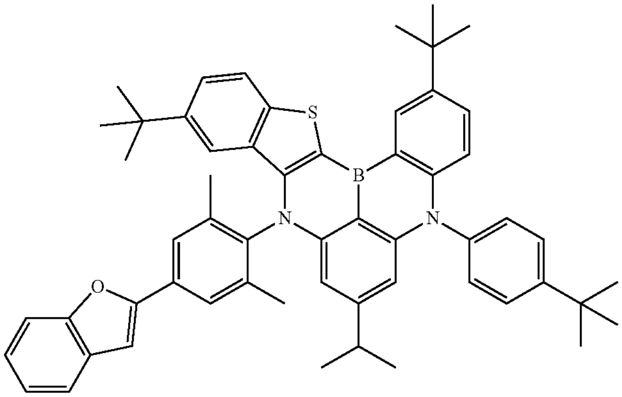
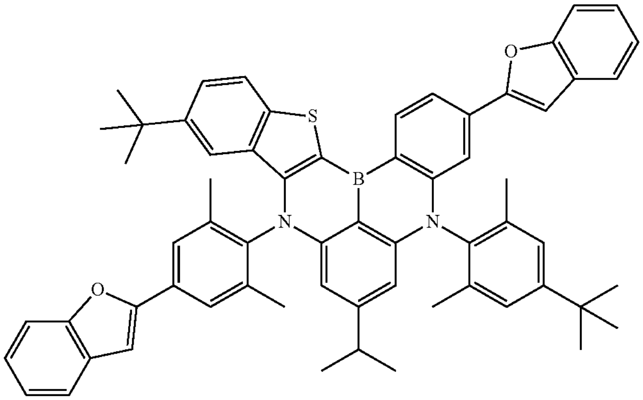
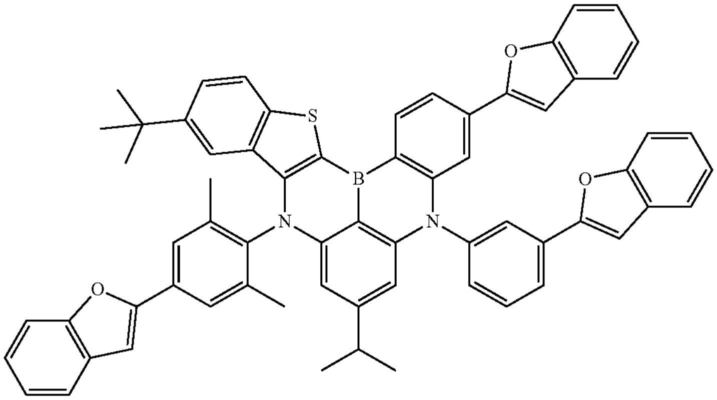
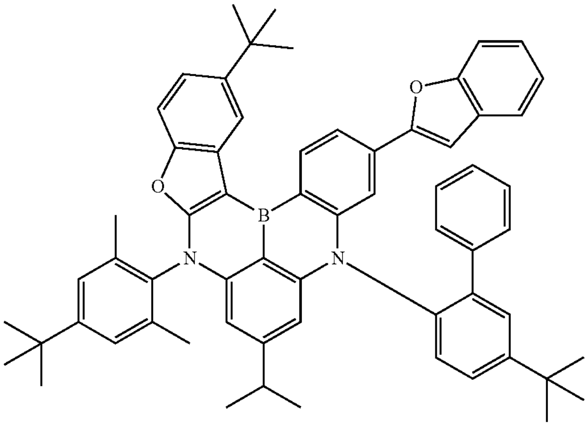
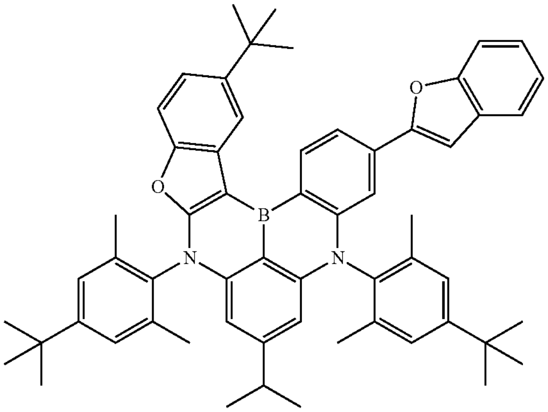

-continued
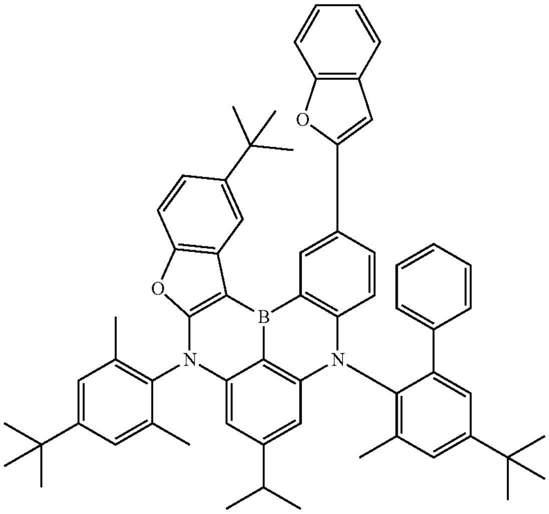
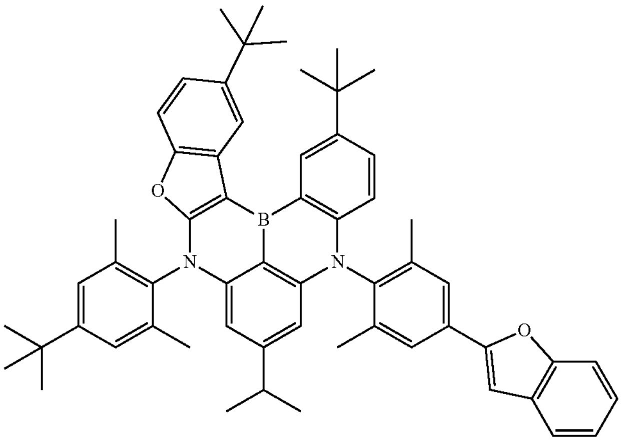
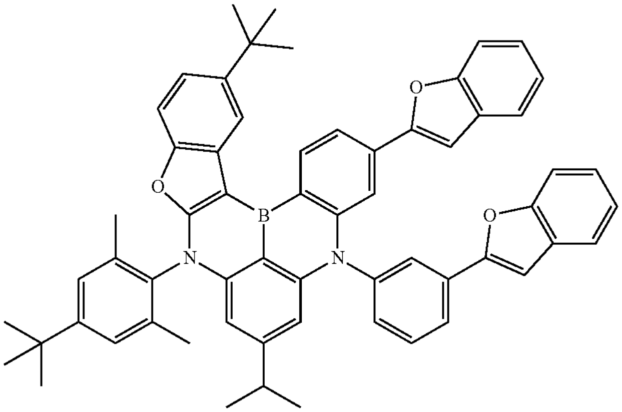
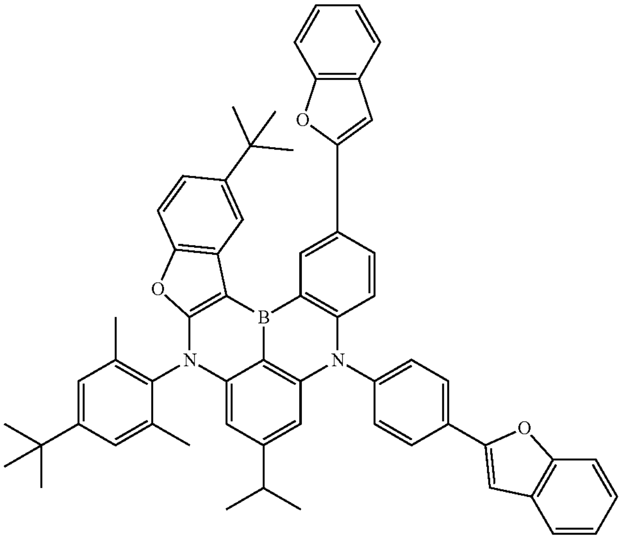

-continued
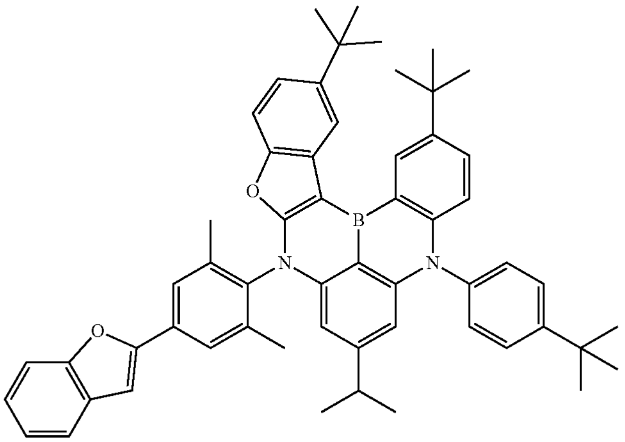
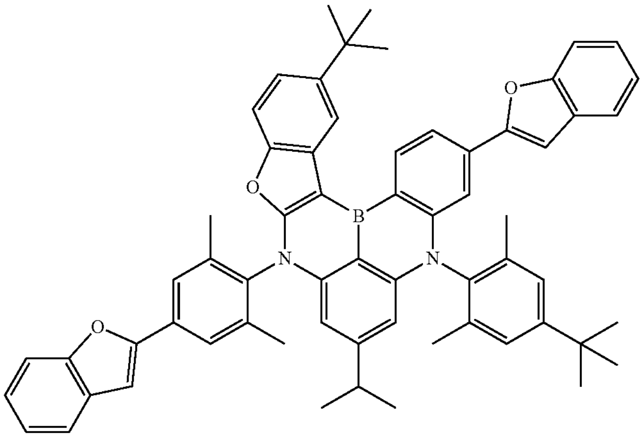
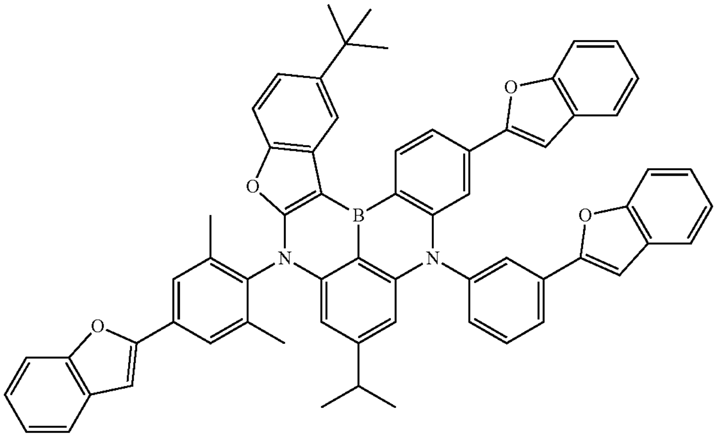

-continued
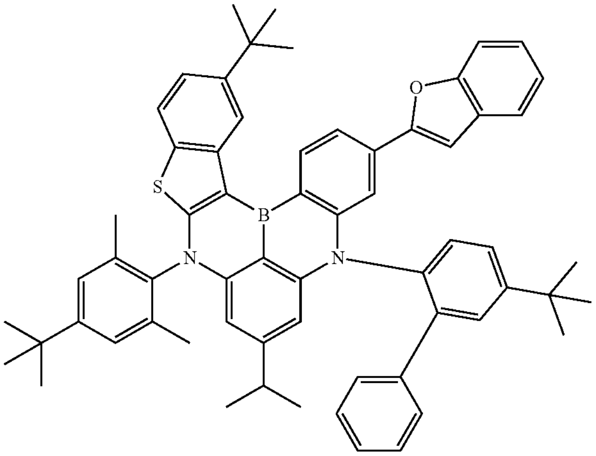
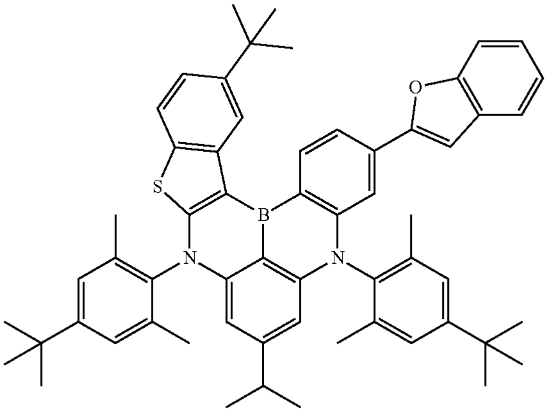
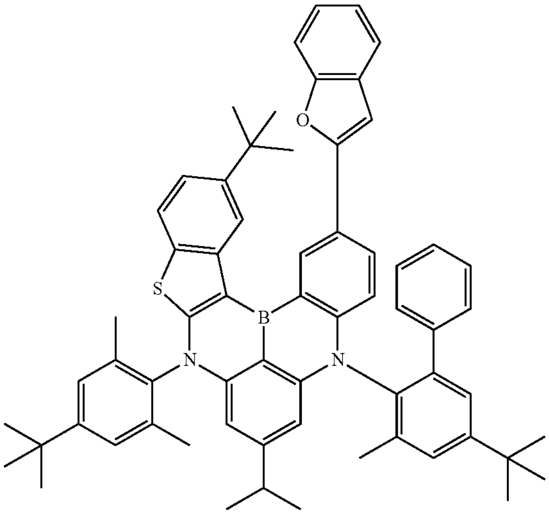
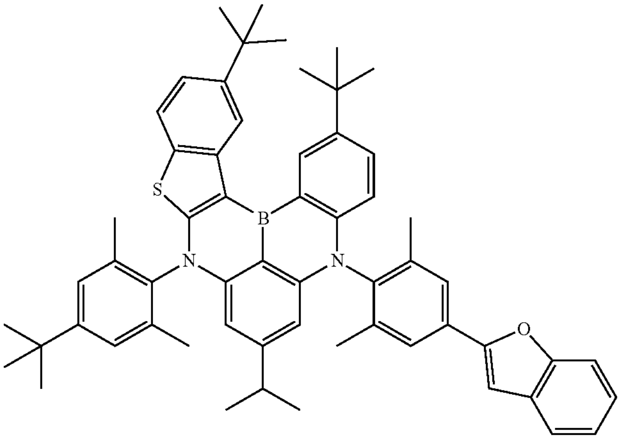
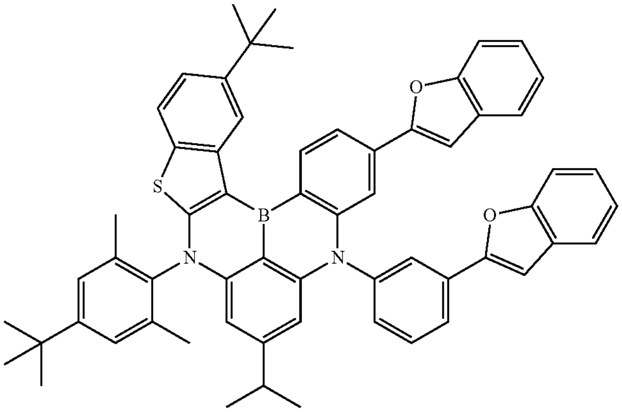

-continued
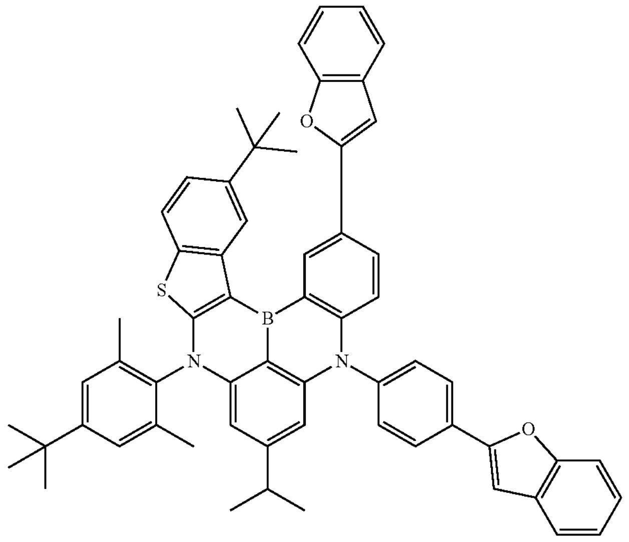
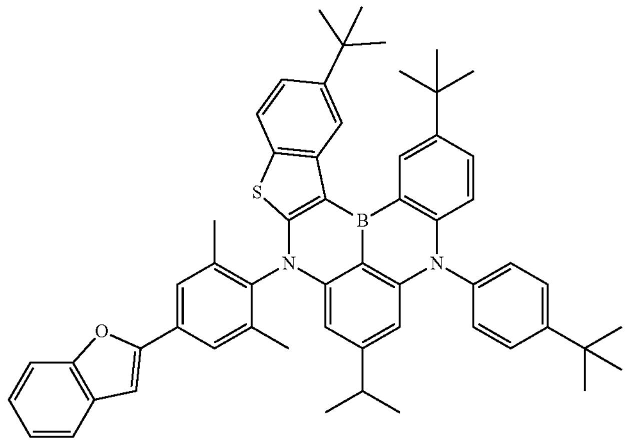
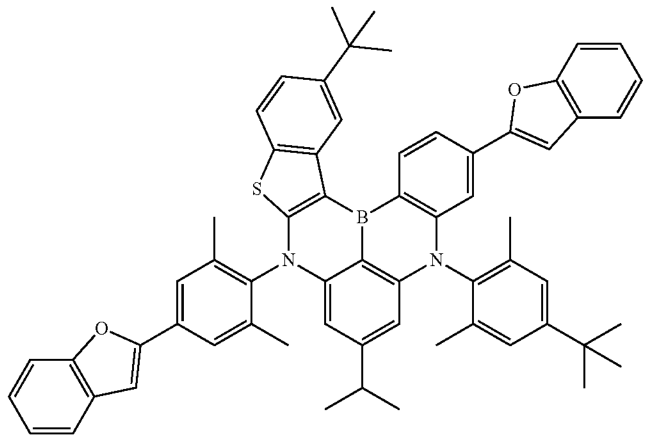

-continued
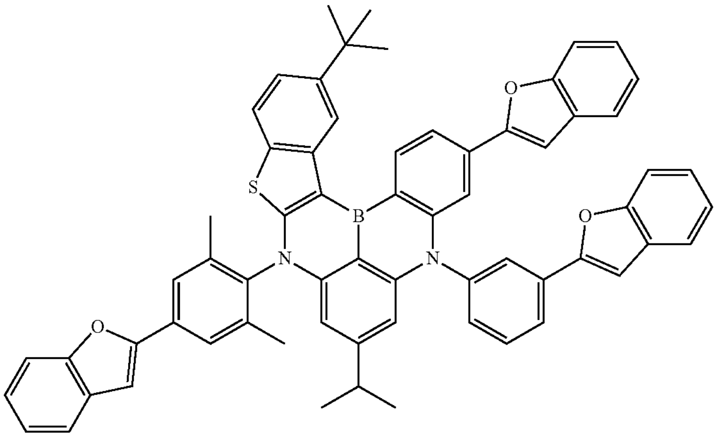
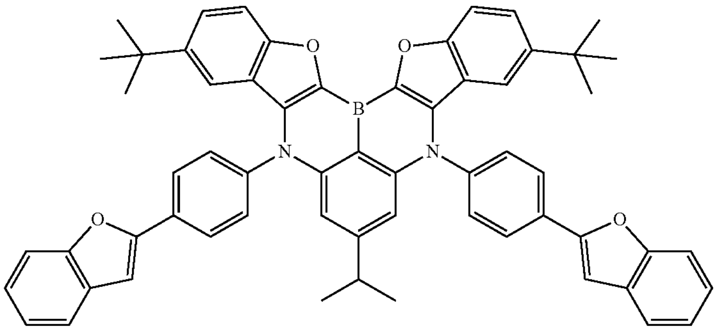
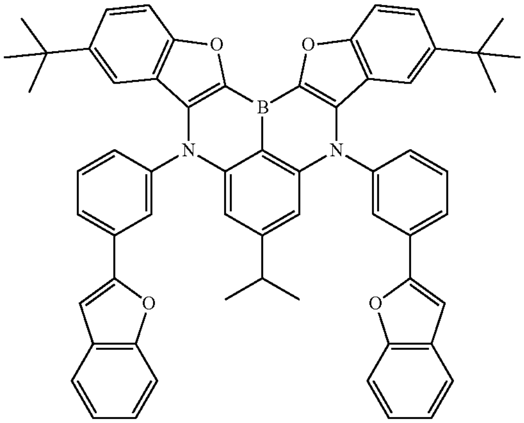
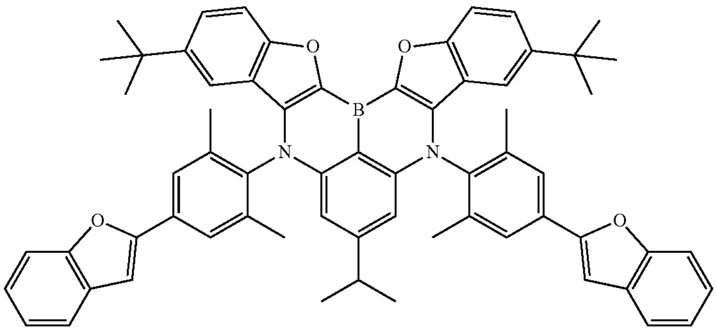

-continued
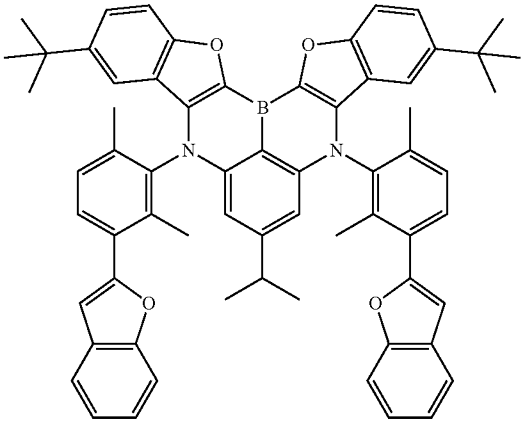
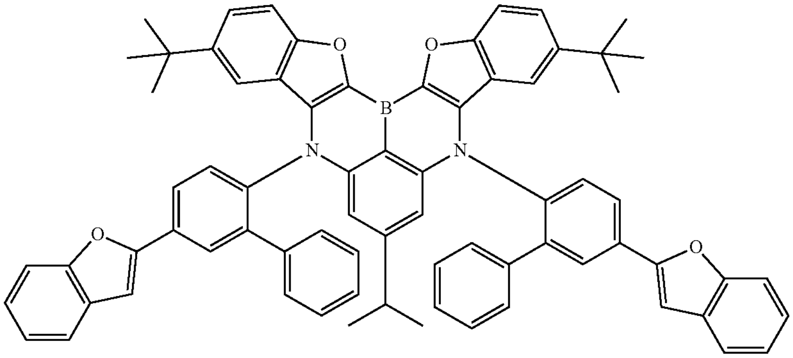
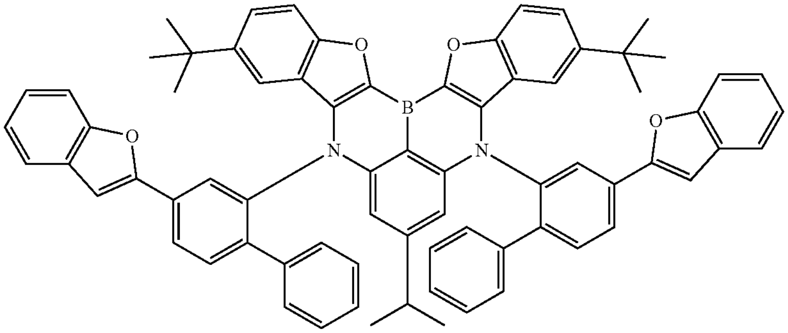
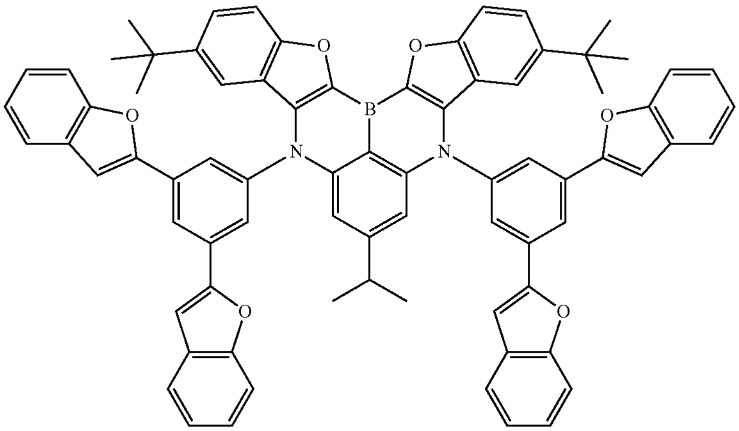

-continued
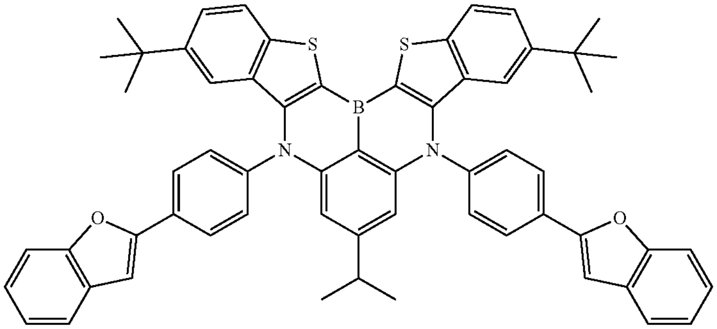
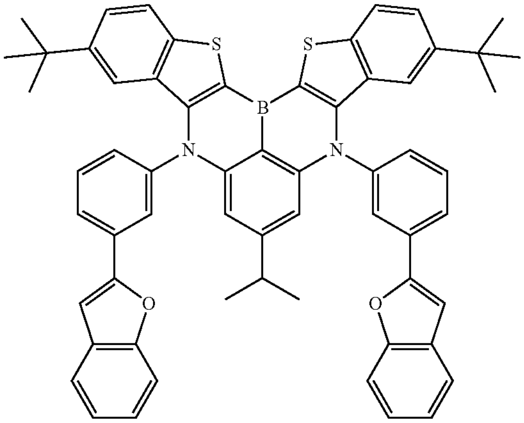
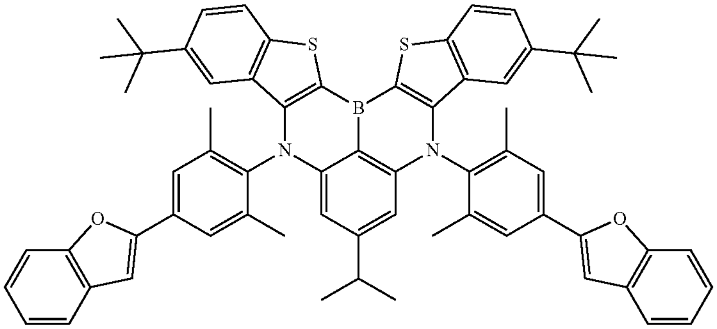
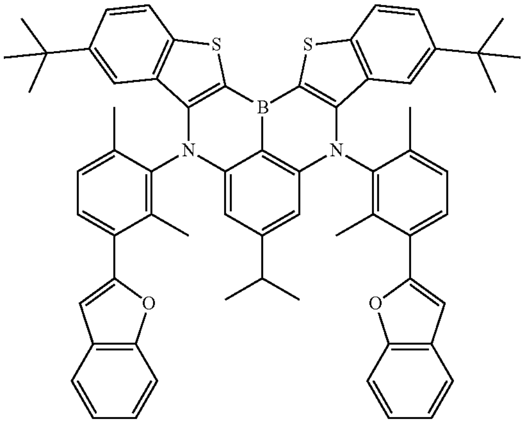

-continued
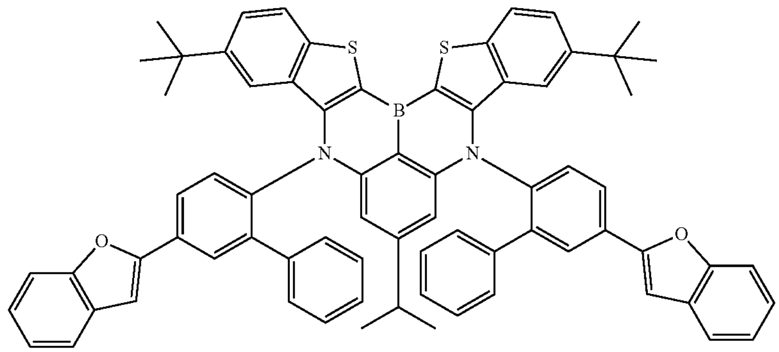
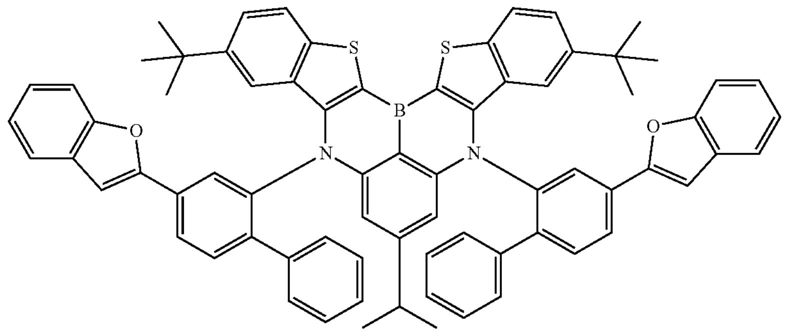
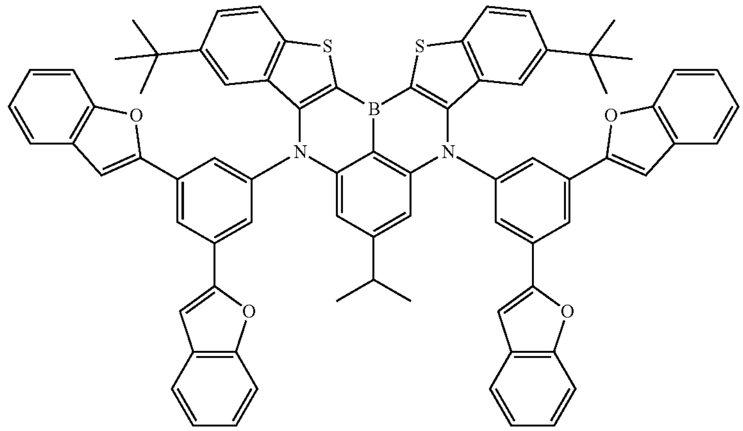
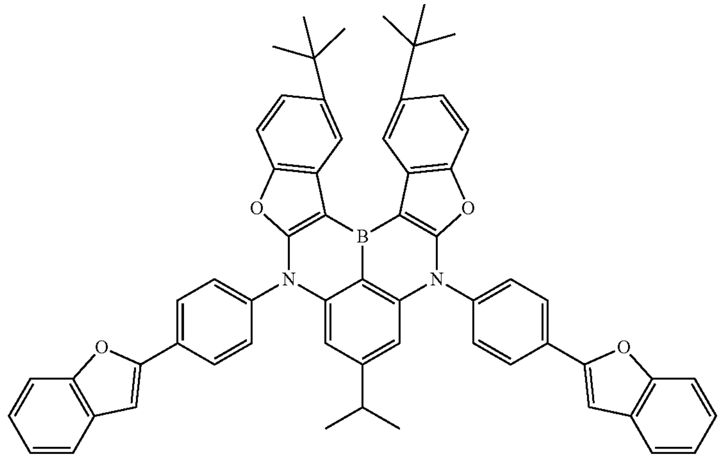

-continued
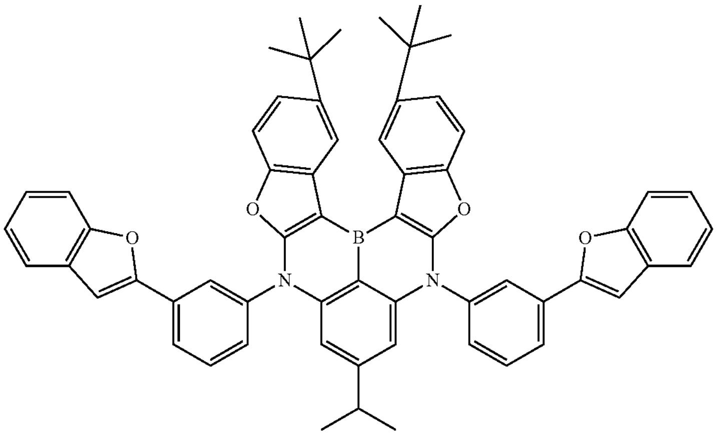
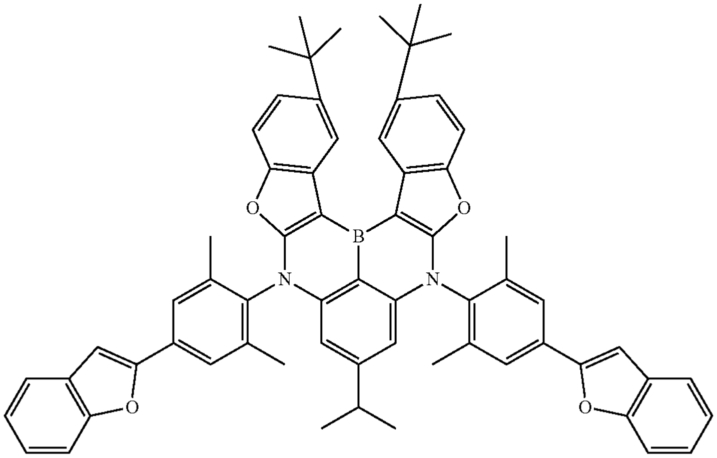
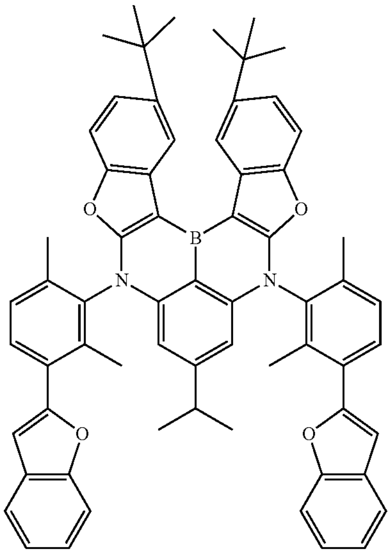
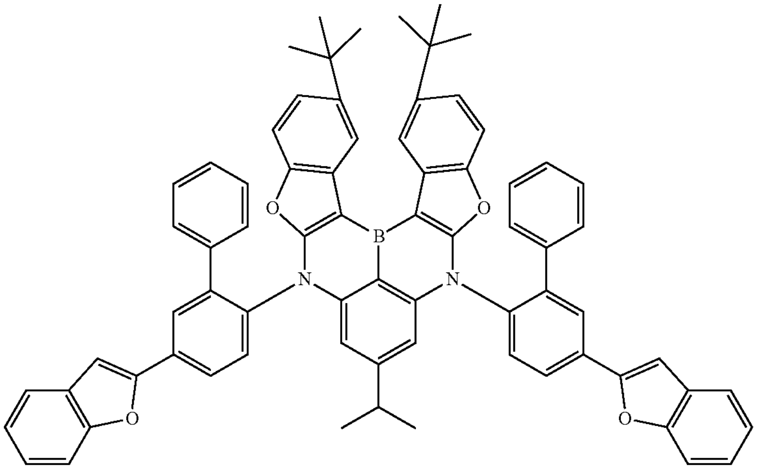

-continued
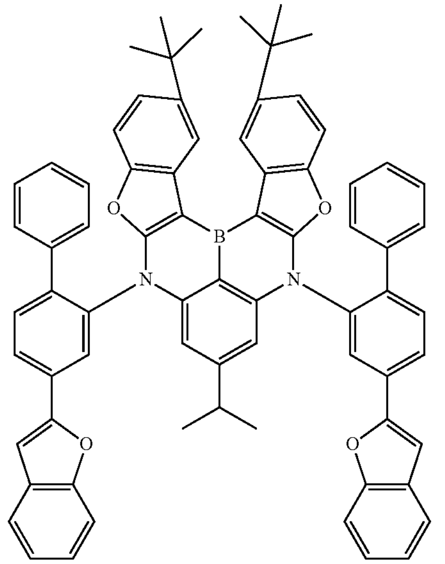
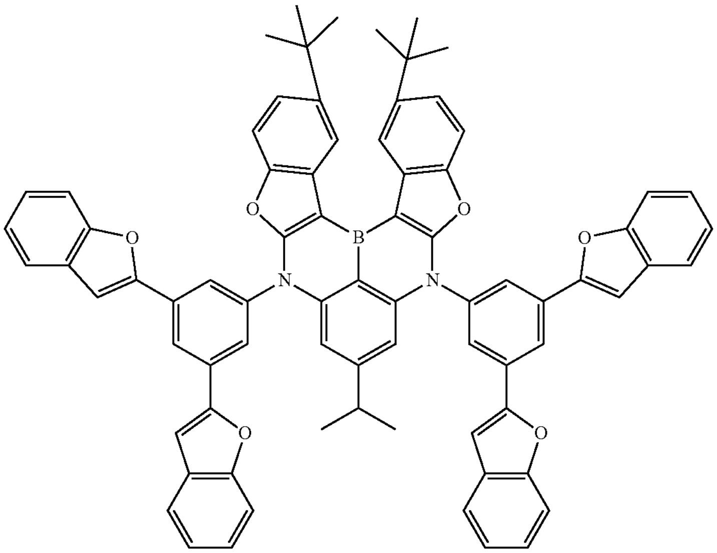
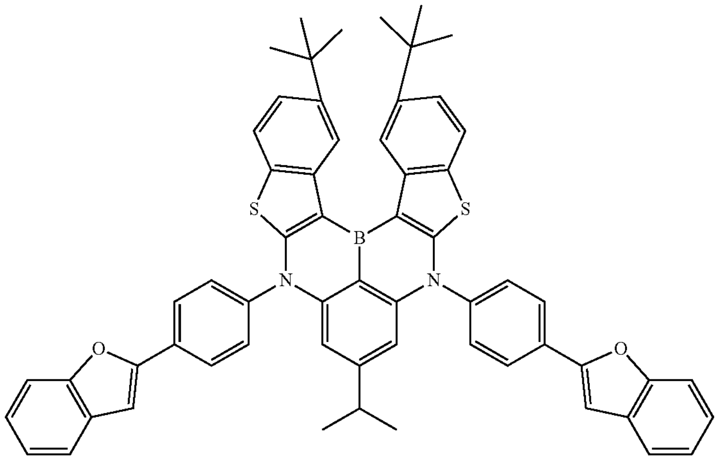
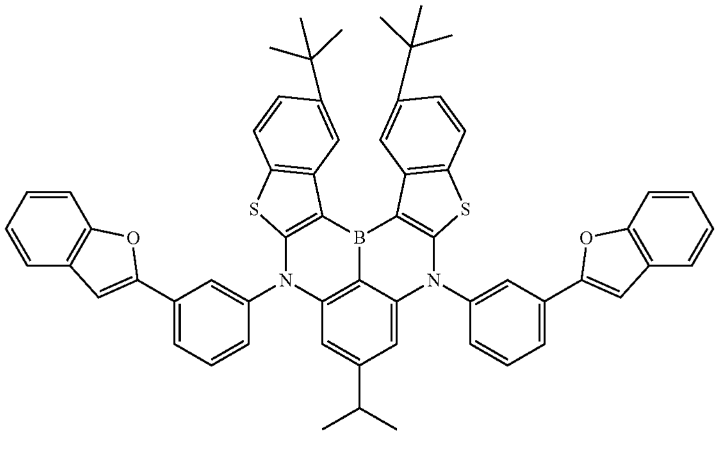

-continued
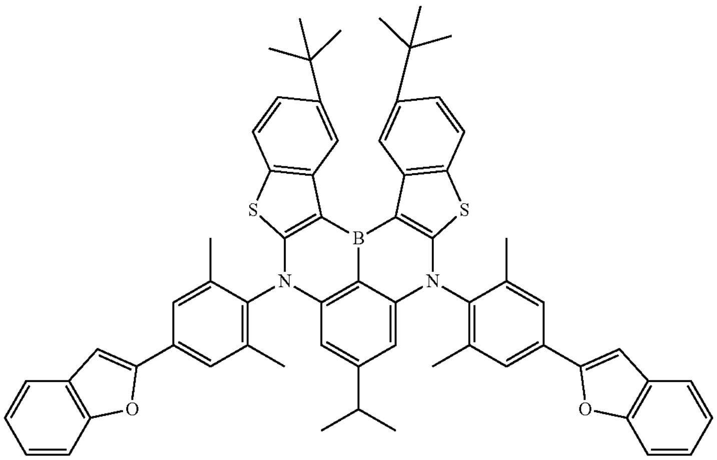
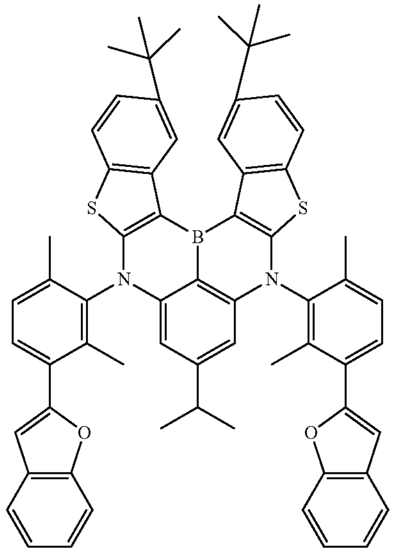
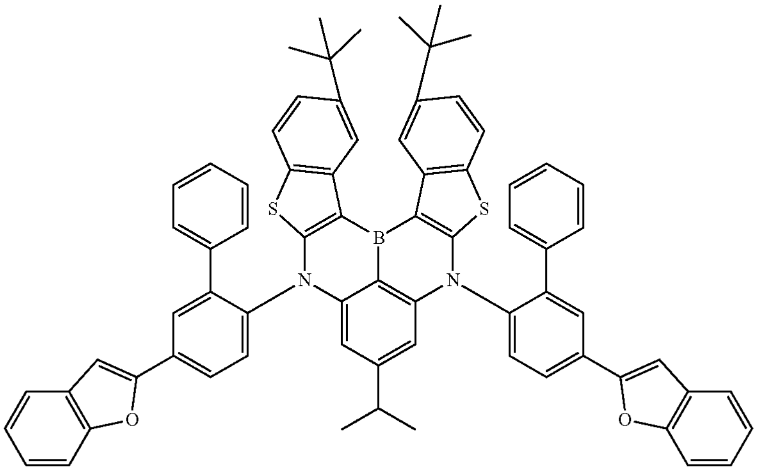
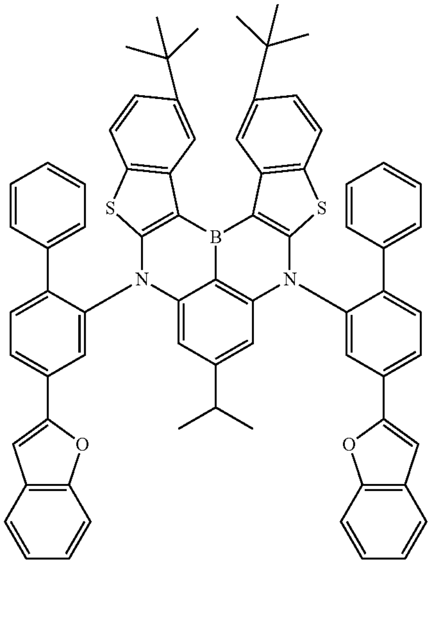
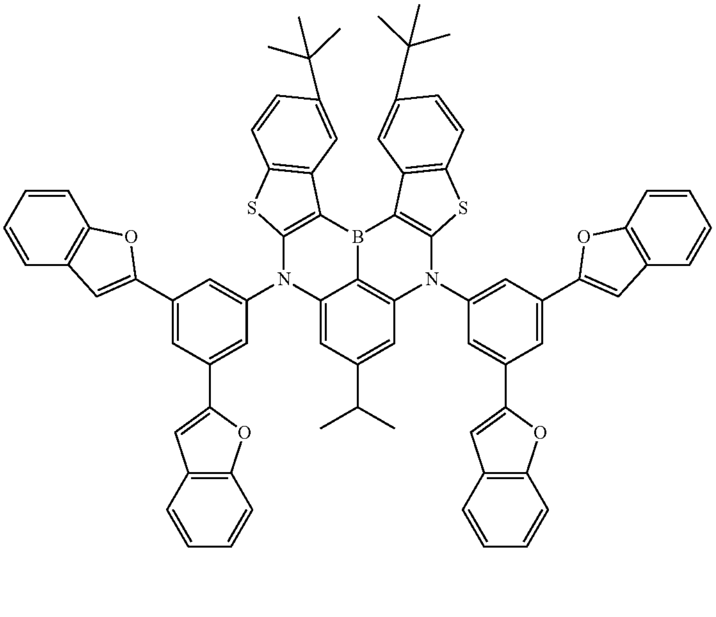

-continued
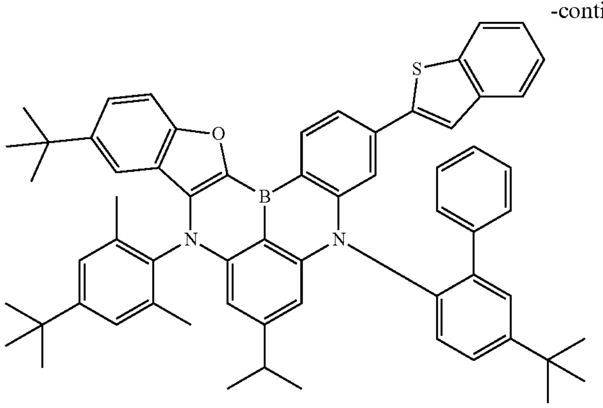
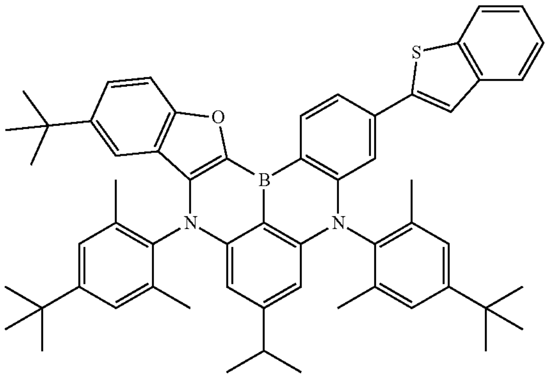
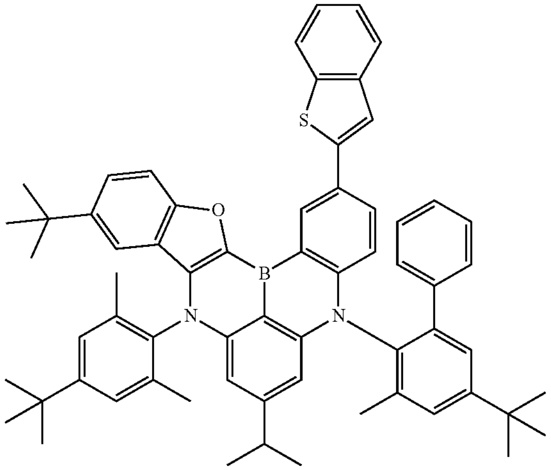
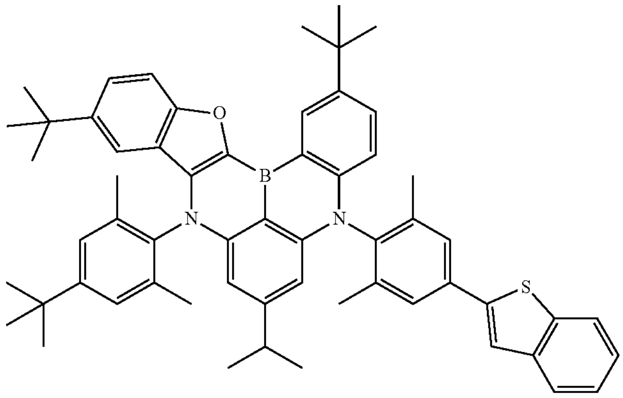
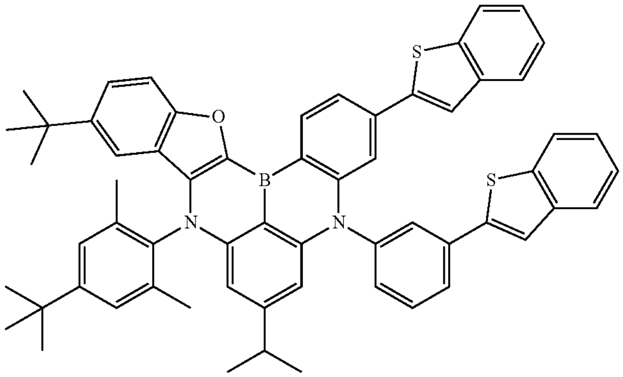
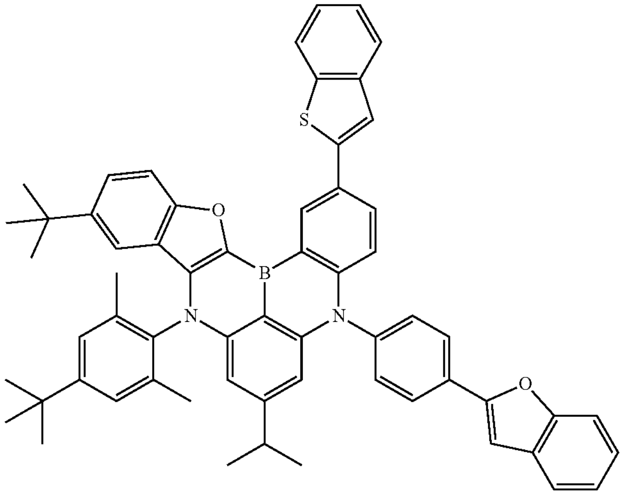

-continued
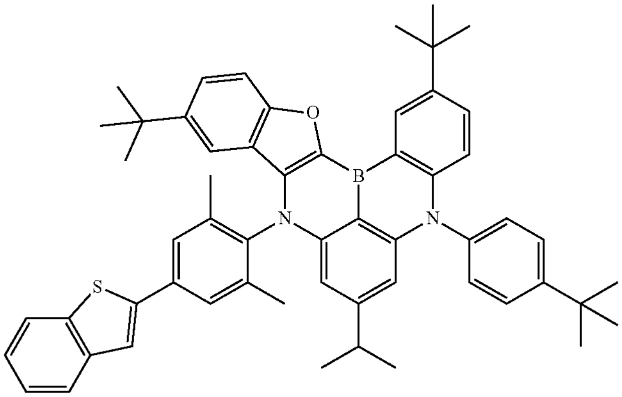
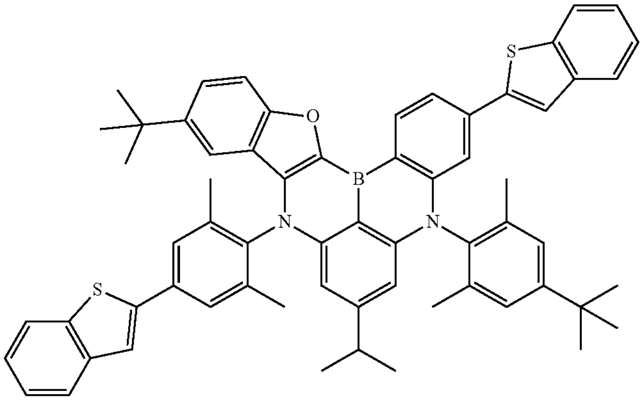
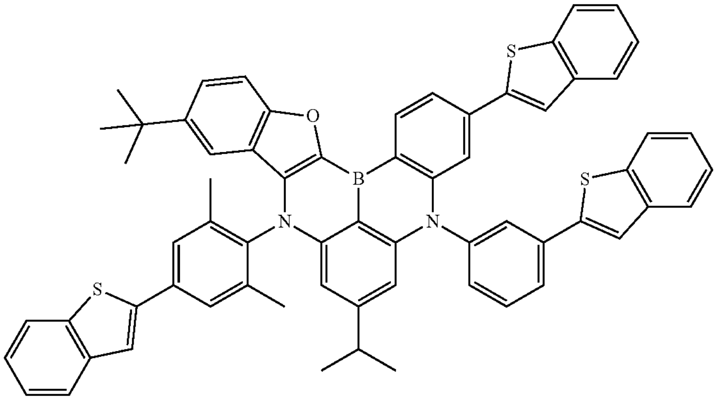
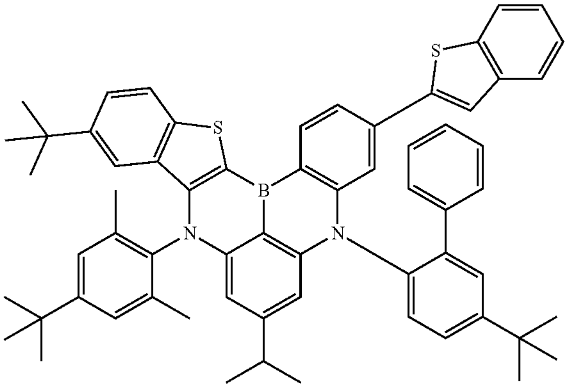
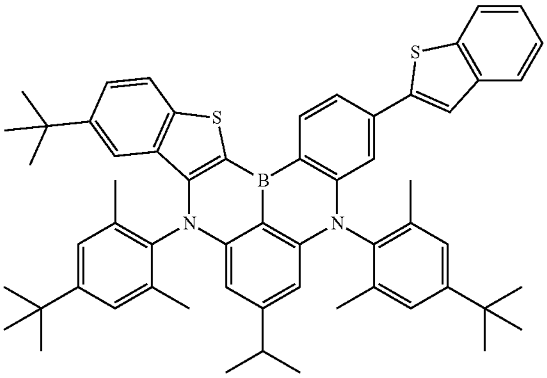

-continued
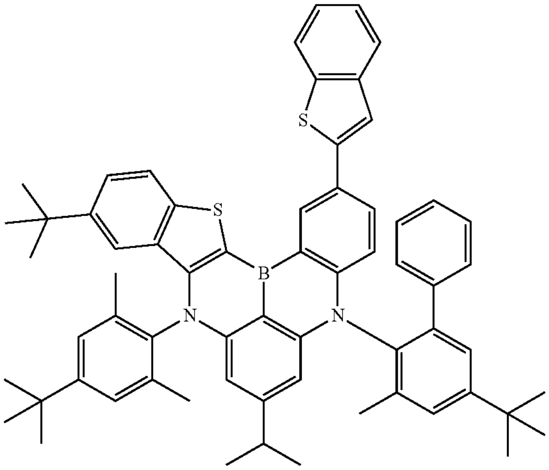
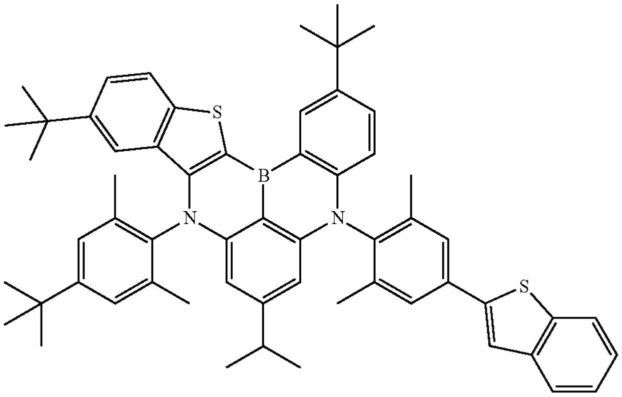
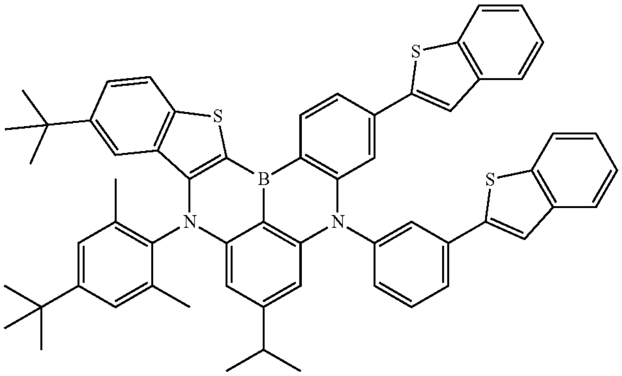
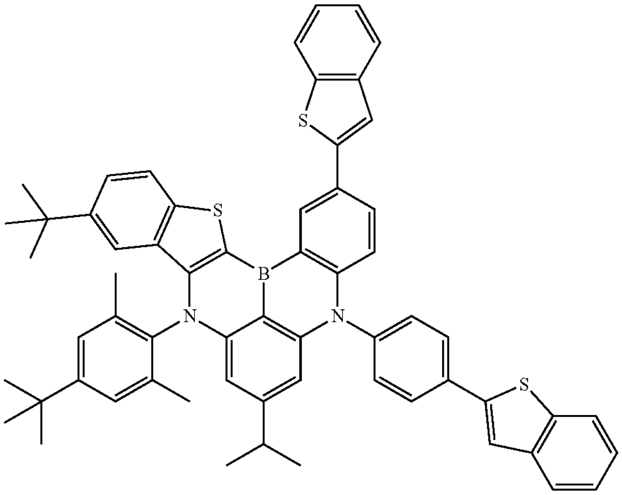
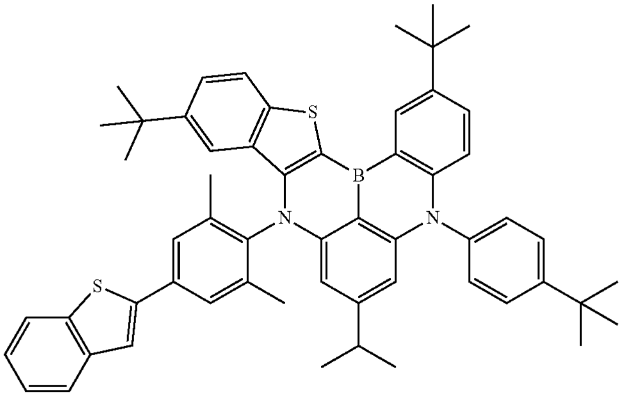

-continued
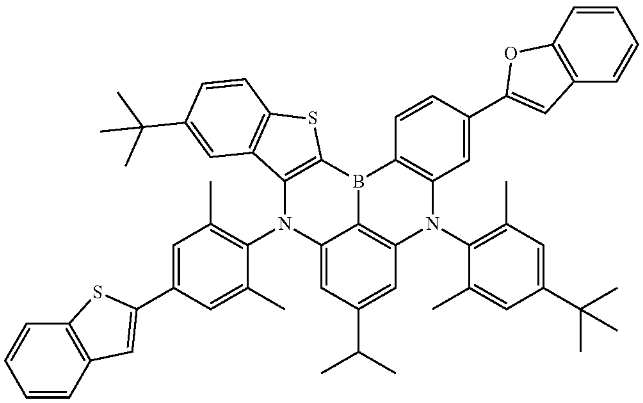
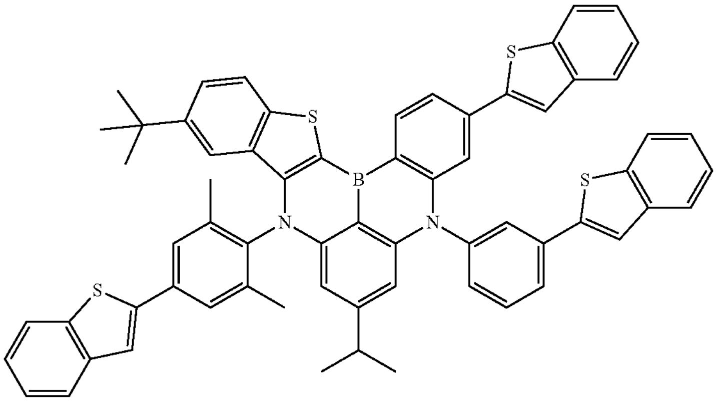
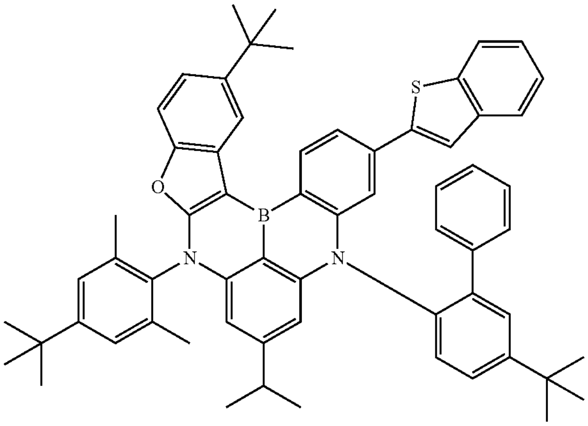
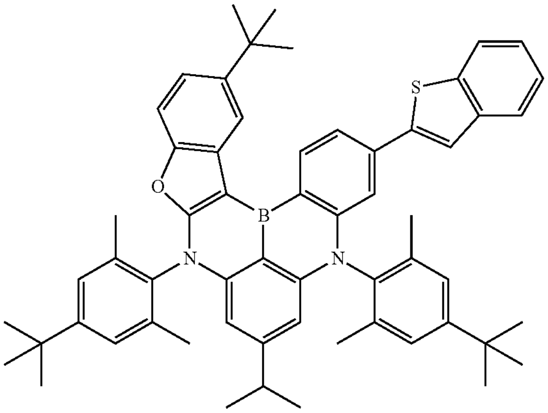

-continued
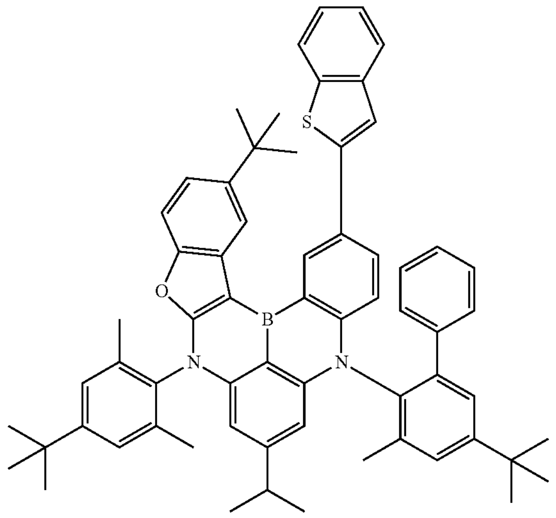
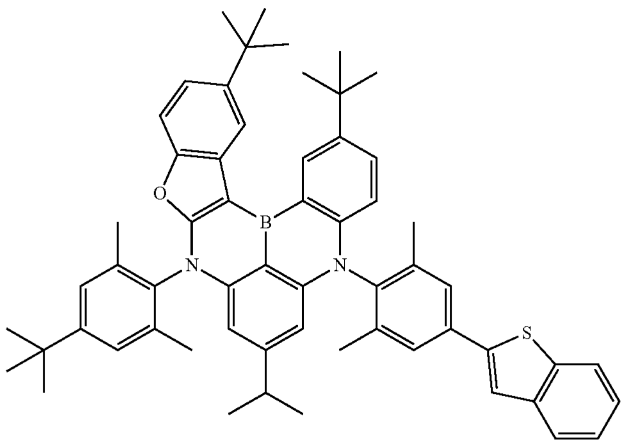
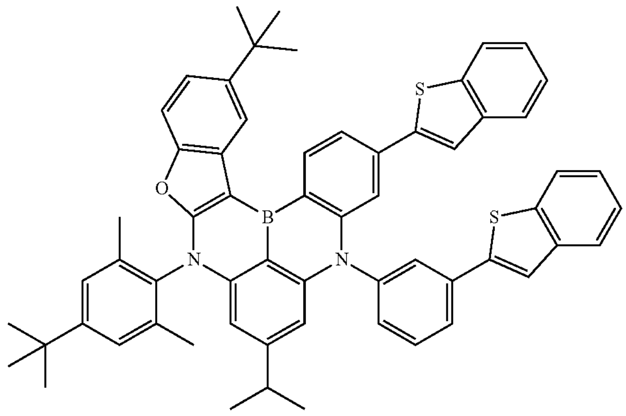
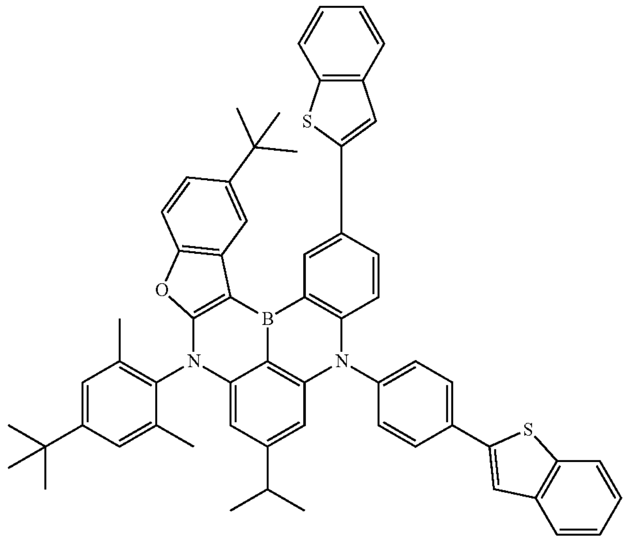

-continued
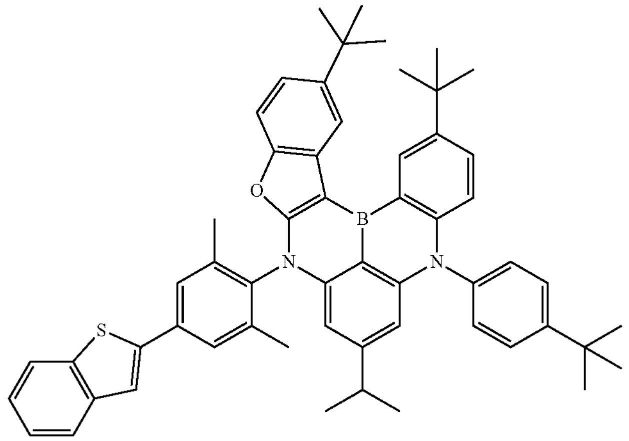
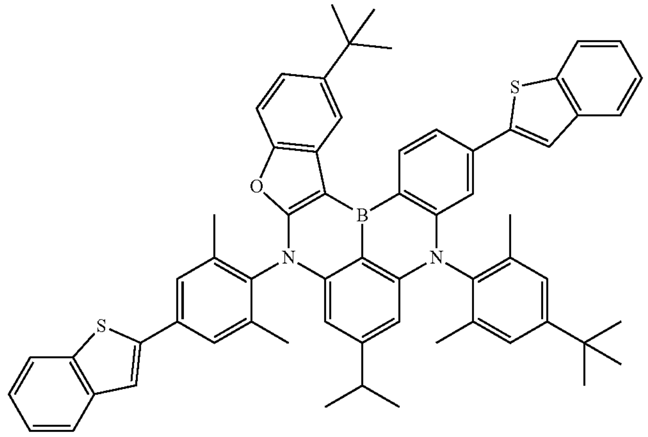
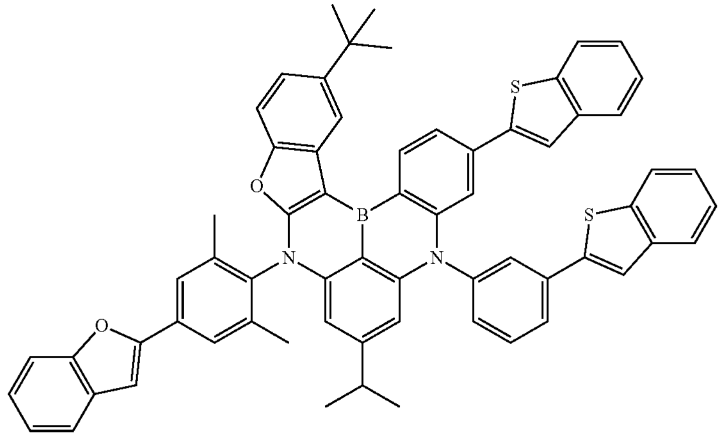

-continued
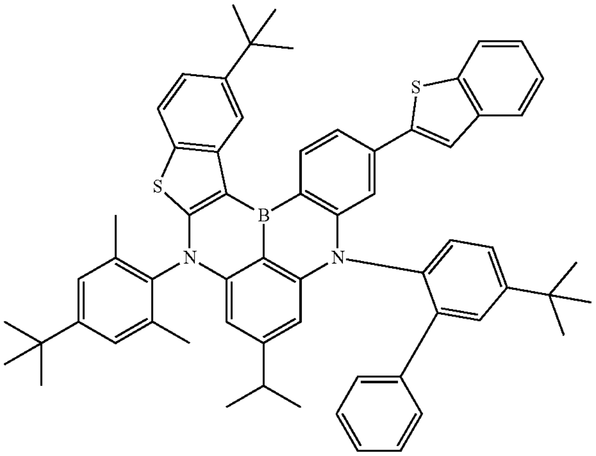
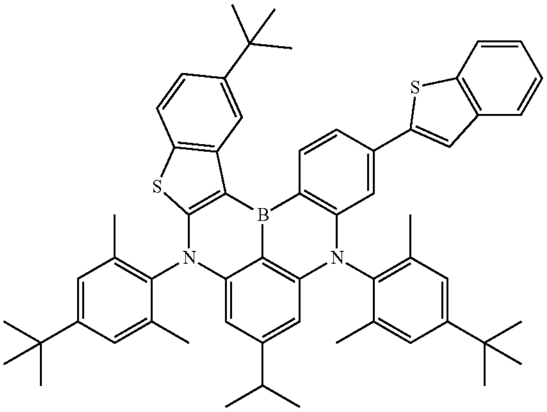
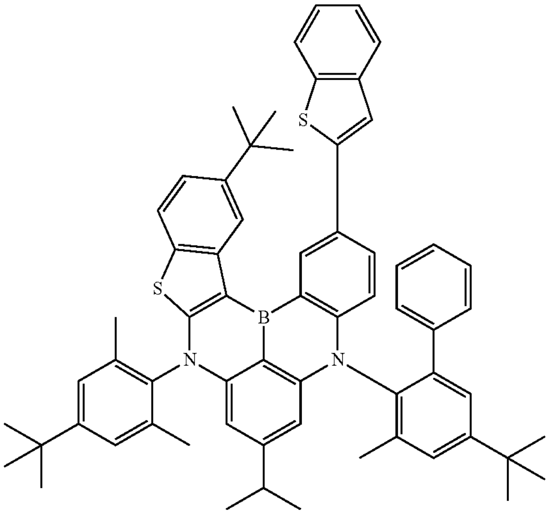
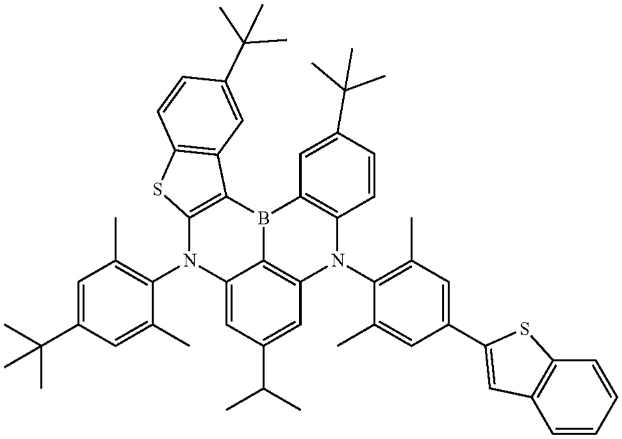
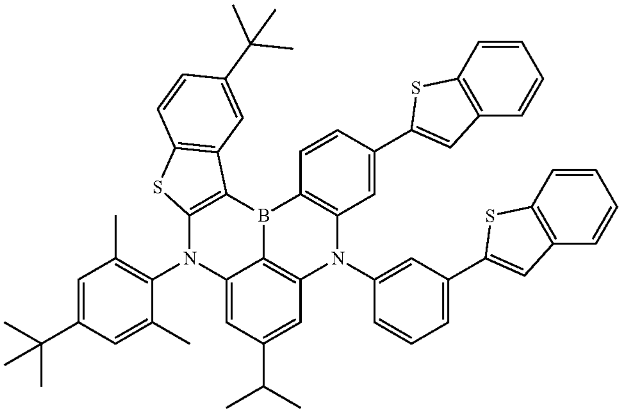

-continued
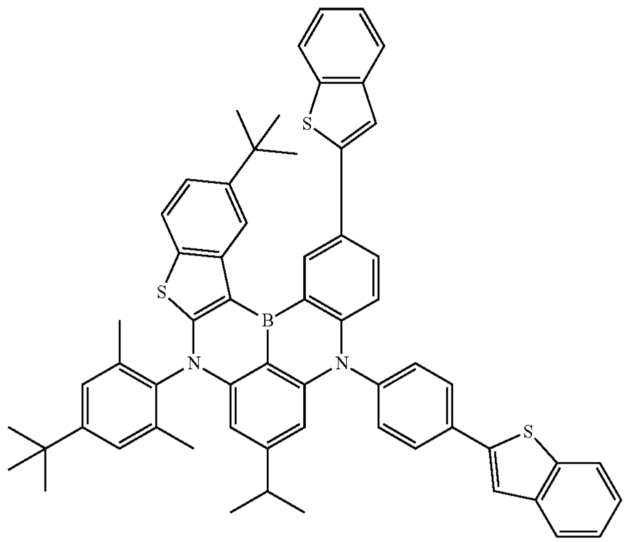
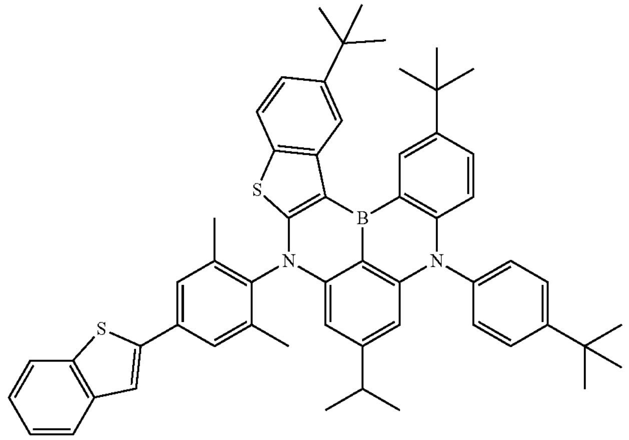
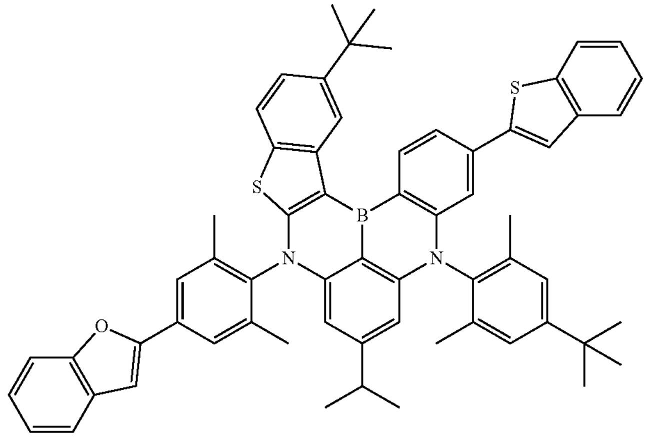

-continued
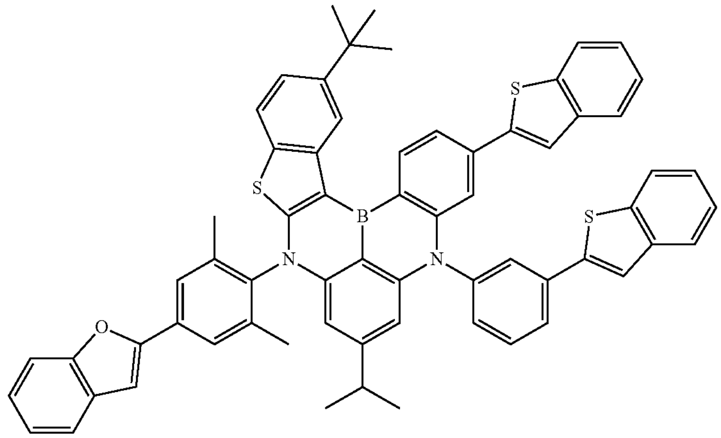
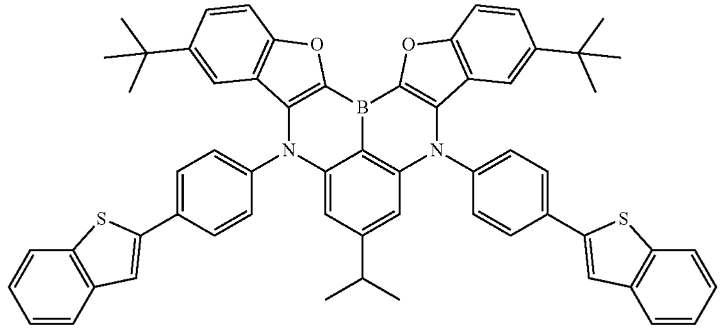
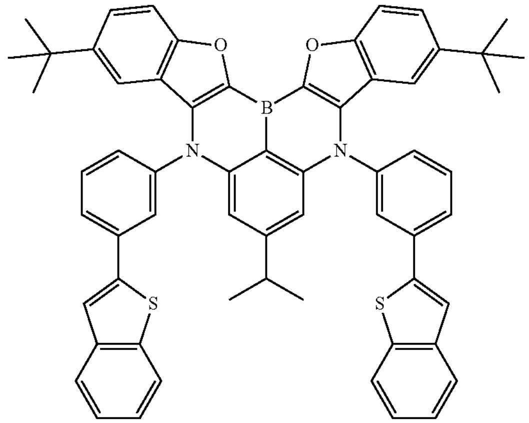
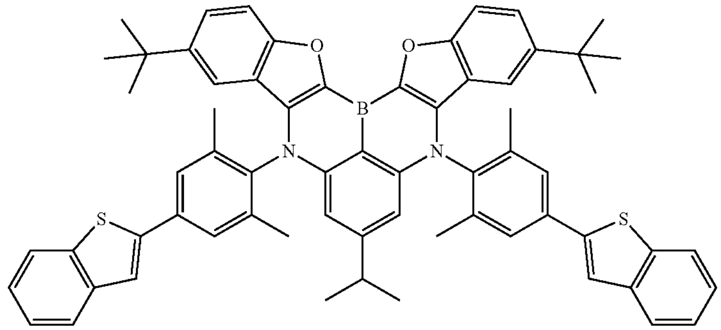

-continued
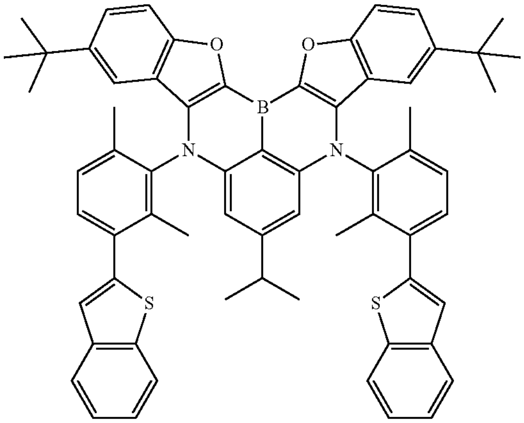
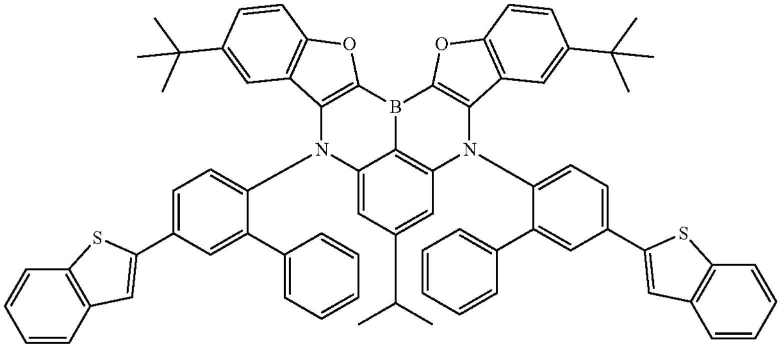
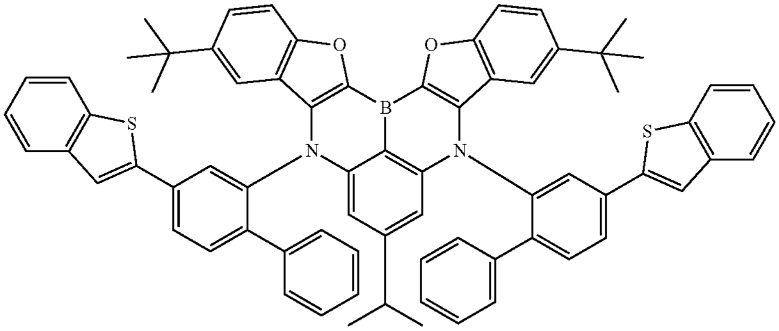
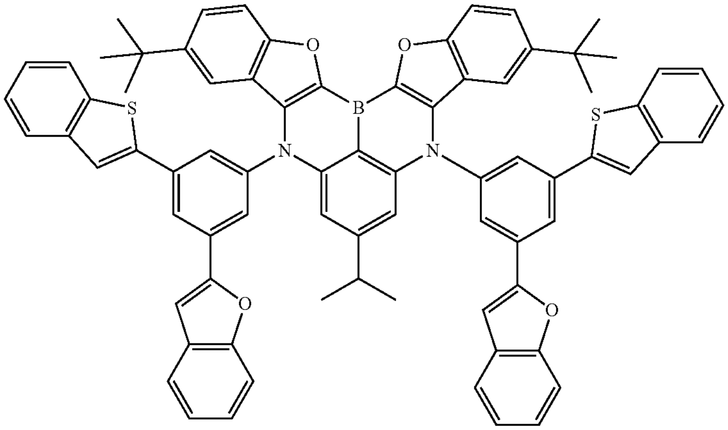

-continued
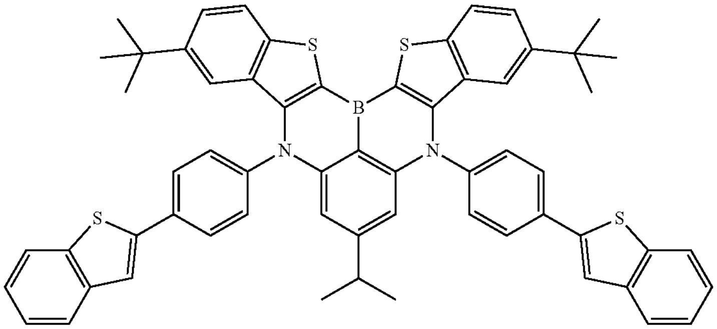
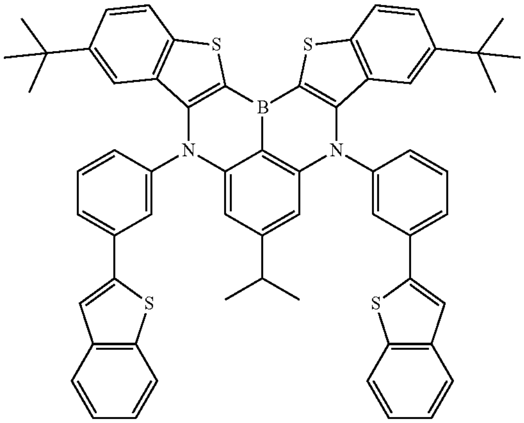
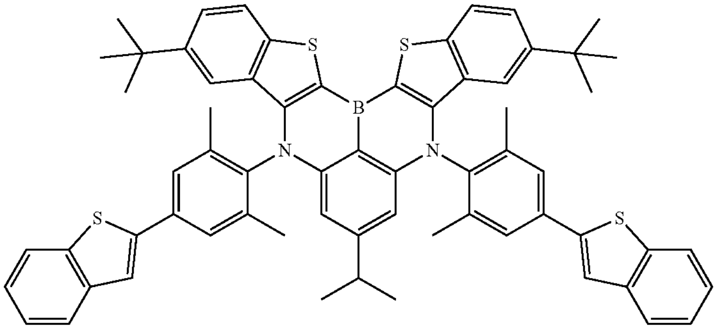
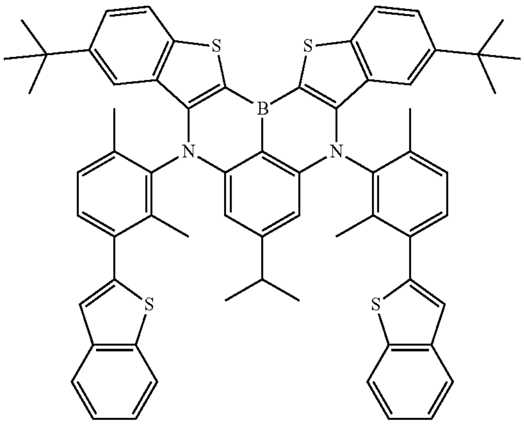

-continued
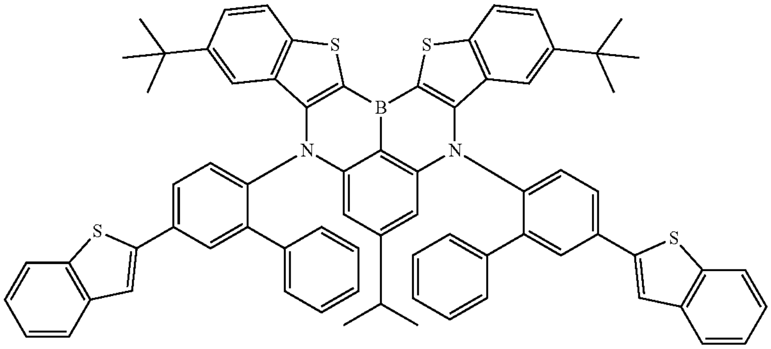
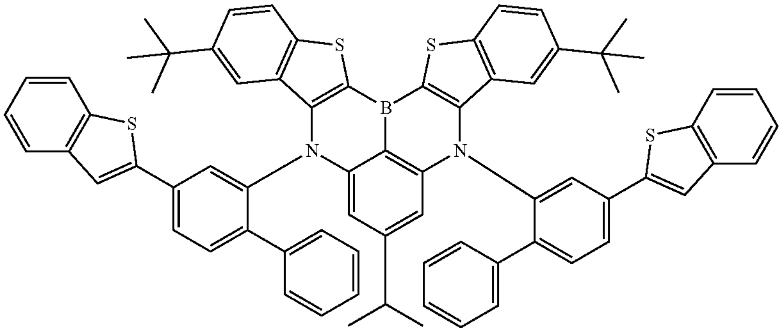
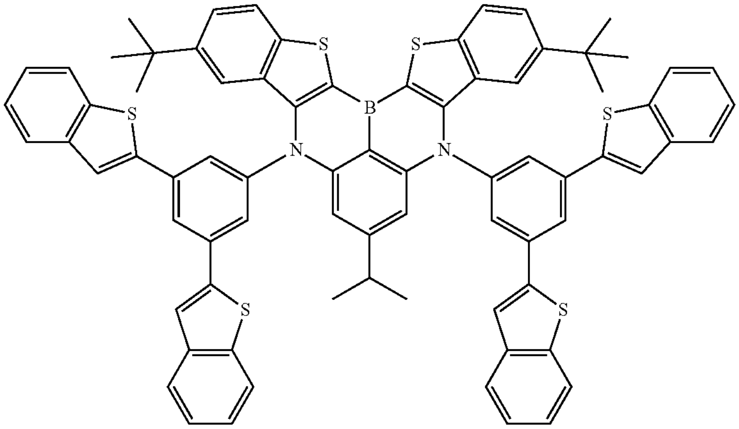
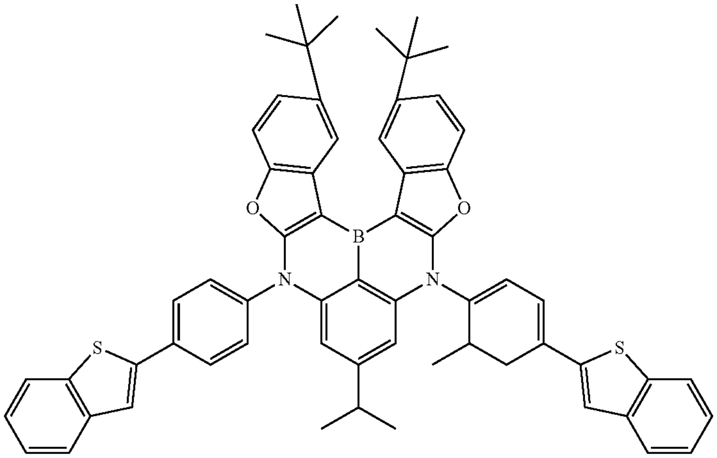

-continued
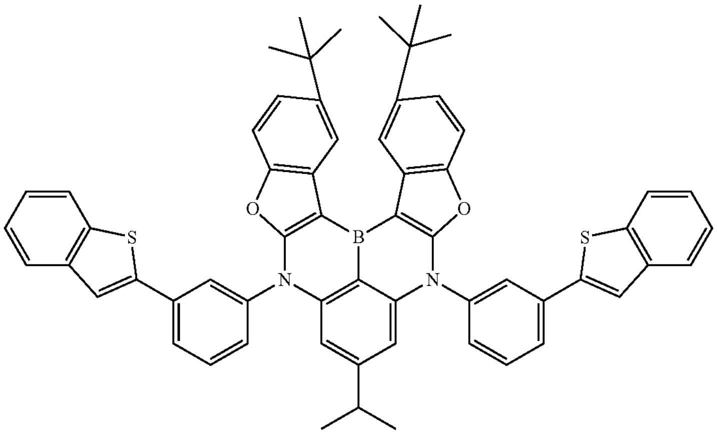
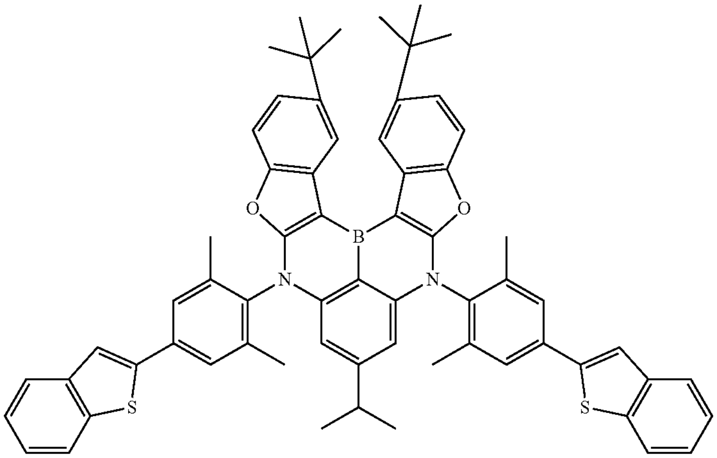
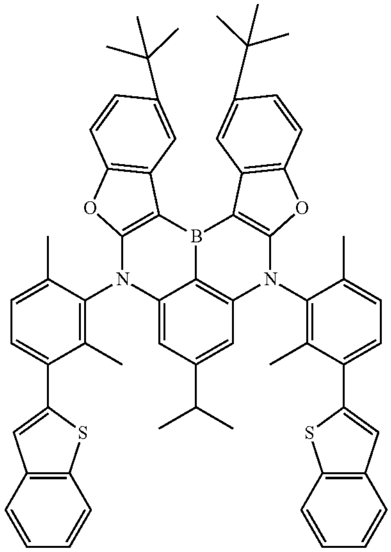
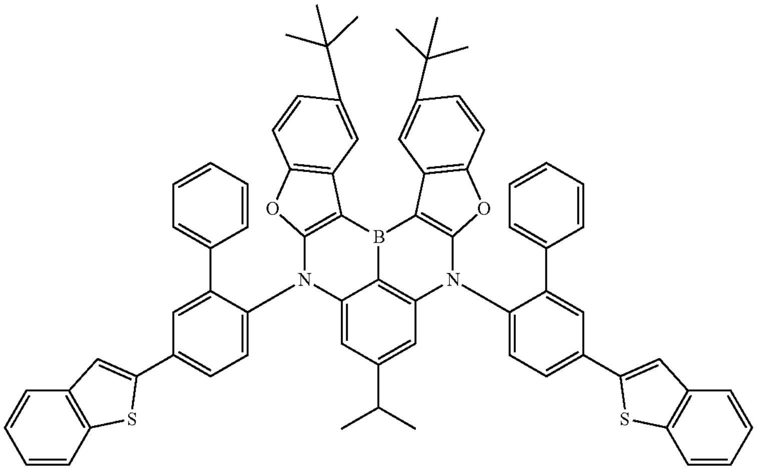

-continued
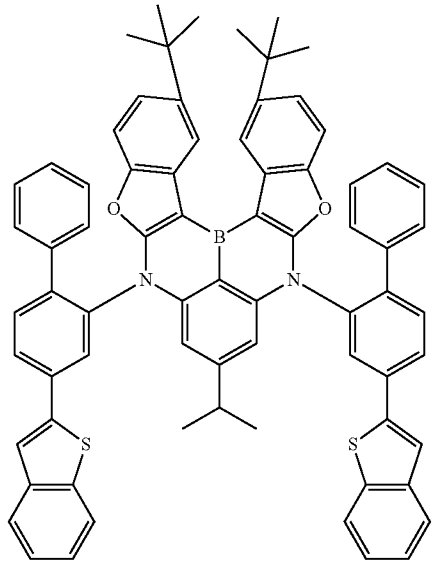
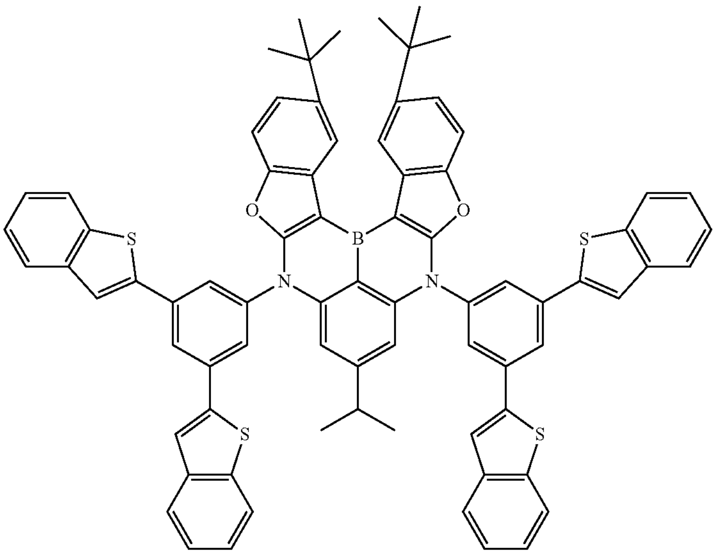
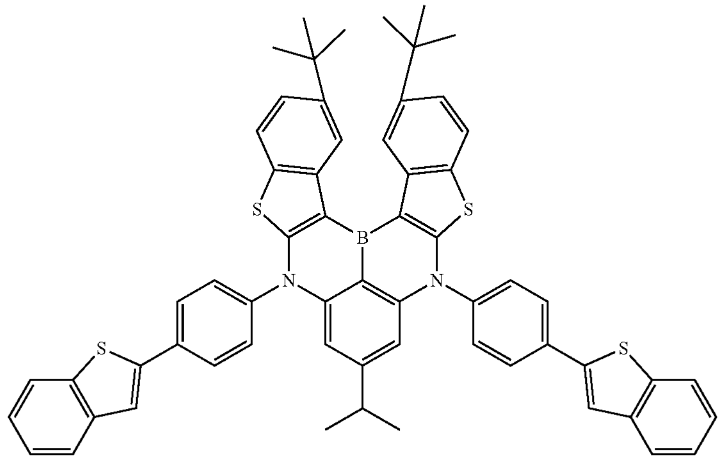
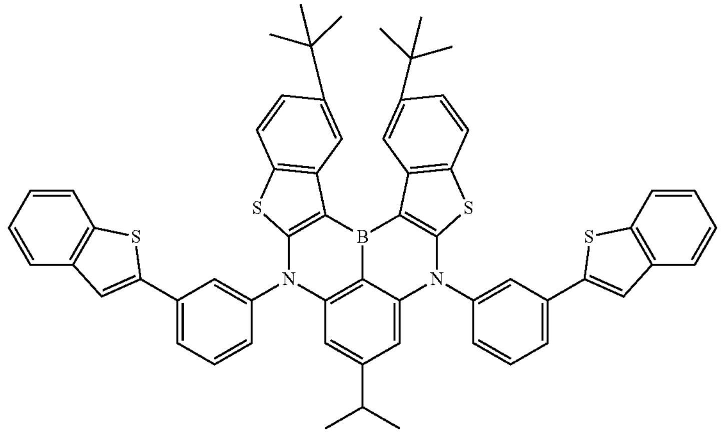

-continued
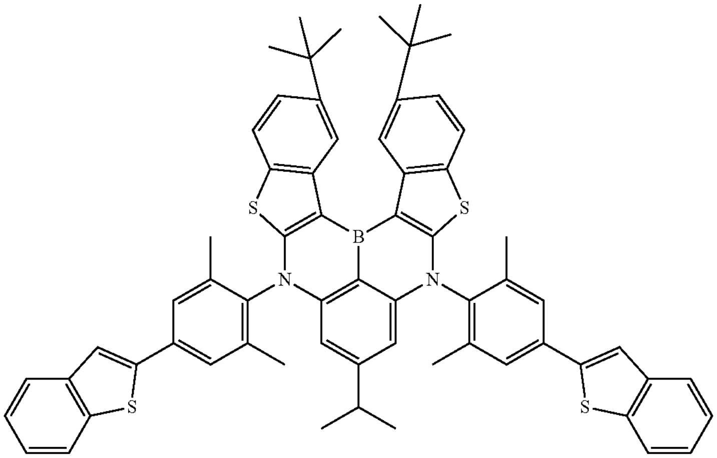
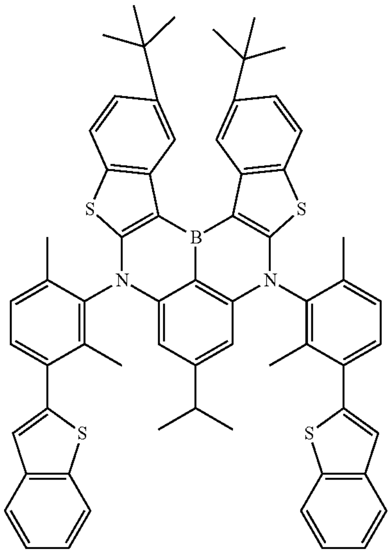
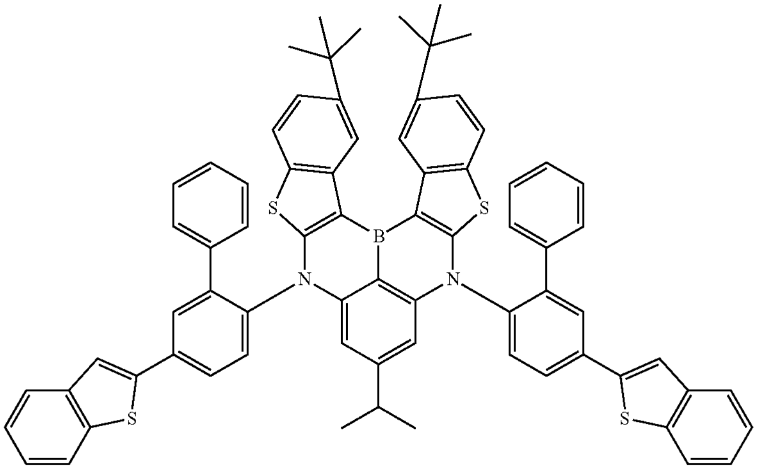
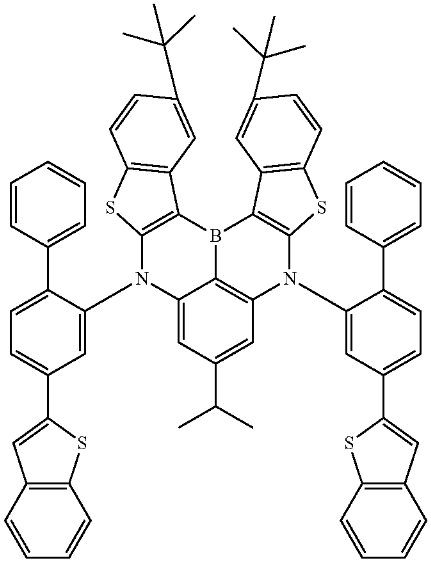
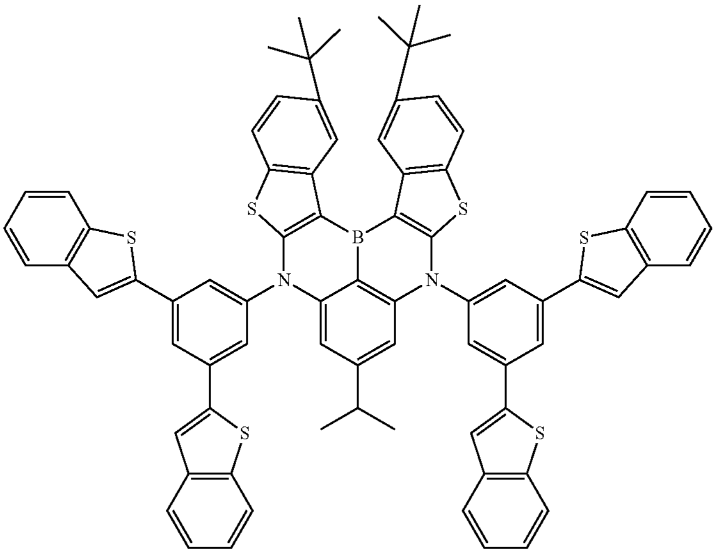

-continued
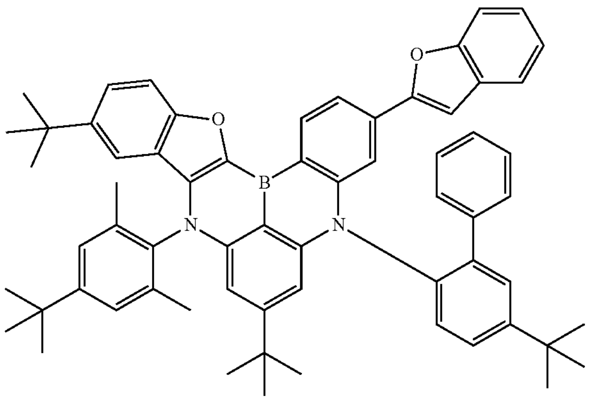
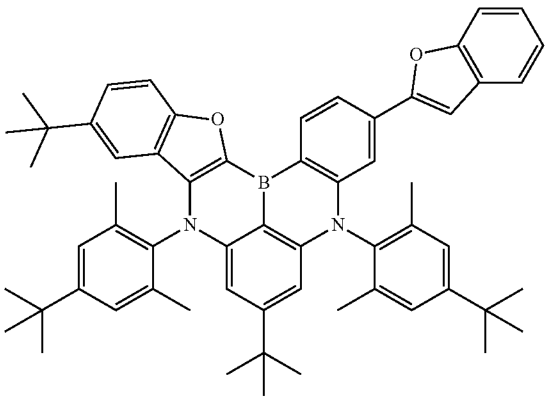
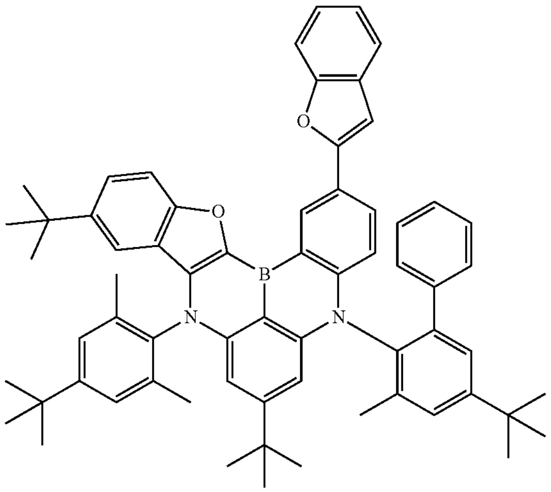
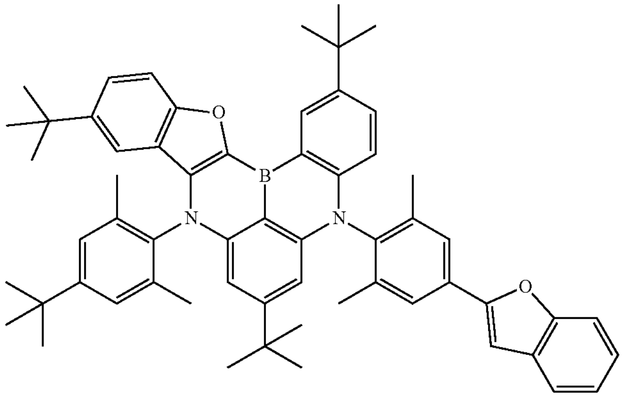
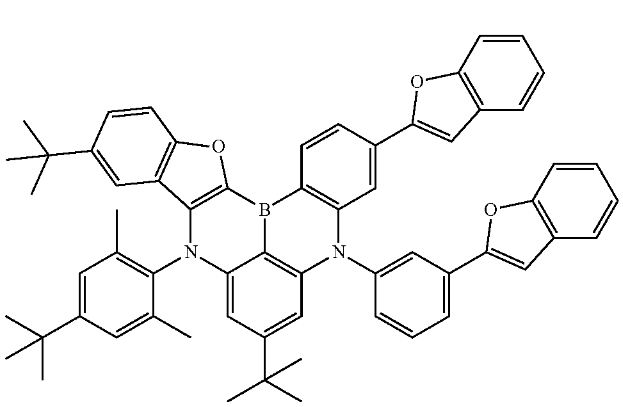

-continued
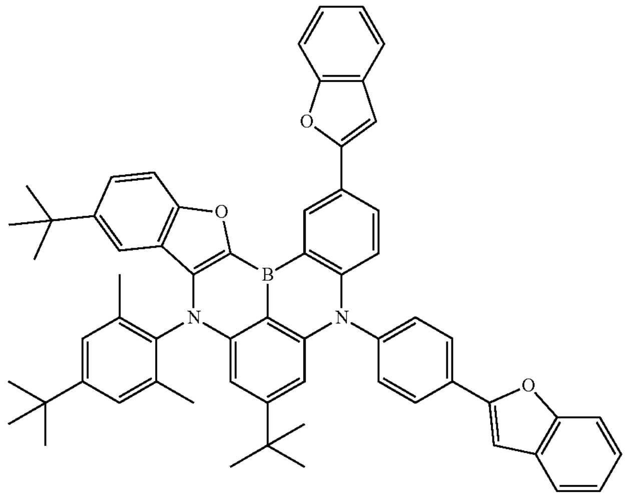
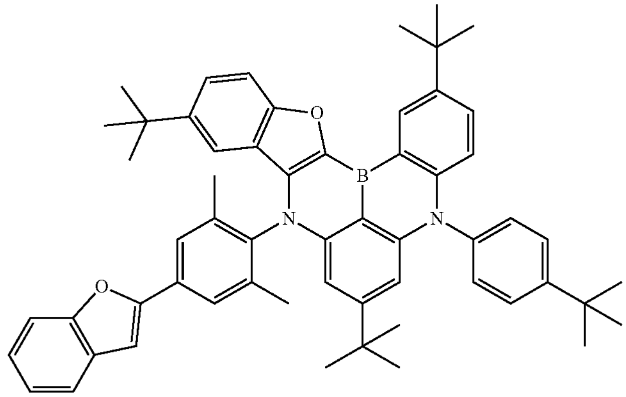
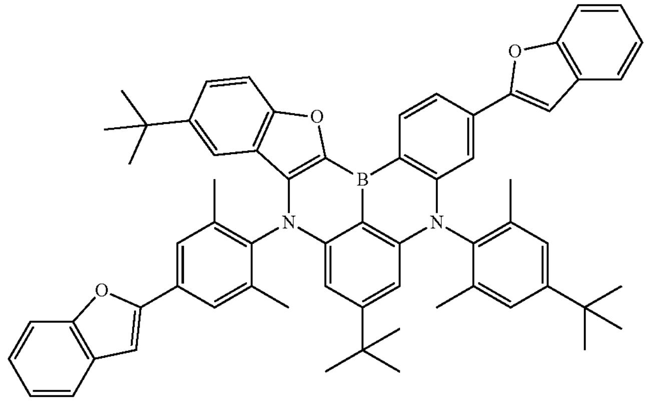
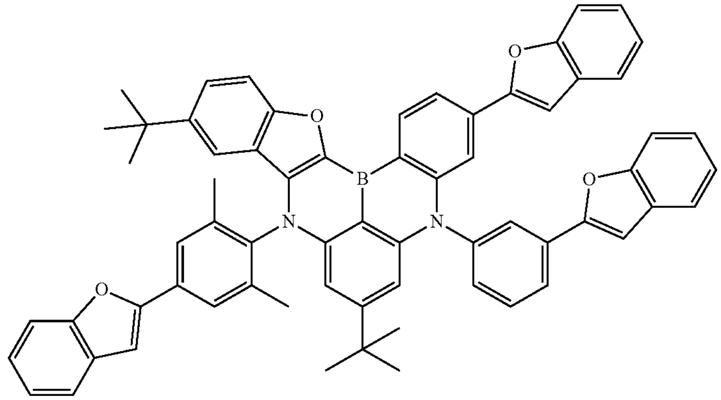

-continued
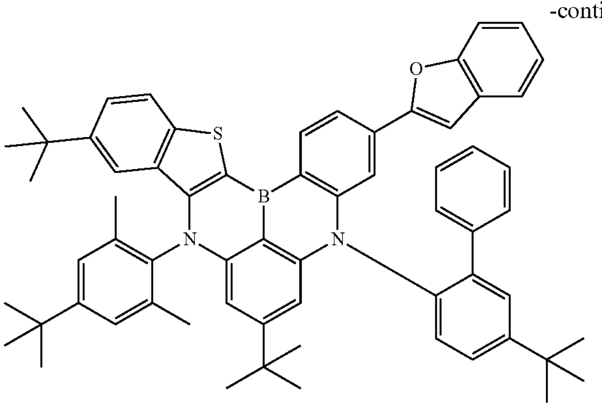
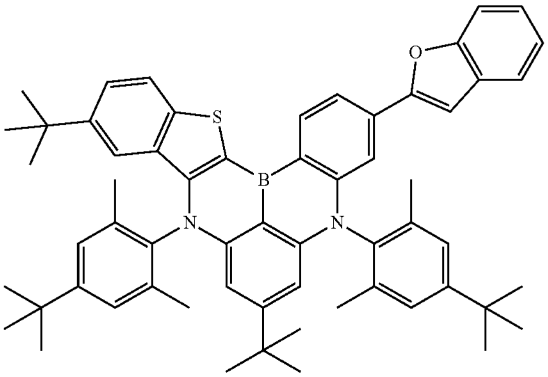
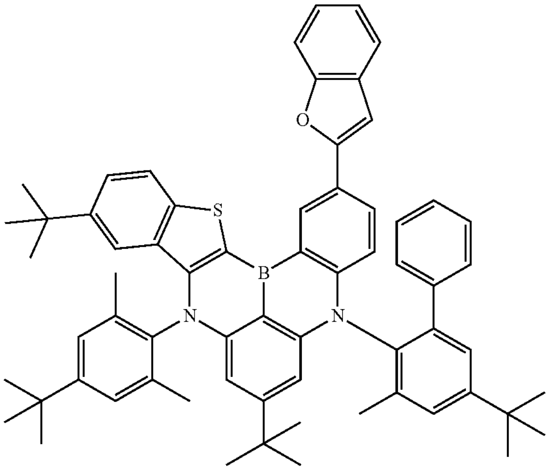
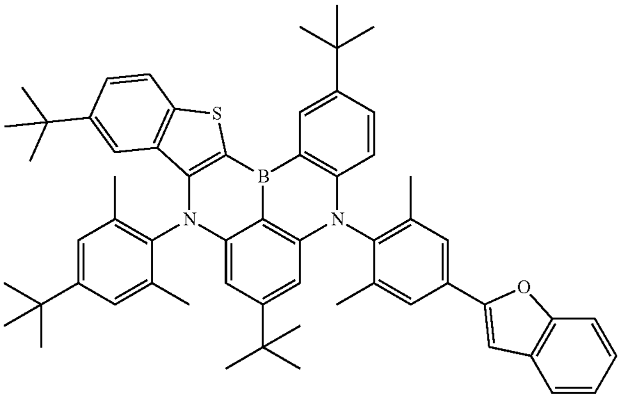
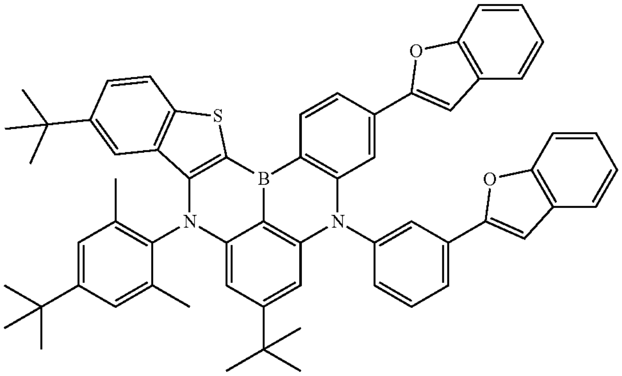
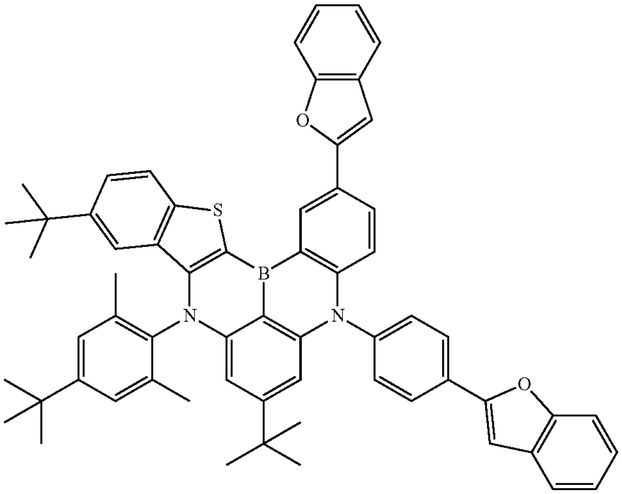

-continued
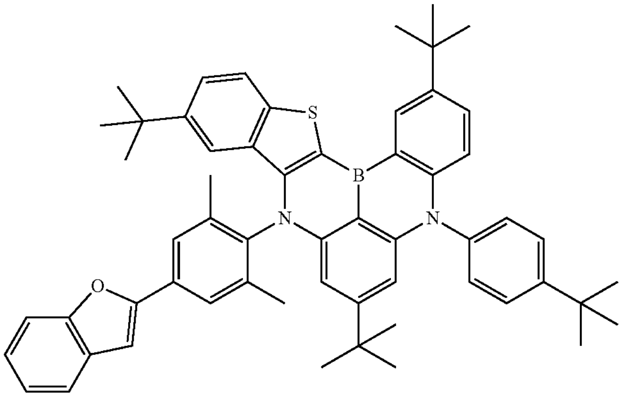
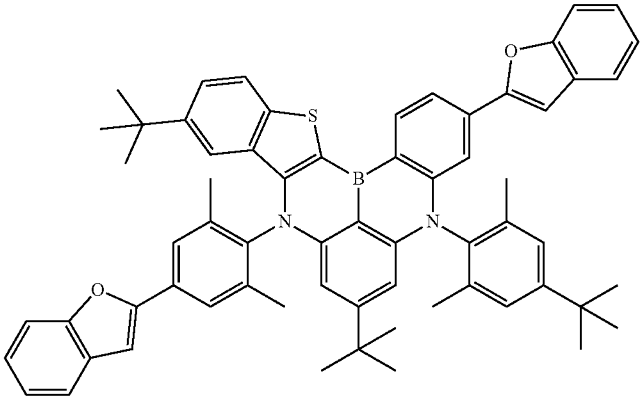
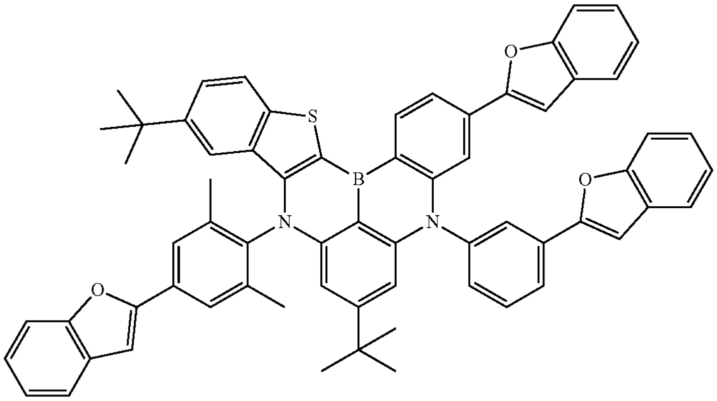
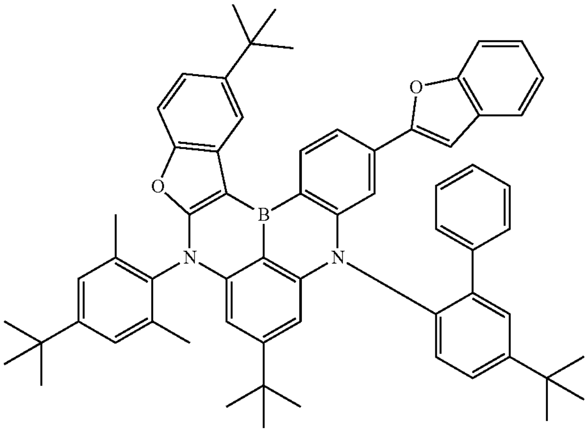
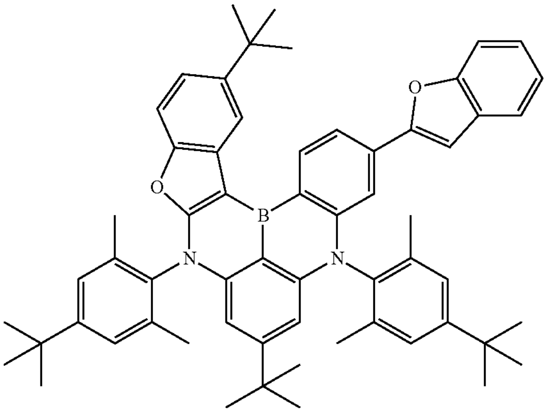

-continued
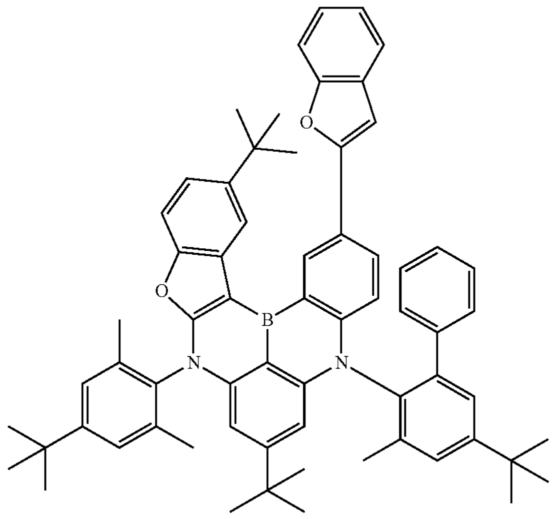
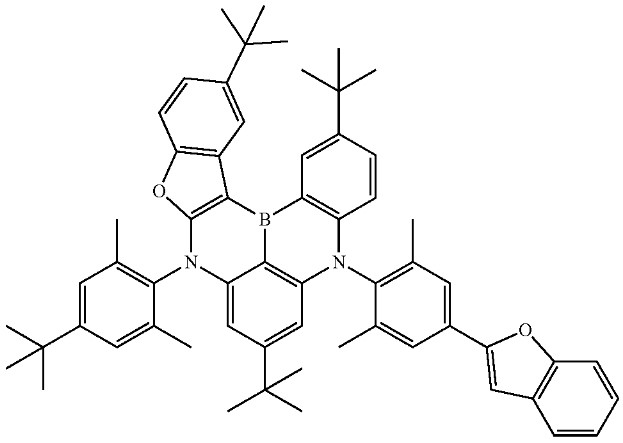
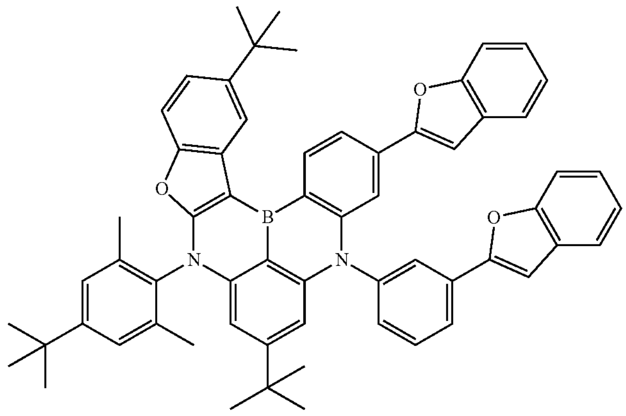
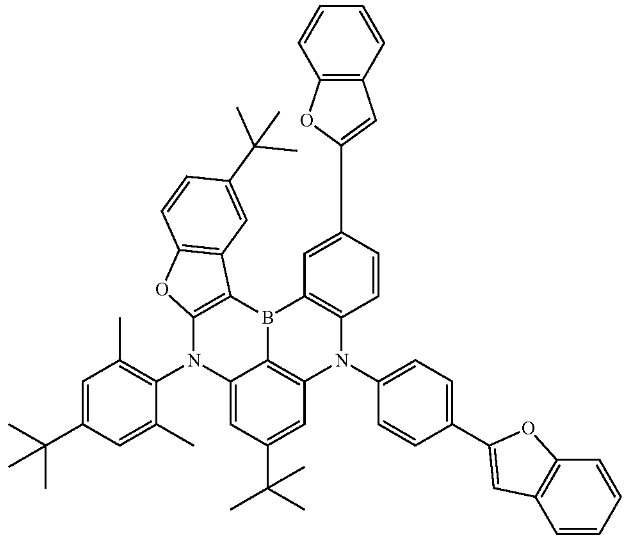

-continued
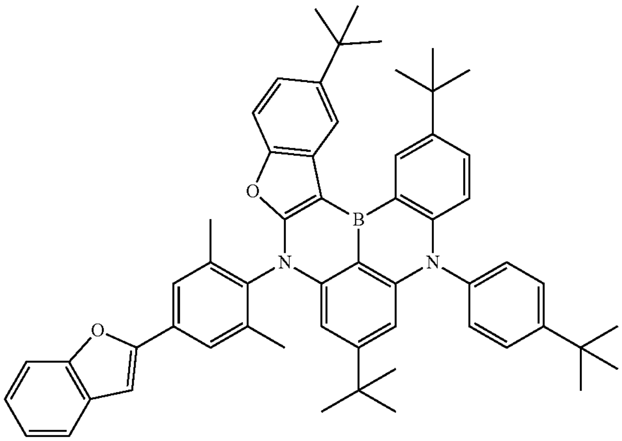
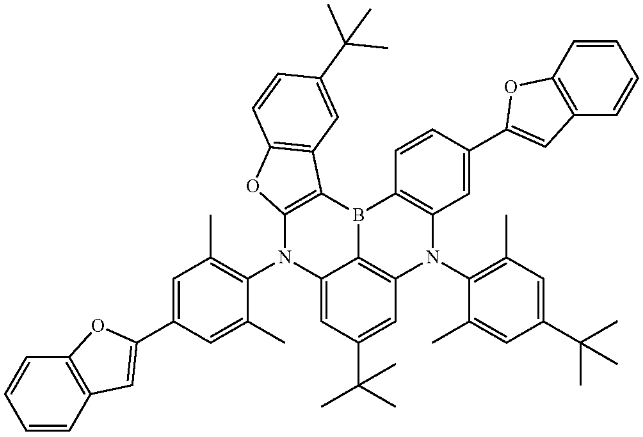
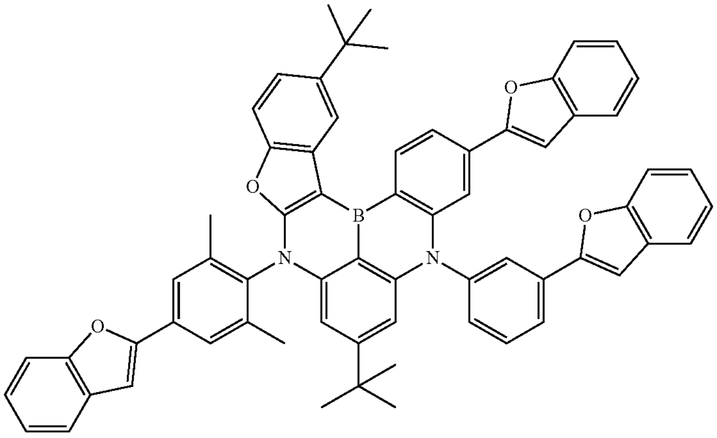

-continued
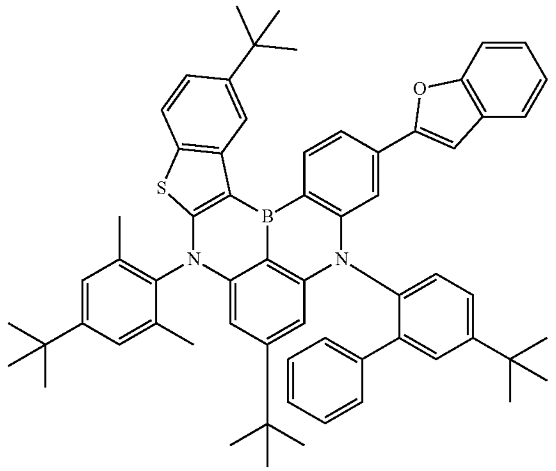
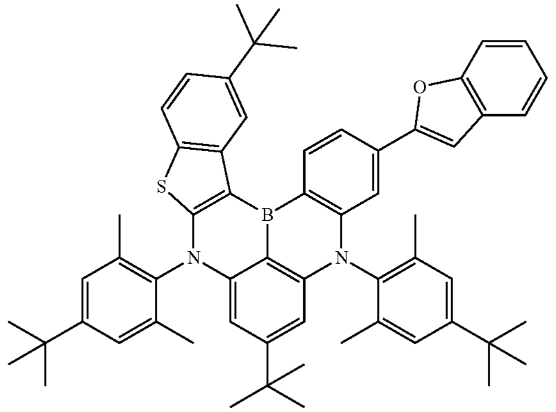
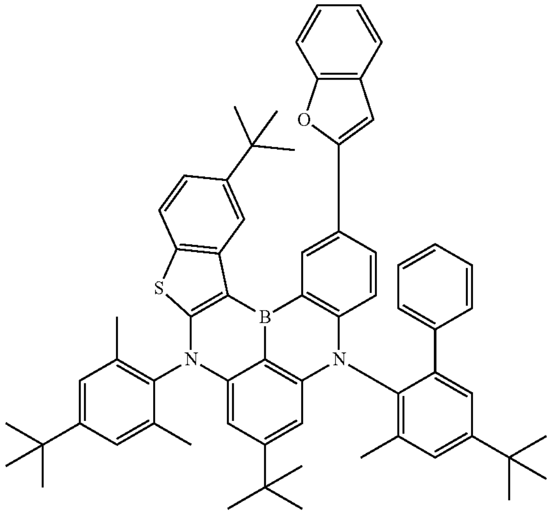
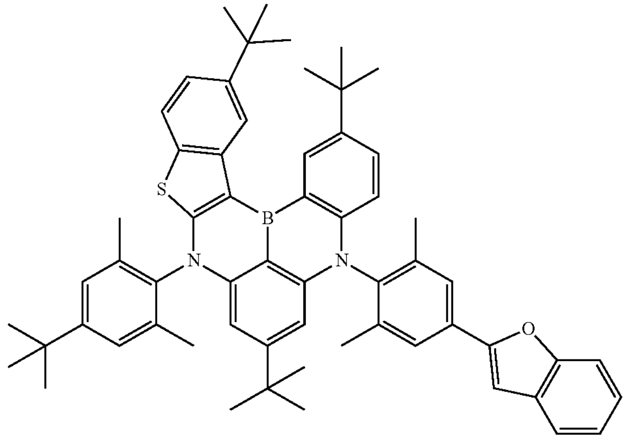

-continued
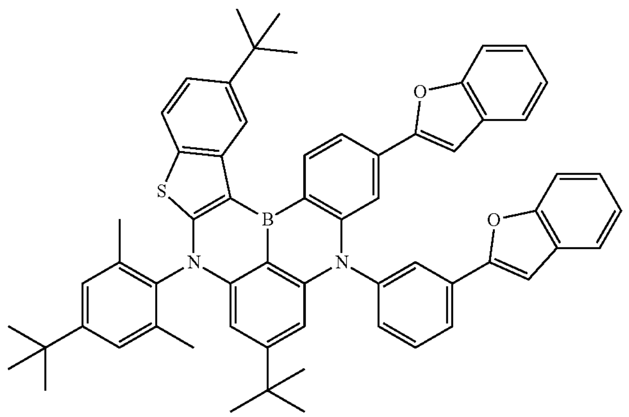
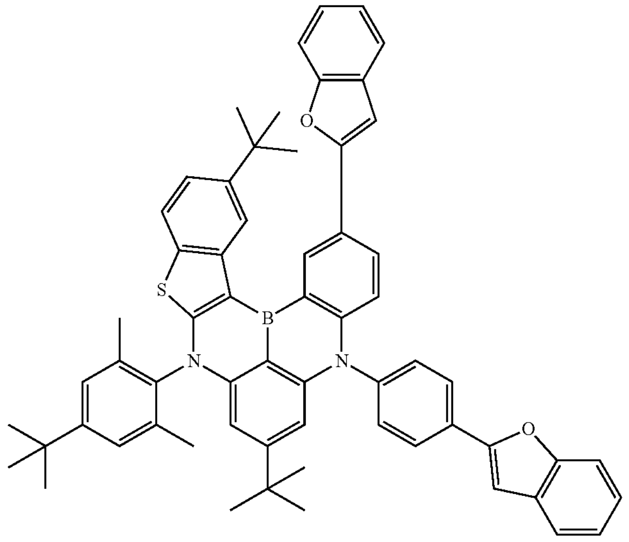
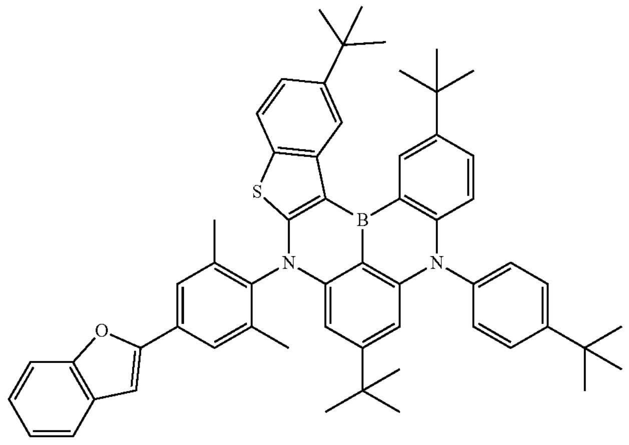

-continued
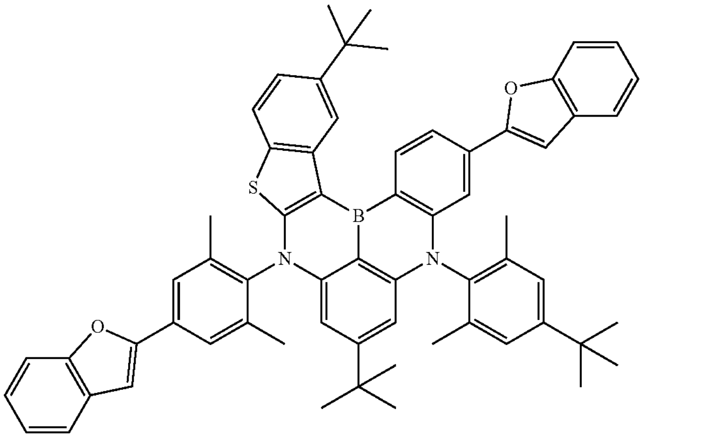
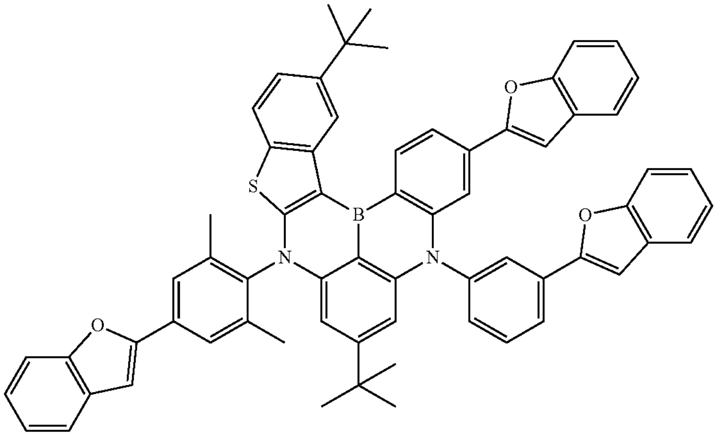
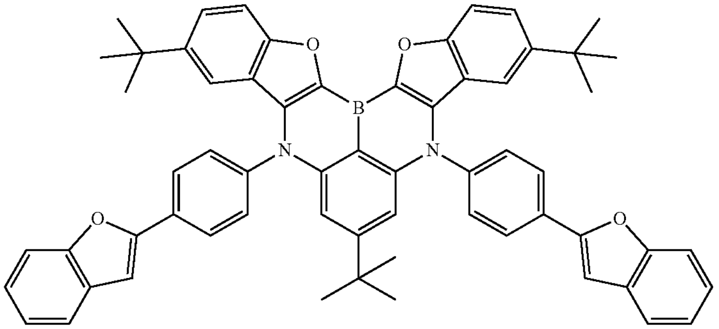
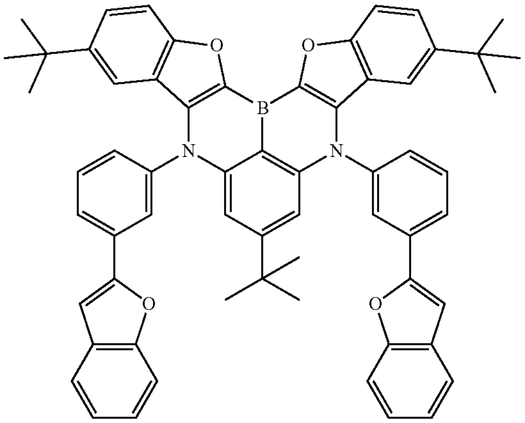

-continued
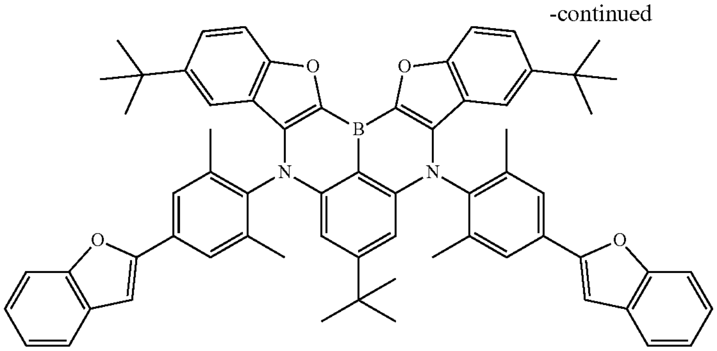
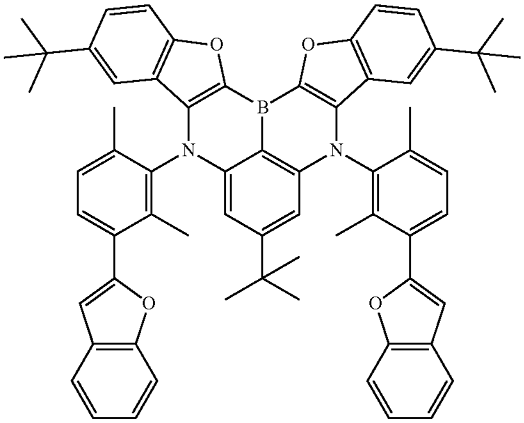
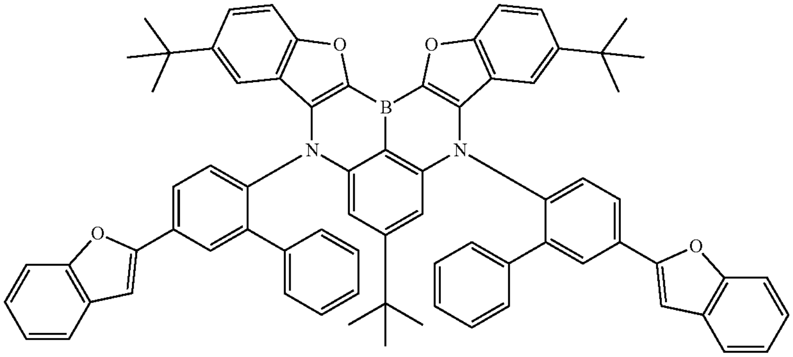
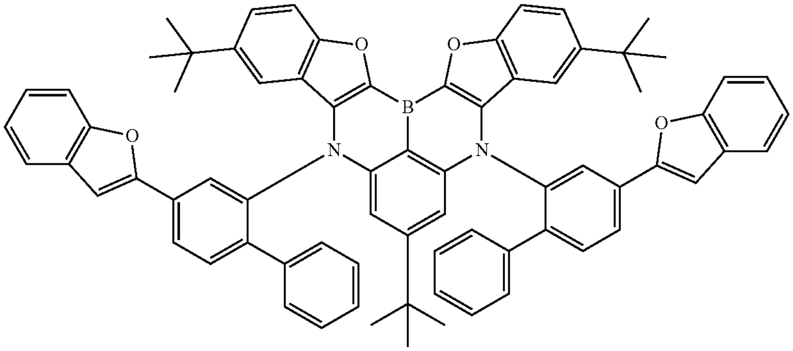

-continued
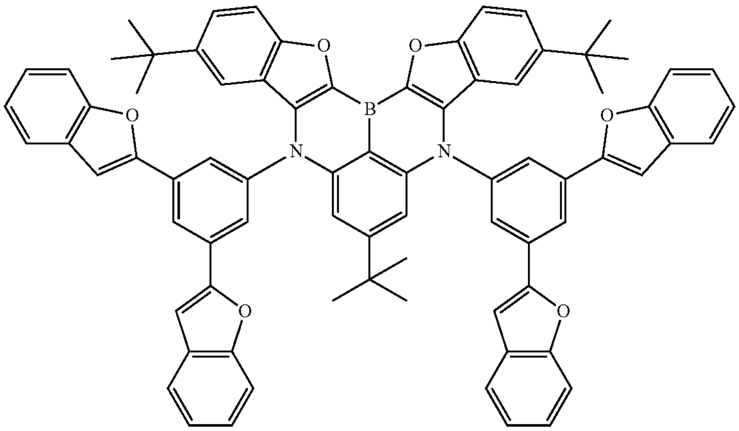
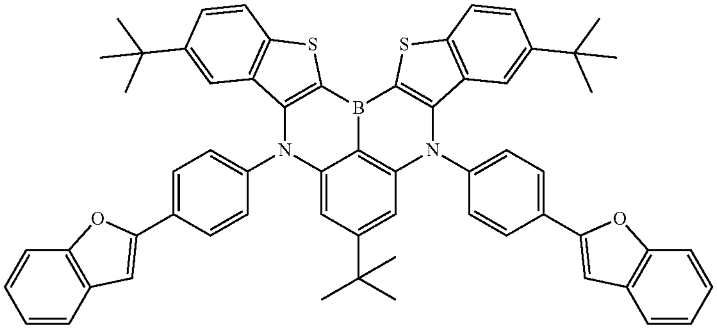
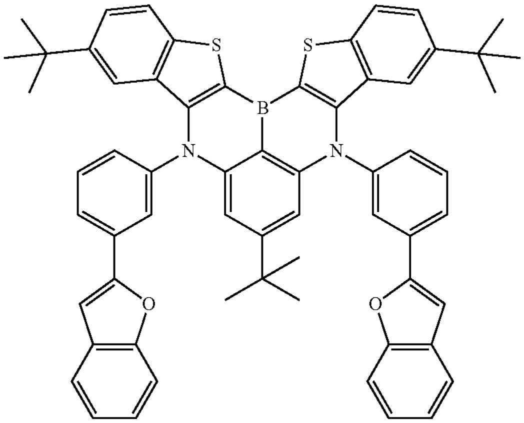
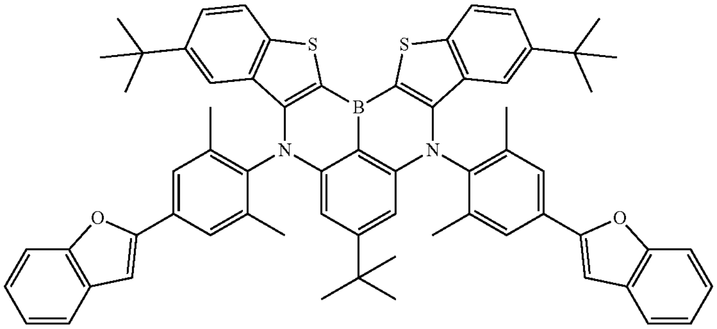

-continued
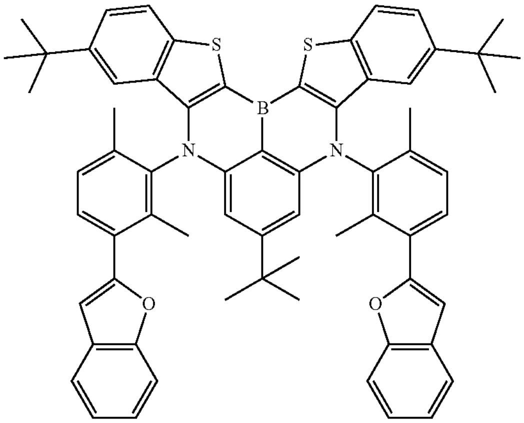
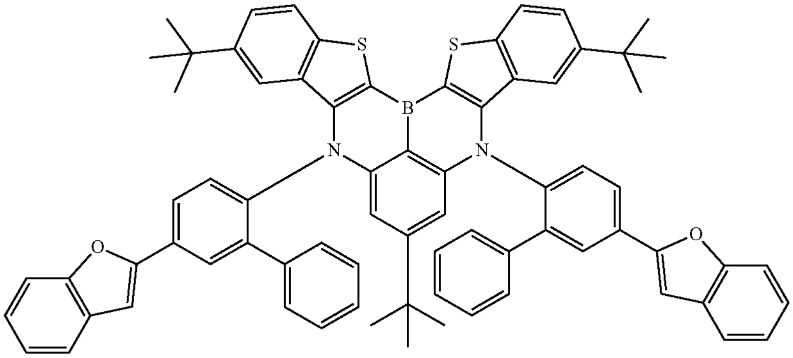
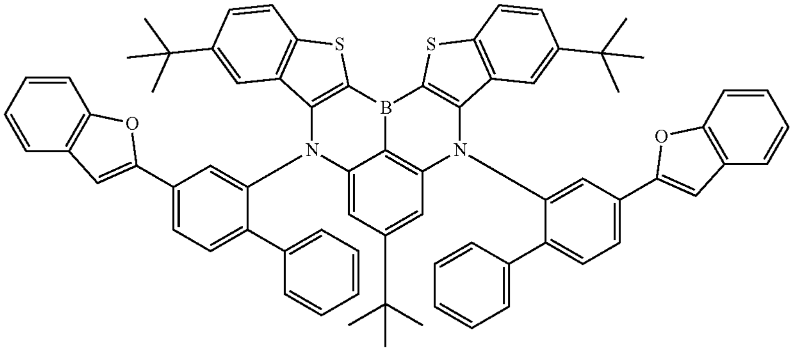
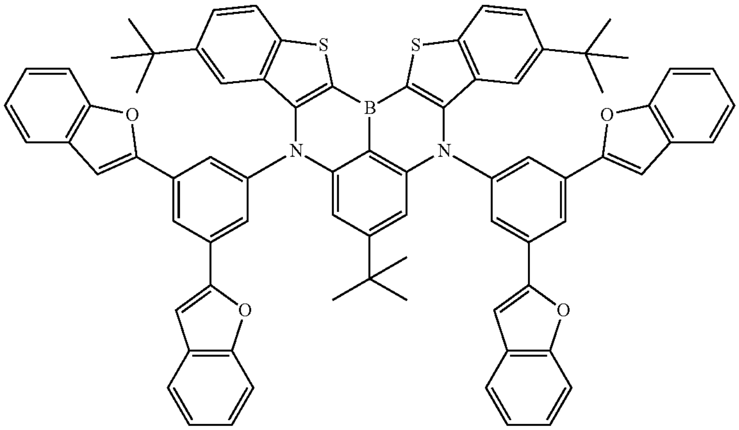

-continued
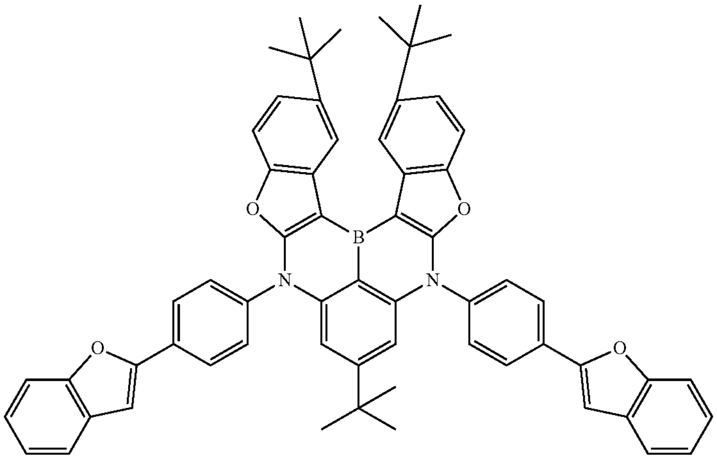
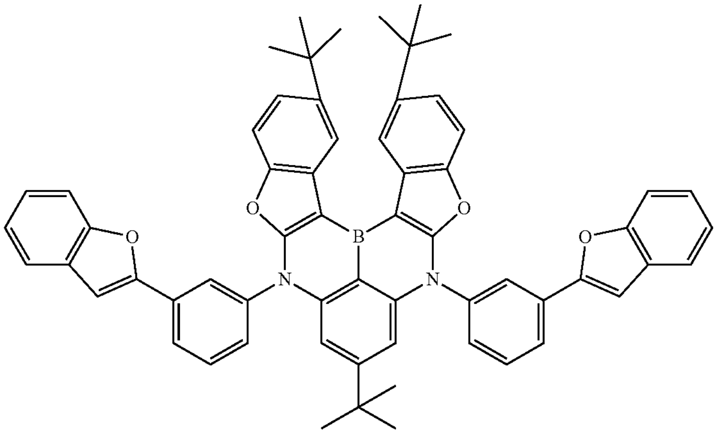
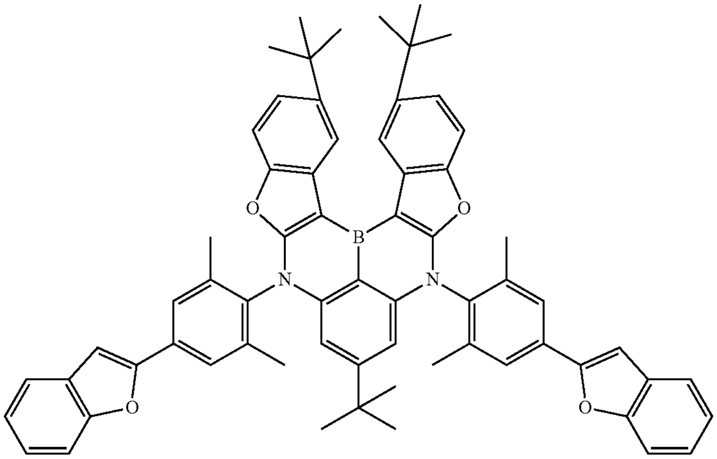
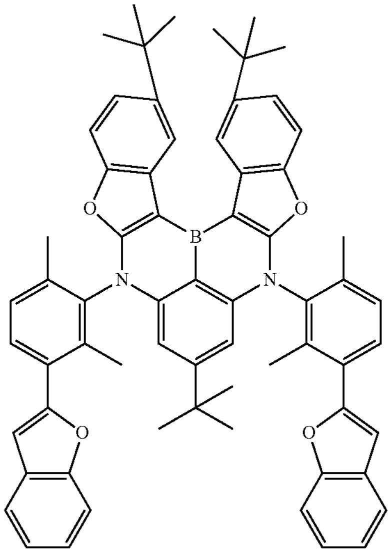

-continued
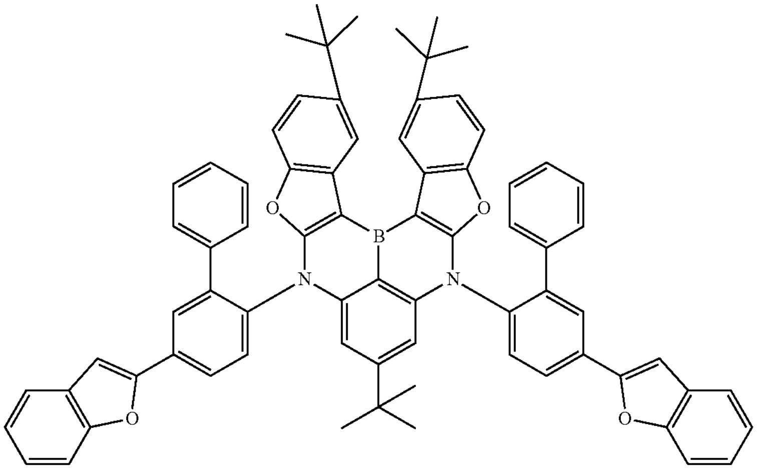
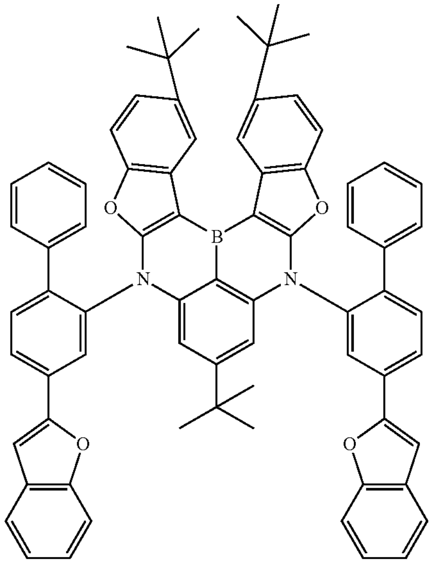
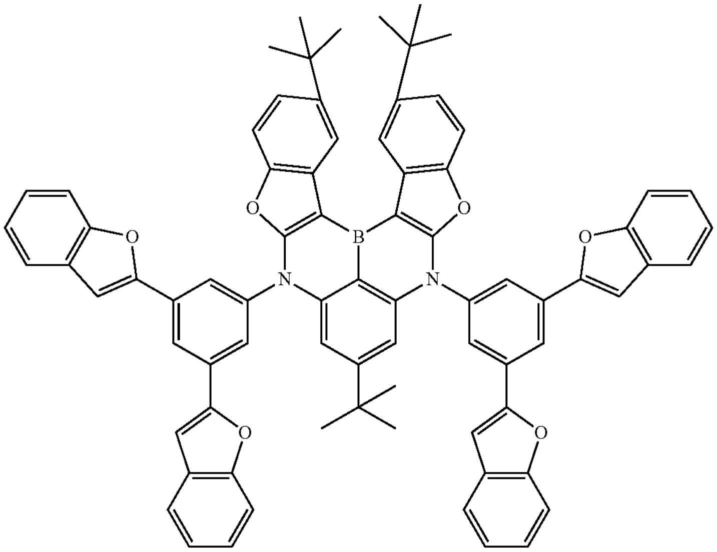
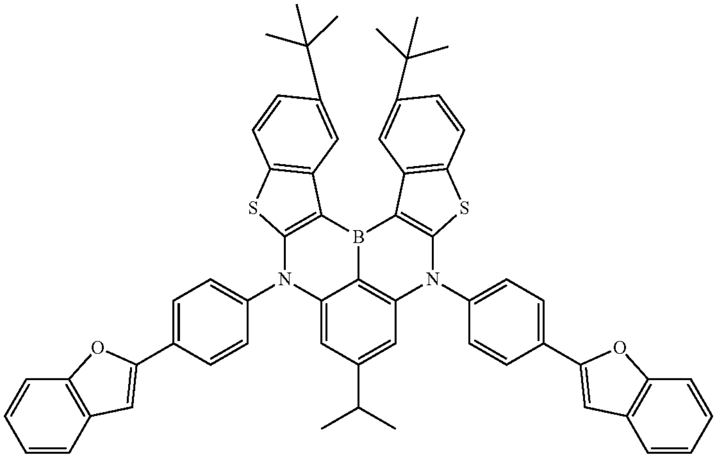

-continued
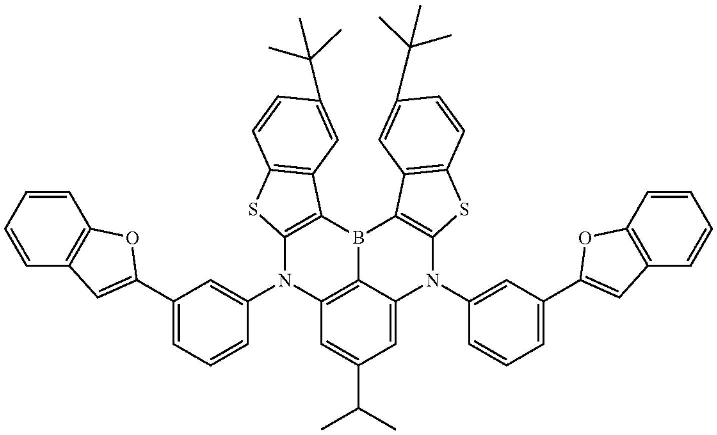
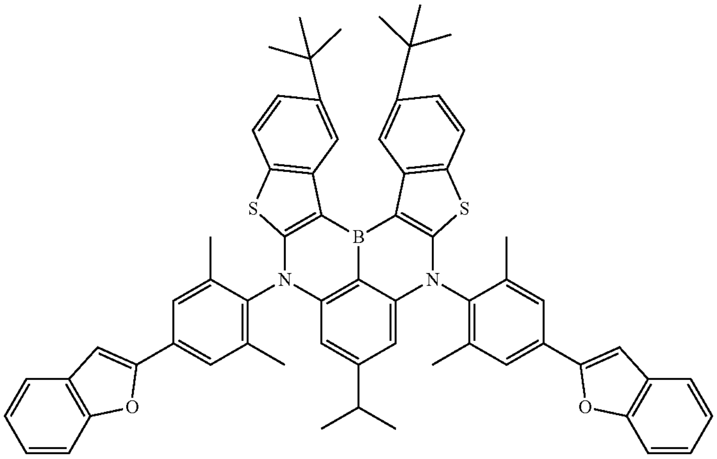
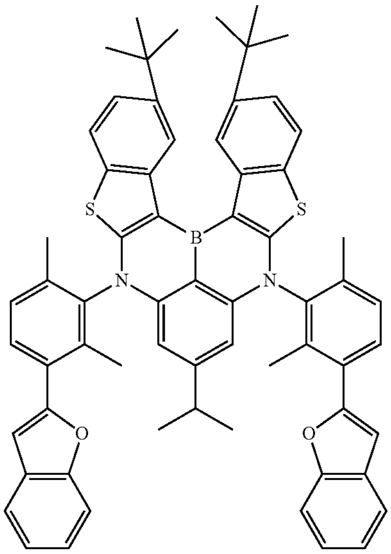
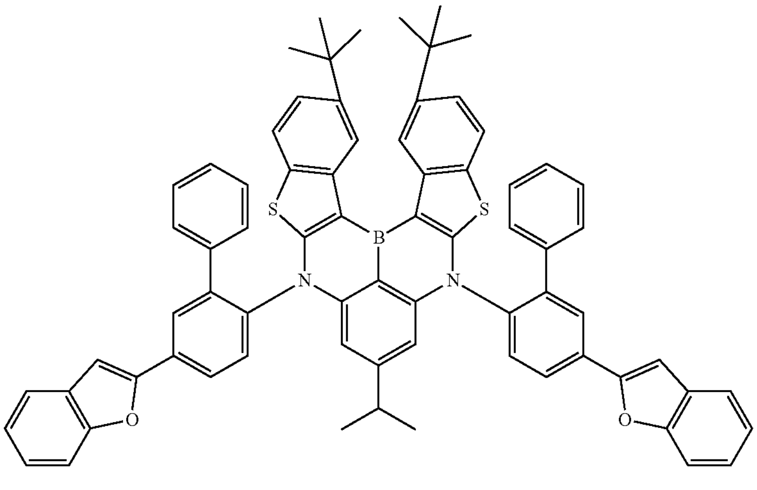
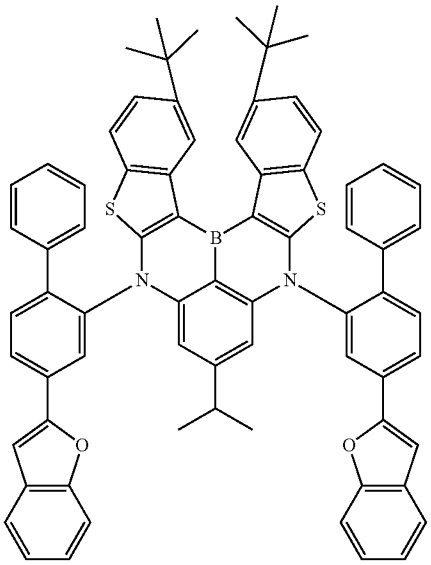

-continued
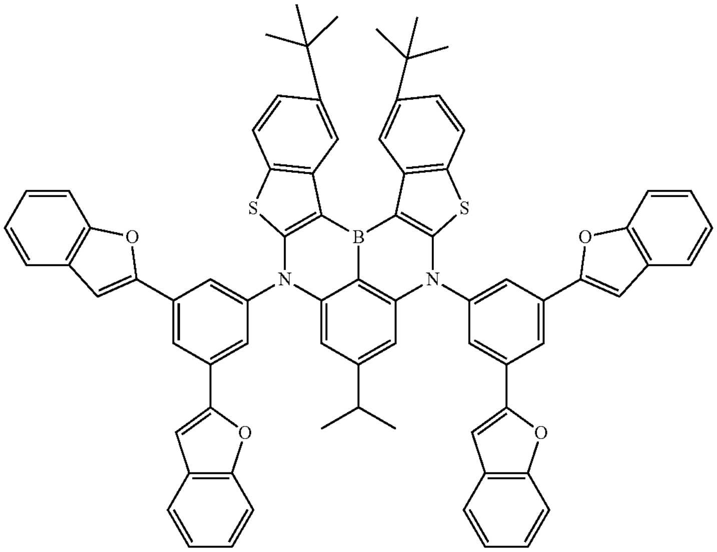
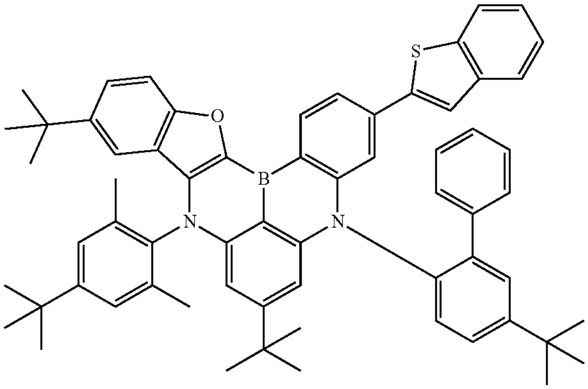
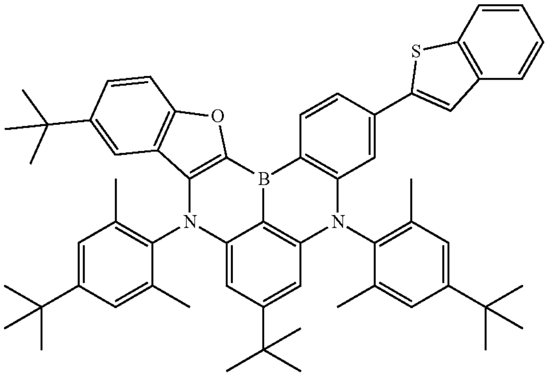
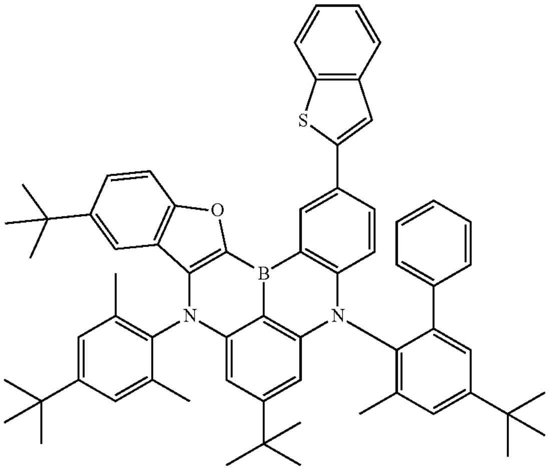
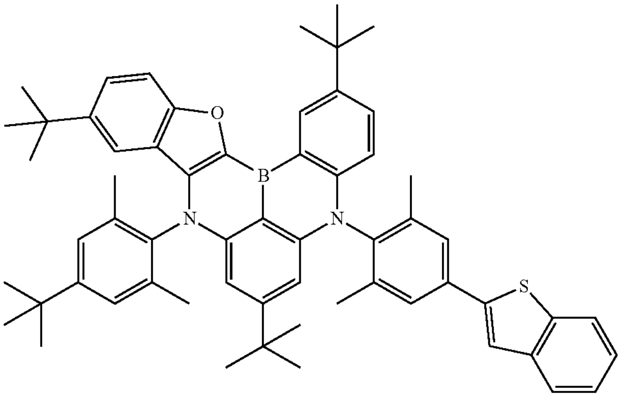

-continued
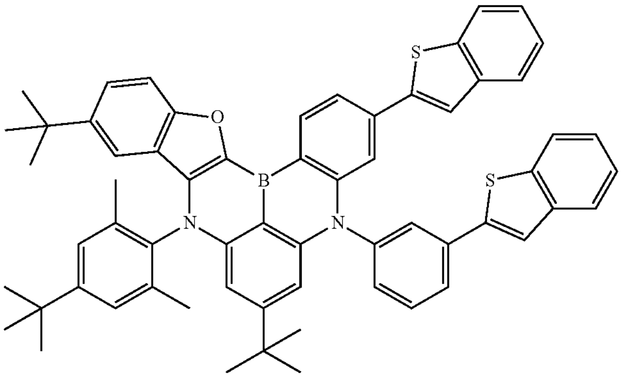
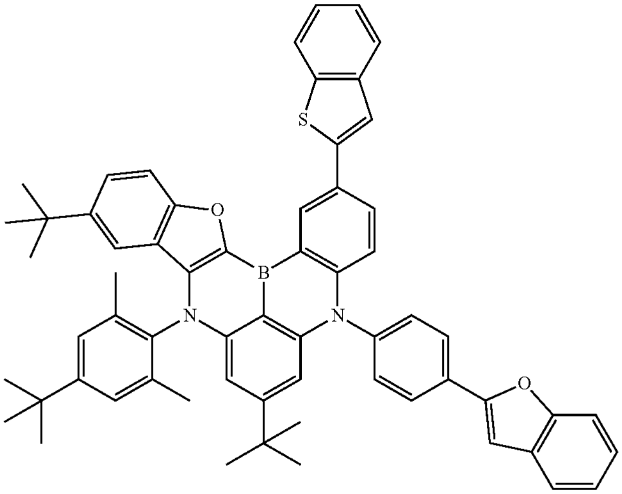
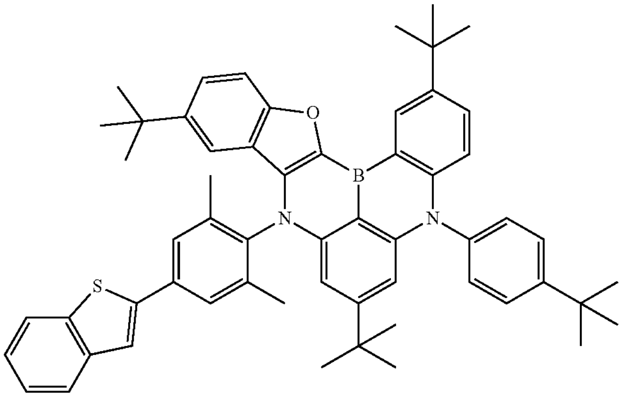
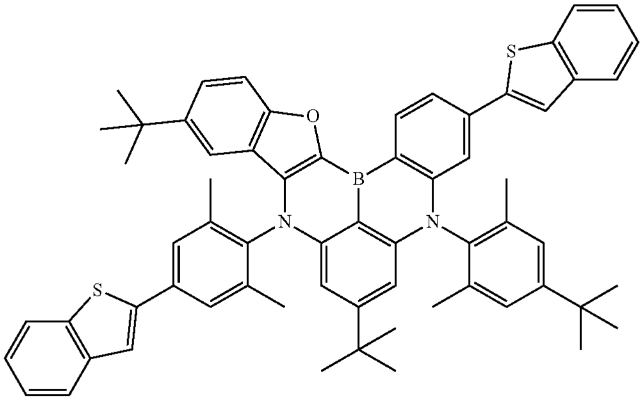

-continued
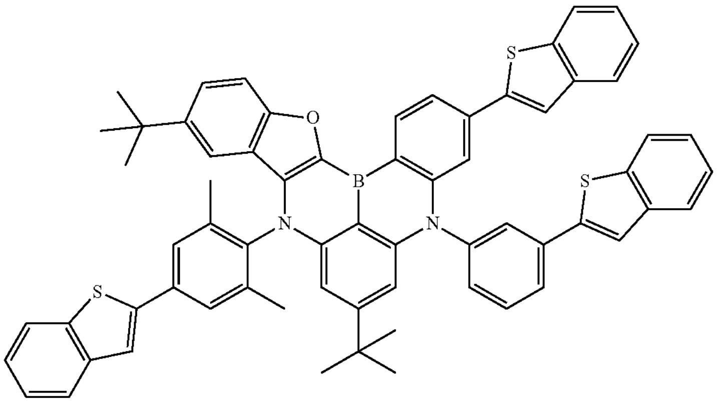
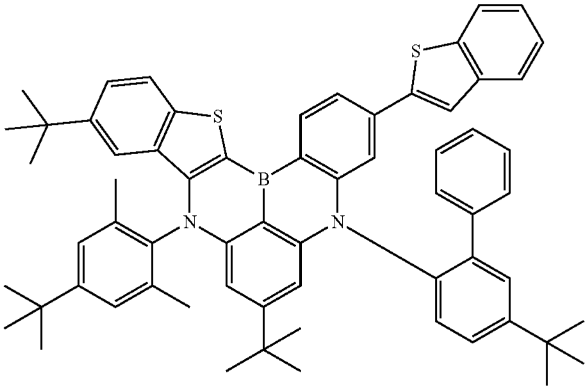
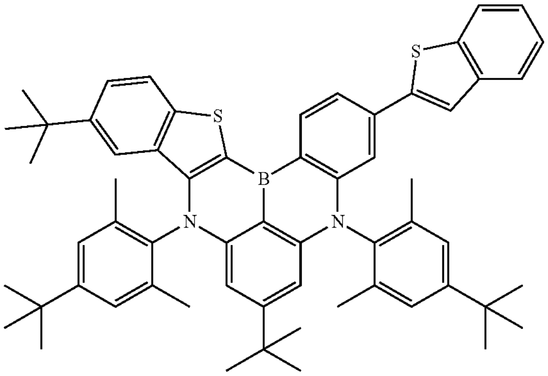
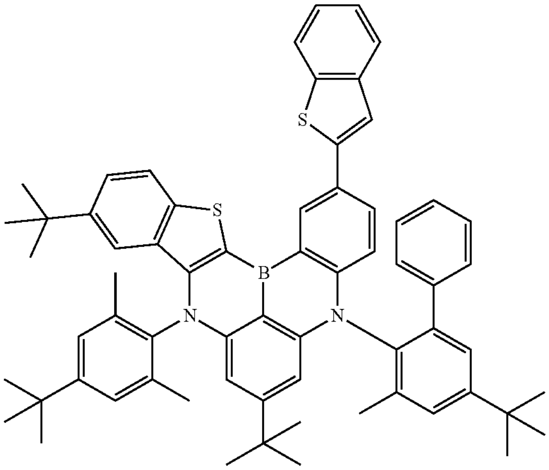
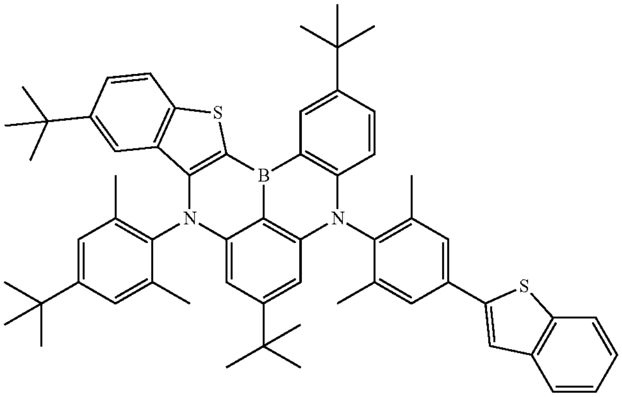

-continued
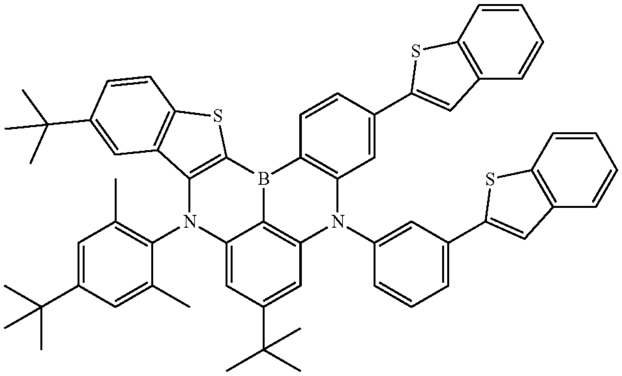
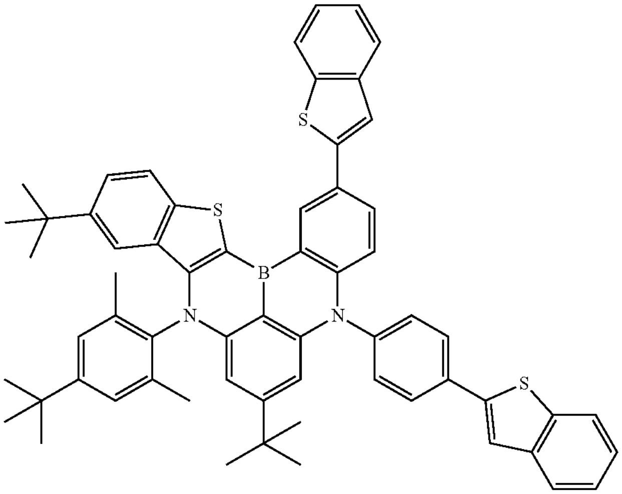
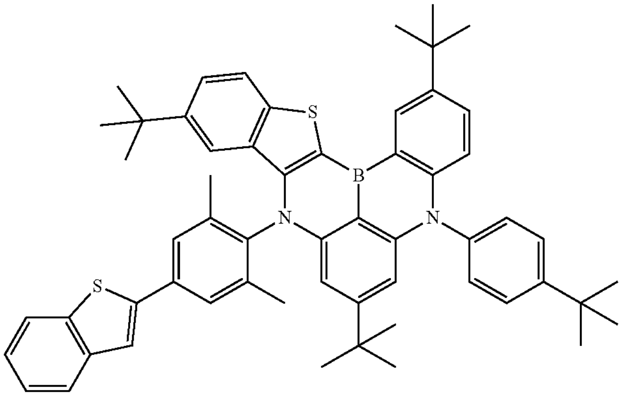
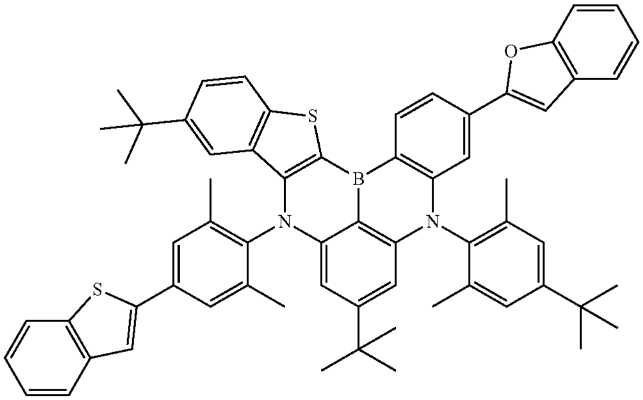

-continued
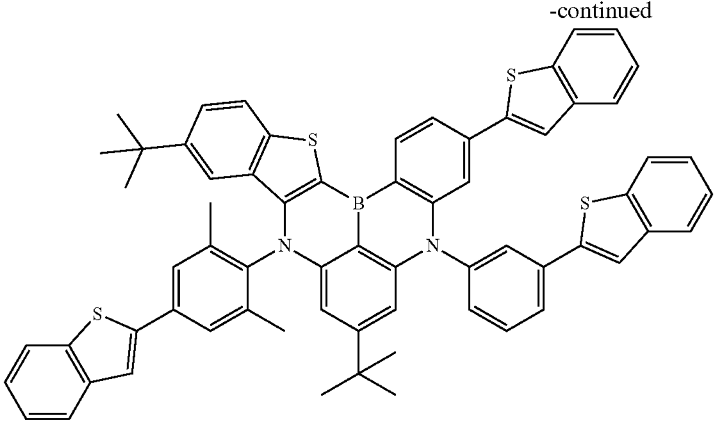
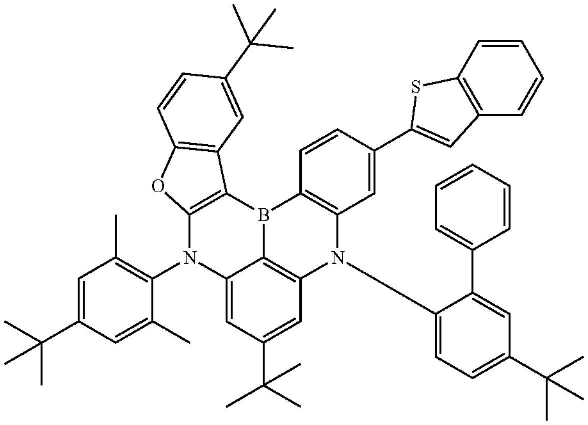
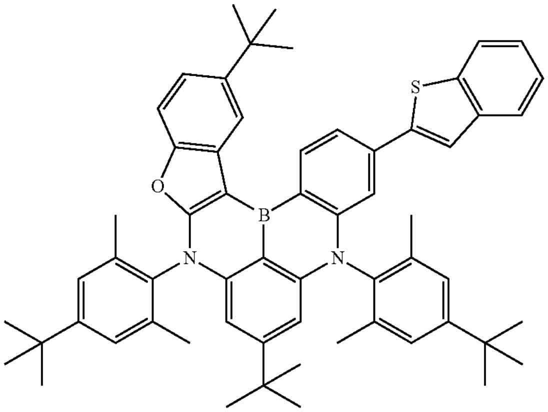
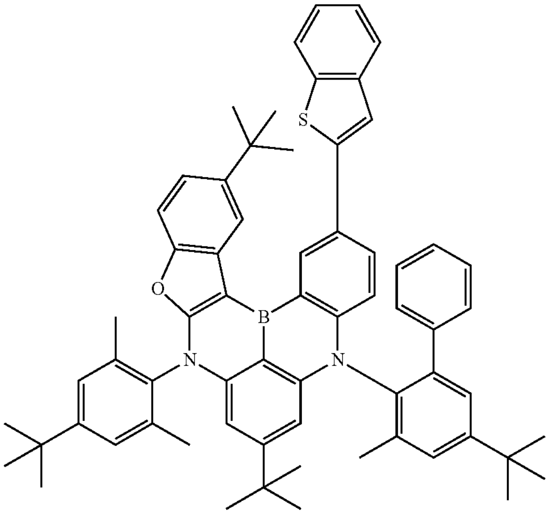
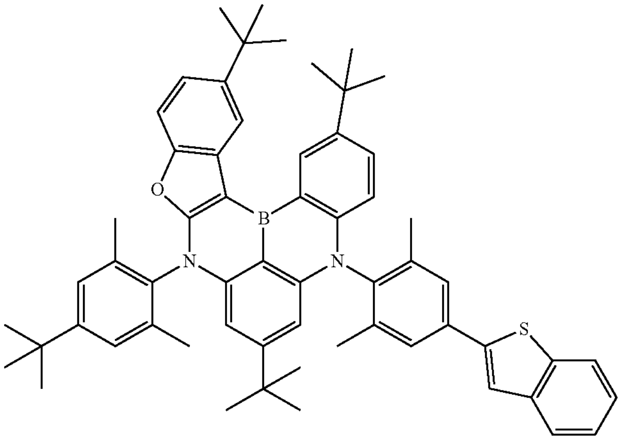

-continued
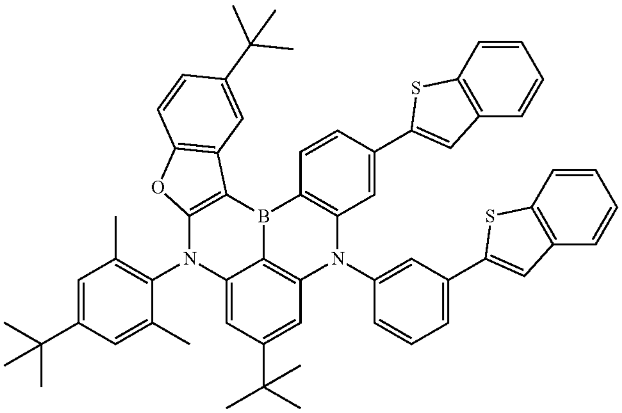
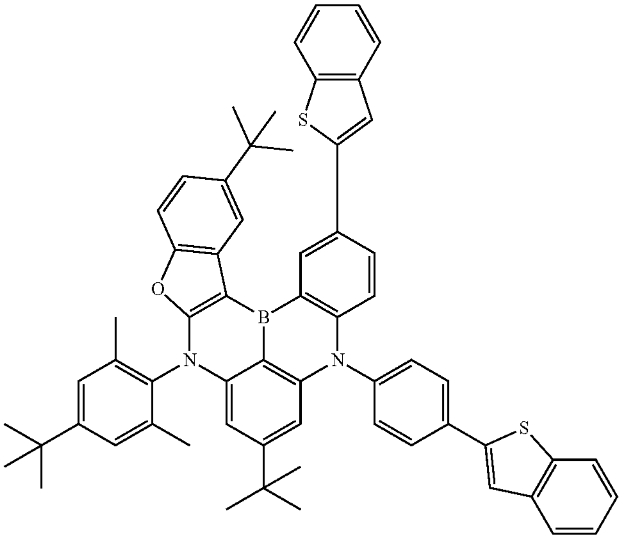
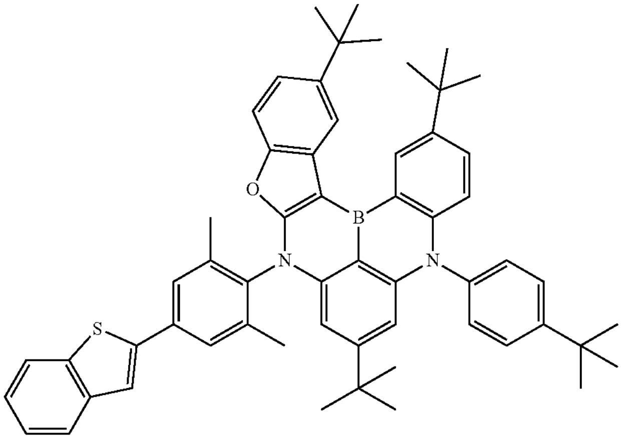

-continued
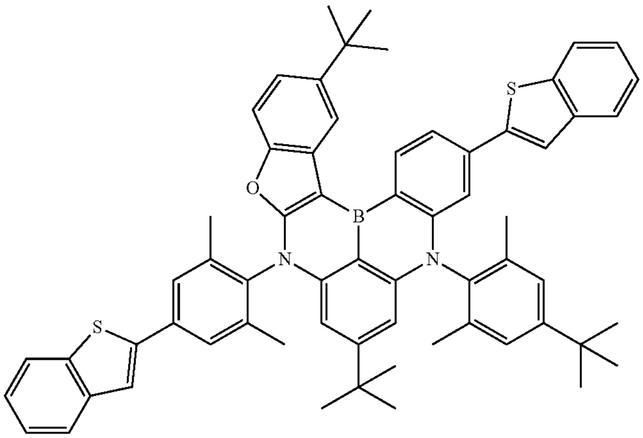
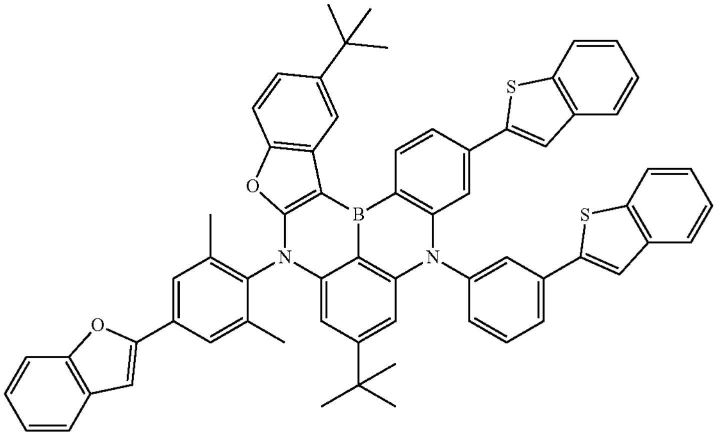
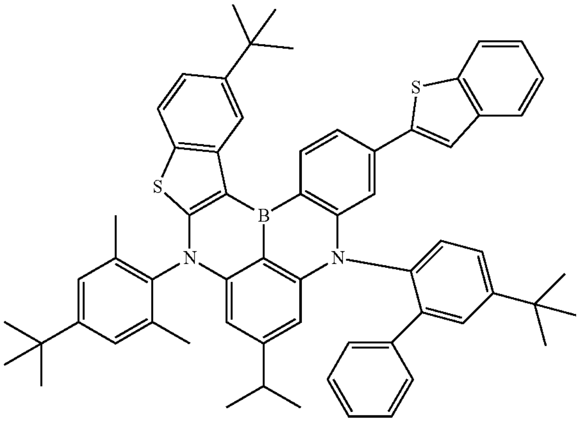
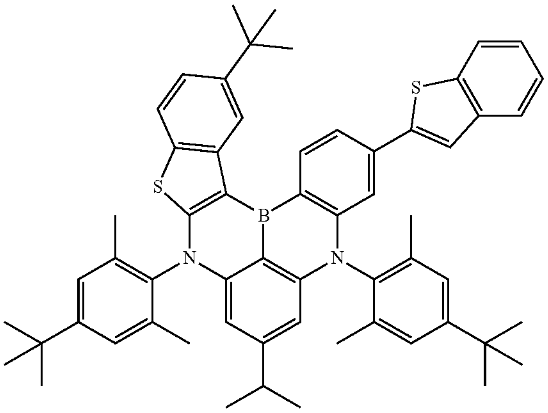

-continued
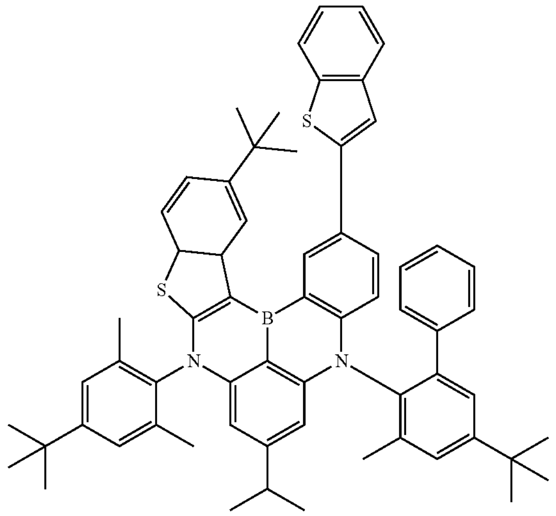
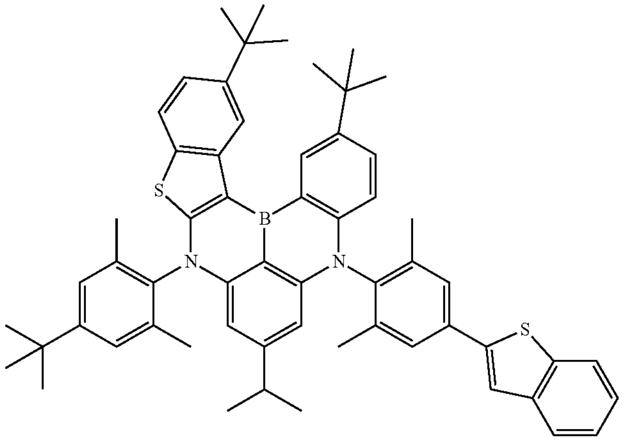
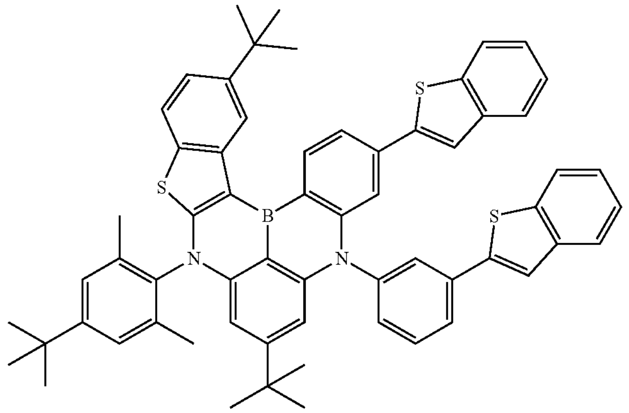
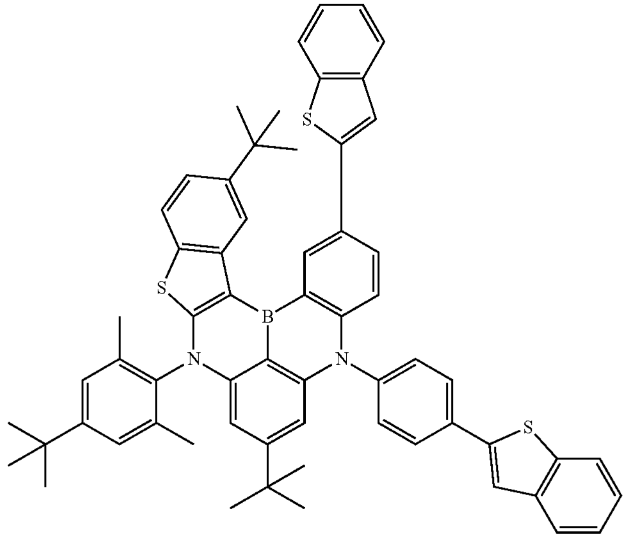

-continued
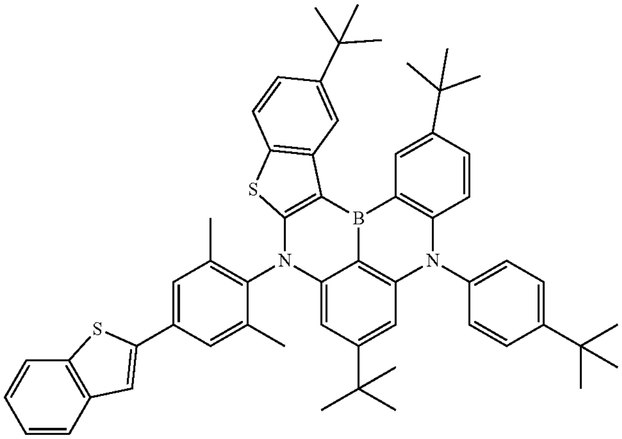
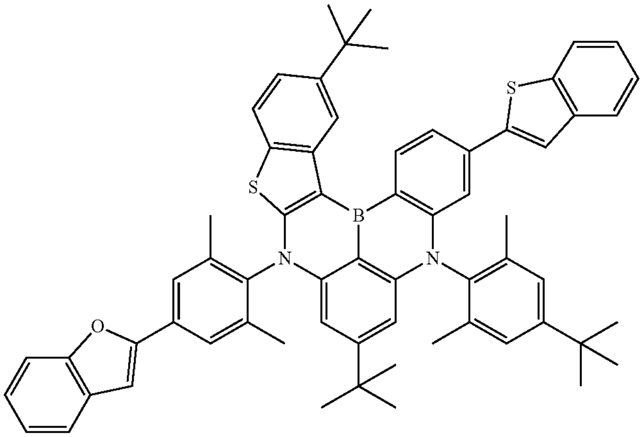
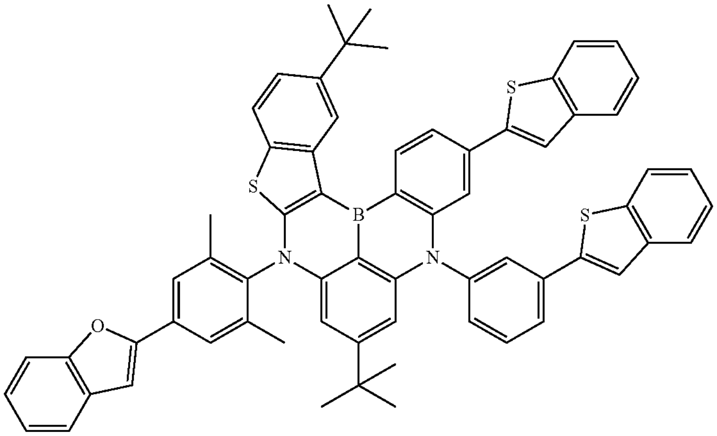
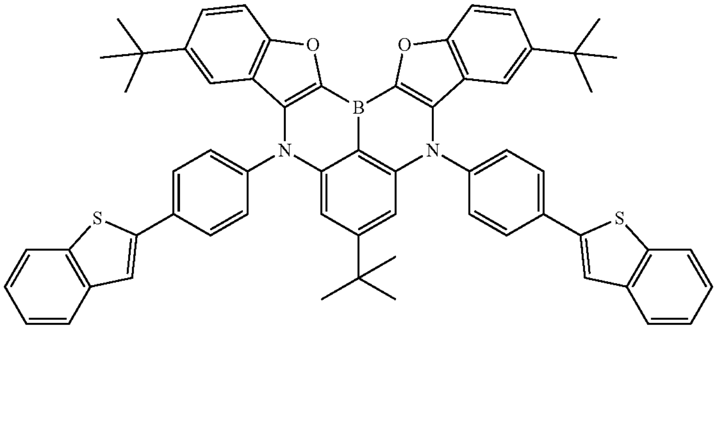

-continued
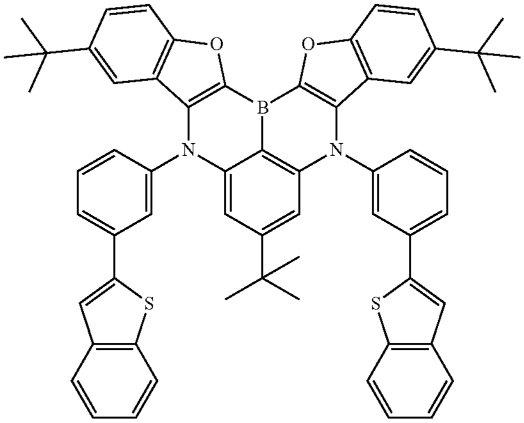
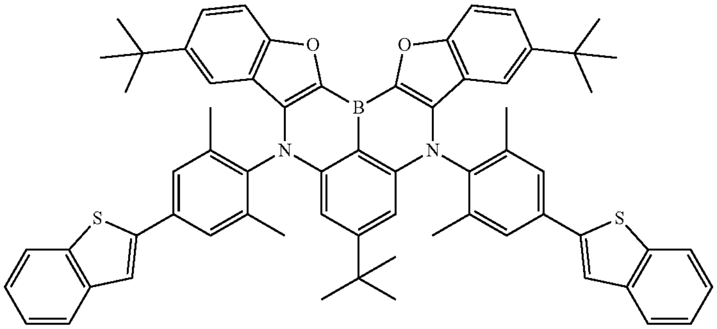
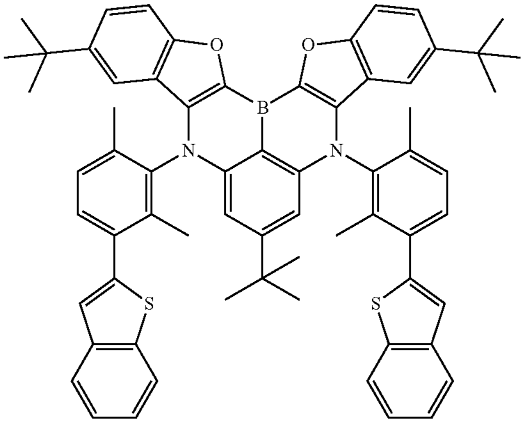
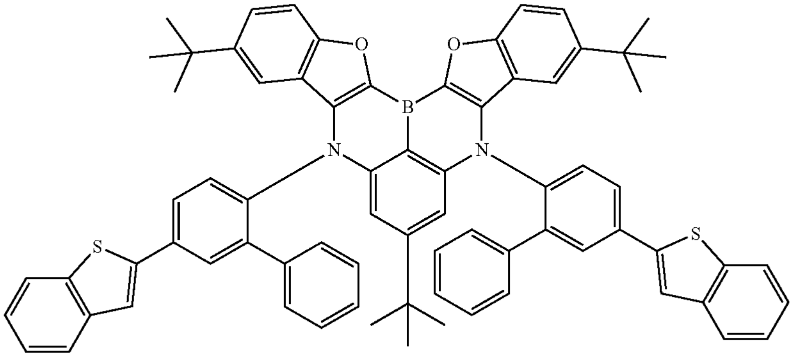

-continued
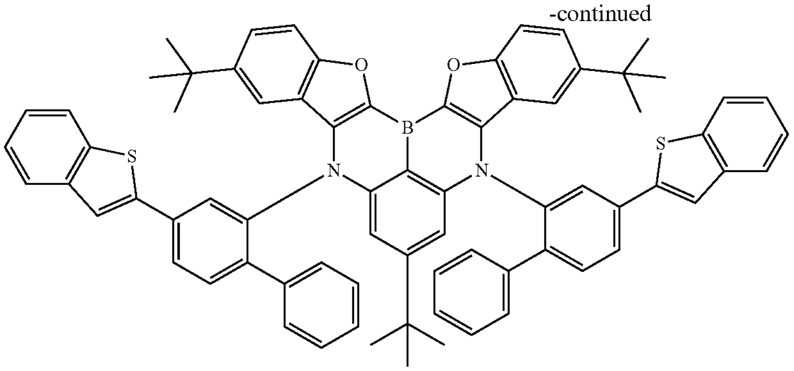
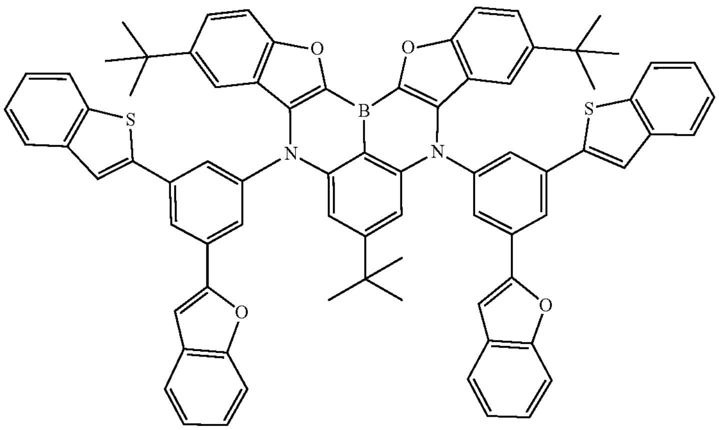
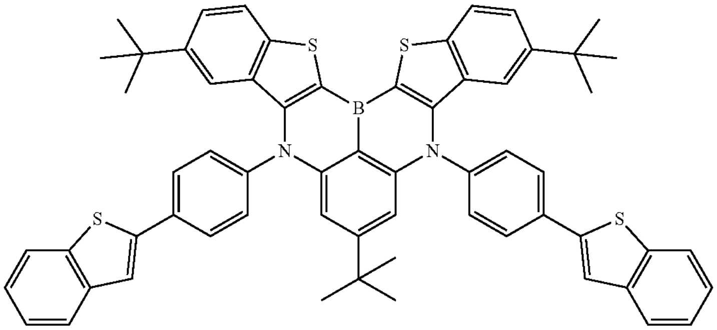
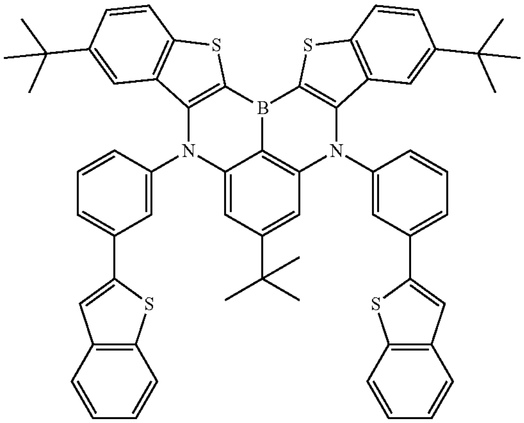

-continued
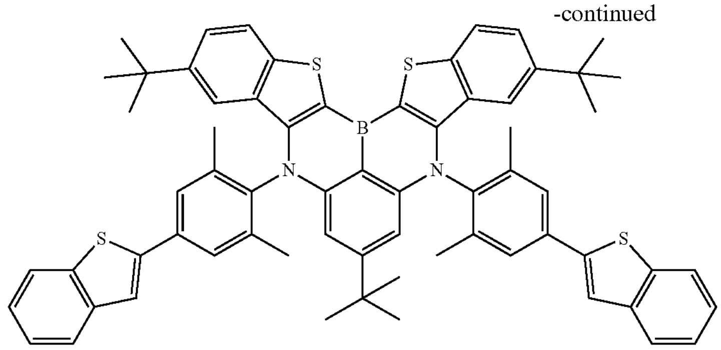
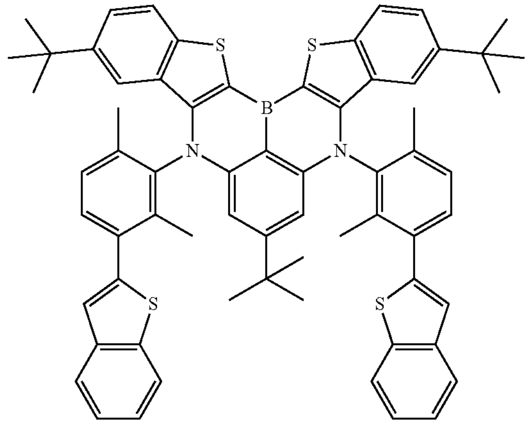
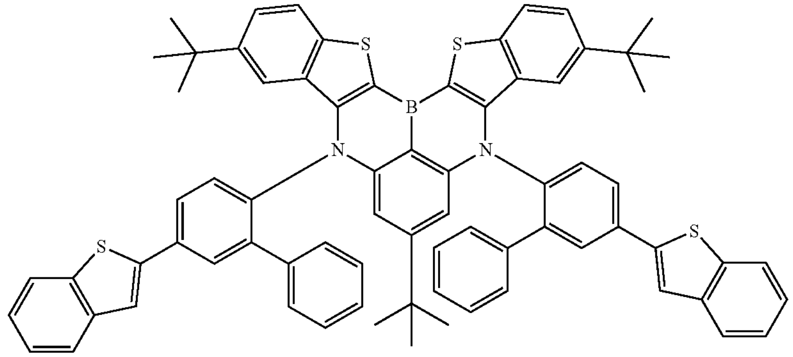
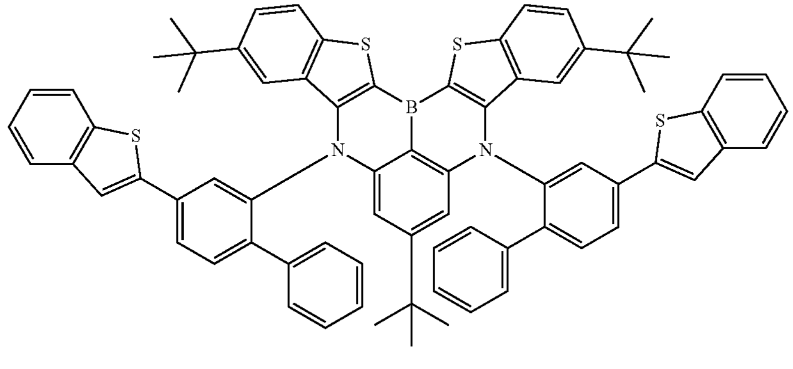

-continued
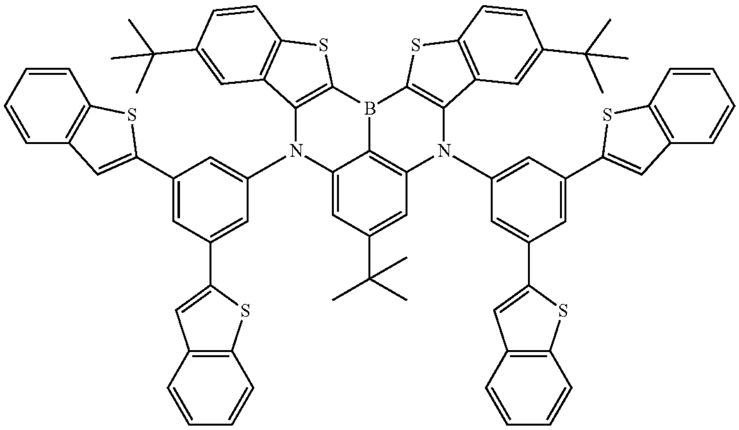
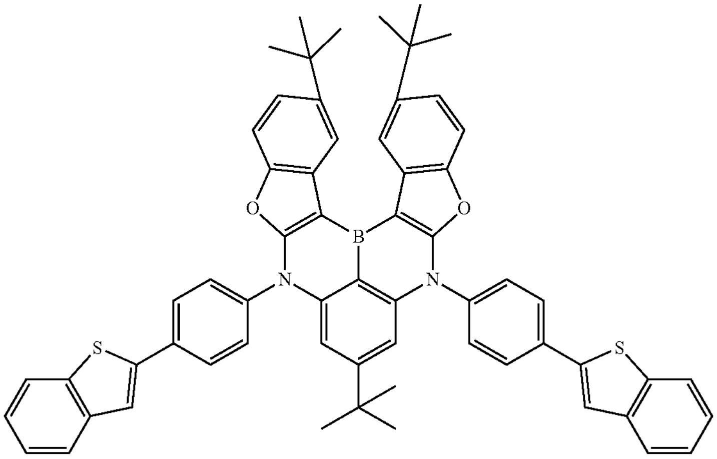
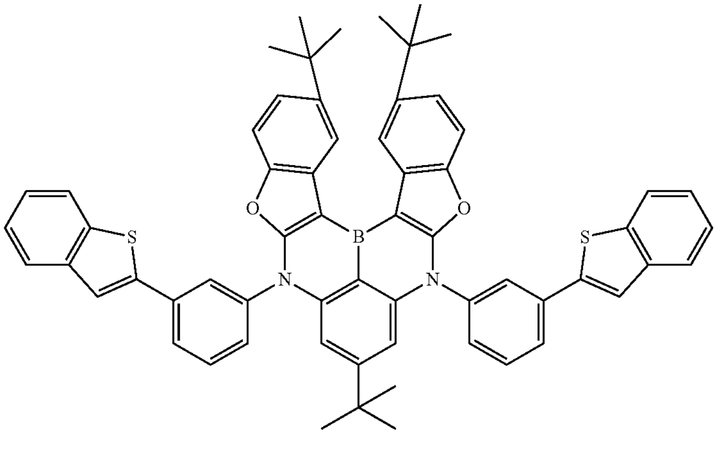

-continued
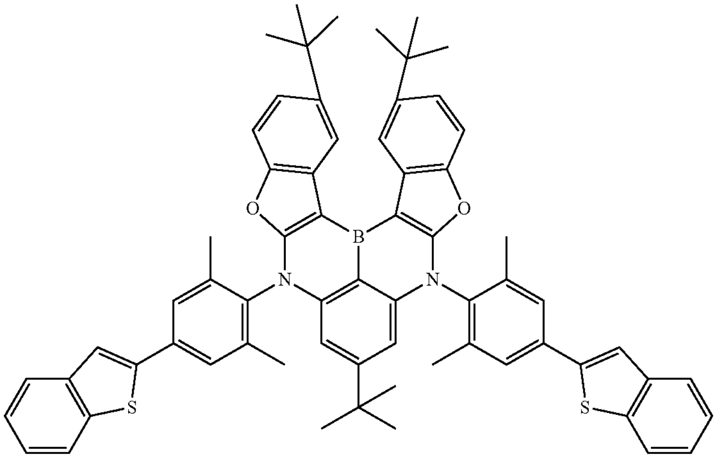
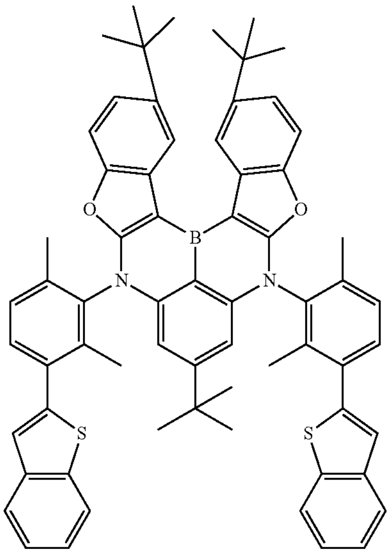
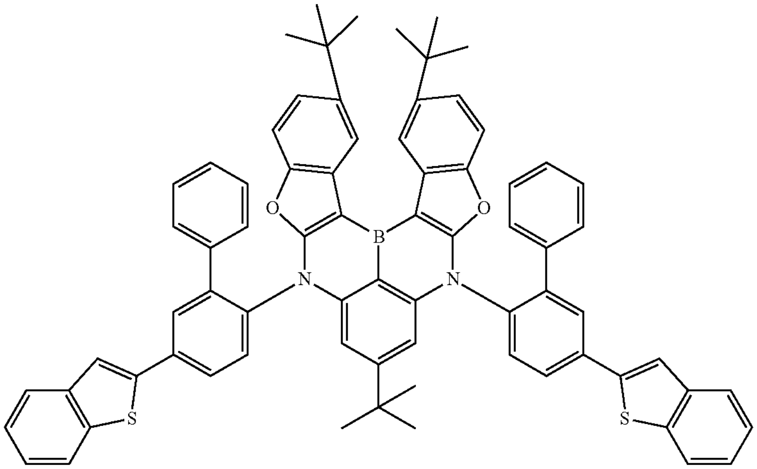
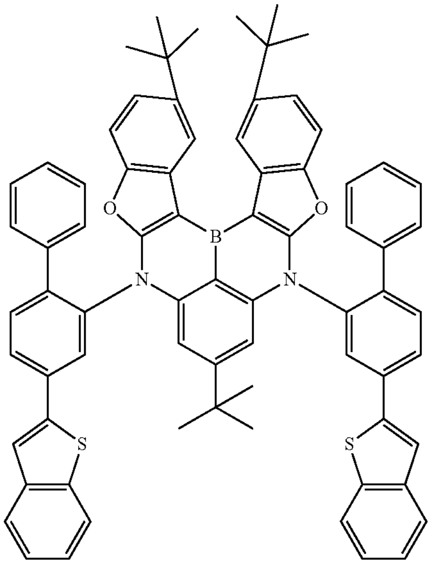
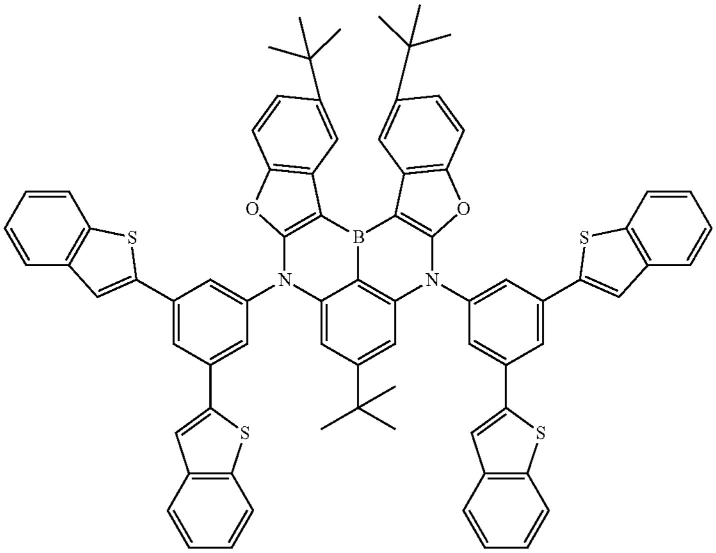

-continued
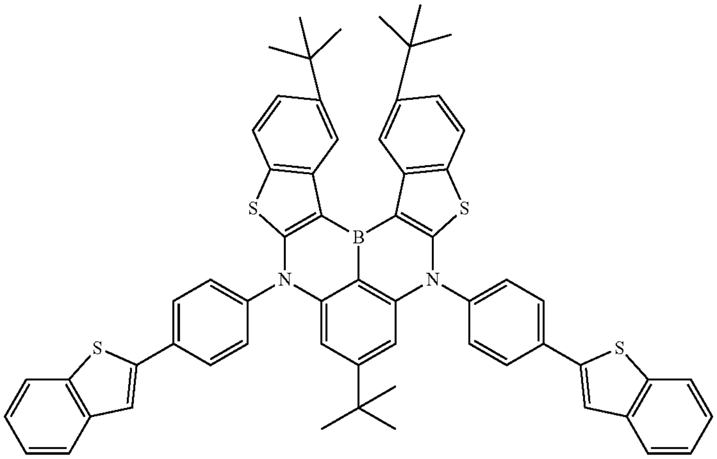
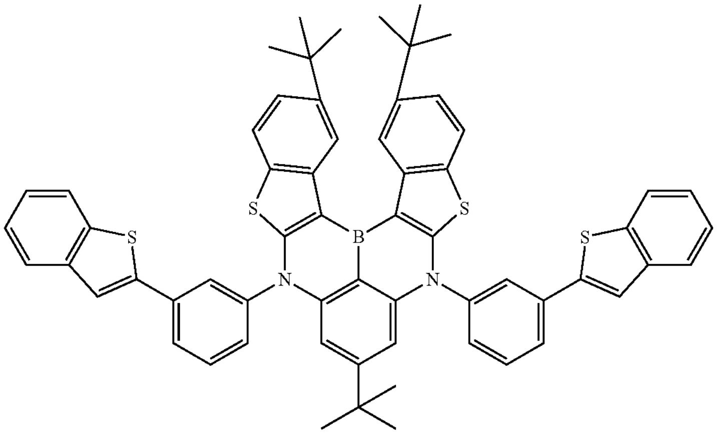
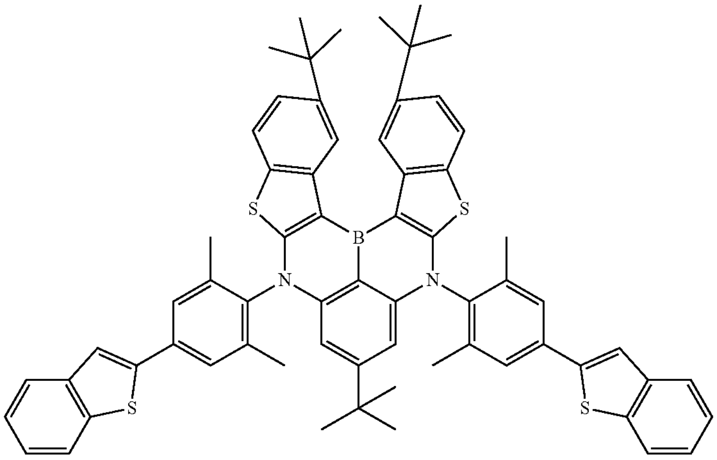
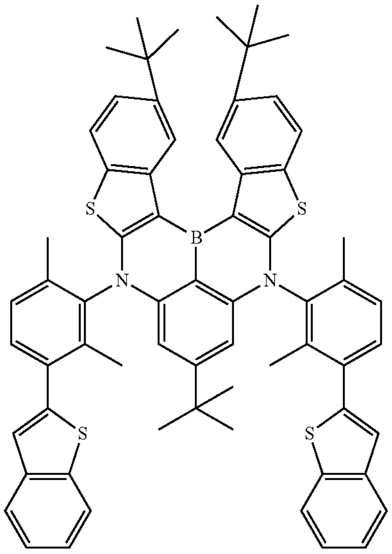

-continued
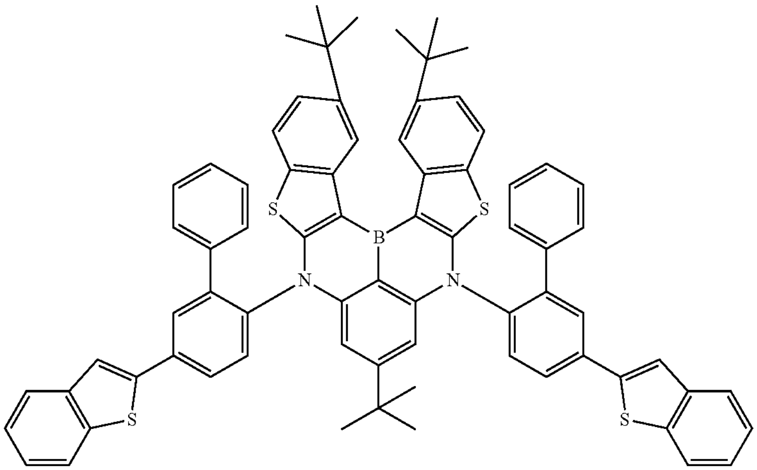
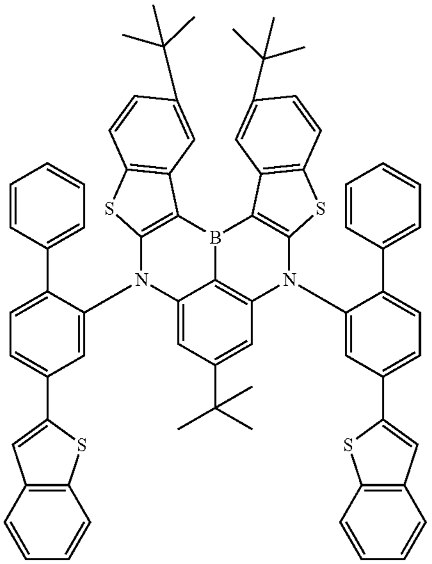
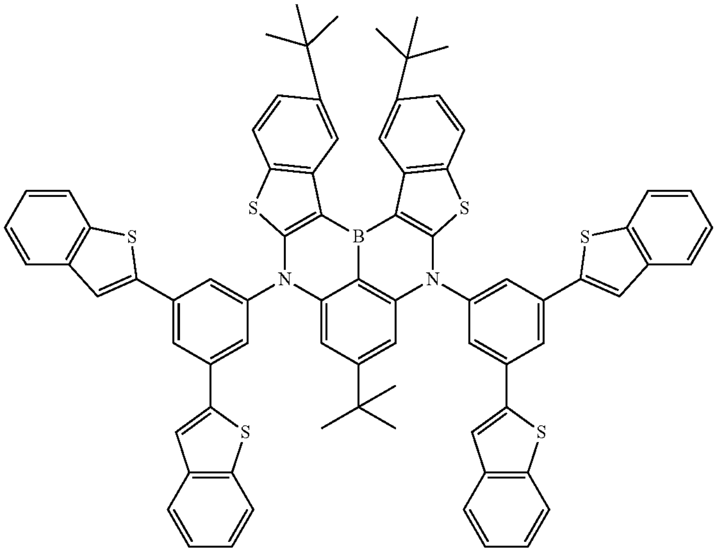
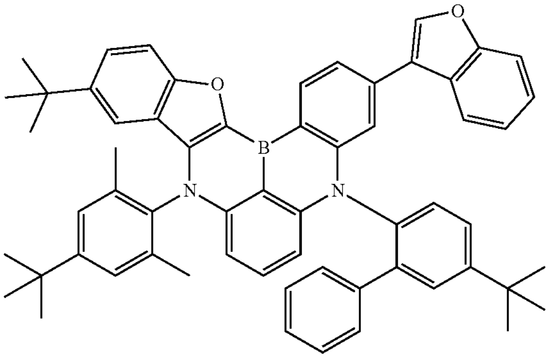
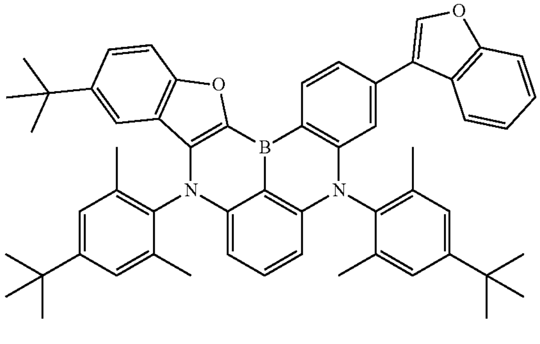

-continued
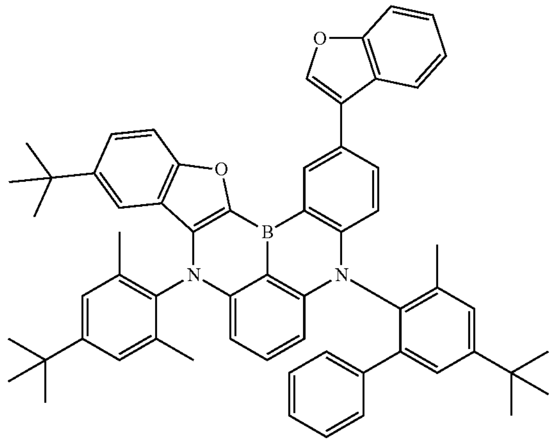
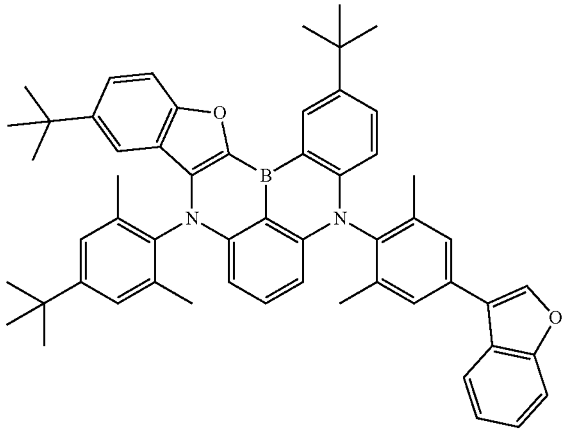
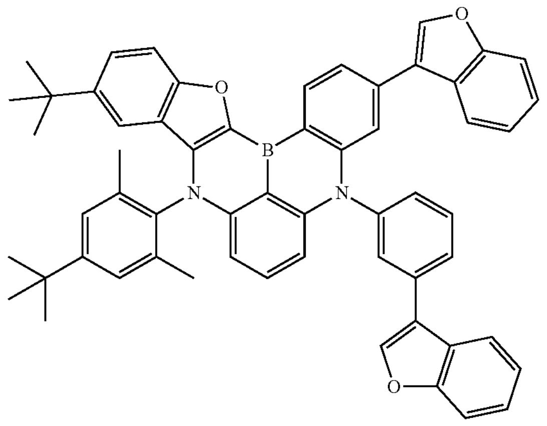
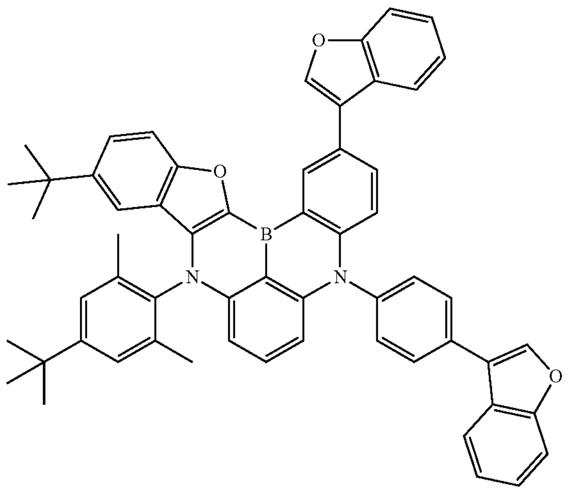
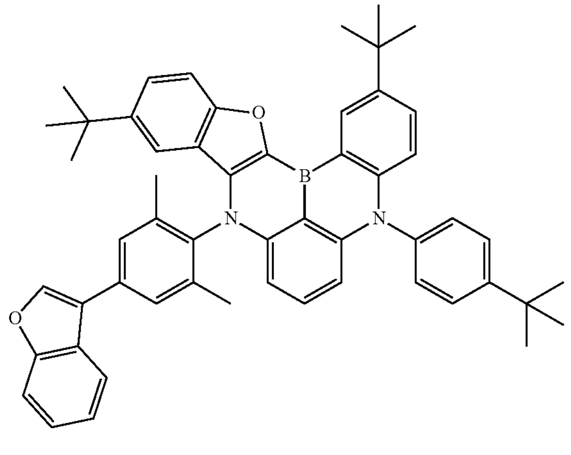

-continued
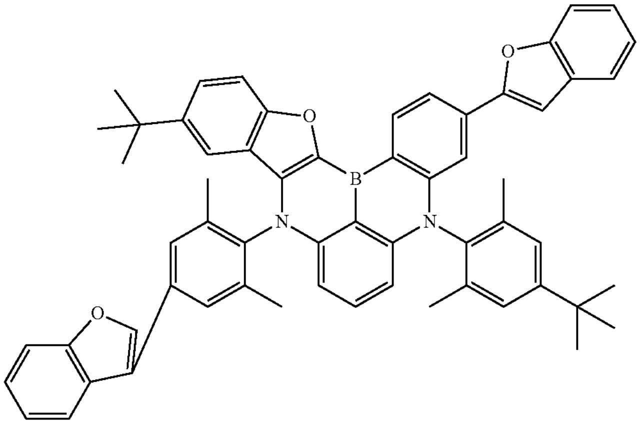
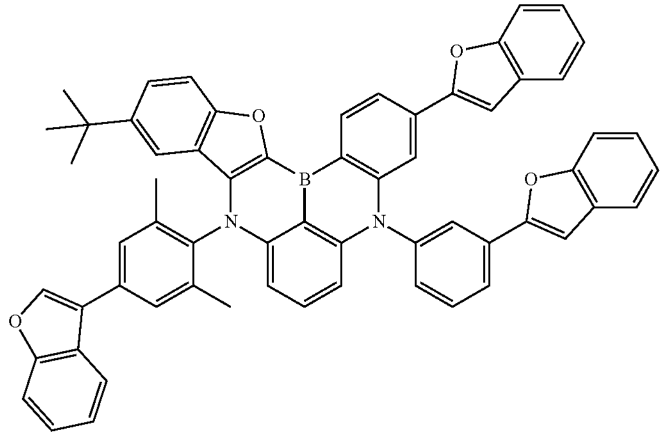
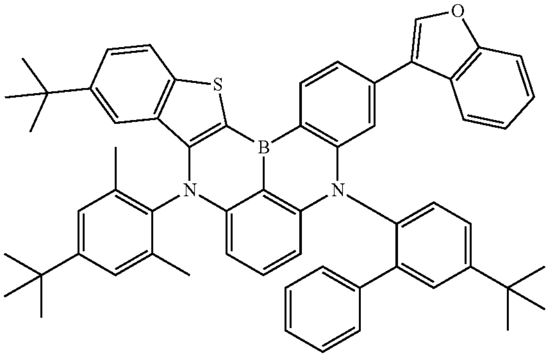
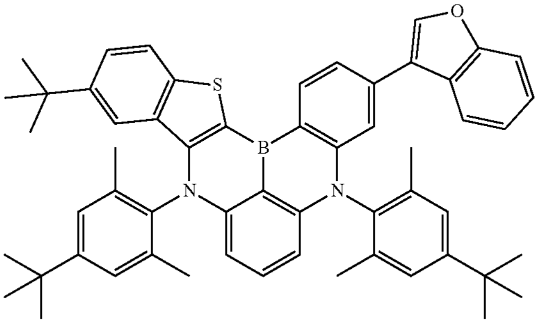
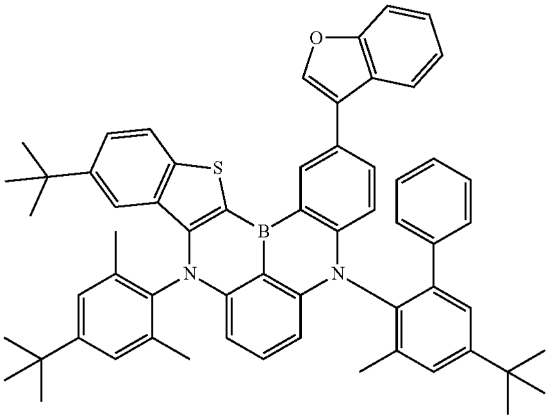
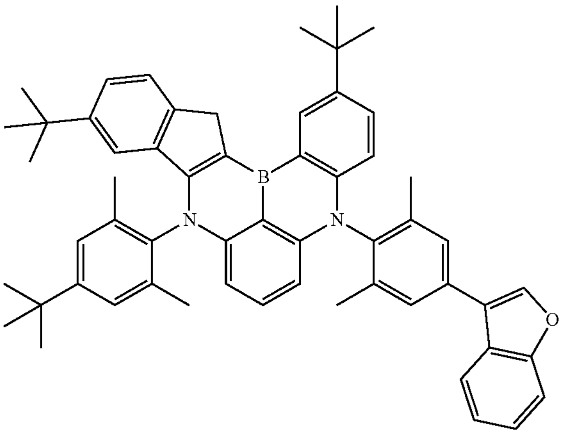

-continued
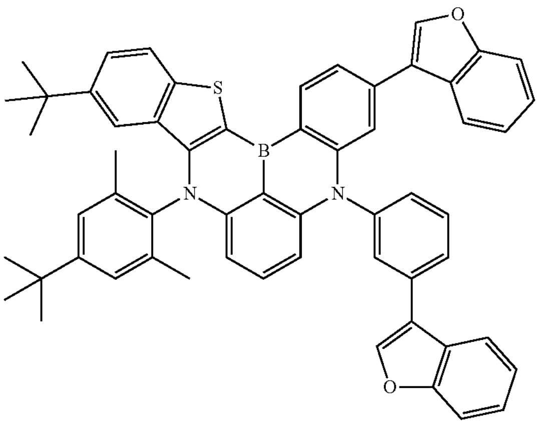
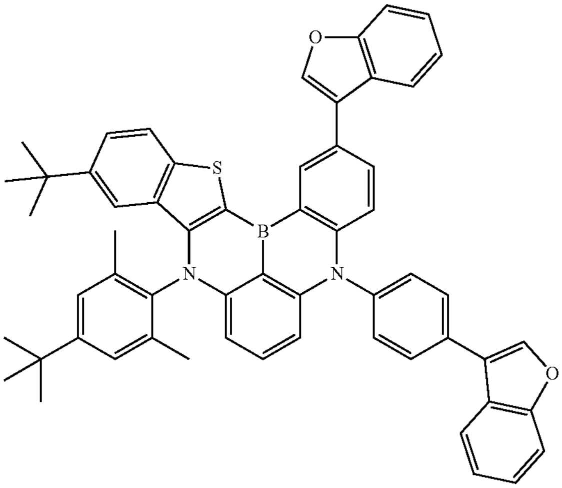
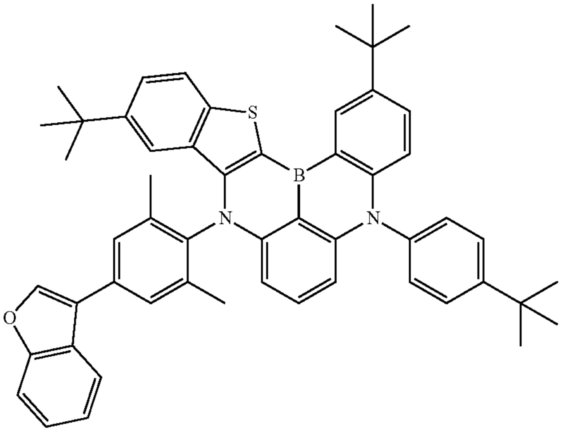
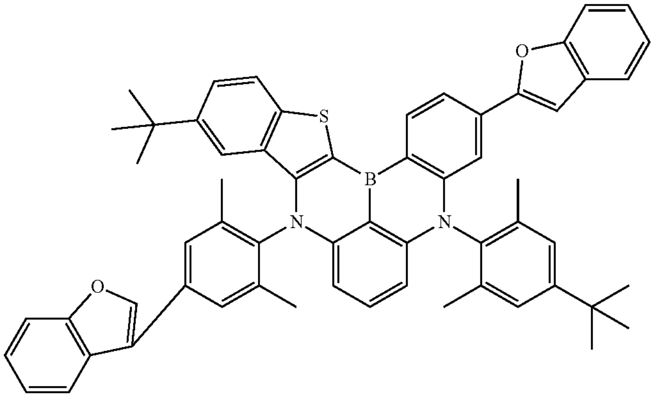

-continued
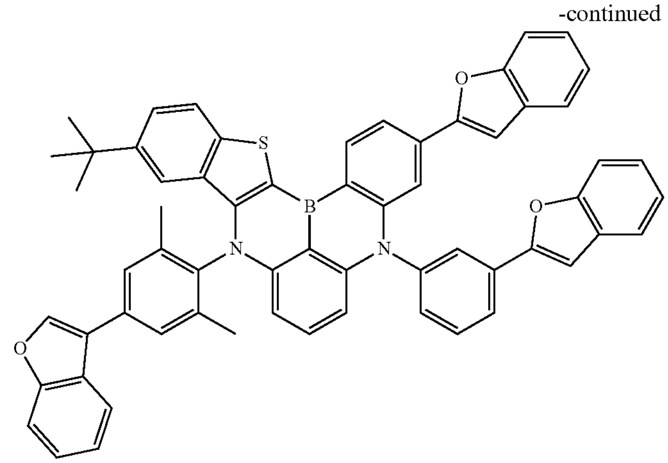
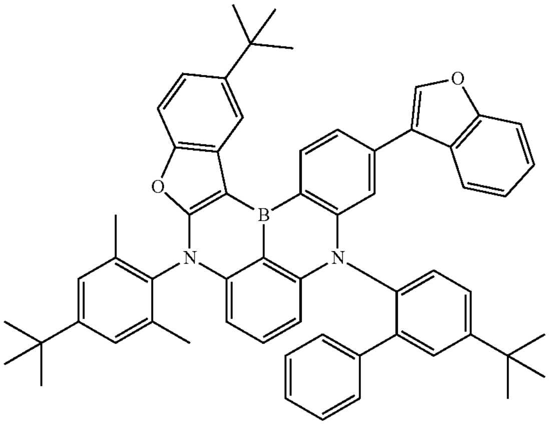
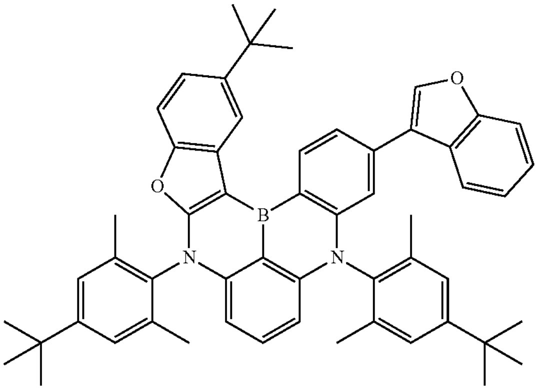
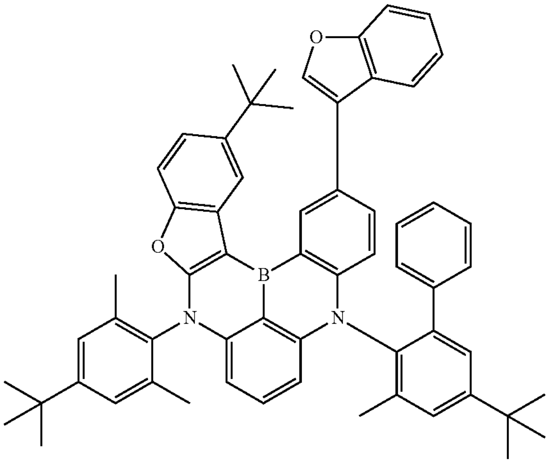
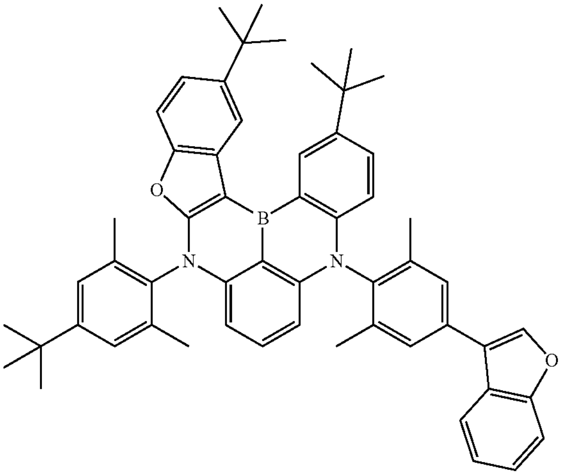

-continued
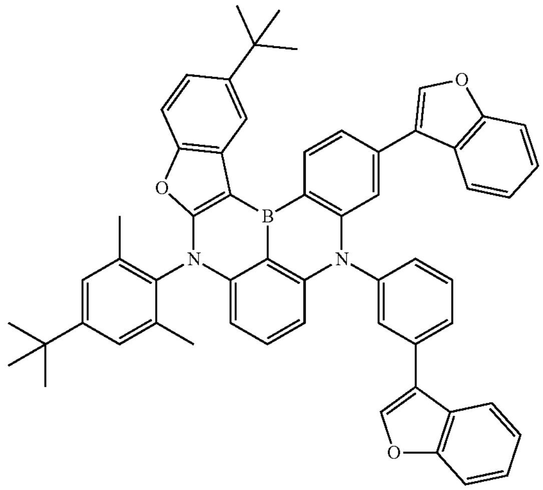
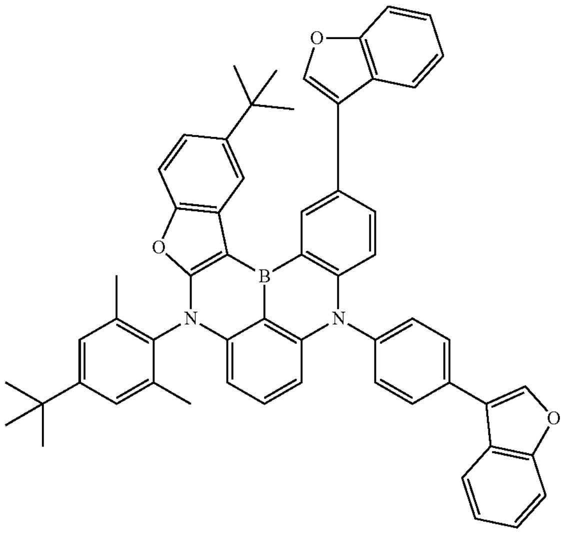
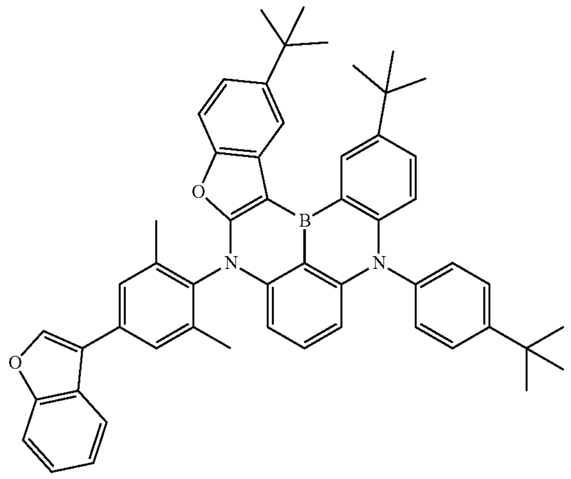
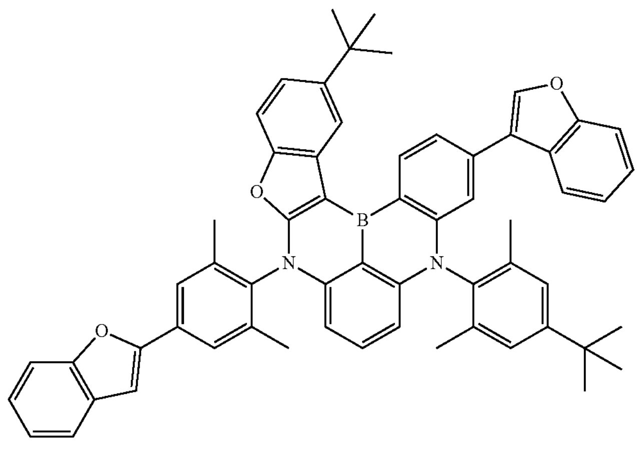

-continued
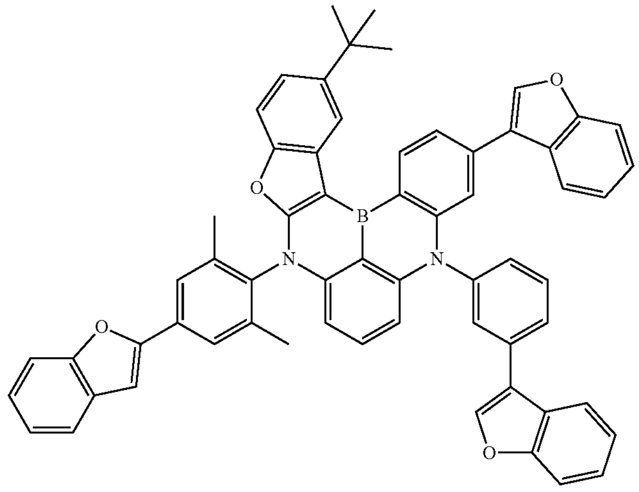
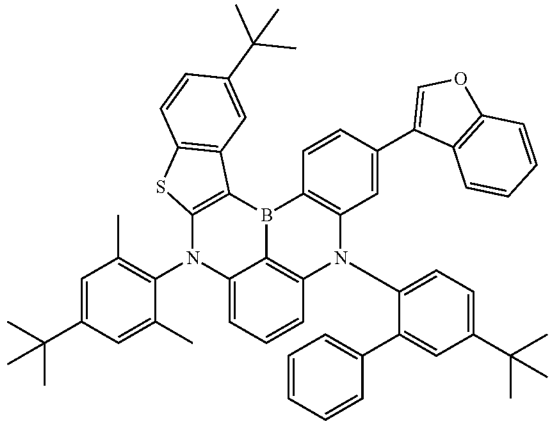
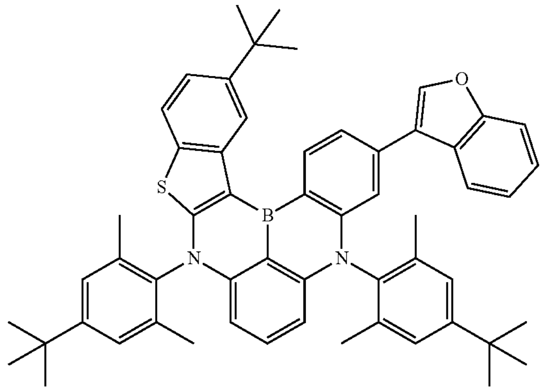
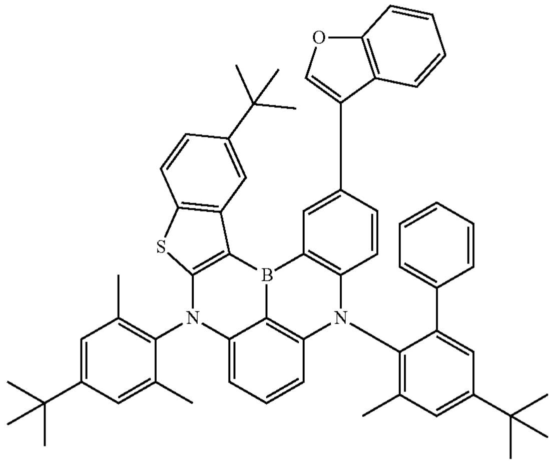
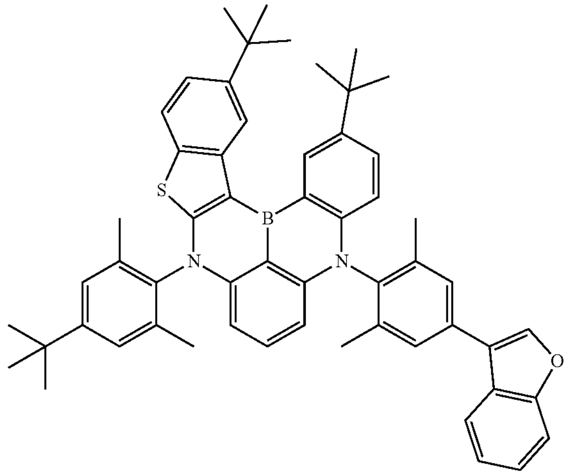
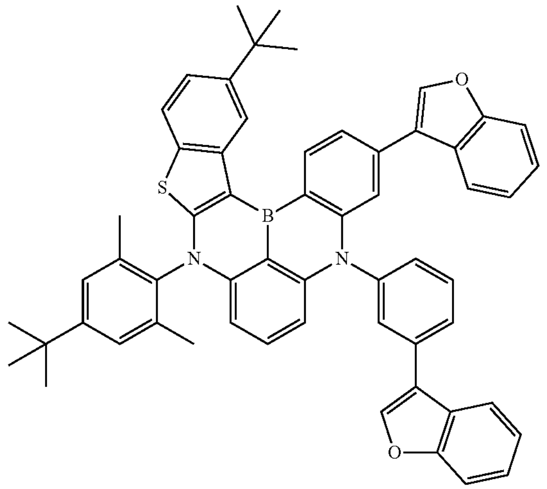

-continued
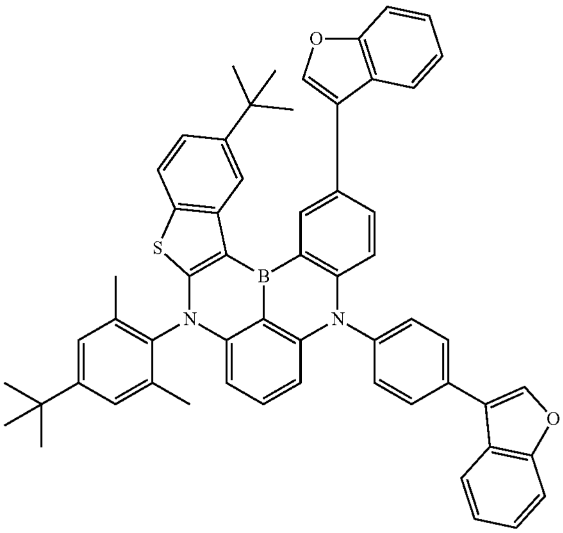
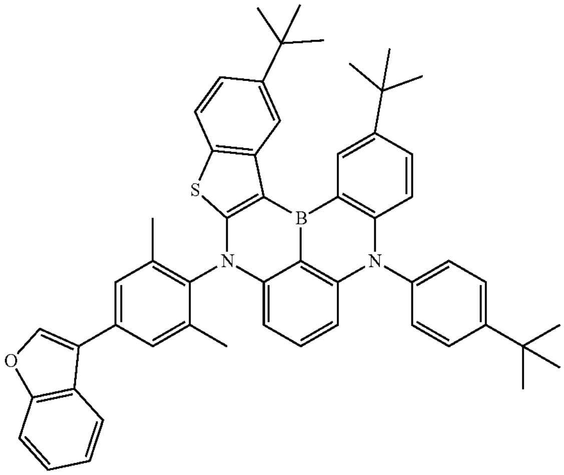
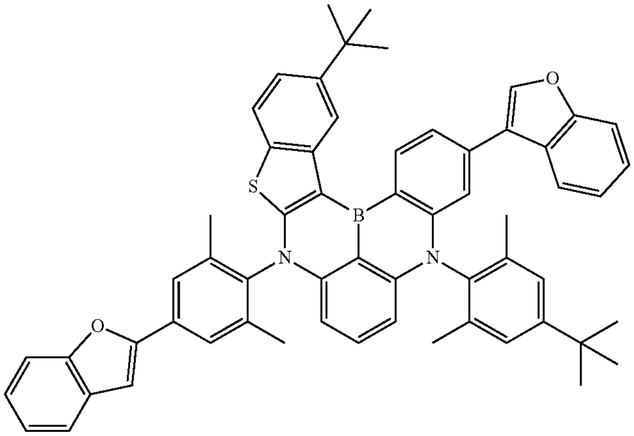
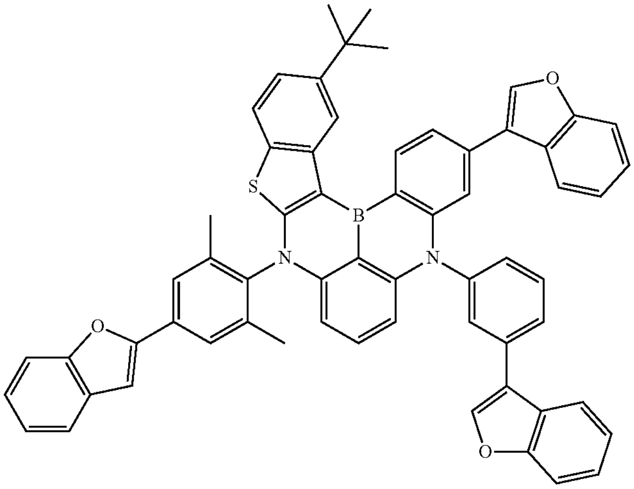

-continued
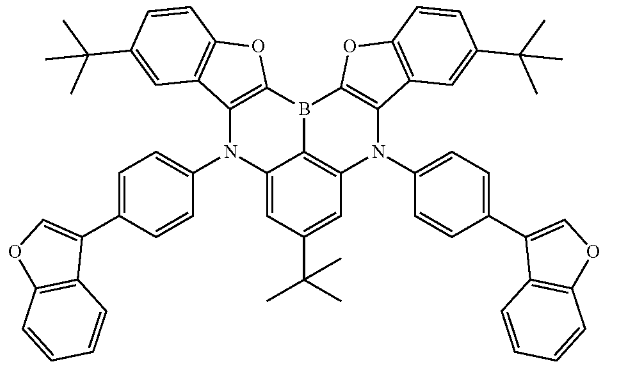
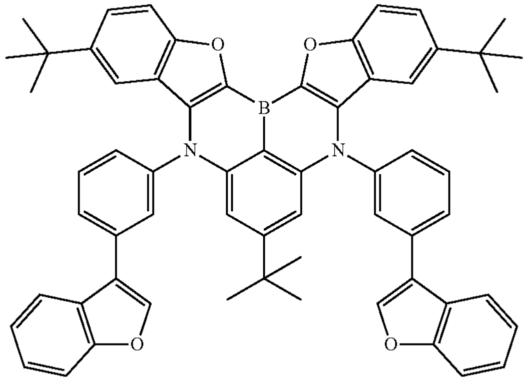
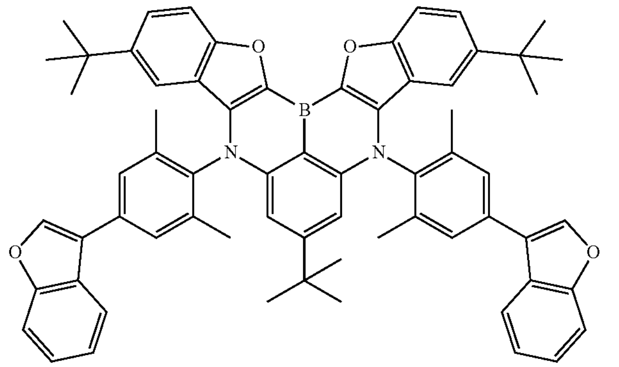
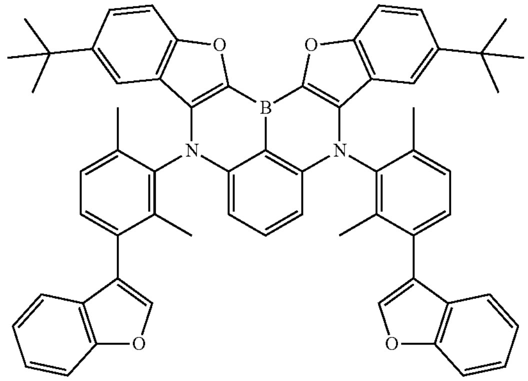
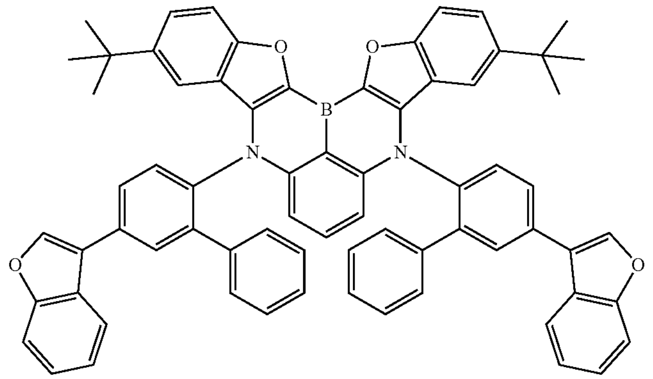
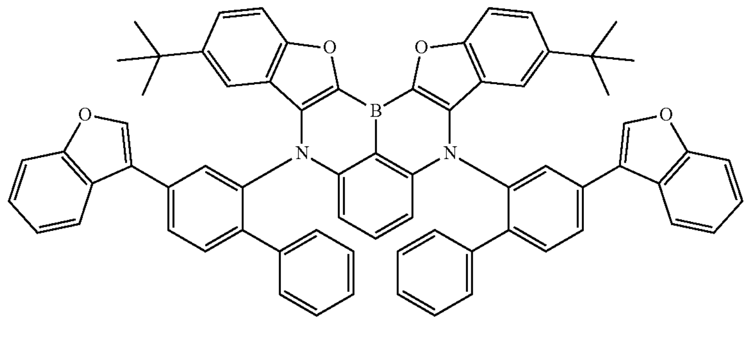

-continued
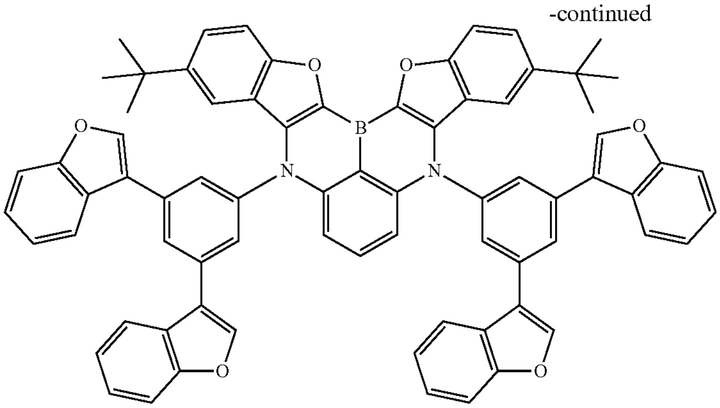
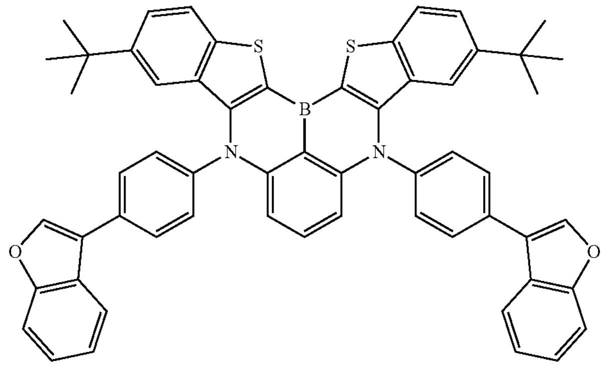
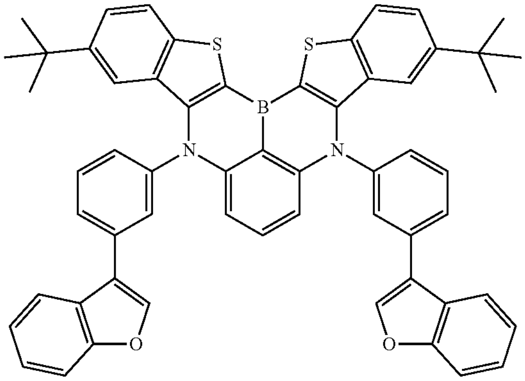
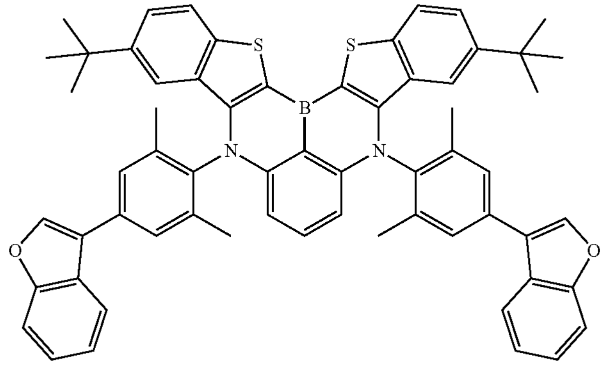
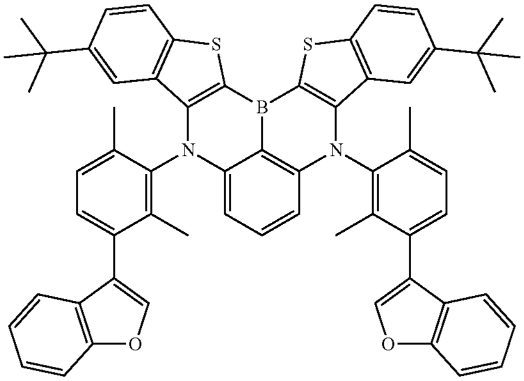
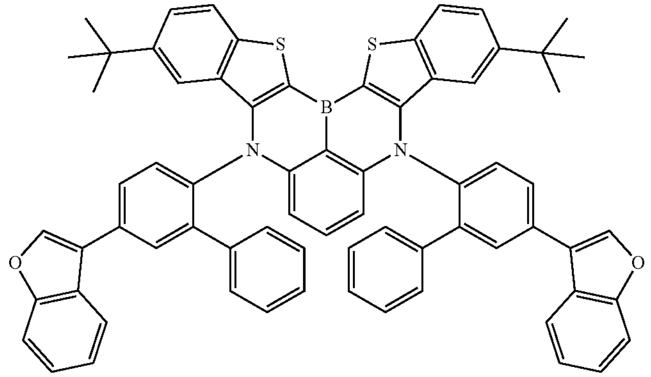

-continued
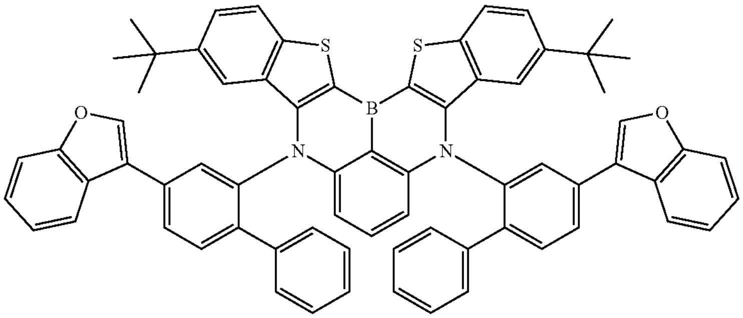
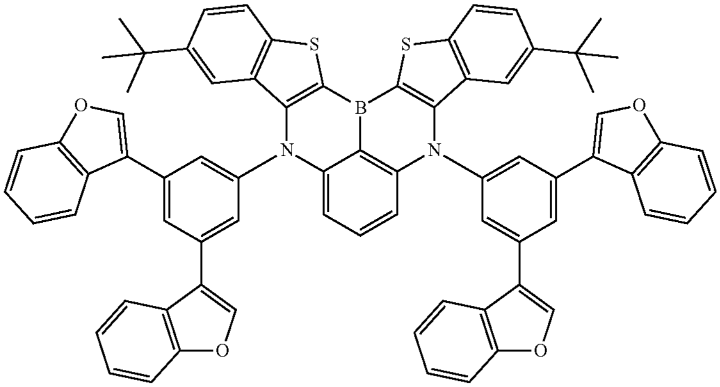
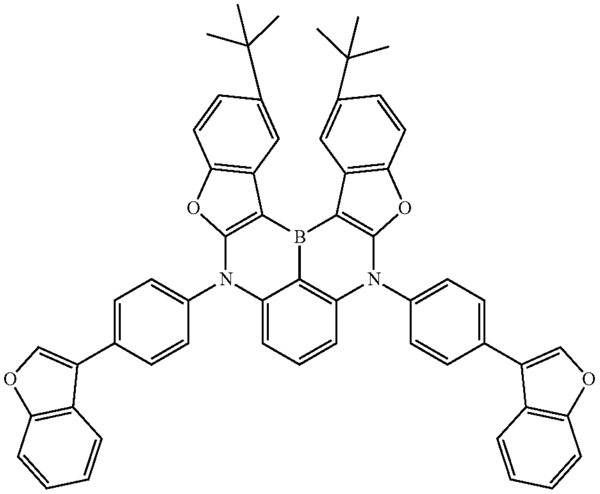
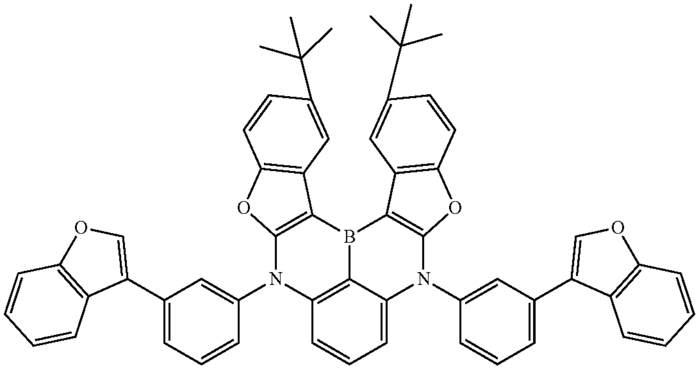

-continued
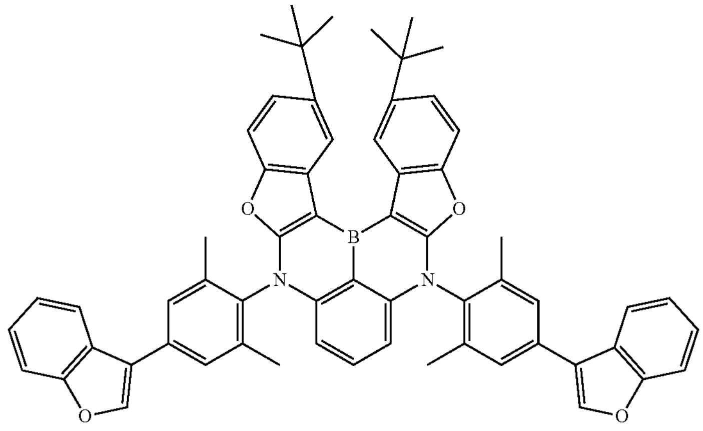
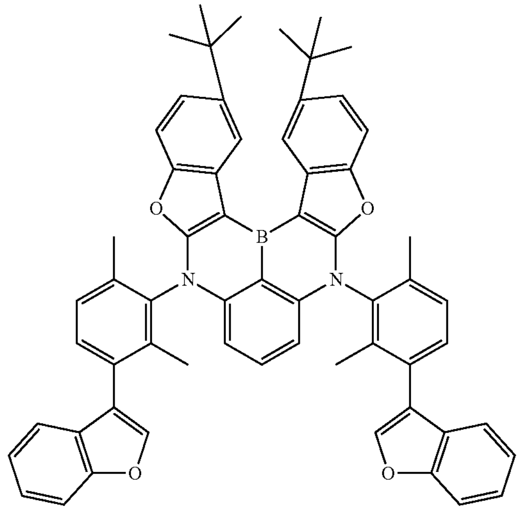
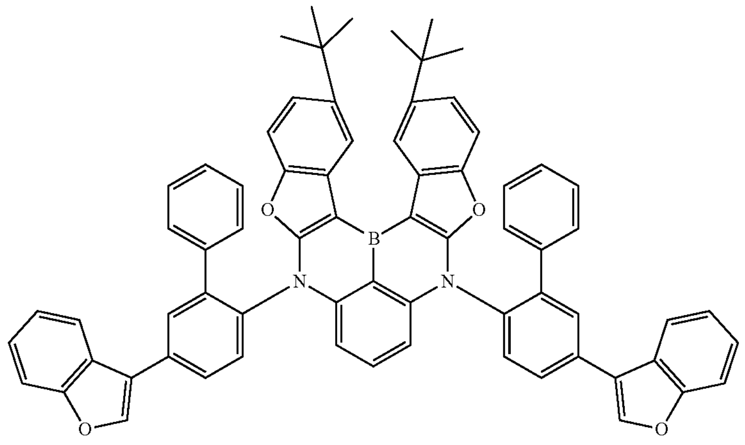

-continued
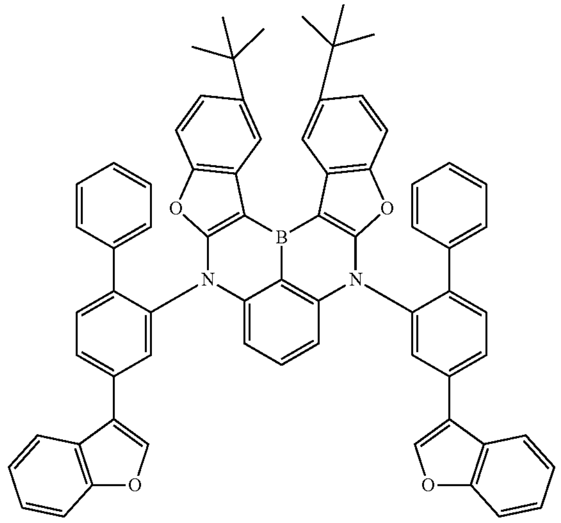
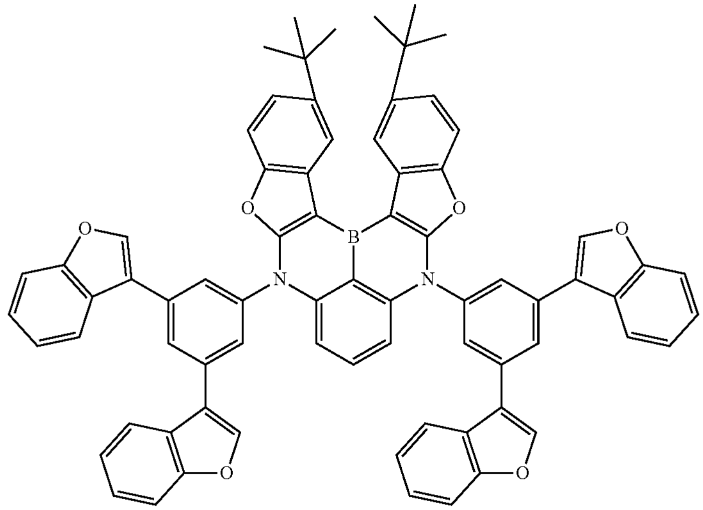
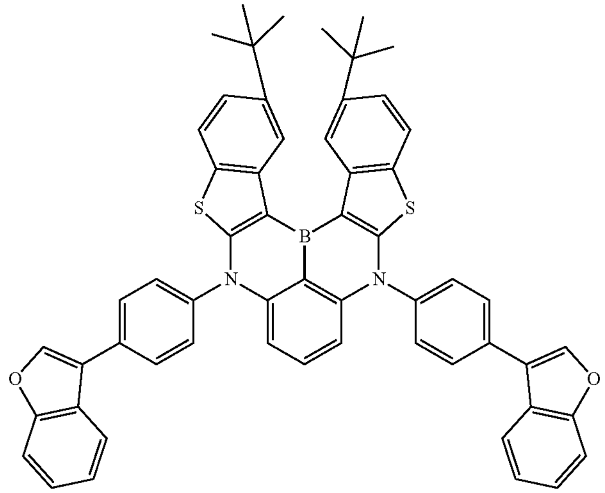

-continued
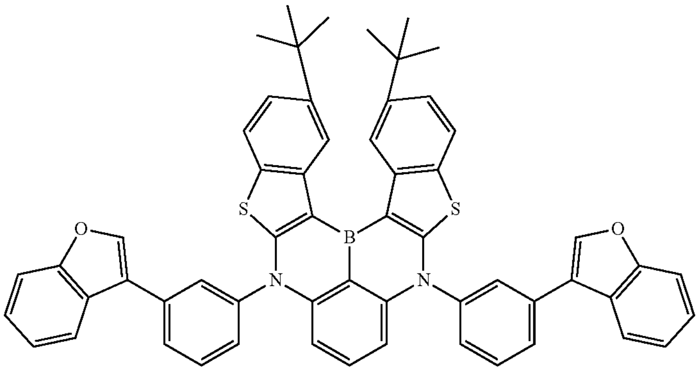
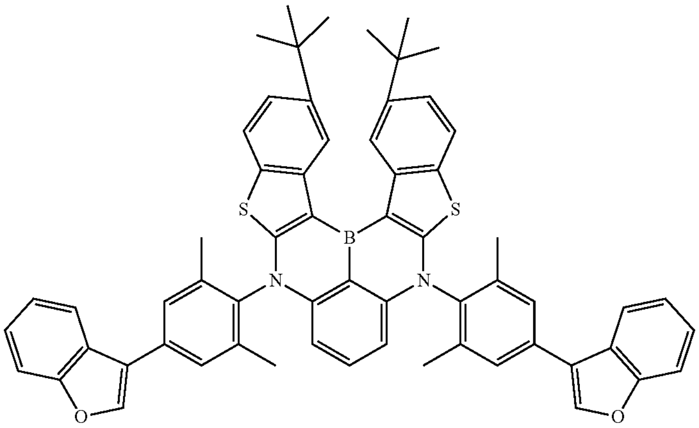
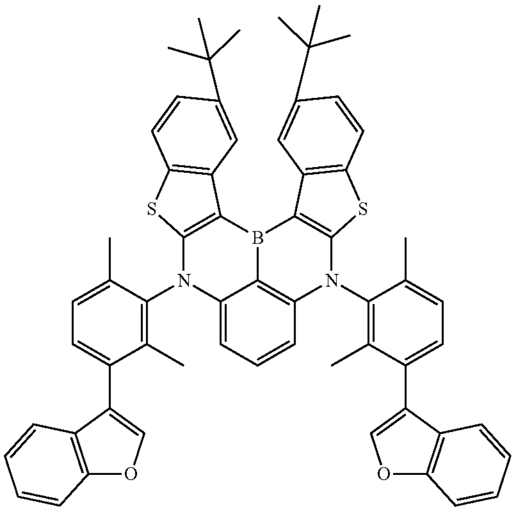

-continued
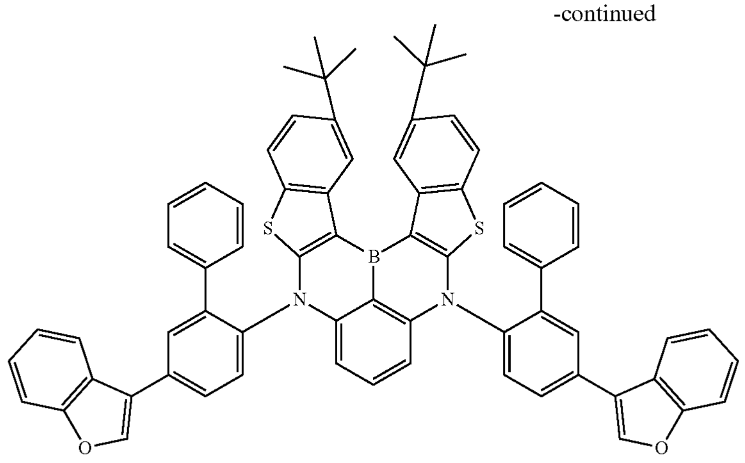
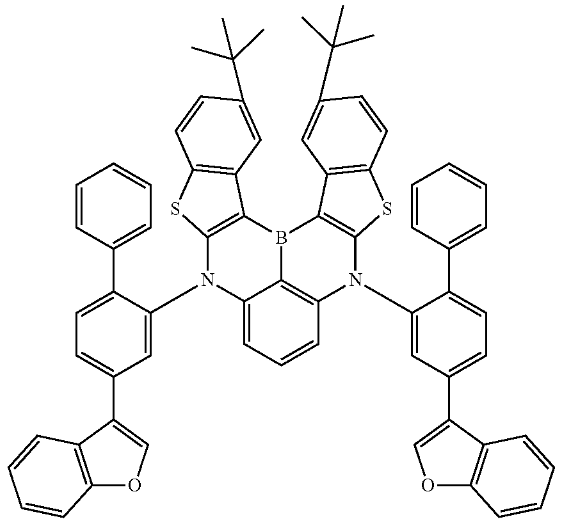
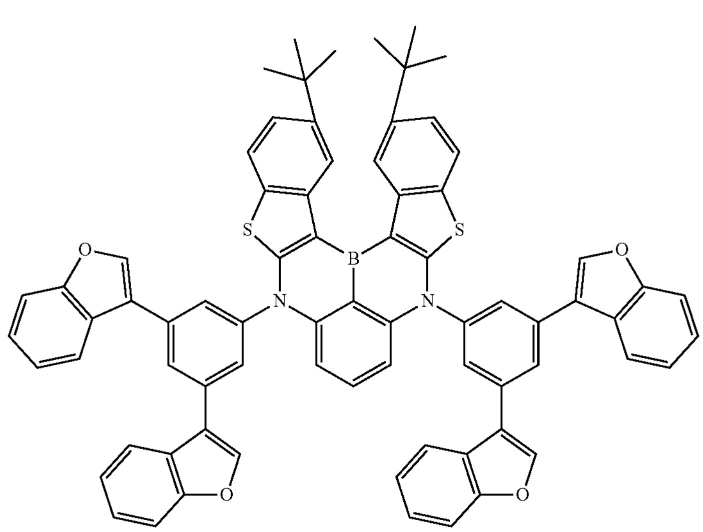

-continued
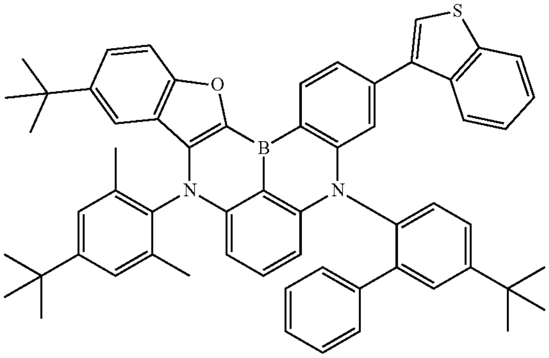
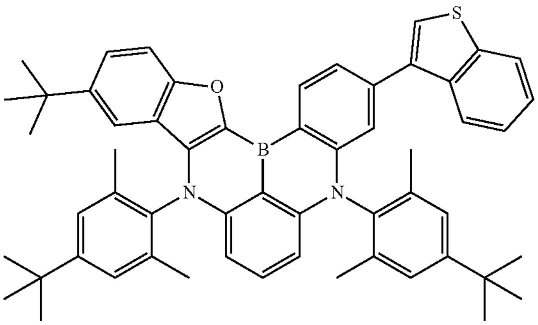
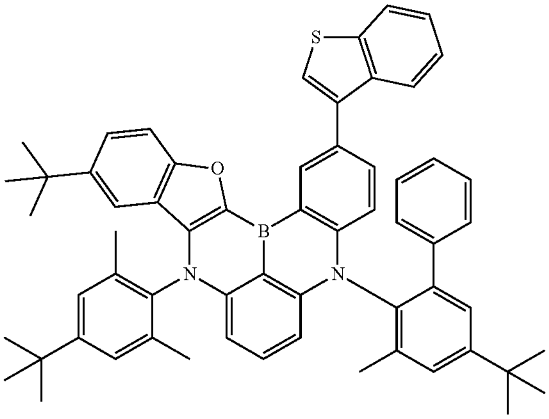
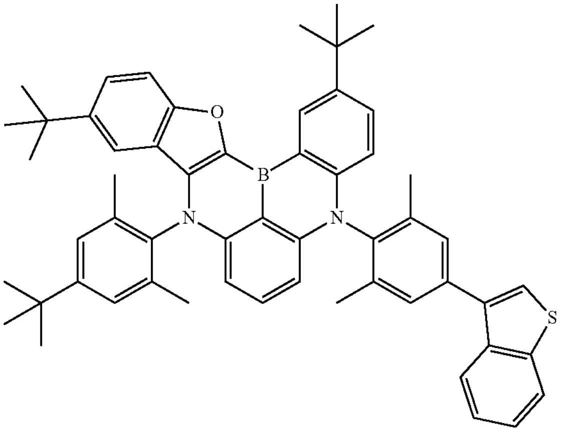
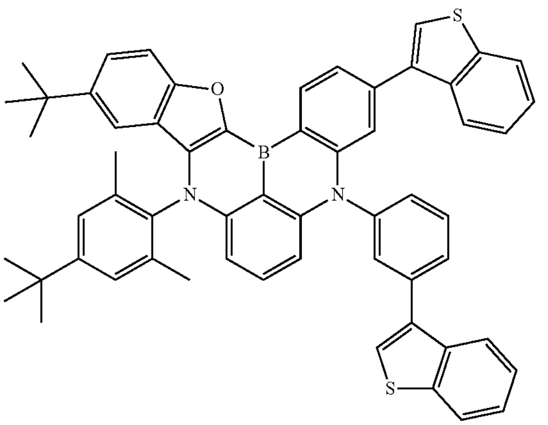
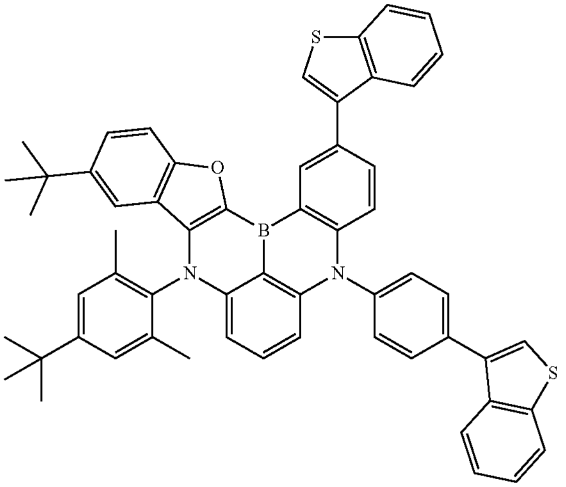
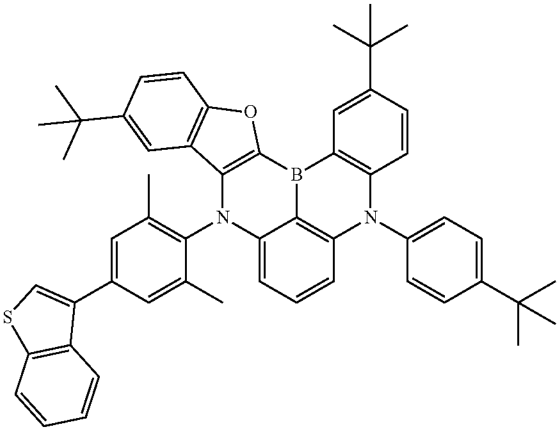
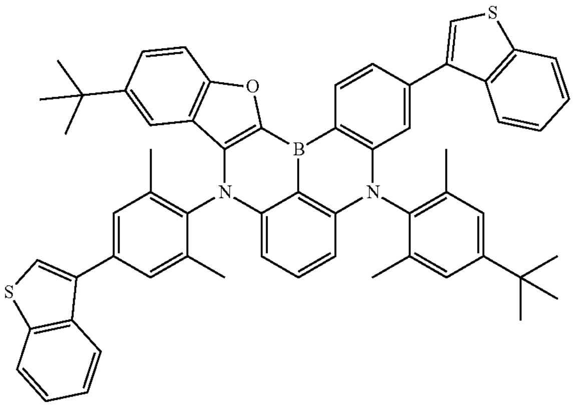

-continued
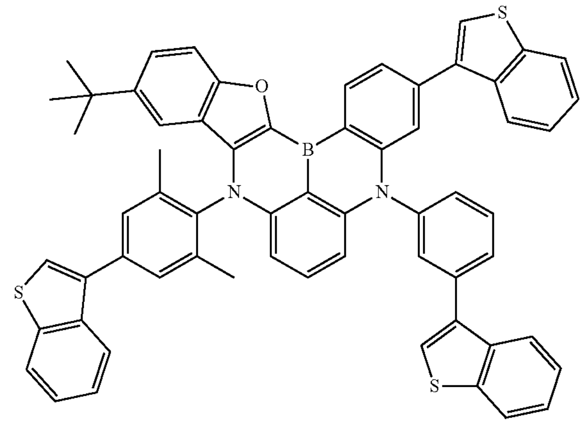
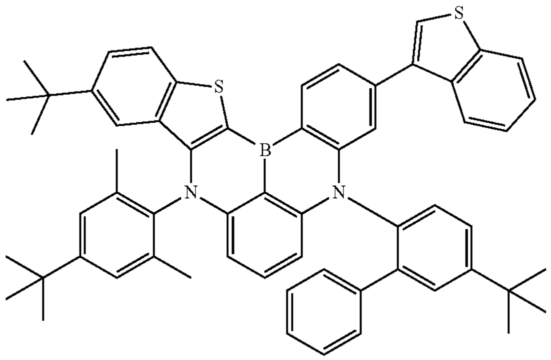
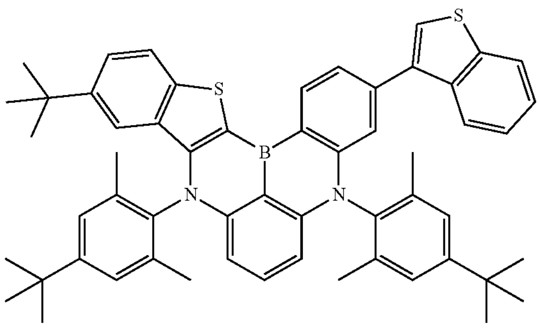
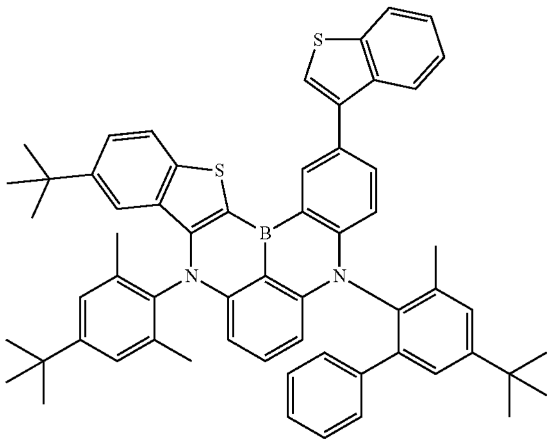
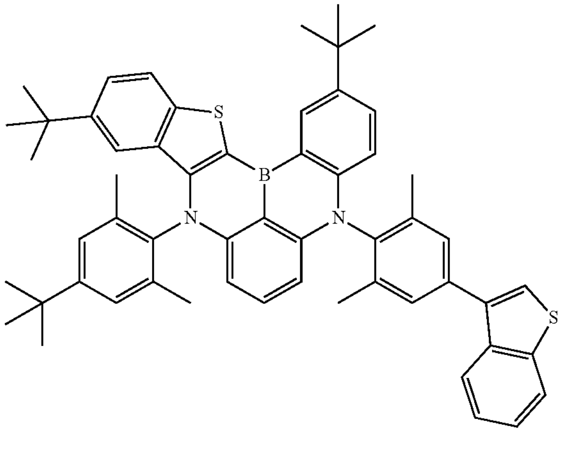
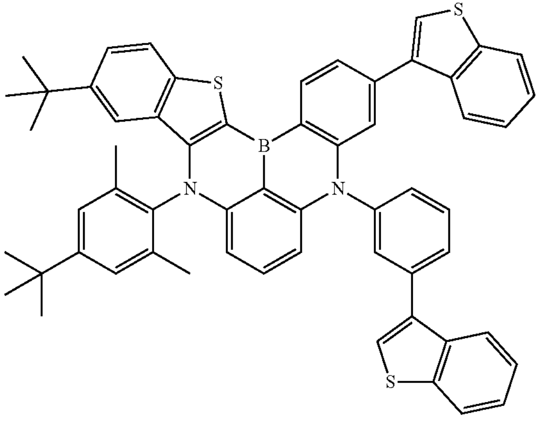

-continued
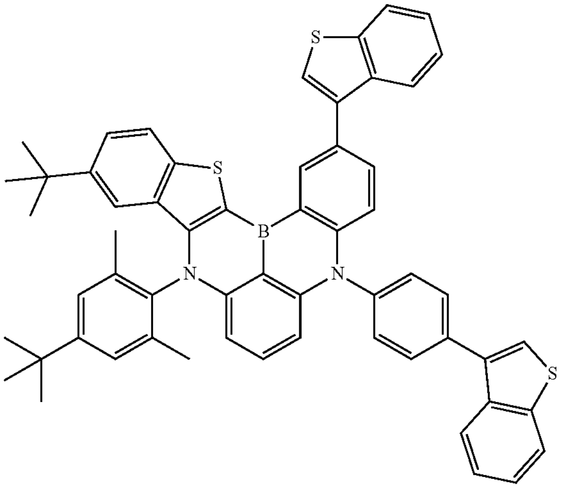
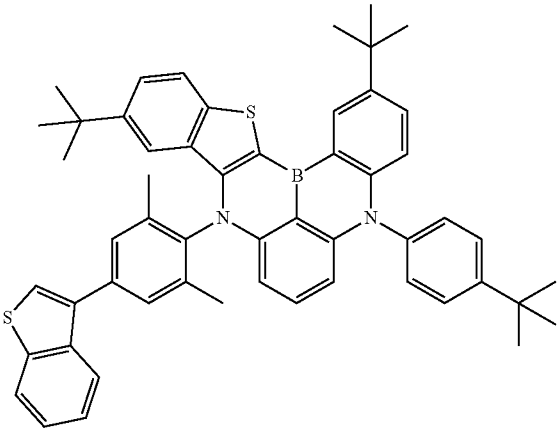
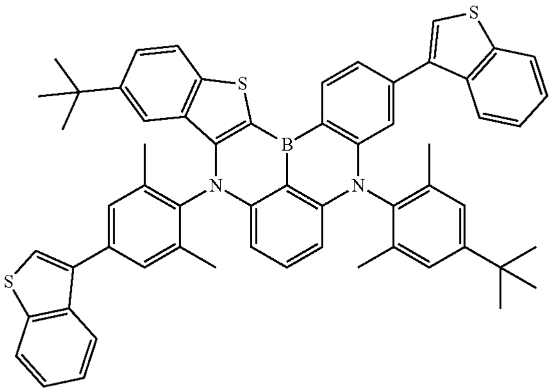
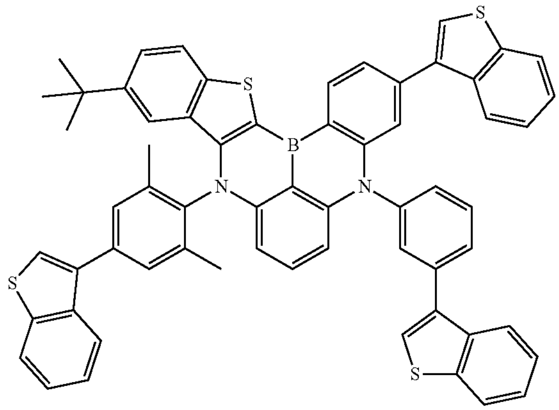
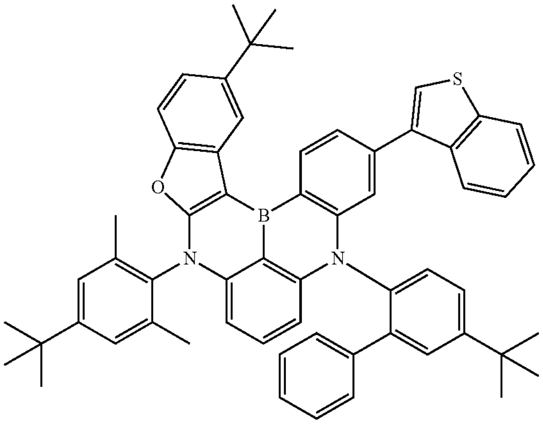
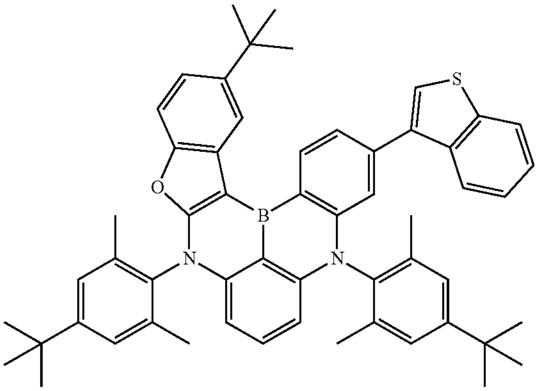

-continued
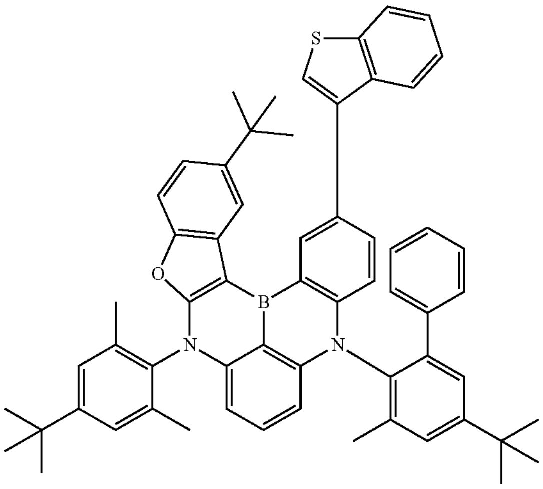
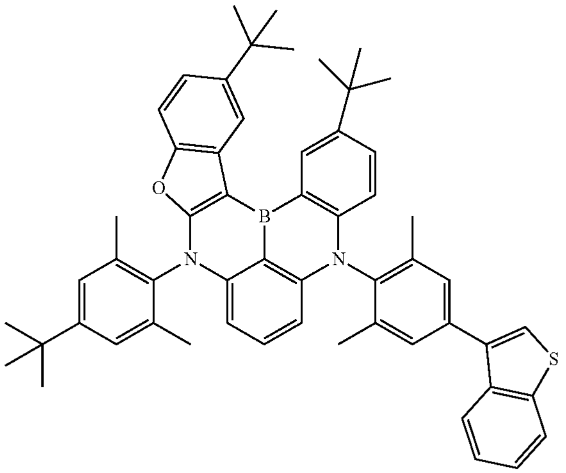
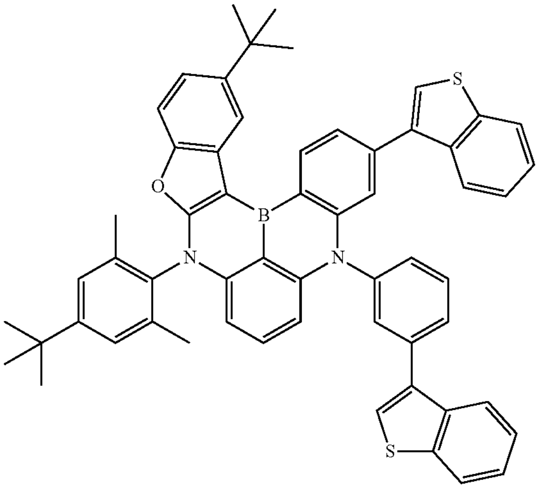
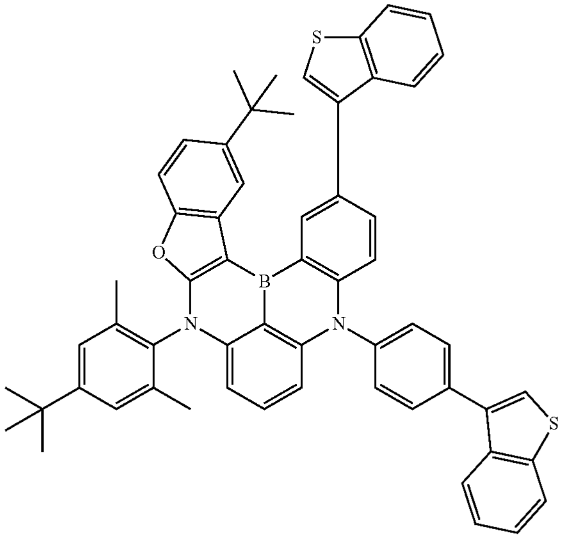
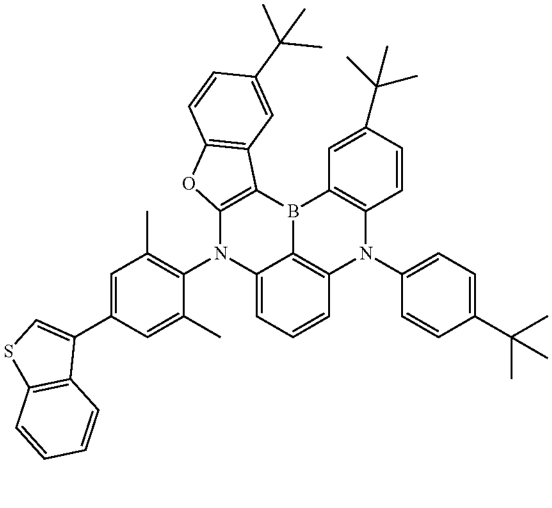
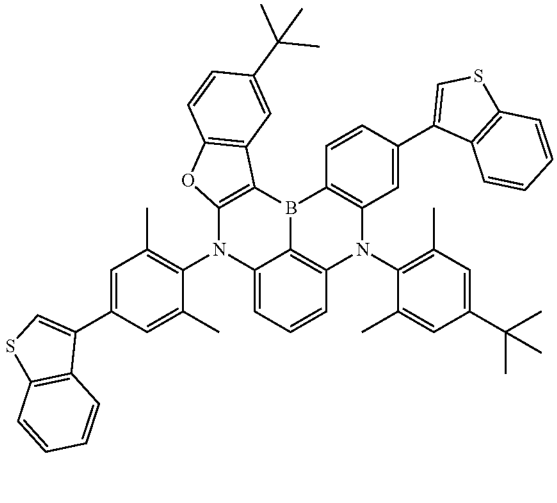

-continued
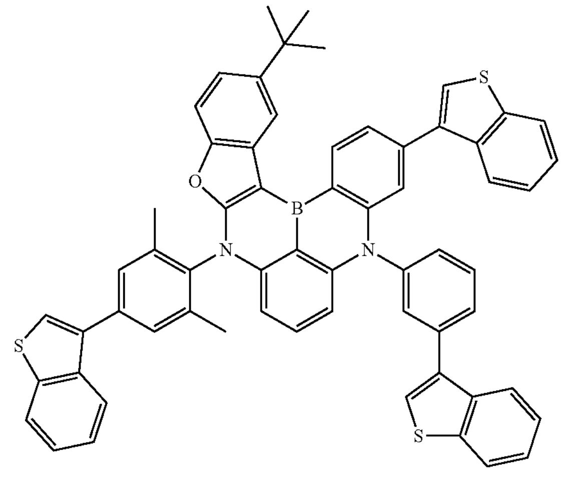
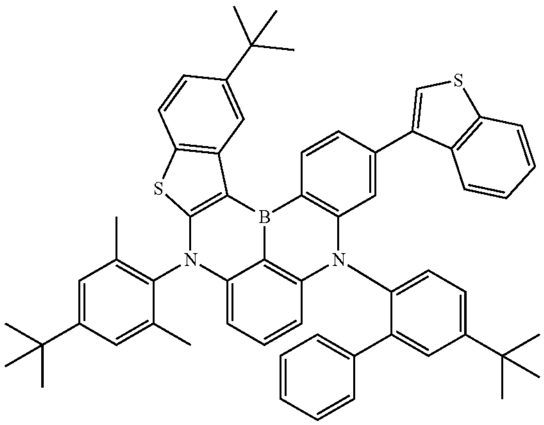
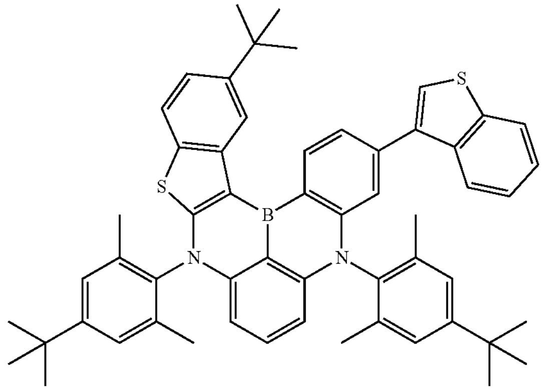
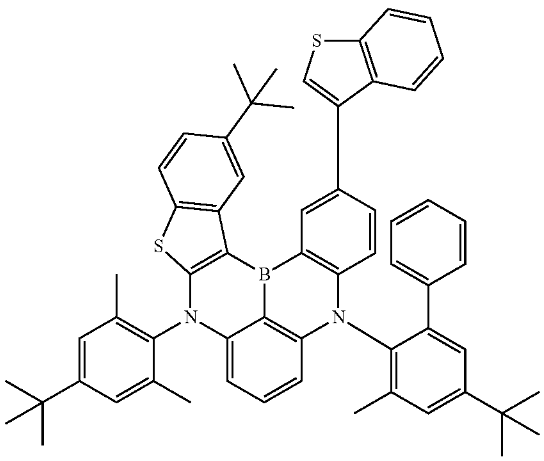
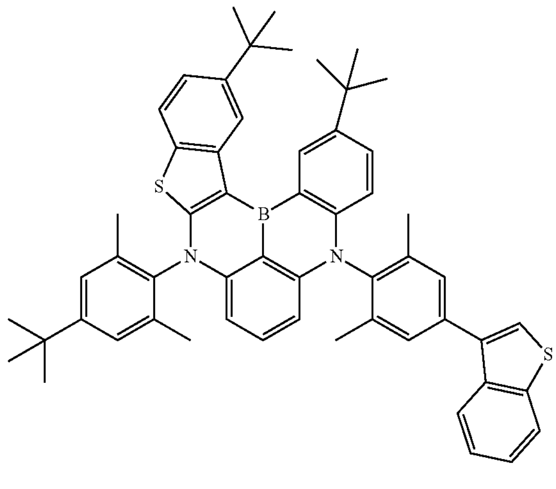
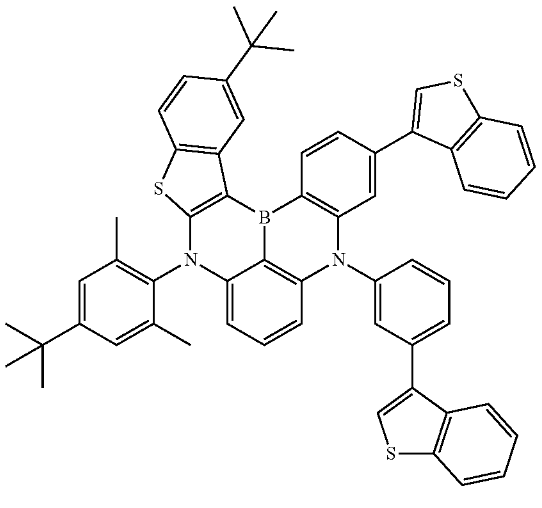

-continued
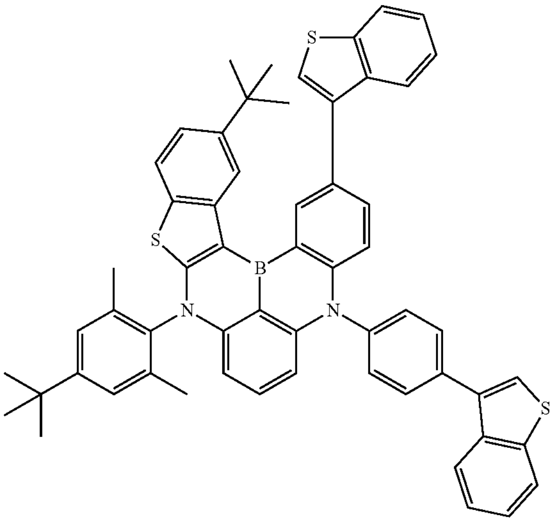
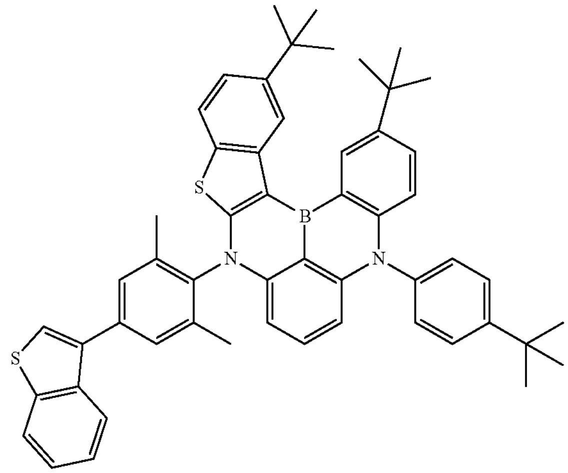
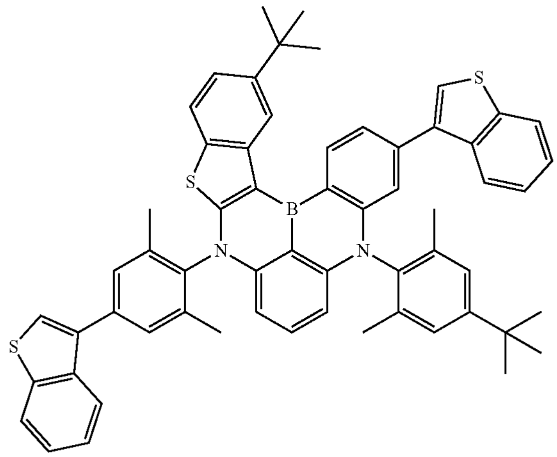
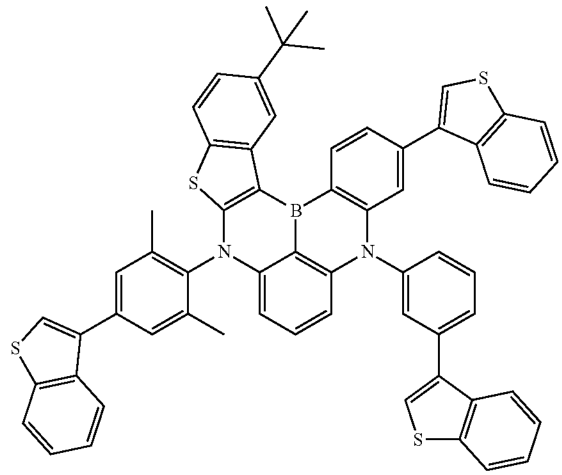
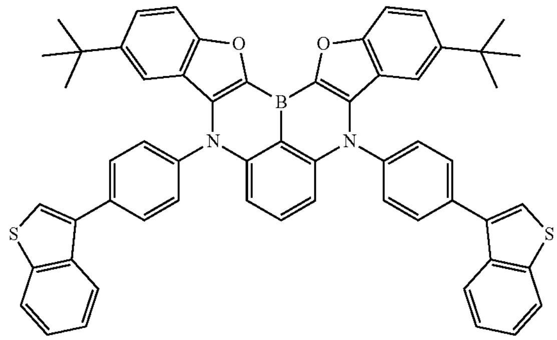
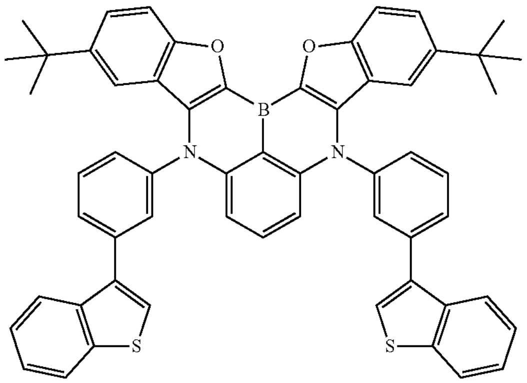

-continued
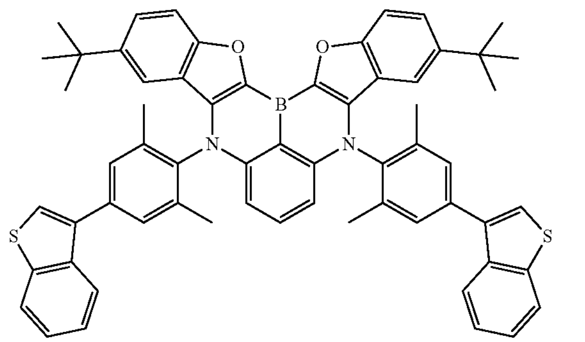
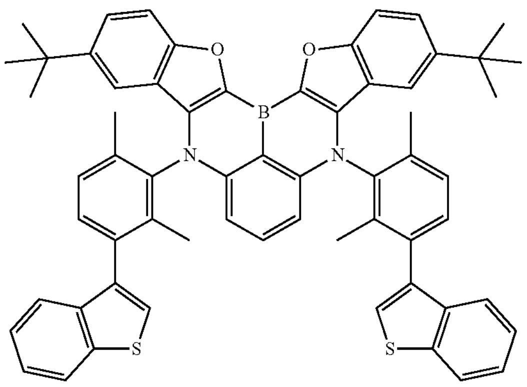
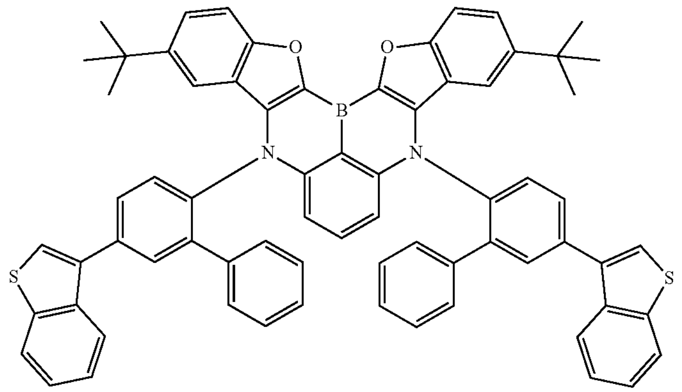
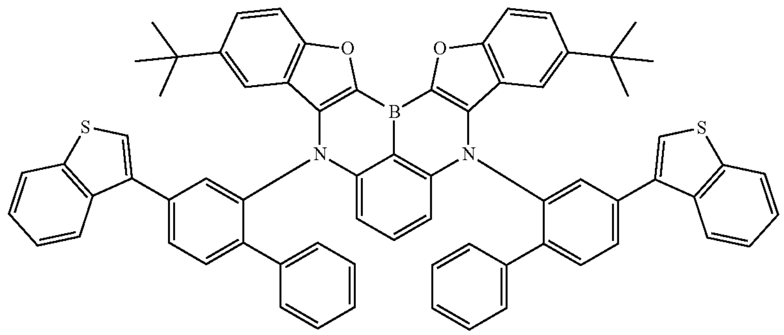
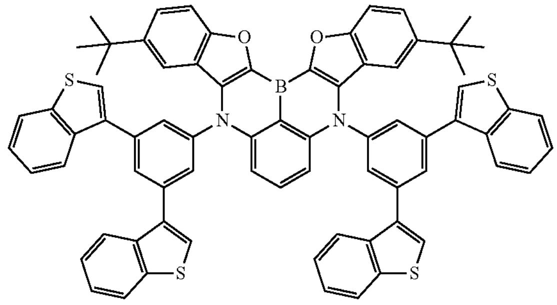
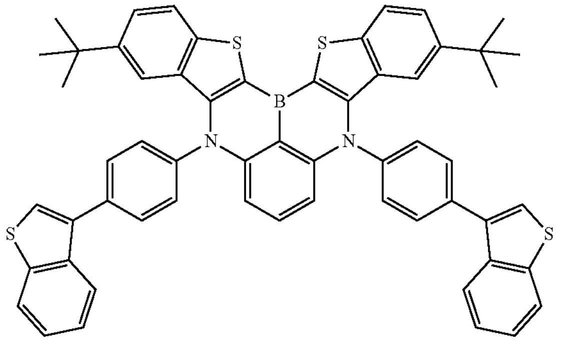

-continued
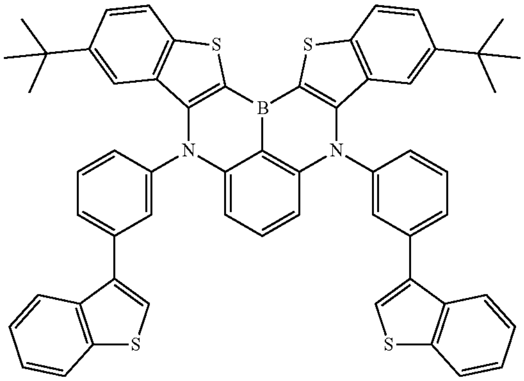
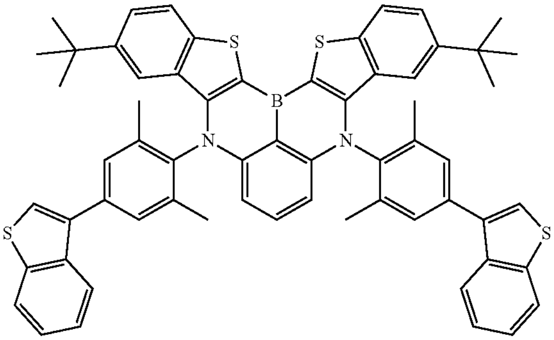
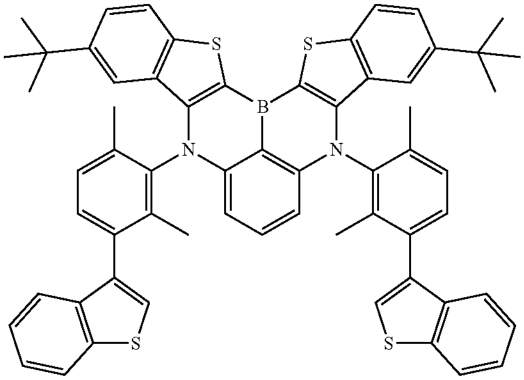
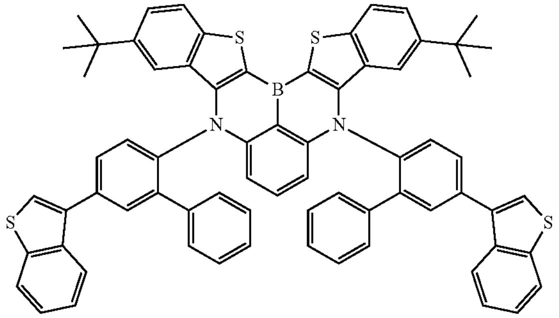
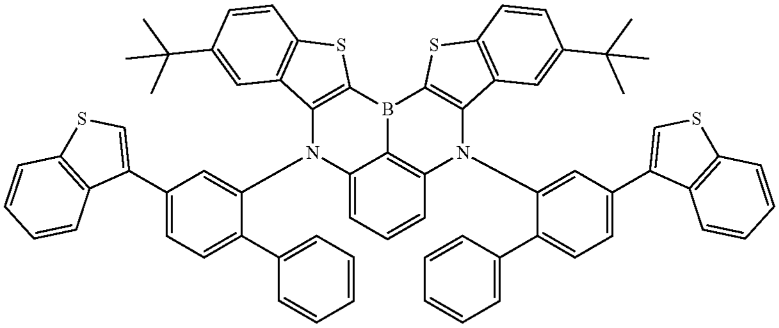
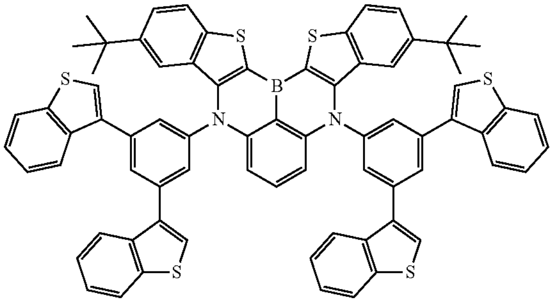
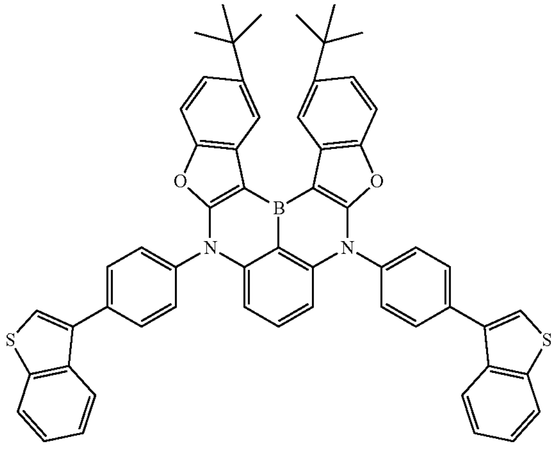

-continued
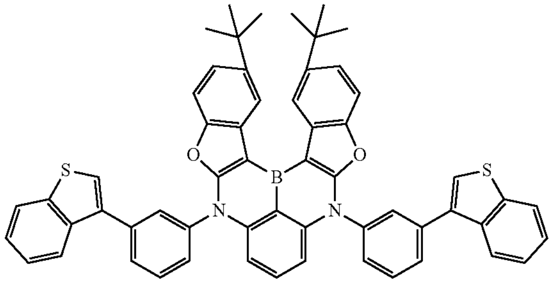
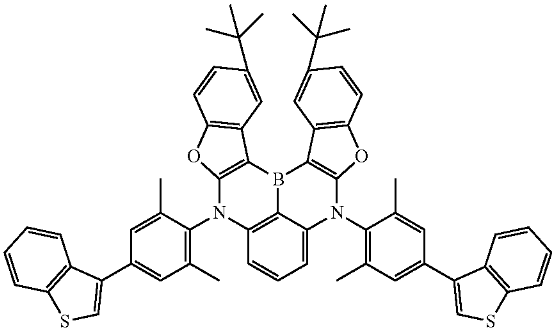
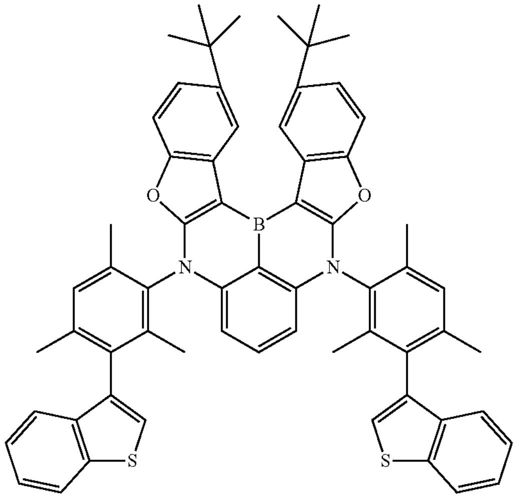
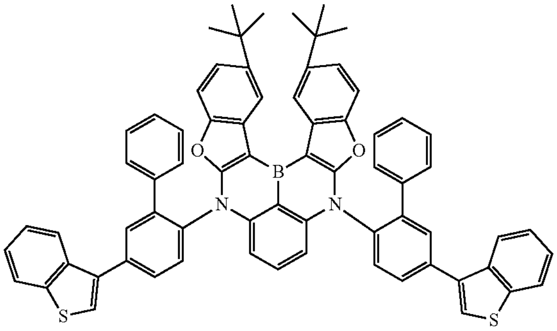
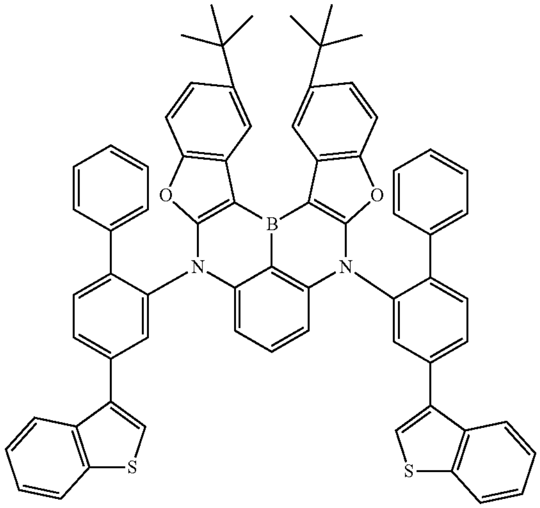
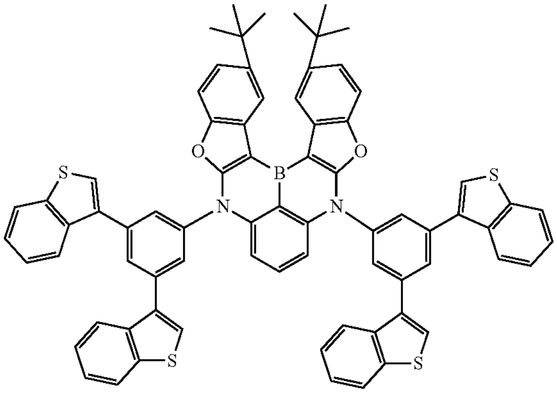

-continued
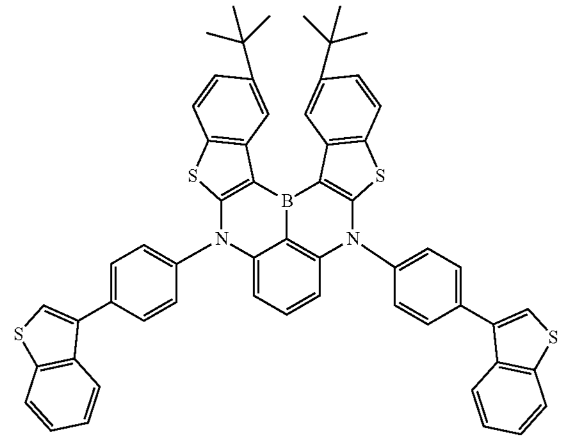
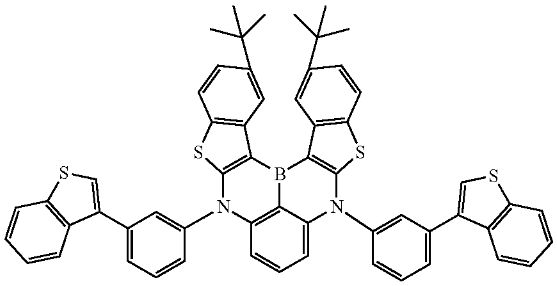
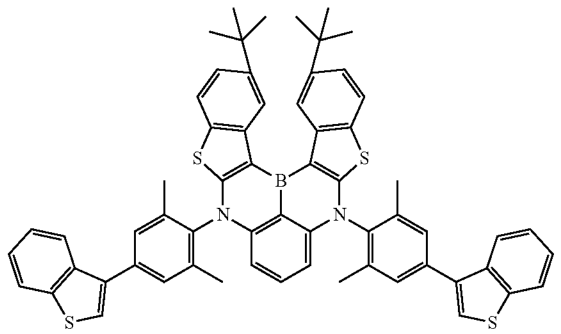
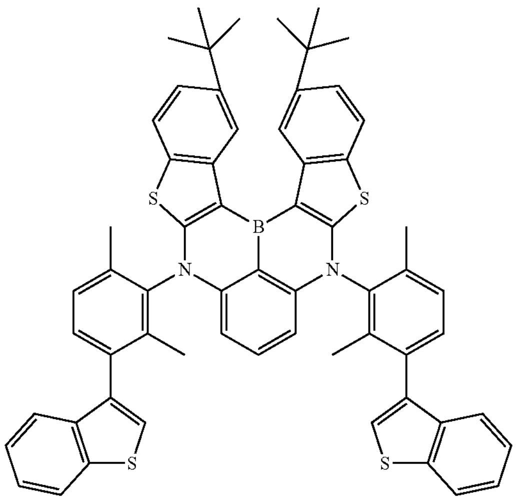
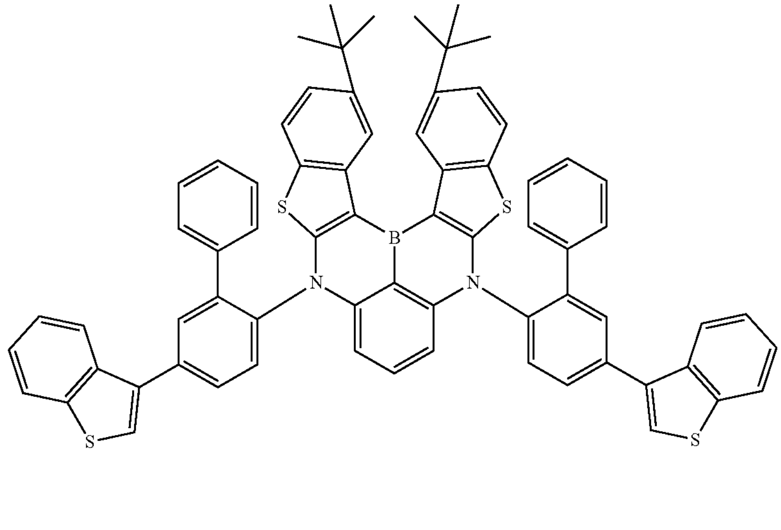

-continued
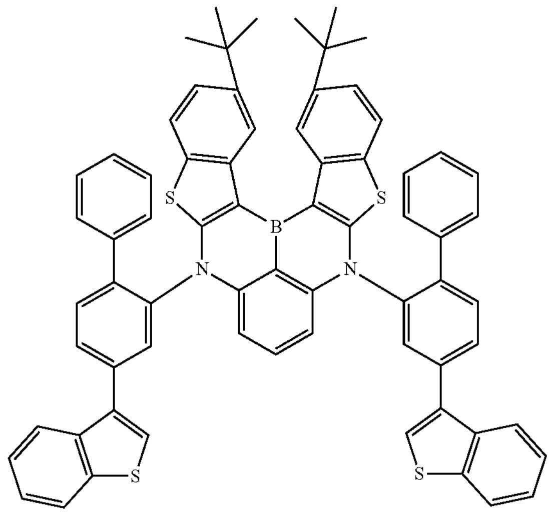
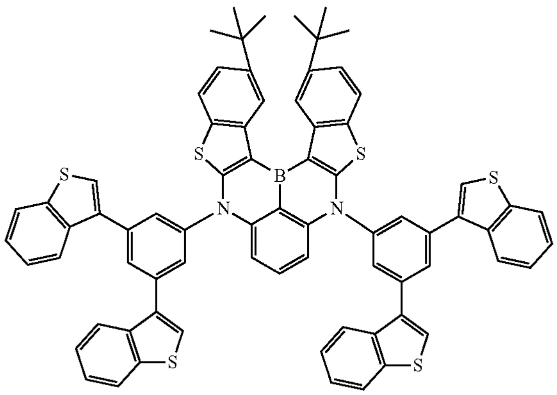
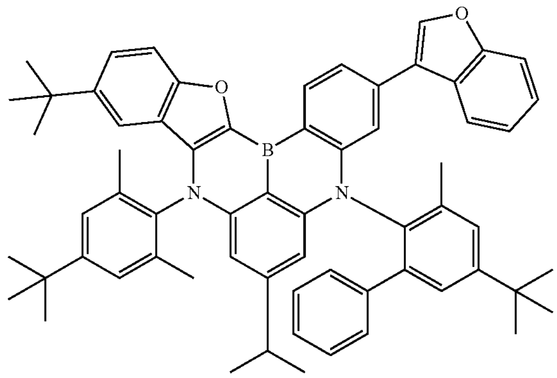
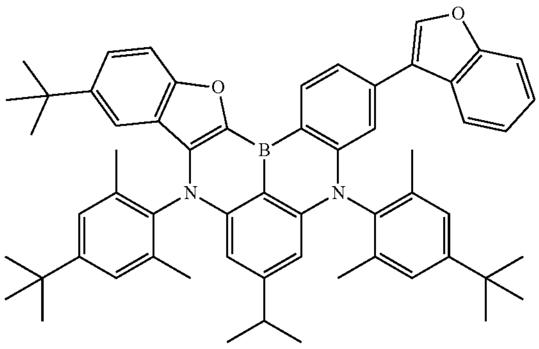
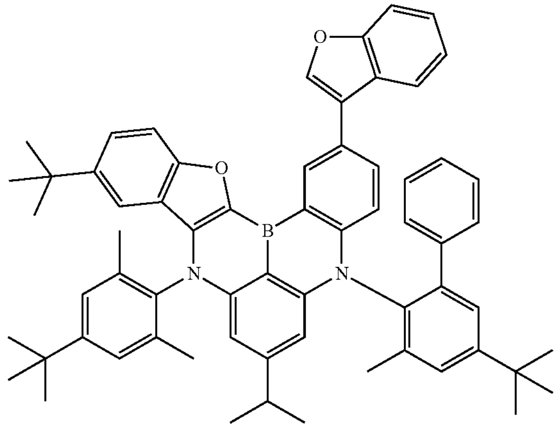
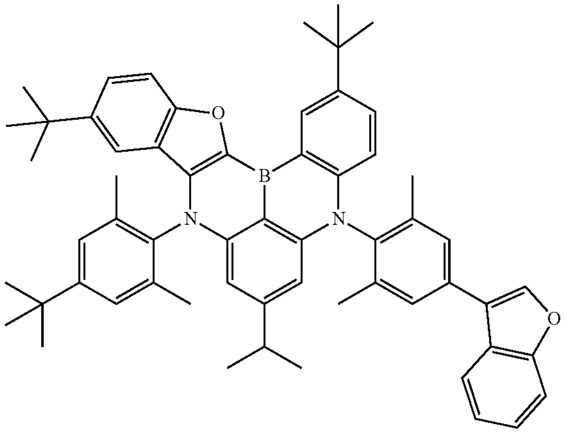

-continued
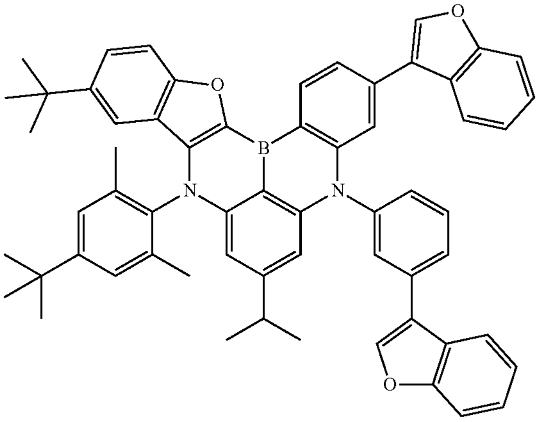
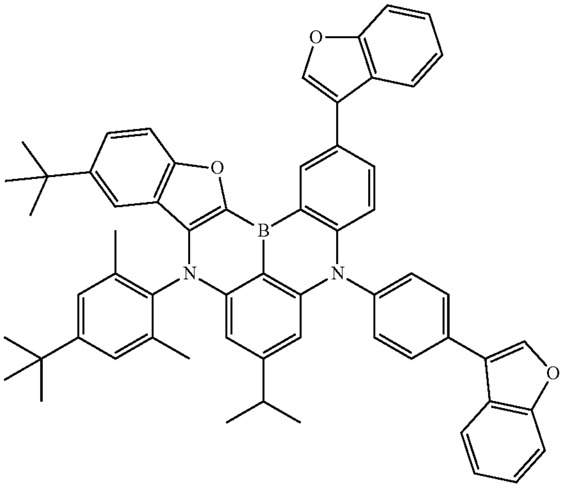
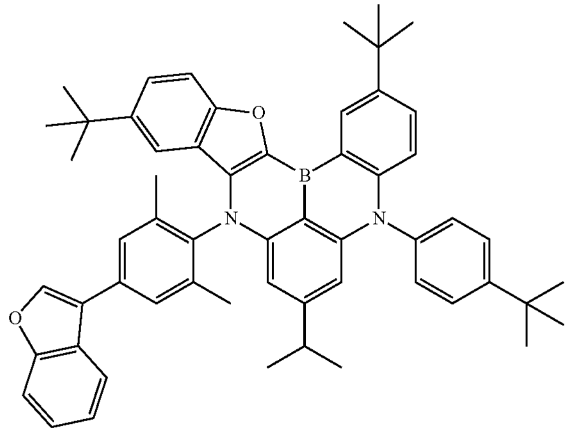
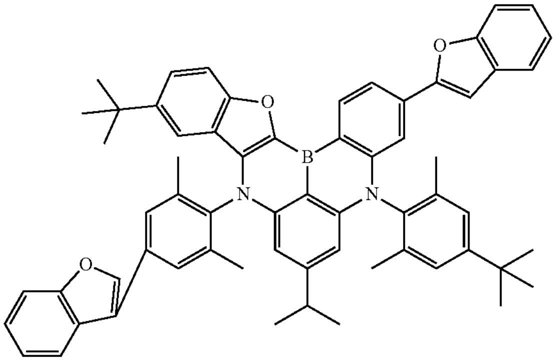
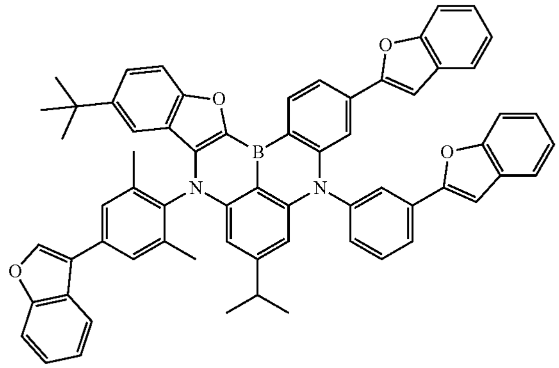
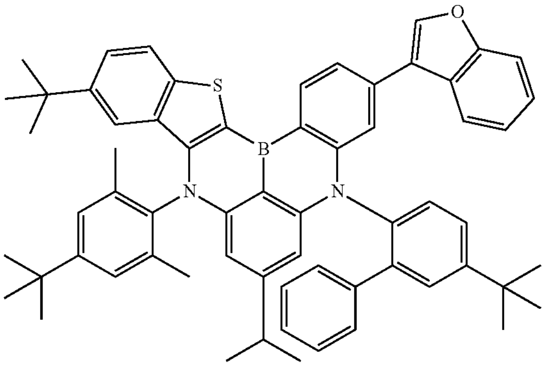
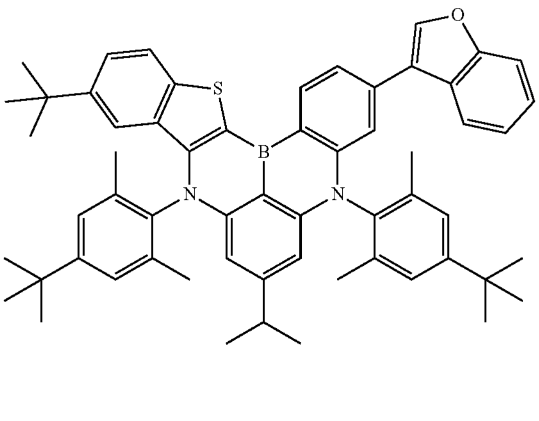
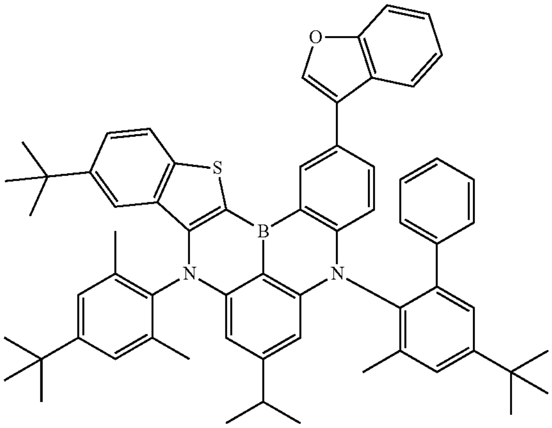

-continued
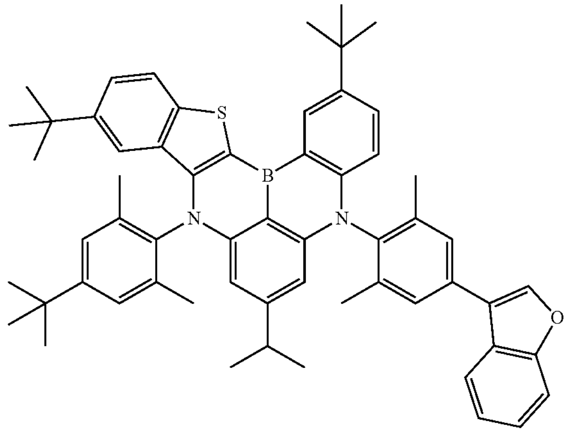
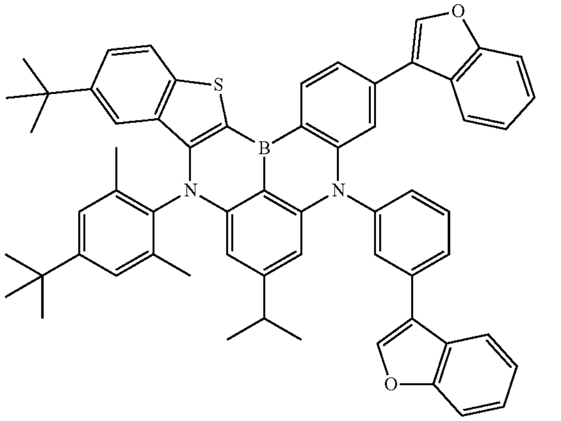
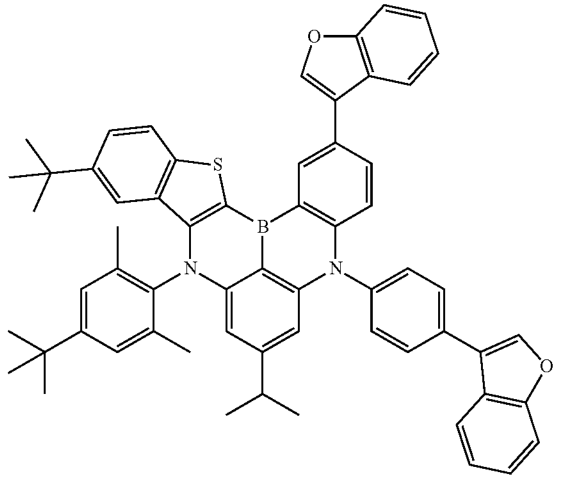
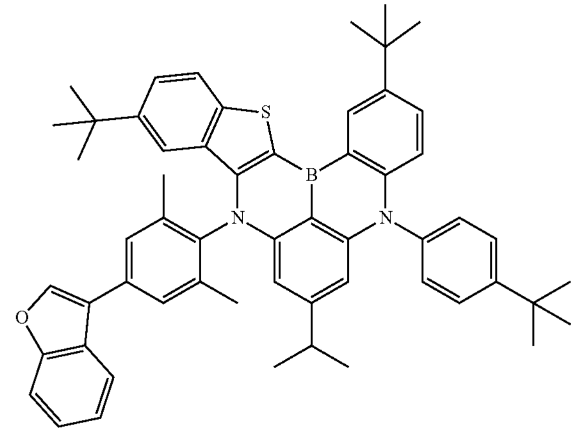
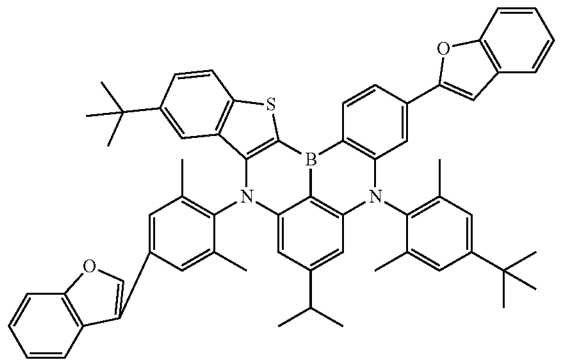
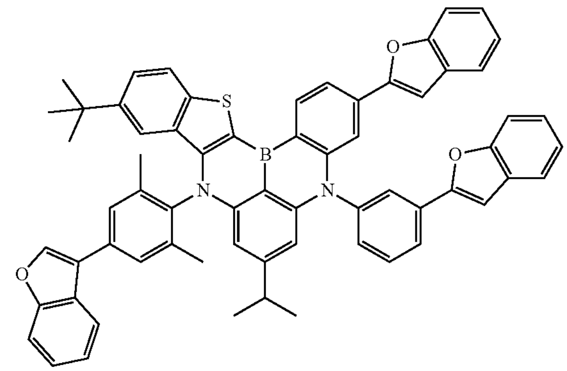
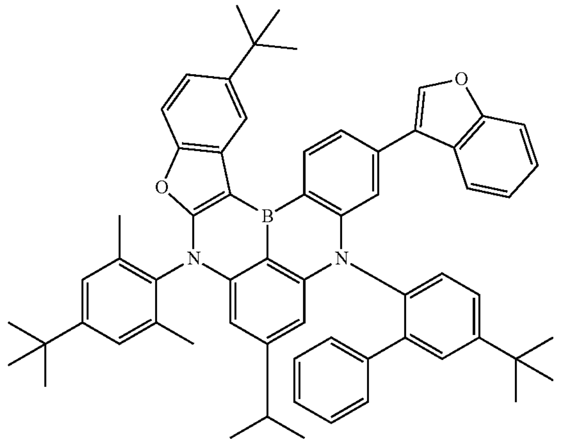
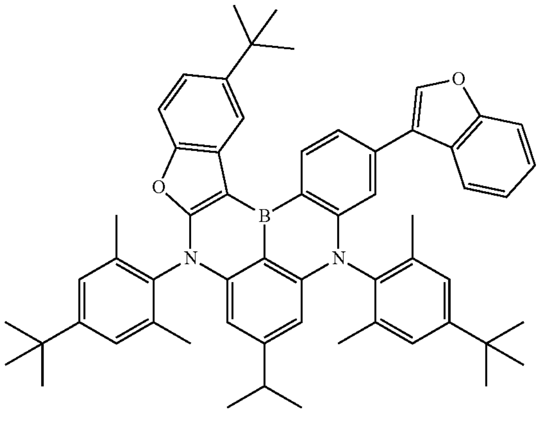

-continued
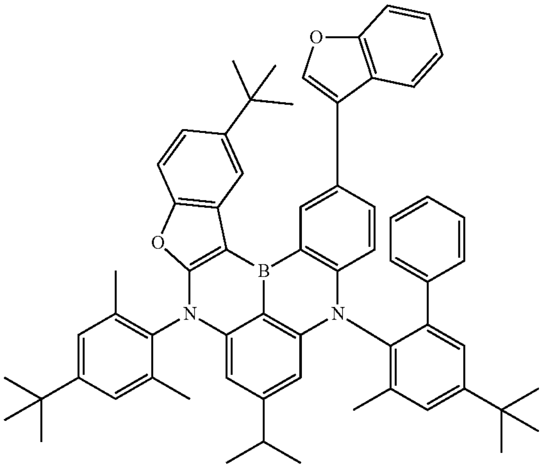
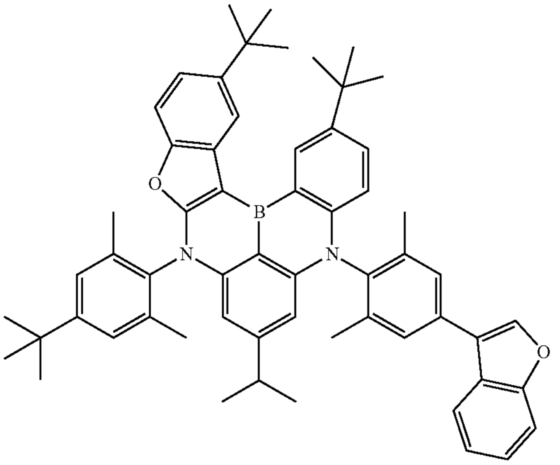
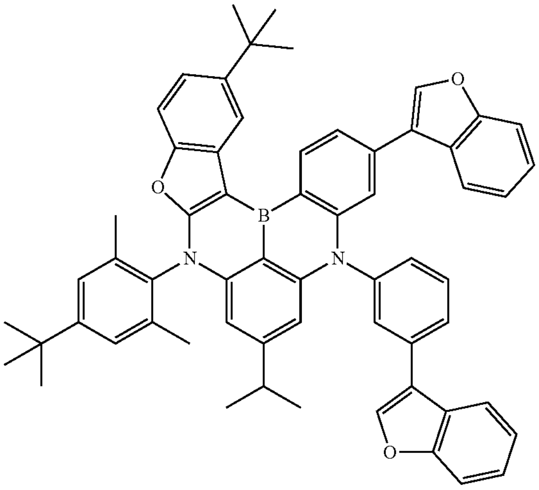
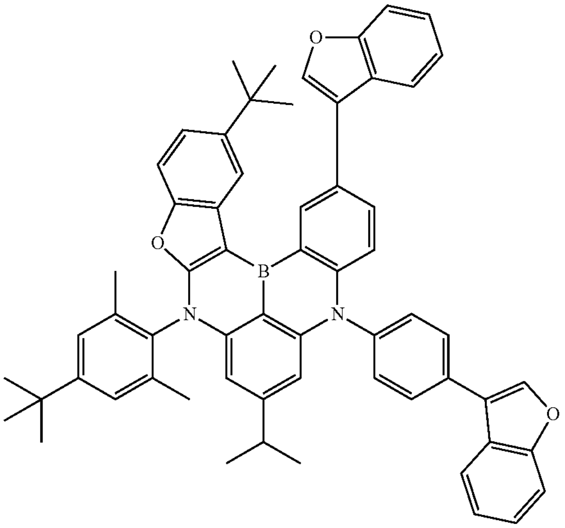
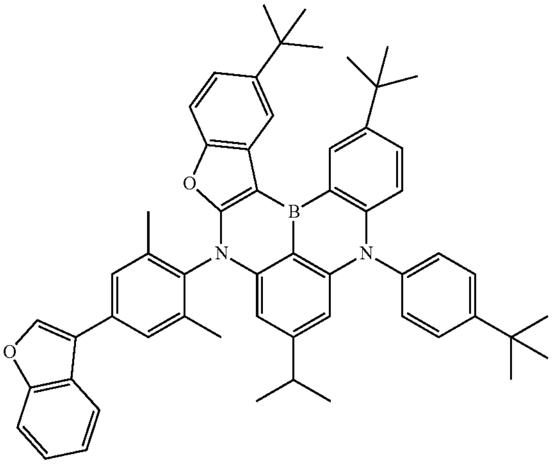
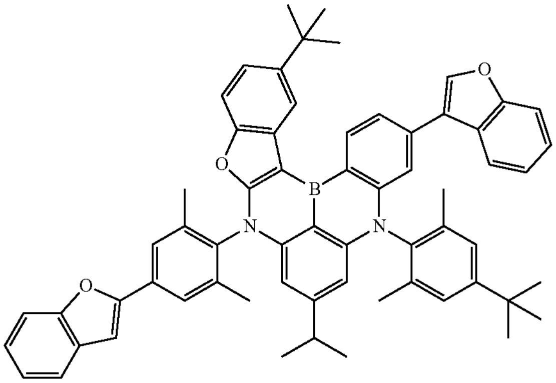

-continued
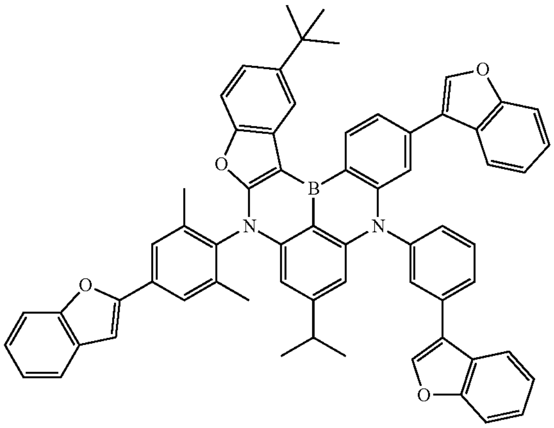
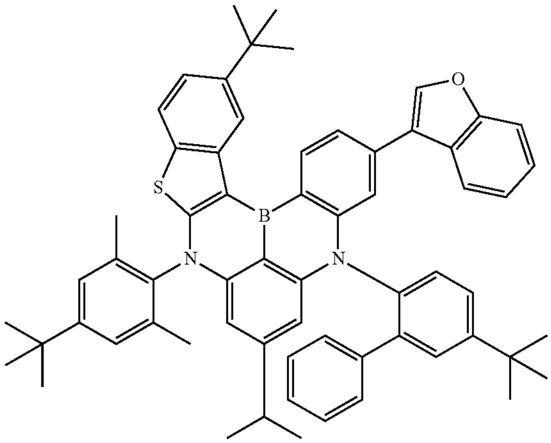
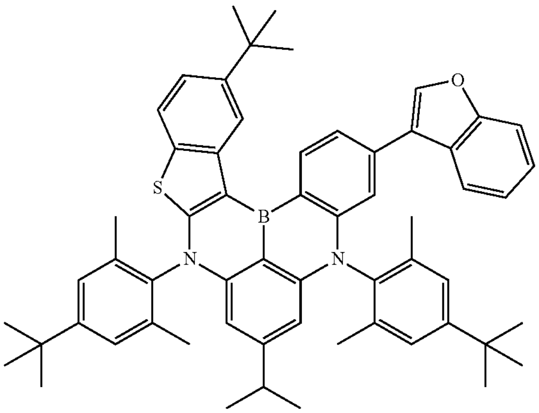
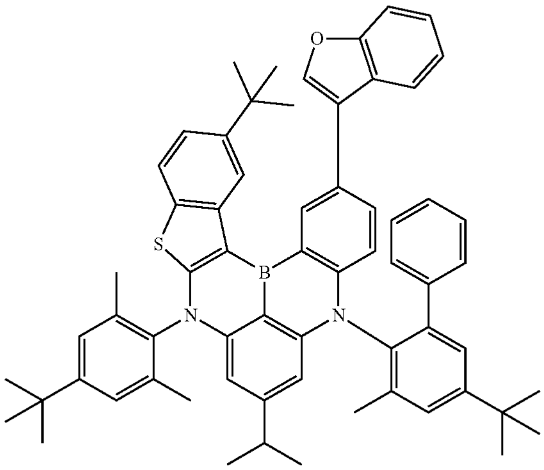
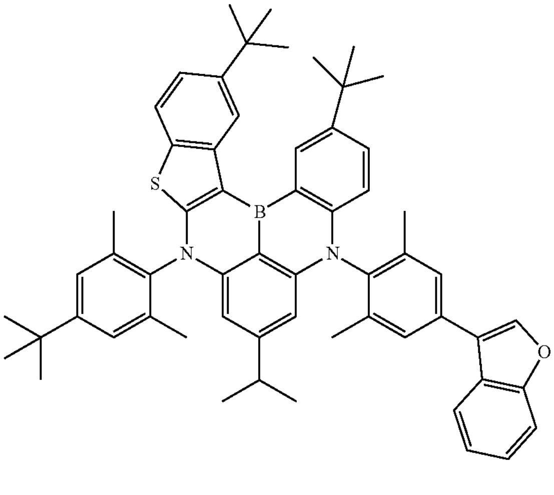
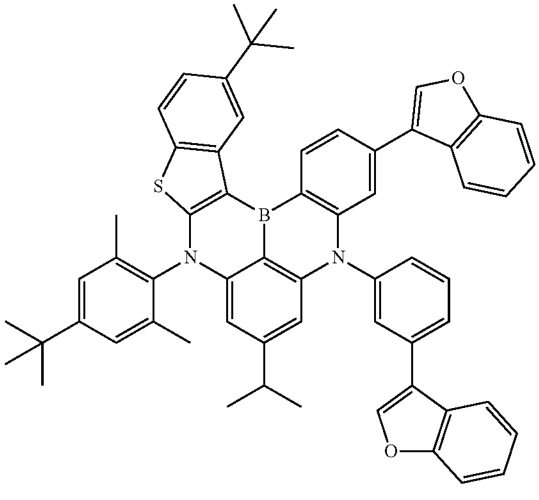

-continued
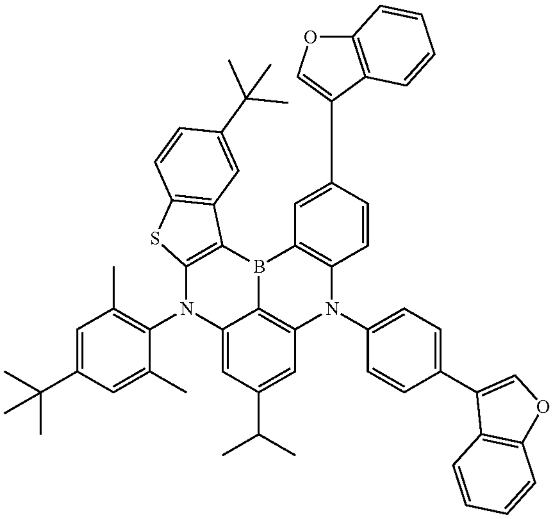
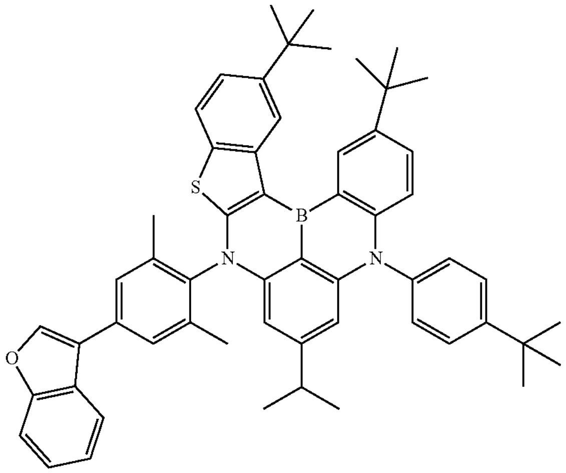
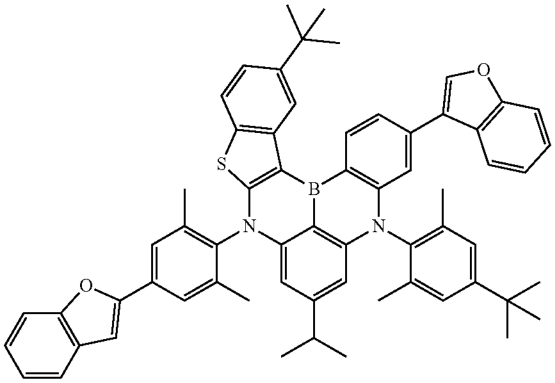
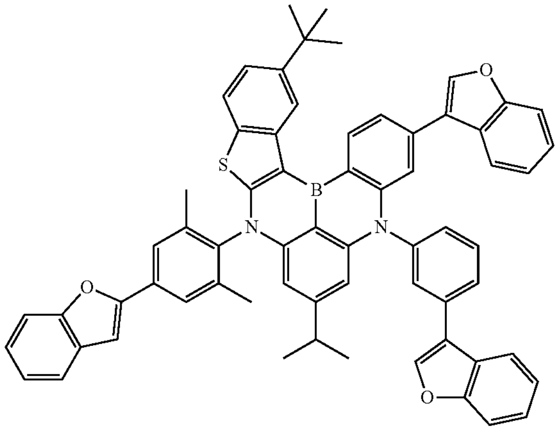
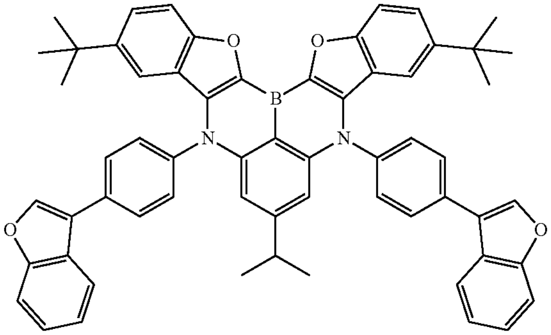
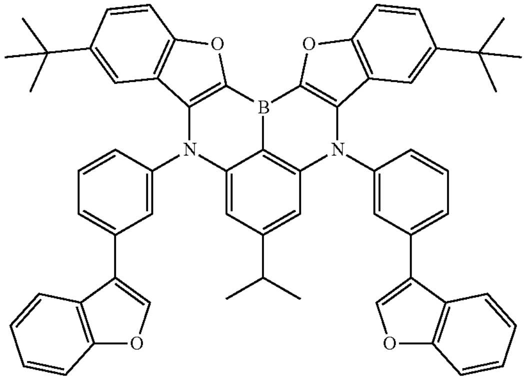
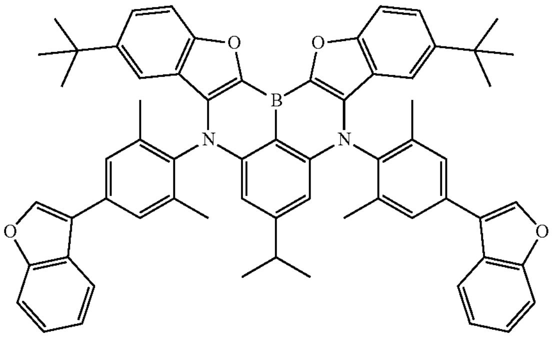
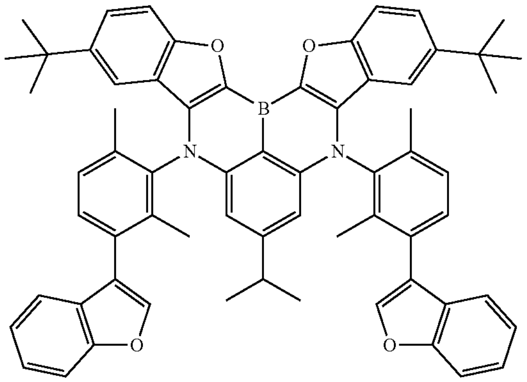

-continued
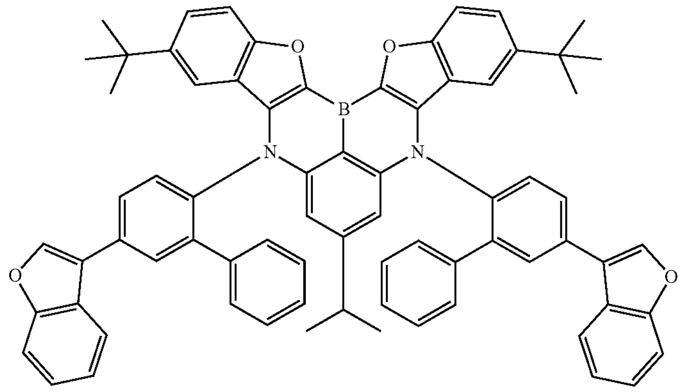
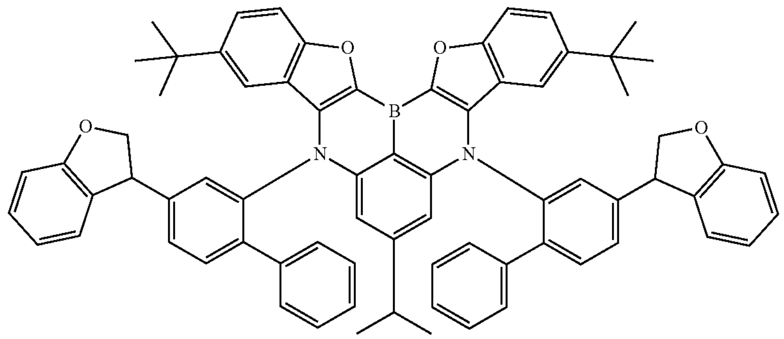
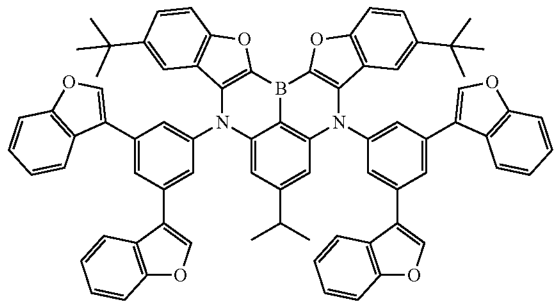
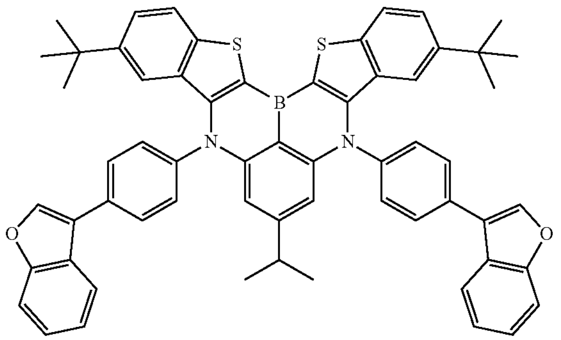
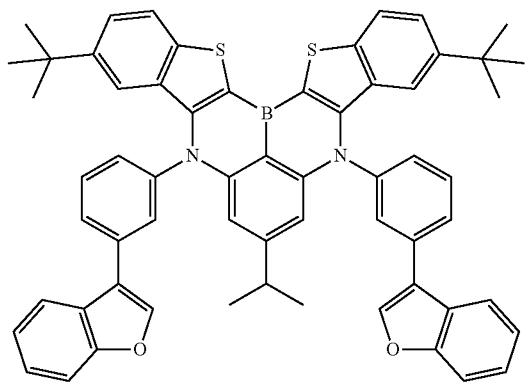
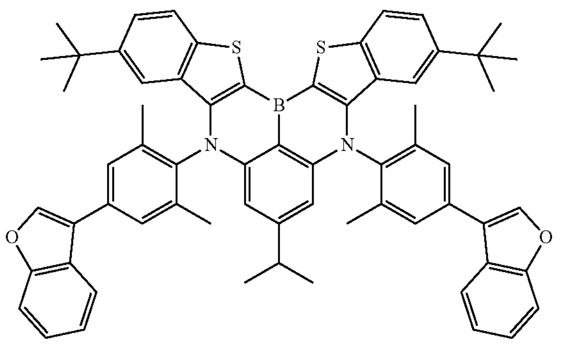

-continued
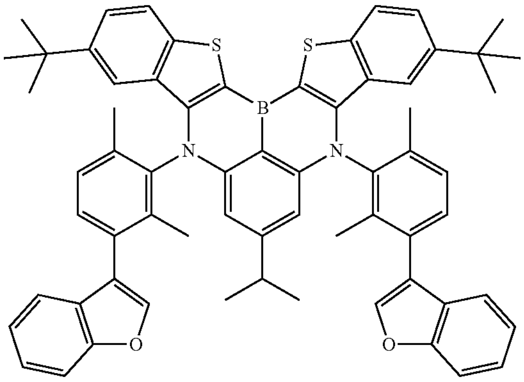
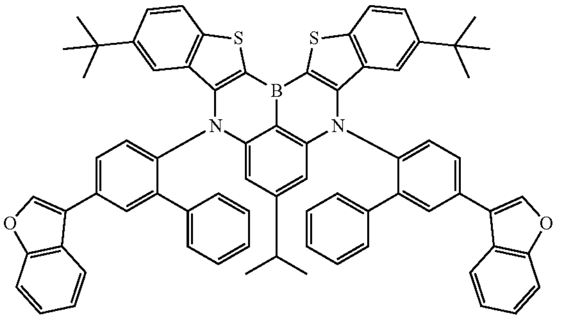
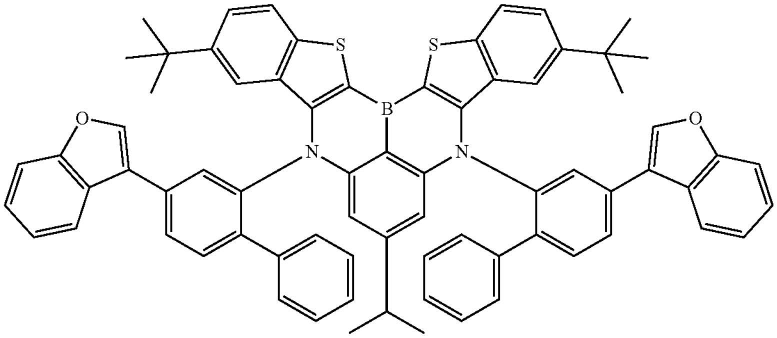
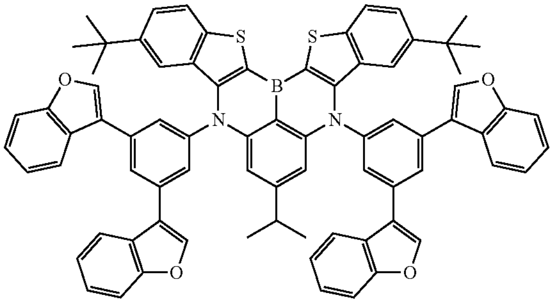
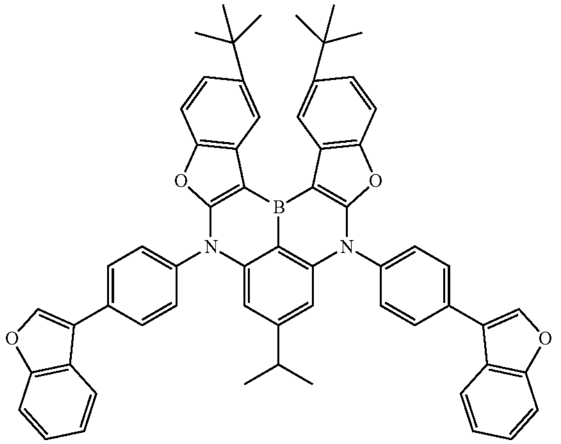
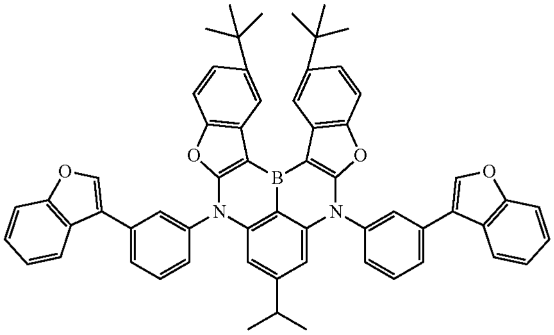
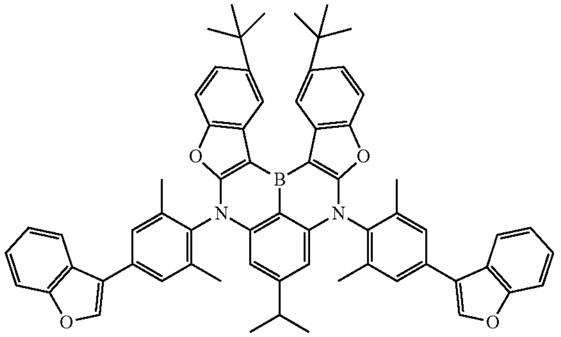

-continued
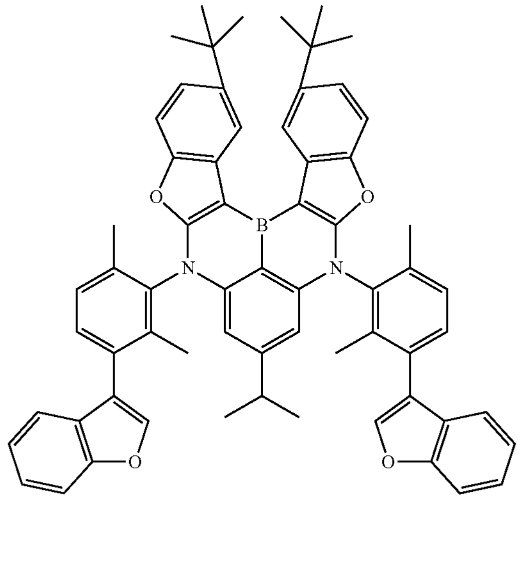
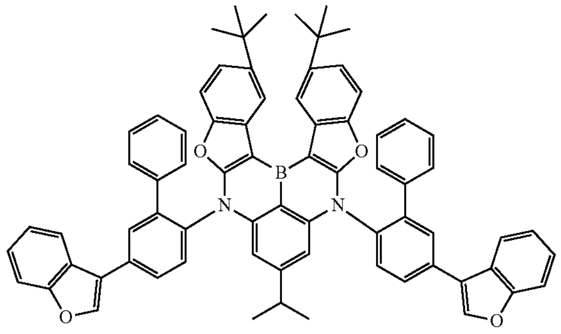
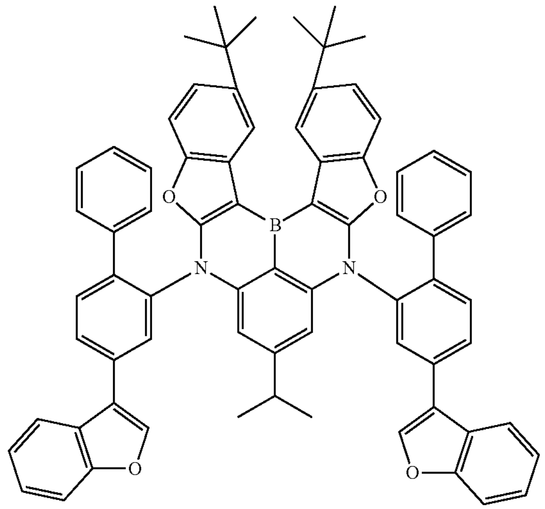
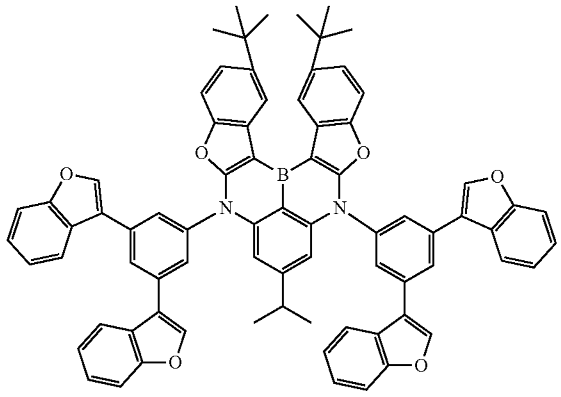
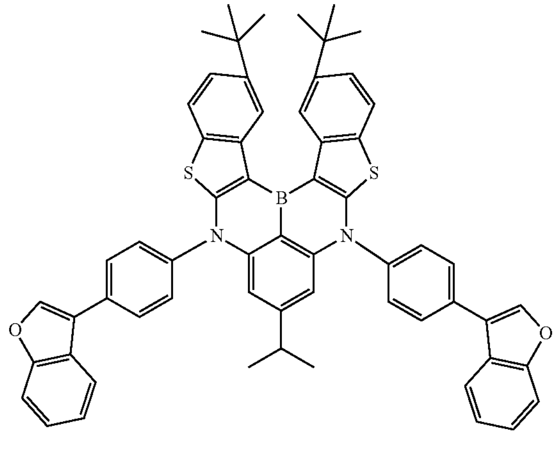
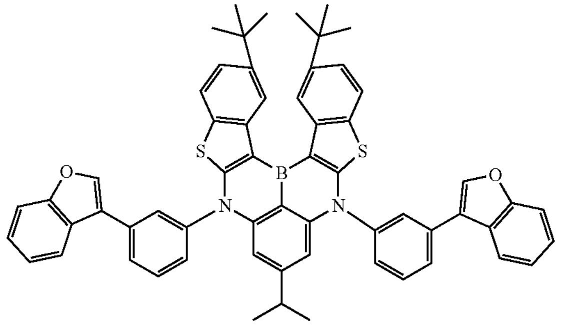

-continued
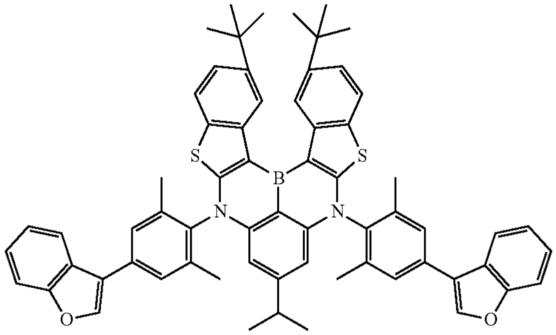
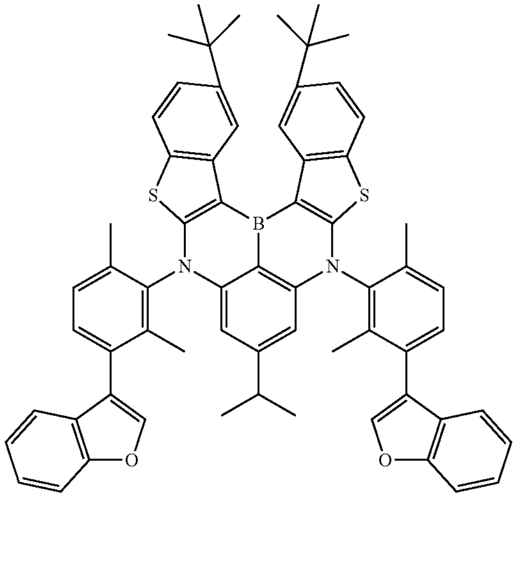
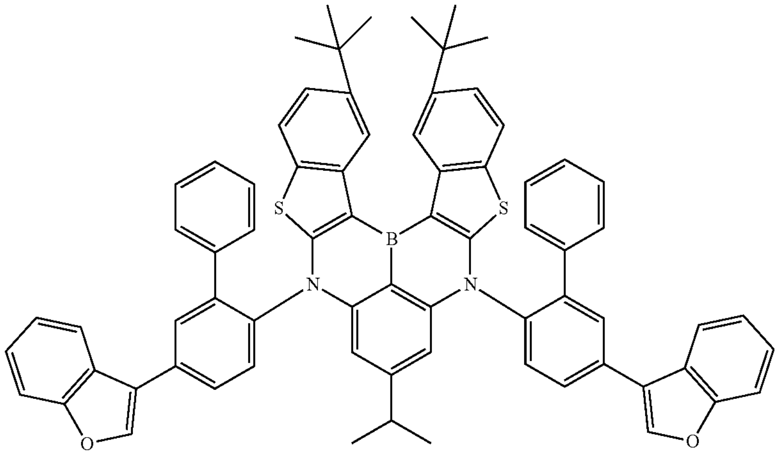
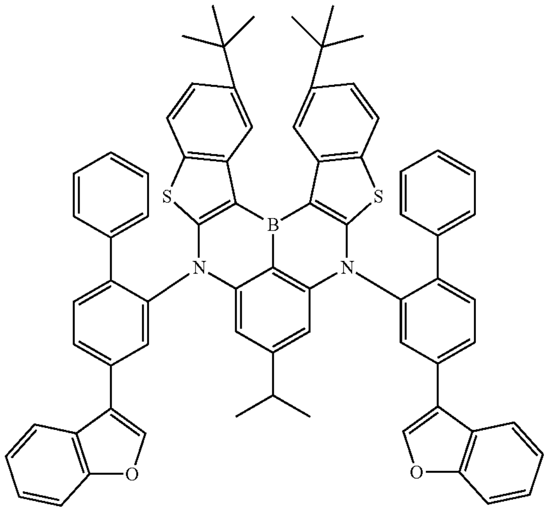
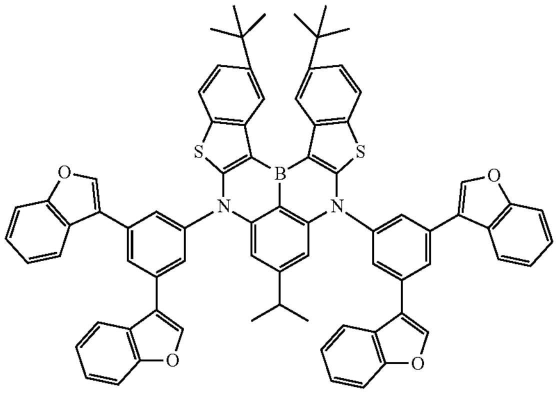

-continued
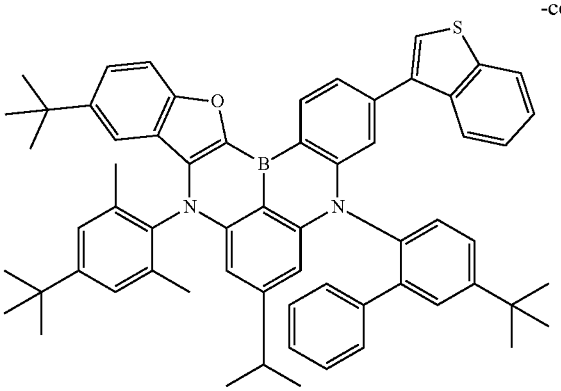
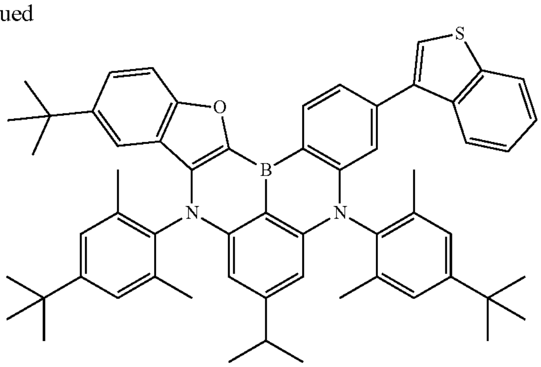
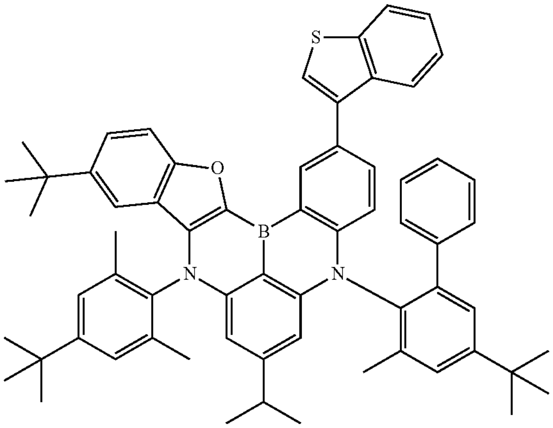
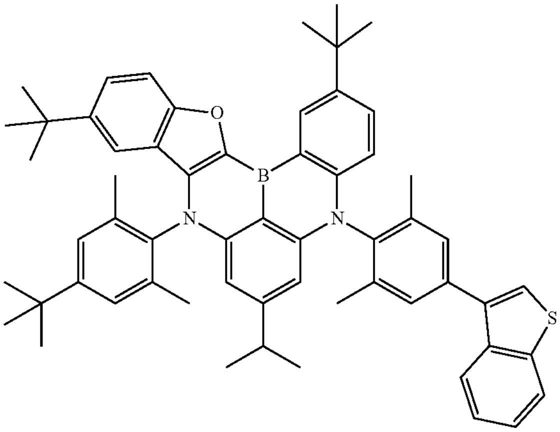
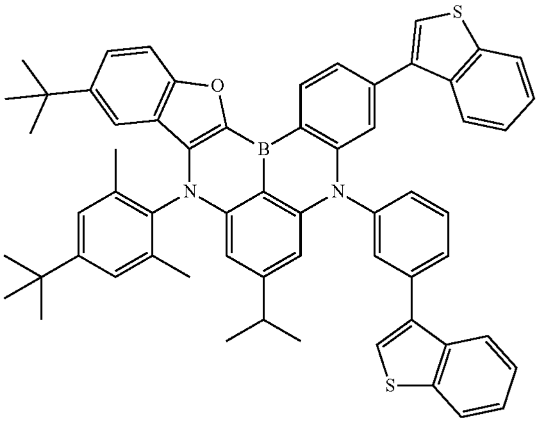
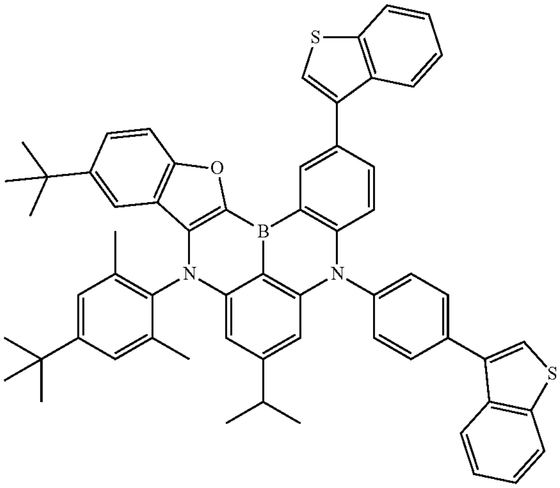
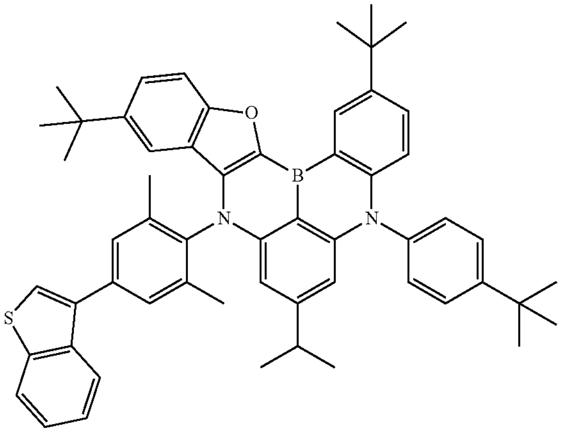
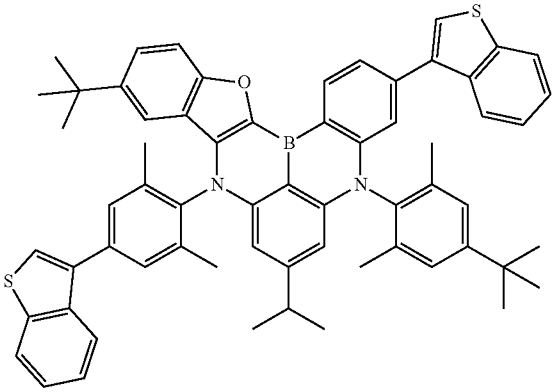

-continued
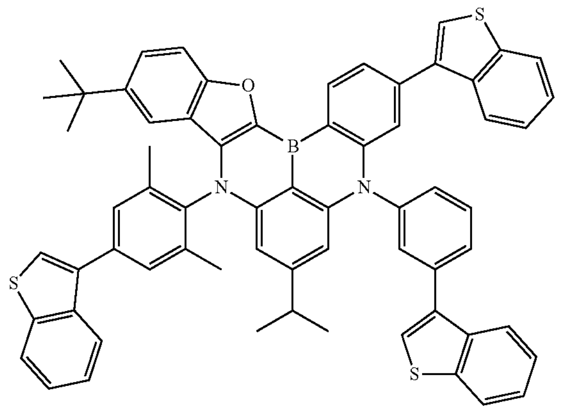
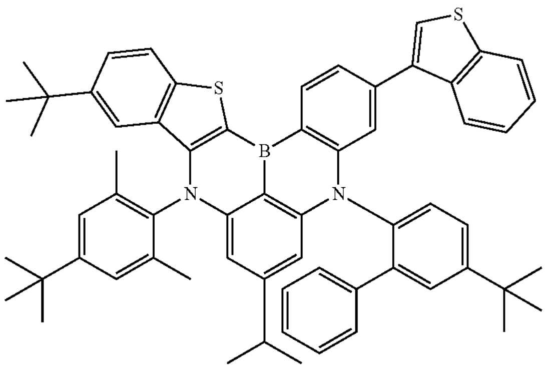
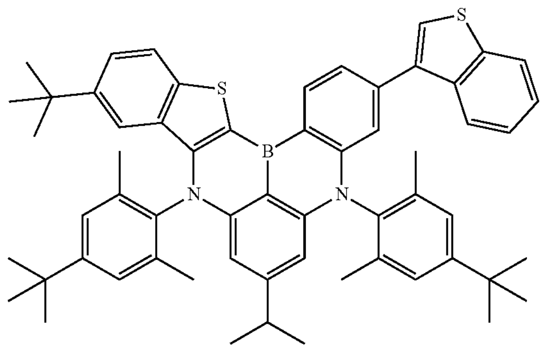
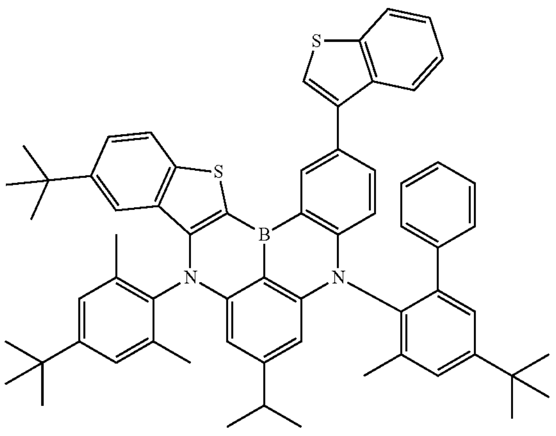
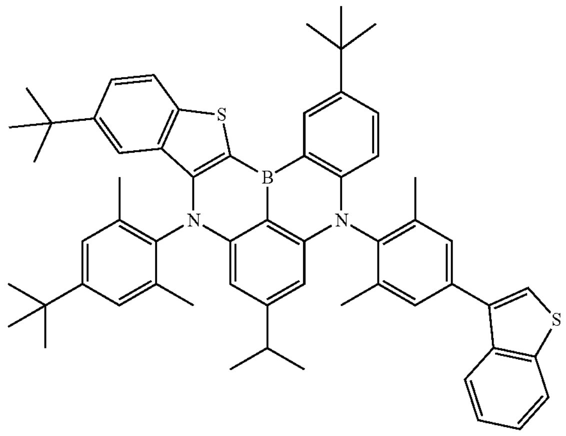
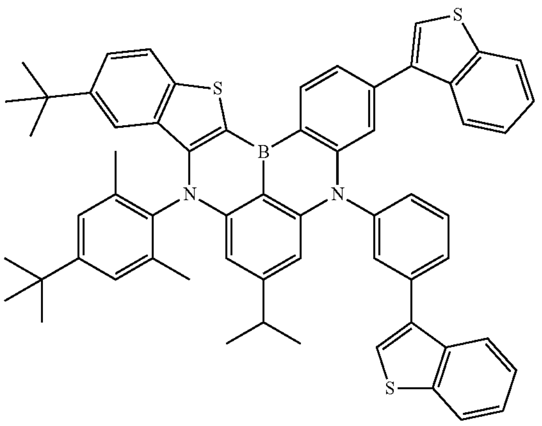

-continued
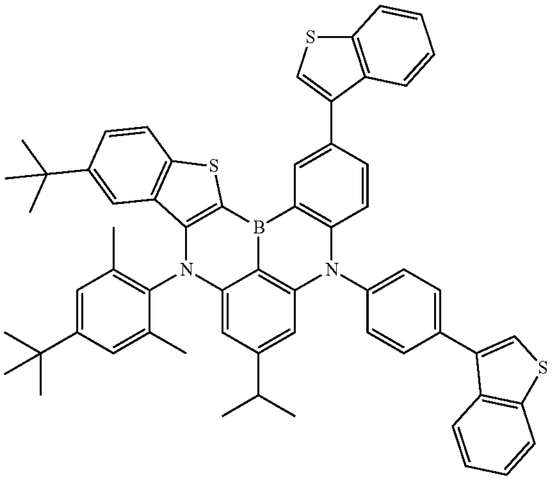
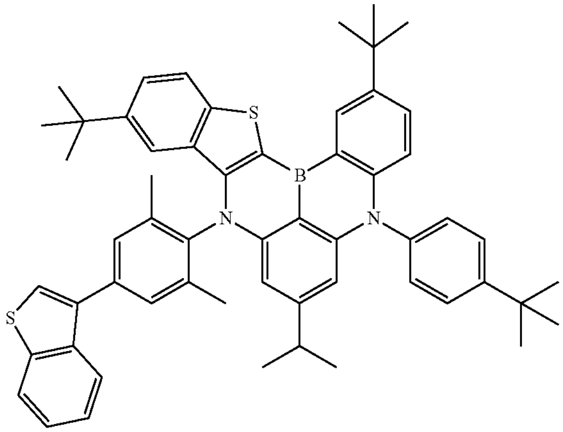
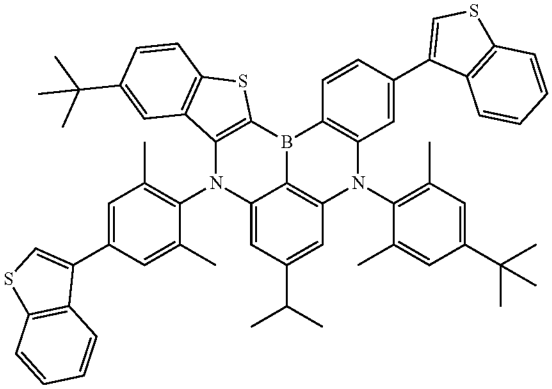
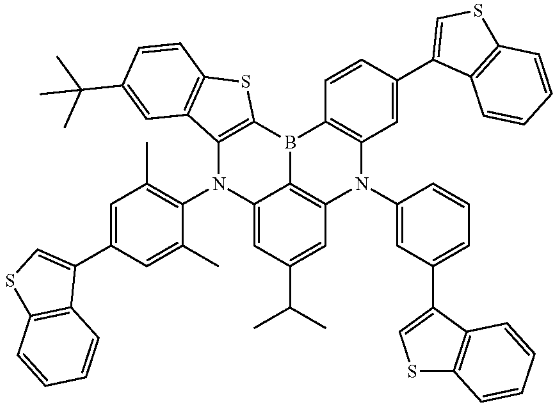
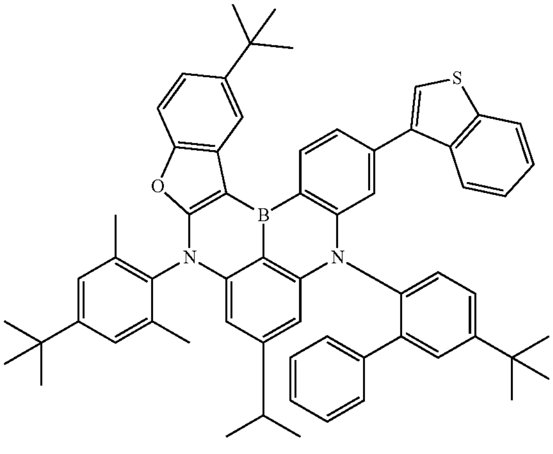
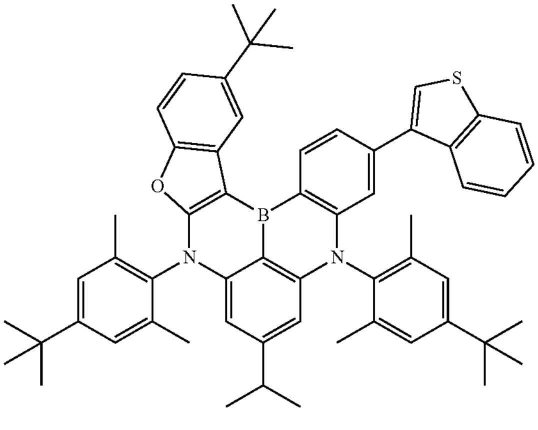

-continued
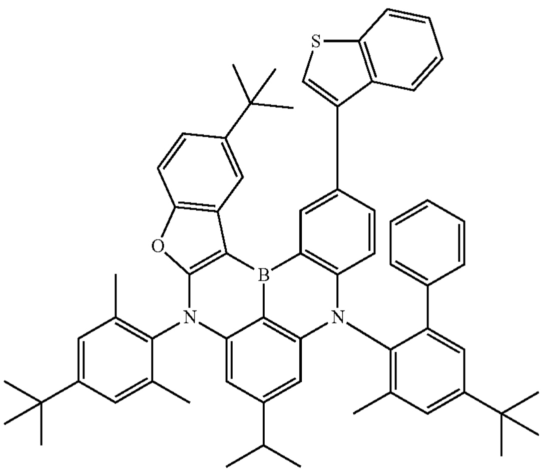
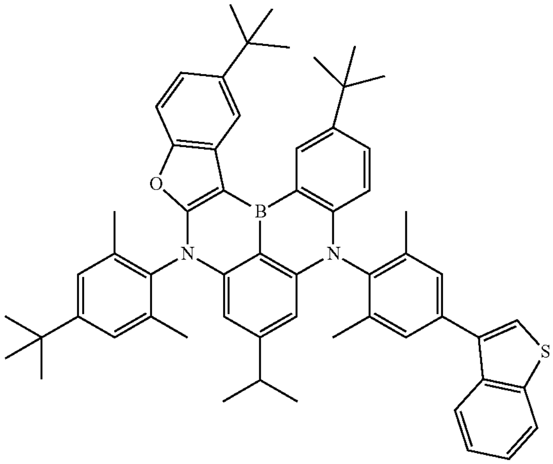
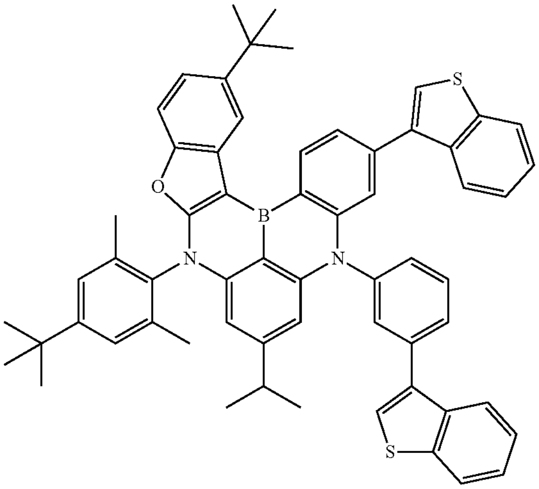
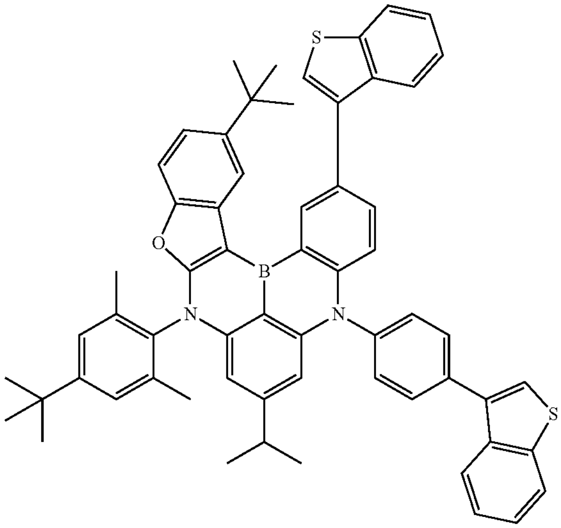
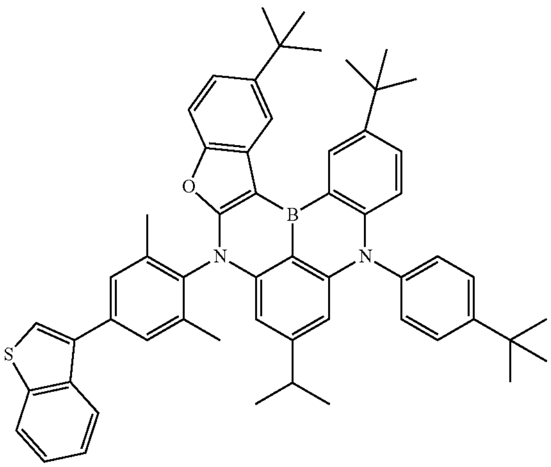
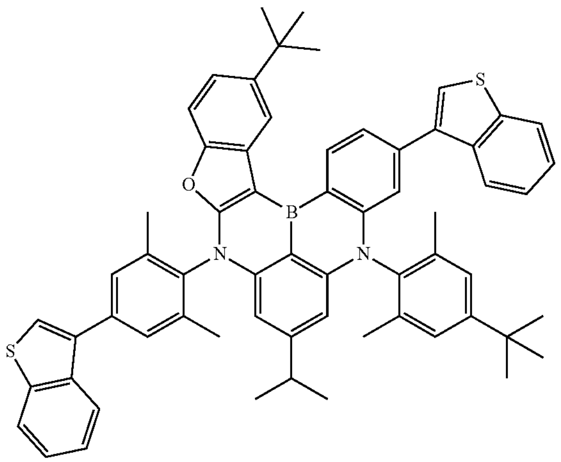

-continued
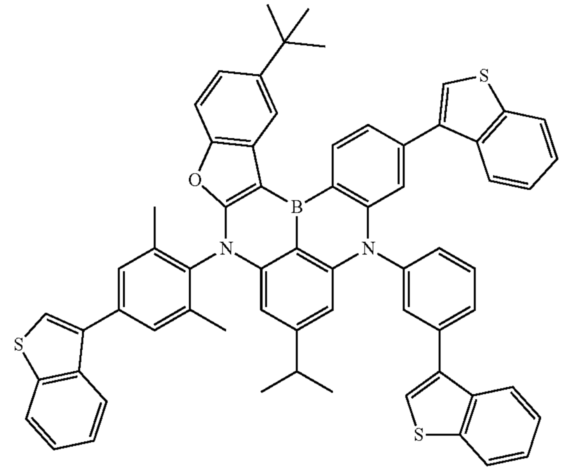
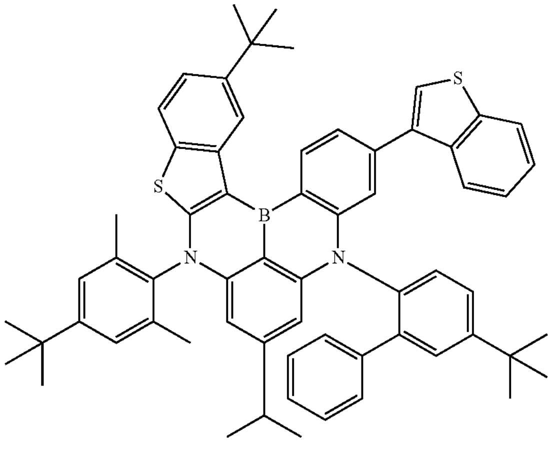
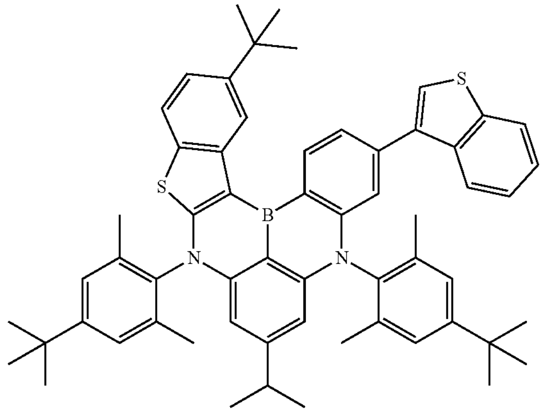
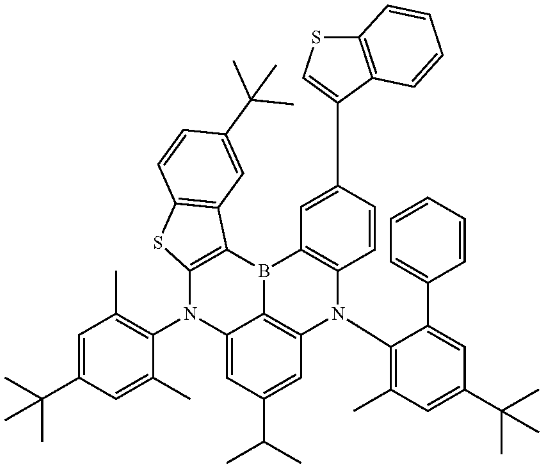
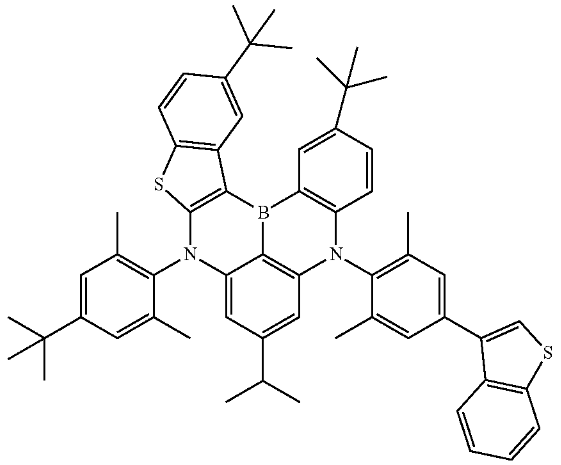
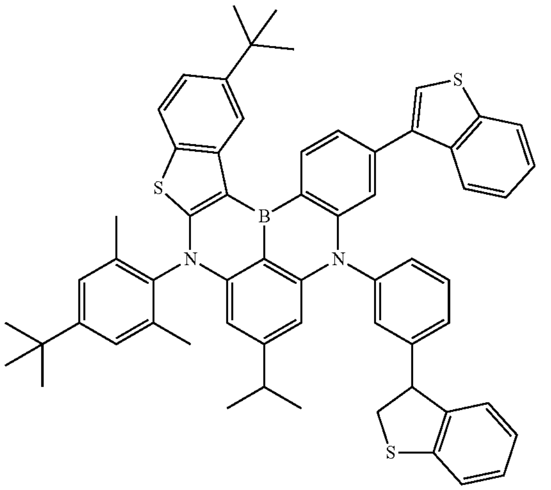

-continued
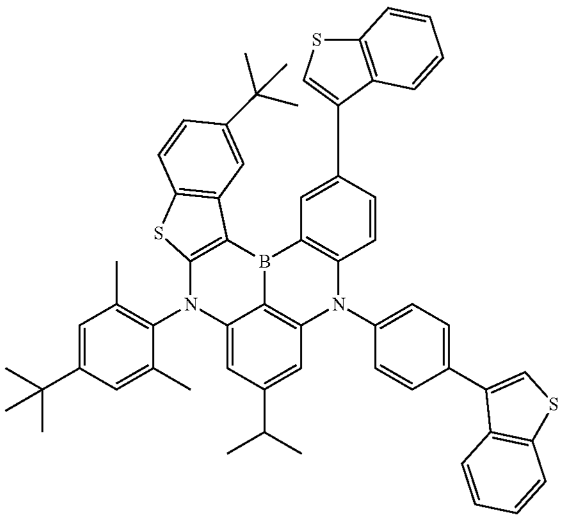
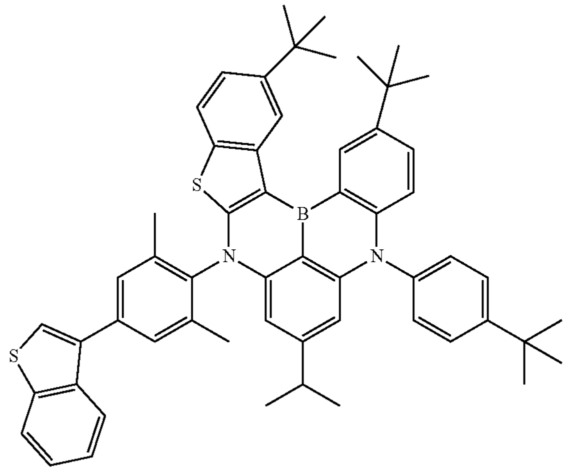
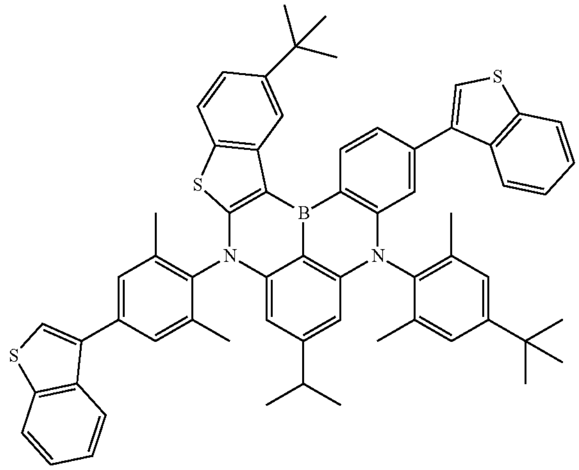
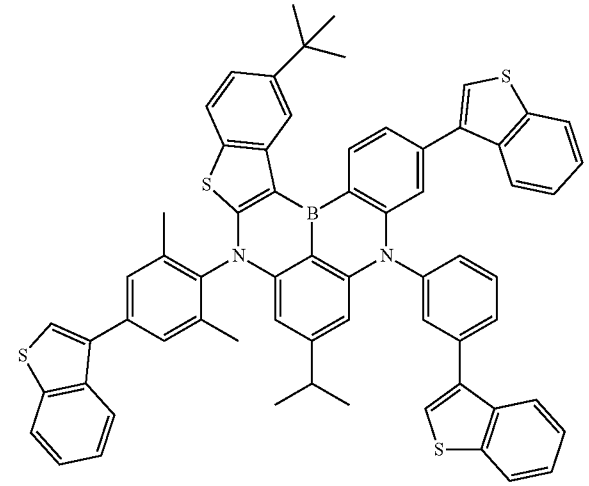
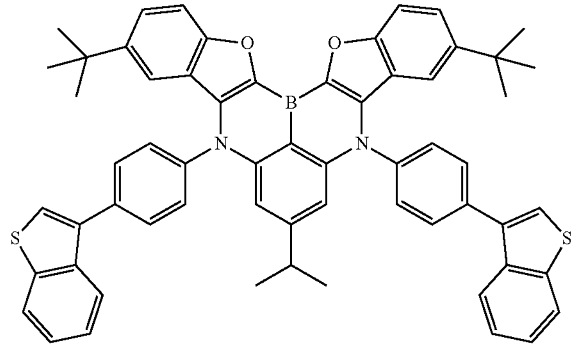
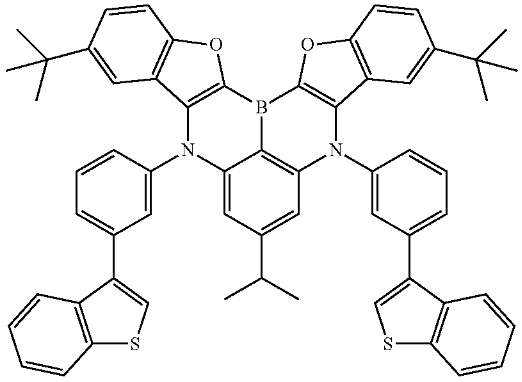
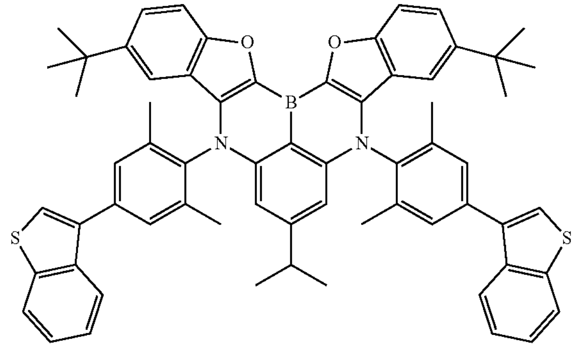

-continued
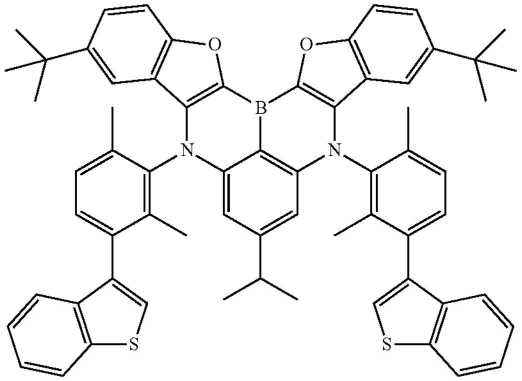
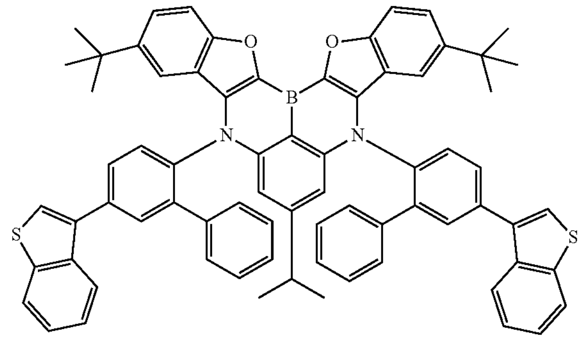
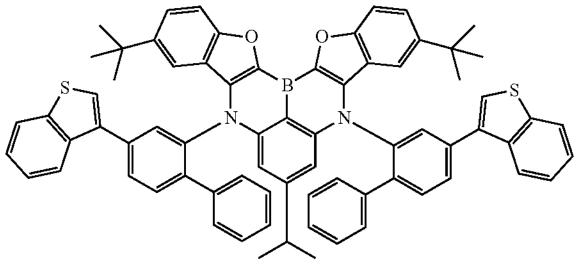
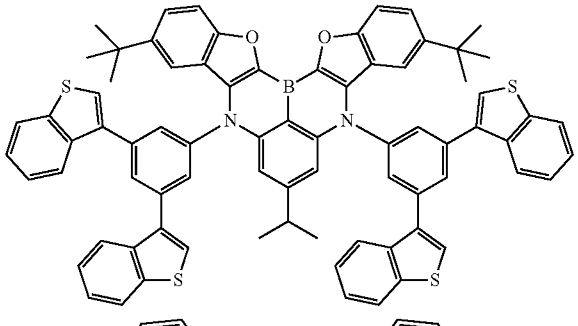
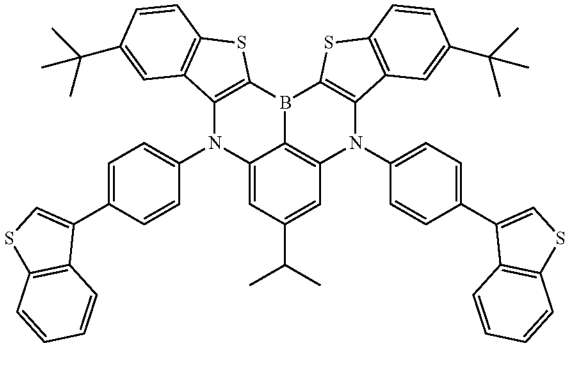
-continued
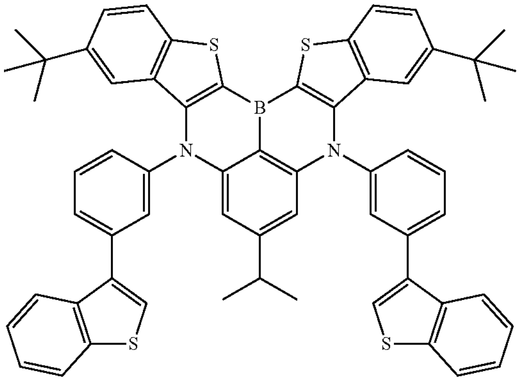
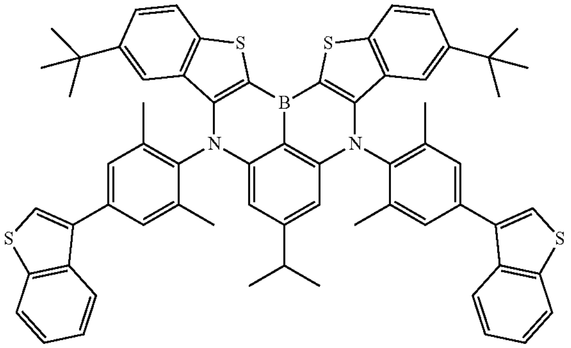
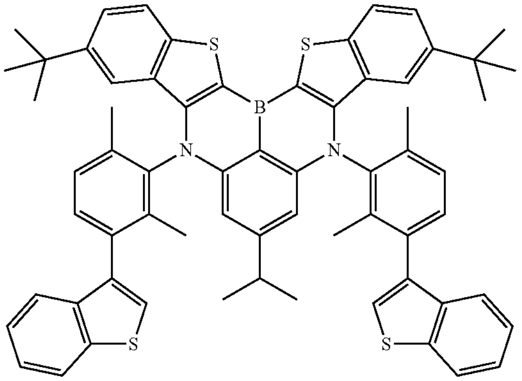
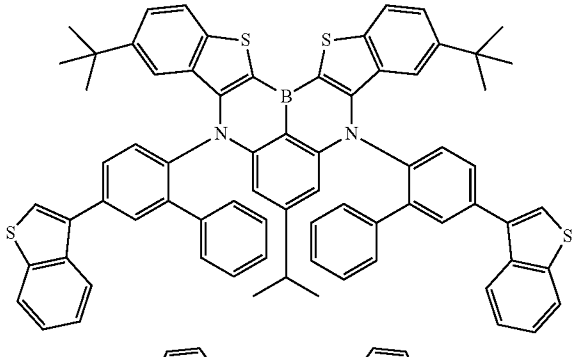
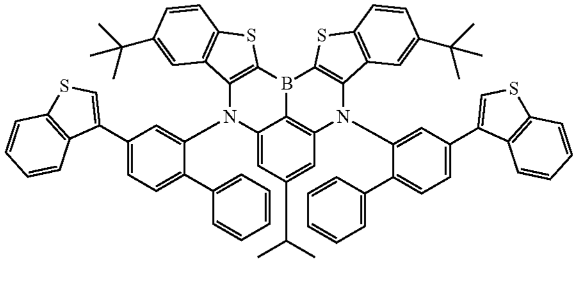

-continued
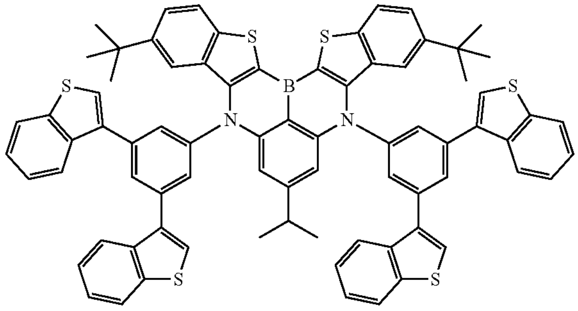
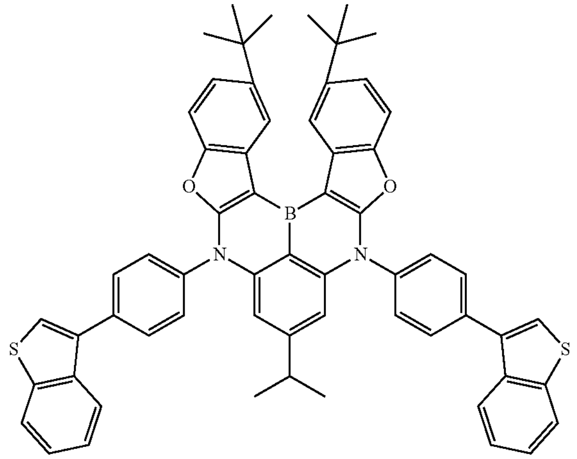
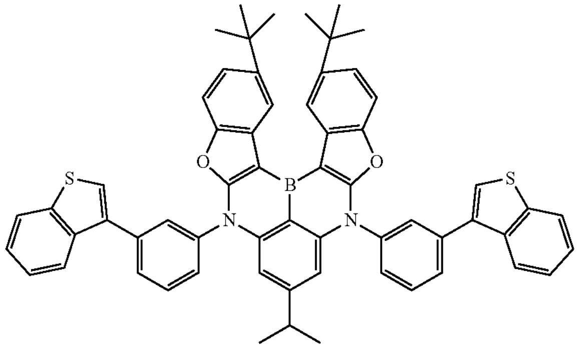
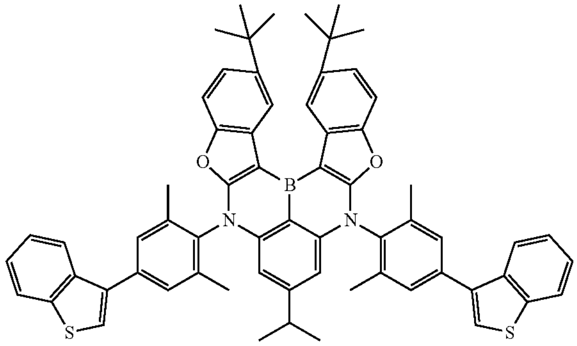
-continued
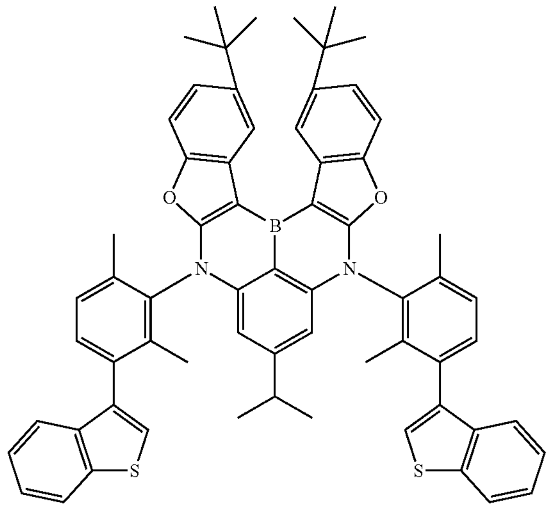
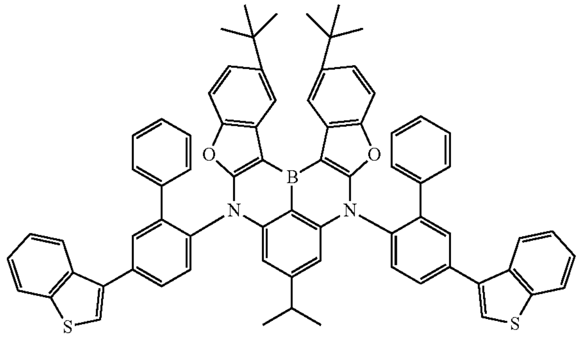
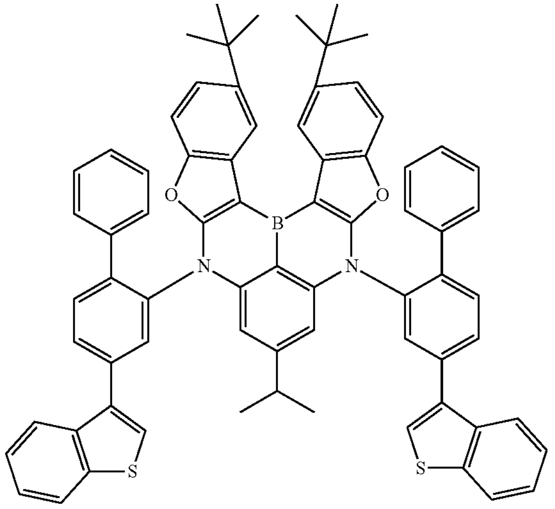

-continued
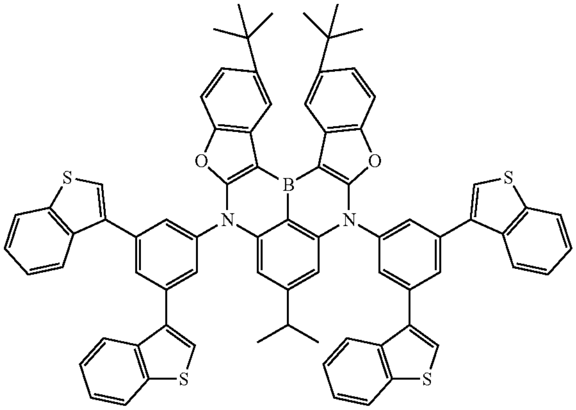
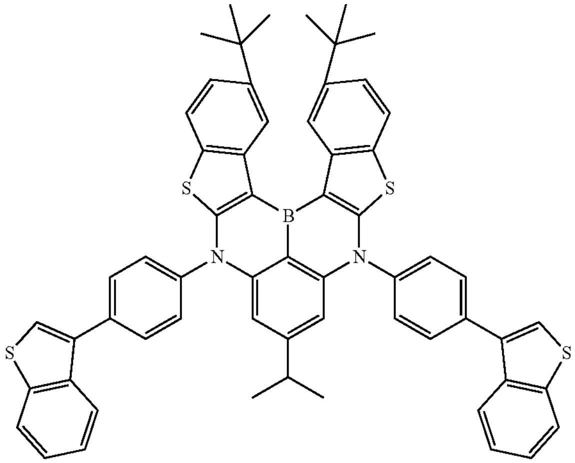
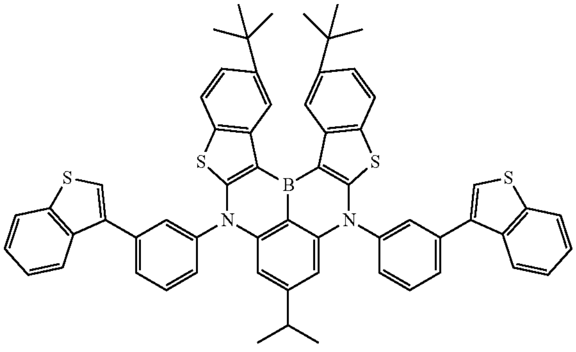
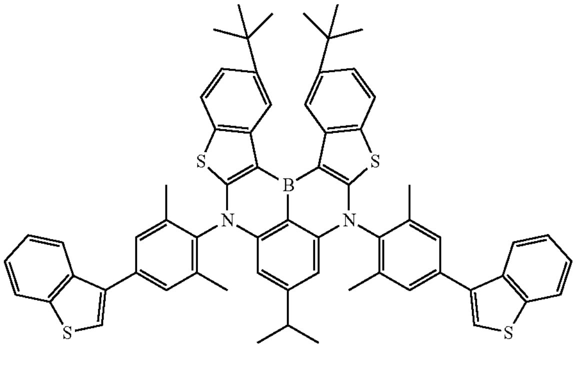
-continued
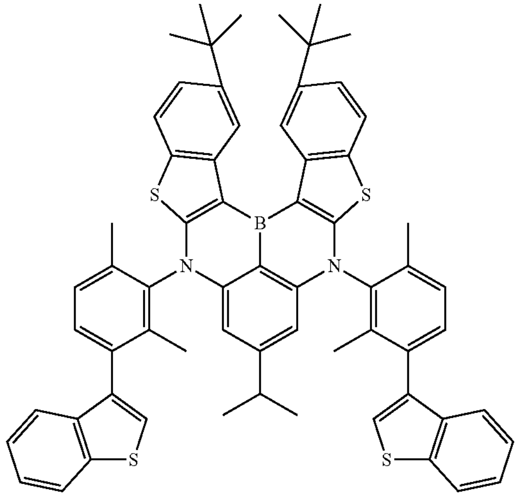
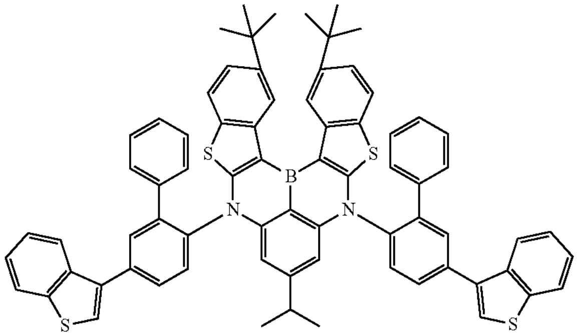
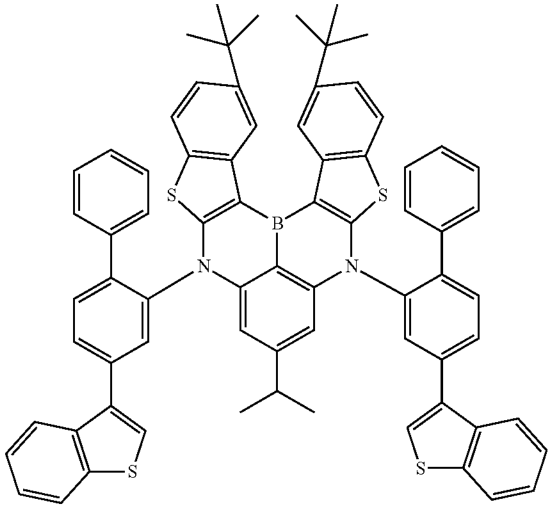

-continued
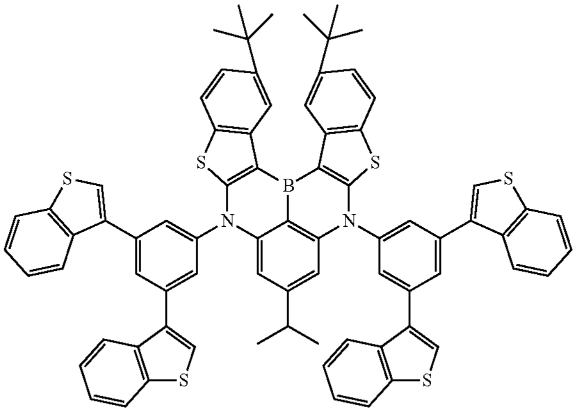
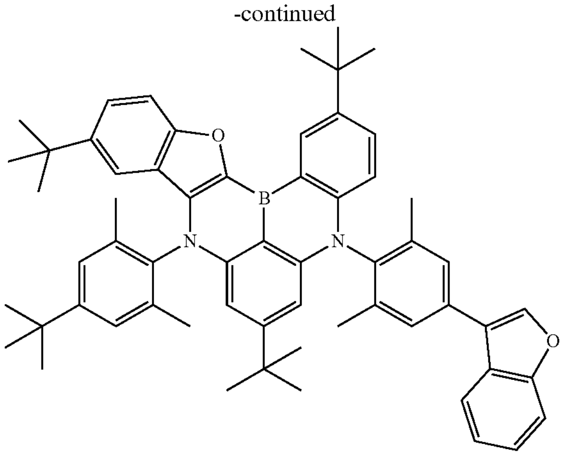
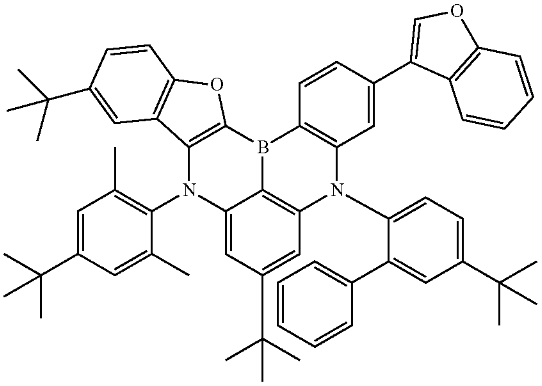
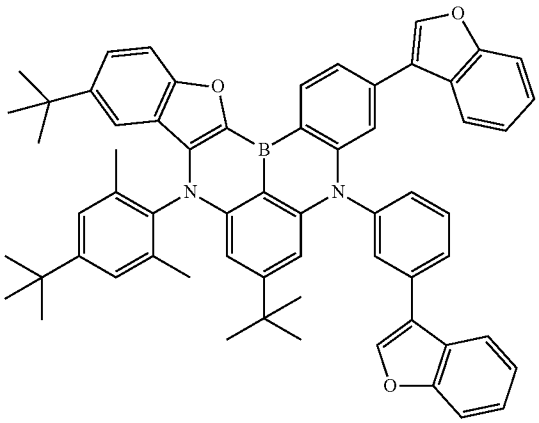
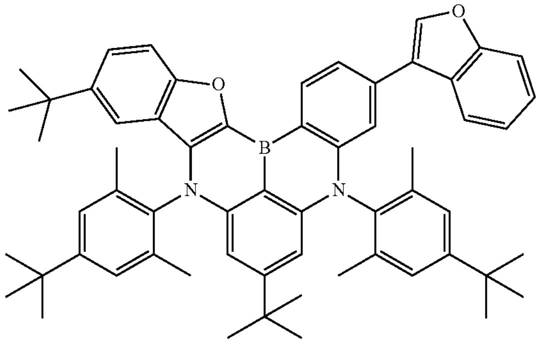
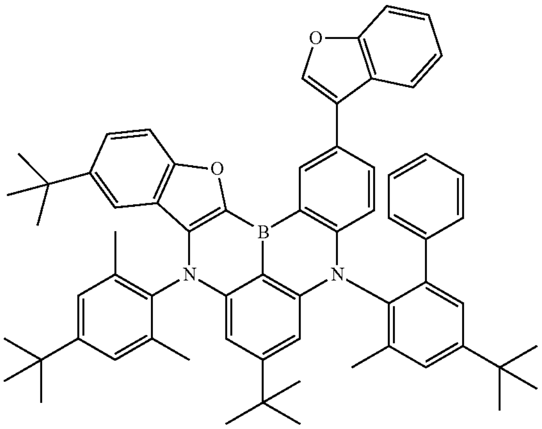
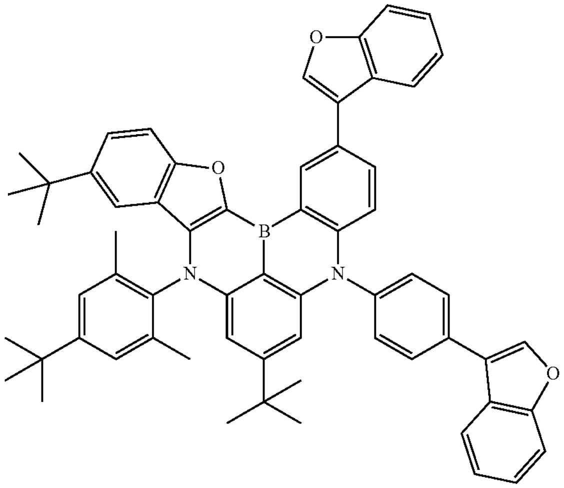

-continued
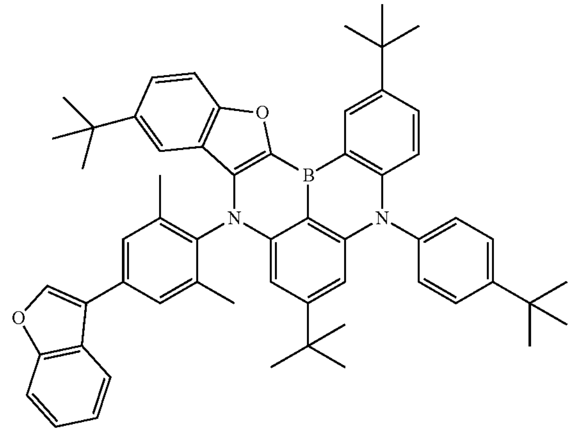
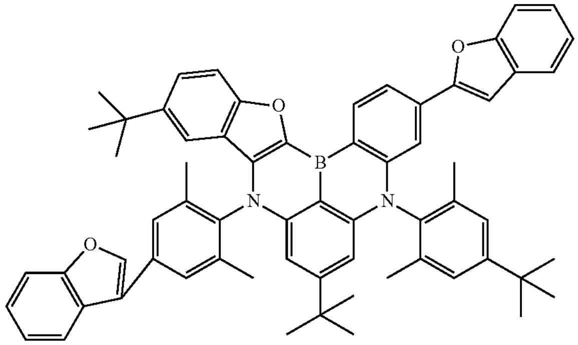
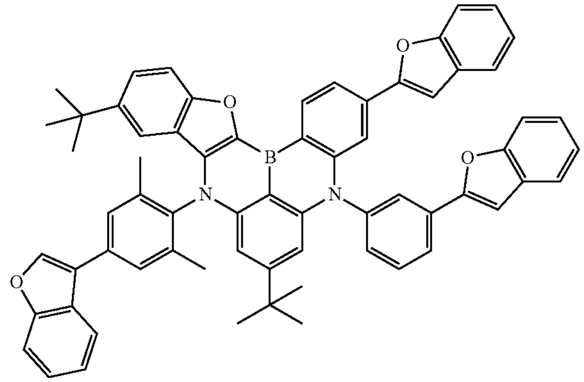
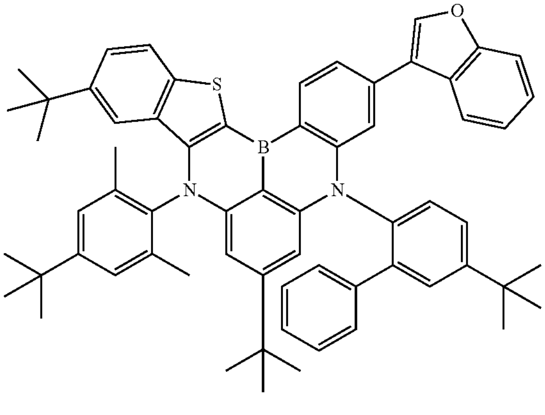
-continued
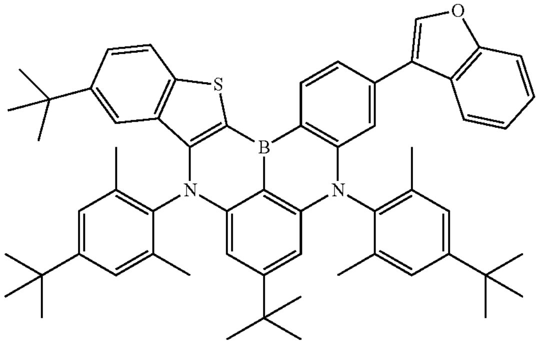
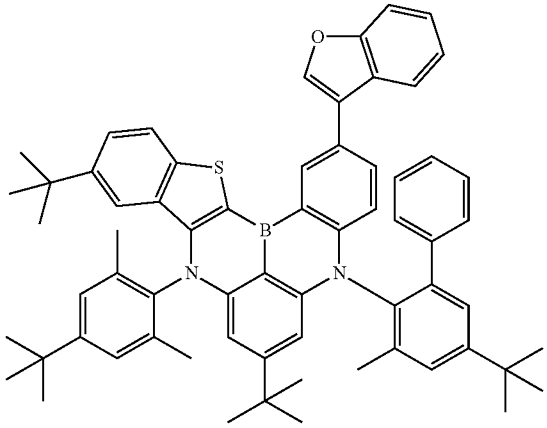
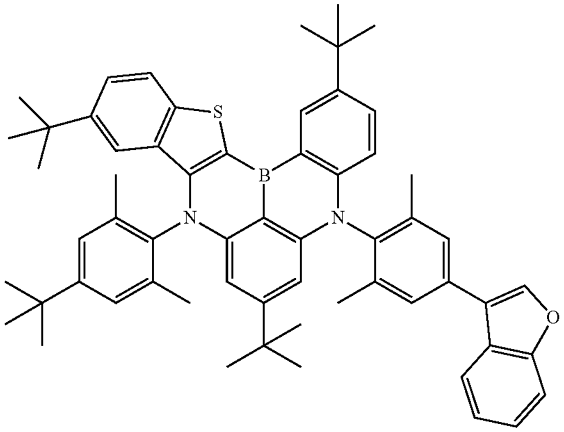
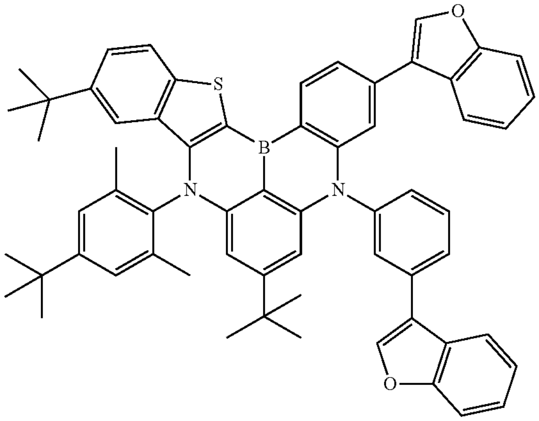

-continued
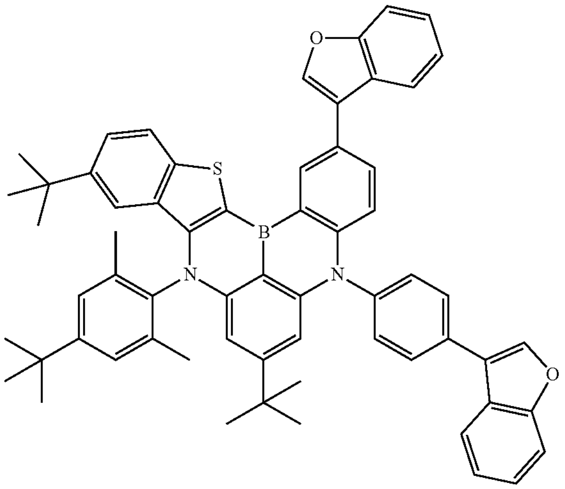
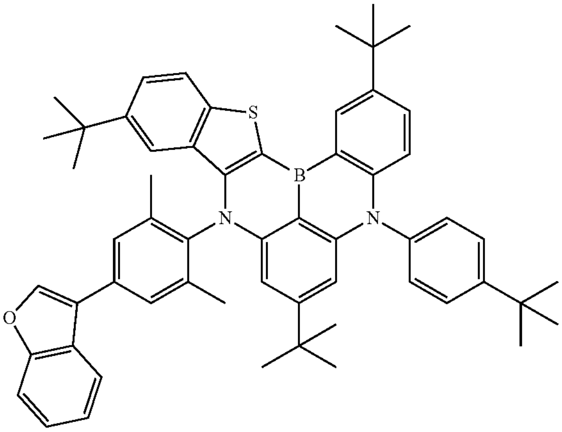
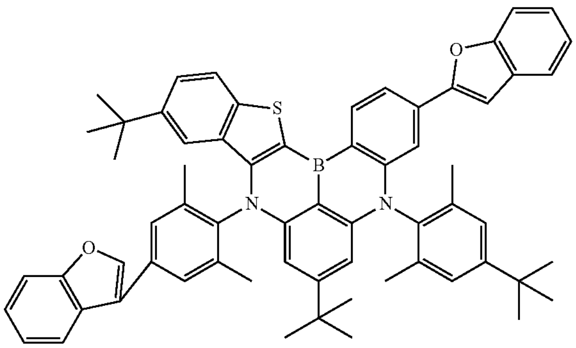
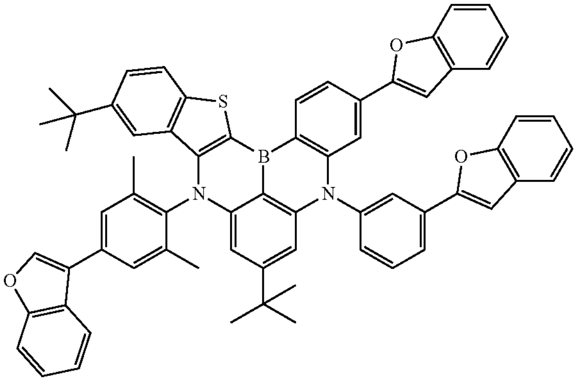
-continued
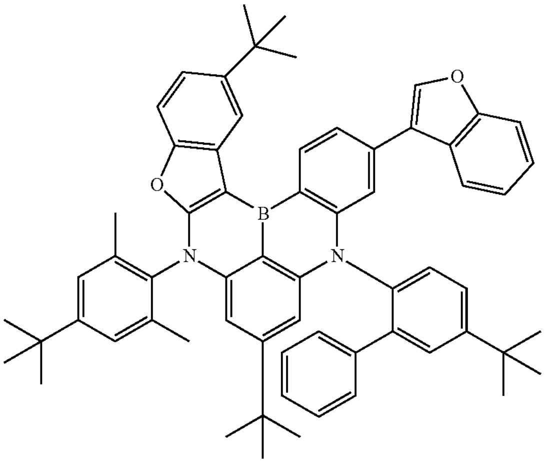
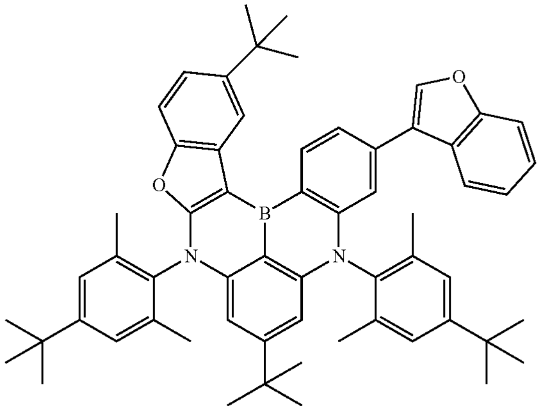
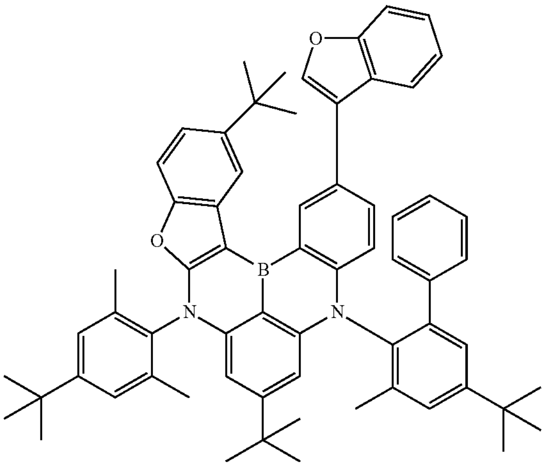

-continued
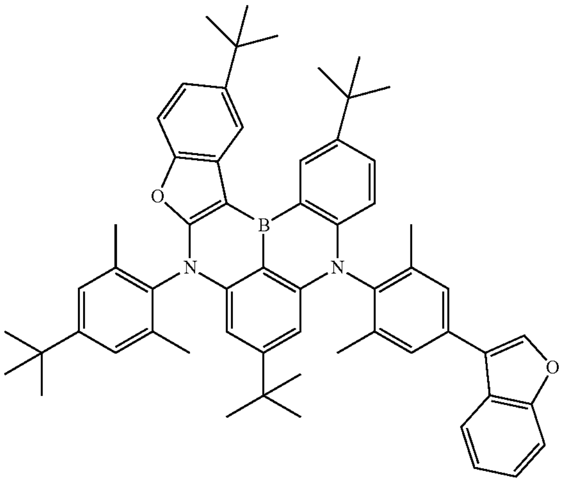
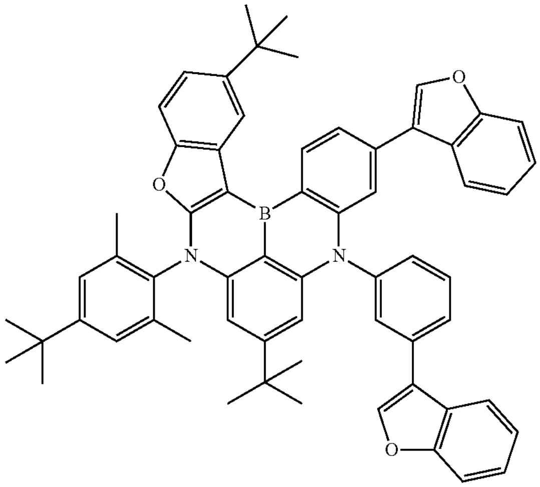
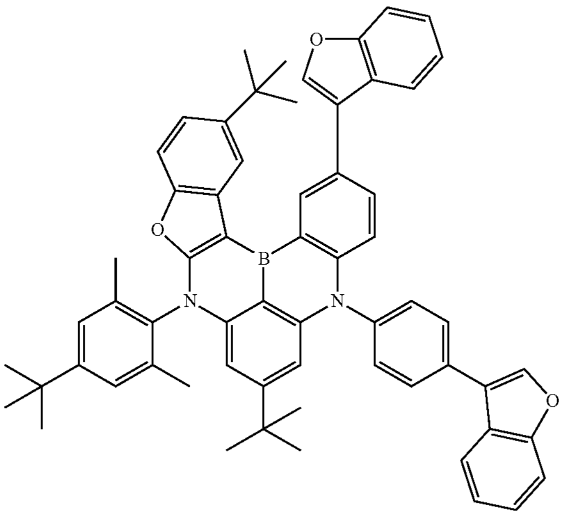
-continued
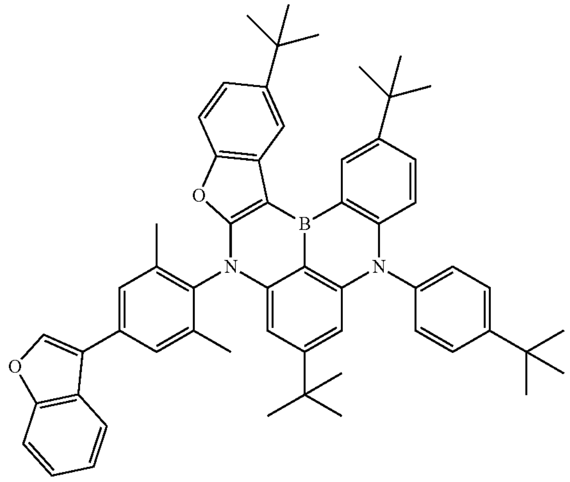
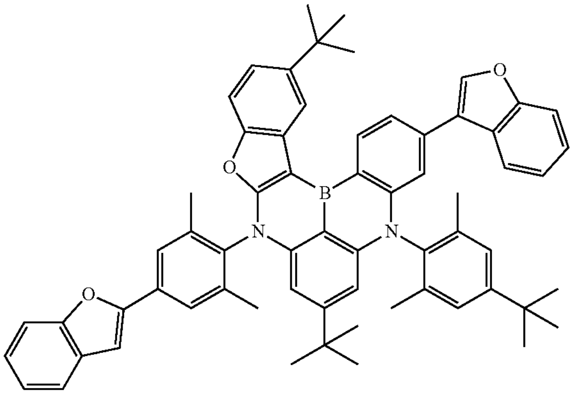
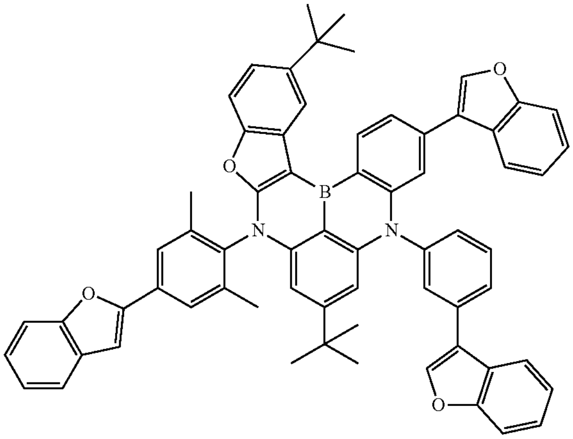

-continued
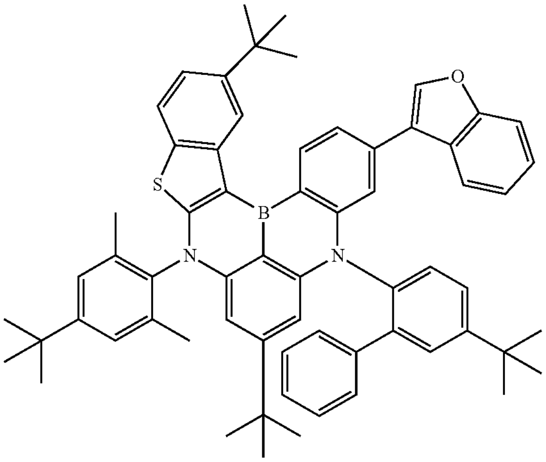
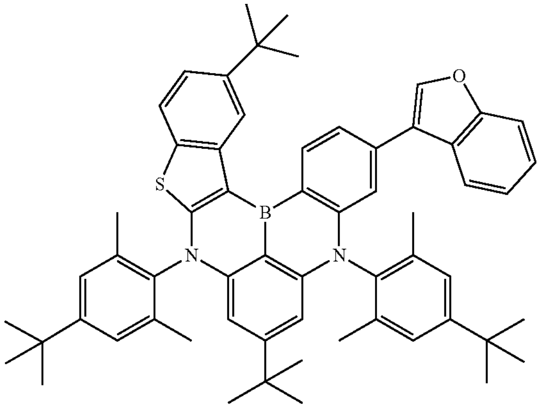
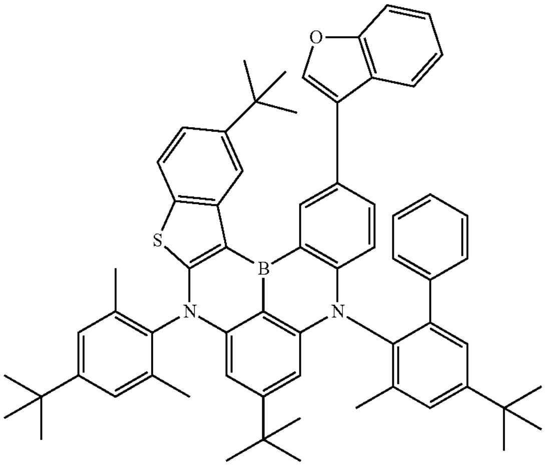
-continued
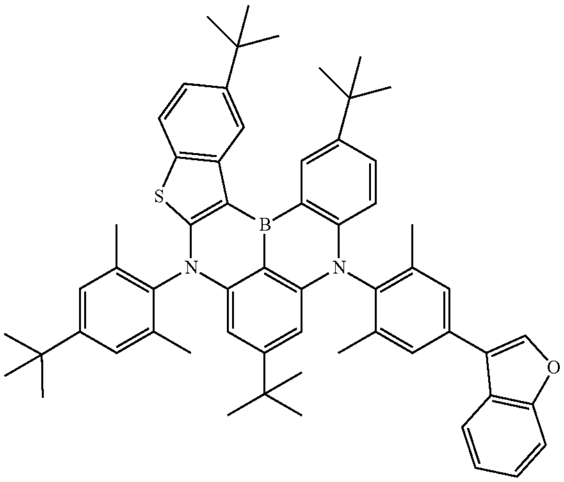
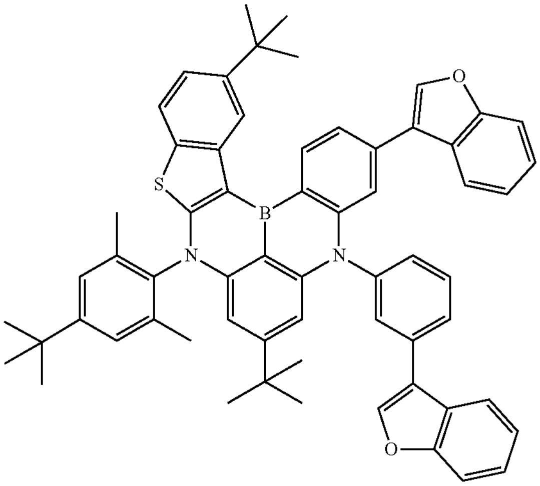
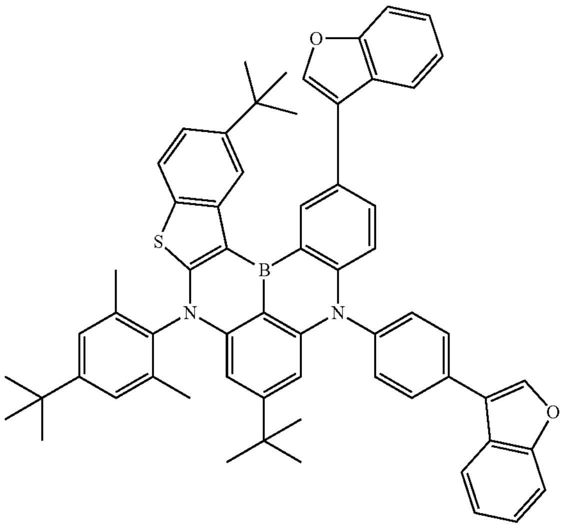

-continued
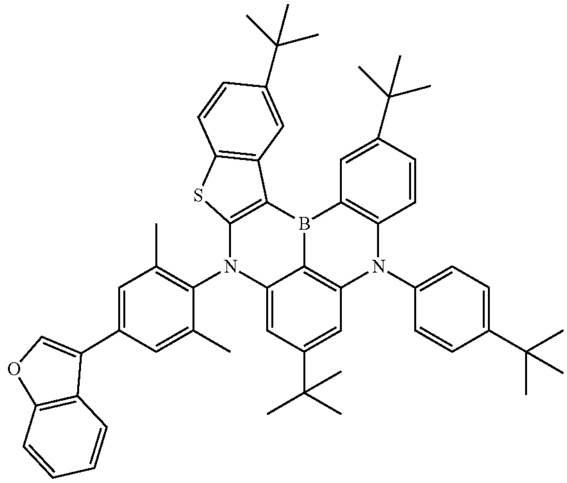
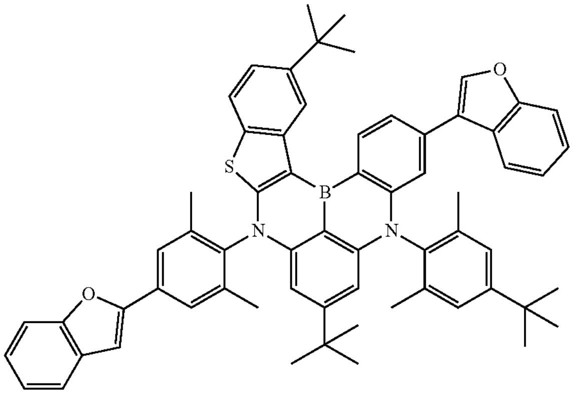
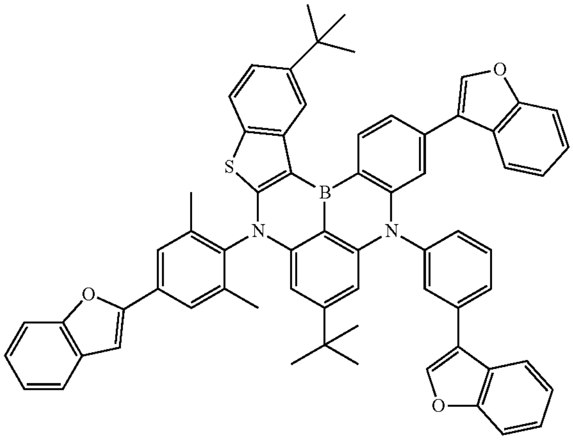
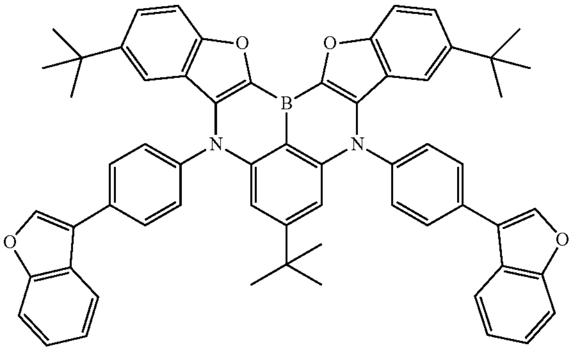
-continued
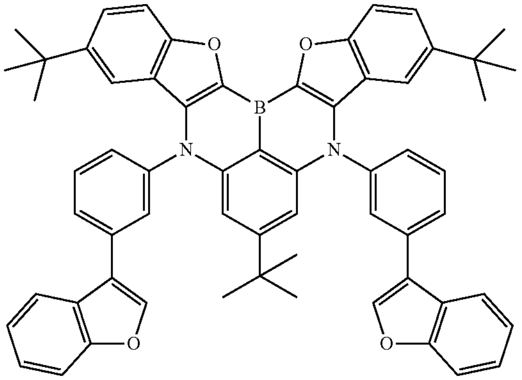
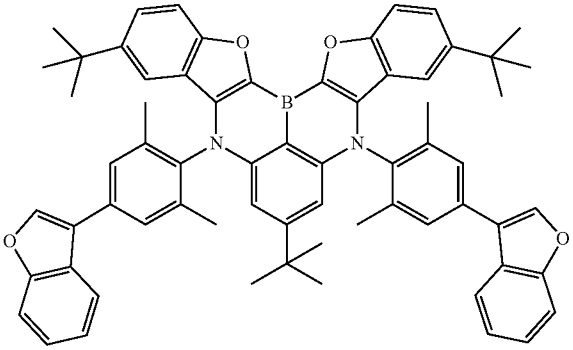
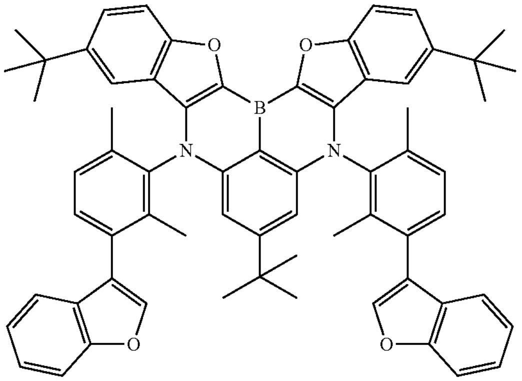
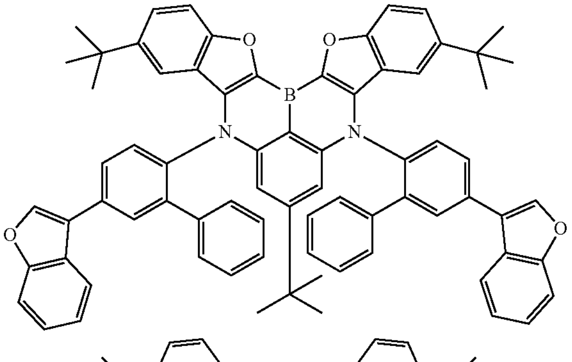
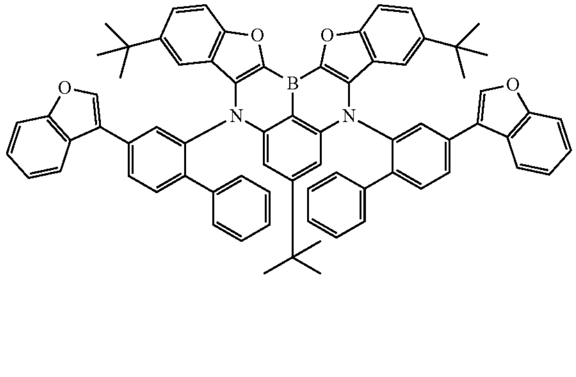

-continued
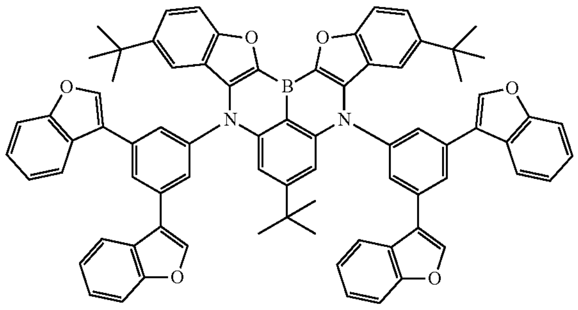
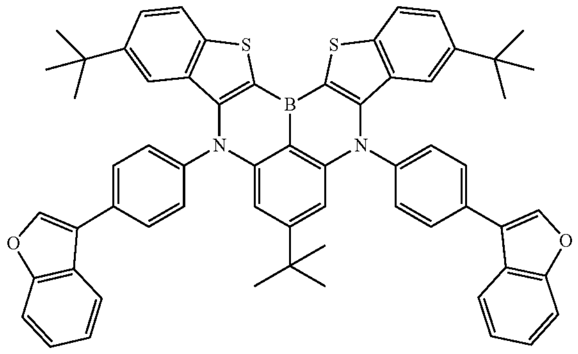
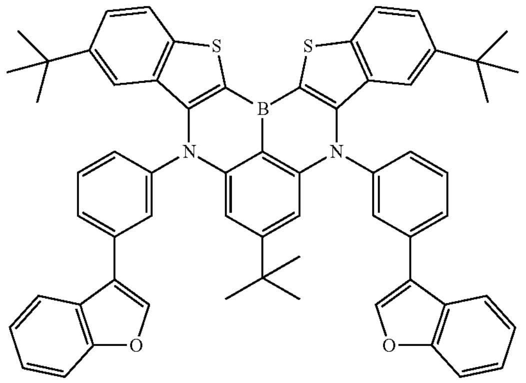
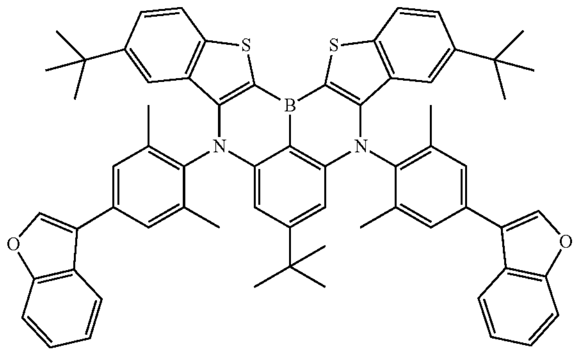
-continued
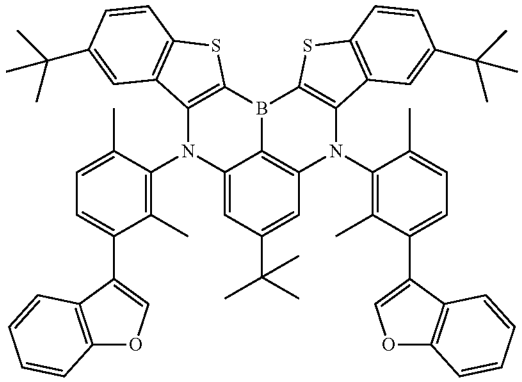
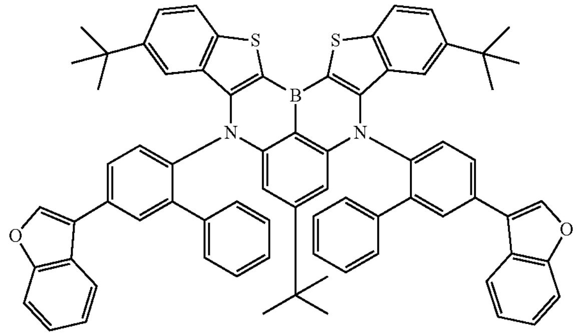
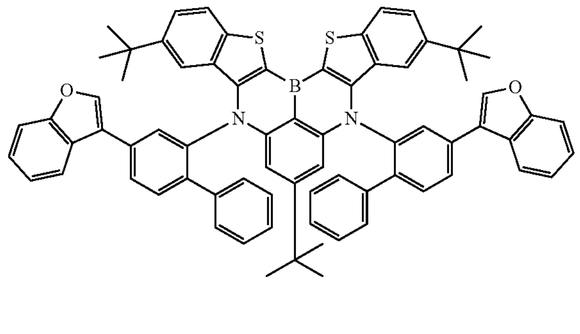
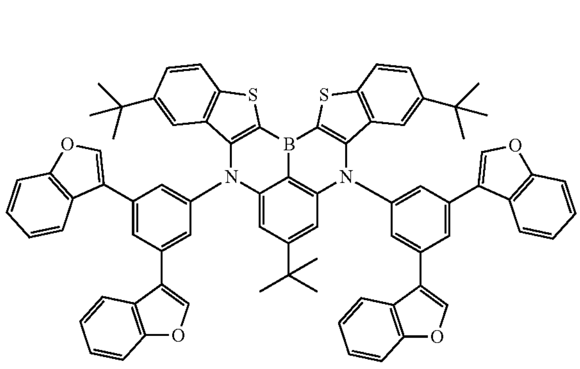

-continued
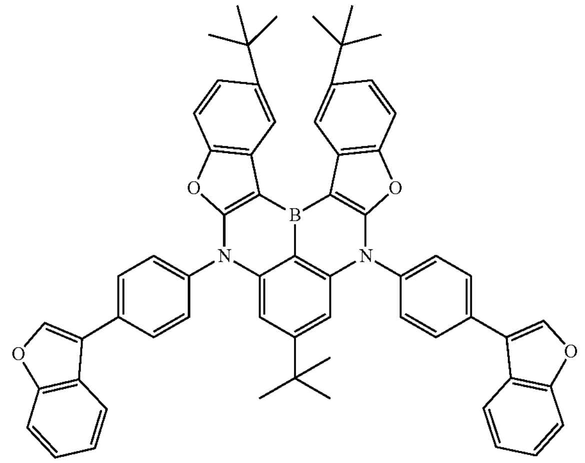
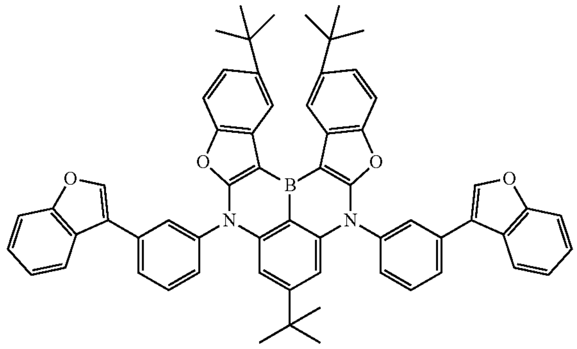
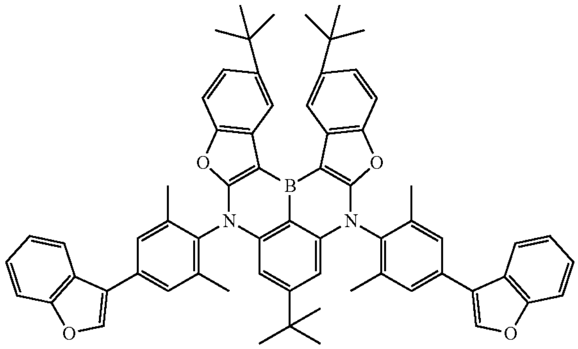
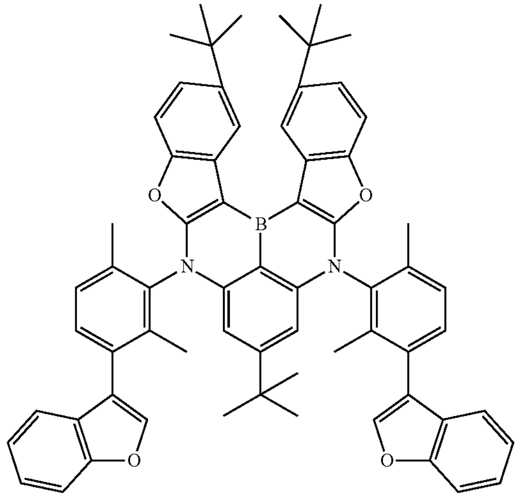
-continued
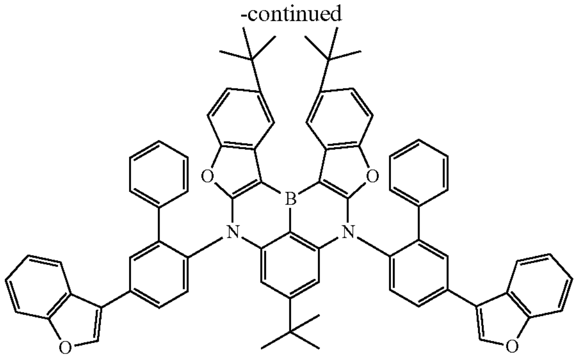
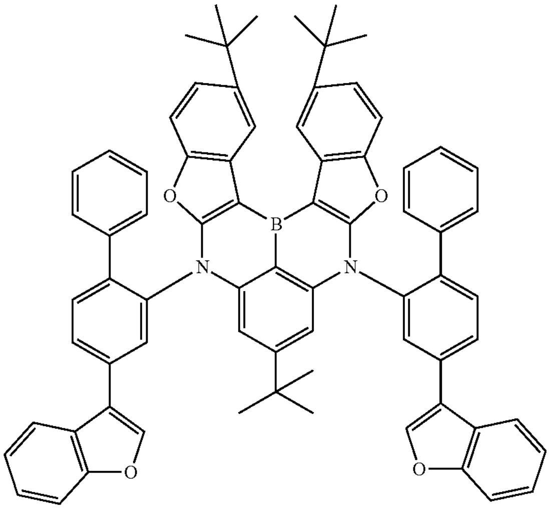
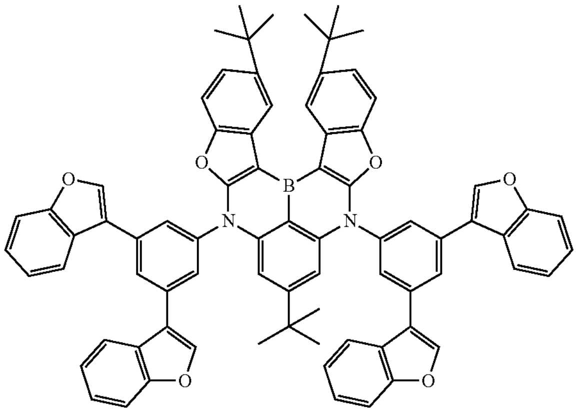
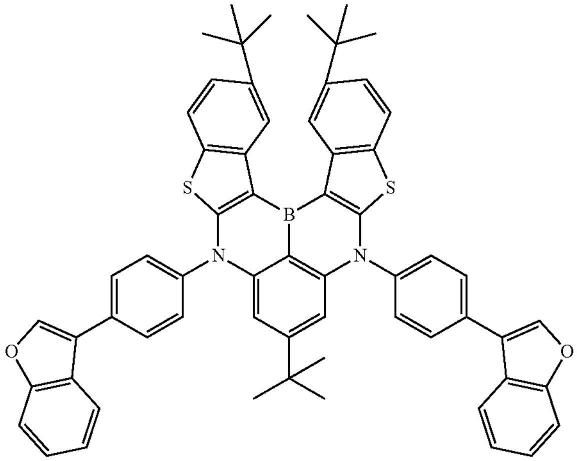

-continued
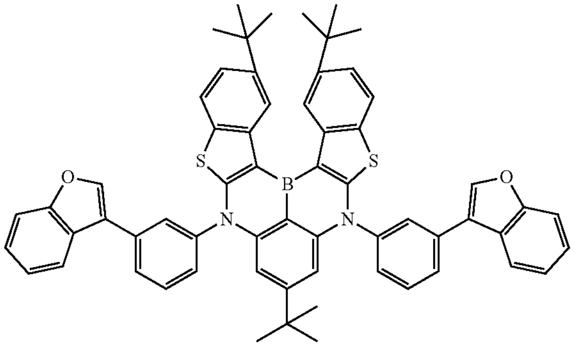
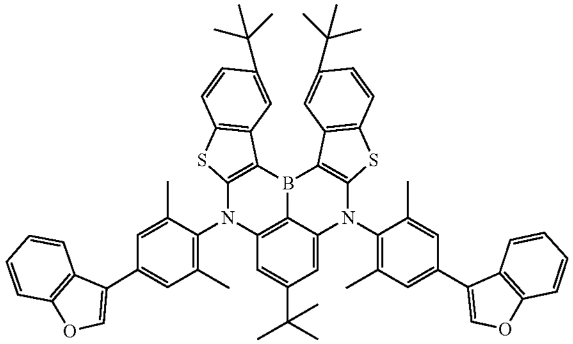
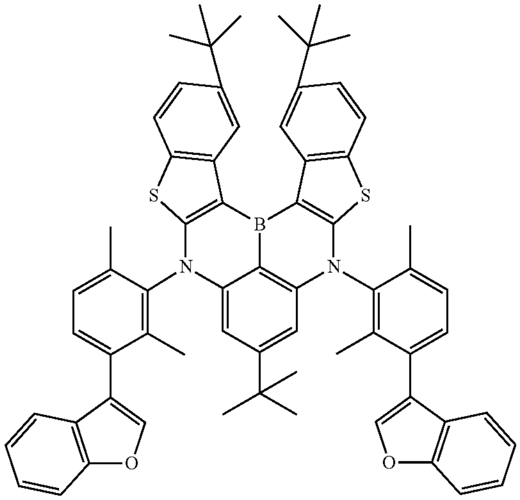
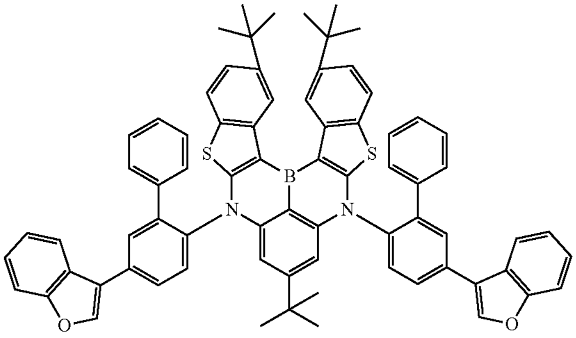
-continued
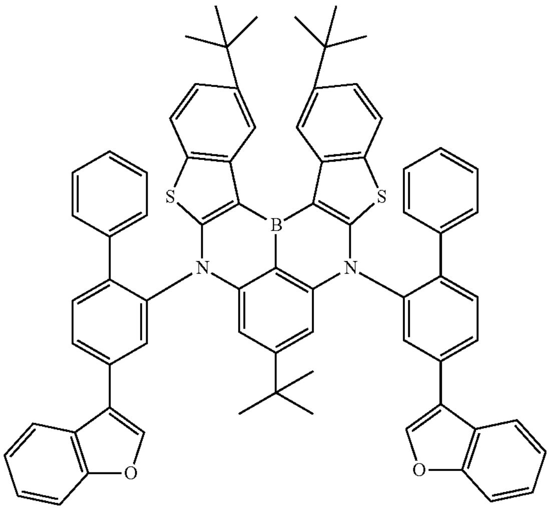
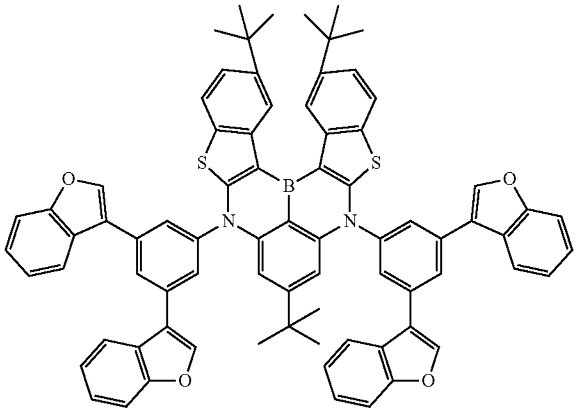
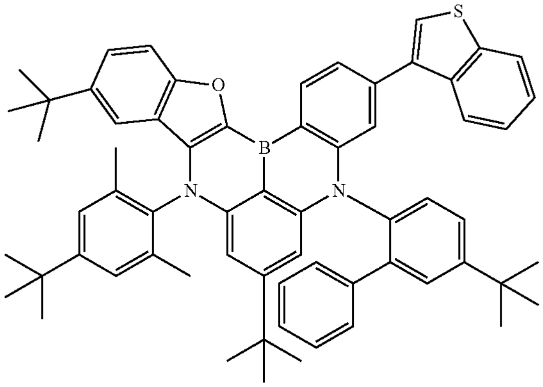
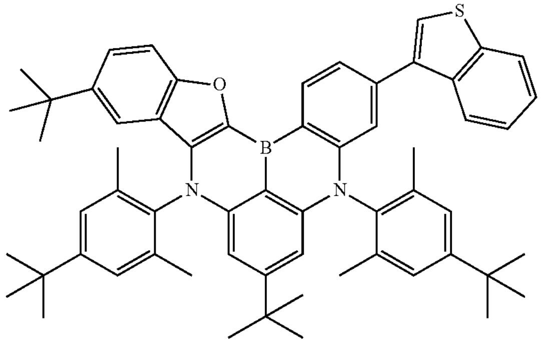

-continued
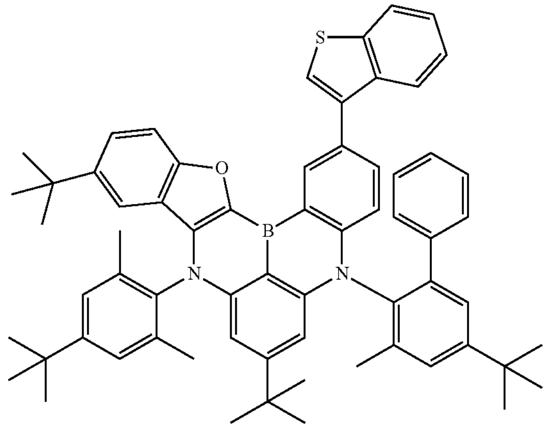
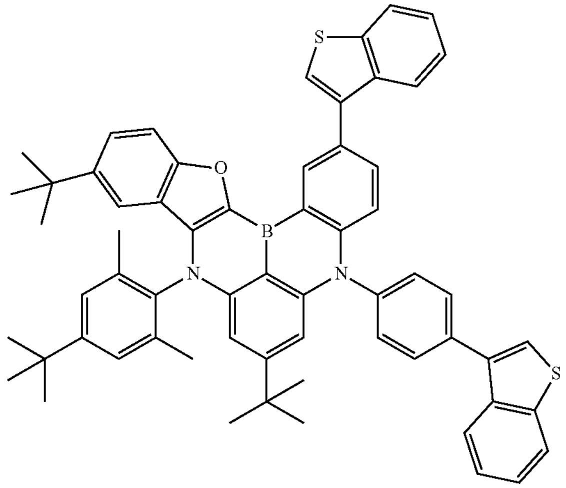
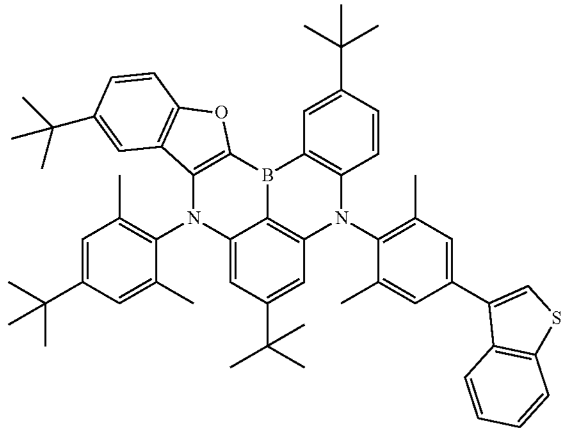
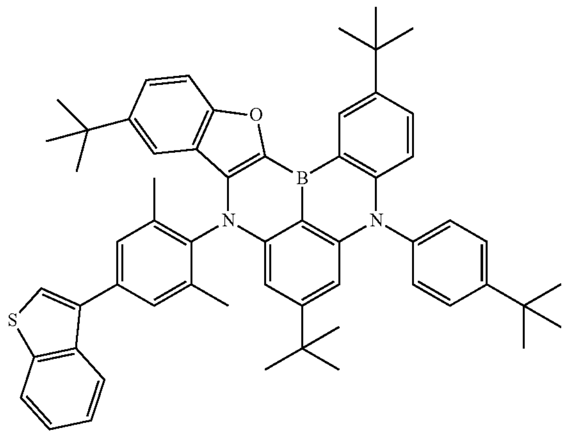
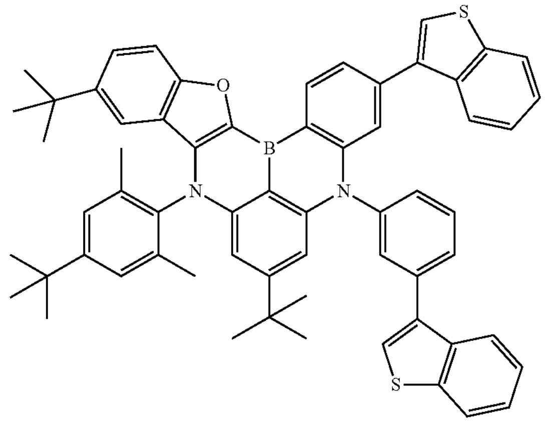
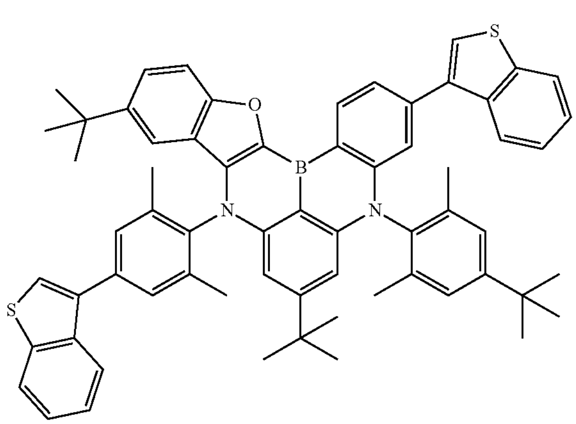
-continued -continued
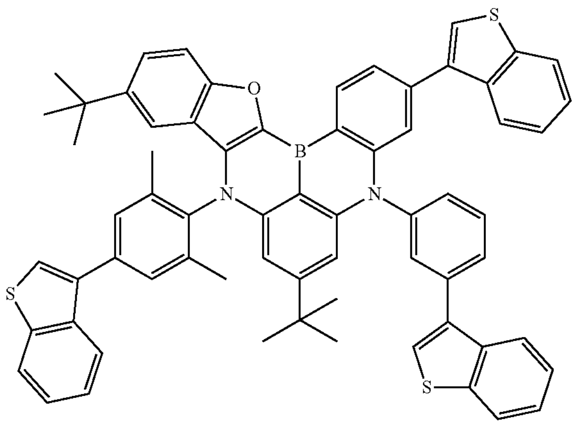
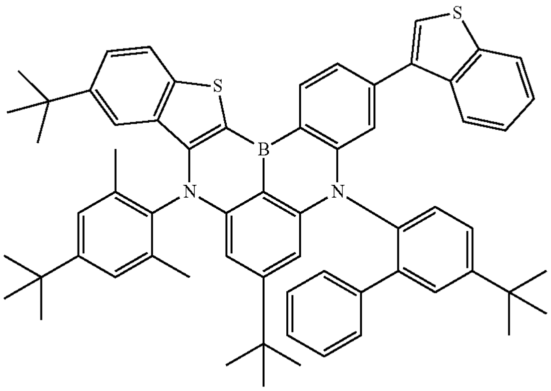
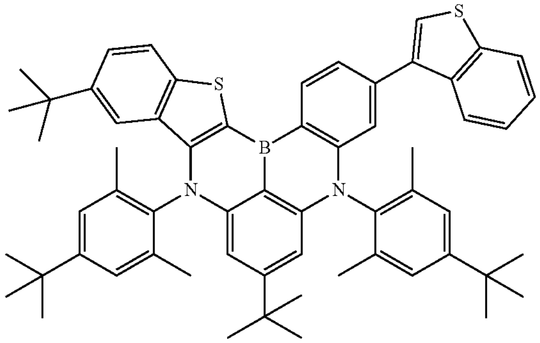
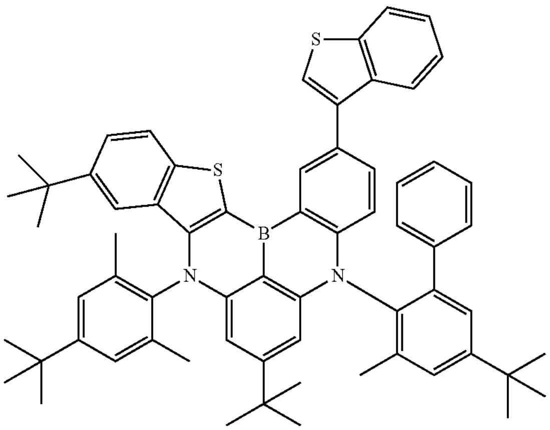
-continued
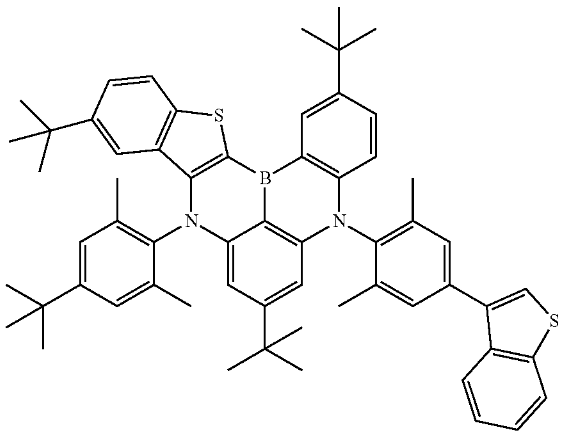
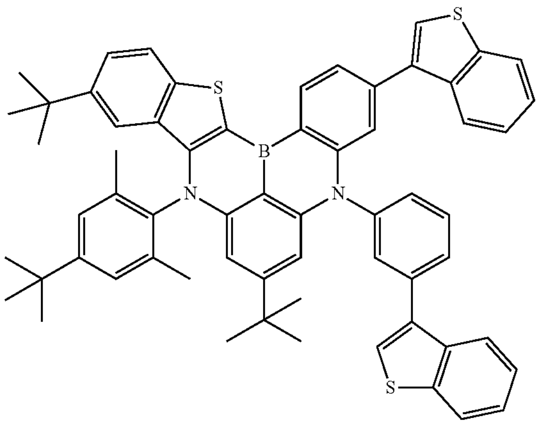
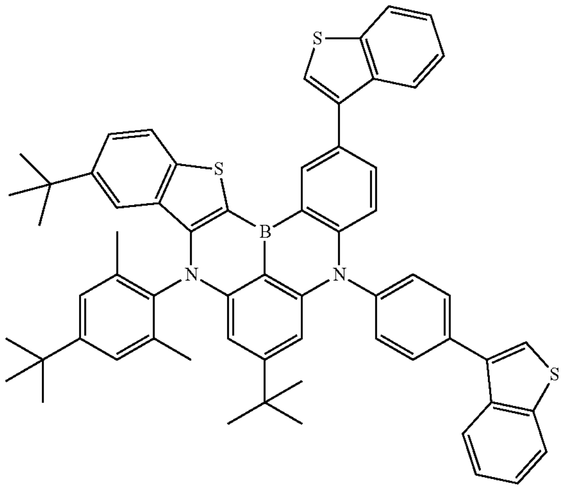

-continued
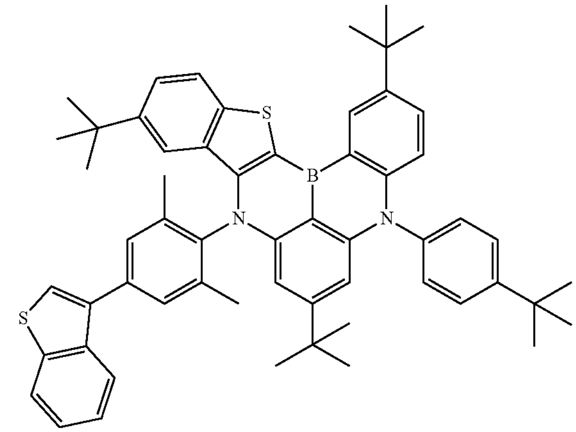
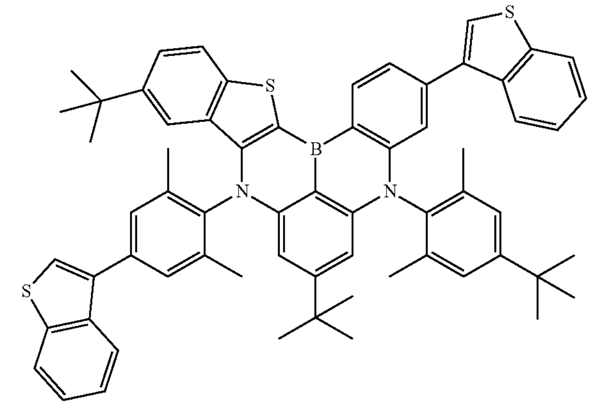
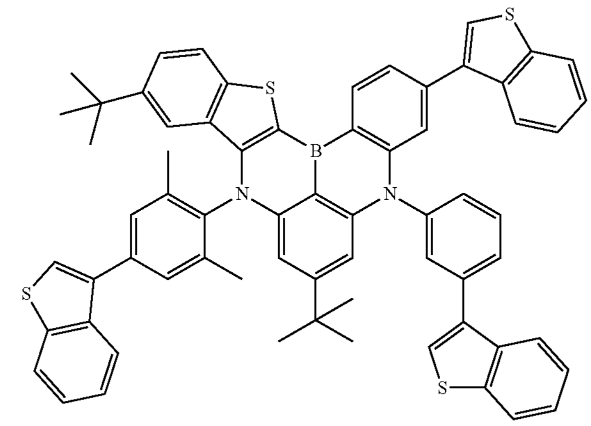
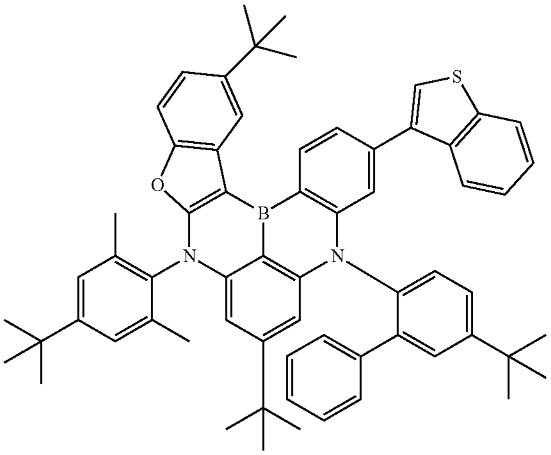
-continued
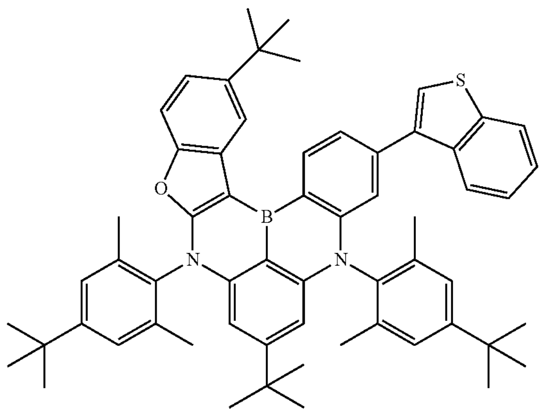
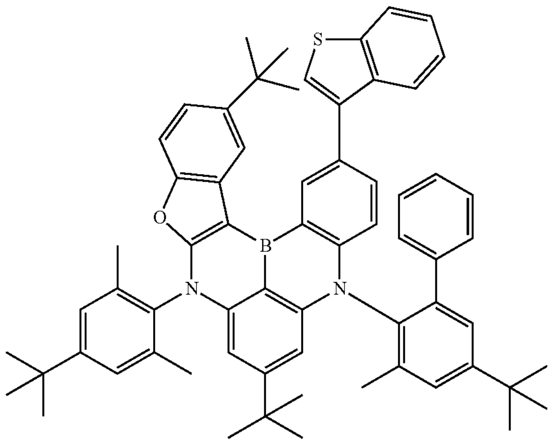
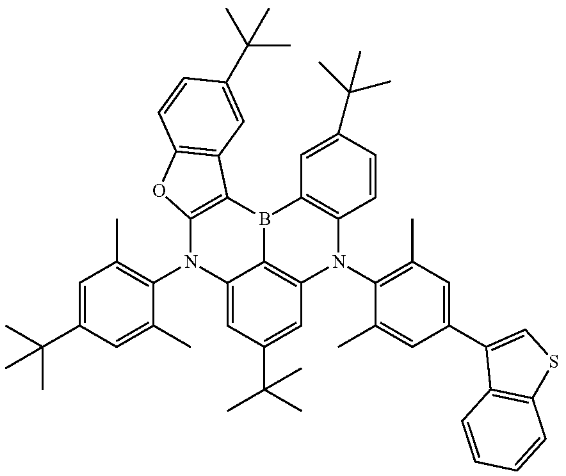

-continued
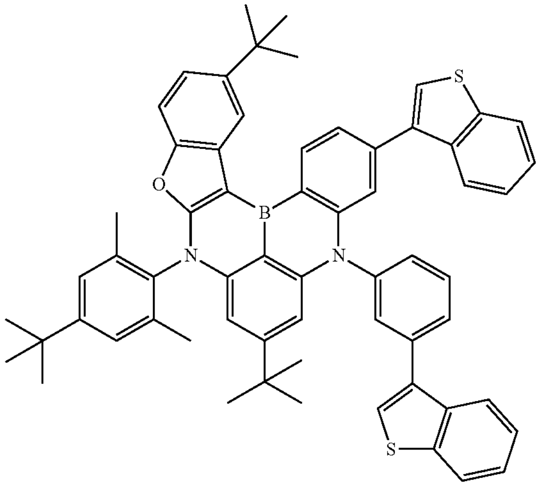
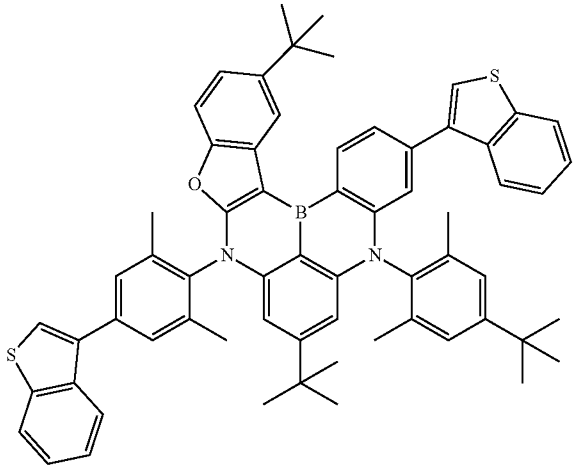
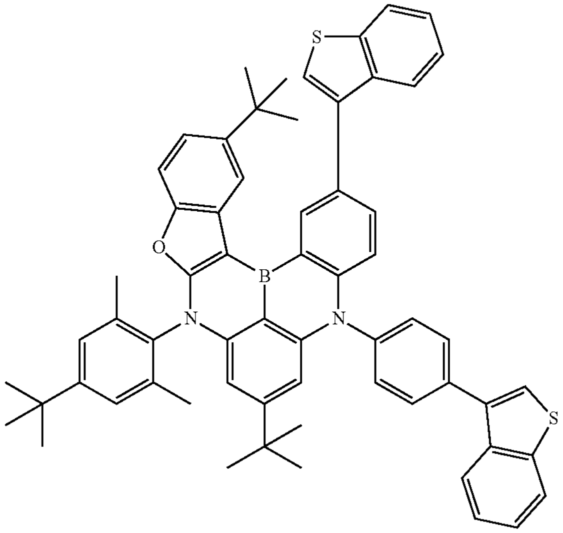
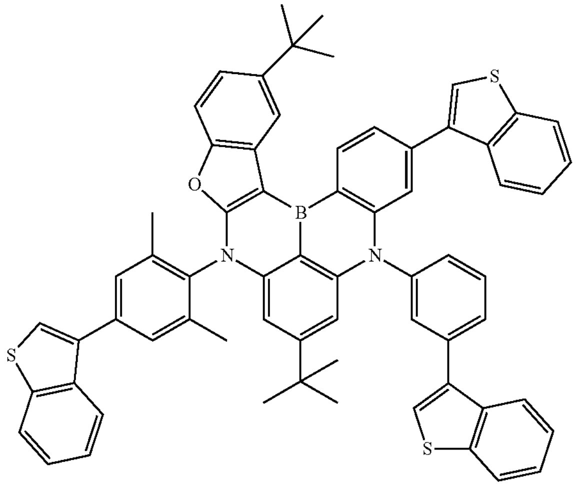
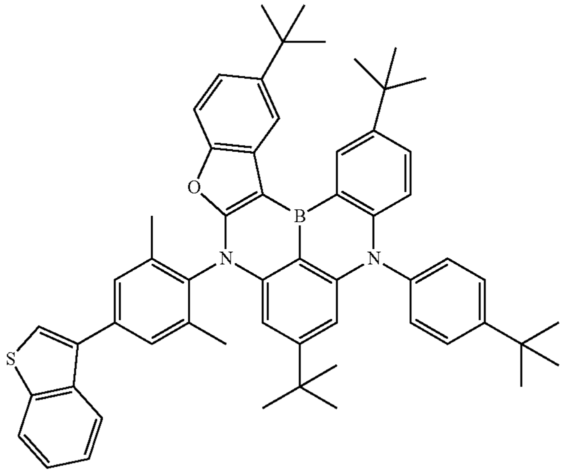
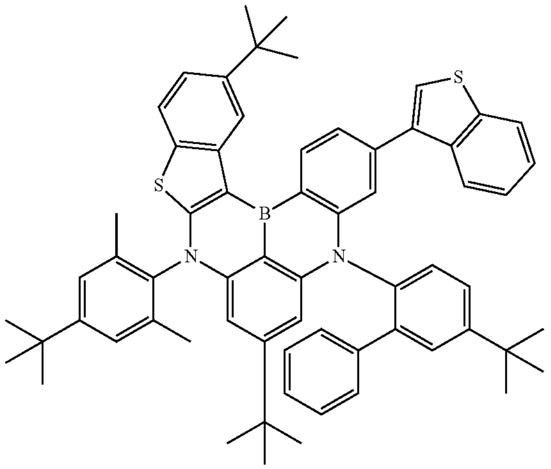

-continued
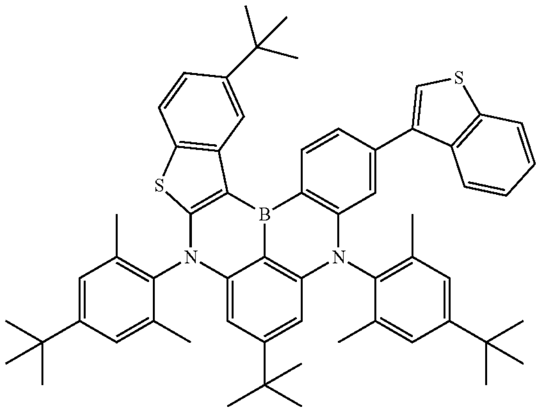
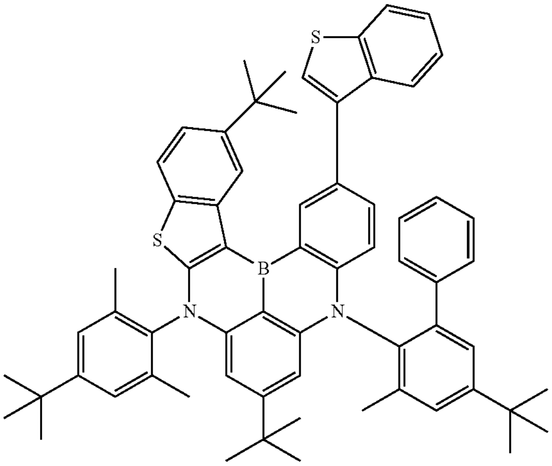
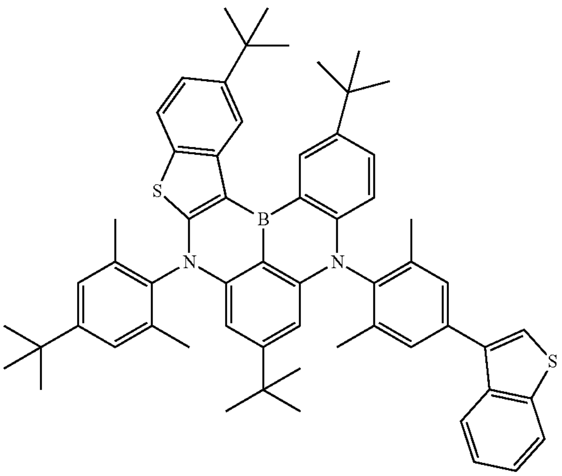
-continued
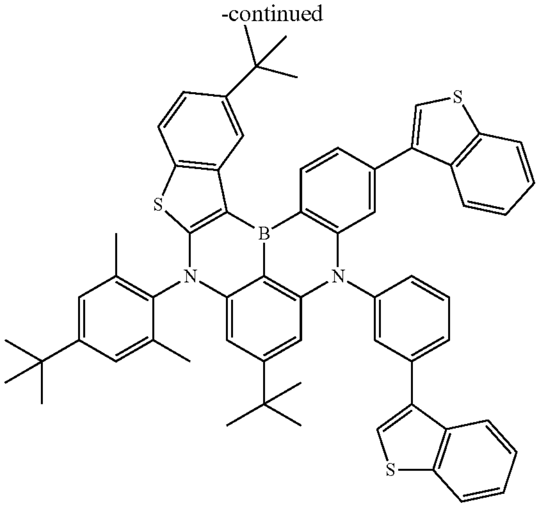
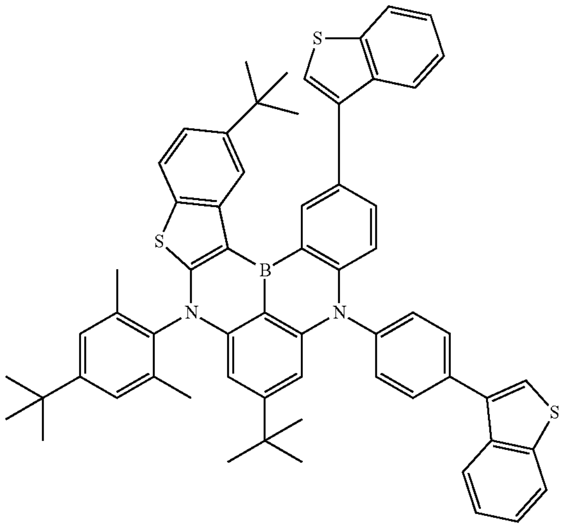
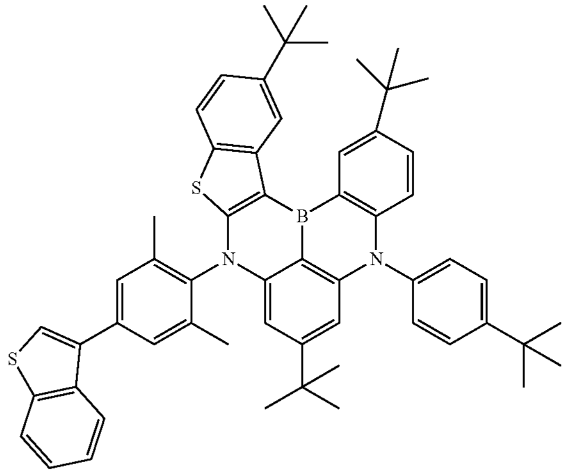

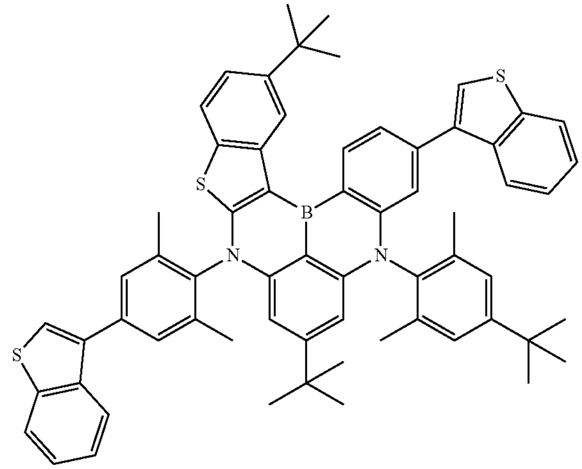
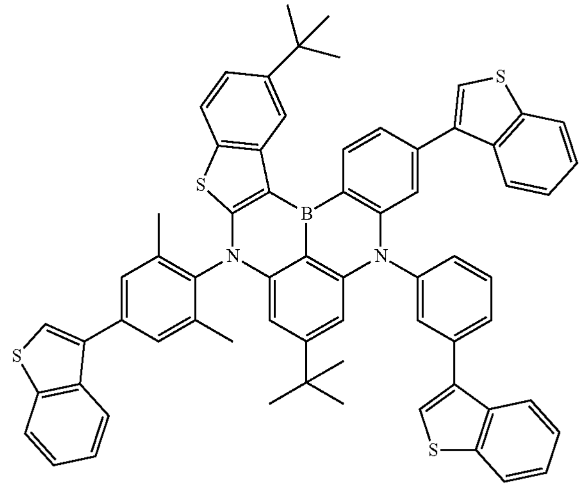
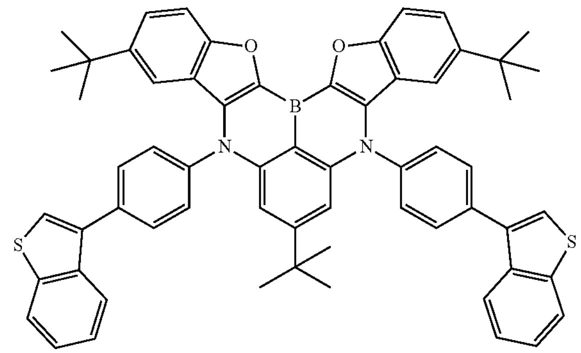
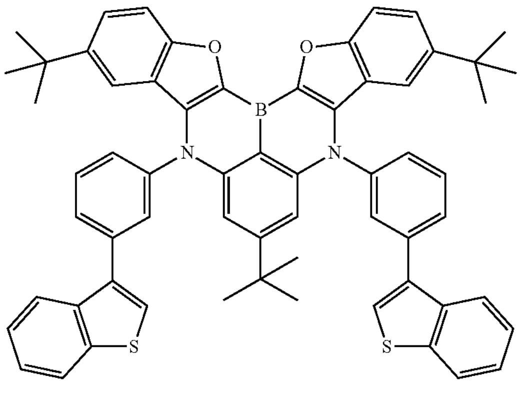
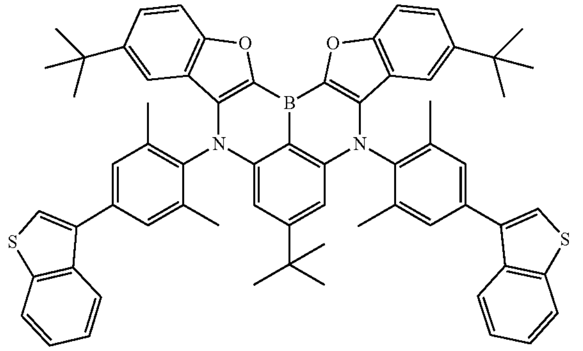
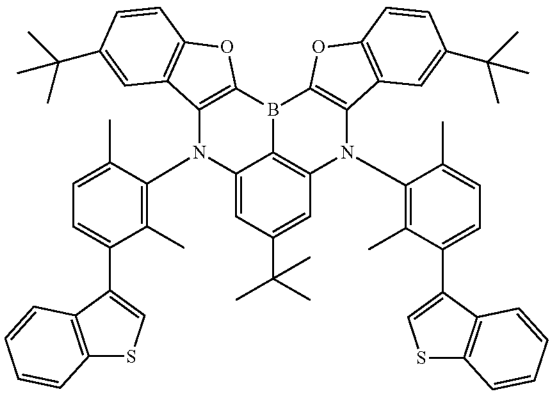
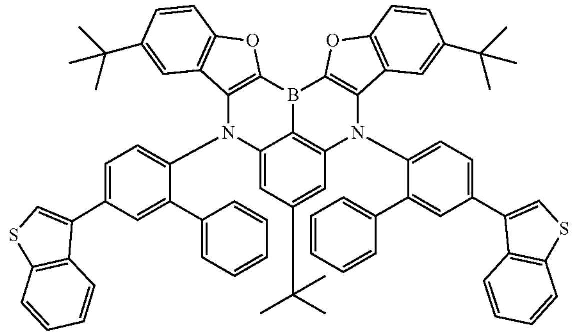
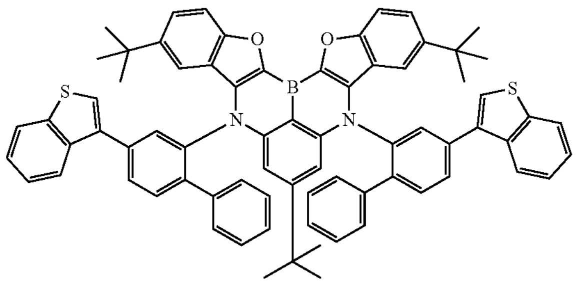
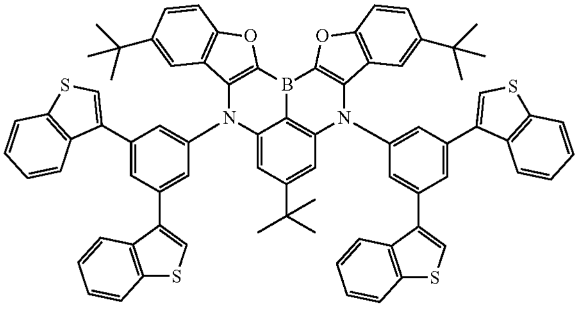

-continued
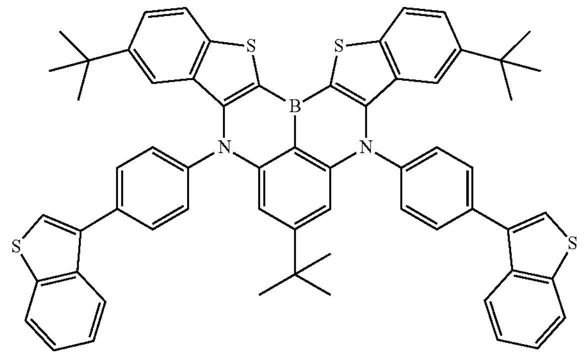
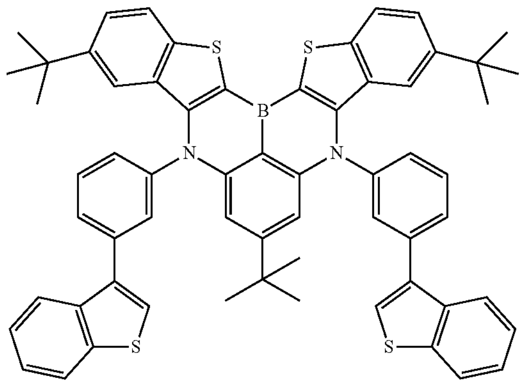
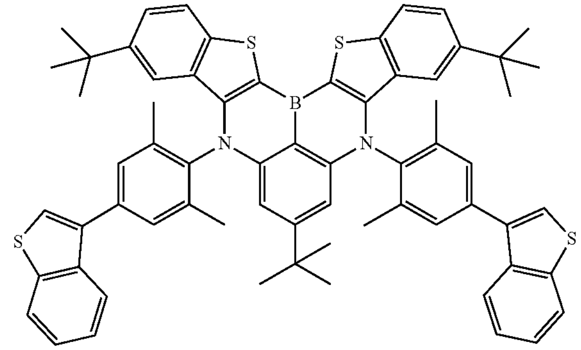
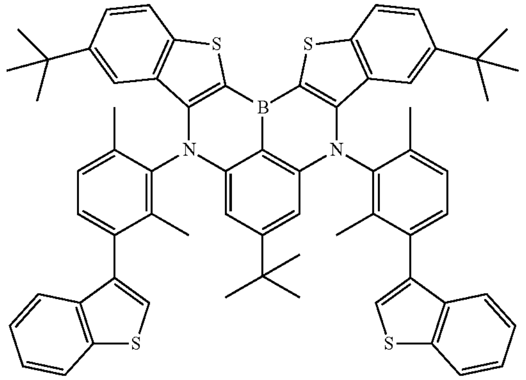
-continued
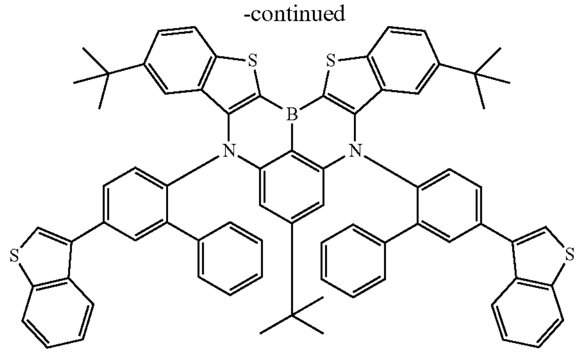
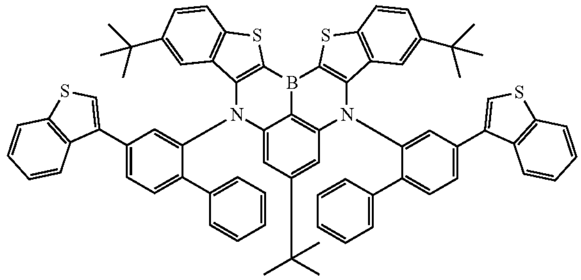
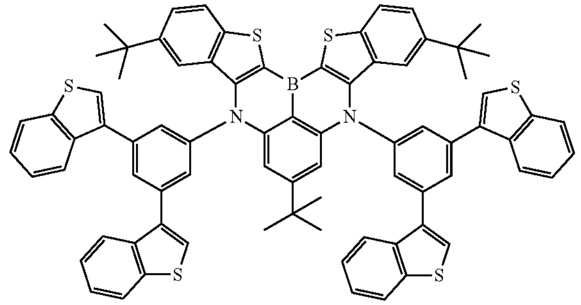
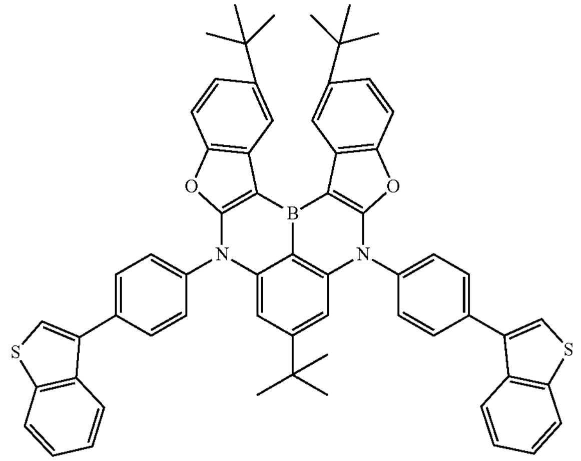
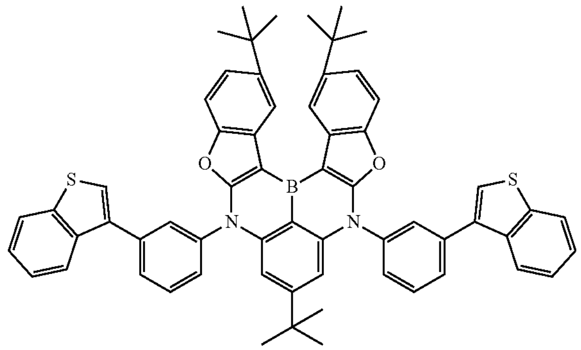

-continued
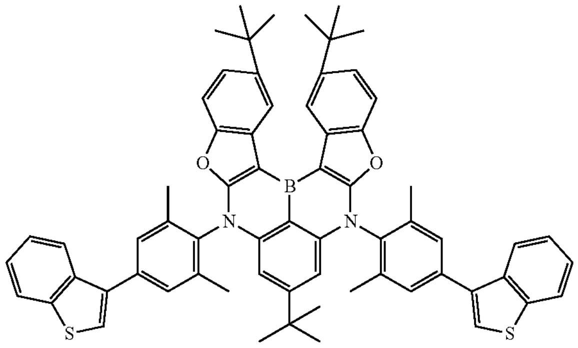
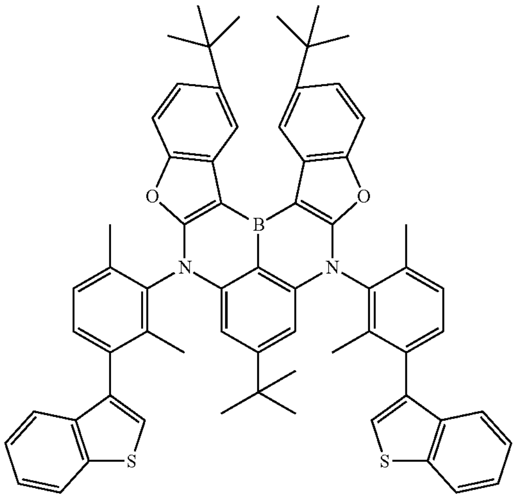
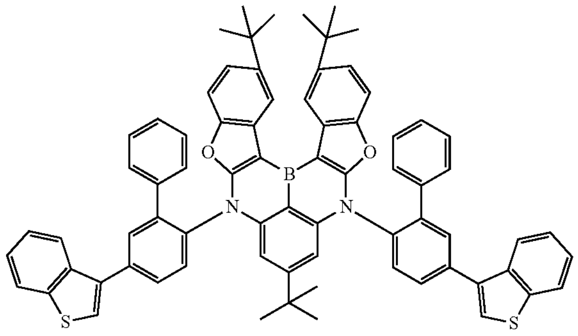
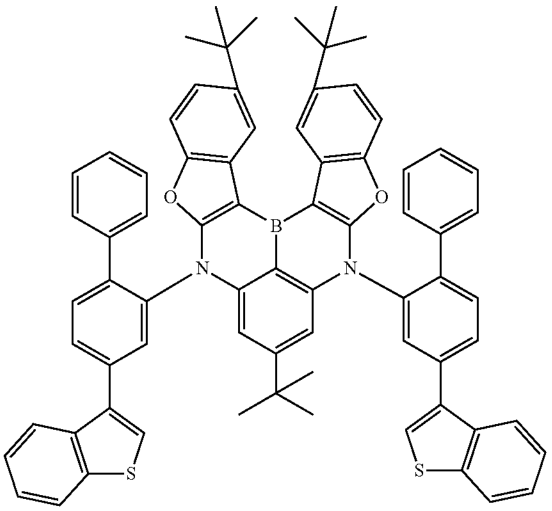
-continued
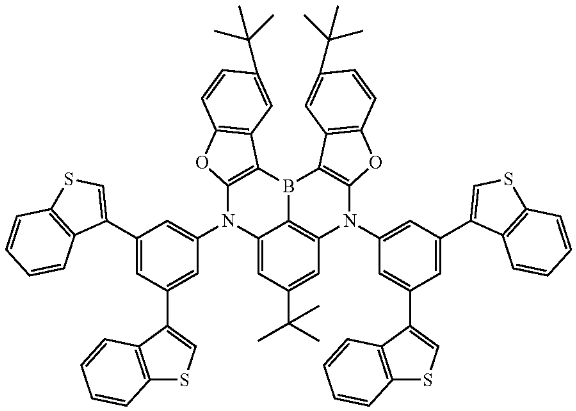
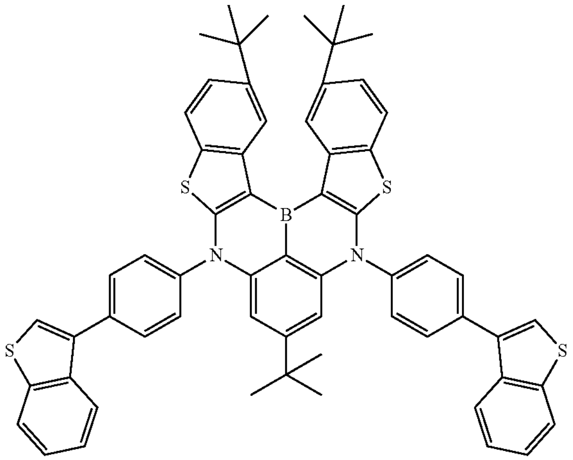
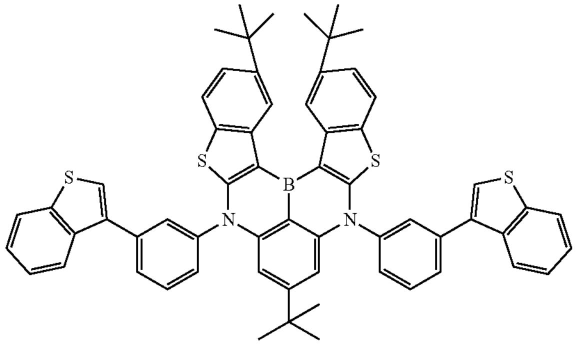

-continued

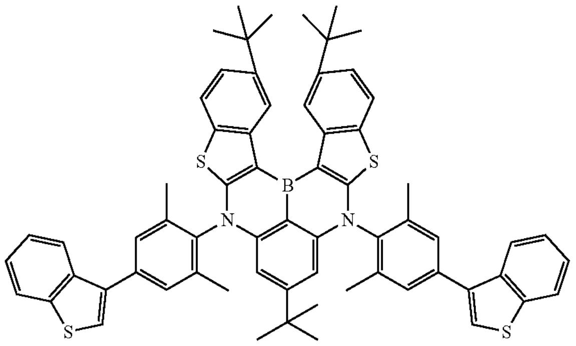

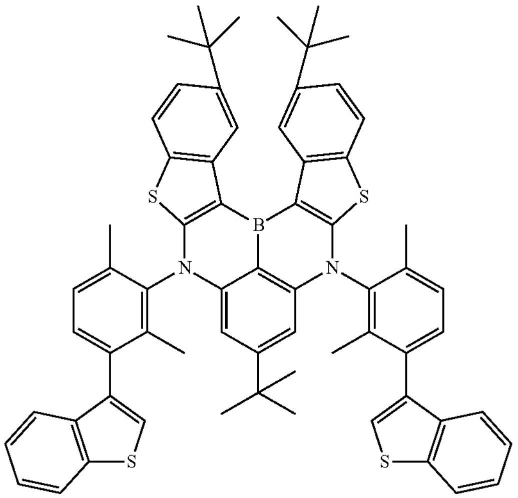

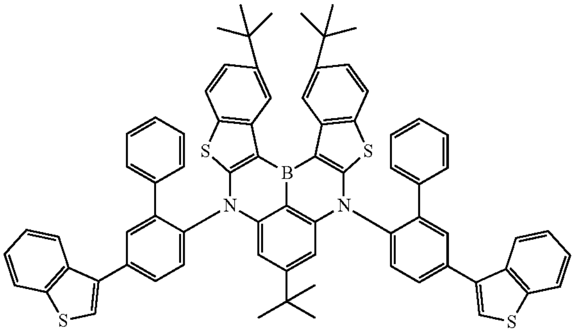

-continued

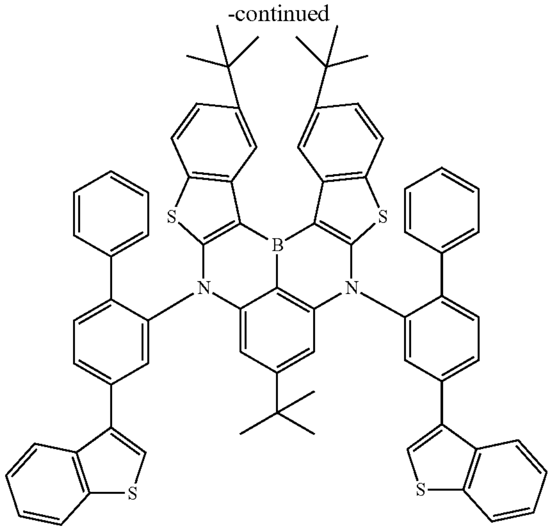

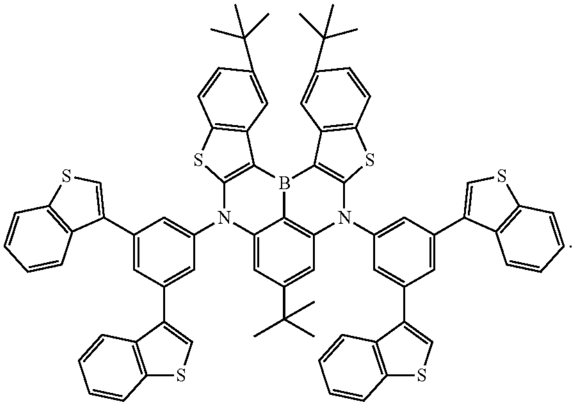

9. An organic light emitting device comprising: a first electrode; a second electrode that is provided opposite to the first electrode; and one or more organic material layers that are provided between the first electrode and the second electrode, wherein the one or more organic material layers comprise the compound of claim 1.

10. The organic light emitting device of claim 9, wherein: the one or more organic material layers comprises a light emitting layer that comprises the compound.

11. An organic light emitting device comprising: a first electrode; a second electrode that is provided opposite to the first electrode; and one or more organic material layers that are provided between the first electrode and the second electrode, wherein the one or more organic material layers comprise the compound of claim 8.

* * * * *